US005683561A

United States Patent [19]

Hollars et al.

[11] Patent Number: 5,683,561

[45] Date of Patent: Nov. 4, 1997

[54] APPARATUS AND METHOD FOR HIGH THROUGHPUT SPUTTERING

[75] Inventors: Dennis R. Hollars, Los Gatos; Delbert F. Waltrip, San Jose; Robert B. Zubeck, Los Altos; Josef Bonigut, Alamo; Robert M. Smith, Antioch; Gary L. Payne, Sunnyvale; Kenneth Lee; David B. Pearce, both of Saratoga, all of Calif.

[73] Assignee: Conner Peripherals, Inc., San Jose, Calif.

[21] Appl. No.: 552,250

[22] Filed: Nov. 2, 1995

Related U.S. Application Data

[63] Continuation of Ser. No. 121,959, Sep. 15, 1993, abandoned, which is a continuation of Ser. No. 681,866, Apr. 4, 1991, abandoned.

[51] Int. Cl.[6] .................... C23C 14/34

[52] U.S. Cl. .................... 204/298.25; 204/298.03; 204/298.19; 204/298.23; 204/298.35

[58] Field of Search .................... 204/192.12, 192.13, 204/298.25, 298.03, 298.19, 298.23, 298.26, 298.27, 298.28, 298.29, 192.2, 298.35

[56] References Cited

U.S. PATENT DOCUMENTS

| | | | |
|---|---|---|---|
| 3,294,670 | 12/1966 | Charschan et al. | 204/298.25 |
| 3,787,312 | 1/1974 | Wagner et al. | 204/298.23 X |
| 3,852,181 | 12/1974 | Cirkler et al. | 204/298.25 |
| 4,500,407 | 2/1985 | Boys et al. | 204/192.15 X |
| 4,558,388 | 12/1985 | Graves, Jr. | 204/298.25 X |
| 4,663,009 | 5/1987 | Bloomquist et al. | 204/298.25 X |
| 4,700,315 | 10/1987 | Blackburn et al. | 204/298.03 X |
| 4,701,251 | 10/1987 | Beardow | 204/298.27 X |
| 4,749,465 | 6/1988 | Flint et al. | 204/192.12 X |
| 4,880,514 | 11/1989 | Scott et al. | 204/192.2 |
| 4,894,133 | 1/1990 | Hedgcoth | 204/298.25 X |
| 5,037,515 | 8/1991 | Tsai et al. | 204/192.2 X |

OTHER PUBLICATIONS

Product Brochure for the Leybold AG Model ZV 1200, entitled "ZV 1200 In-Line System for Sputtering Magnetic Data Storage Media", Leybold AG Industrial Coating, Feb. 11, 1991.

*Primary Examiner*—Nam Nguyen
*Attorney, Agent, or Firm*—Fliesler, Dubb, Meyer & Lovejoy

[57] ABSTRACT

An apparatus in accordance with the present invention provides a single or multi-layer coating to the surface of a plurality of substrates. The apparatus may include a plurality of buffer and sputtering chambers, and an input end and an output end, wherein said substrates are transported through said chambers of said apparatus at varying rates of speed such that the rate of speed of a pallet from said input end to said output end is a constant for each of said plurality of pallets. A high throughput sputtering apparatus having a plurality of integrally matched components in accordance with the present invention may further include means for transporting a plurality of substrates through said sputtering chambers at variable velocities; means for reducing the ambient pressure within said sputtering chambers to a vacuum level within a pressure range sufficient to enable sputtering operation; means for heating said plurality of substrates to a temperature conducive to sputtering said coatings thereon, said means for heating providing a substantially uniform temperature profile over the surface of said substrates; and control means for providing control signals to and for receiving feedback input from, said sputtering chambers, means for transporting, means for reducing, and means for heating, said control means being programmable for allowing control over said means for sputtering, means for transporting, means for reducing and means for heating.

23 Claims, 36 Drawing Sheets

FIGURE 1 part A
Legend
FIGURE 1 part A
FIGURE 1 part B
FIGURE 2 part A
FIGURE 2 part B
W1
W2
C1
C2
C3
C4
C5
C6
98
99
100
101
102
103
104
120-2
120-1
12
14
16
18
20
22A
24
22B
112
114
116
118
122A
124A
122B
24A
155
150
210
2
40
40-1
40-2
40-3
D'
H'
FIGURE 2 part A FIGURE 1 part B FIGURE 2 part B

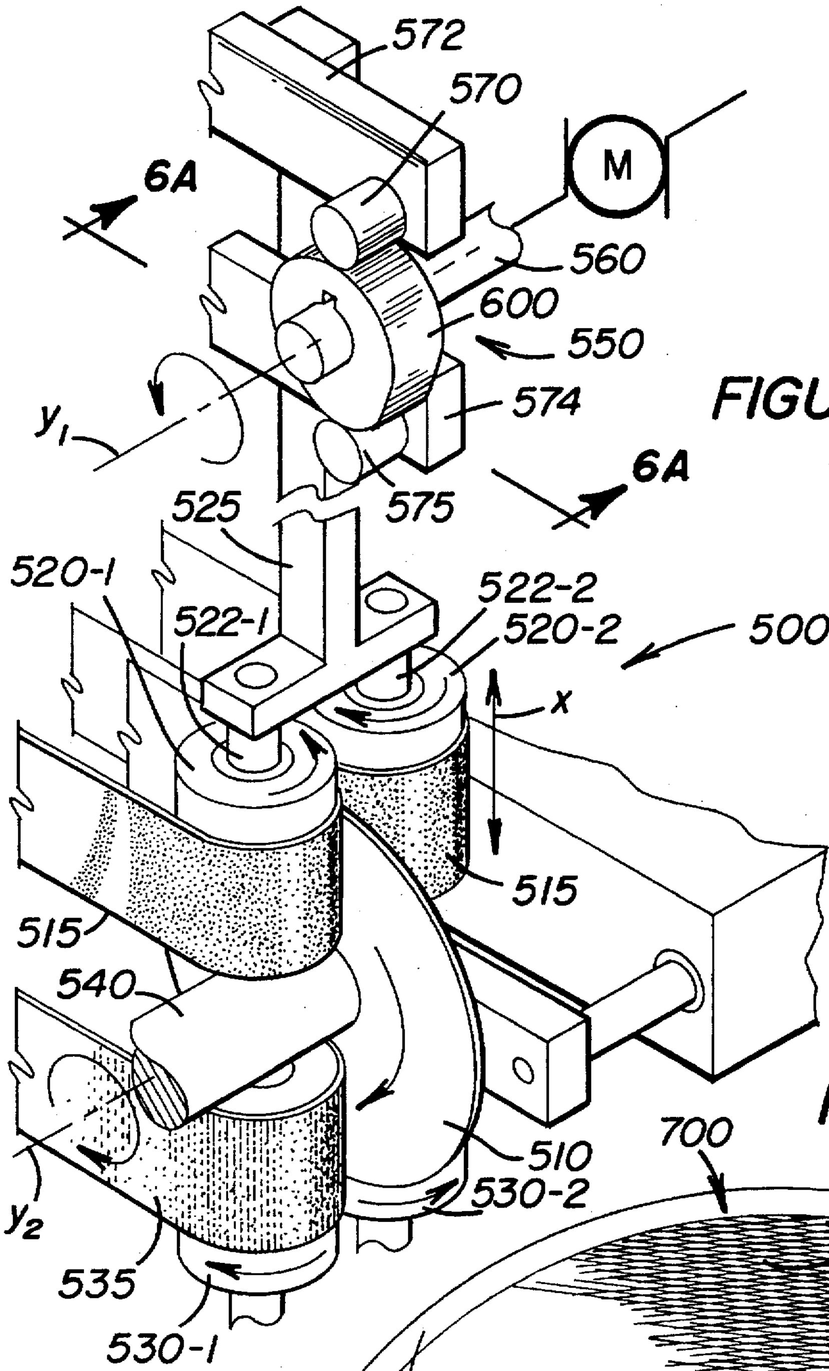
FIGURE 5
FIGURE 7
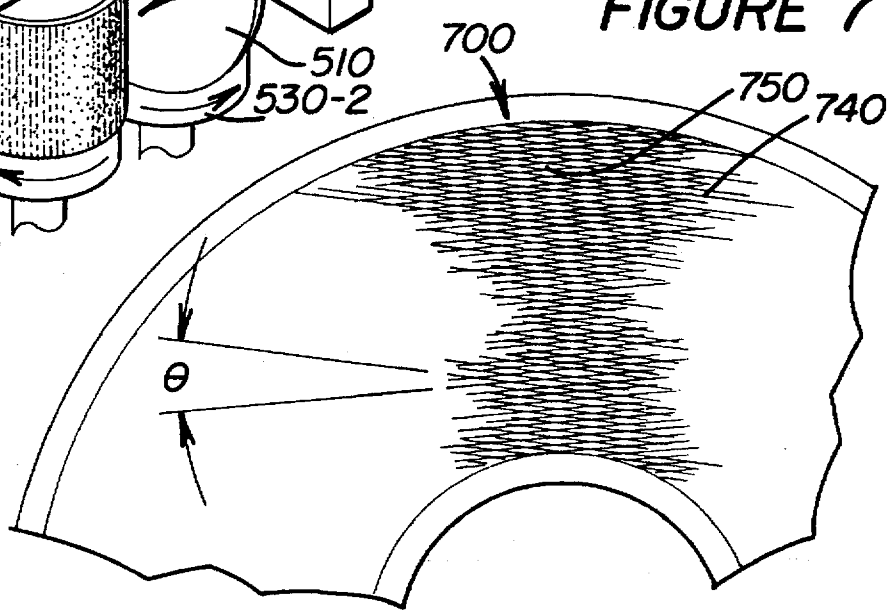

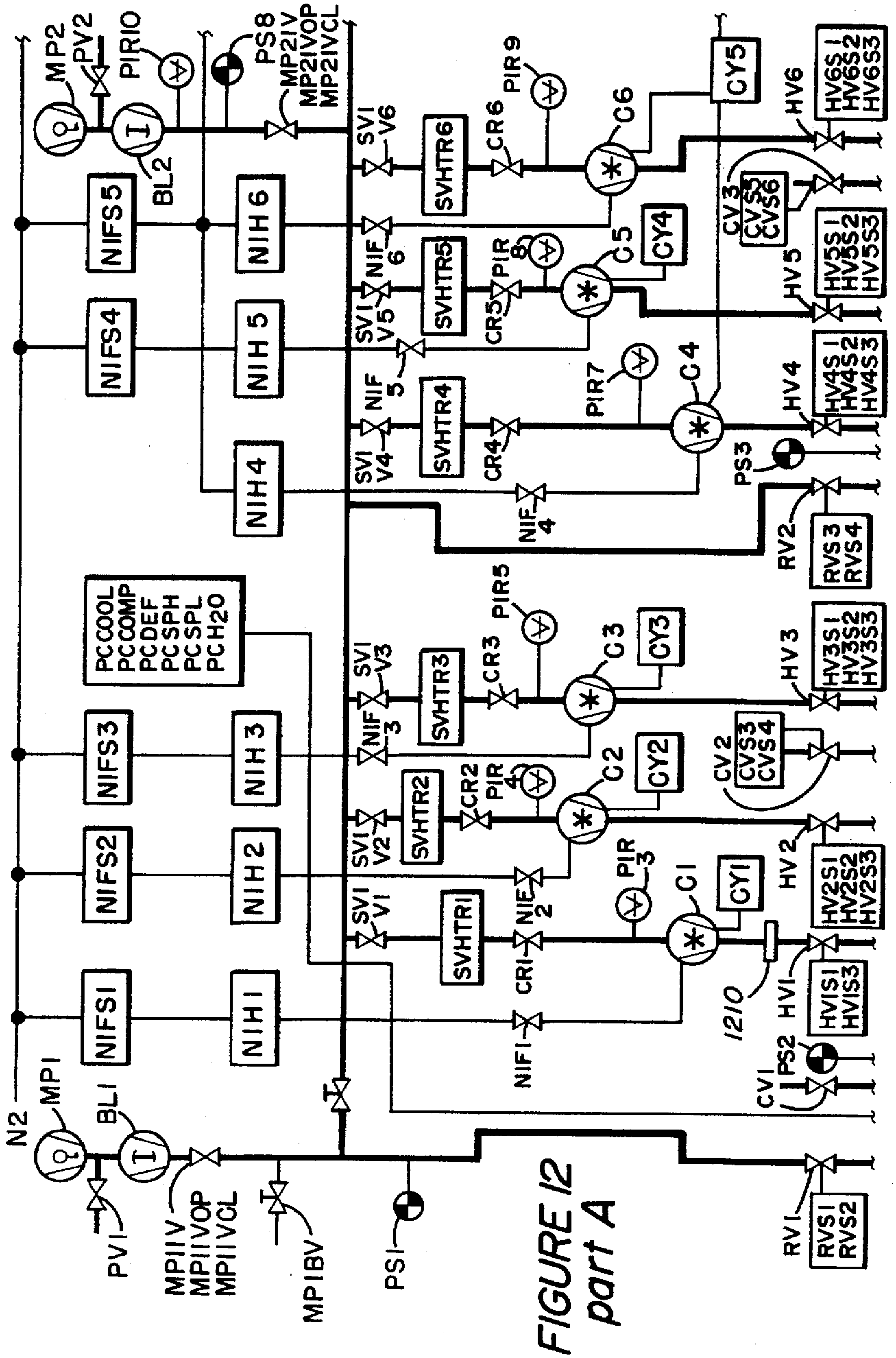
FIGURE 12 part A

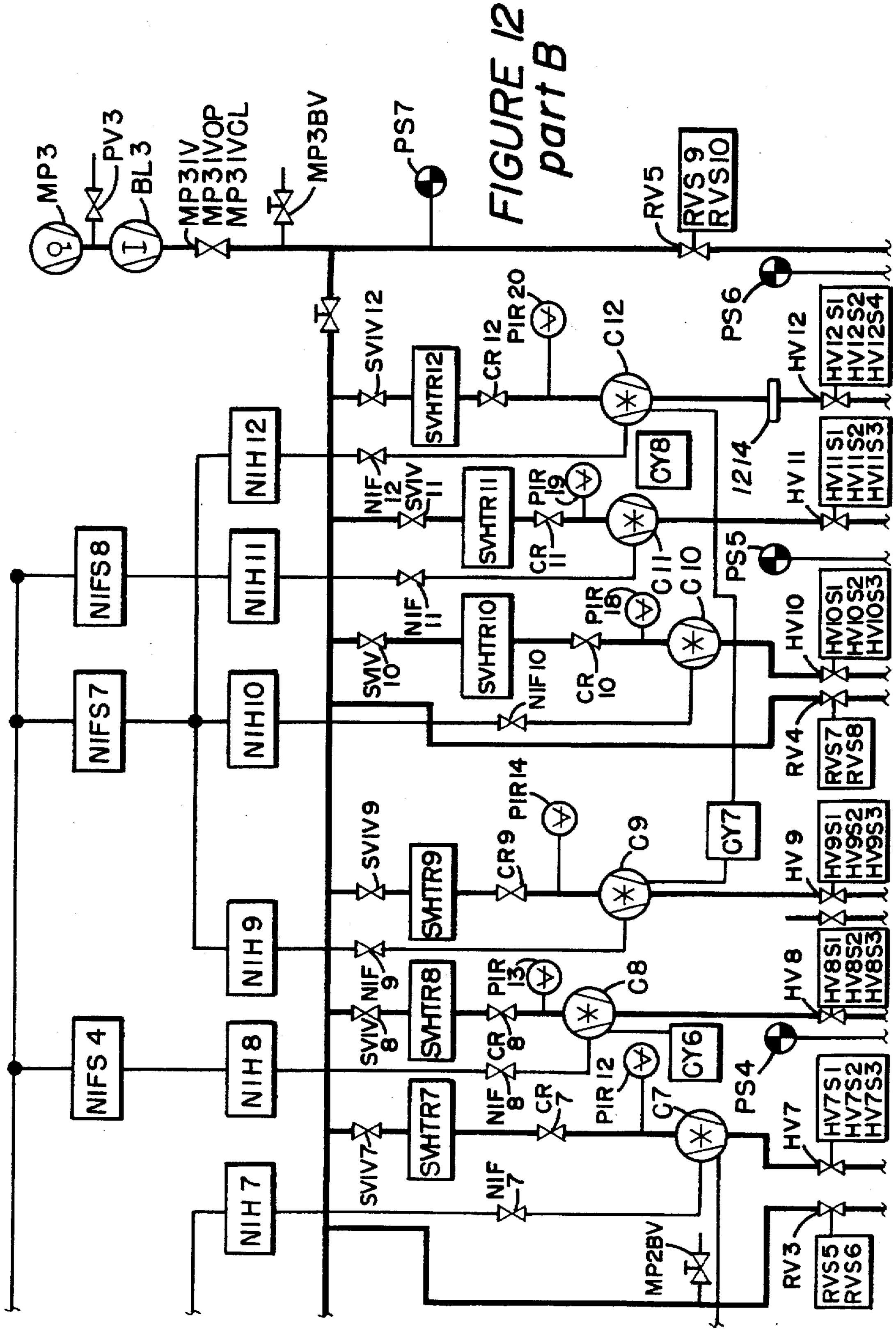
FIGURE 12 part B part C part D

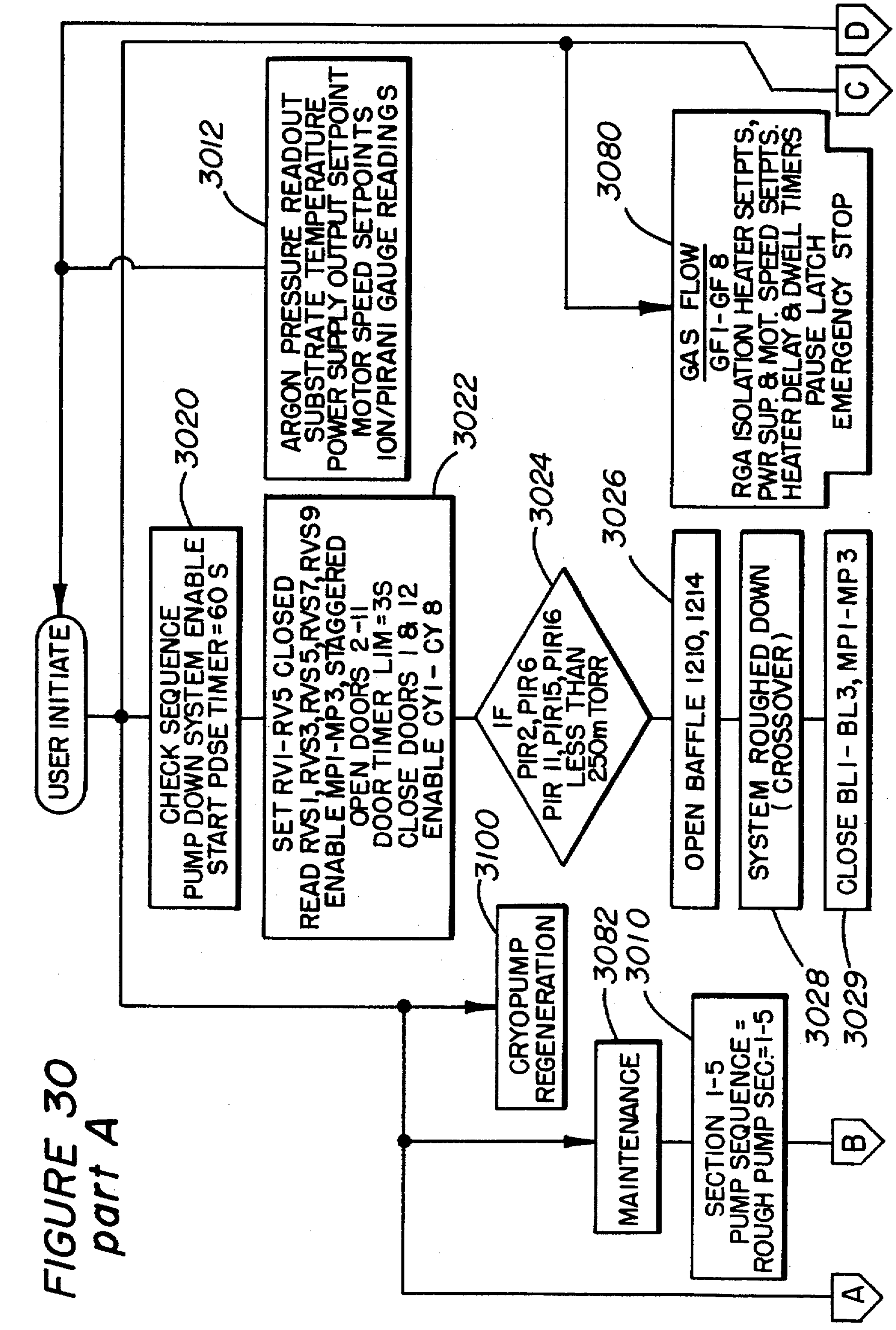
FIGURE 30
part A
USER INITIATE
CHECK SEQUENCE
PUMP DOWN SYSTEM ENABLE
START PDSE TIMER=60 S
3020
SET RV1-RV5 CLOSED
READ RVS1,RVS3,RVS5,RVS7,RVS9
ENABLE MP1-MP3, STAGGERED
OPEN DOORS 2-11
DOOR TIMER LIM=3S
CLOSE DOORS 1 & 12
ENABLE CY1 - CY 8
3022
IF
PIR2, PIR6
PIR 11, PIR15, PIR16
LESS THAN
250m TORR
3024
OPEN BAFFLE 1210, 1214
3026
SYSTEM ROUGHED DOWN
( CROSSOVER )
3028
CLOSE BL1 - BL3, MP1-MP3
3029
ARGON PRESSURE READOUT
SUBSTRATE TEMPERATURE
POWER SUPPLY OUTPUT SETPOINT
MOTOR SPEED SETPOINTS
ION/PIRANI GAUGE READINGS
3012
GAS FLOW
GF1-GF 8
RGA ISOLATION HEATER SETPTS,
PWR SUP. & MOT. SPEED SETPTS.
HEATER DELAY & DWELL TIMERS
PAUSE LATCH
EMERGENCY STOP
3080
CRYOPUMP
REGENERATION
3100
MAINTENANCE
3082
SECTION 1-5
PUMP SEQUENCE =
ROUGH PUMP SEC:=1-5
3010
A
B
C
D

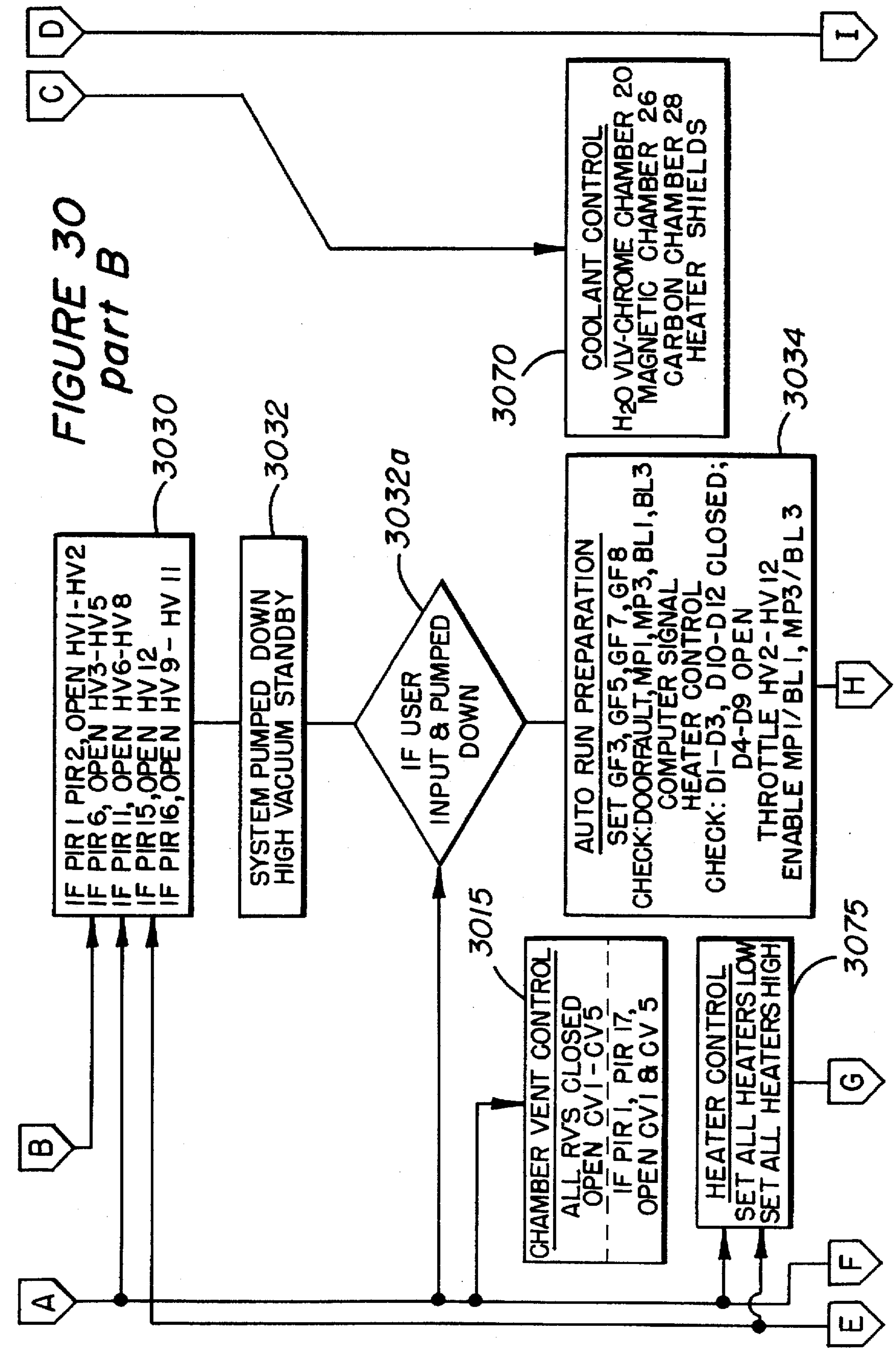
FIGURE 30
part B
A
B
C
D
E
F
G
H
I
3030
IF PIR I PIR 2, OPEN HV1-HV2
IF PIR 6, OPEN HV3-HV5
IF PIR 11, OPEN HV6-HV8
IF PIR 15, OPEN HV 12
IF PIR 16, OPEN HV9 - HV 11
3032
SYSTEM PUMPED DOWN
HIGH VACUUM STANDBY
3032a
IF USER
INPUT & PUMPED
DOWN
3034
AUTO RUN PREPARATION
SET GF3, GF5, GF7, GF8
CHECK: DOORFAULT, MP1, MP3, BL1, BL3
COMPUTER SIGNAL
HEATER CONTROL
CHECK: D1-D3, D10-D12 CLOSED;
D4-D9 OPEN
THROTTLE HV2-HV12
ENABLE MP1/BL1, MP3/BL3
3070
COOLANT CONTROL
H2O VLV-CHROME CHAMBER 20
MAGNETIC CHAMBER 26
CARBON CHAMBER 28
HEATER SHIELDS
3015
CHAMBER VENT CONTROL
ALL RVS CLOSED
OPEN CV1-CV5
IF PIR 1, PIR 17,
OPEN CV1 & CV 5
3075
HEATER CONTROL
SET ALL HEATERS LOW
SET ALL HEATERS HIGH FIGURE 30 part C part A part B part C

APPARATUS AND METHOD FOR HIGH THROUGHPUT SPUTTERING

This application is a File Wrapper Continuation of Ser. No. 08/121,959, filed Sep. 15, 1993, now abandoned, which is a continuation of Ser. No. 07/681,866, filed Apr. 4, 1991, now abandoned.

LIMITED COPYRIGHT WAIVER

A portion of the disclosure of this patent document contains material to which the claim of copyright protection is made. The copyright owner has no objection to the facsimile reproduction by any person of the patent document or the patent disclosure, as it appears in the U.S. Patent and Trademark Office file or records, but reserves all other rights whatsoever.

BACKGROUND OF THE INVENTION

1. Field of the Invention

The invention relates to an apparatus and method for depositing multilayer thin films in a magnetron sputtering process. More particularly, the invention relates to an apparatus and method for depositing thin magnetic films for magnetic recording media in a high volume, electronically controlled, magnetron sputtering process, and to production of an improved magnetic recording disk product thereby.

2. Description of the Related Art

Sputtering is a well-known technique for depositing uniform thin films on a particular substrate. Sputtering is performed in an evacuated chamber using an inert gas, typically argon, with one or more substrates remaining static during deposition, being rotated about the target (a "planetary" system) or being transported past the target (an "in-line" system).

Fundamentally, the technique involves bombarding the surface of a target material to be deposited as the film with electrostatically accelerated argon ions. Generally, electric fields are used to accelerate ions in the plasma gas, causing them to impinge on the target surface. As a result of momentum transfer, atoms and electrons are dislodged from the target surface in an area known as the erosion region. Target atoms deposit on the substrate, forming a film.

Typically, evacuation of the sputtering chamber is a two-stage process in order to avoid contaminant-circulating turbulence in the chamber. First, a throttled roughing stage slowly pumps down the chamber to a first pressure, such as about 50 microns. Then, high vacuum pumping occurs using turbo-, cryo- or diffusion pumps to evacuate the chamber to the highly evacuated base pressure (about $10^{-7}$ Torr) necessary to perform sputtering. Sputtering gas is subsequently provided in the evacuated chamber, backfilling to a pressure of about 2–10 microns.

The sputtering process is useful for depositing coatings from a plurality of target materials onto a variety of substrate materials, including glass, nickel-phosphorus plated aluminum disks, and ceramic materials. However, the relatively low sputtering rate achieved by the process solely relying on electrostatic forces (diode sputtering) may be impracticable for certain commercial applications where high volume processing is desired. Consequently, various magnet arrangements have been used to enhance the sputtering rate by trapping electrons close to the target surface, ionizing more argon, increasing the probability of impacting and dislodging target atoms and therefore the sputtering rate. In particular, an increased sputtering rate is achieved by manipulation of a magnetic field geometry in the region adjacent to the target surface.

Sputter deposition performed in this manner is generally referred to as magnetron sputtering.

The magnetic field geometry may be optimized by adjusting the polarity and position of individual magnets used to generate magnetic fields with the goal of using the magnetic field flux paths to enhance the sputtering rate. For example, U.S. Pat. No. 4,166,018, issued Aug. 28, 1989 to J. S. Chapin and assigned to Airco, Inc., describes a planar direct current (d.c.) magnetron sputtering apparatus which uses a magnet configuration to generate arcuate magnetic flux paths (or lines) that confine the electrons and ions in a plasma region immediately adjacent to the target erosion region. A variety of magnet arrangements are suitable for this purpose, as long as one or more closed loop paths of magnetic flux is parallel to the cathode surface, e.g., concentric ovals or circles.

The role of the magnetic field is to trap moving electrons near the target. The field generates a force on the electrons, inducing the electrons to take a spiral path about the magnetic field lines. Such a spiral path is longer than a path along the field lines, thereby increasing the chance of the electron ionizing a plasma gas atom, typically argon. In addition, field lines also reduce electron repulsion away from a negatively biased target. As a result, a greater ion flux is created in the plasma region adjacent to the target with a correspondingly enhanced erosion of target atoms from an area which conforms to a shape approximating the inverse shape of the field lines. Thus, if the field above the target is configured in arcuate lines, the erosion region adjacent to the field lines conforms to a shallow track, leaving much of the target unavailable for sputtering.

Even lower target utilization is problematic for magnetic targets because magnetic field lines tend to be concentrated within, and just above, a magnetic target. With increasing erosion of the magnetic target during sputtering, the field strength above the erosion region increases as more field lines 'leak' out from the target, trapping more electrons and further intensifying the plasma close to the erosion region. Consequently, the erosion region is limited to a narrow valley.

In addition to achieving high film deposition rates, sputtering offers the ability to tailor film properties to a considerable extent by making minor adjustments to process parameters. Of particular interest are processes yielding films with specific crystalline microstructures and magnetic properties. Consequently, much research has been conducted on the effects of sputtering pressures, deposition temperature and maintenance of the evacuated environment to avoid contamination or degradation of the substrate surface before film deposition.

Alloys of cobalt, nickel and chromium deposited on a chromium underlayer (CoNiCr/Cr) are highly desirable as films for magnetic recording media such as disks utilized in Winchester-type hard disk drives. However, on disk substrates, in-line sputtering processes create magnetic anisotropies which are manifested as signal waveform modulations and anomalies in the deposited films.

Anisotropy in the direction of disk travel through such in-line processes is understood to be caused by crystalline growth perpendicular to the direction of disk travel as a result of the deposition of the obliquely incident flux of target atoms as the disk enters and exits a sputtering chamber. Since magnetic film properties depend on crystalline microstructure, such anisotropy in the chromium underlayer can disrupt the subsequent deposition of the magnetic CoNiCr layer in the preferred orientation. The preferred crystalline orientation for the chromium underlayer is with the closely packed, bcc {110} plane parallel to the film surface. This orientation for the chromium nucleating layer forces the 'C' axis of the hcp structure of the magnetic cobalt-alloy layer, i.e., the easy axis of magnetization, to be aligned in the film plane. Similarly, the orientation of the magnetic field generated in the sputtering process may induce an additional anisotropy which causes similar signal waveform modulations. See, Uchinami, et al., "Magnetic Anisotropies in Sputtered Thin Film Disks", *IEEE Trans. Magn.*, Vol. MAG-23, No. 5, 3408–10, September 1987, and Hill, et al., "Effects of Process Parameters on Low Frequency Modulation on Sputtered Disks for Longitudinal Recording", *J. Vac Sci. Tech.*, Vol. A4, No. 3, 547–9, May 1986 (describing magnetic anisotropy phenomena).

Several approaches have been taken to eliminate the aforementioned waveform modulation problems while enhancing magnetic properties in the coating, especially coercivity. For instance, U.S. Pat. No. 4,816,127, issued Mar. 28, 1989 to A. Eltoukhy and assigned to Xidex Corp., describes one means for shielding the substrate to intercept the obliquely incident target atoms. In addition, Teng, et al., "Anisotropy-Induced Signal Waveform Modulation of DC Magnetron Sputtered Thin Films", *IEEE Trans. Magn.*, Vol. MAG-22, 579–581, 1986, and Simpson, et al., "Effect of Circumferential Texture on the Properties of Thin Film Rigid Recording Disks", *IEEE Trans. Magn.*, Vol. MAG-23, No. 5, 3405–7, September 1987, suggest texturizing the disk substrate surface prior to film deposition. In particular, the authors propose circumferential surface grooves to promote circumferentially oriented grain growth and thereby increase film coercivity.

Other approaches to tailoring film properties have focused on manipulating the crystalline microstructure by introducing other elements into the alloy composition. For example, Shiroishi, et al., "Read and Write Characteristics of Co-Alloy/Cr Thin Films for Longitudinal Recording", *IEEE Trans. Magn.*, Vol. MAG-24, 2730–2, 1988, and U.S. Pat. No. 4,652,499, issued Mar. 24, 1987 to J. K. Howard and assigned to IBM, relate to the substitution of elements such as platinum (Pt), tantalum (Ta), and zirconium (Zr) into cobalt-chromium (CoCr) films to produce higher coercivity and higher corrosion resistance in magnetic recording films.

CoCr alloys with tantalum (CoCrTa) are particularly attractive films for magnetic recording media. For example, it is known in the prior art to produce CoCrTa films by planetary magnetron sputtering processes using individual cobalt, chromium and tantalum targets or using cobalt-chromium and tantalum targets.

Fisher, et al., "Magnetic Properties and Longitudinal Recording Performance of Corrosion Resistant Alloy Films", *IEEE Trans., Magn.*, Vol. MAG 22, no. 5, 352–4, September 1986, describe a study of the magnetic and corrosion resistance properties of sputtered CoCr alloy films. Substitution of 2 atomic percent (at. %) Ta for Cr in a Co-16 at. % Cr alloy (i.e., creating a Co-14 at. % Cr-2 at. % Ta alloy) was found to improve coercivity without increasing the saturation magnetization. In particular, a coercivity of 1400 Oe was induced in a 400 Å film. In addition, linear bit densities from 8386 flux reversals/cm to 1063 flux reversals/cm (21300 fci to 28100 fci) were achieved at −3 dB, with a signal-to-noise (SNR) ratio of 30 dB. Moreover, corrosion resistance of CoCr and CoCrTa films was improved relative to CoNi films.

U.S. Pat. No. 4,940,548, issued on Aug. 21, 1990 to Furusawa, et al., and assigned to Hitachi, Ltd., discloses the use of Ta to increase the coercivity and corrosion resistance of CoCr (and CoNi) alloys. CoCr alloys with 10 at. % Ta (and chromium content between 5 and 25 at. %) were sputtered onto multiple layers of chromium to produce magnetic films with low modulation even without texturing the substrate surface and highly desirable crystalline microstructure and magnetic anisotropy.

Development of a high throughput in-line system to produce sputtered CoCrTa films with enhanced magnetic and corrosion-resistance properties for the magnetic recording media industry has obvious economic advantages.

Linear recording density of magnetic films on media used in Winchester-type hard disk drives is known to be enhanced by decreasing the flying height of the magnetic recording head above the recording medium. With reduced flying height, there is an increased need to protect the magnetic film layer from wear. Magnetic films are also susceptible to corrosion from vapors present even at trace concentrations within the magnetic recording system. A variety of films have been employed as protective overlayers for magnetic films, including rhodium, carbon and inorganic nonmetallic carbides, nitrides and oxides, like silica or alumina. However, problems such as poor adhesion to the magnetic layer and inadequate wear resistance have limited the applicability of these films. U.S. Pat. No. 4,503,125 issued on Mar. 3, 1985 to Nelson, et al. and assigned to Xebec, Inc. describes a protective carbon overcoating for magnetic films where adhesion is enhanced by chemically bonding a sputtered layer of titanium between the magnetic layer and the carbon overcoating.

In the particular case of sputtered carbon, desirable film properties have been achieved by carefully controlling deposition parameters. For example, during the sputtering process, the amount of gas incorporated in the growing film depends on sputtering parameters like target composition, sputtering gas pressure and chamber geometry. U.S. Pat. No. 4,839,244, issued on Jun. 13, 1989 to Y. Tsukamoto and assigned to NEC Corp., describes a process for co-sputtering a protective graphite fluoride overlayer with an inorganic nonmetallic compound in a gaseous atmosphere which includes fluorine gas. U.S. Pat. No. 4,891,114 issued on Jan. 1, 1990 to Hitzfeld, et al., and assigned to BASF Aktiengesellschaft of Germany, relates to a d. c. magnetron sputtering process for an amorphous carbon protective layer using a graphitic carbon target.

As the wear-resistant layer for magnetic recording media, it is desirable that the carbon overlayer have a microcrystalline structure corresponding to high hardness. In other words, it is desirable during sputtering to minimize graphitization of carbon which softens amorphous carbon films. One means employed to moderate graphitization of sputtered carbon films is by incorporating hydrogen into the film. Such incorporation may be accomplished by sputtering in an argon atmosphere mixed with hydrogen or a hydrogen-containing gas, such as methane or other hydrocarbons.

Magnetron sputtering processes have been developed which have been somewhat successful in achieving high throughput. For example, U.S. Pat. Nos. 4,735,840 and 4,894,133 issued to Hedgcoth on Apr. 5, 1988 and Apr. 16, 1990, respectively, describe a high volume planar d. c. magnetron in-line sputtering apparatus which forms multilayer magnetic recording films on disks for use in Winchester-type hard disk technology. The apparatus includes several consecutive regions for sputtering individual layers within a single sputtering chamber through which preheated disk substrates mounted on a pallet or other vertical carrier proceed at velocities up to about 10 mm/sec (1.97 ft/min), though averaging only about 3 mm/sec (0.6 ft/min). The first sputtering region deposits chromium (1,000 to 5,000 Å) on a circumferentially textured disk substrate. The next region deposits a layer (200 to 1,500 Å) of a magnetic alloy such as CoNi. Finally, a protective layer (200 to 800 Å) of a wear- and corrosion-resistant material such as amorphous carbon is deposited.

The apparatus is evacuated by mechanical and cryo pumps to a base pressure about $2\times10^{-7}$ Torr. Sputtering is performed at a relatively high argon pressure between 2 and $4\times10^{-2}$ Torr (20 to 40 microns) to eliminate anisotropy due to obliquely incident flux.

In optimizing a sputtering process to achieve high throughput, consideration should be given to other time-influenced aspects of the process apart from the sputtering rate. For example, substrate heating is typically accomplished with heaters requiring an extended dwell time to warm substrates to a desired equilibrium temperature. In addition, substrate transport speeds through the sputtering apparatus have been limited with respect to mechanisms using traditional bottom drive, gear/belt-driven transport systems. Such bottom drive systems generally have intermeshing gears and may be practically incapable of proceeding faster than a particular rate due to rough section-to-section transitions which may dislodge substrates from the carrier and/or create particulate matter from gear wear which contaminates the disks prior to or during the sputtering process. Thus, overall process throughput would be further enhanced by the employment of heating and transport elements which require minimal time to perform these functions.

Generally, prior art sputtering devices utilize relatively unsophisticated means for controlling the sputtering processes described therein. Such control systems may comprise standard optical or electrical metering monitored by a system operator, with direct electrical or electro-mechanical switching of components utilized in the system by the system operator. Such systems have been adequately successful for limited throughput of sputtered substrates. However, a more comprehensive system is required for higher throughput sputtering operations. Specifically, a control system is required which provides to the operator an extensive amount of information concerning the ongoing process through a relatively user-friendly environment. In addition, the control system must adequately automate functions both in series and in parallel where necessary to control every aspect of the sputtering system. Further, it is desirable to include within such a control system the capability to preset a whole series of operating parameters to facilitate rapid set-up of the system for processes employing myriad sputtering conditions.

SUMMARY OF THE INVENTION

Thus, an object of the present invention is to provide a high throughput sputtering process and apparatus.

A further object of the present invention is to provide a control system for the apparatus and process which continuously monitors and facilitates alteration of film deposition process parameters.

A further object of the present invention is to provide a high throughput sputtering apparatus with a centralized electronic control system.

An additional object of this invention is to provide the above objects in a means by which sputtering is achieved in a highly efficient, contaminant-free environment.

An additional object of this invention is to provide a highly versatile, contaminant-free means for transporting substrates through the apparatus and process.

A further object of this invention is to transport substrates through the sputtering apparatus by means of an overhead, gearless transport mechanism.

A further object of this invention is to provide a transport mechanism for carrying a plurality of substrates, each at a user-defined, variable speed.

A further object of this invention is to maintain a contaminant-free environment within the sputtering apparatus by means of a high speed, high capacity vacuum pump system.

A further object of this invention is to provide a magnetron design allowing efficient erosion of target material during the sputtering process.

A further object of this invention is to provide a high throughput sputtering apparatus which achieves and maintains a uniform substrate surface temperature profile before film deposition.

A further object of this invention is to provide a highly isotropic film by minimizing deposition by target atoms impinging on the substrate surface at high angles of incidence.

A further object of this invention is to provide high throughput sputtering apparatus which minimizes oxidation of the chromium underlayer before magnetic film deposition.

An additional object of the present invention is to provide high quality thin magnetic films on magnetic recording media with superior magnetic recording properties.

A further object of this invention is to provide high quality thin cobalt-chromium-tantalum (CoCrTa) films with superior magnetic recording properties.

A further object of this invention is to provide high quality sputtered thin magnetic films circumferentially oriented along the easy magnetic axis.

A further object of this invention is to provide high throughput sputtering apparatus for high quality thin carbon films with superior wear, hardness, corrosion and elastic properties.

A further object of this invention is to provide a method for depositing wear-resistant carbon films comprising sputtering in the presence of a hydrogen-containing gas.

A further object of this invention is to provide an improved method for sputtering carbon films using either an electrically biased or grounded pallet.

These and other objects of the invention are accomplished in a high throughput sputtering apparatus and process capable of producing sputtered substrates at a rate of up to five times greater than the prior art. An apparatus in accordance with the present invention provides a single or multi-layer coating to the surface of a plurality of substrates. Said apparatus includes a plurality of buffer and sputtering chambers, and an input end and an output end, wherein said substrates are transported through said chambers of said apparatus at varying rates of speed such that the rate of speed of a pallet from said input end to said output end is a constant for each of said plurality of pallets. A high throughput sputtering apparatus having a plurality of integrally matched components in accordance with the present invention may comprise means for sputtering a multi-layer coating onto a plurality of substrates, said means for sputtering including a series of sputtering chambers each having relative isolation from adjacent chambers to reduce cross contamination between the coating components being sputtered onto substrates therein, said sputtering chambers being isolated from ambient atmospheric conditions; means for transporting said plurality of substrates through said means for sputtering at variable velocities; means for reducing the ambient pressure within said means for sputtering to a vacuum level within a pressure range sufficient to enable sputtering operation; means for heating said plurality of substrates to a temperature conducive to sputtering said multi-layer coatings thereon, said means for heating providing a substantially uniform temperature profile over the surface of said substrate; and control means for providing control signals to and for receiving feedback input from, said means for sputtering, means for transporting, means for reducing and means for heating, said control means being programmable for allowing control over said means for sputtering, means for transporting, means for reducing and means for heating.

A process in accordance the present invention includes: providing substrates to be sputtered; creating an environment about said substrates, said environment having a pressure within a pressure range which would enable sputtering operations; providing a gas into said environment in a plasma state and within said pressure range to carry out sputtering operations; transporting substrates at varying velocities through said environment a sequence of sputtering steps within said environment and along a return path external to said environment simultaneously introducing the substrates into said environment without substantially disrupting said pressure of said environment, providing rapid and uniform heating of said substrates to optimize film integrity during sputtering steps, and sputtering said substrates to provide successive layers of thin films on the substrates; and, removing the sputtered substrates without contaminating said environment.

BRIEF DESCRIPTION OF THE DRAWINGS

The invention will be better understood by reference to the figures of the drawings wherein like numbers denote like parts throughout and wherein:

FIG. 5 is a simplified perspective view of the means for texturing disk substrates used in the process of the present invention.

FIG. 7 is a sectional magnified view of the texturing of a disk surface provided by the means for texturing disclosed in FIG. 5.

DESCRIPTION OF THE PREFERRED EMBODIMENT

A. Introduction

Described herein is an apparatus and method for applying multilayer thin films to a substrate. The apparatus of the present invention is capable of applying the multilayer coatings to any given substrate within a time frame of approximately five minutes. The apparatus and process may provide production throughputs on the order of at least five times greater than those of prior art multi-layer coating processes.

Other advantages of the sputtering apparatus and method for high throughput sputtering include: flexibility with respect to the composition of the multilayer films applied and the types of substrates to which they are applied; easily interchanged coating components; a novel means for heating substrates; a novel sputtering magnetron design; a variable speed, overhead, noncontaminating substrate transportation system; and a comprehensive, centralized, programmable electronic means for controlling the apparatus and process. In addition, when the process and apparatus are used for providing magnetic coatings for substrates, such as disks, to be utilized in hard disk drives using Winchester-type technology, also disclosed herein are: a unique disk texturing method for improving the disk's magnetic recording properties, and a novel disk carrier (or pallet) design which contributes to uniform substrate heating characteristics in a large, single, high capacity pallet.

The high throughput process and apparatus of the present invention accomplishes the objectives of the invention and provides the above advantages by providing a comprehensive in-line sputtering system utilizing matched component elements to process multiple large single sheet or pallet transported discrete substrates in a continuous, variable speed, sputtering process wherein each substrate has a start-to-finish process time which is relatively constant. Such an apparatus and method can process up to 3,000 95 mm disk substrates, and 5,300 65 mm disk substrates, per hour. In the disk drive industry where cost savings per disk on the order of a few cents are a distinct advantage, the system manufactures 95 mm disk substrates at a cost of $8.00 per disk as opposed to $12.00 per disk for other sputtering apparatus. Crucial to this process and apparatus are matching and optimizing such elements as disk preparation, including texturing and cleaning, provision of a sputtering environment with a sputtering apparatus, through an optimal vacuum pump system, transporting disk substrates through the sputtering environment in a high volume, high speed, contaminant-free manner without disturbing the sputtering environment, heating the substrates within the environment to optimal thermal levels for sputtering, and sputtering the substrates through a series of substantially isolated, non-crosscontaminating sputtering steps.

Figure 4:
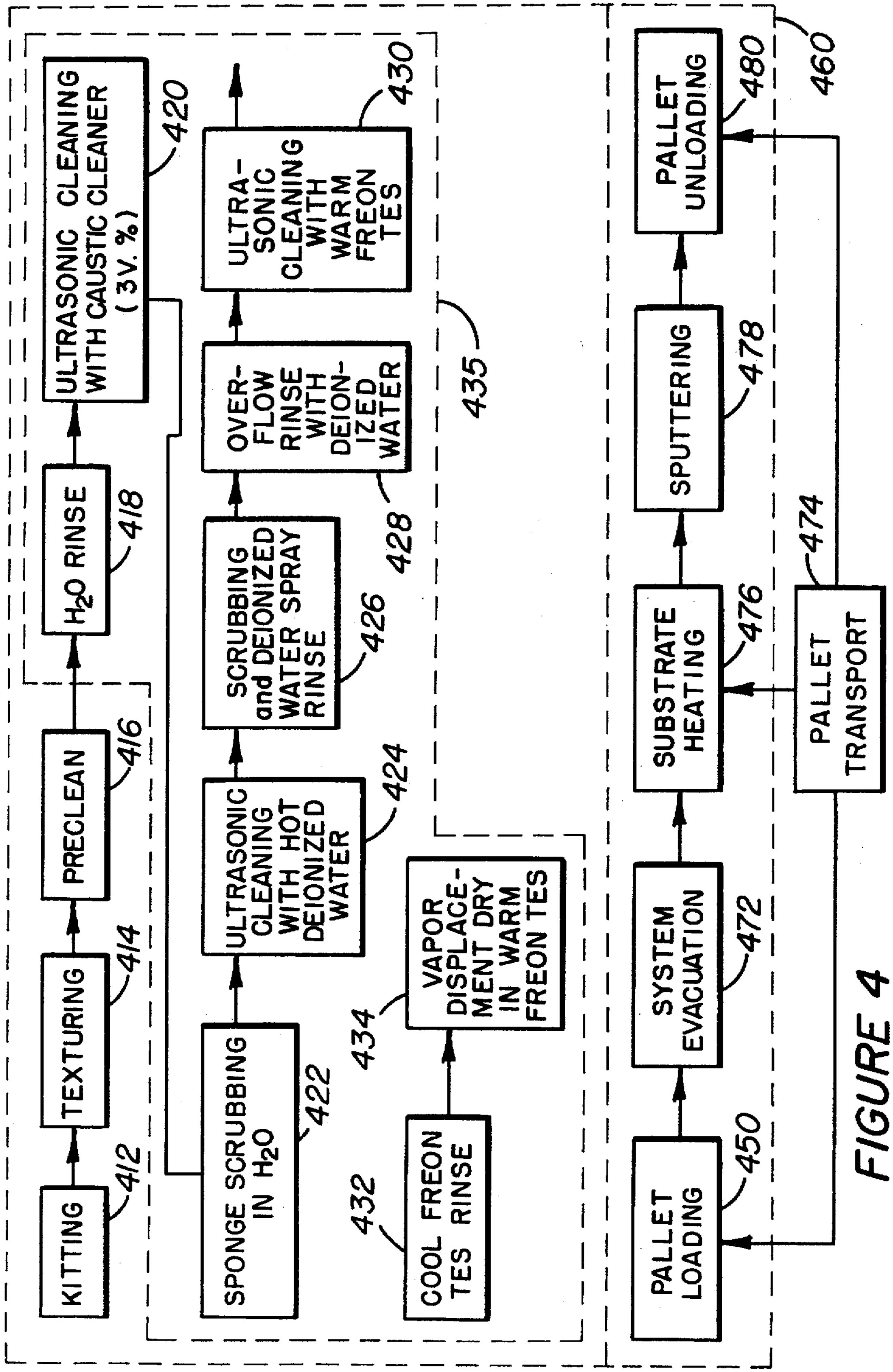
FIG. 4 is an overview block diagram of the sputtering process of the present invention.

In general, application of multilayer films to a substrate involves two basic steps: preparation of the substrate and film deposition. FIG. 4 represents a general overview of the process for applying thin films to a disk substrate according to the present invention. In particular, FIG. 4 outlines the process steps for providing a single or multilayer film on a substrate, for example, a nickel-phosphorus plated aluminum disk for use in Winchester-type hard disk drives. It will be recognized by those skilled in the art that the steps outlined in FIG. 4 may be modified, as required, depending on the particular type of substrate to be coated or thin film to be applied.

Substrate preparation process 410 of FIG. 4 includes: kitting process 412; disk texturing process 414, disk pre-cleaning 416; water rinse 418; ultrasonic cleaning with caustic cleaner 420; a sponge scrubbing in water 422; an ultrasonic cleaning in hot deionized water 424; scrubbing and deionizing water spray rinse 426; overflow deionized water rinse 428; ultrasonic cleaning of the disks with warm FREON TES 430; a cool FREON TES rinse 432; and vapor displacement drying in warm FREON TES 434. Each of the aforementioned steps outlined in FIG. 4 is discussed in further detail in Section C of the specification.

Subsequent to the substrate preparation process 410, the clean, dry disk substrates may be provided to pallet loading process 450, wherein the disk substrates are provided to a substrate carrier which transports the disk substrates through coating process 460.

Figure 1:
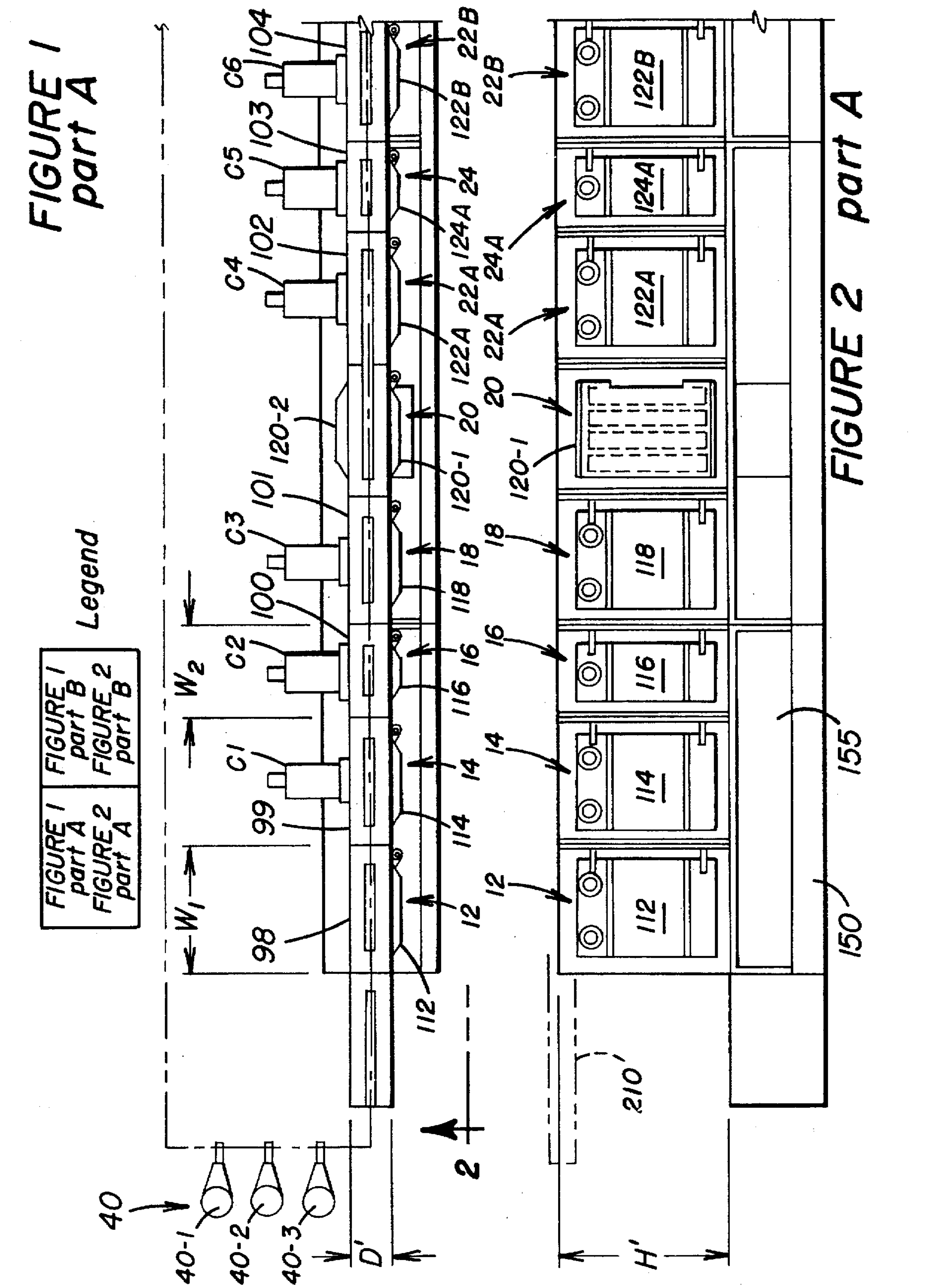
FIG. 1 is a system plan view of the sputtering apparatus of the present invention.
Figure 2:
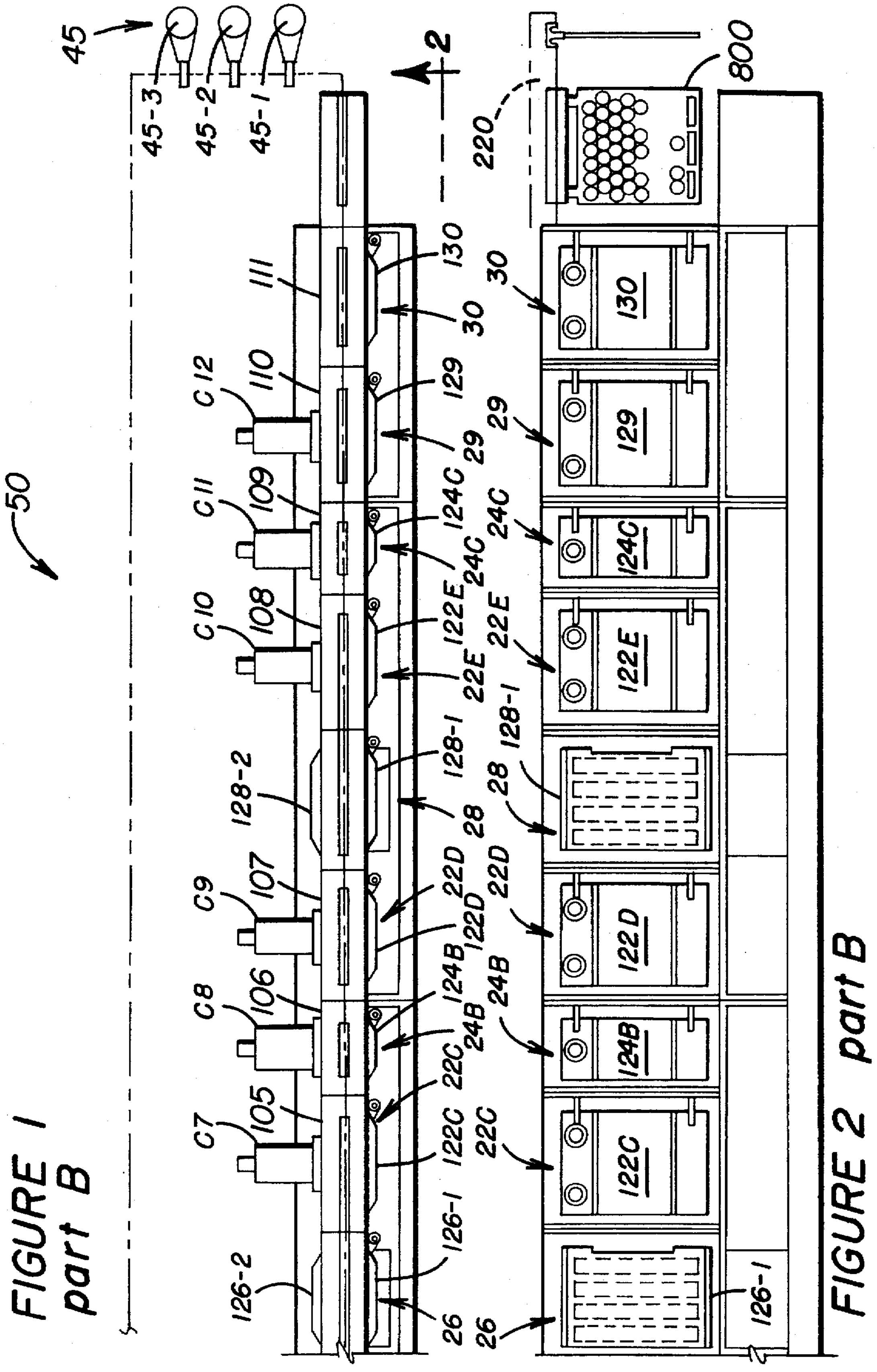
FIG. 2 is a cross sectional view along line 2—2 of the sputtering apparatus of the present invention as shown in FIG. 1.
Figure 3:
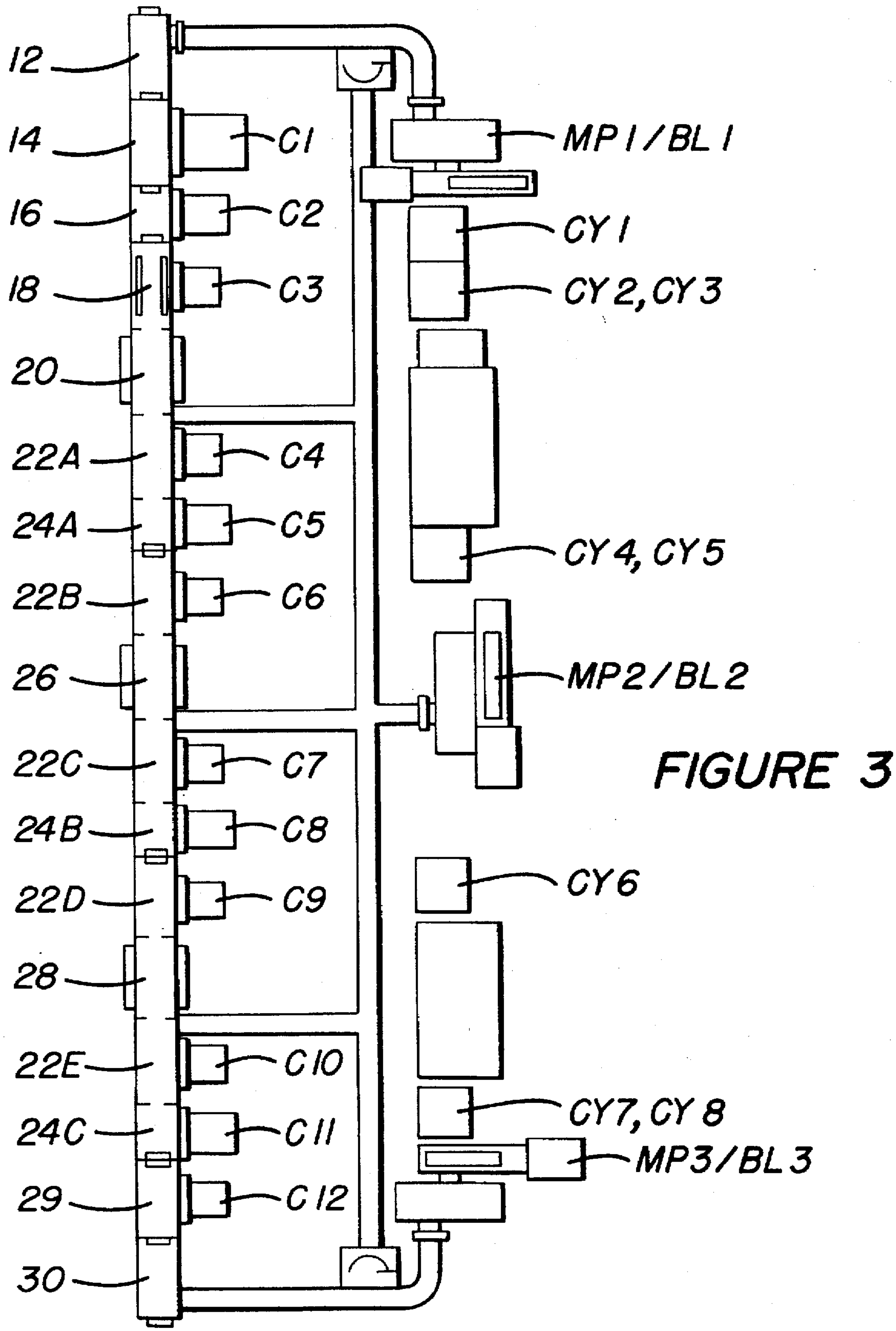
FIG. 3 is a plan view of the sputtering apparatus of the present invention illustrating the physical relationship of the power supply and pumping subsystem components.

In coating process 460, disk substrates are provided to a coating apparatus, such as sputtering apparatus 10 shown in FIGS. 1 and 2, for provision of single or multilayer film thereon. The steps involved in coating process 460, such as in, for example, sputtering apparatus 10 of the present invention, involve: a system evacuation process 472 wherein specific chambers of the sputtering system are evacuated to a pressure of approximately $10^{-7}$ Torr and backfilled with a suitable sputtering gas, such as argon; a substrate heating process 476, wherein the substrates are raised to a temperature conducive to optimal film deposition; and a sputtering process 478 wherein the films are deposited on the substrates. Subsequently, the substrates are provided to an unload process 480. A process for transporting pallets 474 provides means for transporting the substrates through the above processes.

Each of the aforementioned steps with respect to applying the multilayer films to the substrates is discussed below in detail in separate sections of this specification.

B. Sputtering Apparatus Overview

Sputtering apparatus 10, used to apply a single or multilayer film to one or more substrates, will be discussed generally with reference to FIGS. 1A, 1B, 2A, 2B, and 3. Sputtering apparatus 10 provides a high throughput, in-line, magnetron sputtering process which allows reduced manufacturing costs per substrate by performing the coating sequence in a high volume manner. As will be discussed in detail below, single or multilayer film can be applied to a single side, or both sides, individually or simultaneously, of a single large sheet substrate, or to discrete substrates, such as disks mounted in a rack, pallet or other substrate carrier.

Generally, substrates are provided through multiple sputtering chambers 20, 26, 28 in apparatus 10 at a rate of speed, such as 3–6 feet/minute, and through heater chambers 14,16 and buffer chambers 12, 18, 22A–E, 24A–24C, 29 and 30, at a second rate of speed, such as 12 feet/minute. Through carefully matched elements, each of the substrates has a constant speed through apparatus 10.

Sputtering apparatus 10 includes seventeen (17) chamber modules 12–30 generally comprised of two basic types. A first type is configured for use as lock modules (12, 30), deposition process modules (20, 26, 28) or dwell modules (14, 18, 22A–22D and 29). A second type of module is configured for use as high vacuum buffer modules (16, 24A–24C) to provide process separation between deposition modules as discussed below.

Also shown in FIGS. 1 and 2 is substrate carrier return path 50 of the transport system of the present invention. Preferably, return path 50 is provided to allow an ample number of substrate carriers to return from exit lock 30 for reuse in sputtering apparatus 10 in a continuous process, thereby reducing production delays and increasing overall process production speed. In addition, FIGS. 1 and 2 illustrate robotic pallet loading station 40 and robotic pallet unloading station 45, arranged along the transport system return path 50, for automatic loading and unloading, respectively, of the disk substrates into racks or pallets. As discussed in detail below, the substrate transport system utilizes a plurality of individual transport beam platforms, each including one or more optical or proximity position sensors, to move substrates through sputtering apparatus 10 and along return path 50, and to monitor the position of each substrate carrier within the transport system. Transfer speeds of the substrate carriers throughout the transport system may be adjustably varied from 0 to 24 ft/min. It should be noted that the upper limit of substrate carrier transport speed is constrained by the process limits of sputtering apparatus 10. Each individual drive stage (2200, discussed in Section F of this specification) is identical and thus has identical upper and lower speed limits.

Figure 12:
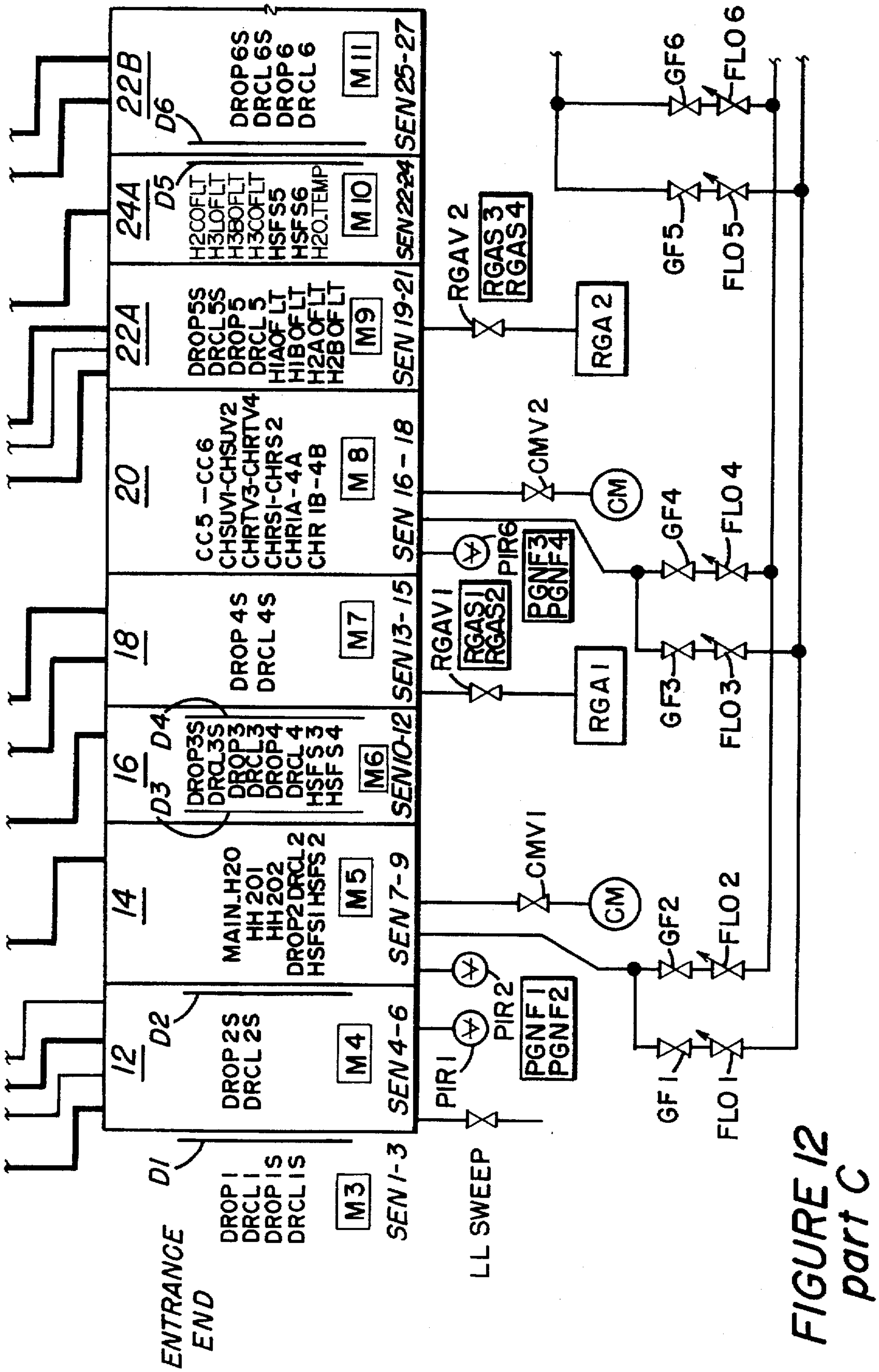
FIG. 12 is an overview diagram of the pumping system used with the apparatus of the present invention.
Figure 12:
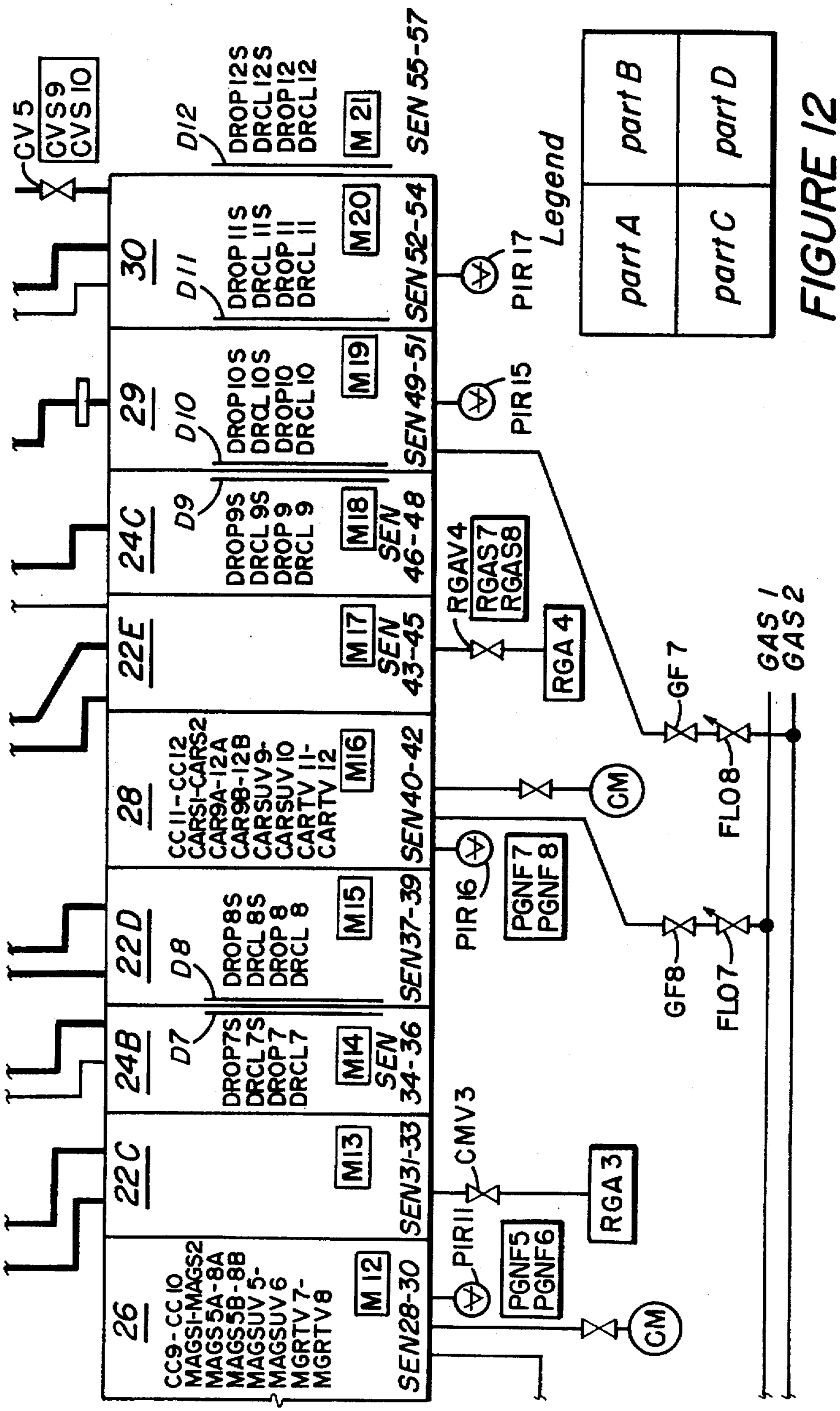

Twelve (12) pneumatically operated doors D1–D12 are placed between specific chamber modules 12–30 of sputtering apparatus 10. Doors D1–D12 are located as generally represented in FIG. 12 and are positioned as follows: door D1 isolates chamber 12 from the ambient environment; door D2 isolates load lock chamber 12 from main ("dwell") heating chamber 14; door D3 isolates main heating chamber 14 from first buffer-passby heating chamber 16; door D4 isolates buffer chamber 16 from first dwell chamber 18; doors D5–D6 isolate second buffer chamber 24A from third dwell chamber 22B; doors D7–D8 isolate third buffer chamber 24B from fifth dwell chamber 22D; doors D9–D10 isolate fourth buffer chamber 24C from exit buffer 29; door D11 isolates exit buffer chamber 29 from exit lock chamber 30; and door D12 isolates exit lock chamber 30 from the ambient environment.

With reference to FIGS. 1–3 and 12, the general arrangement of chamber modules 12–30 will be hereinafter discussed. Load lock chamber 12 is essentially an isolation chamber between the ambient environment and chambers 14–29 of sputtering apparatus 10. Load lock chamber 12 is repeatedly evacuated between a pressure of approximately 50 mTorr and vented to ambient atmospheric conditions. Generally, sputtering within apparatus 10 takes place in an evacuated environment and chambers 16–29 are evacuated to the pressure of approximately $10^{-7}$ Torr, before argon gas is allowed to flow into the chambers to achieve a suitable sputtering pressure. Load lock chamber 12 is constructed of one-inch thick type 304 stainless steel and has a width $W_1$ of approximately 39 inches, length $L_1$ of approximately 49 inches, and a depth $D_1$, of approximately 12 inches as measured at the exterior walls of the chamber. The use of electropolished stainless steel in load lock chamber 12 and all other chambers in apparatus 10 minimizes particulate generation from scratches and other surface imperfections. Chambers 14, 18, 20, 22A–22D, 24A–24C, 26 and 28–30 have roughly the same dimensions. The internal volume of load lock chamber 12 is reduced to approximately three cubic feet by the installation therein of volume-displacing solid aluminum blocks bolted to the chamber door and rear wall (not shown) to facilitate faster evacuation times. Pumpdown of load lock chamber 12, and sputtering apparatus 10 in general, is discussed below in Section F of the specification.

After door D1 is pneumatically operated to allow a single large substrate or pallet to enter load lock chamber 12 at the initiation of processing by sputtering apparatus 10, load lock chamber 12 will be evacuated to a pressure of 50 microns (50 mTorr). Chambers 16–29 will have been evacuated to a base pressure of about $10^{-7}$ Torr and then backfilled with argon to the sputtering pressure (approximately 9–12 mTorr) prior to the entrance of a substrate into load lock chamber 12. Chamber 14 will have been evacuated previously to a pressure of approximately $10^{-5}$–$10^{-7}$ Torr. Load lock chamber 12 is thus mechanically evacuated and pressurized at a level intermediate to that of chambers 14–29, and external ambient pressures, to provide isolation for the downstream sputtering processes occurring in chambers 14–29.

Dwell heating chamber 14 serves two functions: it acts as an entrance buffer between load lock chamber 12 and the internal sputtering environment in chambers 16–29; and it serves as a heating chamber for increasing the substrate temperature to optimize film deposition. Chamber 14 includes eight banks of quartz lamp heating elements, four banks mounted to outer door 114 and four banks mounted opposite thereof on rear chamber wall 99. Door D2, separating load lock chamber 12 and dwell heating chamber 14, is a high vacuum slit valve. Details of the heating banks located in dwell heating chamber 14 are discussed in Section H of this specification.

During processing of a substrate, dwell heating chamber 14 is pumped to a pressure of approximately $10^{-5}$–$10^{-7}$ Torr before the substrate present in load lock chamber 12 is allowed to pass into dwell heating chamber 14. A pressure of $10^{-4}$–$10^{-7}$ Torr helps eliminate the effects of outgassing from the substrate in dwell heating chamber 14. Subsequently argon backfilling is provided to raise the pressure to approximately 9–12 mTorr, equalizing the environment in dwell heating chamber 14 with that in chambers 16–29. The substrate may thereafter remain in dwell heating chamber 14 for the duration of time necessary for the exposure of the substrate to the lamps to have its desired effect.

First buffer-passby heating chamber 16 is a chamber module of the second type having a width $W_2$ of approximately 26 inches by a height H' of approximately 49 inches by a depth D' of approximately 12 inches. In general, buffer chambers 16 and 24A–C are positioned between dwell chambers 18A and 22A–D to separate the ongoing sputtering processes within apparatus 10, thereby reducing cross-contamination of coating components.

First buffer-passby heating chamber 16 includes a heating assembly comprising ten banks of quartz lamp heating elements, five mounted to outer door 116 and five to the rear chamber 100 wall opposite thereof. Passby heating chamber 16 is designed to insure uniform substrate temperature prior to film deposition. The structure of the passby heating assembly is discussed in detail in Section H of this specification.

Three coating modules—chromium deposition chamber 20, magnetic deposition chamber 26, and carbon deposition chamber 28—having dimensions roughly equal to those of load lock chamber 12 and constructed of type 304 electropolished stainless steel, may be utilized to sputter single or multilayer films on a substrate passing through apparatus 10. Four pairs of d. c. magnetron sputtering cathodes are mounted, four magnetrons per door, on doors 120-1, 120-2, 126-1, 126-2, 128-1, and 128-2 on both sides of each chamber 20, 26, and 28, respectively. Target materials are mounted to cathodes 2222–2225. Anodes 2338, gas manifolds 2323, and shielding 2230, 2236, 2238 and 2240 are also attached to outer doors 120-1, 120-2, 126-1, 126-2 and 128-1, 128-2. Mounting these components to the doors facilitates target changes and chamber maintenance. Further, conduits (not shown) for power, cooling, and process gases are provided in outer doors 120, 126, 128. Feedthrough conduits are also provided in doors 112, 114, 116, 118, 122A–122E, 124A–124C, 129, and 130 to allow for modification of the sputtering apparatus 10. Details of deposition chambers 20, 26 and 28 are provided in Section I of this specification.

Dwell chambers 18 and 22A–22E are manufactured to have the same dimensions as load lock chamber 12 and provide separation between the buffer modules and the deposition chambers. Dwell modules 18 and 22A–22E allow for substrate transport system runout, if necessary, during multiple substrate processing in sputtering apparatus 10. If desired, additional heating assemblies may be provided in any or all of dwell modules 22A–22E.

Exit buffer module 29 is essentially identical to dwell heating chamber 14, without the dwell heating assembly hardware. Exit buffer module 29 provides a buffer area to facilitate removal of pallets or substrates from sputtering apparatus 10 to exit lock chamber 30 and further isolates the sputtering process from the external environment.

Exit lock chamber 30 is essentially identical to load lock chamber 12 and operates in reverse pumping order, allowing pallets or substrates to be transferred from the evacuated environment of sputtering apparatus 10, to the ambient external environment.

Optimally, sputtering apparatus 10 can simultaneously process up to seven large single sheet substrates or pallets carrying smaller substrates, such as disks. When seven such substrates are simultaneously processed in sputtering apparatus 10, one such substrate is positioned in each of seven chambers, for example, as follows: load lock chamber 12; dwell heating chamber 14; chromium deposition chamber 20; magnetic deposition chamber 26; carbon deposition chamber 28; exit buffer chamber 29; and exit lock chamber 30. The sheer dimensions of sputtering apparatus 10 allow for a plurality of large single sheet substrates, and a plurality of high capacity discrete substrate carrying pallets, or both, to be simultaneously processed. The problems attending the development of such a large scale, high throughput sputtering apparatus, and the solutions adopted, are discussed herein.

Chambers 12–30 are mounted on steel assembly rack 150. Rack 150 includes channels 55 which preferably are used to mount components used with sputtering apparatus 10, such as those used in the electronic control system. It will be understood by those skilled in the art that any suitable arrangement for mounting chambers 12–30 may be made within contemplation of the present invention.

C. Substrate Preparation

Various materials in the form of large single sheet or discrete substrates may be coated in sputtering apparatus 10. Suitable substrates include polished nickel-phosphorus plated aluminum disks, ceramic disks (available from Kyocera Industrial Ceramics Corporation, Los Angeles, Calif., or Corning Glass Corporation, Corning, N.Y.), glass substrates (available from Pilkington Corporation Microelectronics, Ltd., Toledo, Ohio, Nederlandse Philips Bedrijven B. V., The Netherlands, or Glaverbel Corporation Data Storage Glass Products, Belgium), or carbon substrates or graphite substrates (Kao Corporation of Japan). The process and apparatus disclosed herein is discussed with regard to preparation and sputtering of polished nickel-phosphorus plated aluminum substrates, such as disks suitable for use in Winchester-type hard disk drives. As will be understood by those skilled in the art, the system is readily adaptable for use with other types of single sheet or discrete substrates as discussed above.

1. Kitting

In general, polished nickel-phosphorus plated aluminum disks or similar substrates utilized in the manufacture of magnetic recording media for Winchester-type hard disk drives, such as those available from Mitsubishi Corporation or Seagate Corporation, are shipped to magnetic media manufacturers in standard ribbed or slotted shipping cassettes, 25 substrates per cassette. Transfer of the substrates from the shipping cassettes to process cassettes, used in processing the disks through texturing process 414 and up through precleaning process 416, is known as kitting. Kitting must occur in a class 10,000 clean room environment and is generally performed manually.

2. Texturing

It is well known in the art that circumferential texturing or abrading of a substrate surface can cause the hcp "C" axis of a magnetic cobalt-alloy film to orient in a circumferential direction, and thereby supply a more intense and uniform read/back signal to a flying read/write head in a Winchester-type hard disk drive. Texturing the disk substrate also affects the glide properties of the read/write read. Obviously, the texture of the disk surface also provides a limit to the minimum flying height of the read/write head. Texturing of the substrate also prevents stiction which may result should the head land on a smooth, planar area of the disk, thereby resulting in a job-blocking effect, rendering it almost impossible to remove the stuck read/write head from the disk surface, and rendering a disk drive entirely inoperable.

Texturing generally takes place in a class 1,000 clean room and, as previously discussed, any number of well-known methods may be used.

In the preparation of substrates to be coated within sputtering apparatus 10, a plurality of texturing machines, such as Exclusive Design Company's EDC Model C texturing machine, (EDC, 914 South Clairmont, San Mateo, Calif. 94402) are used. A novel modification to each EDC texturing machine provides a unique, diamond-shaped texturing effect. A portion of a disk surface having such texturing is illustrated in FIG. 7.

With reference to FIGS. 5 through 7, texturing process 414 will be hereinafter described in relation to the texturing of discrete disk substrates 510 suitable for use in sputtering apparatus 10.

FIG. 5 is a general disclosure of the texturing portion 500 of texturing machine M.

Generally, texturing of disk substrate 510 is performed using two loops of fixed abrasive tape 515 which are stretched about rubber rollers 520-1, 520-2. Abrasive tape 515 for each roller 520 is provided by two reels, one supply reel and one take-up reel (not shown), in a single feed direction with a portion of abrasive tape 515 looped about rollers 520. Abrasive tape 515 makes only one transition from the supply reel to the take-up reel during a normal texturing cycle. Rollers 520-1 and 520-2 rotate about spindles 522-1 and 522-2, respectively, mounted to oscillation arm 525 of machine M.

A second set of rubber rollers 530-1, 530-2, and associated supply and take-up reels, (not shown), allow for mounting a fine cloth tape 535 to remove excess particulate matter generated by abrasive tape 515 as disk 510 is texturized. Like abrasive tape 515, cloth tape 535 is used only once from supply reel to take-up reel.

Cam assembly 550 causes arm 525, rollers 520-1, 520-2, and abrasive tape 515 to oscillate in the direction of axis X. Cam assembly 550 includes cam wheel 600 fixed by two set screws (not shown) to spindle 560 which is rotated in a counterclockwise direction about axis $Y_1$ by machine M. Cam wheel 600 contacts first and second rollers 570, 575, rotatably mounted to support members 572, 574, respectively, to translate the motion defined by rotation of cam wheels 600 to oscillation arm 525.

In operation, disk substrate 510 is mounted on spindle 540 of machine M and rotated in a clockwise direction about axis $Y_2$ passing through the center of spindle 540. To mount a disk substrate 510, machine M causes rollers 520 and 530 to linearly separate in opposing directions along paths parallel axes $Y_{1-2}$ allowing disk substrate 510 to be inserted and removed by an automatic loading apparatus (not shown) onto spindle 540. Disk substrate 510 is then rotated about axis $Y_2$ in a clockwise direction. Simultaneously thereto, abrasive tape 515 and cloth tape 535 are rotated about rollers 520-1, 520-2 and 530-1, 530-2, respectively, such that rollers 520-2 and roller 530-1 rotate in a clockwise direction, and rollers 520-1 and 530-2 rotate in a counterclockwise direction. Thus, opposing rollers 520-1, 520-2 and 530-1, 530-2 rotate in directions opposite to each other and in a direction opposing the direction of rotation of disk substrate 510, to provide optimal disk texturing and cleaning. As rollers 520 and 530 are rotated, machine M simultaneously rotates spindle 560, and hence cam wheel 600, causing rollers 520 to oscillate about axis X.

As a result of the unique shape cam wheel 600, discussed with reference with FIGS. 6A–6B, a novel cross-hatched type texturing 700 results. With reference to FIG. 7, texturing process 414, discussed above, generally forms diamond-shaped areas 750 defined by a plurality of crossing texture lines 740 provided to a depth of 60 µm. When lines 740 intersect, they define a plurality of angles θ in a range of approximately 6 to 10 degrees. It has been determined that an angle greater than 10 degrees, while providing generally excellent properties of low dynamic friction and low stiction, results in problems with the magnetic recording properties such as bit dropouts or shifts in areas adjacent to intersecting texturing lines. To compensate, a higher coercivity alloy is required on the substrate. These problems are within acceptable levels when angle θ is within a range of 4°–10°. An angle of 6 degrees or less improves the magnetic recording capability of the record media, but sacrifices in stiction and running friction properties of the disk are made for θ less than 6 degrees. Preferably, when rotation $Y_1$ of cam wheel 600 is approximately 6 Hertz, angles θ of approximately 6° will result.

Figure 6A:
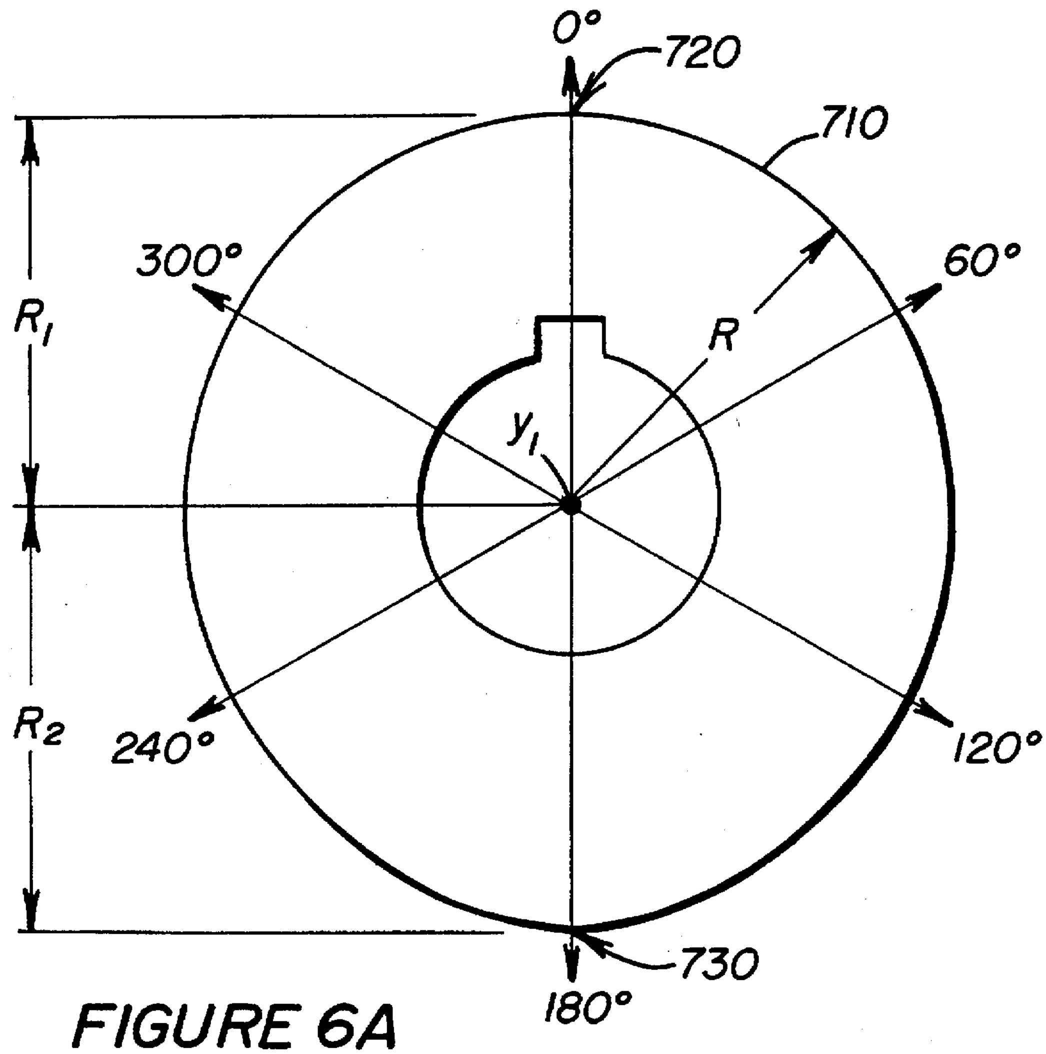
FIG. 6A is a cross sectional view along line 6—6 of the cam wheel utilized in the means for texturing shown in FIG. 5.
Figure 6B:
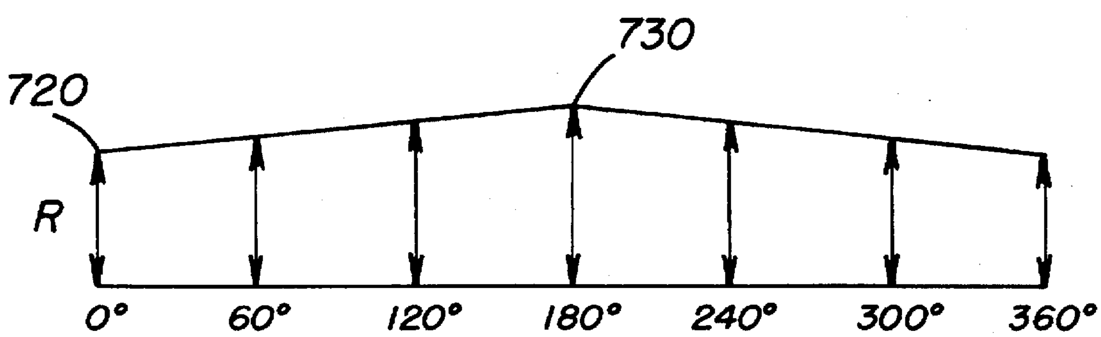
FIG. 6B is a graph representing the radius of the cam shaft shown in FIG. 6A in relation to the rotational position of the shaft.

The structure of cam wheel 600 is detailed in FIG. 6A and 6B. FIG. 6A shows cross-section cam wheel 600 along line 6—6 in FIG. 5. Cam wheel 600 has a shape wherein the radial distance R between axis $Y_1$ and outer edge 710 is at a minimum distance R1 at reference point 720, and at a maximum distance R2 at point 730, 180° opposite point 720.

Currently, two types of cams are used in the machine M for texturing disk substrates 510, depending on the size of disk substrate 510. In one embodiment, the distance R2 equals one inch and distance R1=0.760 inch. FIG. 6B illustrates the distance of all points along outer edge 710 from axis $Y_1$. As can be seen therein, radial distance R from outer diameter 710 to axis Y1 is evenly sloped from the point 720 to point 730, of 180° opposite from point 720. Assuming a line from axis $Y_1$ to point 720 is used as a reference, the distance of all points along outer edge 710 from axis $Y_1$ in one embodiment is as follows: the distance R1 at point 720=0.756 inch, the distance at 60° and 300° angles from point 720=0.840 inch, the distance at 120° and 240° from point 720=0.920 inch, and the distance R2 at 180° from point 720 (point 730)=1.00 inches.

In the above embodiment, cam wheel 600 may be manufactured by beginning with a completely circular cam wheel and removing outer edge 720 of cam wheel 600 in equal linear to rotational increments. For example, at point 730, no material is removed, moving 3 degrees to the left or right, the cutting device is adjusted to move in a distance toward axis $Y_1$ of approximately 0.004 inch, and is thereafter moved 0.004 inch closer to axis $Y_1$ for every 3° of rotational movement about axis $Y_1$. In this manner, one embodiment of cam wheel 600 may be manufactured; those skilled in the art will recognize that various sizes and types of cam wheels may be manufactured in like manner for various sizes of disk substrates 510.

3. Disk Cleaning

Following texturing, the disk surface is cleaned to facilitate uniform film deposition, for example, by performing the following steps, represented as stage 416 in FIG. 4.

During precleaning process 416, each disk surface is rubbed with a polyurethane soap pad. In an automated process, textured disk substrates are removed from process cassettes and placed in a precleaning machine such as the Model MDS1, commercially available from Speed Fam Corporation of Tempe, Ariz. In the Speed Fam machine described above, a plurality of disk substrates is arranged about a large pad assembly in a cylindrical tank, thereby allowing rapid disk cleaning (up to 350 95-mm disks per hour) by performing precleaning process 416 on a number of disk substrates simultaneously.

An additional preparation step involves taking disk substrates through a multi-staged cleaning process 435. This process is illustrated generally in FIG. 4 as stages 418 through 434. Each stage, for example, may represent a separate tank process wherein all tanks are connected with a conveyor system. In addition, transfer between individual stages may be performed by robots.

Specifically, disk substrates 510 are rinsed in water at stage 418, followed by several ultrasonic cleaning stages (420, 424 and 430) and sponge scrubbing stages (422 and 426). The multistage cleaning process 435 processing stages include water rinse 418; ultrasonic cleaning with caustic cleaner 420; a sponge scrubbing in water 422; an ultrasonic cleaning in hot deionized water 424; ultrafiltered deionized water spray rinse 426; overflow deionized water rinse 428; ultrasonic cleaning of disk substrates with warm FREON TES 430; a cool FREON TES rinse 432; and vapor displacement drying in warm FREON TES 434.

Application of ultrasonic power is particularly useful in scouring the newly-applied fine cross-texturing grooves on the disk surface. Stages 420, 424 and 426 combine ultrasonic action in liquids with alkali and aqueous cleaning agents for thorough cleaning. Stage 430 combines ultrasonic action with a degreasing solvent like DuPont's FREON TES.

Multistage cleaning process 435 is preferably performed by a Speed Fam Model MD08 cleaning machine. The Speed Fam model MD08 with certain modifications, is suitable for performing this final cleaning process, to maintain the high level of substrate cleanliness prior to film deposition. Specifically, modifications to the Speed Fam MD08 machine include passivated stainless steel tanks and recirculation lines, brush materials such as polyvinylalcohol, and a highly efficient tank filtration system. In addition, standard process cassette rollers are replaced with highly wear-resistant plastics like DuPont's DELRIN polymethylene oxide. The process regimen 410, as illustrated by FIG. 4, was found to be capable of handling approximately 550–750 disks per hour, using two Speed Fam model MDS1 polishing machines and one Speed Fam model MD08 cleaning machine. Higher processing rates would result with additional process hardware, but may be limited because of the release of FREON TES, a chlorinated fluorocarbon, to the environment.

D. Pallet Design

A unique rack or "pallet" for carrying a number of discrete substrates such as disks utilized in Winchester-type hard disk technology will be discussed with reference to FIGS. 8–11.

Generally, a plurality of magnetic disk sizes are manufactured for Winchester-type hard disk drives; two of the most common include 65 mm and 95 mm diameter disks. It will be understood that the general principles of pallet 800, described herein with reference to a pallet for carrying 95 mm disks, are applicable for pallets equally capable of handling disk substrates of other sizes.

Figure 8:
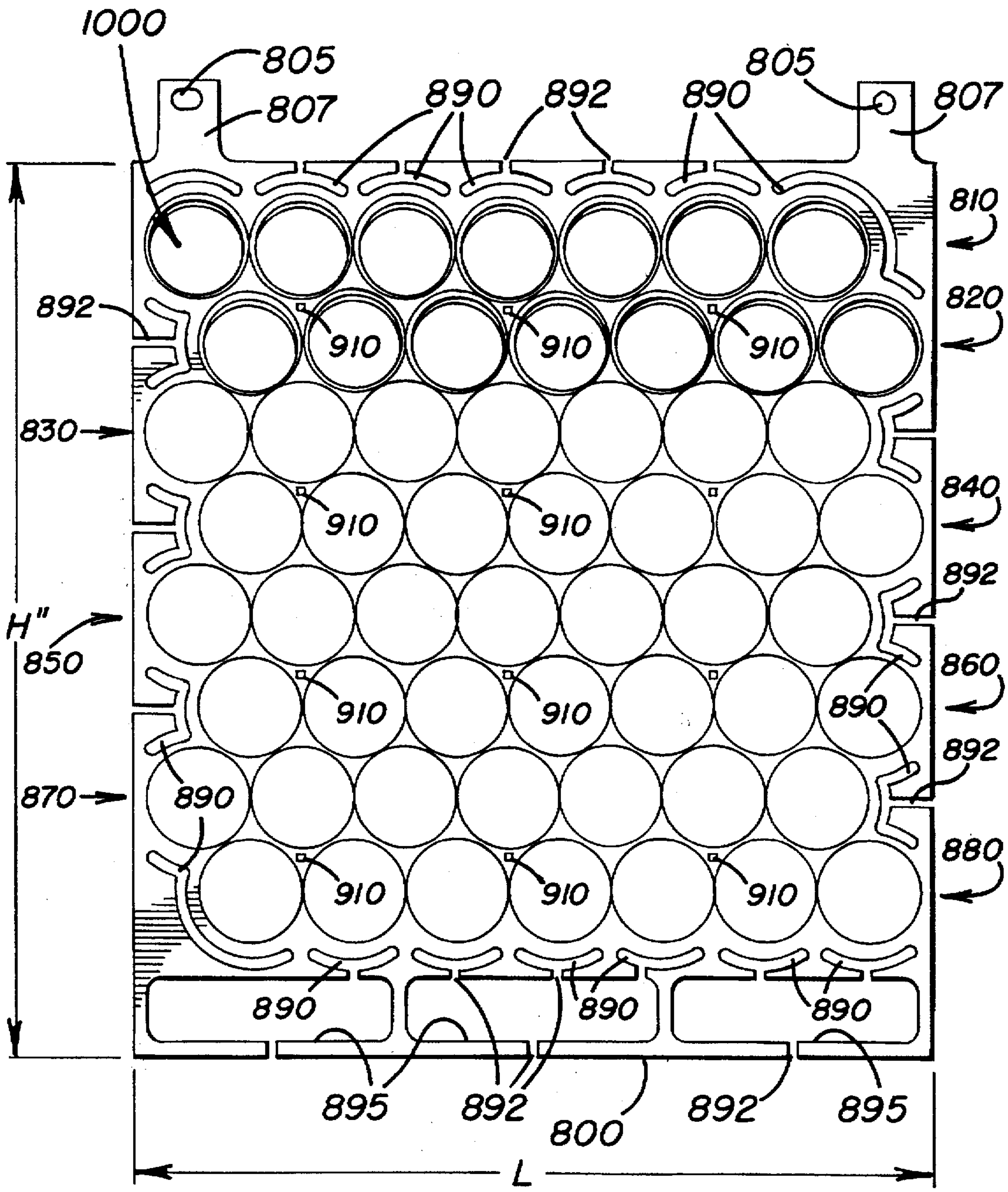
FIG. 8 is a surface view of one embodiment of a pallet for carrying disks through the sputtering apparatus of the present invention.
Figure 9:
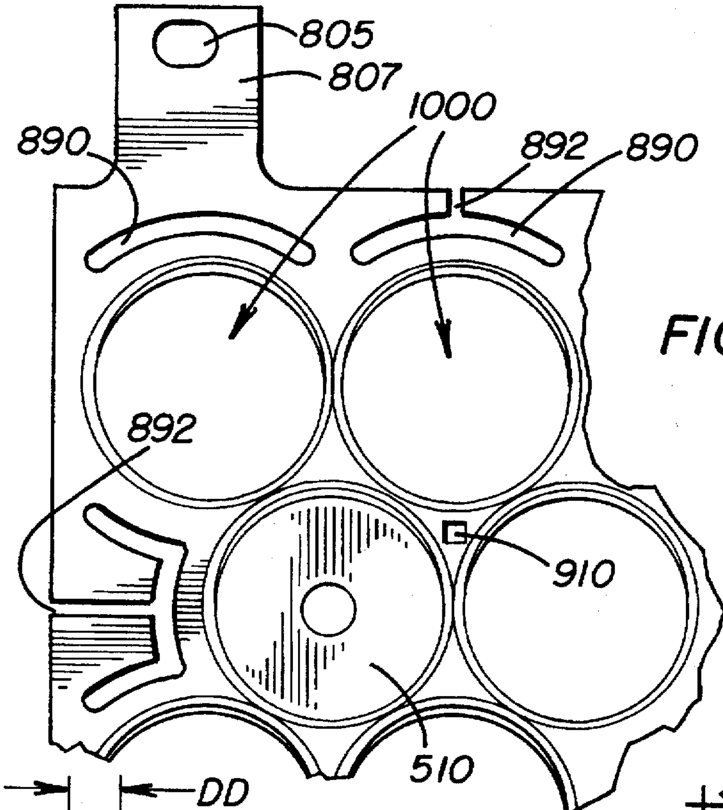
FIG. 9 is a partial, enlarged view of the pallet of FIG. 8.

Pallet 800, shown in FIG. 8, shows 56 substrate carrying regions 1000 for carrying 95 mm diameter disk substrates 510. A pallet designed to carry 65 mm diameter disk substrates has 99 substrate-carrying regions 1000. Pallet 800 may be manufactured from 6061-T6 aluminum, available from the Aluminum Corporation of America (Alcoa), Pittsburg, Pa. or other suitable material. Pallet 800 has a height H" of approximately 34.56 inches, a length L of approximately 31 inches, and a depth DD of approximately 0.25 inch. These dimensions reflect the maximum size pallets or single sheet substrates which may be utilized if sputtering apparatus 10 is made to have dimensions as discussed herein.

In utilizing pallets having the above-mentioned dimensions, several problems arise. Achieving a uniform temperature profile across the surface of the pallet is difficult, especially where thermal expansion of the pallet material occurs at a different rate than that of disk substrates carried therein because of the pallet's greater thickness. Specifically, thermal expansion of the pallet material causes inherent warping of the pallet. Further, thermal expansion reduces the clearance within each substrate-carrying region 1000 around each disk substrate 510, constricting and warping disk substrates 510 undergoing their own thermal expansion, and ultimately precluding uniform film deposition. Addressing thermal expansion incompatibilities between the pallet and disk substrates is more than an issue of material selection. For a high throughput sputtering system, maximizing the substrate-carrying capacity of pallet 800 is equally desirable.

To minimize warping while maximizing the substrate-carrying capacity of pallet 800, substrate-carrying regions 1000 are arranged in a staggered, hexagonal fashion, providing the densest arrangement of disk substrates 510 within the established dimensions of pallet 800. As such, substrate-carrying regions 1000 are arranged in rows 810–880, wherein each substrate-carrying region 1000 in a particular row (e.g., 810) is offset from another substrate-carrying region 1000 in an adjacent row (e.g., 820) by a distance equalling one-half of the total horizontal width of each substrate-carrying region 1000.

In an effort to minimize thermal losses from disk substrates 510 to pallet 800, slots 890 and cavities 895 are provided. Cavities 895 in the lower portion of pallet 800 reduce the surface area of pallet 800 which is subject to thermal expansion, without reducing the substrate-carrying capacity of pallet 800 as the lower portion of pallet 800 does not carry disks beyond the extent of the sputtering flux. Notches 892 compensate for nonuniform thermal expansion across pallet 800 as a result of nonuniform heating across the pallet surface. Specifically, notches 892 allow relatively unrestricted expansion of the edges of pallet 800, thereby avoiding pallet warping.

Reference notches 910 in pallet 800 are provided for use with robotic loading and unloading stations 40 and 45. Specific operation of these stations 40 and 45 is discussed in Section E of the specification.

Figure 10:
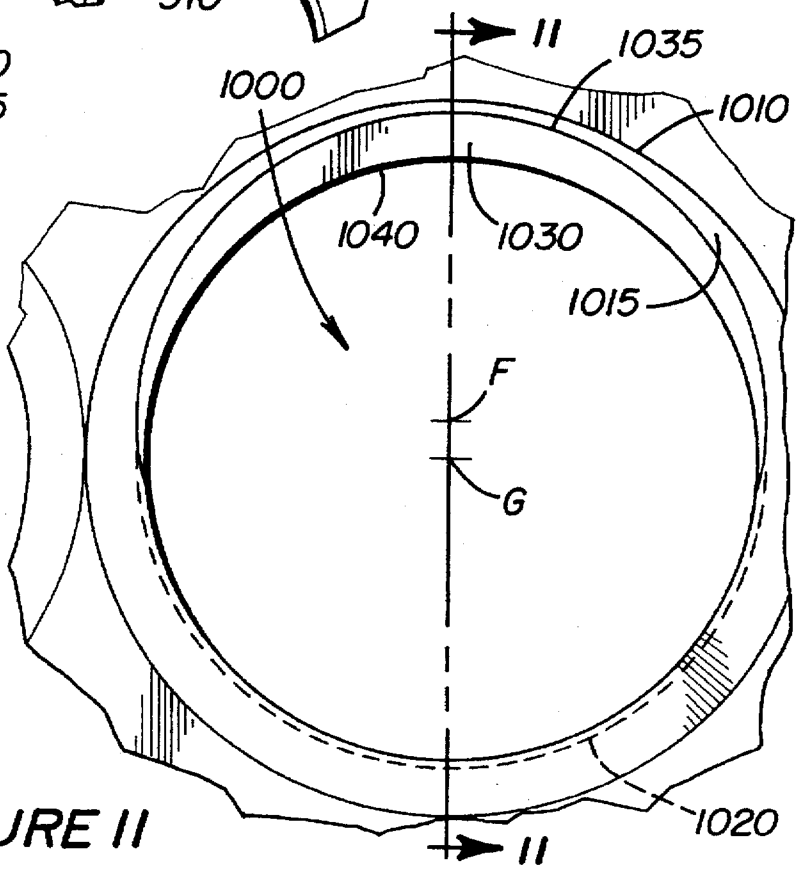
FIG. 10 is a partial, enlarged view of one region for carrying a disk in the pallet of FIG. 9.
Figure 11:
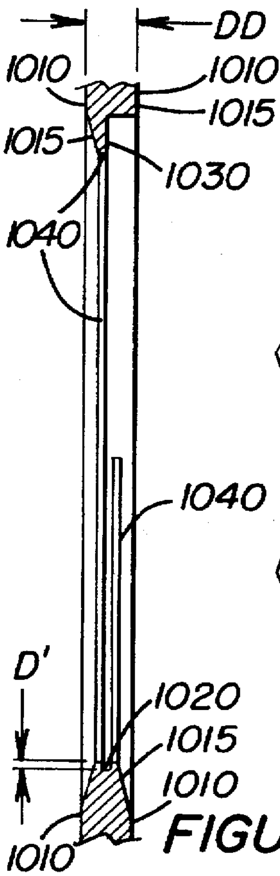
FIG. 11 is a cross sectional view along 11—11 of the disk carrying region shown in FIG. 10.

With reference to FIGS. 10 and 11, details of disk substrate-carrying regions 1000 are hereinafter discussed. Each substrate-carrying region 1000 has a roughly circular orifice with an outer circumferential edge 1010 defined by a beveled edge 1015. Beveled edge 1015 reduces any shielding effect pallet 800 may have on disk substrate 510 mounted in substrate-carrying region 1000 during sputtering. Notch mounting groove 1020 in the lower half of region 1000 allows disk substrate 510 to be seated therein. Lip 1030, at the upper portion of substrate-carrying region 1000, allows manual insertion of disk substrates 510 into substrate-carrying regions 1000. As shown in FIG. 10, lip 1030 defines a semi-circular arc 1035 having a radial distance from axis F of 1.9 inches in the 95 mm embodiment of pallet 800, shown in FIGS. 8–11. Inner edge 1040 is defined by one end of beveled edge 1015 and has a radial distance from axis G of approximately 1.859 inches. Groove 1020 likewise has a semi-circular shape and is positioned a radial distance of 1.883 inches from axis G. Groove 1020 has a depth D' of approximately 0.012 inches.

In practice, disk substrate 510 is seated in groove 1020 and is securely held in place therein. During processing, pallet 800 is relatively stable and disk substrate 510 is securely maintained in substrate-carrying region 1000. The radial distance between axis F and axis G is approximately 0.12 inch, and thus the radial distance between lip region arc 1035 and the base of groove 1020 is 3.903 inches, a distance which is greater than the diameter of a 95 mm disk (3.743 inches). This excess space facilitates disk loading and allows for thermal expansion of disk substrate 510 relative to the pallet 800 during the heating process.

It should be noted that pallet 800 may be passed through sputtering apparatus 10 many times before cleaning, especially of grooves 1020, is required to insure substrate-carrying security within substrate-carrying regions 1000. After approximately 100 production cycles, edge 1040 and groove 1020 must be cleaned due to buildup of deposited layers from constant sputtering in sputtering apparatus 10.

E. Substrate Loading

As discussed briefly with reference to FIG. 1, disk substrates 510 may be provided in pallet 800 by means of an automatic loading process which preferably occurs at a point along transport system return path 50. Robotic loading station 40 is arranged to load disk substrates 510 into pallets 800 just prior to entrance of pallets 800 into load lock chamber 12. Robotic unloading station 45 is preferably positioned to remove disk substrates 510 from pallets 800 just after exit of pallets 800 from exit lock chamber 30.

In the automatic loading/unloading process of the present invention, an automatic pallet loading station 40 and an unloading pallet station 45 built by Intelmatic Corporation of Fremont, Calif. are utilized. Each station uses three Adept Model One robots, controlled by Adept Model CC Compact Controllers and an Elmo Controller operating under conventional control software, tailored for apparatus 10 by Intelmatic Corporation software for controlling the loading processing and sequencing pallet movement. Three robots 40-1, 40-2, 40-3 load pallets 800 in a top to bottom manner, with first robot 40-1 loading the top third of pallet 800, second robot 40-2 loading the middle third of pallet 800 and a third robot 40-3 loading the bottom third of pallet 800. Likewise, three robots 45-1, 45-2, 45-3 unload substrates from pallet 800 in a reverse order to that of robots 40-1, 40-2, 40-3. Specifically, robot 45-1 unloads the bottom third of pallet 800, robot 45-2 then unloads the middle portion of pallet 800 and finally robot 45-3 unloads the top third of pallet 800. Loading and unloading of pallets 800 in this manner ensures that no particulate matter present on pallet 800 or disk substrates 510 falls from the upper portion of pallet 800 to deposit on disk substrates 510 loaded in lower portions of pallet 800 during the loading or unloading process.

The Adept Model One robot and Intelmatic software utilize reference notches 910 in pallet 800 to locate the approximate center of each substrate-carrying region 1000. The Adept robots utilize a single finger-type loading mechanism which engages disk substrates 510 by protruding through the center of each disk substrate 510 and lifts and places disk substrates 510 into grooves 1020 within each substrate-carrying region 1000.

Automatic robots 40-1, 40-2, 40-3 and robots 45-1, 45-2, 45-3 in conjunction with the Intelmatic system, have the capability of loading and unloading, respectively, up to 2,500 disk substrates per hour. Sputtering apparatus 10 has a capability of producing 3,000 95 mm thin magnetic film coated disks per hour. Automatic loading and unloading stations 40, 45 thus represent constraints on production throughput for the present embodiment of the overall sputtering process discussed herein. As will be recognized by those skilled in the art, additional stations may be provided to increase production loading to match apparatus 10 throughput rates.

Pallet 800 may also be manually loaded and unloaded. In manual loading, lip 1030 is used to align the surface of disk substrate 510 with the planar surface of pallet 800 to more accurately provide disk 510 substrate into groove 1020.

F. Pumping System

Sputtering apparatus 10 incorporates a highly efficient, high capacity vacuum pump system, represented schematically in FIG. 12. Preparing sputtering apparatus 10 to carry out the sputtering operation described by the present invention requires that the vacuum pump system achieve two purposes. First, the vacuum pump system must furnish a highly evacuated environment for substantially unobstructed paths between the bombarding species and the target surface, and between dislodged target species and the substrates. Second, the vacuum pump system must minimize contaminant circulation inside sputtering apparatus 10 in order to maintain high film integrity. These goals are achieved simultaneously by virtue of the design of the pumping system of the present invention.

The overall vacuum pump system comprises three mechanical or roughing pumps MP1–MP3, with blowers BL1–BL3, and twelve (12) cryo pumps, C1–C12 including seven 8-inch diameter pumps (C3, C4, C6, C7, C9, C10, and C12), four 10-inch diameter cryo pumps (C2, C5, C8, and C11) for process isolation, and one 16-inch diameter cryo pump C1. A cryo pump model such as is available from CTI Cryogenics, a division of Helix Corporation of Santa Clara, Calif., is suitable for use in the pumping system of the present inventions. Eight compressors CY1–CY8 provide helium gas to cryo pumps C1–C12, with: CY1 supplying C1; CY2 supplying C2; CY3 supplying C3; CY4 supplying C5; CY5 supplying C4, C6 and C7; CY6 supplying C8; CY7 supplying C9, C10 and C12; and CY8 supplying C11.

The overall vacuum system also features a network of valves. Five chamber vent valves CV1–CV5 vent the internal environment of sputtering apparatus 10 to atmosphere. Roughing valves RV1–RV5 isolate mechanical pumps MP1–MP3 and blowers BL1–BL3 from sputtering apparatus 10. Chamber vent valves CV1–CV5 and roughing valves RV1–RV5 allow the apparatus 10 to be divided into five sections allowing each individual section to be vented and pumped down as desired, to facilitate maintenance of sputtering apparatus 10. (See Section K, *System Control Software*.) High vacuum valves HV1–HV12 isolate cryo pumps C1–C3 from apparatus 10 to allow controlled pump-down sputtering apparatus 10 from atmospheric pressure. Valves MP1IV–MP3IV isolate one or more of mechanical pumps MP1–MP3 from the pumping system conduits, allowing flexibility in the number of mechanical pumps operating at a given time. Cryo pump roughing valves CR1–CR12 control contamination out of cryo pumps C1–C12 during a cryopump regeneration.

In operation, mechanical pumps MP1–MP3 and blowers BL1–BL3 perform a pump-down of sputtering apparatus 10 from atmospheric pressure to a level of about 50 mTorr. During the pump-down, high vacuum valves HV1 through HV12 are closed, roughing valves RV1 through RV5 and chamber isolation doors D2 through D11 are open and doors D1 and D12 are closed. Pumps MP1–MP3 and blowers BL1–BL3 evacuate sputtering apparatus 10 to a "crossover" point, which has been selected to be between about 50 microns to 150 microns (50 mTorr to 150 mTorr). When the internal pressure reaches the desired crossover point, the system operator, through the electronic control system, closes roughing valves RV1–RV5 and opens high vacuum valves HV1–HV12. Cryo pumps C1–C12, working in conjunction with compressors CY1–CY8, evacuate the system to about $10^{-5}$ to $10^{-8}$ Torr (0.01 microns to $1\times10^{-5}$ microns). Argon gas flow is thereafter provided through gas manifolds 2323 into chambers 14–29 to a sputtering pressure about 9–12 mTorr (9–12 microns).

When a pallet 800 loaded with disk substrates 510 is ready to proceed into sputtering apparatus 10 through load lock chamber 12, chamber 12 is at atmospheric pressure, and chambers 14 through 29 are at about 10 mTorr (10 microns). Pallet 800 enters from a class 10,000 clean room environment where robotic loading station 40 is positioned. Because the clean room environment is more sterile than that of load lock chamber 12, nitrogen gas is provided through valve LLSWEEP and a vent valve (not shown) in load lock 30 is opened to create a positive outflow from the clean room into load lock chamber 12, prohibiting contaminants from entering the clean room's environment. Ceramic filters are also provided to trap particulate matter generated when nitrogen backfill is provided through LLSWEEP into load lock chamber 12. Sturdy filters, such as Membralox 0.01 micron sintered alumina filters, available from Aluminum Company of America (Alcoa) Separations Technology, Warrendale, Pa., resist flexing over many pumping cycles even at pressures higher than 2000 psi and thereby contribute to the maintenance of a contaminant-free environment within the sputtering apparatus.

After pallet 800 enters load lock chamber 12 and door D1 closes, mechanical pump MP2 and blower BL3 evacuate the load lock chamber 12 down to about 100 mTorr (100 microns). When the crossover point is reached, D2 opens, allowing pallet 800 to proceed into dwell heating chamber 14 where pallet 800 and disk substrates 510 will be preheated in preparation for film deposition. During the heating cycle, some outgassing from pallet 800 and disk substrates 510 occurs, particularly if pallet 800 has been recycled, i.e., has passed through sputtering apparatus 10 at least once without undergoing scheduled cleaning. The carbon remaining on pallet 800 acts as a sponge for water which may be absorbed from the atmosphere when pallet 800 is at any point along return path 50 from a previous sputtering run. Water outgassed (known as 'drag in') in dwell heating chamber 14 is removed from the internal environment of sputtering apparatus 10 by 16-inch cryo pump C1, evacuating dwell heating chamber 14 back down to about $10^{-5}$ Torr (0.01 microns). At this time, a pressure differential on the order of 10 microns (10 mTorr) exists between dwell heating chamber 14 and passby heating chamber 16. Because such a pressure differential can destabilize downstream sputtering processes, argon is used to backfill dwell heating chamber 14 in order to equalize the pressures, as monitored by Pirani gauge PIR2. Once this pressure differential is equalized, door D3 opens, permitting pallet 800 and disk substrates 510 to proceed into dwell chamber 18. A pump, such as model PFC-1000 from Polycold Systems of San Rafael, Calif., connected into dwell chamber 18, removes any residual water outgassed from pallet 800 and disk substrates 510, following additional heating performed in passby heating chamber 16. Removal of this residual water is crucial to eliminate oxidation of the chromium target and underlayer in chromium sputtering chamber 20. Pallet 800 and disk substrates 510 continue through sputtering apparatus 10 and the sputtering operation proceeds as described in Section L.

After the multilayer film is deposited, pallet 800 and disk substrates 510 approach exit lock chamber 30 from exit buffer chamber 29. A pressure differential exists between chambers 29 and 30, on the order of that described in connection with dwell heating chamber 14 and passby heating chamber 16. Argon is used to backfill exit buffer chamber 29 to equalize pressures across door D11, as monitored by Pirani gauge PIR15. Once equalization is accomplished, door D11 opens, allowing pallet 800 with disk substrates 510 to proceed through exit lock chamber 30 and out of sputtering apparatus 10.

Periodically, cryo pumps C1–C12 must be cleaned in order to regenerate the cryogenic capacity of the pumps. More specifically, such cleaning involves clearing the cryo pumps of gases frozen therein. For sputtering apparatus 10, cryo pump regeneration typically takes place during machine down-time scheduled for replacing targets in sputtering chambers 20, 26 and 28.

The cryo pump regeneration process of the present invention is discussed more particularly in Section K of this specification. Generally, cryo pump regeneration is initiated by first closing off all of high vacuum pump valves HV1–HV12, opening roughing sieve valves SVIV1–SVI15 and turning on sieve heaters SVNTR1–SVNTR12, mechanical pumps MP1–MP3 and blowers BL1–BL3. Simultaneously, warm nitrogen ($N_2$) is fed from supply $N_2$ through valves NIF1–NIF12 via heaters NIH1–NIH12 to cryo pumps C1–C12. The nitrogen flow defrosts frozen gases in pumps C1–C12 when C1–C12 reach 290° K., pump MP2 and blower BL2 discharge the contents to the atmosphere external to sputtering apparatus 10. Sieve traps SVIV1–SVIV12 and cryo roughing valves CR1–CR12 insure vapors from hydrocarbon pump oils used in the mechanical pumps do not backflow into and contaminate the internal sputtering environment during the regeneration process. By these means, disk substrates 510 already at various stages within the sputtering apparatus are protected from ambient contaminants accompanying subsequent pallets which enter the sputtering apparatus.

G. Transport Mechanism

With reference to FIGS. 1, 13, 14, and 24, a system for transporting substrates through sputtering apparatus 10 and along return path 50 utilized in the apparatus and process of the present invention, will be hereinafter described.

The transport system of the present invention utilizes a plurality of individually powered transport platforms 2400. Each transport platform 2400 may be individually controlled with respect to motion and speed by controlling a motor assembly (not shown) associated with each platform. Hence, at any given time, only those motor assemblies associated with platforms which are transporting substrates along their lengths at any given time need be powered. Additionally, the transport speed of each individual platform 2400 is user-controlled, with transfer speeds generally selectable within a specific range, allowing substrate transport within sputtering apparatus 10 and return path 50 at varying rates. Each transport platform 2400 is provided with one or more proximity sensors (not shown) which output pallet position signals to the electronic control system of the present invention. This allows the electronic control system and the system operator to identify the location of each and every substrate in sputtering apparatus 10 and along return path 50 at any given time. Three such proximity sensors per transport platform 2400 are provided for each of the 19 platforms used in conjunction with sputtering apparatus 10: 17 platforms in chamber modules 12–30 and two additional platforms at entrance platform 210, at the entrance to load lock chamber 12, and exit platform 220, outside exit lock chamber 30. Twenty (20) transport platforms 2400 are provided along return path 50, each such platform stage along return path 50 having one proximity sensor per platform.

Figure 13:
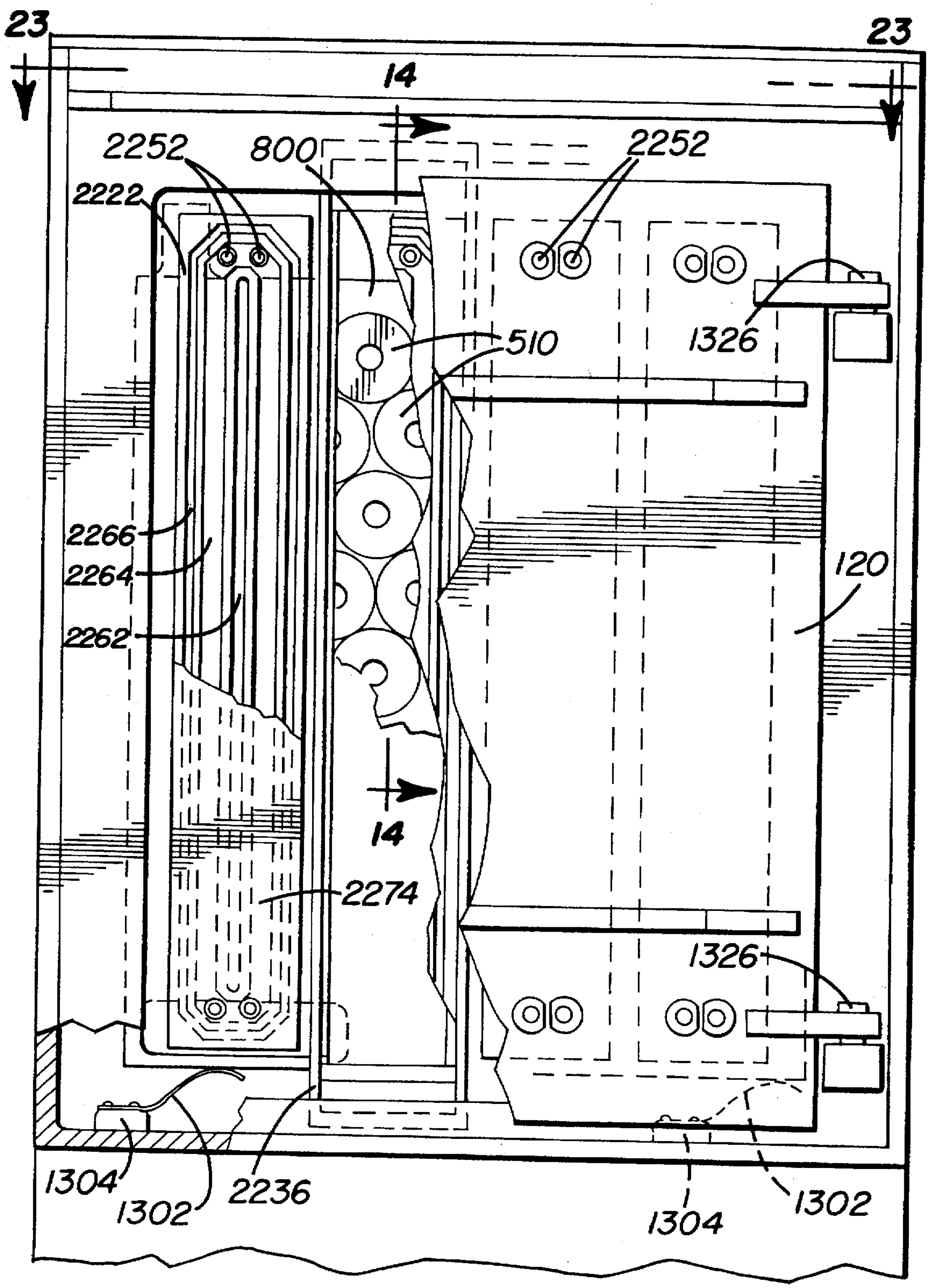
FIG. 13 is a side, partial cutaway view of a sputtering chamber utilized in the apparatus of the present invention.
Figure 14:
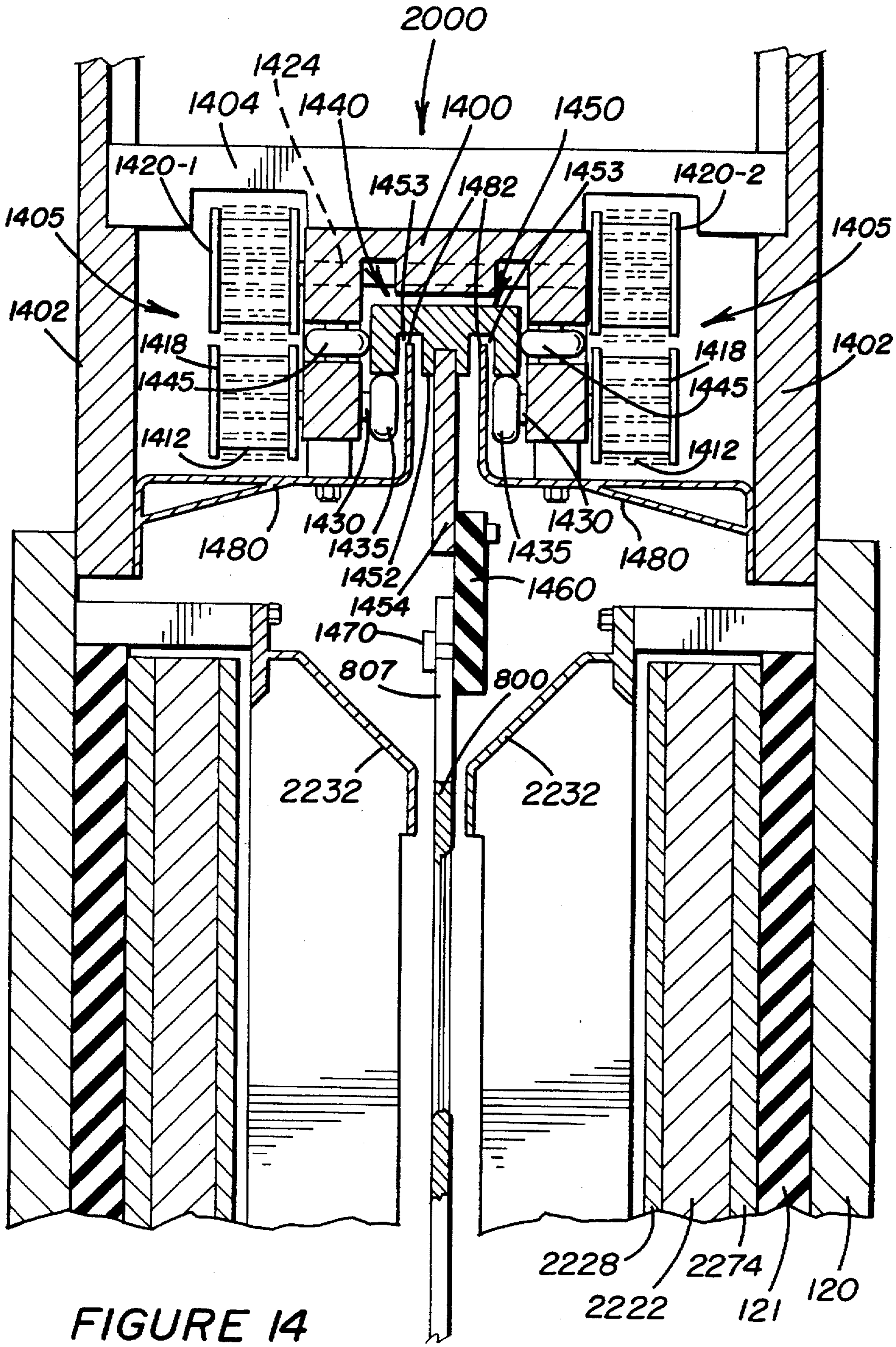
FIG. 14 is an assembled cross sectional view of the substrate transport mechanism, sputtering shields, and pallet viewed along line 14—14 of FIG. 13.
Figure 24:
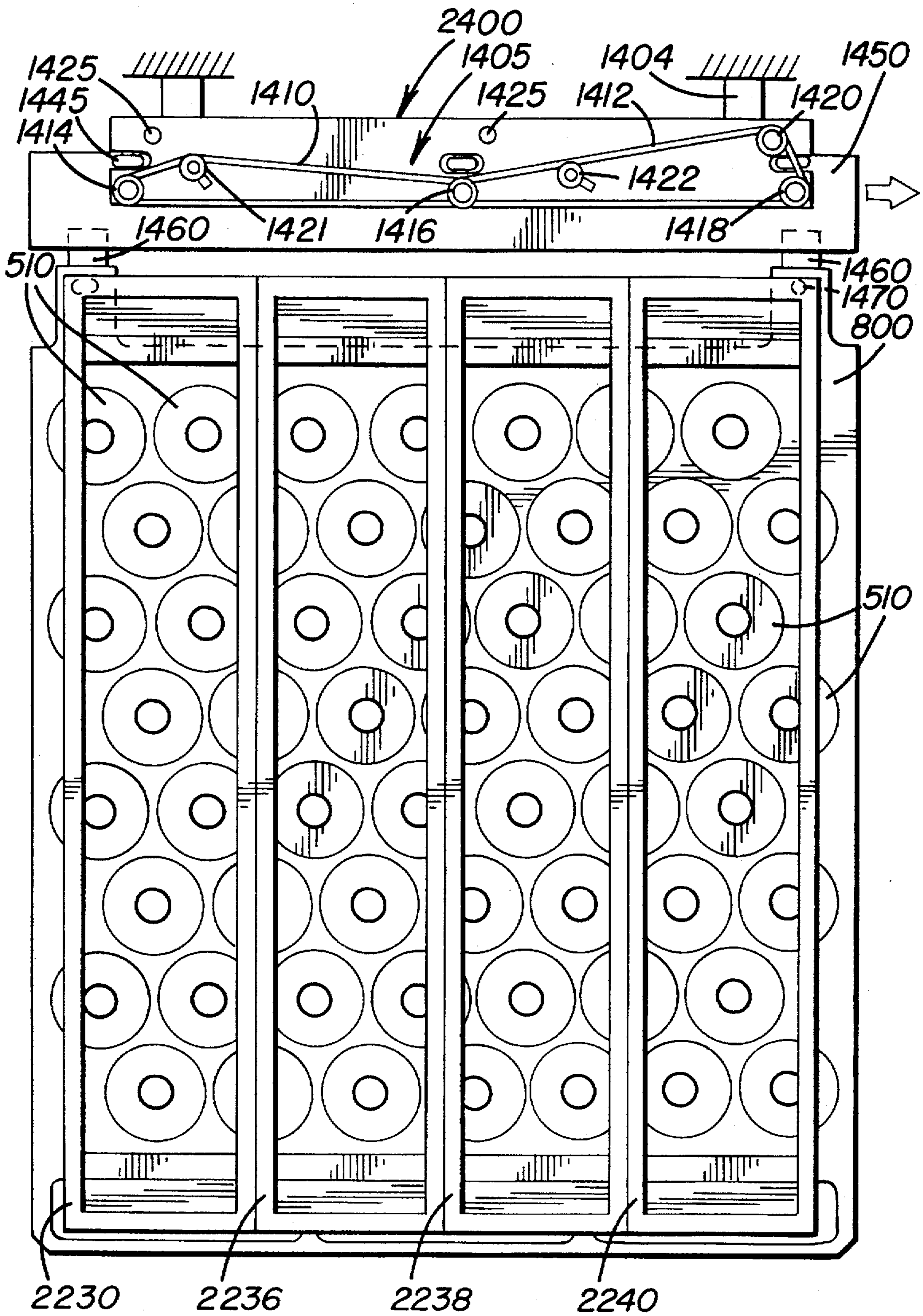
FIG. 24 is a cross-sectional, side view along line 24—24 of FIG. 23.

With reference to FIGS. 13, 14, and 24, each transport platform 2400 includes a motor assembly (not shown) coupled to timing chain assembly 1405, including chains 1410 and 1412, and sprocket wheels 1414–1422, mounted on transport beam 1400. An identical timing chain assembly 1405 is located on the opposite side of each transport platform 2400 (as shown in FIG. 14).

Generally, sprocket wheels 1421 and 1422 have a single set of teeth and are mounted to beam 1400 to provide tension adjustment for timing chains 1410 and 1412, respectively. Wheel 1416 has a double set of teeth, one set engaging timing chain 1410 and one set engaging timing chain 1412. Timing chains 1410 and 1412 may be manufactured from polyurethane; however, in load lock chamber 12 and exit lock chamber 30, stainless steel timing chains are required due to reduce excessive particulate matter generated and circulated during repetitive pump-down and venting cycles when using polyurethane timing chains. Alternatively, stainless steel chains may be utilized throughout the system.

Sprocket wheels 1414 and 1418 may have single or double sets of teeth, as needed. Wheels 1414, 1416 and 1418 are coupled to spindles 1430, passing through beam 1400, which are in turn coupled to rubber roller wheels 1435 in cavity 1440 of beam 1400. Sprocket wheel 1420-1 is coupled to a spindle 1424 passing through beam 1400 into cavity 1440 to translate the motion of sprocket wheel 1420-1 to sprocket wheels 1420-2 located on the opposite side of transport platform 2400. Wheels 1420 generally have two sets of teeth, one set engaging timing chain 1412, the other set engaging a chain or gear assembly coupled to the motor assembly associated with the particular transport platform for powering timing chain assemblies 1405. Through bores 1425 are provided in beam 1400 adjacent to the upper portion of each transport beam 1400 to allow sprocket wheels 1420 to be positioned at any of three points along transport platform 2400 as the positioning of the motor assembly relative to transport platform 2400 requires.

It should be noted that the distance between wheels 1414 and 1416, and the distance between wheels 1416 and 1418, is equal. Further, when assembled into a complete transport system encompassing, for example, both apparatus 10 and return path 50, the distance between respective end wheels 1414 and 1418 on adjacent platforms is equal to the distance from wheels 1414 and 1418 to wheels 1416. Thus, the inter-roller spacing of rubber wheels 1435 is equal through the entire transport system.

Substrate carrier 1450 is receivable in interior cavity 1440 of transport beam 1400. Substrate carrier 1450 includes E-beam assembly 1452 and substrate mounting member 1454. E-beam assembly 1452 enters cavity 1440 seated atop rubber wheels 1435 and is transported along the path of each platform 2400 when the individual motor assembly for that platform drives gears 1420 into motion. Guide wheels 1445 are provided to ensure alignment of substrate carrier 1450, and especially E-beam assembly 1452, within cavity 1440.

Each transport platform 2400 is mounted to a wall portion 1402 of sputtering apparatus 10 by a cross beam 1404 and hex nuts 1406. Dual insulating members 1460 isolate substrate carrier 1450, and individual transport platforms 2400, from thermal and electrical energy which is transferred to pallet 800 during transport through sputtering apparatus 10. Insulating members 1460 may be manufactured from an insulating material such as DuPont's DELRIN thermoplastic elastomer. Insulating members 1460 are preferably bolted to substrate mounting member 1454 and include a T-shaped mounting pin 1470 for securing pallet 800. Apertures 805 are provided on extensions 807 of pallet 800 to allow pins 1470 to pass therethrough and pallet 800 to be mounted on carrier 1450.

Maintaining a contaminant-free environment within sputtering apparatus 10 is crucial to quality control in the provision of multi-layer coatings on substrates. Utilization of an overhead drive transport system in the system of the present invention allows a large variety of substrates to be coated within a single apparatus. However, such overhead systems suffer from excessive particulate generation which may fall from the transport system to contaminate disk substrates carried below. The transport system of the present invention is provided with unique shielding to prevent particulate contaminants generated by the overhead transport drive system from entering chamber modules 12–30 of sputtering apparatus 10. As shown specifically in FIG. 14, contaminant shields 1480 are bolted on the lower portion of transport platform 2400 in the interior of chamber modules 12–30. Shields 1480 are shaped so as to bar particulate contaminants generated by each transport platform 2400 from the interior of chamber modules 12–30. In addition, E-beam assembly 1452 is specifically designed such that ends 1482 of shields 1480 are interposed in grooves 1453 of E-beam assembly 1452, minimizing entry of particulate matter into the interior of chambers 12–30.

The transport system described herein further minimizes particulate generation by eliminating metal-to-metal contact. This particular feature of the transport system provides excellent electrical isolation of the substrate, thus providing the added advantage of allowing the substrate to be biased during, for example, carbon sputtering in chamber 28, thereby improving the quality of the carbon coating deposited.

Each individual transport platform 2400 can move substrate carrier 1450 at a velocity ranging up to 24 ft/min along the entire transport path. Optimally, transport speeds within chambers 12–30 of sputtering apparatus 10 are adjustable up to 24 ft/min. Adjustment of drive speeds and each transfer platform 2400 is controlled by the electronic control system as discussed in Section K of this specification.

H. Substrate Heating System

Uniform substrate temperature is crucial to producing a superior thin film by sputtering processes. FIGS. 15 through 21 illustrate a heating assembly configuration which accomplishes this goal in sputtering apparatus 10.

Specifically, sputtering apparatus 10 includes a heating assembly whose elements are distributed between dwell heating chamber 14, passby heating chamber 16 and dwell chambers 18 and 22.

Figure 16:
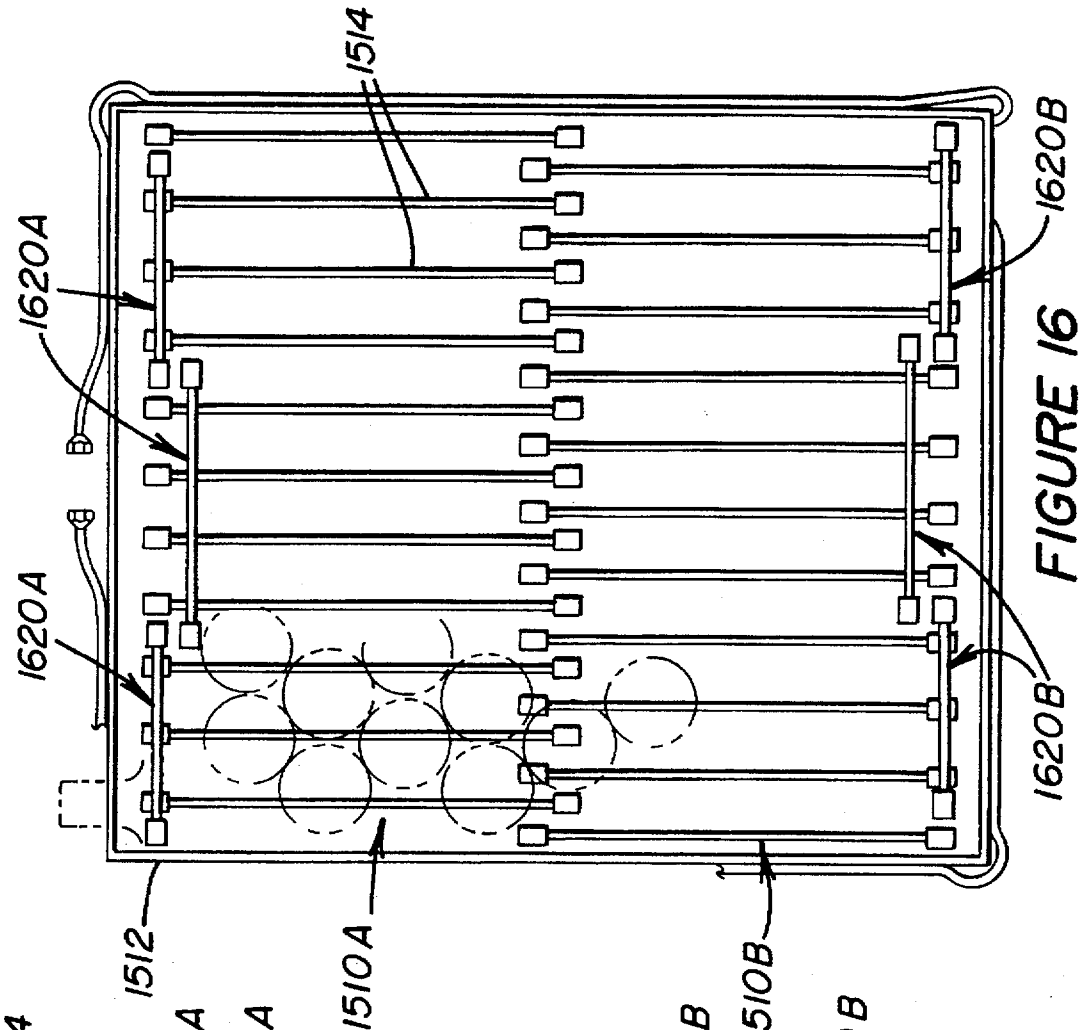
FIG. 16 is a view of the main heating lamp assembly along line 16—16 in FIG. 15.
Figure 15:
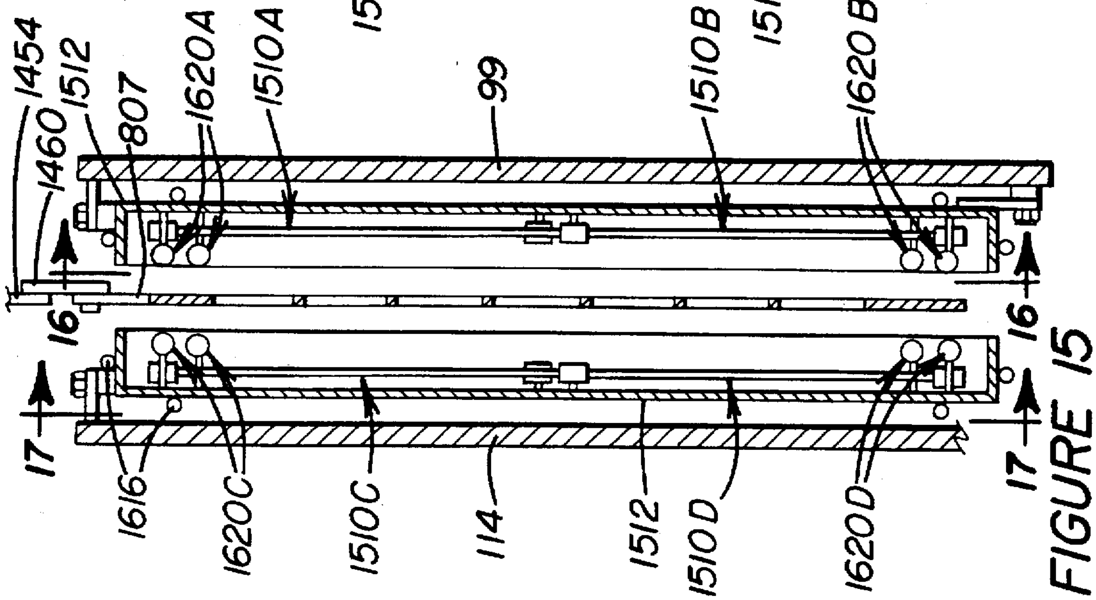
FIG. 15 is a cross sectional view of the main (or "dwell") heating lamp assembly and chamber.
Figure 17:
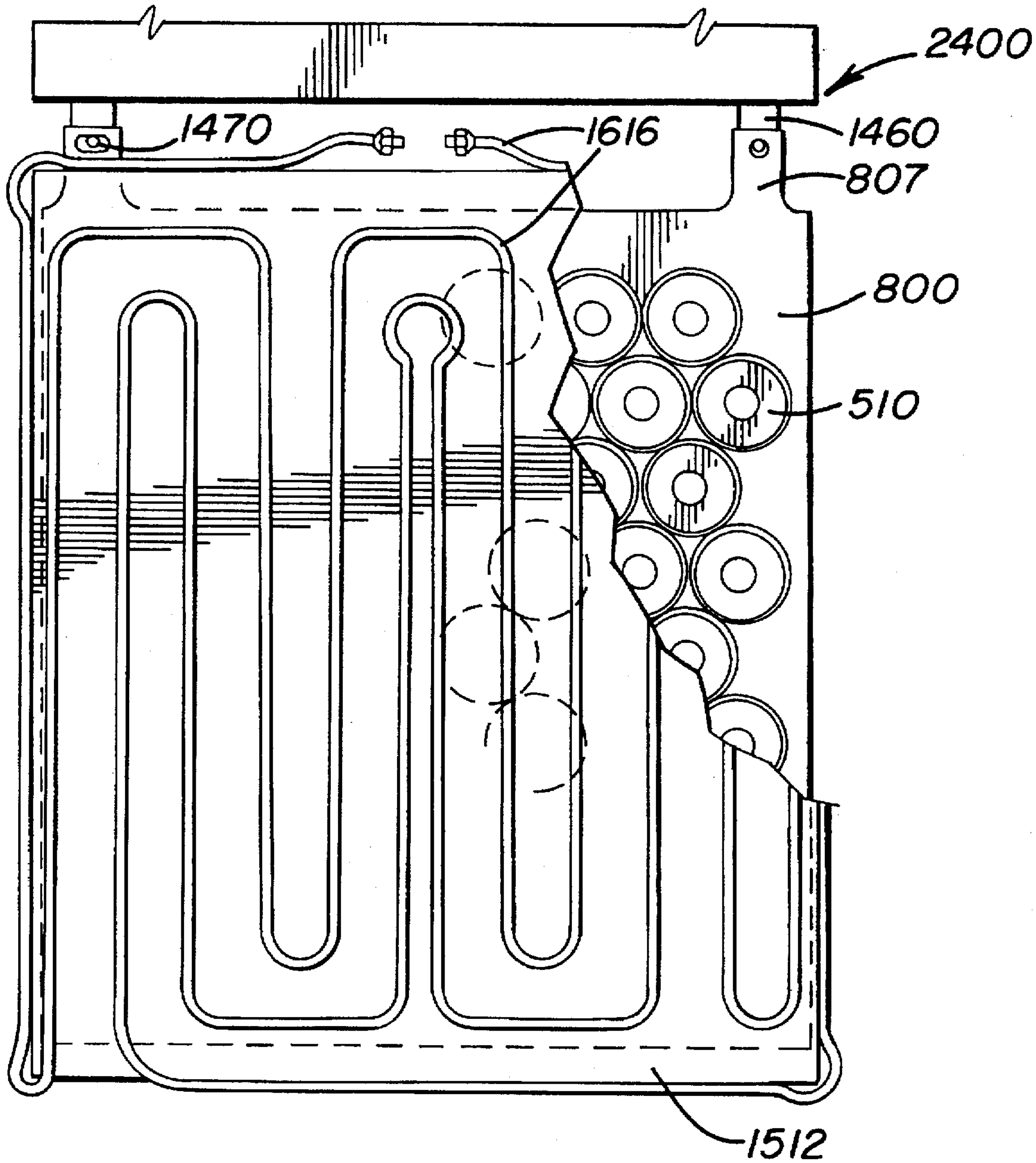
FIG. 17 is a view of the main heating lamp mounting tray and cooling lines along line 17—17 in FIG. 15.

As shown in FIGS. 15 through 17, dwell heating chamber 14 features eight horizontal banks 1510A, 1510B, 1510C, 1510D, 1620A, 1620B, 1620C, 1620D of tubular quartz radiant heating lamps 1514. Banks 1510A, 1510B, 1620A and 1620B are housed in one shallow gold-plated stainless steel tray 1512 and banks 1510C, 1510D, 1620C and 1620D are housed in a second shallow gold-plated stainless steel tray 1512. Each bank 1510A, 1510B, 1510C, 1510D includes eleven 1.5 kW lamps 1514 connected in parallel, vertically aligned and interdigitated to overlap lamp ends between the banks. Individual lamps are separated horizontally by a distance of 3 inches. Each bank 1620A, 1620B, 1620C and 1620D includes three 1.5 kW lamps 1514 connected in parallel, horizontally aligned and interdigitated to overlap lamp ends within each bank. Tubular quartz radiant heating lamps such as those commercially available from General Electric Corporation Lamp Division of Albany, N.Y. are suitable for this purpose.

Within each tray 1512, banks 1510A, 1510B, 1620A and 1620B, and banks 1510C, 1510D, 1620C and 1620D are arrayed vertically. Trays 1512 measure 37.5 in. long (l) by 2⅝ in. deep (d) by 32⅞ in. wide (w), with one tray 1512 mounted on chamber door 114, and the other mounted on rear chamber wall 99. Each tray 1512 is protected from overheating by a circulating coolant fluid provided through cooling lines 1516.

Figure 19:
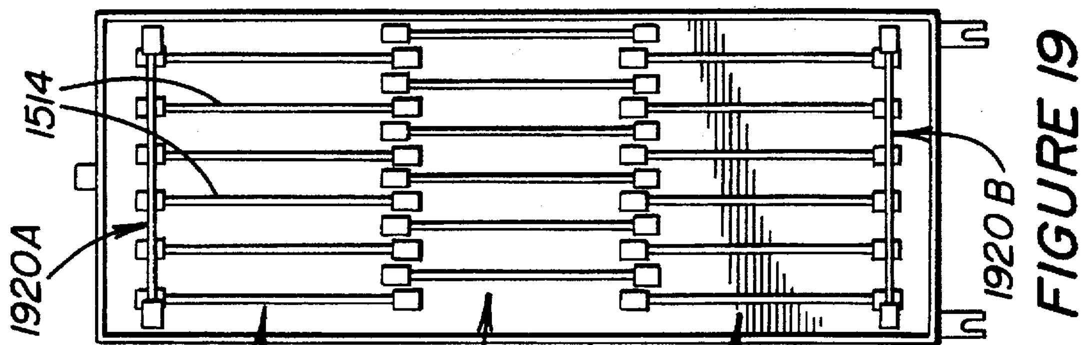
FIG. 19 is a view of the heating lamp assembly along line 19—19 in FIG. 18.
Figure 18:
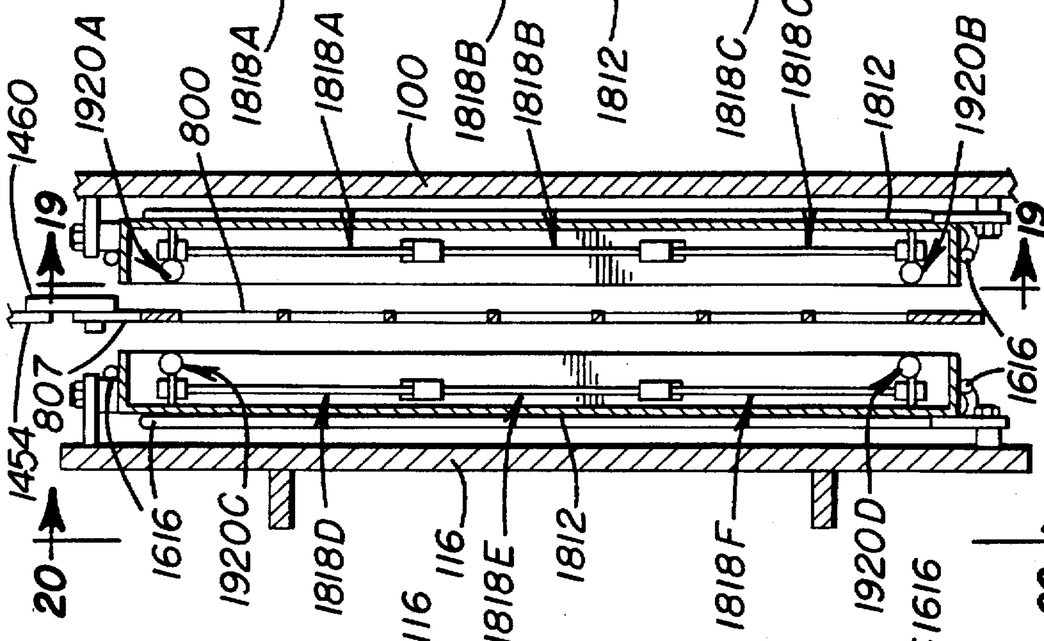
FIG. 18 is a cross sectional view of the secondary (or "passby") heating lamp and chamber assembly.
Figure 20:
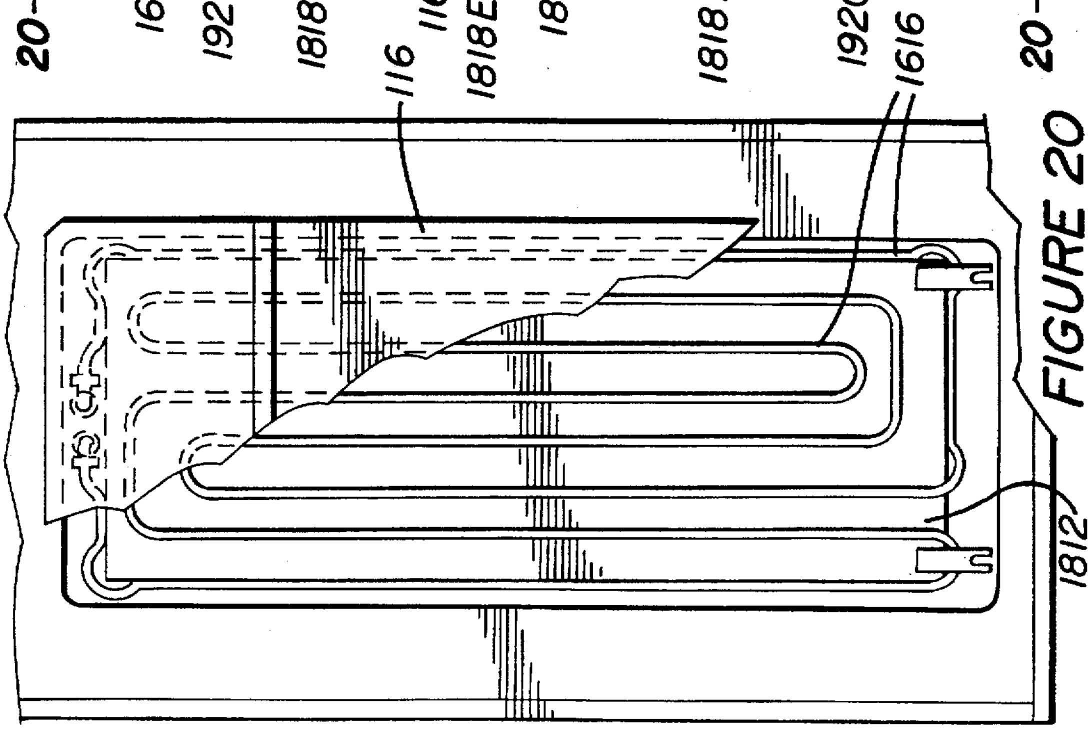
FIG. 20 is a view of the secondary heating lamp, mounting tray and cooling lines along line 20—20 in FIG. 18.

As shown in FIGS. 18 through 20, passby heating chamber 16 includes ten horizontal banks 1818A, 1818B, 1818C, 1818D, 1818E, 1818F, 1920A, 1920B, 1920C, and 1920D of tubular quartz radiant heating lamps 1514. Each bank 1818A, 1818B, 1818C, 1818D, 1818E, and 1818F features six 1.5 kW lamps 1514 of the same type and mounted in the same fashion as those in dwell heating chamber 14. Individual lamps 1514 are separated by a distance of 2 inches. Each bank 1920A and 1920B features a single horizontally aligned 1.5 kW lamp 1514.

Banks 1818A, 1818B, 1818C, 1920A and 1920B, are arrayed vertically in gold-plated stainless steel tray 1812 and banks 1818D, 1818E, 1818F, 1920C and 1920D are arrayed vertically in a second gold-plated stainless steel tray 1812. With the exception of housing five horizontal banks each, instead of four, trays 1812 are identical in measurement and respective mounting to chamber door 116 and rear chamber wall 100 as trays 1512 in dwell heating chamber 14. Likewise, trays 1812 feature cooling lines 1716 to provide protection from overheating.

The output from banks 1510A, 1510B, 1510C, 1510D, 1620A, 1620B, 1620C, 1620D, 1818A, 1818B, 1818C, 1818D, 1818E, 1818F, 1920A and 1920B, may be set and monitored for individual lamp operating voltages and currents via the electronic controlling system, described fully in Section K, to operate at desired power levels and for desired periods of time. In the present embodiment, heater banks 1510A–1510D, 1620A–1620B, 1818A–1818F, and 1920A–1920D are operated in sets, wherein each set comprises banks 1510A/1510B, 1510C/1510D, 1620A/1620C, and 1620B/1620D, operated in parallel. Alternatively, bank sets 1620A/1620C, 1620B/1620D, 1510A/1510C, and 1510B/1510D, may be operated in parallel. Similarly, opposing banks 1818A/1818D, 1818B/1818E, 1818C/1818F, and 1920A/1920D are adjustably controlled in parallel. Preferably, independent control of each bank 1510A–1510D, 1620A–1620B, 1818A–1818F, and 1920A–1920B, may be provided by the electronic control system. Such control of banks 1510A, 1510B, 1510C, 1510D, 1620A, 1620B, 1620C, 1620D, 1818A, 1818B, 1818C, 1818D, 1818E, 1818F, 1920A, 1920B, 1920C, and 1920D facilitates adjustment of heating power to meet the preheating requirements of different substrate materials.

Figure 21:
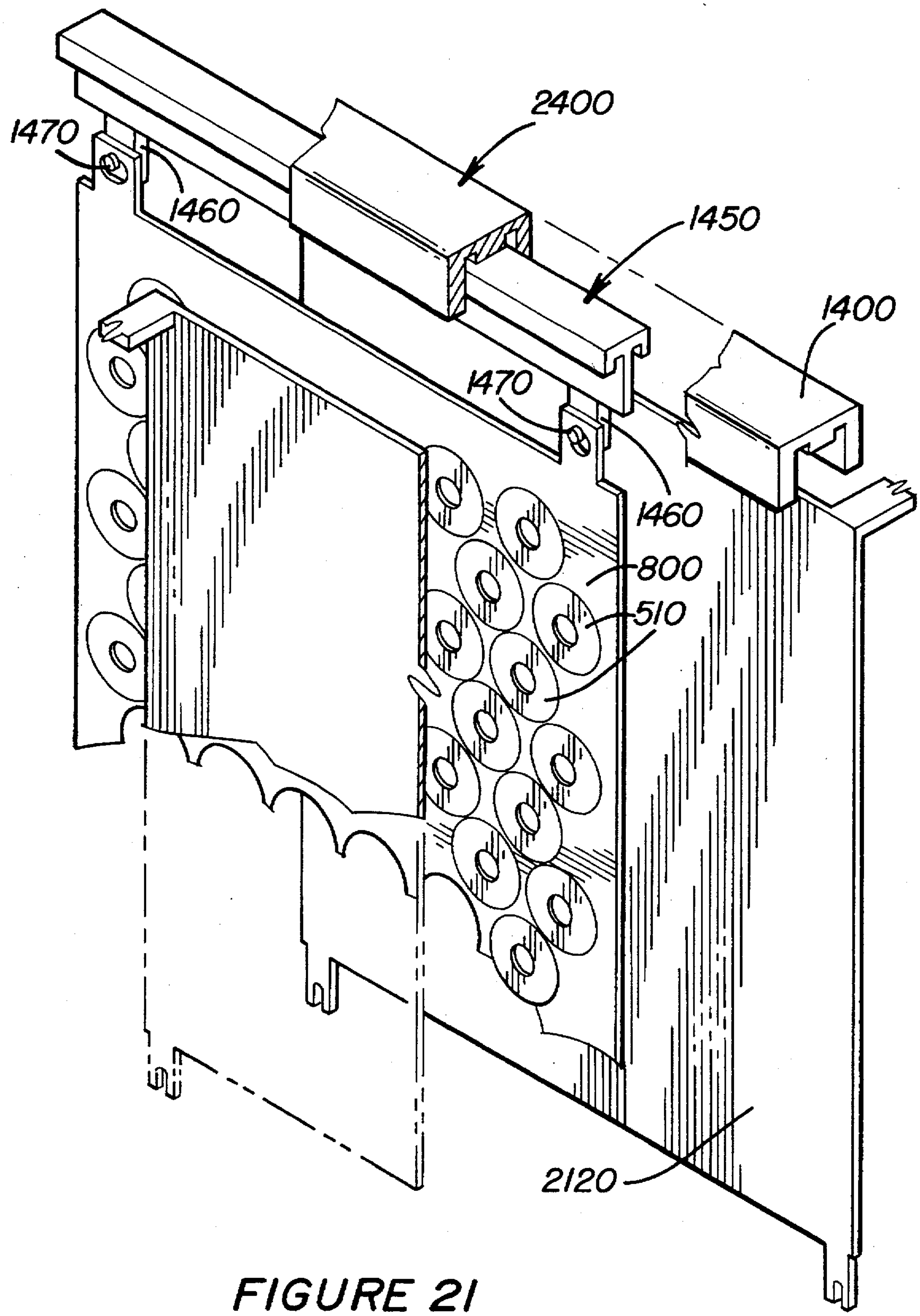
FIG. 21 is a perspective, partial view of a heat reflecting panel, pallet, and substrate transport system utilized in the apparatus present invention.

As shown in FIG. 21, dwell chambers 18 and 22A and 22B each have two gold-plated stainless steel reflecting panels 2120, one each on opposite chamber walls 118, 122A, and 122B and rear chamber walls 101, 102 and 104. Reflecting panels 2120 measure 34⅜ in. in length by 28 in. in width by 0.09 in. thick.

The heating assembly cooperates with the other elements of sputtering apparatus 10 to contribute to the overall high throughput and high quality sputtered films produced. Specifically, as pallet 800 proceeds through dwell heating chamber 14, banks 1510A, 1510B, 1510C, 1510D, 1620A, 1620B, 1620C and 1620D rapidly commence heating to warm both sides of disk substrates 510 before film deposition. If, for example, the desired substrate temperature is about 200° C., the heating time in dwell heating chamber 14 is approximately 30 seconds. Heating lamp warmup time is negligible since low power (about 143 W) is delivered continuously to the lamps to keep lamp filaments warm.

In the geometrically uniform array of heating lamps created by banks 1510A, 1510B, 1510C and 1510D, more heat is radiated towards disk substrates 510 carried in the center of pallet 800 as compared to disk substrates 510 carried in rows 810, 820, 870 and 880. In combination with efficient heat reflection from gold-plated stainless steel trays 1512, there is a need to equalize across pallet 800 the amount of heat radiated to individual disk substrates 510. Banks 1620A and 1620B serve as 'trim heaters' to boost the amount of heat radiated to disk substrates 510 carried in rows 810, 820, 870 and 880 of pallet 800. Although such trim heaters are not required, through equalization of heat distribution across pallet 800, trim heaters 1620A and 1620B allow control of coercivity of the deposited film to within about 60 Oe.

To further insure uniform substrate temperature prior to film deposition, a second heating cycle is performed in passby heating chamber 16. Pallet 800 enters passby heating chamber 16 through door D3. The electronic control system enables high power input to banks 1818, 1920, for example, through internal software timers or by reading the output of optical sensor SEN10 (shown generally in FIG. 12) capable of detecting pallet motion through the sputtering apparatus 10. As pallet 800 begins to depart passby heating chamber 16, the electronic control system reduces the power of those lamps 1514 positioned at the leading edge of pallet 800 or turns off power to those lamps entirely in response to timing parameters incorporated in the electronic control system software, or sensor SEN13, in order to avoid relative overheating of the trailing edge of the pallet 800.

Banks 1818A, 1818B, 1818C, 1818D, 1818E, 1818F, 1920A and 1920B are initiated and will deliver heat for a preset, empirically determined time as monitored by a software timer in the electronic control system. In addition, a software delay timer is triggered to control the opening of door D3, allowing pallet 800 to proceed into passby heating chamber 16. As a result, when pallet 800 triggers SEN13 in dwell chamber 18, after a certain period, lamps 1514 on the leading edge of pallet 800 are reduced in power or turned off entirely, depending on the transport speed through dwell chamber 18. In addition, a Mikron temperature sensor (not shown) may be positioned at the entrance of passby heating chamber 16, allowing the system operator through the electronic control system to adjust the power output of banks 1818A, 1818B, 1818C, 1818D, 1818E, 1818F, 1920A, 1920B, 1920C and 1920D to compensate for thermal variations between disk substrates 510 and across pallet 800. In this manner, a uniform temperature profile is established across the surface of pallet 800 and between individual disk substrates 510, thereby avoiding higher coercivities for those substrates positioned on the trailing edge of pallet 800.

Radiative heat losses from pallets and substrates proceeding through sputtering apparatus 10 are minimized by virtue of gold-plated stainless steel reflective panels 2120.

The cooperation of these elements in the heating assembly contributes to the high throughput of sputtering apparatus 10 by promoting rapid and uniform heating of substrates before film deposition. The heating assembly also efficiently maintains the desired substrate temperature by minimizing radiative heat losses as disk substrates 510 proceed through sputtering apparatus 10. Moreover, integration with the electronic control system introduces added flexibility with respect to selecting and adjusting dwell times and heating rates as required by different substrates and sputtered films.

I. Sputtering Chambers in General

As shown in FIGS. 1 and 2, the present invention includes three in-line sputtering chambers 20, 26, and 28 to deposit a multilayer film, including chromium, CoCrTa and carbon thin films, respectively. Those skilled in the art will recognize that the application of the following principles to design a sputtering apparatus with greater or fewer sputtering chambers or with the capability to deposit more or fewer films is within the contemplation of the present invention. Moreover, all of the sputtering chambers within a particular sputtering apparatus need not be devoted to sputtering films. Indeed, any given sputtering chamber may participate in the overall process solely to the extent of serving as a pressurized inert passageway for substrates.

The following description relates to the internal configuration of each sputtering chamber, which is symmetrical about the line of pallet travel through the sputtering apparatus 10. FIGS. 13, 14 and 23 through 28 illustrate various aspects of the sputtering chambers and will be referred to as necessary.

Referring to FIGS. 13, 14, 22 and 23, sputtering chamber 20 generally represents the internal configuration of sputtering chambers 20, 26 and 28. By way of explanation, only chromium sputtering chamber 20 will be hereafter described. Only one-half of the chamber is described with the understanding that the description applies to both halves.

Four planar (rectangular) cathodes 2222, 2223, 2224 and 2225 are mounted through insulative layer 121 to door 120. Door 120 is rotatable about hinge 1326 to allow access to the interior of chromium sputtering chamber 20, for example, for maintenance purposes. Interlocked protective cover 2305 interrupts the power supply to chromium sputtering chamber 20 when door 120 is opened.

Cathodes 2222–2225 may be composed of a material such as copper and measure about 36 inches in length by 5½ inches in width by 1.125 inches thick. Cathodes 2222–2225 are provided with cooling lines 2552 to protect against overheating. Cooling lines 2552 supply a cooling fluid such as water along cooling conduits 2554 in cathode surface 2550.

Figure 22:
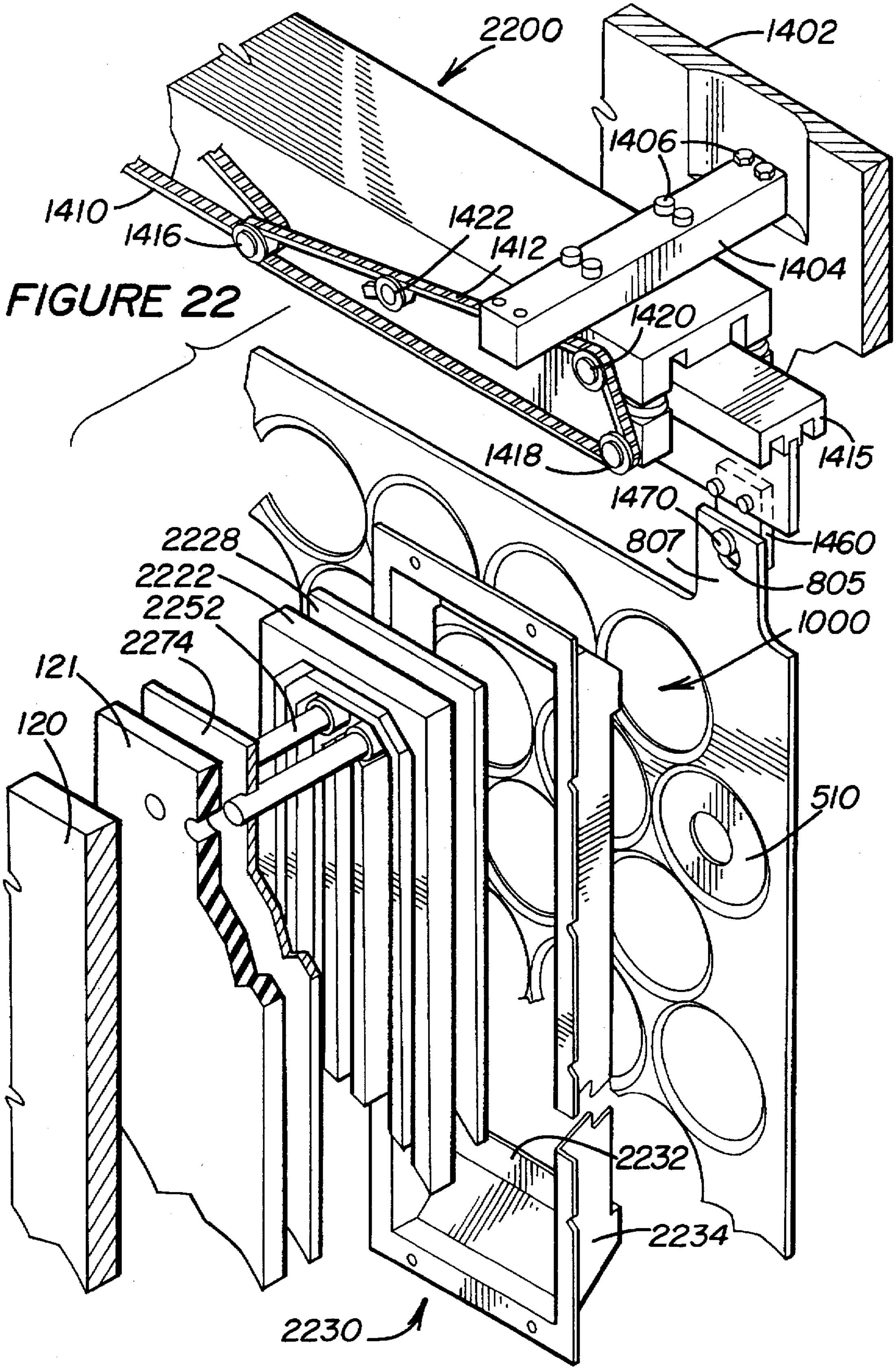
FIG. 22 is a perspective, exploded view of a portion of a pallet, substrate transport mechanism, sputtering shield, and cathode assembly utilized in the sputtering apparatus of the present invention.
Figure 23:
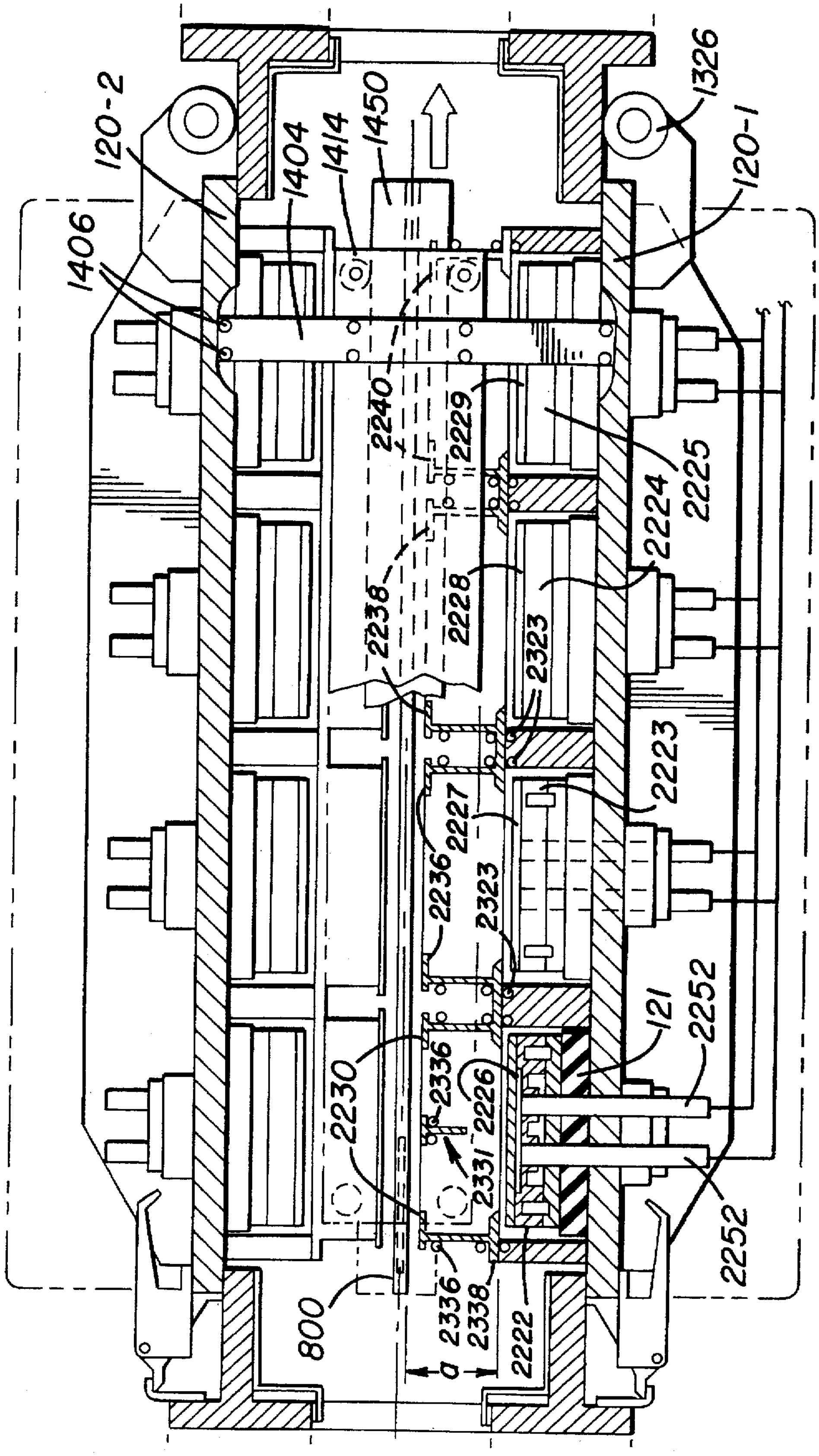
FIG. 23 is a top view of the sputtering chamber shown in FIG. 13.

As illustrated in FIGS. 14, 22 and 23, targets 2226–2229 are mounted one per cathode 2222–2225, with the target being nearest the line of pallet travel through chromium sputtering chamber 20. Within any given sputtering chamber, the composition of all four targets depends upon the film to be deposited, but may be chromium, a magnetic alloy or carbon. Likewise, the thickness of the targets depends upon the type and the thickness of the film to be deposited. In the case of the chromium and magnetic sputtering chambers 20 and 26, the target-to-substrate distance 'a' is about 2¾ inches and the target-to-substrate distance 'a' for carbon targets is 2$^{11}/_{16}$ inches because the chromium and magnetic targets are thicker than the carbon target.

Referring now to FIGS. 21 through 24, shields 2230, 2236, 2238 and 2240 are mounted one per cathode 2222–2225. Shields 2230, 2236, 2238 and 2240 may be composed of a material such as copper and are generally rectangular in shape with peripheral flanges 2232 and 2234. Shield extension 2231 extends from shield 2230 into the chamber interior. Shields 2230, 2236, 2238 and 2240 are cooled by cooling lines 2336. A combined anode and dark space shield 2338 is incorporated into each shield 2230, 2236, 2238 and 2240.

Figure 27A:
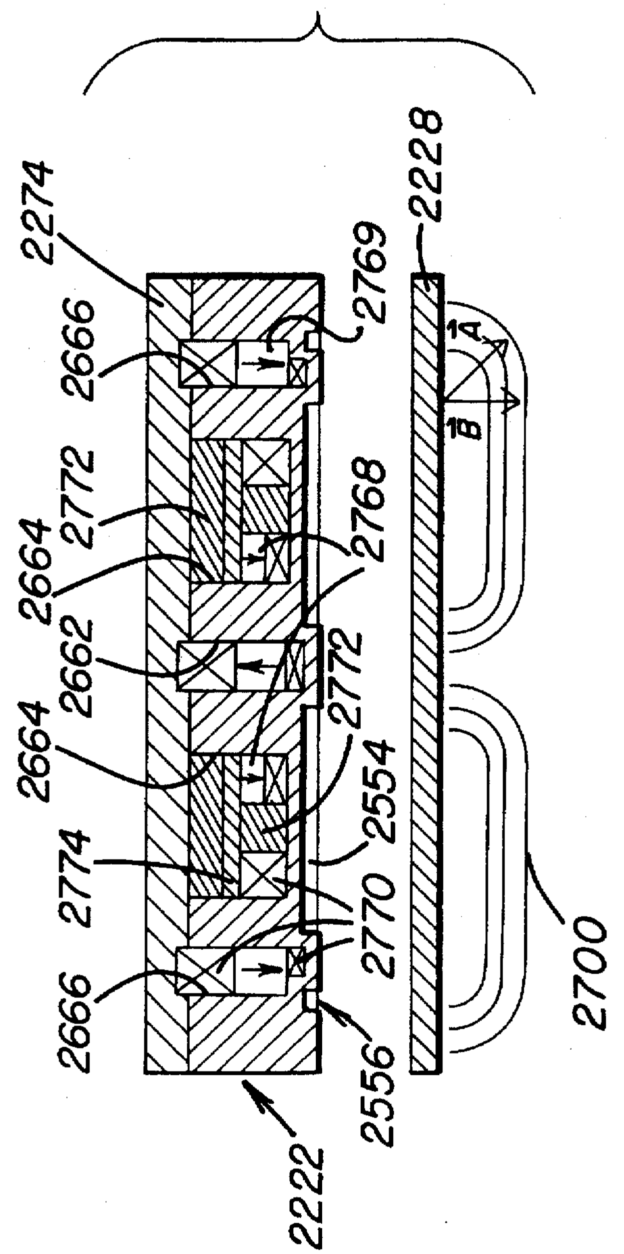
FIG. 27A is a cross-sectional, assembled view of a first embodiment of the magnet configuration in the cathode for a nonmagnetic target of the present invention along line 27—27 of FIG. 25.
Figure 27B:
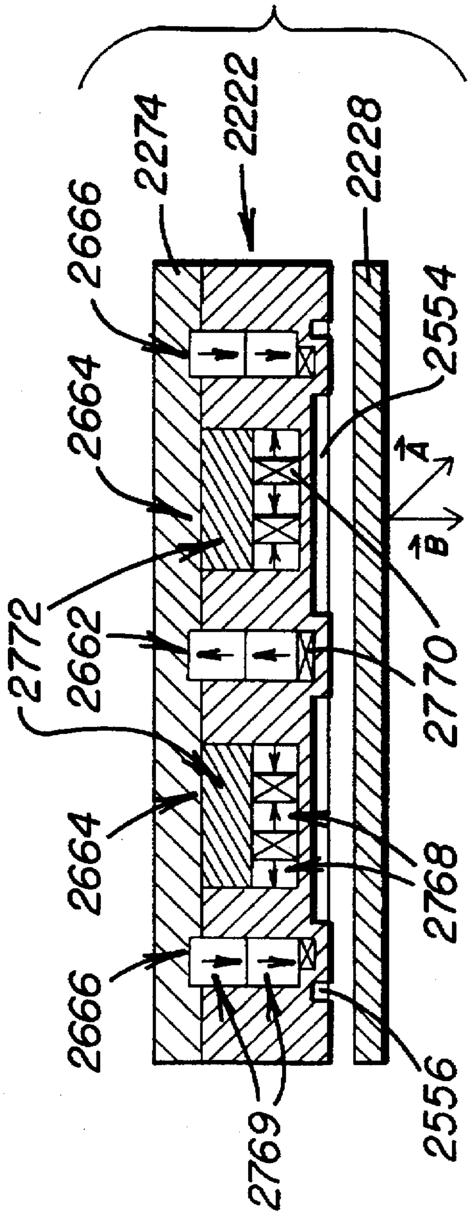
FIG. 27B is a cross-sectional, assembled views of a second embodiment of the magnet configuration in the cathode for magnetic target of the present invention along line 27—27 of FIG. 25.

The sputtering process occurs with the targets sputtering in a sideways fashion, depositing the desired film on each side of disk substrates 510 as pallet 800 proceeds through each sputtering chamber. As FIGS. 27A and 27B show, during sputtering, flux (represented by vectors $\vec{A}$ and $\vec{B}$) leaves the target surface diffusely, depositing on the disk substrates and other surfaces within the sputtering chamber. As discussed previously, in-line sputtering of disk substrates can introduce undesirable magnetic anisotropies into the deposited film. Shields 2230, 2236, 2238 and 2240 intercept the obliquely incident flux (vector $\vec{A}$) from targets 2226–2229 such that only flux substantially normal to the surface of target 2228 (vector $\vec{B}$) is deposited on disk substrates 510. Specifically, peripheral flanges 2232 and 2234, extending the length of each shield, project toward the line of pallet travel through any given sputtering chamber. Shield 2230 also features shield extension 2231 which similarly projects toward the line of pallet travel. Peripheral flanges 2232 and 2234 and shield extension 2231 block deposition from high- and low-angle flux (vector $\vec{A}$) as disk substrates 510 enter and exit each sputtering chamber, while providing an unhindered path for normal flux (vector $\vec{B}$) to the substrates.

Figure 26:
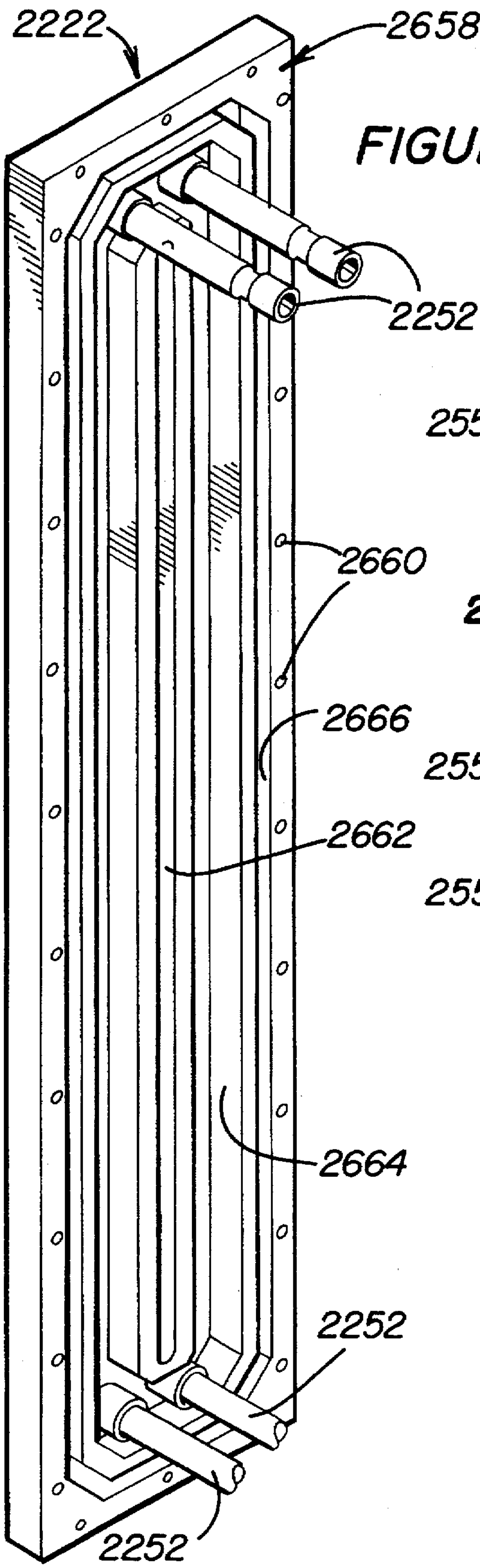
FIG. 26 is a perspective view of a second surface of the cathode of the magnetron of the present invention, including cooling line inputs and magnet channels of the cathode.
Figure 25:
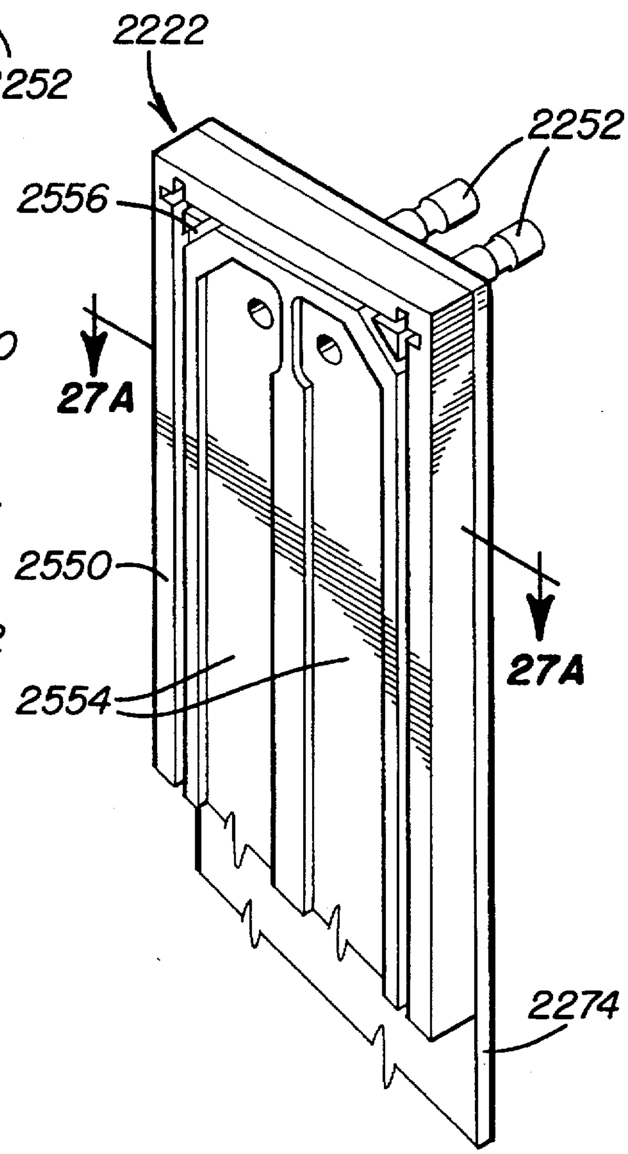
FIG. 25 is a partial perspective view of a first surface of the cathode portion of the magnetron of the present invention.

FIGS. 25 and 26 illustrate the configuration of cathode 2222 in more detail. Cooling lines 2552 discharge cooling fluid along surface 2550 in shallow channels 2554 and an O-ring (not shown) disposed in channel 2556 prevents coolant leakage outside of channels 2554. On the reverse side of cathode 2222, surface 2658 is adapted to receive screws in holes 2660 for mounting cathodes 2222–2225 onto chamber doors 120-1 and 120-2. Surface 2658 is configured to support and receive a magnet and magnetic pole piece assembly to produce the desired magnetic field. The assembly is created in a network of channels in surface 2658 consisting of center channel 2662, intermediate circumferential channel 2664 and outer circumferential channel 2666. Channels 2664 and 2666 are configured as concentric closed loops or ovals surrounding center channel 2662.

Typically, target utilization in sputtering operations are about 15–20% for nonmagnetic materials and about 30–35% for magnetic materials. Considering the high costs associated with the purchase and replacement of target materials, optimal target utilization is another prime concern in sputtering operations. Magnet and magnetic pole piece assemblies used in the present invention substantially improve target utilization, enhancing both production throughputs and cost-effectiveness.

FIGS. 27A and 27B illustrate in greater detail the magnet and magnetic pole piece assemblies for nonmagnetic (e.g., chromium and carbon) and magnetic (e.g., CoCrTa) targets, respectively. Each magnet 2768 is 1-inch long by $^{5}/_{16}$-inch wide by $^{3}/_{16}$-inch thick and magnets 2769 are 1-inch-long by $^{5}/_{16}$-inch wide by ⅜-inch thick, with north and south pole directions indicated by arrows pointing up and down, respectively. Ferritic magnets of neodymium, iron and boron (NeFeB or "Neo iron") are preferred in the present invention.

Along with magnets 2768 and 2769, magnetic pole pieces 2770 and 2774 are arrayed in channels 2662, 2664 and 2666. Magnetic pole pieces 2770 may be adapted to receive screws therethrough for securing the magnet and pole piece assembly within the channels as necessary. A nonmagnetic material 2772, such as aluminum in block or continuous form, is positioned so as to fill the channels as necessary and preclude shunting of the magnetic flux between adjacent magnetic pole pieces 2770. Iron plate 2274 serves as a backing plate for the magnetic and pole piece assembly.

For a nonmagnetic target layout, center channel 2662 of each cathode contains about 25 magnets 2769 separated by ¼-inch spaces and 25-inch pole piece strips 2770 above and below magnets 2768. Intermediate circumferential channel 2662 contains about 35 magnets 2768 separated by 1-inch spaces, two 31-inch pole piece strips 2770, two 31-inch pole piece strips 2774 adjacent to aluminum filler 2772 with additional pole pieces 2770 for fitting the cropped corners of intermediate channel 2664. Outer circumferential 2666 contains about 33 magnets 2769 and two 33-inch pole piece strips 2770 with additional pole pieces 2770 for fitting the cropped corners of outer circumferential channel 2666. The overall effect of the magnet and the pole piece assembly for the nonmagnetic target shown in FIG. 27A is to produce a magnetic field strength above the target surface of 400 Gauss at the center of the erosion region.

For a magnetic target layout, center channel 2662 contains about 25 magnets 2769 with one overlying 25-inch pole piece 2770. Intermediate circumferential channel 2664 contains about 35 magnets 2768 overlaid with two 31-inch pole pieces 2770 and additional pole pieces 2770 for fitting the cropped corners of intermediate channel 2664. Aluminum filler material 2772, in block or continuous form, occupies remaining vacancies in intermediate channel 2664. The overall effect of the magnet and pole piece assembly for a magnetic target shown in FIG. 27B is to produce a magnetic field strength of about 400 Gauss at the center of the erosion region.

As noted above, the purpose of the magnetic field is to trap electrons and ionized species in the plasma and enhance the sputtering rate induced by the circulating plasma above the target surface. The magnetic field 2700 generated by the magnet and magnetic pole piece assemblies used in the present invention approximate an ideal magnetic field 2700 where the vertical components of the magnetic fields above the nonmagnetic (FIG. 27A) and magnetic (FIG. 27B) targets are reduced. As a result, greater target utilization is obtained since the magnetic fields and plasma are focused across a relatively greater portion of the target surface.

Target utilization may be further improved by increasing the magnet loading density within the channel network. For example, by loading intermediate channel 2664 with 24 magnets 2768 separated by ½-inch spaces, nonmagnetic target utilization increases to between 50% and 65%. For magnetic targets, an increased utilization of between 35% to 50% may result.

Figure 28:
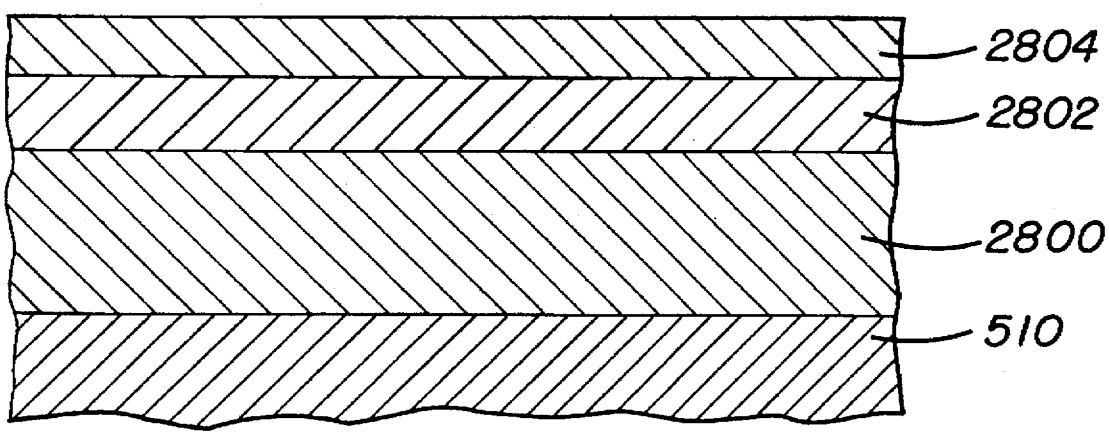
FIG. 28 is a cross sectional view of the multi-layer sputtered thin film created by the process of the present invention.

FIG. 28 illustrates the film structure which may be produced by the present invention on nickel-phosphorus plated aluminum disk substrate 510. A 800 Å to 2000 Å (1000 Å preferably) chromium underlayer 2800 is deposited first on disk substrate 510. A 500 Å to 850 Å CoCrTa magnetic layer 2802 may be deposited over the chromium underlayer. As a result of the circumferential texturing of the disk surface as discussed previously in Section C.2, the 'C' axis of the hcp structure of the magnetic cobalt alloy is aligned in the film plane. Finally, a 350 Å carbon overlayer 2804 may be deposited, incorporating some hydrogen, as discussed in Section J.

J. Carbon Sputtering

Sputtering chamber design in sputtering apparatus 10 for carbon films requires additional refinements to optimize wear and corrosion resistance properties. These refinements are discussed herein with reference to FIG. 13, as necessary.

Experiments have shown that the incorporation of hydrogen into sputtered carbon films improves wear-resistance properties. In sputtering apparatus 10, hydrogen incorporation is achieved by sputtering in an argon atmosphere containing up to about 15% of a hydrocarbon gas. In particular, carbon films sputtered in the presence of ethylene/argon or acetylene/argon showed a 300% improvement in wear resistance as compared to carbon films sputtered in pure argon atmospheres. Thus, as compared to chromium and magnetic sputtering chambers 20 and 26, carbon sputtering chamber 28 uses a gas line for argon/hydrocarbon gas mixture to supply hydrocarbon gas flow during sputtering.

A second type of chamber refinement in the carbon sputtering chamber relates to the need for substrate bias. As noted above, during sputtering, primary or "fast" electrons dislodge from the target and join the plasma. These fast electrons are constrained to field lines in the plasma where they may ionize argon atoms or may be attracted to positively biased regions within the sputtering chamber. Deposition of dielectric target materials, such as carbon, on surfaces other than the substrate can reduce the electrical conductivity of those surfaces and inhibit the electron grounding thereon. As a result of the reduced electrical conductivity, fast electrons either scatter and ionize argon, or are therefor available to impinge on the substrate, whether positively biased or grounded. In the event of the latter, the substrate may be heated sufficiently by electron bombardment to cause graphitization of the growing carbon film.

One means of avoiding graphitization resulting from electron bombardment of the substrate is to apply a negative bias to the substrate to repel any stray electrons. As shown in FIG. 13, arcuate phosphorus-bronze fingers 1302 depending from insulating block 1304 and connected to an external voltage source (not shown) provide an electrical contact to pallet 800 by which a negative bias may be applied. More specifically, as pallet 800 proceeds through carbon sputtering chamber 28, phosphorus-bronze fingers 1302 brush against the bottom edge of pallet 800 and establish the desired negative bias. At least one phosphorus-bronze finger 1302 maintains contact with the moving pallet while pallet 800 is in carbon sputtering chamber 28.

A third refinement relates to a reduction of pallet transport speed through carbon sputtering chamber 28. As a target surface is increasingly eroded during sputtering, the once-flat surface eventually develops a depression which mirrors the magnetic field lines. As a result, the magnetic field lines emerging from the target are no longer perpendicular to the electric field lines at the target surface. The significance of the growing erosion region is that during sputtering, target species continue to leave the erosion region in a path perpendicular to the surface, i.e., according to a cosine distribution, even where the eroded target surface is no longer uniformly flat. Therefore, an increasing portion of the flux leaving the target surface is intercepted by shields 2230 as otherwise obliquely incident flux. In other words, a correspondingly decreasing portion of the flux is deposited on disk substrates 510 (and pallet 800) as the desired normally incident flux, thereby decreasing the overall film deposition rate. In general, such a decrease in deposition rate may be compensated for directly by increasing the power supplied to the cathodes. For carbon targets, it has been discovered that this method of compensation is impracticable because increased power input to and resultant heat from the cathodes would induce undesirable graphitization.

The carbon target is also altered by redeposition of carbon from the flux into the erosion region. Specifically, since carbon is a dielectric material, such redeposition reduces the electrical conductivity of the target, further decreasing the carbon sputtering rate and may cause arcing. For conductive target materials like metals, redeposition is not similarly problematic.

Accumulations of the redeposited carbon, which appear as large blemishes or warts, may be removed by grinding the carbon surface. However, such a solution to the redeposited carbon problem is time- and labor-intensive, and consequently is not preferred because it detracts from the high throughput capability of the sputtering operation of the present invention. A much more manageable and attractive solution directly minimizes graphitization by holding deposition power to the cathodes constant and reducing the pallet transport speed from the typical rate of 3 feet/minute, via the electronic control system to, for instance, about 2.8 ft/min, to compensate for the lower deposition rate.

K. Electronic Control System

The electronic control system for sputtering apparatus 10 and the process of the present invention provides one or more system operators with the means to comprehensively and efficiently control production throughput, applied sputtering power, and other sputtering apparatus parameters. The electronic control system is preferably programmable to allow a plurality of different operating parameter settings to be stored for each of the adjustably controlled elements of the sputtering process. Thus, the electronic control system generally performs two major functions: (1) monitoring sputtering apparatus 10 by reading data input from every aspect of sputtering apparatus 10, and providing status data to the system operator(s); and (2) controlling the sputtering process by providing user-controlled and automatically generated control signals to the functional elements of sputtering apparatus 10.

Figure 32A:
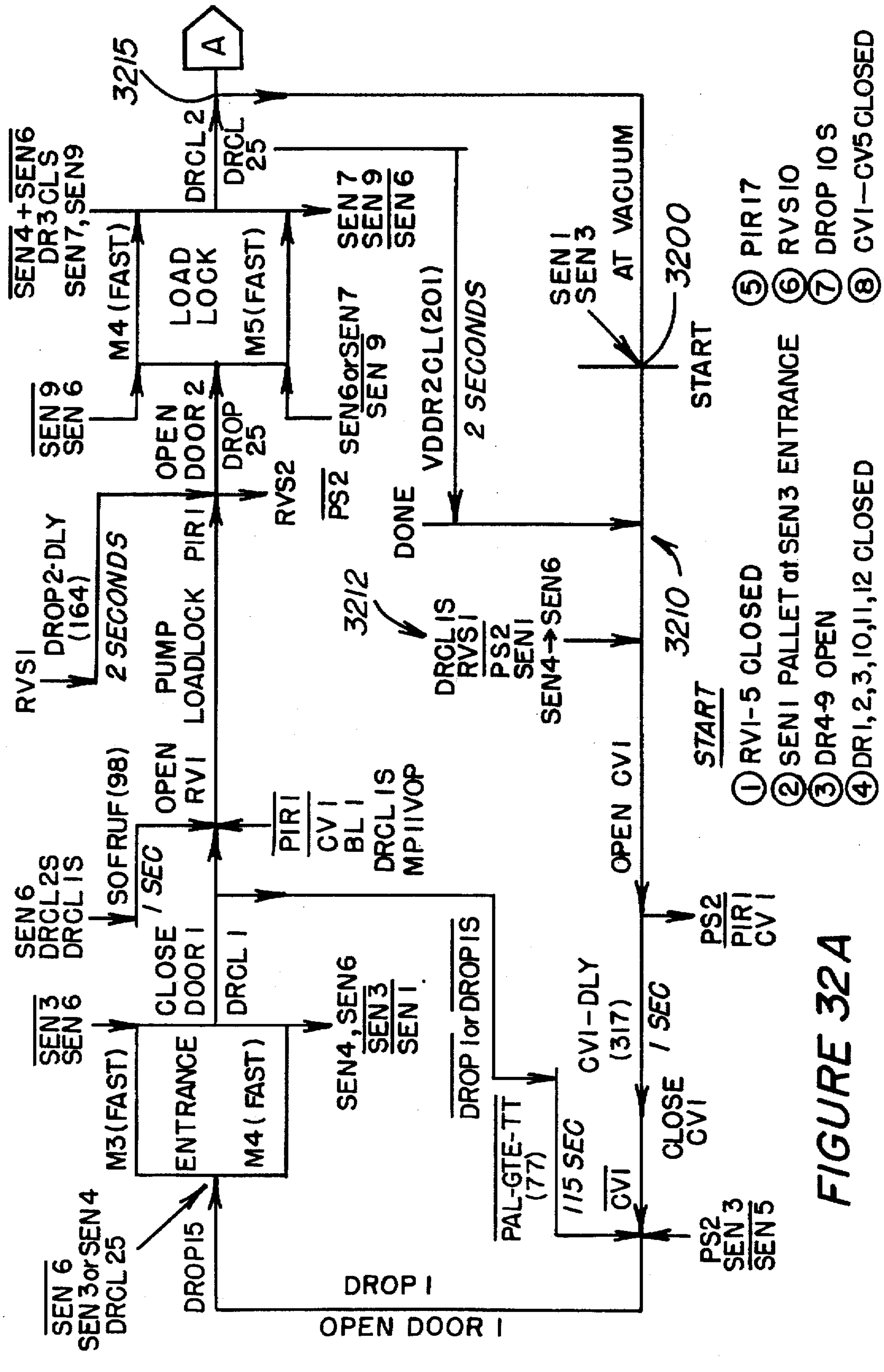
FIGS. 32A through 32E comprise a single logical flow diagram outlining the software logic controlling the motor assemblies, load lock and exit lock pumping, and heater power during the automatic substrate run mode of the software utilized in the electronic control system of the present invention.
Figure 32B:
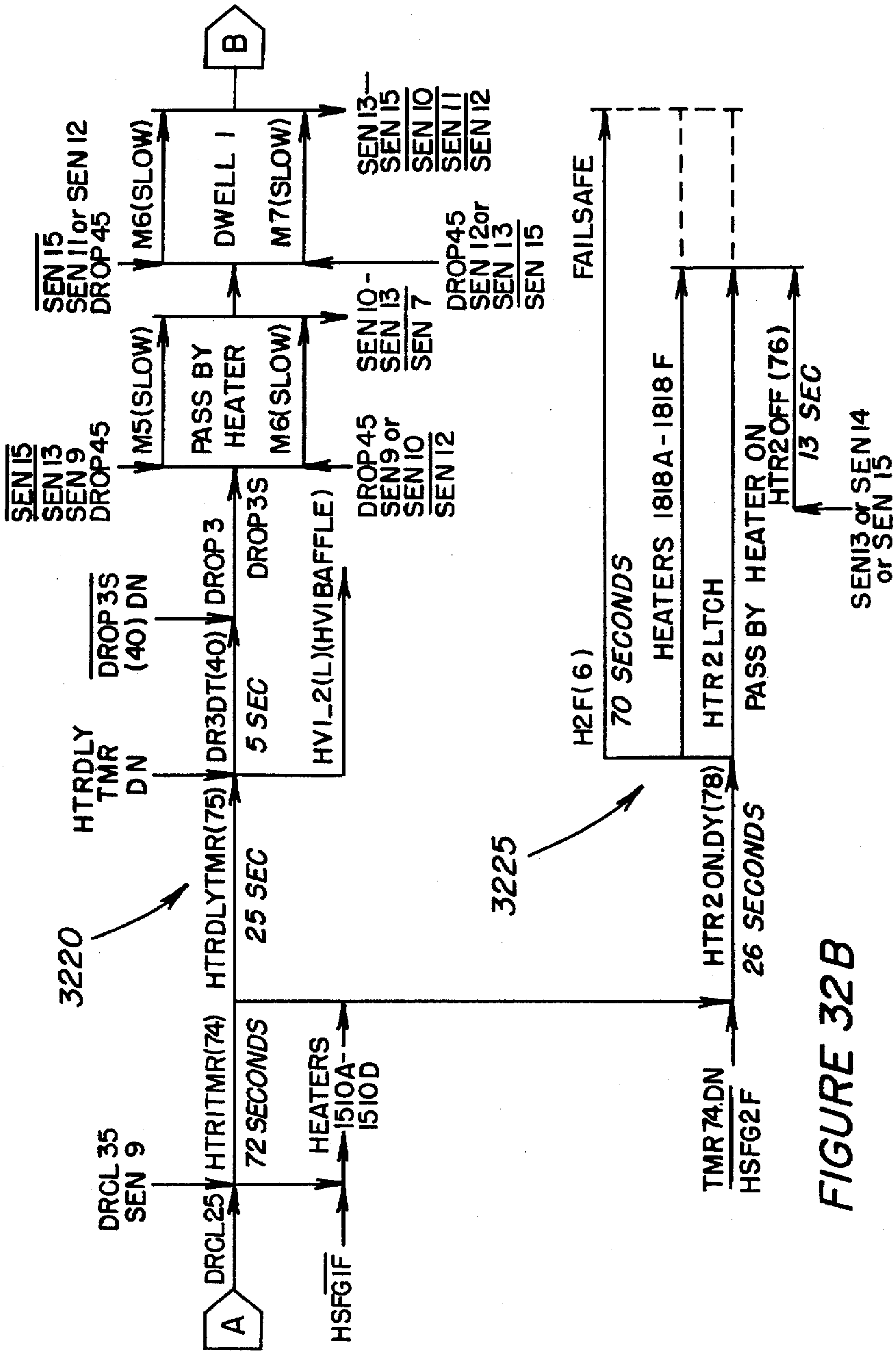

The electronic control system of the present invention will be described with regard to FIGS. 12, 29 and 30. FIG. 12 is a diagram of the vacuum and chamber pumping system of the present invention, including general representations of the location of the various signals and components controlled, or read by, the digital input/output of programmable logic controller 2902. FIGS. 32A–B represent a logical flow diagram of the programmable logic software controlling the motor assemblies powering transport platform arranged in chambers 12–30 in apparatus 10 of the present invention.

Figure 29:
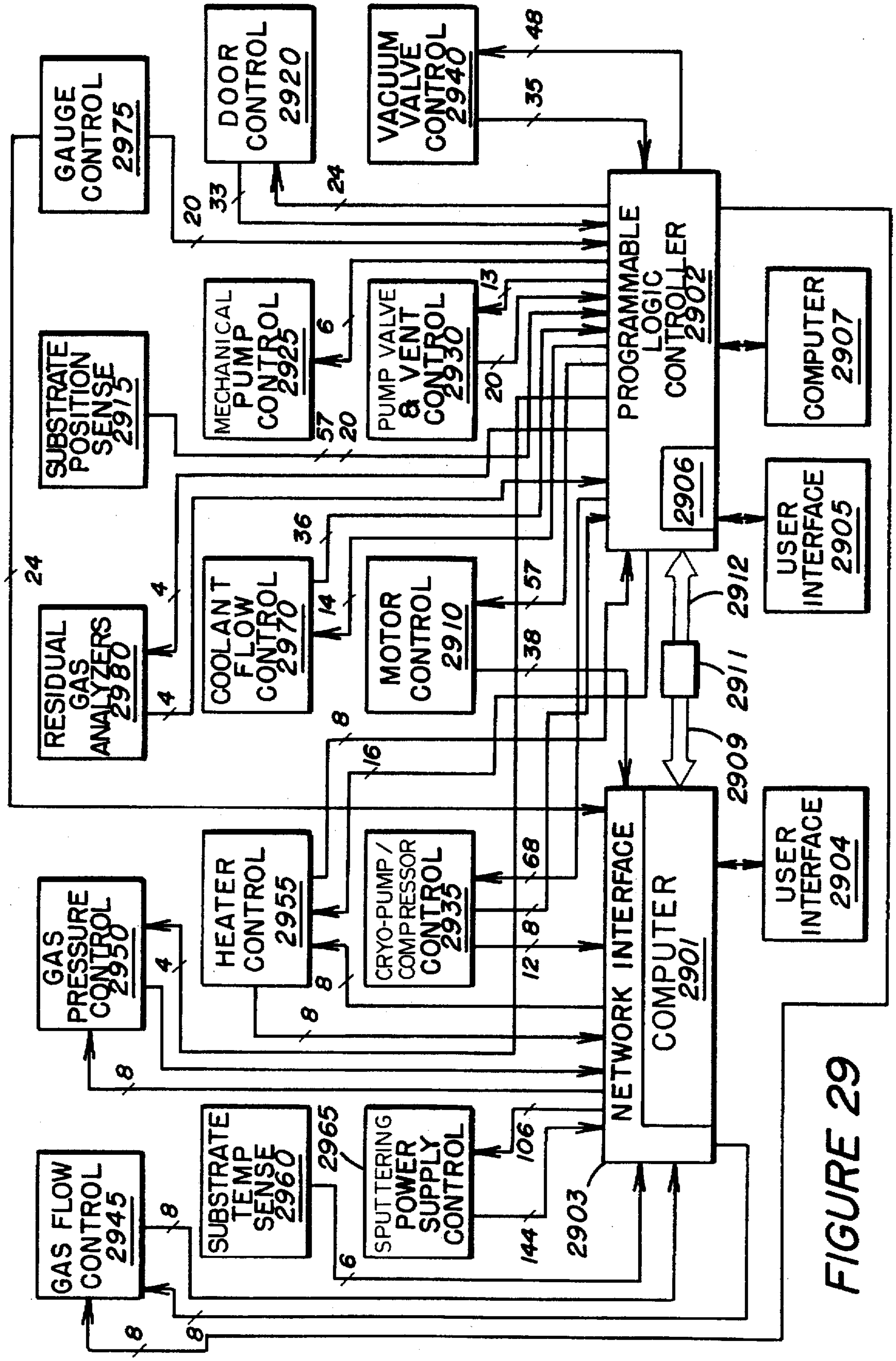
FIG. 29 is a block diagram of the electronic control system of the present invention.

Referring to FIG. 29, the major functional elements of the control system of the present invention are shown. Since both digital and analog input/output must be provided for in one embodiment, two main process controllers are used: a programmable process logic controller 2902, preferably an Allen Bradley PLC-5 programmable process logic controller, and an IBM-compatible, Intel-type 80386 or 80486 microprocessor based, computer 2901. It should be understood by those skilled in the art after review of the specification that the particular choice of process controllers is not crucial to the invention, as long as the process controller(s) can sufficiently handle input/output (I/O) in both analog and digital form to meet the comprehensive requirements of the control system described herein.

The Allen Bradley PLC-5 is manufactured by Allen Bradley Company, Milwaukee, Wis., and includes at least one PLC-5 processor module and a number of input/output modules attached thereto. The input/output modules provide an expandable number of inputs and outputs to handle any number of digital I/O signals.

Programmable logic controller 2902 monitors digital input and provides digital output to those elements of the sputtering apparatus which require two-state control signals. These elements are described in detail below. Allen Bradley PLC-5 uses logic control software configured as "ladder" logic table diagram, a copy of which is included in Section M, to control input and output. In general, this software allows programming of the sensory input and output in a Boolean-type fashion along a series of horizontal timing "rungs". The entire "ladder" is scanned, top to bottom, every 0.030–0.040 second, and each addressed element of I/O is examined by the processor. Each rung is programmed with both internal and external I/O, and generates an output command—either internal or external—if each element in the horizontal rung is "true". In this manner, it will be recognized that horizontally linked elements are ANDed together, while vertically linked elements are ORed. Each rung may be cross-referenced and nested to other individual rungs to achieve the desired logical output. The output of each rung may comprise an "enable," "latch" or "unlatch" signal, depending on the nature of the timing utilized in the particular program.

Computer 2901 primarily controls analog input/output to the various elements of sputtering apparatus 10 via a SIXNET network interface 2903, such as that manufactured by Digitronix SIXNET, Inc., Clifton Park, N.Y., although some digital input/output functions are handled by the computer 2901. The SIXNET network interface 2403 is coupled to computer 2902 via 307,200 baud SIXNET Model 60-232/N-DL network modem (not shown) coupled to a RS-232 serial port on, for example, a peripheral extension card provided in an expansion slot of computer 2901. Such an extension card may comprise, for example, an IBM Real Time Interface Co-Processor (ARTIC) card manufactured by International Business Machines, Boca Raton, Fla.

In order to handle a sufficient quantity of digital and analog I/O, the network interface 2903 comprising a SIXNET I/O network may include eight SIXNET 60 I/O MUX-FEB multiplex stations, each of which may include two RS-232 serial ports or alternative expansion capability, and sixteen dedicated I/O terminals. The multiplex stations are interlinked by the 307K baud SIXNET network interface. Data I/O of each such station may be configured as the constraints of the physical facility and sputtering apparatus 10 require to couple the necessary I/O signals to the network interface 2903. Network interface 2903 may include SIXNET 60-A/D 16–32 analog-to-digital converters, 6-D/A 12B-8 digital-to-analog converters, and 6-I032 FET digital/analog input/output modules to handle additional digital and analog I/O as required.

Programmable logic controller 2902 and computer 2901 may communicate via a data highway 2911, utilizing an RS-232 serial bus coupled between one RS-232 serial port of the ARTIC peripheral card (discussed above) located in computer 2901, and an Allen Bradley 1171-KF2-B communications interface 2911. Interface 2911 is coupled to programmable logic controller 2902 via serial data highway 2912.

Computer 2901 utilizes a user interface and system control software to monitor, control, generate alarms and store data for apparatus 10. One such software suitable for this purpose is "The Fix", produced by Intellution Corporation, Norwood, Mass. The software allows development of a graphic interface environment for data input/output by creating signal control databases linking the particular interface environment to specific control signals output from, and data sensing signals input to, computer 2901. Thus, input data is transmitted via network interface 2903 from the various components of apparatus 10 to computer 2901 to be provided as direct readout to the user I/O environment created using the interface and control software to provide easily readable data to the system operator and/or to create output flags to programmable logic controller 2902.

A limited number of output signals are provided by The Fix software to programmable logic controller 2902. These signals comprise combinational results of specific input signals and act as triggers for programmable logic controller 2902. This specific programming code utilized in "The Fix" software to generate these signals is included as Section N.

As with the particular process controllers utilized in the present invention, it will be noted by those skilled in the art that the particular software utilized in the process controllers to provide data input/output is not crucial to the substance of the invention; any suitable process control software may be utilized within the scope of the invention to generate any number of suitable user interfaces.

A second, IBM compatible computer 2907 is coupled to programmable logic controller 2902. Computer 2907 may be utilized as a separate programming computer allowing on-line monitoring, debugging, and programming of the ladder logic software in programmable logic controller 2902 utilizing a debugging software, such as that manufactured by ICOM Incorporated, Milwaukee, Wis.

User interfaces are provided for both programmable logic controller 2902 and computer 2901. User interface 2905 coupled to programmable logic controller 2902 may comprise a NEMATRON touch screen, manufactured by NEMATRON, Inc., Ann Arbor, Mich., which allows data input/output through a series of custom designed, touch sensing, display screens. When utilizing the NEMATRON touch-screen with the Allen Bradley PLC-5, a BASIC module 2906 is provided in the Allen Bradley and coupled to the NEMATRON. The BASIC module is utilized for selecting the display screens on the NEMATRON and for linking particular screen input/output to the data input/output of the Allen-Bradley PLC-5.

Computer 2901 is coupled to user interface 2904, which preferably comprises a standard high resolution graphics display monitor and keyboard. An EGA or VGA type high-resolution graphics display, such as the NEC Multisync II, manufactured by NEC Information Systems, Inc., Boxborough, Mass. is suitable for use as user interface 2904. Again, it should be understood that any conventional input/output interface may be utilized with the process controllers of the electronic control system while remaining within the scope of the invention.

The electronic control system of the present invention governs three major functions: movement of the substrate through apparatus 10; sputtering process control within apparatus 10; and status indication for apparatus 10. Referring to FIG. 29, movement of the pallet 800 and disk substrate 510 through the process is governed by the electronic control system through motor control system 2910, position sensing system 2915, and door control system 2920. Process control and status indication are governed by mechanical pump control system 2925, pump valve and vent control system 2930, cryogenic pump and compressor control system 2935, vacuum valve control system 2940, gas flow control system 2945, gas pressure control system 2950, heater control system 2955, substrate temperature sensing system 2960 sputtering power supply control system 2965, coolant control system 2970, gauge control system 2975 and residual gas analyzers 2980.

With reference to FIG. 29, the elements of the electronic control system, and their relationship to programmable logic controller 2902, computer 2901, and network interface 2903 are hereinafter described. It should be understood by those skilled in the art that the elements defined in FIG. 29 are arranged in the manner shown for explanation purposes only; various modifications of the system are contemplated as being within the scope of the invention.

1. Motor Control System 2910

Movement of the substrate through in-line sputtering apparatus 10 is controlled by the substrate transport system, discussed with the reference to FIGS. 8–11. As noted therein, each separate transport platform 2400 has a variable speed motor assembly associated therewith and coupled thereto controlling the velocity of the substrate movement at that specific platform in the transport system loop.

With respect to apparatus 10, nineteen (19) individual transport platforms are provided to carry the substrate through the seventeen (17) chambers of sputtering apparatus 10, and load and unload ramps, 210, 212, respectively. Nineteen motors M3–M21 are controlled by three BAM-8 Berkeley Axis Machine (BAM) multi-access servo controllers (not shown). Each BAM-8 can simultaneously control up to eight axis of high performance servo motors, and provide multiple, preset, user-defined motor speeds for each axis, allowing digital input signals to activate preprogrammed control sequences for each axis controlled by each particular BAM-8. Each BAM-8 provides eight separate variable voltage output signals, one per axis, to the motor assemblies to control motor speed and, consequently, the velocity of the target substrate at each particular platform in the transport system. Each BAM-8 is preferably coupled by one RS-232 port from one of the eight SIXNET multiplex stations to each BAM-8.

Two sets of nineteen digital outputs from programmable logic controller 2902 provide motor velocity control signals M3F–M21F, M3S–M21S to the BAM-8 motor controllers. The two-bit control signal provided by signals M3F–M21F, M3S–M21S allows two individual forward speed settings, start/stop, and, forward/reverse direction to be controlled by programmable logic controller 2902. Nineteen additional digital outputs from programmable logic controller 2902 provide motor interrupt signals M3I–M21I to the BAM motor controllers.

Thirty-eight (38) analog output signals DMOTLO1–DMOTLO21, DMOTHI1–DMOTHI21 are provided for selection of individual motor speed set points of motors M3–M21. The high and low speed setpoints defined by DMOTL01–DMOTLO21, DMOTHI1–DMOTHI21 define the motor speeds controlled by signals M3F–M21F, M3S–M21S from programmable logic controller 2902; once set, the BAM-8 automatically controls each motor to meet the desired setpoint state. Optimal motor setpoints are listed in Table 1:

TABLE 1

| | Setpoints (ft./minute) | |
|---|---|---|
| Motor # | Fast | Slow |
| M3 | 12.0 | 7.5 |
| M4 | 12.0 | 7.5 |
| M5 | 12.0 | 6.0 |
| M6 | 6.0 | 6.0 |
| M7 | 6.0 | 6.0 |
| M8 | 6.0 | 6.0 |
| M9 | 12.0 | 6.0 |
| M10 | 12.0 | 6.0 |
| M11 | 12.0 | 6.2 |
| M12 | 12.0 | 6.2 |
| M13 | 6.0 | 6.2 |
| M14 | 6.0 | 6.0 |
| M15 | 6.0 | 2.7 |
| M16 | 6.0 | 2.7 |
| M17 | 12.0 | 2.7 |
| M18 | 12.0 | 6.0 |
| M19 | 12.0 | 6.0 |
| M20 | 12.0 | 6.0 |
| M21 | 12.0 | 6.0 |

Hence, motor control system 2910 provides multiple velocity movement of a substrate through the sputtering apparatus which is useful for controlling a plurality of substrates moving through the sputtering system simultaneously.

2. Substrate Position Detection System 2915

Substrate position detection system 2915 represents the capability of electronic control system to detect and monitor movement of all substrates entering, exiting, or passing through apparatus 10. Fifty-seven pallet position sensors SEN1–SEN57 may be provided in chamber modules 12–30, and entrance and exit platforms 210, 220 to inform programmable logic controller 2902, (and the system operator) of the exact position of each substrate in apparatus 10. Generally, three sensors per pallet platform are provided. Preferably, optical position sensors are utilized in chambers 14 and 16 due to their ability to withstand the high temperatures present in those chambers. It should be recognized that it is preferable to provide three sensors per platform for greater accuracy in determining substrate position; in the present embodiment, to improve durability, only two position sensors are utilized in chambers 14 and 16 to reduce sensor failure rates. Each sensor SEN1–SEN57 provides a digital output signal to programmable logic controller 2902 indicating the presence or absence of a substrate at the sensor's position. Such a comprehensive position detection system provides fault detection in the event a substrate becomes jammed at any point in the sputtering process, permitting the user to compensate for such problems and forestall problems on subsequent substrates in apparatus 10.

Twenty-one additional pallet position sensors (not shown) are provided on the twenty transport platforms utilized in return path 50 (two on the last platform before load station 40). Each such sensor output signal may be provided to programmable logic controller 2902, as shown in FIG. 12; alternatively, return path sensor signals may be provided to a separate programmable logic controller.

3. Door Control System 2920

Twelve chamber isolation doors D1–D12 are provided to separate certain individual ones of compartment chamber modules 12–30. Each door D1–D12 is operated by a pair of pneumatic cylinders (not shown), each cylinder having a pair of solenoid triggers responsive to DROP and DRCL signals to each cylinder in a direction to open or close the door, respectively. Movement of each of doors D1–D12 is governed and detected by door control system 2920. Twenty-four (24) dedicated digital outputs from programmable logic controller 2902 provide pulsed control signals to door open solenoids DROP1–DROP12, and door close solenoids DRCL1–DRCL12.

Additionally, door position sensors are provided to detect each door's opened or closed state for the control system software. Door open sensors DROP1S–DROP12S and door closed sensors DRCL1S–DRCL12S provide direct digital output signals to twenty-four (24) digital inputs of programmable logic controller 2902.

A high pressure air supply (not shown) is used in the sputtering apparatus to provide the requisite air pressure for the pneumatic valves, including door cylinders, high vacuum valves, and other such system components. Primary air sensor APS detects the existence of the high pressure air supply and the absence of a ABS detection signal input to one input of programmable logic controller 2902 initiates a system shutdown override. In addition, eight pressure switches PS1–PS8 are provided to check for the existence of discrete pressure states at various points in the pumping system and apparatus 10. Switches PS1–PS8 redundantly check for a lack of evacuation pressure in pumping conduits in apparatus 10 in the position as shown. Eight digital output signals indicating the detection, or lack thereof, each discrete pressure state are input to programmable logic controller 2902.

4. Mechanical Pump Control System 2925

Three mechanical roughing pumps MP1–MP3 and blowers BL1–BL3 provide initial vacuum pumpdown of sputtering apparatus 10, and explosive pumpdown in load lock 12 and exit lock 30 in accordance with the description of the pumping system discussed in section F of this specification. Mechanical pumps MP1–MP3 provides high speed pumping up to approximately 20–50 mTorr, while blowers BL1–BL3 provide pumping down to about 1 mTorr before the cryo pumps engage. Mechanical pumps MP1–MP3 and blowers BL1–BL3 thus act in concert to provide rapid pumping of apparatus 10.

On/off controls for mechanical pumps MP1, MP2, and MP3, and blowers BL1, BL2, and BL3, are provided by six digital output signals from programmable logic controller 2902.

5. Mechanical Pump valve and vent Control System 2930

Five roughing valves RV1–RV5 isolate mechanical roughing pumps MP1–MP3 and blowers BL1–BL3 from chambers 12–30 of sputtering apparatus 10. In addition, five chamber vent valves CV1–CV5 allow for venting chambers 12, 18, 22B, 22D, and 30 between the evacuated, sputtering atmosphere and the ambient environment outside apparatus 10.

Mechanical pump valve and vent control 2930 controls roughing valves RV1–RV5, monitored by roughing valve sensors RVS1–RVS10, and chamber vent valves CV1–CV5, monitored by chamber vent sensors CVS3–8. In the absence of sensors associated with any valves, the on/off condition of any valve can be determined by referencing the software output commands (for example, for valves CV1 and CV5).

Thirteen outputs of programmable logic controller 2902 are provided to mechanical pump valve and vent control 2930. A first set of five outputs controls the open/close state of roughing valves RV1–RV5, a second set of five outputs controls the open/close state of chamber vent valves CV1–CV5, and a third set of three outputs controls the open/close state of pump vent valves PV1–PV3. In addition, twenty dedicated digital inputs of programmable logic controller 2902 are provided for signals received from roughing valve sensors RVS1–RVS10 and chamber vent valves sensors CVS3–CVS8. Roughing valve sensors RVS1–RVS10 and chamber vent valve sensors CVS3–CVS8 provide state signals to programmable logic controller 2902 to indicate the state of each respective valve CV2–CV4 monitored, thereby allowing the user and the system to more accurately monitor pumpdown and venting of the system. Additional chamber vent valve sensors may be provided on chamber vent valves CV1 and CV5, however because of the high usage of these values, sensor failure occurs rapidly.

6. Compressor and Cryogenic Pump Regeneration Control System 2935

The electronic control system includes a cryogenic pump regeneration and compressor control 2935 which controls the start/stop function of compressors CY1–CY12, nitrogen supply N2, and nitrogen heaters NIH1–NIH12. In addition, cryogenic pump and compressor control 2935 provides on/off control to sieve heaters SVHTR1–SVHTR12 and sieve valves SVIV1–SVIV12, used in flushing contaminants from cryogenic pumps C1–C12 during the cryogenic pump regeneration process discussed above. Nitrogen supply N2 and heaters NIH1–NIH12 are also used to flush and clean cryogenic pumps C1–C12.

As discussed above in section F of this specification, cryogenic pumps C1–C12 are provided to create an evacuated environment in chambers 12–30 in accordance with the sputtering process of the present invention. Compressors CY1–CY8 (FIGS. 3 and 12) provide helium gas to cryogenic pumps C1–C12 to enable cryogenic pumps C1–C12 to create the necessary vacuum in sputtering apparatus.

Eight outputs of programmable logic controller 2902 control the start/stop state of compressors CY1–CY8.

Eight nitrogen flow sensors NIFS1–NIFS8 detect and insure the presence of nitrogen to nitrogen flow heaters NIH1–NIH12. Eight programmable logic controller 2902 digital inputs receive flow detection signals from sensors NIFS1–NIFS8. Twelve digital outputs of programmable logic controller 2902 control the start/stop functions for nitrogen heaters NIH1–NIH12. An additional twelve digital outputs of programmable logic controller 2902 provide open/close state control over nitrogen flow valves NIF1–NIF12.

Also included in cryo regeneration and compressor control 2935 are sensors, not shown, coupled with cryo pumps C1–C12 to monitor the temperature of cryo pumps C1–C12 during the cryo regeneration process and during the sputtering process. Twelve analog network interface 2403 inputs receive the analog temperature signals TD1–TD12, over a range of 3° K.–350° K.

Cryo roughing valves CR1–CR12 are provided to control outgassing of cryogenic pumps C1–C12 through sieve heaters SVHTR1–SVHTR12. As noted above, cryo roughing valves CR1–CR12 function in concert with sieve heaters SVHTR1–SVHTR12 in removing contaminants from cryo pumps C1–C12 during the cryo regeneration process. The open/close states of cryo roughing valves CR1–CR12 are controlled by twelve digital outputs of programmable logic controller 2902.

Control of sieve heaters SVHTR1–SVHTR12 and sieve valves SVIV1–SVIV12 is provided by 24 digital outputs of programmable logic controller 2902: twelve (12) digital outputs of programmable logic controller 2902 control the start/stop functions of sieve-heaters SVHTR1–SVHTR12; twelve outputs of programmable logic controller 2902 control sieve-isolation valves SVIV1–SVIV12.

7. Vacuum Valve Control 2940

Vacuum valve control 2940 provides on/off switching control for, and receives feedback from, high vacuum valves HV1–HV12 coupled between cryogenic pumps C1–C12, and sputtering apparatus 10. Feedback for high vacuum valves HV1–HV12 is provided by 32 high vacuum sensors HV1S1, HV1S3, HV2S1, HV2S2, HV2S3, . . . HV12S1, HV12S2, HV12S3.

High vacuum valves HV2–HV11 are three state (OPEN, CLOSED, and THROTTLE) operation valves. The THROTTLE state is used during operation of the sputtering system to maintain the vacuum level sputtering apparatus, subsequent to initial pumpdown, as the needs of each particular chamber require. High vacuum valve HV1 operates as a two-state (open/closed) valve, and is utilized with baffle 1210. Twenty-four (24) digital outputs (HV1_1, HV1_2, HV2_1, HV2_2, . . . , HV12_2) are dedicated by programmable logic controller 2902 to provide twelve, two-bit control signals for high vacuum valves HV1–HV12 and baffles 1210, 1214, to select one of the three states of valve operation discussed above for valves HV2–HV12, or two states for valve HV1, and enable/disable baffles 1210, 1214. Thirty-five (35) digital inputs of programmable logic controller 2902 monitor high vacuum sensors HV1S1–HV12S3 for respective valves HV1–HV12. One sensor is provided for each operational state of each high vacuum value as applicable.

8. Gas Flow Control 2945

Gas flow control system 2945 controls the sputtering gas supply for apparatus 10.

Flow control for the primary and secondary gasses, discussed above, may be accomplished through use of eight MKS Instruments, Inc., (Andover, Mass.) model 2259B mass flow meters and flow controllers, including MKS model 246 readout displays. Eight isolation valves GF1–GF8 are located between each 2259B mass flow meter and its associated model 246 display. Eight flow control valves FLO1–FLO8 control the flow rate of the primary and secondary gases.

Eight digital outputs of programmable logic controller 2902 are dedicated to control the open/close state of isolation valves GF1–GF8. Computer 2901 receives eight analog input (0–5 volt) flow measurement signals (designated FLO1–FLO8 by "THE FIX") to monitor gas flow via the model 2259B mass flow meters. Flow setpoints of flow controller valves FLO1–FLO8 of the model 2259B mass flow meters are controlled by eight 0–5 volt output signals FLOST1–FLOST8 through network interface 2903 under the control of computer 2901.

9. Gas Pressure Control System 2950

In conjunction with gas flow control system 2945, discussed above, gas pressure control system 2950 monitors and controls pressure in apparatus 10 through a series of four capacitance manometers CM1–CM4, each capacitance manometer CM1–CM4 being separated from apparatus 10 by an associated isolation valve CHV1–CHV4. Each capacitance manometer CM1–CM4 and isolation valve CHV1–CHV4 may comprise, for example, MKS model 390H and 270B capacitance manometers manufactured by MKS Instruments, Inc., supra. MKS model 390H and 270B capacitance manometers include outputs providing analog output signals to computer 2901 for monitoring the gas pressure measured thereby, and digital signal inputs to allow for variable control of the metering range of each capacitance manometer or CM1–CM4. Generally, capacitance manometers CM1–CM4 monitor pressure in apparatus 10 subsequent to evacuation of chambers 14–29 by mechanical pumps MP1–MP3. Specifically, gas pressure monitoring during pump-down of apparatus 10 is provided by twenty pirani gauges PIR1–PIR20; at crossover, the point at which evacuation by mechanical pumps MP1–MP3 blower BL1–BL3 ceases and pumping by cryogenic pumps C1–C12 begins, capacitance manometers CM1–CM4 are used.

Four outputs of programmable logic controller 2902 are dedicated to control open/close states of isolation valves CMV1–CMV4. Four inputs of network interface 2903 receive analog pressure readouts (designated CM1–CM4 by "THE FIX") of capacitance manometers CM1–CM4. Eight discrete outputs of network interface 2903 are dedicated to provide 2-bit digital signals CMR1.1, CMR2.1, CMR1.2, CMR2.2, CMR1.3, CMR2.3, CMR1.4, CMR2.4 to control the pressure metering range of capacitance manometers CM1–CM4.

10. Heater Control System 2955

Substrate heating, including dwell heating in chamber 14 and passby heating in chamber 16, to maintain a uniform temperature gradient over the substrate surface is governed by heater control system 2955. Control of both the "dwell" and "passby" heater banks 1510A, 1510B, 1510C, 1510D, 1620A, 1620B, 1620C, 1620D, 1818A, 1818B, 1818C, 1920A, 1920B, 1920C, 1920D, discussed in Section H of this specification, may be provided by eight Emerson Spectrum III Heater Controllers, manufactured by Emerson Industrial Controls, Grand Island, N.Y. The Emerson Spectrum III controllers allow digital heater temperature setpoint control of the quartz lamp heating elements discussed in section H. Thus, heater setpoints once set will be maintained by each Spectrum III.

In the present embodiment, heater control system 2955 thus utilizes: eight digital outputs of programmable logic controller 2902 providing on/off control signals RH1A–RH3C to the Emerson Spectrum III controllers; eight digital outputs of programmable logic controller 2902 controlling high/low output enable HH1A–HH3C for the Emerson Spectrum III controllers; eight inputs of programmable logic controller 2902 receiving heater fault signals H1A0FLT–H3C0FLT; eight analog outputs from network interface 2903 controlling the voltage setpoints of heater bank sets 1510A/1510B, 1510C/1510D, 1620A/1620B, 1620C/1620D, 1818A/1818D, 1818B/1818E, 1818C/1818F, 1920A/1920B, and 1920C/1920D, and eight analog inputs to network interface 2903 monitoring each heater bank set's current setpoint output HSP1–HSP8.

A preferable embodiment of heater control system 2955 would provide individual control of each of heater banks 1510A–1510D, 1620A–1620B, 1818A–1818D, and 1920A–1920D. Such an embodiment would include additional hardware lines to control each of the heater banks coupled to the electronic control system. In an embodiment using Emerson Spectrum 3 controllers, sixteen such controllers would be utilized and sixteen digital outputs of programmable logic controller 2902 would be needed to provide on/off control signals, sixteen digital outputs of programmable logic controller 2902 would be required to provide high/low output enable signals, sixteen additional outputs of programmable logic controller 2902 would be utilized for heater FALSE signals, sixteen analog outputs from network interface 2903 would be needed to control voltage setpoints of the heater banks, and eight analog input signals to network interface 2903 would be utilized to monitor each heater banks current setpoint output.

11. Substrate Temperature Sensoring System 2960

Six Mikron temperature sensors (not shown) may be provided at various locations throughout the sputtering apparatus in a movable configuration to measure the temperature gradient over the surface of the substrate as it proceeds through various sections of the sputtering apparatus. The Mikron sensors provide 0–5 volt analog output signals TEMP1–TEMP6 through network interface 2903 for output to user interface 2904, thereby allowing the system operator to monitor at every cycle and react each heater bank 1818A–1818C output to maintain a uniform temperature gradient across the surface of the substrate as it proceeds through the apparatus. In general, sensors may be provided in chamber 16 or 18.

12. Power Supply Control System 2965

Power supply control system 2965 controls twenty-four (24) designated forty-eight (48) actual, in master-slave configuration), power supplies PS1A, PS1B, . . . PS12A, PS12B which provide high power output to the sputtering magnetrons utilized in Chambers 20, 26 and 28 of sputtering apparatus 10. Power supplies PS1A–PS12B may be Model MDX-20X 20KW DC Plasma Power Supplies, Manufactured by Advanced Energy Industries Corporation, Fort Collins, Colo., capable of providing constant current, power, or voltage, and remote control thereof.

Control signals for power supply control 2965 are entirely controlled by computer 2901 through network interface 2903. One hundred forty-four inputs of network interface 2903 are utilized as follows:

| # of INPUTS | Signal Designation | Function |
|---|---|---|
| 24 | PSLS1A-PSLS12A<br>PSLS1B-PSLS12B | read power supply set point level |
| 24 | PSC01A-12A<br>PSC01B-12B | read power supply current output |
| 24 | PS01A-12A<br>PS01B-12B | read power supply power output |
| 24 | PSTL1A-12A<br>PSTL1B-12B | read sputtering target life calculation in power supply |
| 24 | PSARC1A-12A<br>PSARC1B-12B | read power supply arc detect sense from power supply |
| 24 | PSSR1A-PSSR12A<br>PSSR1B-PSSR12B | read power supply set point signal reached |

One hundred six analog and digital outputs of network interface 2903 are provided to the power supplies as follows:

| # of OUTPUTS | Signal Designation | Function |
|---|---|---|
| 24 | PSVO1A-PSVO12A<br>PSVO1B-PSVO12B | (set) power supply voltage output |
| 24 | PSM1.1-1.12<br>PSM2.1-2.12 | (digital) mode control signals (12 × 2) |
| 24 | PSON1A-12A<br>PSON1B-12B | (digital) on/off signals (12 × 2) |
| 3 | PSIV1-3 | (digital) indicating vacuum chamber interlocks intact |
| 3 | PSIW1-3 | (digital) indicating water interlocks intact |
| 3 | PSIX1-3 | (digital) indicating heater cover interlocks intact |
| 1 | PSRES | (digital) emergency stop restore |

The aforesaid input signals to network interface 2903, including level set point signals, voltage output signals, current output signals, power output signals, target life signals, arc out signals, and set point reached signals, yield precise data feedback for provision to both the user and the control system software to monitor power supply performance. Interlock control signals PSTV1–PSTV3, PSTW1–PSTW3, PSTX1–PSTX3 are coupled to sensors (not shown) on interlock protective covers 2305 of sputtering apparatus 10 to cut out power supply output if the signals are tripped by an open interlock protective cover 2305 thereby preventing operator injury.

13. Coolant Control 2970

Circulating coolant fluid, such as water, is provided to various components of the sputtering apparatus to maintain temperatures within acceptable operating levels during production thereby forestalling rapid depletion of these system components. Specifically, coolant is provided to heaters 1512, shields 2230, compressors CY1–CY8, and sputtering cathodes 2222.

Coolant control system 2970 monitors the temperature level of the circulating coolant flow in the coolant system and controls the open/close states of coolant flow control valves. While the particular layout of the coolant flow system is not shown, it will be understood by those skilled in the art that any suitable number of coolant control schemes may be utilized within the scope of the present invention. The location of coolant flow sensors CHR1A/CHR1B–CHR4A/CHR4B; MAG5A/MAG5B–MAG8A/MAG8B; CAR9A/CAR9B–CAR12A/CAR12B, is shown in general form in FIG. 12.

Coolant flow control 2970 includes 24 magnetron cathode coolant flow sensors CHR1A/CHR1B–CHR4A/CHR4B; MAG5A/MAG5B–MAG8A/MAG8B; CAR9A/CAR9B–CAR12A/CAR12B, six sputtering shield coolant flow sensors CHRS1–CHRS2; MAG1–MAG2, and CARS1–CARS2, and six heat shield coolant flow sensors HSFS1–HSFS6. Each of these sensors provides a digital output signal to one input of programmable logic controller 2902. Six water supply flow control valves CHSUV1–CHSUV2, MAGSUV5–MAGSUV6, and CARSUV9–CARSUV10, two supply valves per sputtering chamber, and six water return path valves CHRTV3 CHRTV4, MGRTV7–MGRTV8, CARTV11–CARTV12, two return path valves per sputtering chamber, are provided. Twelve outputs from programmable logic controller 2902 control the open/close states of the water supply valves and the water return path valves.

In addition, two main coolant on valves HH201 and HH202 are controlled by programmable logic controller 2902.

14. Pirani and Ion Gauge Control 2975

Gauge control 2975 also monitors the outputs of each pirani gauges PIR1–PIR20 and ion gauges monitoring residual ion contaminants in sputtering apparatus.

Vacuum pressure during the pumpdown process prior to crossover between mechanical pumps MP1–MP3, blowers BL1–BL3 and cryogenic pumps C1–C12, is monitored by twenty (20) pirani gauges PIR1–PIR20 provided in the pumping conduits linking cryo pumps C1–C12 with sieve valves SVIV1–SVIV12, in chambers 12, 14, 20, 26, 28, 29 and 30 of sputtering apparatus 10, and in the conduit linking pump MP2 and blower BL2 with apparatus 10. Twelve pirani gauges PIR3–5, PIR7–9, PIR12–14 and PIR18–20 monitor pressure during outgassing in the region between cryo pumps C1–C12 to cryogenic roughing valves CR1–CR12. Seven pirani gauges PIR1, PIR2, PIR6, PIR11, PIR16, PIR15, and PIR17 to pressure monitor of chambers 12, 14, 20, 26, 28, 29 and 30.

Analog signals in the range of 0–10 volts are output from gauges PIR1–PIR20 to indicate the measured pressure reading of each gauge and are provided to the network interface 2903. Twenty digital signals (designated PIR1–PIR20) provided to programmable logic controller 2902 inputs to indicate the crossover point set for switchover between mechanical pumps MP1–MP3, blowers BL1–BL3, and cryogenic pumps C1–C12.

Four ion gauges IGI–IG4 (not shown) measure the level of background gas (i.e., water contamination) in chambers 14, 20, 26 and 28 of sputtering apparatus 10. Analog output signals ION1–ION4 are provided by gauge control 2975 network interface 2903 for output to user interface 2904 to provide the system operator with data for controlling the pump-down process.

In the preferred embodiment of the present invention, the pirani gauges and ion gauges are coupled through INFICON gauge monitor subsystems, manufactured by Leybold-Heraeus, Hanau, Germany, which provide an independent power source and hardware for use with the pirani gas and ion gauges discussed above.

15. Residual Gas Analyzers 2980

Residual gas analyzers RGA1–RGA4 are utilized with sputtering apparatus 10 to monitor system status. Isolation of the residual gas analyzers RGA1–RGA4 is controlled by the electronic control system by means of four isolation valves RGAV1–RGAV4. Four dedicated outputs of programmable logic controller 2902 are provided to residual gas analyzers RGA1–RGA4 to open and close analyzer isolation valves RGAV1–RGAV4.

Sensors RGAS1–RGAS4 are provided to four inputs programmable logic controller 2902 to provide a status indication of residual gas analyzer valves RGAV1–RGAV4 indicating valve's opened or closed state.

System Control Software

Figure 30:
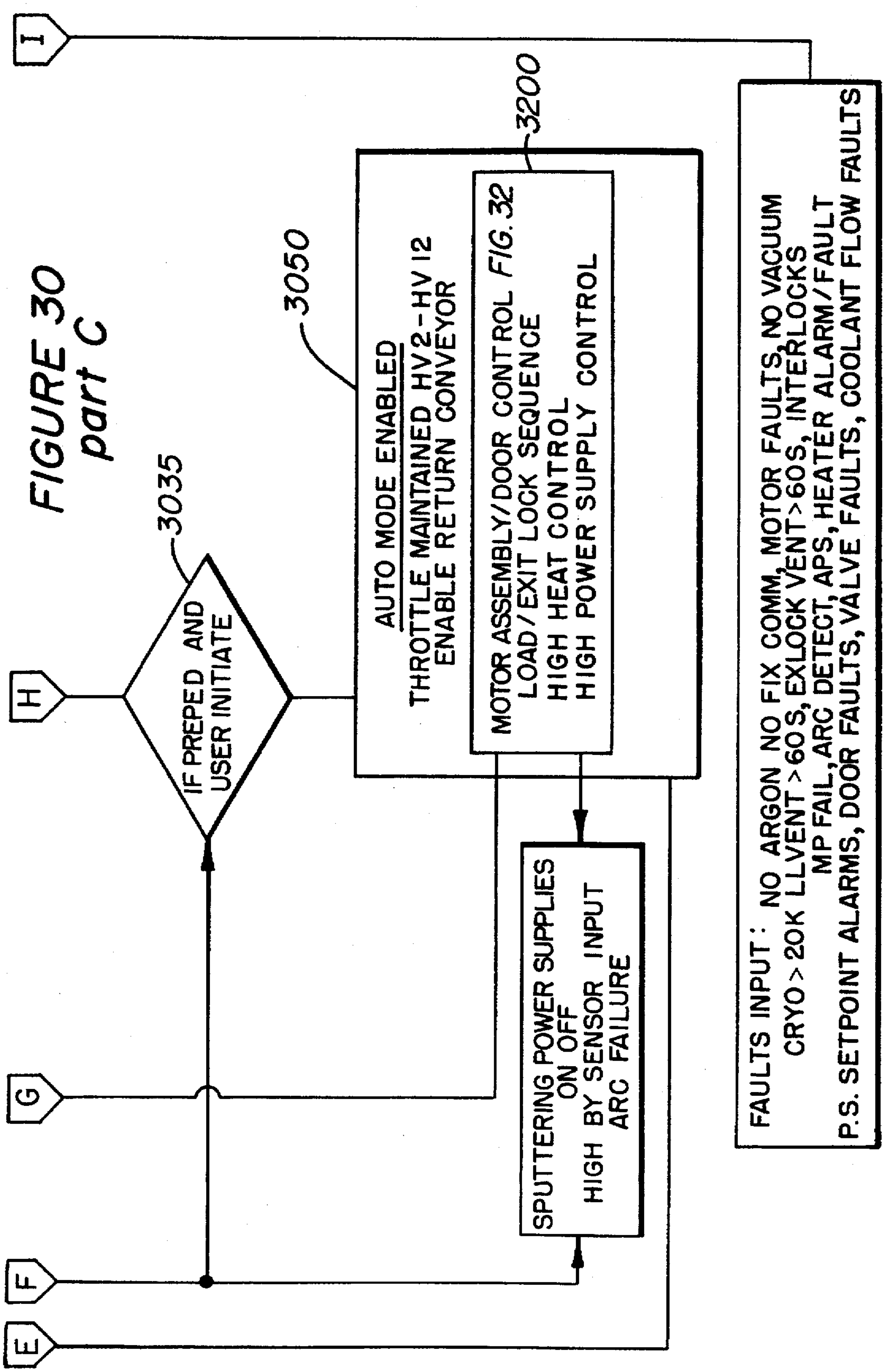
FIG. 30 is a block flow chart of functional aspects of the software utilized in the process controller(s) of the present invention.

FIG. 30 is an overview flow-chart diagram of the system control software of the present invention. It should be noted that the following description is intended to be a general discussion of the capabilities and functions of the system software. Specific software functions and capabilities will be understood by one skilled in the art after a review of the source code in Sections M and N. It should be further noted that the following discussion does not differentiate between those functions controlled by programmable logic controller 2902 and computer 2901. As will be recognized by those skilled in the art, any of the functions described with respect to FIGS. 30–32 may be performed by a single process controller or multiple process controllers. The preferred embodiment for performing each of the functions outlined in FIG. 30 is shown in FIG. 29 and detailed in the source code sections.

As shown in FIG. 30, the software architecture is designed to allow both manual and automatic control of select system functions. Certain processes are automated while others depend on comprehensive feedback provided to the user (system operator) allowing the system operator monitor and react to such feedback to make adjustments in particular operating parameters (such as heater power level, and sputtering power supply output levels, etc.) to obtain optimal sputtering characteristics.

In the embodiment of the control software shown in FIG. 30, the user or system operator manually controls: gas flow valves GF1–GF8, residual gas analyzer isolation valves (RGAV1–RGAV4); passby and dwell heater setpoints (HSP1–HSP8); power supply and motor speed setpoints (PSSP1A–PSSP12B, DMOTLO1–DMOTLO21, DMOTHI1–DMOTHI21); the amount of time spent by a substrate in dwell heater chamber 14 (HTR1TMR); the amount of time the passby heater is on while a pallet is passing therethrough (HTR2ON_DLY); and an emergency stop and pause latch commands.

In addition, other elements such as coolant control, venting control, heater control, power supply control and cryopump system evacuation are manually initiated. Specifically, coolant control functions 3070 initiate coolant flow to heater shields 2230 and cathodes 2222–2225 in chambers 20, 26, and 28 upon manual power up of the system. Further, manual control is provided for some heater control functions 3075, such as selection of low and high heater setpoints. Manual control of the heater setpoints allows the user to monitor the output of the (Mikron) substrate temperature sensors and make adjustments to individual heater bank setpoints and/or substrate heating duration timers to achieve an optimal thermal effect on individual substrates moving through heater chambers 14 and 16. Additionally, manual control of some chamber vent functions 3015 allows for apparatus 10 to be vented in whole or in sections for machine maintenance.

Feedback block 3012 provides the user with such data as: argon pressure readout, substrate temperature, power supply output setpoints, motor speed setpoints, an ion & pirani gauge readouts. Additional data, such as that described above with respect to FIG. 29, is also provided to the system operator.

Referring to FIG. 30, apparatus 10 is generally maintained in a standby state 3028 at full vacuum, e.g., $1\times10^{-7}$ Torr. At system standby 3028, apparatus 10 has been pumped down to a high vacuum level by mechanical pumps MP1–MP3, blowers BL1–BL3 and cryopumps C1–C12. The system stand-by condition is usually maintained due to the time required to perform total system pumpdown.

As noted briefly above, system maintenance 3082 may be performed when apparatus 10 is on a section by section basis while venting only those sections necessary for maintenance purposes. In such cases, apparatus 10 is divided into five sections. Generally these sections comprise: chambers 12–14; chambers 18–24A; chambers 22B–24B; chambers 22D–24C; and chambers 29–30. Each of the five sections can be individually vented and pumped down under user control as required, depending on what access to apparatus 10 is required. In this regard, the chamber vent control functions 3015 allow the user to individually control of the opened or closed state of chamber vent valves CV1–CV5 depending on which section is to be vented. Automated section pump sequences 3010 are provided to control roughing down of each section 1–5 using pumps MP1–MP3 and blowers BL1–BL3, and high vacuum valves sequence 3030 to control valves HV1–HV12 as required, to reduce individual sections to high vacuum. Section pump sequence 3010 also ensures that doors D1–D12 are in their required opened or closed states with respect to the pumping or venting of the particular stage as required:

| | DOORS CLOSED | |
|---|---|---|
| STAGE | PUMP | VENT |
| 1 | D1–D3 | D1–D4 |
| 2 | D4–D6 | D3–D5 |
| 3 | D5–D8 | D6–D7 |
| 4 | D7–D10 | D8–D9 |
| 5 | D9–D12 | D10–D12 |

In the instance where chambers 12–30 of apparatus 10 have been fully vented and are at ambient atmosphere, an automated pump down sequence is provided to reduce the pressure of chambers 12–30 to approximately 50 mTorr. The user initiates the pump down system enable sequence 3020 which provides a check and setup for the pump-down process. A pump down timer PDSTMR is initialized which allows the pump down enable process to run for a maximum of 60 seconds before issuing a fault.

The enable process (PDSE) 3022 comprises: closing RV1–RV5; checking RVS1, RVS3, RVS5, RVS7, RVS9 to ensure valves RV1–RV5 are closed; enabling MP1–MP3; opening doors D2–D11 (within a limit of 3 seconds before outputting a fault); closing doors D1 and D12; and enabling compressors CY1–CY8. A pirani gauge check 3024 is performed to ensure that PIR2, PIR6, PIR11, PIR16, and PIR15 are less than 125 mTorr (or equivalent preset level between 100–250 mTorr) before the system opens baffles 1210 and 1214. At this point, apparatus 10 has reached a roughed down state 3028 wherein each chamber 12–30 is at a pressure of approximately 50 mTorr, and blowers BL1–BL3 and mechanical pumps MP1–MP3 are disabled (3029).

To reduce the pressure in apparatus 10 to a level conducive to sputtering, high vacuum valves HV1–HV12 must be fully opened to allow cryogenic pumps C1–C12 to pump apparatus 10. This sequence 3030 is initiated by a manual user input 3030*a* assuming the system has reached the roughed, crossover point 3028. At stage 3030, pirani gauges PIR2, PIR6, PIR11, PIR16, and PIR15, corresponding to individual pump sections 1–5, are checked before opening each respective high vacuum valve sets HV1–HV2, HV3–HV5, HV6–HV8, HV9–HV11, and HV12, respectively associated therewith. Once high vacuum valves HV1–HV12 are opened, cryogenic pumps C1–C12 will evacuate the internal environment of chambers 12–30 to a pressure of approximately $1\times10^{-7}$–$2\times10^{-7}$ Torr.

When apparatus 10 has achieved a pumped down state 3032, the auto run preparation mode 3034 must be initiated by a manual user input 3032*a*. Auto run preparation sequence 3034 involves: providing argon backfilling by opening GF3, GF5, GF7, and GF8; checking for no door-faults (DOORFAULT); check/enable mechanical pumps MP1 & MP3, and blowers BL1 and BL3; check and set dwell and passby heaters to low power setpoints; check and/or set doors D1–D3, D10–D12 closed, and doors D4–D9 open; and throttle HV2–HV12.

Once the system is prepared for auto run mode operation, a user input 3035 is required before the auto run mode 3050 is enabled. If the user input is made and the system is prepared, the auto mode is enabled. Auto mode functions 3050 include throttling high vacuum valves HV2–HV12 and enabling the transport stages of return conveyor path 50. In addition, auto mode 3050 includes the automatic run sequence 3200 controlling motor assemblies, door operation, load/exit lock pumping and venting, and high power supply/heat control described in FIG. 32. Sputtering power supplies PS1A–PS12B will have been manually preset to low power. It is noteworthy that coolant control sensors CHR1A–CHR4B, MAG5A–MAG5B, and CAR9A–CAR12B must indicate the presence of circulating coolant in cathodes 2222–2225 before power supplies PS1A–PS12B will be enabled.

Upon exiting auto mode 3050, apparatus 10 returns to a standby state wherein the dwell and passby heaters in chambers 14 and 16, respectively, are automatically switched off and auto run mode is disabled.

The software also provides a number of fault flags to the user to allow the user to correct potential problems or to hold processing of other logic rungs until correction of the fault is completed. Such faults may include, for example, argon gas flow failure detection (NO ARGON); a failure in communications between computer 2901 and programmable logic controller 2903 (NO FIX COMM); motor assembly faults; internal system pressure failures (NO VACUUM); cryogenic pump failures (CRYO>20° K.); load lock and exit lock venting problems (LLVENT>60 s, EXLOCK VENT>60 s); open protective covers on sputtering chambers 20, 26, 28, (INTERLOCKS); mechanical pump and blower failures (MP FAIL); power supply arc (ARC DETECT); air supply failsafe (APS); heater alarm/fault; power supply setpoint alarms; door faults (DOORFAULT); valve faults; and coolant flow faults.

Figure 31:
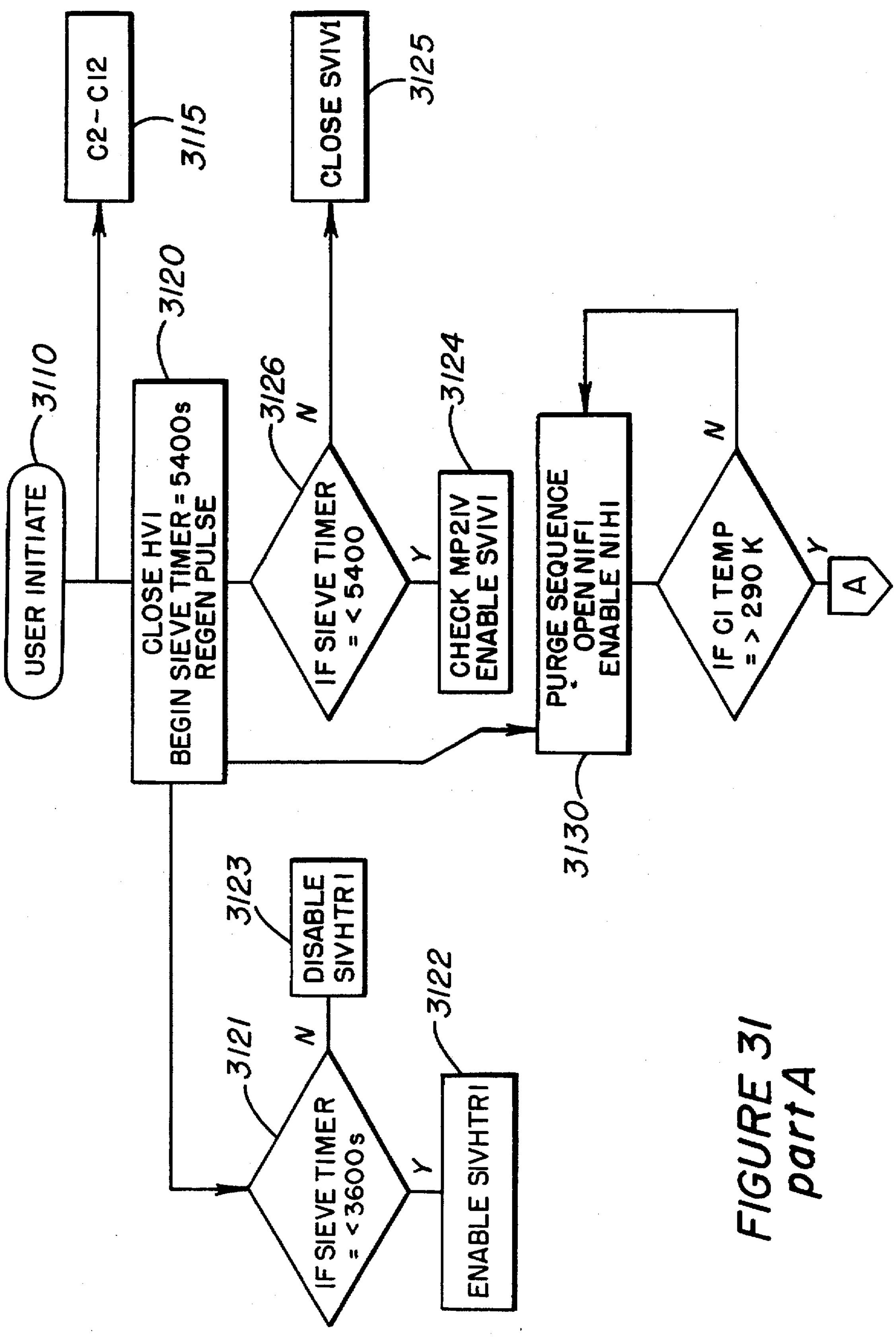
FIG. 31 is a flow chart of the automated cryogenic pump regeneration process of the present invention.
Figure 31:
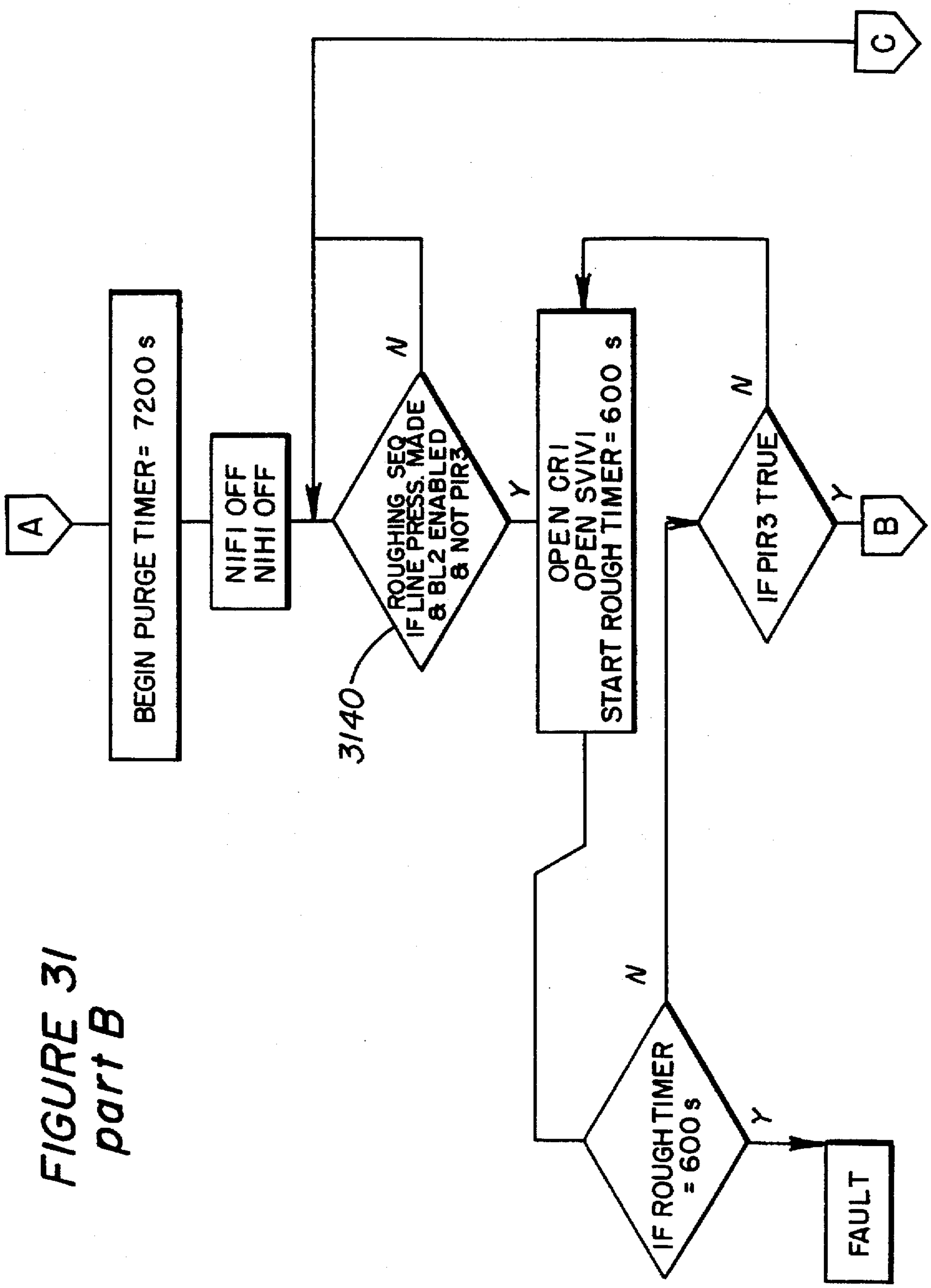
Figure 31:
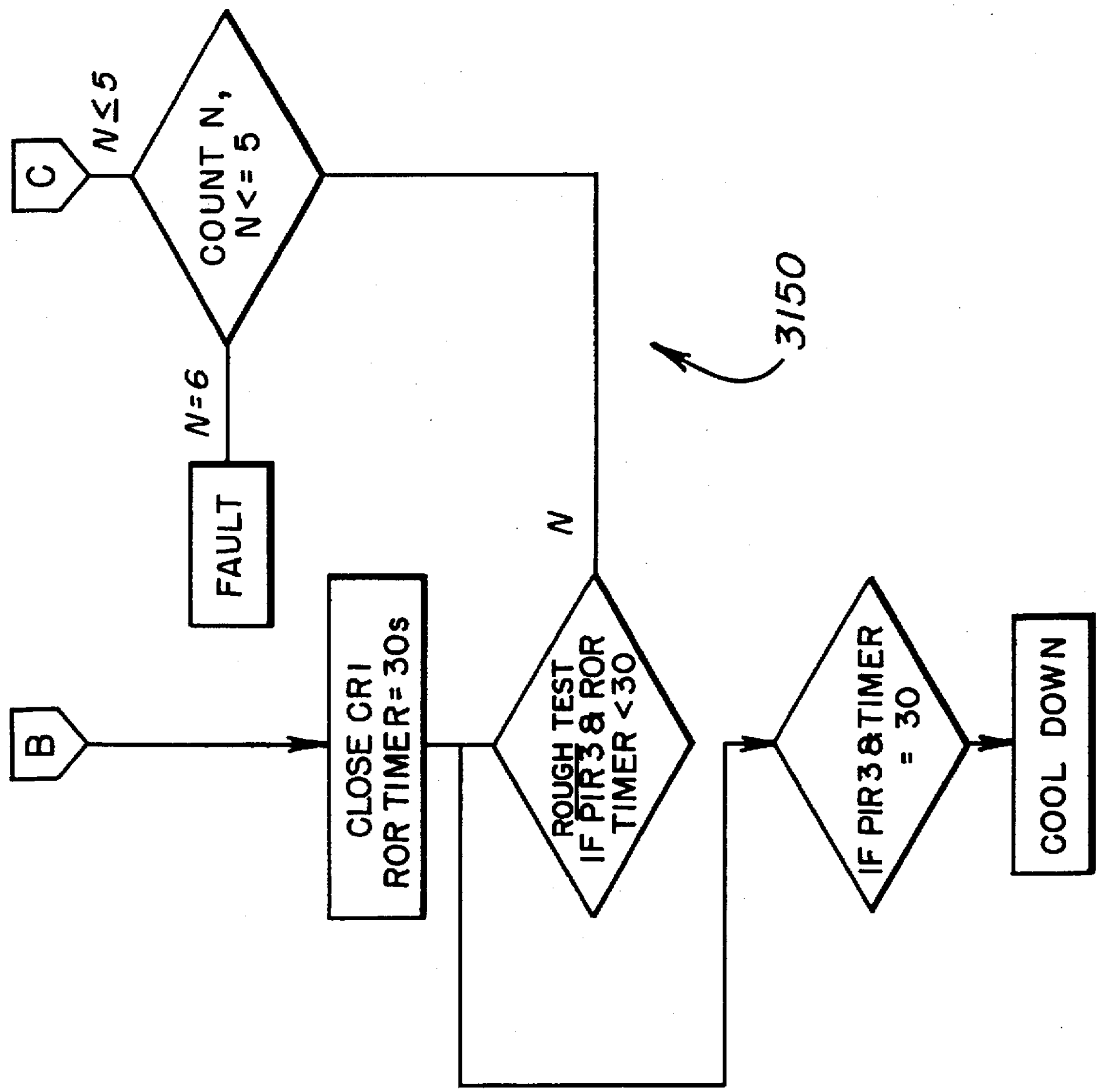

An automated process 3100 for regenerating (cleaning and purging) cryo pumps C1–C12 is also provided in the software of the present invention. Cryogenic pump regeneration process 3100 will be discussed with respect to FIG. 31. FIG. 31 is a flowchart showing the cryogenic pump regeneration process for a single cryogenic pump, C1. The regeneration processes for pumps C2–C12 are identical, using corresponding valves, gauges, and heaters, coupled to respective pumps C2–C12 as applicable, for each pump C2–C12 being regenerated.

In general, the cryogenic pump regeneration comprises raising the temperature of the cryogenic pumps, supplying the pumps with warm nitrogen, and enabling mechanical pump MP2 and blower BL2 to flush the contaminant materials agitated by the nitrogen flow out of the cryo pumps.

Cryogenic pump regeneration process 3100 is manually initiated by a user 3110. User initiation of the cryogenic pump regeneration process preferably enables simultaneous regeneration of all twelve cryogenic pumps 3115. The initial regeneration step 3120 entails closing HV1 and initiating a sieve trap timer with a total duration of 5400 seconds.

The sieve timer initiates enables sieve heater SIVHTR1 for 3600 seconds (3121, 3122). Further, mechanical pump isolation valve MP2IV is checked and sieve valve SVIV1 is opened (3124) for a duration of 5400 seconds (3126); valve SVIV1 is closed at the expiration of 5400 seconds (3125). In addition, the purge sequence 3130 is initiated.

Purge sequence 3130 opens nitrogen flow valve NIF1 and enables nitrogen heater NIH1. Sequence 3130 waits until the cryogenic pump has reached a temperature of 290° K. before initiating the purge timer with a duration of 7200 seconds. Purging of the cryogenic pump thereafter continues for 7200 seconds. When complete, NIF1 and NIH1 are closed and roughing sequence 3140 begins.

The roughing sequence involved initially checking to ensure that line pressure (PIR10) is TRUE, BL2 is enabled and PIR3 outputs false (pressure less than 250 mTorr). If these condition are met, cryo roughing valve CR1 and sieve valve SVIV1 are opened, and a roughing timer having a duration of 600 seconds is started. If roughing takes place for longer than 600 seconds a fault is generated. Otherwise, the system waits for PIR3 to output a TRUE condition before closing CR1.

After CR1 is closed, a ROR timer waits for 30 seconds to ensure PIR3 remains TRUE. If at any time before the expiration of thirty seconds a $\overline{\text{PIR3}}$ signal is received, the system counts one and returns to restart the roughing sequence. The system will perform ROR test 3150 generally for up to five cycles (and up to 20 cycles for pump C1) before outputting a fault.

If PIR3 remains TRUE and the ROR timer=30 seconds, the process goes to cool down—allowing 7200 seconds for the cryogenic pump to reach a temperature of >20° K. If the cryogenic pump does not reach 20° K. within 7200 seconds, a fault is generated.

FIGS. 32A–32D are a logical diagram of one component of the electronic control system software showing input/output and process control of the auto run mode 3200 controlling substrate movement through apparatus 10. In the logical flow diagram of FIGS. 32A–32D, horizontal lines indicate software logic flow in relation to time, with time increasing in the direction of the arrows shown therein; vertical lines generally represent decision points.

Figure 32C:
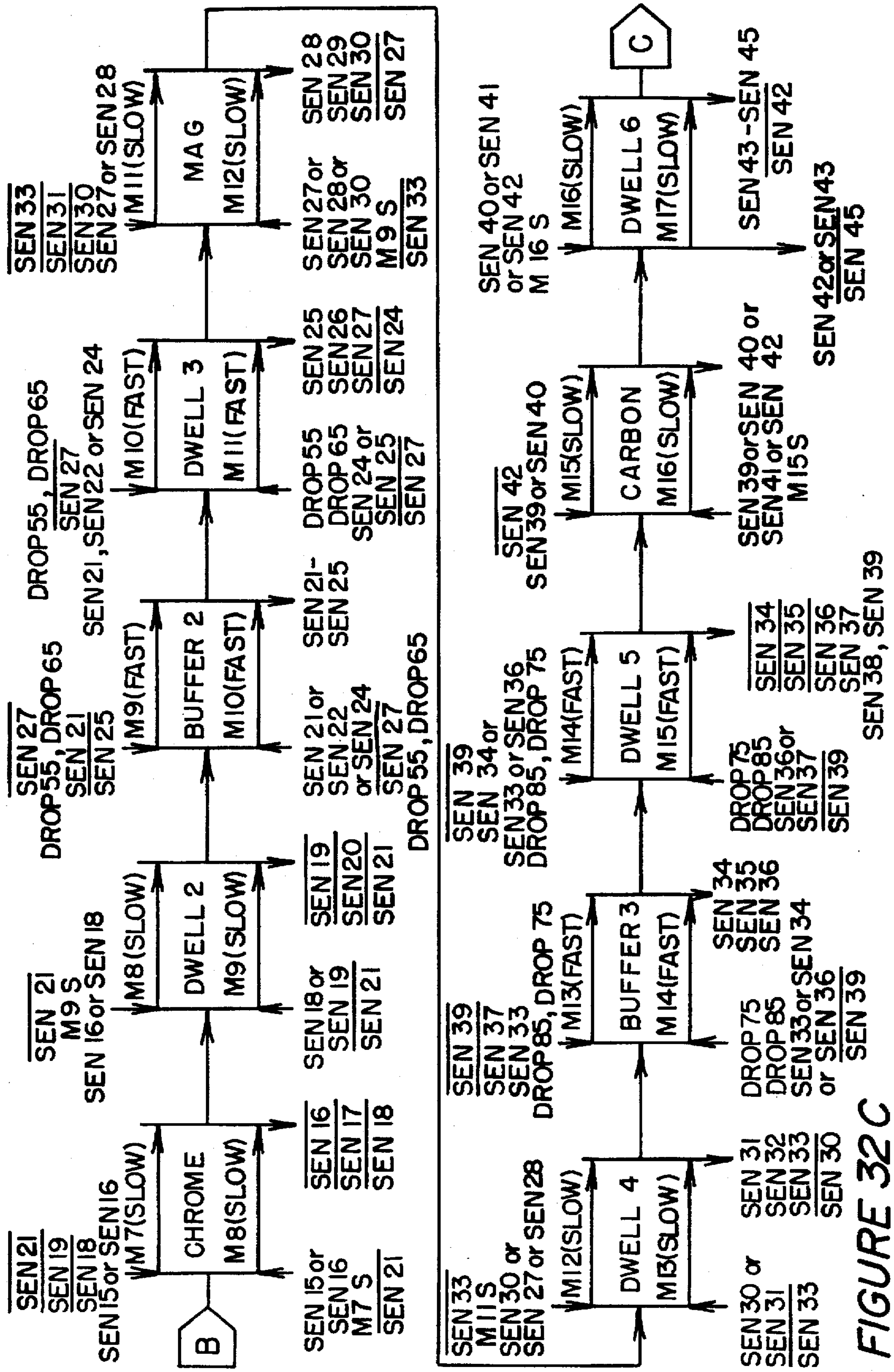
Figure 32D:
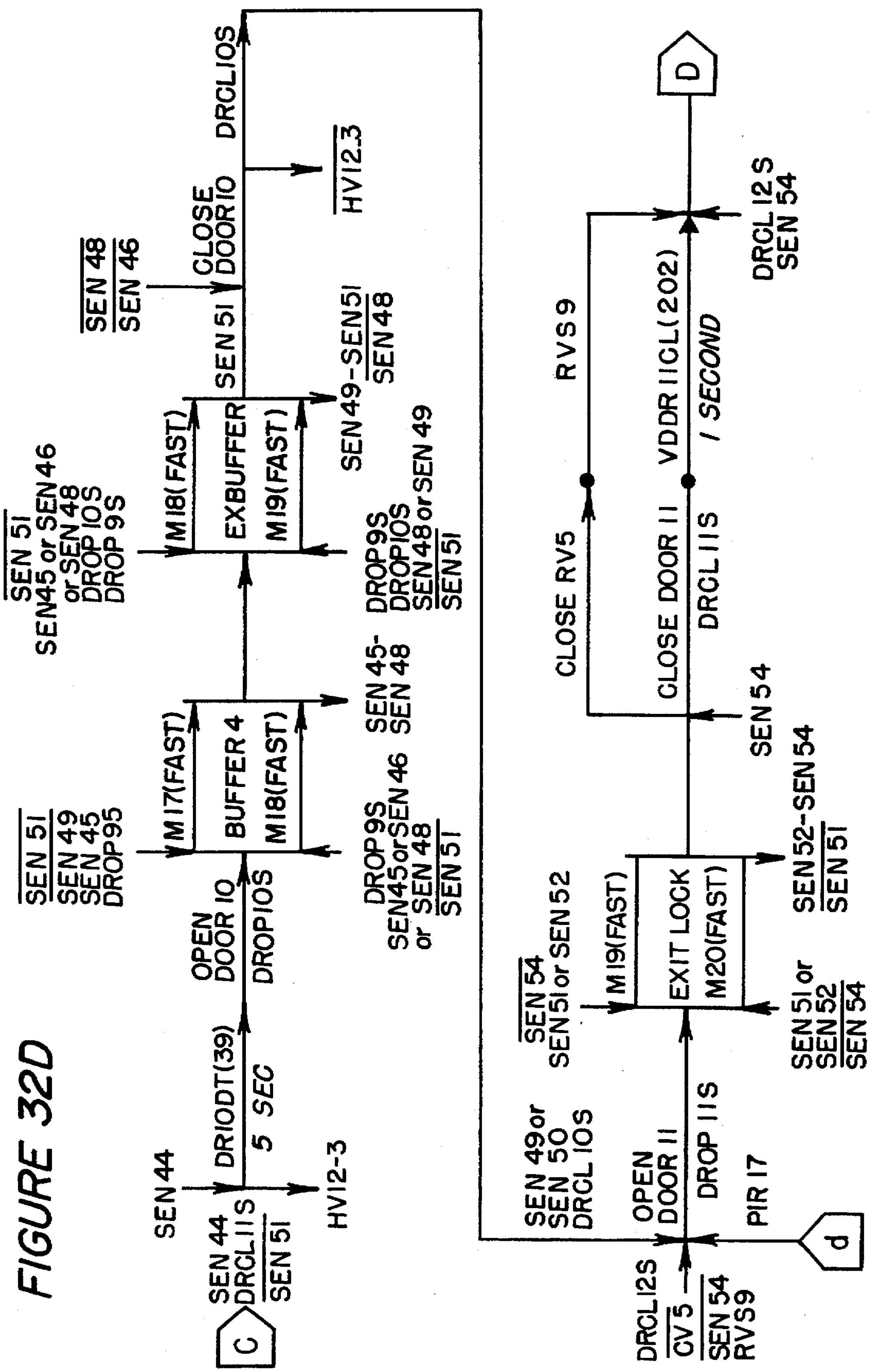
Figure 32E:
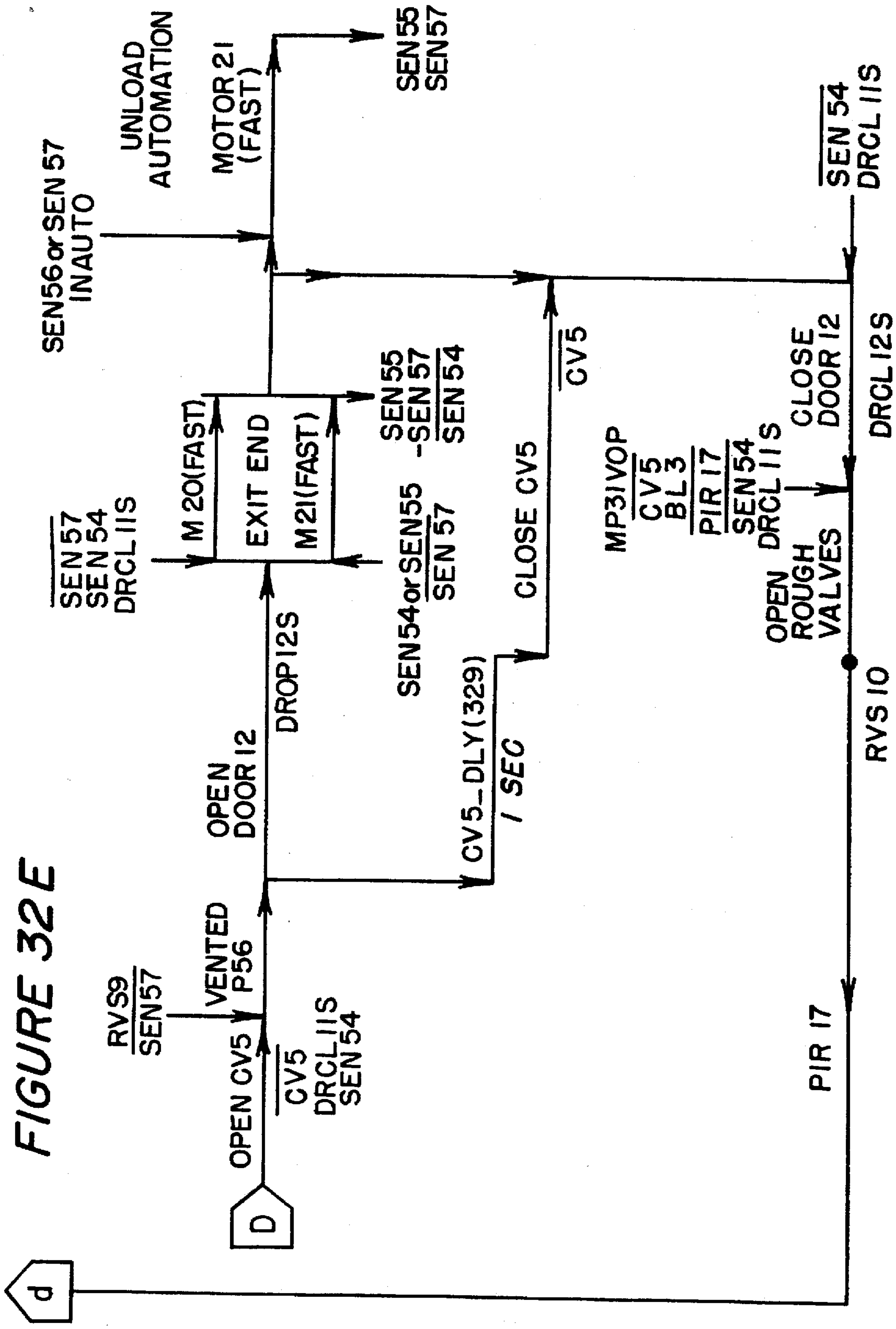

As shown in FIGS. 32A and 32D, the system control software of the present invention utilizes motor control 2910, position sensors 2915, door control 2920 and pump valve and vent system 2930, to control movement of a substrate through sputtering apparatus 10. The addresses used in FIGS. 32A–32D correspond to those discussed above with respect to the functional elements of the electronic control system.

As shown in FIGS. 32A–32D, start point 3200 in entrance lock loop 3210 of the software represents a system status condition wherein sputtering apparatus 10 is prepared for a substrate to enter load lock 12. Start point 3200 may denote the first substrate entering apparatus 10, or may represent a point wherein a prior substrate cleared load lock 12 and passed into heater 14.

At the start point 3200, roughing valves RV1–R5 are closed, doors D4–D9 are open, doors D1–D3, D10–D12 are closed, and chamber vent valves CV1–CV5 are closed. The software also checks for a TRUE output from PIR17, RV5, and DROP10S, indicating, respectively, chamber 30 at crossover pressure, the closed state of roughing valve RV5, and whether door D10 is open.

When a substrate is moved into position at entrance platform 210, the system software is prepared to begin entrance sequence 3210. Position sensors SEN1–SEN3 must indicate a TRUE condition, signaling the presence of a pallet, in order for the software system to proceed. If entrance lock loop 3210 is in a state wherein a substrate has passed out of dwell heater chamber 14, point 3215 in the logic flow line, timer VDDR2CL, which runs for 2 seconds to verify that door D2 has closed, must have completed its sequence in order for processing of that substrate to proceed. Generally, when VDDR2CL is initiated, a substrate will be waiting at entrance platform 210. Thus, input conditions indicated at 3212 will be TRUE and timer VDDR2CL will control initiation of the software logic. After the target position is verified, door close sensor DRCL1S is checked to ensure door D1 is closed, and roughing valve sensor RVS2 is checked to ensure roughing valve RV1 is closed. Additionally, pressure switch PS2 must read FALSE ( $\overline{\text{PS2}}$), sensor SEN1 is redundantly checked for a TRUE output, and position sensors SEN4–SEN6 must read FALSE to ensure the absence of a substrate in load lock 12. When all the above mentioned conditions are met, signal OPCV1 is directed to open chamber vent valve CV1 to vent load lock 12. In logical terms, the condition—DRCL1S AND RVS1 AND $\overline{\text{PS2}}$ AND $\overline{\text{SEN4}}$ AND $\overline{\text{SEN5}}$ AND SEN6—must be TRUE to open CV1, as indicated by the input description 3212. Signal OPCV1 causes pressure switch PS2 to output a TRUE state, and pirani gauge PIR1 to output a FALSE state (e.g., pressure above crossover level).

A timer CV1_DLY runs for 1 second before a signal is sent to close CV2. Timer PAL_GAT_TT is a 155 second duration timer provided to ensure a specified amount of time passes between the entrance of successive pallets into load lock 12. Timer PAL_GAT_TT is initialized when door D1 is closed, as signified by $\overline{\text{DROP1}}$ or $\overline{\text{DROP1S}}$, such signals being generally output after door D1 is closed subsequent to entrance of a substrate into load lock 12, as shown by loop 3214. If PAL_GAT_TT is FALSE ($\overline{\text{PAL\_GAT\_TT}}$ e.g., timer complete), and PS2, SEN3, and SEN5, are TRUE then signal DROP1 is sent to open outer door D1 to receive a substrate into apparatus 10. Signal DROP1 will cause door open sensor DROP1S to output TRUE, indicating door D1 is, in fact, open. Prior to activating motor assemblies M3 and M4, the logical condition—(SEN3 or SEN4) AND $\overline{\text{SEN6}}$ AND DRCL2S—must be TRUE. When this condition is met, motor assemblies M3 and M4 are activated to move the substrate at high motor setpoint speed from entrance platform 210 of the sputtering apparatus into load lock 12. Movement of the substrate will cause sensors SEN4 and SEN6 to output TRUE, and sensors SEN1 and SEN3 to output FALSE. When sensors SEN3 and SEN6 output FALSE and TRUE conditions, respectively, signaling the presence of the substrate in chamber 14, signal DRCL1 is provided to close outer door D1. Signal DRCL1 causes DROP1S to output a FALSE condition indicating door D1 is closed, and enabling timer PAL_GTE_TT, as discussed above.

Subsequently position sensor SEN6, and door close sensors DRCL1S and DRCL2S, when TRUE, enable timer SOFRUF for 1 second, thereby delaying opening of roughing valve RV1. When timer SOFRUF has completed, and the logical condition—DRCL1S, $\overline{\text{PIR1}}$, $\overline{\text{CV1}}$, BL1, AND MPIIVOP—is TRUE, signal OPRV1 is sent to open roughing valve RV1.

High speed, explosive pumping occurs in load lock 12 until such time as the preset requisite chamber pressure is achieved, causing PIR1 to output TRUE. Opening RV1 causes sensor RVS1 to output TRUE, enabling timer DROP2_DLY to run for two seconds to ensure pump MP1 and blower BL2 have sufficient time to pump load lock 12 down. When timer DROP2_DLY is done and PIR1 is TRUE, RVS1 outputs TRUE and PS2, FALSE. At the same time, signal OPTDR2 is sent to open door D2 to allow the substrate to move between load lock 12 and heater chamber 14.

Before motor assembly M4 will engage, sensor SEN6 must be TRUE, and SEN9 FALSE, to indicate the presence and absence of a target in load lock 12 and heater chamber 14, respectively. If all conditions are met, motor assembly M4 is activated at high speed setpoint; somewhat redundantly, the logical condition—(SEN6 0R SEN7) AND $\overline{\text{SEN9}}$—must be TRUE in order for motor assembly M5 to engage at high speed. A substrate is thereby transferred between load lock 12 and heater chamber 14. The engagement of motor assembly M4 and M5 will cause sensors SEN7–SEN9 to output TRUE, and sensor SEN6 to become FALSE. Simultaneously, if the logical condition—($\overline{\text{SEN4}}$ OR SEN6) AND DR3CLS, SEN9, AND SEN7—is TRUE, signal DRCL2 will be sent to close door D2. Signal DRCL will cause sensor DRCL2S to become TRUE, thereby initiating timer VDDR2CL as discussed above.

At point 3215 in the logic diagram, the software and sputtering apparatus 10 are prepared to receive an additional substrate in load lock 12 while proceeding with the sputtering process on the substrate now present in heater chamber 14. Assuming position sensors SEN1 and SEN3 indicate the presence of a substrate, loop 3210 will return to start position 3200 and may continuously receive additional substrates while processing of other substrates continues at different points in apparatus 10 in accordance with the following discussion.

At this point, it is notable that the aforesaid redundant signal and sensor readings take on additional significance when multiple targets will be moving through the system. These fail safe sensor readings are provided to ensure smooth operation of apparatus 10, and the absence of pallet collisions or errors within the apparatus.

The substrate present in heater chamber 14 continues through apparatus 10 under the control of the system software as follows. Door close sensors DRCL2S and DRCL3S to ensure doors D2 and D3 are closed. Again, sensor SEN9 is checked to ensure the presence of a pallet in heater chamber 14. If all such conditions are true, HTR1TMR engages for 72 seconds; simultaneously, if no water faults are detected ($\overline{\text{HSFGIF}}$) heaters 1510A–1510D are driven to high power to act on the substrate present in chamber 14. Heating of the substrate in heater chamber 14 occurs for a specified duration as determined by HTR1TMR.

Upon completion of 72 seconds, two heater timers are initiated: HTRDLYTMR and HTR2ONDLY. If HTR1TMR is completed and no water faults are present ($\overline{\text{HSFGIF}}$), timer HTR2ONDLY, having a duration of 26 seconds, is enabled to control initiation of passby heaters 1818A–1818F and fault generation signal H2F upon its completion. Simultaneously HTRDLYTMR, having a duration of 25 seconds is enabled and measures out the substrate soak time in dwell heater chamber 14. Upon completion, timer HTRDLYTMR initiates the motor control and venting sequence 3220 which runs simultaneously with heater control timing sequence 3225, generally illustrated in FIG. 32B. After 25 seconds, baffle 1210 is throttled by signal HV1_2 and timer DR3DT, having a duration of 5 seconds, is initiated. If $\overline{\text{DROP3S}}$ is TRUE and timer DR3DT is done, signal DROP3 is provided to open door D3 to allow the substrate to pass from heater chamber 14 into first buffer/passby heater chamber 16.

As will be noted by following parallel processes 3220 and 3225, heater banks 1818A–1818E will have been initiated by HTR2ONDLY prior to the substrate's entry into chamber 16 and are timed to remain on until a point at which the substrate is exiting chamber 16. DROP3 will cause door open sensor DROP3S to indicate door D3 is in an open state. When the logical condition—SEN9, $\overline{\text{SEN13}}$, $\overline{\text{SEN15}}$ AND DROP4S—is TRUE, motor assembly M5 is enabled at slow setpoint speed. When the logical condition—DROP4S, $\overline{\text{SEN12}}$ AND (SEN9 OR SEN10)—is TRUE, motor assembly M6 is activated at slow setpoint speed to pass the substrate through from heater chamber 14 first to buffer passby heater chamber 16.

As the substrate is passed through chambers 14 and 16, SEN10–SEN13 will output TRUE and SEN7, FALSE. Subsequently, if the condition—(SEN11 OR SEN12) AND DROP4S AND $\overline{\text{SEN15}}$—is TRUE, motor assembly M6 is enabled, and if—(SEN12 OR SEN13) AND DROP4S AND $\overline{\text{SEN15}}$—is TRUE, motor assembly M7 is enabled at slow setpoint speed to pass the substrate from passby chamber 16 into dwell chamber 18. It will be noted that movement of the substrate into chamber 18 triggers SEN13, which in turn initiates timer HTR2OFF. HTR2OFF is set with a duration of 13 seconds, a period which, when used with the motor setpoint speeds set out above (Table 1), shuts off passby heaters 1818A–1818E before the substrate fully exits chamber 16. This is to avoid overheating the trailing edge of the substrate, as discussed above. It is further noted that heater fault timer H2F runs for duration of 70 seconds before outputting a fault, indicating that the heater banks have been on too long, possibly resulting in burnout of the heating elements.

In like manner, movement of the substrate through sputtering apparatus 10 by motors M7–M19 continues as shown in FIGS. 32C and 32D with associated inputs and outputs shown therein having like affect as the I/O discussed above. Each input condition shown must be met in order to activate subsequent motor assemblies along the substrate's path through sputtering apparatus 10. Likewise, each signal causes an output state change for each sensor or value indicated. In like manner, only those motor assemblies M6/M7, M7/MS, MS/M9, M9/M10, M10/M11, etc., necessary for particular platforms to transport the substrate present at that location are activated. Individual motor assembly speeds are set as discussed in Table 1 to vary the velocity of the substrate through particular chambers of sputtering apparatus 10 as the sputtering process requires. As noted with respect to FIGS. 32A–32D, and Table 1, motor assembly pairs operate at the same speed in order to assure smooth substrate transport.

As shown in FIG. 32D, an exit lock loop 3250, similar to entrance lock loop 3210 discussed above, allows sequential passing of substrates through exit lock chamber 30 to ensure the integrity of the evacuated environment in sputtering apparatus 10 is maintained.

Beginning at point 3252, if—DRCL10S, $\overline{\text{CV5}}$, $\overline{\text{SEN54}}$, AND RVS9—are TRUE, (indicating door D10 is closed, chamber vent CV5 is closed, substrate at SEN54, and roughing valve RV5 is open, respectively), signal DROP11 is sent to open door D11, thereby causing sensor DROP11S to output TRUE. If—(SEN51 OR SEN52) AND $\overline{\text{SEN54}}$—then, motor assemblies M19 and M20 are enabled at high setpoint speeds, causing SEN52–SEN54 to be TRUE and SEN51 to be FALSE. Sensor SEN54 enables a signal to close RV5, thereby causing RVS9 to output TRUE, and also enables a signal to close door DR11, causing DRCL11S to output TRUE. A delay timer VDDR11CL delays CV5's closing for 1 second to allow venting of exit lock 30.

Once the above conditions are met, and sensor SEN54 is TRUE (pallet in exit lock 30) and DRCL12S is TRUE (door D12 closed), chamber vent CV5 is opened. Subsequently, if roughing valve RVS9 is shown as TRUE, sensor SEN57 indicates FALSE, door close sensor DRCL11S and sensor SEN54 indicate TRUE, and pressure switch PS6 indicates TRUE, exit lock 30 will be vented to atmosphere (opening CV5) and a signal DROP12 will be sent to open door 12, thereby resulting in door open sensor DROP12S outputting a TRUE condition. When pressure switch PS6 outputs a TRUE condition, timer CV5_DLY having a duration of second, will be enabled. Timer CV5_DLY will, upon completion, output a signal to close chamber vent valve CV5.

Once door D12 is open, if sensor SEN54 is TRUE, sensor SEN57 output FALSE, and door sensor DRCL11S outputs TRUE, motor assembly M20 will be enabled to proceed at its fast speed setpoint. Simultaneously, if sensor SEN54 or SEN55 output TRUE, and sensor SEN57 outputs FALSE, motor M21 will be enabled to proceed at its fast setpoint. The substrate present in exit lock 30 will thereafter proceed to exit platform 214.

At point 3260 in the software logic flow, the software branches in two directions, enabling the substrate to proceed to robot unloading station 45, if the logical condition—

SEN56 OR SEN57—is TRUE thereby enabling motor assembly M21 to proceed at its fast setpoint, or looping to prepare to receive an additional substrate in exit lock 30. To prepare to receive an additional substrate, chamber vent CV5 must be closed. Subsequently, sensor SEN54 must output FALSE and door close sensor DRCL11S output TRUE in order for a signal to be sent to close door D12. If the logical condition—MP3IVOP, $\overline{CV5}$, BL3, $\overline{PIR17}$, $\overline{SEN54}$, AND DRCL11S—is TRUE, a signal will be sent to open roughing valve RV5 to pump down chamber 30 to prepare for receiving an additional pallet therein. Opening roughing valve RV5 will cause roughing valve sensor RVS10 to output TRUE, and pirani gauge PIR17 will output TRUE when chamber 30 is below crossover. Apparatus 10 is then in a state which exists at software logic point 3252 to prepare to receive an additional substrate in exit lock 30.

As should be understood by those skilled in the art, the particular cross-over pumping levels described above with respect to the software of the present invention may be varied as desired to achieve the requisite atmospheric conditions in apparatus 10 for the particular sputtering application desired. In the preferred embodiment of the present invention, the pirani gauge pressure setpoints outputting digital signals to programmable logic controller 2902 are shown in Table 2:

TABLE 2

| | Setpoints (in mTorr) | |
|---|---|---|
| Gauge | Upper | Lower |
| PIR1 | 125 | 100 |
| PIR2 | 125 | 100 |
| PIR3 | 80 | 50 |
| PIR4 | 80 | 50 |
| PIR5 | 80 | 50 |
| PIR6 | 125 | 100 |
| PIR7 | 80 | 50 |
| PIR8 | 80 | 50 |
| PIR9 | 80 | 50 |
| PIR10 | 1000 | 50 |
| PIR11 | 125 | 50 |
| PIR12 | 80 | 50 |
| PIR13 | 80 | 50 |
| PIR14 | 80 | 50 |
| PIR15 | 150 | 125 |
| PIR16 | 125 | 100 |
| PIR17 | 125 | 100 |
| PIR18 | 80 | 50 |
| PIR19 | 80 | 50 |
| PIR20 | 80 | 50 |

It should be further understood by those skilled in the art that a multitude of control schemes and sensor I/O arrangements may be utilized within the scope of the present invention to provide an automated control sequence over a substrate or substrates moving through a sputtering apparatus in accordance with the present invention. The above-described automated run mode 3200 provides for a multitude of pallets, optimally seven pallets, moving through apparatus 10 as discussed in the present specification. It should be understood that all such modifications are contemplated as being within the scope of the invention described herein.

L. Process In General

Examples 1 and 2 illustrate process parameters for sputtering apparatus 10 to produce 950 Oe and 1200 Oe, respectively, hard drive disks.

EXAMPLE 1

As illustrated in FIG. 2, once engaged by substrate carrier 1450, pallet 800 loaded with disk substrates 510 proceeds through door D1 into load lock chamber 12. After pallet 800 enters load lock chamber 12, door D1 closes. Load lock chamber 12 is pumped down to 50 microns (50 mTorr) in 20 seconds by mechanical roughing pump MP1. Door D2 opens, allowing pallet 800 to proceed at 6 ft/min into dwell heating chamber 14. Dwell heating chamber 14 has already been evacuated by cryo pump C1 to $10^{-5}$ Torr (0.01 microns). As pallet 800 proceeds through the chamber, it triggers proximity position sensors which in turn initiate heaters. Heating lamp warmup time is negligible since, during sputtering operations, the lamp filaments are kept warm by a low power level. Pallet 800 and disk substrates 510 soak in dwell heating chamber 14 for 30 seconds with the temperature about 220° C. During this soak period, the heating power applied is 3.1 kW per bank. Argon enters through gas manifolds to backfill dwell heating chamber 14 and equalize the internal pressure before door D3 opens, allowing pallet 800 to proceed. This backfill also maintains pressure equilibrium throughout the apparatus, essential to stabilizing sputtering processes. Door D3 opens to passby heating chamber 16, triggering the initiation of passby heaters. Pallet 800 enters passby heating chamber 16 and after clearing sensor SEN10, triggers the closure of door D3. This chamber also has been evacuated by cryo pump C2 to about $10^{-5}$ Torr (0.01 microns). Passby heating banks 1818A–1818F operate using 7.6 kW per bank. Lamps 1514 on the leading edge of the pallet reduce power as pallet 800 exits into dwell chamber 18 at 6 ft/min. Pallet 800 proceeds through dwell chamber 18 which has already been evacuated by cryo pump C3 to $10^{-5}$ Torr. The pallet proceeds at 6 ft/min past heat reflective panels 2120.

Pallet 800 enters chromium sputtering chamber 20 maintained at 9–12 microns (9–12 mTorr) of argon pressure with argon flow at 300 standard cubic centimeters per minute (sccm). Pallet 800 travels at 6 ft/min as it passes sputtering targets 2226–2229. The sputtering power is 7.5 kW per cathode, with a 1,000 Å thick chromium film deposited. Transport speed through dwell chamber 22A, buffer chamber 24A and dwell chamber 22B is 12 ft/min through open doors D5 and D6. These three chambers are pumped by cryo pumps C4, C5, and C6. Pallet 800 enters magnetic sputtering chamber 26 maintained at 9–12 microns (9–12 mTorr) of argon by cryo pumps C6 and C7 with argon flow at approximately 400 sccm. The transport speed through sputtering chamber 26 is 6 ft/min. The sputtering power is 7.5 kW per cathode, depositing a 800 Å thick CoCrTa film. Transport speed through dwell chambers 22C and 22D and buffer chamber 24B is 6 ft/min. Dwell chambers 22C, 22D and buffer chamber 24B are pumped by cryo pumps C7, C8 and C9. Pallet 800 enters carbon sputtering chamber 28 maintained at 9–10 microns (9–12 mTorr) by cryo pumps C9 and C10 with argon and up to 15% hydrocarbon gas like ethylene or acetylene flowing at 100 sccm. The transport speed is 2.8 ft/min as the pallet passes the sputtering targets in carbon sputtering chamber 28. Sputtering power is 7 kW per cathode with a film thickness of 350 Å. Transport speed through dwell chamber 22E, buffer chamber 24C and exit buffer chamber 29 is 6 ft/min with doors D9 and D10 opening and closing sequentially to allow pallet 800 to proceed. Dwell chamber 22E is pumped by cryo pumps C10 and C11, buffer chamber 24C and exit buffer chamber 29 are pumped by cryo pump C12. Argon is backfilled into exit buffer chamber 29 by cryo pump C12 to equalize the pressure differential existing with respect to exit lock chamber 30. Pallet 800 next proceeds through exit lock chamber 30 which is vented to the atmosphere by chamber vent valve CV5 in 10 seconds. Pallet 800 then proceeds to robotic unloading station 45.

To produce a 1,200 Oe magnetic film, the soak time in dwell heating chamber 14 may be increased to about 50 seconds to allow the substrate temperature to increase to approximately 250° C. and/or the pallet transport speed through chromium sputtering chamber 20 may be reduced in order to allow a thicker deposition of a chromium underlayer. Adjustment of soak time and/or substrate temperature parameters depends on the life cycle of the pallet—a pallet which has proceeded through numerous sputtering runs will have a thicker film deposition which can absorb more water and consequently would have more water to outgas before film deposition.

The many features and advantages of the apparatus and process of the present invention will be apparent to those skilled in the art from the description of the preferred embodiments and the drawings.

Thus, a high throughput process and apparatus which accomplishes the objectives of the invention and provides the above advantages by providing a comprehensive in-line sputtering system utilizing matched component elements to process multiple large single sheet or pallet transported discrete substrates in a continuous, variable speed, sputtering process has been described. Such an apparatus and method can process up to 3,000 95 mm disk substrates, and 5,300 65 mm disk substrates, per hour. Such high volume production offers both high volume production and, consequently, cost savings per disk on the order of $4.00 per disk over prior art sputtering apparatus and processes. As noted throughout this specification, such an apparatus and process is achieved through a novel combination of process and structural elements involved in disk preparation, provision of a sputtering environment, transportation of substrates through the sputtering environment at rapid speeds and in a contaminant free manner, heating the substrates to optimal thermal levels for sputtering, and sputtering the substrates through a series of substantially isolated, noncrosscontaminating sputtering steps.

SECTION M

COPYRIGHT 1989, 1990, 1991
CONNER PERIPHERALS, INC.

Number of Program Files:7 - 110 -

| Name | File | Sub-Program Description | Size: Elems | Bytes |
|---|---|---|---|---|
| | 0 | [SYSTEM DATA STORAGE HEADER] | 32 | 64 |
| MAIH_PRGRM | 2 | THE MAIN PROGRAM | 7205 | 36456 |
| CRYO_REGEN | 3 | CRYO REGENERATION RUNGS | 1942 | 10475 |
| RETRN_CNVR | 4 | THE RETURN CONVEYOR | 550 | 2683 |
| FAULTS | 5 | THE FAULT RUNGS | 798 | 5114 |
| TECH_RUNGS | 6 | THE TECHNICIAN RUNGS | 370 | 2578 |

COPYRIGHT 1989, 1990, 1991
CONNER PERIPHERALS, INC.

```
Rung #000
|FIRST SCAN                                                               FIRST SCAN  |
|AFTER POWER                                                              AFTER POWER |
|LOSS                                                                     LOSS        |
|1ST_PASS                                                                 PWR_ON_DLY  |
|     S:1                                                                    B3       |
|----] [-------------------------------------------------------------------(L)-------|
|     15                                                                     444      |
B3/444 - ] [- - File #2 MAIN_PRGRM -  155
        -]/[- - File #2 MAIN_PRGRM -  115,117,118,119,120,121,122,123,124,125,126,127,128,129,130,131,132,133,134,135,136,137,138
        -(L)- - File #2 MAIN_PRGRM -  0
        -(U)- - File #2 MAIN_PRGRM -  1
Rung #001
|
|POWER ON DELAY                                                           FIRST SCAN  |
|DEFEAT                                                                   AFTER POWER |
|PWR_ON_DLY_DFT                                                           LOSS        |
|     B3                                                                  PWR_ON_DLY  |
|----] [-------------------------------------------------------------------   B3      |
|     268                                                                 -(U)-------|
                                                                             444      |
B3/444 - ] [- - File #2 MAIN_PRGRM -  155
        -]/[- - File #2 MAIN_PRGRM -  115,117,118,119,120,121,122,123,124,125,126,127,128,129,130,131,132,133,134,135,136,137,138
        -(L)- - File #2 MAIN_PRGRM -  0
        -(U)- - File #2 MAIN_PRGRM -  1
Rung #002
|BLOCK TRANSFER  BLOCK TRANSFER                               BLOCK TRANSFER              |
|WRITE           READ                                         WRITE ENABLE                |
|BT_WRITE        BT_READ                                      BTWRITE                     |
|    N11:1           N10:0                                    +-BTW--------------------+  |
|----]/[-------------]/[--------------------------------------|BLOCK TRANSFER WRITE    |-(EN)-|
|    15              15                                       |Mod Type:        1771-DS|  |
|[2]             [3]                                          |           BASIC module |-(DN) |
|                                                             |Rack:                  4|  |
|                                                             |Group:                 7|-(ER) |
|                                                             |Module:                0|  |
|                                                             |Control Block:    N11:1|  |
|                                                             |Data File:        N7:21|  |
|                                                             |LENGTH:               21|  |
|                                                             |Continuous:            N|  |
|                                                             +-------------------------+  |
N11:1/15 - ]/[- - File #2 MAIN_PRGRM -  2,3
N7:21/3 - -( )- - File #2 MAIN_PRGRM -  532
N7:21/4 - -( )- - File #2 MAIN_PRGRM -  533
N7:21/5 - -( )- - File #2 MAIN_PRGRM -  534
N7:21/6 - -( )- - File #2 MAIN_PRGRM -  535
N7:21/7 - -( )- - File #2 MAIN_PRGRM -  536
N7:21/8 - -( )- - File #2 MAIN_PRGRM -  537
N7:21/9 - -( )- - File #2 MAIN_PRGRM -  538
N7:21/10 - -( )- - File #2 MAIN_PRGRM -  539
N7:21/11 - -( )- - File #2 MAIN_PRGRM -  540
N7:21/12 - -( )- - File #2 MAIN_PRGRM -  541
N7:21/13 - -( )- - File #2 MAIN_PRGRM -  542
N7:21/14 - -( )- - File #2 MAIN_PRGRM -  543
N7:21/15 - -( )- - File #2 MAIN_PRGRM -  544
```

```
Rung #003
|BLOCK TRANSFER  BLOCK TRANSFER                                        BLOCK TRANSFER                       |
|WRITE           READ                                                  READ ENABLE                          |
|BT_WRITE        BT_READ                                               BTREAD                               |
|    N11:1           N10:0                                             +-BTR-------------------+            |
|----]/[-----------]/[-------------------------------------------------+BLOCK TRANSFER READ    +-(EN)-------|
|     15              15                                               |Mod Type:       1771-DB|            |
|[2]             [3]                                                   |          BASIC module +-(DN)       |
|                                                                      |Rack:                 4|            |
|                                                                      |Group:                7+-(ER)       |
|                                                                      |Module:               0|            |
|                                                                      |Control Block:    N10:0|            |
|                                                                      |Data File:         N7:0|            |
|                                                                      |LENGTH:              21|            |
|                                                                      |Continuous:           N|            |
|                                                                      +-----------------------+            |
N10:0/15 - ]/[ - File #2 MAIN_PRGRM - 2
N7:0/3 - ] [ - File #2 MAIN_PRGRM - 551
N7:0/4 - ] [ - File #2 MAIN_PRGRM - 552
N7:0/5 - ] [ - File #2 MAIN_PRGRM - 553
N7:0/6 - ] [ - File #2 MAIN_PRGRM - 554
N7:0/7 - ] [ - File #2 MAIN_PRGRM - 555
N7:0/8 - ] [ - File #2 MAIN_PRGRM - 556
N7:0/9 - ] [ - File #2 MAIN_PRGRM - 557
N7:0/10 - ] [ - File #2 MAIN_PRGRM - 558
N7:0/11 - ] [ - File #2 MAIN_PRGRM - 559
N7:0/12 - ] [ - File #2 MAIN_PRGRM - 560
N7:0/13 - ] [ - File #2 MAIN_PRGRM - 561
N7:0/14 - ] [ - File #2 MAIN_PRGRM - 562
N7:0/15 - ] [ - File #2 MAIN_PRGRM - 563
Rung #004
|                                                                      OSCILLATOR                   |
|OSCILLATOR                                                            TIMER 1                      |
|OSC                                                                   OSC_TMR1                     |
|    B3                                                                +-TON-------------+          |
|----]/[---------------------------------------------------------------+TIMER ON DELAY   +-(EN)-----|
|    142                                                               |TIMER:    T4:184 |          |
|[6]                                                                   |BASE (SEC):  0.01+-(DN)     |
|                                                                      |PRESET:        50|          |
|                                                                      |ACCUM:          0|          |
|                                                                      +-----------------+          |
T4:184.DN - ] [ - File #2 MAIN_PRGRM - 6
Rung #005
|                                                                      OSCILLATOR                   |
|OSCILLATOR                                                            TIMER 2                      |
|OSC                                                                   OSC_TMR2                     |
|    B3                                                                +-TON-------------+          |
|----] [---------------------------------------------------------------+TIMER ON DELAY   +-(EN)-----|
|    142                                                               |TIMER:    T4:185 |          |
|[6]                                                                   |BASE (SEC):  0.01+-(DN)     |
|                                                                      |PRESET:        50|          |
|                                                                      |ACCUM:         48|          |
|                                                                      +-----------------+          |
T4:185.DN - ] [ - File #2 MAIN_PRGRM - 7
Rung #006
|                                                                          OSCILLATOR |
|OSC_TMR1                                                                  OSC        |
| T4:184                                                                       B3     |
|----] [-----------------------------------------------------------------------(L)----|
|    DN                                                                        142    |
|[4]                                                                                  |
B3/142 - ] [ - File #2 MAIN_PRGRM - 5,624
```

```
        -|/|- - File #2 MAIN_PRGRM -  4
        -(L)- - File #2 MAIN_PRGRM -  6
        -(U)- - File #2 MAIN_PRGRM -  7
Rung #007
|                                                                          OSCILLATOR |
|OSC_TMR2                                                                  OSC        |
| T4:185                                                                     B3       |
|--| |---------------------------------------------------------------------(U)--------|
|   DN                                                                       142      |
|[5]                                                                                  |
B3/142 - -| |- - File #2 MAIN_PRGRM -  5,624
        -|/|- - File #2 MAIN_PRGRM -  4
        -(L)- - File #2 MAIN_PRGRM -  6
        -(U)- - File #2 MAIN_PRGRM -  7
Rung #008
|OSCILLATOR                                                    OSCILLATOR             |
|2                                                             TIMER 3                |
|OSC2                                                          OSC_TMR3               |
|    B3                                                        +-TON--------------+   |
|--|/|---------------------------------------------------------|TIMER ON DELAY    |-(EN)-|
|   143                                                        |TIMER:     T4:186 |   |
|[10]                                                          |BASE (SEC):  0.01 |-(DN)|
|                                                              |PRESET:       200 |   |
|                                                              |ACCUM:        166 |   |
|                                                              +------------------+   |
T4:186.DN - -| |- - File #2 MAIN_PRGRM -  10
Rung #009
|OSCILLATOR                                                    OSCILLATOR             |
|2                                                             TIMER 4                |
|OSC2                                                          OSC_TMR4               |
|    B3                                                        +-TON--------------+   |
|--| |---------------------------------------------------------|TIMER ON DELAY    |-(EN)-|
|   143                                                        |TIMER:     T4:187 |   |
|[10]                                                          |BASE (SEC):  0.01 |-(DN)|
|                                                              |PRESET:       200 |   |
|                                                              |ACCUM:          0 |   |
|                                                              +------------------+   |
T4:187.DN - -| |- - File #2 MAIN_PRGRM -  11
Rung #010
|                                                                          OSCILLATOR |
|                                                                          2          |
|OSC_TMR3                                                                  OSC2       |
| T4:186                                                                     B3       |
|--| |---------------------------------------------------------------------(L)--------|
|   DN                                                                       143      |
|[8]                                                                                  |
B3/143 - -| |- - File #2 MAIN_PRGRM -  9,624
        -|/|- - File #2 MAIN_PRGRM -  8
        -(L)- - File #2 MAIN_PRGRM -  10
        -(U)- - File #2 MAIN_PRGRM -  11
Rung #011
|                                                                          OSCILLATOR |
|                                                                          2          |
|OSC_TMR4                                                                  OSC2       |
| T4:187                                                                     B3       |
|--| |---------------------------------------------------------------------(U)--------|
|   DN                                                                       143      |
|[9]                                                                                  |
B3/143 - -| |- - File #2 MAIN_PRGRM -  9,624
        -|/|- - File #2 MAIN_PRGRM -  8
        -(L)- - File #2 MAIN_PRGRM -  10
        -(U)- - File #2 MAIN_PRGRM -  11
```

```
Rung #012
|                                                              MOTOR DRIVE              |
|                                                              PULSER                   |
|                                                              TIMER B                  |
|MDPTA                                                         MDPTB                    |
|T4:298                                                        +--TON----------------+  |
|--|/|---------------------------------------------------------+TIMER ON DELAY       +-(EN)-|
|   DN                                                         |TIMER:       T4:299  |  |
|[13]                                                          |BASE (SEC):   0.01   +-(DN) |
|                                                              |PRESET:          5   |  |
|                                                              |ACCUM:           6   |  |
|                                                              +---------------------+  |
T4:299.DN - -| |- - File #2 MAIN_PRGRM -  13,14,184,189,194
Rung #013
|                                                              MOTOR DRIVE              |
|MOTOR START                                                   PULSER                   |
|PULSE                                                         TIMER A                  |
|MDPTB                                                         MDPTA                    |
|  T4:299                                                      +--TON----------------+  |
|-----| |------------------------------------------------------+TIMER ON DELAY       +-(EN)-|
|      DN                                                      |TIMER:       T4:298  |  |
|[12]                                                          |BASE (SEC):   0.01   +-(DN) |
|                                                              |PRESET:          5   |  |
|                                                              |ACCUM:           3   |  |
|                                                              +---------------------+  |
T4:298.DN - -|/|- - File #2 MAIN_PRGRM -  12
Rung #014
|MOTOR START                                                          MOTOR DRIVE |
|PULSE                                                                PULSER      |
|MDPTB                                                                MDP         |
|  T4:299                                                                  B3     |
|-----| |----------------------------------------------------------------( )------|
|      DN                                                                  299    |
|[12]                                                                             |
B3/299 - -| |- - File #2 MAIN_PRGRM -  217,230,248,252,257,262,280,284,289,294,305,309,314,319,330,354
         -( )- - File #2 MAIN_PRGRM -  14
Rung #015
|               PALLET      PALLET                                                |
|  AUTO         DETECTED    DETECTED                                  ENTER       |
|  MODE         LEFT SIDE   RIGHT SIDE                                PRODUCTION  |
|  ENABLE       ENTRANCE    ENTRANCE                                  SYSTEM      |
|  AUTO         SEN1        SEN3                                      LLIN        |
|  N7:37          I:003       I:003                                     O:007     |
|+--| |------+----|/|--------|/|-------------------------------------------( )-----|
||   11      |     00          02                                        15       |
||  [155]    |                                                                    |
|| MOTOR 3   |                                                                    |
|| SLOW      |                                                                    |
|| M3S       |                                                                    |
||   O:013   |                                                                    |
|+---| |-----+                                                                    |
|      02                                                                         |
|    [187]                                                                        |
Rung #016
|SUSPEND                                                              SUSPEND     |
|OPERATION                                                            OPERATION   |
|ENABLE                                                               LATCH       |
|SUSOPE                                                               SUSOPL      |
|  N7:18                                                                  B3      |
|-----| |----------------------------------------------------------------(L)------|
|      0                                                                  101     |
|[3]                                                                              |
```

```
B3/101 - -|/|- - File #4 RETRN_CNVR -  59,60
         -(L)- - File #2 MAIN_PRGRM -  16
         -(U)- - File #2 MAIN_PRGRM -  17
Rung #017
|                                                                                     SUSPEND    |
| PREPARE FOR                                                                         OPERATION  |
| AUTO RUN                                                                            LATCH      |
| >AUTO                                                                               SUSOPL     |
|    N7:37                                                                              B3       |
|-+---| |---+-----------------------------------------------------------------------(U)------|
| |    1    |                                                                         101      |
| |[157]    |                                                                                  |
| |         | B3/101 - -|/|- - File #4 RETRN_CNVR - 59, 60                                     |
| |         |          -(L)- - File #2 MAIN_PRGRM - 16                                         |
| |COMPUTER |                                                                                  |
| |SIGNAL FOR|                                                                                 |
| |AUTO MODE|                                                                                  |
| |OK       |                                                                                  |
| |COMPAUTO |                                                                                  |
| |  N7:16  |                                                                                  |
| +---| |---+                                                                                  |
|      11                                                                                      |
| [3]
Rung #018
|PALLET                                                                                        |
|DETECTED                                                                     PALLET           |
|RIGHT SIDE                                                                   WAITING AT       |
|EXIT END                                                                     MINT EXIT        |
|SENS7                                                                        PWAME            |
|  I:054                                                                        O:057          |
|---| |-------------------------------------------------------------------------( )-------|
|   17                                                                            14           |
Rung #019
|REGENERATE                                                                   HIVAC CLOSE      |
|ALL CRYO'S                                                                   STAGGER          |
|TS20                                                                         HVCL_STAG        |
|  N7:16                                                                        B3             |
|---| |-------------------------------------------------------------------------(L)-------|
|   12                                                                           280           |
|[3]                                                                                           |
B3/280 - -| |- - File #2 MAIN_PRGRM -  20
         -(L)- - File #2 MAIN_PRGRM -  19
         -(U)- - File #2 MAIN_PRGRM -  21
Rung #020
|HIVAC CLOSE                                                        HIVAC STAGGER              |
|STAGGER                                                            TIMER                      |
|HVCL_STAG                                                          HI_STAG                    |
|    B3                                                             +-TON----------------+     |
|----| |------------------------------------------------------------|TIMER ON DELAY      |-(EN)-|
|    280                                                            |TIMER:       T4:197 |      |
|[19]                                                               |BASE (SEC):     1.0 |-(DN) |
|                                                                   |PRESET:          35 |      |
|                                                                   |ACCUM:            0 |      |
|                                                                   +--------------------+      |
T4:197.ACC - GEQ - File #3 CRYO_REGEN -  34,38,42,46,52,53,57
T4:197.DN - -| |- - File #2 MAIN_PRGRM -  21
                    File #3 CRYO_REGEN -  63
```

```
Rung #021
| ABORT CRYO                                                              KIVAC CLOSE |
| REGENERATION                                                            STAGGER     |
| BT_CR                                                                   HVCL_STAG   |
|     N7:17                                                                  B3       |
|----] [----+------------------------------------------------------------------(U)----|
| |    9    |                                                                  280    |
| |[3]      |                                                                         |
| |         | B3/280 - -] [- - File #2 MAIN_PRGRM - 20                                |
| |         |          -(L)- - File #2 MAIN_PRGRM - 19                                |
| |HI_STAG  |                                                                         |
| | T4:197  |                                                                         |
| |---] [---|                                                                       |
| |    DN   |                                                                         |
| |[20]     |                                                                         |
| |ABORT CRYO                                                                       |
| |REGEN ENABLE                                                                     |
| |ABORTCRGN|                                                                       |
| |    B3   |                                                                         |
| +---] [---+                                                                       |
|    297                                                                            |
| [3:26]                                                                            |
Rung #022
| SYSTEM IS                                                                         |
| PUMPED                                                      PUMPDOWN              |
| DOWN                                                        SYSTEM                |
| SYS_PD                                                      ENABLE                |
|     B3                                                      POSE                  |
|                                                                B3                 |
|----] [----+-----------------------------------------------+----(U)----+----+      |
| |   389   |                                               | |  303    |    |      |
| |[140]    |                                               | |         |    |      |
| |         | B3/303 - -] [- - File #2 MAIN_PRGRM - 24, 25, 26, 27, 28, 29, 30, 31, 32,
| |         |           33, 46, 47, 48, 49, 68, 73, 78, 104, 140, 183, 200,         |
| |         |           216, 324, 326, 327, 353, 415      |MANUAL    |    |          |
| |         |        -]/[- - File #2 MAIN_PRGRM - 369, 405, 411, 418, 425, 430        |
| |         |        -(L)- - File #2 MAIN_PRGRM - 23      |SYSTEM    |    |          |
| |ABORT PUMPDOWN N7:36/8 - -(L)- - File #2 MAIN_PRGRM - 23 |PUMPDOWN |    |          |
| |BT_PD    | _F:N7:21(%21 - BTW - File #2 MAIN_PRGRM - 2 |ENABLE    |    |          |
| |   N7:17 | T4:285.TT - -] [- - File #2 MAIN_PRGRM - 84, 91, 98 |MSPE |  |          |
| |---] [---|                                             | | N7:36   |    |          |
| |    8    |                                             | +--(U)----+    |          |
| |[3]      |                                             |     8          |          |
| |         |                                             |PUMPDOWN        |          |
| |         |                                             |SEQUENCE        |          |
| |PIRINI   |                                             |DISABLE         |          |
| |GUAGE NO |                                             |PULSE           |          |
| |FAULT    |                                             |PDSDPLSE        |          |
| |PGNF     |                                             | +-TON-------------+       |
| |    B3   |                                             +-|TIMER ON DELAY   |-(EN)-+|
| |---]/[---|                                               |TIMER:    T4:285 |       |
| |   465   |                                               |BASE (SEC):  1.0 |-(DN)  |
| |[5:205]  |                                               |PRESET:        5 |       |
| |PREPARE FOR                                              |ACCUM:         0 |       |
| |AUTO RUN |                                               +-----------------+       |
| |>AUTO    |                                                                         |
| |   N7:37 |                                                                         |
| +---] [---+                                                                         |
|      1                                                                              |
| [157]                                                                               |
```

- 117 -

```
Rung #023
|         PIRINI                               SYSTEM                                                                                   PUMPDOWN   |
|START    GUAGE NO   NO CRYOS BEING           VENT      VENT AREA  VENT AREA  VENT AREA  VENT AREA  VENT AREA                          SYSTEM     |
|PUMPDOWN FAULT      REGENERATED              ENABLE    1 ENABLE   2 ENABLE   3 ENABLE   4 ENABLE   5 ENABLE                           ENABLE     |
|TS00     PGNF       NO_CYRGN                 SYSVNTE   VENT1E     VENT2E     VENT3E     VENT4E     VENT5E                             POSE       |
| N7:15    B3           B3                    N7:37     N7:37      N7:37      N7:37      N7:37      N7:37                                 B3     |
|--] [-----] [----------] [-------------------]/[-------]/[--------]/[--------]/[--------]/[--------]/[-------------------------------+---(L)---+-|
|   8      465          233                     5         6          7          8          9          10                             |   303   | |
|[3]      [5:205]    [3:33]                   [368]     [405]      [411]      [418]      [425]      [430]                             |         | |
|                                                                                                                                     |MANUAL   | |
| B3/303 - ] [ - File #2 MAIN_PRGRM - 24, 25, 26, 27, 28, 29, 30, 31, 32, 33, 46, 47, 48, 49, 68,                                     |SYSTEM   | |
|          73, 78, 104, 140, 183, 200, 216, 324, 326, 327, 353, 415                                                                   |PUMPDOWN | |
|        ]/[ - File #2 MAIN_PRGRM - 369, 405, 411, 418, 425, 430                                                                      |ENABLE   | |
|        -(U)- - File #2 MAIN_PRGRM - 22                                                                                              |MSPE     | |
| N7:36/8 - -(U)- - File #2 MAIN_PRGRM - 22                                                                                           | N7:36   | |
| _F:N7:211X21 - BTW - File #2 MAIN_PRGRM - 2                                                                                         +---(L)---+ |
|                                                                                                                                         8       |
Rung #024
|         LLOCK     DWELL 2    DWELL 4   DWELL 5   EXLOCK                                                                                       |
|         CHAMBER   CHAMBER    CHAMBER   CHAMBER   CHAMBER                                                                                      |
|PUMPDOWN ROUGH     ROUGH      ROUGH     ROUGH     ROUGH                                                                                        |
|SYSTEM   VALVE     VALVE RV2  VALVE     VALVE     VALVE                                                                       RV'S ALL         |
|ENABLE   CLOSED    CLOSED     CLOSED    CLOSED    CLOSED                                                                      CLOSED FOR       |
|POSE     RVS1      RVS3       RVS5      RVS7      RVS9                                                                        CROSSOVER        |
|  B3     I:002     I:022      I:036     I:052     I:052                                                                       RVS_CLOSED       |
|--] [-----] [-------] [--------] [-------] [-------] [----------------------------------------------------------------------------( )------------|
|  303      15        15         15        14        16                                                                             176           |
|[23]
B3/176 - ] [ - File #2 MAIN_PRGRM -  105,106,107,108,109
       -( )- - File #2 MAIN_PRGRM -  24
Rung #025
|PUMPDOWN
|SYSTEM                                                                                                  PUMPDOWN                                  |
|ENABLE                                                                                                  SYSTEM                                    |
|POSE                                                                                                    TIMER                                     |
|  B3                                                                                                    POSTMR                                    |
|--] [--------------------------------------------------------------------------------------------------+-TON-----------------+                    |
|  303                                                                                                  |TIMER ON DELAY       |-(EN)-              |
|[23]                                                                                                   |TIMER:      T4:190   |                    |
|                                                                                                       |BASE (SEC):    1.0   |-(DN)               |
|                                                                                                       |PRESET:        600   |                    |
|                                                                                                       |ACCUM:           0   |                    |
|                                                                                                       +---------------------+                    |
T4:190.DN - ] [ - File #2 MAIN_PRGRM -  609
```

Rung #026
- 118 -
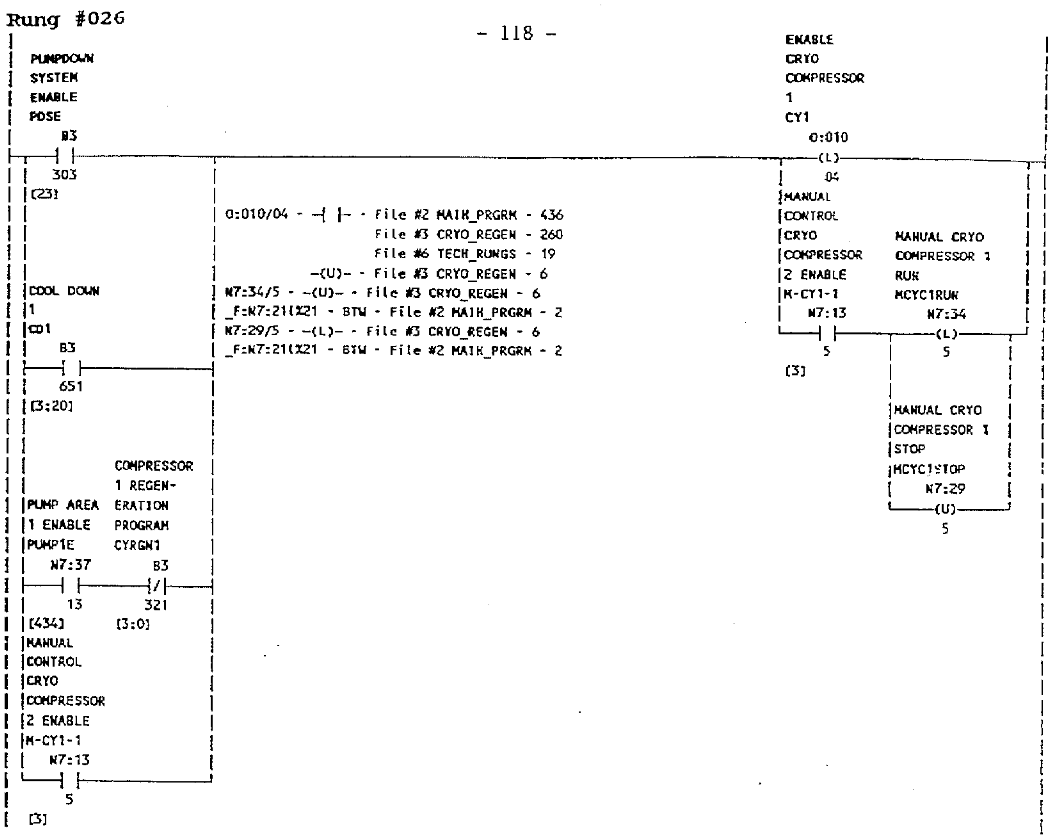

Rung #027

- 119 -

```
PUMPDOWN                                                                    ENABLE
SYSTEM                                                                      CRYO
ENABLE                                                                      COMPRESSOR
POSE                                                                        2
    B3                                                                      CY2
                                                                              O:010
--] [------------------------------------------------------------------------(L)----
  303                                                                          05
 [23]                                                                       MANUAL
                  O:010/05 - -] [- - File #2 MAIN_PRGRM - 436, 440          CONTROL
                             File #3 CRYO_REGEN - 260                       CRYO        MANUAL CRYO
                             File #6 TECH_RUNGS - 19                        COMPRESSOR  COMPRESSOR 2
                       -(U)- - File #3 CRYO_REGEN - 81                      2 ENABLE    RUN
 COOL DOWN        N7:34/6 - -(U)- - File #3 CRYO_REGEN - 81                 M-CY2-1     MCYC2RUN
 2                _F:N7:21[X21 - BTW - File #2 MAIN_PRGRM - 2                 N7:13       N7:34
 CD2              N7:29/6 - -(L)- - File #3 CRYO_REGEN - 81                 --] [-------(L)--
   B3             _F:N7:21[X21 - BTW - File #2 MAIN_PRGRM - 2                  6           6
--] [-------                                                                [3]
  652                                                                                   MANUAL CRYO
 [3:203]                                                                                COMPRESSOR 2
                                                                                        STOP
                          COMPRESSOR                                                    MCYC2STOP
                          2 REGEN-                                                        N7:29
  PUMP AREA               ERATION                                                      ----(U)----
  1 ENABLE                PROGRAM                                                          6
  PUMP1E                  CYRGN2
    N7:37                   B3
--] [-----------------]/[----
     13                    322
  [434]                 [3:34]
  PUMP AREA
  2 ENABLE
  PUMP2E
    N7:37
--] [--
     14
  [438]
 MANUAL
 CONTROL
 CRYO
 COMPRESSOR
 2 ENABLE
 M-CY2-1
   N7:13
--] [--------
     6
 [3]
```

Rung #028
- 120 -
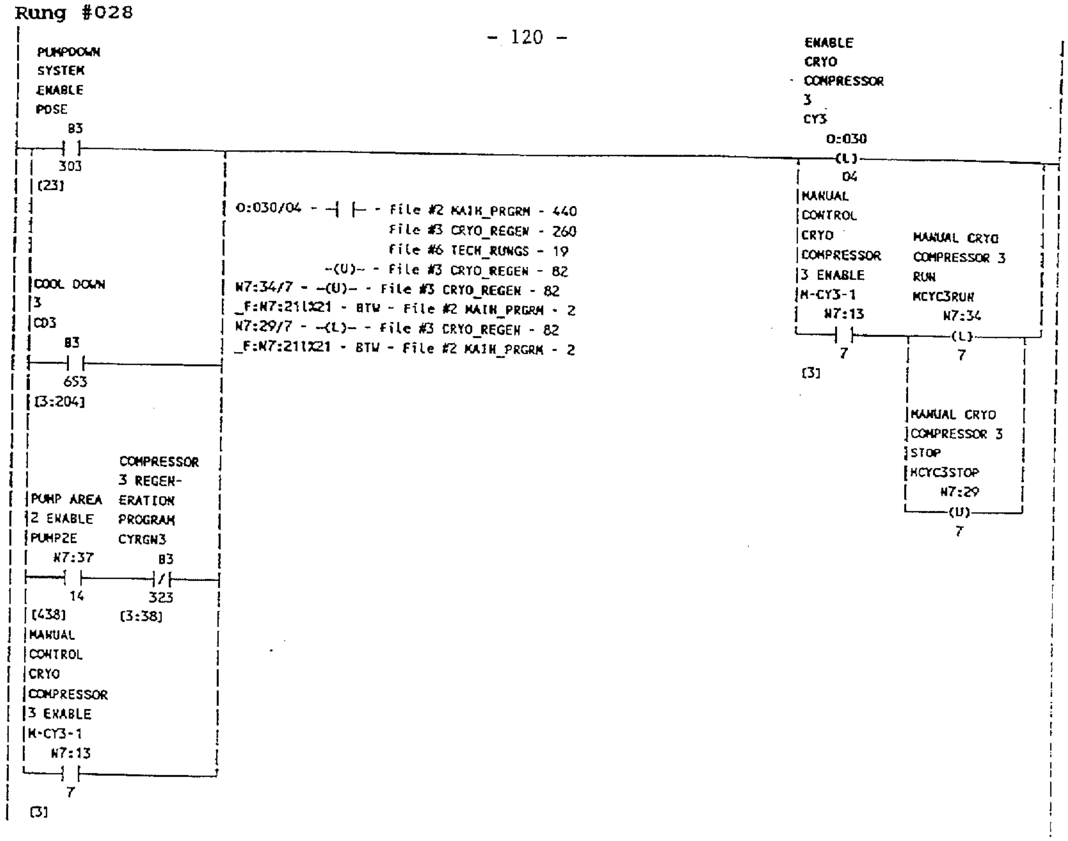

Rung #029
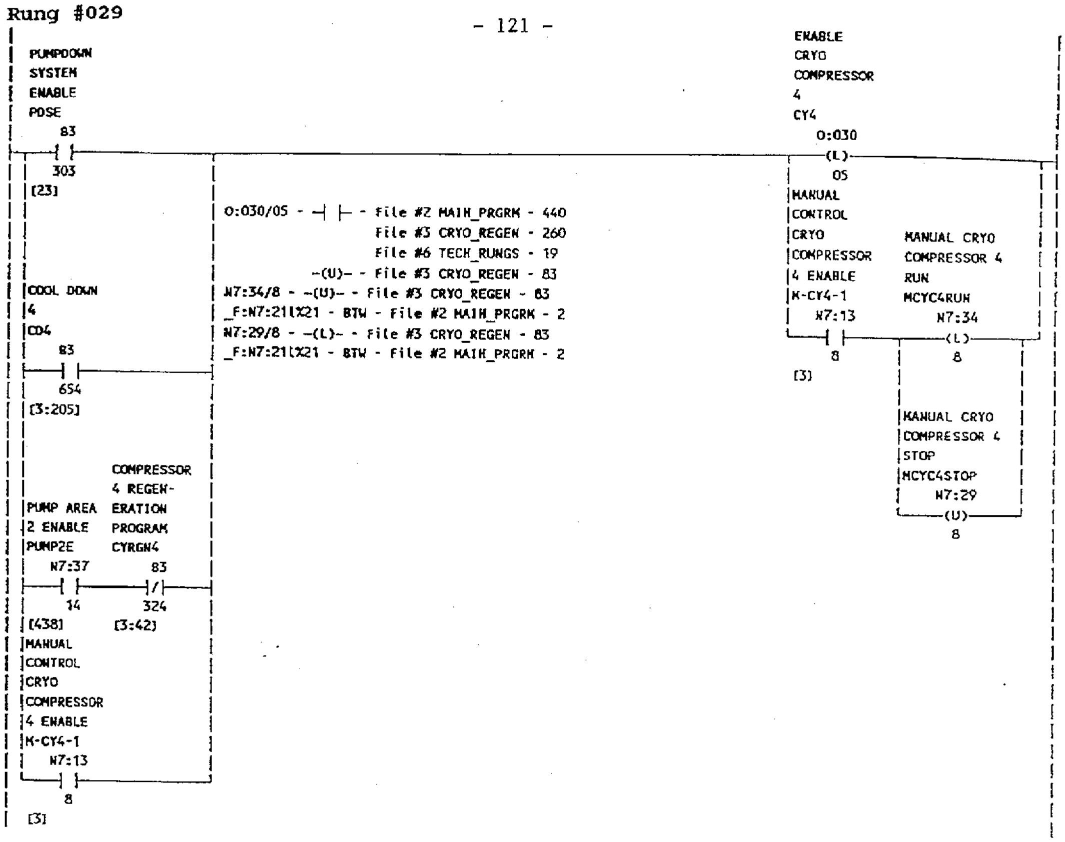

Rung #030

- 122 -

```
PUMPDOWN SYSTEM ENABLE POSE
B3 303 [23]
    --] [--

COOL DOWN 5 COS
B3 655 [3:206]
    --] [--

PUMP AREA 2 ENABLE PUMP2E
N7:37 14 [438]
    --] [--
PUMP AREA 3 ENABLE PUMP3E
N7:37 15 [442]
    --] [--
COMPRESSOR 5 REGEN-ERATION PROGRAM CYRGN5
B3 325 [3:46]
    --]/[--

MANUAL CONTROL CRYO COMPRESSOR 5 ENABLE M-CY5-1
N7:13 9 [3]
    --] [--

O:044/04 - -] [- - File #2 MAIN_PRGRM - 440, 444
                   File #3 CRYO_REGEN - 260
                   File #6 TECH_RUNGS - 19
              -(U)- - File #3 CRYO_REGEN - 84
N7:34/9 - -(U)- - File #3 CRYO_REGEN - 84
_F:N7:21[X2] - BTW - File #2 MAIN_PRGRM - 2
N7:29/9 - -(L)- - File #3 CRYO_REGEN - 84
_F:N7:21[X2] - BTW - File #2 MAIN_PRGRM - 2

ENABLE CRYO COMPRESSOR 5 CY5
O:044 04
    --(L)--

MANUAL CONTROL CRYO COMPRESSOR 5 ENABLE M-CY5-1
N7:13 9 [3]
    --] [--
MANUAL CRYO COMPRESSOR 5 RUN MCYC5RUN
N7:34 9
    --(L)--
MANUAL CRYO COMPRESSOR 5 STOP MCYC5STOP
N7:29 9
    --(U)--
```

- 123 -
Rung #031
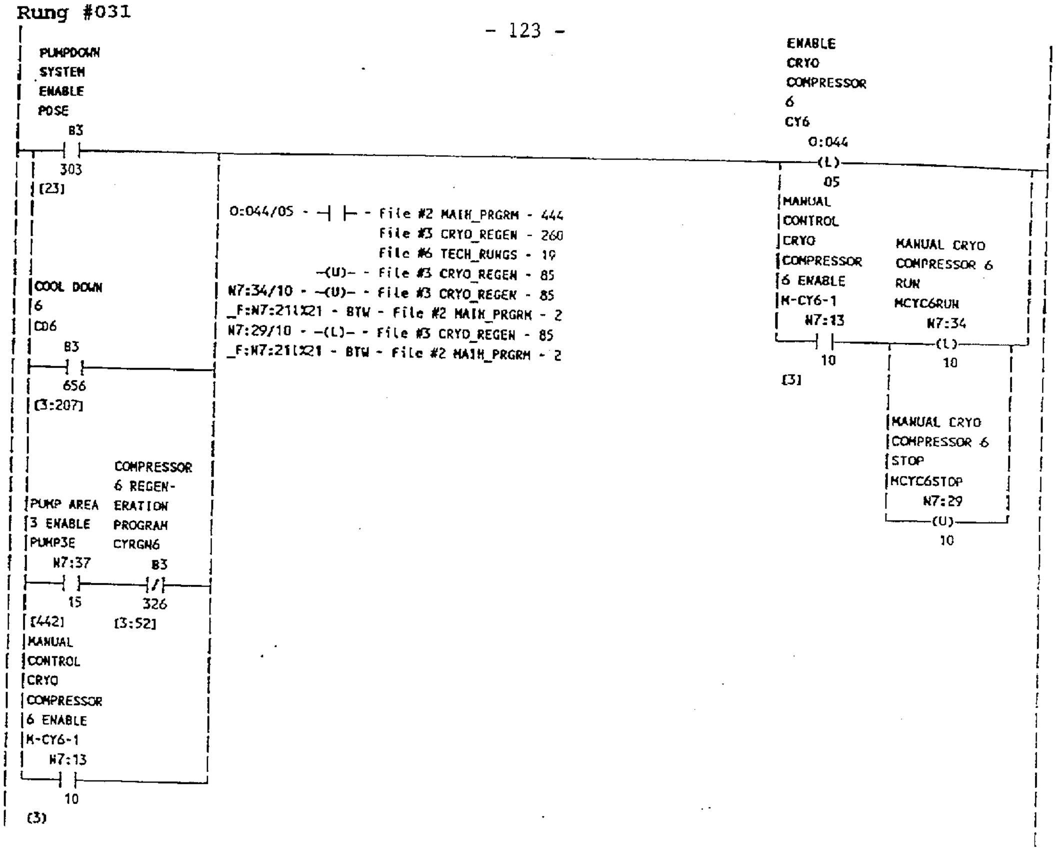

Rung #032
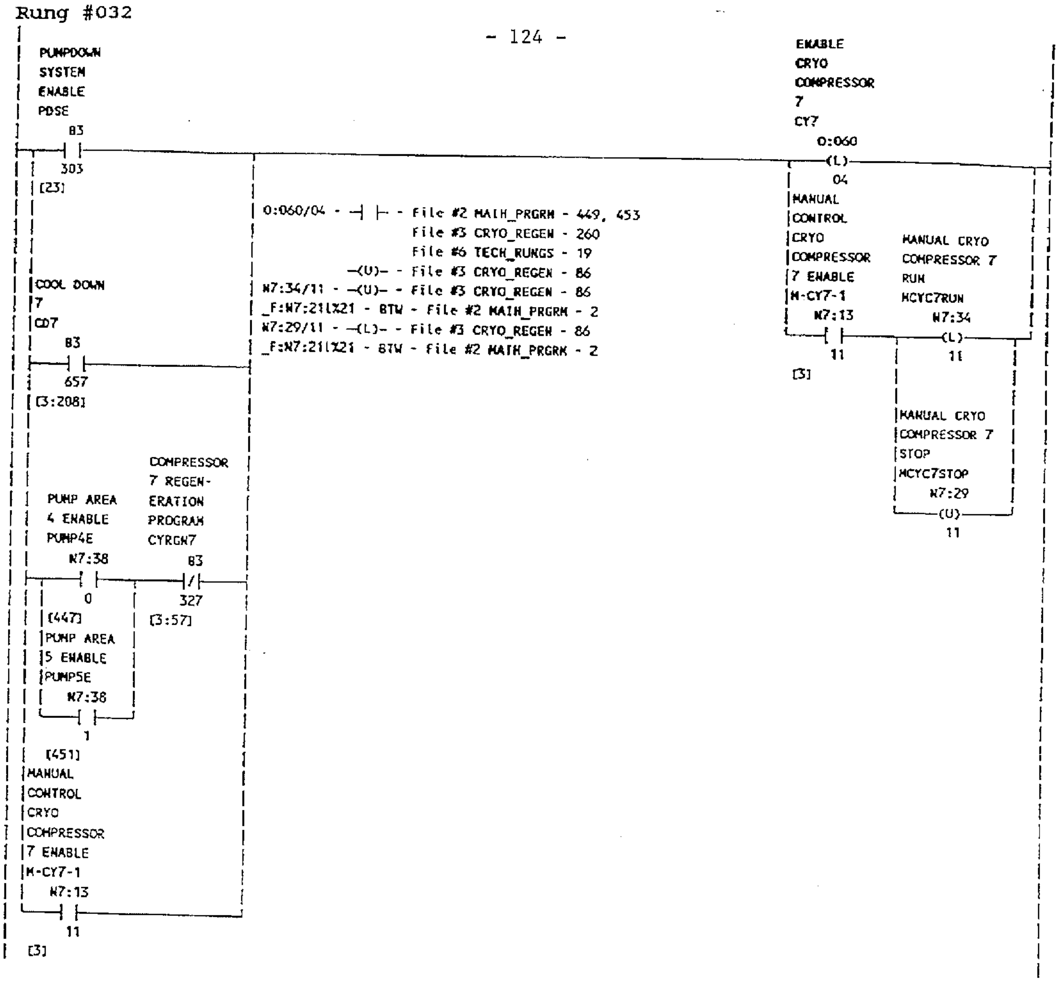

Rung #033
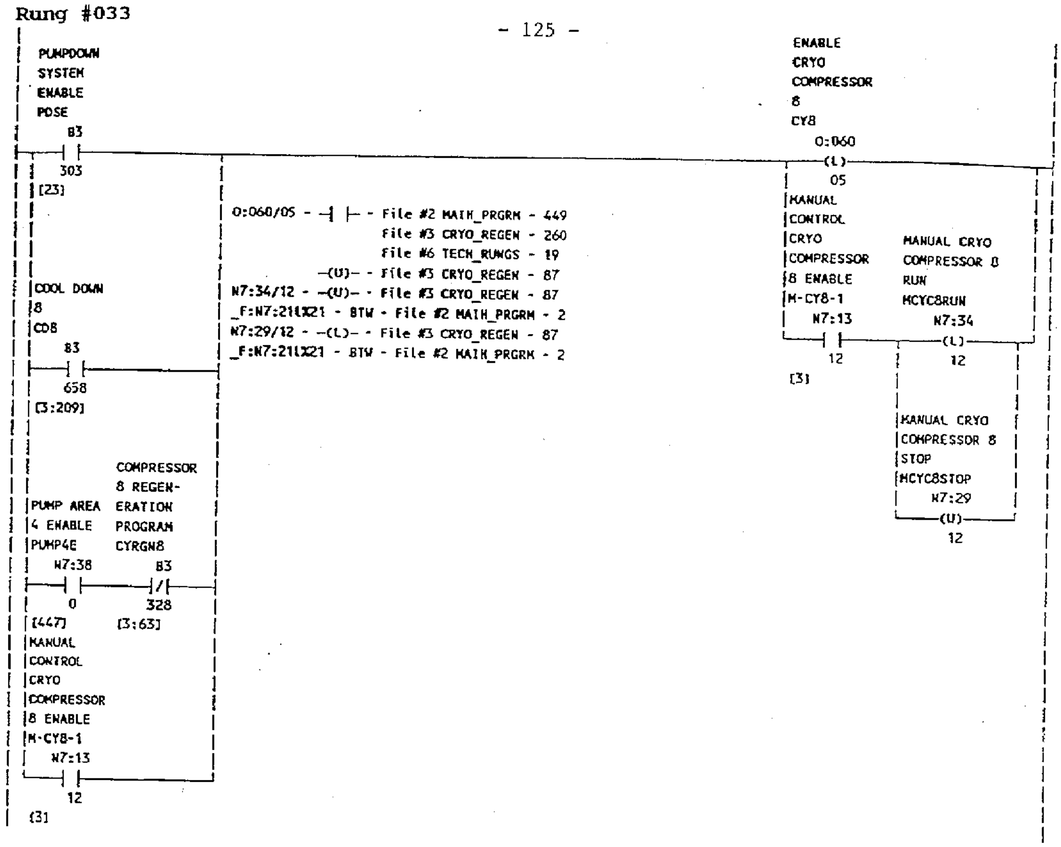

Rung #034

```
MANUAL                                                        OPEN RGA
CONTROL                                                       ISOLATION
RGA VALVE                                                     VALVE 1
1 CLOSE                                                       RGAV1
M-RGAV1-O                                                     O:010
N7:9                                                          -(U)-
-| |-                                                         13
1
[3]
O:010/13 - -| |- - File #6 TECH_RUNGS - 7
           -(L)- - File #2 MAIN_PRGRM - 371
N7:28/5 - -(L)- - File #2 MAIN_PRGRM - 371
_F:N7:21(X21 - BTW - File #2 MAIN_PRGRM - 2
N7:30/1 - -(U)- - File #2 MAIN_PRGRM - 371
_F:N7:21(X21 - BTW - File #2 MAIN_PRGRM - 2

VENT AREA                                                     MANUAL RGA
1 ENABLE                                                      VALVE 1
VENT1E                                                        OPEN
N7:37                                                         MRGAV1OP
-| |-                                                         N7:28
6                                                             -(U)-
[405]                                                         5

SYSTEM                                                        MANUAL RGA
VENT                                                          VALVE 1
ENABLE                                                        CLOSE
SYSVNTE                                                       MRGAV1CL
N7:37                                                         N7:30
-| |-                                                         -(L)-
5                                                             1
[368]
HEATER 1
CHAMBER
=<250
MICRONS
PIR2
I:004
-|/|-
10
```

Rung #035

```
MANUAL CONTROL RGA VALVE 2 CLOSE
M-RGAV2-O
N7:9
--] [--   2
(3)

VENT AREA 2 ENABLE
VENT2E
N7:37
--] [--   7
(411)

SYSTEM VENT ENABLE
SYSVNTE
N7:37
--] [--   5
(368)

CHROME CHAMBER =<250 MICRONS
PIR6
I:024
--]/[--   07

O:030/13 - -] [- - File #6 TECH_RUNGS - 7
           -(L)- - File #2 MAIN_PRGRM - 372
N7:28/6 - -(L)- - File #2 MAIN_PRGRM - 372
_F:N7:21IX21 - BTW - File #2 MAIN_PRGRM - 2
N7:30/2 - -(U)- - File #2 MAIN_PRGRM - 372
_F:N7:21IX21 - BTW - File #2 MAIN_PRGRM - 2

OPEN RGA ISOLATION VALVE 2
RGAV2
O:030
--(U)--   13

MANUAL RGA VALVE 2 OPEN
MRGAV2OP
N7:28
--(U)--   6

MANUAL RGA VALVE 2 CLOSE
MRGAV2CL
N7:30
--(L)--   2
```

Rung #036
- 128 -
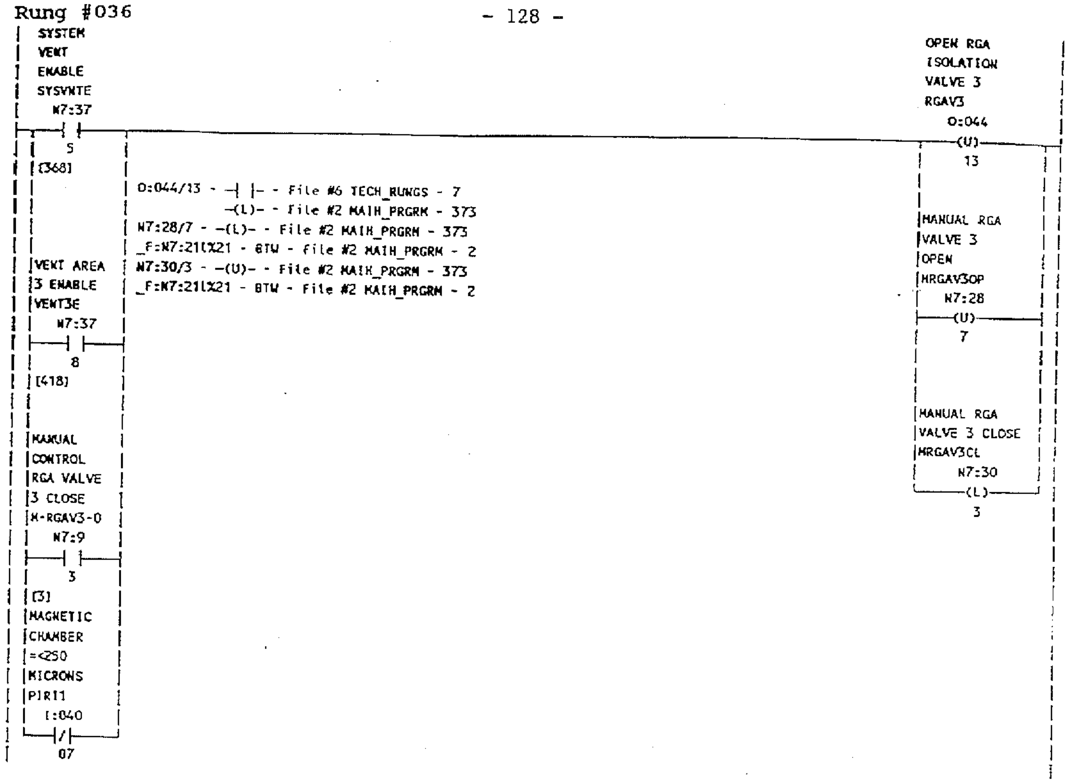

Rung #037
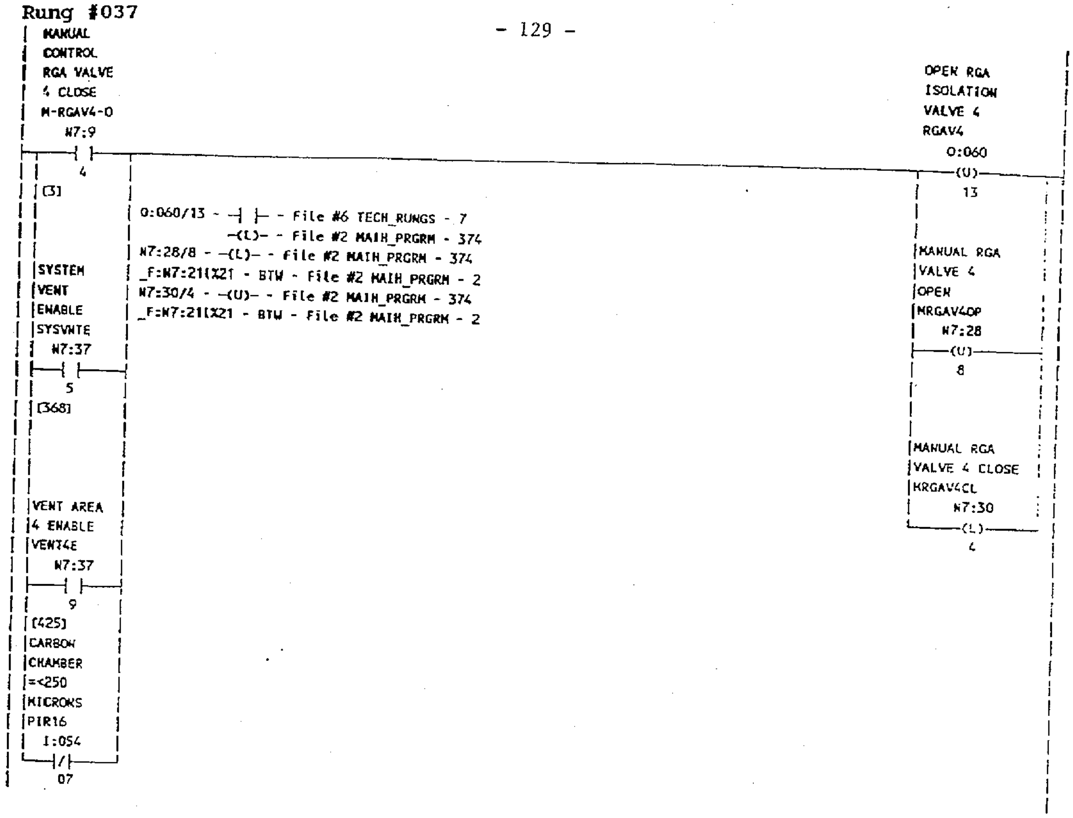

Rung #038

```
MANUAL                                                        OPEN
CONTROL                                                       GAS FLOW
GAS FLOW                                                      ISOLATION
VALVE 1                                                       VALVE 1
CLOSE                                                         GF1
M-GF1-0                                                       O:010
N7:9                                                          -(U)-
-] [-                                                         07
7
[3]
         O:010/07 - -(L)- - File #2 MAIN_PRGRM - 379         MANUAL GAS
         N7:30/15 - -(L)- - File #2 MAIN_PRGRM - 379         FLOW I V 1
         _F:N7:21(X21 - BTW - File #2 MAIN_PRGRM - 2         OPEN
         N7:30/7 - -(U)- - File #2 MAIN_PRGRM - 379          MGFIV1OP
         _F:N7:21(X21 - BTW - File #2 MAIN_PRGRM - 2         N7:30
AUTO OFF                                                      -(U)-
PULSE                                                         15
AUOFPULSE
T4:283                                                        MANUAL GAS
-] [-                                                         FLOW I V 1
TT                                                            CLOSE
[155]                                                         MGFIV1CL
                                                              N7:30
HEATER 1                                                      -(L)-
HIVAC BAFFLE                                                  7
XV1_2
O:011
-]/[-
12
[116]
```

Rung #039

```
MANUAL                                                        OPEN
CONTROL                                                       GAS FLOW
GAS FLOW                                                      ISOLATION
VALVE 2                                                       VALVE 2
CLOSE                                                         GF2
M-GF2-0                                                       O:010
N7:9                                                          -(U)-
-] [-                                                         10
8
[3]
         O:010/10 - -(L)- - File #2 MAIN_PRGRM - 380         MANUAL GAS
         N7:31/0 - -(L)- - File #2 MAIN_PRGRM - 380          FLOW I V 2
         _F:N7:21(X21 - BTW - File #2 MAIN_PRGRM - 2         OPEN
         N7:30/8 - -(U)- - File #2 MAIN_PRGRM - 380          MGFIV2OP
         _F:N7:21(X21 - BTW - File #2 MAIN_PRGRM - 2         N7:31
AUTO OFF                                                      -(U)-
PULSE                                                         0
AUOFPULSE
T4:283                                                        MANUAL GAS
-] [-                                                         FLOW I V 2
TT                                                            CLOSE
[155]                                                         MGFIV2CL
                                                              N7:30
                                                              -(L)-
                                                              8
```

BASE : Rung #040
- 131 -
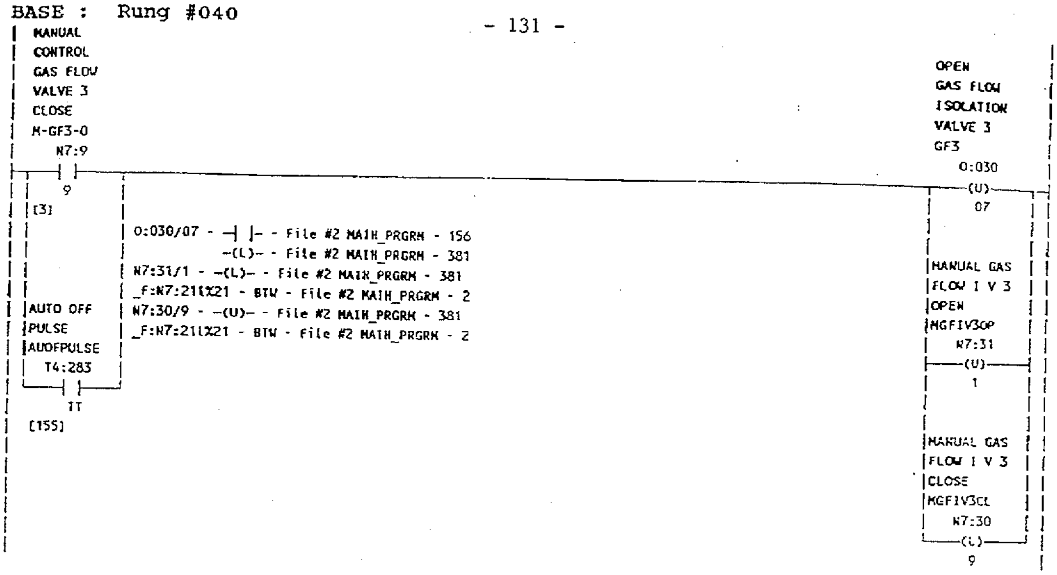

Rung #041

```
MANUAL                                                          OPEN
CONTROL                                                         GAS FLOW
GAS FLOW                                                        ISOLATION
VALVE 4                                                         VALVE 4
CLOSE                                                           GF4
M-GH4-0                                                           O:030
   N7:9
---] [------------------------------------------------------------(U)---
    10                                                              10
 [3]
        O:030/10 - -(L)- - File #2 MAIN_PRGRM - 382
        N7:31/2 - -(L)- - File #2 MAIN_PRGRM - 382                  MANUAL GAS
        _F:N7:211X21 - BTW - File #2 MAIN_PRGRM - 2                 FLOW I V 4
        N7:30/10 - -(U)- - File #2 MAIN_PRGRM - 382                 OPEN
        _F:N7:211X21 - BTW - File #2 MAIN_PRGRM - 2                 MGFIV4OP
AUTO OFF                                                              N7:31
PULSE                                                              ---(U)---
AUOFPULSE                                                              2
  T4:283
---] [---                                                           MANUAL GAS
    TT                                                              FLOW I V 4
 [155]                                                              CLOSE
                                                                    MGFIV4CL
                                                                      N7:30
                                                                   ---(L)---
                                                                      10
```

```
BASE :  Rung #042
| MANUAL
| CONTROL                                                                       GAS FLOW
| GAS FLOW                                                                      ISOLATION
| VALVE 5                                                                       VALVE 5
| CLOSE                                                                         GFS
| M-GF5-0                                                                          O:044
|    N7:9
|-+---] [---+-------------------------------------------------------------------+--(U)--+--|
| |   11    |                                                                   |   07   |
| |[3]      |                                                                   |        |
| |         | O:044/07 - ] [ - File #2 MAIN_PRGRM - 156                         |        |
| |         |            -(L)- - File #2 MAIN_PRGRM - 383                       |MANUAL GAS
| |         | N7:31/3 - -(L)- - File #2 MAIN_PRGRM - 383                        |FLOW I V 5
| |         | _F:N7:21lX21 - BTW - File #2 MAIN_PRGRM - 2                       |OPEN    |
| |AUTO OFF | N7:30/11 - -(U)- - File #2 MAIN_PRGRM - 383                       |MGFIVSOP|
| |PULSE    | _F:N7:21lX21 - BTW - File #2 MAIN_PRGRM - 2                       |  N7:31 |
| |AUOFPULSE|                                                                   +--(U)---+
| |  T4:283 |                                                                   |   3    |
| +---] [---+                                                                   |        |
|      TT                                                                       |MANUAL GAS
|  [155]                                                                        |FLOW I V 5
|                                                                               |CLOSE   |
|                                                                               |MGFIVSCL|
|                                                                               |  N7:30 |
|                                                                               +--(L)---+
|                                                                                   11
```

Rung #043
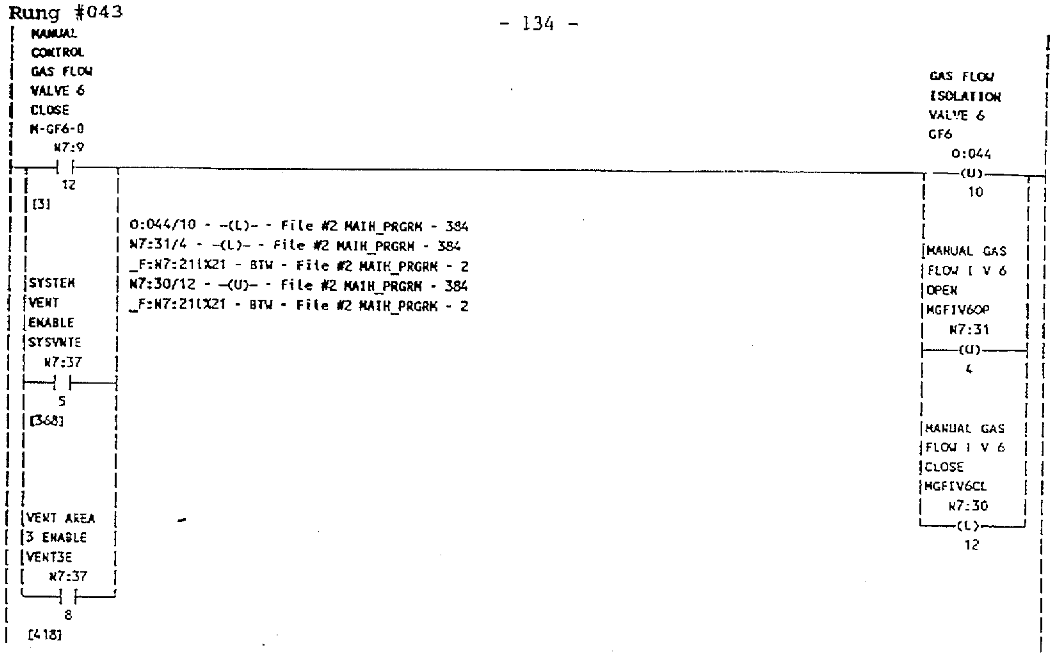

BASE : Rung #044
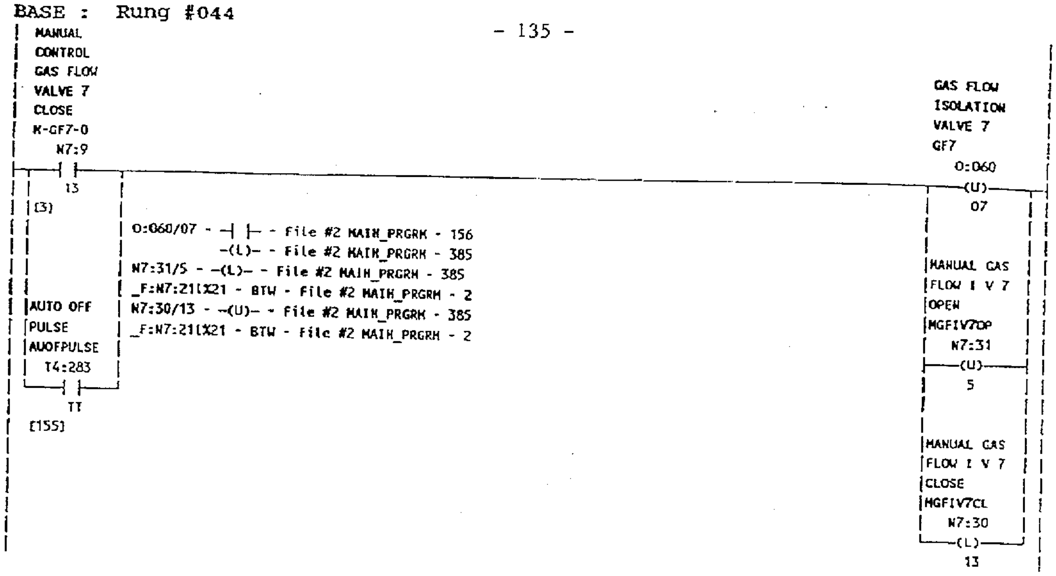

BASE : Rung #045

```
| MANUAL                                                              GAS FLOW
| CONTROL                                                             ISOLATION
| GAS FLOW                                                            VALVE 8
| VALVE 8                                                             GFB
| CLOSE                                                                O:060
| M-GF8-0                                                            ---(U)---
|    N7:9                                                               10
|---] [---
|    14
| [3]
|           | O:060/10 - -(L)- - File #2 MAIN_PRGRM - 386
|           | N7:31/6 - -(L)- - File #2 MAIN_PRGRM - 386               MANUAL GAS
|           | _F:N7:21(X21 - BTW - File #2 MAIN_PRGRM - 2              FLOW I V 8
|           | N7:30/14 - -(U)- - File #2 MAIN_PRGRM - 386              OPEN
|AUTO OFF   | _F:N7:21(X21 - BTW - File #2 MAIN_PRGRM - 2              MGFIV8OP
|PULSE      |                                                          N7:31
|AUOFPULSE  |                                                      ---(U)---
|  T4:283   |                                                          6
|---] [-----
|    TT
| [155]                                                              MANUAL GAS
|                                                                    FLOW I V 8
|                                                                    CLOSE
|                                                                    MGFIV8CL
|                                                                      N7:30
|                                                                    ---(L)---
|                                                                        14
```

Rung #046
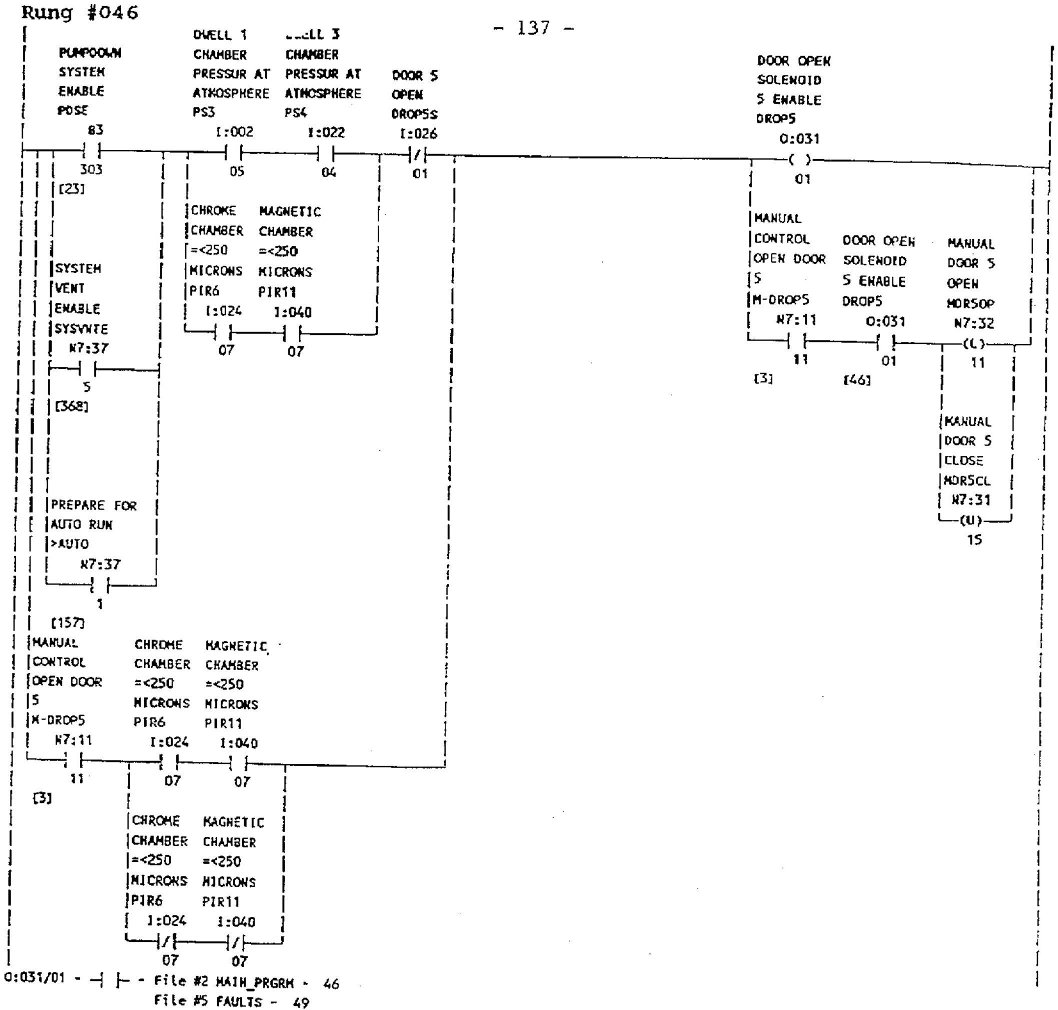
O:031/01 - -| |- - File #2 MAIN_PRGRM - 46
File #5 FAULTS - 49
File #6 TECH_RUNGS - 2
-( )- - File #2 MAIN_PRGRM - 46
N7:32/11 - -(L)- - File #2 MAIN_PRGRM - 46
-(U)- - File #2 MAIN_PRGRM - 414
_F:N7:21(X21 - BTW - File #2 MAIN_PRGRM - 2
N7:31/15 - -(L)- - File #2 MAIN_PRGRM - 414
-(U)- - File #2 MAIN_PRGRM - 46
_F:N7:21(X21 - BTW - File #2 MAIN_PRGRM - 2

Rung #047
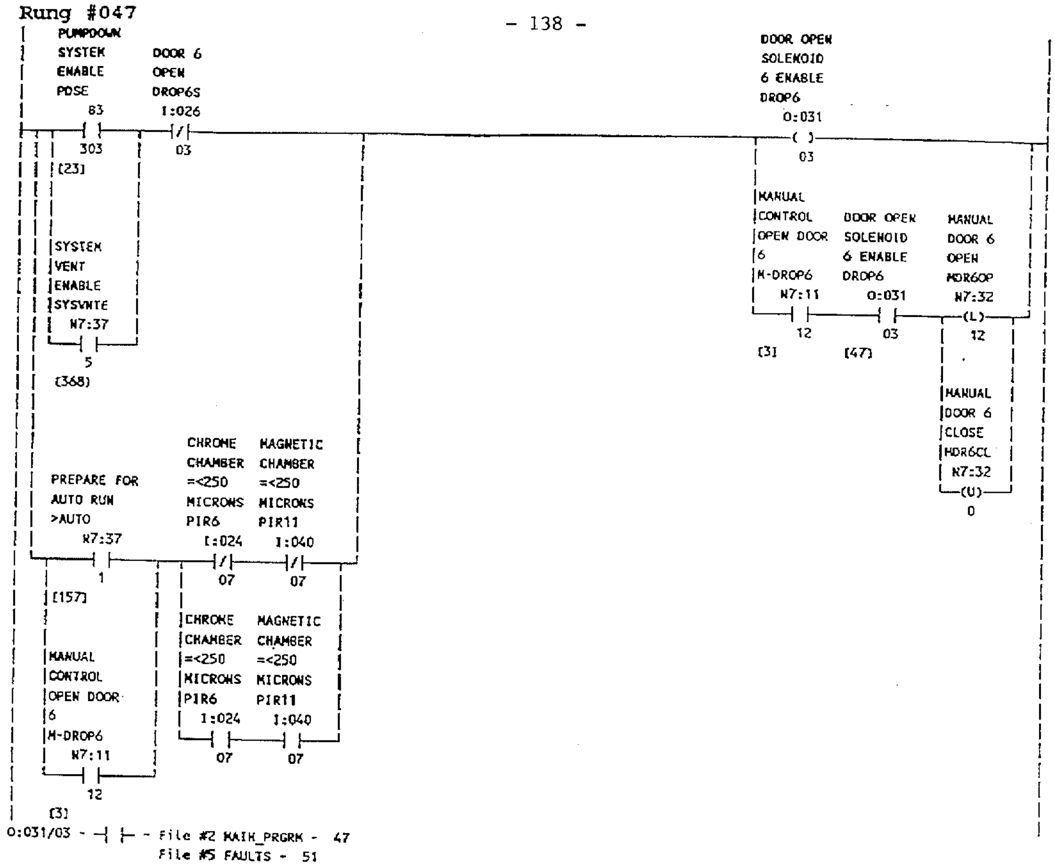
```
O:031/03 - -| |- - File #2 MAIN_PRGRM -  47
                   File #5 FAULTS -  51
                   File #6 TECH_RUNGS -  2
         -( )- - File #2 MAIN_PRGRM -  47
N7:32/12 - -(L)- - File #2 MAIN_PRGRM -  47
         -(U)- - File #2 MAIN_PRGRM -  420
_F:N7:21\X21 - BTW - File #2 MAIN_PRGRM -  2
N7:32/0 - -(L)- - File #2 MAIN_PRGRM -  420
         -(U)- - File #2 MAIN_PRGRM -  47
_F:N7:21\X21 - BTW - File #2 MAIN_PRGRM -  2
```

Rung #048
- 139 -
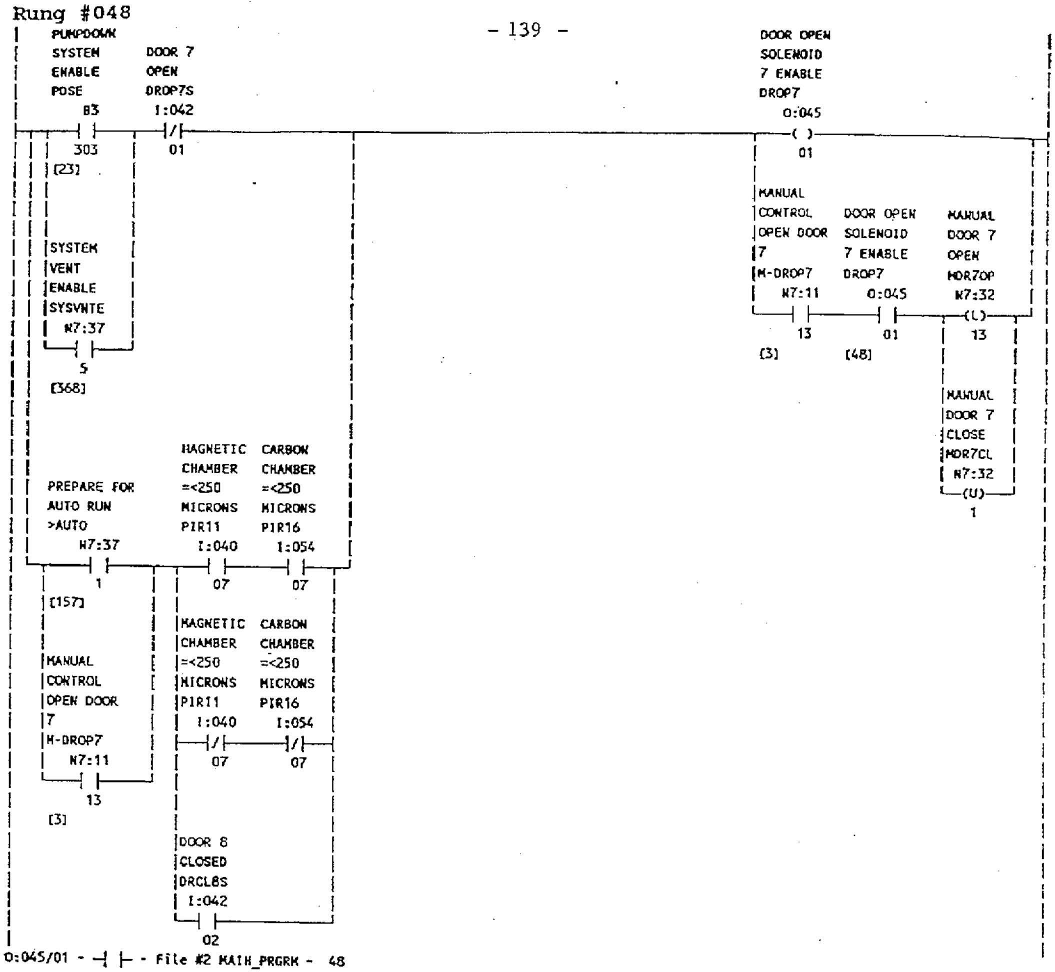
```
O:045/01 - -| |- - File #2 MAIN_PRGRM -  48
                   File #5 FAULTS -  53
                   File #6 TECH_RUNGS -  3
           -( )- - File #2 MAIN_PRGRM -  48
N7:32/13 - -(L)- - File #2 MAIN_PRGRM -  48
           -(U)- - File #2 MAIN_PRGRM -  422
_F:N7:21%21 - BTW - File #2 MAIN_PRGRM -  2
N7:32/1 - -(L)- - File #2 MAIN_PRGRM -  422
          -(U)- - File #2 MAIN_PRGRM -  48
_F:N7:21%21 - BTW - File #2 MAIN_PRGRM -  2
```

Rung #049
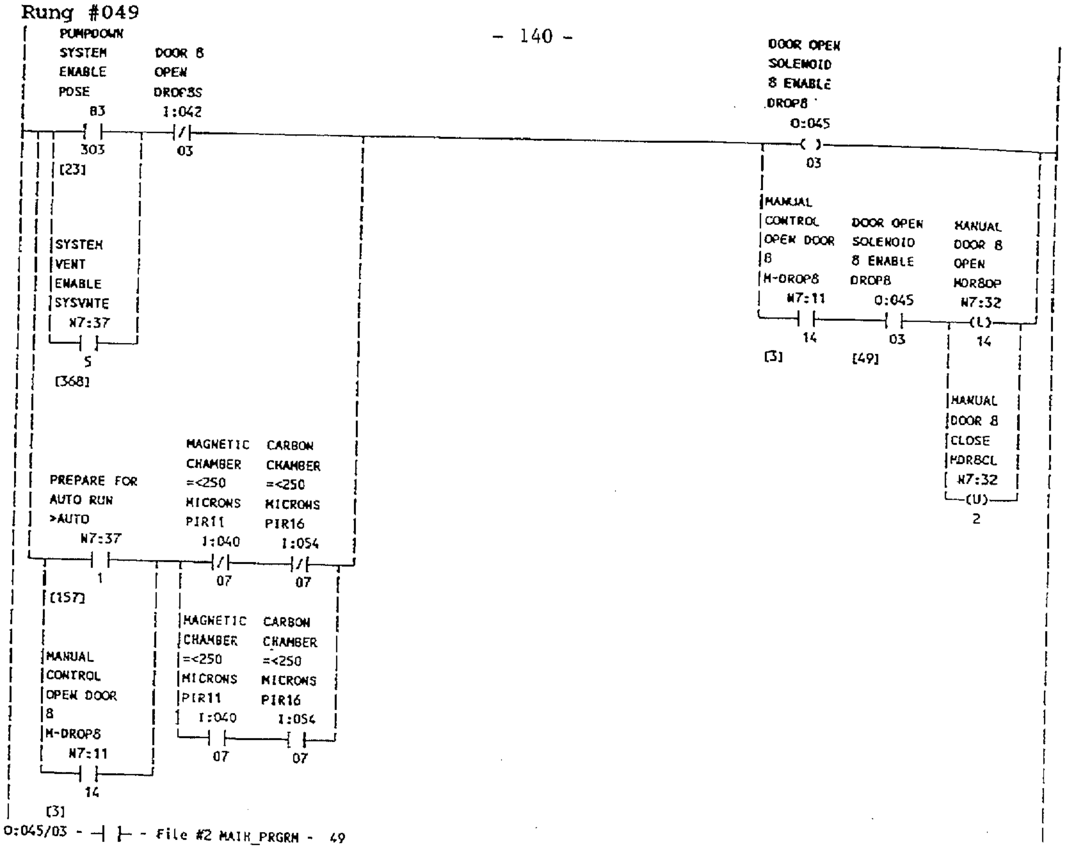
O:045/03 - -| |- - File #2 MAIN_PRGRM - 49
File #5 FAULTS - 55
File #6 TECH_RUNGS - 3
-( )- - File #2 MAIN_PRGRM - 49
N7:32/14 - -(L)- - File #2 MAIN_PRGRM - 49
-(U)- - File #2 MAIN_PRGRM - 427
_F:N7:21[X21 - BTW - File #2 MAIN_PRGRM - 2
N7:32/2 - -(L)- - File #2 MAIN_PRGRM - 427
-(U)- - File #2 MAIN_PRGRM - 49
_F:N7:21[X21 - BTW - File #2 MAIN_PRGRM - 2

Rung #050

```
|DWELL 1                                                              |
|CHAMBER                                                              |
|PRESSUR AT                                   CHAMBER VENT 2          |
|ATMOSPHERE                                   CLOSE DELAY             |
|PS3                                          CV2_DLY                 |
|   I:002                                     +-TON-------------+     |
|----] [--------------------------------------+TIMER ON DELAY   +-(EN)-|
|     05                                      |TIMER:    T4:318 |     |
|                                             |BASE (SEC):  1.0 +-(DN) |
| T4:318.DN - ] [ - File #2 MAIN_PRGRM - 51   |PRESET:        2 |     |
|                                             |ACCUM:         0 |     |
|                                             +-----------------+     |
```

Rung #051
- 142 -
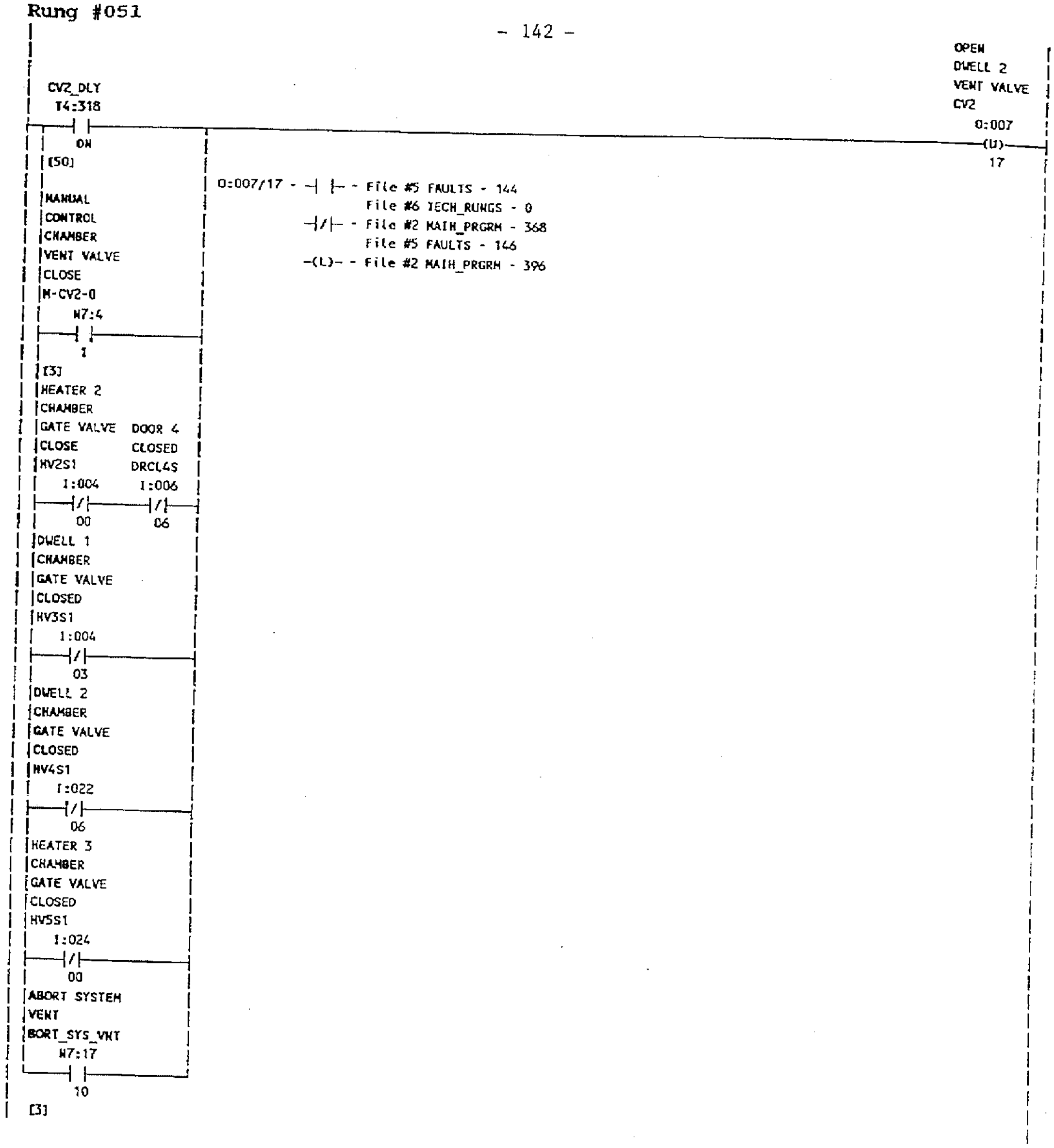

- 143 -

```
Rung #052
|DWELL 3
|CHAMBER
|PRESSUR AT                                                                 CHAMBER VENT 3
|ATMOSPHERE                                                                 CLOSE DELAY
|PS4                                                                        CV3_DLY
|   I:022                                                                   +-TON-----------+
|---] [-------------------------------------------------------------------+-|TIMER ON DELAY |-(EN)-|
|    04                                                                     |TIMER:   T4:319|
|                                                                           |BASE (SEC):  1.0|-(DN) |
| T4:319.DN - ] [ - File #2 MAIN_PRGRM - S3                                 |PRESET:       2|      |
|                                                                           |ACCUM:        0|      |
|                                                                           +----------------+      |
```

Rung #053

```
 CV3_DLY                                                          OPEN
 T4:319                                                           DWELL 3
                                                                  VENT VALVE
                                                                  CV3
                                                                  O:027
--] [-------------------------------------------------------------(U)--
   DN                                                              16
 [52]
                     O:027/16 - -] [- - File #5 FAULTS - 148
 MANUAL                               File #6 TECH_RUNGS - 0
 CONTROL                       -]/[- - File #2 MAIN_PRGRM - 368
 CHAMBER                              File #5 FAULTS - 150
 VENT VALVE                    -(L)- - File #2 MAIN_PRGRM - 401
 CLOSE
 M-CV3-O
   N7:4
--] [--
   2
 [3]
          HEATER 3
          CHAMBER
 DOOR 6   GATE VALVE
 CLOSED   CLOSED
 DRCL6S   HV5S1
 I:026    I:024
--]/[------]/[--
  02        00
 DWELL 3
 CHAMBER
 GATE VALVE
 CLOSED
 HV6S1
  I:024
--]/[--
  03
 DWELL 4
 CHAMBER
 GATE VALVE
 CLOSED
 HV7S1
  I:036
--]/[--
  06
 BUFFER 3
 CHAMBER
 GATE VALVE
 CLOSED
 HV8S1
  I:040
--]/[--
  00
 ABORT SYSTEM
 VENT
 BORT_SYS_VNT
  N7:17
--] [--
  10
 [3]
```

Rung #054

- 145 -

```
|DWELL 5
|CHAMBER
|PRESSUR AT                                                       CHAMBER VENT 4
|ATMOSPHERE                                                       CLOSE DELAY
|PS5                                                              CV4_DLY
|  I:036                                                          +-TON-------------+
|---] [-----------------------------------------------------------|TIMER ON DELAY   |-(EN)-|
|    04                                                           |TIMER:    T4:320 |      |
|                                                                 |BASE (SEC):   1.0|-(DN) |
| T4:320.DN - ] [ - File #2 MAIN_PRGRM - 55                       |PRESET:         2|      |
|                                                                 |ACCUM:          0|      |
|                                                                 +-----------------+      |
```

Rung #055

- 146 -

```
CV4_DLY                                                    OPEN
T4:320                                                     DWELL 5
--| |--                                                    VENT VALVE
   DN                                                      CV4
[54]                                                       0:043
                                                           --(U)--
MANUAL                                                     16
CONTROL
CHAMBER                 0:043/16 - -| |- - File #5 FAULTS - 152
VENT VALVE                                 File #6 TECH_RUNGS - 0
4 CLOSE                            -|/|- - File #2 MAIN_PRGRM - 368
M-CV4-0                                    File #5 FAULTS - 154
  N7:4                             -(L)- - File #2 MAIN_PRGRM - 403
--| |--
   3
[3]
BUFFER 3
CHAMBER
GATE VALVE   DOOR 8
CLOSED       CLOSED
HV8S1        DRCL8S
  I:040      I:042
--|/|--------|/|--
   00         02
DWELL 5
CHAMBER
GATE VALVE
CLOSED
HV9S1
  I:040
--|/|--
   03
DWELL 6
CHAMBER
GATE VALVE
CLOSED
HV10S1
  I:052
--|/|--
   06
BUFFER 4
CHAMBER
GATE VALVE
CLOSED
HV11S1
  I:054
--|/|--
   00
ABORT SYSTEM
VENT
BORT_SYS_VNT
  N7:17
--| |--
   10
[3]
```

- 147 -

```
Rung #056
|    OPEN                          CHROME                    DWELL 1      MECHANICAL                         OPEN      |
|    ROUGHING                      CHAMBER                   CHAMBER      PUMP 2                             DWELL 2   |
|    VALVES                        =<250       BLOWER 2      VENT VALVE   ISOLATION                          ROUGH     |
|    1->5                          MICRONS     ENABLED       CLOSED       VALVE OPEN                         VALVE     |
|    OP_RV1->5                     PIK6        BL2           CVS3         MP2IVOP                            RV2       |
|       B3                          I:024       O:027         I:002        I:025                              O:030     |
|-+-+-+--] [-------------------+-+---]/[---------] [----------] [----------] [-------------------------------( )-------|
| | | |   309                  | |    07          01           13           13                                 11      |
| | | |[104]                   | |               [74]                                                                  |
| | | |               OPEN ROUGH | |                                                                                   |
| | | |PUMP AREA      VALVE 2,3,OR | |                                                                                 |
| | | |2 ENABLE       4 DELAY  | |                                                                                     |
| | | |PUMP2E         P2-4RVTMR| |                                                                                     |
| | | |  N7:37          T4:3   | |                                                                                     |
| | | +---] [-----------] [----+ |                                                                                     |
| | |     14            DN       |                                                                                     |
| | |  [438]        [445]        |                                                                                     |
| | |MANUAL ROUGH                |                                                                                     |
| | |PUMP VALVE                  |                                                                                     |
| | |2 OPEN                      |                                                                                     |
| | |MRPV2OP                     |                                                                                     |
| | |   N7:28                    |                                                                                     |
| | +----] [---------------------+                                                                                     |
| |       1                                                                                                            |
| [504]                                                                                                                |
O:030/11 - -] [- - File #5 FAULTS -  163
                   File #6 TECH_RUNGS -  0
           -]/[- - File #5 FAULTS -  165
           -( )- - File #2 MAIN_PRGRM -  56
Rung #057
|    OPEN                          MAGNETIC                  DWELL 4      MECHANICAL                         OPEN      |
|    ROUGHING                      CHAMBER                   CHAMBER      PUMP 2                             DWELL 4   |
|    VALVES                        =<250       BLOWER 2      VENT VALVE   ISOLATION                          ROUGH     |
|    1->5                          MICRONS     ENABLED       CLOSED       VALVE OPEN                         VALVE     |
|    OP_RV1->5                     PIR11       BL2           CVS5         MP2IVOP                            RV3       |
|       B3                          I:040       O:027         I:022        I:025                              O:044     |
|-+-+-+--] [-------------------+-+---]/[---------] [----------] [----------] [-------------------------------( )-------|
| | | |   309                  | |    07          01           11           13                                 11      |
| | | |(104]                   | |               [74]                                                                  |
| | | |               OPEN ROUGH | |                                                                                   |
| | | |PUMP AREA      VALVE 2,3,OR | |                                                                                 |
| | | |3 ENABLE       4 DELAY  | |                                                                                     |
| | | |PUMP3E         P2-4RVTMR| |                                                                                     |
| | | |  N7:37          T4:3   | |                                                                                     |
| | | +---] [-----------] [----+ |                                                                                     |
| | |     15            DN       |                                                                                     |
| | |  [442]        [445]        |                                                                                     |
| | |MANUAL ROUGH                |                                                                                     |
| | |PUMP VALVE                  |                                                                                     |
| | |3 OPEN                      |                                                                                     |
| | |MRPV3OP                     |                                                                                     |
| | |   N7:28                    |                                                                                     |
| | +----] [---------------------+                                                                                     |
| |       2                                                                                                            |
| [505]                                                                                                                |
O:044/11 - -] [- - File #5 FAULTS -  167
                   File #6 TECH_RUNGS -  0
           -]/[- - File #5 FAULTS -  169
           -( )- - File #2 MAIN_PRGRM -  57
```

```
Rung #058
  OPEN                            CARBON              DWELL 5     MECHANICAL                  OPEN
  ROUGHING                        CHAMBER             CHAMBER     PUMP 2                      DWELL 6
  VALVES                          =<250    BLOWER 2   VENT VALVE  ISOLATION                   ROUGH
  1->5                            MICRONS  ENABLED    CLOSED      VALVE OPEN                  VALVE
  OP_RV1->5                       PIR16    BL2        CVS7        MP2IVOP                     RV4
     B3                           I:054    O:027      I:036       I:025                       O:060
 ---] [---------------------------]/[------] [--------] [---------] [-------------------------( )--
     309                           07       01         11          13                          11
 [104]                                     [74]
  PUMP AREA    OPEN ROUGH
  4 ENABLE     VALVE 2,3,OR
  PUMP4E       4 DELAY
               P2-4RVTMR
    N7:38        T4:3
 ---] [---------] [---
     0           DN
 [447]         [445]
 MANUAL ROUGH
 PUMP VALVE
 4 OPEN
 MRPV4OP
   N7:28
 ---] [---
     3
 [506]
O:060/11 - ] [ - File #5 FAULTS -   171
                 File #6 TECH_RUNGS -  0
           ]/[ - File #5 FAULTS -   173
           ( ) - File #2 MAIN_PRGRM -  58
Rung #059
 MECHANICAL                                                         OPEN
 PUMP 1                                                             PUMP 1
 ENABLED                                                            VENT VALVE
 MP1                                                                PV1
   O:007                                                              O:007
 ---] [--------------------------------------------------------------( )--
     00                                                                02
 [68]
O:007/02 - ] [ - File #6 TECH_RUNGS -  1
           ]/[ - File #2 MAIN_PRGRM -  68
           ( ) - File #2 MAIN_PRGRM -  59
Rung #060
 MECHANICAL                                                         OPEN
 PUMP 2                                                             PUMP 2
 ENABLED                                                            VENT VALVE
 MP2                                                                PV2
   O:027                                                              O:027
 ---] [--------------------------------------------------------------( )--
     00                                                                02
 [73]
O:027/02 - ] [ - File #6 TECH_RUNGS -  1
           ]/[ - File #2 MAIN_PRGRM -  73
           ( ) - File #2 MAIN_PRGRM -  60
Rung #061
 MECHANICAL                                                         OPEN
 PUMP 3                                                             PUMP 3
 ENABLED                                                            VENT VALVE
 MP3                                                                PV3
   O:057                                                              O:057
 ---] [--------------------------------------------------------------( )--
     00                                                                02
 [78]
```

```
O:057/02 - -| |- - File #6 TECH_RUNGS -  1
           -|/|- - File #2 MAIN_PRGRM -  78
           -( )- - File #2 MAIN_PRGRM -  61
Rung #062
|DOOR 1  DOOR 1  DOOR 12  DOOR 12                                          DOOR 1&12 |
|CLOSED  OPEN    CLOSED   OPEN                                             CLOSED    |
|DRCL1S  DROP1S  DRCL12S  DROP12S                                          DR1&12CL  |
| I:006  I:006   I:056    I:056                                              B3      |
|-| |----|/|-----| |------|/|------------------------------------------------( )-----|
| 00     01      06       07                                                 304     |
B3/304 - -| |- - File #2 MAIN_PRGRM -  68
         -( )- - File #2 MAIN_PRGRM -  62
Rung #063
|                        RGA 2      RGA 2      RGA 3      RGA 3      RGA 4      RGA 4          ALL RGA   |
|                        ISOLATION  ISOLATION  ISOLATION  ISOLATION  ISOLATION  ISOLATION      ISOLATION |
|RGA VALVE     RGA VALVE VALVE      VALVE      VALVE      VALVE      VALVE      VALVE          VALVES    |
|SENSOR CLOSED SENSOR OPEN CLOSED   OPEN       CLOSED     OPEN       CLOSED     OPEN           CLOSED    |
|RGAS1_        RGAS2_    RGAS3      RGAS4      RGAS5      RGAS6      RGAS7      RGAS8          RGACL     |
|    I:005       I:005      I:025      I:025      I:041      I:041      I:055      I:055        B3      |
|------| |--------|/|--------| |--------|/|--------| |--------|/|--------| |--------|/|---------( )-----|
|      16         17         16         17         16         17         16         17          305     |
B3/305 - -| |- - File #2 MAIN_PRGRM -  68,391
         -( )- - File #2 MAIN_PRGRM -  63
Rung #064
|DOOR 3 DOOR 3 DOOR 4 DOOR 4 DOOR 5 DOOR 5 DOOR 6 DOOR 6                   DOORS 2->6 |
|CLOSED OPEN   CLOSED OPEN   CLOSED OPEN   CLOSED OPEN                     OPEN       |
|DRCL3S DROP3S DRCL4S DROP4S DRCL5S DROP5S DRCL6S DROP6S                   DR2->6OP   |
| I:006 I:006  I:006  I:006  I:026  I:026  I:026  I:026                      B3       |
|-|/|----| |----|/|----| |----|/|----| |----|/|----| |----------------------( )------|
| 04     05     06     07     00     01     02     03                        306      |
B3/306 - -| |- - File #2 MAIN_PRGRM -  68,391
         -( )- - File #2 MAIN_PRGRM -  64
Rung #065
|DOOR 7 DOOR 7 DOOR 8 DOOR 8 DOOR 9 DOOR 9 DOOR 10 DOOR 10                 DOORS 7->11 |
|CLOSED OPEN   CLOSED OPEN   CLOSED OPEN   CLOSED  OPEN                    OPEN        |
|DRCL7S DROP7S DRCL8S DROP8S DRCL9S DROP9S DRCL10S DROP10S                 DR7->11OP   |
| I:042 I:042  I:042  I:042  I:056  I:056  I:056   I:056                     B3        |
|-|/|----| |----|/|----| |----|/|----| |----|/|-----| |---------------------( )-------|
| 00     01     02     03     00     01     02      03                        307       |
B3/307 - -| |- - File #2 MAIN_PRGRM -  68,391
         -( )- - File #2 MAIN_PRGRM -  65
Rung #066
|LLOCK   LLOCK   DWELL 2  DWELL 2 DWELL 4 DWELL 4 DWELL 5 DWELL 5 EXLOCK  EXLOCK          |
|CHAMBER CHAMBER CHAMBER  CHAMBER CHAMBER CHAMBER CHAMBER CHAMBER CHAMBER CHAMBER         |
|ROUGH   ROUGH   ROUGH    ROUGH   ROUGH   ROUGH   ROUGH   ROUGH   ROUGH   ROUGH   ROUGH   |
|VALVE   VALVE   VALVE RV2 VALVE  VALVE   VALVE   VALVE   VALVE   VALVE   VALVE   VALVES  |
|CLOSED  OPEN    CLOSED   OPEN    CLOSED  OPEN    CLOSED  OPEN    CLOSED  OPEN    CLOSED  |
|RVS1    RVS2    RVS3     RVS4    RVS5    RVS6    RVS7    RVS8    RVS9    RVS10   RVCL    |
| I:002  I:002   I:022    I:022   I:036   I:036   I:052   I:052   I:052   I:052     B3    |
|-| |----|/|-----| |------|/|-----| |-----|/|-----| |-----|/|-----| |-----|/|-------( )---|
| 15     16      15       16      15      16      14      15      16      17        310   |
B3/310 - -| |- - File #2 MAIN_PRGRM -  68,391
         -( )- - File #2 MAIN_PRGRM -  66
Rung #067
|OPEN       DWELL 1    DWELL 1    DWELL 4    DWELL 3    DWELL 5    DWELL 5    OPEN              |
|LOAD LOCK  CHAMBER    CHAMBER    CHAMBER    CHAMBER    CHAMBER    CHAMBER    EXLOCK     VENT   |
|CHAMBER    VENT VALVE VENT VALVE VENT VALVE VENT VALVE VENT VALVE VENT VALVE CHAMBER    VALVES |
|VENT VALVE CLOSED     OPEN       CLOSED     OPEN       CLOSED     OPEN       VENT VALVE CLOSED |
|CV1        CVS3       CVS4       CVS5       CVS6       CVS7       CVS8       CVS        VVCL   |
|  O:007      I:002      I:002      I:022      I:022      I:036      I:036      O:057      B3   |
|----|/|--------| |--------|/|--------| |--------|/|--------| |--------|/|--------|/|-----( )---|
|     16         13         14         11         12         11         12         16    308   |
|[173]                                                                           [346]          |
```

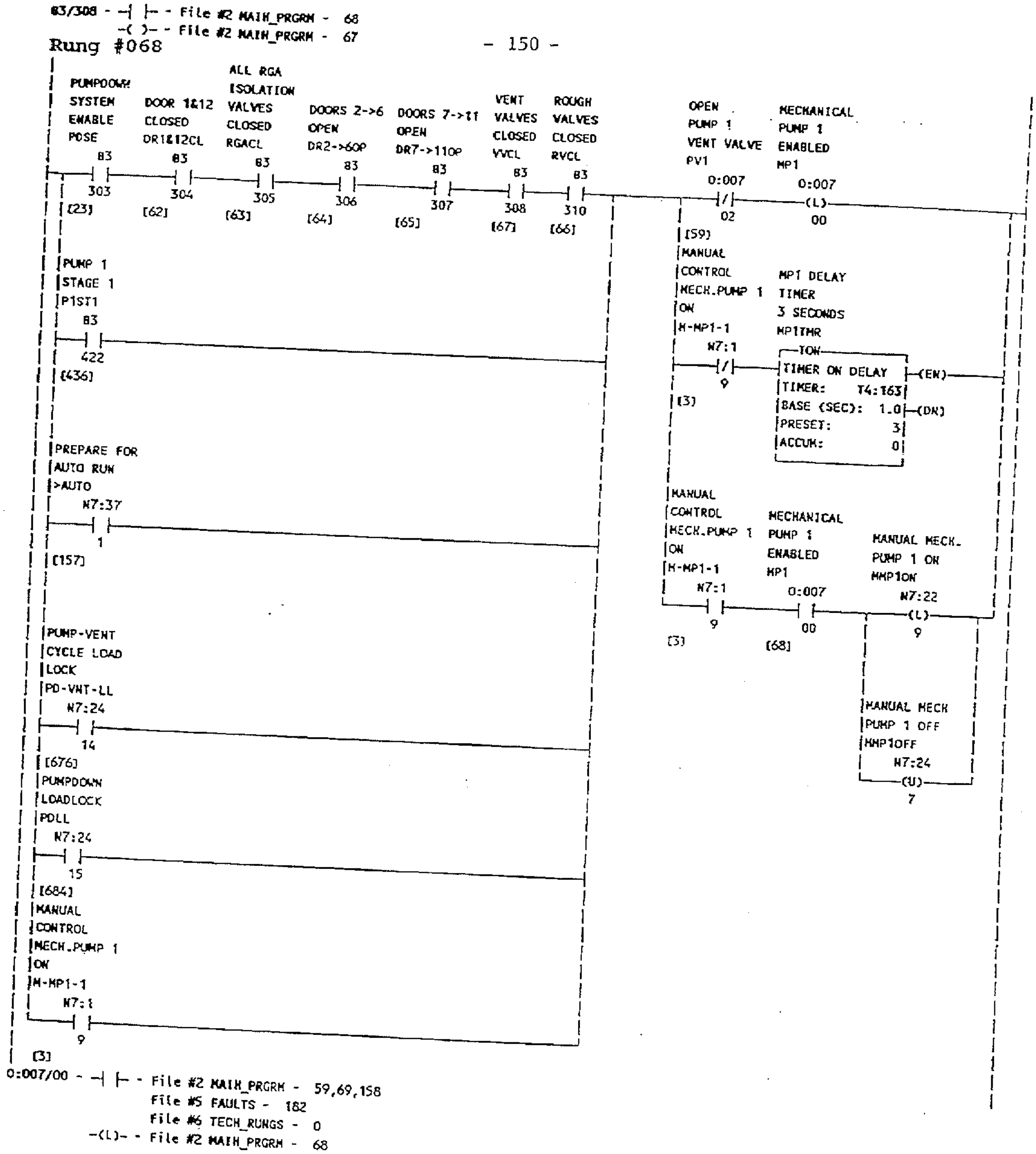
B3/308 - -| |- - File #2 MAIN_PRGRM - 68
-( )- - File #2 MAIN_PRGRM - 67
Rung #068
- 150 -
PUMPDOWN SYSTEM ENABLE PDSE B3 303 [23]
DOOR 1&12 CLOSED DR1&12CL B3 304 [62]
ALL RGA ISOLATION VALVES CLOSED RGACL B3 305 [63]
DOORS 2->6 OPEN DR2->6OP B3 306 [64]
DOORS 7->11 OPEN DR7->11OP B3 307 [65]
VENT VALVES CLOSED VVCL B3 308 [67]
ROUGH VALVES CLOSED RVCL B3 310 [66]
OPEN PUMP 1 VENT VALVE PV1 O:007 02 [59]
MECHANICAL PUMP 1 ENABLED MP1 O:007 (L) 00
PUMP 1 STAGE 1 P1ST1 B3 422 [436]
PREPARE FOR AUTO RUN >AUTO N7:37 1 [157]
PUMP-VENT CYCLE LOAD LOCK PD-VNT-LL N7:24 14 [676]
PUMPDOWN LOADLOCK PDLL N7:24 15 [684]
MANUAL CONTROL MECH.PUMP 1 ON M-MP1-1 N7:1 9 [3]
MANUAL CONTROL MECH.PUMP 1 ON M-MP1-1 N7:1 9 [3]
MP1 DELAY TIMER 3 SECONDS MP1THR
TON
TIMER ON DELAY
TIMER: T4:163
BASE (SEC): 1.0
PRESET: 3
ACCUM: 0
(EN)
(DN)
MANUAL CONTROL MECH.PUMP 1 ON M-MP1-1 N7:1 9 [3]
MECHANICAL PUMP 1 ENABLED MP1 O:007 00 [68]
MANUAL MECH. PUMP 1 ON MMP1ON N7:22 (L) 9
MANUAL MECH PUMP 1 OFF MMP1OFF N7:24 (U) 7
O:007/00 - -| |- - File #2 MAIN_PRGRM - 59,69,158
File #5 FAULTS - 182
File #6 TECH_RUNGS - 0
-(L)- - File #2 MAIN_PRGRM - 68

```
        -(U)- - File #2 MAIN_PRGRM -  89
T4:163.DN - -| |- - File #2 MAIN_PRGRM -  69,73,78
N7:22/9 - -(L)- - File #2 MAIN_PRGRM -  68
        -(U)- - File #2 MAIN_PRGRM -  89
_F:N7:211X21 - BTW - File #2 MAIN_PRGRM -  2
N7:24/7 - -(L)- - File #2 MAIN_PRGRM -  89
        -(U)- - File #2 MAIN_PRGRM -  68
_F:N7:211X21 - BTW - File #2 MAIN_PRGRM -  2
Rung #069
|              MECHANICAL
|  MP1 DELAY   PUMP 1       BLOWER 1                                   BLOWER 1
|  TIMER       ENABLED      DISABLE                                    ENABLED
|  MP1TMR      MP1          BL1D                                       BL1
|   T4:163      O:007        B3                                         O:007
|----| |--------| |----------|/|----------------------------------------(L)-----
|      DN        00          122                                         01
|  [68]        [68]         [86]
|                                                                    |MANUAL
|             | O:007/01 - -| |- - File #2 MAIN_PRGRM - 70, 73, 158, 167, 455   |CONTROL
|MANUAL       |             File #5 FAULTS - 182                     |BLOWER 1   MANUAL BLOWER
|CONTROL      |             File #6 TECH_PUMPS - 0                   |ON         1 ON
|BLOWER 1     |          -|/|- - File #2 MAIN_PRGRM - 87, 89         |M-BL1-1    MBL1ON
|ON           |          -(U)- - File #2 MAIN_PRGRM - 86             |  N7:1          N7:22
|M-BL1-1      | N7:22/12 - -(U)- - File #2 MAIN_PRGRM - 86           |--| |------+-----(L)-----
|  N7:1       | _F:N7:211X21 - BTW - File #2 MAIN_PRGRM - 2             12       |      12
|--| |--------  N7:24/10 - -(L)- - File #2 MAIN_PRGRM - 86          [3]          |
|    12         _F:N7:211X21 - BTW - File #2 MAIN_PRGRM - 2                      |
|  [3]                                                                          |
|                                                                               |MANUAL BLOWER
|                                                                               |1 OFF
|                                                                               |MBL1OFF
|                                                                               |     N7:24
|                                                                               +-----(U)-----
|                                                                                      10
Rung #070
|                                                                       MP1 ISOL
|BLOWER 1                                                               VALVE
|ENABLED                                                                OPEN DELAY
|BL1                                                                    MP1IVOPDY
|  O:007                                                                +-TON-----------------+
|---| |-----------------------------------------------------------------|TIMER ON DELAY       |-(EN)-
|    01                                                                 |TIMER:        T4:95  |
|[69]                                                                   |BASE (SEC):    1.0   |-(DN)
|                                                                       |PRESET:        10    |
|                                                                       |ACCUM:         10    |
|                                                                       +---------------------+
T4:95.TT - -| |- - File #2 MAIN_PRGRM -  71
Rung #071
|                                                                       BLOWER 1
|                                                                       DELAY TO
|                                                                       START MP1IV
|MP1IVOPDY                                                              BL1DLY
|  T4:95                                                                +-TOF-----------------+
|---| |-----------------------------------------------------------------|TIMER OFF DELAY      |-(EN)-
|    TT                                                                 |TIMER:        T4:5   |
|[70]                                                                   |BASE (SEC):    1.0   |-(DN)
|                                                                       |PRESET:         5    |
|                                                                       |ACCUM:          5    |
|                                                                       +---------------------+
T4:5.TT - -| |- - File #2 MAIN_PRGRM -  72
```

```
Rung #072
|
|                                                                    MECHANICAL PUMP |
|                                                                    1 ISOLATION     |
|BL10LY                                                              VALVE           |
| T4:5                                                               MP1IV           |
|                                                                        O:010       |
|-] [-----------------------------------------------------------------------(L)-------|
|  TT                                                                     03        |
|(71)                                                                               |
O:010/03 - ] [ - File #2 MATH_PRGRM -  83
          -(L)- - File #2 MATH_PRGRM -  72
          -(U)- - File #2 MATH_PRGRM -  84
```

- 153 -
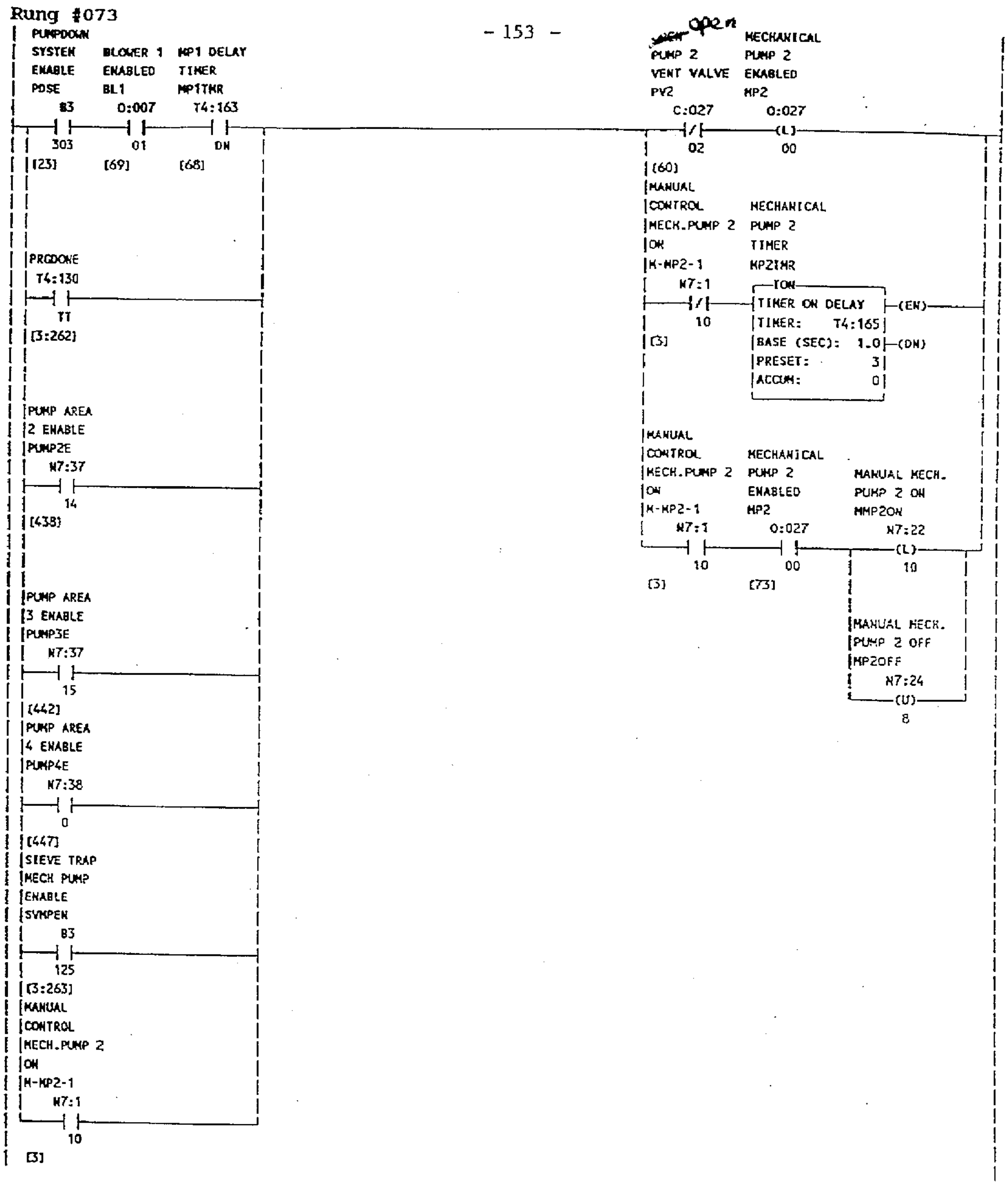

```
O:027/00 - -| |- - File #2 MAIN_PRGRM -  60,74
                   File #5 FAULTS -  184
                   File #6 TECH_RUNGS -  0,15
          -(L)- - File #2 MAIN_PRGRM -  73
          -(U)- - File #2 MAIN_PRGRM -  96
T4:165.DN - -| |- - File #2 MAIN_PRGRM -  74,78
N7:22/10 - -(L)- - File #2 MAIN_PRGRM -  73
         -(U)- - File #2 MAIN_PRGRM -  96
_F:N7:21[X21 - BTW - File #2 MAIN_PRGRM -  2
N7:24/8 - -(L)- - File #2 MAIN_PRGRM -  96
        -(U)- - File #2 MAIN_PRGRM -  73
_F:N7:21[X21 - BTW - File #2 MAIN_PRGRM -  2
```

Rung #074

```
| BLOWER 2  MECHANICAL                                         BLOWER 2
| DELAY     PUMP 2     BLOWER 2                                ENABLED
| MP2TMR    ENABLED    DISABLE                                 BL2
|  T4:165   MP2        BL2D                                     O:027
|           O:027       B3
+--| |---+---| |-------|/|------------------------------------+--(L)--+
|   ON   |   00        123                                    |   01   |
| [73]   | [73]       [93]                                    |        |
|        |                                                    |MANUAL  |
|        | O:027/01 - -| |- - File #2 MAIN_PRGRM - 56, 57, 58, 74, 75, 78,
|MANUAL  |                    445                             |CONTROL |
|CONTROL |                    File #3 CRYO_REGEN - 10, 11, 15, 16, 117, 118,
|BLOWER 2|                    119, 120, 121, 122, 123, 124, 125, 126, 127,
|ON      |                    128, 129, 130, 131, 132, 133, 134, 135, 136,
|M-BL2-1 |                    137, 138, 139, 140, 141, 164, 165, 166, 167,
|  N7:1  |                    168, 169, 170, 171, 172, 173, 174, 175, 177,
+--| |---+                    179, 181, 183, 185, 187
   13                         File #5 FAULTS - 184
  [3]                         File #6 TECH_RUNGS - 0, 15
                      -|/|- - File #2 MAIN_PRGRM - 94, 96
          -(U)- - File #2 MAIN_PRGRM - 93
N7:22/13 - -(U)- - File #2 MAIN_PRGRM - 93
_F:N7:21[X21 - BTW - File #2 MAIN_PRGRM - 2
N7:24/11 - -(L)- - File #2 MAIN_PRGRM - 93
_F:N7:21[X21 - BTW - File #2 MAIN_PRGRM - 2

  |MANUAL
  |CONTROL
  |BLOWER 2  BLOWER 2   MANUAL BLOWER
  |ON        ENABLED    2 ON
  |M-BL2-1   BL2        MBL2ON
  |  N7:1    O:027        N7:22
  +--| |------| |----+----(L)----+
     13        01    |    13     |
    [3]       [74]   |           |
                     |MANUAL BLOWER
                     |2 OFF      |
                     |MBL2OFF    |
                     |   N7:24   |
                     +----(U)----+
                          11
```

Rung #075

```
|BLOWER 2                                          MP2 ISOL
|ENABLED                                           VALVE
|BL2                                               OPEN DELAY
| O:027                                            MP2IVOPDY
|                                                  +-TON-----------------+
+--| |---------------------------------------------+TIMER ON DELAY       +-(EN)-
|   01                                             |TIMER:        T4:96  |
|[74]                                              |BASE (SEC):    1.0   +-(DN)
|                                                  |PRESET:         10   |
|                                                  |ACCUM:           0   |
|                                                  +---------------------+
T4:96.TT - -| |- - File #2 MAIN_PRGRM -  76
```

Rung #076

```
|                                                  BLOWER 2
|                                                  DELAY TO
|                                                  START MP2IV
|MP2IVOPDY                                         BL2DLY
|  T4:96                                           +-TOF-----------------+
+--| |---------------------------------------------+TIMER OFF DELAY      +-(EN)-
|   TT                                             |TIMER:        T4:10  |
|[75]                                              |BASE (SEC):    1.0   +-(DN)
|                                                  |PRESET:         48   |
|                                                  |ACCUM:          48   |
|                                                  +---------------------+
```

T4:10.TT - -| |- - File #2 MAIN_PRGRM - 77
-|/|- - File #2 MAIN_PRGRM - 91

Rung #077

```
|                                                          MECHANICAL PUMP |
|                                                          2 ISOLATION     |
|                                                          VALVE           |
|BL2DLY                                                    MP2IV           |
| T4:10                                                         O:030      |
|-| |------------------------------------------------------------(L)------|
|   TT                                                            03       |
|[76]                                                                      |
```

O:030/03 - -| |- - File #2 MAIN_PRGRM - 90
-(L)- - File #2 MAIN_PRGRM - 77
-(U)- - File #2 MAIN_PRGRM - 91

Rung #078
- 156 -
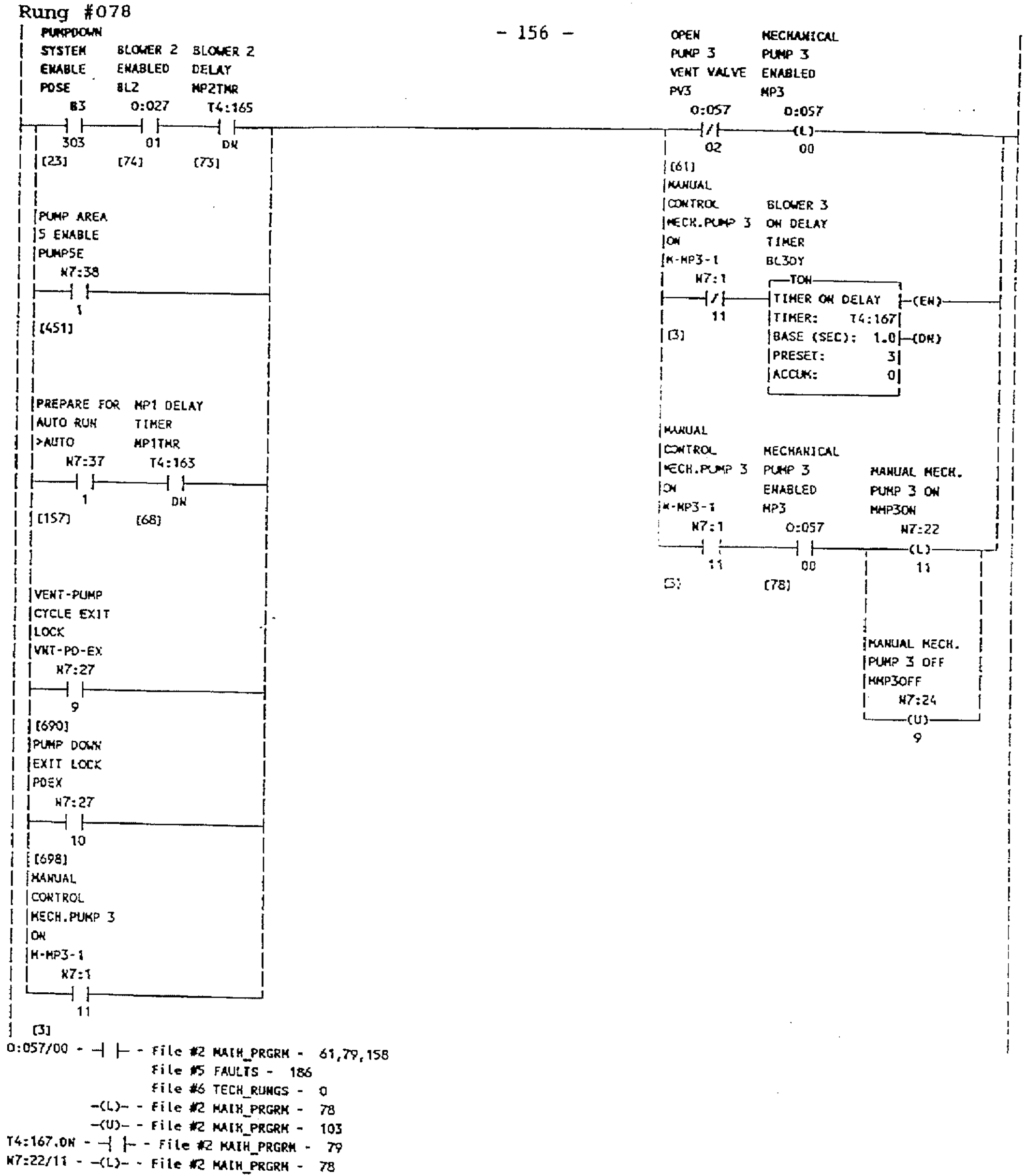
O:057/00 - ┤ ├ - File #2 MAIN_PRGRM - 61,79,158
File #5 FAULTS - 186
File #6 TECH_RUNGS - 0
-(L)- - File #2 MAIN_PRGRM - 78
-(U)- - File #2 MAIN_PRGRM - 103
T4:167.DN - ┤ ├ - File #2 MAIN_PRGRM - 79
N7:22/11 - -(L)- - File #2 MAIN_PRGRM - 78

```
        -(U)- - File #2 MAIN_PRGRM -  103
_F:N7:21[X21 - BTW - File #2 MAIN_PRGRM -  2
N7:24/9 - -(L)- - File #2 MAIN_PRGRM -  103
        -(U)- - File #2 MAIN_PRGRM -  78
_F:N7:21[X21 - BTW - File #2 MAIN_PRGRM -  2
Rung #079

 BLOWER 3       MECHANICAL
 ENABLE DELAY   PUMP 3        BLOWER 3                      BLOWER 3
 BL3DY          ENABLED       DISABLE                       ENABLED
 T4:167         MP3           BL3D                          BL3
                0:057         B3                            0:057
--] [-----------] [-----------]/[----------------------------(L)--
   DN           00            124                           01
 [78]           [78]          [100]

                0:057/01 - -] [- - File #2 MAIN_PRGRM - 79, 80, 158, 340, 456
 MANUAL                        File #5 FAULTS - 186
 CONTROL                       File #6 TECH_RUNGS - 0
 BLOWER 3                -]/[- - File #2 MAIN_PRGRM - 101, 103
 ON                      -(U)- - File #2 MAIN_PRGRM - 100
 M-BL3-1        N7:22/14 - -(U)- - File #2 MAIN_PRGRM - 100
 N7:1           _F:N7:21[X21 - BTW - File #2 MAIN_PRGRM - 2
--] [-----      N7:24/12 - -(L)- - File #2 MAIN_PRGRM - 100
  14            _F:N7:21[X21 - BTW - File #2 MAIN_PRGRM - 2
 [3]

                                 MANUAL
                                 CONTROL
                                 BLOWER 3   BLOWER 3   MANUAL BLOWER
                                 ON         ENABLED    3 ON
                                 M-BL3-1    BL3        MB3ON
                                 N7:1       0:057        N7:22
                                 --] [-------] [----+------(L)--
                                   14         01    |      14
                                 [3]        [79]    |
                                                    | MANUAL BLOWER
                                                    | 3 OFF
                                                    | MBL3OFF
                                                    |    N7:24
                                                    +------(U)--
                                                           12
Rung #080

 BLOWER 3                                        MP3 ISOL.
 ENABLED                                         VALVE
 BL3                                             OPEN DELAY
 0:057                                           MP3IVOPDY
                                                 +-TON---------------+
--] [--------------------------------------------+TIMER ON DELAY     +-(EN)-
   01                                            |TIMER:        T4:97|
 [79]                                            |BASE (SEC):   1.0  +-(DN)
                                                 |PRESET:          10|
                                                 |ACCUM:           10|
                                                 +-------------------+
T4:97.TT - -] [- - File #2 MAIN_PRGRM -  81
Rung #081

                                                 BLOWER 3
                                                 DELAY TO
 MP3IVOPDY                                       START MP3IV
 T4:97                                           BL3DLY
                                                 +-TOF---------------+
--] [--------------------------------------------+TIMER OFF DELAY    +-(EN)-
   TT                                            |TIMER:       T4:164|
 [80]                                            |BASE (SEC):   1.0  +-(DN)
                                                 |PRESET:           5|
                                                 |ACCUM:            5|
                                                 +-------------------+
T4:164.TT - -] [- - File #2 MAIN_PRGRM -  82
```

```
Rung #082
|                                                                    MECHANICAL PUMP |
|                                                                    3 ISOLATION     |
|                                                                    VALVE           |
|BL3DLY                                                              MP3IV           |
| T4:164                                                                0:060        |
|--] [--------------------------------------------------------------------(L)--------|
|   TT                                                                    03         |
|[81]                                                                                |
0:060/03 - ] [ - File #2 MAIN_PRGRM -  97
           -(L)- - File #2 MAIN_PRGRM -  82
           -(U)- - File #2 MAIN_PRGRM -  98
Rung #083
|MANUAL                                                                              |
|CONTROL   MECHANICAL PUMP                                             BLOWER 1      |
|BLOWER 1  1 ISOLATION                                                 MANUAL OFF    |
|OFF       VALVE                                                       PULSE         |
|K-BL1-0   MP11V                                                       BL1MANOFF     |
|  N7:3        0:010                                                      B3         |
|--] [--------] [---------------------------------------------------------(L)--------|
|    10         03                                                        317        |
|[3]       [84]                                                                      |
B3/317 - ]/[ - File #2 MAIN_PRGRM -  89
         -(L)- - File #2 MAIN_PRGRM -  83
         -(U)- - File #2 MAIN_PRGRM -  88
```

```
Rung #084
|                                      LLOCK
| MANUAL                               CHAMBER
| CONTROL                              ROUGH                                        MECHANICAL PUMP
| BLOWER 1                             VALVE                                        1 ISOLATION
| OFF                                  CLOSED                                       VALVE
| M-BL1-O                              RVS1                                         MP1IV
|   N7:3                                I:002                                          O:010
|-+--] [--------------------------------+--] [--------------------------------------------(U)-----|
| |   10                                |   15                                             03
| | [3]                                 |
| |                                     | O:010/03 - ] [ - File #2 MAIN_PRGRM - 83
| |                                     |          -(L)- - File #2 MAIN_PRGRM - 72
| |AUTO OFF                             |
| |PULSE                                |
| |AUOFPULSE                            |
| |  T4:283                             |
| |--] [--------------------------------|
| |    TT                               |
| |[155]                                |
| |PUMP1EDPLSE                          |
| |  T4:284                             |
| |--] [--------------------------------|
| |    TT                               |
| |[437]                                |
| |PDSDPLSE                             |
| |  T4:285                             |
| |--] [--------------------------------|
| |    TT                               |
| |[22]                                 |
| |SYSTEM                               |
| |VENT                                 |
| |ENABLE                               |
| |PULSE                                |
| |SYSVNTPLSE                           |
| |+-LEQ---------------------------+    |
| +|LESS THAN OR EQUAL (A<=B)      |----|
| ||SOURCE A:              T4:286  |    |
| ||                          606  |    |
| ||SOURCE B:                   3  |    |
| ||                            3  |    |
| |+-------------------------------+    |
| |T4:286 - [370]                       |
| |PUMPDOWN                             |
| |LOADLOCK    AUTO                     |
| |DISABLE     MODE                     |
| |PULSE       ENABLE                   |
| |POLLDPLSE   AUTO                     |
| |  T4:287     N7:37                   |
| +--] [-------]/[----------------------+
|      TT         11
|  [686]        [155]
Rung #085
|MECH. PUMP 1
|ISOL. VALVE                                                             UNLATCH BL1
|CLOSE SENSOR                                                           PULSE
|MP1IVCL                                                                UNL_BL1_PL
|   I:005                                                               +-TON-----------------+
|----] [----------------------------------------------------------------+TIMER ON DELAY       +-(EN)-|
|     14                                                                |TIMER:       T4:289  |
|                                                                       |BASE (SEC):     1.0  +-(DN)
| T4:289.TT - ] [ - File #2 MAIN_PRGRM - 86                             |PRESET:          10  |
|                                                                       |ACCUM:            0  |
>                                                                       >>>>>>>>>>>>>>>>>>>     >
```

```
Rung #086

                                                                      BLOWER 1
                                                                      ENABLED
|UNL_BL1_PL                                                           BL1
|  T4:289                                                              O:007
|---| |---------------------------------------------------------------+--(U)--
|    TT                                                               |  01
|[85]
| O:007/01 - -| |- - File #2 MAIN_PRGRM - 70, 73, 158, 167, 455
|                    File #5 FAULTS - 182                             |BLOWER 1
|                    File #6 TECH_RUNGS - 0                           |DISABLE
|           -|/|- - File #2 MAIN_PRGRM - 87, 89                       |BL1D
|           -(L)- - File #2 MAIN_PRGRM - 69                           |   B3
| B3/122 - -|/|- - File #2 MAIN_PRGRM - 69                            +--( )--
| N7:22/12 - -(L)- - File #2 MAIN_PRGRM - 69                          |  122
| _F:N7:21&X21 - BTW - File #2 MAIN_PRGRM - 2
| N7:24/10 - -(U)- - File #2 MAIN_PRGRM - 69
| _F:N7:21&X21 - BTW - File #2 MAIN_PRGRM - 2
|                                                                     |MANUAL BLOWER
|                                                                     |1 ON
|                                                                     |MBL1ON
|                                                                     |    N7:22
|                                                                     +----(U)----
|                                                                     |     12
|                                                                     |MANUAL BLOWER
|                                                                     |1 OFF
|                                                                     |MBL1OFF
|                                                                     |    N7:24
|                                                                     +----(L)----
|                                                                           10
Rung #087
|                                                                 BLOWER 1
|BLOWER 1                                                         OFF-AUTO
|ENABLED                                                          PULSE
|BL1                                                              BL1OFFPLSE
| O:007                                                           +--TON--------------+
|---|/|-----------------------------------------------------------|TIMER ON DELAY     |-(EN)-
|    01                                                           |TIMER:      T4:292 |
|[86]                                                             |BASE (SEC):    1.0 |-(DN)
|                                                                 |PRESET:          8 |
|                                                                 |ACCUM:           0 |
|                                                                 +-------------------+
T4:292.DN - -| |- - File #2 MAIN_PRGRM - 88
T4:292.TT - -| |- - File #2 MAIN_PRGRM - 89
Rung #088
|                                                                       BLOWER 1
|                                                                       MANUAL OFF
|BL1OFFPLSE                                                             PULSE
|  T4:292                                                               BL1MANOFF
|---| |--------------------------------------------------------------------B3
|    DN                                                                 --(U)--
|[87]                                                                     317
B3/317 - -|/|- - File #2 MAIN_PRGRM - 89
         -(L)- - File #2 MAIN_PRGRM - 83
         -(U)- - File #2 MAIN_PRGRM - 88
```

```
Rung #089
|                BLOWER 1                                                                      MECHANICAL   |
|                MANUAL OFF   BLOWER 1                                                         PUMP 1       |
|                PULSE        ENABLED                                                          ENABLED      |
| BL1OFFPLSE     BL1MANOFF    BL1                                                              MP1          |
|   T4:292         B3          O:007                                                            O:007       |
|---| |-----------|/|---------|/|-----------------------------------------------------------------(U)------|
| |   TT           317          01                                                          |     00     | |
| |[87]            [88]     | [86]                                                           |            | |
| |MANUAL                   | O:007/00 - -| |- - File #2 MAIN_PRGRM - 59, 68, 69, 158          |            | |
| |CONTROL                  |                   File #5 FAULTS - 182                           |MANUAL MECH.| |
| |MECHANICAL               |                   File #6 TECH_RUNGS - 0                         |PUMP 1 ON   | |
| |PUMP 1                   |              -(L)- - File #2 MAIN_PRGRM - 68                     |MMP1ON      | |
| |OFF                      | N7:22/9 - -(L)- - File #2 MAIN_PRGRM - 68                          |  N7:22     | |
| |M-MP1-O                  | _F:N7:21(X21 - BTW - File #2 MAIN_PRGRM - 2                        |----(U)-----| |
| |   N7:3                  | N7:24/7 - -(U)- - File #2 MAIN_PRGRM - 68                          |     9      | |
| |---| |-------------------| _F:N7:21(X21 - BTW - File #2 MAIN_PRGRM - 2                        |            | |
|      7                                                                                       |            | |
| [3]                                                                                          |            | |
|                                                                                              |MANUAL MECH | |
|                                                                                              |PUMP 1 OFF  | |
|                                                                                              |MMP1OFF     | |
|                                                                                              |  N7:24     | |
|                                                                                              |----(L)-----| |
|                                                                                                    7        |
Rung #090
|MANUAL                                                                                                     |
|CONTROL    MECHANICAL PUMP                                                                    BLOWER 2     |
|BLOWER 2   2 ISOLATION                                                                        MANUAL OFF   |
|OFF        VALVE                                                                              PULSE        |
|M-BL2-O    MP2IV                                                                              BL2MANOFF    |
|  N7:3          O:030                                                                           B3         |
|---| |------------| |-----------------------------------------------------------------------------(L)--------|
|   11             03                                                                            318        |
|[3]        [91]                                                                                            |
B3/318 - -|/|- - File #2 MAIN_PRGRM -  96
         -(L)- - File #2 MAIN_PRGRM -  90
         -(U)- - File #2 MAIN_PRGRM -  95
```

```
Rung #091
|                                                DWELL 2    DWELL 4  DWELL 5                                                      |
|                                                CHAMBER    CHAMBER  CHAMBER                                                      |
|                                                ROUGH      ROUGH    ROUGH                                   MECHANICAL PUMP      |
|                                                VALVE RV2  VALVE    VALVE                                   2 ISOLATION          |
|                                                CLOSED     CLOSED   CLOSED                                  VALVE                |
| PDSDPLSE                                      RVS3       RVS5     RVS7                                    MP2IV                |
|  T4:285                                        I:022      I:036    I:052                                        O:030         |
|-+--] [-------------------------------------+--] [--------] [-----] [-----------------------------------------------(U)--------|
| |  TT                                      |    15         15       14                                            03         |
| |[22]                                      |                                                                               |
| |                                          | O:030/03 - ] [ - File #2 MAIN_PRGRM - 90                                      |
| |                                          |            -(L)- - File #2 MAIN_PRGRM - 77                                    |
| |DISABLE                                   |                                                                               |
| |MP2 & BL2                                 |                                                                               |
| |CRMPBL2D                                  |                                                                               |
| |  T4:170                                  |                                                                               |
| |---] [------------------------------------|                                                                               |
| |    TT                                    |                                                                               |
| |[3:261]                                   |                                                                               |
| |SYSTEM                                    |                                                                               |
| |VENT                                      |                                                                               |
| |ENABLE                                    |                                                                               |
| |PULSE                                     |                                                                               |
| |SYSVNTPLSE                                |                                                                               |
| |+-LEQ-----------------------+             |                                                                               |
| +|LESS THAN OR EQUAL (A<=B)  |-------------|                                                                               |
| ||SOURCE A:           T4:286|             |                                                                               |
| ||                       606|             |                                                                               |
| ||SOURCE B:                3|             |                                                                               |
| ||                         3|             |                                                                               |
| |+---------------------------+             |                                                                               |
| |T4:286 - [370]                            |                                                                               |
| |P2ENDPULSE                                |                                                                               |
| |   T4:125                                 |                                                                               |
| |----] [-----------------------------------|                                                                               |
| |     TT                                   |                                                                               |
| |[441]                                     |                                                                               |
| |P3ENDPULSE                                |                                                                               |
| |   T4:126                                 |                                                                               |
| |----] [-----------------------------------|                                                                               |
| |     TT                                   |                                                                               |
| |[446]                                     |                                                                               |
| |P4ENDPULSE                                |                                                                               |
| |   T4:127                                 |                                                                               |
| |----] [-----------------------------------|                                                                               |
| |     TT                                   |                                                                               |
| |[450]                                     |                                                                               |
| |NO CRYOS BEING  ABORT CRYO                |                                                                               |
| |REGENERATED     TIMER                     |                                                                               |
| |NO_CYRGN        ABORTCRYO                 |                                                                               |
| |     B3          T4:297                   |                                                                               |
| |----] [----------] [----------------------|                                                                               |
| |    233           TT                      |                                                                               |
| |[3:33]          [3:27]                    |                                                                               |
| |                SIEVE TRAP                |                                                                               |
| |NO CRYOS BEING  MECH PUMP                 |                                                                               |
| |REGENERATED     DISABLE                   |                                                                               |
| |NO_CYRGN        SVMPDIS       BL2DLY      |                                                                               |
| |     B3            B3        T4:10        |                                                                               |
| |----]/[-----------] [---------]/[---------|                                                                               |
| |    233           102          TT         |                                                                               |
| |[3:33]         [3:264]        [76]        |                                                                               |
> >                                          >                                                                               >
```

```
|MANUAL
|CONTROL
|BLOWER 2
|OFF
|M-BL2-0
|  N7:3
└──┤ ├──┘
    11
[3]
```

Rung #092

```
|MECHANICAL PUMP                                          UNLATCH BL2
|2 ISOLATION                                              PULSE
|VALVE CLOSE                                              UNL_BL2_PL
|SENSOR                                                   ┌─TON──────────┐
|MP2IVCL                                                  |TIMER ON DELAY ├─(EN)─
|   I:025                                                 |TIMER:   T4:290|
├───┤ ├───────────────────────────────────────────────────|BASE (SEC): 1.0├─(DN)
     14                                                   |PRESET:      10|
                                                          |ACCUM:       10|
| T4:290.TT - ┤ ├ - File #2 MAIN_PRGRM - 93               └───────────────┘
```

Rung #093

```
|                                                          BLOWER 2
|UNL_BL2_PL                                                ENABLED
|  T4:290                                                  BL2
├──┤ ├──────────────────────────────────────────────────── O:027
    TT                                                    ──(U)──
|[92]                                                        01
| O:027/01 - ┤ ├ - File #2 MAIN_PRGRM - 56, 57, 58, 74, 75, 78, 445
|                  File #3 CRYO_REGEN - 10, 11, 15, 16, 117, 118, 119, 120, 121, 122, 123, 124,
|                  125, 126, 127, 128, 129, 130, 131, 132, 133, 134, 135, 136, 137, 138, 139,
|                  140, 141, 164, 165, 166, 167, 168, 169, 170, 171, 172, 173, 174, 175, 177,
|                  179, 181, 183, 185, 187
|                  File #5 FAULTS - 184
|                  File #6 TECH_RUNGS - 0, 15
|            ┤/├ - File #2 MAIN_PRGRM - 94, 96
|            ─(L)─ - File #2 MAIN_PRGRM - 74
| B3/123 - ┤/├ - File #2 MAIN_PRGRM - 74
| N7:24/11 - ─(U)─ - File #2 MAIN_PRGRM - 74
| _F:N7:21LX21 - BTW - File #2 MAIN_PRGRM - 2
| N7:22/13 - ─(L)─ - File #2 MAIN_PRGRM - 74
| _F:N7:21LX21 - BTW - File #2 MAIN_PRGRM - 2

                                                          |BLOWER 2
                                                          |DISABLE
                                                          |BL2D
                                                          |   B3
                                                          ├──( )──
                                                             123
                                                          |MANUAL BLOWER
                                                          |2 OFF
                                                          |MBL2OFF
                                                          |   N7:24
                                                          ├───(L)──
                                                               11
                                                          |MANUAL BLOWER
                                                          |2 ON
                                                          |MBL2ON
                                                          |   N7:22
                                                          └───(U)──
                                                               13
```

```
Rung #094
|                                                                         BLOWER 2
|BLOWER 2                                                                 OFF-AUTO
|ENABLED                                                                  PULSE
|BL2                                                                      BL2OFFPLSE
|  O:027                                                                  +-TON------------+
|--]/[------------------------------------------------------------------+-|TIMER ON DELAY  |-(EN)-
|   01                                                                    |TIMER:   T4:293 |
|[93]                                                                     |BASE (SEC):  1.0|-(DN)
|                                                                         |PRESET:        5|
|                                                                         |ACCUM:         5|
|                                                                         +----------------+
T4:293.DN - -] [- - File #2 MAIN_PRGRM -  95
T4:293.TT - -] [- - File #2 MAIN_PRGRM -  96
Rung #095
|                                                                              BLOWER 2
|                                                                              MANUAL OFF
|                                                                              PULSE
|BL2OFFPLSE                                                                    BL2MANOFF
|  T4:293                                                                         B3
|--] [------------------------------------------------------------------------(U)----
|   DN                                                                            318
|[94]
B3/318 - -]/[- - File #2 MAIN_PRGRM -  96
        -(L)- - File #2 MAIN_PRGRM -  90
        -(U)- - File #2 MAIN_PRGRM -  95
Rung #096
|             BLOWER 2
|             MANUAL OFF    BLOWER 2                                          MECHANICAL
|             PULSE         ENABLED                                           PUMP 2
| BL2OFFPLSE  BL2MANOFF     BL2                                               ENABLED
|   T4:293       B3          O:027                                            MP2
|--+--] [-------]/[------+----]/[--------------------------------------------+--O:027--+
|  |   TT        318     |     01                                           |--(U)----|
|  | [94]       [95]     |  [93]                                            |   00    |
|  |MANUAL               | O:027/00 - -] [- - File #2 MAIN_PRGRM - 60, 73, 74 |        |
|  |CONTROL              |                    File #5 FAULTS - 184          |MANUAL MECH.
|  |MECHANICAL           |                    File #6 TECH_RUNGS - 0, 15    |PUMP 2 ON
|  |PUMP 2               |              -(L)- - File #2 MAIN_PRGRM - 73     |MMP2ON
|  |OFF                  | N7:22/10 - -(L)- - File #2 MAIN_PRGRM - 73       |   N7:22
|  |M-MP2-O              | _F:N7:21[X21 - BTW - File #2 MAIN_PRGRM - 2       |--(U)----|
|  |  N7:3               | N7:24/8 - -(U)- - File #2 MAIN_PRGRM - 73        |   10    |
|  +--] [----------------+ _F:N7:21[X21 - BTW - File #2 MAIN_PRGRM - 2       |         |
|      8                                                                    |         |
| [3]                                                                       |MANUAL MECH.
|                                                                           |PUMP 2 OFF
|                                                                           |MP2OFF
|                                                                           |   N7:24 |
|                                                                           +--(L)----+
|                                                                               8
Rung #097
|MANUAL
|CONTROL   MECHANICAL PUMP
|BLOWER 3  3 ISOLATION                                                        BLOWER 3
|OFF       VALVE                                                              MANUAL OFF
|M-BL3-O   MP3IV                                                              PULSE
|  N7:3       O:060                                                           BL3MANOFF
|--] [---------] [----------------------------------------------------------------B3
|                                                                             --(L)----
|   12          03                                                               319
|[3]        [98]
B3/319 - -]/[- - File #2 MAIN_PRGRM -  103
```

```
        -(L)- - File #2 MAIN_PRGRM -  97
        -(U)- - File #2 MAIN_PRGRM -  102
Rung #098
|                                          EXLOCK
|  SYSTEM                                  CHAMBER
|  VENT                                    ROUGH                                                  MECHANICAL PUMP
|  ENABLE                                  VALVE                                                  3 ISOLATION
|  PULSE                                   CLOSED                                                 VALVE
|  SYSVNTPLSE                              RVS9                                                   MP3IV
|  +-LEQ--------------------------+         I:052                                                  O:060
|--+LESS THAN OR EQUAL (A<=B)+----] [---------------------------------------------------------------(U)----|
|  ||SOURCE A:           T4:286|  |         16                                                       03
|  ||                       606|  |
|  ||SOURCE B:                3|  | O:060/03 - ] [ - - File #2 MAIN_PRGRM - 97
|  ||                         3|  |            -(L)- - File #2 MAIN_PRGRM - 82
|  |+--------------------------+  |
|  |T4:286 - [370]                |
|  |MANUAL                        |
|  |CONTROL                       |
|  |BLOWER 3                      |
|  |OFF                           |
|  |M-BL3-0                       |
|  |   N7:3                       |
|  |---] [------------------------|
|  |    12                        |
|  |[3]                           |
|  |AUTO OFF                      |
|  |PULSE                         |
|  |AUOFPULSE                     |
|  |   T4:283                     |
|  |---] [------------------------|
|  |    TT                        |
|  |[155]                         |
|  |PSENDPULSE                    |
|  |   T4:128                     |
|  |---] [------------------------|
|  |    TT                        |
|  |[454]                         |
|  |POSDPLSE                      |
|  |   T4:285                     |
|  |---] [------------------------|
|  |    TT                        |
|  |[22]                          |
|  |          AUTO                |
|  |          MODE                |
|  |          ENABLE              |
|  |PFEXEND   AUTO                |
|  | T4:222   N7:37               |
|  +---] [------]/[---------------+
|       TT        11
|    [699]     [155]
Rung #099
|MECHANICAL PUMP
|3 ISOL. VALVE                                                                          UNLATCH BL3
|CLOSE SENSOR                                                                           PULSE
|MP3IVCL                                                                                URL_BL3_PL
|      I:055                                                                            +-TON-------------+
|------] [------------------------------------------------------------------------------+TIMER ON DELAY  +-(EN)-|
|       15                                                                              |TIMER:    T4:291|
|                                                                                       |BASE (SEC):  1.0+-(DN)
| T4:291.TT - ] [ - - File #2 MAIN_PRGRM - 100                                          |PRESET:       20|
|                                                                                       |ACCUM:         0|
|                                                                                       +-----------------+
```

Rung #100

```
|UNL_BL3_PL                                              BLOWER 3
|  T4:291                                                ENABLED
|---] [--------------------------------------------------BL3
|    TT                                                    O:057
|[99]                                                   +--(U)--+
| O:057/01 - ] [ - File #2 MAIN_PRGRM - 79, 80, 158, 340, 456   01
|                File #5 FAULTS - 186                   |
|                File #6 TECH_RUNGS - 0                 |BLOWER 3
|          ]/[ - File #2 MAIN_PRGRM - 101, 103          |DISABLE
|          -(L)- - File #2 MAIN_PRGRM - 79              |BL3D
| B3/124 - ]/[ - File #2 MAIN_PRGRM - 79                |   B3
| N7:22/14 - -(L)- - File #2 MAIN_PRGRM - 79            +--( )--+
| _F:N7:211X21 - BTW - File #2 MAIN_PRGRM - 2           |  124
| N7:24/12 - -(U)- - File #2 MAIN_PRGRM - 79            |
| _F:N7:211X21 - BTW - File #2 MAIN_PRGRM - 2           |
|                                                       |MANUAL BLOWER
|                                                       |3 ON
|                                                       |MB3ON
|                                                       |   N7:22
|                                                       +--(U)--+
|                                                       |   14
|                                                       |MANUAL BLOWER
|                                                       |3 OFF
|                                                       |MBL3OFF
|                                                       |   N7:24
|                                                       +--(L)--+
|                                                           12
```

Rung #101

```
|                                                  BLOWER 3
|BLOWER 3                                          OFF-AUTO
|ENABLED                                           PULSE
|BL3                                               BL3OFFPLSE
| O:057                                            +-TON-----------------+
|---]/[--------------------------------------------+TIMER ON DELAY       +-(EN)-
|   01                                             |TIMER:       T4:294  |
|[100]                                             |BASE (SEC):     1.0  +-(DN)
|                                                  |PRESET:           5  |
|                                                  |ACCUM:            0  |
|                                                  +---------------------+
T4:294.DN - ] [ - File #2 MAIN_PRGRM - 102
T4:294.TT - ] [ - File #2 MAIN_PRGRM - 103
```

Rung #102

```
|                                                       BLOWER 3
|                                                       MANUAL OFF
|                                                       PULSE
|BL3OFFPLSE                                             BL3MANOFF
|  T4:294                                                  B3
|---] [---------------------------------------------------(U)---
|    DN                                                    319
|[101]
B3/319 - ]/[ - File #2 MAIN_PRGRM - 103
         -(L)- - File #2 MAIN_PRGRM - 97
         -(U)- - File #2 MAIN_PRGRM - 102
```

```
Rung #103
|                     BLOWER 3                                                            MECHANICAL    |
|                     MANUAL OFF  BLOWER 3                                                PUMP 3        |
|                     PULSE       ENABLED                                                 ENABLED       |
| BL3OFFPLSE          BL3MANOFF   BL3                                                     MP3           |
|   T4:294            B3          O:057                                                   O:057         |
|-+--] [--------------]/[-----+---]/[-------------------------------------------------+----(U)------+-|
| |   TT                319    |    01                                                |     00      | |
| |[101]               [102]   | [100]                                                |             | |
| |MANUAL                      | O:057/00 - -] [- - File #2 MAIN_PRGRM - 61, 78, 79, 158              |
| |CONTROL                     |                    File #5 FAULTS - 186           |MANUAL MECH.   | |
| |MECHANICAL                  |                    File #6 TECH_RUNGS - 0         |PUMP 3 ON      | |
| |PUMP 3                      |            -(L)- - File #2 MAIN_PRGRM - 78        |MMP3ON         | |
| |OFF                         | N7:22/11 - -(L)- - File #2 MAIN_PRGRM - 78        |  N7:22        | |
| |M-MP3-O                     | _F:N7:211X21 - BTW - File #2 MAIN_PRGRM - 2       +----(U)------+ |
| |   N7:3                     | N7:24/9 - -(U)- - File #2 MAIN_PRGRM - 78         |     11      | |
| +--] [---------------------+ _F:N7:211X21 - BTW - File #2 MAIN_PRGRM - 2         |             | |
|      9                                                                           |             | |
| [3]                                                                              |MANUAL MECH.   | |
|                                                                                  |PUMP 3 OFF     | |
|                                                                                  |MMP3OFF        | |
|                                                                                  |  N7:24        | |
|                                                                                  +----(L)------+ |
|                                                                                        9         |

Rung #104
|                                                                                      OPEN          |
|PUMPDOWN                                                                              ROUGHING      |
|SYSTEM     OPEN ROUGHING                                                              VALVES        |
|ENABLE     VALVES DELAY                                                               1->5          |
|PDSE       DROP2_DLY                                                                  OP_RV1->5     |
|  B3            T4:169                                                                B3            |
|--] [------+----] [-------+-----------------------------------------------------------( )---------|
|  303      |     DN       |                                                            309          |
|[23]       |[199]         |                                                                         |
|           |              | B3/309 - -] [- - File #2 MAIN_PRGRM - 56, 57, 58, 167, 340              |
|           |AUTO          |                                                                         |
|           |MODE          |                                                                         |
|           |ENABLE        |                                                                         |
|           |AUTO          |                                                                         |
|           | N7:37        |                                                                         |
|           +--]/[---------+                                                                         |
|               11                                                                                    |
|             [155]                                                                                   |
```

Rung #105

- 168 -

```
|                  LLOCK
|                  CHAMBER  HEATER 1
|                  ROUGH    CHAMBER
| PUMP AREA        VALVE    =<250
| 1 ENABLE         CLOSED   MICRONS                                         AREA 1 AT
| PUMP1E           RVS1     PIR2                                            STANDBY
|  N7:37           I:002    I:004                                           1STANDBY
|                                                                           B3
+---| |------+------| |------| |--------------------------------------------(L)----|
| |  13      |      15        10                                            291
| |[434]     |
| |          | B3/291 - -| |- - File #2 MAIN_PRGRM - 115, 117, 118
| |          |          -(U)- - File #2 MAIN_PRGRM - 110
| |RV'S ALL  |
| |CLOSED FOR|
| |CROSSOVER |
| |RVS_CLOSED|
| |   B3     |
| +---| |----+
| |   176    |
| |[24]      |
| |AUTO OFF  |
| |PULSE     |
| |AUOFPULSE |
| |  T4:283  |
| +---| |----+
|       TT
|  [155]
```

Rung #106

```
|                  DWELL 2
|                  CHAMBER    CHROME
|                  ROUGH      CHAMBER
| PUMP AREA        VALVE RV2  =<250
| 2 ENABLE         CLOSED     MICRONS                                       AREA 2
| PUMP2E           RVS3       PIR6                                          AT STANDBY
|  N7:37           I:022      I:024                                         2STANDBY
|                                                                           B3
+---| |------+------| |--------| |------------------------------------------(L)----|
| |  14      |      15          07                                          292
| |[438]     |
| |          | B3/292 - -| |- - File #2 MAIN_PRGRM - 117, 118, 119, 120, 121, 122, 123, 124
| |          |          -(U)- - File #2 MAIN_PRGRM - 111
| |RV'S ALL  |
| |CLOSED FOR|
| |CROSSOVER |
| |RVS_CLOSED|
| |   B3     |
| +---| |----+
| |   176    |
| |[24]      |
| |AUTO OFF  |
| |PULSE     |
| |AUOFPULSE |
| |  T4:283  |
| +---| |----+
|       TT
|  [155]
```

```
Rung #107
|                  DWELL 4
|                  CHAMBER  MAGNETIC
|                  ROUGH    CHAMBER
|  PUMP AREA       VALVE    =<250                                                      AREA 3
|  3 ENABLE        CLOSED   MICRONS                                                    AT STANDBY
|  PUMP3E          RVS5     PIR11                                                      3STANDBY
|     N7:37         I:036    I:040                                                        B3
|-+---] [---+------] [------] [-------------------------------------------------------(L)---|
| |    15   |       15       07                                                          293
| |[442]    |
| |         | B3/293 - ] [ - File #2 MAIN_PRGRM - 125, 126, 127, 128, 129, 130
| |         |         -(U)- - File #2 MAIN_PRGRM - 112
| |RV'S ALL |
| |CLOSED FOR
| |CROSSOVER|
| |RVS_CLOSED
| |    B3   |
| |---] [---|
| |   176   |
| |[24]     |
| |AUTO OFF |
| |PULSE    |
| |AUOFPULSE|
| |  T4:283 |
| +---] [---+
|      TT
|  [155]
Rung #108
|                  DWELL 5
|                  CHAMBER  CARBON
|                  ROUGH    CHAMBER
|  PUMP AREA       VALVE    =<250                                                      AREA 4
|  4 ENABLE        CLOSED   MICRONS                                                    AT STANDBY
|  PUMP4E          RVS7     PIR16                                                      4STANDBY
|     N7:38         I:052    I:054                                                        B3
|-+---] [---+------] [------] [-------------------------------------------------------(L)---|
| |     0   |       14       07                                                          294
| |[447]    |
| |         | B3/294 - ] [ - File #2 MAIN_PRGRM - 131, 132, 133, 134, 135, 136
| |         |         -(U)- - File #2 MAIN_PRGRM - 113
| |RV'S ALL |
| |CLOSED FOR
| |CROSSOVER|
| |RVS_CLOSED
| |    B3   |
| |---] [---|
| |   176   |
| |[24]     |
| |AUTO OFF |
| |PULSE    |
| |AUOFPULSE|
| |  T4:283 |
| +---] [---+
|      TT
|  [155]
```

Rung #109
- 170 -
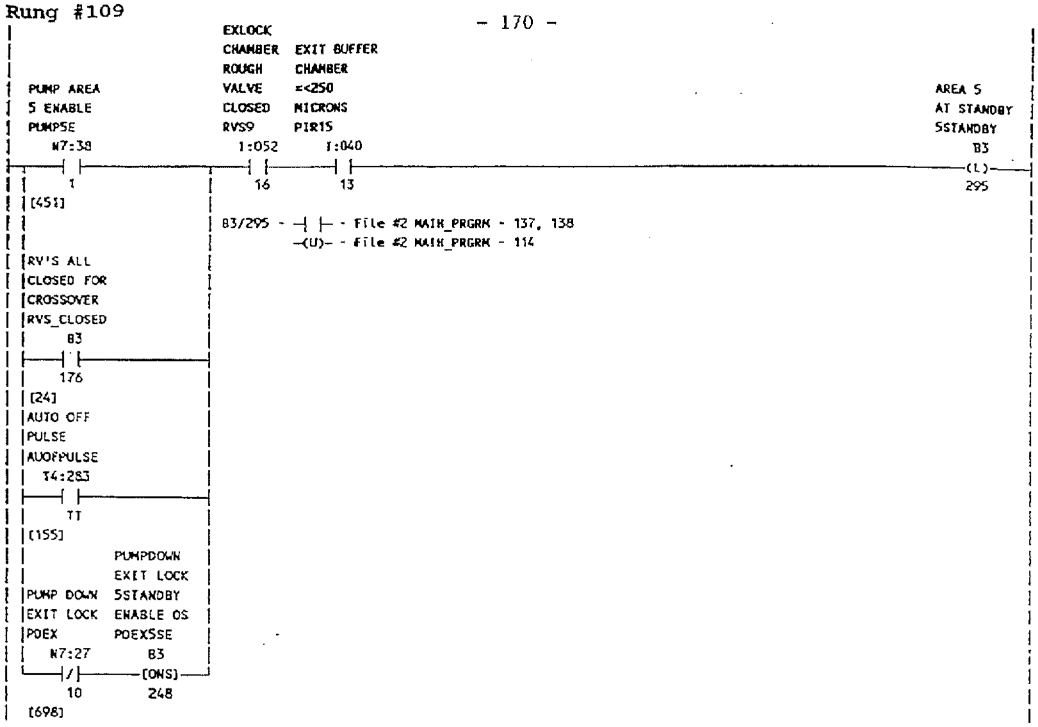

Rung #110

```
| SYSTEM                                                                        AREA 1 AT |
| VENT                                                                          STANDBY   |
| ENABLE                                                                        1STANDBY  |
| SYSVNTE                                                                         B3      |
|   N7:37                                                                                 |
|-+--| |--+-----------------------------------------------------------------------(U)----|
| |    5   |                                                                      291     |
| |[368]   |                                                                              |
| |        | B3/291 - -| |- - File #2 MAIN_PRGRM - 115, 117, 118                         |
| |        |          -(L)- - File #2 MAIN_PRGRM - 105                                    |
| |VENT AREA                                                                            |
| |1 ENABLE|                                                                            |
| |VENT1E  |                                                                            |
| |  N7:37 |                                                                            |
| |--| |---|                                                                            |
| |    6   |                                                                            |
| |[405]   |                                                                            |
| |PREPARE FOR                                                                          |
| |AUTO RUN|                                                                            |
| |>AUTO   |                                                                            |
| |   N7:37|                                                                            |
| |--| |---|                                                                            |
| |    1   |                                                                            |
| |[157]   |                                                                            |
| |reset   |                                                                            |
| |RESET   |                                                                            |
| | N7:17  |                                                                            |
| |-| |----|                                                                            |
| |  15    |                                                                            |
| |[3]     |                                                                            |
| |COMPRESSOR                                                                           |
| |2 REGEN-|                                                                            |
| |ERATION |                                                                            |
| |PROGRAM |                                                                            |
| |CYRGN2  |                                                                            |
| |   B3   |                                                                            |
| +--| |---+                                                                            |
|   322                                                                                   |
|  [3:34]                                                                                 |
```

Rung #111

```
| SYSTEM                                                              AREA 2     |
| VENT                                                                AT STANDBY |
| ENABLE                                                              2STANDBY   |
| SYSVNTE                                                               B3       |
| N7:37                                                                          |
|--] [------------------------------------------------------------------(U)-----|
|  5                                                                    292      |
| [368]                                                                          |
|                   B3/292 - ] [ - File #2 MAIN_PRGRM - 117, 118, 119, 120, 121, 122, 123, 124
|                          -(L)- - File #2 MAIN_PRGRM - 106                      |
| VENT AREA                                                                      |
| 2 ENABLE                                                                       |
| VENT2E                                                                         |
|   N7:37                                                                        |
|--] [--                                                                         |
|    7                                                                           |
| [411]                                                                          |
| PREPARE FOR                                                                    |
| AUTO RUN                                                                       |
| >AUTO                                                                          |
|   N7:37                                                                        |
|--] [--                                                                         |
|    1                                                                           |
| [157]                                                                          |
| reset                                                                          |
| RESET                                                                          |
| N7:17                                                                          |
|--] [--                                                                         |
|   15                                                                           |
| [3]                                                                            |
| COMPRESSOR                                                                     |
| 3 REGEN-                                                                       |
| ERATION                                                                        |
| PROGRAM                                                                        |
| CYRGN3                                                                         |
|    B3                                                                          |
|--] [--                                                                         |
|   323                                                                          |
| [3:38]                                                                         |
| COMPRESSOR                                                                     |
| 4 REGEN-                                                                       |
| ERATION                                                                        |
| PROGRAM                                                                        |
| CYRGN4                                                                         |
|    B3                                                                          |
|--] [--                                                                         |
|   324                                                                          |
| [3:42]                                                                         |
| COMPRESSOR                                                                     |
| 5 REGEN-                                                                       |
| ERATION                                                                        |
| PROGRAM                                                                        |
| CYRGN5                                                                         |
|    B3                                                                          |
|--] [--                                                                         |
|   325                                                                          |
| [3:46]                                                                         |
```

- 173 -

```
Rung #112
| SYSTEM                                                                    |
| VENT                                                          AREA 3      |
| ENABLE                                                        AT STANDBY  |
| SYSVNTE                                                       3STANDBY    |
|   N7:37                                                         B3        |
|-+--| |--+-------------------------------------------------------(U)-------|
| |    5  |                                                        293      |
| |[368]  |                                                                 |
| |       | B3/293 - -| |- - File #2 MAIN_PRGRM - 125, 126, 127, 128, 129, 130
| |       |          -(L)- - File #2 MAIN_PRGRM - 107                       |
| |VENT AREA |                                                              |
| |3 ENABLE  |                                                              |
| |VENT3E    |                                                              |
| |  N7:37   |                                                              |
| |---| |----|                                                              |
| |    8     |                                                              |
| |[418]     |                                                              |
| |PREPARE FOR|                                                             |
| |AUTO RUN  |                                                              |
| |>AUTO     |                                                              |
| |  N7:37   |                                                              |
| |---| |----|                                                              |
| |     1    |                                                              |
| |[157]     |                                                              |
| |reset     |                                                              |
| |RESET     |                                                              |
| | N7:17    |                                                              |
| |-| |------|                                                              |
| |  15      |                                                              |
| |[3]       |                                                              |
| |COMPRESSOR|                                                              |
| |5 REGEN-  |                                                              |
| |ERATION   |                                                              |
| |PROGRAM   |                                                              |
| |CYRGN5    |                                                              |
| |    B3    |                                                              |
| |---| |----|                                                              |
| |   325    |                                                              |
| |[3:46]    |                                                              |
| |COMPRESSOR|                                                              |
| |6 REGEN-  |                                                              |
| |ERATION   |                                                              |
| |PROGRAM   |                                                              |
| |CYRGN6    |                                                              |
| |    B3    |                                                              |
| +---| |----+                                                              |
|     326                                                                   |
|   [3:52]                                                                  |
```

Rung #113

```
| SYSTEM                                                                AREA 4     |
| VENT                                                                  AT STANDBY |
| ENABLE                                                                4STANDBY   |
| SYSVNTE                                                                  B3      |
|  N7:37                                                                           |
|---] [---+-------------------------------------------------------------(U)-------|
|    5    |                                                              294       |
| [368]   | B3/294 - ] [ - - File #2 MAIN_PRGRM - 131, 132, 133, 134, 135, 136     |
|         |         -(L)- - File #2 MAIN_PRGRM - 108                               |
|VENT AREA|                                                                        |
|4 ENABLE |                                                                        |
|VENT4E   |                                                                        |
|  N7:37  |                                                                        |
|---] [---+                                                                        |
|    9    |                                                                        |
|[425]    |                                                                        |
|PREPARE FOR                                                                       |
|AUTO RUN |                                                                        |
|>AUTO    |                                                                        |
|  N7:37  |                                                                        |
|---] [---+                                                                        |
|    1    |                                                                        |
|[157]    |                                                                        |
|reset    |                                                                        |
|RESET    |                                                                        |
| N7:17   |                                                                        |
|--] [----+                                                                        |
|   15    |                                                                        |
|[3]      |                                                                        |
|COMPRESSOR                                                                        |
|7 REGEN- |                                                                        |
|ERATION  |                                                                        |
|PROGRAM  |                                                                        |
|CYRGN7   |                                                                        |
|   B3    |                                                                        |
|---] [---+                                                                        |
|   327   |                                                                        |
|[3:57]   |                                                                        |
|COMPRESSOR                                                                        |
|8 REGEN- |                                                                        |
|ERATION  |                                                                        |
|PROGRAM  |                                                                        |
|CYRGN8   |                                                                        |
|   B3    |                                                                        |
|---] [---+                                                                        |
   328
 [3:63]
```

- 175 -

Rung #114

```
| SYSTEM                                                              AREA 5       |
| VENT                                                                AT STANDBY   |
| ENABLE                                                              5STANDBY     |
| SYSVNTE                                                                 B3       |
|   N7:37                                                                          |
|---] [------------------------------------------------------------------(U)------|
| |   5       |                                                            295       |
| |[368]      |                                                                      |
| |           | B3/295 - ] [ - File #2 MAIN_PRGRM - 137, 138                         |
| |           |          -(L)- - File #2 MAIN_PRGRM - 109                            |
| |VENT AREA  |                                                                      |
| |5 ENABLE   |                                                                      |
| |VENT5E     |                                                                      |
| |   N7:37   |                                                                      |
| |---] [-----|                                                                      |
| |     10    |                                                                      |
| |[430]      |                                                                      |
| |PREPARE FOR|                                                                      |
| |AUTO RUN   |                                                                      |
| |>AUTO      |                                                                      |
| |   N7:37   |                                                                      |
| |---] [-----|                                                                      |
| |     1     |                                                                      |
| |[157]      |                                                                      |
| |reset      |                                                                      |
| |RESET      |                                                                      |
| | N7:17     |                                                                      |
| |--] [------|                                                                      |
| |  15       |                                                                      |
| |[3]        |                                                                      |
| |COMPRESSOR |                                                                      |
| |7 REGEN-   |                                                                      |
| |ERATION    |                                                                      |
| |PROGRAM    |                                                                      |
| |CYRGN7     |                                                                      |
| |     B3    |                                                                      |
| |---] [-----|                                                                      |
|     327                                                                          |
|  [3:57]                                                                          |
```

Rung #115
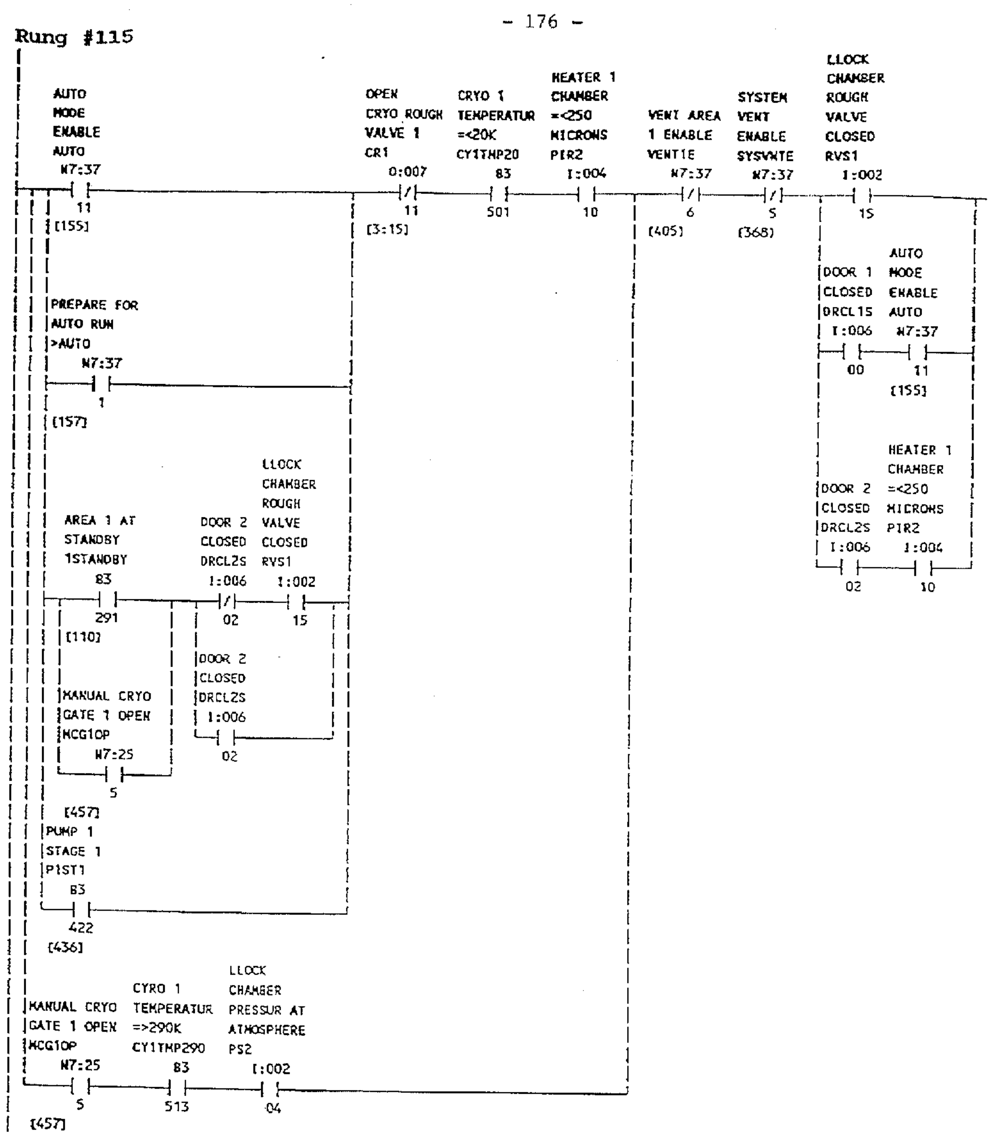
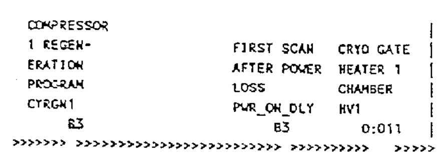

- 177 -

```
                                                  <<<<<<< <<<<<<<<<<<<<<<<<<<<<<<<<<< <<<<<<<<<<   <<<<<
                                                  ┬───┤/├──────────────────┬───┤/├────────( )───┤
                                                  |   321                  |   444        11    |
                                                  |[3:0]                   | [1]                |
                                                  |COMPRESSOR              |                    |
                                                  |1 REGEN-                |                    |
                                                  |ERATION      COOL DOWN  |                    |
                                                  |PROGRAM      1          |                    |
                                                  |CYRGN1       CO1        |                    |
                                                  |    B3         B3       |                    |
                                                  └───┤ ├─────────┤ ├──────┘                    |
                                                      321         651                           |
                                                  [3:0]      [3:20]                             |
O:011/11 - ┤ ├ - File #5 FAULTS -  69
                 File #6 TECH_RUNGS -  6
         ┤/├ - File #5 FAULTS -  117
         ─( )- - File #2 MAIN_PRGRM -  115
Rung #116
| DOOR 3                                                                       HEATER 1        |
| CLOSED                                                                       HIVAC BAFFLE    |
| DRCL3S                                                                       HV1_2           |
|  I:006                                                                          O:011        |
├─┬─┤ ├─┬────────────────────────────────────────────────────────────────────────(U)──────────┤
| |  04 |                                                                          12          |
| |     | O:011/12 - ┤ ├ - File #2 MAIN_PRGRM - 379                                            |
| |AUTO |          ┤/├ - File #2 MAIN_PRGRM - 38                                               |
| |MODE |          ─(L)- - File #2 MAIN_PRGRM - 215                                            |
| |ENABLE|                                                                                     |
| |AUTO |                                                                                      |
| | N7:37|                                                                                     |
| └─┤/├─┘                                                                                      |
|    11                                                                                        |
| [155]                                                                                        |
```

Rung #117
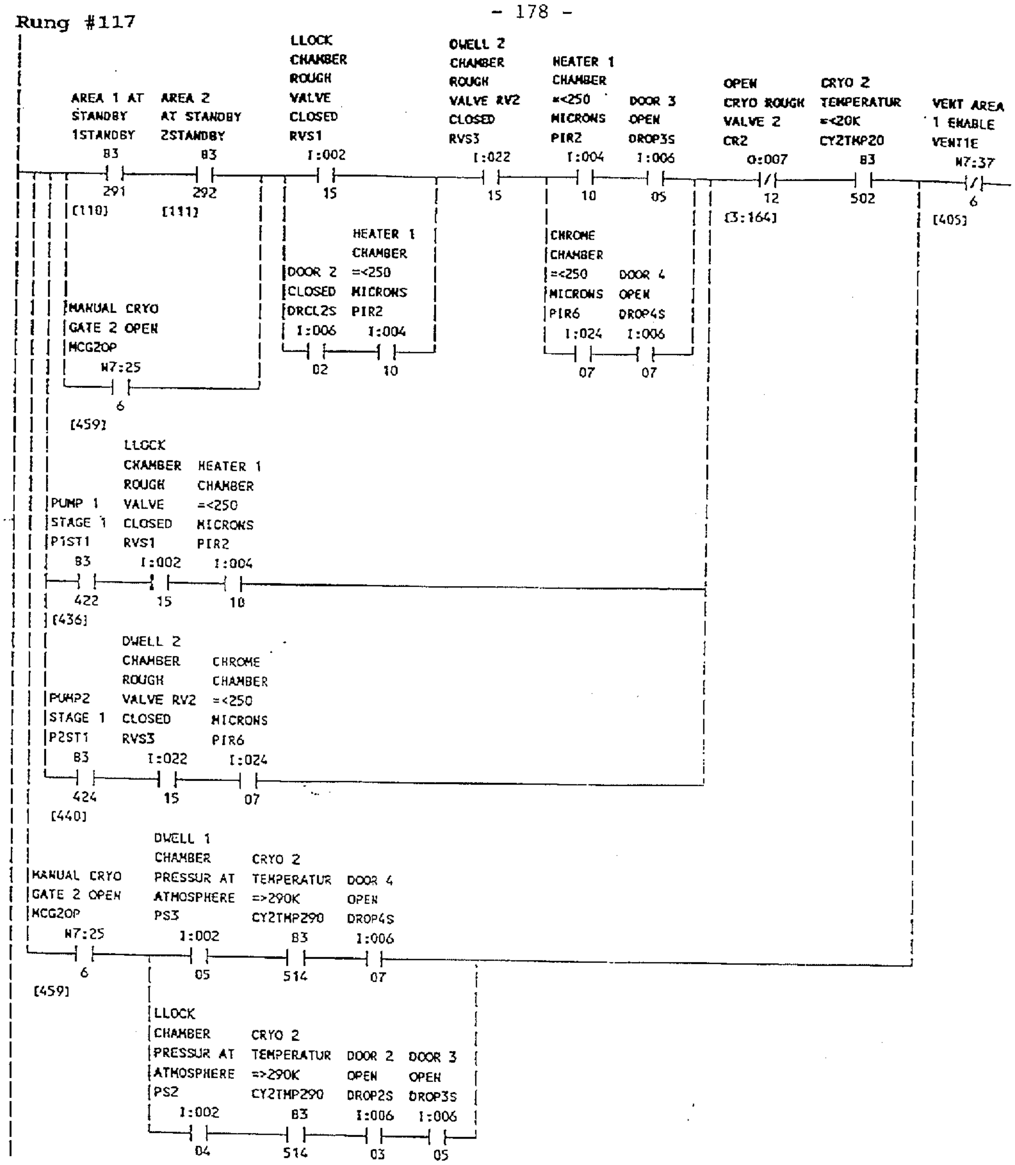
VENT AREA 2 ENABLE | SYSTEM VENT ENABLE | COMPRESSOR 2 REGEN-ERATION PROGRAM | FIRST SCAN AFTER POWER LOSS | CRYO GATE SOLENOID 1 HEATER 2 CHAMBER

- 179 -
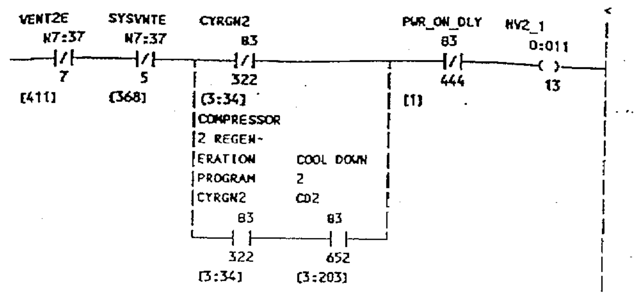
O:011/13 - ┤ ├ - File #5 FAULTS - 71
File #6 TECH_RUNGS - 6
┤/├ - File #5 FAULTS - 94,119
-( )- - File #2 MAIN_PRGRM - 117

- 180 -
Rung #118
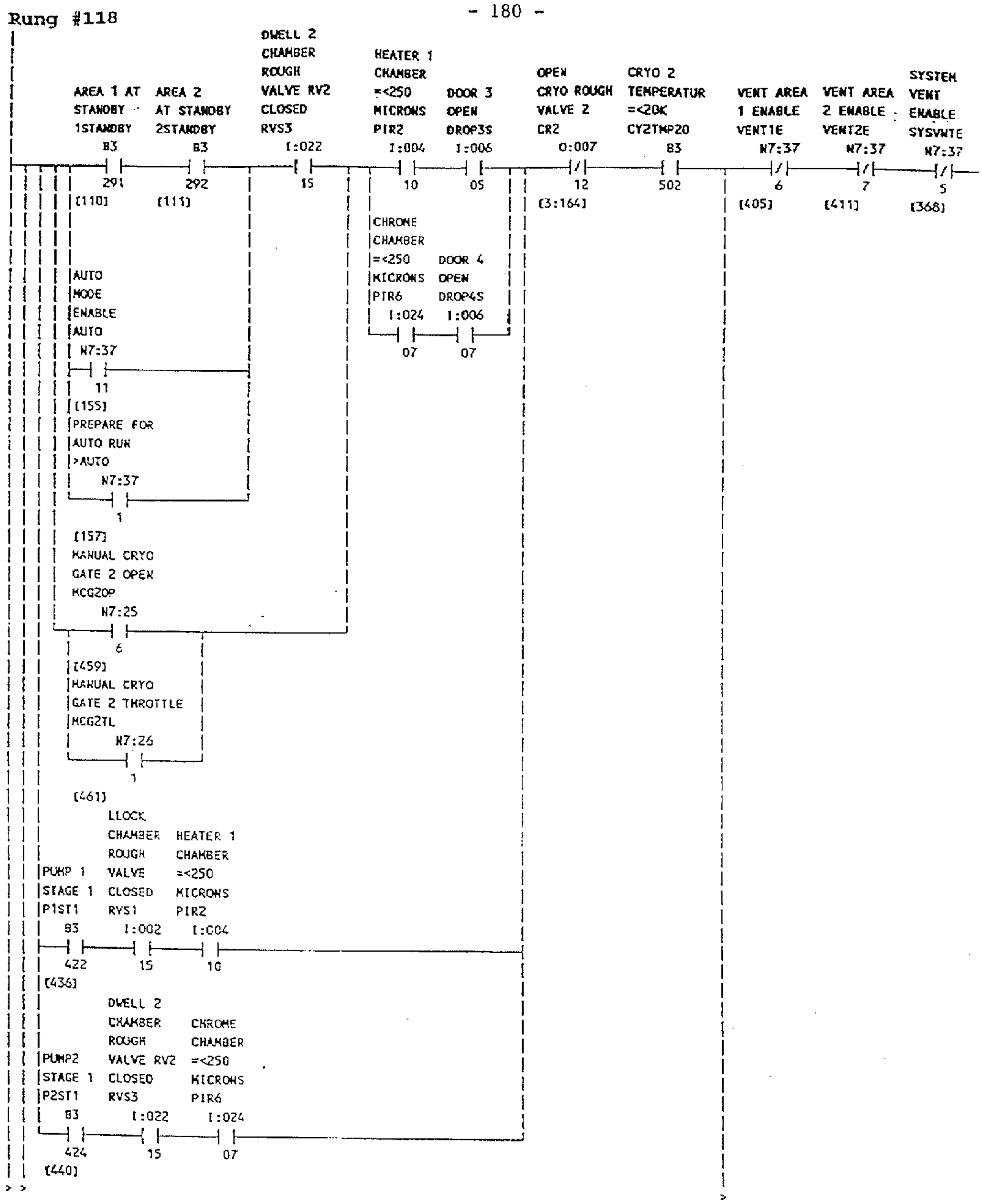

- 181 -
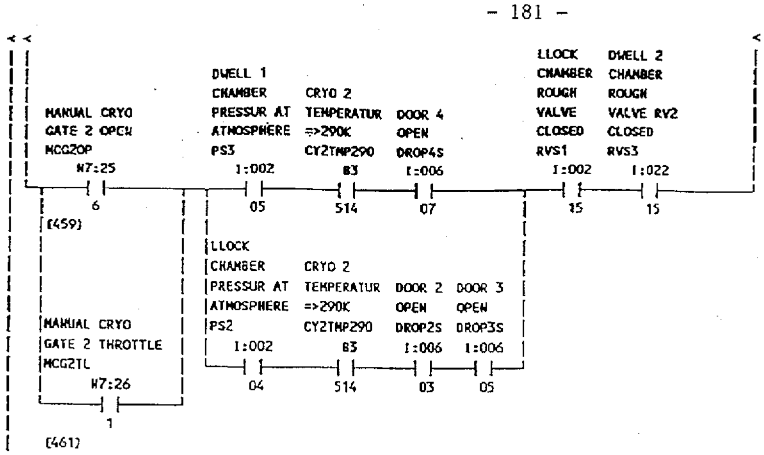
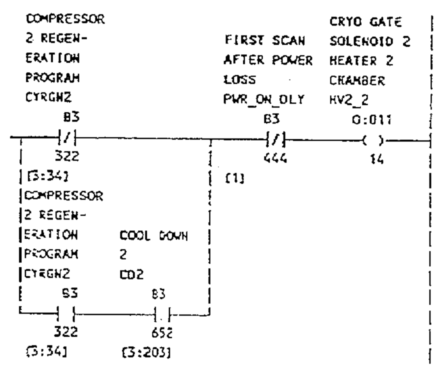
O:011/14 - -| |- - File #5 FAULTS - 71,94
File #6 TECH_RUNGS - 6
-|/|- - File #5 FAULTS - 119
-( )- - File #2 MAIN_PRGRM - 118

- 182 -
Rung #119
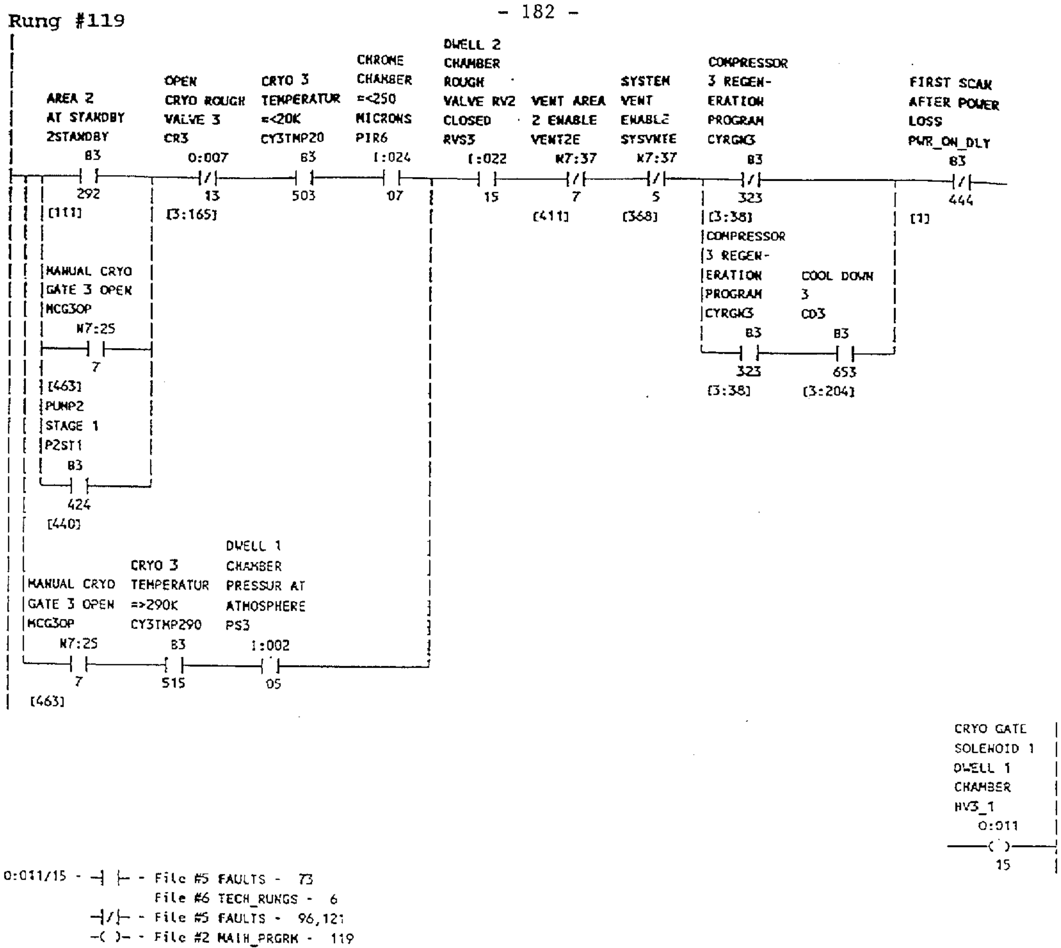
0:011/15 - -] [- - File #5 FAULTS - 73
File #6 TECH_RUNGS - 6
-]/[- - File #5 FAULTS - 96,121
-( )- - File #2 MAIN_PRGRM - 119

Rung #120
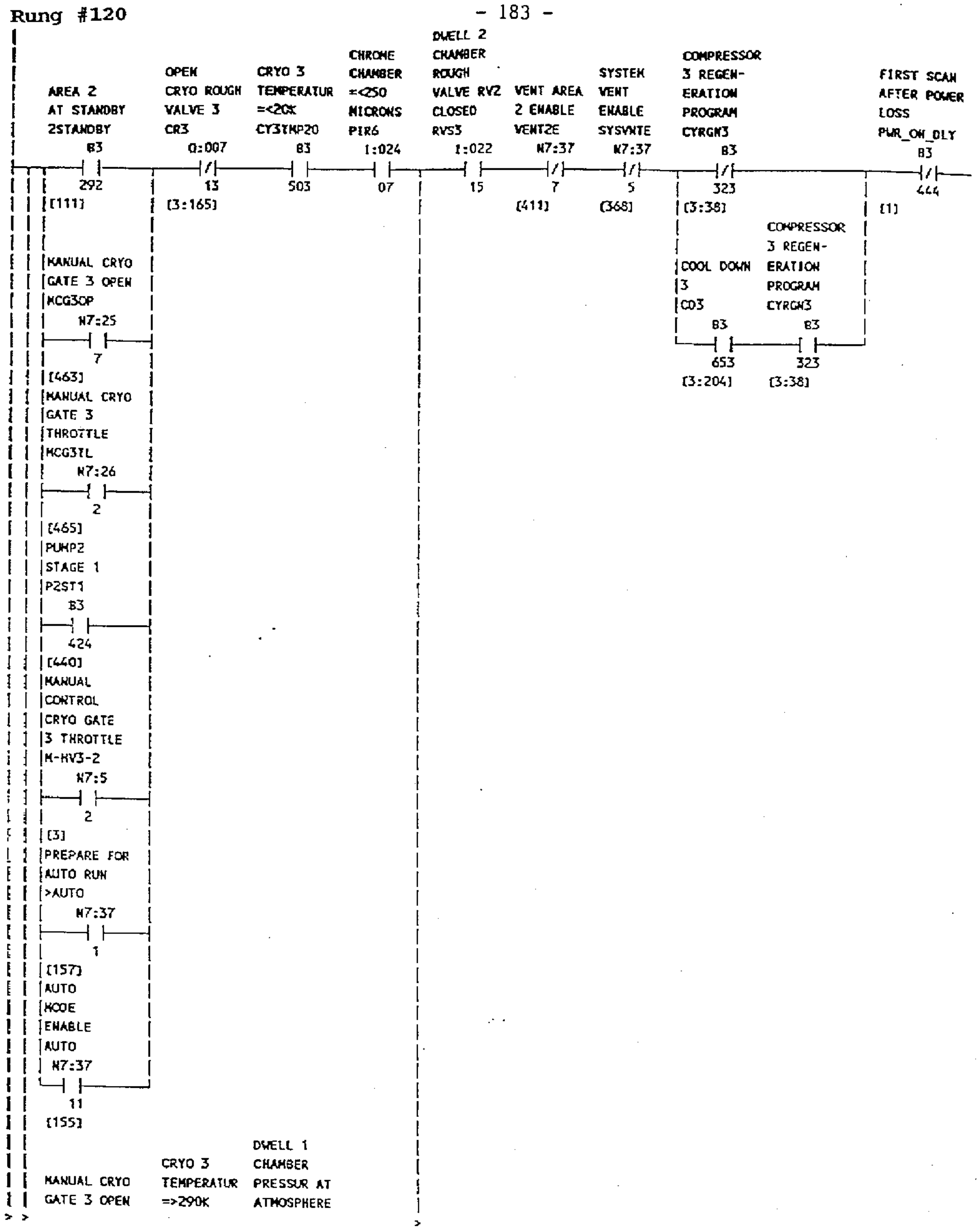

- 184 -

```
< <                                                   <
| |  MCG3OP          CY3TMP290    PS3                  |
| |     N7:25           B3        I:002                |
| └────┤ ├──────┬──────┤ ├────────┤ ├──────────────────┘
|   |     7     |      515         05
|   |[463]      |
|   |MANUAL CRYO|
|   |GATE 3     |
|   |THROTTLE   |
|   |MCG3TL     |
|   |   N7:26   |
|   └────┤ ├────┘
|         2
|  [465]
                                                              CRYO GATE     |
                                                              SOLENOID 2    |
                                                              DWELL 1       |
                                                              CHAMBER       |
                                                              HV3_2         |
                                                                 O:011      |
                                                              ────( )───────┤
                                                                  16        |

O:011/16 - ┤ ├- - File #5 FAULTS -  73,96
                  File #6 TECH_RUNGS -  6
          ┤/├- - File #5 FAULTS -  121
          -( )- - File #2 MAIN_PRGRM -  120
Rung #121
|
|                                                     DWELL 2
|                                          CHROME     CHAMBER                                 COMPRESSOR
|                        OPEN       CRYO 4     CHAMBER    ROUGH                  SYSTEM     5 REGEN-                 FIRST SCAN
|   AREA 2               CRYO ROUGH TEMPERATUR =<250      VALVE RV2  VENT AREA   VENT       ERATION                  AFTER POWER
|   AT STANDBY           VALVE 4    =<20K      MICRONS    CLOSED     2 ENABLE    ENABLE     PROGRAM                  LOSS
|   2STANDBY             CR4        CY4TMP20   PIR6       RVS3       VENT2E      SYSVNTE    CYRGN5                   PWR_ON_DLY
|      B3                O:027        B3       I:024      I:022      N7:37       N7:37        B3                        B3
├─┬─┬──┤ ├─────────┬──────┤/├───────┤ ├───────┤ ├───┬─────┤ ├────────┤/├────────┤/├──────┬───┤/├───────────────┬────────┤/├──
| | |   292        |      11         504       07   |      15          7           5      |   325             |         444
| | |[111]         | [3:167]                        |              [411]       [365]      |[3:46]             | [1]
| | |              |                                |                                     |COMPRESSOR         |
| | |              |                                |                                     |5 REGEN-           |
| | |PUMP2         |                                |                                     |ERATION   COOL DOWN|
| | |STAGE 1       |                                |                                     |PROGRAM   5        |
| | |P2ST1         |                                |                                     |CYRGN5    CDS      |
| | |  B3          |                                |                                     |   B3        B3    |
| | ├──┤ ├─────────┤                                |                                     └───┤ ├───────┤ ├───┘
| | |  424         |                                |                                         325       655
| | |[440]         |                                |                                       [3:46]    [3:206]
| | |MANUAL CRYO   |                                |
| | |GATE 4 OPEN   |                                |
| | |MCG4OP        |                                |
| | |   N7:25      |                                |
| | └────┤ ├───────┘                                |
| |       8                                         |
| |  [467]                                          |
| |                              DWELL 1            |
| |              CRYO 4          CHAMBER            |
| |MANUAL CRYO   TEMPERATUR      PRESSUR AT         |
| |GATE 4 OPEN   =>290K          ATMOSPHERE         |
| |MCG4OP        CY4TMP290       PS3                |
| |  N7:25          B3           I:002              |
| └────┤ ├──────────┤ ├───────────┤ ├───────────────┘
|       8           516            05
|  [467]
                                                                                                                CRYO GATE  |
                                                                                                                           >
```

- 185 -

```
                                                        SOLENOID 1
                                                        DWELL 2
                                                        CHAMBER
                                                        HV4_1
                                                          O:031
                                                        ---( )---
                                                            11

O:031/11 - -| |- - File #5 FAULTS -  75
                   File #6 TECH_RUNGS -  6
           -|/|- - File #5 FAULTS -  98,123
           -( )- - File #2 MAIN_PRGRM -  121
```

- 186 -
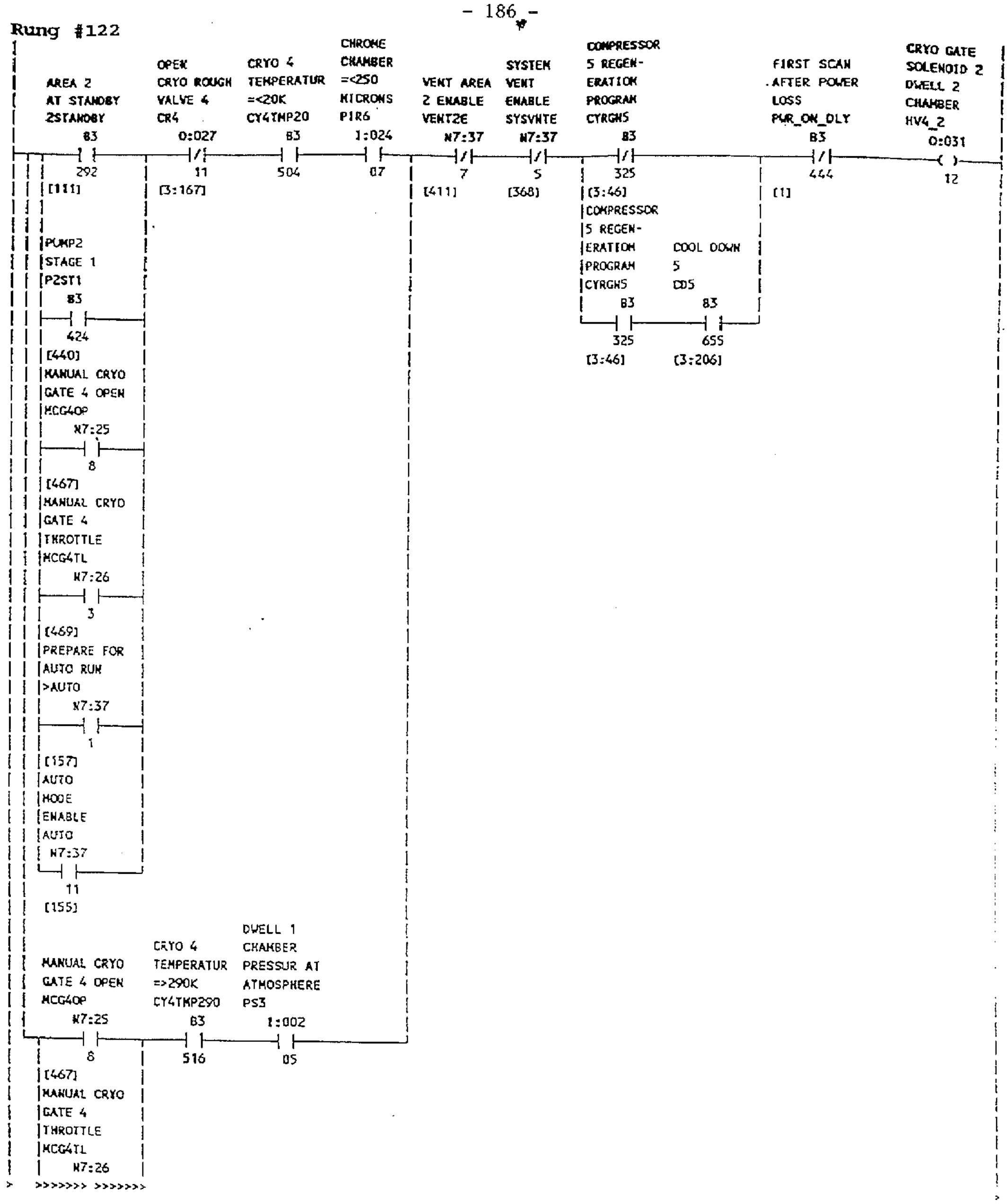

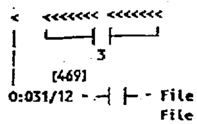
0:031/12 - -| |- - File #5 FAULTS - 75,98
File #6 TECH_RUNGS - 6
-|/|- - File #5 FAULTS - 123
-( )- - File #2 MAIN_PRGRM - 122
Rung #123
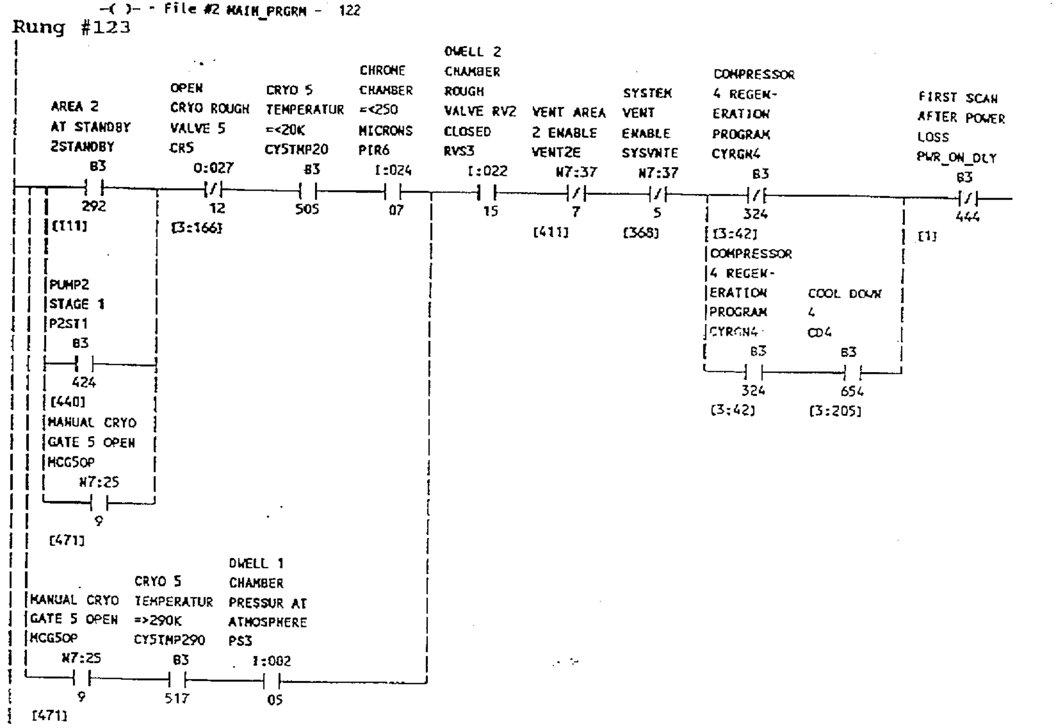
0:031/13 - -| |- - File #5 FAULTS - 77
File #6 TECH_RUNGS - 6
-|/|- - File #5 FAULTS - 100,125
-( )- - File #2 MAIN_PRGRM - 123

Rung #124
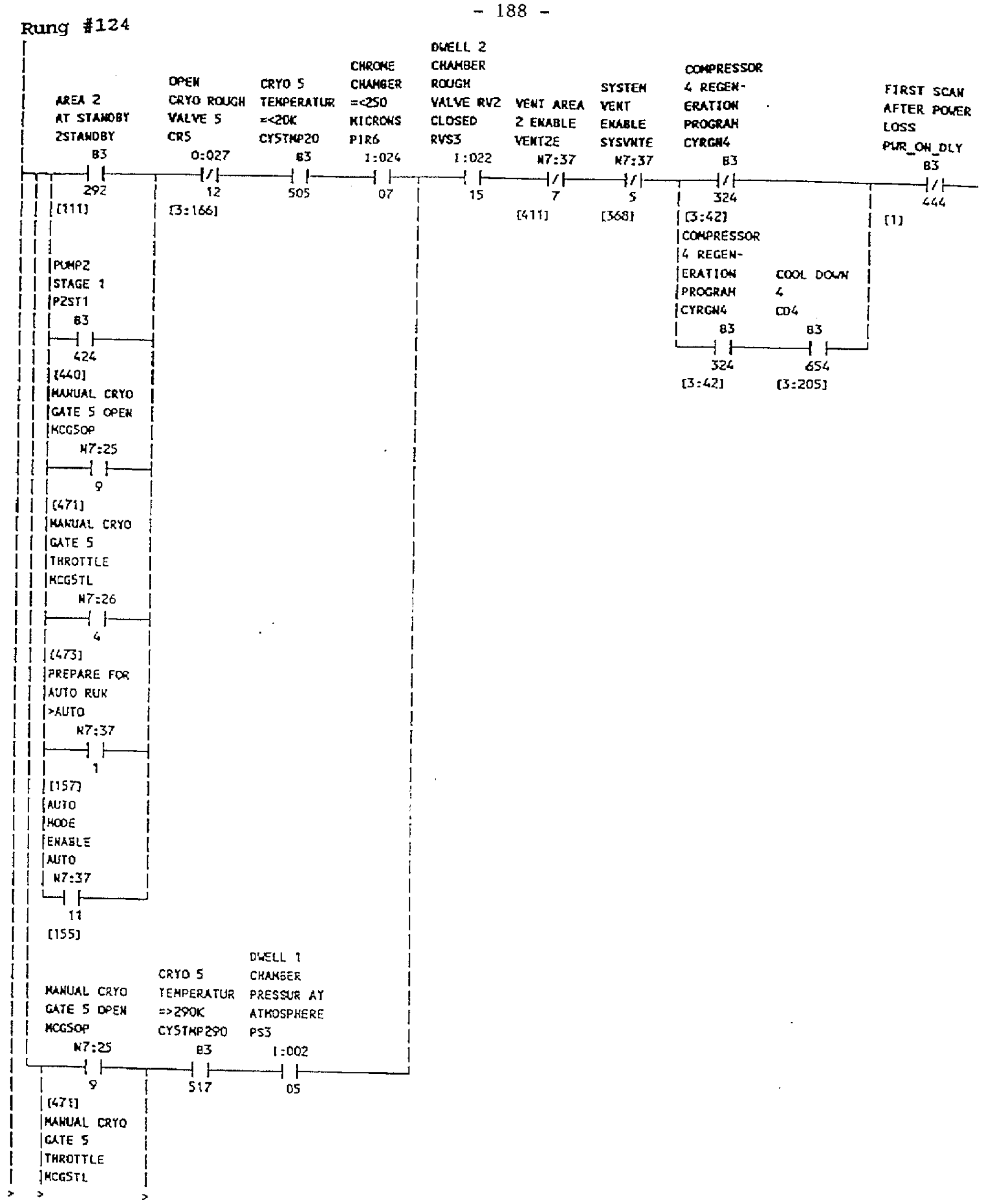

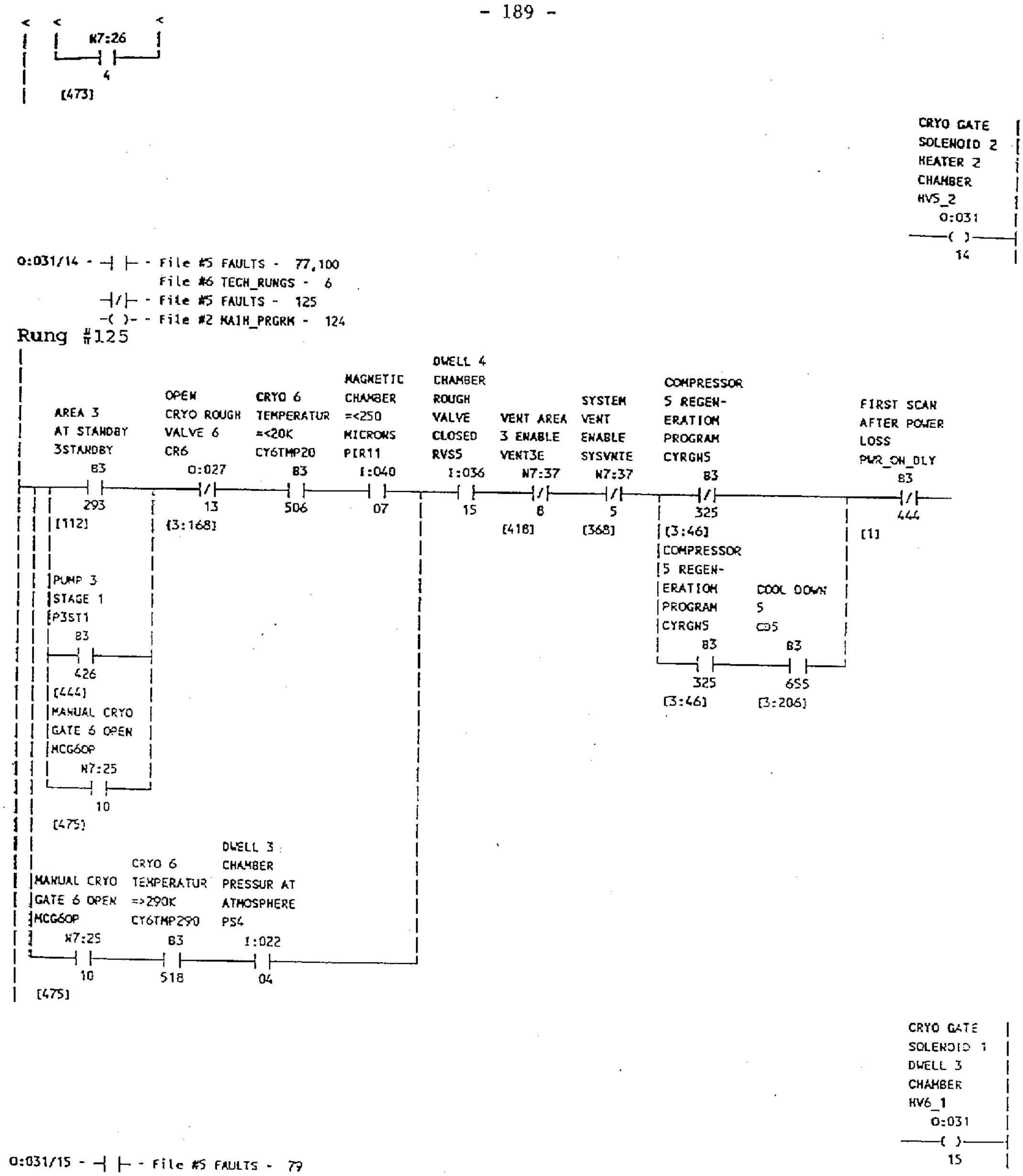
N7:26
4
[473]
CRYO GATE
SOLENOID 2
HEATER 2
CHAMBER
HVS_2
O:031
14
O:031/14 - ┤ ├ - File #5 FAULTS - 77,100
File #6 TECH_RUNGS - 6
┤/├ - File #5 FAULTS - 125
-( )- - File #2 MAIN_PRGRM - 124
Rung #125
AREA 3
AT STANDBY
3STANDBY
B3
293
[112]
OPEN
CRYO ROUGH
VALVE 6
CR6
O:027
13
[3:168]
CRYO 6
TEMPERATUR
=<20K
CY6TMP20
B3
506
MAGNETIC
CHAMBER
=<250
MICRONS
PIR11
I:040
07
DWELL 4
CHAMBER
ROUGH
VALVE
CLOSED
RVS5
I:036
15
VENT AREA
3 ENABLE
VENT3E
N7:37
8
[418]
SYSTEM
VENT
ENABLE
SYSVNTE
N7:37
5
[368]
COMPRESSOR
5 REGEN-
ERATION
PROGRAM
CYRGN5
B3
325
[3:46]
FIRST SCAN
AFTER POWER
LOSS
PWR_ON_DLY
B3
444
[1]
PUMP 3
STAGE 1
P3ST1
B3
426
[444]
MANUAL CRYO
GATE 6 OPEN
MCG6OP
N7:25
10
[475]
COMPRESSOR
5 REGEN-
ERATION
PROGRAM
CYRGN5
B3
325
[3:46]
COOL DOWN
5
CD5
B3
655
[3:206]
MANUAL CRYO
GATE 6 OPEN
MCG6OP
N7:25
10
[475]
CRYO 6
TEMPERATUR
=>290K
CY6TMP290
B3
518
DWELL 3
CHAMBER
PRESSUR AT
ATMOSPHERE
PS4
I:022
04
CRYO GATE
SOLENOID 1
DWELL 3
CHAMBER
HV6_1
O:031
15
O:031/15 - ┤ ├ - File #5 FAULTS - 79

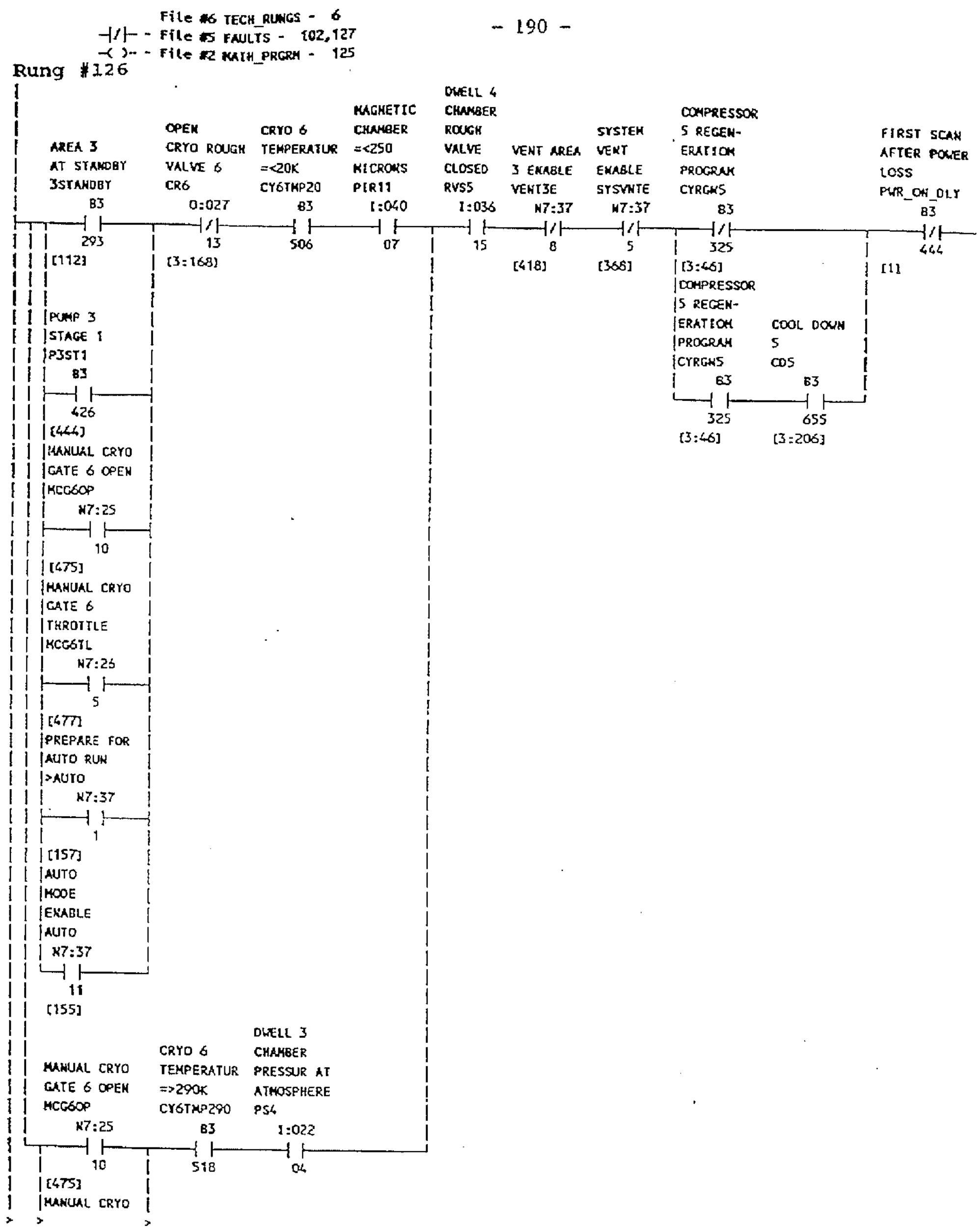
File #6 TECH_RUNGS - 6
-]/[- - File #5 FAULTS - 102,127
-( )- - File #2 MAIN_PRGRM - 125
- 190 -
Rung #126
AREA 3 AT STANDBY 3STANDBY B3 293 [112]
OPEN CRYO ROUGH VALVE 6 CR6 O:027 13 [3:168]
CRYO 6 TEMPERATUR =<20K CY6TMP20 B3 506
MAGNETIC CHAMBER =<250 MICRONS PIR11 I:040 07
DWELL 4 CHAMBER ROUGH VALVE CLOSED RVS5 I:036 15
VENT AREA 3 ENABLE VENT3E N7:37 8 [418]
SYSTEM VENT ENABLE SYSVNTE N7:37 5 [368]
COMPRESSOR 5 REGEN-ERATION PROGRAM CYRGN5 B3 325 [3:46]
FIRST SCAN AFTER POWER LOSS PWR_ON_DLY B3 444 [1]
PUMP 3 STAGE 1 P3ST1 B3 426 [444]
MANUAL CRYO GATE 6 OPEN MCG6OP N7:25 10 [475]
MANUAL CRYO GATE 6 THROTTLE MCG6TL N7:26 5 [477]
PREPARE FOR AUTO RUN >AUTO N7:37 1 [157]
AUTO MODE ENABLE AUTO N7:37 11 [155]
COMPRESSOR 5 REGEN-ERATION PROGRAM CYRGN5 B3 325 [3:46]
COOL DOWN 5 CD5 B3 655 [3:206]
MANUAL CRYO GATE 6 OPEN MCG6OP N7:25 10 [475]
CRYO 6 TEMPERATUR =>290K CY6TMP290 B3 518
DWELL 3 CHAMBER PRESSUR AT ATMOSPHERE PS4 I:022 04
[475] MANUAL CRYO

GATE 6
THROTTLE
MCG6TL
N7:26
5
[477]

CRYO GATE
SOLENOID 2
DWELL 3
CHAMBER
HV6_2
O:031
16

O:031/16 - -| |- - File #5 FAULTS - 79,102
File #6 TECH_RUNGS - 6
-|/|- - File #5 FAULTS - 127
-( )- - File #2 MAIN_PRGRM - 126

Rung #127

AREA 3
AT STANDBY
3STANDBY
B3
293
[112]

OPEN
CRYO ROUGH
VALVE 7
CR7
O:043
11
[3:169]

CRYO 7
TEMPERATUR
=<20K
CY7TMP20
B3
507

MAGNETIC
CHAMBER
=<250
MICRONS
PIR11
I:040
07

DWELL 4
CHAMBER
ROUGH
VALVE
CLOSED
RVS5
I:036
15

VENT AREA
3 ENABLE
VENT3E
N7:37
8
[418]

SYSTEM
VENT
ENABLE
SYSVNTE
N7:37
5
[368]

COMPRESSOR
5 REGEN-
ERATION
PROGRAM
CYRGN5
B3
325
[3:46]

FIRST SCAN
AFTER POWER
LOSS
PWR_ON_DLY
B3
444
[1]

PUMP 3
STAGE 1
P3ST1
B3
426
[444]

MANUAL CRYO
GATE 7 OPEN
MCG7OP
N7:25
11
[479]

COMPRESSOR
5 REGEN-
ERATION
PROGRAM
CYRGN5
B3
325
[3:46]

COOL DOWN
5
CD5
B3
655
[3:206]

MANUAL CRYO
GATE 7 OPEN
MCG7OP
N7:25
11
[479]

CRYO 7
TEMPERATUR
=>290K
CY7TMP290
B3
519

DWELL 3
CHAMBER
PRESSUR AT
ATMOSPHERE
PS4
I:022
04

CRYO GATE
SOLENOID 1
DWELL 4
CHAMBER
HV7_1
O:045

0:045/11 - -| |- - File #5 FAULTS - 81
File #6 TECH_RUNGS - 6
-|/|- - File #5 FAULTS - 104,129
-( )- - File #2 MAIN_PRGRM - 127
Rung #128
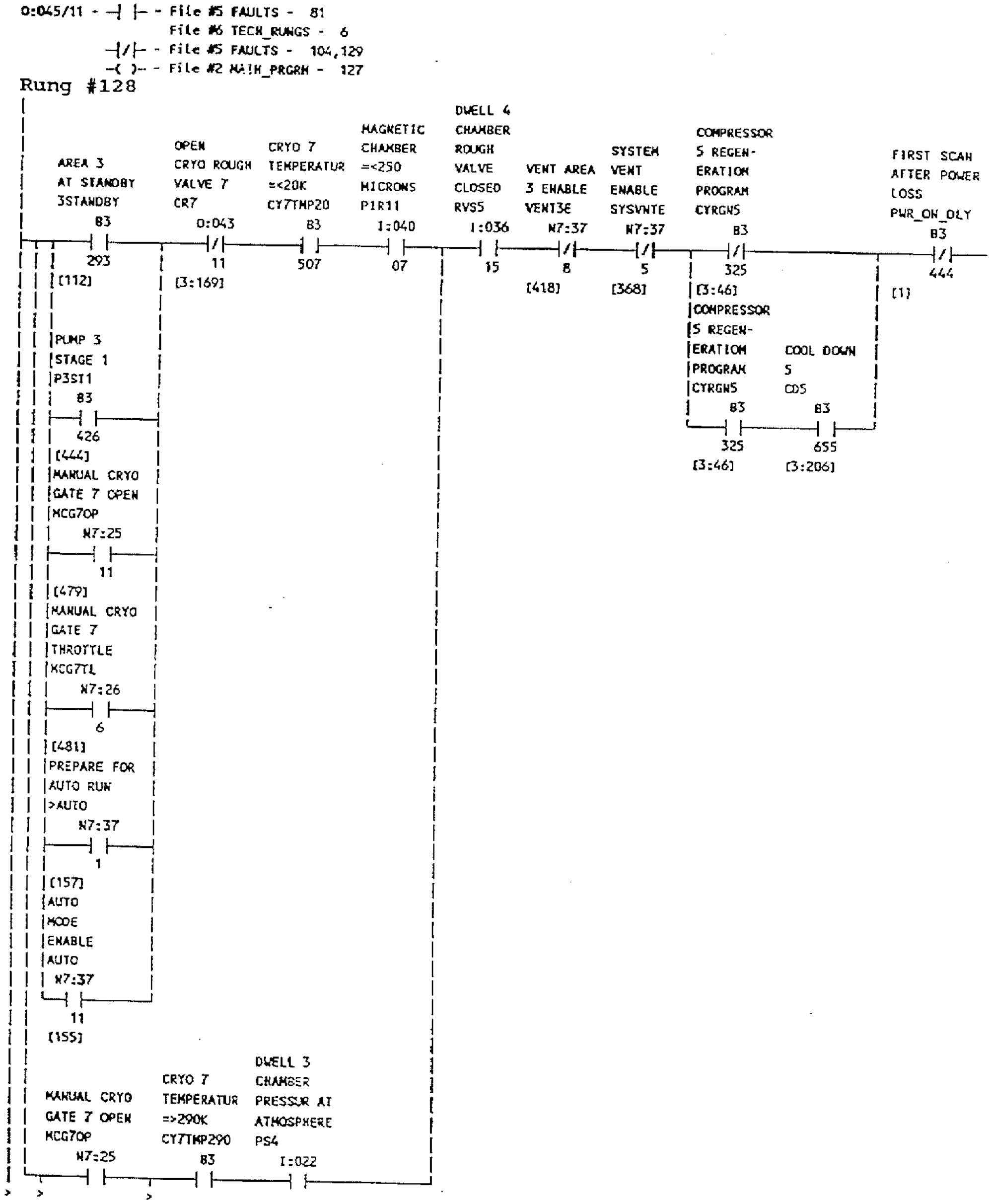

- 193 -

```
 <  <          <
 |  |    11    |     519        04
 |  |[479]     |
 |  |MANUAL CRYO|
 |  |GATE 7    |
 |  |THROTTLE  |
 |  |MCG7TL    |
 |  |  N7:26   |
 |  +---] [----+
 |       6
 |  [481]

                                                              CRYO GATE   |
                                                              SOLENOID 2  |
                                                              DWELL 4     |
                                                              CHAMBER     |
                                                              HV7_2       |
                                                                0:045     |
                                                              ---( )------|
                                                                 12       |

O:045/12 - ] [ - File #5 FAULTS -  81,104
                 File #6 TECH_RUNGS -  7
          ]/[ -  File #5 FAULTS -  129
          -( )- File #2 MAIN_PRGRM -  128
Rung #129
|
|                                            DWELL 4
|                                 MAGNETIC   CHAMBER                          COMPRESSOR
|            OPEN       CRYO 8    CHAMBER    ROUGH                 SYSTEM     6 REGEN-             FIRST SCAN
|  AREA 3    CRYO ROUGH TEMPERATUR =<250     VALVE     VENT AREA   VENT       ERATION              AFTER POWER
|  AT STANDBY VALVE 8   =<20K     MICRONS    CLOSED    3 ENABLE    ENABLE     PROGRAM              LOSS
|  3STANDBY  CR8        CY8TMP20  PIR11      RVS5      VENT3E      SYSVNTE    CYRGN6               PWR_ON_DLY
|    B3       O:043      B3       I:040      I:036     N7:37       N7:37        B3                   B3
+-+-+--] [---+--]/[------] [-------] [----+----] [------]/[--------]/[------+---]/[--------------+-----]/[---
| | |  293   |   12      508       07     |    15        8           5      |   326           |     444
| | |[112]   | [3:170]                    |            [418]       [368]    |[3:52]          |[1]
| | |        |                            |                                 |COMPRESSOR      |
| | |PUMP 3  |                            |                                 |6 REGEN-        |
| | |STAGE 1 |                            |                                 |ERATION  COOL DOWN
| | |P3ST1   |                            |                                 |PROGRAM  6      |
| | |  B3    |                            |                                 |CYRGN6   CD6    |
| | +--] [---+                            |                                 |  B3      B3    |
| | |  426   |                            |                                 +--] [-----] [---+
| | |[444]   |                            |                                    326      656
| | |MANUAL CRYO                          |                                 [3:52]   [3:207]
| | |GATE 8 OPEN                          |
| | |MCG8OP  |                            |
| | |  N7:25 |                            |
| | +--] [---+                            |
| |     12                                |
| |  [483]                                |
| |                      DWELL 3          |
| |           CRYO 8     CHAMBER          |
| |MANUAL CRYO TEMPERATUR PRESSUR AT      |
| |GATE 8 OPEN =>290K    ATMOSPHERE       |
| |MCG8OP    CY8TMP290   PS4              |
| |  N7:25     B3        I:022            |
| +--] [-------] [--------] [-------------+
|     12      520         04
|  [483]

                                                              CRYO GATE   |
                                                              SOLENOID 1  |
                                                              BUFFER 3    |
                                                              CHAMBER     |
                                                                          >
```

HV8_1
0:045
—( )—
13
0:045/13 - -| |- - File #5 FAULTS - 83
File #6 TECH_RUNGS - 7
-|/|- - File #5 FAULTS - 106,131
-( )- - File #2 MAIN_PRGRM - 129
Rung #130
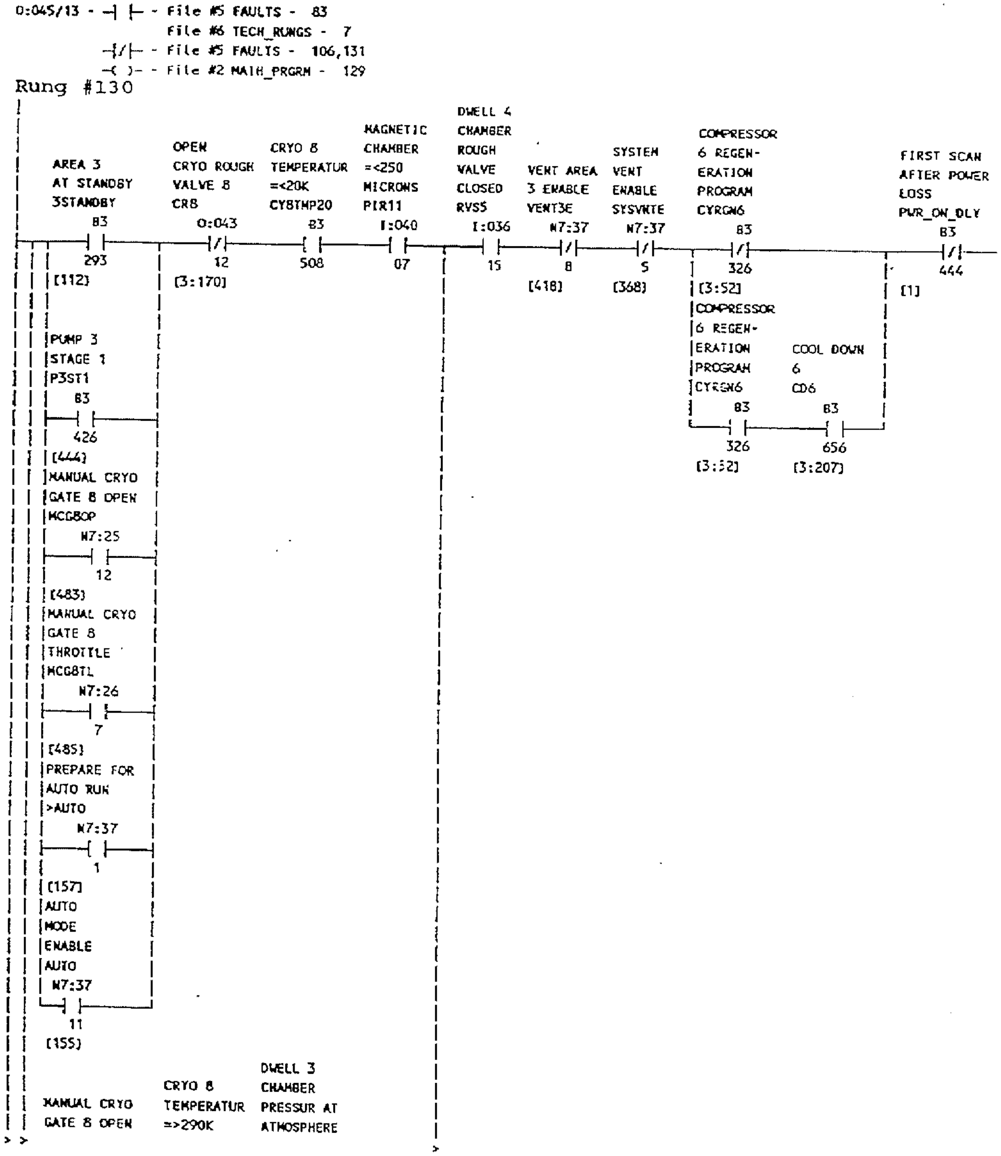

```
< <                                                     <
| |  MCG8OP         CY8TMP290   PS4                     |
| |    N7:25          B3        I:022                   |
| +---+--] [---+------] [-------] [---------------------+
|     |   12   |     520         04
|     |[483]   |
|     |MANUAL CRYO |
|     |GATE 8  |
|     |THROTTLE|
|     |MCG8TL  |
|     |   N7:26|
|     +---] [--+
|          7
|   [485]

                                                              CRYO GATE  |
                                                              SOLENOID 2 |
                                                              BUFFER 3   |
                                                              CHAMBER    |
                                                              RV8_2      |
                                                                O:045    |
                                                              ---( )-----+
                                                                 14      |

O:045/14 - -] [- - File #5 FAULTS -  83,106
                   File #6 TECH_RUNGS -  7
           -]/[- - File #5 FAULTS -  131
           -( )- - File #2 MAIN_PRGRM -  130
Rung #131
|
|                                                 DWELL 5
|                                        CARBON   CHAMBER
|                   OPEN       CRYO 9    CHAMBER  ROUGH                         COMPRESSOR
|                   CRYO ROUGH TEMPERATUR =<250   VALVE              SYSTEM     7 REGEN-             FIRST SCAN
|   AREA 4          VALVE 9    =<20K     MICRONS  CLOSED  VENT AREA  VENT       ERATION              AFTER POWER
|   AT STANDBY      CR9        CY9TMP20  PIR16    RVS7    4 ENABLE   ENABLE     PROGRAM              LOSS
|   4STANDBY         O:043       B3      I:054    I:052   VENT4E     SYSVXTE    CYRGN7               PWR_ON_DLY
|     B3                                                   N7:37      N7:37       B3                    B3
+-+-+--] [-----+----]/[------] [-------] [---+----] [------]/[--------]/[----+----]/[---------+--------]/[---
| | |   294    |     13         509       07 |     14        9          5   |    327         |         444
| | |[113]     |  [3:171]                    |            [425]      [365]  |[3:57]          |   [1]
| | |          |                             |                              |COMPRESSOR      |
| | |          |                             |                              |7 REGEN-        |
| | |PUMP 4    |                             |                              |ERATION  COOL DOWN
| | |STAGE 1   |                             |                              |PROGRAM  7      |
| | |P4ST1     |                             |                              |CYRGN7   CD7    |
| | |  B3      |                             |                              |  B3       B3   |
| | +--] [-----+                             |                              +--] [------] [--+
| |    428     |                             |                                 327       657
| | [449]      |                             |                               [3:57]   [3:203]
| | |MANUAL CRYO                             |
| | |GATE 9 OPEN                             |
| | |MCG9OP    |                             |
| | |   N7:25  |                             |
| | +---] [----+                             |
| |      13                                  |
| |  [487]                                   |
| |                      DWELL 5             |
| |           CRYO 9     CHAMBER             |
| |MANUAL CRYO TEMPERATUR PRESSUR AT         |
| |GATE 9 OPEN =>290K    ATMOSPHERE          |
| |MCG9OP     CY9TMP290  PS5                 |
| |  N7:25       B3      I:036               |
| +---] [------] [-------] [-----------------+
|      13       521       04
|  [487]

                                                              CRYO GATE  |
                                                                         >
```

- 196 -

```
                                                    SOLENOID 1  |
                                                    DWELL 5     |
                                                    CHAMBER     |
                                                    KV9_1       |
                                                      O:045     |
                                                    ----( )-----|
                                                       15       |

O:045/15 - -] [- - File #5 FAULTS -  85
                   File #6 TECH_RUNGS -  7
           -]/[- - File #5 FAULTS -  108,133
           -( )- - File #2 MAIN_PRGRM -  131
```

Rung #132
- 197 -
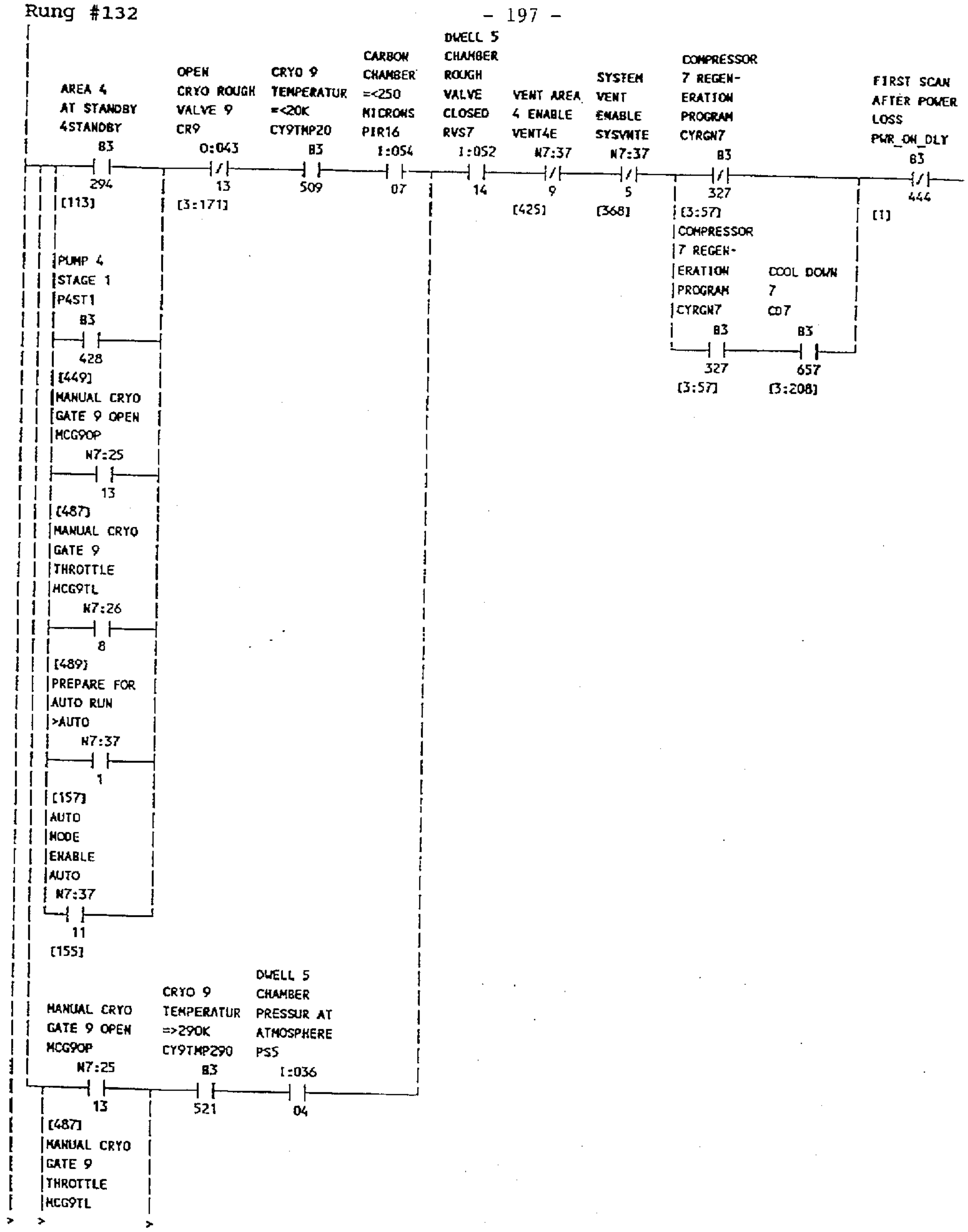

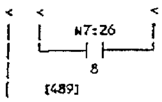
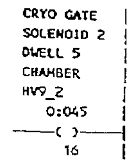
O:045/16 - ┤ ├ - File #5 FAULTS - 85,108
File #6 TECH_RUNGS - 7
┤/├ - File #5 FAULTS - 133
-( )- - File #2 MAIN_PRGRM - 132
Rung #133
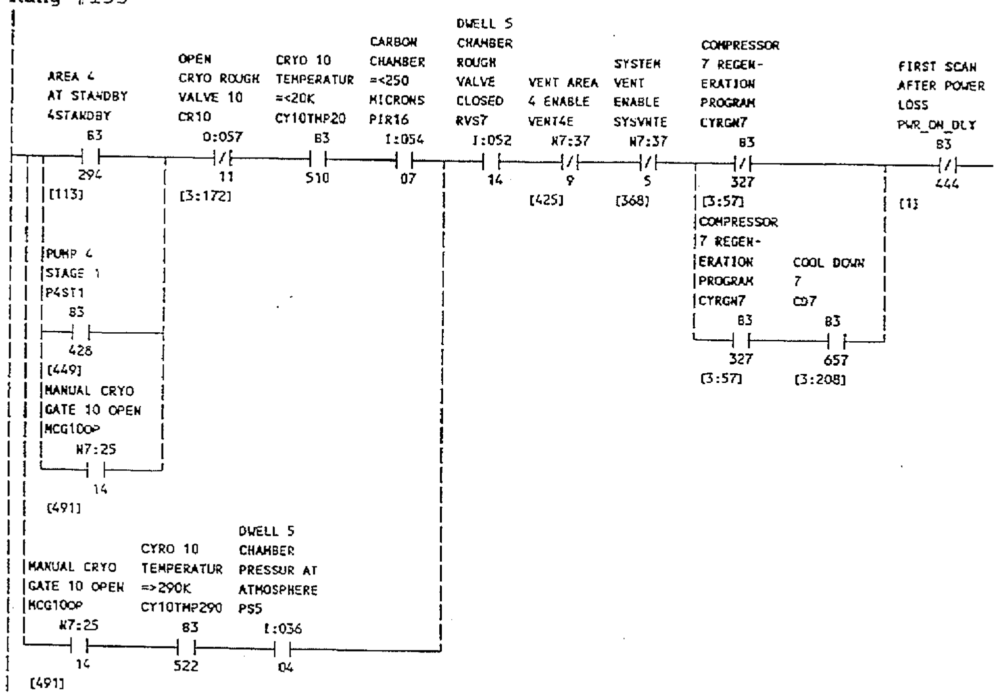
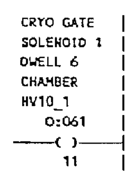
O:061/11 - ┤ ├ - File #5 FAULTS - 87,110

File #6 TECH_RUNGS - 7
-|/|- - File #5 FAULTS - 135
-( )- - File #2 MAIN_PRGRM - 133
- 199 -
Rung #134
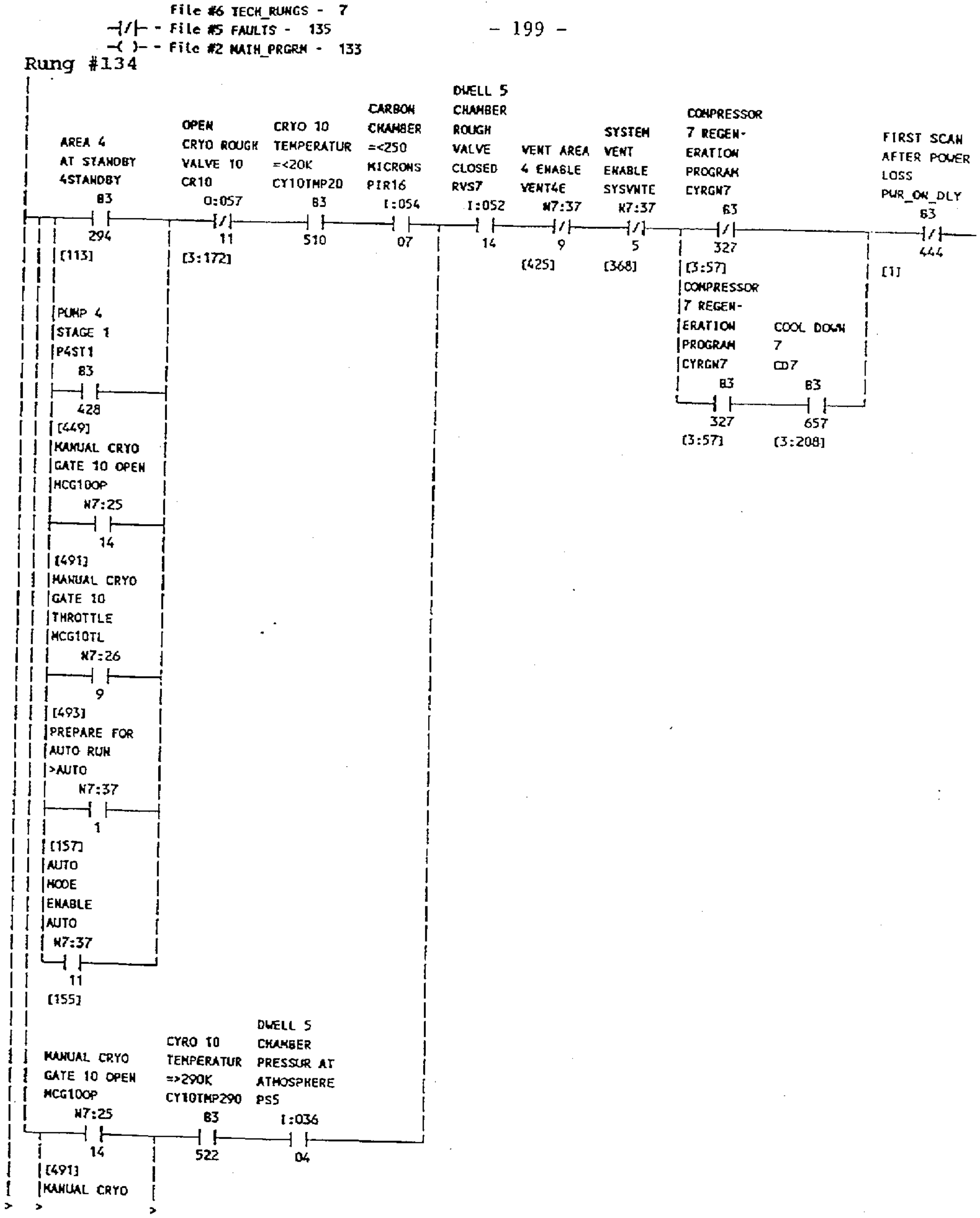

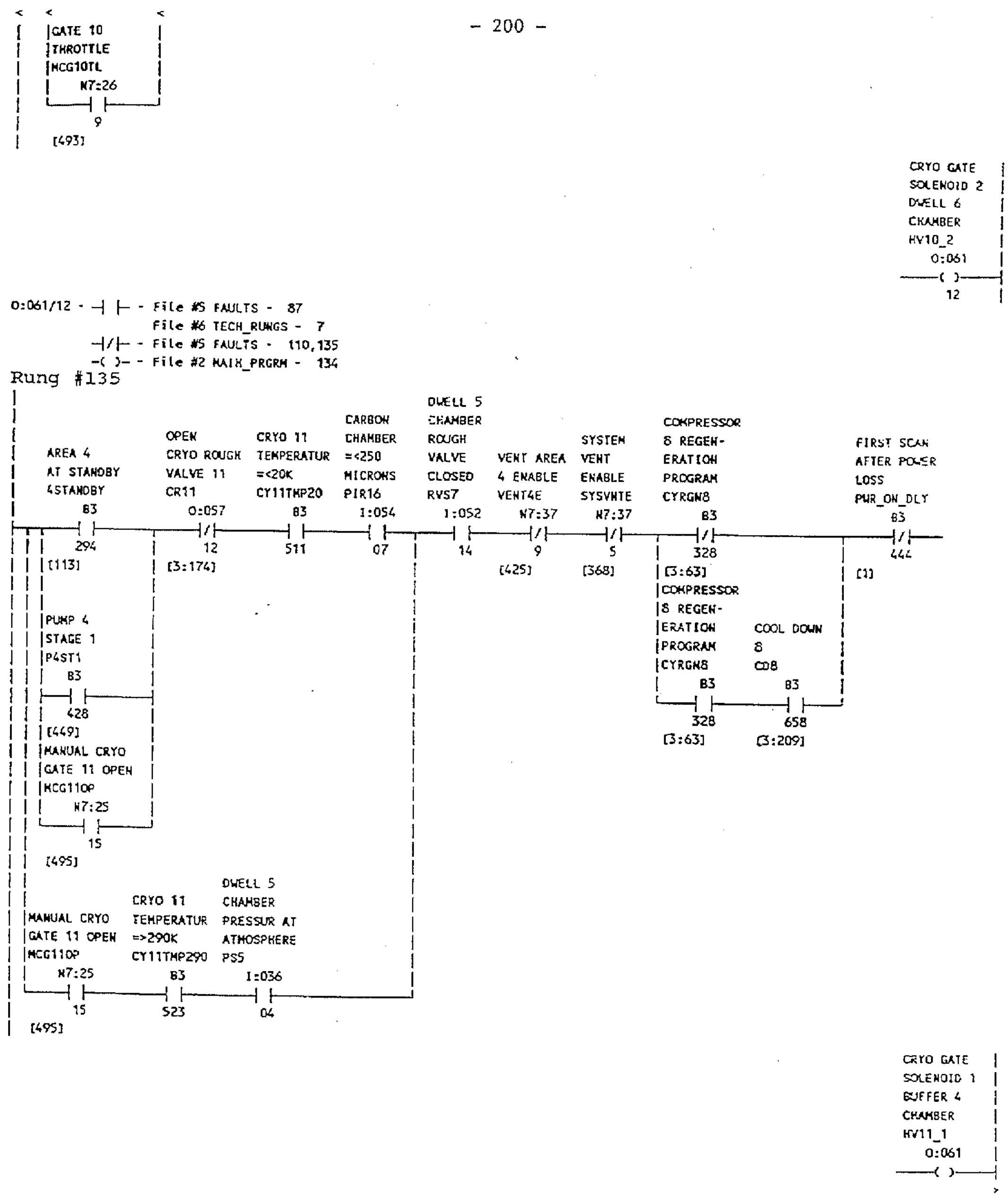
GATE 10
THROTTLE
MCG10TL
N7:26
9
[493]
CRYO GATE
SOLENOID 2
DWELL 6
CHAMBER
HV10_2
O:061
12
O:061/12 - ┤ ├ - File #5 FAULTS - 87
File #6 TECH_RUNGS - 7
┤/├ - File #5 FAULTS - 110,135
-( )- - File #2 MAIN_PRGRM - 134
Rung #135
AREA 4
AT STANDBY
4STANDBY
B3
294
[113]
OPEN
CRYO ROUGH
VALVE 11
CR11
O:057
12
[3:174]
CRYO 11
TEMPERATUR
=<20K
CY11TMP20
B3
511
CARBON
CHAMBER
=<250
MICRONS
PIR16
I:054
07
DWELL 5
CHAMBER
ROUGH
VALVE
CLOSED
RVS7
I:052
14
VENT AREA
4 ENABLE
VENT4E
N7:37
9
[425]
SYSTEM
VENT
ENABLE
SYSVNTE
N7:37
5
[368]
COMPRESSOR
8 REGEN-
ERATION
PROGRAM
CYRGN8
B3
328
[3:63]
FIRST SCAN
AFTER POWER
LOSS
PWR_ON_DLY
B3
444
[1]
PUMP 4
STAGE 1
P4ST1
B3
428
[449]
MANUAL CRYO
GATE 11 OPEN
MCG11OP
N7:25
15
[495]
COMPRESSOR
8 REGEN-
ERATION
PROGRAM
CYRGN8
B3
328
[3:63]
COOL DOWN
8
CD8
B3
658
[3:209]
MANUAL CRYO
GATE 11 OPEN
MCG11OP
N7:25
15
[495]
CRYO 11
TEMPERATUR
=>290K
CY11TMP290
B3
523
DWELL 5
CHAMBER
PRESSUR AT
ATMOSPHERE
PS5
I:036
04
CRYO GATE
SOLENOID 1
BUFFER 4
CHAMBER
HV11_1
O:061

- 201 - 13

```
O:061/13 - -| |- - File #5 FAULTS -  89
                   File #6 TECH_RUNGS -  7
           -|/|- - File #5 FAULTS -  112,137
           -( )- - File #2 MAIN_PRGRM -  135
Rung #136

                                                    DWELL 5
                                          CARBON    CHAMBER                         COMPRESSOR
              OPEN        CRYO 11         CHAMBER   ROUGH                SYSTEM     8 REGEN-                 FIRST SCAN
 AREA 4       CRYO ROUGH  TEMPERATUR      =<250     VALVE     VENT AREA  VENT       ERATION                  AFTER POWER
 AT STANDBY   VALVE 11    =<20K           MICRONS   CLOSED    4 ENABLE   ENABLE     PROGRAM                  LOSS
 4STANDBY     CR11        CY11TMP20       PIR16     RVS7      VENT4E     SYSVNTE    CYRGN8                   PWR_ON_DLY
   B3         O:057       B3              I:054     I:052     N7:37      N7:37      B3                       B3
--| |---------|/|---------| |-------------| |-------| |--------|/|--------|/|--------|/|----------------------|/|--
   294         12         511             07        14         9          5          328                      444
 [113]        [3:174]                                         [425]      [368]      [3:63]                   [1]
                                                                                    COMPRESSOR
                                                                                    8 REGEN-
 PUMP 4                                                                             ERATION     COOL DOWN
 STAGE 1                                                                            PROGRAM     8
 P4ST1                                                                              CYRGN8      CD8
   B3                                                                                B3          B3
--| |--                                                                            --| |---------| |--
   428                                                                               328         658
 [449]                                                                              [3:63]      [3:209]
 MANUAL CRYO
 GATE 11 OPEN
 MCG11OP
   N7:25
--| |--
   15
 [495]
 MANUAL CRYO
 GATE 11
 THROTTLE
 MCG11TL
   N7:26
--| |--
   10
 [497]
 PREPARE FOR
 AUTO RUN
 >AUTO
   N7:37
--| |--
   1
 [157]
 AUTO
 MODE
 ENABLE
 AUTO
 N7:37
--| |--
   11
 [155]
                                     DWELL 5
              CRYO 11                CHAMBER
 MANUAL CRYO  TEMPERATUR             PRESSUR AT
 GATE 11 OPEN =>290K                 ATMOSPHERE
 MCG11OP      CY11TMP290             PS5
   N7:25      B3                     I:036
--| |---------| |--------------------| |--
>  >          >
```

- 202 -

```
<  <             <
|  |     15      |     523         04
|  |[495]        |
|  |MANUAL CRYO  |
|  |GATE 11      |
|  |THROTTLE     |
|  |MCG11TL      |
|  |   N7:26     |
|  +----] [------+
|        10
|   [497]

                                                                  CRYO GATE      |
                                                                  SOLENOID 2     |
                                                                  BUFFER 4       |
                                                                  CHAMBER        |
                                                                  HV11_2         |
                                                                     O:061       |
                                                                  ----( )--------|
                                                                      14         |

O:061/14 - -] [- - File #5 FAULTS -  89,112
                   File #6 TECH_RUNGS -  7
           -]/[- - File #5 FAULTS -  137
           -( )- - File #2 MAIN_PRGRM -  136
Rung #137
|
|                                          EXLOCK
|                              EXIT BUFFER CHAMBER                    COMPRESSOR
|                   OPEN       CRYO 12     CHAMBER   ROUGH               SYSTEM   7 REGEN-
|  AREA 5           CRYO ROUGH TEMPERATUR  =<250     VALVE    VENT AREA  VENT     ERATION
|  AT STANDBY       VALVE 12   =<20K       MICRONS   CLOSED   5 ENABLE   ENABLE   PROGRAM
|  5STANDBY         CR12       CY12TMP20   PIR15     RVS9     VENT5E     SYSVNTE  CYRGN7
|     B3              O:057       B3         I:040     I:052     N7:37     N7:37     B3
|-+-+--] [------+-----]/[--------] [---------] [----+-+--] [--+---]/[-------]/[----+--]/[----------+
| | |   295     |      13         512         13    | |  16   |   10         5    |  327         |
| | |[114]      | [3:173]                           | |       | [430]      [368]  |[3:57]        |
| | |           |                                   | |DOOR 11|                   |COMPRESSOR    |
| | |           |                                   | |CLOSED |                   |7 REGEN-      |
| | |PUMP 5     |                                   | |DRCL11S|                   |ERATION  COOL DOWN
| | |STAGE 1    |                                   | | I:056 |                   |PROGRAM  7    |
| | |P5ST1      |                                   | +--] [--+                   |CYRGN7   CD7  |
| | |  B3       |                                   |    04                       |  B3      B3  |
| | +--] [------+                                   |                             +--] [-----] [-+
| | |  430      |                                   |                               327     657
| | |[453]      |                                   |                             [3:57]  [3:208]
| | |MANUAL CRYO|                                   |
| | |GATE 12 OPEN                                   |
| | |MCG12OP    |                                   |
| | |  N7:26    |                                   |
| | +---] [-----+                                   |
| |      0                                          |
| |  [499]                                          |
| |                         EXLOCK                  |
| |               CRYO 12   CHAMBER                 |
| |MANUAL CRYO    TEMPERATUR PRESSUR AT             |
| |GATE 12 OPEN   =>290K    ATMOSPHERE              |
| |MCG12OP        CY12TMP290 PS6                    |
| |  N7:26          B3       I:052                  |
| +---] [-----------] [-------] [-------------------+
|      0           524        04
|  [499]

                                                              CRYO GATE    |
                                                 FIRST SCAN   SOLENOID 1   |
                                                 AFTER POWER  EXBUFFER     |
                                                 LOSS         CHAMBER      |
                                                                           >
```

- 203 -

```
PWR_ON_DLY    HV12_1
    B3         O:061
----]/[--------( )----
   444           15
[1]
```

```
O:061/15 - ] [ - File #5 FAULTS -  91
                 File #6 TECH_RUNGS -  7
           ]/[ - File #5 FAULTS -  114,139
           ( ) - File #2 MAIN_PRGRM -  137
```

- 204 -
Rung #138
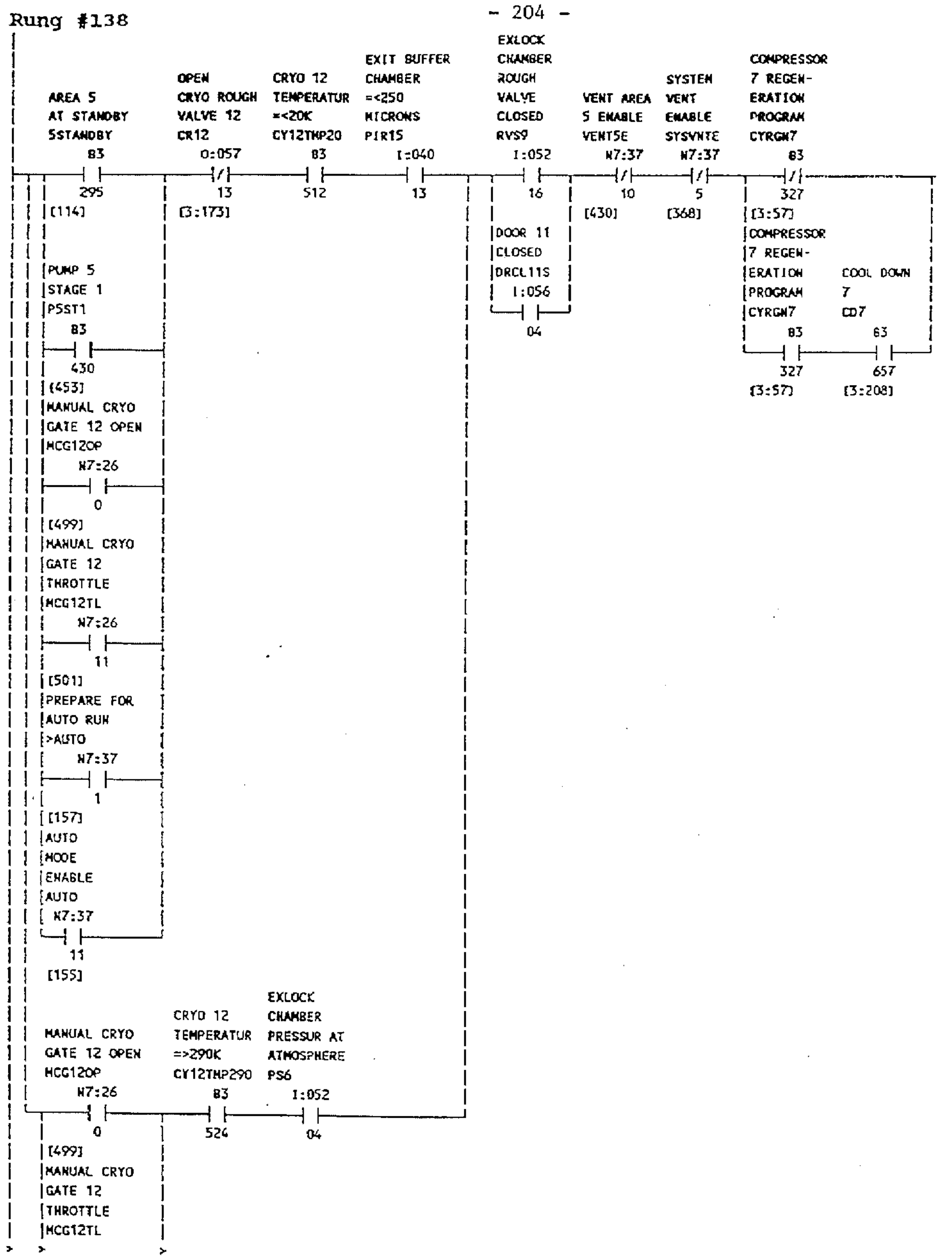

```
 <  <            <
 |  |   N7:26    |
 |  └───┤ ├──────┘
 |       11
 |   [501]

                                                FIRST SCAN    CRYO GATE
                                                AFTER POWER   SOLENOID 2
                                                LOSS          EXBUFFER
                                                PWR_ON_DLY    CHAMBER
                                                   B3         KV12_2
                                                              O:061
                                                ───┤/├────────( )───
                                                  444          16
                                                [1]

O:061/16 - ┤ ├ - File #5 FAULTS -  91,114
                 File #6 TECH_RUNGS -  7
           ┤/├ - File #5 FAULTS -  139
           -( )- - File #2 MAIN_PRGRM -  138
```

Rung #139

```
|DOOR 10                                        EXITLOCK
|CLOSED                                         HIVAC BAFFLE
|DRCL10S                                        ENABLE
| I:056                                         KV12_3
|                                                 O:061
├─┤ ├──────────────────────────────────────────────(U)───
|  02                                               17
O:061/17 - -(L)- - File #2 MAIN_PRGRM -  324
           -(U)- - File #2 MAIN_PRGRM -  139
```

Rung #140

```
|         HEATER 1  CHROME    MAGNETIC  CARBON    EXIT BUFFER
|PUMPDOWN CHAMBER   CHAMBER   CHAMBER   CHAMBER   CHAMBER                    SYSTEM IS
|SYSTEM   =<250     =<250     =<250     =<250     =<250                      PUMPED
|ENABLE   MICRONS   MICRONS   MICRONS   MICRONS   MICRONS                    DOWN
|PDSE     PIR2      PIR6      PIR11     PIR16     PIR15                      SYS_PD
|  B3     I:004     I:024     I:040     I:054     I:040                        B3
├─┤ ├─────┤ ├───────┤ ├───────┤ ├───────┤ ├───────┤ ├──────────────────────────( )───
| 303      10        07        07        07        13                          389
|[23]
B3/389 - ┤ ├ - File #2 MAIN_PRGRM -  22
         -( )- - File #2 MAIN_PRGRM -  140
```

Rung #141

```
|HEATER
|SHIELD H20                                   HEATER SHIELD
|FLOW                                         FLOW SWITCH
|SWITCH 1                                     1 SENSOR
|HSFS1                                        TIMER
| I:006                                       HSFS1TMR
|                                             ┌─TOF──────────────┐
├─┤ ├─────────────────────────────────────────┤TIMER OFF DELAY   ├─(EN)─
|  10                                         |TIMER:     T4:191|
|                                             |BASE (SEC):   1.0├─(DN)
| T4:191.DN - ┤ ├ - File #2 MAIN_PRGRM - 147  |PRESET:        20|
|             ┤/├ - File #2 MAIN_PRGRM - 149  |ACCUM:          0|
|                                             └─────────────────┘
```

```
Rung #142
|HEATER
|SHIELD H2O                                                                  HEATER SHIELD
|FLOW                                                                        FLOW SWITCH
|SWITCH 2                                                                    2 SENSOR
|HSFS2                                                                       HSFS2TMR
|   I:006                                                                    +--TOF--------------+
|---] [--------------------------------------------------------------------+-|TIMER OFF DELAY    |-(EN)-|
|    11                                                                      |TIMER:      T4:192 |
|                                                                            |BASE (SEC):   1.0 |-(DN) |
| T4:192.DN - ] [ - File #2 MAIN_PRGRM - 147                                 |PRESET:        20 |
|             ]/[ - File #2 MAIN_PRGRM - 149                                 |ACCUM:          0 |
|                                                                            +-------------------+
Rung #143
|HEATER
|SHIELD H2O                                                                  HEATER SHIELD
|FLOW                                                                        FLOW SWITCH
|SWITCH 3                                                                    3 TIMER
|HSFS3                                                                       HSFS3TMR
|   I:006                                                                    +--TOF--------------+
|---] [--------------------------------------------------------------------+-|TIMER OFF DELAY    |-(EN)-|
|    12                                                                      |TIMER:      T4:193 |
|                                                                            |BASE (SEC):   1.0 |-(DN) |
| T4:193.DN - ] [ - File #2 MAIN_PRGRM - 148                                 |PRESET:        20 |
|             ]/[ - File #2 MAIN_PRGRM - 150                                 |ACCUM:          0 |
|                                                                            +-------------------+
Rung #144
|HEATER
|SHIELD H2O                                                                  HEATER SHIELD
|FLOW                                                                        FLOW SWITCH
|SWITCH 4                                                                    4 TIMER
|HSFS4                                                                       HSFS4TMR
|   I:006                                                                    +--TOF--------------+
|---] [--------------------------------------------------------------------+-|TIMER OFF DELAY    |-(EN)-|
|    13                                                                      |TIMER:      T4:194 |
|                                                                            |BASE (SEC):   1.0 |-(DN) |
| T4:194.DN - ] [ - File #2 MAIN_PRGRM - 148                                 |PRESET:        20 |
|             ]/[ - File #2 MAIN_PRGRM - 150                                 |ACCUM:          0 |
|                                                                            +-------------------+
Rung #145
|HEATER
|SHIELD H2O                                                                  HEATER SHIELD
|FLOW                                                                        FLOW SWITCH
|SWITCH 5                                                                    5 TIMER
|HSFS5                                                                       HSFS5TMR
|   I:023                                                                    +--TOF--------------+
|---] [--------------------------------------------------------------------+-|TIMER OFF DELAY    |-(EN)-|
|    16                                                                      |TIMER:      T4:195 |
|                                                                            |BASE (SEC):   1.0 |-(DN) |
|                                                                            |PRESET:        20 |
|                                                                            |ACCUM:         20 |
|                                                                            +-------------------+
```

```
Rung #146
|HEATER
|SHIELD H20                                                              HEATER SHIELD
|FLOW                                                                    FLOW SWITCH
|SWITCH 6                                                                6 TIMER
|HSFS6                                                                   HSFS6TMR
|  I:023                                                                 +-TOF------------+
|---] [------------------------------------------------------------------|TIMER OFF DELAY |-(EN)-
|   17                                                                   |TIMER:   T4:196 |
|                                                                        |BASE (SEC):  1.0|-(DN)
|                                                                        |PRESET:       20|
|                                                                        |ACCUM:        20|
|                                                                        +----------------+
Rung #147
|                                         HEATER 1
|                                         CHAMBER                                          SUBSTRATE
|RUN HEATER                      HEATER   =<250    HEATER WATER  HEATER WATER             HEATER  1A
|GROUP 1                         ALARM    MICRONS  VALVE 1       VALVE 2                  ON
|TS26     HSFS1TMR  HSFS2TMR     HTALM    PIR2     HH201         HH202                    RH1A
|  N7:17   T4:191    T4:192       B3      I:004     O:010         O:010                     O:046
|---] [-----] [-------] [-------]/[-------] [-------] [------------] [---------------------+---(L)---+-
|    2       DN         DN        530      10        16             17                    |   10     |
|[3]       [141]      [142]                        [737]          [736]                  |          |
| O:046/10 - -] [- - File #2 MAIN_PRGRM - 153                                            |SUBSTRATE |
|           -(U)- - File #2 MAIN_PRGRM - 149                                             |HEATER  1B|
| O:046/11 - -] [- - File #2 MAIN_PRGRM - 153                                            |ON        |
|           -(U)- - File #2 MAIN_PRGRM - 149                                             |RH1B      |
| O:046/15 - -(U)- - File #2 MAIN_PRGRM - 149                                            |  O:046   |
| O:046/16 - -(U)- - File #2 MAIN_PRGRM - 149                                            +---(L)----+
| N7:38/2 - -(U)- - File #2 MAIN_PRGRM - 149                                             |   11     |
| _F:N7:21[%21 - BTW - File #2 MAIN_PRGRM - 2                                            |          |
| N7:38/5 - -(L)- - File #2 MAIN_PRGRM - 149                                             |          |
| _F:N7:21[%21 - BTW - File #2 MAIN_PRGRM - 2                                            |SUBSTRATE |
|                                                                                        |HEATER  3A|
|                                                                                        |ON        |
|                                                                                        |RH3A      |
|                                                                                        |  O:046   |
|                                                                                        +---(L)----+
|                                                                                        |   15     |
|                                                                                        |SUBSTRATE |
|                                                                                        |HEATER  3B|
|                                                                                        |ON        |
|                                                                                        |RH3B      |
|                                                                                        |  O:046   |
|                                                                                        +---(L)----+
|                                                                                        |   16     |
|                                                                                        |MANUAL    |
|                                                                                        |RUN HEATER|
|                                                                                        |GROUP 1   |
|                                                                                        |MRHG1     |
|                                                                                        |  N7:38   |
|                                                                                        +---(L)----+
|                                                                                        |   2      |
|                                                                                        |MANUAL    |
|                                                                                        |STOP HEATER
|                                                                                        |GROUP 1   |
|                                                                                        |MSHG1     |
|                                                                                        |  N7:38   |
|                                                                                        +---(U)----+
|                                                                                            5
```

Rung #148

```
                                                           CHROME
                                                           CHAMBER
RUN HEATER                                       HEATER    =<250     DOOR 4    HEATER WATER  HEATER WATER                 SUBSTRATE
GROUP 2                                          ALARM     MICRONS   OPEN      VALVE 1       VALVE 2                      HEATER 2A
TS27          HSFS3TMR     HSFS4TMR              HTALM     PIR6      DROP4S    HH201         HH202                        ON
  N7:17        T4:193       T4:194                B3       I:024     I:006      O:010         O:010                       RH2A
|---] [-------] [-----------] [--------------------]/[---+---] [------] [---+-----] [-----------] [-------------------+----O:046---+
    3           DN           DN                  530    |   07        07   |      16            17                  |    -(L)-    |
[3]           [143]        [144]                        |                  |   [737]          [736]                 |     12      |
                                                        |HEATER 1          |                                        |             |
                                                        |CHAMBER           | O:046/12 - -] [- - File #2 MAIN_PRGRM - 153  |SUBSTRATE    |
                                                        |=<250     DOOR 3  |              -(U)- - File #2 MAIN_PRGRM - 150|HEATER 2B    |
                                                        |MICRONS   OPEN    | O:046/13 - -] [- - File #2 MAIN_PRGRM - 153  |ON           |
                                                        |PIR2      DROP3S  |              -(U)- - File #2 MAIN_PRGRM - 150|RH2B         |
                                                        |  I:004    I:006  | O:046/14 - -] [- - File #2 MAIN_PRGRM - 153  |   O:046     |
                                                        +---] [------] [---+              -(U)- - File #2 MAIN_PRGRM - 150|----(L)------|
                                                            10       05      O:046/17 - -(U)- - File #2 MAIN_PRGRM - 150  |    13       |
                                                                             N7:38/3 - -(U)- - File #2 MAIN_PRGRM - 150   |             |
                                                                             _F:N7:21L%21 - BTW - File #2 MAIN_PRGRM - 2  |             |
N7:38/6 - -(L)- - File #2 MAIN_PRGRM - 150                                                                              |SUBSTRATE    |
_F:N7:21L%21 - BTW - File #2 MAIN_PRGRM - 2                                                                             |HEATER 2C    |
                                                                                                                        |ON           |
                                                                                                                        |RH2C         |
                                                                                                                        |   O:046     |
                                                                                                                        |----(L)------|
                                                                                                                        |    14       |
                                                                                                                        |SUBSTRATE    |
                                                                                                                        |HEATER 3C    |
                                                                                                                        |ON           |
                                                                                                                        |RH3C         |
                                                                                                                        |   O:046     |
                                                                                                                        |----(L)------|
                                                                                                                        |    17       |
                                                                                                                        |MANUAL       |
                                                                                                                        |RUN HEATER   |
                                                                                                                        |GROUP 2      |
                                                                                                                        |MRHG2        |
                                                                                                                        |   N7:38     |
                                                                                                                        |----(L)------|
                                                                                                                        |    3        |
                                                                                                                        |MANUAL       |
                                                                                                                        |STOP HEATER  |
                                                                                                                        |GROUP 2      |
                                                                                                                        |MSHG2        |
                                                                                                                        |   N7:38     |
                                                                                                                        +----(U)------+
                                                                                                                             6
```

Rung #149

```
STOP HEATER
GROUP 1
TS29
   N7:17
---] [---
    5
(3)
                 O:046/10 - -] [- - File #2 MAIN_PRGRM - 153
                            -(L)- - File #2 MAIN_PRGRM - 147
                 O:046/11 - -] [- - File #2 MAIN_PRGRM - 153
                            -(L)- - File #2 MAIN_PRGRM - 147
                 O:046/15 - -(L)- - File #2 MAIN_PRGRM - 147
                 O:046/16 - -(L)- - File #2 MAIN_PRGRM - 147
HSFS1TMR         N7:38/2 - -(L)- - File #2 MAIN_PRGRM - 147
  T4:191         _F:N7:21(X21 - BTW - File #2 MAIN_PRGRM - 2
---]/[---        N7:38/5 - -(U)- - File #2 MAIN_PRGRM - 147
   DN            _F:N7:21(X21 - BTW - File #2 MAIN_PRGRM - 2
[141]

HSFS2TMR
  T4:192
---]/[---
   DN
[142]

HEATER
ALARM
HTALM
   B3
---] [---
  530

HEATER WATER
VALVE 2
HH202
    O:010
---]/[---
     17
[736]

HEATER WATER
VALVE 1
HH201
    O:010
---]/[---
     16
[737]
AUTO OFF
PULSE
AUOFPULSE
> >          >

                                        SUBSTRATE
                                        HEATER 1A
                                        ON
                                        RH1A
                                          O:046
                                        ---(U)---
                                           10

                                        SUBSTRATE
                                        HEATER 1B
                                        ON
                                        RH1B
                                          O:046
                                        ---(U)---
                                           11

                                        SUBSTRATE
                                        HEATER 3A
                                        ON
                                        RH3A
                                          O:046
                                        ---(U)---
                                           15

                                        SUBSTRATE
                                        HEATER 3B
                                        ON
                                        RH3B
                                          O:046
                                        ---(U)---
                                           16

                                        MANUAL
                                        RUN HEATER
                                        GROUP 1
                                        MRHG1
                                          N7:38
                                        ---(U)---
                                            2

                                        MANUAL
                                        STOP HEATER
                                        GROUP 1
                                        MSHG1
                                          N7:38
                                        ---(L)---
                                            5
                                                   >
```

```
T4:283
--] [--
   TT
[155]
```

Rung #150

```
STOP HEATER
GROUP 2
TS30
   N7:17
--] [--
   6
[3]

HSFS3THR
  T4:193
--]/[--
   DN
[143]

HSFS4THR
  T4:194
--]/[--
   DN
[144]

HEATER WATER
VALVE 2
HH202
   O:010
--]/[--
   17
[736]

HEATER WATER
VALVE 1
HH201
   O:010
--]/[--
   16
[737]

HEATER
ALARM
HTALM
   B3
--] [--
  530
AUTO OFF
```

```
O:046/12 - -] [- - File #2 MAIN_PRGRM - 153
           -(L)- - File #2 MAIN_PRGRM - 148
O:046/13 - -] [- - File #2 MAIN_PRGRM - 153
           -(L)- - File #2 MAIN_PRGRM - 148
O:046/14 - -] [- - File #2 MAIN_PRGRM - 153
           -(L)- - File #2 MAIN_PRGRM - 148
O:046/17 - -(L)- - File #2 MAIN_PRGRM - 148
N7:38/3 - -(L)- - File #2 MAIN_PRGRM - 148
_F:N7:21(X21 - BTW - File #2 MAIN_PRGRM - 2
N7:38/6 - -(U)- - File #2 MAIN_PRGRM - 148
_F:N7:21(X21 - BTW - File #2 MAIN_PRGRM - 2
```

```
SUBSTRATE
HEATER 2A
ON
RH2A
  O:046
--(U)--
   12

SUBSTRATE
HEATER 2B
ON
RH2B
  O:046
--(U)--
   13

SUBSTRATE
HEATER 2C
ON
RH2C
  O:046
--(U)--
   14

SUBSTRATE
HEATER 3C
ON
RH3C
  O:046
--(U)--
   17

MANUAL
RUN HEATER
GROUP 2
MRHG2
  N7:38
--(U)--
   3

MANUAL
STOP HEATER
GROUP 2
MSHG2
  N7:38
--(L)--
   6
```

```
< <                  <
| |PULSE             |
| |AUOFPULSE         |
| |  T4:283          |
|.└───┤ ├────────────┘
|       TT
| [155]
```

Rung #151

```
|HEATER
|ALARM                                                   HEATER ALARM
|HTALM                                                   HTRALM
|  B3                                                         B3
├─┤ ├──────────────────────────────────────────────────────(L)───┤
|  530                                                        290
B3/290 - ┤ ├ - File #2 MAIN_PRGRM - 62
         -(L)- - File #2 MAIN_PRGRM - 151
         -(U)- - File #2 MAIN_PRGRM - 152
```

Rung #152

```
|PAUSE
|DISABLE                                                 HEATER ALARM
|TS12                                                    HTRALM
|  K7:16                                                      B3
├─┤ ├──────────────────────────────────────────────────────(U)───┤
|   4                                                         290
|[3]
B3/290 - ┤ ├ - File #2 MAIN_PRGRM - 62
         -(L)- - File #2 MAIN_PRGRM - 151
         -(U)- - File #2 MAIN_PRGRM - 152
```

Rung #153

```
|SUBSTRATE SUBSTRATE SUBSTRATE SUBSTRATE SUBSTRATE SUBSTRATE SUBSTRATE SUBSTRATE SUBSTRATE    SUBSTRATE    SUBSTRATE
|HEATER    HEATER    HEATER    HEATER    HEATER    HEATER    HEATER    HEATER    HEATER 1A    HEATER 1B    HEATER 2A
|SET HIGH  SET HIGH  SET HIGH  SET HIGH  SET HIGH  SET HIGH  SET HIGH  SET HIGH  ON           ON           ON
|HH1A      HH1B      HH2A      HH2B      HH2C      HH3A      HH3B      HH3C      RH1A         RH1B         RH2A
|  0:046     0:046     0:046     0:046     0:046     0:046     0:046     0:046     0:046        0:046        0:046
├───┤/├──────┤/├───────┤/├───────┤/├───────┤/├───────┤/├───────┤/├───────┤/├───────┤ ├──────────┤ ├──────────┤ ├──
|    00        01        02        03        04        05        06        07        10           11           12
|[213]     [213]     [227]     [227]     [227]     [213]     [213]     [227]     [149]        [149]        [150]

                                                          SUBSTRATE    SUBSTRATE    ALL
                                                          HEATER 2B    HEATER 2C    SUBSTRATE
                                                          ON           ON           HEATERS
                                                          RH2B         RH2C         SET LOW
                                                                                    ASHSL
                                                            0:046        0:046        B3
                                                          ──┤ ├──────────┤ ├─────────( )──┤
                                                             13           14          398
                                                          [150]        [150]
B3/398 - ┤ ├ - File #2 MAIN_PRGRM - 158
         -( )- - File #2 MAIN_PRGRM - 153
```

Rung #154

```
|                                                                                          DOORS 1,2,3,9,
|DOOR 1  DOOR 2  DOOR 3  DOOR 9  DOOR 11  DOOR 12  DOOR 4  DOOR 5  DOOR 6  DOOR 7  DOOR 8  DOOR 10    11,12 CLOSED:
|CLOSED  CLOSED  CLOSED  OPEN    CLOSED   CLOSED   OPEN    OPEN    OPEN    OPEN    OPEN    CLOSED     4,5,6,7,8 OPEN
|DRCL1S  DRCL2S  DRCL3S  DROP9S  DRCL11S  DRCL12S  DROP4S  DROP5S  DROP6S  DROP7S  DROP8S  DRCL10S    DRS_OK
| I:006  I:006   I:006   I:056   I:056    I:056    I:006   I:026   I:026   I:042   I:042   I:056          B3
├─┤ ├────┤ ├─────┤ ├─────┤ ├─────┤ ├──────┤ ├──────┤ ├─────┤ ├─────┤ ├─────┤ ├─────┤ ├─────┤ ├──────────( )──┤
|  00     02      04      01      04       06       07      01      03      01      03      02            396
B3/396 - ┤ ├ - File #2 MAIN_PRGRM - 158
         -( )- - File #2 MAIN_PRGRM - 154
```

Rung #155

```
|            POWER SUPPLIES  POWER SUPPLIES                                                    AUTO
| AUTO MODE  CHROME,MAG-A    MAGB,CARBON                                                       MODE
| DISABLE    ON              ON                                                                ENABLE
| TS10       PS_CH_MA_ON     PS_M8_CR_ON                                                       AUTO
|  N7:16         B3              B3                                                             N7:37
|-+--] [--------]/[------------]/[---+--------------------------------------------------------+--(U)--+-|
| |   2         527             543  |                                                        |  11    | |
| |[3]                               |                                                        |        | |
| |                                  | N7:37/11 - ] [ - File #2 MAIN_PRGRM - 15, 115,         |        | |
| |                                  |                118, 120, 122, 124, 126, 128,           |        | |
| |                                  |                130, 132, 134, 136, 138, 159,           |AUTO OFF| |
| |FIRST SCAN                        |                160, 162, 163, 165, 168, 173,           |PULSE   | |
| |AFTER POWER                       |                174, 180, 181, 185, 187, 190,           |AUOFPULSE |
| |LOSS                              |                195, 197, 199, 200, 202, 204,           | +-TON-------------+ |
| |PWR_ON_DLY                        |                205, 206, 207, 208, 209, 211,           +-|TIMER ON DELAY   |-(EN)-+
| |   B3                             |                214, 218, 222, 226, 229, 231,             |TIMER:    T4:283 |
| +--] [-----------------------------+                233, 235, 237, 238, 243, 249,             |BASE (SEC):  1.0 |-(DN)
|    444                                              253, 255, 258, 263, 265, 267,             |PRESET:        5 |
| [1]                                                 269, 270, 275, 281, 285, 287,             |ACCUM:         0 |
|                                                     290, 295, 297, 299, 300, 306,             +-----------------+
           310, 312, 315, 320, 324, 327, 331, 335, 337, 338, 341, 346, 347, 351, 355, 614, 616, 624, 625,
           630, 631, 633
           File #5 FAULTS - 0, 1, 2, 3, 4, 5, 6, 7, 8, 9, 10, 11, 12, 13, 14
       ]/[ - File #2 MAIN_PRGRM - 84, 98, 104, 116, 187, 200, 212, 327, 369, 405, 411, 418, 425, 430, 674, 676,
           684, 688, 690, 698
      -(L)- - File #2 MAIN_PRGRM - 158
 _F:N7:21[X21 - BTW - File #2 MAIN_PRGRM - 2
 T4:283.DN - ] [ - File #2 MAIN_PRGRM - 711
 T4:283.TT - ] [ - File #2 MAIN_PRGRM - 38, 39, 40, 41, 42, 44, 45, 84, 98, 105, 106, 107, 108, 109, 149, 150, 223,
            237, 240, 243, 269, 272, 275
```

Rung #156

```
|OPEN
|GAS FLOW   GAS FLOW   GAS FLOW                                          GAS FLOW |
|ISOLATION  ISOLATION  ISOLATION                                         VALVES   |
|VALVE 3    VALVE 5    VALVE 7                                           3,5,7    |
|GF3        GF5        GF7                                               ARE OPEN |
|  O:030      O:044      O:060                                           MAST-VAL |
|----] [--------] [--------] [-------------------------------------------  B3     |
|    07         07         07                                           --( )----|
|[40]       [42]       [44]                                              148      |
B3/148 - ] [ - File #2 MAIN_PRGRM - 158
       -( )- - File #2 MAIN_PRGRM - 156
```

Rung #157

```
|PREPARE
|FOR AUTO RUN
|ENABLE                                                                  PREPARE FOR |
|TS09                                                                    AUTO RUN    |
|   N7:16                                                                >AUTO       |
|----] [--------------------------------------------------------------------N7:37    |
|    1                                                                   ---(L)------|
|[3]                                                                        1        |
N7:37/1 - ] [ - File #2 MAIN_PRGRM - 17,22,46,47,48,49,68,78,110,111,112,113,114,115,118,120,122,124,126,128,130,132,134,136,138
          158,183,202,229,325,335,337,353,368,381,383,385,386,410,415,417,424,429,433,437,441,446,450,454,458,460,462,464,466
          468,470,472,474,476,478,480,482,484,486,488,490,492,494,496,498,500,502,508,509,510,511,512,551,552,553,554,555,556
          557,558,559,560,561,562,563,564,565,566,567,568,569,589,590,591,592,593,594,595,596,597,598,599,600,601,602,603,604
          605,606,607,625
          File #3 CRYO_REGEN - 25,238,239,240,241,242,243,244
    -(L)- - File #2 MAIN_PRGRM - 157
    -(U)- - File #2 MAIN_PRGRM - 162
_F:N7:21[X21 - BTW - File #2 MAIN_PRGRM - 2
```

Rung #158

```
              GAS FLOW                                                                COMPUTER    ALL
              VALVES                 MECHANICAL              MECHANICAL               SIGNAL FOR  SUBSTRATE  DOORS 1,2,3,9,
PREPARE FOR   3,5,7                  PUMP 1       BLOWER 1   PUMP 3       BLOWER 3    AUTO MODE   HEATERS    11,12 CLOSED:
AUTO RUN      ARE OPEN   DOOR FAULT  ENABLED      ENABLED    ENABLED      ENABLED     OK          SET LOW    4,5,6,7,8 OPEN
>AUTO         MAST-VAL   DRFLT       MP1          BL1        MP3          BL3         COMPAUTO    ASHSL      DRS_OK
  N7:37        B3          B3        0:007        0:007      0:057        0:057       N7:16       B3          B3
|---] [--------] [--------]/[--------] [----------] [----------] [----------] [----------] [----------] [----------] [----
    1          148         215        00           01         00           01          11          398         396
[157]         [156]       [5:67]     [89]         [86]       [103]        [100]        [3]        [153]       [154]
N7:37/11 - ] [ - File #2 MAIN_PRGRM - 15, 115, 118, 120, 122, 124, 126, 128, 130, 132, 134, 136, 138,
                 159, 160, 162, 163, 165, 168, 173, 174, 180, 181, 185, 187, 190, 195, 197, 199,
                 200, 202, 204, 205, 206, 207, 208, 209, 211, 214, 218, 222, 226, 229, 231, 233,
                 235, 237, 238, 243, 249, 253, 255, 258, 263, 265, 267, 269, 270, 275, 281, 285,
                 287, 290, 295, 297, 299, 300, 306, 310, 312, 315, 320, 324, 327, 331, 335, 337,
                 338, 341, 346, 347, 351, 355, 614, 616, 624, 625, 630, 631, 633
                 File #5 FAULTS - 0, 1, 2, 3, 4, 5, 6, 7, 8, 9, 10, 11, 12, 13, 14
         ]/[ - File #2 MAIN_PRGRM - 84, 98, 104, 116, 187, 200, 212, 327, 369, 405, 411, 418, 425,
                 430, 674, 676, 684, 688, 690, 698
         -(U)- - File #2 MAIN_PRGRM - 155
_F:N7:21[X21 - BTW - File #2 MAIN_PRGRM - 2
T4:282.TT - ] [ - File #2 MAIN_PRGRM - 165, 338, 711

                                                   AUTO
                                                   MODE
                                                   ENABLE
                                                   AUTO
                                                    N7:37
                                                 +--(L)--------------------+
                                                 |   11
                                                 |AUTO ON
                                                 |PULSE
                                                 |AUTOPULSE
                                                 |+-TON-----------------+
                                                 +|TIMER ON DELAY       |-(EN)-
                                                  |TIMER:        T4:282 |
                                                  |BASE (SEC):   1.0    |-(DN)
                                                  |PRESET:          5   |
                                                  |ACCUM:           0   |
                                                  +---------------------+
```

Rung #159

```
AUTO
MODE
ENABLE                                                              RETURN CONVEYOR
AUTO                                                                ON
 N7:37                                                              RTNCVYR
+--] [--------+                                                        0:060
|   11        |---------------------------------------------------------(L)----
|[158]        |                                                          01
|             | 0:060/01 - -(U)- - File #2 MAIN_PRGRM - 161
|MANUAL CONTROL
|RETURN CONVEYOR
|RTNCVYR      |
|    I:055    |
+----] [------+
      03
```

```
Rung #160
| AUTO                                                                                    RETURN CONVEYOR  |
| MODE                                                                                    OFF DELAY        |
| ENABLE                                                                                  RC_OFF           |
| AUTO                                                                                    +-TOF----------+ |
| N7:37                                                                                   |TIMER OFF DELAY|-(EN)-|
|-+--| |---+------------------------------------------------------------------------------|TIMER:  T4:332|      |
| |   11    |                                                                             |BASE (SEC): 1.0|-(DN) |
| |[158]    | T4:332.DN - -|/|- - File #2 MAIN_PRGRM - 161                                |PRESET:  1800|      |
| |         |                                                                             |ACCUM:      0|      |
| |MANUAL CONTROL                                                                         +--------------+      |
| |RETURN CONVEYOR                                                                                            |
| |RTNCNVYR |                                                                                                 |
| |   I:055 |                                                                                                 |
| +---| |---+                                                                                                 |
|      03                                                                                                     |
Rung #161
|                                                                                         RETURN CONVEYOR    |
|                                                                                         ON                 |
|RC_OFF                                                                                   RTNCVYR            |
| T4:332                                                                                     O:060           |
|--|/|-----------------------------------------------------------------------------------------(U)----------|
|   DN                                                                                          01           |
|[160]
O:060/01 - -(L)- - File #2 MAIN_PRGRM -  159
           -(U)- - File #2 MAIN_PRGRM -  161
Rung #162
| AUTO MODE                                                                               PREPARE FOR       |
| DISABLE                                                                                 AUTO RUN          |
| TS10                                                                                    >AUTO             |
|    N7:16                                                                                   N7:37          |
|-+--| |---+-------------------------------------------------------------------------------------(U)-------|
| |   2     |                                                                                     1         |
| |[3]      |
| |         | N7:37/1 - -| |- - File #2 MAIN_PRGRM - 17, 22, 46, 47, 48, 49, 68, 78, 110, 111, 112, 113, 114, 115,
| |         |              118, 120, 122, 124, 126, 128, 130, 132, 134, 136, 138, 158, 183, 202, 229, 325,
| |         |              335, 337, 353, 368, 381, 383, 385, 386, 410, 415, 417, 424, 429, 433, 437, 441,
| |AUTO     |              446, 450, 454, 458, 460, 462, 464, 466, 468, 470, 472, 474, 476, 478, 480, 482,
| |MODE     |              484, 486, 488, 490, 492, 494, 496, 498, 500, 502, 508, 509, 510, 511, 512, 551,
| |ENABLE   |              552, 553, 554, 555, 556, 557, 558, 559, 560, 561, 562, 563, 564, 565, 566, 567,
| |AUTO     |              568, 569, 589, 590, 591, 592, 593, 594, 595, 596, 597, 598, 599, 600, 601, 602,
| | N7:37   |              603, 604, 605, 606, 607, 625
| +--| |----+              File #3 CRYO_REGEN - 25, 238, 239, 240, 241, 242, 243, 244
|     11                -(L)- - File #2 MAIN_PRGRM - 157
|  [158]        _F:N7:211X21 - STW - File #2 MAIN_PRGRM - 2
Rung #163
|                           PALLET
|AUTO                       DETECTED
|MODE    DOOR 1   DOOR 2    RIGHT SIDE                                               SOFT                   |
|ENABLE  CLOSED   CLOSED    LOADLOCK                                                 ROUGHING               |
|AUTO    DRCL1S   DRCL2S    SENS                                                     TIMER                  |
|N7:37   I:006    I:006       I:003                                                  SOFRUF                 |
|                                                                                    +-TON-----------+      |
|--| |-----| |-----| |---------| |---------------------------------------------------|TIMER ON DELAY |-(EN)-|
|  11       00       02          05                                                  |TIMER:    T4:98|      |
|[158]                                                                               |BASE (SEC): 1.0|-(DN) |
|                                                                                    |PRESET:       0|      |
|                                                                                    |ACCUM:        0|      |
|                                                                                    +---------------+      |
T4:98.DN - -| |- - File #2 MAIN_PRGRM -  167
T4:98.TT - -| |- - File #2 MAIN_PRGRM -  164
```

Rung #164

```
SOFRUF                                                    MECH PUMP
T4:98                                                     SOFT ROUGH
                                                          VALVE
                                                          SOFRUFVLV
                                                          O:030
--| |------------------------------------------------------( )--
  TT                                                        00
[163]
```

Rung #165

```
AUTOPULSE                                                 LOADLOCK
T4:282                                                    AUTO
                                                          LL_AUTO
                                                          B3
--| |-----------------------------------------------------(L)--
   TT                                                      287
[158]
                 B3/287 - -| |- - File #2 MAIN_PRGRM - 167, 183
                         -(U)- - File #2 MAIN_PRGRM - 166
         COMPUTER
AUTO     SIGNAL FOR
MODE     AUTO MODE
ENABLE   OK
AUTO     COMPAUTO
N7:37    N7:16
--| |------| |--
   11       11
[158]    [3]
```

Rung #166

```
VENT                                                      LOADLOCK
LOAD LOCK                                                 AUTO
VNT_LL                                                    LL_AUTO
N7:24                                                     B3
--| |-----------------------------------------------------(U)--
   13                                                      287
[674]
             B3/287 - -| |- - File #2 MAIN_PRGRM - 167, 183
                     -(L)- - File #2 MAIN_PRGRM - 165
PUMP-VENT
CYCLE LOAD
LOCK
PO-VNT-LL
N7:24
--| |--
   14
[676]
AUTO MODE
DISABLE
TS10
N7:16
--| |--
   2
[3]
```

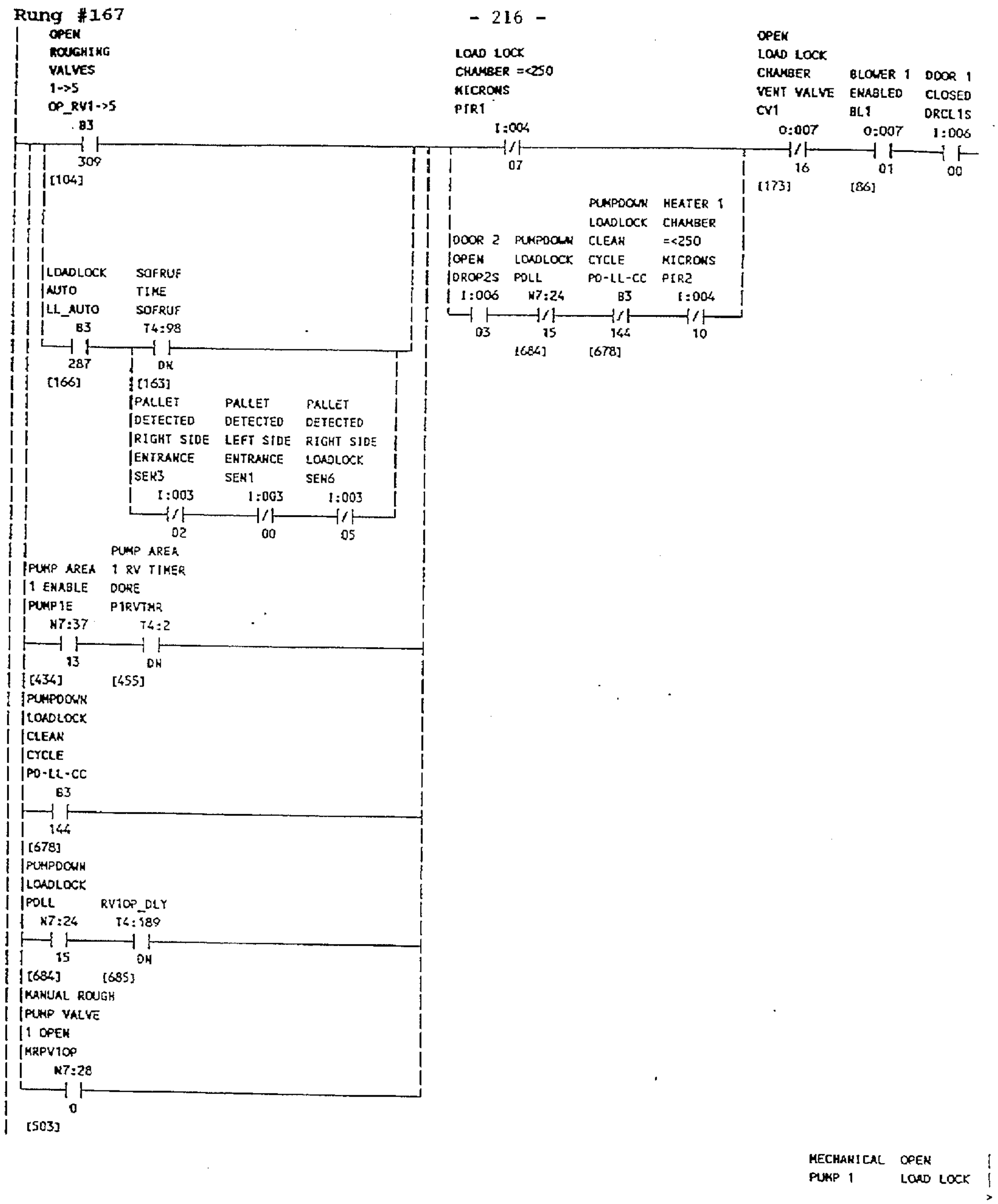
Rung #167
- 216 -
OPEN ROUGHING VALVES 1->5 OP_RV1->5
B3
309
[104]
LOAD LOCK CHAMBER =<250 MICRONS PIR1
I:004
07
OPEN LOAD LOCK CHAMBER VENT VALVE CV1
O:007
16
[173]
BLOWER 1 ENABLED BL1
O:007
01
[86]
DOOR 1 CLOSED DRCL1S
I:006
00
DOOR 2 OPEN DROP2S
I:006
03
PUMPDOWN LOADLOCK POLL
N7:24
15
[684]
PUMPDOWN LOADLOCK CLEAN CYCLE PD-LL-CC
B3
144
[678]
HEATER 1 CHAMBER =<250 MICRONS PIR2
I:004
10
LOADLOCK AUTO LL_AUTO
B3
287
[166]
SOFRUF TIME SOFRUF
T4:98
DN
[163]
PALLET DETECTED RIGHT SIDE ENTRANCE SEN3
I:003
02
PALLET DETECTED LEFT SIDE ENTRANCE SEN1
I:003
00
PALLET DETECTED RIGHT SIDE LOADLOCK SEN6
I:003
05
PUMP AREA 1 ENABLE PUMP1E
N7:37
13
[434]
PUMP AREA 1 RV TIMER DONE P1RVTMR
T4:2
DN
[455]
PUMPDOWN LOADLOCK CLEAN CYCLE PD-LL-CC
B3
144
[678]
PUMPDOWN LOADLOCK POLL
N7:24
15
[684]
RV1OP_DLY
T4:189
DN
[685]
MANUAL ROUGH PUMP VALVE 1 OPEN MRPV1OP
N7:28
0
[503]
MECHANICAL PUMP 1
OPEN LOAD LOCK

```
                                                              ISOLATION   ROUGH
                                                              VALVE OPEN  VALVE
                                                              KP1IVOP     RV1
                                                                I:005       O:010
                                                              ----] [--------( )----|
                                                                 13          11

O:010/11 - ] [ - File #2 MAIN_PRGRM -  168
                 File #5 FAULTS -  159
                 File #6 TECH_RUNGS -  0
           ]/[ - File #5 FAULTS -  161
           -( )- - File #2 MAIN_PRGRM -  167
Rung #168
|
|        OPEN
|AUTO    LOAD LOCK
|MODE    ROUGH
|ENABLE  VALVE                                              LOAD LOCK
|AUTO    RV1                                                ROUGH TIMER
| N7:37    O:010                                            LLRUFFTMR
|                                                           +-TON-----------+
|--] [------] [---------------------------------------------|TIMER ON DELAY |-(EN)-|
|  11        11                                             |TIMER:  T4:113 |
|[158]    [167]                                             |BASE (SEC): 1.0|-(DN) |
|                                                           |PRESET:      60|
|                                                           |ACCUM:        0|
|                                                           +---------------+
T4:113.DN - ] [ - File #2 MAIN_PRGRM -  169
Rung #169
|
|                                                                  LOAD LOCK
|                                                                  ROUGHING
|LLRUFFTMR                                                         >60 SECONDS
| T4:113                                                           LLRUF>60
|                                                                    B3
|--] [-----------------------------------------------------------------(L)-----|
|     DN                                                              816
|[168]
B3/816 - ] [ - File #2 MAIN_PRGRM -  626
       -(L)- - File #2 MAIN_PRGRM -  169
       -(U)- - File #2 MAIN_PRGRM -  170
Rung #170
|
|PAUSE                                                             LOAD LOCK
|DISABLE                                                           ROUGHING
|TS12                                                              >60 SECONDS
| N7:16                                                            LLRUF>60
|                                                                    B3
|--] [-----------------------------------------------------------------(U)-----|
|   4                                                                 816
|[3]
B3/816 - ] [ - File #2 MAIN_PRGRM -  626
       -(L)- - File #2 MAIN_PRGRM -  169
       -(U)- - File #2 MAIN_PRGRM -  170
```

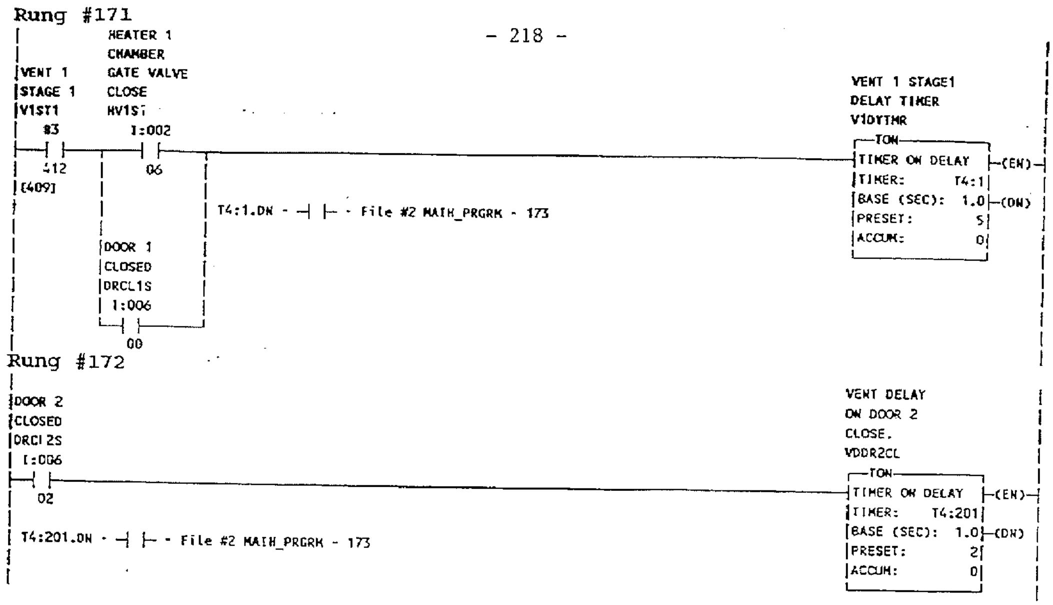
Rung #171
VENT 1
STAGE 1
V1ST1
B3
412
[409]
HEATER 1
CHAMBER
GATE VALVE
CLOSE
HV1ST
I:002
06
DOOR 1
CLOSED
DRCL1S
I:006
00
T4:1.DN - ┤ ├ - File #2 MAIN_PRGRM - 173
VENT 1 STAGE1
DELAY TIMER
V1DYTMR
TON
TIMER ON DELAY
TIMER: T4:1
BASE (SEC): 1.0
PRESET: 5
ACCUM: 0
(EN)
(DN)
Rung #172
DOOR 2
CLOSED
DRCL2S
I:006
02
T4:201.DN - ┤ ├ - File #2 MAIN_PRGRM - 173
VENT DELAY
ON DOOR 2
CLOSE.
VDDR2CL
TON
TIMER ON DELAY
TIMER: T4:201
BASE (SEC): 1.0
PRESET: 2
ACCUM: 0
(EN)
(DN)

Rung #173 - 219 -
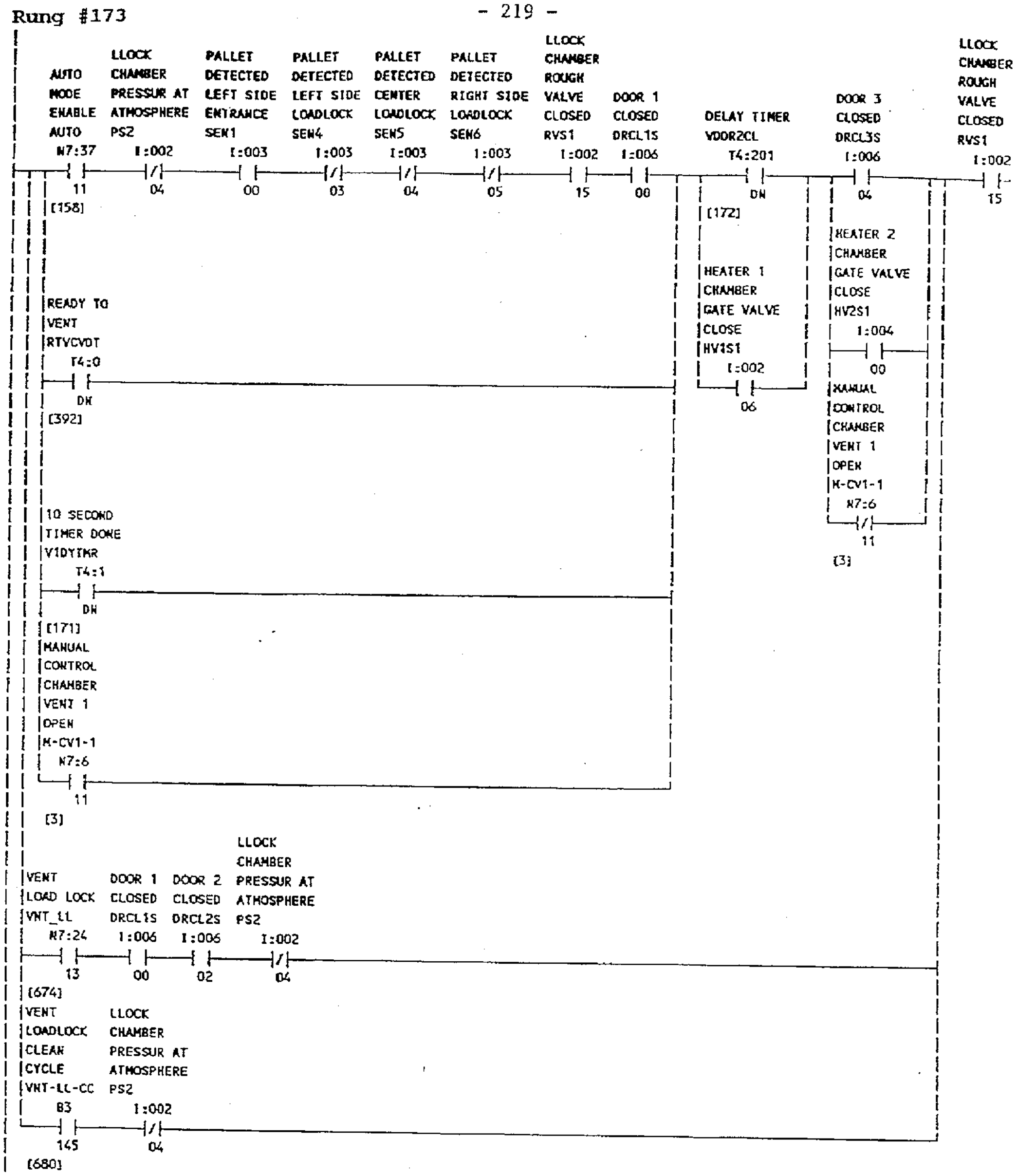
OPEN LOAD LOCK

- 220 -

```
                                                                                      CHAMBER     |
                                                                                      VENT VALVE  |
                                                                                      CV1         |
                                                                                         O:007    |
                                                                                      ----(L)-----|
                                                                                          16      |
O:007/16 - -| |- - File #2 MAIN_PRGRM -  174
                   File #6 TECH_RUNGS -  0
           -|/|- - File #2 MAIN_PRGRM -  67,167,181,181,368,436,675,681
           -(L)- - File #2 MAIN_PRGRM -  173
           -(U)- - File #2 MAIN_PRGRM -  177
Rung #174
|        OPEN
|AUTO    LOAD LOCK                                                                                |
|MODE    CHAMBER                                                          ENTRANCE                |
|ENABLE  VENT VALVE                                                       LOCK VENT               |
|AUTO    CV1                                                              TIMER                   |
| N7:37     O:007                                                         LDVNTTIMER              |
|                                                                         +-TON--------------+    |
|-| |------| |------------------------------------------------------------|TIMER ON DELAY    |-(EN)-|
|  11        16                                                          |TIMER:     T4:143 |     |
|[158]    [173]                                                          |BASE (SEC):   1.0 |-(DN) |
|                                                                        |PRESET:       100 |     |
|                                                                        |ACCUM:          0 |     |
|                                                                        +------------------+     |
T4:143.DN - -| |- - File #2 MAIN_PRGRM -  175
Rung #175
|
|                                                                             LOAD LOCK          |
|LDVNTTIMER                                                                   VENT >30 SECS      |
|  T4:143                                                                     LLVNT>30SECS       |
|                                                                                  B3            |
|-| |--------------------------------------------------------------------------------(L)---------|
|   DN                                                                            814            |
|[174]                                                                                           |
B3/814 - -| |- - File #2 MAIN_PRGRM -  626
         -(L)- - File #2 MAIN_PRGRM -  175
         -(U)- - File #2 MAIN_PRGRM -  176
Rung #176
|PAUSE
|DISABLE                                                                      LOAD LOCK          |
|TS12                                                                         VENT >30 SECS      |
| N7:16                                                                       LLVNT>30SECS       |
|                                                                                  B3            |
|-| |--------------------------------------------------------------------------------(U)---------|
|   4                                                                             814            |
|[3]                                                                                             |
B3/814 - -| |- - File #2 MAIN_PRGRM -  626
         -(L)- - File #2 MAIN_PRGRM -  175
         -(U)- - File #2 MAIN_PRGRM -  176
```

```
Rung #177
                                                                          OPEN
                                                                          LOAD LOCK
                                                                          CHAMBER
                                                                          VENT VALVE
  CV1_DLY                                                                 CV1
  T4:317                                                                    O:007
---] [-----------------------------------------------------------------------(U)---
    DN                                                                       16
  [178]
            O:007/16 - ] [ - - File #2 MAIN_PRGRM - 174
  MANUAL                        File #6 TECH_RUNGS - 0
  CONTROL                ]/[ - - File #2 MAIN_PRGRM - 67, 167, 181, 368, 436, 675, 681
  CHAMBER                -(L)- - File #2 MAIN_PRGRM - 173
  VENT 1
  CLOSE
  M-CV1-O
   N7:4
---] [-----
    0
  [3]
  HEATER 1
  CHAMBER
  GATE VALVE  DOOR 2
  CLOSE       CLOSED
  HV1S1       DRCL2S
   I:002       I:006
---]/[--------]/[---
    06          02
  ABORT SYSTEM
  VENT
  BORT_SYS_VNT
   N7:17
---] [-----
    10
  [3]
Rung #178
LLOCK
CHAMBER
PRESSUR AT
ATMOSPHERE                                                     CHAMBER VENT 1
PS2                                                            CLOSE DELAY
  I:002                                                        CV1_DLY
                                                               +-TON-----------+
---] [---------------------------------------------------------|TIMER ON DELAY |-(EN)-
   04                                                          |TIMER:   T4:317|
                                                               |BASE (SEC): 1.0|-(DN)
 T4:317.DN - ] [ - - File #2 MAIN_PRGRM - 177                  |PRESET:       1|
                                                               |ACCUM:        0|
                                                               +---------------+
Rung #179
DOOR 1                                                                    LOAD LOCK
OPEN                                                                      AIR SWEEP
DROP1S                                                                    SOLENOID
 I:006                                                                    LLSWEEP
                                                                            O:011
---] [-----------------------------------------------------------------------( )---
   01                                                                        10
```

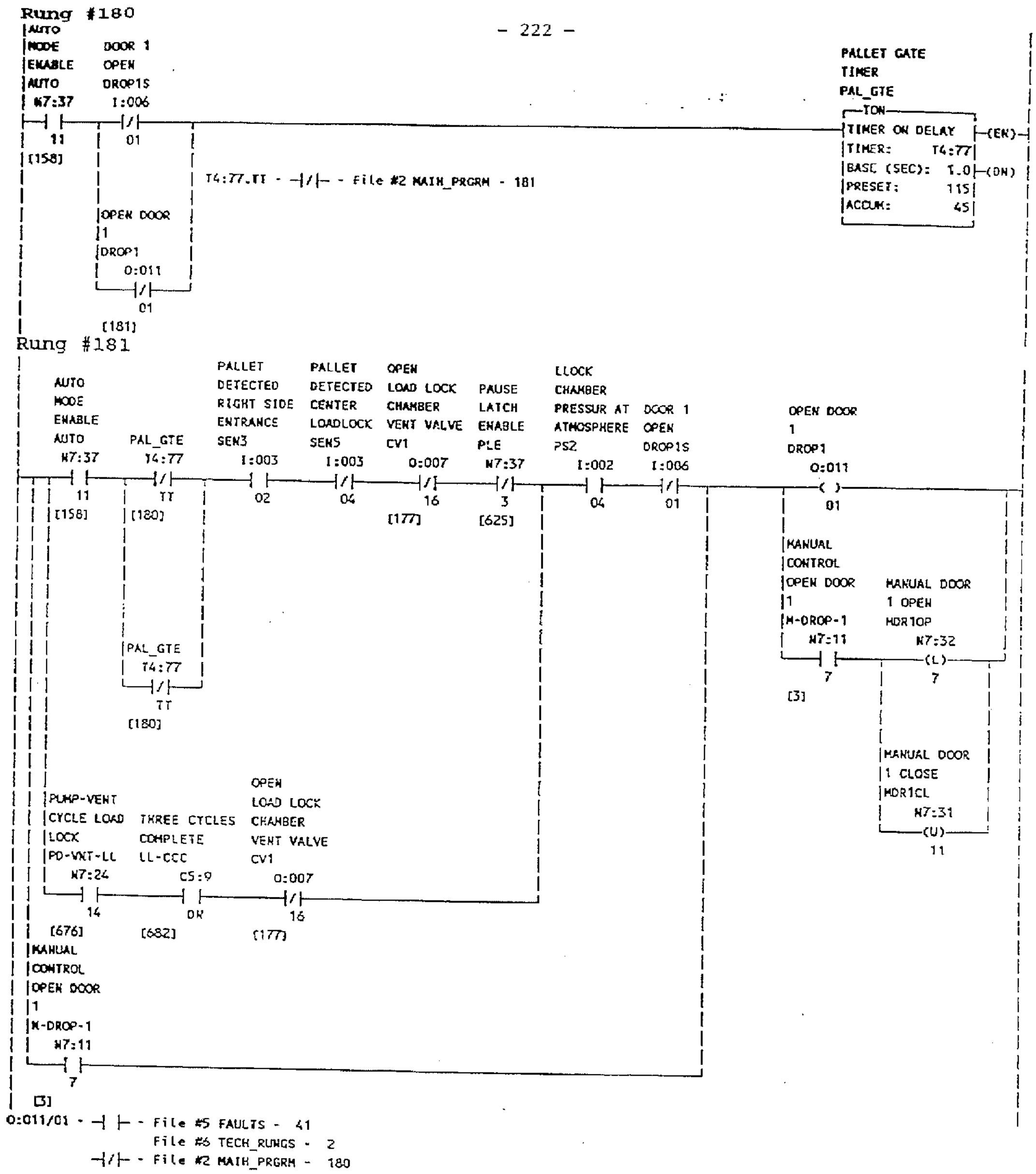
Rung #180
- 222 -
AUTO
MODE
ENABLE
AUTO
N7:37
11
[158]
DOOR 1
OPEN
DROP1S
I:006
01
T4:77.TT - -|/|- - File #2 MAIN_PRGRM - 181
OPEN DOOR
1
DROP1
O:011
01
[181]
PALLET GATE
TIMER
PAL_GTE
TON
TIMER ON DELAY
TIMER: T4:77
BASE (SEC): 1.0
PRESET: 115
ACCUM: 45
(EN)
(DN)
Rung #181
AUTO
MODE
ENABLE
AUTO
N7:37
11
[158]
PAL_GTE
T4:77
TT
[180]
PALLET
DETECTED
RIGHT SIDE
ENTRANCE
SEN3
I:003
02
PALLET
DETECTED
CENTER
LOADLOCK
SEN5
I:003
04
OPEN
LOAD LOCK
CHAMBER
VENT VALVE
CV1
O:007
16
[177]
PAUSE
LATCH
ENABLE
PLE
N7:37
3
[625]
LLOCK
CHAMBER
PRESSUR AT
ATMOSPHERE
PS2
I:002
04
DOOR 1
OPEN
DROP1S
I:006
01
OPEN DOOR
1
DROP1
O:011
01
PAL_GTE
T4:77
TT
[180]
MANUAL
CONTROL
OPEN DOOR
1
M-DROP-1
N7:11
7
[3]
MANUAL DOOR
1 OPEN
MDR1OP
N7:32
(L)
7
MANUAL DOOR
1 CLOSE
MDR1CL
N7:31
(U)
11
PUMP-VENT
CYCLE LOAD
LOCK
PD-VNT-LL
N7:24
14
[676]
THREE CYCLES
COMPLETE
LL-CCC
C5:9
DN
[682]
OPEN
LOAD LOCK
CHAMBER
VENT VALVE
CV1
O:007
16
[177]
MANUAL
CONTROL
OPEN DOOR
1
M-DROP-1
N7:11
7
[3]
O:011/01 - -| |- - File #5 FAULTS - 41
File #6 TECH_RUNGS - 2
-|/|- - File #2 MAIN_PRGRM - 180

```
         -( )- - File #2 MAIN_PRGRM -  181
N7:32/7 - -(L)- - File #2 MAIN_PRGRM -  181
         -(U)- - File #2 MAIN_PRGRM -  183
_F:N7:21[X21 - BTW - File #2 MAIN_PRGRM -  2
N7:31/11 - -(L)- - File #2 MAIN_PRGRM -  183
         -(U)- - File #2 MAIN_PRGRM -  181
_F:N7:21[X21 - BTW - File #2 MAIN_PRGRM -  2
Rung #182
| PALLET     PALLET      PALLET                                      |
| DETECTED   DETECTED    DETECTED                                    |
| CENTER     RIGHT SIDE  LEFT SIDE                        PALLET AT  |
| ENTRANCE   ENTRANCE    LOADLOCK                         DOOR 1     |
| SEN2       SEN3        SEN4                             PLT_DR1    |
|   I:003      I:003       I:003                          B3         |
|-+--] [---+---] [--------] [---------------------------( )---------|
| |   01   |    02          03                            198        |
| |PALLET  | B3/198 - -]/[- - File #2 MAIN_PRGRM - 183                |
| |DETECTED|                                                         |
| |CENTER  |                                                         |
| |LOADLOCK|                                                         |
| |SEN5    |                                                         |
| |  I:003 |                                                         |
| +--] [---+                                                         |
|     04                                                             |
```

ung #183
- 224 -
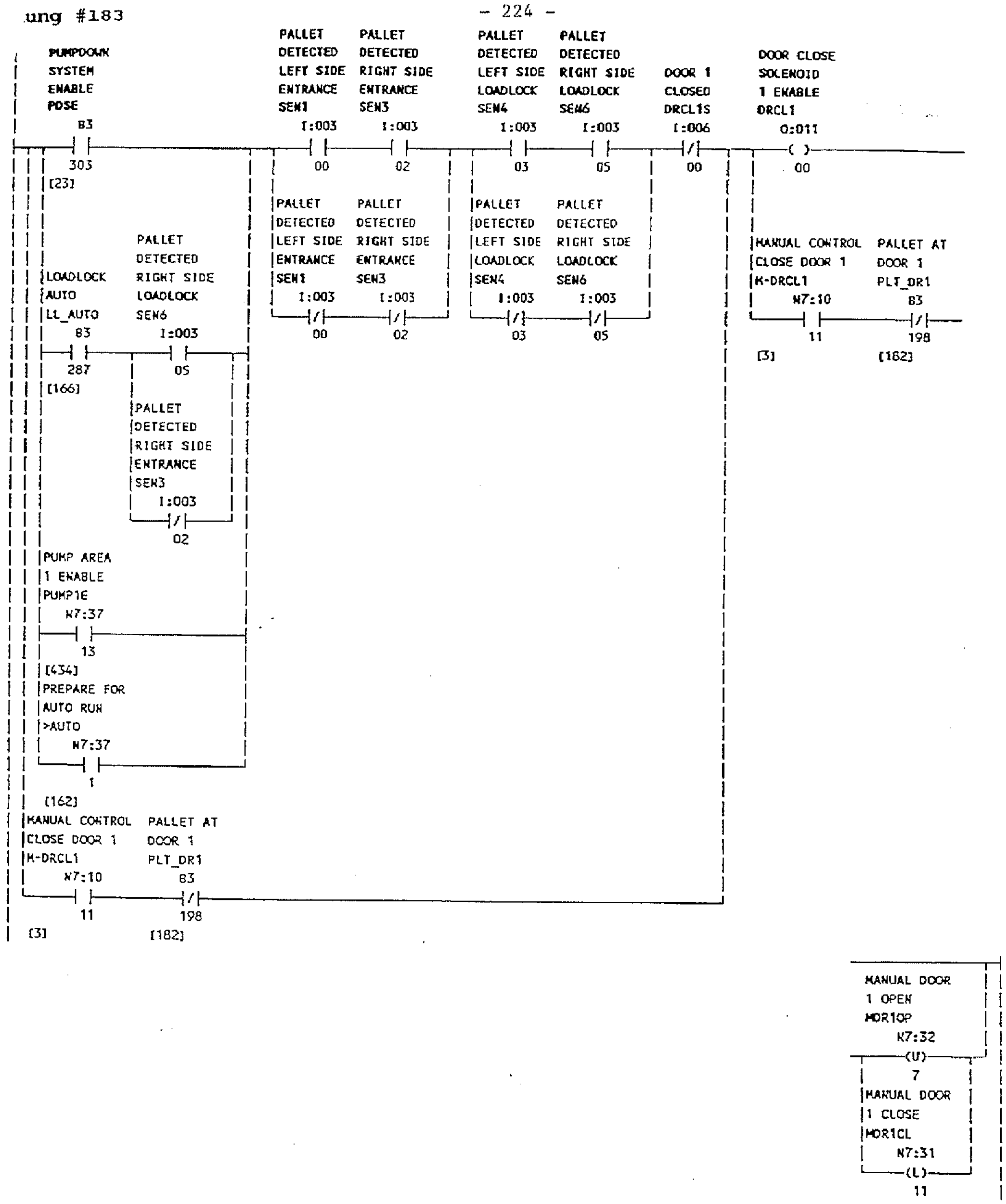

```
O:011/00 - -| |- - File #5 FAULTS -  17
                   File #6 TECH_RUNGS -  2
         -( )- - File #2 MAIN_PRGRM -  183
N7:32/7 - -(L)- - File #2 MAIN_PRGRM -  181
        -(U)- - File #2 MAIN_PRGRM -  183
_F:N7:21[X21 - BTW - File #2 MAIN_PRGRM -  2
N7:31/11 - -(L)- - File #2 MAIN_PRGRM -  183
          -(U)- - File #2 MAIN_PRGRM -  181
_F:N7:21[X21 - BTW - File #2 MAIN_PRGRM -  2
Rung #184
|  MOTOR 3        MOTOR START                                   MOTOR 3    |
|  FAST PULSE     PULSE                                         INTERRUPT  |
|  M3FP           MOPIB                                         M31        |
|    T4:203         T4:299                                        O:012    |
|-+---| |----+-----| |------------------------------------------------( )---|
| |     TT   |       DN                                              02    |
| |[185]     | [12]                                                        |
| |MOTOR 3   |                                                             |
| |FAST STOP |                                                             |
| |PULSE     |                                                             |
| |M3FSP     |                                                             |
| |  T4:223  |                                                             |
| |---| |----|                                                             |
| |     TT   |                                                             |
| |[186]     |                                                             |
| |MOTOR 3   |                                                             |
| |SLOW PULSE|                                                             |
| |M3SP      |                                                             |
| |  T4:243  |                                                             |
| |---| |----|                                                             |
| |     TT   |                                                             |
| |[187]     |                                                             |
| |MOTOR 3   |                                                             |
| |SLOW STOP |                                                             |
| |PULSE     |                                                             |
| |M3SSP     |                                                             |
| |  T4:263  |                                                             |
| +---| |----+                                                             |
|       TT                                                                 |
|  [188]                                                                   |
```

Rung #185
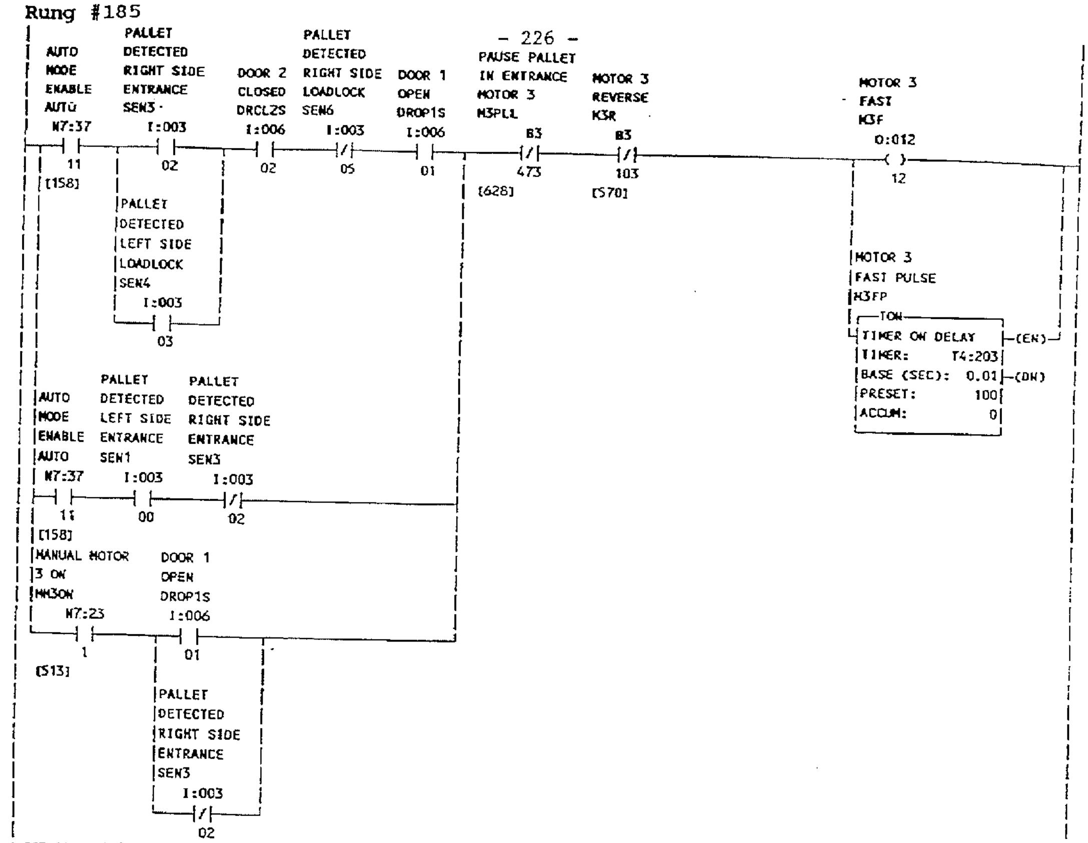
O:012/12 - ┤ ├ - File #5 FAULTS - 0
┤/├ - File #2 MAIN_PRGRM - 186
–( )– - File #2 MAIN_PRGRM - 185
T4:203.TT - ┤ ├ - File #2 MAIN_PRGRM - 184
Rung #186
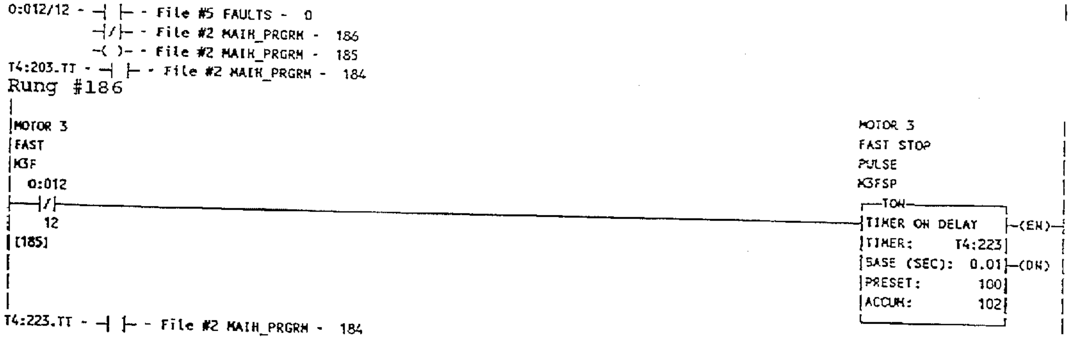
T4:223.TT - ┤ ├ - File #2 MAIN_PRGRM - 184

```
Rung #187

MANUAL MOTOR   AUTO MODE   DOOR 1     PAUSE PALLET                     MOTOR 3
3 ON           ENABLE      OPEN       IN ENTRANCE                      SLOW
MM3ON          AUTO        DROP1S     MOTOR 3                          M3S
N7:23          N7:37       I:006      M3PLL                            O:013
                                      B3
---] [---------]/[---------] [----+---]/[----------------------------------( )---
   1           11          01     |   473                                02
[513]          [158]              |   [628]
                       PALLET     |
                       DETECTED   |   O:013/02 - ] [ - File #2 MAIN_PRGRM - 15, 187
                       RIGHT SIDE |            ]/[ - File #2 MAIN_PRGRM - 188
                       ENTRANCE   |   T4:243.TT - ] [ - File #2 MAIN_PRGRM - 184
                       SEN3       |
                       I:003      |                                    MOTOR 3
                   +---]/[--------+                                    SLOW PULSE
                       02                                              M3SP
                                                                       +-TON-------------------+
                                                                       |TIMER ON DELAY         |-(EN)-
                                                                       |TIMER:          T4:243 |
                                                                       |BASE (SEC):       0.01 |-(DN)
                                                                       |PRESET:            100 |
                                                                       |ACCUM:               0 |
                                                                       +-----------------------+
 AUTO         PALLET        PALLET
 MODE         DETECTED      DETECTED
 ENABLE       LEFT SIDE     RIGHT SIDE
 AUTO         ENTRANCE      ENTRANCE
 N7:37        SEN1          SEN3
              I:003         I:003
+-] [---------] [-----------]/[-----+
  11          00            02
 [158]
                            PALLET
 AUTO                       DETECTED
 MODE         MOTOR 3       RIGHT SIDE
 ENABLE       SLOW          ENTRANCE
 AUTO         M3S           SEN3
 N7:37        O:013         I:003
+-] [---------] [-----------]/[-----+
  11          02            02
 [158]        [187]
              PALLET
              DETECTED      AUTO
 MOTOR 3      LEFT SIDE     MODE
 REVERSE      ENTRANCE      ENABLE
 M3R          SEN1          AUTO
 B3           I:003         N7:37
+-] [---------]/[-----------]/[-----+
  103         00            11
 [570]                      [158]

Rung #188

MOTOR 3                                                                MOTOR 3
SLOW                                                                   SLOW STOP
M3S                                                                    PULSE
O:013                                                                  M3SSP
                                                                       +-TON-------------------+
---]/[-----------------------------------------------------------------|TIMER ON DELAY         |-(EN)-
   02                                                                  |TIMER:          T4:263 |
[187]                                                                  |BASE (SEC):       0.01 |-(DN)
                                                                       |PRESET:            100 |
                                                                       |ACCUM:             102 |
                                                                       +-----------------------+
T4:263.TT - ] [ - File #2 MAIN_PRGRM - 184
```

Rung #189
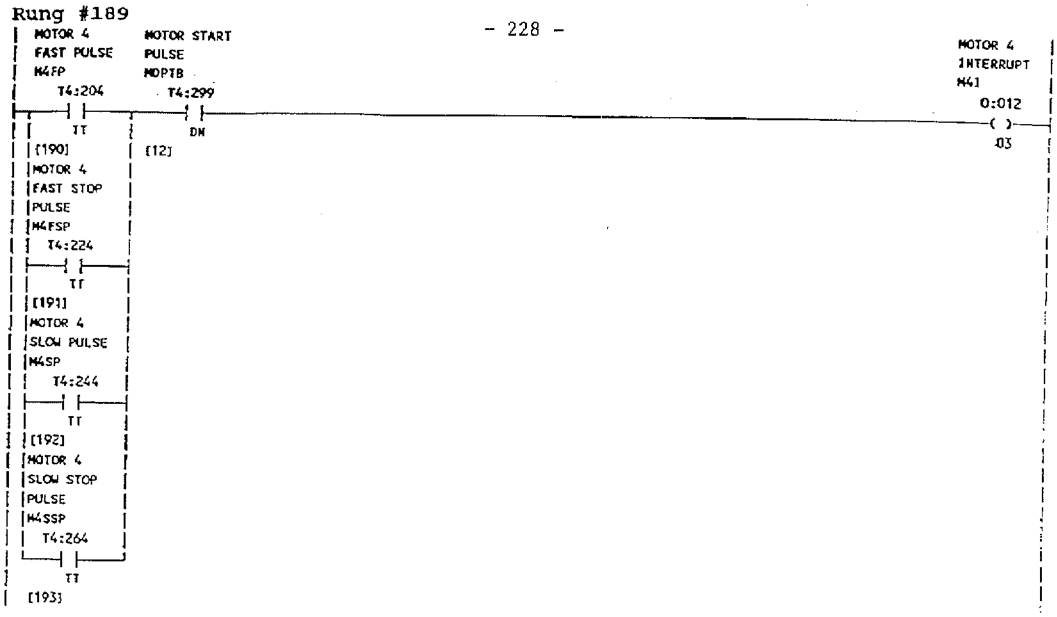

Rung #190
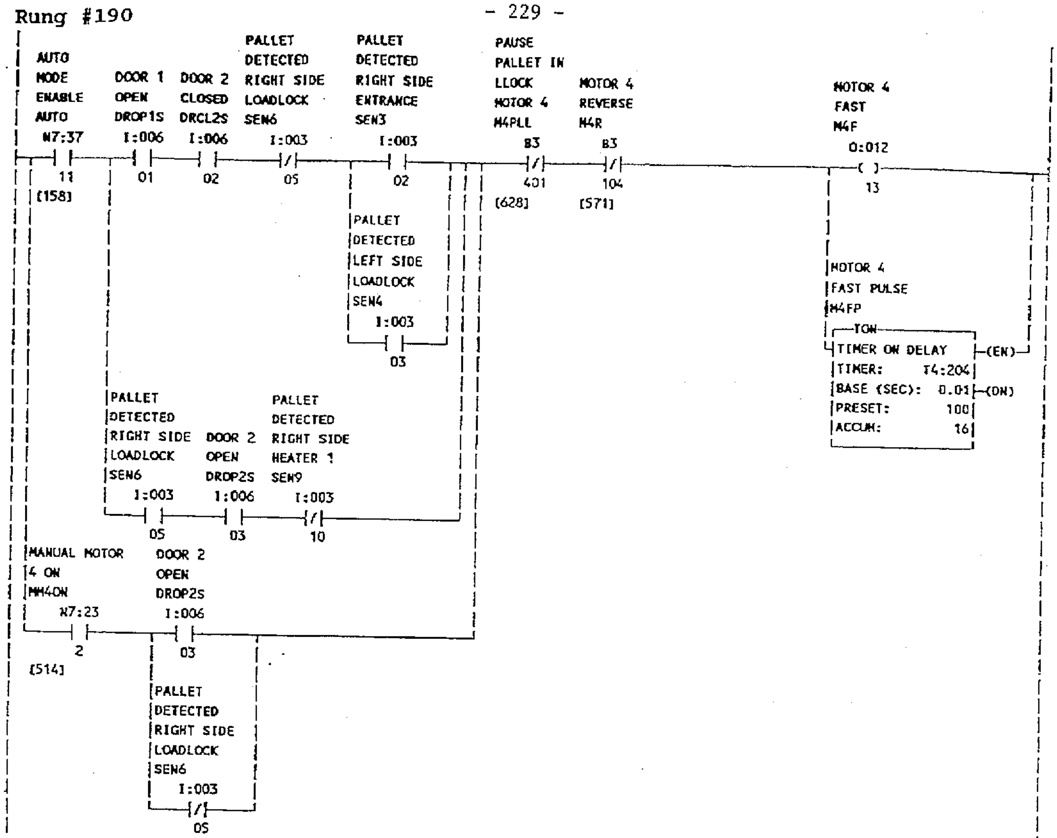
O:012/13 - -| |- - File #5 FAULTS - 1
-|/|- - File #2 MAIN_PRGRM - 191
-( )- - File #2 MAIN_PRGRM - 190
T4:204.TT - -| |- - File #2 MAIN_PRGRM - 189
Rung #191
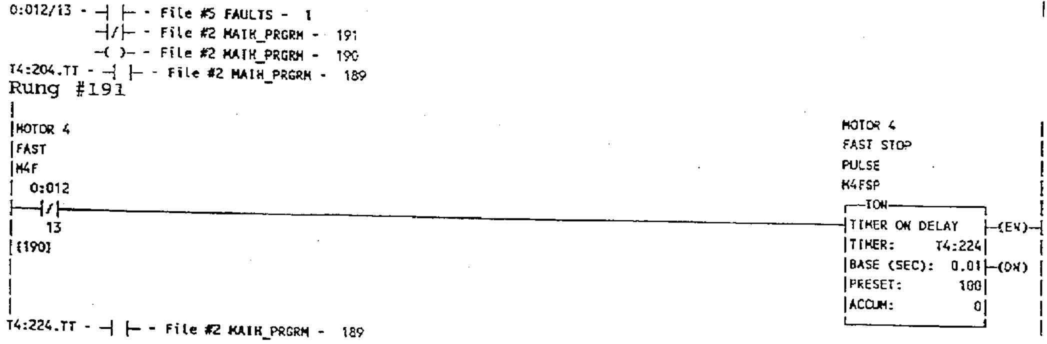
T4:224.TT - -| |- - File #2 MAIN_PRGRM - 189

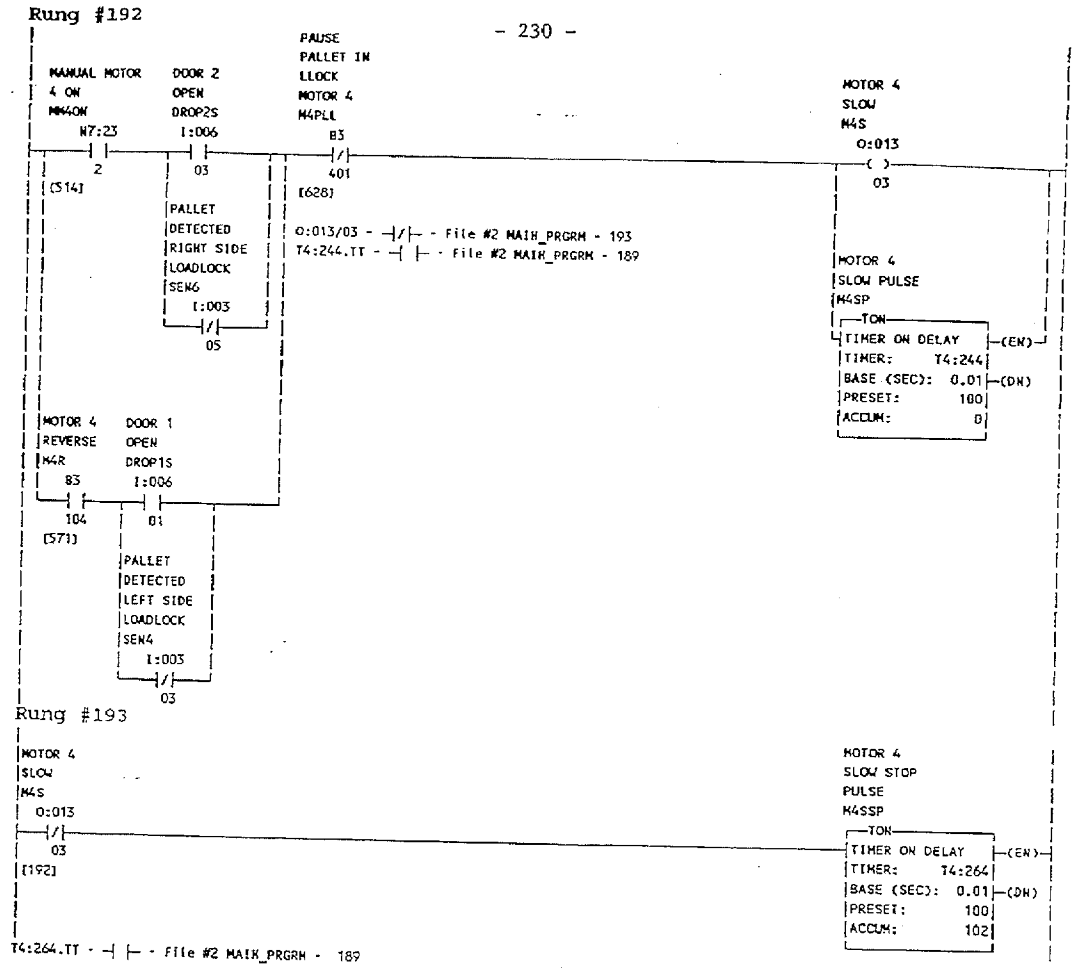
Rung #192
MANUAL MOTOR 4 ON MM4ON
N7:23
2
[S14]
DOOR 2 OPEN DROP2S
I:006
03
PALLET DETECTED RIGHT SIDE LOADLOCK SEN6
I:003
05
PAUSE PALLET IN LLOCK MOTOR 4 M4PLL
B3
401
[628]
O:013/03 - ┤/├ - - File #2 MAIN_PRGRM - 193
T4:244.TT - ┤ ├ - - File #2 MAIN_PRGRM - 189
MOTOR 4 SLOW M4S
O:013
03
MOTOR 4 SLOW PULSE M4SP
TON
TIMER ON DELAY
TIMER: T4:244
BASE (SEC): 0.01
PRESET: 100
ACCUM: 0
(EN)
(DN)
MOTOR 4 REVERSE M4R
B3
104
[571]
DOOR 1 OPEN DROP1S
I:006
01
PALLET DETECTED LEFT SIDE LOADLOCK SEN4
I:003
03
Rung #193
MOTOR 4 SLOW M4S
O:013
03
[192]
MOTOR 4 SLOW STOP PULSE M4SSP
TON
TIMER ON DELAY
TIMER: T4:264
BASE (SEC): 0.01
PRESET: 100
ACCUM: 102
(EN)
(DN)
T4:264.TT - ┤ ├ - - File #2 MAIN_PRGRM - 189

Rung #194

```
| MOTOR 5      MOTOR START                                        MOTOR 5   |
| FAST PULSE   PULSE                                              INTERRUPT |
| M5FP         MOPTB                                              M5I       |
|   T4:205       T4:299                                            O:012    |
|-+---] [---+-----] [-------------------------------------------------( )---|
| |   TT    |      DN                                               04      |
| |[195]    | [12]                                                        |
| |MOTOR 5  |                                                             |
| |FAST STOP|                                                             |
| |PULSE    |                                                             |
| |M5FSP    |                                                             |
| |  T4:225 |                                                             |
| |---] [---|                                                             |
| |   TT    |                                                             |
| |[196]    |                                                             |
| |MOTOR 5  |                                                             |
| |SLOW PULSE                                                             |
| |M5SP     |                                                             |
| |  T4:245 |                                                             |
| |---] [---|                                                             |
| |   TT    |                                                             |
| |[197]    |                                                             |
| |MOTOR 5  |                                                             |
| |SLOW STOP|                                                             |
| |PULSE    |                                                             |
| |M5SSP    |                                                             |
| |  T4:265 |                                                             |
| +---] [---+                                                             |
|     TT                                                                  |
| [198]                                                                   |
```

Rung #195 -232 -
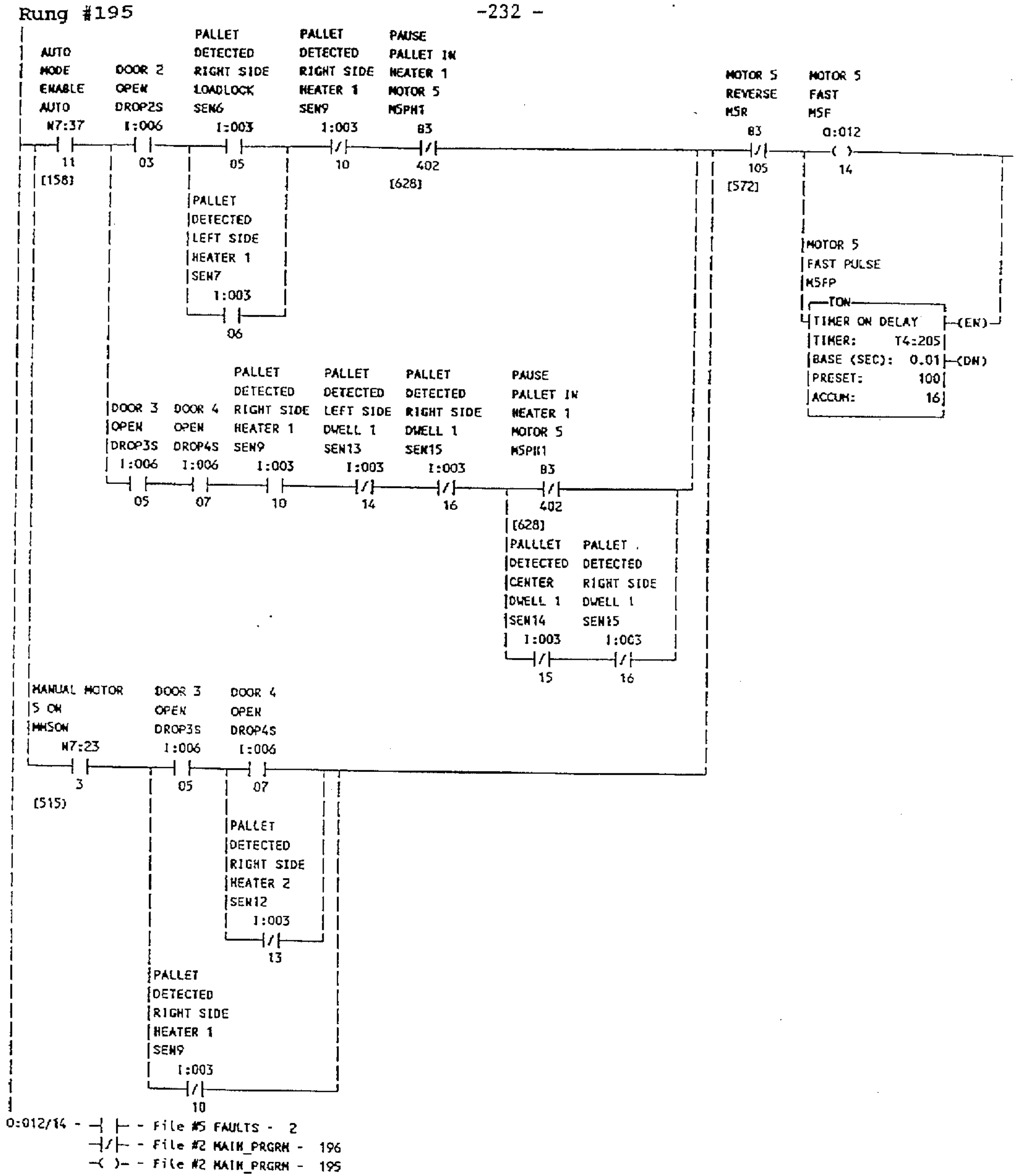
O:012/14 - -| |- - File #5 FAULTS - 2
-|/|- - File #2 MAIN_PRGRM - 196
-( )- - File #2 MAIN_PRGRM - 195

```
T4:205.TT - -| |- - File #2 MAIN_PRGRM - 194
Rung #196

 MOTOR 5                                                      MOTOR 5
 FAST                                                         FAST STOP
 M5F                                                          PULSE
 O:012                                                        M5FSP
--|/|-------------------------------------------------------- +-TON------------------+
  14                                                          |TIMER ON DELAY        |-(EN)-
 [195]                                                        |TIMER:        T4:225  |
                                                              |BASE (SEC):     0.01  |-(DN)
                                                              |PRESET:          100  |
                                                              |ACCUM:             0  |
                                                              +----------------------+

T4:225.TT - -| |- - File #2 MAIN_PRGRM - 194
Rung #197
                                   PALLET     PALLET     PALLET
 AUTO                              DETECTED   DETECTED   DETECTED    PAUSE
 MODE      DOOR 3    DOOR 4        RIGHT SIDE LEFT SIDE  RIGHT SIDE  PALLET IN
 ENABLE    OPEN      OPEN          HEATER 1   DWELL 1    DWELL 1     HEATER 1     MOTOR 5
 AUTO      DROP3S    DROP4S        SEN9       SEN13      SEN15       MOTOR 5      SLOW
 N7:37     I:006     I:006         I:003      I:003      I:003       M5PH1        M5S
                                                                     B3           O:013
--| |------| |-------| |-----------| |--------|/|--------|/|--------+--|/|--------+---( )---
   11       05        07            10         14         16       |  402        |   04
 [158]                                                             | [628]       |
                                                                   | PALLLET  PALLET     MOTOR 5
 MANUAL MOTOR       DOOR 3    DOOR 4                               | DETECTED DETECTED   SLOW PULSE
 5 ON               OPEN      OPEN                                 | CENTER   RIGHT SIDE M5SP
 MM5ON              DROP3S    DROP4S                               | DWELL 1  DWELL 1    +-TON------------------+
 N7:23              I:006     I:006                                | SEN14    SEN15      |TIMER ON DELAY        |-(EN)-
                                                                   | I:003    I:003      |TIMER:        T4:245  |
--| |-------------+--| |-----+--| |--+---------------------------+ +--|/|------|/|--+   |BASE (SEC):     0.01  |-(DN)
   3              |   05     |   07  |                              15        16         |PRESET:          100  |
 [515]            |          |       |                                                   |ACCUM:             0  |
                  |          | PALLET                                                    +----------------------+
                  |          | DETECTED
                  |          | RIGHT SIDE
                  |          | HEATER 2
                  |          | SEN12
                  |          |  I:003
                  |          +--|/|--+
                  |             13
                  | PALLET
                  | DETECTED
                  | RIGHT SIDE
                  | HEATER 1
                  | SEN9
                  |  I:003
                  +--|/|------------+
                     10
 MOTOR 5     DOOR 2
 REVERSE     OPEN
 M5R         DROP2S
 B3          I:006
--| |------+--| |--+------------------------------------------+
   105     |   03  |
 [572]     |       |
           | PALLET
           | DETECTED
           | LEFT SIDE
           | HEATER 1
           | SEN7
           |  I:003
           +--|/|--+
>                                                                                          >
```

- 234 -

```
<                                                                                  <
|                    06                                                            |
O:013/04 - -|/|- - File #2 MAIN_PRGRM -  198
           -( )- - File #2 MAIN_PRGRM -  197
T4:245.TT - -| |- - File #2 MAIN_PRGRM -  194
Rung #198
|                                                                   MOTOR 5        |
|MOTOR 5                                                            SLOW STOP      |
|SLOW                                                               PULSE          |
|M5S                                                                M5SSP          |
|  O:013                                                            +-TON--------+ |
|--|/|--------------------------------------------------------------|TIMER ON DELAY|-(EN)-|
|   04                                                              |TIMER:  T4:265| |
|[197]                                                              |BASE (SEC): 0.01|-(DN)|
|                                                                   |PRESET:    100| |
|                                                                   |ACCUM:     102| |
|                                                                   +------------+ |
T4:265.TT - -| |- - File #2 MAIN_PRGRM -  194
Rung #199
|LLOCK                                                                             |
|CHAMBER                                                                           |
|ROUGH    AUTO                                                                     |
|VALVE    MODE                                                      DOOR 2 OPEN    |
|CLOSED   ENABLE                                                    DELAY          |
|RVS1     AUTO                                                      DROP2_DLY      |
| I:002   N7:37                                                     +-TON--------+ |
|--| |-----| |------------------------------------------------------|TIMER ON DELAY|-(EN)-|
|   15      11                                                      |TIMER:  T4:169| |
|          [158]                                                     |BASE (SEC): 1.0|-(DN)|
|                                                                   |PRESET:      2| |
|                                                                   |ACCUM:       2| |
|                                                                   +------------+ |
T4:169.DN - -| |- - File #2 MAIN_PRGRM -  104,200
```

Rung #200
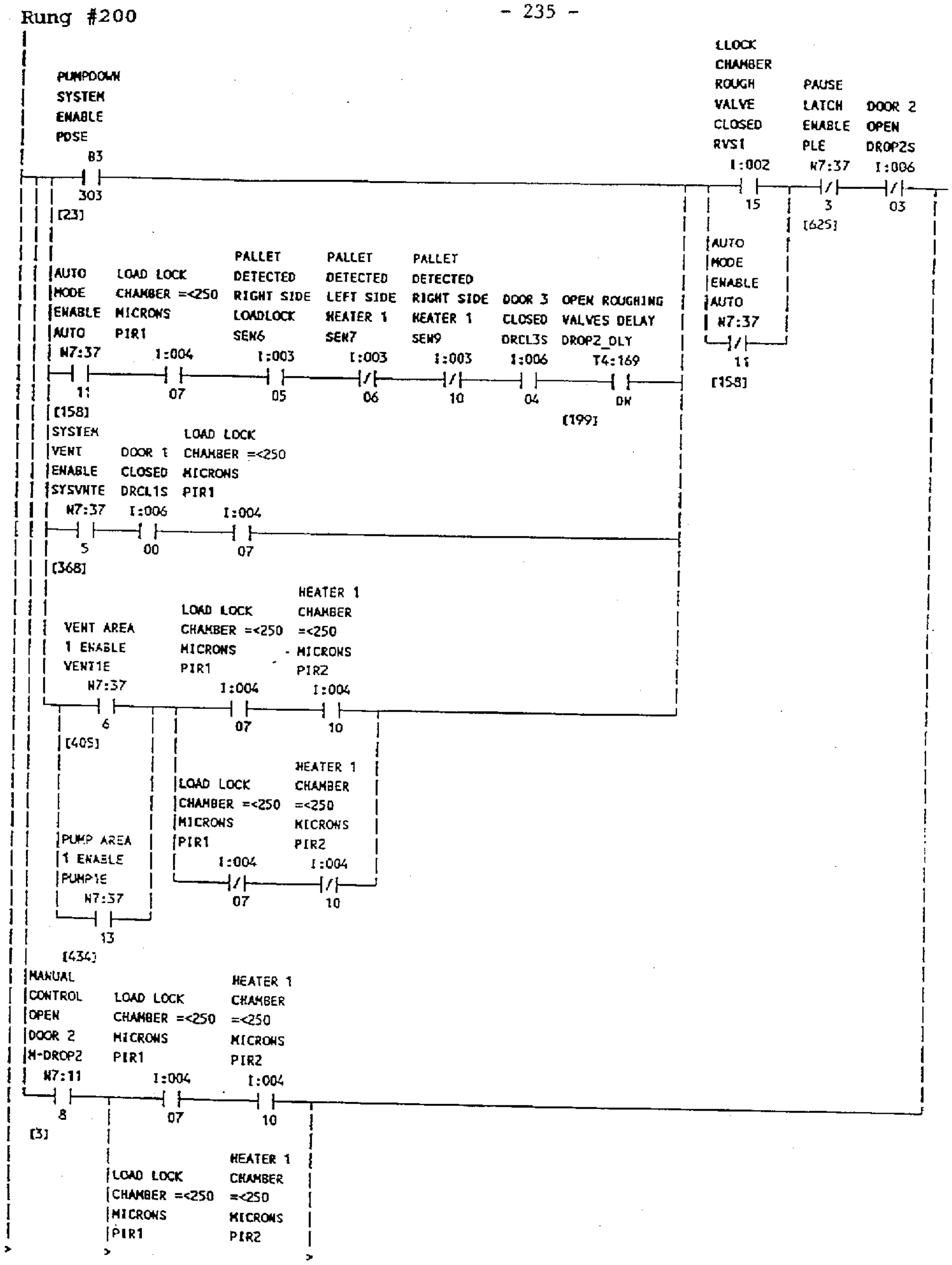

```
   <               <                                <
   |               |   I:004          I:004        |
   |               └───┤/├────────────┤/├──────────┘
   |                   07             10

                                                         OPEN DOOR
                                                         SOLENOID
                                                         2 ENABLE
                                                         DROP2
                                                           O:011
                                                       ┬───( )─────────────────────────┤
                                                       |    03
                                                       |MANUAL
                                                       |CONTROL  OPEN DOOR      MANUAL
                                                       |OPEN     SOLENOID       DOOR 2
                                                       |DOOR 2   2 ENABLE       OPEN
                                                       |M-DROP2  DROP2          MDR2OP
                                                       | N7:11     O:011         N7:32
                                                       └──┤ ├──────┤ ├──────┬───(L)───┘
                                                           8        03      |    8
                                                         [3]      [200]     |
                                                                            |MANUAL
                                                                            |DOOR 2
                                                                            |CLOSE
                                                                            |MDR2CL
                                                                            | N7:31
                                                                            └──(U)───┘
                                                                                 12

O:011/03 - ┤ ├ - File #2 MAIN_PRGRM -  200
                 File #5 FAULTS -  43
                 File #6 TECH_RUNGS -  2
         -( )- - File #2 MAIN_PRGRM -  200
N7:32/8 - -(L)- - File #2 MAIN_PRGRM -  200
        -(U)- - File #2 MAIN_PRGRM -  202
_F:N7:21L21 - BTW - File #2 MAIN_PRGRM -  2
N7:31/12 - -(L)- - File #2 MAIN_PRGRM -  202
         -(U)- - File #2 MAIN_PRGRM -  200
_F:N7:21L21 - BTW - File #2 MAIN_PRGRM -  2
Rung #201
|PALLET     PALLET      PALLET
|DETECTED   DETECTED    DETECTED
|CENTER     RIGHT SIDE  LEFT SIDE
|LOADLOCK   LOADLOCK    HEATER 1                                        PALLET AT
|SEN5       SEN6        SEN7                                            DOOR 2
|  I:003      I:003       I:003                                         PLT_DR2
|                                                                          B3
├──┤ ├────────┤ ├─────────┤ ├───────────────────────────────────────────( )───┤
|   04          05          06                                            200
B3/200 - ┤/├ - File #2 MAIN_PRGRM -  202
       -( )- - File #2 MAIN_PRGRM -  201
```

Rung #202
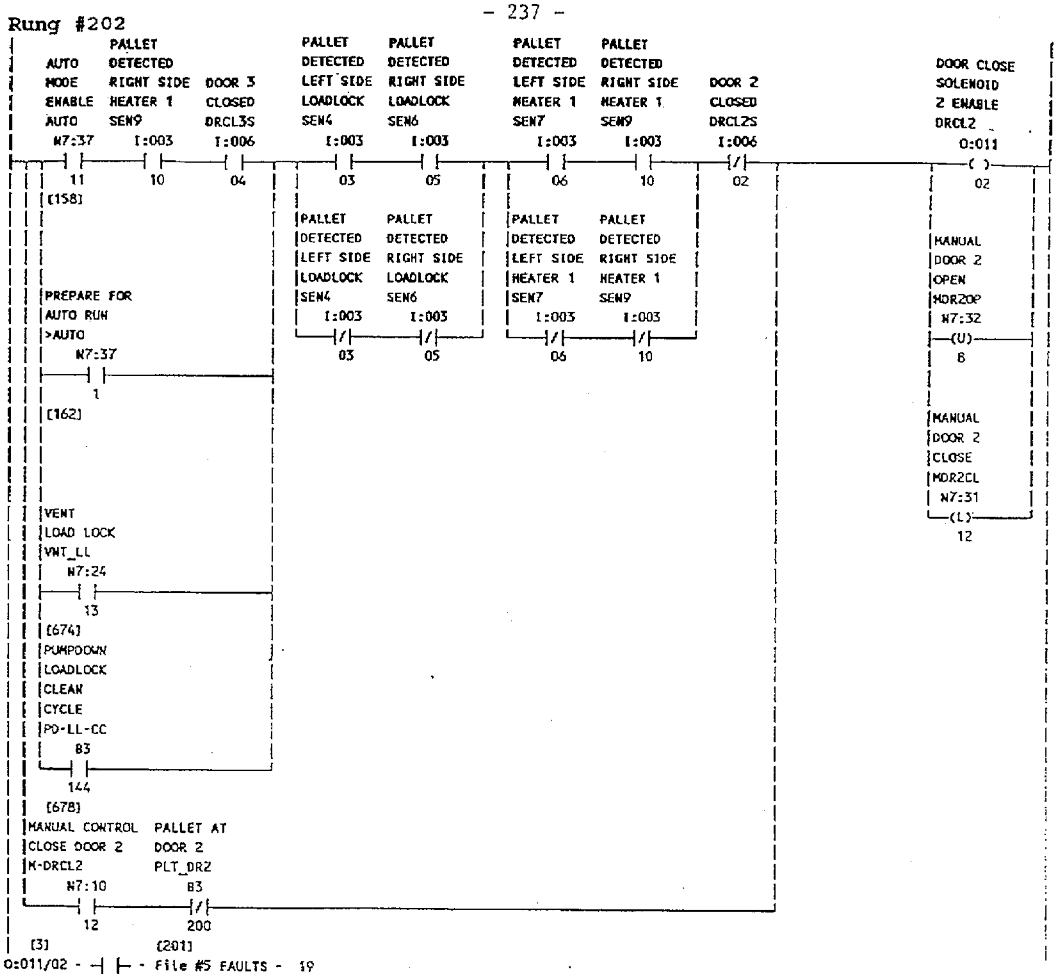
```
O:011/02 - -| |- - File #5 FAULTS -  19
                   File #6 TECH_RUNGS -  2
          -( )- - File #2 MAIN_PRGRM -  202
N7:32/8 - -(L)- - File #2 MAIN_PRGRM -  200
          -(U)- - File #2 MAIN_PRGRM -  202
_F:N7:21LX21 - BTW - File #2 MAIN_PRGRM -  2
N7:31/12 - -(L)- - File #2 MAIN_PRGRM -  202
          -(U)- - File #2 MAIN_PRGRM -  200
_F:N7:21LX21 - BTW - File #2 MAIN_PRGRM -  2
```

```
Rung #203
|DOOR OPEN
|SOLENOID
|3 ENABLE                                                              TEST COUNTER
|DROP3                                                                 TST_CNTR
|  O:011                                                               +-CTU-------+
|---] [--------------------------------------------------------------+-|COUNT UP   |-(CU)-|
|   05                                                                 |COUNTER: C5:0|
|[216]                                                                 |PRESET:     0|-(DN)|
|                                                                      |ACCUM:     98|
|                                                                      +-------------+
C5:0 - CTU - File #2 MAIN_PRGRM - 203
       RES - File #2 MAIN_PRGRM - 212
Rung #204
|        PALLET
|AUTO    DETECTED
|MODE    RIGHT SIDE
|ENABLE  HEATER 1                                                      SENSOR 9
|AUTO    SEN9                                                          LATCH
| N7:37     I:003                                                      SEN9_LTCH
|---] [------] [----------------------------------------------------------B3
|   11        10                                                       --(L)--|
|[158]                                                                   329
B3/329 - ] [ - File #2 MAIN_PRGRM - 206
        -(L)- - File #2 MAIN_PRGRM - 204
        -(U)- - File #2 MAIN_PRGRM - 205
Rung #205
|        PALLET      PALLET
|AUTO    DETECTED    DETECTED
|MODE    RIGHT SIDE  LEFT SIDE
|ENABLE  HEATER 2    DWELL 1                                           SENSOR 9
|AUTO    SEN12       SEN13                                             LATCH
| N7:37     I:003       I:003                                          SEN9_LTCH
|---] [------] [---------] [-------------------------------------------- B3
|   11        13          14                                           --(U)--|
|[158]                                                                   329
B3/329 - ] [ - File #2 MAIN_PRGRM - 206
        -(L)- - File #2 MAIN_PRGRM - 204
        -(U)- - File #2 MAIN_PRGRM - 205
Rung #206
|AUTO
|MODE    SENSOR 9                                                      CHART RECORDER
|ENABLE  LATCH                                                         COUNTER 1
|AUTO    SEN9_LTCH                                                     CHRTCNTR1
| N7:37     B3                                                         +-CTU-------+
|---] [------] [-----------------------------------------------------+-|COUNT UP   |-(CU)-|
|   11       329                                                       |COUNTER: C5:29|
|[158]     [205]                                                       |PRESET:     0|-(DN)|
|                                                                      |ACCUM:     98|
|                                                                      +-------------+
C5:29 - CTU - File #2 MAIN_PRGRM - 206
        RES - File #2 MAIN_PRGRM - 212
C5:29.ACC - NEQ - File #2 MAIN_PRGRM - 210
Rung #207
|        PALLET      PALLET
|AUTO    DETECTED    DETECTED
|MODE    CENTER      RIGHT SIDE
|ENABLE  CARBON      CARBON                                            SENSOR 42
|AUTO    SEN41       SEN42                                             LATCH
| N7:37     I:053       I:053                                          SEN42_LTCH
|---] [------] [---------] [-------------------------------------------- B3
|   11        01          02                                           --(L)--|
|[158]                                                                   330
```

```
B3/330 - -| |- - File #2 MAIN_PRGRM -  209
         -(L)- - File #2 MAIN_PRGRM -  207
         -(U)- - File #2 MAIN_PRGRM -  208
Rung #208
|        PALLET   PALLET
|AUTO    DETECTED DETECTED
|MODE    CENTER   RIGHT SIDE                                          SENSOR 42
|ENABLE  DWELL 6  DWELL 6                                             LATCH
|AUTO    SEN44    SEN45                                               SEN42_LTCH
| N7:37   I:053     I:053                                                B3
|-| |----| |-------| |-------------------------------------------------(U)----|
|  11      04        05                                                 330
|[158]
B3/330 - -| |- - File #2 MAIN_PRGRM -  209
         -(L)- - File #2 MAIN_PRGRM -  207
         -(U)- - File #2 MAIN_PRGRM -  208
Rung #209
|AUTO
|MODE    SENSOR 42                                         CHART RECORDER
|ENABLE  LATCH                                             COUNTER 2
|AUTO    SEN42_LTCH                                        CHRTCNTR2
| N7:37      B3                                            +-CTU----------+
|-| |------| |-------------------------------------------+-|COUNT UP      |-(CU)-|
|  11       330                                            |COUNTER: C5:30|
|[158]    [208]                                            |PRESET:      0|-(DN)
|                                                          |ACCUM:      96|
|                                                          +--------------+
C5:30 - CTU - File #2 MAIN_PRGRM -  209
        RES - File #2 MAIN_PRGRM -  212
C5:30.ACC - NEQ - File #2 MAIN_PRGRM -  210
Rung #210
|                                                             CHART RECORDER
|                                                             1 ON
|CHRTCNTR1                                                    CHRTRCD1
| +-NEQ-------------+                                            O:044
|-|NOT EQUAL (A<>B) |----------------------------------------+----( )-----+-|
| |SOURCE A: C5:29.ACC|                                      |     00      |
| |               98|                                        |             |
| |SOURCE B: C5:30.ACC|                                      |             |
| |               96|                                        |CHART RECORDER|
| +-----------------+                                        |2 ON         |
|C5:29.ACC - [212]                                           |CHRTRCD2     |
|C5:30.ACC - [209]                                           |    O:044    |
|                                                            +----( )-----+
|                                                                  01
Rung #211
|                        PALLET
|AUTO                    DETECTED
|MODE    DOOR 2  DOOR 3  RIGHT SIDE                     HEATER1
|ENABLE  CLOSED  CLOSED  HEATER 1                       TIMER
|AUTO    DRCL2S  DRCL3S  SEN9                           HTR1TMR
| N7:37   I:006   I:006    I:003                        +-TON-----------------+
|-| |----| |-----| |-------| |------------------------+-|TIMER ON DELAY       |-(EN)-|
|  11      02      04        10                         |TIMER:         T4:74 |
|[158]                                                  |BASE (SEC):      1.0 |-(DN)
|                                                       |PRESET:           60 |
|                                                       |ACCUM:             0 |
|                                                       +---------------------+
T4:74.DN - -| |- - File #2 MAIN_PRGRM -  214,226
T4:74.TT - -| |- - File #2 MAIN_PRGRM -  213
```

```
Rung #212
|AUTO
|MODE
|ENABLE                                                                  TEST COUNTER
|AUTO                                                                    TST_CNTR
| N7:37                                                                     C5:0
|-|/|--------------------------------------------------------------------+---[RES]-----+-|
|  11                                                                    |             |
|[158]                                                                   |             |
| C5:0 - CTU - File #2 MAIN_PRGRM - 203                                  |             |
| C5:29 - CTU - File #2 MAIN_PRGRM - 206                                 |CHART RECORDER
| C5:29.ACC - NEQ - File #2 MAIN_PRGRM - 210                             |COUNTER 1    |
| C5:30 - CTU - File #2 MAIN_PRGRM - 209                                 |CHRTCNTR1    |
| C5:30.ACC - NEQ - File #2 MAIN_PRGRM - 210                             |    C5:29    |
|                                                                        +---[RES]-----+
|                                                                        |CHART RECORDER
|                                                                        |COUNTER 2    |
|                                                                        |CHRTCNTR2    |
|                                                                        |    C5:30    |
|                                                                        +---[RES]-----+
Rung #213
|          HEATER
|          SHIELD H2O
|          FLOW
|HEATER 1  GROUP 1                                                         SUBSTRATE
|TIMER     FAULT                                                           HEATER
|HTR1TMR   HSFG1F                                                          SET HIGH
| T4:74     B3                                                             HH1A
|-| |-------|/|-------------------------------------------------------------+--( )--+-|
|  TT      216                                                              |  00   |
|[211]     [S:190]                                                          |       |
| O:046/00 - -|/|- - File #2 MAIN_PRGRM - 153                               |SUBSTRATE
| O:046/01 - -|/|- - File #2 MAIN_PRGRM - 153                               |HEATER |
| O:046/05 - -|/|- - File #2 MAIN_PRGRM - 153                               |SET HIGH
| O:046/06 - -|/|- - File #2 MAIN_PRGRM - 153                               |HH1B   |
|                                                                           | O:046 |
|                                                                           +--( )--+
|                                                                           |  01   |
|                                                                           |SUBSTRATE
|                                                                           |HEATER |
|                                                                           |SET HIGH
|                                                                           |HH3A   |
|                                                                           | O:046 |
|                                                                           +--( )--+
|                                                                           |  05   |
|                                                                           |SUBSTRATE
|                                                                           |HEATER |
|                                                                           |SET HIGH
|                                                                           |HH3B   |
|                                                                           | O:046 |
|                                                                           +--( )--+
|                                                                              06
```

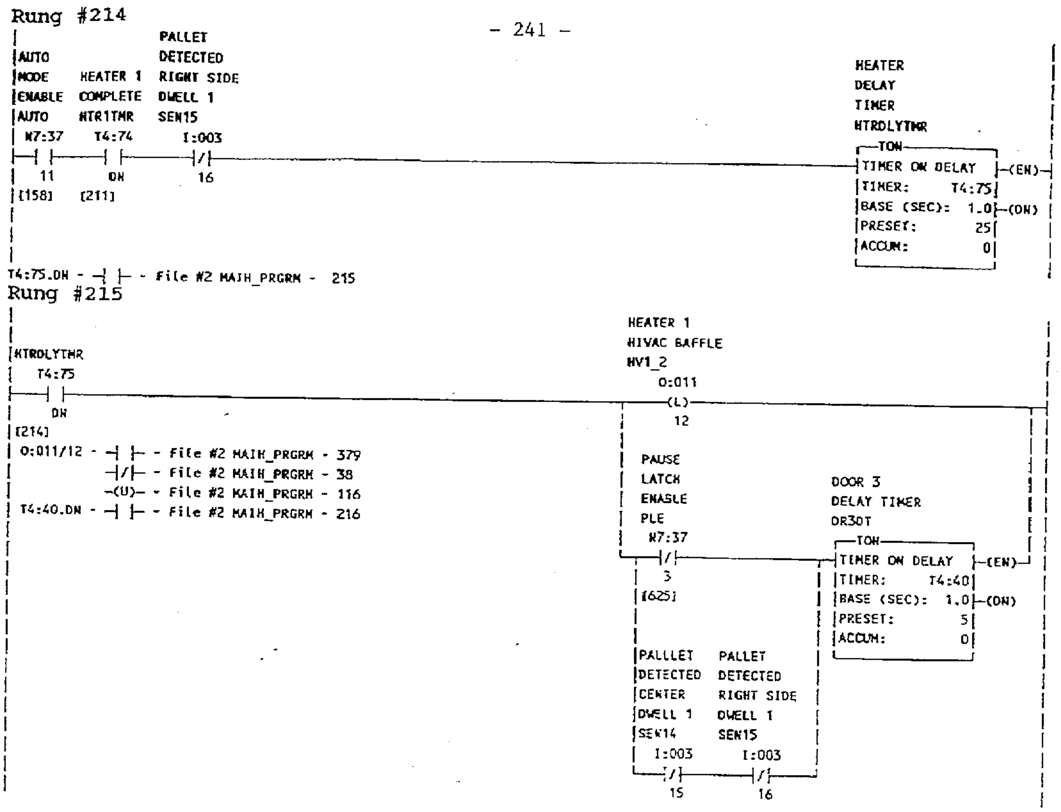
Rung #214
AUTO MODE ENABLE AUTO
N7:37
11
[158]
HEATER 1 COMPLETE HTR1TMR
T4:74
DN
[211]
PALLET DETECTED RIGHT SIDE DWELL 1 SEN15
I:003
16
HEATER DELAY TIMER HTRDLYTMR
TON
TIMER ON DELAY
TIMER: T4:75
BASE (SEC): 1.0
PRESET: 25
ACCUM: 0
(EN)
(DN)
T4:75.DN - ┤ ├ - File #2 MAIN_PRGRM - 215
Rung #215
HTRDLYTMR
T4:75
DN
[214]
O:011/12 - ┤ ├ - File #2 MAIN_PRGRM - 379
┤/├ - File #2 MAIN_PRGRM - 38
-(U)- - File #2 MAIN_PRGRM - 116
T4:40.DN - ┤ ├ - File #2 MAIN_PRGRM - 216
HEATER 1 HIVAC BAFFLE HV1_2
O:011
(L)
12
PAUSE LATCH ENABLE PLE
N7:37
3
[625]
DOOR 3 DELAY TIMER DR3OT
TON
TIMER ON DELAY
TIMER: T4:40
BASE (SEC): 1.0
PRESET: 5
ACCUM: 0
(EN)
(DN)
PALLLET DETECTED CENTER DWELL 1 SEN14
I:003
15
PALLET DETECTED RIGHT SIDE DWELL 1 SEN15
I:003
16

Rung #216
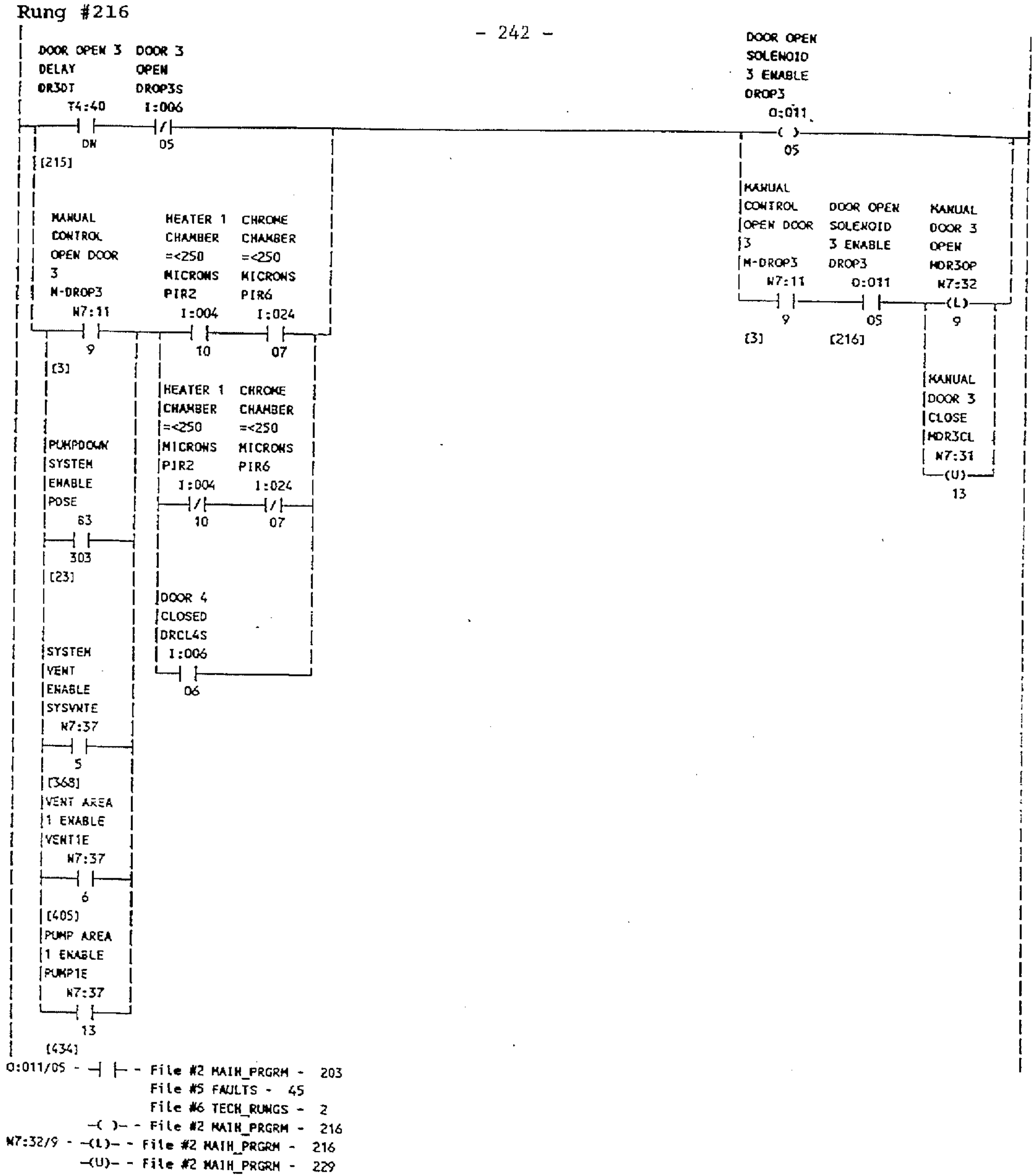
O:011/05 - ┤ ├ - - File #2 MAIN_PRGRM - 203
File #5 FAULTS - 45
File #6 TECH_RUNGS - 2
–( )– - File #2 MAIN_PRGRM - 216
N7:32/9 - –(L)– - File #2 MAIN_PRGRM - 216
–(U)– - File #2 MAIN_PRGRM - 229

```
_F:N7:21[X21 - BTW - File #2 MAIN_PRGRM -
N7:31/13 - -(L)- - File #2 MAIN_PRGRM - 2__ 229
           -(U)- - File #2 MAIN_PRGRM - 216
_F:N7:21[X21 - BTW - File #2 MAIN_PRGRM - 2
Rung #217
| MOTOR 6       MOTOR DRIVE                                    MOTOR 6    |
| FAST PULSE    PULSER                                         INTERRUPT  |
| M6FP          MOP                                            M6I        |
|   T4:206        B3                                            O:012     |
|-+--] [---+------] [-------------------------------------------( )------|
| |   TT   |     299                                             05       |
| |[218]   |    [14]                                                      |
| |MOTOR 6 |                                                              |
| |FAST STOP                                                              |
| |PULSE   |                                                              |
| |M6FSP   |                                                              |
| |  T4:226|                                                              |
| |--] [---|                                                              |
| |   TT   |                                                              |
| |[219]   |                                                              |
| |MOTOR 6 |                                                              |
| |SLOW PULSE                                                             |
| |M6SP    |                                                              |
| |  T4:246|                                                              |
| |--] [---|                                                              |
| |   TT   |                                                              |
| |[220]   |                                                              |
| |MOTOR 6 |                                                              |
| |SLOW STOP                                                              |
| |PULSE   |                                                              |
| |M6SSP   |                                                              |
| |  T4:266|                                                              |
| +--] [---+                                                              |
|     TT                                                                  |
| [221]                                                                   |
```

Rung #218
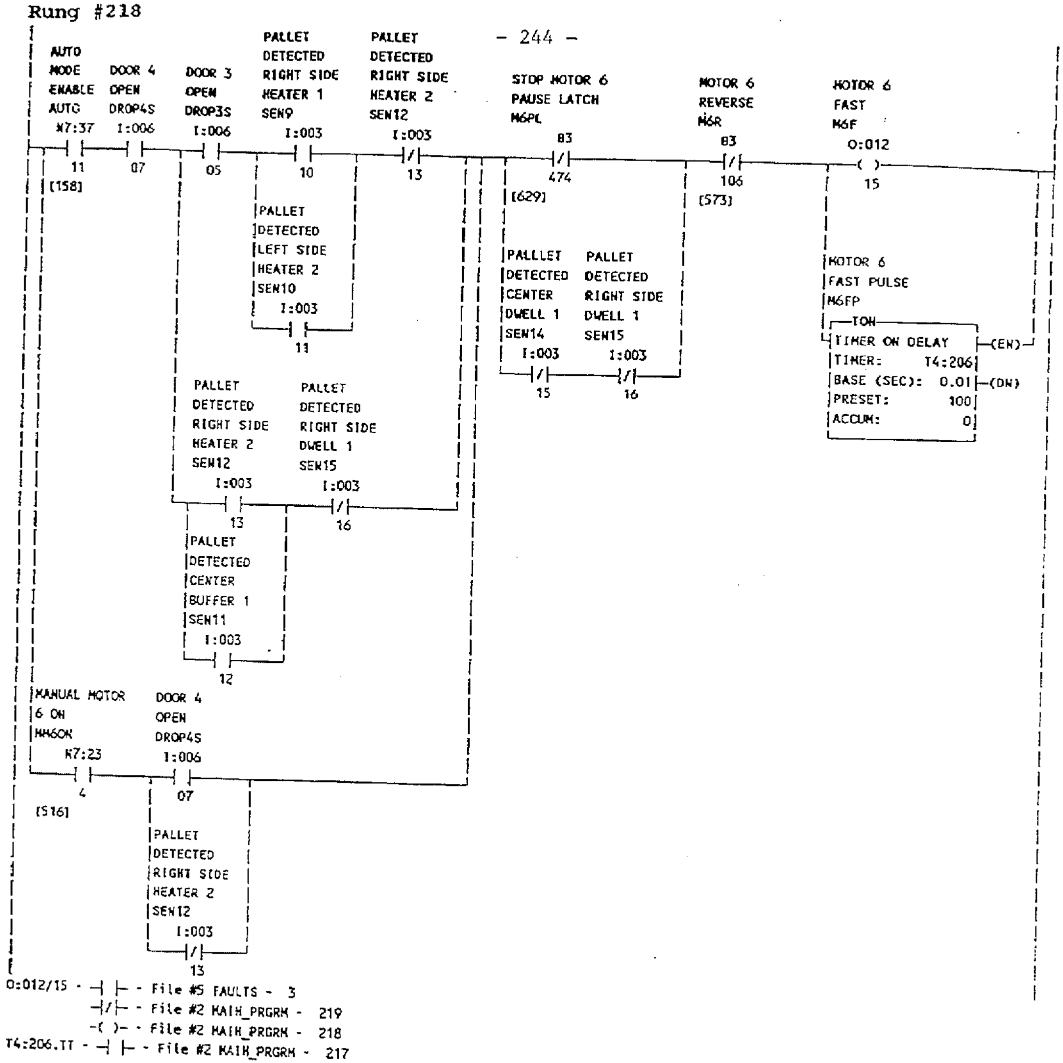
O:012/15 - ┤ ├ - File #5 FAULTS - 3
┤/├ - File #2 MAIN_PRGRM - 219
-( )- - File #2 MAIN_PRGRM - 218
T4:206.TT - ┤ ├ - File #2 MAIN_PRGRM - 217

```
Rung #219
|
|MOTOR 6                                                         MOTOR 6
|FAST                                                            FAST STOP
|M6F                                                             PULSE
| O:012                                                          M6FSP
|                                                                +-TON-----------------+
+--|/|-----------------------------------------------------------+TIMER ON DELAY       +-(EN)-
|  15                                                            |TIMER:        T4:226 |
|[218]                                                           |BASE (SEC):    0.01  +-(DN)
|                                                                |PRESET:        100   |
|                                                                |ACCUM:         102   |
                                                                 +---------------------+
T4:226.TT - -| |- - File #2 MAIN_PRGRM - 217
Rung #220
| MANUAL MOTOR   DOOR 4                                          MOTOR 6
| 6 ON           OPEN                                            SLOW
| MM6ON          DROP4S                                          M6S
|    N7:23       I:006                                            O:013
+-+----| |-------+--| |----+-+-----------------------------------+--( )--+
| |      4       |   07    | |                                   |   05   |
| |[516]         |         | |                                   |        |
| |              |PALLET   | | O:013/05 - -|/|- - File #2 MAIN_PRGRM - 221
| |              |DETECTED | | T4:246.TT - -| |- - File #2 MAIN_PRGRM - 217
| |              |RIGHT SIDE |                                   |
| |              |HEATER 2 | |                                   |MOTOR 6
| |              |SEN12    | |                                   |SLOW PULSE
| |              |  I:003  | |                                   |M6SP
| |              +---|/|---+ |                                   |+-TON--------------+
| |                   13     |                                   ++TIMER ON DELAY    +-(EN)-+
| |                          |                                    |TIMER:     T4:246 |
| |                          |                                    |BASE (SEC): 0.01  +-(DN)
| |                          |                                    |PRESET:     100   |
| |MOTOR 6     DOOR 3        |                                    |ACCUM:      0     |
| |REVERSE     OPEN          |                                    +------------------+
| |M6R         DROP3S        |
| |  B3        I:006         |
| +---| |---+---| |---+------+
|     106   |   05    |
|    [573]  |         |
|           |PALLET   |
|           |DETECTED |
|           |LEFT SIDE|
|           |HEATER 2 |
|           |SEN10    |
|           |  I:003  |
|           +--|/|----+
|               11
Rung #221
|
|MOTOR 6                                                         MOTOR 6
|SLOW                                                            SLOW STOP
|M6S                                                             PULSE
| O:013                                                          M6SSP
|                                                                +-TON-----------------+
+--|/|-----------------------------------------------------------+TIMER ON DELAY       +-(EN)-
|  05                                                            |TIMER:        T4:266 |
|[220]                                                           |BASE (SEC):    0.01  +-(DN)
|                                                                |PRESET:        100   |
|                                                                |ACCUM:         102   |
                                                                 +---------------------+
T4:266.TT - -| |- - File #2 MAIN_PRGRM - 217
```

- 246 -

Rung #222

AUTO MODE ENABLE AUTO N7:37 11 [158]

PALLET DETECTED LEFT SIDE DWELL 1 SEN13 I:003 14

PALLET DETECTED CENTER DWELL 1 SEN14 I:003 15

PALLET DETECTED RIGHT SIDE DWELL 1 SEN15 I:003 16

T4:76.DN - -| |- - File #2 MAIN_PRGRM - 223

HEATER 2 DELAY OFF TIMER HTR2_OFF

TON
TIMER ON DELAY (EN)
TIMER: T4:76
BASE (SEC): 1.0 (DN)
PRESET: 13
ACCUM: 13

Rung #223

HTR2_OFF T4:76 DN [222]

HSFFTMR T4:93 DN [5:199]

AUTO OFF PULSE AUOFPULSE T4:283 TT [155]

PALLET DETECTED RIGHT SIDE DWELL 1 SEN15 I:003 16

HEATER LATCH UNLATCH HTR_UNLTCH B3 [ONS] 411

B3/320 - -| |- - File #2 MAIN_PRGRM - 225, 227
-(L)- - File #2 MAIN_PRGRM - 224

HEATER 2 LATCH HTR2LTCH B3 (U) 320

Rung #224

```
|                                                                     HEATER 2 |
|                                                                     LATCH    |
|HTR2ON_DY                                                            HTR2LTCH |
|  T4:78                                                                B3     |
|---] [-----------------------------------------------------------------(L)----|
|    DN                                                                 320    |
|[226]                                                                         |
B3/320 - -] [- - File #2 MAIN_PRGRM -  225,227
         -(L)- - File #2 MAIN_PRGRM -  224
         -(U)- - File #2 MAIN_PRGRM -  223
```

Rung #225

```
|HEATER 2                                                                      |
|LATCH                                              HEATER 2 DRIVE             |
|HTR2LTCH                                           FAULT TIMER                |
|  B3                                               H2F                        |
|---] [---------------------------------------------+-TON---------------+      |
|   320                                             |TIMER ON DELAY     |-(EN)-|
|[224]                                              |TIMER:        T4:6 |      |
|                                                   |BASE (SEC):    1.0 |-(DN) |
|                                                   |PRESET:         70 |      |
|                                                   |ACCUM:           0 |      |
|                                                   +-------------------+      |
T4:6.DN - -]/[- - File #2 MAIN_PRGRM -  227
```

Rung #226

```
|                    HEATER                                                    |
|                    SHIELD H2O                                                |
|AUTO                FLOW                                                      |
|MODE     HEATER 1   GROUP 2                                                   |
|ENABLE   COMPLETE   FAULT                         heater 2 on                 |
|AUTO     HTR1TMR    HSFG2F                        delay                       |
| N7:37    T4:74       B3                          HTR2ON_DY                   |
|---] [------] [-------]/[-------------------------+-TON---------------+       |
|   11       DN        217                         |TIMER ON DELAY     |-(EN)- |
|[158]     [211]     [5:191]                       |TIMER:        T4:78|       |
|                                                  |BASE (SEC):    1.0 |-(DN)  |
|                                                  |PRESET:         26 |       |
|                                                  |ACCUM:           0 |       |
|                                                  +-------------------+       |
T4:78.DN - -] [- - File #2 MAIN_PRGRM -  224
```

Rung #227

```
HEATER 2   HEATER 2 DRIVE                                              SUBSTRATE
LATCH      FAULT TIMER                                                 HEATER
HTR2LTCH   H2F                                                         SET HIGH
  B3         T4:6                                                      HH2A
                                                                        O:046
--] [--------]/[---------------------------------------------------+---( )---+
  320        DN                                                     |   02    |
[224]      [225]                                                    |         |
O:046/02 - ]/[ - File #2 MAIN_PRGRM - 153                           |SUBSTRATE|
O:046/03 - ]/[ - File #2 MAIN_PRGRM - 153                           |HEATER   |
O:046/04 - ]/[ - File #2 MAIN_PRGRM - 153                           |SET HIGH |
O:046/07 - ]/[ - File #2 MAIN_PRGRM - 153                           |HH2B     |
                                                                    |  O:046  |
                                                                    +---( )---+
                                                                    |   03    |
                                                                    |SUBSTRATE|
                                                                    |HEATER   |
                                                                    |SET HIGH |
                                                                    |HH2C     |
                                                                    |  O:046  |
                                                                    +---( )---+
                                                                    |   04    |
                                                                    |SUBSTRATE|
                                                                    |HEATER   |
                                                                    |SET HIGH |
                                                                    |HH3C     |
                                                                    |  O:046  |
                                                                    +---( )---+
                                                                        07
```

Rung #228

```
 PALLET        PALLET       PALLET
 DETECTED      DETECTED     DETECTED
 CENTER        RIGHT SIDE   LEFT SIDE
 HEATER 1      HEATER 1     HEATER 2                              PALLET AT
 SEN8          SEN9         SEN10                                 DOOR 3
  I:003         I:003        I:003                                PLT_DR3
                                                                    B3
+--] [--+------] [----------] [---------------------------------------( )---
|   07  |       10           11                                     246
|PALLET |  B3/246 - ]/[ - File #2 MAIN_PRGRM - 229
|DETECTED|
|RIGHT SIDE|
|HEATER 2|
|SEN12  |
| I:003 |
+--] [--+
    13
```

Rung #229
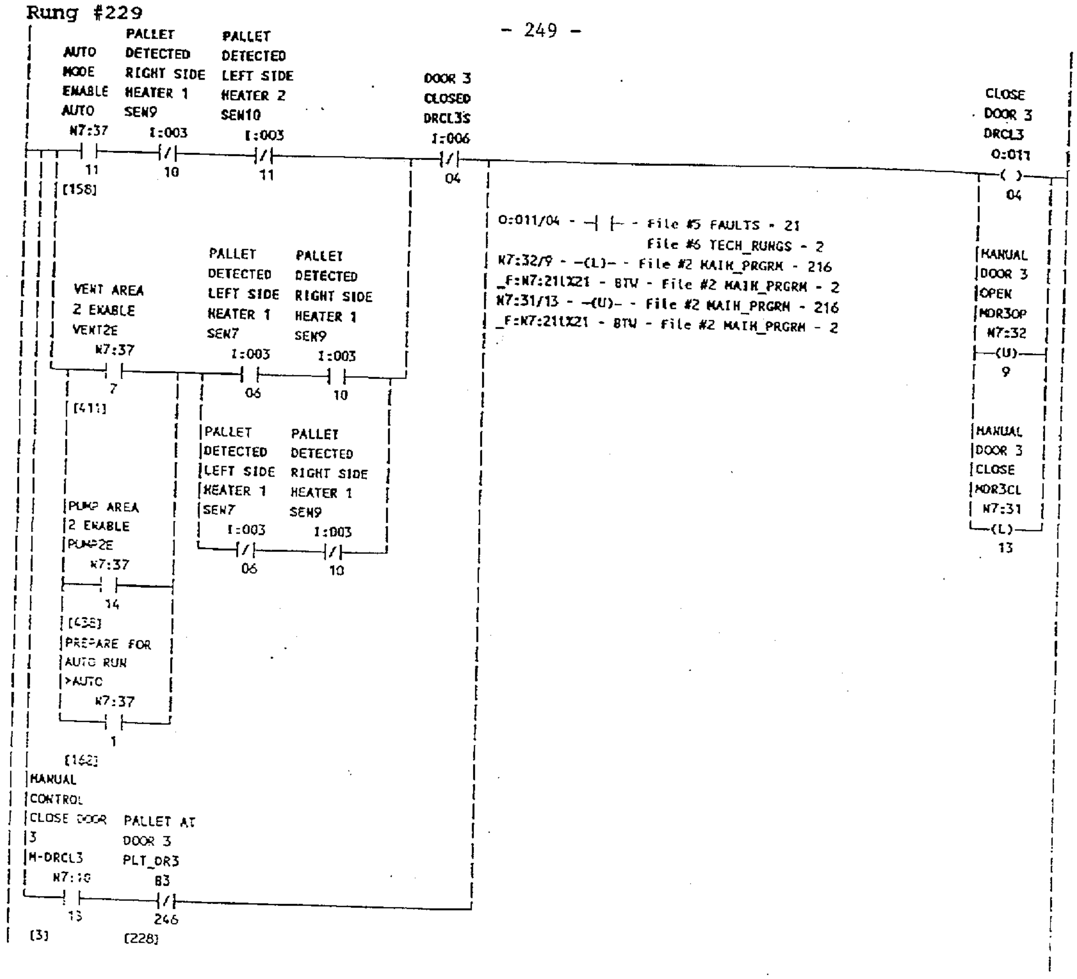

- 250 -
Rung #230
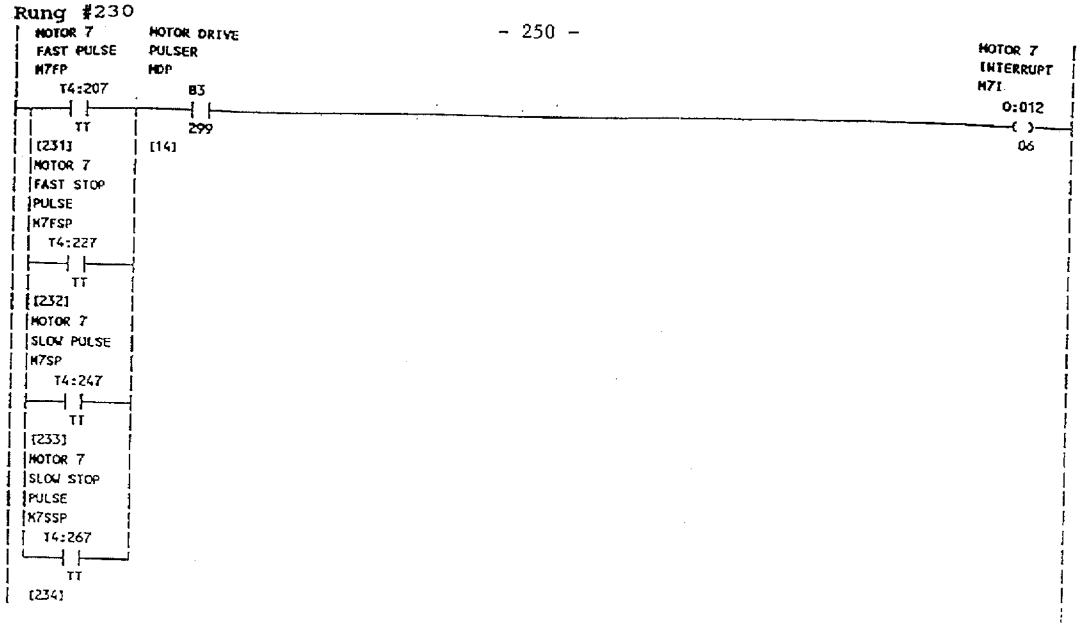

- 251 -
Rung #231
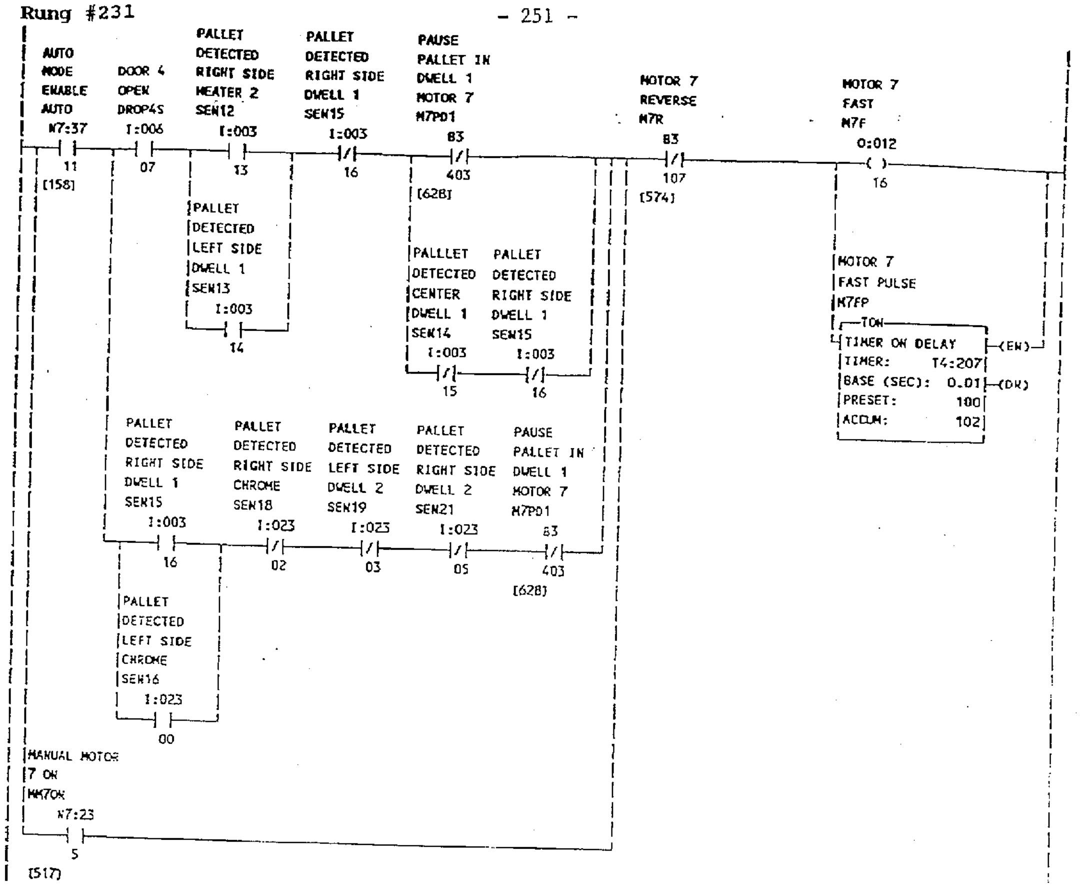
O:012/16 - -| |- - File #5 FAULTS - 3
-|/|- - File #2 MAIN_PRGRM - 232
-( )- - File #2 MAIN_PRGRM - 231
T4:207.TT - -| |- - File #2 MAIN_PRGRM - 230
Rung #232
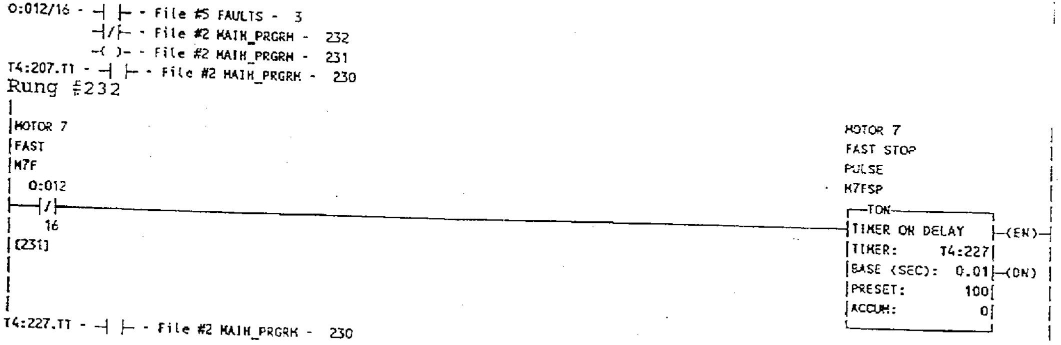
T4:227.TT - -| |- - File #2 MAIN_PRGRM - 230

Rung #233 - 252 -
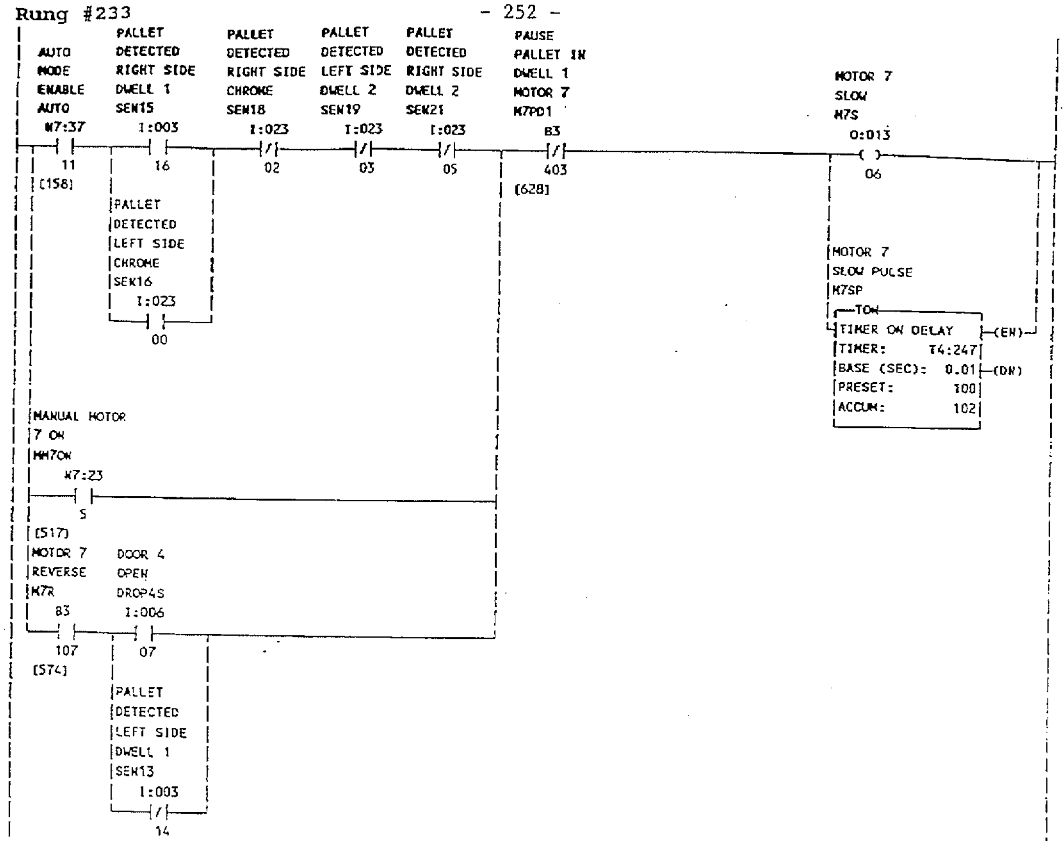
O:013/06 - -| |- - File #2 MAIN_PRGRM - 235,238,249
-|/|- - File #2 MAIN_PRGRM - 234
-( )- - File #2 MAIN_PRGRM - 233
T4:247.TT - -| |- - File #2 MAIN_PRGRM - 230
Rung #234
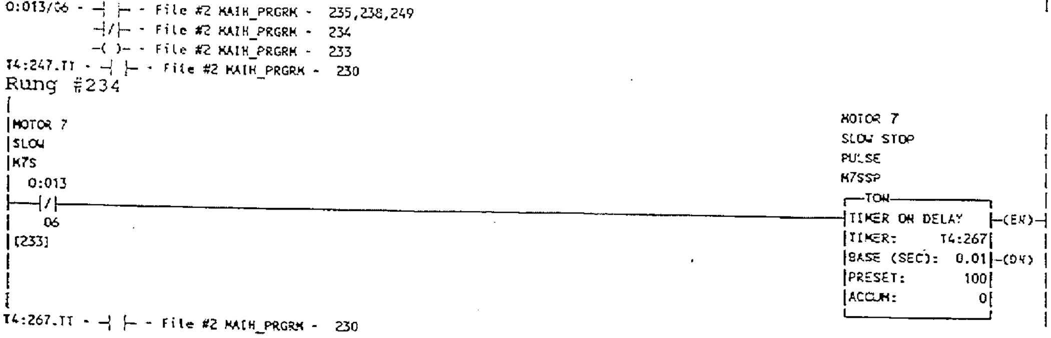
T4:267.TT - -| |- - File #2 MAIN_PRGRM - 230

- 253 -

Rung #235

```
         PALLLET   PALLET     PALLET
AUTO     DETECTED  DETECTED   DETECTED                                      CHROME HI
MODE     MOTOR 7   CENTER     RIGHT SIDE  LEFT SIDE                         POWER
ENABLE   SLOW      DWELL 1    DWELL 1     CHROME    CHROME WATER OK         SECT 1 & 2
AUTO     M7S       SEN14      SEN15       SEN16     CHR-OK                  LATCHED
N7:37    O:013     I:003      I:003       I:023     B3                      HIPRCHR1,2-LAT
                                                                            B3
--] [----] [-------] [-------] [-------]/[--------] [------------------------(L)--
  11       06        15        16         00        277                     269
[158]    [233]                                      [725]
B3/269 - -| |- - File #2 MAIN_PRGRM - 236
         -(L)- - File #2 MAIN_PRGRM - 235
         -(U)- - File #2 MAIN_PRGRM - 237
```

Rung #236

```
CHROME HI                                                                   CHROME
POWER                                                                       HI POWER
SECT 1 & 2                                                                  SUPPLY 1
LATCHED           CHROME WATER OK                                           OUTPUT
HIPRCHR1,2-LAT    CHR-OK                                                    CHRPS1
    B3                B3                                                    O:033
----] [-----------] [--------------------------------------------------------( )--
    269               277                                                   10
[235]             [725]
                                                                            CHROME
O:033/10 - -| |- - File #5 TECH_RUNGS - 6                                   HI POWER
B3/831 - -| |- - File #2 MAIN_PRGRM - 620, 622                              SUPPLY 2
                                                                            OUTPUT
                                                                            CHRPS2
                                                                            O:033
                                                                            ( )
                                                                            11
                                                                            HIGH POWER
                                                                            CHROME 1 & 2
                                                                            TO THE FIX
                                                                            HIPRCH1,2
                                                                            B3
                                                                            ( )
                                                                            831
```

Rung #237

```
         PALLET     PALLET      PALLET
AUTO     DETECTED   DETECTED    DETECTED                                    CHROME HI
MODE     CENTER     RIGHT SIDE  LEFT SIDE                                   POWER
ENABLE   CHROME     CHROME      DWELL 2                                     SECT 1 & 2
AUTO     SEN17      SEN18       SEN19                                       LATCHED
N7:37    I:023      I:023       I:023                                       HIPRCHR1,2-LAT
                                                                            B3
--] [-----]/[-------] [--------] [-------------------------------------------(U)--
  11       01         02         03                                         269
[155]
                                         B3/269 - -| |- - File #2 MAIN_PRGRM - 236
                                                  -(L)- - File #2 MAIN_PRGRM - 235
CHROME WATER OK
CHR-OK
    B3
----]/[-----
    277
[725]
AUTO OFF
PULSE
AUOFPULSE
T4:283
----] [-----
    TT
[155]
```

Rung #238

```
                                                                                          TURN ON CHROME
                                  PALLET     PALLET                                       HI POWER TO
AUTO                              DETECTED   DETECTED                                     SECT 3 & 4
MODE      MOTOR 7   MOTOR 8      RIGHT SIDE LEFT SIDE                                     TIMER DELAY
ENABLE    SLOW      FAST         DWELL 1    CHROME     CHROME WATER OK                   LATCH
AUTO      N7S       N8F          SEN15      SEN16      CHR-OK                            HIPRCHR-3,4-LAT
N7:37     O:013     O:012        I:003      I:023      B3                                 B3
--] [------] [------] [------------] [--------] [---------] [-------------------------------(L)--
  11        06        17           16         00         277                               263
[158]     [233]     [249]                              [725]
B3/263 - ] [ - - File #2 MAIN_PRGRM -  239
         -(L)- - File #2 MAIN_PRGRM -  238
         -(U)- - File #2 MAIN_PRGRM -  240
```

Rung #239

```
TURN ON CHROME                                                     READY TO TURN
HI POWER TO                                                        HI POWER TO
SECT 3 & 4                                                         CHROME SECT 3
TIMER DELAY                                                        & 4 WHEN PALLET
LATCH                                                              @ LEFT SIDE CHR
HIPRCHR-3,4-LAT                                                    HIPRCHR-3,4-DLY
      B3                                                           +-TON-----------+
------] [----------------------------------------------------------+TIMER ON DELAY +-(EN)-
     263                                                           |TIMER:   T4:300|
[238]                                                              |BASE (SEC): 0.01+-(DN)
                                                                   |PRESET:     300|
                                                                   |ACCUM:        0|
                                                                   +---------------+
T4:300.DN - ] [ - File #2 MAIN_PRGRM -  240,241
```

Rung #240

```
                                                                        TURN ON CHROME
  READY TO TURN                                                         HI POWER TO
  HI POWER TO                                                           SECT 3 & 4
  CHROME SECT 3                                                         TIMER DELAY
  & 4                                                                   LATCH
  HIPRCHR-3,4-DLY                                                       HIPRCHR-3,4-LAT
       T4:300                                                             B3
--+------] [---------+----------------------------------------------------(U)--
  |        DN        |                                                    263
  | [239]            |
  |                  | B3/263 - ] [ - - File #2 MAIN_PRGRM - 239
  |                  |          -(L)- - File #2 MAIN_PRGRM - 238
  | CHROME WATER OK  |
  | CHR-OK           |
  |       B3         |
  +------]/[---------+
  |      277         |
  | [725]            |
  | AUTO OFF         |
  | PULSE            |
  | AUOFPULSE        |
  |  T4:283          |
  +------] [---------+
         TT
  [155]
```

```
Rung #241
|READY TO TURN                                                      HI POWER TO  |
|HI POWER TO                                                        CHROME SECT  |
|CHROME SECT 3                                                      3 & 4        |
|& 4                                                                LATCHED      |
|HIPRCHR-3,4-DLY                                                    HIPRCHR3,4-LAT|
|     T4:300                                                          B3         |
|-----] [---------------------------------------------------------------(L)------|
|      DN                                                             266        |
|[239]
B3/266 - ] [ - File #2 MAIN_PRGRM - 242
        -(L)- - File #2 MAIN_PRGRM - 241
        -(U)- - File #2 MAIN_PRGRM - 243
Rung #242
|HI POWER TO                                                        CHROME       |
|CHROME SECT                                                        HI POWER     |
|3 & 4                                                              SUPPLY 3     |
|LATCHED         CHROME WATER OK                                    OUTPUT       |
|HIPRCHR3,4-LAT  CHR-OK                                             CHRPS3       |
|     B3              B3                                              O:033      |
|-----] [-------------] [--------------------------------------------+---( )---+-|
|     266             277                                            |   12    | |
|[241]             [725]                                             |         | |
|                                                                    |CHROME   | |
| O:033/12 - ] [ - File #6 TECH_RUNGS - 6                            |HI POWER | |
| B3/832 - ] [ - File #2 MAIN_PRGRM - 620, 622                       |SUPPLY 4 | |
|                                                                    |OUTPUT   | |
|                                                                    |CHRPS4   | |
|                                                                    |  O:033  | |
|                                                                    +---( )---+ |
|                                                                    |   13    | |
|                                                                    |HIGH POWER |
|                                                                    |CHROME 3 & 4|
|                                                                    |TO THE FIX | |
|                                                                    |HIPRCHR3,4 | |
|                                                                    |   B3    | |
|                                                                    +---( )---+ |
|                                                                       832      |
Rung #243
|       PALLET    PALLET
| AUTO  DETECTED  DETECTED                                          HI POWER TO  |
| MODE  CENTER    RIGHT SIDE                                        CHROME SECT  |
| ENABLE DWELL 2  DWELL 2                                           3 & 4        |
| AUTO  SEN20     SEN21                                             LATCHED      |
| N7:37   I:023     I:023                                           HIPRCHR3,4-LAT|
|-+-] [---+-] [-------] [----+                                        B3         |
| |  11      04        05    +--------------------------------------(U)--------|
| |[158]                     |                                      266        |
| |                          | B3/266 - ] [ - File #2 MAIN_PRGRM - 242           |
| |                          |         -(L)- - File #2 MAIN_PRGRM - 241          |
| |CHROME WATER OK           |                                                   |
| |CHR-OK                    |                                                   |
| |     B3                   |                                                   |
| +----]/[-------------------+                                                   |
| |    277                   |                                                   |
| |[725]                     |                                                   |
| |AUTO OFF                  |                                                   |
| |PULSE                     |                                                   |
| |AUOFPULSE                 |                                                   |
| |  T4:283                  |                                                   |
| +---] [--------------------+                                                   |
|      TT                                                                        |
| [155]                                                                          |
```

Rung #244

```
|PALLET       PALLET
|DETECTED     DETECTED
|LEFT SIDE    RIGHT SIDE
|HEATER 2     HEATER 2                                                       |
|SEN10        SEN12                                              CHROME TIMER |
|   I:003       I:003                                            CHR_TMR      |
|---] [-------] [------------------------------------------------  T4:71      |
|    11          13                                              ---(RES)-----|
T4:71 - RTO - File #2 MAIN_PRGRM -  246
        RES - File #2 MAIN_PRGRM -  244
```

Rung #245

```
|PALLET       PALLLET      PALLET
|DETECTED     DETECTED     DETECTED
|LEFT SIDE    CENTER       RIGHT SIDE                                        |
|DWELL 1      DWELL 1      DWELL 1                                           |
|SEN13        SEN14        SEN15                                CHROME COUNTER |
|   I:003       I:003        I:003                              CHR_CNT        |
|---] [-------] [-------] [------------------------------------    B3          |
|    14          15          16                                 ---(L)---------|
B3/90 - ] [ - File #2 MAIN_PRGRM -  246                             90          |
       -(L)- - File #2 MAIN_PRGRM -  245
       -(U)- - File #2 MAIN_PRGRM -  247
```

Rung #246

```
|CHROME COUNTER                                      CHRONE TIMER
|CHR_CNT                                             CHR_TMR
|     B3                                             +-RTO-----------------+
|---] [-------------------------------------------- -|RETENTIVE TIMER ON  |-(EN)-|
|    90                                              |TIMER:        T4:71 |
|[245]                                               |BASE (SEC):     1.0 |-(DN)
|                                                    |PRESET:        1000 |
|                                                    |ACCUM:            2 |
|                                                    +---------------------+
T4:71 - RTO - File #2 MAIN_PRGRM -  246
        RES - File #2 MAIN_PRGRM -  244
```

Rung #247

```
|PALLET       PALLET       PALLET
|DETECTED     DETECTED     DETECTED                                          |
|LEFT SIDE    CENTER       RIGHT SIDE                                        |
|DWELL 2      DWELL 2      DWELL 2                                           |
|SEN19        SEN20        SEN21                                CHROME COUNTER |
|   I:023       I:023        I:023                              CHR_CNT        |
|---] [-------] [-------] [------------------------------------    B3          |
|    03          04          05                                 ---(U)---------|
B3/90 - ] [ - File #2 MAIN_PRGRM -  246                             90          |
       -(L)- - File #2 MAIN_PRGRM -  245
       -(U)- - File #2 MAIN_PRGRM -  247
```

Rung #248
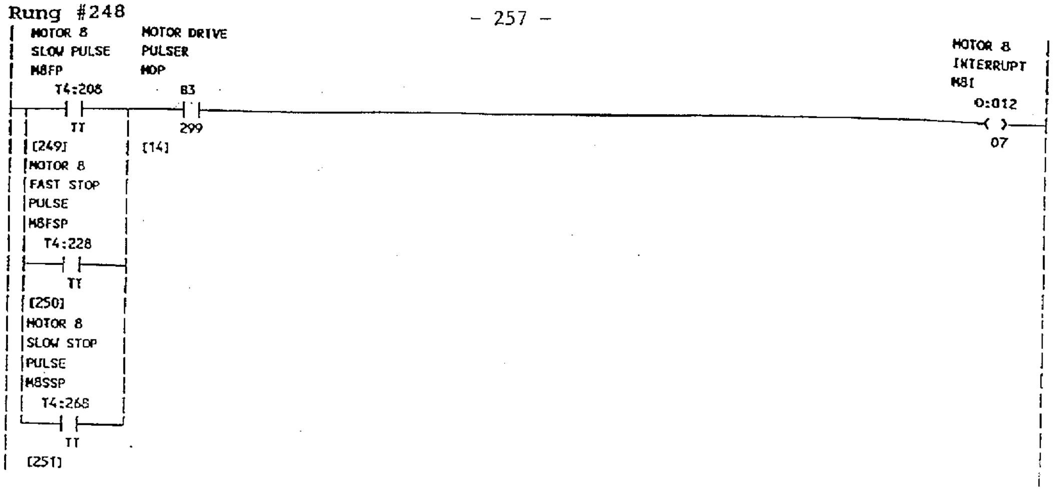

Rung #249
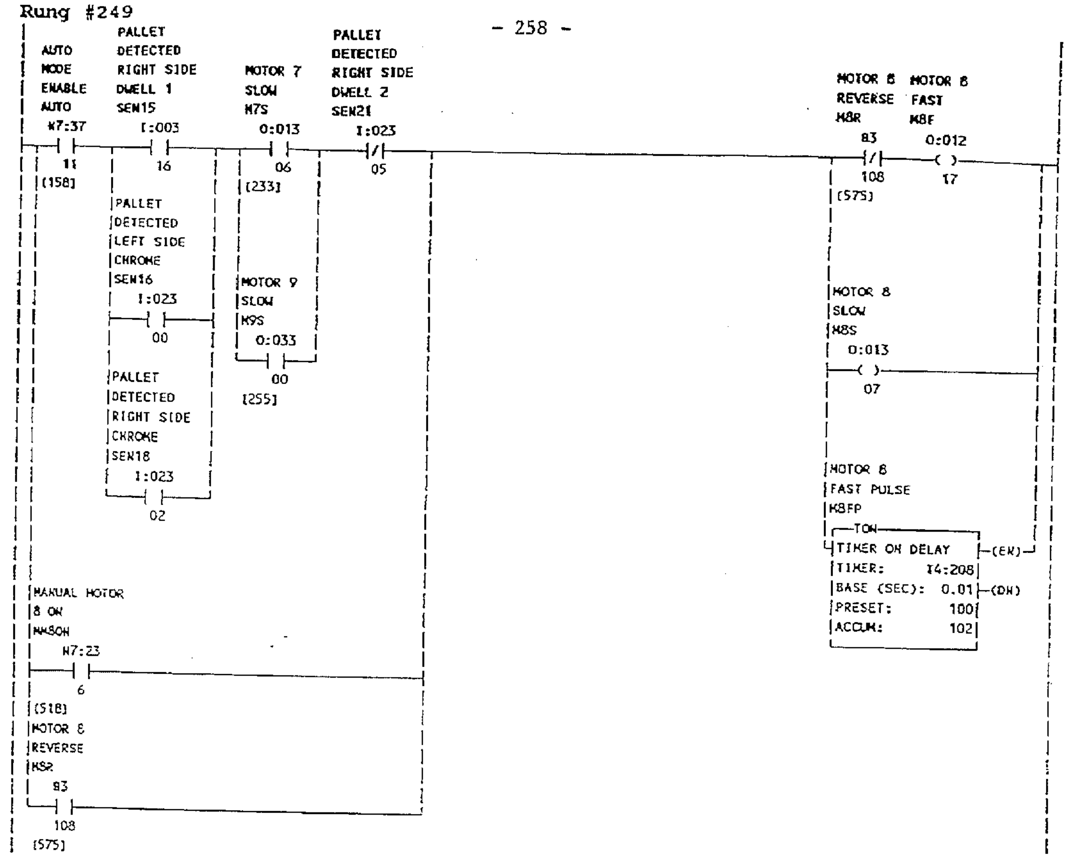
0:012/17 - ┤ ├ - File #2 MAIN_PRGRM - 238
File #5 FAULTS - 4
┤/├ - File #2 MAIN_PRGRM - 250
–( )– - File #2 MAIN_PRGRM - 249
0:013/07 - ┤/├ - File #2 MAIN_PRGRM - 251
–( )– - File #2 MAIN_PRGRM - 249
T4:208.TT - ┤ ├ - File #2 MAIN_PRGRM - 248
Rung #250
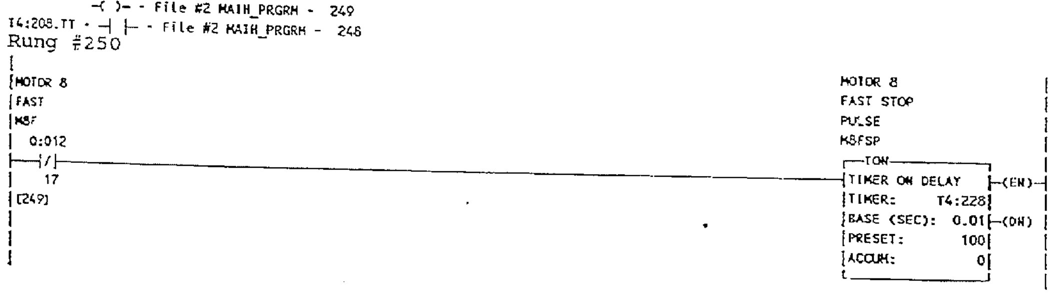

```
T4:228.TT - -| |- - File #2 MAIN_PRGRM - 248
Rung #251
|MOTOR 8                                                    MOTOR 8
|SLOW                                                       SLOW STOP
|M8S                                                        PULSE
|  O:013                                                    M8SSP
|--|/|------------------------------------------------------+-TON-----------------+
|   07                                                      |TIMER ON DELAY       |-(EN)-
|[249]                                                      |TIMER:       T4:268  |
|                                                           |BASE (SEC):    0.01  |-(DN)
|                                                           |PRESET:         100  |
|                                                           |ACCUM:            0  |
|                                                           +---------------------+
T4:268.TT - -| |- - File #2 MAIN_PRGRM - 248
Rung #252
| MOTOR 9        MOTOR DRIVE
| FAST PULSE     PULSER                                          MOTOR 9
| M9FP           MDP                                             INTERRUPT
|    T4:209        B3                                            M9I
|-+---| |---+-----| |----------------------------------------------O:032
| |    TT   |     299                                             ---( )---
| |[253]    |  [14]                                                  00
| |MOTOR 9  |
| |FAST STOP|
| |PULSE    |
| |M9FSP    |
| |  T4:229 |
| |---| |---|
| |    TT   |
| |[254]    |
| |MOTOR 9  |
| |SLOW PULSE
| |M9SP     |
| |  T4:249 |
| |---| |---|
| |    TT   |
| |[255]    |
| |MOTOR 9  |
| |SLOW STOP|
| |PULSE    |
| |M9SSP    |
| |  T4:269 |
| +---| |---+
|      TT
|  [256]
```

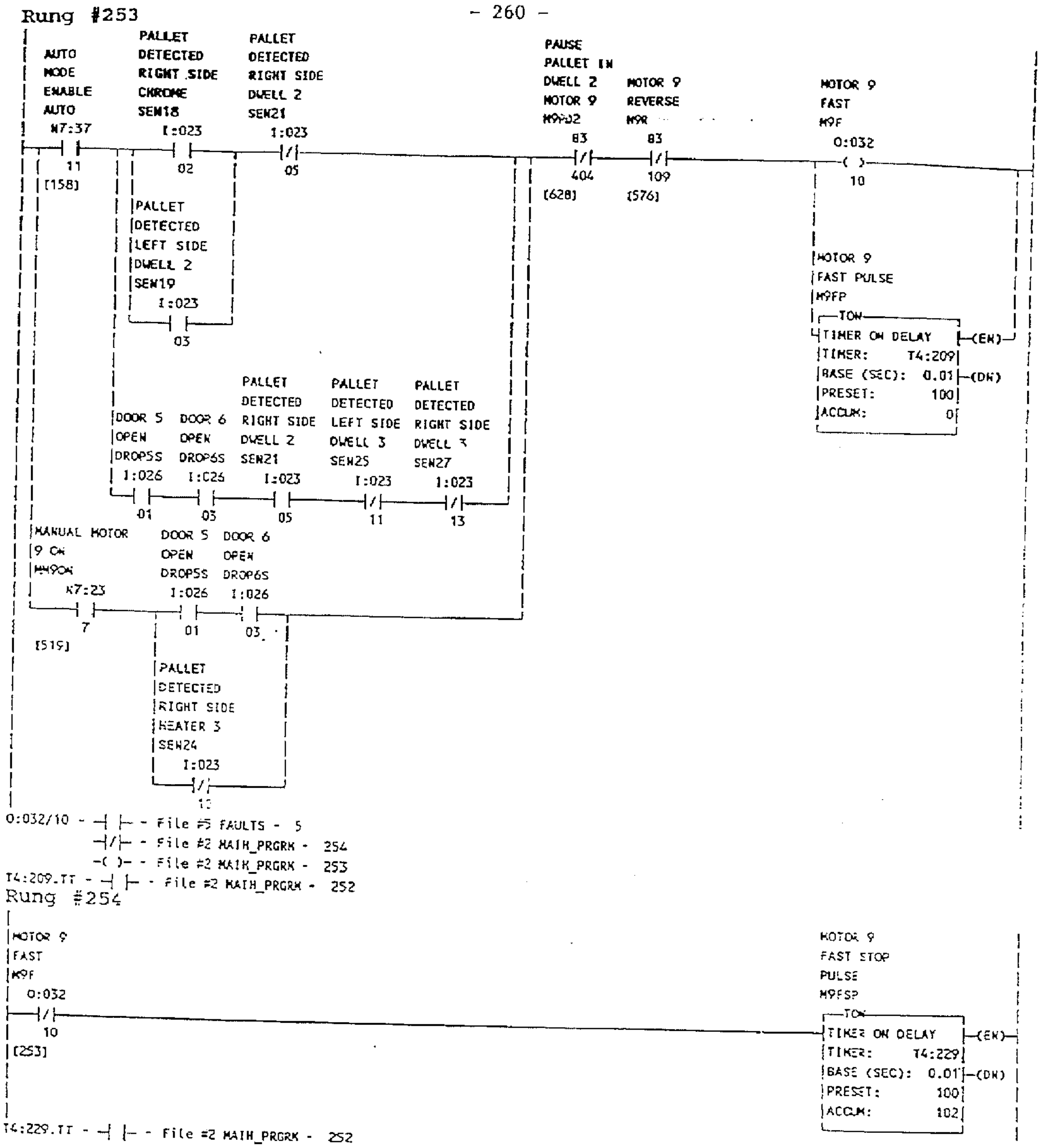
Rung #253
AUTO MODE ENABLE AUTO N7:37 11 [158]
PALLET DETECTED RIGHT SIDE CHROME SEN18 I:023 02
PALLET DETECTED RIGHT SIDE DWELL 2 SEN21 I:023 05
PALLET DETECTED LEFT SIDE DWELL 2 SEN19 I:023 03
PAUSE PALLET IN DWELL 2 MOTOR 9 N9PD2 B3 404 [628]
MOTOR 9 REVERSE N9R B3 109 [576]
MOTOR 9 FAST N9F O:032 10
MOTOR 9 FAST PULSE N9FP
TON TIMER ON DELAY TIMER: T4:209 BASE (SEC): 0.01 PRESET: 100 ACCUM: 0 (EN) (DN)
DOOR 5 OPEN DROP5S I:026 01
DOOR 6 OPEN DROP6S I:026 03
PALLET DETECTED RIGHT SIDE DWELL 2 SEN21 I:023 05
PALLET DETECTED LEFT SIDE DWELL 3 SEN25 I:023 11
PALLET DETECTED RIGHT SIDE DWELL 3 SEN27 I:023 13
MANUAL MOTOR 9 ON MM9ON N7:23 7 [519]
DOOR 5 OPEN DROP5S I:026 01
DOOR 6 OPEN DROP6S I:026 03
PALLET DETECTED RIGHT SIDE HEATER 3 SEN24 I:023 13
O:032/10 - ] [ - - File #5 FAULTS - 5
]/[ - - File #2 MAIN_PRGRM - 254
-( )- - File #2 MAIN_PRGRM - 253
T4:209.TT - ] [ - - File #2 MAIN_PRGRM - 252
Rung #254
MOTOR 9 FAST N9F O:032 10 [253]
MOTOR 9 FAST STOP PULSE N9FSP
TON TIMER ON DELAY TIMER: T4:229 BASE (SEC): 0.01 PRESET: 100 ACCUM: 102 (EN) (DN)
T4:229.TT - ] [ - - File #2 MAIN_PRGRM - 252

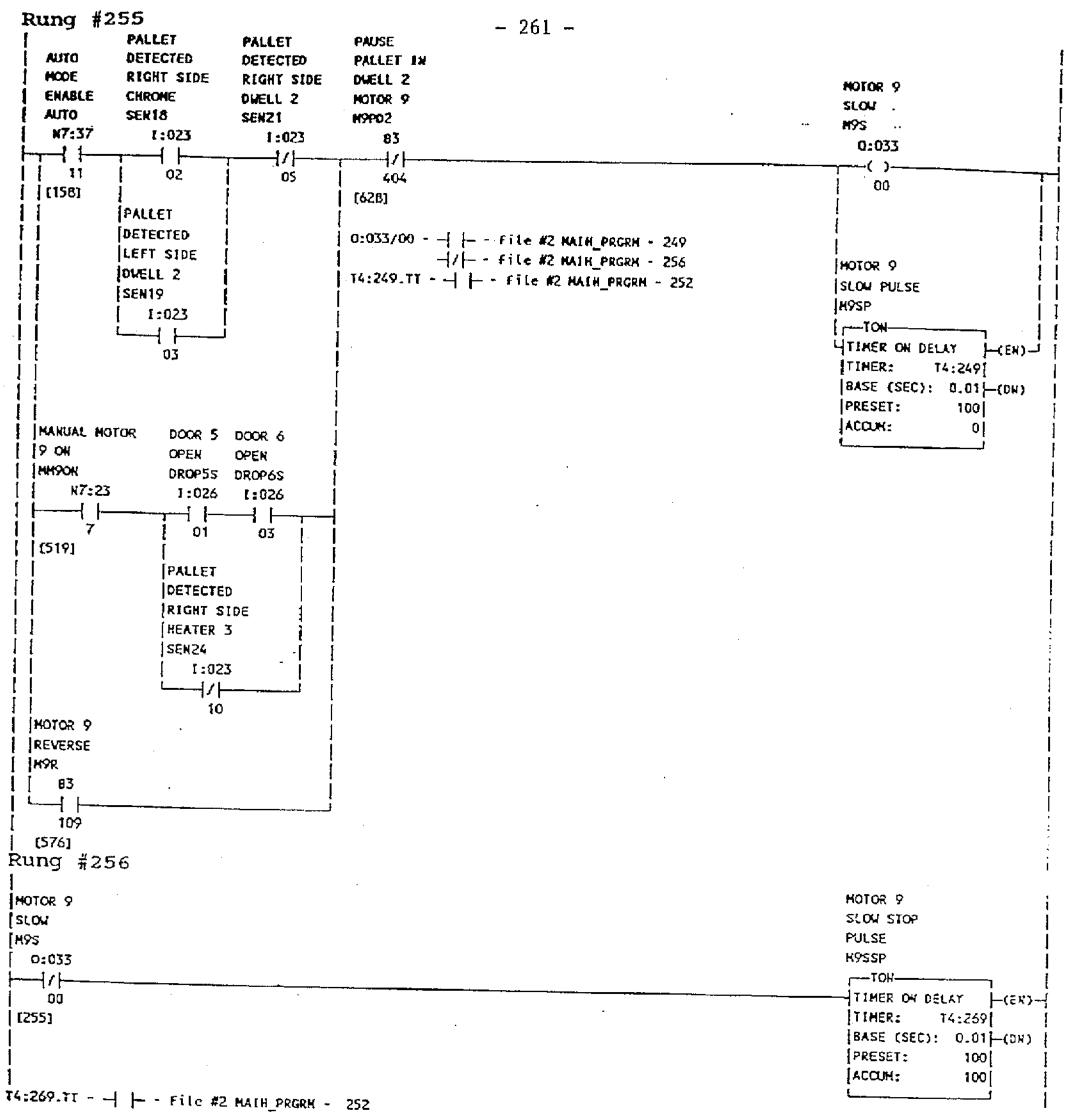
Rung #255
AUTO MODE ENABLE AUTO
N7:37
11
[158]
PALLET DETECTED RIGHT SIDE CHROME SEN18
I:023
02
PALLET DETECTED LEFT SIDE DWELL 2 SEN19
I:023
03
PALLET DETECTED RIGHT SIDE DWELL 2 SEN21
I:023
05
PAUSE PALLET IN DWELL 2 MOTOR 9 M9PD2
B3
404
[628]
O:033/00 - ┤ ├ - - File #2 MAIN_PRGRM - 249
┤/├ - - File #2 MAIN_PRGRM - 256
T4:249.TT - ┤ ├ - - File #2 MAIN_PRGRM - 252
MOTOR 9 SLOW M9S
O:033
00
MOTOR 9 SLOW PULSE M9SP
TON
TIMER ON DELAY
TIMER: T4:249
BASE (SEC): 0.01
PRESET: 100
ACCUM: 0
(EN)
(DN)
MANUAL MOTOR 9 ON MM9ON
N7:23
7
[519]
DOOR 5 OPEN DROP5S
I:026
01
DOOR 6 OPEN DROP6S
I:026
03
PALLET DETECTED RIGHT SIDE HEATER 3 SEN24
I:023
10
MOTOR 9 REVERSE M9R
B3
109
[576]
Rung #256
MOTOR 9 SLOW M9S
O:033
00
[255]
MOTOR 9 SLOW STOP PULSE M9SSP
TON
TIMER ON DELAY
TIMER: T4:269
BASE (SEC): 0.01
PRESET: 100
ACCUM: 100
(EN)
(DN)
T4:269.TT - ┤ ├ - - File #2 MAIN_PRGRM - 252

Rung #257
- 262 -
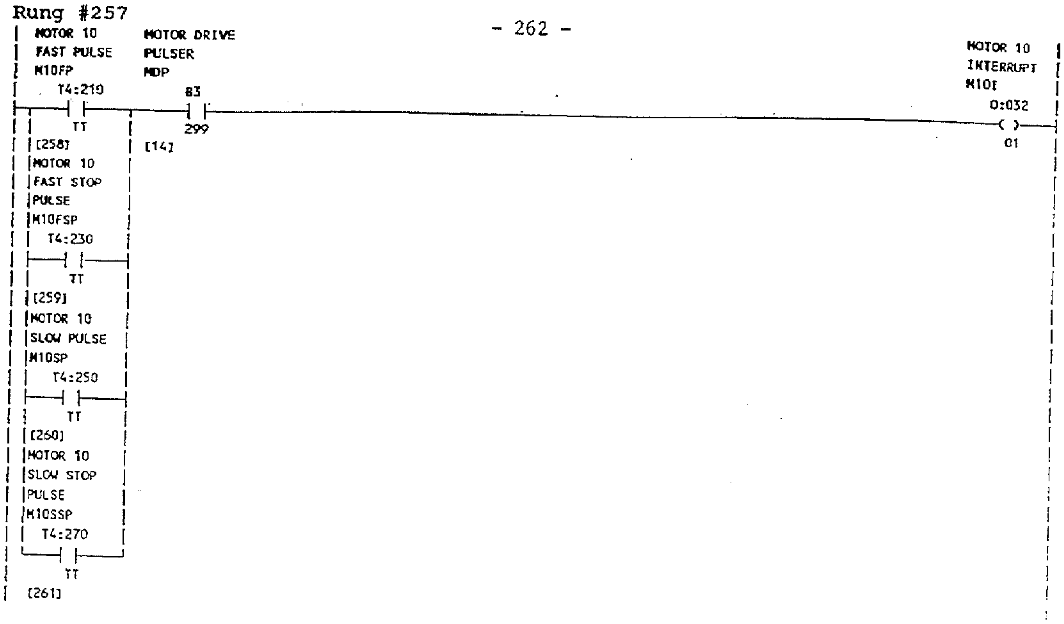

Rung #258
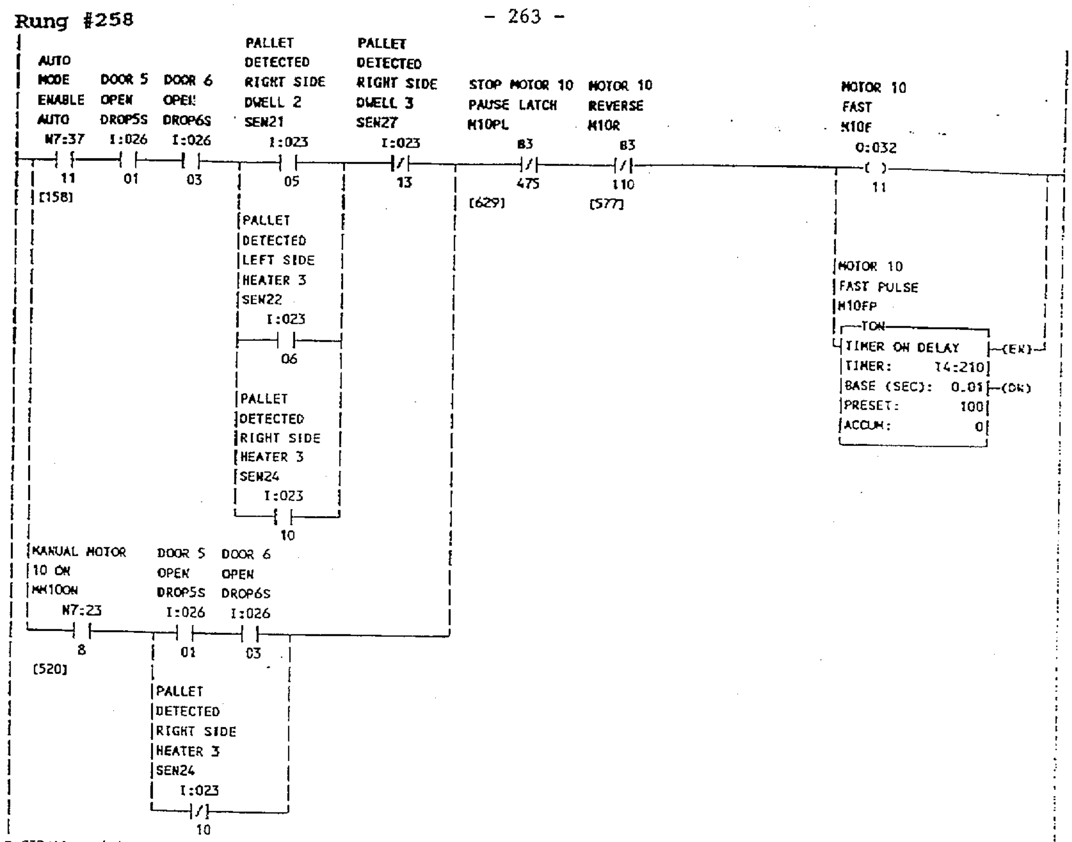
O:032/11 - ┤ ├ - File #5 FAULTS - 6
-┤/├ - File #2 MAIN_PRGRM - 259
-( )- - File #2 MAIN_PRGRM - 258
T4:210.TT - ┤ ├ - File #2 MAIN_PRGRM - 257
Rung #259
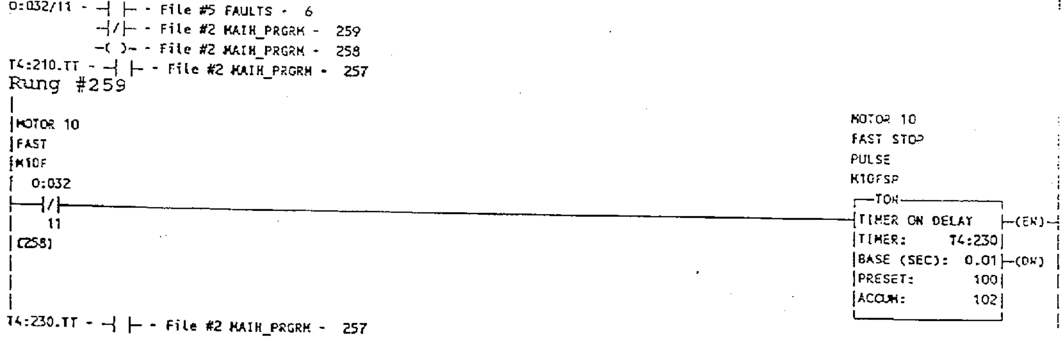
T4:230.TT - ┤ ├ - File #2 MAIN_PRGRM - 257

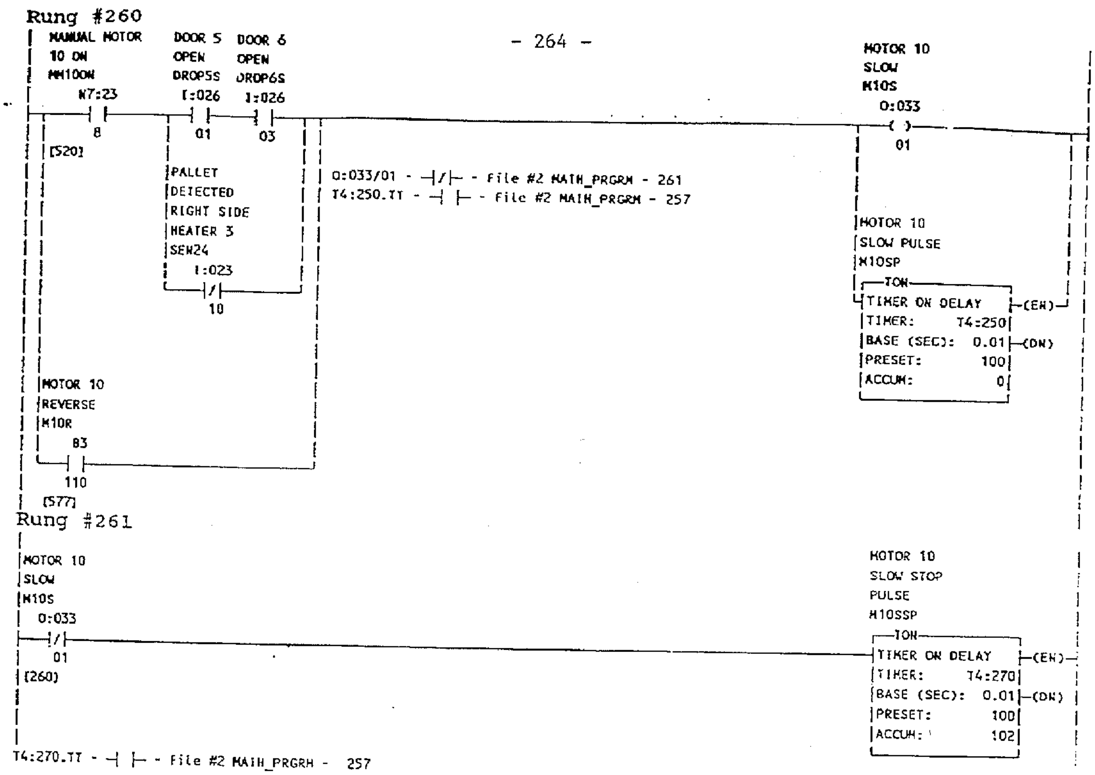
Rung #260
- 264 -
MANUAL MOTOR
10 ON
MM10ON
N7:23
8
[520]
DOOR 5
OPEN
DROP5S
I:026
01
DOOR 6
OPEN
DROP6S
I:026
03
PALLET
DETECTED
RIGHT SIDE
HEATER 3
SEN24
I:023
10
MOTOR 10
REVERSE
M10R
B3
110
[577]
O:033/01 - -|/|- - File #2 MAIN_PRGRM - 261
T4:250.TT - -| |- - File #2 MAIN_PRGRM - 257
MOTOR 10
SLOW
M10S
O:033
01
MOTOR 10
SLOW PULSE
M10SP
TON
TIMER ON DELAY
TIMER: T4:250
BASE (SEC): 0.01
PRESET: 100
ACCUM: 0
(EN)
(DN)
Rung #261
MOTOR 10
SLOW
M10S
O:033
01
[260]
MOTOR 10
SLOW STOP
PULSE
M10SSP
TON
TIMER ON DELAY
TIMER: T4:270
BASE (SEC): 0.01
PRESET: 100
ACCUM: 102
(EN)
(DN)
T4:270.TT - -| |- - File #2 MAIN_PRGRM - 257

Rung #262
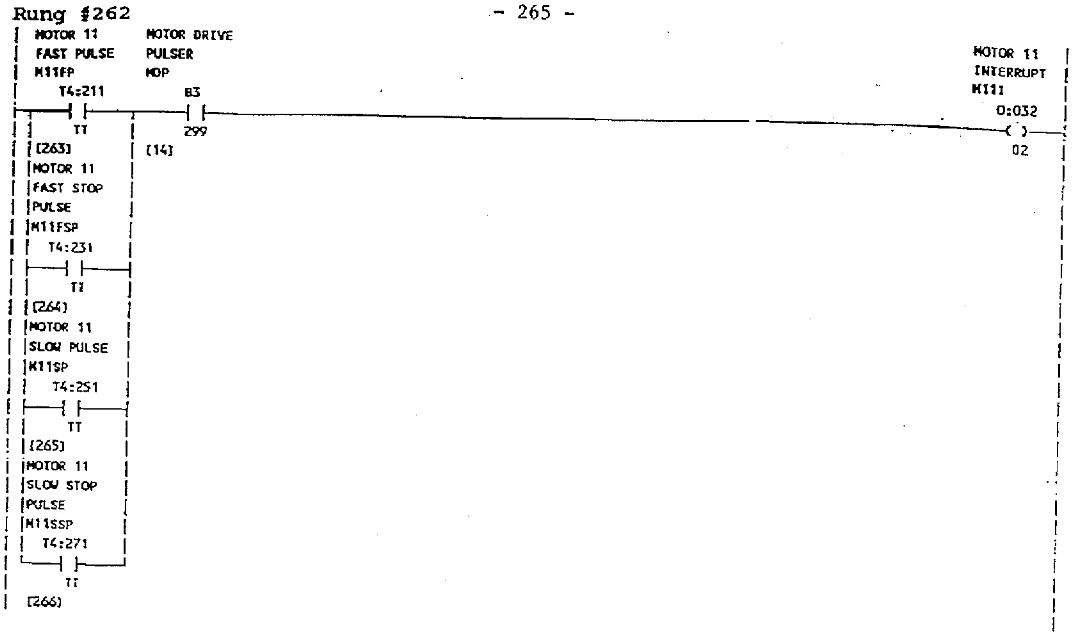

Rung #263
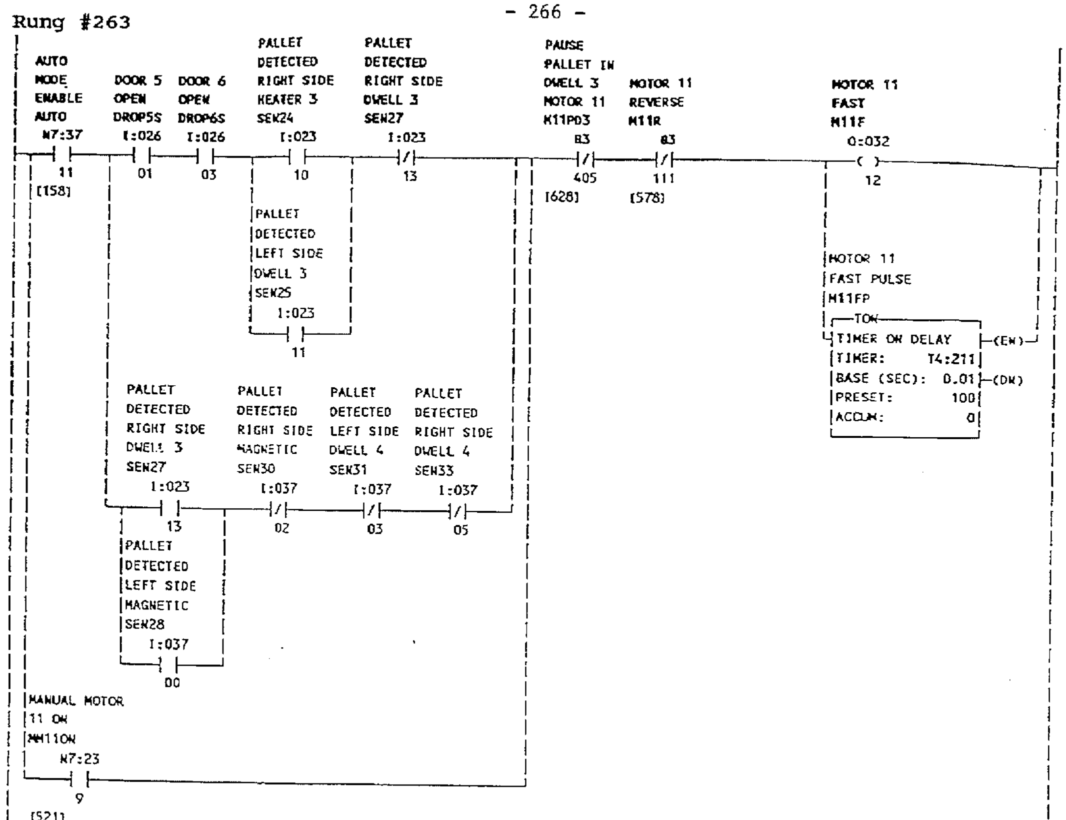
O:032/12 - ┤ ├ - File #2 MAIN_PRGRM - 267
File #5 FAULTS - 6
┤/├ - File #2 MAIN_PRGRM - 264
–( )– - File #2 MAIN_PRGRM - 263
T4:211.TT - ┤ ├ - File #2 MAIN_PRGRM - 262
Rung #264
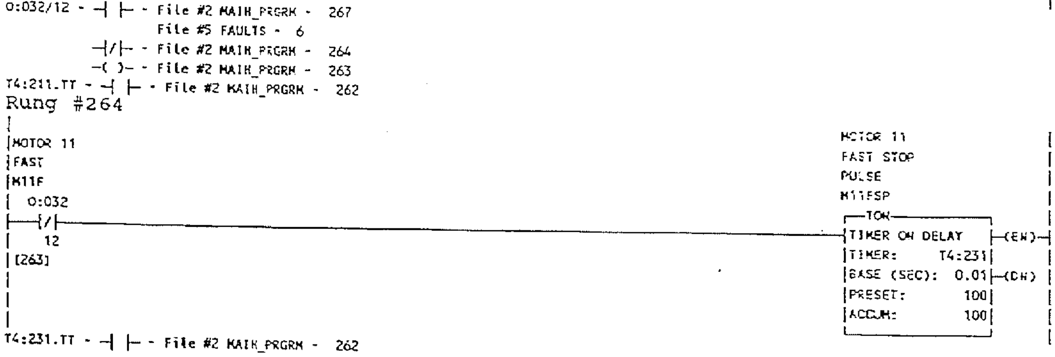
T4:231.TT - ┤ ├ - File #2 MAIN_PRGRM - 262

- 267 -
Rung #265
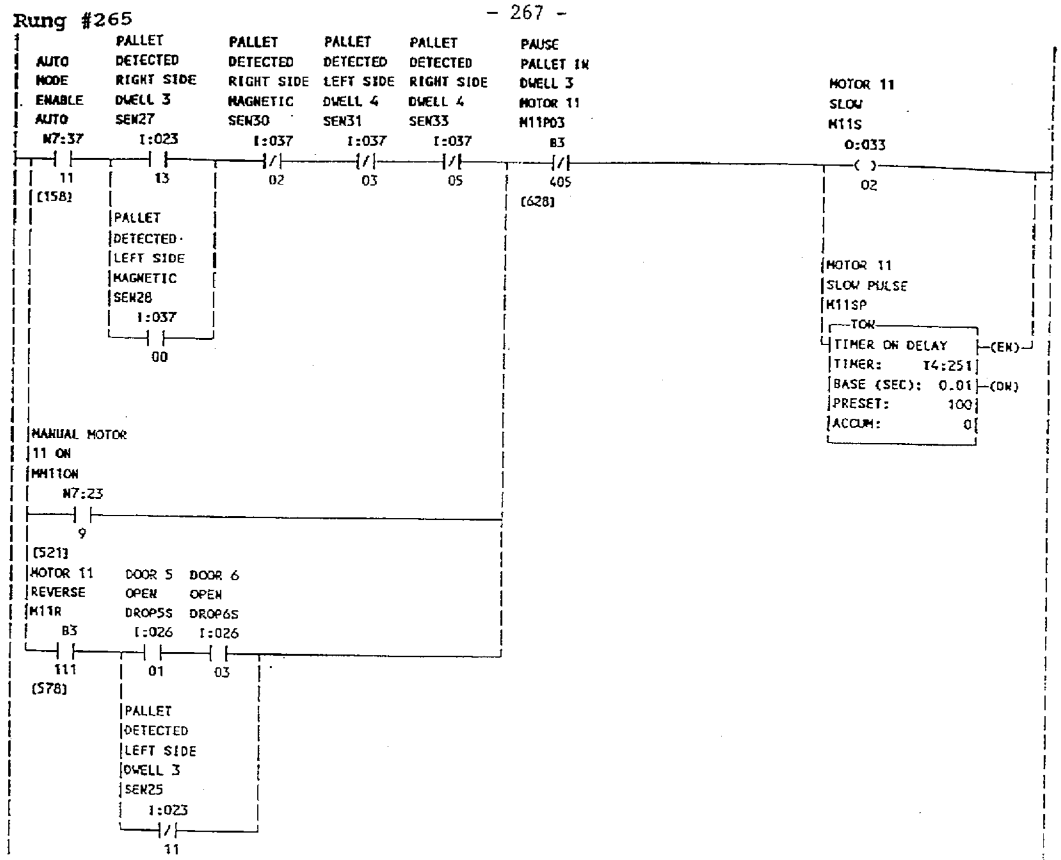
O:033/02 - -| |- - File #2 MAIN_PRGRM - 270,281
-|/|- - File #2 MAIN_PRGRM - 266
-( )- - File #2 MAIN_PRGRM - 265
T4:251.TT - -| |- - File #2 MAIN_PRGRM - 262
Rung #266
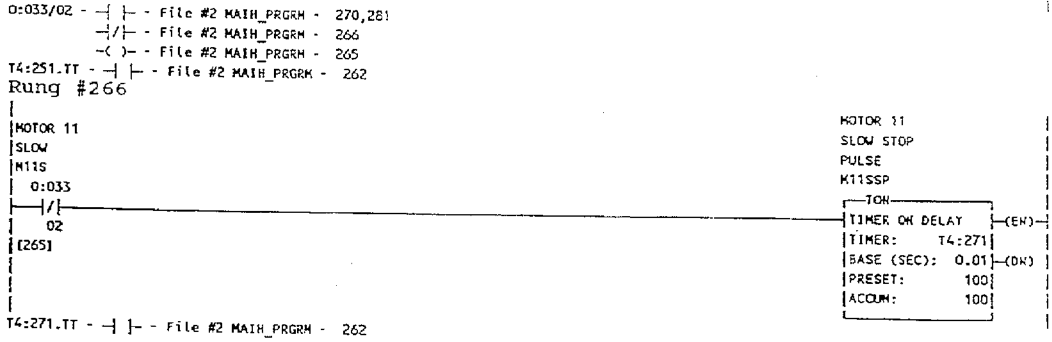
T4:271.TT - -| |- - File #2 MAIN_PRGRM - 262

```
Rung #267
|
|                          PALLET       PALLET                                              MAGNETIC
|AUTO                      DETECTED     DETECTED                                            HI POWER
|MODE        MOTOR 11      RIGHT SIDE   LEFT SIDE                                           SECTIONS
|ENABLE      FAST          DWELL 3      MAGNETIC     MAG WATER OK                           1 AND 2
|AUTO        M11F          SEN27        SEN28        MAG_OK                                 LATCHED
| N7:37      O:032         I:023        I:037         B3                                    HIPRMAG1,2-LAT
|--| |--------| |-----------| |----------|/|-----------| |-------------------------------------  B3
|   11         12            13           00           278                                  --(L)--
|[158]       [263]                                   [726]                                    270
B3/270 - -| |- - File #2 MAIN_PRGRM -  268
        -(L)-  - File #2 MAIN_PRGRM -  267
        -(U)-  - File #2 MAIN_PRGRM -  269
Rung #268
|MAGNETIC
|HI POWER
|SECTIONS                                                                                   MAGNETIC
|1 AND 2                                                                                    HI POWER
|LATCHED          MAG WATER OK                                                              SUPPLY 1
|HIPRMAG1,2-LAT   MAG_OK                                                                    OUTPUT
|    B3             B3                                                                      MAGPS1
|----| |-------------| |------------------------------------------------------------------   O:033
|    270            278                                                                   +---( )---+
|[267]            [726]                                                                   |    14   |
|                                                                                         |MAGNETIC |
| O:033/14 - -| |- - File #6 TECH_RUNGS - 6                                               |HI POWER |
| B3/833 - -| |- - File #2 MAIN_PRGRM - 620, 622                                          |SUPPLY 2 |
|                                                                                         |OUTPUT   |
|                                                                                         |MAGPS2   |
|                                                                                         |  O:033  |
|                                                                                         +---( )---+
|                                                                                         |    15   |
|                                                                                         |HIGH POWER
|                                                                                         |MAG 1 & 2|
|                                                                                         |TO THE FIX
|                                                                                         |HIMAG1,2 |
|                                                                                         |    B3   |
|                                                                                         +---( )---+
                                                                                               833
```

Rung #269

- 269 -

AUTO MODE ENABLE AUTO N7:37 11 [158]
PALLET DETECTED CENTER MAGNETIC SEN29 I:037 01
PALLET DETECTED RIGHT SIDE MAGNETIC SEN30 I:037 02
PALLET DETECTED LEFT SIDE DWELL 4 SEN31 I:037 03

MAGNETIC HI POWER SECTIONS 1 AND 2 LATCHED HIPRMAG1,2-LAT B3 -(U)- 270

B3/270 - -| |- - File #2 MAIN_PRGRM - 268
-(L)- - File #2 MAIN_PRGRM - 267

MAG WATER OK MAG_OK B3 -|/|- 278 [726]

AUTO OFF PULSE AUOFPULSE T4:283 TT [155]

Rung #270

AUTO MODE ENABLE AUTO N7:37 11 [158]
PALLET DETECTED RIGHT SIDE DWELL 3 SEN27 I:023 13
PALLET DETECTED LEFT SIDE MAGNETIC SEN28 I:037 00
MOTOR 11 SLOW M11S O:033 02 [265]
MOTOR 12 FAST M12F O:032 13 [281]
MAG WATER OK MAG_OK B3 278 [726]

TURN ON MAG HI POWER TO SECT 3 AND 4 TIMER DELAY LATCH HIPRMAG-3,4-LAT B3 -(L)- 264

B3/264 - -| |- - File #2 MAIN_PRGRM - 271
-(L)- - File #2 MAIN_PRGRM - 270
-(U)- - File #2 MAIN_PRGRM - 272

Rung #271

TURN ON MAG HI POWER TO SECT 3 AND 4 TIMER DELAY LATCH HIPRMAG-3,4-LAT B3 264 [270]

READY TO TURN HI POWER TO MAG SECT 3 & 4 WHEN PALLET @ LEFT SIDE MAG HIPRMAG-3,4-DLY

TON
TIMER ON DELAY -(EN)-
TIMER: T4:301
BASE (SEC): 0.01 -(DN)
PRESET: 300
ACCUM: 0

T4:301.DN - -| |- - File #2 MAIN_PRGRM - 272,273

```
Rung #272
                                    - 270 -
                                                                    TURN ON MAG
 READY TO TURN                                                      HI POWER TO
 HI POWER TO                                                        SECT 3 AND 4
 MAG SECT 3 & 4                                                     TIMER DELAY
 HIPRMAG-3,4-DLY                                                    LATCH
      T4:301                                                        HIPRMAG-3,4-LAT
|-+----] [----+-----------------------------------------------------+----B3----|
  |     DN    |                                                        -(U)-
  |[271]      |                                                         264
  |           | B3/264 - -] [- - File #2 MAIN_PRGRM - 271
  |           |           -(L)- - File #2 MAIN_PRGRM - 270
  |MAG WATER OK
  |MAG_OK     |
  |   B3      |
  +---]/[-----+
  |   278     |
  |[726]      |
  |AUTO OFF   |
  |PULSE      |
  |AUOFPULSE  |
  |  T4:283   |
  +---] [-----+
      TT
 [155]
Rung #273
                                                                    HI POWER TO
|READY TO TURN                                                      MAGNETIC
|HI POWER TO                                                        SECTIONS
|MAG SECT 3 & 4                                                     3 AND 4
|HIPRMAG-3,4-DLY                                                    LATCHED
|    T4:301                                                         HIPRMAG3,4-LAT
|------] [---------------------------------------------------------------B3-----|
        DN                                                           -(L)-
|[271]                                                                267
B3/267 - -] [- - File #2 MAIN_PRGRM - 274
         -(L)- - File #2 MAIN_PRGRM - 273
         -(U)- - File #2 MAIN_PRGRM - 275
```

```
Rung #274
|HI POWER TO                                                              MAGNETIC
|MAGNETIC                                                                 HI POWER
|SECTIONS                                                                 SUPPLY 3
|3 AND 4                                                                  OUTPUT
|LATCHED          MAG WATER OK                                            MAGPS3
|HIPRMAG3,4-LAT   MAG_OK                                                   O:063
|    B3              B3
|----] [-----------] [------------------------------------------------+-----( )-----+
|   267             278                                               |     10      |
|[273]            [726]                                               |             |
|                                                                     |MAGNETIC     |
| O:063/10 - ] [ - File #6 TECH_RUNGS - 6                              |HI POWER     |
| B3/834 - ] [ - File #2 MAIN_PRGRM - 620, 622                         |SUPPLY 4     |
|                                                                     |OUTPUT       |
|                                                                     |MAGPS4       |
|                                                                     |  O:063      |
|                                                                     |-----( )-----|
|                                                                     |     11      |
|                                                                     |HIGH POWER   |
|                                                                     |MAG 3 & 4    |
|                                                                     |TO THE FIX   |
|                                                                     |HIPRMAG3,4   |
|                                                                     |    B3       |
|                                                                     +-----( )-----+
Rung #275                                                                  834
|
|          PALLET     PALLET                                          HI POWER TO
| AUTO     DETECTED   DETECTED                                        MAGNETIC
| MODE     MIDDLE     RIGHT SIDE                                      SECTIONS
| ENABLE   DWELL 4    DWELL 4                                         3 AND 4
| AUTO     SEN32      SEN33                                           LATCHED
| N7:37     I:037      I:037                                          HIPRMAG3,4-LAT
|                                                                        B3
|-+--] [--------] [--------] [--+------------------------------------------(U)-----|
| |   11         04         05  |                                         267
| |[158]                        |
| |                             | B3/267 - ] [ - File #2 MAIN_PRGRM - 274
| |                             |        -(L)- - File #2 MAIN_PRGRM - 273
| |MAG WATER OK                 |
| |MAG_OK                       |
| |     B3                      |
| |----]/[----------------------+
| |    278                      |
| |[726]                        |
| |AUTO OFF                     |
| |PULSE                        |
| |AUOFPULSE                    |
| | T4:283                      |
| +----] [----------------------+
|       TT
| [155]
Rung #276
|PALLET      PALLET
|DETECTED    DETECTED
|LEFT SIDE   RIGHT SIDE
|HEATER 3    HEATER 3
|SEN22       SEN24                                              MAGNETIC TIMER
| I:023       I:023                                             MAG_TMR
|                                                                    T4:72
|----] [-------] [-------------------------------------------------[RES]-------|
|    06         10
T4:72 - RTO - File #2 MAIN_PRGRM - 278
```

```
       RES - File #2 MAIN_PRGRM -  276
Rung #277
|PALLET     PALLET     PALLET                                                    |
|DETECTED   DETECTED   DETECTED                                                  |
|LEFT SIDE  CENTER     RIGHT SIDE                                      MAGNETIC  |
|DWELL 3    DWELL 3    DWELL 3                                         TRANSIT   |
|SEN25      SEN26      SEN27                                           MAG_TRAN  |
|  I:023     I:023      I:023                                            B3      |
|---] [-------] [-------] [----------------------------------------------(L)-----|
|   11         12         13                                             91      |
B3/91 - -] [- - File #2 MAIN_PRGRM -  278
       -(L)- - File #2 MAIN_PRGRM -  277
       -(U)- - File #2 MAIN_PRGRM -  279
Rung #278
|MAGNETIC                                                                        |
|TRANSIT                                                MAGNETIC TIMER           |
|MAG_TRAN                                               MAG_TMR                  |
|  B3                                                   +-RTO-------------+      |
|---] [-------------------------------------------------+RETENTIVE TIMER ON+-(EN)-|
|   91                                                  |TIMER:      T4:72|      |
|[277]                                                  |BASE (SEC):   1.0+-(DN) |
|                                                       |PRESET:      1000|      |
|                                                       |ACCUM:         79|      |
|                                                       +-----------------+      |
T4:72 - RTO - File #2 MAIN_PRGRM -  278
       RES - File #2 MAIN_PRGRM -  276
Rung #279
|PALLET     PALLET     PALLET                                                    |
|DETECTED   DETECTED   DETECTED                                                  |
|LEFT SIDE  MIDDLE     RIGHT SIDE                                      MAGNETIC  |
|DWELL 4    DWELL 4    DWELL 4                                         TRANSIT   |
|SEN31      SEN32      SEN33                                           MAG_TRAN  |
|  I:037     I:037      I:037                                            B3      |
|---] [-------] [-------] [----------------------------------------------(U)-----|
|   03         04         05                                             91      |
B3/91 - -] [- - File #2 MAIN_PRGRM -  278
       -(L)- - File #2 MAIN_PRGRM -  277
       -(U)- - File #2 MAIN_PRGRM -  279
Rung #280
|  MOTOR 12        MOTOR DRIVE                                         MOTOR 12  |
|  SLOW PULSE      PULSER                                              INTERRUPT |
|  M12SP           MDP                                                 M12I      |
|    T4:212          B3                                                  O:032   |
|-+---] [------+------] [------------------------------------------------( )-----|
| |     TT     |     299                                                 03      |
| |[281]       |  [14]                                                           |
| |MOTOR 12    |                                                                 |
| |FAST STOP   |                                                                 |
| |PULSE       |                                                                 |
| |M12FSP      |                                                                 |
| |  T4:232    |                                                                 |
| +---] [------+                                                                 |
| |     TT     |                                                                 |
| |[282]       |                                                                 |
| |MOTOR 12    |                                                                 |
| |SLOW STOP   |                                                                 |
| |PULSE       |                                                                 |
| |M12SSP      |                                                                 |
| |  T4:272    |                                                                 |
| +---] [------+                                                                 |
|       TT                                                                       |
| [283]                                                                          |
```

Rung #281
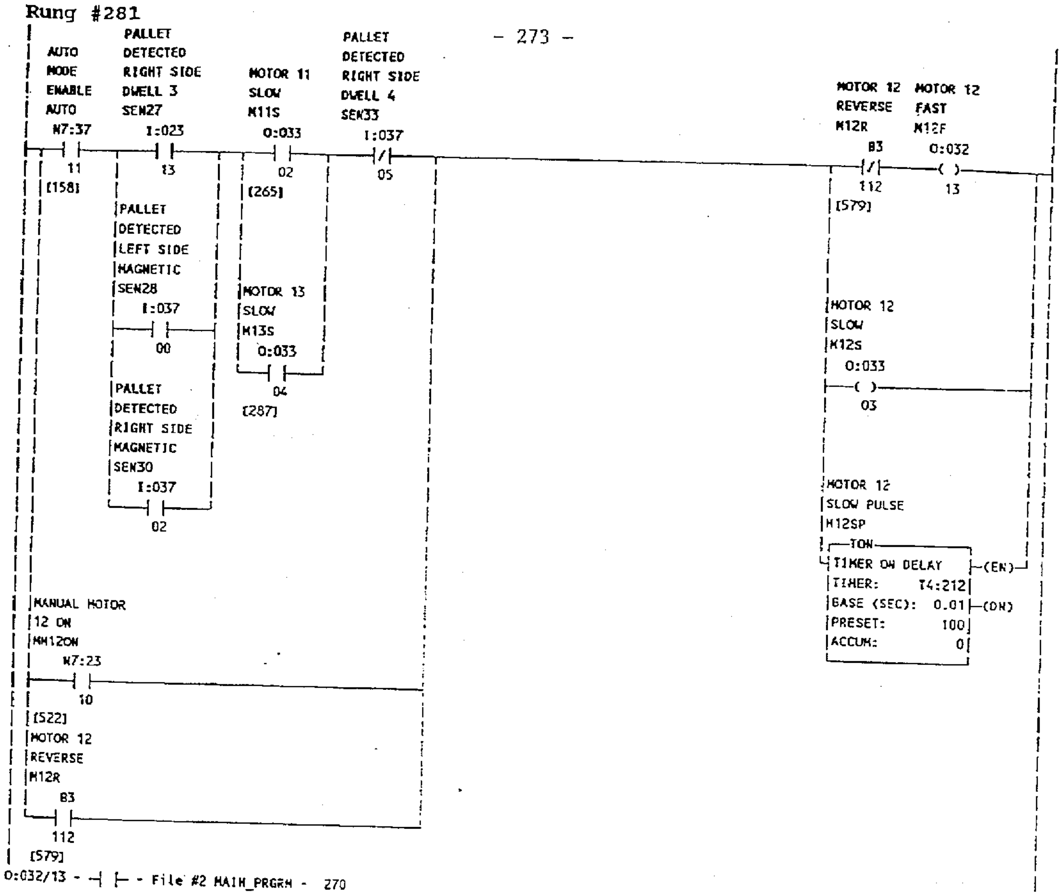
O:032/13 - ┤ ├ - File #2 MAIN_PRGRM - 270
File #5 FAULTS - 7
┤/├ - File #2 MAIN_PRGRM - 282
-( )- - File #2 MAIN_PRGRM - 281
O:033/03 - ┤/├ - File #2 MAIN_PRGRM - 283
-( )- - File #2 MAIN_PRGRM - 281
T4:212.TT - ┤ ├ - File #2 MAIN_PRGRM - 280
Rung #282
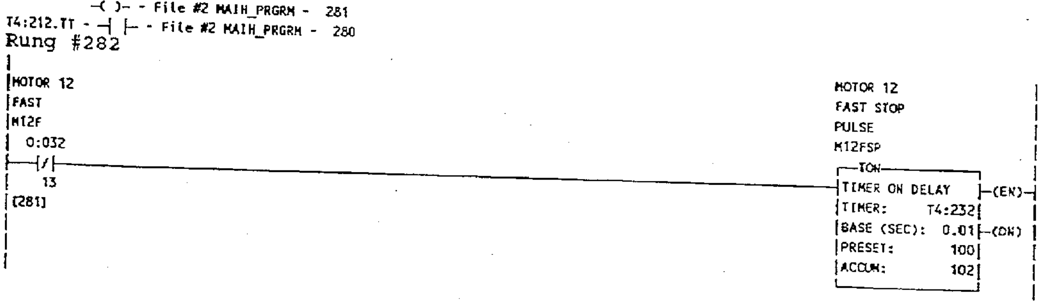

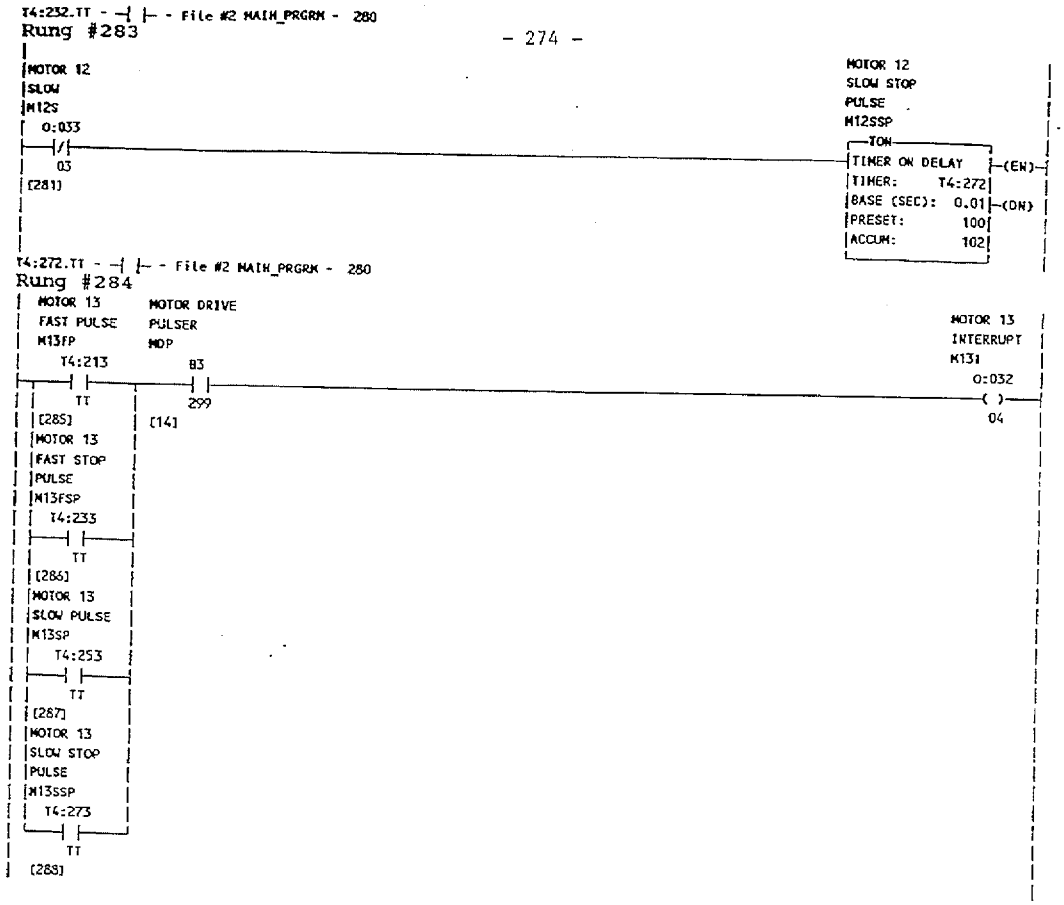
T4:232.TT - -| |- - File #2 MAIN_PRGRM - 280
Rung #283
- 274 -
MOTOR 12
SLOW
M12S
O:033
03
[281]
MOTOR 12
SLOW STOP
PULSE
M12SSP
TON
TIMER ON DELAY
TIMER: T4:272
BASE (SEC): 0.01
PRESET: 100
ACCUM: 102
(EN)
(DN)
T4:272.TT - -| |- - File #2 MAIN_PRGRM - 280
Rung #284
MOTOR 13
FAST PULSE
M13FP
T4:213
TT
[285]
MOTOR DRIVE
PULSER
MDP
B3
299
[14]
MOTOR 13
FAST STOP
PULSE
M13FSP
T4:233
TT
[286]
MOTOR 13
SLOW PULSE
M13SP
T4:253
TT
[287]
MOTOR 13
SLOW STOP
PULSE
M13SSP
T4:273
TT
[288]
MOTOR 13
INTERRUPT
M13I
O:032
04

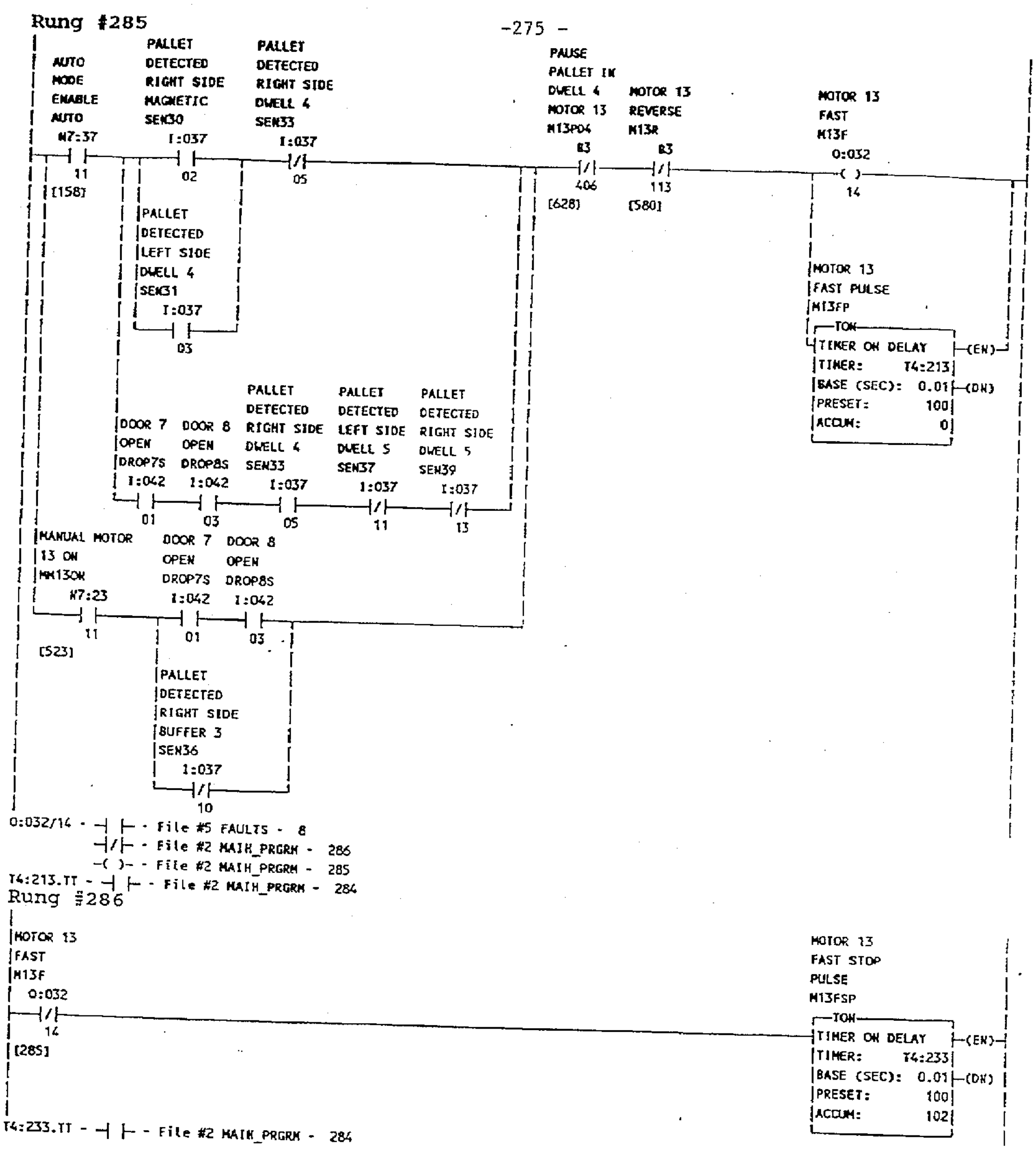
Rung #285
-275 -
AUTO MODE ENABLE AUTO
N7:37
11
[158]
PALLET DETECTED RIGHT SIDE MAGNETIC SEN30
I:037
02
PALLET DETECTED RIGHT SIDE DWELL 4 SEN33
I:037
05
PALLET DETECTED LEFT SIDE DWELL 4 SEN31
I:037
03
PAUSE PALLET IN DWELL 4 MOTOR 13 M13P04
B3
406
[628]
MOTOR 13 REVERSE M13R
B3
113
[580]
MOTOR 13 FAST M13F
O:032
14
MOTOR 13 FAST PULSE M13FP
TON
TIMER ON DELAY
TIMER: T4:213
BASE (SEC): 0.01
PRESET: 100
ACCUM: 0
(EN)
(DN)
DOOR 7 OPEN DROP7S
I:042
01
DOOR 8 OPEN DROP8S
I:042
03
PALLET DETECTED RIGHT SIDE DWELL 4 SEN33
I:037
05
PALLET DETECTED LEFT SIDE DWELL 5 SEN37
I:037
11
PALLET DETECTED RIGHT SIDE DWELL 5 SEN39
I:037
13
MANUAL MOTOR 13 ON MM13ON
N7:23
11
[523]
DOOR 7 OPEN DROP7S
I:042
01
DOOR 8 OPEN DROP8S
I:042
03
PALLET DETECTED RIGHT SIDE BUFFER 3 SEN36
I:037
10
O:032/14 - ] [ - File #5 FAULTS - 8
]/[ - File #2 MAIN_PRGRM - 286
-( )- - File #2 MAIN_PRGRM - 285
T4:213.TT - ] [ - File #2 MAIN_PRGRM - 284
Rung #286
MOTOR 13 FAST M13F
O:032
14
[285]
MOTOR 13 FAST STOP PULSE M13FSP
TON
TIMER ON DELAY
TIMER: T4:233
BASE (SEC): 0.01
PRESET: 100
ACCUM: 102
(EN)
(DN)
T4:233.TT - ] [ - File #2 MAIN_PRGRM - 284

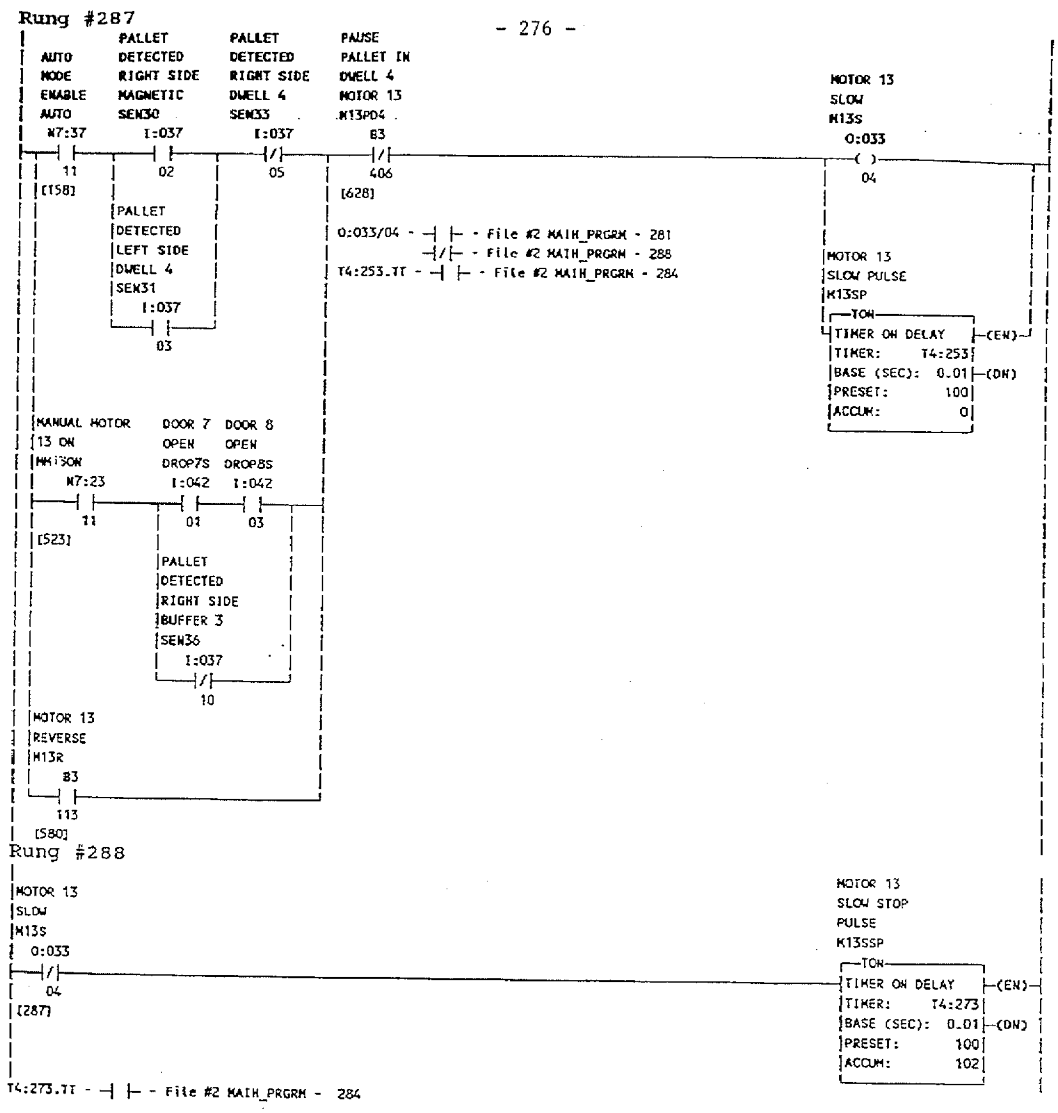
Rung #287
AUTO MODE ENABLE AUTO N7:37 11 [158]
PALLET DETECTED RIGHT SIDE MAGNETIC SEN30 I:037 02
PALLET DETECTED RIGHT SIDE DWELL 4 SEN33 I:037 05
PAUSE PALLET IN DWELL 4 MOTOR 13 M13PD4 B3 406 [628]
MOTOR 13 SLOW M13S O:033 04
PALLET DETECTED LEFT SIDE DWELL 4 SEN31 I:037 03
O:033/04 - ⊣ ⊢ - File #2 MAIN_PRGRM - 281
⊣/⊢ - File #2 MAIN_PRGRM - 288
T4:253.TT - ⊣ ⊢ - File #2 MAIN_PRGRM - 284
MOTOR 13 SLOW PULSE M13SP
TON
TIMER ON DELAY (EN)
TIMER: T4:253
BASE (SEC): 0.01 (DN)
PRESET: 100
ACCUM: 0
MANUAL MOTOR 13 ON MM13ON N7:23 11 [523]
DOOR 7 OPEN DROP7S I:042 01
DOOR 8 OPEN DROP8S I:042 03
PALLET DETECTED RIGHT SIDE BUFFER 3 SEN36 I:037 10
MOTOR 13 REVERSE M13R B3 113 [580]
Rung #288
MOTOR 13 SLOW M13S O:033 04 [287]
MOTOR 13 SLOW STOP PULSE M13SSP
TON
TIMER ON DELAY (EN)
TIMER: T4:273
BASE (SEC): 0.01 (DN)
PRESET: 100
ACCUM: 102
T4:273.TT - ⊣ ⊢ - File #2 MAIN_PRGRM - 284

Rung #289
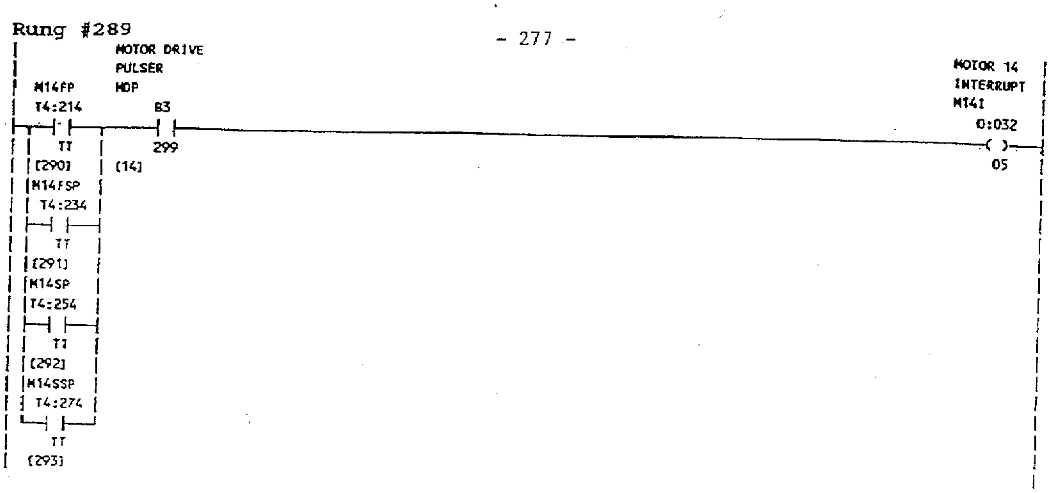

Rung #290
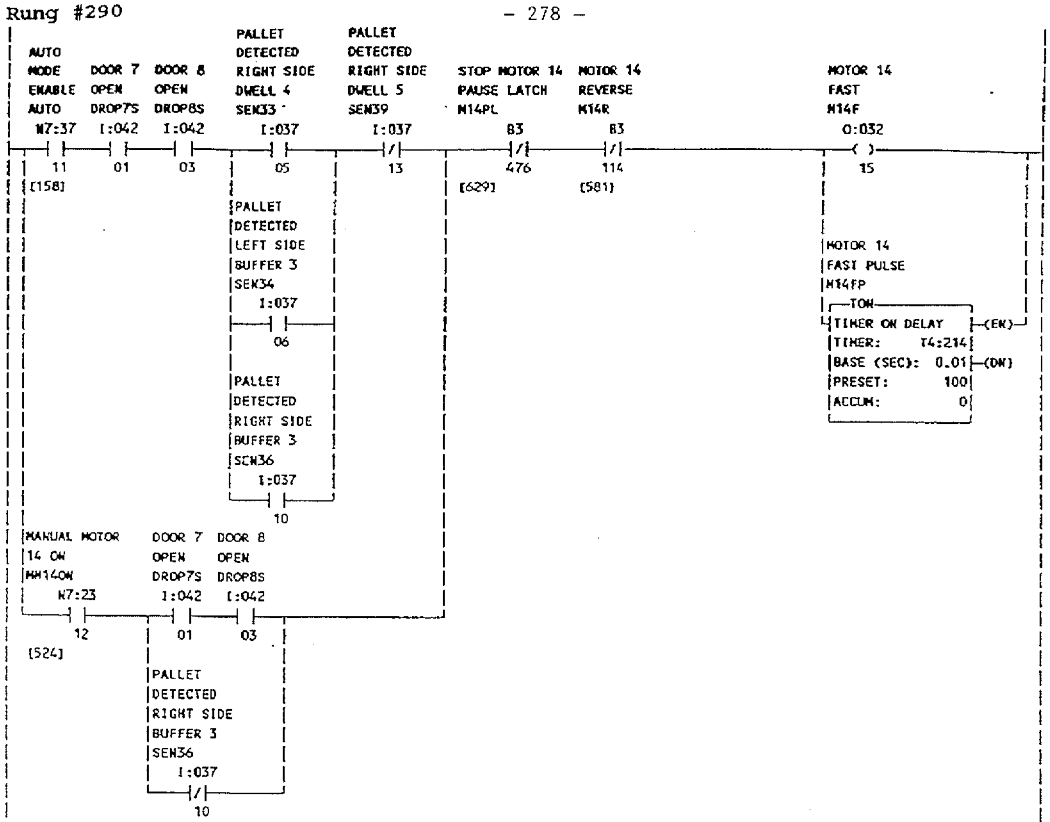
O:032/15 - ┤ ├ - File #5 FAULTS - 9
┤/├ - File #2 MAIN_PRGRM - 291
-( )- - File #2 MAIN_PRGRM - 290
T4:214.TT - ┤ ├ - File #2 MAIN_PRGRM - 289
Rung #291
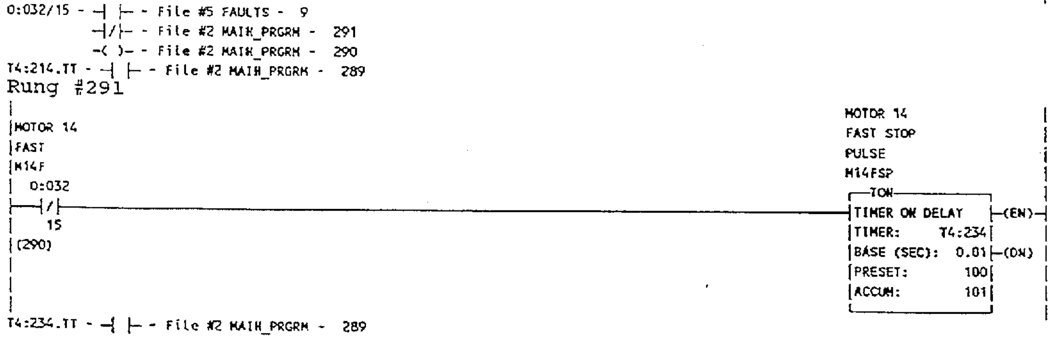
T4:234.TT - ┤ ├ - File #2 MAIN_PRGRM - 289

Rung #292

```
MANUAL MOTOR    DOOR 7   DOOR 8                                   MOTOR 14
14 ON           OPEN     OPEN                                     SLOW
MM14ON          DROP7S   DROP8S                                   M14S
   N7:23        I:042    I:042                                    0:033
---| |----------| |------| |--------------------------------------( )---
   12           01       03                                        05
[524]
                PALLET            0:033/05 - -|/|- - File #2 MAIN_PRGRM - 293
                DETECTED          T4:254.TT - -| |- - File #2 MAIN_PRGRM - 289
                RIGHT SIDE
                BUFFER 3                                          MOTOR 14
                SEN36                                             SLOW PULSE
                  I:037                                           M14SP
                ---|/|---                                         TON
                   10                                             TIMER ON DELAY    (EN)
                                                                  TIMER:      T4:254
                                                                  BASE (SEC):   0.01 (DN)
MOTOR 14                                                          PRESET:        100
REVERSE                                                           ACCUM:           0
M14R
   B3
---| |---
   114
[581]
```

Rung #293

```
MOTOR 14                                                          MOTOR 14
SLOW                                                              SLOW STOP
M14S                                                              PULSE
 0:033                                                            M14SSP
---|/|------------------------------------------------------------TON
   05                                                             TIMER ON DELAY    (EN)
[292]                                                             TIMER:      T4:274
                                                                  BASE (SEC):   0.01 (DN)
                                                                  PRESET:        100
                                                                  ACCUM:         102
T4:274.TT - -| |- - File #2 MAIN_PRGRM -  289
```

Rung #294

```
            MOTOR DRIVE
            PULSER                                                MOTOR 15
 M15FP      MOP                                                   INTERRUPT
 T4:215       B3                                                  M15I
---| |-------| |--------------------------------------------------0:032
    TT        299                                                 ( )
 [295]       [14]                                                  06
 M15FSP
 T4:235
---| |---
    TT
 [296]
 M15SP
 T4:255
---| |---
    TT
 [297]
 M15SSP
 T4:275
---| |---
    TT
 [298]
```

Rung #295
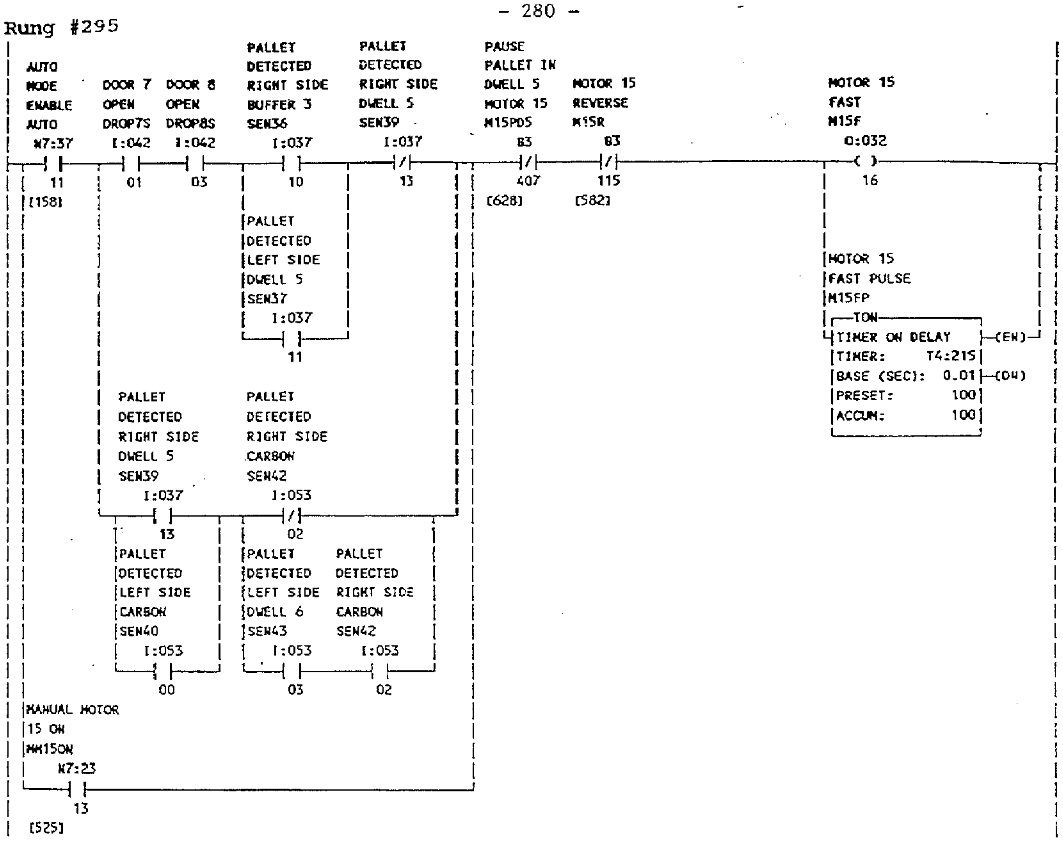
O:032/16 - ┤ ├ - File #5 FAULTS - 9
┤/├ - File #2 MAIN_PRGRM - 296
-( )- - File #2 MAIN_PRGRM - 295
T4:215.TT - ┤ ├ - File #2 MAIN_PRGRM - 294
Rung #296
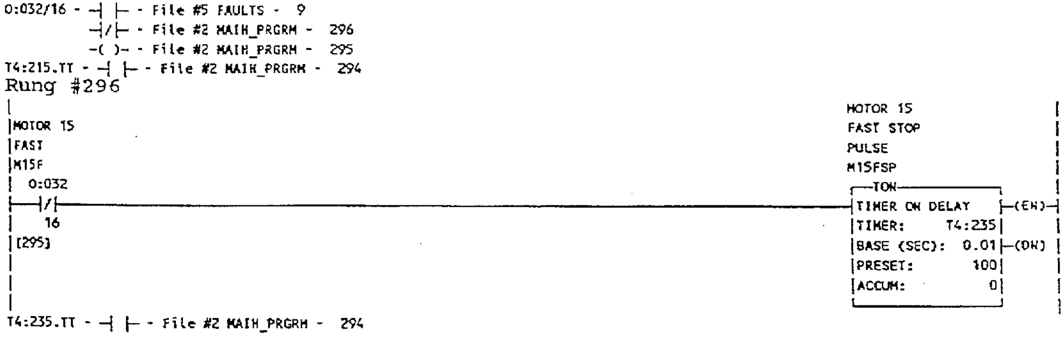
T4:235.TT - ┤ ├ - File #2 MAIN_PRGRM - 294

Rung #297
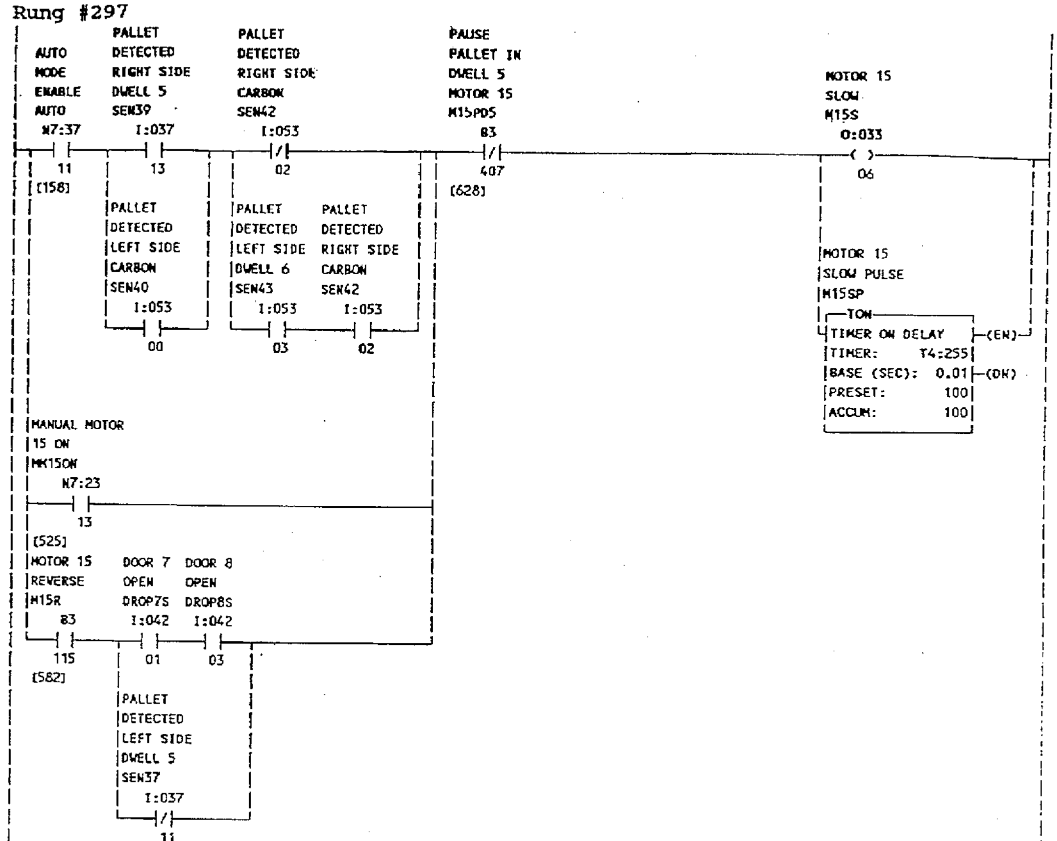
O:033/06 - ┤ ├ - File #2 MAIN_PRGRM - 299,300,306
┤/├ - File #2 MAIN_PRGRM - 298
-( )- - File #2 MAIN_PRGRM - 297
T4:255.TT - ┤ ├ - File #2 MAIN_PRGRM - 294
Rung #298
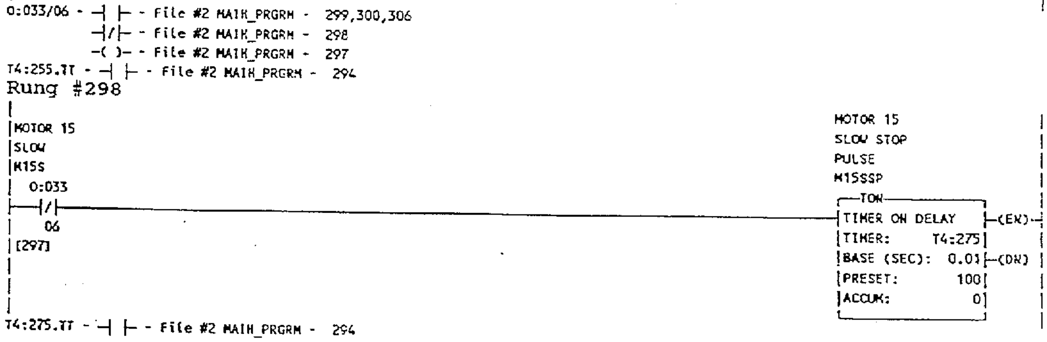
T4:275.TT - ┤ ├ - File #2 MAIN_PRGRM - 294

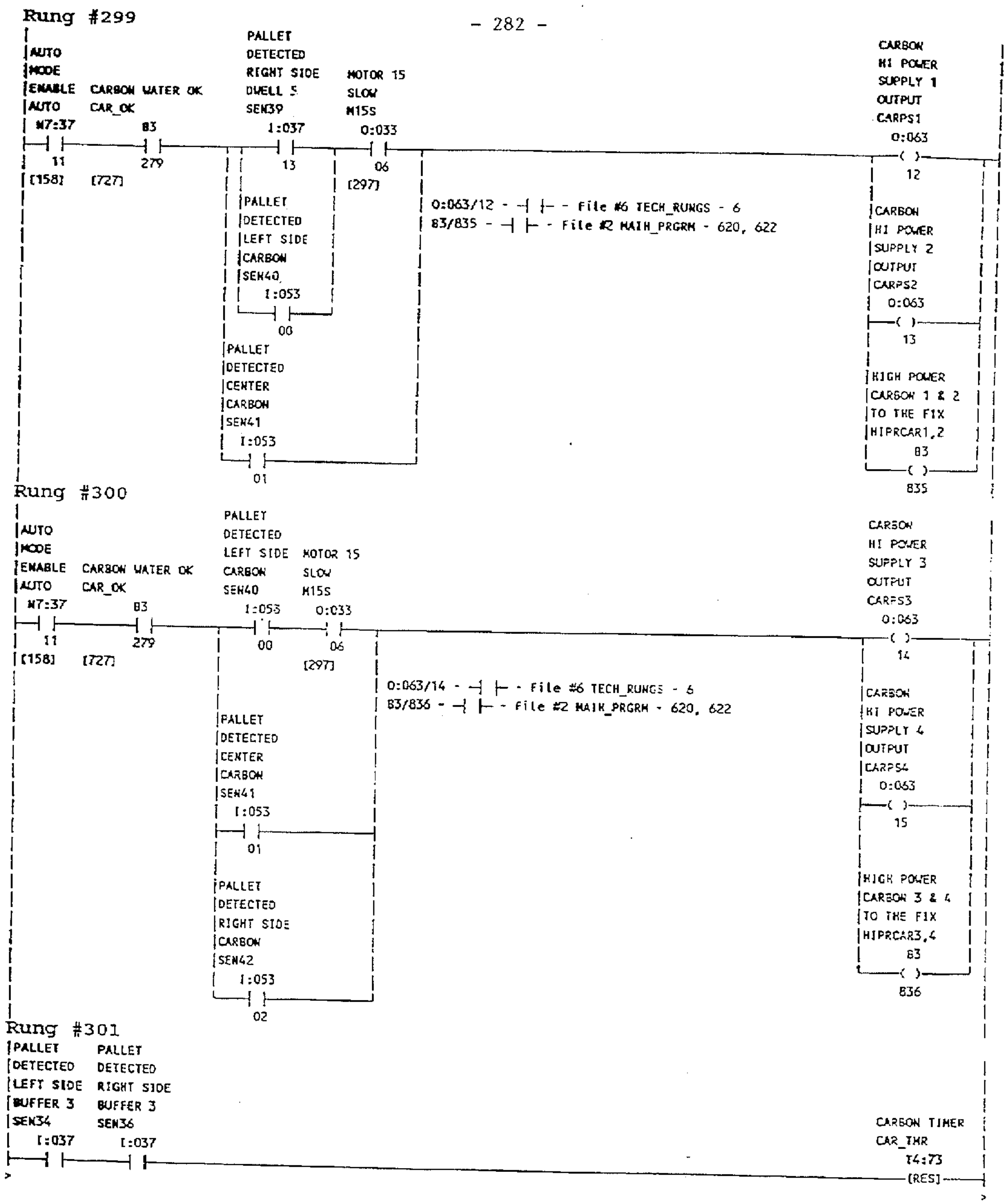
Rung #299
- 282 -
AUTO
MODE
ENABLE
AUTO
N7:37
11
[158]
CARBON WATER OK
CAR_OK
B3
279
[727]
PALLET
DETECTED
RIGHT SIDE
DWELL 5
SEN39
I:037
13
MOTOR 15
SLOW
M15S
O:033
06
[297]
PALLET
DETECTED
LEFT SIDE
CARBON
SEN40
I:053
00
PALLET
DETECTED
CENTER
CARBON
SEN41
I:053
01
O:063/12 - -| |- - File #6 TECH_RUNGS - 6
B3/835 - -| |- - File #2 MAIN_PRGRM - 620, 622
CARBON
HI POWER
SUPPLY 1
OUTPUT
CARPS1
O:063
12
CARBON
HI POWER
SUPPLY 2
OUTPUT
CARPS2
O:063
13
HIGH POWER
CARBON 1 & 2
TO THE FIX
HIPRCAR1,2
B3
835
Rung #300
AUTO
MODE
ENABLE
AUTO
N7:37
11
[158]
CARBON WATER OK
CAR_OK
B3
279
[727]
PALLET
DETECTED
LEFT SIDE
CARBON
SEN40
I:053
00
MOTOR 15
SLOW
M15S
O:033
06
[297]
PALLET
DETECTED
CENTER
CARBON
SEN41
I:053
01
PALLET
DETECTED
RIGHT SIDE
CARBON
SEN42
I:053
02
O:063/14 - -| |- - File #6 TECH_RUNGS - 6
B3/836 - -| |- - File #2 MAIN_PRGRM - 620, 622
CARBON
HI POWER
SUPPLY 3
OUTPUT
CARPS3
O:063
14
CARBON
HI POWER
SUPPLY 4
OUTPUT
CARPS4
O:063
15
HIGH POWER
CARBON 3 & 4
TO THE FIX
HIPRCAR3,4
B3
836
Rung #301
PALLET
DETECTED
LEFT SIDE
BUFFER 3
SEN34
I:037
PALLET
DETECTED
RIGHT SIDE
BUFFER 3
SEN36
I:037
CARBON TIMER
CAR_TMR
T4:73
(RES)

```
<
|     06          10
T4:73 - RTO - File #2 MAIN_PRGRM -  303
        RES - File #2 MAIN_PRGRM -  301
Rung #302
|PALLET      PALLET     PALLET
|DETECTED    DETECTED   DETECTED
|LEFT SIDE   CENTER     RIGHT SIDE
|DWELL 5     DWELL 5    DWELL 5
|SEN37       SEN38      SEN39                                       CARBON TRANSIT
|  I:037      I:037      I:037                                      CAR_TRAN
|----] [--------] [--------] [-----------------------------------------B3
|    11         12         13                                   ---(L)---|
B3/92 - ] [ - File #2 MAIN_PRGRM -  303                               92
        -(L)- - File #2 MAIN_PRGRM -  302
        -(U)- - File #2 MAIN_PRGRM -  304
Rung #303
|CARBON TRANSIT
|CAR_TRAN                                          CARBON TIMER
|     B3                                           CAR_THR
|----] [-------------------------------------------+-RTO--------------------+
|     92                                           |RETENTIVE TIMER ON|-(EN)-|
|[302]                                             |TIMER:        T4:73|
|                                                  |BASE (SEC):    1.0|-(DN)
|                                                  |PRESET:       1000|
|                                                  |ACCUM:           6|
|                                                  +------------------+
T4:73 - RTO - File #2 MAIN_PRGRM -  303
        RES - File #2 MAIN_PRGRM -  301
Rung #304
|PALLET      PALLET     PALLET
|DETECTED    DETECTED   DETECTED
|LEFT SIDE   CENTER     RIGHT SIDE
|DWELL 6     DWELL 6    DWELL 6
|SEN43       SEN44      SEN45                                       CARBON TRANSIT
|  I:053      I:053      I:053                                      CAR_TRAN
|----] [--------] [--------] [-----------------------------------------B3
|    03         04         05                                   ---(U)---|
B3/92 - ] [ - File #2 MAIN_PRGRM -  303                               92
        -(L)- - File #2 MAIN_PRGRM -  302
        -(U)- - File #2 MAIN_PRGRM -  304
Rung #305
|               MOTOR DRIVE
|               PULSER                                              MOTOR 16
| M16SP         MOP                                                 INTERRUPT
| T4:216          B3                                                M161
|--] [----+------] [-------------------------------------------------O:032
| |  TT   |      299                                            ---( )---|
| |[306]  | [14]                                                     07
| |M16FSP |
| | T4:236|
| |--] [--|
| |   TT  |
| |[307]  |
| |M16SSP |
| | T4:276|
| |--] [--|
|    TT
|  [308]
```

Rung #306
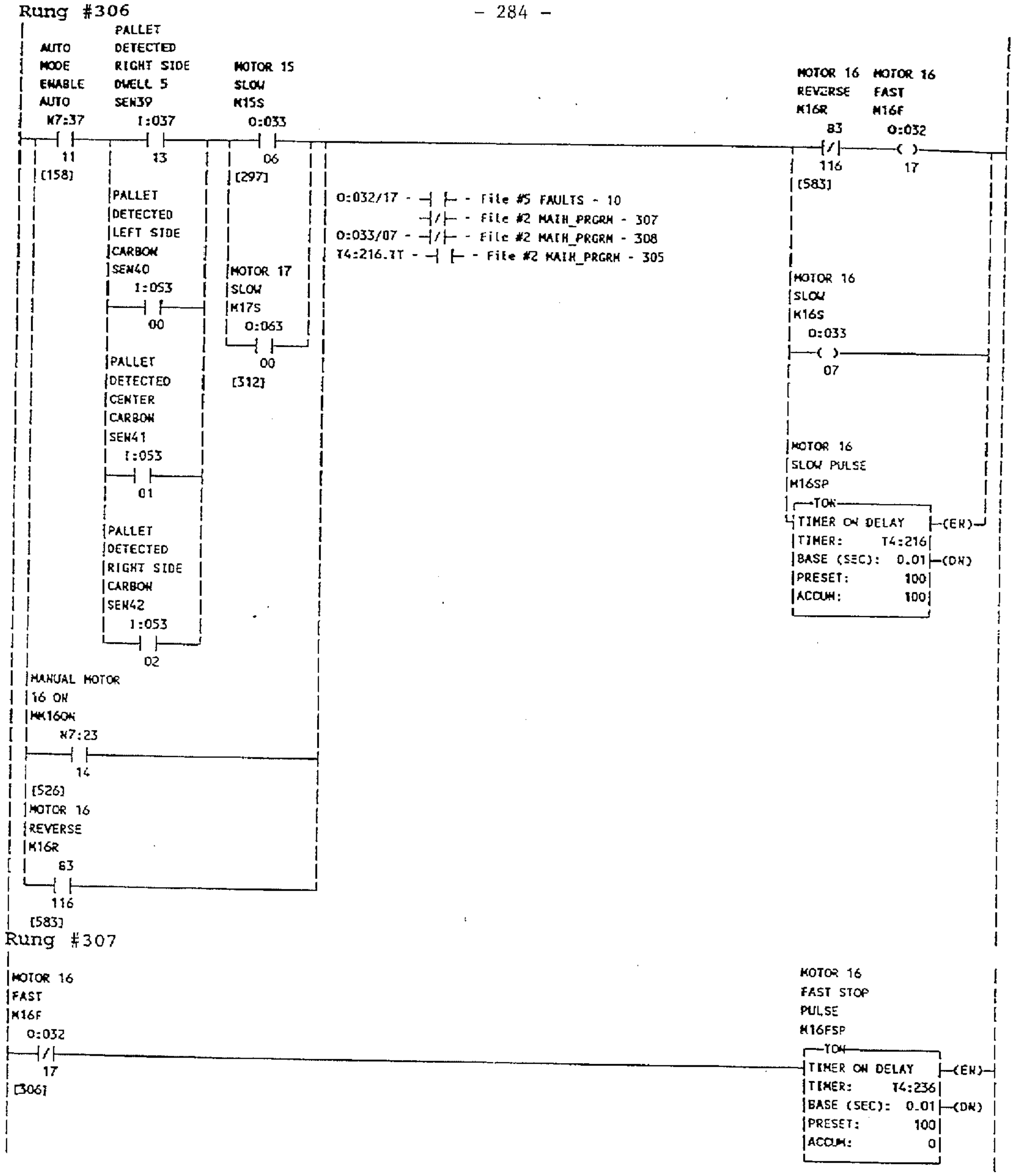

```
T4:236.TT - -| |- - File #2 MAIN_PRGRM -  305
Rung #308
|
|MOTOR 16                                                        MOTOR 16
|SLOW                                                            SLOW STOP
|M16S                                                            PULSE
|  O:033                                                         M16SSP'
|                                                               +-TON--------------+
|--|/|-----------------------------------------------------------|TIMER ON DELAY    |-(EN)-|
|   07                                                           |TIMER:     T4:276 |
|[306]                                                           |BASE (SEC):  0.01 |-(DN) |
|                                                                |PRESET:       100 |      |
|                                                                |ACCUM:          0 |      |
|                                                                +------------------+      |
T4:276.TT - -| |- - File #2 MAIN_PRGRM -  305
Rung #309
|            MOTOR DRIVE
|            PULSER                                                    MOTOR 17
|  M17FP     MDP                                                       INTERRUPT
|  T4:217     B3                                                       M17I
|                                                                        O:062
|-+--| |--+---| |--------------------------------------------------------( )----|
| |   TT  |   299                                                          00
| |[310]  |  [14]
| |M17FSP |
| | T4:237|
| |--| |--|
| |   TT  |
| |[311]  |
| |M17SP  |
| |T4:257 |
| |--| |--|
| |   TT  |
| |[312]  |
| |M17SSP |
| | T4:277|
| +--| |--+
|     TT
|   [313]
```

- 286 -
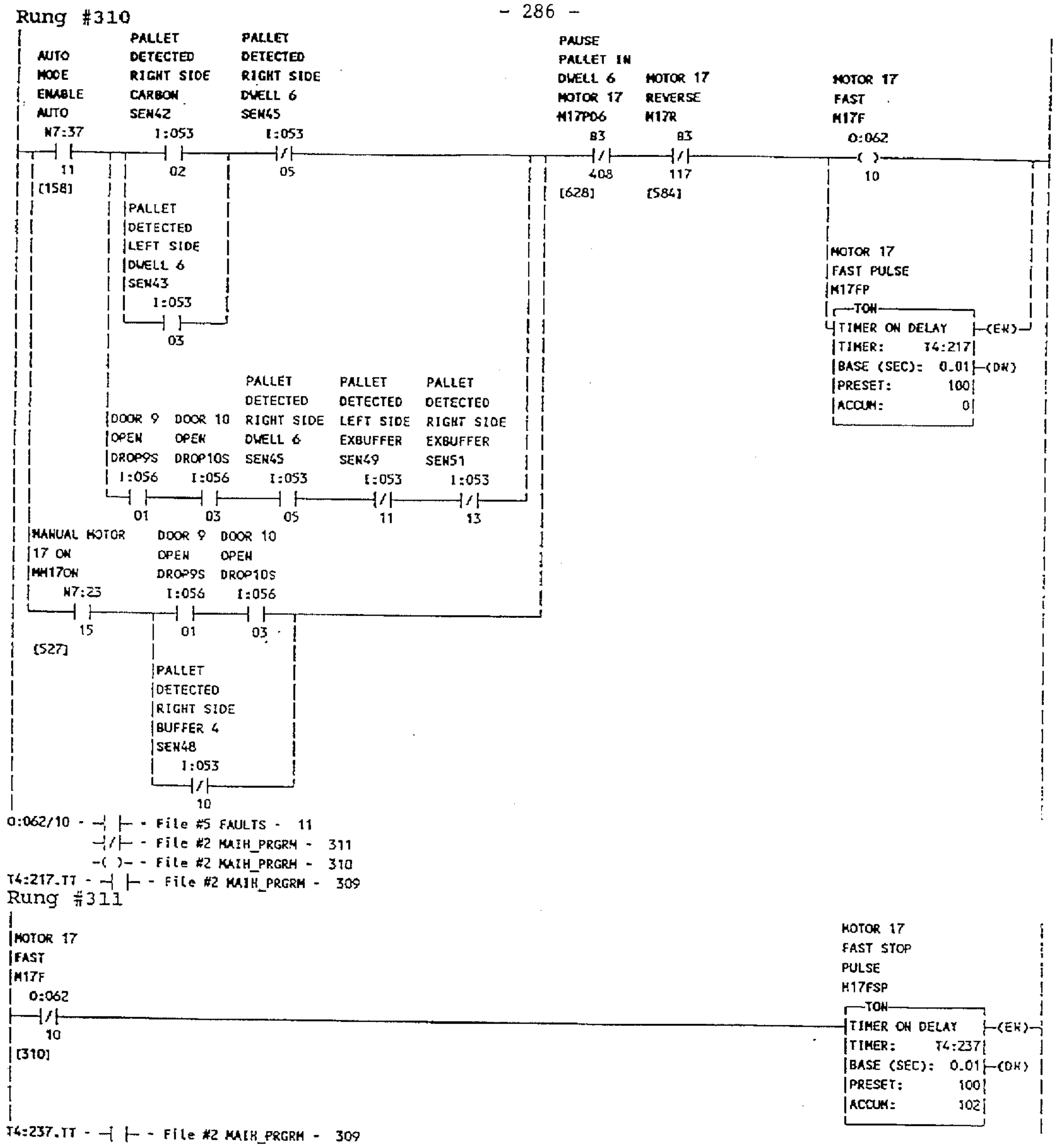

Rung #312

```
  AUTO     PALLET      PALLET       PAUSE
  MODE     DETECTED    DETECTED     PALLET IN
  ENABLE   RIGHT SIDE  RIGHT SIDE   DWELL 6                              MOTOR 17
  AUTO     CARBON      DWELL 6      MOTOR 17                             SLOW
  N7:37    SEN42       SEN45        M17P06                               M17S
           I:053       I:053        B3                                   O:063
--] [------] [--------]/[----------]/[---------------------------------( )--
   11        02          05         408                                   00
 [158]                             [628]
          PALLET
          DETECTED                O:063/00 - ] [ - File #2 MAIN_PRGRM - 306
          LEFT SIDE                        ]/[ - File #2 MAIN_PRGRM - 313
          DWELL 6                 T4:257.TT - ] [ - File #2 MAIN_PRGRM - 309
          SEN43                                                          MOTOR 17
           I:053                                                         SLOW PULSE
          --] [--                                                        M17SP
             03                                                          +-TON-----------------+
                                                                         |TIMER ON DELAY       |-(EN)-
                                                                         |TIMER:       T4:257  |
                                                                         |BASE (SEC):    0.01  |-(DN)
                                                                         |PRESET:        100   |
                                                                         |ACCUM:           0   |
                                                                         +---------------------+
 MANUAL MOTOR   DOOR 9   DOOR 10
 17 ON          OPEN     OPEN
 MM17ON         DROP9S   DROP10S
   N7:23        I:056    I:056
--] [----------] [------] [--
    15           01       03
 [527]
               PALLET
               DETECTED
               RIGHT SIDE
               BUFFER 4
               SEN48
                 I:053
               --]/[--
                  10
 MOTOR 17
 REVERSE
 M17R
   B3
--] [--
  117
 [584]
```

Rung #313

```
 MOTOR 17                                                                  MOTOR 17
 SLOW                                                                      SLOW STOP
 M17S                                                                      PULSE
  O:063                                                                    M17SSP
                                                                           +-TON-----------------+
--]/[----------------------------------------------------------------------|TIMER ON DELAY       |-(EN)-
   00                                                                      |TIMER:       T4:277  |
 [312]                                                                     |BASE (SEC):    0.01  |-(DN)
                                                                           |PRESET:        100   |
                                                                           |ACCUM:         102   |
                                                                           +---------------------+
T4:277.TT - ] [ - File #2 MAIN_PRGRM - 309
```

Rung #314
- 288 -
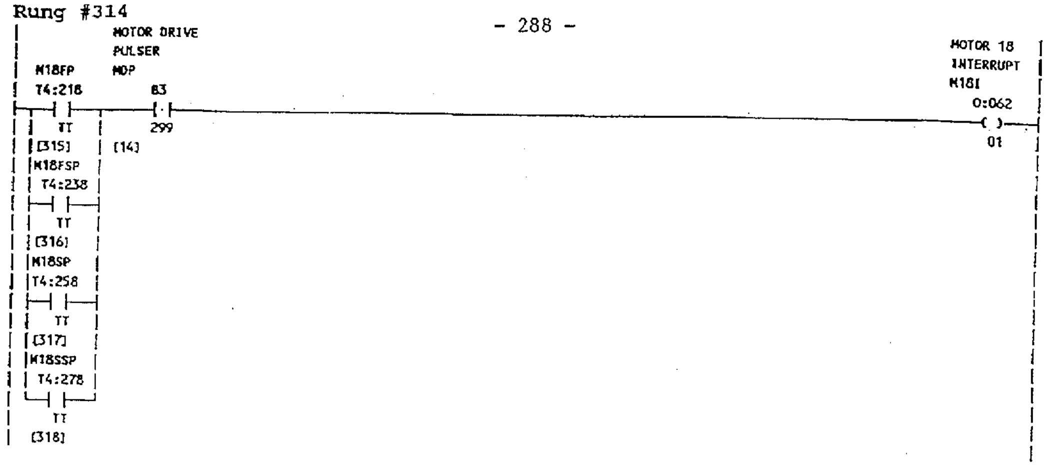

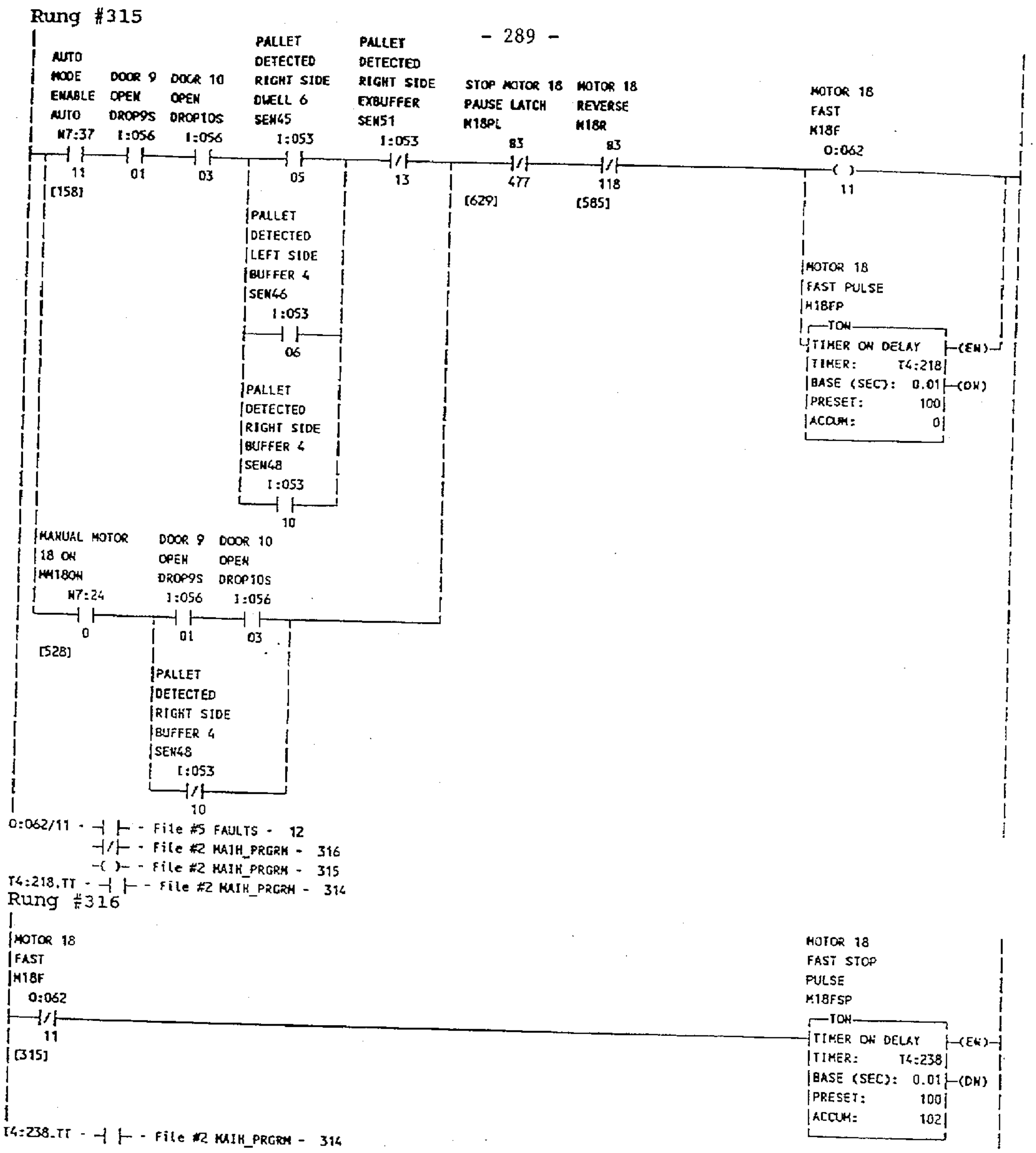
Rung #315
- 289 -
AUTO MODE ENABLE AUTO N7:37 11 [158]
DOOR 9 OPEN DROP9S I:056 01
DOOR 10 OPEN DROP10S I:056 03
PALLET DETECTED RIGHT SIDE DWELL 6 SEN45 I:053 05
PALLET DETECTED RIGHT SIDE EXBUFFER SEN51 I:053 13
STOP MOTOR 18 PAUSE LATCH M18PL B3 477 [629]
MOTOR 18 REVERSE M18R B3 118 [585]
MOTOR 18 FAST M18F O:062 11
PALLET DETECTED LEFT SIDE BUFFER 4 SEN46 I:053 06
PALLET DETECTED RIGHT SIDE BUFFER 4 SEN48 I:053 10
MOTOR 18 FAST PULSE M18FP
TON TIMER ON DELAY TIMER: T4:218 BASE (SEC): 0.01 PRESET: 100 ACCUM: 0 (EN) (DN)
MANUAL MOTOR 18 ON MM18ON N7:24 0 [528]
DOOR 9 OPEN DROP9S I:056 01
DOOR 10 OPEN DROP10S I:056 03
PALLET DETECTED RIGHT SIDE BUFFER 4 SEN48 I:053 10
O:062/11 - ┤ ├ - File #5 FAULTS - 12
┤/├ - File #2 MAIN_PRGRM - 316
-( )- - File #2 MAIN_PRGRM - 315
T4:218.TT - ┤ ├ - File #2 MAIN_PRGRM - 314
Rung #316
MOTOR 18 FAST M18F O:062 11 [315]
MOTOR 18 FAST STOP PULSE M18FSP
TON TIMER ON DELAY TIMER: T4:238 BASE (SEC): 0.01 PRESET: 100 ACCUM: 102 (EN) (DN)
T4:238.TT - ┤ ├ - File #2 MAIN_PRGRM - 314

```
Rung #317
| MANUAL MOTOR   DOOR 9   DOOR 10                                         MOTOR 18
| 18 ON          OPEN     OPEN                                            SLOW
| MM18ON         DROP9S   DROP10S                                         M18S
|     N7:24      I:056    I:056                                           O:063
|----] [-------+--] [------] [---+-+---------------------------------------( )----|
|      0       |   01       03   | |                                      01
| [528]        |                 | |
|              |PALLET           | | O:063/01 - ]/[ - File #2 MAIN_PRGRM - 318
|              |DETECTED         | | T4:258.TT - ] [ - File #2 MAIN_PRGRM - 314
|              |RIGHT SIDE       | |
|              |BUFFER 4         | |                                    |MOTOR 18
|              |SEN48            | |                                    |SLOW PULSE
|              |   I:053         | |                                    |M18SP
|              +----]/[----------+ |                                    |+-TON---------------+
|                    10            |                                    +|TIMER ON DELAY     |-(EN)-
|                                  |                                     |TIMER:      T4:258|
|                                  |                                     |BASE (SEC):   0.01|-(DN)
|                                  |                                     |PRESET:        100|
|                                  |                                     |ACCUM:           0|
|MOTOR 18                          |                                     +-------------------+
|REVERSE                           |
|M18R                              |
|   B3                             |
+----] [---------------------------+
    118
  [585]
Rung #318
|MOTOR 18                                                              MOTOR 18
|SLOW                                                                  SLOW STOP
|M18S                                                                  PULSE
|  O:063                                                               M18SSP
|                                                                      +-TON---------------+
|----]/[---------------------------------------------------------------|TIMER ON DELAY     |-(EN)-
|    01                                                                |TIMER:      T4:278|
| [317]                                                                |BASE (SEC):   0.01|-(DN)
|                                                                      |PRESET:        100|
|                                                                      |ACCUM:         101|
|                                                                      +-------------------+
T4:278.TT - ] [ - File #2 MAIN_PRGRM - 314
Rung #319
|            MOTOR DRIVE                                                MOTOR 19
|            PULSER                                                     INTERRUPT
|  M19FP     MDP                                                        M19I
|  T4:219        B3                                                     O:062
|--+--] [--+----] [--------------------------------------------------------( )----|
|  |  TT   |    299                                                       02
|  | [320] | [14]
|  |M19FSP |
|  | T4:239|
|  +--] [--+
|  |  TT   |
|  | [321] |
|  |M19SP  |
|  |T4:259 |
|  +--] [--+
|  |  TT   |
|  | [322] |
|  |M19SSP |
|  | T4:279|
|  +--] [--+
|     TT
|   [323]
```

Rung #320
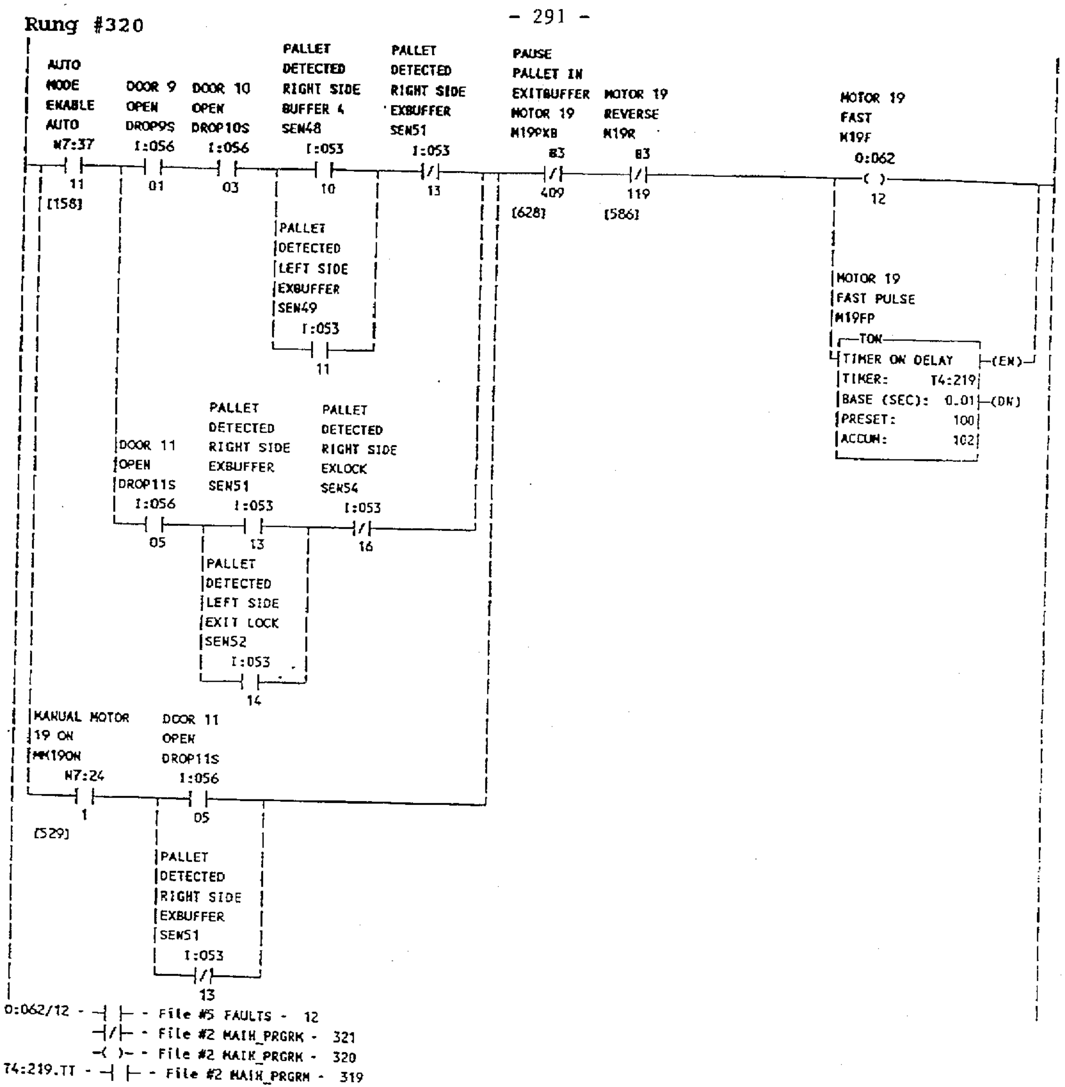
O:062/12 - ┤ ├ - File #5 FAULTS - 12
┤/├ - File #2 MAIN_PRGRM - 321
─( )─ - File #2 MAIN_PRGRM - 320
T4:219.TT - ┤ ├ - File #2 MAIN_PRGRM - 319

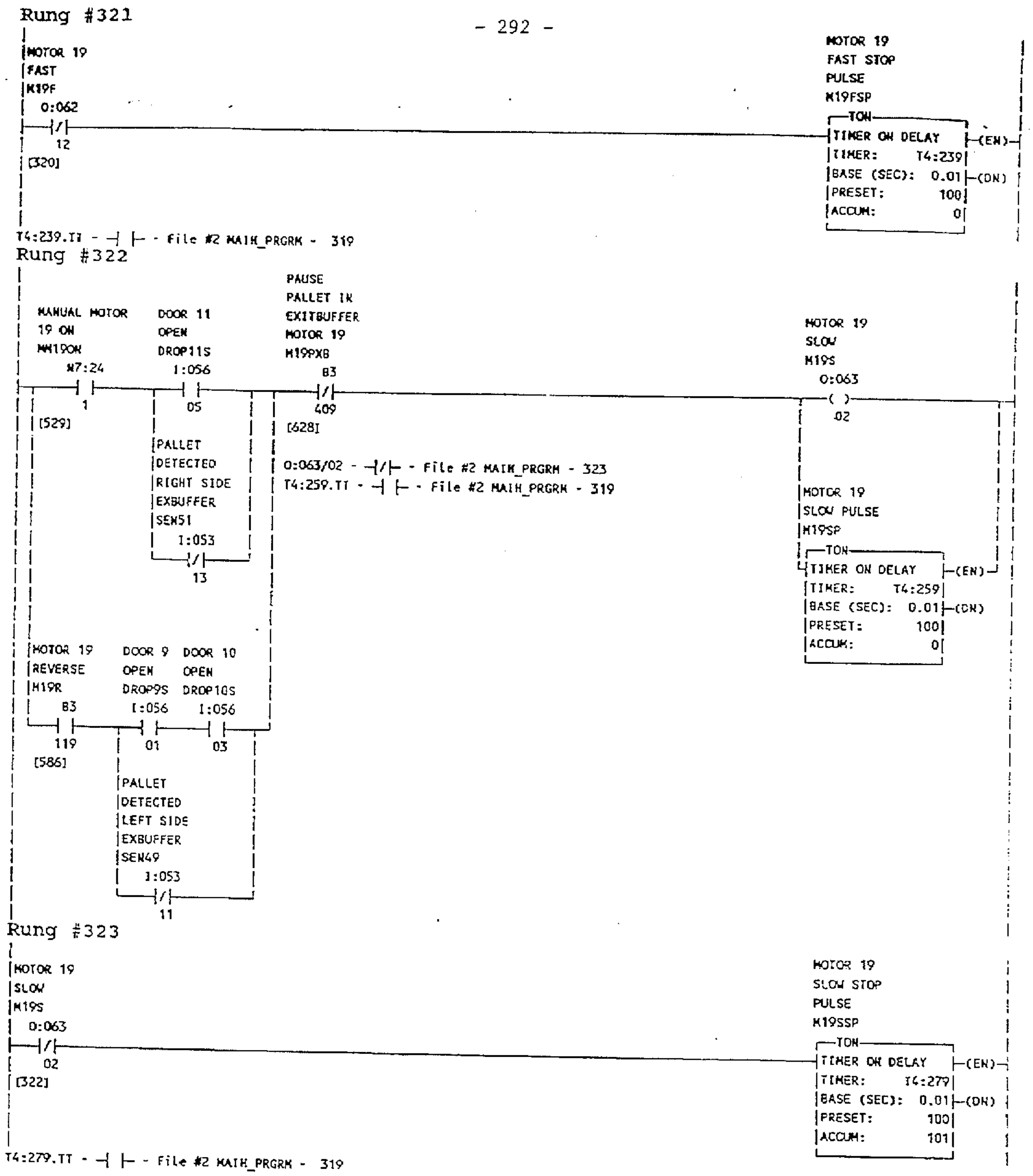
Rung #321
- 292 -
MOTOR 19
FAST
M19F
O:062
12
[320]
MOTOR 19
FAST STOP
PULSE
M19FSP
TON
TIMER ON DELAY
TIMER: T4:239
BASE (SEC): 0.01
PRESET: 100
ACCUM: 0
(EN)
(DN)
T4:239.TT - ┤ ├ - File #2 MAIN_PRGRM - 319
Rung #322
MANUAL MOTOR
19 ON
MM19ON
N7:24
1
[529]
DOOR 11
OPEN
DROP11S
I:056
05
PALLET
DETECTED
RIGHT SIDE
EXBUFFER
SEN51
I:053
13
PAUSE
PALLET IN
EXITBUFFER
MOTOR 19
M19PXB
B3
409
[628]
O:063/02 - ┤/├ - File #2 MAIN_PRGRM - 323
T4:259.TT - ┤ ├ - File #2 MAIN_PRGRM - 319
MOTOR 19
SLOW
M19S
O:063
02
MOTOR 19
SLOW PULSE
M19SP
TON
TIMER ON DELAY
TIMER: T4:259
BASE (SEC): 0.01
PRESET: 100
ACCUM: 0
(EN)
(DN)
MOTOR 19
REVERSE
M19R
B3
119
[586]
DOOR 9
OPEN
DROP9S
I:056
01
DOOR 10
OPEN
DROP10S
I:056
03
PALLET
DETECTED
LEFT SIDE
EXBUFFER
SEN49
I:053
11
Rung #323
MOTOR 19
SLOW
M19S
O:063
02
[322]
MOTOR 19
SLOW STOP
PULSE
M19SSP
TON
TIMER ON DELAY
TIMER: T4:279
BASE (SEC): 0.01
PRESET: 100
ACCUM: 101
(EN)
(DN)
T4:279.TT - ┤ ├ - File #2 MAIN_PRGRM - 319

```
Rung #324
| PUMPDOWN                                                              EXITLOCK
| SYSTEM                                                                HIVAC BAFFLE
| ENABLE                                                                ENABLE
| POSE                                                                  HV12_3
|     B3                                                                  O:061
|-+--| |-----------------------------------------------------------------+---(L)------+-|
| |   303                                  |                             |    17      | |
| |[23]                                    |                             |            | |
| |                                        | O:061/17 - -(U)- - File #2 MAIN_PRGRM - 139
| |                                        | T4:39.DN - -| |- - File #2 MAIN_PRGRM - 326
| |         PALLET               PALLET    |                             |
| |AUTO     DETECTED             DETECTED  |                             |DOOR 10
| |MODE     CENTER     DOOR 11   RIGHT SIDE|                             |DELAY TIMER
| |ENABLE   DWELL 6    CLOSED    EXBUFFER  |                             |DR10OT
| |AUTO     SEN44      DRCL11S   SEN51     |                             |+-TON-------------+
| | N7:37    I:053     I:056     I:053     |                             +|TIMER ON DELAY   |-(EN)-+
| |-| |------| |-------| |-------|/|-------|                              |TIMER:     T4:39|
| |   11     04        04        13        |                              |BASE (SEC):  1.0|-(DN)
| |[158]                                   |                              |PRESET:        5|
| |                                        |                              |ACCUM:         0|
| |SYSTEM                                  |                              +----------------+
| |VENT                                    |
| |ENABLE                                  |
| |SYSVNTE                                 |
| | N7:37                                  |
| +--| |-----------------------------------+
|      5
|  [368]
Rung #325
|
| PREPARE FOR  DOOR 9                                          DOOR OPEN
| AUTO RUN     OPEN                                            SOLENOID
| >AUTO        DROP9S                                          9 ENABLE
|     N7:37     I:056                                          DROP9
|                                                                O:061
|-+--| |-------|/|-------------------------------------------+---( )-------------------------+-|
| |     1       01                     |                     |   01                         | |
| |[162]                               |                     |                              | |
| |                                    | O:061/01 - -| |- - File #2 MAIN_PRGRM - 325
| |                                    |            File #5 FAULTS - 57
| |MANUAL       EXIT BUFFER  CARBON    |            File #6 TECH_RUNGS - 3
| |CONTROL      CHAMBER      CHAMBER   | N7:32/15 - -(U)- - File #2 MAIN_PRGRM - 329
| |OPEN DOOR    =<250        =<250     | _F:N7:21[%21 - BTW - File #2 MAIN_PRGRM - 2
| |9            MICRONS      MICRONS   | N7:32/3 - -(L)- - File #2 MAIN_PRGRM - 329
| |M-DROP9      PIR15        PIR16     | _F:N7:21[%21 - BTW - File #2 MAIN_PRGRM - 2
| | N7:11          I:040       I:054   |
| +--| |------+-----| |---------| |--+-+
|     15      |      13          07  |
|  [3]        |                      |
|             |EXIT BUFFER  CARBON   |
|             |CHAMBER      CHAMBER  |
|             |=<250        =<250    |
|             |MICRONS      MICRONS  |
|             |PIR15        PIR16    |
|             |   I:040       I:054  |
|             +----|/|---------|/|---+
|                  13           07

                                                               |MANUAL
                                                               |CONTROL     DOOR OPEN   MANUAL
                                                               |OPEN DOOR   SOLENOID    DOOR 9
                                                               |9           9 ENABLE    OPEN
                                                               |M-DROP9     DROP9       MDR9OP
                                                               |  N7:11       O:061      N7:32
                                                               +---| |--------| |-----+--(L)---+
                                                                    15         01     |   15   |
                                                               [3]          [325]     |        |
                                                                                      |MANUAL  |
                                                                                      |DOOR 9  |
                                                                                      |CLOSE   |
                                                                                      |MDR9CL  |
                                                                                      | N7:32  |
                                                                                      +--(U)---+
                                                                                          3
```

- 294 -
Rung #326
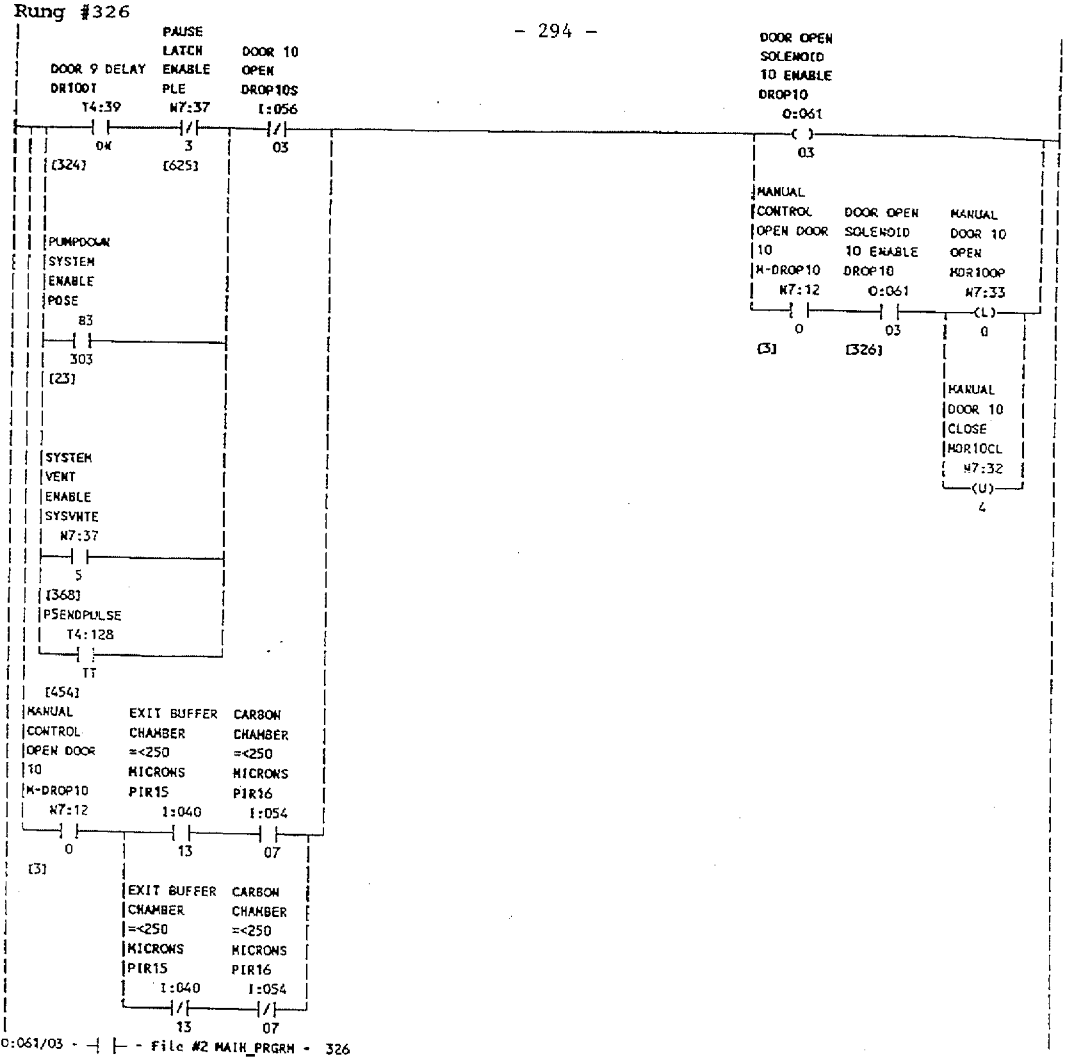
O:061/03 - -| |- - File #2 MAIN_PRGRM - 326
File #5 FAULTS - 59
File #6 TECH_RUNGS - 3
-( )- - File #2 MAIN_PRGRM - 326
N7:33/0 - -(L)- - File #2 MAIN_PRGRM - 326
-(U)- - File #2 MAIN_PRGRM - 335
_F:N7:211X21 - BTW - File #2 MAIN_PRGRM - 2
N7:32/4 - -(L)- - File #2 MAIN_PRGRM - 335
-(U)- - File #2 MAIN_PRGRM - 326

_F:N7:21[X21 - BTW - File #2 MAIN_PRGRM - 2 
Rung #327
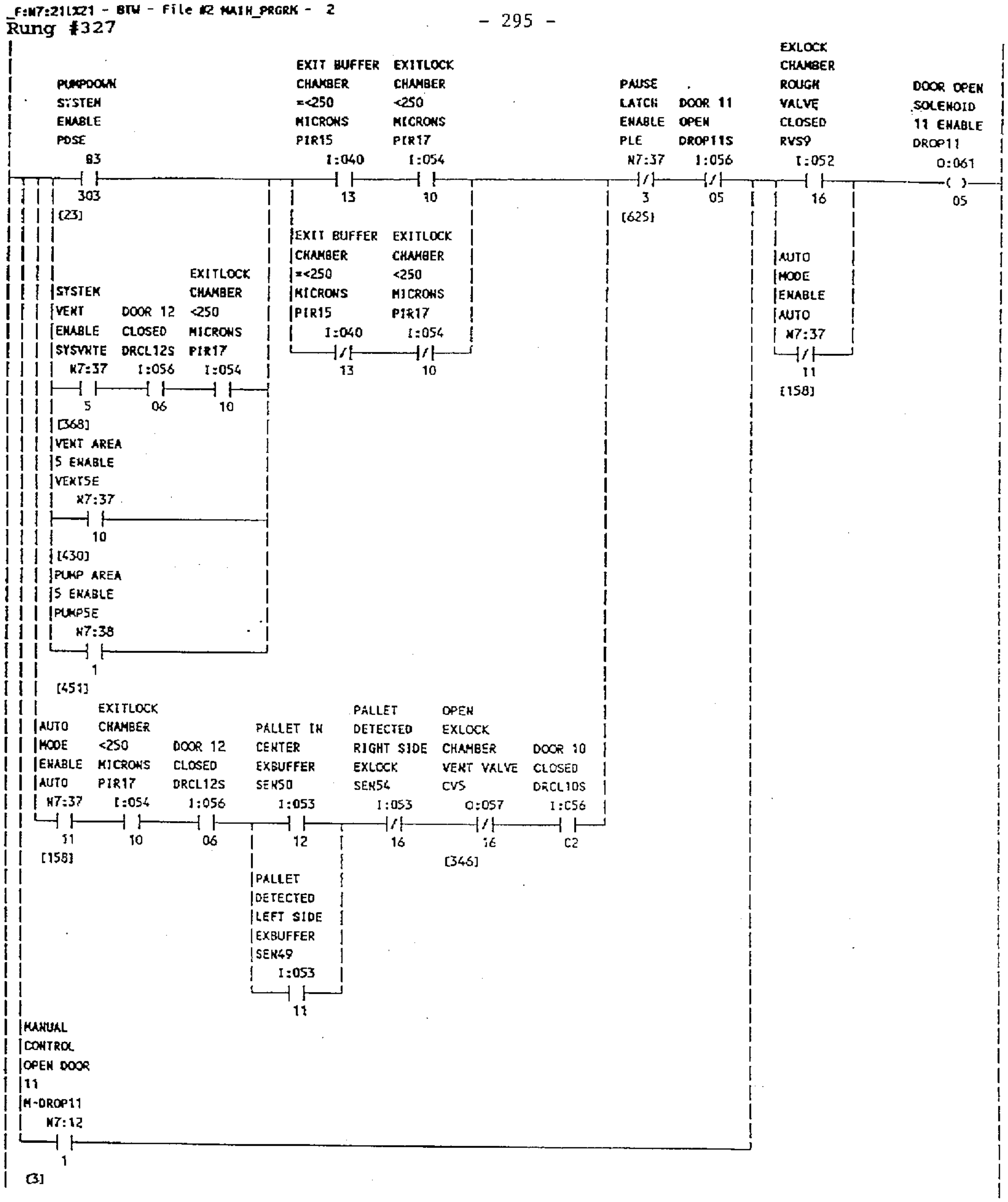

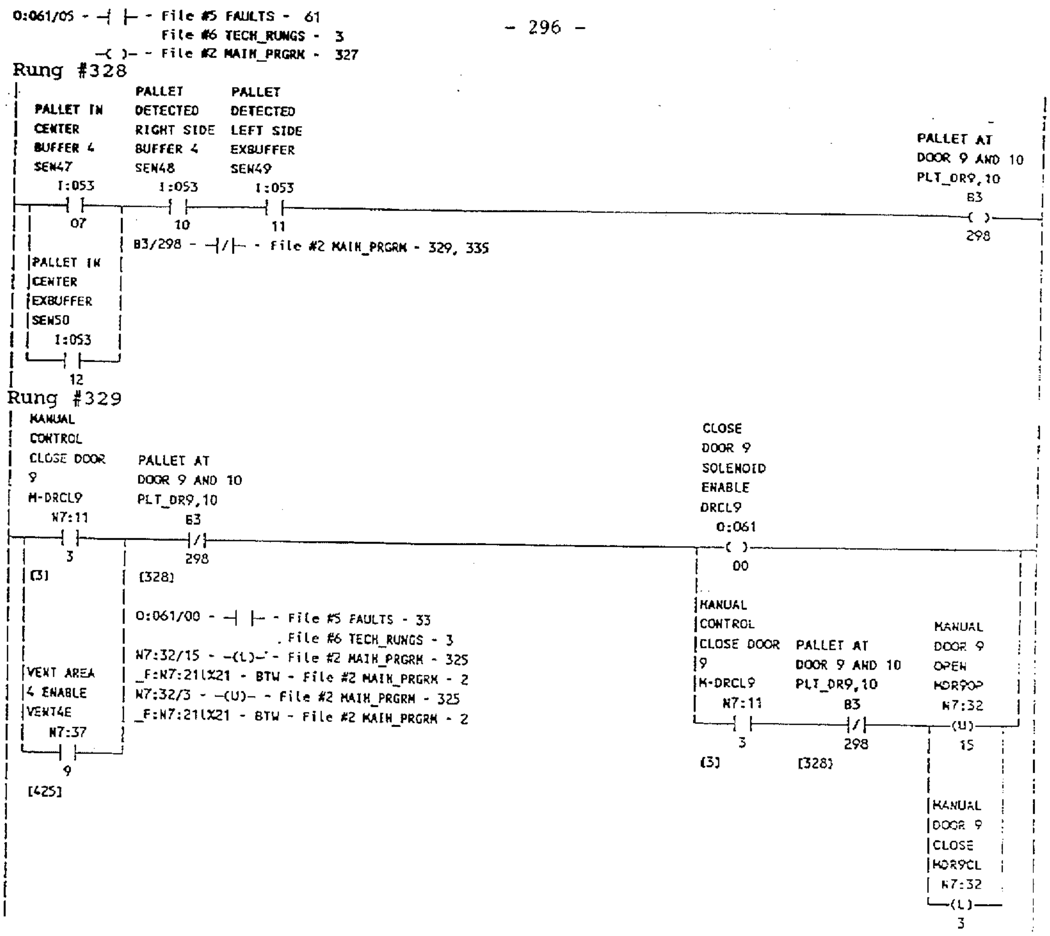
0:061/05 - ┤ ├ - File #5 FAULTS - 61
File #6 TECH_RUNGS - 3
-( )- - File #2 MAIN_PRGRM - 327
- 296 -
Rung #328
PALLET IN CENTER BUFFER 4 SEN47 I:053 07
PALLET DETECTED RIGHT SIDE BUFFER 4 SEN48 I:053 10
PALLET DETECTED LEFT SIDE EXBUFFER SEN49 I:053 11
PALLET AT DOOR 9 AND 10 PLT_DR9,10 B3 298
B3/298 - ┤/├ - File #2 MAIN_PRGRM - 329, 335
PALLET IN CENTER EXBUFFER SEN50 I:053 12
Rung #329
MANUAL CONTROL CLOSE DOOR 9 M-DRCL9 N7:11 3 [3]
PALLET AT DOOR 9 AND 10 PLT_DR9,10 B3 298 [328]
CLOSE DOOR 9 SOLENOID ENABLE DRCL9 0:061 00
0:061/00 - ┤ ├ - File #5 FAULTS - 33
File #6 TECH_RUNGS - 3
N7:32/15 - -(L)- - File #2 MAIN_PRGRM - 325
_F:N7:21LX21 - BTW - File #2 MAIN_PRGRM - 2
N7:32/3 - -(U)- - File #2 MAIN_PRGRM - 325
_F:N7:21LX21 - BTW - File #2 MAIN_PRGRM - 2
VENT AREA 4 ENABLE VENT4E N7:37 9 [425]
MANUAL CONTROL CLOSE DOOR 9 M-DRCL9 N7:11 3 [3]
PALLET AT DOOR 9 AND 10 PLT_DR9,10 B3 298 [328]
MANUAL DOOR 9 OPEN MDR9OP N7:32 15
MANUAL DOOR 9 CLOSE MDR9CL N7:32 3

Rung #330
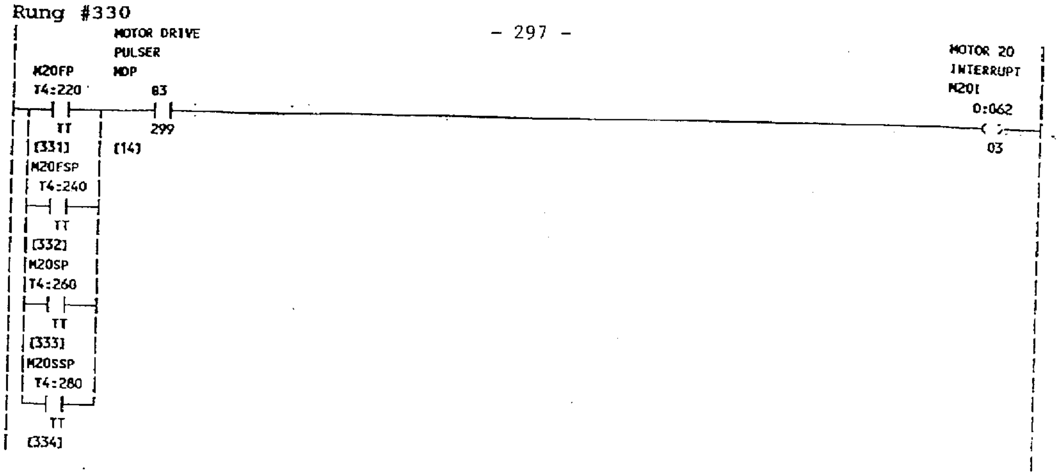

Rung #331
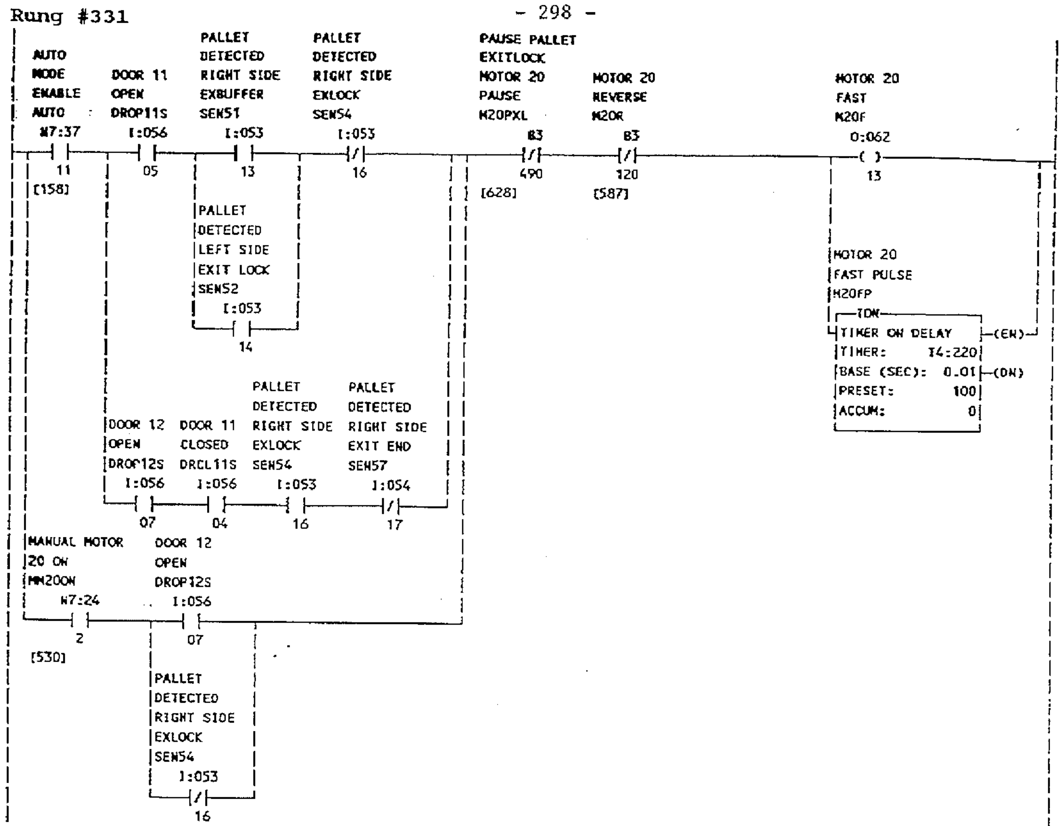
O:062/13 - ┤ ├ - File #5 FAULTS - 13
-┤/├- - File #2 MAIN_PRGRM - 332
-( )- - File #2 MAIN_PRGRM - 331
T4:220.TT - ┤ ├ - File #2 MAIN_PRGRM - 330
Rung #332
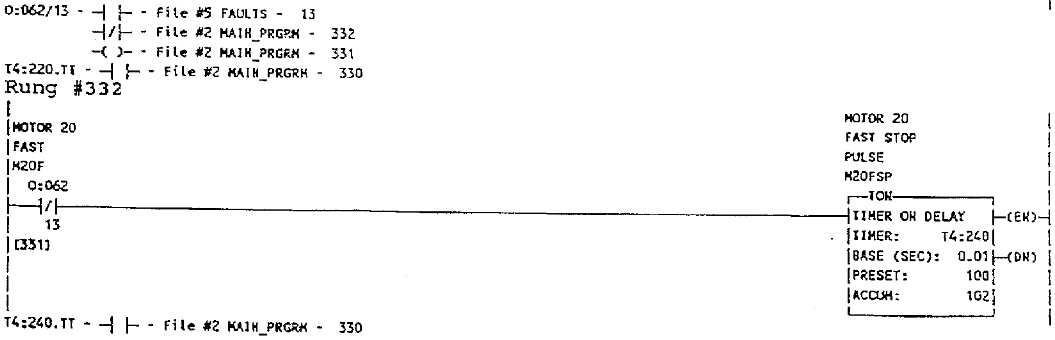
T4:240.TT - ┤ ├ - File #2 MAIN_PRGRM - 330

Rung #333
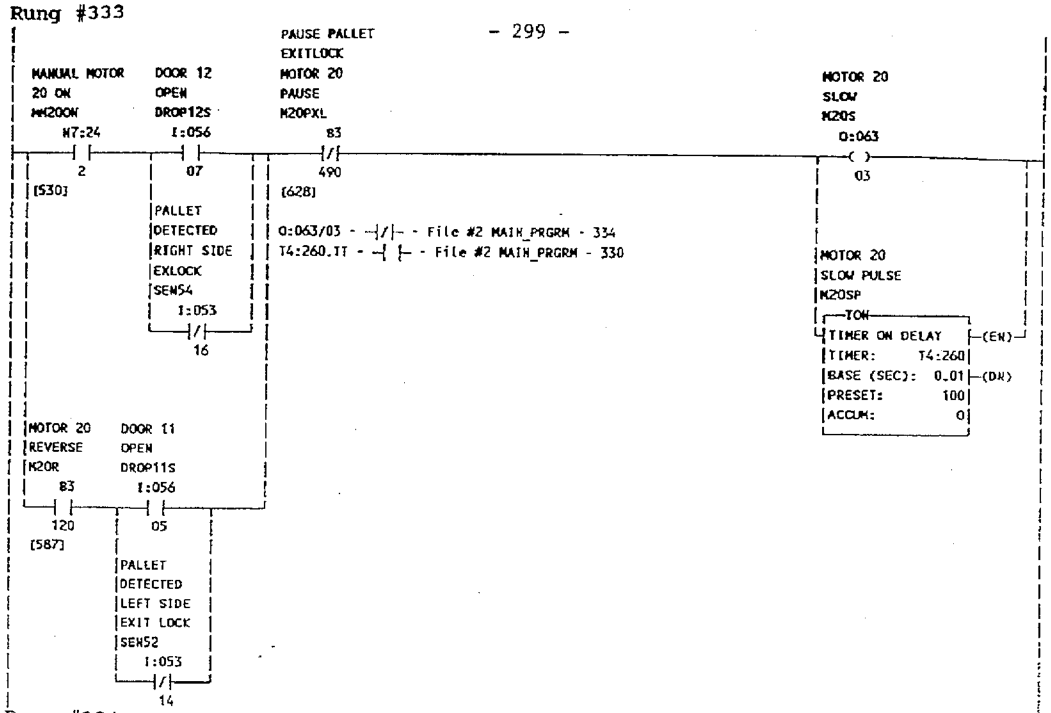
Rung #334
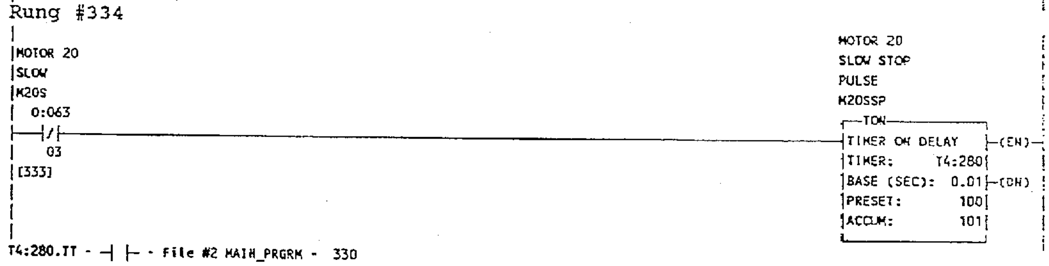

Rung #335 - 300 -
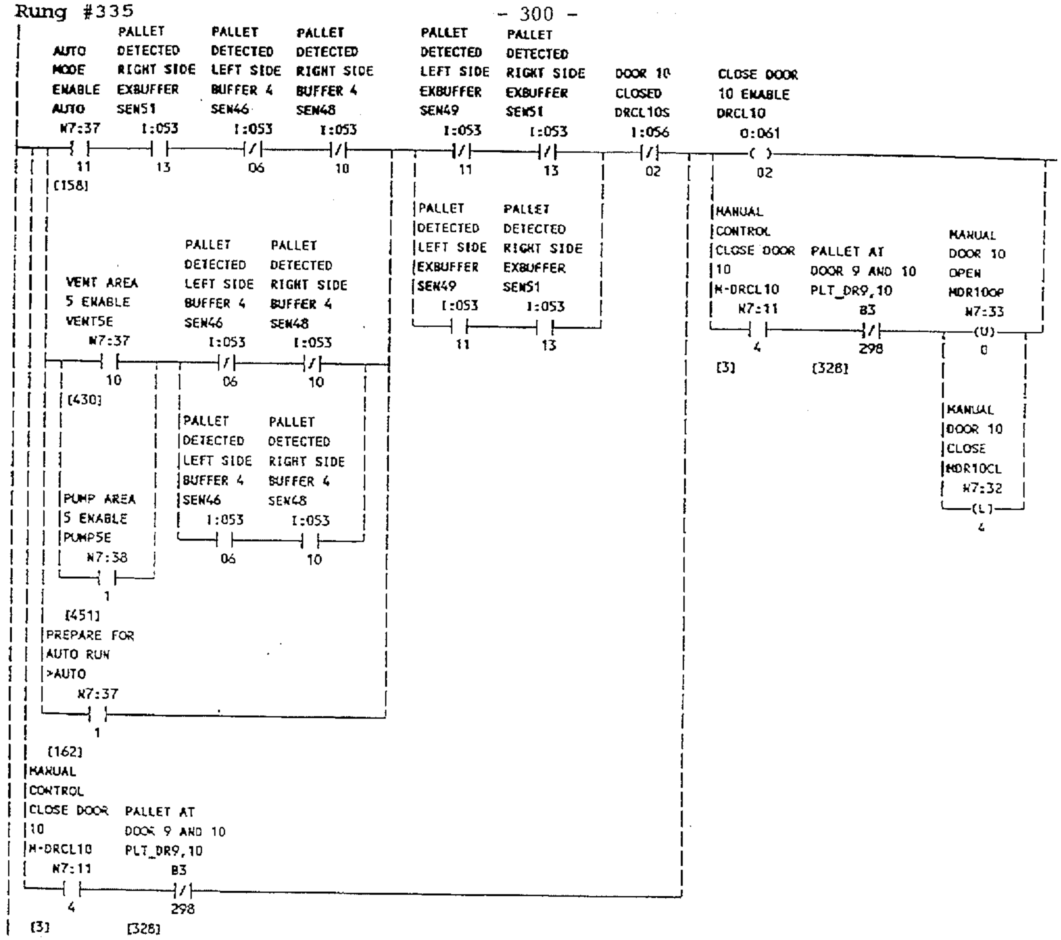
O:061/02 - -| |- - File #5 FAULTS - 35
File #6 TECH_RUNGS - 3
-( )- - File #2 MAIN_PRGRM - 335
N7:33/0 - -(L)- - File #2 MAIN_PRGRM - 326
-(U)- - File #2 MAIN_PRGRM - 335
_F:N7:21[X21 - BTW - File #2 MAIN_PRGRM - 2
N7:32/4 - -(L)- - File #2 MAIN_PRGRM - 335
-(U)- - File #2 MAIN_PRGRM - 326
_F:N7:21[X21 - BTW - File #2 MAIN_PRGRM - 2

Rung #336
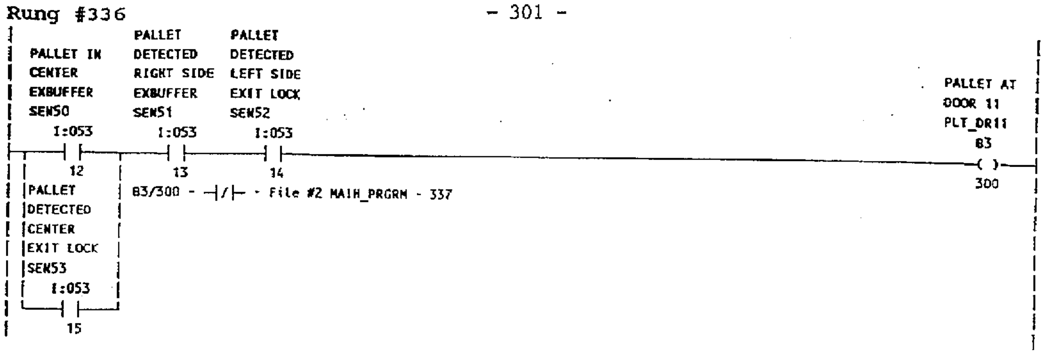

Rung #337 - 302 -
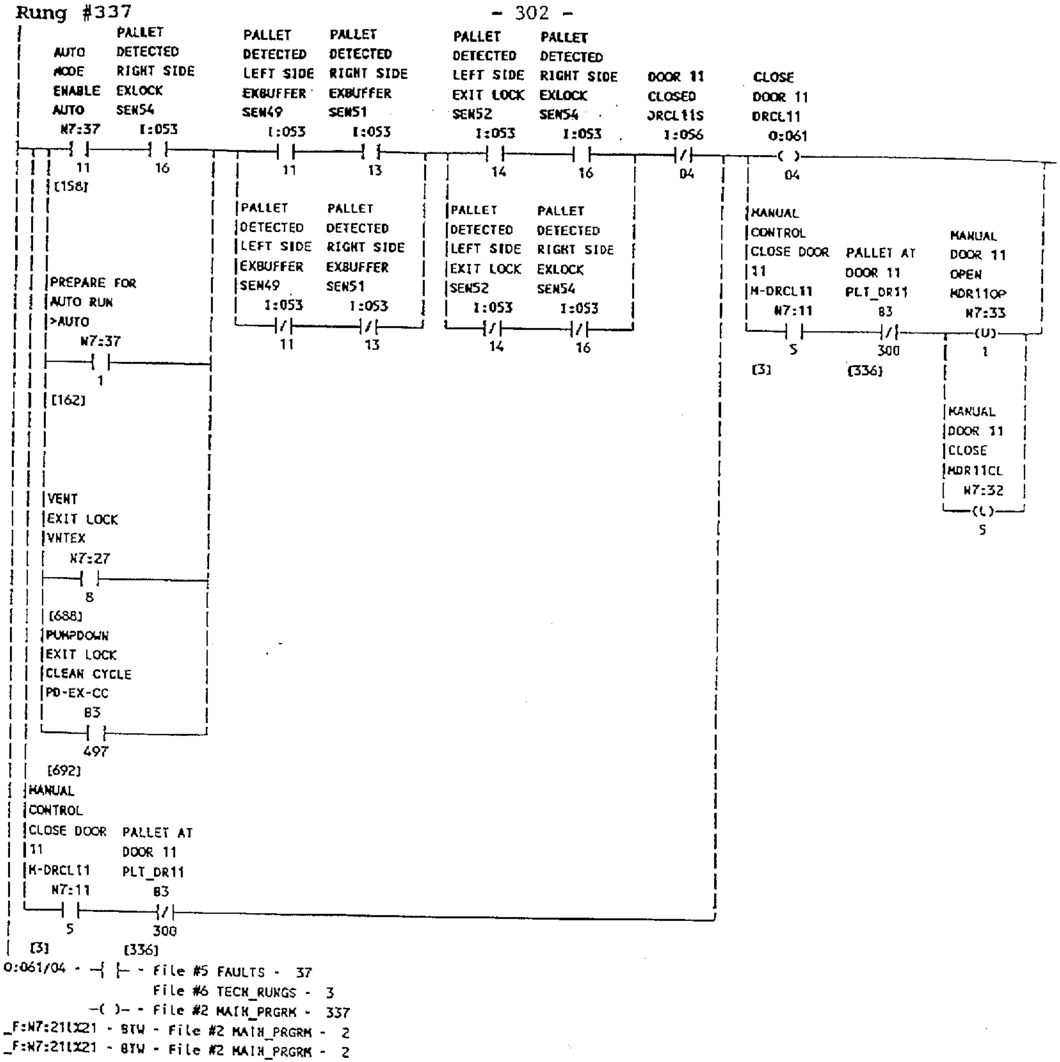
O:061/04 - -] [- - File #5 FAULTS - 37
File #6 TECH_RUNGS - 3
-( )- - File #2 MAIN_PRGRM - 337
_F:N7:21[X21 - BTW - File #2 MAIN_PRGRM - 2
_F:N7:21[X21 - BTW - File #2 MAIN_PRGRM - 2

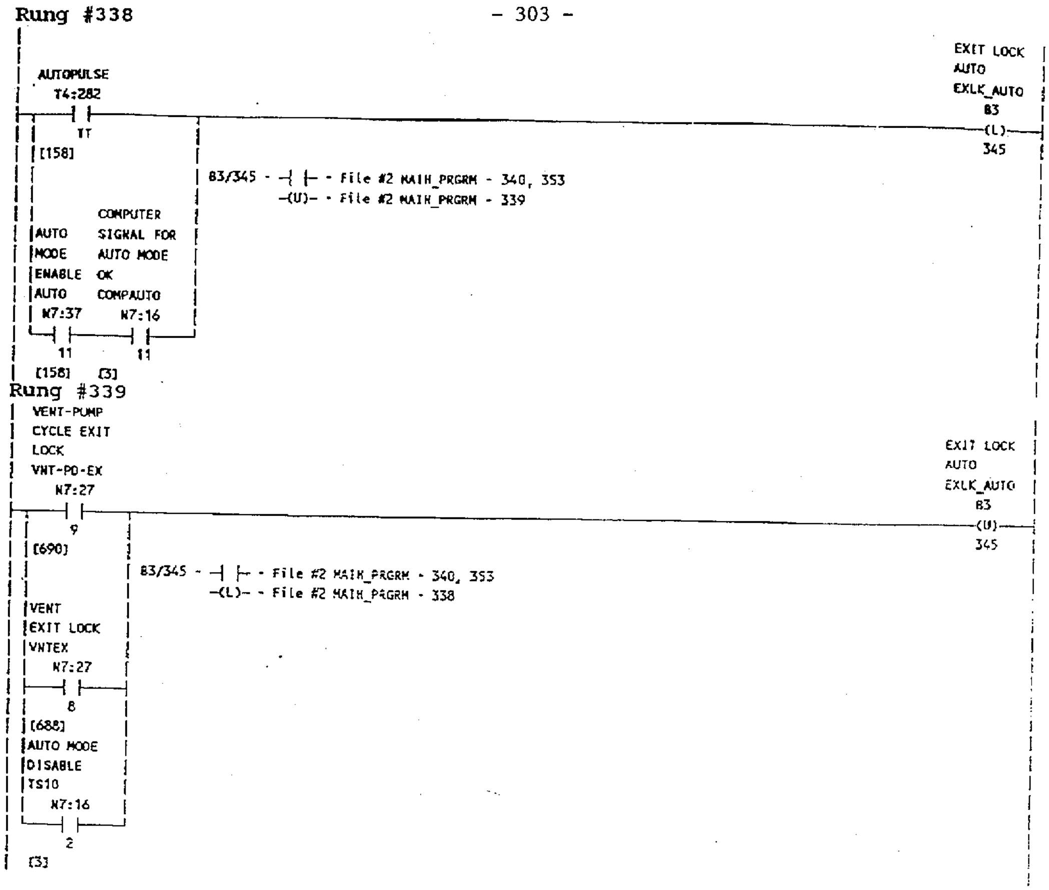
Rung #338
AUTOPULSE
T4:282
TT
[158]
EXIT LOCK
AUTO
EXLK_AUTO
B3
(L)
345
B3/345 - ┤ ├ - File #2 MAIN_PRGRM - 340, 353
-(U)- - File #2 MAIN_PRGRM - 339
AUTO
MODE
ENABLE
AUTO
N7:37
11
[158]
COMPUTER
SIGNAL FOR
AUTO MODE
OK
COMPAUTO
N7:16
11
[3]
Rung #339
VENT-PUMP
CYCLE EXIT
LOCK
VNT-PD-EX
N7:27
9
[690]
EXIT LOCK
AUTO
EXLK_AUTO
B3
(U)
345
B3/345 - ┤ ├ - File #2 MAIN_PRGRM - 340, 353
-(L)- - File #2 MAIN_PRGRM - 338
VENT
EXIT LOCK
VNTEX
N7:27
8
[688]
AUTO MODE
DISABLE
TS10
N7:16
2
[3]

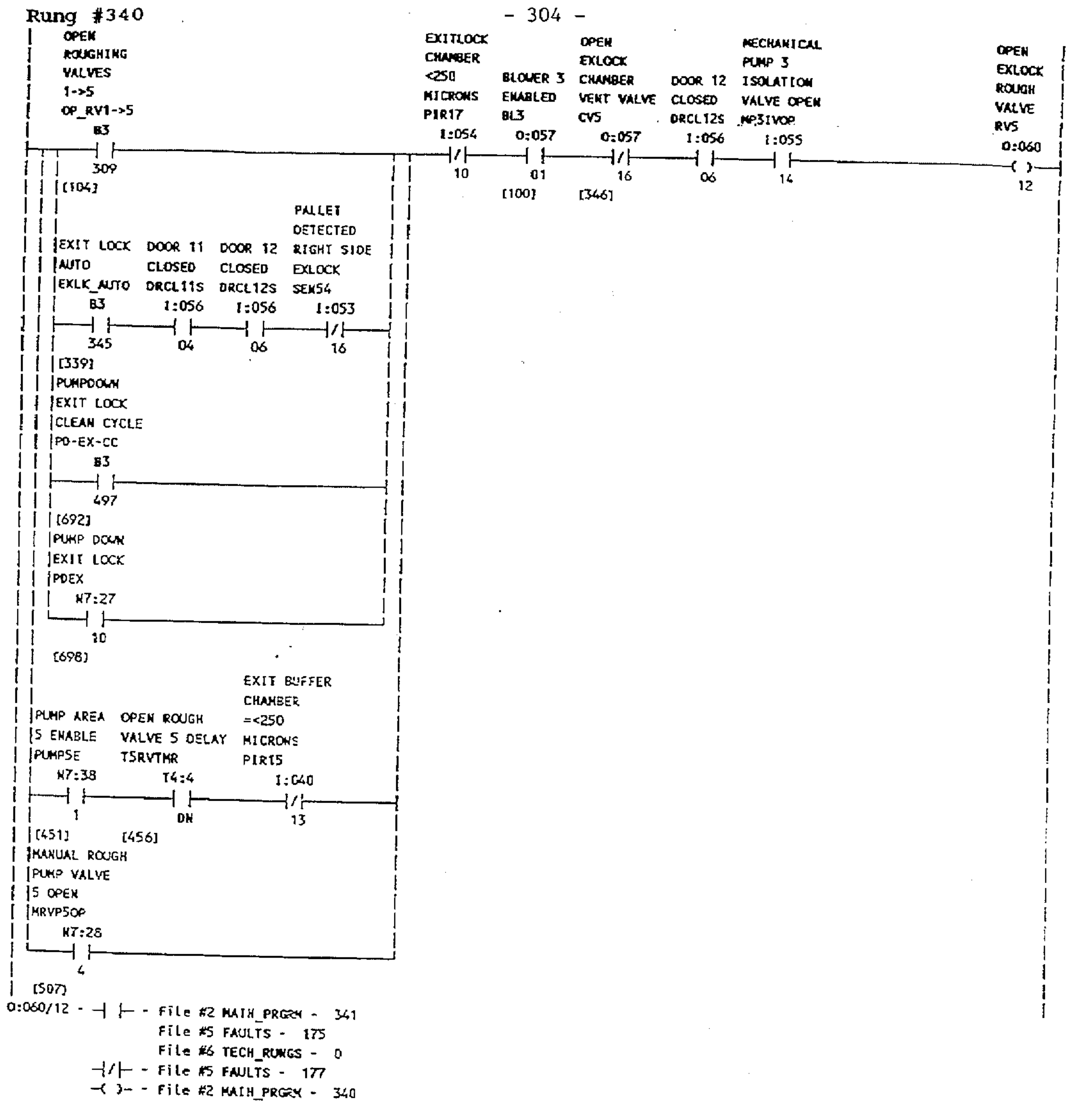
Rung #340
- 304 -
OPEN ROUGHING VALVES 1->5 OP_RV1->5
B3
309
[104]
EXIT LOCK AUTO EXLK_AUTO
B3
345
DOOR 11 CLOSED DRCL11S
I:056
04
DOOR 12 CLOSED DRCL12S
I:056
06
PALLET DETECTED RIGHT SIDE EXLOCK SEN54
I:053
16
[339]
PUMPDOWN EXIT LOCK CLEAN CYCLE PD-EX-CC
B3
497
[692]
PUMP DOWN EXIT LOCK PDEX
N7:27
10
[698]
PUMP AREA 5 ENABLE PUMP5E
N7:38
1
OPEN ROUGH VALVE 5 DELAY T5RVTMR
T4:4
DN
EXIT BUFFER CHAMBER =<250 MICRONS PIR15
I:040
13
[451]
[456]
MANUAL ROUGH PUMP VALVE 5 OPEN MRVP5OP
N7:26
4
[507]
EXITLOCK CHAMBER <250 MICRONS PIR17
I:054
10
BLOWER 3 ENABLED BL3
O:057
01
[100]
OPEN EXLOCK CHAMBER VENT VALVE CVS
O:057
16
[346]
DOOR 12 CLOSED DRCL12S
I:056
06
MECHANICAL PUMP 3 ISOLATION VALVE OPEN MP3IVOP
I:055
14
OPEN EXLOCK ROUGH VALVE RVS
O:060
12
O:060/12 - ┤ ├ - File #2 MAIN_PRGRM - 341
File #5 FAULTS - 175
File #6 TECH_RUNGS - 0
┤/├ - File #5 FAULTS - 177
-( )- - File #2 MAIN_PRGRM - 340

```
Rung #341
|        OPEN
|AUTO    EXLOCK                                                              EXIT LOCK        |
|MODE    ROUGH                                                               ROUGHING         |
|ENABLE  VALVE                                                               TIMER            |
|AUTO    RV5                                                                 EXRUFFTMR        |
| N7:37   O:060                                                             +-TON-----------+  |
|--] [----] [---------------------------------------------------------------+TIMER ON DELAY +-(EN)-|
|  11      12                                                               |TIMER:   T4:166|  |
|[158]    [340]                                                             |BASE (SEC): 1.0+-(DN)|
|                                                                           |PRESET:     60|  |
|                                                                           |ACCUM:       0|  |
|                                                                           +--------------+  |
T4:166.DN - ] [ - File #2 MAIN_PRGRM - 342
Rung #342
|
|                                                                              EXIT LOCK    |
|                                                                              ROUGHING     |
|EXRUFFTMR                                                                     >60 SEC      |
| T4:166                                                                       EXLKRUFF>60S |
|---] [------------------------------------------------------------------------    B3      |
|    DN                                                                        ---(L)------|
|[341]                                                                            817      |
B3/817 - ] [ - File #2 MAIN_PRGRM - 626
        -(L)- - File #2 MAIN_PRGRM - 342
        -(U)- - File #2 MAIN_PRGRM - 343
Rung #343
|
|PAUSE                                                                         EXIT LOCK    |
|DISABLE                                                                       ROUGHING     |
|TS12                                                                          >60 SEC      |
| N7:16                                                                        EXLKRUFF>60S |
|---] [------------------------------------------------------------------------    B3      |
|    4                                                                         ---(U)------|
|[3]                                                                              817      |
B3/817 - ] [ - File #2 MAIN_PRGRM - 626
        -(L)- - File #2 MAIN_PRGRM - 342
        -(U)- - File #2 MAIN_PRGRM - 343
Rung #344
|
|VENT 5                                                                     VENT 5 STAGE1    |
|STAGE 1                                                                    VENT 5 DELAY     |
|VSST1                                                                      TIMER            |
| B3                                                                        VSCV5DYTMR       |
|---] [--------------------------------------------------------------------+-TON-----------+  |
|   420                                                                    +TIMER ON DELAY +-(EN)-|
|[432]                                                                     |TIMER:    T4:30|  |
|                                                                          |BASE (SEC): 1.0+-(DN)|
|                                                                          |PRESET:       5|  |
|                                                                          |ACCUM:        0|  |
|                                                                          +---------------+  |
T4:30.DN - ] [ - File #2 MAIN_PRGRM - 346
Rung #345
|
|                                                                           VENT OPEN        |
|DOOR 11                                                                    DELAY ON         |
|CLOSED                                                                     DOOR 11          |
|DRCL11S                                                                    CLOSE            |
| I:056                                                                     VDOR11CL         |
|---] [--------------------------------------------------------------------+-TON-----------+  |
|   04                                                                     +TIMER ON DELAY +-(EN)-|
|                                                                          |TIMER:   T4:202|  |
| T4:202.DN - ] [ - File #2 MAIN_PRGRM - 346                               |BASE (SEC): 1.0+-(DN)|
|                                                                          |PRESET:       1|  |
|                                                                          |ACCUM:        1|  |
>                                                                          >>>>>>>>>>>>>>>>>  >
```

- 306 -

Rung #346

| Label | Address | Bit |
|---|---|---|
| AUTO MODE ENABLE AUTO | N7:37 | 11 [158] |
| DOOR 11 CLOSED DRCL11S | I:056 | 04 |
| DOOR 12 CLOSED DRCL12S | I:056 | 06 |
| EXLOCK CHAMBER ROUGH VALVE CLOSED RVS9 | I:052 | 16 |
| PALLET DETECTED RIGHT SIDE EXLOCK SEN54 | I:053 | 16 |
| VDOR11CL | T4:202 | DN [345] |
| EXITLOCK CHAMBER GATE VALVE CLOSED RV12S1 | I:054 | 03 |
| CHAMBER VENT 5 DELAY TIMER VSCVSDYTMR | T4:30 | DN [344] |
| READY TO VENT RTVCVDT | T4:0 | DN [392] |
| EXLOCK CHAMBER ROUGH VALVE CLOSED RVS9 | I:052 | 16 |
| MANUAL CONTROL CHAMBER VENT 5 OPEN M-CVS-1 | N7:6 | 15 [3] |
| VENT EXIT LOCK VNTEX | N7:27 | 8 [688] |
| DOOR 11 CLOSED DRCL11S | I:056 | 04 |
| DOOR 12 CLOSED DRCL12S | I:056 | 06 |
| EXLOCK CHAMBER PRESSUR AT ATMOSPHERE PS6 | I:052 | /04 |
| VENT EXIT LOCK VNT-EX | B3 | 498 [694] |
| EXLOCK CHAMBER PRESSUR AT ATMOSPHERE PS6 | I:052 | /04 |

OPEN EXLOCK CHAMBER VENT VALVE CV5 — O:057 —(L)— 16

0:057/16 - ┤ ├ - - File #2 MAIN_PRGRM - 347
File #6 TECH_RUNGS - 0
-┤/├- - File #2 MAIN_PRGRM - 67, 327, 340, 368, 453, 689, 695
-(U)- - File #2 MAIN_PRGRM - 367

```
Rung #347
|       OPEN
|AUTO   EXLOCK
|MODE   CHAMBER     PAUSE                                             EXIT LOCK
|ENABLE VENT VALVE  DISABLE                                           VENT TIMER
|AUTO   CVS         TS12                                              EXVNTTIMER
| N7:37    O:057     N7:16                                            +--TON---------------+
|--| |------| |-------|/|---------------------------------------------|TIMER ON DELAY      |-(EN)-
|   11      16        4                                               |TIMER:        T4:99 |
|[158]    [346]      [3]                                              |BASE (SEC):     1.0 |-(DN)
|                                                                     |PRESET:         100 |
|                                                                     |ACCUM:            0 |
|                                                                     +--------------------+
T4:99.DN - -| |- - File #2 MAIN_PRGRM - 348
Rung #348
|
|                                                                     EXIT LOCK
|EXVNTTIMER                                                           VENT>30 SECS
|  T4:99                                                              EXLKVNT>30SECS
|--| |----------------------------------------------------------------B3
|   DN                                                              --(L)--
|[347]                                                                815
B3/815 - -| |- - File #2 MAIN_PRGRM - 626
        -(L)- - File #2 MAIN_PRGRM - 348
        -(U)- - File #2 MAIN_PRGRM - 349
Rung #349
|PAUSE
|DISABLE                                                              EXIT LOCK
|TS12                                                                 VENT>30 SECS
| N7:16                                                               EXLKVNT>30SECS
|--| |----------------------------------------------------------------B3
|   4                                                               --(U)--
|[3]                                                                  815
B3/815 - -| |- - File #2 MAIN_PRGRM - 626
        -(L)- - File #2 MAIN_PRGRM - 348
        -(U)- - File #2 MAIN_PRGRM - 349
Rung #350
|
|DOOR 12                                                              EXITLOCK
|OPEN                                                                 AIR SWEEP
|DROP12S                                                              SOLENOID
| I:056                                                               EXSWEEP
|--| |----------------------------------------------------------------O:061
|   07                                                              --( )--
|                                                                     10
```

Rung #351 - 308 -
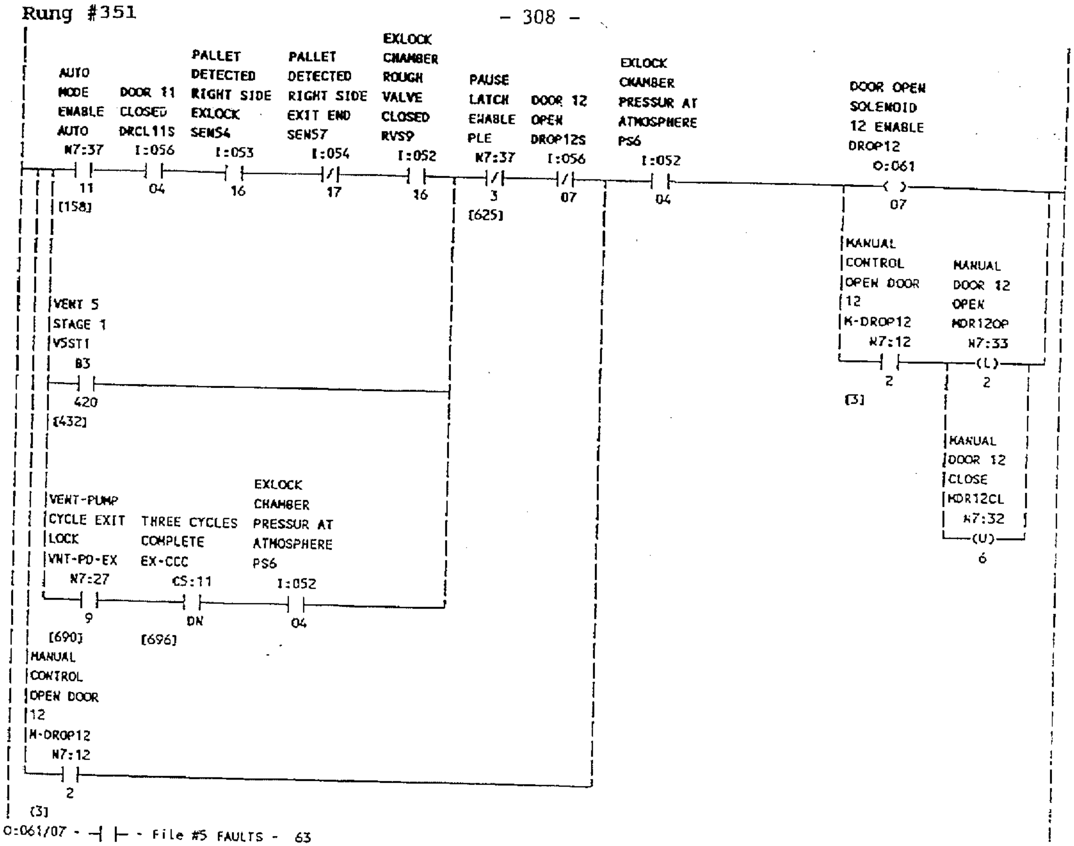
```
O:061/07 - -| |- - File #5 FAULTS -  63
           -( )- - File #2 MAIN_PRGRM -  351
N7:33/2 - -(L)- - File #2 MAIN_PRGRM -  351
          -(U)- - File #2 MAIN_PRGRM -  353
_F:N7:211X21 - BTW - File #2 MAIN_PRGRM -  2
N7:32/6 - -(L)- - File #2 MAIN_PRGRM -  353
          -(U)- - File #2 MAIN_PRGRM -  351
_F:N7:211X21 - BTW - File #2 MAIN_PRGRM -  2
```

- 309 -
Rung #352
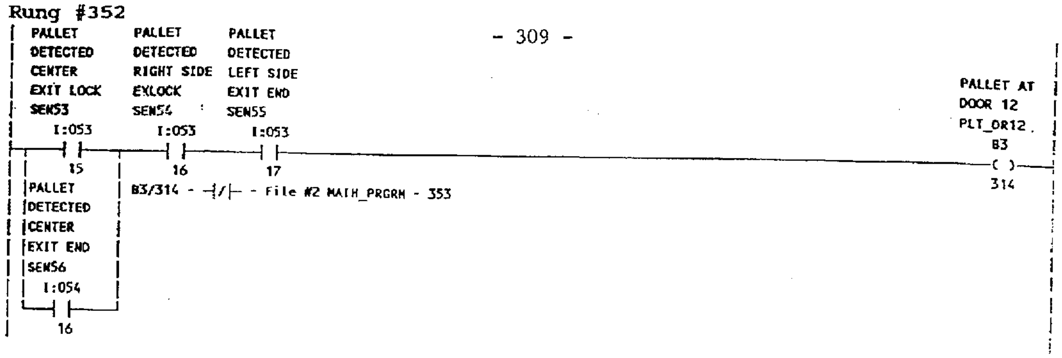

Rung #353 - 310 -
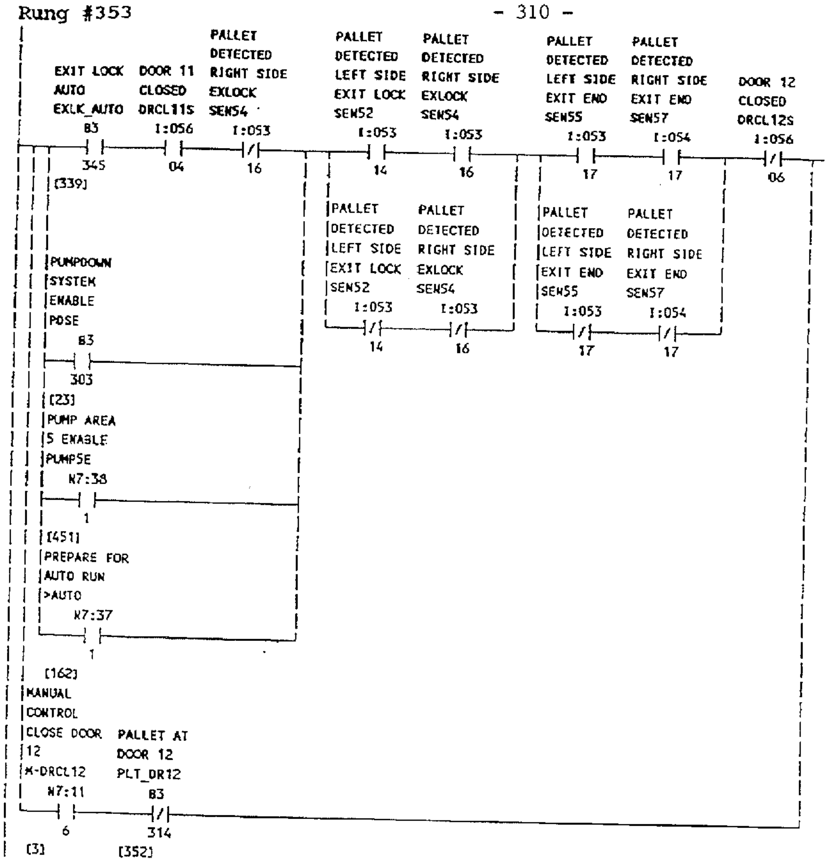
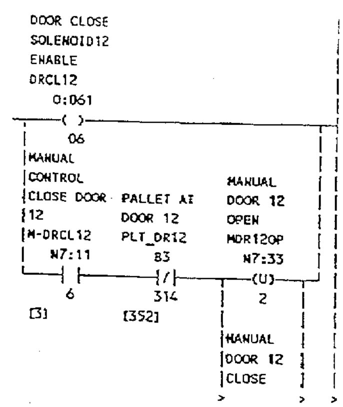

```
                                                                        |MDR12CL |
                                                                        | N7:32  |
                                                                        +--(L)---+
                                                                            6
O:061/06 - -| |- - File #5 FAULTS - 39
                   File #6 TECH_RUNGS - 3
          -( )- - File #2 MAIN_PRGRM - 353
N7:33/2 - -(L)- - File #2 MAIN_PRGRM - 351
          -(U)- - File #2 MAIN_PRGRM - 353
_F:N7:21[X21 - BTW - File #2 MAIN_PRGRM - 2
N7:32/6 - -(L)- - File #2 MAIN_PRGRM - 353
          -(U)- - File #2 MAIN_PRGRM - 351
_F:N7:21[X21 - BTW - File #2 MAIN_PRGRM - 2
Rung #354
|                MOTOR DRIVE                                            MOTOR 21  |
|                PULSER                                                 INTERRUPT |
|  M21FP         MDP                                                    #211      |
|  T4:221         B3                                                     O:062    |
|-+--] [---+------] [--------------------------------------------------------( )---|
| |   TT   |       299                                                     04     |
| |[355]   |  [T4]                                                                |
| |M21FSP  |                                                                      |
| | T4:241 |                                                                      |
| |--] [---|                                                                      |
| |   TT   |                                                                      |
| |[356]   |                                                                      |
| |M21SP   |                                                                      |
| |T4:261  |                                                                      |
| |--] [---|                                                                      |
| |   TT   |                                                                      |
| |[357]   |                                                                      |
| |M21SSP  |                                                                      |
| | T4:281 |                                                                      |
| +--] [---+                                                                      |
|     TT                                                                          |
|  [358]                                                                          |
```

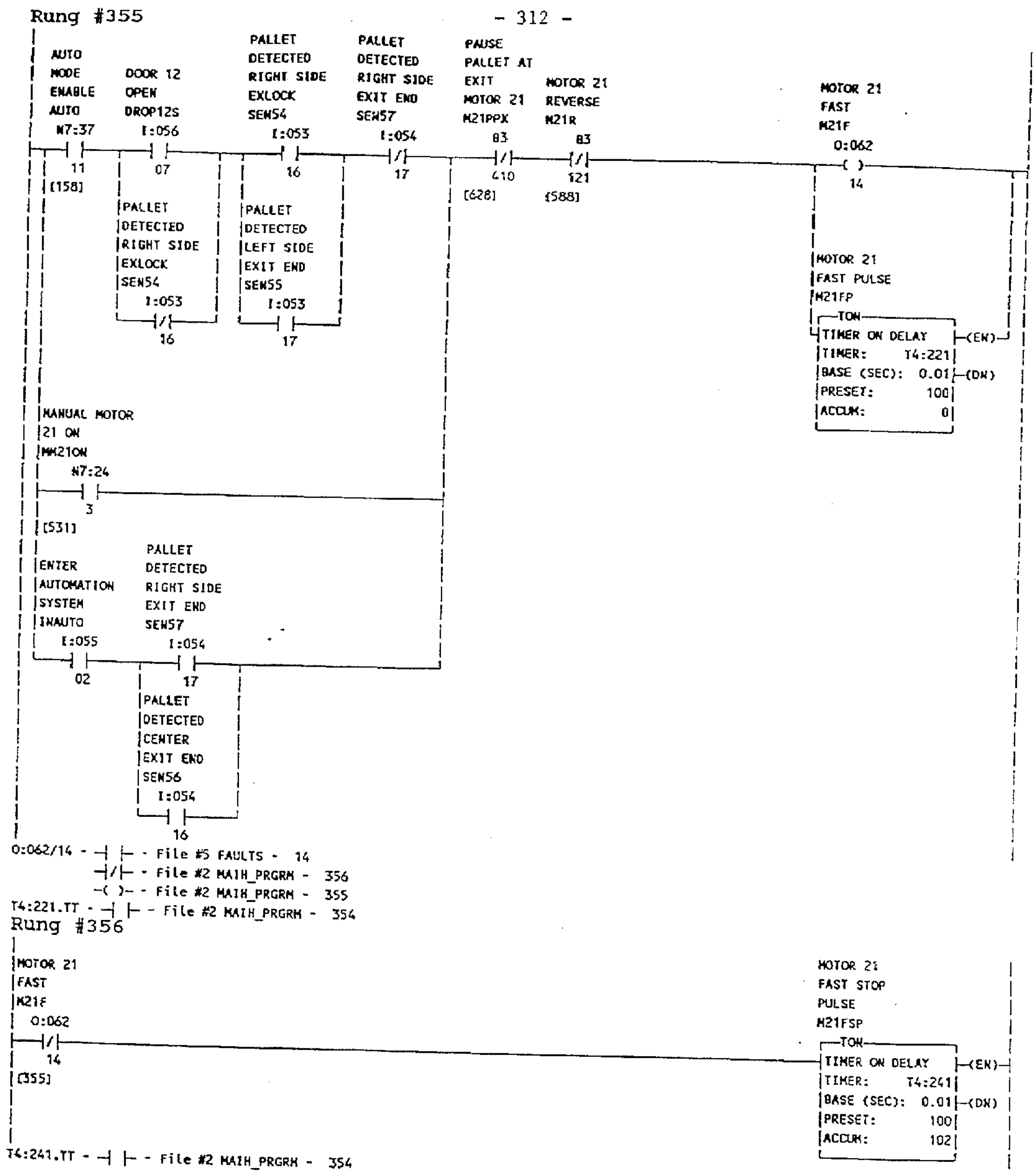
Rung #355
- 312 -
AUTO MODE ENABLE AUTO N7:37 11 [158]
DOOR 12 OPEN DROP12S I:056 07
PALLET DETECTED RIGHT SIDE EXLOCK SEN54 I:053 16
PALLET DETECTED RIGHT SIDE EXIT END SEN57 I:054 17
PAUSE PALLET AT EXIT MOTOR 21 M21PPX B3 410 [628]
MOTOR 21 REVERSE M21R B3 121 [588]
MOTOR 21 FAST M21F O:062 14
PALLET DETECTED RIGHT SIDE EXLOCK SEN54 I:053 16
PALLET DETECTED LEFT SIDE EXIT END SEN55 I:053 17
MOTOR 21 FAST PULSE M21FP
TON TIMER ON DELAY TIMER: T4:221 BASE (SEC): 0.01 PRESET: 100 ACCUM: 0
(EN) (DN)
MANUAL MOTOR 21 ON MM21ON N7:24 3 [531]
ENTER AUTOMATION SYSTEM INAUTO I:055 02
PALLET DETECTED RIGHT SIDE EXIT END SEN57 I:054 17
PALLET DETECTED CENTER EXIT END SEN56 I:054 16
O:062/14 - -| |- - File #5 FAULTS - 14
-|/|- - File #2 MAIN_PRGRM - 356
-( )- - File #2 MAIN_PRGRM - 355
T4:221.TT - -| |- - File #2 MAIN_PRGRM - 354
Rung #356
MOTOR 21 FAST M21F O:062 14 [355]
MOTOR 21 FAST STOP PULSE M21FSP
TON TIMER ON DELAY TIMER: T4:241 BASE (SEC): 0.01 PRESET: 100 ACCUM: 102
(EN) (DN)
T4:241.TT - -| |- - File #2 MAIN_PRGRM - 354

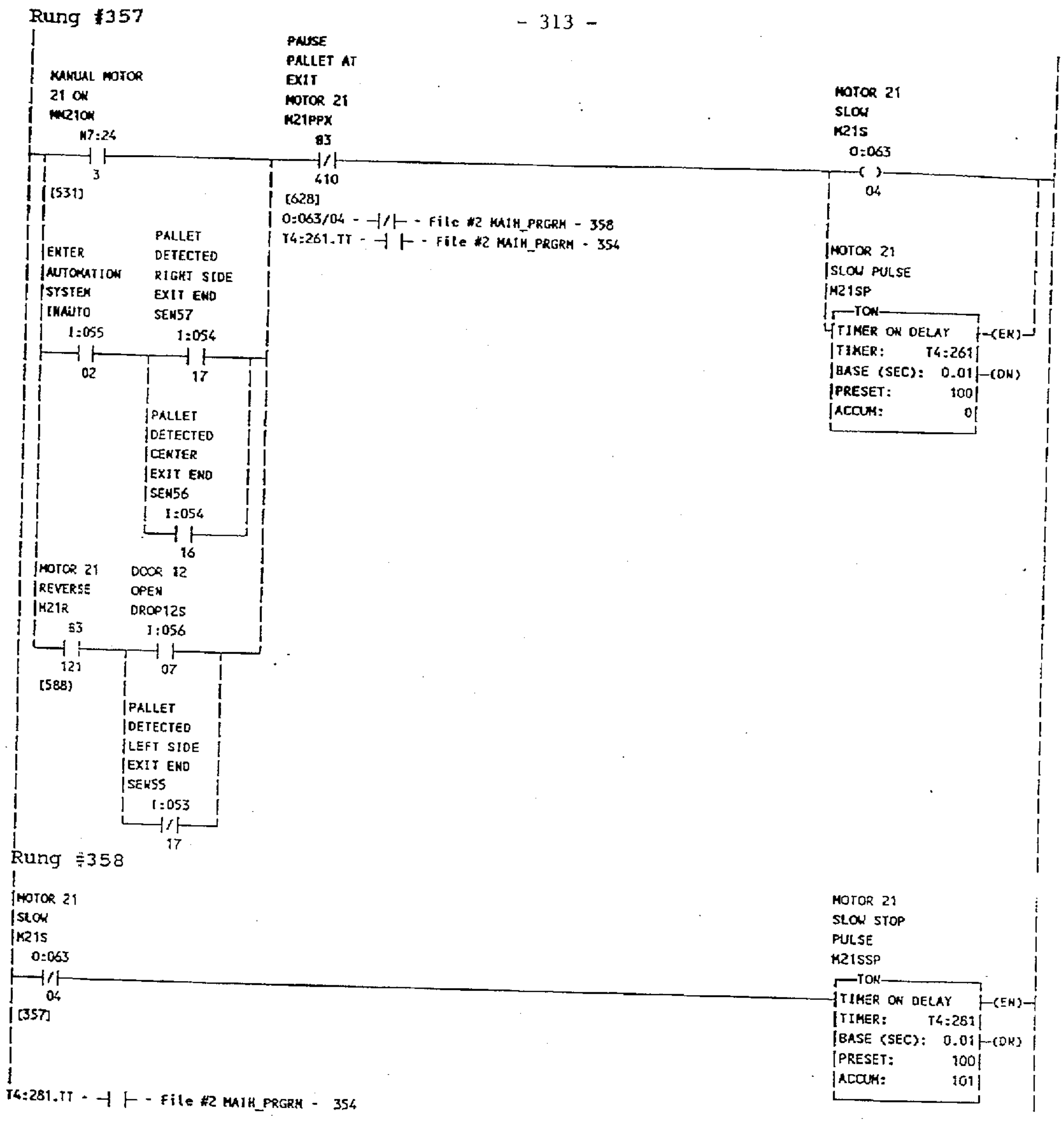
Rung #357
MANUAL MOTOR
21 ON
MM21ON
N7:24
3
[531]
PAUSE
PALLET AT
EXIT
MOTOR 21
M21PPX
B3
410
[628]
0:063/04 - ┤/├ - File #2 MAIN_PRGRM - 358
T4:261.TT - ┤ ├ - File #2 MAIN_PRGRM - 354
MOTOR 21
SLOW
M21S
O:063
04
ENTER
AUTOMATION
SYSTEM
INAUTO
I:055
02
PALLET
DETECTED
RIGHT SIDE
EXIT END
SEN57
I:054
17
PALLET
DETECTED
CENTER
EXIT END
SEN56
I:054
16
MOTOR 21
SLOW PULSE
M21SP
TON
TIMER ON DELAY
TIMER: T4:261
BASE (SEC): 0.01
PRESET: 100
ACCUM: 0
(EN)
(DN)
MOTOR 21
REVERSE
M21R
B3
121
[588]
DOOR 12
OPEN
DROP12S
I:056
07
PALLET
DETECTED
LEFT SIDE
EXIT END
SEN55
I:053
17
Rung #358
MOTOR 21
SLOW
M21S
O:063
04
[357]
MOTOR 21
SLOW STOP
PULSE
M21SSP
TON
TIMER ON DELAY
TIMER: T4:261
BASE (SEC): 0.01
PRESET: 100
ACCUM: 101
(EN)
(DN)
T4:281.TT - ┤ ├ - File #2 MAIN_PRGRM - 354

```
Rung #359
THE PALLET COUNTER
|              PALLET                                                                            |
|PALLET IN     DETECTED                                                                          |
|CENTER        RIGHT SIDE                                                              PALLET    |
|EXBUFFER      EXBUFFER                                                                COUNTER   |
|SEN50         SEN51                                                                   LATCH     |
|   I:053        I:053                                                                 PALCNT    |
|                                                                                        B3       |
|----] [---------]/[----------------------------------------------------------------------(L)-----|
|     12          13                                                                    100      |
B3/100 - ] [ - - File #2 MAIN_PRGRM -  361,363,364
        -(L)- - File #2 MAIN_PRGRM -  359
        -(U)- - File #2 MAIN_PRGRM -  360
Rung #360
THE PALLET COUNTER
|PALLET                                                                                          |
|DETECTED                                                                                        |
|RIGHT SIDE                                                                            PALLET    |
|EXBUFFER                                                                              COUNTER   |
|SEN51                                                                                 LATCH     |
|   I:053                                                                              PALCNT    |
|                                                                                        B3       |
|----] [----------------------------------------------------------------------------------(U)-----|
|     13                                                                                100      |
B3/100 - ] [ - - File #2 MAIN_PRGRM -  361,363,364
        -(L)- - File #2 MAIN_PRGRM -  359
        -(U)- - File #2 MAIN_PRGRM -  360
Rung #361
|PALLET                                                                                          |
|COUNTER                                                                                         |
|LATCH                                                                 PALLET                    |
|PALCNT                                                                COUNTER                   |
|  B3                                                                  PCOUNT                    |
|                                                                      +-CTU-------------+        |
|----] [---------------------------------------------------------------+COUNT UP         +-(CU)---|
|     100                                                              |COUNTER:   C5:16 |        |
|[360]                                                                 |PRESET:    10000 +-(DN)   |
|                                                                      |ACCUM:        90 |        |
|                                                                      +-----------------+        |
C5:16 - CTU - File #2 MAIN_PRGRM -  361
        RES - File #2 MAIN_PRGRM -  362
Rung #362
|INCREMENTAL                                                                                     |
|PALLET COUNTER                                                                        PALLET    |
|RESET                                                                                 COUNTER   |
|INC_CNT-RST                                                                           PCOUNT    |
|      B3                                                                              C5:16     |
|----] [----------------------------------------------------------------------------------(RES)---|
|     526                                                                                         |
C5:16 - CTU - File #2 MAIN_PRGRM -  361
        RES - File #2 MAIN_PRGRM -  362
Rung #363
|PALLET                                                                                          |
|COUNTER                                                               NON-RESETABLE             |
|LATCH                                                                 PALLET COUNTER            |
|PALCNT                                                                A                         |
|  B3                                                                  NRSTCNTR_A                |
|                                                                      +-CTU-------------+        |
|----] [---------------------------------------------------------------+COUNT UP         +-(CU)---|
|     100                                                              |COUNTER:   C5:17 |        |
|[360]                                                                 |PRESET:     1000 +-(DN)   |
|                                                                      |ACCUM:       889 |        |
|                                                                      +-----------------+        |
C5:17 - CTU - File #2 MAIN_PRGRM -  363
        RES - File #2 MAIN_PRGRM -  365
```

```
C5:17.DN - -| |- - File #2 MAIN_PRGRM -  364,365                - 315 -
Rung #364
|PALLET
|COUNTER                                                      NON-RESETABLE        |
|LATCH                                                        PALLET COUNTER       |
|PALCNT   NRSTCNTR_A                                          B                    |
|  B3       C5:17                                             NRSTCNTR_B           |
|--| |------| |-----------------------------------------------+-CTU--------+        |
|  100       DN                                               |COUNT UP    |-(CU)--|
|[360]     [363]                                              |COUNTER: C5:18|     |
|                                                             |PRESET:   1000|-(DN)|
|                                                             |ACCUM:      53|     |
|                                                             +--------------+     |
Rung #365
|
|                                                                NON-RESETABLE    |
|                                                                PALLET COUNTER   |
|                                                                A                |
|NRSTCNTR_A                                                      NRSTCNTR_A       |
|  C5:17                                                              C5:17      |
|--| |-------------------------------------------------------------------(RES)----|
|   DN                                                                            |
|[365]                                                                            |
C5:17 - CTU - File #2 MAIN_PRGRM -  363
        RES - File #2 MAIN_PRGRM -  365
C5:17.DN - -| |- - File #2 MAIN_PRGRM -  364
Rung #366
|EXLOCK                                                                          |
|CHAMBER                                                                         |
|PRESSUR AT                                                                      |
|ATMOSPHERE                                                  CHAMBER VENT 5      |
|PS6                                                         CLOSE DELAY         |
|  I:052                                                     CV5_DLY             |
|--| |------------------------------------------------------+-TON----------+     |
|   04                                                      |TIMER ON DELAY|-(EN)-|
|                                                           |TIMER:  T4:329|     |
| T4:329.DN - -| |- - File #2 MAIN_PRGRM - 367              |BASE (SEC): 1.0|-(DN)|
|                                                           |PRESET:      1|     |
|                                                           |ACCUM:       0|     |
|                                                           +--------------+     |
```

Rung #367
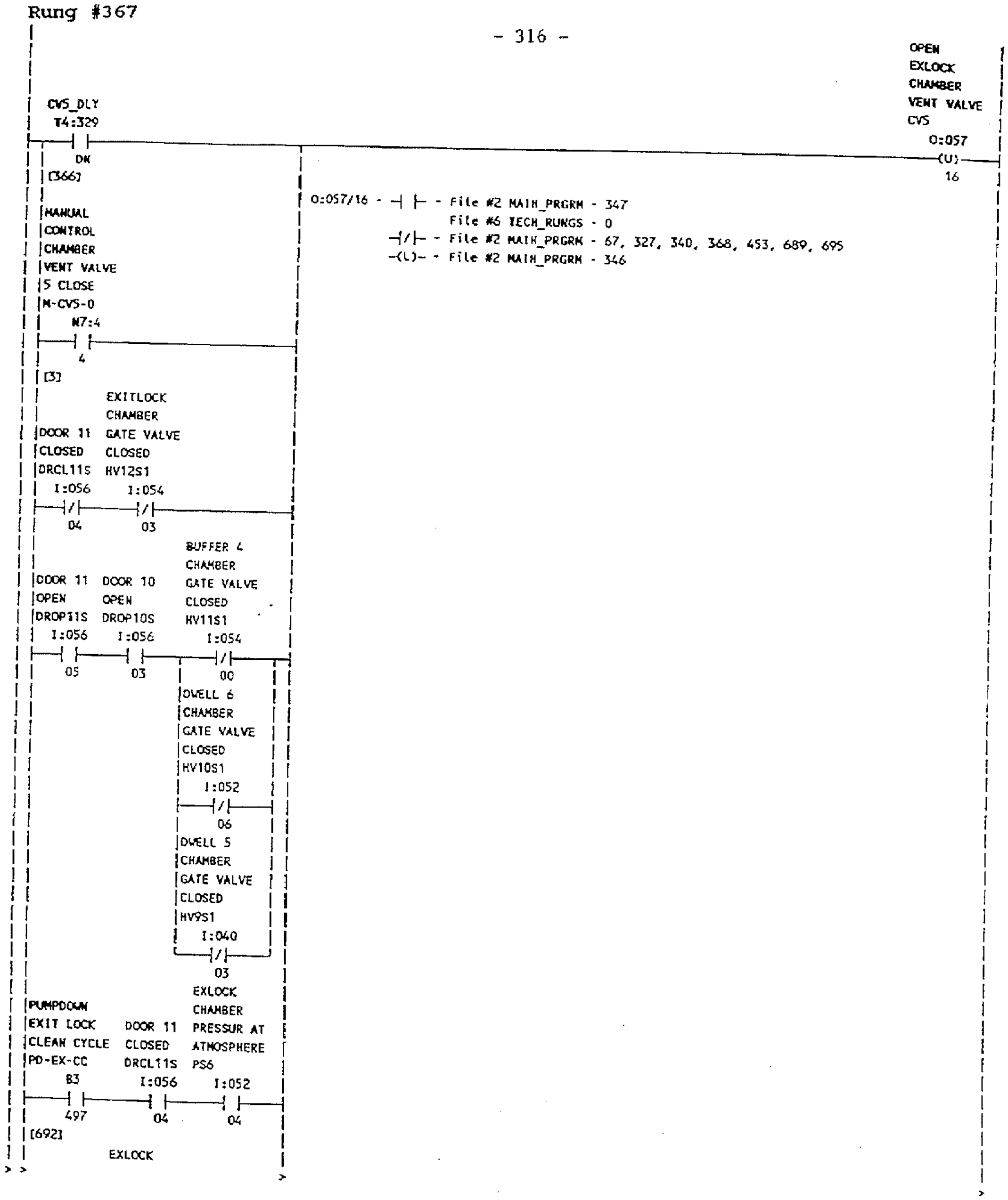

```
|  |            CHAMBER
|  |VENT        PRESSUR AT
|  |EXIT LOCK   ATMOSPHERE
|  |VNT-EX      PS6
|  |   B3         I:052
|  |---] [--------] [-----------
|  |   498         04
|  |[694]
|  |ABORT SYSTEM
|  |VENT
|  |BORT_SYS_VNT
|  |   N7:17
|  |----] [----------------------
|       10
|  [3]
Rung #368
| ALL
| CHAMBERS   OPEN                                               OPEN
| AT         LOAD LOCK  OPEN       OPEN       OPEN       EXLOCK
| ATMOSPHERE CHAMBER    DWELL 2    DWELL 3    DWELL 5    CHAMBER              SYSTEM
| CHBATMOS   VENT VALVE VENT VALVE VENT VALVE VENT VALVE VENT VALVE           VENT
|            CV1        CV2        CV3        CV4        CV5                  ENABLE
|    B3      0:007      0:007      0:027      0:043      0:057                SYSVNTE
|----] [-------]/[--------]/[--------]/[--------]/[--------]/[------------   N7:37
|   383       16         17         16         16         16   |          ---(U)---
| [404]     [177]      [396]      [401]      [403]      [367]   |              5
|                                                               |
|                                                               | N7:37/5 - ] [ - File #2 MAIN_PRGRM - 34, 35, 36,
|                                                               |     37, 43, 46, 47, 48, 49, 110,
|                                                               |     111, 112, 113, 114, 200, 216,
|ABORT SYSTEM                                                   |     324, 326, 327, 370, 391
|VENT                                                           |   ]/[ - File #2 MAIN_PRGRM - 23, 115,
|BORT_SYS_VNT                                                   |     117, 118, 119, 120, 121, 122,
|   N7:17                                                       |     123, 124, 125, 126, 127, 128,
|----] [--------------------------------------------------------|     129, 130, 131, 132, 133, 134,
|    10                                                         |     135, 136, 137, 138, 375, 376,
|[3]                                                            |     377, 378, 434, 438, 442, 447,
|                                                               |     451
|                                                               |   -(L)- - File #2 MAIN_PRGRM - 369
|PREPARE FOR                                                    | _F:N7:21[X21 - BTW - File #2 MAIN_PRGRM - 2
|AUTO RUN
|>AUTO
|   N7:37
|----] [--------------------------------------------------------
|    1
| [162]
Rung #369
|         PUMPDOWN                                                            AUTO
|SYSTEM   SYSTEM   PUMP AREA  PUMP AREA  PUMP AREA  PUMP AREA  PUMP AREA   MODE       SYSTEM
|VENT     ENABLE   1 ENABLE   2 ENABLE   3 ENABLE   4 ENABLE   5 ENABLE    ENABLE     VENT
|TS13     POSE     PUMP1E     PUMP2E     PUMP3E     PUMP4E     PUMP5E      AUTO       ENABLE
| N7:16     B3      N7:37      N7:37      N7:37      N7:38      N7:38      N7:37      SYSVNTE
|--] [------]/[-------]/[--------]/[--------]/[--------]/[--------]/[--------]/[-----   N7:37
|  5       303       13         14         15          0          1          11     ---(L)---
|[3]      [23]     [434]      [438]      [442]      [447]      [451]      [158]          5
N7:37/5 - ] [ - File #2 MAIN_PRGRM -  34,35,36,37,43,46,47,48,49,110,111,112,113,114,200,216,324,326,327,370,391
          ]/[ - File #2 MAIN_PRGRM -  23,115,117,118,119,120,121,122,123,124,125,126,127,128,129,130,131,132,133,134,135,136,137
                138,375,376,377,378,434,438,442,447,451
          -(L)- - File #2 MAIN_PRGRM -  369
          -(U)- - File #2 MAIN_PRGRM -  368
_F:N7:21[X21 - BTW - File #2 MAIN_PRGRM -  2
```

```
Rung #370
|
|SYSTEM                                                         SYSTEM
|VENT                                                           VENT
|ENABLE                                                         ENABLE
|SYSVNTE                                                        PULSE
| N7:37                                                         SYSVNTPLSE
|                                                               ┌─TON──────────────┐
|──┤ ├──────────────────────────────────────────────────────────┤TIMER ON DELAY    ├─(EN)─
|   5                                                           |TIMER:     T4:286 |
|[369]                                                          |BASE (SEC):   1.0 ├─(DN)
|                                                               |PRESET:      180  |
|                                                               |ACCUM:         0  |
|                                                               └──────────────────┘
T4:286 - TON - File #2 MAIN_PRGRM - 370
       LEQ - File #2 MAIN_PRGRM - 84,91,98
T4:286.DN - ┤ ├ - File #2 MAIN_PRGRM - 608

Rung #371
|MANUAL     HEATER 1
|CONTROL    CHAMBER
|RGA VALVE  =<250                                                    OPEN RGA
|1 OPEN     MICRONS                                                  ISOLATION
|M-RGAV1-1  PIR2                                                     VALVE 1
| N7:7      I:004                                                    RGAV1
|──┤ ├──────┤ ├────────────────────────────────────────────────┬───────O:010───
|   5        10                                                 |     ─(L)─
|[3]                                                            |      13
| O:010/13 - ┤ ├ - File #6 TECH_RUNGS - 7                       |
|            -(U)- - File #2 MAIN_PRGRM - 34                    |MANUAL RGA
| N7:28/5 - -(U)- - File #2 MAIN_PRGRM - 34                     |VALVE 1
| _F:N7:21[X21 - BTW - File #2 MAIN_PRGRM - 2                   |OPEN
| N7:30/1 - -(L)- - File #2 MAIN_PRGRM - 34                     |MRGAV1OP
| _F:N7:21[X21 - BTW - File #2 MAIN_PRGRM - 2                   |  N7:28
|                                                               ├────(L)───
|                                                               |    5
|                                                               |MANUAL RGA
|                                                               |VALVE 1
|                                                               |CLOSE
|                                                               |MRGAV1CL
|                                                               |  N7:30
|                                                               └────(U)───
                                                                     1
Rung #372
|MANUAL     CHROME
|CONTROL    CHAMBER
|RGA VALVE  =<250                                                    OPEN RGA
|2 OPEN     MICRONS                                                  ISOLATION
|M-RGAV2-1  PIR6                                                     VALVE 2
| N7:7      I:024                                                    RGAV2
|──┤ ├──────┤ ├────────────────────────────────────────────────┬───────O:030───
|   6        07                                                 |     ─(L)─
|[3]                                                            |      13
| O:030/13 - ┤ ├ - File #6 TECH_RUNGS - 7                       |
|            -(U)- - File #2 MAIN_PRGRM - 35                    |MANUAL RGA
| N7:28/6 - -(U)- - File #2 MAIN_PRGRM - 35                     |VALVE 2
| _F:N7:21[X21 - BTW - File #2 MAIN_PRGRM - 2                   |OPEN
| N7:30/2 - -(L)- - File #2 MAIN_PRGRM - 35                     |MRGAV2OP
| _F:N7:21[X21 - BTW - File #2 MAIN_PRGRM - 2                   |  N7:28
|                                                               ├────(L)───
|                                                               |    6
|                                                               |MANUAL RGA
|                                                               |VALVE 2 CLOSE
|                                                               |MRGAV2CL
|                                                               |  N7:30
|                                                               └────(U)───
                                                                     2
```

```
Rung #373
|MANUAL     MAGNETIC
|CONTROL    CHAMBER                                        OPEN RGA
|RGA VALVE  =<250                                          ISOLATION
|3 OPEN     MICRONS                                        VALVE 3
|M-RGAV3-1  PIR11                                          RGAV3
|  N7:7       I:040                                          O:044
|--] [-------] [--------------------------------------------+--(L)--+-
|   7         07                                            |  13   |
|[3]                                                        |       |
| O:044/13 - ] [ - File #6 TECH_RUNGS - 7                   |MANUAL RGA
|          -(U)- - File #2 MAIN_PRGRM - 36                  |VALVE 3
| N7:28/7 - -(U)- - File #2 MAIN_PRGRM - 36                 |OPEN
| _F:N7:21[X21 - BTW - File #2 MAIN_PRGRM - 2               |MRGAV3OP
| N7:30/3 - -(L)- - File #2 MAIN_PRGRM - 36                 |  N7:28
| _F:N7:21[X21 - BTW - File #2 MAIN_PRGRM - 2               +--(L)--+
|                                                           |   7   |
|                                                           |MANUAL RGA
|                                                           |VALVE 3 CLOSE
|                                                           |MRGAV3CL
|                                                           |  N7:30
|                                                           +--(U)--+
                                                               3
Rung #374
|MANUAL     EXIT BUFFER
|CONTROL    CHAMBER                                        OPEN RGA
|RGA VALVE  =<250                                          ISOLATION
|4 OPEN     MICRONS                                        VALVE 4
|M-RGAV4-1  PIR15                                          RGAV4
|  N7:7       I:040                                          O:060
|--] [-------] [--------------------------------------------+--(L)--+-
|   8         13                                            |  13   |
|[3]                                                        |       |
| O:060/13 - ] [ - File #6 TECH_RUNGS - 7                   |MANUAL RGA
|          -(U)- - File #2 MAIN_PRGRM - 37                  |VALVE 4
| N7:28/8 - -(U)- - File #2 MAIN_PRGRM - 37                 |OPEN
| _F:N7:21[X21 - BTW - File #2 MAIN_PRGRM - 2               |MRGAV4OP
| N7:30/4 - -(L)- - File #2 MAIN_PRGRM - 37                 |  N7:28
| _F:N7:21[X21 - BTW - File #2 MAIN_PRGRM - 2               +--(L)--+
|                                                           |   8   |
|                                                           |MANUAL RGA
|                                                           |VALVE 4 CLOSE
|                                                           |MRGAV4CL
|                                                           |  N7:30
|                                                           +--(U)--+
                                                               4
Rung #375
|
|HEATER 1                                                  OPEN
|CHAMBER               SYSTEM                              CAPACITANC
|=<250     VENT AREA   VENT                                MANOMETER
|MICRONS   1 ENABLE    ENABLE                              ISOLATION
|PIR2      VENT1E      SYSVNTE                             VALVE 1
| I:004     N7:37       N7:37                              CMV1
|--] [-------]/[---------]/[-----------------------------------O:010
|   10         6           5                                 --( )--
|           [405]       [369]                                  06
O:010/06 - ] [ - File #6 TECH_RUNGS - 7
           ]/[ - File #2 MAIN_PRGRM - 389,409
           -( )- - File #2 MAIN_PRGRM - 375
```

- 320 -

Rung #376

```
|CHROME                                                              OPEN         |
|CHAMBER              SYSTEM                                         CAPACITANC   |
|<<250     VENT AREA  VENT                                           MANOMETER    |
|MICRONS   2 ENABLE   ENABLE                                         ISOLATION    |
|PIR6      VENT2E     SYSVNTE                                        VALVE 2      |
|  I:024    N7:37      N7:37                                         CHV2         |
|---] [------]/[--------]/[-------------------------------------------  O:030     |
|    07        7          5                                          ---( )-----|
|                                                                       06         |
|          [411]      [369]                                                        |
O:030/06 - ] [ - File #6 TECH_RUNGS -  7
          ]/[ - File #2 MAIN_PRGRM -  389,416
          -( )- - File #2 MAIN_PRGRM -  376
```

Rung #377

```
|MAGNETIC                                                            OPEN         |
|CHAMBER              SYSTEM                                         CAPACITANC   |
|=<250     VENT AREA  VENT                                           MANOMETER    |
|MICRONS   3 ENABLE   ENABLE                                         ISOLATION    |
|PIR11     VENT3E     SYSVNTE                                        VALVE 3      |
|  I:040    N7:37      N7:37                                         CHV3         |
|---] [------]/[--------]/[-------------------------------------------  O:044     |
|    07        8          5                                          ---( )-----|
|                                                                       06         |
|          [418]      [369]                                                        |
O:044/06 - ] [ - File #6 TECH_RUNGS -  7
          ]/[ - File #2 MAIN_PRGRM -  389,423
          -( )- - File #2 MAIN_PRGRM -  377
```

Rung #378

```
|CARBON                                                              OPEN         |
|CHAMBER              SYSTEM                                         CAPACITANC   |
|=<250     VENT AREA  VENT                                           MANOMETER    |
|MICRONS   4 ENABLE   ENABLE                                         ISOLATION    |
|PIR16     VENT4E     SYSVNTE                                        VALVE 4      |
|  I:054    N7:37      N7:37                                         CHV4         |
|---] [------]/[--------]/[-------------------------------------------  O:060     |
|    07        9          5                                          ---( )-----|
|                                                                       06         |
|          [425]      [369]                                                        |
O:060/06 - ] [ - File #6 TECH_RUNGS -  7
          ]/[ - File #2 MAIN_PRGRM -  389,428
          -( )- - File #2 MAIN_PRGRM -  378
```

BASE : Rung #379
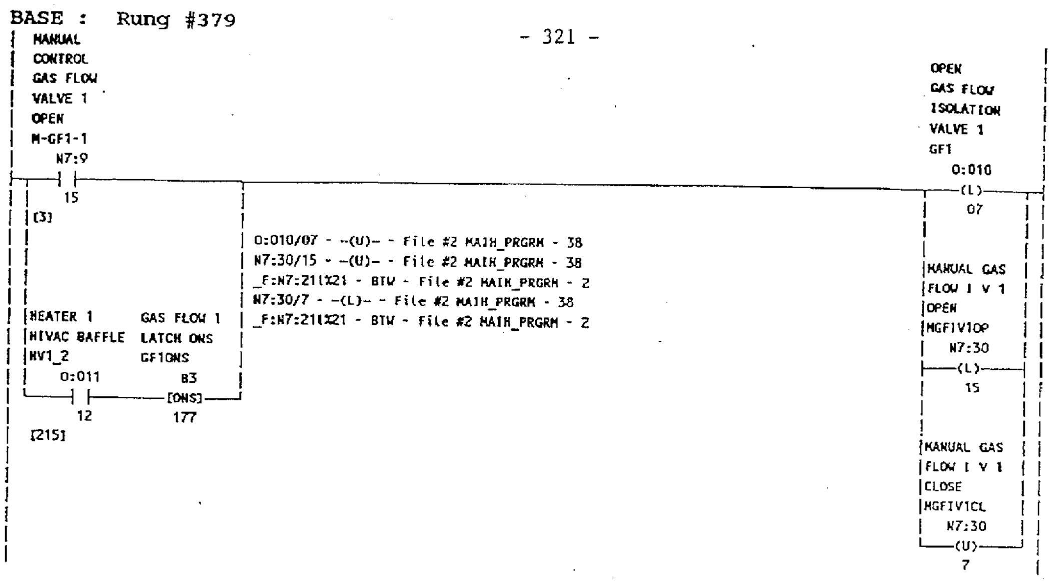

12

```
Rung #380
|
|MANUAL CONTROL                                                          OPEN
|GAS FLOW VALVE                                                          GAS FLOW
|2 OPEN                                                                  ISOLATION
|G-GF2-1                                                                 VALVE 2
|     N7:10                                                              GF2
|                                                                          O:010
|----] [--------------------------------------------------------------+---(L)---+
|     0                                                                |    10    |
|[3]                                                                   |          |
| O:010/10 - -(U)- - File #2 MAIN_PRGRM - 39                           |MANUAL GAS|
| N7:31/0 - -(U)- - File #2 MAIN_PRGRM - 39                            |FLOW I V 2|
| _F:N7:21(X21 - BTW - File #2 MAIN_PRGRM - 2                          |OPEN      |
| N7:30/8 - -(L)- - File #2 MAIN_PRGRM - 39                            |MGFIV2OP  |
| _F:N7:21(X21 - BTW - File #2 MAIN_PRGRM - 2                          |   N7:31  |
|                                                                      +---(L)----+
|                                                                      |    0     |
|                                                                      |MANUAL GAS|
|                                                                      |FLOW I V 2|
|                                                                      |CLOSE     |
|                                                                      |MGFIV2CL  |
|                                                                      |   N7:30  |
|                                                                      +---(U)----+
                                                                            8
```

```
BASE :  Rung #381
                                                     - 323 -
MANUAL CONTROL                                                              OPEN
GAS FLOW VALVE                                                              GAS FLOW
3 OPEN                                                                      ISOLATION
M-GF3-1                                                                     VALVE 3
      N7:10                                                                 GF3
                                                                              O:030
|-----] [-------------------------------------------------------------------+--(L)--+
       1                                                                    |   07  |
| [3]                                                                       |       |
|                   | O:030/07 - -] [- - File #2 MAIN_PRGRM - 156           |       |
|                   |            -(U)- - File #2 MAIN_PRGRM - 40            |MANUAL GAS
|                   | N7:31/1 - -(U)- - File #2 MAIN_PRGRM - 40             |FLOW I V 3
|                   | _F:N7:21[%21 - BTW - File #2 MAIN_PRGRM - 2           |OPEN
|PREPARE FOR  GAS FLOW 3 | N7:30/9 - -(L)- - File #2 MAIN_PRGRM - 40        |MGFIV3OP
|AUTO RUN     LATCH ONS  | _F:N7:21[%21 - BTW - File #2 MAIN_PRGRM - 2      |  N7:31
|>AUTO        GF3ONS                                                        +--(L)--+
|   N7:37        B3                                                         |   1   |
+---] [--------[ONS]----+                                                   |
     1          178                                                         |MANUAL GAS
 [162]                                                                      |FLOW I V 3
                                                                            |CLOSE
                                                                            |MGFIV3CL
                                                                            |  N7:30
                                                                            +--(U)--+
                                                                                9
Rung #382
|MANUAL
|CONTROL                                                                    OPEN
|GAS FLOW                                                                   GAS FLOW
|VALVE 4                                                                    ISOLATION
|OPEN                                                                       VALVE 4
|M-GF4-1                                                                    GF4
|  N7:10                                                                      O:030
|--] [----------------------------------------------------------------------+--(L)--+
    2                                                                       |   10  |
|[3]                                                                        |
| O:030/10 - -(U)- - File #2 MAIN_PRGRM - 41                                |MANUAL GAS
| N7:31/2 - -(U)- - File #2 MAIN_PRGRM - 41                                 |FLOW I V 4
| _F:N7:21[%21 - BTW - File #2 MAIN_PRGRM - 2                               |OPEN
| N7:30/10 - -(L)- - File #2 MAIN_PRGRM - 41                                |MGFIV4OP
| _F:N7:21[%21 - BTW - File #2 MAIN_PRGRM - 2                               |  N7:31
|                                                                           +--(L)--+
|                                                                           |   2
|                                                                           |MANUAL GAS
|                                                                           |FLOW I V 4
|                                                                           |CLOSE
|                                                                           |MGFIV4CL
|                                                                           |  N7:30
|                                                                           +--(U)--+
                                                                                10
```

```
BASE :   Rung #383
                                   - 324 -
MANUAL
CONTROL
GAS FLOW                                                        GAS FLOW
VALVE 5                                                         ISOLATION
OPEN                                                            VALVE 5
M-GF5-1                                                         GF5
 N7:10                                                            O:044
--] [--------------------------------------------------------------(L)--
   3                                                               07
[3]
             O:044/07 - -] [- - File #2 MAIN_PRGRM - 156
                       -(U)- - File #2 MAIN_PRGRM - 42              MANUAL GAS
             N7:31/3 - -(U)- - File #2 MAIN_PRGRM - 42              FLOW I V 5
             _F:N7:21[X21 - BTW - File #2 MAIN_PRGRM - 2            OPEN
PREPARE FOR  GAS FLOW 5  N7:30/11 - -(L)- - File #2 MAIN_PRGRM - 42 MGFIV5OP
AUTO RUN     LATCH ONS   _F:N7:21[X21 - BTW - File #2 MAIN_PRGRM - 2  N7:31
>AUTO        GF5ONS                                                --(L)--
  N7:37        63                                                    3
--] [--------[ONS]--
   1           179                                                MANUAL GAS
[162]                                                             FLOW I V 5
                                                                  CLOSE
                                                                  MGFIV5CL
                                                                    N7:30
                                                                  --(U)--
                                                                     11
Rung #384
MANUAL
CONTROL
GAS FLOW
VALVE 6                                                         GAS FLOW
OPEN                                                            ISOLATION
M-GF6-1                                                         VALVE 6
 N7:10                                                          GF6
--] [--------------------------------------------------------------O:044
   4                                                             --(L)--
[3]                                                                 10
O:044/10 - -(U)- - File #2 MAIN_PRGRM - 43
N7:31/4 - -(U)- - File #2 MAIN_PRGRM - 43                         MANUAL GAS
_F:N7:21[X21 - BTW - File #2 MAIN_PRGRM - 2                       FLOW I V 6
N7:30/12 - -(L)- - File #2 MAIN_PRGRM - 43                        OPEN
_F:N7:21[X21 - BTW - File #2 MAIN_PRGRM - 2                       MGFIV6OP
                                                                    N7:31
                                                                  --(L)--
                                                                     4
                                                                  MANUAL GAS
                                                                  FLOW I V 6
                                                                  CLOSE
                                                                  MGFIV6CL
                                                                    N7:30
                                                                  --(U)--
                                                                     12
```

BASE : Rung #385

```
| MANUAL                                                                              |
| CONTROL                                                                             |
| GAS FLOW                                                            GAS FLOW        |
| VALVE 7                                                             ISOLATION       |
| OPEN                                                                VALVE 7         |
| M-GF7-1                                                             GF7             |
|   N7:10                                                               O:060         |
|---] [---------------------------------------------------------------+---(L)---+--|
|     5                |                                              |   07     |  |
| [3]                  |                                              |          |  |
|                      | O:060/07 - -] [- - File #2 MAIN_PRGRM - 156  |          |  |
|                      |          -(U)- - File #2 MAIN_PRGRM - 44     |MANUAL GAS|  |
|                      | N7:31/5 - -(U)- - File #2 MAIN_PRGRM - 44    |FLOW I V 7|  |
|                      | _F:N7:21(X21 - BTW - File #2 MAIN_PRGRM - 2  |OPEN      |  |
| PREPARE FOR  GAS FLOW 7 | N7:30/13 - -(L)- - File #2 MAIN_PRGRM - 44 |MGFIV7OP  |  |
| AUTO RUN     LATCH ONS  | _F:N7:21(X21 - BTW - File #2 MAIN_PRGRM - 2|  N7:31   |  |
| >AUTO        GF7ONS  |                                              |---(L)----|  |
|   N7:37        B3    |                                              |    5     |  |
|---] [--------[ONS]---|                                              |          |  |
|     1         180                                                   |          |  |
| [162]                                                               |MANUAL GAS|  |
|                                                                     |FLOW I V 7|  |
|                                                                     |CLOSE     |  |
|                                                                     |MGFIV7CL  |  |
|                                                                     |  N7:30   |  |
|                                                                     +---(U)----+  |
|                                                                         13         |
```

```
BASE :   Rung #386
                                              - 326 -
| MANUAL
| CONTROL
| GAS FLOW
| VALVE 8                                                                              GAS FLOW
| OPEN                                                                                 ISOLATION
| M-GF8-1                                                                              VALVE 8
|  N7:10                                                                               GF8
|                                                                                        O:060
+-+---] [---+---------------------------------------------------------------------+------(L)------+-+
| |    6    |                                                                     |      10       | |
| |[3]      |                                                                     |               | |
| |         | O:060/10 - -(U)- - File #2 MAIN_PRGRM - 45                          |               | |
| |         | N7:31/6 - -(U)- - File #2 MAIN_PRGRM - 45                           |MANUAL GAS     | |
| |         | _F:N7:21(X21 - BTW - File #2 MAIN_PRGRM - 2                         |FLOW I V 8     | |
| |         | N7:30/14 - -(L)- - File #2 MAIN_PRGRM - 45                          |OPEN           | |
| |PREPARE FOR  GAS FLOW 8  _F:N7:21(X21 - BTW - File #2 MAIN_PRGRM - 2         |MGFIV8OP       | |
| |AUTO RUN     LATCH ONS |                                                     |  N7:31        | |
| |>AUTO        GF8ONS    |                                                     +-----(L)-------+ |
| |  N7:37        B3      |                                                     |      6          |
| +---] [--------[ONS]----+                                                     |                 |
|      1        181                                                             |MANUAL GAS       |
|  [162]                                                                        |FLOW I V 8       |
|                                                                               |CLOSE            |
|                                                                               |MGFIV8CL         |
|                                                                               |  N7:30          |
|                                                                               +-----(U)-------+ |
|                                                                                     14          |
```

Rung #387 - 327 -

```
|                                                                                   CRYO          |
|OPEN        OPEN        OPEN        OPEN        OPEN        OPEN                   VALVES        |
|CRYO ROUGH  CRYO ROUGH  CRYO ROUGH  CRYO ROUGH  CRYO ROUGH  CRYO ROUGH             1->6          |
|VALVE 1     VALVE 2     VALVE 3     VALVE 4     VALVE 5     VALVE 6                CLOSED        |
|CR1         CR2         CR3         CR4         CR5         CR6                    CR1->6_CL     |
|  0:007       0:007       0:007       0:027       0:027       0:027                   B3         |
|---]/[--------]/[---------]/[---------]/[---------]/[---------]/[----------------------( )-------|
|    11          12          13          11          12          13                    381        |
|[3:15]      [3:164]     [3:165]     [3:167]     [3:166]     [3:168]                              |
B3/381 - -] [- - File #2 MAIN_PRGRM -  391
         -( )- - File #2 MAIN_PRGRM -  387
```

Rung #388

```
|                                                                                   CRYO          |
|OPEN        OPEN        OPEN        OPEN        OPEN        OPEN                   VALVES        |
|CRYO ROUGH  CRYO ROUGH  CRYO ROUGH  CRYO ROUGH  CRYO ROUGH  CRYO ROUGH             7->12         |
|VALVE 7     VALVE 8     VALVE 9     VALVE 10    VALVE 11    VALVE 12               CLOSED        |
|CR7         CR8         CR9         CR10        CR11        CR12                   CR7->12_CL    |
|  0:043       0:043       0:043       0:057       0:057       0:057                   B3         |
|---]/[--------]/[---------]/[---------]/[---------]/[---------]/[----------------------( )-------|
|    11          12          13          11          12          13                    382        |
|[3:169]     [3:170]     [3:171]     [3:172]     [3:174]     [3:173]                              |
B3/382 - -] [- - File #2 MAIN_PRGRM -  391
         -( )- - File #2 MAIN_PRGRM -  388
```

Rung #389

```
|OPEN        OPEN        OPEN        OPEN                                           ALL CAP.      |
|CAPACITANC  CAPACITANC  CAPACITANC  CAPACITANC                                     MANOMETER     |
|MANOMETER   MANOMETER   MANOMETER   MANOMETER                                      ISOLATION     |
|ISOLATION   ISOLATION   ISOLATION   ISOLATION                                      VALVES        |
|VALVE 1     VALVE 2     VALVE 3     VALVE 4                                        CLOSED        |
|CMV1        CMV2        CMV3        CMV4                                           CMIV_CL       |
|  0:010       0:030       0:044       0:060                                           B3         |
|---]/[--------]/[---------]/[---------]/[----------------------------------------------( )-------|
|    06          06          06          06                                            380        |
|[375]       [376]       [377]       [378]                                                        |
B3/380 - -] [- - File #2 MAIN_PRGRM -  391
         -( )- - File #2 MAIN_PRGRM -  389
```

Rung #390

```
|HEATER 1    HEATER 2    DWELL 1     DWELL 2     HEATER 3    DWELL 3     DWELL 4     BUFFER 3    DWELL 5     DWELL 6
|CHAMBER     CHAMBER     CHAMBER     CHAMBER     CHAMBER     CHAMBER     CHAMBER     CHAMBER     CHAMBER     CHAMBER
|GATE VALVE  GATE VALVE  GATE VALVE  GATE VALVE  GATE VALVE  GATE VALVE  GATE VALVE  GATE VALVE  GATE VALVE  GATE VALVE
|CLOSE       CLOSE       CLOSED      CLOSED      CLOSED      CLOSED      CLOSED      CLOSED      CLOSED      CLOSED
|HV1S1       HV2S1       HV3S1       HV4S1       HV5S1       HV6S1       HV7S1       HV8S1       HV9S1       HV10S1
|  I:002       I:004       I:004       I:022       I:024       I:024       I:036       I:040       I:040       I:052
|---] [--------] [---------] [---------] [---------] [---------] [---------] [---------] [---------] [---------] [---
|    06          00          03          06          00          03          06          00          03          06
                                                                                        BUFFER 4    EXITLOCK                 |
                                                                                        CHAMBER     CHAMBER     ALL HIVAC    |
                                                                                        GATE VALVE  GATE VALVE  GATES        |
                                                                                        CLOSED      CLOSED      CLOSED       |
                                                                                        HV11S1      HV12S1      HVGC         |
                                                                                          I:054       I:054       B3         |
                                                                                       ----] [---------] [---------( )-------|
                                                                                            00          03         150       |
B3/150 - -] [- - File #2 MAIN_PRGRM -  391
         -( )- - File #2 MAIN_PRGRM -  390
```

```
BASE :  Rung #391                                                    - 328 -
|                                ALL CAP.
|                      ALL RGA   MANOMETER  CRYO       CRYO
|SYSTEM   ROUGH    ISOLATION  ISOLATION  VALVES     VALVES     ALL HIVAC
|VENT     VALVES   VALVES     VALVES     1->6       7->12      GATES                              READY TO
|ENABLE   CLOSED   CLOSED     CLOSED     CLOSED     CLOSED     CLOSED                             VENT
|SYSVNTE  RVCL     RGACL      CHIV_CL    CR1->6_CL  CR7->12_CL HVGC                               RTOVENT
| N7:37    B3       B3         B3         B3         B3         B3                                  B3
|--] [----] [------] [--------] [--------] [--------] [--------] [----------------------------------( )--|
|   5     310      305        380        381        382        150                                 379
|[369]   [66]     [63]       [389]      [387]      [388]      [390]
B3/379 - ] [ - - File #2 MAIN_PRGRM -  392
---       -( )- - File #2 MAIN_PRGRM -  391
          -( )- - File #2 MAIN_PRGRM -  391
Rung #392
|
|READY TO                                                            READY TO VENT
|VENT                                                                CHAMBER VENT
|RTOVENT                                                             DELAY TIMER
|  B3                                                                RTVCVDT
|--] [---------------------------------------------------------------+-TON-------------+
|  379                                                               |TIMER ON DELAY   |-(EN)-
|[391]                                                               |TIMER:      T4:0 |
|                                                                    |BASE (SEC):  1.0 |-(DN)
|                                                                    |PRESET:        5 |
|                                                                    |ACCUM:         0 |
|                                                                    +-----------------+
T4:0.DN - ] [ - - File #2 MAIN_PRGRM -  173,346,394,401,403
Rung #393
|VENT 2
|STAGE 1                                                             VENT 2 STAGE1
|V2ST1                                                               DELAY TIMER
|  B3                                                                V2DYTMR
|--] [---------------------------------------------------------------+-TON-------------+
|  414                                                               |TIMER ON DELAY   |-(EN)-
|[416]                                                               |TIMER:     T4:19 |
|                                                                    |BASE (SEC):  1.0 |-(DN)
|                                                                    |PRESET:        5 |
|                                                                    |ACCUM:         0 |
|                                                                    +-----------------+
T4:19.DN - ] [ - : File #2 MAIN_PRGRM -  394
```

BASE : Rung #394

```
|                                   DWELL 1    DWELL 2    HEATER 3
|                                   CHAMBER    CHAMBER    CHAMBER
| READY TO                          GATE VALVE GATE VALVE GATE VALVE                                |
| VENT                              CLOSED     CLOSED     CLOSED     POLYCOLD COOL       VENT 2 REQUEST |
| RTVCVDT                           HV3S1      HV4S1      HV5S1      PC_COOL             VNT2_RQST |
|   T4:0                            I:004      I:022      I:024      O:074                  B3   |
|-+--] [---------------------------+--] [--------] [--------] [--------]/[------------------( )---|
| |  DN                            |   03         06         00         11                  164  |
| |[392]                           |                               [400]                     |
| |CHAMBER VENT                    |                                                          |
| |ENABLE DELAY                    |                                                          |
| |V2DYTMR                         |                                                          |
| |   T4:19                        |                                                          |
| |---] [--------------------------|                                                          |
| |    DN                          |                                                          |
| |[393]                           |                                                          |
| |MANUAL                          |                                                          |
| |CONTROL    HEATER 2             |                                                          |
| |CHAMBER    CHAMBER              |                                                          |
| |VENT 2     GATE VALVE           |                                                          |
| |OPEN       CLOSE                |                                                          |
| |M-CV2-1    HV2S1                |                                                          |
| |  N7:6       I:004              |                                                          |
| |--] [----+----] [----+----------|                                                          |
|    12     |     00    |                                                                     |
|   [3]     |           |                                                                     |
|           |DOOR 4     |                                                                     |
|           |CLOSED     |                                                                     |
|           |DRCL4S     |                                                                     |
|           |  I:006    |                                                                     |
|           +---] [-----+                                                                     |
|                06                                                                           |
B3/164 - ] [ - - File #2 MAIN_PRGRM -  395,396
       -( )- - File #2 MAIN_PRGRM -  394
```

```
BASE :  Rung #395
|                    POLYCOLD                       - 330 -                            POLYCOLD |
|VENT 2 REQUEST  SETPOINT HIGH                                                         DEFROST  |
|VNT2_RQST       PCSPH                                                                 PCDEF    |
|    B3             I:002                                                               O:074   |
|----] [-----------]/[-------------------------------------------------------------------(L)----|
|    164             01                                                                  12     |
|[394]                                                                                          |
O:074/12 - -] [- - File #2 MAIN_PRGRM -  399
           -]/[- - File #2 MAIN_PRGRM -  400
           -(L)- - File #2 MAIN_PRGRM -  395
           -(U)- - File #2 MAIN_PRGRM -  398
COMPARE :  Rung #394
|                             DWELL 1     DWELL 2     HEATER 3                                  |
|                             CHAMBER     CHAMBER     CHAMBER                                   |
|  READY TO                   GATE VALVE  GATE VALVE  GATE VALVE                      POLYCOLD  |
|  VENT                       CLOSED      CLOSED      CLOSED                          DEFROST   |
|  RTVCVDT                    HV3S1       HV4S1       HV5S1                           PCDEF     |
|    T4:0                       I:004       I:022       I:024                          O:074    |
|-+--] [------------------+------] [---------] [---------] [------------------------------(L)---|
| |   DN                  |      03          06          00                               12    |
| |[392]                  |                                                                     |
| |                       | O:074/12 - -] [- - File #2 MAIN_PRGRM - 399                         |
| |                       |            -]/[- - File #2 MAIN_PRGRM - 400                         |
| |                       |            -(L)- - File #2 MAIN_PRGRM - 395                         |
| |                       |            -(U)- - File #2 MAIN_PRGRM - 398                         |
| |CHAMBER VENT           |                                                                     |
| |ENABLE DELAY           |                                                                     |
| |V2DYTMR                |                                                                     |
| |   T4:19               |                                                                     |
| |----] [----------------|                                                                     |
| |    DN                 |                                                                     |
| |[393]                  |                                                                     |
| |MANUAL                 |                                                                     |
| |CONTROL   HEATER 2     |                                                                     |
| |CHAMBER   CHAMBER      |                                                                     |
| |VENT 2    GATE VALVE   |                                                                     |
| |OPEN      CLOSE        |                                                                     |
| |M-CV2-1   HV2S1        |                                                                     |
| |  N7:6      I:004      |                                                                     |
| +---] [---+----] [------+                                                                     |
|     12    |     00      |                                                                     |
|  [3]      |             |                                                                     |
|           |DOOR 4       |                                                                     |
|           |CLOSED       |                                                                     |
|           |DRCL4S       |                                                                     |
|           | I:006       |                                                                     |
|           +---] [-------+                                                                     |
|                06                                                                             |
```

BASE : Rung #396

```
|                    POLYCOLD                                              VENT DELAY           |
|VENT 2 REQUEST   SETPOINT HIGH                                            TIMER                |
|VNT2_RQST        PCSPH                                                    VNTDLYTMR            |
|     83            I:002                                                  +-TON-------------+   |
|----] [-----------] [---------------------------------------------------+-|TIMER ON DELAY   |-(EN)-|
|    164            01                                                     |TIMER:      T4:80|      |
|[394]                                                                     |BASE (SEC):   1.0|-(DN) |
|                                                                          |PRESET:         5|      |
|                                                                          |ACCUM:          0|      |
|                                                                          +-----------------+      |
T4:80.DN - ] [ - File #2 MAIN_PRGRM - 397
```

COMPARE : Rung #395

```
|POLYCOLD                                                                  VENT DELAY           |
|DEFROST                                                                   TIMER                |
|PCDEF                                                                     VNTDLYTMR            |
|  O:074                                                                   +-TON-------------+   |
|---] [--------------------------------------------------------------------|TIMER ON DELAY   |-(EN)-|
|    12                                                                    |TIMER:      T4:80|      |
|[395]                                                                     |BASE (SEC):   1.0|-(DN) |
|                                                                          |PRESET:       180|      |
|                                                                          |ACCUM:          0|      |
|                                                                          +-----------------+      |
T4:80 - TON - File #2 MAIN_PRGRM - 396
T4:80.DN - ] [ - File #2 MAIN_PRGRM - 397
```

```
          -(U)- - File #2 MAIN_PRGRM -  51
Rung #397                                        - 332 -
|POLYCOLD
|SETPOINT HIGH                                                                   POLYCOLD |
|PCSPH                                                                           DEFROST  |
|     I:002                                                                      PCDEF    |
|----] [-------------------------------------------------------------------------  O:074  |
|     01                                                                       ---(U)----|
O:074/12 - -] [- - File #2 MAIN_PRGRM -  395,398                                    12    |
           -]/[- - File #2 MAIN_PRGRM -  399
           -(L)- - File #2 MAIN_PRGRM -  394
           -(U)- - File #2 MAIN_PRGRM -  397
Rung #398
|POLYCOLD WATER   POLYCOLD                                                  POLYCOLD        |
|ON               DEFROST                                                   COMPRESSOR ON   |
|PC_H2O           PCDEF                                                     PCCOMP          |
|     I:066         O:074                                                      O:074        |
|-----] [---------+---] [---+--------------------------------------------------( )---------|
|     10          |   12    |                                                   10          |
|                 |[397]    |                                                               |
|                 |POLYCOLD COOL                                                            |
|                 |PC_COOL  |                                                               |
|                 |   O:074 |                                                               |
|                 +---] [---+                                                               |
|                      11                                                                   |
|                 [399]
Rung #399
|CHROME    DWELL 1                                                                          |
|CHAMBER   CHAMBER                                                                          |
|=<250     GATE VALVE   POLYCOLD                                                            |
|MICRONS   CLOSED       DEFROST                                               POLYCOLD COOL |
|PIR6      HV3S1        PCDEF                                                 PC_COOL       |
| I:024      I:004       O:074                                                   O:074      |
|---] [---+---]/[---+---]/[------------------------------------------------------( )-------|
|   07    |   03    |   12                                                        11        |
|         |         | [397]                                                                |
|         |DWELL 2  |                                                                      |
|         |CHAMBER  |                                                                      |
|         |GATE VALVE                                                                      |
|         |CLOSED   |                                                                      |
|         |HV4S1    |                                                                      |
|         |  I:022  |                                                                      |
|         +---]/[---+                                                                      |
|         |   05    |                                                                      |
|         |HEATER 3 |                                                                      |
|         |CHAMBER  |                                                                      |
|         |GATE VALVE                                                                      |
|         |CLOSED   |                                                                      |
|         |HV5S1    |                                                                      |
|         |  I:024  |                                                                      |
|         +---]/[---+                                                                      |
|             00                                                                           |
O:074/11 - -] [- - File #2 MAIN_PRGRM -  398
           -( )- - File #2 MAIN_PRGRM -  399
```

```
Rung #400
|VENT 3                                                          VENT 3 STAGE1
|STAGE 1                                                         DELAY TIMER
|V3ST1                                                           V3DYTMR
|  B3                                                            +-TON-----------+
|--| |-----------------------------------------------------------|TIMER ON DELAY |-(EN)-
|  416                                                           |TIMER:    T4:20|
|[423]                                                           |BASE (SEC): 1.0|-(DN)
|                                                                |PRESET:       5|
|                                                                |ACCUM:        0|
|                                                                +---------------+
T4:20.DN - -| |- - File #2 MAIN_PRGRM - 401
Rung #401
|                         DWELL 3     DWELL 4     BUFFER 3
|                         CHAMBER     CHAMBER     CHAMBER                 OPEN
| READY TO                GATE VALVE  GATE VALVE  GATE VALVE              DWELL 3
| VENT                    CLOSED      CLOSED      CLOSED                  VENT VALVE
| RTVCVDT                 HV6S1       HV7S1       HV8S1                   CV3
|   T4:0                  I:024       I:036       I:040                     O:027
|-+--| |-----------------+---| |---------| |---------| |-------------------(L)---
| |   DN                 |   03          06          00                      16
| |[392]                 |
| |                      | O:027/16 - -| |- - File #5 FAULTS - 148
| |                      |                  File #6 TECH_RUNGS - 0
| |                      |          -|/|- - File #2 MAIN_PRGRM - 368
| |                      |                  File #5 FAULTS - 150
| |CHAMBER VENT 3        |          -(U)- - File #2 MAIN_PRGRM - 53
| |ENABLE DELAY          |
| |V3DYTHR               |
| |    T4:20             |
| |------| |-------------+
| |      DN              |
| |[400]                 |
| |MANUAL                |
| |CONTROL    HEATER 3   |
| |CHAMBER    CHAMBER    |
| |VENT 3     GATE VALVE |
| |OPEN       CLOSED     |
| |K-CV3-1    HV5S1      |
| |  N7:6       I:024    |
| +--| |----+---| |----+-+
|     13    |    00    |
|  [3]      |          |
|           |DOOR 6    |
|           |CLOSED    |
|           |DRCL6S    |
|           | I:026    |
|           +--| |-----+
|               02
Rung #402
|
|VENT 4                                                          VENT 4 STAGE1
|STAGE 1                                                         VENT 4 DELAY
|V4ST1                                                           TIMER
|  B3                                                            V4CV4DYTMR
|                                                                +-TON-----------+
|--| |-----------------------------------------------------------|TIMER ON DELAY |-(EN)-
|  418                                                           |TIMER:    T4:29|
|[428]                                                           |BASE (SEC): 1.0|-(DN)
|                                                                |PRESET:       5|
|                                                                |ACCUM:        0|
|                                                                +---------------+
T4:29.DN - -| |- - File #2 MAIN_PRGRM - 403
```

```
Rung #403

READY TO VENT RTVCVDT T4:0 ON [392]
  DWELL 5 CHAMBER GATE VALVE CLOSED HV9S1 I:040 03
  DWELL 6 CHAMBER GATE VALVE CLOSED HV10S1 I:052 06
  BUFFER 4 CHAMBER GATE VALVE CLOSED HV11S1 I:054 00
  OPEN DWELL 5 VENT VALVE CV4 O:043 -(L)- 16

O:043/16 - ┤ ├ - File #5 FAULTS - 152
                 File #6 TECH_RUNGS - 0
           ┤/├ - File #2 MAIN_PRGRM - 368
                 File #5 FAULTS - 154
           -(U)- - File #2 MAIN_PRGRM - 55

CHAMBER VENT 4 ENABLE TIME DELAY V4CV4DYTMR T4:29 ON [402]

MANUAL CONTROL CHAMBER VENT 4 OPEN K-CV4-1 N7:6 14 [3]
  BUFFER 3 CHAMBER GATE VALVE CLOSED HV8S1 I:040 00
  DOOR 8 CLOSED DRCL8S I:042 02

Rung #404
LLOCK CHAMBER PRESSUR AT ATMOSPHERE PS2 I:002 04
DWELL 1 CHAMBER PRESSUR AT ATMOSPHERE PS3 I:002 05
DWELL 3 CHAMBER PRESSUR AT ATMOSPHERE PS4 I:022 04
DWELL 5 CHAMBER PRESSUR AT ATMOSPHERE PS5 I:036 04
EXLOCK CHAMBER PRESSUR AT ATMOSPHERE PS6 I:052 04
  ALL CHAMBERS AT ATMOSPHERE CHBATMOS B3 -( )- 383
B3/383 - ┤ ├ - File #2 MAIN_PRGRM - 368
         -( )- - File #2 MAIN_PRGRM - 404

Rung #405
VENT AREA 1 TS14 N7:16 6 [3]
PUMPDOWN SYSTEM ENABLE PDSE B3 ┤/├ 303 [23]
PUMP AREA 1 ENABLE PUMP1E N7:37 ┤/├ 13 [434]
AUTO MODE ENABLE AUTO N7:37 ┤/├ 11 [158]
  [AF1]
  VENT AREA 1 ENABLE VENT1E N7:37 -(L)- 6
N7:37/6 - ┤ ├ - File #2 MAIN_PRGRM - 34,110,200,216,406,408,409,684
          ┤/├ - File #2 MAIN_PRGRM - 23,115,117,118,375,434
          -(L)- - File #2 MAIN_PRGRM - 405
          -(U)- - File #2 MAIN_PRGRM - 410
_F:N7:21LX21 - BTW - File #2 MAIN_PRGRM - 2
```

Rung #406

VENT AREA 1 ENABLE VENT1E N7:37 — ] [ — 6 [405]

VENT SECTION 1 TIMER VNT1TMR

TON
TIMER ON DELAY —(EN)
TIMER: T4:168
BASE (SEC): 1.0 —(DN)
PRESET: 180
ACCUM: 0

T4:168.DN - ] [ - File #2 MAIN_PRGRM - 608

Rung #407

PALLET DETECTED LEFT SIDE HEATER 2 SEN10 I:003 — ] [ — 11

PALLET DETECTED RIGHT SIDE HEATER 2 SEN12 I:003 — ] [ — 13

PALLET DETECTED LEFT SIDE DWELL 1 SEN13 I:003 — ] [ — 14

PALLET DETECTED CENTER DWELL 1 SEN14 I:003 — ] [ — 15

PALLET AT DOOR 4 PLT_DR4 B3 —( )— 247

B3/247 - ]/[ - File #2 MAIN_PRGRM - 408

Rung #408

VENT AREA 1 ENABLE VENT1E N7:37 — ] [ — 6 [410]

PUMP AREA 1 ENABLE PUMP1E N7:37 — ] [ — 13 [434]

MANUAL CONTROL CLOSE DOOR 4 M-DRCL4 N7:10 — ] [ — 14 [3]

PALLET AT DOOR 4 PLT_DR4 B3 — ]/[ — 247 [407]

PALLET DETECTED LEFT SIDE DWELL 1 SEN13 I:003 — ]/[ — 14

PALLET DETECTED RIGHT-SIDE HEATER 2 SEN12 I:003 — ]/[ — 13

PALLET DETECTED LEFT SIDE DWELL 1 SEN13 I:003 — ] [ — 14

PALLET DETECTED RIGHT SIDE DWELL 1 SEN15 I:003 — ] [ — 16

PALLET DETECTED LEFT SIDE DWELL 1 SEN13 I:003 — ]/[ — 14

PALLET DETECTED RIGHT SIDE DWELL 1 SEN15 I:003 — ]/[ — 16

DOOR 4 CLOSED DRCL4S I:006 — ]/[ — 06

DOOR CLOSE SOLENOID 4 ENABLE DRCL4 O:011 —( )— 06

MANUAL CONTROL CLOSE DOOR 4 M-DRCL4 N7:10 — ] [ — 14 [3]

PALLET AT DOOR 4 PLT_DR4 B3 — ]/[ — 247 [407]

MANUAL DOOR 4 OPEN MDR4OP N7:32 —(U)— 10

MANUAL DOOR 4 CLOSE MDR4CL N7:31 —(L)— 14

O:011/06 - ] [ - File #5 FAULTS - 23

```
            File #6 TECH_RUNGS -  2
        -( )- - File #2 MAIN_PRGRM -  408
N7:32/10 - -(L)- - File #2 MAIN_PRGRM -  415
        -(U)- - File #2 MAIN_PRGRM -  408
_F:N7:21lX21 - BTW - File #2 MAIN_PRGRM -  2
N7:31/14 - -(L)- - File #2 MAIN_PRGRM -  408
        -(U)- - File #2 MAIN_PRGRM -  415
_F:N7:21lX21 - BTW - File #2 MAIN_PRGRM -  2
Rung #409
|                                   LLOCK                                   OPEN
|                                   CHAMBER   HEATER 1     HEATER 2     CAPACITANC
|                                   ROUGH     CHAMBER      CHAMBER      MANOMETER
|VENT AREA  DOOR 4   DOOR 2  DOOR 3  VALVE     GATE VALVE   GATE VALVE   ISOLATION                  VENT 1
|1 ENABLE   CLOSED   OPEN    OPEN    CLOSED    CLOSE        CLOSE        VALVE 1                    STAGE 1
|VENT1E     DRCL4S   DROP2S  DROP3S  RVS1      HV1S1        HV2S1        CMV1                       V1ST1
|  N7:37    I:006    I:006   I:006   I:002     I:002        I:004        O:010                        B3
|---] [------] [------] [------] [------] [------] [-----------] [----------]/[------------------------( )--
|   6        06       03      05      15        06           00           06                          412
|[410]                                                                  [375]
B3/412 - ] [ - File #2 MAIN_PRGRM -  171,410
      -( )- - File #2 MAIN_PRGRM -  409
Rung #410
|           LLOCK
|           CHAMBER
| VENT 1    PRESSUR AT                                                                  VENT AREA
| STAGE 1   ATMOSPHERE                                                                  1 ENABLE
| V1ST1     PS2                                                                         VENT1E
|   B3        I:002                                                                       N7:37
|-+---] [-------] [-------+-------------------------------------------------------------(U)---
| |  412          04      |                                                                 6
| |[409]                  |
| |                       | N7:37/6 - ] [ - File #2 MAIN_PRGRM - 34, 110, 200, 216, 406, 408, 409, 684
| |                       |          ]/[ - File #2 MAIN_PRGRM - 23, 115, 117, 118, 375, 434
| |                       |          -(L)- - File #2 MAIN_PRGRM - 405
| |                       | _F:N7:21lX21 - BTW - File #2 MAIN_PRGRM - 2
| |ABORT SYSTEM           |
| |VENT                   |
| |BORT_SYS_VNT           |
| |   N7:17               |
| |---] [-----------------|
| |    10                 |
| |[3]                    |
| |PREPARE FOR            |
| |AUTO RUN               |
| |>AUTO                  |
| |   N7:37               |
| +---] [-----------------+
|      1
| [162]
Rung #411
|        PUMPDOWN                  AUTO
|AREA 2  SYSTEM     PUMP AREA      MODE                                                VENT AREA
|VENT    ENABLE     2 ENABLE       ENABLE                                              2 ENABLE
|TS15    POSE       PUMP2E         AUTO                                                VENT2E
| N7:16    B3        N7:37         N7:37                                                N7:37
|--] [-----]/[--------]/[-----------]/[---[AFI]-----------------------------------------(L)---
|  7      303          14            11                                                    7
|[3]     [23]        [438]         [158]
N7:37/7 - ] [ - File #2 MAIN_PRGRM -  35,111,229,412,414,415,416
         ]/[ - File #2 MAIN_PRGRM -  23,117,118,119,120,121,122,123,124,376,438
        -(L)- - File #2 MAIN_PRGRM -  411
        -(U)- - File #2 MAIN_PRGRM -  417
```

_F:N7:21[X21 - BTW - File #2 MAIN_PRGRM - 2
- 337 -
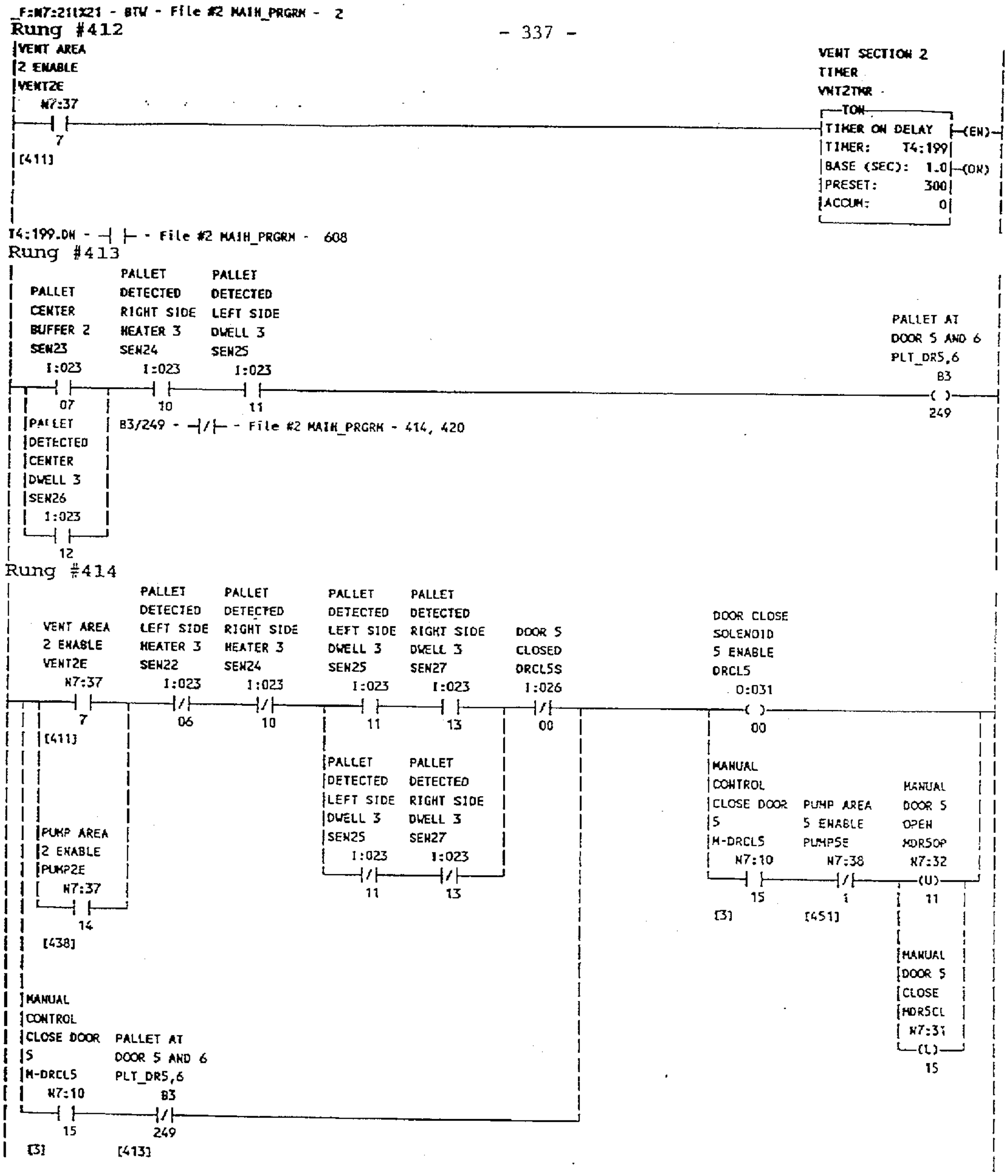

O:031/00 - -| |- - File #5 FAULTS - 25
File #6 TECH_RUNGS - 2
-( )- - File #2 MAIN_PRGRM - 414
N7:32/11 - -(L)- - File #2 MAIN_PRGRM - 46
-(U)- - File #2 MAIN_PRGRM - 414
_F:N7:21[X21 - BTW - File #2 MAIN_PRGRM - 2
N7:31/15 - -(L)- - File #2 MAIN_PRGRM - 414
-(U)- - File #2 MAIN_PRGRM - 46
_F:N7:21[X21 - BTW - File #2 MAIN_PRGRM - 2
Rung #415
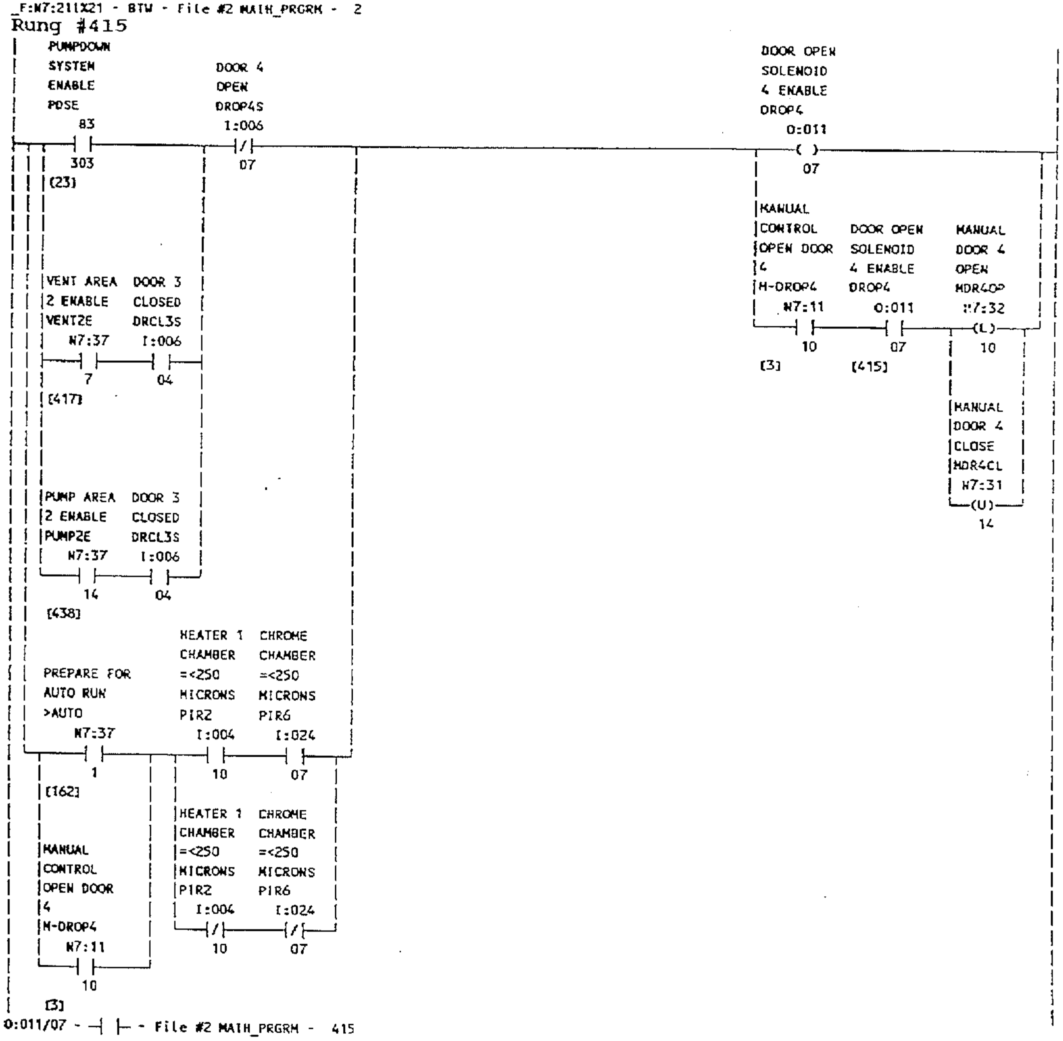
O:011/07 - -| |- - File #2 MAIN_PRGRM - 415
File #5 FAULTS - 47

```
                File #6 TECH_RUNGS -  2
          -( )- - File #2 MAIN_PRGRM -  415
N7:32/10 - -(L)- - File #2 MAIN_PRGRM -  415
          -(U)- - File #2 MAIN_PRGRM -  408
_F:N7:21(X21 - BTW - File #2 MAIN_PRGRM -  2
N7:31/14 - -(L)- - File #2 MAIN_PRGRM -  408
          -(U)- - File #2 MAIN_PRGRM -  415
_F:N7:21(X21 - BTW - File #2 MAIN_PRGRM -  2
Rung #416
|                                                                                  OPEN                     DWELL 2
|                                   HEATER 2   DWELL 1    DWELL 2    HEATER 3    CAPACITANC  RGA 2       CHAMBER
|                                   CHAMBER    CHAMBER    CHAMBER    CHAMBER     MANOMETER   ISOLATION   ROUGH
|VENT AREA  DOOR 3  DOOR 4  DOOR 5  GATE VALVE GATE VALVE GATE VALVE GATE VALVE  ISOLATION   VALVE       VALVE RV2   VENT 2
|2 ENABLE   CLOSED  OPEN    CLOSED  CLOSE      CLOSED     CLOSED     CLOSED      VALVE 2     CLOSED      CLOSED      STAGE 1
|VENT2E     DRCL3S  DROP4S  DRCL5S  HV2S1      HV3S1      HV4S1      HV5S1       CKV2        RGAS3       RVS3        V2ST1
|  N7:37    I:006   I:006   I:026   I:004      I:004      I:022      I:024       O:030       I:025       I:022       B3
|---] [-----] [-----] [-----] [-----] [--------] [--------] [--------] [---------]/[---------] [---------] [--------( )--
|   7       04      07      00      00         03         06         00          06          16          15          414
|[417]                                                                          [376]
B3/414 - -] [- - File #2 MAIN_PRGRM -  393,417
         -( )- - File #2 MAIN_PRGRM -  416
Rung #417
|          DWELL 1     DWELL 1
|          CHAMBER     CHAMBER
| VENT 2   PRESSUR AT  VENT VALVE                                                                        VENT AREA
| STAGE 1  ATMOSPHERE  OPEN                                                                              2 ENABLE
| V2ST1    PS3         CVS4                                                                              VENT2E
|  B3       I:002       I:002                                                                              N7:37
|-+--] [-----] [--------] [---+----------------------------------------------------------------------------(U)--
| |  414       05          14 |                                                                              7
| |[416]                      |
| |                           | N7:37/7 - -] [- - File #2 MAIN_PRGRM - 35, 111, 229, 412, 414, 415, 416
| |                           |           -]/[- - File #2 MAIN_PRGRM - 23, 117, 118, 119, 120, 121, 122, 123, 124,
| |                           |                   376, 438
| |                           |           -(L)- - File #2 MAIN_PRGRM - 411
| |ABORT SYSTEM               | _F:N7:21(X21 - BTW - File #2 MAIN_PRGRM - 2
| |VENT                       |
| |BORT_SYS_VNT               |
| |  N7:17                    |
| |---] [---------------------|
| |    10                     |
| |[3]                        |
| |PREPARE FOR                |
| |AUTO RUN                   |
| |>AUTO                      |
| |  N7:37                    |
| +---] [---------------------+
|       1
| [162]
Rung #418
|        PUMPDOWN                AUTO
|AREA 3  SYSTEM    PUMP AREA     MODE                                                                   VENT AREA
|VENT    ENABLE    3 ENABLE      ENABLE                                                                 3 ENABLE
|TS16    POSE      PUMP3E        AUTO                                                                   VENT3E
| N7:16   B3        N7:37        N7:37                                                                    N7:37
|--] [-----]/[--------]/[--------]/[--[AFI]----------------------------------------------------------------(L)--
|  8     303        15           11                                                                          8
|[3]    [23]       [442]        [158]
N7:37/8 - -] [- - File #2 MAIN_PRGRM -  36,43,112,419,420,422,423
          -]/[- - File #2 MAIN_PRGRM -  23,125,126,127,128,129,130,377,442
          -(L)- - File #2 MAIN_PRGRM -  418
          -(U)- - File #2 MAIN_PRGRM -  424
```

_F:N7:21[X21 - BTW - File #2 MAIN_PRGRM - 2

Rung #419

```
|VENT AREA                                                   VENT SECTION 3
|3 ENABLE                                                    TIMER
|VENT3E                                                      VNT3TMR
|  N7:37                                                     +-TON--------------+
|--] [-------------------------------------------------------|TIMER ON DELAY    |-(EN)-
|   8                                                        |TIMER:     T4:242 |
|[418]                                                       |BASE (SEC):   1.0 |-(DN)
|                                                            |PRESET:       300 |
|                                                            |ACCUM:          0 |
|                                                            +------------------+
```

T4:242.DN - ] [ - File #2 MAIN_PRGRM - 608

Rung #420

```
           PALLET     PALLET      PALLET     PALLET
           DETECTED   DETECTED    DETECTED   DETECTED                 DOOR CLOSE
 VENT AREA LEFT SIDE  RIGHT SIDE  LEFT SIDE  RIGHT SIDE               SOLENOID
 3 ENABLE  HEATER 3   HEATER 3    DWELL 3    DWELL 3    DOOR 6        6 ENABLE
 VENT3E    SEN22      SEN24       SEN25      SEN27      CLOSED        DRCL6
  N7:37     I:023      I:023       I:023      I:023     DRCL6S         O:031
                                                         I:026
---] [------]/[--------]/[---------]/[--------]/[--------]/[------------( )---
    8        06         10          11         13         02             02
 [418]
                                  PALLET     PALLET                MANUAL
                                  DETECTED   DETECTED              CONTROL                     MANUAL
                                  LEFT SIDE  RIGHT SIDE            CLOSE DOOR  PALLET AT       DOOR 6
                                  DWELL 3    DWELL 3               6           DOOR 5 AND 6    OPEN
 PUMP AREA                        SEN25      SEN27                 M-DRCL6     PLT_DR5,6       MDR6OP
 3 ENABLE                          I:023      I:023                 N7:11       B3             N7:32
 PUMP3E                          --] [--------] [--                --] [---------]/[-----------(U)--
  N7:37                             11         13                    0          249             12
--] [--                                                            [3]         [413]
   15                                                                                          MANUAL
 [442]                                                                                         DOOR 6
                                                                                               CLOSE
MANUAL                                                                                         MDR6CL
CONTROL                                                                                        N7:32
CLOSE DOOR  PALLET AT                                                                        --(L)--
6           DOOR 5 AND 6                                                                         0
M-DRCL6     PLT_DR5,6
 N7:11       B3
--] [--------]/[------------------------------------------
   0         249
 [3]        [413]
```

O:031/02 - ] [ - File #5 FAULTS - 27
File #6 TECH_RUNGS - 2
-( )- - File #2 MAIN_PRGRM - 420
N7:32/12 - -(L)- - File #2 MAIN_PRGRM - 47
-(U)- - File #2 MAIN_PRGRM - 420
_F:N7:21[X21 - BTW - File #2 MAIN_PRGRM - 2
N7:32/0 - -(L)- - File #2 MAIN_PRGRM - 420
-(U)- - File #2 MAIN_PRGRM - 47
_F:N7:21[X21 - BTW - File #2 MAIN_PRGRM - 2

```
Rung #421

 PALLET      PALLET       PALLET                                      PALLET AT
 CENTER      DETECTED     DETECTED                                    DOOR 7 AND 8
 BUFFER 3    RIGHT SIDE   LEFT SIDE                                   PLT_DR7,8
 SEN35       BUFFER 3     DWELL 5                                        83
 I:037       SEN36        SEN37
  07         I:037        I:037                                        ( )
             10           11                                           296
 PALLET
 DETECTED    83/296 - -|/|- - File #2 MAIN_PRGRM - 422, 427
 CENTER
 DWELL 5
 SEN38
 I:037
  12

Rung #422

 VENT AREA   PALLET       PALLET       PALLET      PALLET                    DOOR CLOSE
 3 ENABLE    DETECTED     DETECTED     DETECTED    DETECTED     DOOR 7       SOLENOID
 VENT3E      LEFT SIDE    RIGHT SIDE   LEFT SIDE   RIGHT SIDE   CLOSED       7 ENABLE
 N7:37       BUFFER 3     BUFFER 3     DWELL 5     DWELL 5      DRCL7S       DRCL7
  8          SEN34        SEN36        SEN37       SEN39        I:042        O:045
 [424]       I:037        I:037        I:037       I:037         -|/|-        ( )
              -|/|-        -|/|-        11          13            00          00
              06           10
                                       PALLET      PALLET                    MANUAL
 PUMP AREA                             DETECTED    DETECTED                  CONTROL                     MANUAL
 3 ENABLE                              LEFT SIDE   RIGHT SIDE                CLOSE DOOR   PALLET AT      DOOR 7
 PUMP3E                                DWELL 5     DWELL 5                   7            DOOR 7 AND 8   OPEN
 N7:37                                 SEN37       SEN39                     M-CRCL7      PLT_DR7,8      MDR7OP
  15                                   I:037       I:037                     N7:11         83            N7:32
 [442]                                  -|/|-       -|/|-                     1           -|/|-          (U)
                                        11          13                       [3]           296           13
                                                                                         [421]
 MANUAL                                                                                                  MANUAL
 CONTROL                                                                                                 DOOR 7
 CLOSE DOOR  PALLET AT                                                                                   CLOSE
 7           DOOR 7 AND 8                                                                                MDR7CL
 M-CRCL7     PLT_DR7,8                                                                                   N7:32
 N7:11        83                                                                                         (L)
  1           -|/|-                                                                                       1
              296
 [3]         [421]

O:045/00 - -| |- - File #5 FAULTS - 29
                   File #6 TECH_RUNGS - 3
           -( )- - File #2 MAIN_PRGRM - 422
N7:32/13 - -(L)- - File #2 MAIN_PRGRM - 48
           -(U)- - File #2 MAIN_PRGRM - 422
_F:N7:21[X21 - BTW - File #2 MAIN_PRGRM - 2
N7:32/1 - -(L)- - File #2 MAIN_PRGRM - 422
          -(U)- - File #2 MAIN_PRGRM - 48
_F:N7:21[X21 - BTW - File #2 MAIN_PRGRM - 2
```

```
Rung #423                                                              - 342 -
|                                                          DWELL 2             OPEN
|                        DWELL 3     DWELL 4     BUFFER 3  CHAMBER   RGA 2     CAPACITANC
|                        CHAMBER     CHAMBER     CHAMBER   ROUGH     ISOLATION MANOMETER
|VENT AREA DOOR 6 DOOR 7 GATE VALVE  GATE VALVE  GATE VALVE VALVE RV2 VALVE    ISOLATION                 VENT 3
|3 ENABLE  CLOSED CLOSED CLOSEC      CLOSED      CLOSED    CLOSED    CLOSED    VALVE 3                   STAGE 1
|VENT3E    DRCL6S DRCL7S HV6S1       HV7S1       HV8S1     RVS3      RGAS3     CHV3                      V3ST1
| N7:37    I:026  I:042  I:024       I:036       I:040     I:022     I:025     O:044                     B3
|--] [-----] [----] [-----] [---------] [----------] [---------] [---------] [--------]/[----------------( )--|
|   8       02     00     03          06          00        15        16        06                      416
|[424]                                                                         [377]
B3/416 - ] [ - - File #2 MAIN_PRGRM -  400,424
         -( )- - File #2 MAIN_PRGRM -  423
Rung #424
|         DWELL 3      DWELL 3
|         CHAMBER      CHAMBER
| VENT 3  PRESSUR AT   VENT VALVE                                                                  VENT AREA
| STAGE 1 ATMOSPHERE   OPEN                                                                        3 ENABLE
| V3ST1   PS4          CVS6                                                                        VENT3E
|  B3      I:022        I:022                                                                       N7:37
|-+--] [-----] [-----------] [---+--------------------------------------------------------------------(U)--|
| |  416       04            12  |                                                                      8
| |[423]                         |
| |                              | N7:37/8 - ] [ - - File #2 MAIN_PRGRM - 36, 43, 112, 419, 420, 422, 423
| |                              |           ]/[ - - File #2 MAIN_PRGRM - 23, 125, 126, 127, 128, 129, 130, 377, 442
| |                              |           -(L)- - File #2 MAIN_PRGRM - 418
| |                              | _F:N7:211%21 - BTW - File #2 MAIN_PRGRM - 2
| |ABORT SYSTEM                  |
| |VENT                          |
| |BORT_SYS_VNT                  |
| |   N7:17                      |
| |---] [------------------------|
| |    10                        |
| |[3]                           |
| |PREPARE FOR                   |
| |AUTO RUN                      |
| |>AUTO                         |
| |   N7:37                      |
| +---] [------------------------+
|      1
| [162]
Rung #425
|       PUMPDOWN            AUTO
|AREA 4 SYSTEM  PUMP AREA   MODE                                                                   VENT AREA
|VENT   ENABLE  4 ENABLE    ENABLE                                                                 4 ENABLE
|TS17   POSE    PUMP4E      AUTO                                                                   VENT4E
| N7:16  B3      N7:38      N7:37                                                                   N7:37
|--] [---]/[------]/[--------]/[---(AFI)--------------------------------------------------------------(L)--|
|  9    303        0         11                                                                        9
|[3]   [23]      [447]      [158]
N7:37/9 - ] [ - - File #2 MAIN_PRGRM -  37,113,329,426,427,428
          ]/[ - - File #2 MAIN_PRGRM -  23,131,132,133,134,135,136,378,447
          -(L)- - File #2 MAIN_PRGRM -  425
          -(U)- - File #2 MAIN_PRGRM -  429
_F:N7:211%21 - BTW - File #2 MAIN_PRGRM -  2
```

```
Rung #426
|VENT AREA                                                   VENT SECTION 4
|4 ENABLE                                                    TIMER
|VENT4E                                                      VNT4TMR
|  N7:37                                                    +-TON-----------------+
|--] [-----------------------------------------------------+|TIMER ON DELAY       |-(EN)-
|   9                                                       |TIMER:       T4:248  |
|[425]                                                      |BASE (SEC):     1.0  |-(DN)
|                                                           |PRESET:         300  |
|                                                           |ACCUM:            0  |
                                                            +---------------------+
T4:248.DN - ] [ - File #2 MAIN_PRGRM - 608

Rung #427
            PALLET     PALLET     PALLET     PALLET
            DETECTED   DETECTED   DETECTED   DETECTED
 VENT AREA  LEFT SIDE  RIGHT SIDE LEFT SIDE  RIGHT SIDE  DOOR 8       DOOR CLOSE
 4 ENABLE   BUFFER 3   BUFFER 3   DWELL 5    DWELL 5     CLOSED       SOLENOID
 VENT4E     SEN34      SEN36      SEN37      SEN39       DRCL8S       8 ENABLE
   N7:37     I:037      I:037      I:037      I:037       I:042       DRCL8
                                                                       O:045
--] [-------]/[--------]/[--------] [--------] [---------]/[-----------( )-
    9        06         10         11         13          02           02
 [425]
                                  PALLET     PALLET                  MANUAL
                                  DETECTED   DETECTED                CONTROL
                                  LEFT SIDE  RIGHT SIDE              CLOSE DOOR PALLET AT   MANUAL
                                  DWELL 5    DWELL 5                 8          DOOR 7 AND 8 DOOR 8
                                  SEN37      SEN39                   M-CRCL8    PLT_DR7,8    OPEN
  PUMP AREA                        I:037      I:037                   N7:11      B3          MDR8OP
  4 ENABLE                        --]/[--------]/[--                --] [--------]/[------   N7:32
  PUMP4E                            11         13                     2          296        -(U)-
    N7:38                                                            [3]        [421]         14
  --] [--
    0                                                                                    MANUAL
  [447]                                                                                  DOOR 8
                                                                                         CLOSE
  MANUAL                                                                                 MDR8CL
  CONTROL                                                                                 N7:32
  CLOSE DOOR                                                                             -(L)-
  8                                                                                        2
  M-CRCL8
    N7:11
  --] [--
     2
  [3]
 MANUAL
 CONTROL
 CLOSE DOOR  PALLET AT
 8           DOOR 7 AND 8
 M-CRCL8     PLT_DR7,8
   N7:11        B3
 --] [---------]/[--
   2           296
 [3]          [421]
O:045/02 - ] [ - File #5 FAULTS - 31
                 File #6 TECH_RUNGS - 3
          -( )- - File #2 MAIN_PRGRM - 427
N7:32/14 - -(L)- - File #2 MAIN_PRGRM - 49
           -(U)- - File #2 MAIN_PRGRM - 427
_F:N7:21(X21 - BTW - File #2 MAIN_PRGRM - 2
N7:32/2 - -(L)- - File #2 MAIN_PRGRM - 427
          -(U)- - File #2 MAIN_PRGRM - 49
_F:N7:21(X21 - BTW - File #2 MAIN_PRGRM - 2
```

```
Rung #428
|                                                                  DWELL 5             OPEN
|                         DWELL 5     DWELL 6     BUFFER 4     CHAMBER   RGA 4      CAPACITANC
|                         CHAMBER     CHAMBER     CHAMBER      ROUGH     ISOLATION  MANOMETER
|VENT AREA DOOR 8  DOOR 9 GATE VALVE  GATE VALVE  GATE VALVE   VALVE     VALVE      ISOLATION                VENT 4
|4 ENABLE  CLOSED  CLOSED CLOSED      CLOSED      CLOSED       CLOSED    CLOSED     VALVE 4                  STAGE 1
|VENT4E    DRCL8S  DRCL9S HV9S1       HV10S1      HV11S1       RVS7      RGAS7      CKV4                     V4ST1
| N7:37    I:042   I:056  I:040       I:052       I:054        I:052     I:055      O:060                      B3
|---] [-----] [-----] [-----] [---------] [---------] [----------] [--------] [---------]/[------------------( )--|
|    9       02      00      03          06          00           14         16          06                    418
|[429]                                                                               [378]
B3/418 - ] [ - File #2 MAIN_PRGRM -  402,429
         -( )- - File #2 MAIN_PRGRM -  428
Rung #429
|          DWELL 5      DWELL 5
|          CHAMBER      CHAMBER
|  VENT 4  VENT VALVE   PRESSUR AT                                                                  VENT AREA
|  STAGE 1 OPEN         ATMOSPHERE                                                                  4 ENABLE
|  V4ST1   CVS8         PS5                                                                         VENT4E
|   B3       I:036        I:036                                                                      N7:37
|-+--] [------] [--------] [---+-------------------------------------------------------------------(U)-----|
| |  418        12          04 |                                                                      9
| |[428]                       |
| |                            | N7:37/9 - ] [ - File #2 MAIN_PRGRM - 37, 113, 329, 426, 427, 428
| |                            |           ]/[ - File #2 MAIN_PRGRM - 23, 131, 132, 133, 134, 135, 136, 378, 447
| |                            |           -(L)- - File #2 MAIN_PRGRM - 425
| |                            | _F:N7:21 1X21 - BTW - File #2 MAIN_PRGRM - 2
| |ABORT SYSTEM                |
| |VENT                        |
| |BORT_SYS_VNT                |
| |  N7:17                     |
| |---] [----------------------|
| |    10                      |
| |[3]                         |
| |PREPARE FOR                 |
| |AUTO RUN                    |
| |>AUTO                       |
| |  N7:37                     |
| +---] [----------------------+
|      1
| [162]
Rung #430
|       PUMPDOWN               AUTO
|AREA 5 SYSTEM    PUMP AREA    MODE                                                                 VENT AREA
|VENT   ENABLE    5 ENABLE     ENABLE                                                               5 ENABLE
|TS18   PDSE      PUMP5E       AUTO                                                                 VENT5E
| N7:16   B3       N7:38       N7:37                                                                 N7:37
|--] [-----]/[--------]/[--------]/[---[AFI]------------------------------------------------------(L)-----|
|   10     303         1          11                                                                  10
|[3]     [23]      [451]       [158]
N7:37/10 - ] [ - File #2 MAIN_PRGRM -  114,327,335,431,432,698
           ]/[ - File #2 MAIN_PRGRM -  23,137,138,451
           -(L)- - File #2 MAIN_PRGRM -  430
           -(U)- - File #2 MAIN_PRGRM -  433
_F:N7:21 1X21 - BTW - File #2 MAIN_PRGRM -  2
```

```
Rung #431
|VENT AREA                                                              VENT SECTION 5
|5 ENABLE                                                               TIMER
|VENT5E                                                                 VNT5TMR
|  N7:37                                                                +-TON------------+
|---] [-----------------------------------------------------------------+TIMER ON DELAY  +-(EN)-
|   10                                                                  |TIMER:   T4:252 |
|[430]                                                                  |BASE (SEC):  1.0+-(DN)
|                                                                       |PRESET:     180 |
|                                                                       |ACCUM:        0 |
|                                                                       +----------------+
T4:252.DN - ] [ - File #2 MAIN_PRGRM - 608
Rung #432
|           EXLOCK
|           CHAMBER   EXITLOCK
|           ROUGH     CHAMBER
|VENT AREA  VALVE     GATE VALVE  DOOR 10  DOOR 11
|5 ENABLE   CLOSED    CLOSED      CLOSED   OPEN                                    VENT 5
|VENT5E     RVS9      HV12S1      DRCL10S  DROP11S                                 STAGE 1
|  N7:37     I:052     I:054       I:056    I:056                                  V5ST1
|---] [------] [-------] [----------] [------] [-----------------------------------  B3
|   10        16        03          02       05                                   -( )-
|[433]                                                                              420
B3/420 - ] [ - File #2 MAIN_PRGRM - 344,351,433
       -( )- - File #2 MAIN_PRGRM - 432
Rung #433
|          EXLOCK
|          CHAMBER
| VENT 5   PRESSUR AT                                                        VENT AREA
| STAGE 1  ATMOSPHERE                                                        5 ENABLE
| V5ST1    PS6                                                               VENT5E
|   B3      I:052                                                            N7:37
|-+--] [-----] [----+-------------------------------------------------------(U)-
| |  420       04   |                                                         10
| |[432]            |
| |                 | N7:37/10 - ] [ - File #2 MAIN_PRGRM - 114, 327, 335, 431, 432, 698
| |                 |            ]/[ - File #2 MAIN_PRGRM - 23, 137, 138, 451
| |                 |            -(L)- - File #2 MAIN_PRGRM - 430
| |                 | _F:N7:211X21 - BTW - File #2 MAIN_PRGRM - 2
| |ABORT SYSTEM     |
| |VENT             |
| |BORT_SYS_VNT     |
| |  N7:17          |
| +---] [-----------+
| |    10           |
| |[3]              |
| |PREPARE FOR      |
| |AUTO RUN         |
| |>AUTO            |
| |  N7:37          |
| +---] [-----------+
|      1
| [162]
Rung #434
|         HEATER 1    HEATER 2
|         CHAMBER     CHAMBER     PIRANI              SYSTEM
|PUMP AREA GATE VALVE GATE VALVE  GUAGE 1   DOOR 2    VENT     VENT AREA
|1         CLOSE      CLOSE       NO FAULT  OPEN      ENABLE   1 ENABLE              PUMP AREA
|TS21      HV1S1      HV2S1       PGNF1     DROP2S    SYSVNTE  VENT1E                1 ENABLE
|  N7:16    I:002      I:004       I:004     I:006    N7:37    N7:37                 PUMP1E
|---] [------] [-------] [----------] [-------] [------]/[------]/[------------------ N7:37
|   13        06        00          14        03       5        6                   -(L)-
|[3]                                                  [369]    [410]                  13
```

```
N7:37/13 - -| |- - File #2 MAIN_PRGRM -  26,27,105,167,183,200,216,408,435,436,455
           -|/|- - File #2 MAIN_PRGRM -  369,405
           -(L)- - File #2 MAIN_PRGRM -  434
           -(U)- - File #2 MAIN_PRGRM -  437
_F:N7:21tX21 - BTW - File #2 MAIN_PRGRM -  2
```

Rung #435

```
|PUMP AREA  VENT AREA                                                                  PUMP SECTION 1      |
|1 ENABLE   ACTIVE                                                                     TIMER               |
|PUMP1E     VNTACT                                                                     PMP1TMR             |
|  N7:37      B3                                                                       +-TON------------+  |
|---| |-------|/|--------------------------------------------------------------------+-|TIMER ON DELAY  |-(EN)-|
|   13        343                                                                    |TIMER:    T4:256|      |
|[434]                                                                               |BASE (SEC):  1.0|-(DN) |
|                                                                                    |PRESET:      600|      |
|                                                                                    |ACCUM:         0|      |
|                                                                                    +----------------+      |
T4:256.DN - -| |- - File #2 MAIN_PRGRM -  609
```

Rung #436

```
|                                                                            LLOCK                       |
|           ENABLE      ENABLE      OPEN                                     CHAMBER                     |
|           CRYO        CRYO        LOAD LOCK                                ROUGH                       |
|PUMP AREA  COMPRESSOR  COMPRESSOR  CHAMBER     DOOR 1   DOOR 3   DOOR 4     VALVE             PUMP 1    |
|1 ENABLE   1           2           VENT VALVE  CLOSED   OPEN     CLOSED     CLOSED            STAGE 1   |
|PUMP1E     CY1         CY2         CV1         DRCL1S   DROP3S   DRCL4S     RVS1              P1ST1     |
|  N7:37     O:010       O:010       O:007      I:006    I:006    I:006      I:002               B3      |
|---| |-------| |---------| |---------|/|--------| |------| |------| |-------| |-----------------( )-----|
|   13        04          05          16         00       05       06         15                422      |
|[437]      [26]        [27]        [177]                                                               |
B3/422 - -| |- - File #2 MAIN_PRGRM -  68,115,117,118,437
         -( )- - File #2 MAIN_PRGRM -  436
```

- 347 -

Rung #437

```
|          HEATER 1   HEATER 2                                                          |
|          CHAMBER    CHAMBER                                                           |
| PUMP 1   GATE VALVE GATE VALVE                                      PUMP AREA         |
| STAGE 1  OPEN       OPEN                                            1 ENABLE          |
| P1ST1    HV1S3      HV2S3                                           PUMP1E            |
|   B3      I:002      I:004                                           N7:37            |
|-+--] [-----] [-------] [---+-------------------------------------------+----(U)-------|
| |  422      10         02   |                                         |     13     | |
| |[436]                      |                                         |            | |
| |                           | N7:37/13 - ] [ - File #2 MAIN_PRGRM - 26, 27, 105, 167, | |
| |                           |        183, 200, 216, 408, 435, 436, 455 |PUMP1E      | |
| |                           |        ]/[ - File #2 MAIN_PRGRM - 369, 405 |DISABLE   | |
| |                           |        -(L)- - File #2 MAIN_PRGRM - 434  |PULSE       | |
| |                           | _F:N7:21[X21 - BTW - File #2 MAIN_PRGRM - 2 |PUMP1EDPLSE| |
| |ABORT PUMPDOWN             | T4:284.TT - ] [ - File #2 MAIN_PRGRM - 84 |+-TON-----+ | |
| |BT_PD                      |                                         +|TIMER ON DELAY|-(EN)-+
| |    N7:17                  |                                          |TIMER:  T4:284|
| |---] [---------------------|                                          |BASE (SEC): 1.0|-(DN)
| |     8                     |                                          |PRESET:     5|
| |[3]                        |                                          |ACCUM:      0|
| |                           |                                          +--------------+
| |PIRANI                     |
| |GUAGE 1                    |
| |NO FAULT                   |
| |PGNF1                      |
| |  I:004                    |
| |---]/[---------------------|
| |   14                      |
| |PREPARE FOR                |
| |AUTO RUN                   |
| |>AUTO                      |
| |   N7:37                   |
| +---] [---------------------+
|      1
| [162]
```

Rung #438

```
|          HEATER 2   DWELL 1    DWELL 2    HEATER 3
|          CHAMBER    CHAMBER    CHAMBER    CHAMBER    PIRANI    SYSTEM
|PUMP AREA GATE VALVE GATE VALVE GATE VALVE GATE VALVE GUAGE 2   VENT     VENT AREA              PUMP AREA |
|2         CLOSE      CLOSED     CLOSED     CLOSED     NO FAULT  ENABLE   2 ENABLE               2 ENABLE  |
|TS22      HV2S1      HV3S1      HV4S1      HV5S1      PGNF2     SYSVNTE  VENT2E                 PUMP2E    |
|  N7:16    I:004      I:004      I:022      I:024      I:004     N7:37    N7:37                  N7:37    |
|---] [------] [--------] [--------] [--------] [--------] [--------]/[------]/[------------------(L)------|
|    14      00         03         06         00         15        5        7                      14     |
|[3]                                                              [369]    [417]                          |
N7:37/14 - ] [ - File #2 MAIN_PRGRM - 27,28,29,30,56,73,106,229,414,415,439,440,445
           ]/[ - File #2 MAIN_PRGRM - 369,411
          -(L)- - File #2 MAIN_PRGRM - 438
          -(U)- - File #2 MAIN_PRGRM - 441
_F:N7:21[X21 - BTW - File #2 MAIN_PRGRM - 2
```

Rung #439

```
|PUMP AREA                                                              PUMP SECTION 2  |
|2 ENABLE                                                               TIMER           |
|PUMP2E                                                                 PMP2TMR         |
|  N7:37                                                                +-TON-----------+
|---] [-----------------------------------------------------------------|TIMER ON DELAY |-(EN)-|
|    14                                                                 |TIMER:   T4:262|      |
|[438]                                                                  |BASE (SEC): 1.0|-(DN) |
|                                                                       |PRESET:     600|      |
|                                                                       |ACCUM:        0|      |
|                                                                       +---------------+      |
```

```
T4:262.DN - -] [- - File #2 MAIN_PRGRM -  609
Rung #440                                              - 348 -
                                                                                  DWELL 2
          ENABLE      ENABLE      ENABLE      ENABLE      DWELL 1                                  CHAMBER
          CRYO        CRYO        CRYO        CRYO        CHAMBER                                  ROUGH
PUMP AREA COMPRESSOR  COMPRESSOR  COMPRESSOR  COMPRESSOR  VENT VALVE DOOR 3  DOOR 5  DOOR 4  VALVE RV2        PUMP2
2 ENABLE  2           3           4           5           CLOSED     CLOSED  CLOSED  OPEN    CLOSED           STAGE 1
PUMP2E    CY2         CY3         CY4         CY5         CVS3       DRCL3S  DRCL5S  DROP4S  RVS3             P2ST1
  N7:37     O:010       O:030       O:030       O:044       I:002     I:006   I:026   I:006   I:022             B3
|--] [------] [--------] [--------] [--------] [---------] [-------] [-----] [-----] [------] [-----------------( )--|
   14        05          04          05          04          13        04      00      07      15               424
[441]       [27]        [28]        [29]        [30]
B3/424 - -] [- - File #2 MAIN_PRGRM -  117,118,119,120,121,122,123,124,441
       -( )- - File #2 MAIN_PRGRM -  440
Rung #441
          HEATER 2    DWELL 1     DWELL 2     HEATER 3
          CHAMBER     CHAMBER     CHAMBER     CHAMBER
 PUMP2    GATE VALVE  GATE VALVE  GATE VALVE  GATE VALVE                          PUMP AREA
 STAGE 1  OPEN        OPEN        OPEN        OPEN                                2 ENABLE
 P2ST1    HV2S3       HV3S3       HV4S3       HV5S3                               PUMP2E
   B3       I:004       I:004       I:022       I:024                               N7:37
|-+-] [------] [--------] [--------] [--------] [--+-------------------------+--------(U)--------+-|
  |  424      02          05          10          02 |                         |         14         |
  | [440]                                            |                         |                    |
  |                                                  |                         |PUMP 2              |
  |                                                  |                         |END PULSE           |
  |                                                  |                         |P2ENDPULSE          |
  |ABORT PUMPDOWN                                    |                         |+-TON-------------+ |
  |BT_PD                                             |                         +|TIMER ON DELAY   |-(EN)-+
  |   N7:17                                          |                          |TIMER:    T4:125|
  |----] [-------------------------------------------|                          |BASE (SEC):  1.0|-(DN)
  |      8                                           |                          |PRESET:        5|
  |[3]                                               |                          |ACCUM:         0|
  |                                                  |                          +-----------------+
  |PIRANI                                            |
  |GUAGE 2                                           |
  |NO FAULT                                          |
  |PGNF2                                             |
  |  I:004                                           |
  |---]/[--------------------------------------------|
  |    15                                            |
  |PREPARE FOR                                       |
  |AUTO RUN                                          |
  |>AUTO                                             |
  |   N7:37                                          |
  +----] [-------------------------------------------+
        1
 [162]
N7:37/14 - -] [- - File #2 MAIN_PRGRM -  27,28,29,30,56,73,106,229,414,415,439,440,445
         -]/[- - File #2 MAIN_PRGRM -  369,411
         -(L)- - File #2 MAIN_PRGRM -  438
         -(U)- - File #2 MAIN_PRGRM -  441
_F:N7:21[X21 - BTW - File #2 MAIN_PRGRM -  2
T4:125.TT - -] [- - File #2 MAIN_PRGRM -  91
```

Rung #442

```
         DWELL 3      DWELL 4      BUFFER 3
         CHAMBER      CHAMBER      CHAMBER      PIRINI      SYSTEM
PUMP AREA GATE VALVE  GATE VALVE   GATE VALVE   GUAGE 3     VENT      VENT AREA            PUMP AREA
3        CLOSED       CLOSED       CLOSED       NO FAULT    ENABLE    3 ENABLE             3 ENABLE
TS23     HV6S1        HV7S1        HV8S1        PGNF3       STSVNTE   VENT3E               PUMP3E
 N7:16   I:024        I:036        I:040        I:024       N7:37     N7:37                N7:37
--] [------] [---------] [-----------] [-----------] [---------]/[-------]/[------------------(L)--
  15       03           06            00            14          5         8                  15
[3]                                                           [369]     [424]
N7:37/15 - ] [ - File #2 MAIN_PRGRM -  30,31,57,73,107,420,422,443,444,445
           ]/[ - File #2 MAIN_PRGRM -  369,418
           -(L)- - File #2 MAIN_PRGRM -  442
           -(U)- - File #2 MAIN_PRGRM -  446
_F:N7:21(X21 - BTW - File #2 MAIN_PRGRM -  2
```

Rung #443

```
PUMP AREA                                                        PUMP SECTION 3
3 ENABLE                                                         TIMER
PUMP3E                                                           PMP3TMR
 N7:37                                                           +-TON-----------------+
--] [------------------------------------------------------------+TIMER ON DELAY       +-(EN)-
  15                                                             |TIMER:       T4:288  |
[442]                                                            |BASE (SEC):    1.0   +-(DN)
                                                                 |PRESET:        600   |
                                                                 |ACCUM:           0   |
                                                                 +---------------------+
T4:288.DN - ] [ - File #2 MAIN_PRGRM -  609
```

Rung #444

```
                                                                    DWELL 4
          ENABLE      ENABLE       DWELL 4                          CHAMBER
          CRYO        CRYO         CHAMBER                          ROUGH
PUMP AREA COMPRESSOR  COMPRESSOR   VENT VALVE   DOOR 6    DOOR 7    VALVE                 PUMP 3
3 ENABLE  5           6            CLOSED       CLOSED    CLOSED    CLOSED                STAGE 1
PUMP3E    CY5         CY6          CVS5         DRCL6S    DRCL7S    RVS5                  P3ST1
 N7:37    O:044       O:044        I:022        I:026     I:042     I:036                 B3
--] [------] [---------] [-----------] [-----------] [-------] [-------] [-----------------( )--
  15        04          05           11           02        00        15                  426
[442]    [30]        [31]
B3/426 - ] [ - File #2 MAIN_PRGRM -  125,126,127,128,129,130,446
         -( )- - File #2 MAIN_PRGRM -  444
```

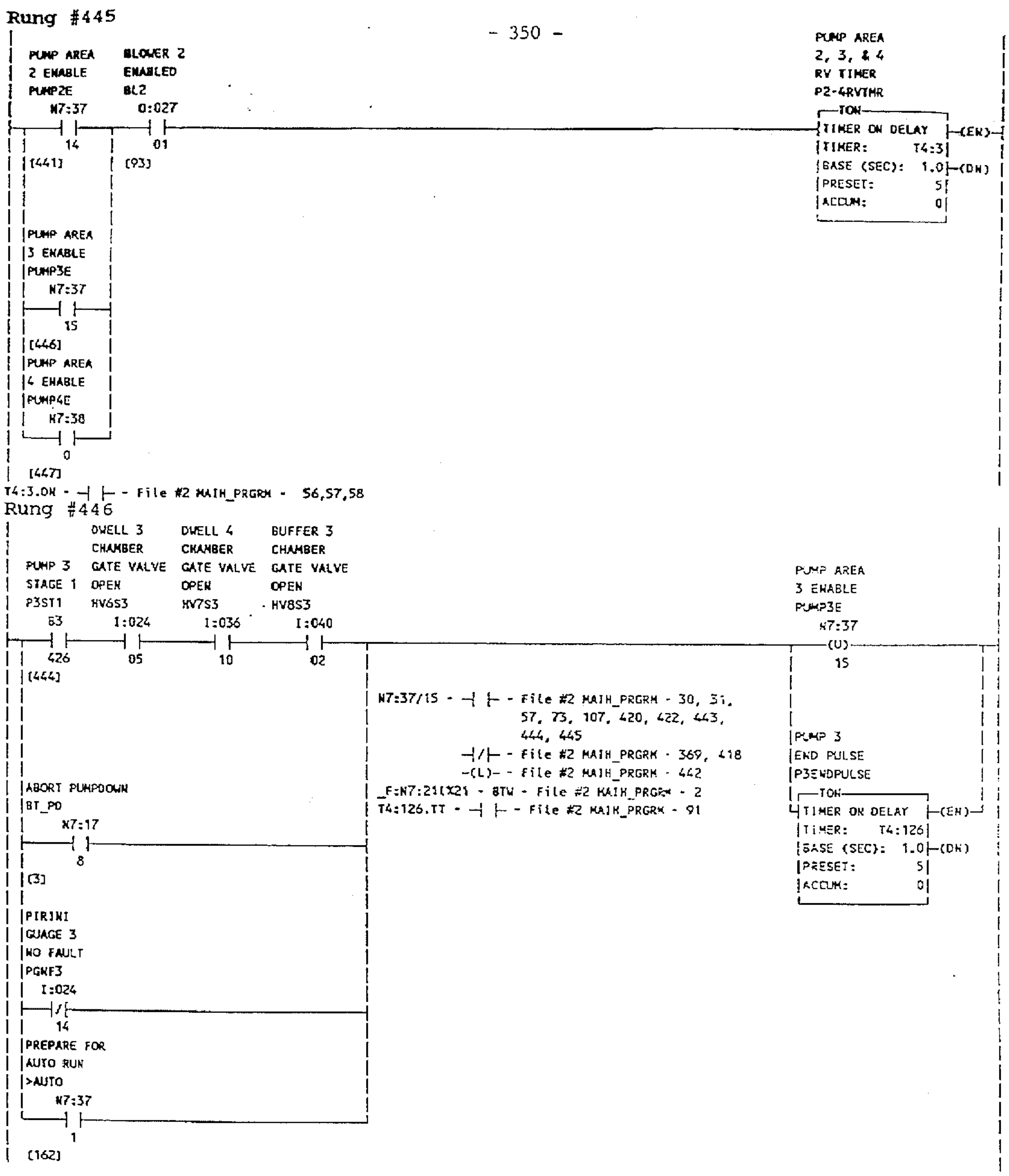
Rung #445
PUMP AREA 2 ENABLE PUMP2E N7:37 14 [441]
BLOWER 2 ENABLED BL2 O:027 01 [93]
PUMP AREA 3 ENABLE PUMP3E N7:37 15 [446]
PUMP AREA 4 ENABLE PUMP4E N7:38 0 [447]
PUMP AREA 2, 3, & 4 RV TIMER P2-4RVTMR
TON TIMER ON DELAY TIMER: T4:3 BASE (SEC): 1.0 PRESET: 5 ACCUM: 0 (EN) (DN)
T4:3.DN - ┤ ├ - File #2 MAIN_PRGRM - 56,57,58
Rung #446
PUMP 3 STAGE 1 P3ST1 B3 426 [444]
DWELL 3 CHAMBER GATE VALVE OPEN HV6S3 I:024 05
DWELL 4 CHAMBER GATE VALVE OPEN HV7S3 I:036 10
BUFFER 3 CHAMBER GATE VALVE OPEN HV8S3 I:040 02
ABORT PUMPDOWN BT_PD N7:17 8 [3]
PIRINI GUAGE 3 NO FAULT PGNF3 I:024 14
PREPARE FOR AUTO RUN >AUTO N7:37 1 [162]
N7:37/15 - ┤ ├ - File #2 MAIN_PRGRM - 30, 31, 57, 73, 107, 420, 422, 443, 444, 445
┤/├ - File #2 MAIN_PRGRM - 369, 418
-(L)- - File #2 MAIN_PRGRM - 442
_F:N7:21[X2] - BTW - File #2 MAIN_PRGRM - 2
T4:126.TT - ┤ ├ - File #2 MAIN_PRGRM - 91
PUMP AREA 3 ENABLE PUMP3E N7:37 (U) 15
PUMP 3 END PULSE P3ENDPULSE
TON TIMER ON DELAY TIMER: T4:126 BASE (SEC): 1.0 PRESET: 5 ACCUM: 0 (EN) (DN)

```
Rung #447                                                   - 351 -
|
|                   DWELL 5   DWELL 6   BUFFER 4
|          PIRINI   CHAMBER   CHAMBER   CHAMBER   SYSTEM
|PUMP AREA GUAGE 4  GATE VALVE GATE VALVE GATE VALVE VENT  VENT AREA                    PUMP AREA |
|4         NO FAULT CLOSED    CLOSED    CLOSED    ENABLE   4 ENABLE                     4 ENABLE  |
|TS24      PGNF4    HV9S1     HV10S1    HV11S1    SYSVNTE  VENT4E                       PUMP4E    |
|  N7:17    I:024    I:040     I:052     I:054     N7:37    N7:37                         N7:38   |
|---] [-----] [-----] [-----] [-----] [-----]/[------]/[---------------------------------(L)----|
|    0       15       03        06        00        5        9                              0    |
|[3]                                              [369]    [429]                                 |
N7:38/0 - -] [- - File #2 MAIN_PRGRM -  32,33,58,73,108,427,445,448,449
          -]/[- - File #2 MAIN_PRGRM -  369,425
          -(L)- - File #2 MAIN_PRGRM -  447
          -(U)- - File #2 MAIN_PRGRM -  450
_F:N7:21(X21 - BTW - File #2 MAIN_PRGRM -  2
Rung #448
|PUMP AREA                                                          PUMP SECTION 4          |
|4 ENABLE                                                           TIMER                   |
|PUMP4E                                                             PMP4TMR                 |
|  N7:38                                                            +-TON-------------+     |
|---] [-------------------------------------------------------------|TIMER ON DELAY   |-(EN)-|
|    0                                                              |TIMER:    T4:295 |     |
|[447]                                                              |BASE (SEC):   1.0|-(DN) |
|                                                                   |PRESET:      600 |     |
|                                                                   |ACCUM:         0 |     |
|                                                                   +-----------------+     |
T4:295.DN - -] [- - File #2 MAIN_PRGRM -  609
Rung #449
|                                                         DWELL 5                            |
|          ENABLE     ENABLE     DWELL 5                  CHAMBER                            |
|          CRYO       CRYO       CHAMBER                  ROUGH                              |
|PUMP AREA COMPRESSOR COMPRESSOR VENT VALVE DOOR 8  DOOR 9 VALVE                  PUMP 4     |
|4 ENABLE  7          8          CLOSED     CLOSED  CLOSED CLOSED                 STAGE 1    |
|PUMP4E    CY7        CY8        CVS7       DRCL8S  DRCL9S RVS7                   P4ST1      |
|  N7:38    O:060      O:060      I:036     I:042   I:056   I:052                   B3       |
|---] [------] [------] [------] [-------] [----] [-----] [------------------------( )------|
|    0        04         05         11        02      00      14                    428      |
|[450]     [32]       [33]                                                                   |
B3/428 - -] [- - File #2 MAIN_PRGRM -  131,132,133,134,135,136,450
       -( )- - File #2 MAIN_PRGRM -  449
```

Rung #450

- 352 -

```
        DWELL 5     DWELL 6     BUFFER 4
        CHAMBER     CHAMBER     CHAMBER
PUMP 4  GATE VALVE  GATE VALVE  GATE VALVE                                  PUMP AREA
STAGE 1 OPEN        OPEN        OPEN                                        4 ENABLE
P4ST1   HV9S3       HV10S3      HV11S3                                      PUMP4E
 B3      I:040       I:052       I:054                                       N7:38
--| |-----| |--------| |--------| |---------------------------------------------(U)---
 428      05          10          02                                          0
[449]
                                  N7:38/0 - -| |- - File #2 MAIN_PRGRM - 32, 33, 58,
                                                73, 108, 427, 445, 448, 449
                                           -|/|- - File #2 MAIN_PRGRM - 369, 425
                                           -(L)- - File #2 MAIN_PRGRM - 447
                                  _F:N7:21(X21 - BTW - File #2 MAIN_PRGRM - 2
                                  T4:127.TT - -| |- - File #2 MAIN_PRGRM - 91
                                                                            PUMP 4
                                                                            END PULSE
                                                                            P4ENDPULSE
ABORT PUMPDOWN                                                              +-TON---------------+
BT_PD                                                                       |TIMER ON DELAY     |-(EN)-
   N7:17                                                                    |TIMER:      T4:127 |
---| |--------------------------                                            |BASE (SEC):    1.0 |-(DN)
    8                                                                       |PRESET:          5 |
[3]                                                                         |ACCUM:           0 |
                                                                            +-------------------+
PIRINI
GUAGE 4
NO FAULT
PGNF4
  I:024
---|/|--------------------------
   15
PREPARE FOR
AUTO RUN
>AUTO
   N7:37
---| |--------------------------
    1
[162]
```

Rung #451

```
           EXITLOCK
           CHAMBER     SYSTEM
PUMP AREA  GATE VALVE  VENT      VENT AREA
5          CLOSED      ENABLE    5 ENABLE                                   PUMP AREA
TS25       HV12S1      SYSVNTE   VENT5E                                     5 ENABLE
  N7:17     I:054       N7:37     N7:37                                     PUMP5E
---| |-------| |---------|/|-------|/|--------------------------------------N7:38
    1         03          5         10                                      --(L)--
[3]                     [369]     [433]                                          1
N7:38/1 - -| |- - File #2 MAIN_PRGRM -  32,78,109,327,335,340,353,452,453,456
          -|/|- - File #2 MAIN_PRGRM -  369,414,430
          -(L)- - File #2 MAIN_PRGRM -  451
          -(U)- - File #2 MAIN_PRGRM -  454
_F:N7:21(X21 - BTW - File #2 MAIN_PRGRM -  2
```

Rung #452

```
PUMP AREA                                                                 PUMP SECTION 5
5 ENABLE                                                                  TIMER
PUMP5E                                                                    PMP5TRM
  N7:38                                                                   +-TON---------------+
---| |--------------------------------------------------------------------|TIMER ON DELAY     |-(EN)-
    1                                                                     |TIMER:      T4:296 |
[451]                                                                     |BASE (SEC):    1.0 |-(DN)
                                                                          |PRESET:        600 |
                                                                          |ACCUM:           0 |
                                                                          +-------------------+
```

```
T4:296.DN - -| |- - File #2 MAIN_PRGRM - 609
Rung #453
|            ENABLE      OPEN
|            CRYO        EXLOCK
|PUMP AREA   COMPRESSOR  CHAMBER     DOOR 10   DOOR 11   DOOR 12                 PUMP 5
|5 ENABLE    7           VENT VALVE  CLOSED    OPEN      CLOSED                  STAGE 1
|PUMP5E      CY7         CVS         DRCL10S   DROP11S   DRCL12S                 P5ST1
|  N7:38     O:060       O:057       I:056     I:056     I:056                   B3
|---| |--------| |--------|/|--------| |--------| |--------| |--------------------( )---
|    1          04          16          02        05        06                   430
|[454]      [32]        [367]
B3/430 - -| |- - File #2 MAIN_PRGRM - 137,138,454
       -( )- - File #2 MAIN_PRGRM - 453
Rung #454
|                                                                    PUMP AREA
| ABORT PUMPDOWN                                                     5 ENABLE
| BT_PD                                                              PUMP5E
|      N7:17                                                           N7:38
|-+-----| |-----+----------------------------------------------------+---(U)---+
| |       8     |                                                    |    1    |
| | [3]         |                                                    |         |
| |             | N7:38/1 - -| |- - File #2 MAIN_PRGRM - 32, 78, 109, 327, 335, 340,
| |             |           353, 452, 453, 456                       |         |
| |    EXIT     |        -|/|- - File #2 MAIN_PRGRM - 369, 414, 430   |PUMP 5   |
| |    BUFFER   |        -(L)- - File #2 MAIN_PRGRM - 451            |END PULSE|
| |PUMP 5  GATE VALVE | _F:N7:21[X21 - BTW - File #2 MAIN_PRGRM - 2  |P5ENDPULSE
| |STAGE 1 OPEN | T4:128.TT - -| |- - File #2 MAIN_PRGRM - 98, 326    |+-TON--------------+
| |P5ST1   HV12S3                                                    +|TIMER ON DELAY   |-(EN)-+
| |  B3     I:054                                                     |TIMER:    T4:128|
| |--| |-----| |--+                                                   |BASE (SEC):  1.0|-(DN)
| |  430      05  |                                                   |PRESET:        5|
| |[453]          |                                                   |ACCUM:         0|
| |               |                                                   +----------------+
| |PREPARE FOR    |
| |AUTO RUN       |
| |>AUTO          |
| |   N7:37       |
| +----| |--------+
|        1
| [162]
Rung #455
|PUMP AREA  BLOWER 1                                                  PUMP AREA
|1 ENABLE   ENABLED                                                   1 RV TIMER
|PUMP1E     BL1                                                       P1RVTMR
|  N7:37    O:007                                                     +-TON--------------+
|---| |------| |------------------------------------------------------|TIMER ON DELAY   |-(EN)-
|    13        01                                                     |TIMER:      T4:2|
|[437]      [86]                                                      |BASE (SEC):  1.0|-(DN)
|                                                                     |PRESET:        5|
|                                                                     |ACCUM:         0|
|                                                                     +----------------+
T4:2.DN - -| |- - File #2 MAIN_PRGRM - 167
Rung #456
|PUMP AREA  BLOWER 3                                                  PUMP AREA
|5 ENABLE   ENABLED                                                   5 RV TIMER
|PUMP5E     BL3                                                       T5RVTMR
|  N7:38    O:057                                                     +-TON--------------+
|---| |------| |------------------------------------------------------|TIMER ON DELAY   |-(EN)-
|    1         01                                                     |TIMER:      T4:4|
|[454]      [100]                                                     |BASE (SEC):  1.0|-(DN)
|                                                                     |PRESET:        5|
|                                                                     |ACCUM:         0|
|                                                                     +----------------+
```

```
T4:4.DN - -| |- - File #2 MAIN_PRGRM - 340
Rung #457
|MANUAL                                                              MANUAL CRYO
|CONTROL                                                             GATE 1 OPEN
|CRYO GATE                                                           MCG1OP
|1 OPEN                                                                 N7:25
|M-HV1-1                                                           +----(L)----+
|  N7:4                                                            |     5     |
|---| |------------------------------------------------------------+           |
|   5                                                              | MANUAL CRYO
|[3]                                                               | GATE 1 CLOSE
| N7:25/5 - -| |- - File #2 MAIN_PRGRM - 115                       | MCG1CL
|          -(U)- - File #2 MAIN_PRGRM - 458                        |   N7:26   |
| _F:N7:21(%21 - BTW - File #2 MAIN_PRGRM - 2                      +----(U)----+
| N7:26/12 - -(L)- - File #2 MAIN_PRGRM - 458                          12
| _F:N7:21(%21 - BTW - File #2 MAIN_PRGRM - 2
|
Rung #458
| MANUAL                                                             MANUAL CRYO
| CONTROL                                                            GATE 1 OPEN
| CRYO GATE                                                          MCG1OP
| 1 CLOSE                                                               N7:25
| M-HV1-0                                                          +----(U)----+
|   N7:5                                                           |     5     |
|-+---| |----+-----------------------------------------------------+           |
| |   12     |                                                     | MANUAL CRYO
| |[3]       | N7:25/5 - -| |- - File #2 MAIN_PRGRM - 115          | GATE 1 CLOSE
| |          |          -(L)- - File #2 MAIN_PRGRM - 457           | MCG1CL
| |          | _F:N7:21(%21 - BTW - File #2 MAIN_PRGRM - 2         |   N7:26   |
| |          | N7:26/12 - -(U)- - File #2 MAIN_PRGRM - 457         +----(L)----+
| |PREPARE FOR | _F:N7:21(%21 - BTW - File #2 MAIN_PRGRM - 2           12
| |AUTO RUN  |
| |>AUTO     |
| |  N7:37   |
| |---| |----+
| |   1      |
| |[162]     |
| |COMPRESSOR|
| |1 REGEN-  |
| |ERATION   |
| |PROGRAM   |
| |CYRGN1    |
| |   B3     |
| +---| |----+
|    321
|  [3:0]
```

Rung #459

```
|MANUAL
|CONTROL
|CRYO GATE                                                    MANUAL CRYO
|2 OPEN                                                       GATE 2 OPEN
|N-HV2-1                                                      MCG2OP
|  N7:4                                                          N7:25
|---] [----------------------------------------------------------+---(L)---+
|   6                                                            |    6    |
|[3]                                                             |         |
| N7:25/6 - ] [ - - File #2 MAIN_PRGRM - 117, 118, 462           |         |
|         -(U)- - File #2 MAIN_PRGRM - 460                       |MANUAL CRYO
| _F:N7:21[X21 - BTW - File #2 MAIN_PRGRM - 2                    |GATE 2 CLOSE
| N7:26/13 - -(L)- - File #2 MAIN_PRGRM - 460                    |MCG2CL   |
| _F:N7:21[X21 - BTW - File #2 MAIN_PRGRM - 2                    |  N7:26  |
|                                                                +---(U)---+
|                                                                    13
```

Rung #460

```
| MANUAL
| CONTROL
| CRYO GATE                                                   MANUAL CRYO
| 2 CLOSE                                                     GATE 2 OPEN
| M-HV2-0                                                     MCG2OP
|    N7:5                                                        N7:25
|-+---] [---+----------------------------------------------------+---(U)---+
| |   13    |                                                    |    6    |
| |[3]      |                                                    |         |
| |         | N7:25/6 - ] [ - - File #2 MAIN_PRGRM - 117, 118, 462         |
| |         |         -(L)- - File #2 MAIN_PRGRM - 459           |         |
| |MANUAL   | _F:N7:21[X21 - BTW - File #2 MAIN_PRGRM - 2          |MANUAL CRYO
| |CONTROL  | N7:26/13 - -(U)- - File #2 MAIN_PRGRM - 459        |GATE 2 CLOSE
| |CRYO GATE| _F:N7:21[X21 - BTW - File #2 MAIN_PRGRM - 2          |MCG2CL   |
| |2 THROTTLE                                                    |  N7:26  |
| |M-HV2-2  |                                                    +---(L)---+
| |   N7:5  |                                                         13
| +---] [---+
| |    1    |
| |[3]      |
| |PREPARE FOR
| |AUTO RUN |
| |>AUTO    |
| |   N7:37 |
| +---] [---+
| |    1    |
| |[162]    |
| |COMPRESSOR
| |2 REGEN- |
| |ERATION  |
| |PROGRAM  |
| |CYRGN2   |
| |    B3   |
| +---] [---+
|      322
| [3:34]
```

```
Rung #461
|MANUAL
|CONTROL
|CRYO GATE                                                          MANUAL CRYO
|2 THROTTLE                                                         GATE 2 THROTTLE
|M-HV2-2                                                            MCG2TL
|   N7:5                                                               N7:26
|---] [-----------------------------------------------------------------(L)----|
|    1                                                                    1
|[3]
N7:26/1 - ] [ - File #2 MAIN_PRGRM -  118,118
        -(L)- - File #2 MAIN_PRGRM -  461
        -(U)- - File #2 MAIN_PRGRM -  462
_F:N7:21[X21 - BTW - File #2 MAIN_PRGRM -  2
Rung #462
| MANUAL
| CONTROL
| CRYO GATE                                                         MANUAL CRYO
| 2 CLOSE                                                           GATE 2 THROTTLE
| M-HV2-0                                                           MCG2TL
|   N7:5                                                               N7:26
|+---] [----+-----------------------------------------------------------(U)----|
||    13    |                                                             1
||[3]       |
||          | N7:26/1 - ] [ - File #2 MAIN_PRGRM - 118
||          |         -(L)- - File #2 MAIN_PRGRM - 461
||          | _F:N7:21[X21 - BTW - File #2 MAIN_PRGRM - 2
||MANUAL CRYO
||GATE 2 OPEN
||MCG2OP    |
||   N7:25  |
|+---] [----+
||    6     |
||[460]     |
||PREPARE FOR
||AUTO RUN  |
||>AUTO     |
||   N7:37  |
|+---] [----+
||    1     |
||[162]     |
||COMPRESSOR|
||2 REGEN-  |
||ERATION   |
||PROGRAM   |
||CYRGN2    |
||   B3     |
|+---] [----+
|    322
|  [3:34]
```

```
Rung #463
|MANUAL                                                               MANUAL CRYO
|CONTROL                                                              GATE 3 OPEN
|CRYO GATE                                                            MCG3OP
|3 OPEN                                                                  N7:25
|M-HV3-1                                                              ---(L)---
|   N7:4                                                                  7
|---] [--------------------------------------------------------------
|    7                                                                MANUAL CRYO
|[3]                                                                  GATE 3 CLOSE
| N7:25/7 - -] [- - File #2 MAIN_PRGRM - 119, 120, 466                MCG3CL
|           -(U)- - File #2 MAIN_PRGRM - 464                             N7:26
| _F:N7:21[%21 - BTW - File #2 MAIN_PRGRM - 2                         ---(U)---
| N7:26/14 - -(L)- - File #2 MAIN_PRGRM - 464                             14
| _F:N7:21[%21 - BTW - File #2 MAIN_PRGRM - 2

Rung #464
| MANUAL                                                              MANUAL CRYO
| CONTROL                                                             GATE 3 OPEN
| CRYO GATE                                                           MCG3OP
| 3 CLOSE                                                                N7:25
| M-HV3-0                                                             ---(U)---
|   N7:5                                                                  7
|---] [------------------------------------------------------------
|    14                                                               MANUAL CRYO
| [3]                                                                 GATE 3 CLOSE
|             N7:25/7 - -] [- - File #2 MAIN_PRGRM - 119, 120, 466    MCG3CL
|                      -(L)- - File #2 MAIN_PRGRM - 463                  N7:26
| |MANUAL     _F:N7:21[%21 - BTW - File #2 MAIN_PRGRM - 2             ---(L)---
| |CONTROL    N7:26/14 - -(U)- - File #2 MAIN_PRGRM - 463                 14
| |CRYO GATE  _F:N7:21[%21 - BTW - File #2 MAIN_PRGRM - 2
| |3 THROTTLE
| |M-HV3-2
| |  N7:5
| |---] [---
| |    2
| |[3]
| |PREPARE FOR
| |AUTO RUN
| |>AUTO
| |  N7:37
| |---] [---
| |    1
| |[162]
| |COMPRESSOR
| |3 REGEN-
| |ERATION
| |PROGRAM
| |CYRGN3
| |   B3
| |---] [---
|     323
| [3:38]
```

Rung #465

```
|MANUAL                                                                    |
|CONTROL                                                        MANUAL CRYO|
|CRYO GATE                                                      GATE 3     |
|3 THROTTLE                                                     THROTTLE   |
|M-HV3-2                                                        MCG3TL     |
|   N7:5                                                          N7:26    |
|---| |-------------------------------------------------------------(L)----|
|    2                                                              2      |
|[3]                                                                       |
N7:26/2 - -| |- - File #2 MAIN_PRGRM -  120,120
         -(L)- - File #2 MAIN_PRGRM -  465
         -(U)- - File #2 MAIN_PRGRM -  466
_F:N7:21[X21 - BTW - File #2 MAIN_PRGRM -  2
```

Rung #466

```
| MANUAL                                                                   |
| CONTROL                                                       MANUAL CRYO|
| CRYO GATE                                                     GATE 3     |
| 3 CLOSE                                                       THROTTLE   |
| M-HV3-0                                                       MCG3TL     |
|   N7:5                                                          N7:26    |
|-+---| |------+----------------------------------------------------(U)----|
| |    14      |                                                    2      |
| |[3]         |                                                           |
| |            | N7:26/2 - -| |- - File #2 MAIN_PRGRM - 120                 |
| |            |          -(L)- - File #2 MAIN_PRGRM - 465                 |
| |            | _F:N7:21[X21 - BTW - File #2 MAIN_PRGRM - 2               |
| |MANUAL CRYO |                                                           |
| |GATE 3 OPEN |                                                           |
| |MCG3OP      |                                                           |
| |   N7:25    |                                                           |
| |---| |------|                                                           |
| |    7       |                                                           |
| |[464]       |                                                           |
| |PREPARE FOR |                                                           |
| |AUTO RUN    |                                                           |
| |>AUTO       |                                                           |
| |   N7:37    |                                                           |
| |---| |------|                                                           |
| |    1       |                                                           |
| |[162]       |                                                           |
| |COMPRESSOR  |                                                           |
| |3 REGEN-    |                                                           |
| |ERATION     |                                                           |
| |PROGRAM     |                                                           |
| |CYRGN3      |                                                           |
| |   B3       |                                                           |
| +---| |------+                                                           |
|    323                                                                   |
|  [3:38]                                                                  |
```

```
Rung #467
|MANUAL
|CONTROL
|CRYO GATE                                                                  MANUAL CRYO
|4 OPEN                                                                     GATE 4 OPEN
|M-HV4-1                                                                    MCG4OP
|   N7:4                                                                      N7:25
|---] [----------------------------------------------------------------------+--(L)---+-|
|    8                                                                        |   8     |
|[3]                                                                          |         |
| N7:25/8 - ] [ - File #2 MAIN_PRGRM - 121, 122, 470                          |         |
|          -(U)- - File #2 MAIN_PRGRM - 468                                   |MANUAL CRYO
| _F:N7:21[X21 - BTW - File #2 MAIN_PRGRM - 2                                 |GATE 4 CLOSE
| N7:26/15 - -(L)- - File #2 MAIN_PRGRM - 468                                 |MCG4CL   |
| _F:N7:21[X21 - BTW - File #2 MAIN_PRGRM - 2                                 |   N7:26 |
|                                                                             +---(U)---+
|                                                                                  15
Rung #468
| MANUAL
| CONTROL
| CRYO GATE                                                                 MANUAL CRYO
| 4 CLOSE                                                                   GATE 4 OPEN
| M-HV4-0                                                                   MCG4OP
|    N7:5                                                                     N7:25
|-+---] [---+-----------------------------------------------------------------+--(U)---+-|
| |    15   |                                                                 |   8     |
| |[3]      |                                                                 |         |
| |         | N7:25/8 - ] [ - File #2 MAIN_PRGRM - 121, 122, 470              |         |
| |         |          -(L)- - File #2 MAIN_PRGRM - 467                       |         |
| |MANUAL   | _F:N7:21[X21 - BTW - File #2 MAIN_PRGRM - 2                     |MANUAL CRYO
| |CONTROL  | N7:26/15 - -(U)- - File #2 MAIN_PRGRM - 467                     |GATE 4 CLOSE
| |CRYO GATE| _F:N7:21[X21 - BTW - File #2 MAIN_PRGRM - 2                     |MCG4CL   |
| |4 THROTTLE                                                                 |   N7:26 |
| |M-HV4-2  |                                                                 +---(L)---+
| |   N7:5  |                                                                      15
| |---] [---|
| |    3    |
| |[3]      |
| |PREPARE FOR
| |AUTO RUN |
| |>AUTO    |
| |   N7:37 |
| |---] [---|
| |    1    |
| |[162]    |
| |COMPRESSOR
| |5 REGEN- |
| |ERATION  |
| |PROGRAM  |
| |CYRGN5   |
| |    B3   |
| +---] [---+
|     325
| [3:46]
```

Rung #469

```
|MANUAL                                                          MANUAL CRYO |
|CONTROL                                                         GATE 4      |
|CRYO GATE                                                       THROTTLE    |
|4 THROTTLE                                                      MCG4TL      |
|M-MV4-2                                                           N7:26     |
|    N7:5                                                                    |
|---] [------------------------------------------------------------(L)-------|
|    3                                                              3        |
|[3]                                                                         |
N7:26/3 - ] [ - File #2 MAIN_PRGRM -  122,122
        -(L)- - File #2 MAIN_PRGRM -  469
        -(U)- - File #2 MAIN_PRGRM -  470
_F:N7:21[X21 - BTW - File #2 MAIN_PRGRM -  2
```

Rung #470

```
| MANUAL                                                        |
| CONTROL                                          MANUAL CRYO  |
| CRYO GATE                                        GATE 4       |
| 4 CLOSE                                          THROTTLE     |
| M-MV4-0                                          MCG4TL       |
|    N7:5                                              N7:26    |
|-+---] [---+---------------------------------------------(U)---|
| |    15   |                                              3    |
| |[3]      |                                                   |
| |         | N7:26/3 - ] [ - File #2 MAIN_PRGRM - 122          |
| |         |          -(L)- - File #2 MAIN_PRGRM - 469         |
| |         | _F:N7:21[X21 - BTW - File #2 MAIN_PRGRM - 2       |
| |MANUAL CRYO |                                                |
| |GATE 4 OPEN |                                                |
| |MCG4OP      |                                                |
| |    N7:25   |                                                |
| |---] [------|                                                |
| |     8      |                                                |
| |[468]       |                                                |
| |PREPARE FOR |                                                |
| |AUTO RUN    |                                                |
| |>AUTO       |                                                |
| |    N7:37   |                                                |
| |---] [------|                                                |
| |     1      |                                                |
| |[162]       |                                                |
| |COMPRESSOR  |                                                |
| |4 REGEN-    |                                                |
| |ERATION     |                                                |
| |PROGRAM     |                                                |
| |CYRGN4      |                                                |
| |    B3      |                                                |
| +---] [------+                                                |
|     324                                                       |
|  [3:42]                                                       |
```

Rung #471

```
|MANUAL                                                            MANUAL CRYO
|CONTROL                                                           GATE 5 OPEN
|CRYO GATE                                                         MCGSOP
|5 OPEN                                                              N7:25
|M-HV5-1                                                        +----(L)----+
|  N7:4                                                         |     9     |
|---] [--------------------------------------------------------+           |
|    9                                                          |MANUAL CRYO|
|[3]                                                            |GATE 5 CLOSE
| N7:25/9 - ] [ - File #2 MAIN_PRGRM - 123, 124, 474            |MCGSCL     |
|          -(U)- - File #2 MAIN_PRGRM - 472                     |   N7:27   |
| _F:N7:21[X21 - BTW - File #2 MAIN_PRGRM - 2                   +----(U)----+
| N7:27/0 - -(L)- - File #2 MAIN_PRGRM - 472                          0
| _F:N7:21[X21 - BTW - File #2 MAIN_PRGRM - 2
```

Rung #472

```
| MANUAL                                                           MANUAL CRYO
| CONTROL                                                          GATE 5 OPEN
| CRYO GATE                                                        MCGSOP
| 5 CLOSE                                                            N7:25
| M-HV5-0                                                       +----(U)----+
|    N7:6                                                       |     9     |
|-+---] [----+-------------------------------------------------+           |
| |     0    |                                                  |MANUAL CRYO|
| |[3]       | N7:25/9 - ] [ - File #2 MAIN_PRGRM - 123, 124, 474 |GATE 5 CLOSE
| |          |          -(L)- - File #2 MAIN_PRGRM - 471        |MCGSCL     |
| |MANUAL    | _F:N7:21[X21 - BTW - File #2 MAIN_PRGRM - 2      |   N7:27   |
| |CONTROL   | N7:27/0 - -(U)- - File #2 MAIN_PRGRM - 471       +----(L)----+
| |CRYO GATE | _F:N7:21[X21 - BTW - File #2 MAIN_PRGRM - 2           0
| |5 THROTTLE|
| |M-HV5-2   |
| |   N7:5   |
| +---] [----+
| |     4    |
| |[3]       |
| |PREPARE FOR
| |AUTO RUN  |
| |>AUTO     |
| |   N7:37  |
| +---] [----+
| |     1    |
| |[162]     |
| |COMPRESSOR|
| |4 REGEN-  |
| |ERATION   |
| |PROGRAM   |
| |CYRGN4    |
| |    B3    |
| +---] [----+
|      324
|  [3:42]
```

```
Rung #473
|MANUAL
|CONTROL                                                        MANUAL CRYO |
|CRYO GATE                                                      GATE 5      |
|5 THROTTLE                                                     THROTTLE    |
|M-HV5-2                                                        MCG5TL      |
|   N7:5                                                          N7:26     |
|---] [-------------------------------------------------------------(L)-----|
|   4                                                               4       |
|[3]                                                                        |
N7:26/4 - ] [- - File #2 MAIN_PRGRM -  124,124
        -(L)- - File #2 MAIN_PRGRM -  473
        -(U)- - File #2 MAIN_PRGRM -  474
_F:N7:21[X21 - BTW - File #2 MAIN_PRGRM -  2
Rung #474
|  MANUAL                                                                   |
|  CONTROL                                                      MANUAL CRYO |
|  CRYO GATE                                                    GATE 5      |
|  5 CLOSE                                                      THROTTLE    |
|  M-HV5-O                                                      MCG5TL      |
|    N7:6                                                         N7:26     |
|-+---] [---+-------------------------------------------------------(U)-----|
| |   0     |                                                       4       |
| |[3]      |                                                               |
| |         | N7:26/4 - ] [- - File #2 MAIN_PRGRM - 124                      |
| |         |         -(L)- - File #2 MAIN_PRGRM - 473                      |
| |         | _F:N7:21[X21 - BTW - File #2 MAIN_PRGRM - 2                    |
| |MANUAL CRYO|                                                             |
| |GATE 5 OPEN|                                                             |
| |MCG5OP   |                                                               |
| |   N7:25 |                                                               |
| |---] [---|                                                               |
| |   9     |                                                               |
| |[472]    |                                                               |
| |PREPARE FOR|                                                             |
| |AUTO RUN |                                                               |
| |>AUTO    |                                                               |
| |   N7:37 |                                                               |
| |---] [---|                                                               |
| |   1     |                                                               |
| |[162]    |                                                               |
| |COMPRESSOR|                                                              |
| |4 REGEN- |                                                               |
| |ERATION  |                                                               |
| |PROGRAM  |                                                               |
| |CYRGN4   |                                                               |
| |   B3    |                                                               |
| +---] [---+                                                               |
|    324                                                                    |
|  [3:42]                                                                   |
```

Rung #475

```
MANUAL CONTROL CRYO GATE 6 OPEN
M-HV6-1
N7:4 ] [ 10 [3]                                   MANUAL CRYO GATE 6 OPEN  MCG6OP  N7:25 (L) 10
                                                  MANUAL CRYO GATE 6 CLOSE MCG6CL  N7:27 (U) 1
N7:25/10 - ] [ - File #2 MAIN_PRGRM - 125, 126, 478
           -(U)- - File #2 MAIN_PRGRM - 476
_F:N7:21lX21 - BTW - File #2 MAIN_PRGRM - 2
N7:27/1 - -(L)- - File #2 MAIN_PRGRM - 476
_F:N7:21lX21 - BTW - File #2 MAIN_PRGRM - 2
```

Rung #476

```
MANUAL CONTROL CRYO GATE 6 CLOSE
M-HV6-D
N7:6 ] [ 1 [3]                                    MANUAL CRYO GATE 6 OPEN  MCG6OP  N7:25 (U) 10
                                                  MANUAL CRYO GATE 6 CLOSE MCG6CL  N7:27 (L) 1
  N7:25/10 - ] [ - File #2 MAIN_PRGRM - 125, 126, 478
             -(L)- - File #2 MAIN_PRGRM - 475
  _F:N7:21lX21 - BTW - File #2 MAIN_PRGRM - 2
  N7:27/1 - -(U)- - File #2 MAIN_PRGRM - 475
  _F:N7:21lX21 - BTW - File #2 MAIN_PRGRM - 2
MANUAL CONTROL CRYO GATE 6 THROTTLE
M-HV6-2
N7:5 ] [ 5 [3]
PREPARE FOR AUTO RUN
>AUTO
N7:37 ] [ 1 [162]
COMPRESSOR 5 REGEN-ERATION PROGRAM
CYRGN5
B3 ] [ 325 [3:46]
```

Rung #477

```
|MANUAL                                                                    |
|CONTROL                                                     MANUAL CRYO   |
|CRYO GATE                                                   GATE 6        |
|6 THROTTLE                                                  THROTTLE      |
|M-HV6-2                                                     MCG6TL        |
|   N7:5                                                         N7:26     |
|---] [-------------------------------------------------------------(L)----|
|   5                                                               5      |
|[3]                                                                       |
N7:26/5 - ] [ - - File #2 MAIN_PRGRM -  126,126
         -(L)- - File #2 MAIN_PRGRM -  477
         -(U)- - File #2 MAIN_PRGRM -  478
_F:N7:21[X21 - BTW - File #2 MAIN_PRGRM -  2
```

Rung #478

```
| MANUAL                                                                   |
| CONTROL                                                    MANUAL CRYO   |
| CRYO GATE                                                  GATE 6        |
| 6 CLOSE                                                    THROTTLE      |
| M-HV6-0                                                    MCG6TL        |
|   N7:6                                                         N7:26     |
|+---] [----+-------------------------------------------------------(U)----|
||     1     |                                                       5     |
|| [3]       |                                                             |
||           | N7:26/5 - ] [ - - File #2 MAIN_PRGRM - 126                  |
||           |            -(L)- - File #2 MAIN_PRGRM - 477                 |
||           | _F:N7:21[X21 - BTW - File #2 MAIN_PRGRM - 2                 |
||MANUAL CRYO|                                                             |
||GATE 6 OPEN|                                                             |
||MCG6OP     |                                                             |
||   N7:25   |                                                             |
|+---] [-----+                                                             |
||    10     |                                                             |
||[476]      |                                                             |
||PREPARE FOR|                                                             |
||AUTO RUN   |                                                             |
||>AUTO      |                                                             |
||   N7:37   |                                                             |
|+---] [-----+                                                             |
||    1      |                                                             |
||[162]      |                                                             |
||COMPRESSOR |                                                             |
||5 REGEN-   |                                                             |
||ERATION    |                                                             |
||PROGRAM    |                                                             |
||CYRGN5     |                                                             |
||   B3      |                                                             |
|+---] [-----+                                                             |
|    325                                                                   |
| [3:46]                                                                   |
```

Rung #479

```
|MANUAL                                                                    MANUAL CRYO
|CONTROL                                                                   GATE 7 OPEN
|CRYO GATE                                                                 MCG7OP
|7 OPEN                                                                       N7:25
|M-HV7-1                                                                 +----(L)----+
|   N7:4                                                                 |     11    |
|---] [------------------------------------------------------------------+           |
|    11                                                                  |MANUAL CRYO|
|[3]                                                                     |GATE 7 CLOSE
| N7:25/11 - -] [- - File #2 MAIN_PRGRM - 127, 128, 482                  |MCG7CL     |
|           -(U)- - File #2 MAIN_PRGRM - 480                             |   N7:27   |
| _F:N7:21lX21 - BTW - File #2 MAIN_PRGRM - 2                            +----(U)----+
| N7:27/2 - -(L)- - File #2 MAIN_PRGRM - 480                                   2
| _F:N7:21lX21 - BTW - File #2 MAIN_PRGRM - 2
```

Rung #480

```
| MANUAL                                                                   MANUAL CRYO
| CONTROL                                                                  GATE 7 OPEN
| CRYO GATE                                                                MCG7OP
| 7 CLOSE                                                                     N7:25
| M-HV7-0                                                                +----(U)----+
|    N7:6                                                                |     11    |
|-+---] [---+------------------------------------------------------------+           |
| |     2   |                                                            |MANUAL CRYO|
| |[3]      | N7:25/11 - -] [- - File #2 MAIN_PRGRM - 127, 128, 482      |GATE 7 CLOSE
| |         |           -(L)- - File #2 MAIN_PRGRM - 479                 |MCG7CL     |
| |MANUAL   | _F:N7:21lX21 - BTW - File #2 MAIN_PRGRM - 2                |   N7:27   |
| |CONTROL  | N7:27/2 - -(U)- - File #2 MAIN_PRGRM - 479                 +----(L)----+
| |CRYO GATE| _F:N7:21lX21 - BTW - File #2 MAIN_PRGRM - 2                      2
| |7 THROTTLE
| |M-HV7-2  |
| |   N7:5  |
| +---] [---+
| |   6     |
| |[3]      |
| |PREPARE FOR
| |AUTO RUN |
| |>AUTO    |
| |   N7:37 |
| +---] [---+
| |   1     |
| |[162]    |
| |COMPRESSOR
| |5 REGEN- |
| |ERATION  |
| |PROGRAM  |
| |CYRGN5   |
| |   B3    |
| +---] [---+
|    325
|  [3:46]
```

Rung #481

```
|MANUAL
|CONTROL                                                    MANUAL CRYO
|CRYO GATE                                                  GATE 7
|7 THROTTLE                                                 THROTTLE
|M-HV7-2                                                    MCG7TL
|   N7:5                                                       N7:26
|---] [--------------------------------------------------------(L)---|
|   6                                                            6
|[3]
N7:26/6 - ] [ - File #2 MAIN_PRGRM -  128,128
        -(L)- - File #2 MAIN_PRGRM -  481
        -(U)- - File #2 MAIN_PRGRM -  482
_F:N7:21[X21 - BTW - File #2 MAIN_PRGRM -  2
```

Rung #482

```
| MANUAL
| CONTROL                                                   MANUAL CRYO
| CRYO GATE                                                 GATE 7
| 7 CLOSE                                                   THROTTLE
| M-HV7-0                                                   MCG7TL
|   N7:6                                                       N7:26
|-+---] [---+--------------------------------------------------(U)---|
| |   2     |                                                    6
| |[3]      |
| |         | N7:26/6 - ] [ - File #2 MAIN_PRGRM - 128
| |         |         -(L)- - File #2 MAIN_PRGRM - 481
| |         | _F:N7:21[X21 - BTW - File #2 MAIN_PRGRM - 2
| |MANUAL CRYO|
| |GATE 7 OPEN|
| |MCG7OP   |
| |   N7:25 |
| |---] [---|
| |   11    |
| |[480]    |
| |PREPARE FOR|
| |AUTO RUN |
| |>AUTO    |
| |   N7:37 |
| |---] [---|
| |   1     |
| |[162]    |
| |COMPRESSOR|
| |5 REGEN- |
| |ERATION  |
| |PROGRAM  |
| |CYRGN5   |
| |   B3    |
| +---] [---+
|    325
| [3:46]
```

Rung #483

```
|MANUAL                                                            MANUAL CRYO
|CONTROL                                                           GATE 8 OPEN
|CRYO GATE                                                         MCG8OP
|8 OPEN                                                              N7:25
|M-HV8-1                                                          ---(L)---
|  N7:4                                                               12
|---] [--------------------------------------------------------
|   12                                                             MANUAL CRYO
|[3]                                                               GATE 8 CLOSE
| N7:25/12 - -] [- - File #2 MAIN_PRGRM - 129, 130, 486            MCG8CL
|           -(U)- - File #2 MAIN_PRGRM - 484                         N7:27
| _F:N7:21[X21 - BTW - File #2 MAIN_PRGRM - 2                     ---(U)---
| N7:27/3 - -(L)- - File #2 MAIN_PRGRM - 484                          3
| _F:N7:21[X21 - BTW - File #2 MAIN_PRGRM - 2
```

Rung #484

```
| MANUAL                                                           MANUAL CRYO
| CONTROL                                                          GATE 8 OPEN
| CRYO GATE                                                        MCG8OP
| 8 CLOSE                                                            N7:25
| M-HV8-0                                                         ---(U)---
|   N7:6                                                              12
|-+---] [---+--------------------------------------------------
| |    3    |                                                      MANUAL CRYO
| |[3]      |                                                      GATE 8 CLOSE
| |         | N7:25/12 - -] [- - File #2 MAIN_PRGRM - 129, 130, 486  MCG8CL
| |         |            -(L)- - File #2 MAIN_PRGRM - 483              N7:27
| |MANUAL   | _F:N7:21[X21 - BTW - File #2 MAIN_PRGRM - 2          ---(L)---
| |CONTROL  | N7:27/3 - -(U)- - File #2 MAIN_PRGRM - 483               3
| |CRYO GATE| _F:N7:21[X21 - BTW - File #2 MAIN_PRGRM - 2
| |8 THROTTLE
| |M-HV8-2  |
| |  N7:5   |
| |---] [---|
| |    7    |
| |[3]      |
| |PREPARE FOR
| |AUTO RUN |
| |>AUTO    |
| |  N7:37  |
| |---] [---|
| |    1    |
| |[162]    |
| |COMPRESSOR
| |6 REGEN- |
| |ERATION  |
| |PROGRAM  |
| |CYRGN6   |
| |   B3    |
| +---] [---+
|     326
|  [3:52]
```

Rung #485

```
|MANUAL                                                              |
|CONTROL                                              MANUAL CRYO    |
|CRYO GATE                                            GATE 8         |
|8 THROTTLE                                           THROTTLE       |
|M-HV8-2                                              MCG8TL         |
|  N7:5                                                 N7:26        |
|---] [------------------------------------------------(L)-----------|
|    7                                                   7           |
|[3]                                                                 |
N7:26/7 - ] [ - File #2 MAIN_PRGRM -  130,130
         -(L)- - File #2 MAIN_PRGRM -  485
         -(U)- - File #2 MAIN_PRGRM -  486
_F:N7:21[X21 - BTW - File #2 MAIN_PRGRM -  2
```

Rung #486

```
|  MANUAL                                                            |
|  CONTROL                                            MANUAL CRYO    |
|  CRYO GATE                                          GATE 8         |
|  8 CLOSE                                            THROTTLE       |
|  M-HV8-0                                            MCG8TL         |
|    N7:6                                               N7:26        |
|-+---] [----+-----------------------------------------(U)-----------|
| |    3     |                                           7           |
| |[3]       |                                                       |
| |          | N7:26/7 - ] [ - File #2 MAIN_PRGRM - 130              |
| |          |          -(L)- - File #2 MAIN_PRGRM - 485             |
| |          | _F:N7:21[X21 - BTW - File #2 MAIN_PRGRM - 2           |
| |MANUAL CRYO|                                                      |
| |GATE 8 OPEN|                                                      |
| |MCG8OP    |                                                       |
| |   N7:25  |                                                       |
| |---] [----|                                                       |
| |     12   |                                                       |
| |[484]     |                                                       |
| |PREPARE FOR|                                                      |
| |AUTO RUN  |                                                       |
| |>AUTO     |                                                       |
| |   N7:37  |                                                       |
| |---] [----|                                                       |
| |     1    |                                                       |
| |[162]     |                                                       |
| |COMPRESSOR|                                                       |
| |6 REGEN-  |                                                       |
| |ERATION   |                                                       |
| |PROGRAM   |                                                       |
| |CYRGN6    |                                                       |
| |    B3    |                                                       |
| +---] [----+                                                       |
|     326                                                            |
|  [3:52]                                                            |
```

```
Rung #487
|MANUAL
|CONTROL
|CRYO GATE                                                          MANUAL CRYO
|9 OPEN                                                             GATE 9 OPEN
|M-KV9-1                                                            MCG9OP
|  N7:4                                                               N7:25
|---| |----------------------------------------------------------------+--(L)---+-
|   13                                                                 |   13    |
|[3]                                                                   |         |
| N7:25/13 - -| |- - File #2 MAIN_PRGRM - 131, 132, 490                |         |
|            -(U)- - File #2 MAIN_PRGRM - 488                          |MANUAL CRYO
| _F:N7:21[X21 - BTW - File #2 MAIN_PRGRM - 2                          |GATE 9 CLOSE
| N7:27/4 - -(L)- - File #2 MAIN_PRGRM - 488                           |MCG9CL   |
| _F:N7:21[X21 - BTW - File #2 MAIN_PRGRM - 2                          |  N7:27  |
|                                                                      +--(U)----+
Rung #488                                                                  4
| MANUAL
| CONTROL
| CRYO GATE                                                         MANUAL CRYO
| 9 CLOSE                                                           GATE 9 OPEN
| M-KV9-0                                                           MCG9OP
|    N7:6                                                             N7:25
|+---| |----+---------------------------------------------------------+--(U)---+-
||     4    |                                                         |   13    |
||[3]       |                                                         |         |
||          | N7:25/13 - -| |- - File #2 MAIN_PRGRM - 131, 132, 490   |         |
||          |            -(L)- - File #2 MAIN_PRGRM - 487             |         |
||MANUAL    | _F:N7:21[X21 - BTW - File #2 MAIN_PRGRM - 2             |MANUAL CRYO
||CONTROL   | N7:27/4 - -(U)- - File #2 MAIN_PRGRM - 487              |GATE 9 CLOSE
||CRYO GATE | _F:N7:21[X21 - BTW - File #2 MAIN_PRGRM - 2             |MCG9CL   |
||9 THROTTLE|                                                         |  N7:27  |
||M-KV9-2   |                                                         +--(L)----+
||   N7:5   |                                                             4
||---| |----|
||     8    |
||[3]       |
||PREPARE FOR
||AUTO RUN  |
||>AUTO     |
||   N7:37  |
||---| |----|
||     1    |
||[162]     |
||COMPRESSOR|
||7 REGEN-  |
||ERATION   |
||PROGRAM   |
||CYRGN7    |
||    B3    |
|+---| |----+
|    327
| [3:57]
```

```
Rung #489
|MANUAL
|CONTROL                                                              MANUAL CRYO |
|CRYO GATE                                                            GATE 9      |
|9 THROTTLE                                                           THROTTLE    |
|M-HV9-2                                                              MCG9TL      |
|   N7:5                                                                N7:26     |
|---] [-----------------------------------------------------------------(L)------|
|    8                                                                   8        |
|[3]
N7:26/8 - ] [ - File #2 MAIN_PRGRM -  132,132
        -(L)- - File #2 MAIN_PRGRM -  489
        -(U)- - File #2 MAIN_PRGRM -  490
_F:N7:21lX21 - BTW - File #2 MAIN_PRGRM -  2
Rung #490
| MANUAL                                                                          |
| CONTROL                                                             MANUAL CRYO |
| CRYO GATE                                                           GATE 9      |
| 9 CLOSE                                                             THROTTLE    |
| M-HV9-0                                                             MCG9TL      |
|    N7:6                                                               N7:26     |
|-+---] [-----+---------------------------------------------------------(U)------|
| |     4     |                                                          8        |
| |[3]        |                                                                   |
| |           | N7:26/8 - ] [ - File #2 MAIN_PRGRM - 132                          |
| |           |         -(L)- - File #2 MAIN_PRGRM - 489                          |
| |           | _F:N7:21lX21 - BTW - File #2 MAIN_PRGRM - 2                       |
| |MANUAL CRYO|                                                                   |
| |GATE 9 OPEN|                                                                   |
| |MCG9OP     |                                                                   |
| |   N7:25   |                                                                   |
| |----] [----|                                                                   |
| |     13    |                                                                   |
| |[488]      |                                                                   |
| |PREPARE FOR|                                                                   |
| |AUTO RUN   |                                                                   |
| |>AUTO      |                                                                   |
| |   N7:37   |                                                                   |
| |----] [----|                                                                   |
| |     1     |                                                                   |
| |[162]      |                                                                   |
| |COMPRESSOR |                                                                   |
| |7 REGEN-   |                                                                   |
| |ERATION    |                                                                   |
| |PROGRAM    |                                                                   |
| |CYRGN7     |                                                                   |
| |    B3     |                                                                   |
| +----] [----+                                                                   |
|     327                                                                         |
|  [3:57]                                                                         |
```

Rung #491 - 371 -

```
|MANUAL
|CONTROL
|CRYO GATE                                                              MANUAL CRYO
|10 OPEN                                                                GATE 10 OPEN
|M-HV10-1                                                               MCG10OP
|  N7:4                                                                    N7:25
|---] [-----------------------------------------------------------------+----(L)----+-
|   14                                                                  |    14     |
|[3]                                                                    |           |
| N7:25/14 - ] [ - File #2 MAIN_PRGRM - 133, 134, 494                   |           |
|           -(U)- - File #2 MAIN_PRGRM - 492                            |MANUAL CRYO|
| _F:N7:21[%21 - BTW - File #2 MAIN_PRGRM - 2                           |GATE 10 CLOSE
| N7:27/5 - -(L)- - File #2 MAIN_PRGRM - 492                            |MCG10CL    |
| _F:N7:21[%21 - BTW - File #2 MAIN_PRGRM - 2                           |   N7:27   |
|                                                                       +----(U)----+
|                                                                            5
```

Rung #492

```
| MANUAL
| CONTROL
| CRYO GATE                                                             MANUAL CRYO
| 10 CLOSE                                                              GATE 10 OPEN
| M-HV10-0                                                              MCG10OP
|   N7:6                                                                   N7:25
|-+---] [---+-----------------------------------------------------------+----(U)----+-
| |    5    |                                                           |    14     |
| |[3]      |                                                           |           |
| |         | N7:25/14 - ] [ - File #2 MAIN_PRGRM - 133, 134, 494       |           |
| |         |            -(L)- - File #2 MAIN_PRGRM - 491               |           |
| |MANUAL   | _F:N7:21[%21 - BTW - File #2 MAIN_PRGRM - 2               |MANUAL CRYO|
| |CONTROL  | N7:27/5 - -(U)- - File #2 MAIN_PRGRM - 491                |GATE 10 CLOSE
| |CRYO GATE| _F:N7:21[%21 - BTW - File #2 MAIN_PRGRM - 2               |MCG10CL    |
| |10THROTTLE                                                           |   N7:27   |
| |M-HV10-2 |                                                           +----(L)----+
| |   N7:5  |                                                                5
| +---] [---+
| |    9    |
| |[3]      |
| |PREPARE FOR
| |AUTO RUN |
| |>AUTO    |
| |   N7:37 |
| +---] [---+
| |    1    |
| |[162]    |
| |COMPRESSOR
| |7 REGEN- |
| |ERATION  |
| |PROGRAM  |
| |CYRGN7   |
| |   B3    |
| +---] [---+
|     327
|  [3:57]
```

```
Rung #493
|MANUAL
|CONTROL                                                          MANUAL CRYO |
|CRYO GATE                                                        GATE 10     |
|10THROTTLE                                                       THROTTLE    |
|M-HV10-2                                                         MCG10TL     |
|   N7:5                                                             N7:26    |
|---] [-------------------------------------------------------------(L)------|
|     9                                                                9      |
|[3]
N7:26/9 - ] [ - File #2 MAIN_PRGRM -  134,134
        -(L)- - File #2 MAIN_PRGRM -  493
        -(U)- - File #2 MAIN_PRGRM -  494
_F:N7:21[%21 - BTW - File #2 MAIN_PRGRM -  2
Rung #494
| MANUAL                                                                      |
| CONTROL                                                         MANUAL CRYO |
| CRYO GATE                                                       GATE 10     |
| 10 CLOSE                                                        THROTTLE    |
| M-HV10-O                                                        MCG10TL     |
|   N7:6                                                             N7:26    |
|-+---] [-----+-----------------------------------------------------(U)------|
| |    5      |                                                        9      |
| |[3]        |                                                               |
| |           | N7:26/9 - ] [ - File #2 MAIN_PRGRM - 134                        |
| |           |         -(L)- - File #2 MAIN_PRGRM - 493                        |
| |           | _F:N7:21[%21 - BTW - File #2 MAIN_PRGRM - 2                     |
| |MANUAL CRYO|                                                               |
| |GATE 10 OPEN                                                               |
| |MCG10OP    |                                                               |
| |   N7:25   |                                                               |
| |---] [-----|                                                               |
| |    14     |                                                               |
| |[492]      |                                                               |
| |PREPARE FOR|                                                               |
| |AUTO RUN   |                                                               |
| |>AUTO      |                                                               |
| |   N7:37   |                                                               |
| |---] [-----|                                                               |
| |    1      |                                                               |
| |[162]      |                                                               |
| |COMPRESSOR |                                                               |
| |7 REGEN-   |                                                               |
| |ERATION    |                                                               |
| |PROGRAM    |                                                               |
| |CYRGN7     |                                                               |
| |   B3      |                                                               |
| +---] [-----+                                                               |
|     327                                                                     |
|  [3:57]                                                                     |
```

```
Rung #495
|MANUAL
|CONTROL
|CRYO GATE                                                                MANUAL CRYO
|11 OPEN                                                                  GATE 11 OPEN
|M-HV11-1                                                                 MCG11OP
|  N7:4                                                                     N7:25
|---] [------------------------------------------------------------------+---(L)---+--|
|   15                                                                   |   15     |
|[3]                                                                     |          |
| N7:25/15 - ] [ - File #2 MAIN_PRGRM - 135, 136, 498                    |          |
|           -(U)- - File #2 MAIN_PRGRM - 496                              |MANUAL CRYO
| _F:N7:21lX21 - BTW - File #2 MAIN_PRGRM - 2                            |GATE 11 CLOSE
| N7:27/6 - -(L)- - File #2 MAIN_PRGRM - 496                             |MCG11CL   |
| _F:N7:21lX21 - BTW - File #2 MAIN_PRGRM - 2                            |   N7:27  |
|                                                                        +---(U)----+
|                                                                            6
Rung #496
| MANUAL
| CONTROL
| CRYO GATE                                                               MANUAL CRYO
| 11 CLOSE                                                                GATE 11 OPEN
| M-HV11-0                                                                MCG11OP
|   N7:6                                                                    N7:25
|-+---] [----+-----------------------------------------------------------+---(U)---+--|
| |    6     |                                                           |   15     |
| |[3]       |                                                           |          |
| |          | N7:25/15 - ] [ - File #2 MAIN_PRGRM - 135, 136, 498       |          |
| |          |           -(L)- - File #2 MAIN_PRGRM - 495                |          |
| |MANUAL    | _F:N7:21lX21 - BTW - File #2 MAIN_PRGRM - 2               |MANUAL CRYO
| |CONTROL   | N7:27/6 - -(U)- - File #2 MAIN_PRGRM - 495                |GATE 11 CLOSE
| |CRYO GATE | _F:N7:21lX21 - BTW - File #2 MAIN_PRGRM - 2               |MCG11CL   |
| |11THROTTLE|                                                           |   N7:27  |
| |M-HV11-2  |                                                           +---(L)----+
| |  N7:5    |                                                               6
| |---] [----|
| |   10     |
| |[3]       |
| |PREPARE FOR
| |AUTO RUN  |
| |>AUTO     |
| |  N7:37   |
| |---] [----|
| |   1      |
| |[162]     |
| |COMPRESSOR|
| |& REGEN-  |
| |ERATION   |
| |PROGRAM   |
| |CYRGN8    |
| |   83     |
| +---] [----+
|    328
|  [3:63]
```

Rung #497

```
|MANUAL                                                              |
|CONTROL                                              MANUAL CRYO    |
|CRYO GATE                                            GATE 11        |
|11THROTTLE                                           THROTTLE       |
|M-MV11-2                                             MCG11TL        |
|    N7:5                                               N7:26        |
|----] [--------------------------------------------------(L)-------|
|    10                                                   10         |
|[3]
N7:26/10 - ] [ - File #2 MAIN_PRGRM -  136,136
         -(L)- - File #2 MAIN_PRGRM -  497
         -(U)- - File #2 MAIN_PRGRM -  498
_F:N7:21[X21 - BTW - File #2 MAIN_PRGRM -  2
```

Rung #498

```
|  MANUAL                                                            |
|  CONTROL                                            MANUAL CRYO    |
|  CRYO GATE                                          GATE 11        |
|  11 CLOSE                                           THROTTLE       |
|  M-MV11-0                                           MCG11TL        |
|    N7:6                                               N7:26        |
|-+---] [---+---------------------------------------------(U)-------|
| |    6    |                                             10         |
| |[3]      |                                                        |
| |         | N7:26/10 - ] [ - File #2 MAIN_PRGRM - 136              |
| |         |            -(L)- - File #2 MAIN_PRGRM - 497            |
| |         | _F:N7:21[X21 - BTW - File #2 MAIN_PRGRM - 2            |
| |MANUAL CRYO                                                       |
| |GATE 11 OPEN                                                      |
| |MCG11OP  |                                                        |
| |   N7:25 |                                                        |
| +---] [---+                                                        |
| |    15   |                                                        |
| |[496]    |                                                        |
| |PREPARE FOR                                                       |
| |AUTO RUN |                                                        |
| |>AUTO    |                                                        |
| |   N7:37 |                                                        |
| +---] [---+                                                        |
| |    1    |                                                        |
| |[162]    |                                                        |
| |COMPRESSOR                                                        |
| |& REGEN- |                                                        |
| |ERATION  |                                                        |
| |PROGRAM  |                                                        |
| |CYRGNB   |                                                        |
| |    B3   |                                                        |
| +---] [---+                                                        |
|     328                                                            |
|  [3:63]                                                            |
```

Rung #499

```
|MANUAL
|CONTROL
|CRYO GATE                                                               MANUAL CRYO
|12 OPEN                                                                 GATE 12 OPEN
|M-HV12-1                                                                MCG12OP
|  N7:5                                                                    N7:26
|---] [--------------------------------------------------------------+------(L)-----+--|
|    0                                                               |       0      |
|[3]                                                                 |              |
| N7:26/0 - ] [ - File #2 MAIN_PRGRM - 137, 138, 502                 |              |
|           -(U)- - File #2 MAIN_PRGRM - 500                         |MANUAL CRYO   |
| _F:N7:21[X21 - BTW - File #2 MAIN_PRGRM - 2                        |GATE 12 CLOSE |
| N7:27/7 - -(L)- - File #2 MAIN_PRGRM - 500                         |MCG12CL       |
| _F:N7:21[X21 - BTW - File #2 MAIN_PRGRM - 2                        |   N7:27      |
|                                                                    +-----(U)------+
|                                                                          7
Rung #500
| MANUAL
| CONTROL
| CRYO GATE                                                              MANUAL CRYO
| 12 CLOSE                                                               GATE 12 OPEN
| M-HV12-0                                                               MCG12OP
|   N7:6                                                                   N7:26
+-+---] [----+--------------------------------------------------------+-----(U)-----+-|
| |     7    |                                                        |      0      |
| |[3]       |                                                        |             |
| |          | N7:26/0 - ] [ - File #2 MAIN_PRGRM - 137, 138, 502     |             |
| |          |           -(L)- - File #2 MAIN_PRGRM - 499             |             |
| |MANUAL    | _F:N7:21[X21 - BTW - File #2 MAIN_PRGRM - 2              |MANUAL CRYO  |
| |CONTROL   | N7:27/7 - -(U)- - File #2 MAIN_PRGRM - 499               |GATE 12 CLOSE|
| |CRYO GATE | _F:N7:21[X21 - BTW - File #2 MAIN_PRGRM - 2              |MCG12CL      |
| |12THROTTLE|                                                        |   N7:27     |
| |M-HV12-2  |                                                        +-----(L)-----+
| |   N7:5   |                                                              7
| +---] [----+
| |    11    |
| |[3]       |
| |PREPARE FOR
| |AUTO RUN  |
| |>AUTO     |
| |   N7:37  |
| +---] [----+
| |    1     |
| |[162]     |
| |COMPRESSOR|
| |7 REGEN-  |
| |ERATION   |
| |PROGRAM   |
| |CYRGN7    |
| |   B3     |
| +---] [----+
|     327
| [3:57]
```

```
Rung #501
|MANUAL                                                              MANUAL CRYO |
|CONTROL                                                             GATE 12     |
|CRYO GATE                                                           THROTTLE    |
|12THROTTLE                                                          MCG12TL     |
|M-HV12-2                                                              N7:26     |
|   N7:5                                                             ---(L)------|
|---] [--------------------------------------------------------------    11      |
|    11                                                                          |
|[3]
N7:26/11 - ] [ - File #2 MAIN_PRGRM -  138,138
         -(L)- - File #2 MAIN_PRGRM -  501
         -(U)- - File #2 MAIN_PRGRM -  502
_F:N7:21(X21 - BTW - File #2 MAIN_PRGRM -  2
Rung #502
| MANUAL                                                            MANUAL CRYO |
| CONTROL                                                           GATE 12     |
| CRYO GATE                                                         THROTTLE    |
| 12 CLOSE                                                          MCG12TL     |
| M-HV12-0                                                            N7:26     |
|   N7:6                                                            ---(U)------|
|-+---] [----+--------------------------------------------------------  11      |
| |    7     |                                                                  |
| |[3]       |                                                                  |
| |          | N7:26/11 - ] [ - File #2 MAIN_PRGRM - 138                        |
| |          |          -(L)- - File #2 MAIN_PRGRM - 501                        |
| |          | _F:N7:21(X21 - BTW - File #2 MAIN_PRGRM - 2                      |
| |MANUAL CRYO |                                                                |
| |GATE 12 OPEN|                                                                |
| |MCG12OP     |                                                                |
| |   N7:26    |                                                                |
| +---] [------+                                                                |
| |    0       |                                                                |
| |[500]       |                                                                |
| |PREPARE FOR |                                                                |
| |AUTO RUN    |                                                                |
| |>AUTO       |                                                                |
| |   N7:37    |                                                                |
| +---] [------+                                                                |
| |    1       |                                                                |
| |[162]       |                                                                |
| |COMPRESSOR  |                                                                |
| |7 REGEN-    |                                                                |
| |ERATION     |                                                                |
| |PROGRAM     |                                                                |
| |CYRGN7      |                                                                |
| |   B3       |                                                                |
| +---] [------+                                                                |
|    327                                                                        |
|  [3:57]                                                                       |
```

Rung #503

```
|MANUAL CONTROL                                                        MANUAL ROUGH
|ROUGH PUMP                                                            PUMP VALVE
|VALVE 1 OPEN                                                          1 OPEN
|M-RV1-1                                                               MRPV1OP
|     N7:7                                                               N7:28
|----] [------------------------------------------------------------+----(L)----+
|     0                                                             |    0      |
|[3]                                                                |           |
| N7:28/0 - -] [- - File #2 MAIN_PRGRM - 167                        |MANUAL ROUGH
|           -(U)- - File #2 MAIN_PRGRM - 508                        |PUMP VALVE
| _F:N7:21[X21 - BTW - File #2 MAIN_PRGRM - 2                       |1 CLOSE
| N7:33/3 - -(L)- - File #2 MAIN_PRGRM - 508                        |MRPV1CL
| _F:N7:21[X21 - BTW - File #2 MAIN_PRGRM - 2                       |   N7:33
|                                                                   +----(U)----+
                                                                         3
```

Rung #504

```
|MANUAL CONTROL                                                        MANUAL ROUGH
|ROUGH PUMP                                                            PUMP VALVE
|VALVE 2 OPEN                                                          2 OPEN
|M-RV2-1                                                               MRPV2OP
|     N7:7                                                               N7:28
|----] [------------------------------------------------------------+----(L)----+
|     1                                                             |    1      |
|[3]                                                                |           |
| N7:28/1 - -] [- - File #2 MAIN_PRGRM - 56                         |MANUAL ROUGH
|           -(U)- - File #2 MAIN_PRGRM - 509                        |PUMP VALVE
| _F:N7:21[X21 - BTW - File #2 MAIN_PRGRM - 2                       |2 CLOSE
| N7:33/4 - -(L)- - File #2 MAIN_PRGRM - 509                        |MRPV2CL
| _F:N7:21[X21 - BTW - File #2 MAIN_PRGRM - 2                       |   N7:33
|                                                                   +----(U)----+
                                                                         4
```

Rung #505

```
|MANUAL CONTROL                                                        MANUAL ROUGH
|ROUGH PUMP                                                            PUMP VALVE
|VALVE 3 OPEN                                                          3 OPEN
|M-RV3-1                                                               MRPV3OP
|     N7:7                                                               N7:28
|----] [------------------------------------------------------------+----(L)----+
|     2                                                             |    2      |
|[3]                                                                |           |
| N7:28/2 - -] [- - File #2 MAIN_PRGRM - 57                         |MANUAL ROUGH
|           -(U)- - File #2 MAIN_PRGRM - 510                        |PUMP VALVE
| _F:N7:21[X21 - BTW - File #2 MAIN_PRGRM - 2                       |3 CLOSE
| N7:33/5 - -(L)- - File #2 MAIN_PRGRM - 510                        |MRPV3CL
| _F:N7:21[X21 - BTW - File #2 MAIN_PRGRM - 2                       |   N7:33
|                                                                   +----(U)----+
                                                                         5
```

Rung #506

```
|MANUAL CONTROL                                                        MANUAL ROUGH
|ROUGH PUMP                                                            PUMP VALVE
|VALVE 4 OPEN                                                          4 OPEN
|M-RV4-1                                                               MRPV4OP
|     N7:7                                                               N7:28
|----] [------------------------------------------------------------+----(L)----+
|     3                                                             |    3      |
|[3]                                                                |           |
| N7:28/3 - -] [- - File #2 MAIN_PRGRM - 58                         |MANUAL ROUGH
|           -(U)- - File #2 MAIN_PRGRM - 511                        |PUMP VALVE
| _F:N7:21[X21 - BTW - File #2 MAIN_PRGRM - 2                       |4 CLOSE
| N7:33/6 - -(L)- - File #2 MAIN_PRGRM - 511                        |MRPV4CL
| _F:N7:21[X21 - BTW - File #2 MAIN_PRGRM - 2                       |   N7:33
|                                                                   +----(U)----+
>                                                                               >
```

```
                                                                       6
Rung #507
MANUAL CONTROL                                                   MANUAL ROUGH
ROUGH PUMP                                                       PUMP VALVE
VALVE 5 OPEN                                                     5 OPEN
M-RV5-1                                                          MRVP5OP
      N7:7                                                          N7:28
|----] [--------------------------------------------------------+----(L)----+
      4                                                         |    4      |
[3]                                                             |           |
 N7:28/4 - -] [- - File #2 MAIN_PRGRM - 340                     |MANUAL ROUGH
            -(U)- - File #2 MAIN_PRGRM - 512                    |PUMP VALVE |
 _F:N7:21(%21 - BTW - File #2 MAIN_PRGRM - 2                    |5 CLOSE    |
 N7:33/7 - -(L)- - File #2 MAIN_PRGRM - 512                     |MRPV5CL    |
 _F:N7:21(%21 - BTW - File #2 MAIN_PRGRM - 2                    |   N7:33   |
                                                                +----(U)----+
                                                                     7
Rung #508
 MANUAL
 CONTROL
 ROUGH PUMP                                                      MANUAL ROUGH
 1 VALVE                                                         PUMP VALVE
 CLOSE                                                           1 OPEN
 M-RV1-0                                                         MRPV1OP
    N7:12                                                           N7:28
+-+----] [----+-------------------------------------------------+----(U)----+
| |      3    |                                                 |    0      |
| |[3]        |                                                 |           |
| |           | N7:28/0 - -] [- - File #2 MAIN_PRGRM - 167      |           |
| |           |           -(L)- - File #2 MAIN_PRGRM - 503      |MANUAL ROUGH
| |           | _F:N7:21(%21 - BTW - File #2 MAIN_PRGRM - 2     |PUMP VALVE |
| |           | N7:33/3 - -(U)- - File #2 MAIN_PRGRM - 503      |1 CLOSE    |
| |PREPARE FOR| _F:N7:21(%21 - BTW - File #2 MAIN_PRGRM - 2     |MRPV1CL    |
| |AUTO RUN   |                                                 |   N7:33   |
| |>AUTO      |                                                 +----(L)----+
| |   N7:37   |                                                      3
| +----] [----+
        1
 [162]
Rung #509
 MANUAL
 CONTROL
 ROUGH PUMP                                                      MANUAL ROUGH
 2 VALVE                                                         PUMP VALVE
 CLOSE                                                           2 OPEN
 M-RV2-0                                                         MRPV2OP
    N7:12                                                           N7:28
+-+----] [----+-------------------------------------------------+----(U)----+
| |      4    |                                                 |    1      |
| |[3]        |                                                 |           |
| |           | N7:28/1 - -] [- - File #2 MAIN_PRGRM - 56       |           |
| |           |           -(L)- - File #2 MAIN_PRGRM - 504      |MANUAL ROUGH
| |           | _F:N7:21(%21 - BTW - File #2 MAIN_PRGRM - 2     |PUMP VALVE |
| |           | N7:33/4 - -(U)- - File #2 MAIN_PRGRM - 504      |2 CLOSE    |
| |PREPARE FOR| _F:N7:21(%21 - BTW - File #2 MAIN_PRGRM - 2     |MRPV2CL    |
| |AUTO RUN   |                                                 |   N7:33   |
| |>AUTO      |                                                 +----(L)----+
| |   N7:37   |                                                      4
| +----] [----+
        1
 [162]
```

Rung #510

```
MANUAL
CONTROL
ROUGH PUMP
3 VALVE
CLOSE
M-RV3-O
N7:12                                             MANUAL ROUGH
--] [--                                           PUMP VALVE
  5                                               3 OPEN
[3]                                               MRPV3OP
                                                  N7:28
N7:28/2 - -] [- - File #2 MAIN_PRGRM - 57         --(U)--
          -(L)- - File #2 MAIN_PRGRM - 505           2
_F:N7:21[%21 - BTW - File #2 MAIN_PRGRM - 2
N7:33/5 - -(U)- - File #2 MAIN_PRGRM - 505        MANUAL ROUGH
_F:N7:21[%21 - BTW - File #2 MAIN_PRGRM - 2       PUMP VALVE
                                                  3 CLOSE
PREPARE FOR                                       MRPV3CL
AUTO RUN                                          N7:33
>AUTO                                             --(L)--
N7:37                                                5
--] [--
  1
[162]
```

Rung #511

```
MANUAL
CONTROL
ROUGH PUMP
4 VALVE
CLOSE
M-RV4-O
N7:12                                             MANUAL ROUGH
--] [--                                           PUMP VALVE
  6                                               4 OPEN
[3]                                               MRPV4OP
                                                  N7:28
N7:28/3 - -] [- - File #2 MAIN_PRGRM - 58         --(U)--
          -(L)- - File #2 MAIN_PRGRM - 506           3
_F:N7:21[%21 - BTW - File #2 MAIN_PRGRM - 2
N7:33/6 - -(U)- - File #2 MAIN_PRGRM - 506        MANUAL ROUGH
_F:N7:21[%21 - BTW - File #2 MAIN_PRGRM - 2       PUMP VALVE
                                                  4 CLOSE
PREPARE FOR                                       MRPV4CL
AUTO RUN                                          N7:33
>AUTO                                             --(L)--
N7:37                                                6
--] [--
  1
[162]
```

```
Rung #512
| MANUAL
| CONTROL
| ROUGH PUMP
| 5 VALVE
| CLOSE
| M-RVS-O
|    N7:12                                                      MANUAL ROUGH
|                                                               PUMP VALVE
|                                                               5 OPEN
|                                                               MRVP5OP
|                                                                 N7:28
|--+--] [--+----------------------------------------------------+--(U)--+--
|  |   7   |                                                    |    4  |
|  | [3]   |                                                    |       |
|  |       | N7:28/4 - ] [ - File #2 MAIN_PRGRM - 340           |       |
|  |       |           -(L)- - File #2 MAIN_PRGRM - 507         |MANUAL ROUGH
|  |       | _F:N7:21[%21 - BTW - File #2 MAIN_PRGRM - 2        |PUMP VALVE
|  |       | N7:33/7 - -(U)- - File #2 MAIN_PRGRM - 507         |5 CLOSE
|  |PREPARE FOR _F:N7:21[%21 - BTW - File #2 MAIN_PRGRM - 2     |MRPVSCL
|  |AUTO RUN |                                                  |  N7:33
|  |>AUTO    |                                                  +--(L)--+
|  |  N7:37  |                                                       7
|  +--] [---+
|      1
|  [162]
Rung #513
|MANUAL
|CONTROL
|MOTOR 3
|ON                                                             MANUAL MOTOR
|M-MCON3                                                        3 ON
|  N7:2                                                         MM3ON
|                                                                 N7:23
|--] [--------------------------------------------------------------(L)----|
|    1                                                               1
|[3]
N7:23/1 - ] [ - File #2 MAIN_PRGRM - 185,187
          ]/[ - File #2 MAIN_PRGRM - 532
          -(L)- - File #2 MAIN_PRGRM - 513
          -(U)- - File #2 MAIN_PRGRM - 551
_F:N7:21[%21 - BTW - File #2 MAIN_PRGRM - 2
Rung #514
|MANUAL
|CONTROL
|MOTOR 4
|ON                                                             MANUAL MOTOR
|M-MCON4                                                        4 ON
|  N7:2                                                         MM4ON
|                                                                 N7:23
|--] [--------------------------------------------------------------(L)----|
|    2                                                               2
|[3]
N7:23/2 - ] [ - File #2 MAIN_PRGRM - 190,192
          ]/[ - File #2 MAIN_PRGRM - 533
          -(L)- - File #2 MAIN_PRGRM - 514
          -(U)- - File #2 MAIN_PRGRM - 552
_F:N7:21[%21 - BTW - File #2 MAIN_PRGRM - 2
Rung #515
|MANUAL
|CONTROL
|MOTOR 5
|ON                                                             MANUAL MOTOR
|M-MCON5                                                        5 ON
|  N7:2                                                         MM5ON
|                                                                 N7:23
|--] [--------------------------------------------------------------(L)----|
|    3                                                               3
|[3]
```

```
N7:23/3 - -| |- - File #2 MAIN_PRGRM - 195,197
          -|/|- - File #2 MAIN_PRGRM - 534
          -(L)- - File #2 MAIN_PRGRM - 515
          -(U)- - File #2 MAIN_PRGRM - 553
_F:N7:21tX21 - BTW - File #2 MAIN_PRGRM - 2
Rung #516
|MANUAL
|CONTROL
|MOTOR 6
|ON                                                    MANUAL MOTOR |
|M-MCON6                                               6 ON         |
|  N7:2                                                MM6ON        |
|                                                         N7:23     |
|--| |---------------------------------------------------(L)--------|
|   4                                                      4        |
|[3]
N7:23/4 - -| |- - File #2 MAIN_PRGRM - 218,220
          -|/|- - File #2 MAIN_PRGRM - 535
          -(L)- - File #2 MAIN_PRGRM - 516
          -(U)- - File #2 MAIN_PRGRM - 554
_F:N7:21tX21 - BTW - File #2 MAIN_PRGRM - 2
Rung #517
|MANUAL
|CONTROL
|MOTOR 7
|ON                                                    MANUAL MOTOR |
|M-MCON7                                               7 ON         |
|  N7:2                                                MM7ON        |
|                                                         N7:23     |
|--| |---------------------------------------------------(L)--------|
|   5                                                      5        |
|[3]
N7:23/5 - -| |- - File #2 MAIN_PRGRM - 231,233
          -|/|- - File #2 MAIN_PRGRM - 536
          -(L)- - File #2 MAIN_PRGRM - 517
          -(U)- - File #2 MAIN_PRGRM - 555
_F:N7:21tX21 - BTW - File #2 MAIN_PRGRM - 2
Rung #518
|MANUAL
|CONTROL
|MOTOR 8
|ON                                                    MANUAL MOTOR |
|M-MCON8                                               8 ON         |
|  N7:2                                                MM8ON        |
|                                                         N7:23     |
|--| |---------------------------------------------------(L)--------|
|   6                                                      6        |
|[3]
N7:23/6 - -| |- - File #2 MAIN_PRGRM - 249
          -|/|- - File #2 MAIN_PRGRM - 537
          -(L)- - File #2 MAIN_PRGRM - 518
          -(U)- - File #2 MAIN_PRGRM - 556
_F:N7:21tX21 - BTW - File #2 MAIN_PRGRM - 2
Rung #519
|MANUAL
|CONTROL
|MOTOR 9
|ON                                                    MANUAL MOTOR |
|M-MCON9                                               9 ON         |
|  N7:2                                                MM9ON        |
|                                                         N7:23     |
|--| |---------------------------------------------------(L)--------|
|   7                                                      7        |
|[3]
N7:23/7 - -| |- - File #2 MAIN_PRGRM - 253,255
          -|/|- - File #2 MAIN_PRGRM - 538
```

```
        -(L)- - File #2 MAIN_PRGRM -  519
        -(U)- - File #2 MAIN_PRGRM -  557
_F:N7:21[X21 - BTW - File #2 MAIN_PRGRM -  2
Rung #520
|MANUAL
|CONTROL
|MOTOR 10
|ON                                                        MANUAL MOTOR |
|M-MCON10                                                  10 ON        |
|  N7:2                                                    MM10ON       |
|--] [------------------------------------------------------N7:23-------|
|  8                                                       -(L)---------|
|[3]                                                         8          |
N7:23/8 - ] [ - File #2 MAIN_PRGRM -  258,260
          ]/[ - File #2 MAIN_PRGRM -  539
          -(L)- - File #2 MAIN_PRGRM -  520
          -(U)- - File #2 MAIN_PRGRM -  558
_F:N7:21[X21 - BTW - File #2 MAIN_PRGRM -  2
Rung #521
|MANUAL
|CONTROL
|MOTOR 11
|ON                                                        MANUAL MOTOR |
|M-MCON11                                                  11 ON        |
|  N7:2                                                    MM11ON       |
|--] [------------------------------------------------------N7:23-------|
|  9                                                       -(L)---------|
|[3]                                                         9          |
N7:23/9 - ] [ - File #2 MAIN_PRGRM -  263,265
          ]/[ - File #2 MAIN_PRGRM -  540
          -(L)- - File #2 MAIN_PRGRM -  521
          -(U)- - File #2 MAIN_PRGRM -  559
_F:N7:21[X21 - BTW - File #2 MAIN_PRGRM -  2
Rung #522
|MANUAL
|CONTROL
|MOTOR 12
|ON                                                        MANUAL MOTOR |
|M-MCON12                                                  12 ON        |
|  N7:2                                                    MM12ON       |
|--] [------------------------------------------------------N7:23-------|
|  10                                                      -(L)---------|
|[3]                                                         10         |
N7:23/10 - ] [ - File #2 MAIN_PRGRM -  281
           ]/[ - File #2 MAIN_PRGRM -  541
           -(L)- - File #2 MAIN_PRGRM -  522
           -(U)- - File #2 MAIN_PRGRM -  560
_F:N7:21[X21 - BTW - File #2 MAIN_PRGRM -  2
Rung #523
|MANUAL
|CONTROL
|MOTOR 13
|ON                                                        MANUAL MOTOR |
|M-MCON13                                                  13 ON        |
|  N7:2                                                    MM13ON       |
|--] [------------------------------------------------------N7:23-------|
|  11                                                      -(L)---------|
|[3]                                                         11         |
N7:23/11 - ] [ - File #2 MAIN_PRGRM -  285,287
           ]/[ - File #2 MAIN_PRGRM -  542
           -(L)- - File #2 MAIN_PRGRM -  523
           -(U)- - File #2 MAIN_PRGRM -  561
```

```
_F:N7:21(X21 - BTW - File #2 MAIN_PRGRM -  2
Rung #524
|MANUAL
|CONTROL
|MOTOR 14
|ON                                                         MANUAL MOTOR
|M-MCON14                                                   14 ON
|   N7:2                                                    MM14ON
|--] [--------------------------------------------------------N7:23
|     12                                                    --(L)--
|[3]                                                           12
N7:23/12 - ] [ - File #2 MAIN_PRGRM -  290,292
           ]/[ - File #2 MAIN_PRGRM -  543
           -(L)- - File #2 MAIN_PRGRM -  524
           -(U)- - File #2 MAIN_PRGRM -  562
_F:N7:21(X21 - BTW - File #2 MAIN_PRGRM -  2
Rung #525
|MANUAL
|CONTROL
|MOTOR 15
|ON                                                         MANUAL MOTOR
|M-MCON15                                                   15 ON
|   N7:2                                                    MM15ON
|--] [--------------------------------------------------------N7:23
|     13                                                    --(L)--
|[3]                                                           13
N7:23/13 - ] [ - File #2 MAIN_PRGRM -  295,297
           ]/[ - File #2 MAIN_PRGRM -  544
           -(L)- - File #2 MAIN_PRGRM -  525
           -(U)- - File #2 MAIN_PRGRM -  563
_F:N7:21(X21 - BTW - File #2 MAIN_PRGRM -  2
Rung #526
|MANUAL
|CONTROL
|MOTOR 16
|ON                                                         MANUAL MOTOR
|M-MCON16                                                   16 ON
|   N7:2                                                    MM16ON
|--] [--------------------------------------------------------N7:23
|     14                                                    --(L)--
|[3]                                                           14
N7:23/14 - ] [ - File #2 MAIN_PRGRM -  306
           ]/[ - File #2 MAIN_PRGRM -  545
           -(L)- - File #2 MAIN_PRGRM -  526
           -(U)- - File #2 MAIN_PRGRM -  564
_F:N7:21(X21 - BTW - File #2 MAIN_PRGRM -  2
Rung #527
|MANUAL
|CONTROL
|MOTOR 17
|ON                                                         MANUAL MOTOR
|M-MCON17                                                   17 ON
|   N7:2                                                    MM17ON
|--] [--------------------------------------------------------N7:23
|     15                                                    --(L)--
|[3]                                                           15
N7:23/15 - ] [ - File #2 MAIN_PRGRM -  310,312
           ]/[ - File #2 MAIN_PRGRM -  546
           -(L)- - File #2 MAIN_PRGRM -  527
           -(U)- - File #2 MAIN_PRGRM -  565
_F:N7:21(X21 - BTW - File #2 MAIN_PRGRM -  2
```

```
Rung #528
|MANUAL                                  - 384 -
|CONTROL
|MOTOR 18
|ON                                                              MANUAL MOTOR
|M-MCON18                                                        18 ON
|  N7:3                                                          MM18ON
|--| |---------------------------------------------------------------N7:24
|   0                                                              --(L)--
|[3]                                                                  0
N7:24/0 - -| |- - File #2 MAIN_PRGRM -  315,317
          -|/|- - File #2 MAIN_PRGRM -  547
          -(L)- - File #2 MAIN_PRGRM -  528
          -(U)- - File #2 MAIN_PRGRM -  566
_F:N7:21(X21 - BTW - File #2 MAIN_PRGRM -  2
Rung #529
|MANUAL
|CONTROL
|MOTOR 19
|ON                                                              MANUAL MOTOR
|M-MCON19                                                        19 ON
|  N7:3                                                          MM19ON
|--| |---------------------------------------------------------------N7:24
|   1                                                              --(L)--
|[3]                                                                  1
N7:24/1 - -| |- - File #2 MAIN_PRGRM -  320,322
          -|/|- - File #2 MAIN_PRGRM -  548
          -(L)- - File #2 MAIN_PRGRM -  529
          -(U)- - File #2 MAIN_PRGRM -  567
_F:N7:21(X21 - BTW - File #2 MAIN_PRGRM -  2
Rung #530
|MANUAL
|CONTROL
|MOTOR 20
|ON                                                              MANUAL MOTOR
|M-MCON20                                                        20 ON
|  N7:3                                                          MM20ON
|--| |---------------------------------------------------------------N7:24
|   2                                                              --(L)--
|[3]                                                                  2
N7:24/2 - -| |- - File #2 MAIN_PRGRM -  331,333
          -|/|- - File #2 MAIN_PRGRM -  549,550
          -(L)- - File #2 MAIN_PRGRM -  530
          -(U)- - File #2 MAIN_PRGRM -  568
_F:N7:21(X21 - BTW - File #2 MAIN_PRGRM -  2
Rung #531
|MANUAL
|CONTROL
|MOTOR 21
|ON                                                              MANUAL MOTOR
|M-MCON21                                                        21 ON
|  N7:3                                                          MM21ON
|--| |---------------------------------------------------------------N7:24
|   3                                                              --(L)--
|[3]                                                                  3
N7:24/3 - -| |- - File #2 MAIN_PRGRM -  355,357
          -(L)- - File #2 MAIN_PRGRM -  531
          -(U)- - File #2 MAIN_PRGRM -  569
_F:N7:21(X21 - BTW - File #2 MAIN_PRGRM -  2
```

```
Rung #532
|MANUAL MOTOR                                                      MANUAL MOTOR |
|3 ON                                                              3 OFF        |
|MM3ON                                                             MM3OFF       |
|    N7:23                                                            N7:21     |
|----|/|-------------------------------------------------------------( )--------|
|     1                                                                3        |
|[513]                                                                          |
N7:21 - BTW - File #2 MAIN_PRGRM - 2
_F:N7:21[X21 - BTW - File #2 MAIN_PRGRM - 2
Rung #533
|MANUAL MOTOR                                                      MANUAL MOTOR |
|4 ON                                                              4 OFF        |
|MM4ON                                                             MM4OFF       |
|    N7:23                                                            N7:21     |
|----|/|-------------------------------------------------------------( )--------|
|     2                                                                4        |
|[514]                                                                          |
N7:21 - BTW - File #2 MAIN_PRGRM - 2
_F:N7:21[X21 - BTW - File #2 MAIN_PRGRM - 2
Rung #534
|MANUAL MOTOR                                                      MANUAL MOTOR |
|5 ON                                                              5 OFF        |
|MM5ON                                                             MM5OFF       |
|    N7:23                                                            N7:21     |
|----|/|-------------------------------------------------------------( )--------|
|     3                                                                5        |
|[515]                                                                          |
N7:21 - BTW - File #2 MAIN_PRGRM - 2
_F:N7:21[X21 - BTW - File #2 MAIN_PRGRM - 2
Rung #535
|MANUAL MOTOR                                                      MANUAL MOTOR |
|6 ON                                                              6 OFF        |
|MM6ON                                                             MM6OFF       |
|    N7:23                                                            N7:21     |
|----|/|-------------------------------------------------------------( )--------|
|     4                                                                6        |
|[516]                                                                          |
N7:21 - BTW - File #2 MAIN_PRGRM - 2
_F:N7:21[X21 - BTW - File #2 MAIN_PRGRM - 2
Rung #536
|MANUAL MOTOR                                                      MANUAL MOTOR |
|7 ON                                                              7 OFF        |
|MM7ON                                                             MM7OFF       |
|    N7:23                                                            N7:21     |
|----|/|-------------------------------------------------------------( )--------|
|     5                                                                7        |
|[517]                                                                          |
N7:21 - BTW - File #2 MAIN_PRGRM - 2
_F:N7:21[X21 - BTW - File #2 MAIN_PRGRM - 2
Rung #537
|MANUAL MOTOR                                                      MANUAL MOTOR |
|8 ON                                                              8 OFF        |
|MM8ON                                                             MM8OFF       |
|    N7:23                                                            N7:21     |
|----|/|-------------------------------------------------------------( )--------|
|     6                                                                8        |
|[518]                                                                          |
N7:21 - BTW - File #2 MAIN_PRGRM - 2
_F:N7:21[X21 - BTW - File #2 MAIN_PRGRM - 2
```

```
Rung #538
|MANUAL MOTOR                                                        MANUAL MOTOR |
|9 ON                                                                9 OFF        |
|MM9ON                                                               MM9OFF       |
|   N7:23                                                              N7:21      |
|---|/|-----------------------------------------------------------------( )-------|
|    7                                                                   9        |
|[519]                                                                            |
N7:21 - BTW - File #2 MAIN_PRGRM - 2
_F:N7:21[X21 - BTW - File #2 MAIN_PRGRM - 2
Rung #539
|MANUAL MOTOR                                                        MANUAL MOTOR |
|10 ON                                                               10 OFF       |
|MM10ON                                                              MM10OFF      |
|   N7:23                                                              N7:21      |
|---|/|-----------------------------------------------------------------( )-------|
|    8                                                                   10       |
|[520]                                                                            |
N7:21 - BTW - File #2 MAIN_PRGRM - 2
_F:N7:21[X21 - BTW - File #2 MAIN_PRGRM - 2
Rung #540
|MANUAL MOTOR                                                        MANUAL MOTOR |
|11 ON                                                               11 OFF       |
|MM11ON                                                              MM11OFF      |
|   N7:23                                                              N7:21      |
|---|/|-----------------------------------------------------------------( )-------|
|    9                                                                   11       |
|[521]                                                                            |
N7:21 - BTW - File #2 MAIN_PRGRM - 2
_F:N7:21[X21 - BTW - File #2 MAIN_PRGRM - 2
Rung #541
|MANUAL MOTOR                                                        MANUAL MOTOR |
|12 ON                                                               12 OFF       |
|MM12ON                                                              MM12OFF      |
|   N7:23                                                              N7:21      |
|---|/|-----------------------------------------------------------------( )-------|
|    10                                                                  12       |
|[522]                                                                            |
N7:21 - BTW - File #2 MAIN_PRGRM - 2
_F:N7:21[X21 - BTW - File #2 MAIN_PRGRM - 2
Rung #542
|MANUAL MOTOR                                                        MANUAL MOTOR |
|13 ON                                                               13 OFF       |
|MM13ON                                                              MM13OFF      |
|   N7:23                                                              N7:21      |
|---|/|-----------------------------------------------------------------( )-------|
|    11                                                                  13       |
|[523]                                                                            |
N7:21 - BTW - File #2 MAIN_PRGRM - 2
_F:N7:21[X21 - BTW - File #2 MAIN_PRGRM - 2
Rung #543
|MANUAL MOTOR                                                        MANUAL MOTOR |
|14 ON                                                               14 OFF       |
|MM14ON                                                              MM14OFF      |
|   N7:23                                                              N7:21      |
|---|/|-----------------------------------------------------------------( )-------|
|    12                                                                  14       |
|[524]                                                                            |
N7:21 - BTW - File #2 MAIN_PRGRM - 2
_F:N7:21[X21 - BTW - File #2 MAIN_PRGRM - 2
```

```
Rung #544
|MANUAL MOTOR                                                        MANUAL MOTOR |
|15 ON                                                               15 OFF       |
|MM15ON                                                              MM15OFF      |
|   N7:23                                                             N7:21       |
|---]/[--------------------------------------------------------------( )---------|
|    13                                                                15         |
|[525]                                                                            |
N7:21 - BTW - File #2 MAIN_PRGRM -  2
_F:N7:21[%21 - BTW - File #2 MAIN_PRGRM -  2
Rung #545
|MANUAL MOTOR                                                        MANUAL MOTOR |
|16 ON                                                               16 OFF       |
|MM16ON                                                              MM16OFF      |
|   N7:23                                                             N7:22       |
|---]/[--------------------------------------------------------------( )---------|
|    14                                                                0          |
|[526]                                                                            |
_F:N7:21[%21 - BTW - File #2 MAIN_PRGRM -  2
Rung #546
|MANUAL MOTOR                                                        MANUAL MOTOR |
|17 ON                                                               17 OFF       |
|MM17ON                                                              MM17OFF      |
|   N7:23                                                             N7:22       |
|---]/[--------------------------------------------------------------( )---------|
|    15                                                                1          |
|[527]                                                                            |
_F:N7:21[%21 - BTW - File #2 MAIN_PRGRM -  2
Rung #547
|MANUAL MOTOR                                                        MANUAL MOTOR |
|18 ON                                                               18 OFF       |
|MM18ON                                                              MM18OFF      |
|   N7:24                                                             N7:22       |
|---]/[--------------------------------------------------------------( )---------|
|    0                                                                 2          |
|[528]                                                                            |
_F:N7:21[%21 - BTW - File #2 MAIN_PRGRM -  2
Rung #548
|MANUAL MOTOR                                                        MANUAL MOTOR |
|19 ON                                                               19 OFF       |
|MM19ON                                                              MM19OFF      |
|   N7:24                                                             N7:22       |
|---]/[--------------------------------------------------------------( )---------|
|    1                                                                 3          |
|[529]                                                                            |
_F:N7:21[%21 - BTW - File #2 MAIN_PRGRM -  2
Rung #549
|MANUAL MOTOR                                                        MANUAL MOTOR |
|20 ON                                                               20 OFF       |
|MM20ON                                                              MM20OFF      |
|   N7:24                                                             N7:22       |
|---]/[--------------------------------------------------------------( )---------|
|    2                                                                 4          |
|[530]                                                                            |
_F:N7:21[%21 - BTW - File #2 MAIN_PRGRM -  2
Rung #550
|MANUAL MOTOR                                                        MANUAL MOTOR |
|20 ON                                                               21 OFF       |
|MM20ON                                                              MM21OFF      |
|   N7:24                                                             N7:22       |
|---]/[--------------------------------------------------------------( )---------|
|    2                                                                 5          |
|[568]                                                                            |
```

```
_F:N7:21(X21 - BTW - File #2 MAIN_PRGRM - 2
Rung #551                                   - 388 -
| MANUAL
| CONTROL
| MOTOR 3
| OFF                                                              MANUAL MOTOR
| M-MCOF3                                                          3 ON
|   N7:0                                                           MM3ON
|                                                                    N7:23
|---] [------+-------------------------------------------------------(U)----|
|     3      |                                                        1
| [3]        |
|            | N7:23/1 - ] [ - File #2 MAIN_PRGRM - 185, 187
|            |           ]/[ - File #2 MAIN_PRGRM - 532
|            |           -(L)- - File #2 MAIN_PRGRM - 513
|            | _F:N7:21(X21 - BTW - File #2 MAIN_PRGRM - 2
| PREPARE FOR|
| AUTO RUN   |
| >AUTO      |
|    N7:37   |
|----] [-----+
|      1
| [162]
Rung #552
| MANUAL
| CONTROL
| MOTOR 4
| OFF                                                              MANUAL MOTOR
| M-MCOF4                                                          4 ON
|   N7:0                                                           MM4ON
|                                                                    N7:23
|---] [------+-------------------------------------------------------(U)----|
|     4      |                                                        2
| [3]        |
|            | N7:23/2 - ] [ - File #2 MAIN_PRGRM - 190, 192
|            |           ]/[ - File #2 MAIN_PRGRM - 533
|            |           -(L)- - File #2 MAIN_PRGRM - 514
|            | _F:N7:21(X21 - BTW - File #2 MAIN_PRGRM - 2
| PREPARE FOR|
| AUTO RUN   |
| >AUTO      |
|    N7:37   |
|----] [-----+
|      1
| [162]
```

```
Rung #553
| MANUAL
| CONTROL
| MOTOR 5                                                               MANUAL MOTOR
| OFF                                                                   5 ON
| M-MCOF5                                                               MM5ON
|  N7:0                                                                   N7:23
|--] [----------------------------------------------------------------------(U)----|
| |  5    |                                                                  3
| |[3]    |
| |       | N7:23/3 - ] [ - File #2 MAIN_PRGRM - 195, 197
| |       |           ]/[ - File #2 MAIN_PRGRM - 534
| |       |           (L) - File #2 MAIN_PRGRM - 515
| |       | _F:N7:211X21 - BTW - File #2 MAIN_PRGRM - 2
| |PREPARE FOR |
| |AUTO RUN    |
| |>AUTO       |
| |   N7:37    |
| |----] [-----|
|        1
| [162]
Rung #554
| MANUAL
| CONTROL
| MOTOR 6                                                               MANUAL MOTOR
| OFF                                                                   6 ON
| M-MCOF6                                                               MM6ON
|  N7:0                                                                   N7:23
|--] [----------------------------------------------------------------------(U)----|
| |  6    |                                                                  4
| |[3]    |
| |       | N7:23/4 - ] [ - File #2 MAIN_PRGRM - 218, 220
| |       |           ]/[ - File #2 MAIN_PRGRM - 535
| |       |           (L) - File #2 MAIN_PRGRM - 516
| |       | _F:N7:211X21 - BTW - File #2 MAIN_PRGRM - 2
| |PREPARE FOR |
| |AUTO RUN    |
| |>AUTO       |
| |   N7:37    |
| |----] [-----|
|        1
| [162]
Rung #555
| MANUAL
| CONTROL
| MOTOR 7                                                               MANUAL MOTOR
| OFF                                                                   7 ON
| M-MCOF7                                                               MM7ON
|  N7:0                                                                   N7:23
|--] [----------------------------------------------------------------------(U)----|
| |  7    |                                                                  5
| |[3]    |
| |       | N7:23/5 - ] [ - File #2 MAIN_PRGRM - 231, 233
| |       |           ]/[ - File #2 MAIN_PRGRM - 536
| |       |           (L) - File #2 MAIN_PRGRM - 517
| |       | _F:N7:211X21 - BTW - File #2 MAIN_PRGRM - 2
| |PREPARE FOR |
| |AUTO RUN    |
| |>AUTO       |
| |   N7:37    |
| |----] [-----|
|        1
| [162]
```

```
Rung #556
  MANUAL
  CONTROL
  MOTOR 8
  OFF
  M-MCOF8                                                        MANUAL MOTOR
  N7:0                                                           8 ON
                                                                 MM8ON
                                                                 N7:23
--] [------------------------------------------------------------(U)--
   8                                                              6
 [3]
            N7:23/6 - ] [ - File #2 MAIN_PRGRM - 249
                      ]/[ - File #2 MAIN_PRGRM - 537
                      (L) - File #2 MAIN_PRGRM - 518
            _F:N7:21[X21 - BTW - File #2 MAIN_PRGRM - 2
 PREPARE FOR
 AUTO RUN
 >AUTO
   N7:37
 --] [--
    1
 [162]
Rung #557
  MANUAL
  CONTROL
  MOTOR 9
  OFF
  M-MCOF9                                                        MANUAL MOTOR
  N7:0                                                           9 ON
                                                                 MM9ON
                                                                 N7:23
--] [------------------------------------------------------------(U)--
   9                                                              7
 [3]
            N7:23/7 - ] [ - File #2 MAIN_PRGRM - 253, 255
                      ]/[ - File #2 MAIN_PRGRM - 538
                      (L) - File #2 MAIN_PRGRM - 519
            _F:N7:21[X21 - BTW - File #2 MAIN_PRGRM - 2
 PREPARE FOR
 AUTO RUN
 >AUTO
   N7:37
 --] [--
    1
 [162]
Rung #558
  MANUAL
  CONTROL
  MOTOR 10
  OFF
  M-MCOF10                                                       MANUAL MOTOR
  N7:0                                                           10 ON
                                                                 MM10ON
                                                                 N7:23
--] [------------------------------------------------------------(U)--
   10                                                             8
 [3]
            N7:23/8 - ] [ - File #2 MAIN_PRGRM - 258, 260
                      ]/[ - File #2 MAIN_PRGRM - 539
                      (L) - File #2 MAIN_PRGRM - 520
            _F:N7:21[X21 - BTW - File #2 MAIN_PRGRM - 2
 PREPARE FOR
 AUTO RUN
 >AUTO
   N7:37
 --] [--
    1
 [162]
```

Rung #559

```
MANUAL
CONTROL
MOTOR 11
OFF                                                      MANUAL MOTOR
M-MCOF11                                                 11 ON
  N7:0                                                   MM11ON
                                                           N7:23
--| |--------------------------------------------------------(U)---
   11                                                        9
[3]
       N7:23/9 - -| |- - File #2 MAIN_PRGRM - 263, 265
                 -|/|- - File #2 MAIN_PRGRM - 540
                 -(L)- - File #2 MAIN_PRGRM - 521
       _F:N7:21[X21 - BTW - File #2 MAIN_PRGRM - 2
PREPARE FOR
AUTO RUN
>AUTO
  N7:37
--| |--
   1
[162]
```

Rung #560

```
MANUAL
CONTROL
MOTOR 12
OFF                                                      MANUAL MOTOR
M-MCOF12                                                 12 ON
  N7:0                                                   MM12ON
                                                           N7:23
--| |--------------------------------------------------------(U)---
   12                                                        10
[3]
       N7:23/10 - -| |- - File #2 MAIN_PRGRM - 281
                  -|/|- - File #2 MAIN_PRGRM - 541
                  -(L)- - File #2 MAIN_PRGRM - 522
       _F:N7:21[X21 - BTW - File #2 MAIN_PRGRM - 2
PREPARE FOR
AUTO RUN
>AUTO
  N7:37
--| |--
   1
[162]
```

Rung #561

```
MANUAL
CONTROL
MOTOR 13
OFF                                                      MANUAL MOTOR
M-MCOF13                                                 13 ON
  N7:0                                                   MM13ON
                                                           N7:23
--| |--------------------------------------------------------(U)---
   13                                                        11
[3]
       N7:23/11 - -| |- - File #2 MAIN_PRGRM - 285, 287
                  -|/|- - File #2 MAIN_PRGRM - 542
                  -(L)- - File #2 MAIN_PRGRM - 523
       _F:N7:21[X21 - BTW - File #2 MAIN_PRGRM - 2
PREPARE FOR
AUTO RUN
>AUTO
  N7:37
--| |--
   1
[162]
```

Rung #562

```
MANUAL                                                           MANUAL MOTOR
CONTROL                                                          14 ON
MOTOR 14                                                         MM14ON
OFF                                                              N7:23
M-MCOF14                                                         -(U)-
N7:0                                                             12
-| |-  14
[3]
      N7:23/12 - -| |- - File #2 MAIN_PRGRM - 290, 292
                 -|/|- - File #2 MAIN_PRGRM - 543
                 -(L)- - File #2 MAIN_PRGRM - 524
      _F:N7:21[X21 - BTW - File #2 MAIN_PRGRM - 2
PREPARE FOR
AUTO RUN
>AUTO
N7:37
-| |-  1
[162]
```

Rung #563

```
MANUAL                                                           MANUAL MOTOR
CONTROL                                                          15 ON
MOTOR 15                                                         MM15ON
OFF                                                              N7:23
M-MCOF15                                                         -(U)-
N7:0                                                             13
-| |-  15
[3]
      N7:23/13 - -| |- - File #2 MAIN_PRGRM - 295, 297
                 -|/|- - File #2 MAIN_PRGRM - 544
                 -(L)- - File #2 MAIN_PRGRM - 525
      _F:N7:21[X21 - BTW - File #2 MAIN_PRGRM - 2
PREPARE FOR
AUTO RUN
>AUTO
N7:37
-| |-  1
[162]
```

Rung #564

```
MANUAL                                                           MANUAL MOTOR
CONTROL                                                          16 ON
MOTOR 16                                                         MM16ON
OFF                                                              N7:23
M-MCOF16                                                         -(U)-
N7:1                                                             14
-| |-  0
[3]
      N7:23/14 - -| |- - File #2 MAIN_PRGRM - 306
                 -|/|- - File #2 MAIN_PRGRM - 545
                 -(L)- - File #2 MAIN_PRGRM - 526
      _F:N7:21[X21 - BTW - File #2 MAIN_PRGRM - 2
PREPARE FOR
AUTO RUN
>AUTO
N7:37
-| |-  1
[162]
```

Rung #565

```
MANUAL
CONTROL
MOTOR 17                                                      MANUAL MOTOR
OFF                                                           17 ON
M-MCOF17                                                      MM17ON
  N7:1                                                          N7:23
--] [----------------------------------------------------------------(U)--
   1                                                              15
[3]
            N7:23/15 - ] [ - File #2 MAIN_PRGRM - 310, 312
                       ]/[ - File #2 MAIN_PRGRM - 546
                       -(L)- - File #2 MAIN_PRGRM - 527
            _F:N7:21[X21 - BTW - File #2 MAIN_PRGRM - 2
PREPARE FOR
AUTO RUN
>AUTO
  N7:37
--] [--
   1
[162]
```

Rung #566

```
MANUAL
CONTROL
MOTOR 18                                                      MANUAL MOTOR
OFF                                                           18 ON
M-MCOF18                                                      MM18ON
  N7:1                                                          N7:24
--] [----------------------------------------------------------------(U)--
   2                                                              0
[3]
            N7:24/0 - ] [ - File #2 MAIN_PRGRM - 315, 317
                      ]/[ - File #2 MAIN_PRGRM - 547
                      -(L)- - File #2 MAIN_PRGRM - 528
            _F:N7:21[X21 - BTW - File #2 MAIN_PRGRM - 2
PREPARE FOR
AUTO RUN
>AUTO
  N7:37
--] [--
   1
[162]
```

Rung #567

```
MANUAL
CONTROL
MOTOR 19                                                      MANUAL MOTOR
OFF                                                           19 ON
M-MCOF19                                                      MM19ON
  N7:1                                                          N7:24
--] [----------------------------------------------------------------(U)--
   3                                                              1
[3]
            N7:24/1 - ] [ - File #2 MAIN_PRGRM - 320, 322
                      ]/[ - File #2 MAIN_PRGRM - 548
                      -(L)- - File #2 MAIN_PRGRM - 529
            _F:N7:21[X21 - BTW - File #2 MAIN_PRGRM - 2
PREPARE FOR
AUTO RUN
>AUTO
  N7:37
--] [--
   1
[162]
```

Rung #568

```
| MANUAL
| CONTROL
| MOTOR 20
| OFF                                                                MANUAL MOTOR
| M-MCOF20                                                           20 ON
|   N7:1                                                             MM20ON
|---] [----+                                                         N7:24
|  | 4     |-----------------------------------------------------------(U)------|
|  |[3]    |                                                           2
|  |       | N7:24/2 - ] [ - File #2 MAIN_PRGRM - 331, 333
|  |       |          ]/[ - File #2 MAIN_PRGRM - 549, 550
|  |       |          -(L)- - File #2 MAIN_PRGRM - 530
|  |       | _F:N7:21[X21 - BTW - File #2 MAIN_PRGRM - 2
|  |PREPARE FOR |
|  |AUTO RUN    |
|  |>AUTO       |
|  |   N7:37    |
|  +---] [------+
|       1
| [162]
```

Rung #569

```
| MANUAL
| CONTROL
| MOTOR 21
| OFF                                                                MANUAL MOTOR
| M-MCOF21                                                           21 ON
|   N7:1                                                             MM21ON
|---] [----+                                                         N7:24
|  | 5     |-----------------------------------------------------------(U)------|
|  |[3]    |                                                           3
|  |       | N7:24/3 - ] [ - File #2 MAIN_PRGRM - 355, 357
|  |       |          -(L)- - File #2 MAIN_PRGRM - 531
|  |       | _F:N7:21[X21 - BTW - File #2 MAIN_PRGRM - 2
|  |PREPARE FOR |
|  |AUTO RUN    |
|  |>AUTO       |
|  |   N7:37    |
|  +---] [------+
|       1
| [162]
```

Rung #570

```
|MOTOR 3                                                              MOTOR 3
|REVERSE                                                              REVERSE
|ENABLE                                                               M3R
|M3RE                                                                   B3
| N7:19                                                              +--(L)--+
|--] [------------------------------------------------------------------+  103   |
|   2                                                                 |        |
|[3]                                                                  |MANUAL  |
|                                                                     |MOTOR 3 |
| B3/103 - -] [- - File #2 MAIN_PRGRM - 187                           |REVERSE |
|          -]/[- - File #2 MAIN_PRGRM - 185                           |ENABLE  |
|          -(U)- - File #2 MAIN_PRGRM - 589                           |MM3RE   |
| N7:40/2 - -(U)- - File #2 MAIN_PRGRM - 589                          | N7:40  |
| _F:N7:21[X21 - BTW - File #2 MAIN_PRGRM - 2                         |--(L)---|
| N7:34/15 - -(L)- - File #2 MAIN_PRGRM - 589                         |  2     |
| _F:N7:21[X21 - BTW - File #2 MAIN_PRGRM - 2                         |MANUAL  |
|                                                                     |MOTOR 3 |
|                                                                     |REVERSE |
|                                                                     |DISABLE |
|                                                                     |MM3RD   |
|                                                                     | N7:34  |
|                                                                     +--(U)---+
|                                                                        15
```

Rung #571

```
|MOTOR 4                                                              MOTOR 4
|REVERSE                                                              REVERSE
|ENABLE                                                               M4R
|M4RE                                                                   B3
| N7:19                                                              +--(L)--+
|--] [------------------------------------------------------------------+  104   |
|   3                                                                 |        |
|[3]                                                                  |MANUAL  |
|                                                                     |MOTOR 4 |
| B3/104 - -] [- - File #2 MAIN_PRGRM - 192                           |REVERSE |
|          -]/[- - File #2 MAIN_PRGRM - 190                           |ENABLE  |
|          -(U)- - File #2 MAIN_PRGRM - 590                           |MM4RE   |
| N7:40/3 - -(U)- - File #2 MAIN_PRGRM - 590                          | N7:40  |
| _F:N7:21[X21 - BTW - File #2 MAIN_PRGRM - 2                         |--(L)---|
| N7:35/0 - -(L)- - File #2 MAIN_PRGRM - 590                          |  3     |
| _F:N7:21[X21 - BTW - File #2 MAIN_PRGRM - 2                         |MANUAL  |
|                                                                     |MOTOR 4 |
|                                                                     |REVERSE |
|                                                                     |DISABLE |
|                                                                     |MM4RD   |
|                                                                     | N7:35  |
|                                                                     +--(U)---+
|                                                                        0
```

Rung #572

```
|MOTOR 5                                                     MOTOR 5
|REVERSE                                                     REVERSE
|ENABLE                                                      MSR
|M5RE                                                          B3
|  N7:19                                                      
|---| |-------------------------------------------------------+--(L)--+
|     4                                                       |  105  |
|[3]                                                          |       |
|                                                             |MANUAL |
| B3/105 - -| |- - File #2 MAIN_PRGRM - 197                   |MOTOR 5|
|          -|/|- - File #2 MAIN_PRGRM - 195                   |REVERSE|
|          -(U)- - File #2 MAIN_PRGRM - 591                   |ENABLE |
| N7:40/4 - -(U)- - File #2 MAIN_PRGRM - 591                  |MM5RE  |
| _F:N7:211X21 - BTW - File #2 MAIN_PRGRM - 2                 | N7:40 |
| N7:35/1 - -(L)- - File #2 MAIN_PRGRM - 591                  +--(L)--+
| _F:N7:211X21 - BTW - File #2 MAIN_PRGRM - 2                 |   4   |
|                                                             |MANUAL |
|                                                             |MOTOR 5|
|                                                             |REVERSE|
|                                                             |DISABLE|
|                                                             |MM5RD  |
|                                                             | N7:35 |
|                                                             +--(U)--+
                                                                  1
```

Rung #573

```
|MOTOR 6                                                     MOTOR 6
|REVERSE                                                     REVERSE
|ENABLE                                                      M6R
|M6RE                                                          B3
|  N7:19                                                      
|---| |-------------------------------------------------------+--(L)--+
|     5                                                       |  106  |
|[3]                                                          |       |
|                                                             |MANUAL |
| B3/106 - -| |- - File #2 MAIN_PRGRM - 220                   |MOTOR 6|
|          -|/|- - File #2 MAIN_PRGRM - 218                   |REVERSE|
|          -(U)- - File #2 MAIN_PRGRM - 592                   |ENABLE |
| N7:40/5 - -(U)- - File #2 MAIN_PRGRM - 592                  |MM6RE  |
| _F:N7:211X21 - BTW - File #2 MAIN_PRGRM - 2                 | N7:40 |
| N7:35/2 - -(L)- - File #2 MAIN_PRGRM - 592                  +--(L)--+
| _F:N7:211X21 - BTW - File #2 MAIN_PRGRM - 2                 |   5   |
|                                                             |MANUAL |
|                                                             |MOTOR 6|
|                                                             |REVERSE|
|                                                             |DISABLE|
|                                                             |MM6RD  |
|                                                             | N7:35 |
|                                                             +--(U)--+
                                                                  2
```

Rung #574

```
|MOTOR 7                                                                     MOTOR 7
|REVERSE                                                                     REVERSE
|ENABLE                                                                      M7R
|M7RE                                                                          B3
|  N7:19                                                                  
|---] [-------------------------------------------------------------------+---(L)---+-
|   6                                                                     |   107   |
|[3]                                                                      |         |
|                                                                         |MANUAL   |
| B3/107 - ] [ - File #2 MAIN_PRGRM - 233                                 |MOTOR 7  |
|          ]/[ - File #2 MAIN_PRGRM - 231                                 |REVERSE  |
|          (U) - File #2 MAIN_PRGRM - 593                                 |ENABLE   |
| N7:40/6 - (U) - File #2 MAIN_PRGRM - 593                                |MM7RE    |
| _F:N7:21[X21 - BTW - File #2 MAIN_PRGRM - 2                             |  N7:40  |
| N7:35/3 - (L) - File #2 MAIN_PRGRM - 593                                +---(L)---+
| _F:N7:21[X21 - BTW - File #2 MAIN_PRGRM - 2                             |   6     |
|                                                                         |MANUAL   |
|                                                                         |MOTOR 7  |
|                                                                         |REVERSE  |
|                                                                         |DISABLE  |
|                                                                         |MM7RD    |
|                                                                         |  N7:35  |
|                                                                         +---(U)---+
                                                                              3
```

Rung #575

```
|MOTOR 8                                                                     MOTOR 8
|REVERSE                                                                     REVERSE
|ENABLE                                                                      M8R
|M8RE                                                                          B3
|  N7:19                                                                  
|---] [-------------------------------------------------------------------+---(L)---+-
|   7                                                                     |   108   |
|[3]                                                                      |         |
|                                                                         |MANUAL   |
| B3/108 - ] [ - File #2 MAIN_PRGRM - 249                                 |MOTOR 8  |
|          ]/[ - File #2 MAIN_PRGRM - 249                                 |REVERSE  |
|          (U) - File #2 MAIN_PRGRM - 594                                 |ENABLE   |
| N7:40/7 - (U) - File #2 MAIN_PRGRM - 594                                |MM8RE    |
| _F:N7:21[X21 - BTW - File #2 MAIN_PRGRM - 2                             |  N7:40  |
| N7:35/4 - (L) - File #2 MAIN_PRGRM - 594                                +---(L)---+
| _F:N7:21[X21 - BTW - File #2 MAIN_PRGRM - 2                             |   7     |
|                                                                         |MANUAL   |
|                                                                         |MOTOR 8  |
|                                                                         |REVERSE  |
|                                                                         |DISABLE  |
|                                                                         |MM8RD    |
|                                                                         |  N7:35  |
|                                                                         +---(U)---+
                                                                              4
```

Rung #576

```
|MOTOR 9                                                              MOTOR 9
|REVERSE                                                              REVERSE
|ENABLE                                                               M9R
|M9RE                                                                   B3
| N7:19
|--] [----------------------------------------------------------------+--(L)--+
|   8                                                                 |  109  |
|[3]                                                                  |       |
|                                                                     |MANUAL |
| B3/109 - -] [- - File #2 MAIN_PRGRM - 255                           |MOTOR 9|
|          -]/[- - File #2 MAIN_PRGRM - 253                           |REVERSE|
|          -(U)- - File #2 MAIN_PRGRM - 595                           |ENABLE |
| N7:40/8 - -(U)- - File #2 MAIN_PRGRM - 595                          |MM9RE  |
| _F:N7:21(X21 - BTW - File #2 MAIN_PRGRM - 2                         | N7:40 |
| N7:35/5 - -(L)- - File #2 MAIN_PRGRM - 595                          +--(L)--+
| _F:N7:21(X21 - BTW - File #2 MAIN_PRGRM - 2                         |   8   |
|                                                                     |MANUAL |
|                                                                     |MOTOR 9|
|                                                                     |REVERSE|
|                                                                     |DISABLE|
|                                                                     |MM9RD  |
|                                                                     | N7:35 |
|                                                                     +--(U)--+
                                                                          5
```

Rung #577

```
|MOTOR 10                                                             MOTOR 10
|REVERSE                                                              REVERSE
|ENABLE                                                               M10R
|M10RE                                                                  B3
| N7:19
|--] [----------------------------------------------------------------+--(L)--+
|   9                                                                 |  110  |
|[3]                                                                  |       |
|                                                                     |MANUAL |
| B3/110 - -] [- - File #2 MAIN_PRGRM - 260                           |MOTOR 10
|          -]/[- - File #2 MAIN_PRGRM - 258                           |REVERSE|
|          -(U)- - File #2 MAIN_PRGRM - 596                           |ENABLE |
| N7:40/9 - -(U)- - File #2 MAIN_PRGRM - 596                          |MM10RE |
| _F:N7:21(X21 - BTW - File #2 MAIN_PRGRM - 2                         | N7:40 |
| N7:35/6 - -(L)- - File #2 MAIN_PRGRM - 596                          +--(L)--+
| _F:N7:21(X21 - BTW - File #2 MAIN_PRGRM - 2                         |   9   |
|                                                                     |MANUAL |
|                                                                     |MOTOR 10
|                                                                     |REVERSE|
|                                                                     |DISABLE|
|                                                                     |MM10RD |
|                                                                     | N7:35 |
|                                                                     +--(L)--+
                                                                          6
```

```
Rung #578
|MOTOR 11                                                          MOTOR 11
|REVERSE                                                           REVERSE
|ENABLE                                                            M11R
|M11RE                                                               B3
|  N7:17
|--] [--------------------------------------------------------------+--(L)--+-
|   10                                                              |  111  |
|[3]                                                                |       |
|                                                                   |MANUAL |
| B3/111 - ] [ - - File #2 MAIN_PRGRM - 265                         |MOTOR 11
|          ]/[ - - File #2 MAIN_PRGRM - 263                         |REVERSE|
|          -(U)- - File #2 MAIN_PRGRM - 597                         |ENABLE |
| N7:40/10 - -(U)- - File #2 MAIN_PRGRM - 597                       |MM11RE |
| _F:N7:21[X21 - BTW - File #2 MAIN_PRGRM - 2                       | N7:40 |
| N7:35/7 - -(L)- - File #2 MAIN_PRGRM - 597                        +--(L)--+
| _F:N7:21[X21 - BTW - File #2 MAIN_PRGRM - 2                       |  10   |
|                                                                   |MANUAL |
|                                                                   |MOTOR 11
|                                                                   |REVERSE|
|                                                                   |DISABLE|
|                                                                   |MM11RD |
|                                                                   | N7:35 |
|                                                                   +--(U)--+
                                                                       7
Rung #579
|MOTOR 12                                                          MOTOR 12
|REVERSE                                                           REVERSE
|ENABLE                                                            M12R
|M12RE                                                               B3
|  N7:19
|--] [--------------------------------------------------------------+--(L)--+-
|   11                                                              |  112  |
|[3]                                                                |       |
|                                                                   |MANUAL |
| B3/112 - ] [ - - File #2 MAIN_PRGRM - 281                         |MOTOR 12
|          ]/[ - - File #2 MAIN_PRGRM - 281                         |REVERSE|
|          -(U)- - File #2 MAIN_PRGRM - 598                         |ENABLE |
| N7:40/11 - -(U)- - File #2 MAIN_PRGRM - 598                       |MM12RE |
| _F:N7:21[X21 - BTW - File #2 MAIN_PRGRM - 2                       | N7:40 |
| N7:35/8 - -(L)- - File #2 MAIN_PRGRM - 598                        +--(L)--+
| _F:N7:21[X21 - BTW - File #2 MAIN_PRGRM - 2                       |  11   |
|                                                                   |MANUAL |
|                                                                   |MOTOR 12
|                                                                   |REVERSE|
|                                                                   |DISABLE|
|                                                                   |MM12RD |
|                                                                   | N7:35 |
|                                                                   +--(U)--+
                                                                       8
```

```
Rung #580
|MOTOR 13                                                              MOTOR 13
|REVERSE                                                               REVERSE
|ENABLE                                                                M13R
|M13RE                                                                    B3
|  N7:19
|--] [-----------------------------------------------------------------+--(L)--+
|   12                                                                 |  113  |
|[3]                                                                   |       |
|                                                                      |MANUAL |
| B3/113 - -] [- - File #2 MAIN_PRGRM - 287                            |MOTOR 13
|          -]/[- - File #2 MAIN_PRGRM - 285                            |REVERSE|
|          -(U)- - File #2 MAIN_PRGRM - 599                            |ENABLE |
| N7:40/12 - -(U)- - File #2 MAIN_PRGRM - 599                          |MM13RE |
| _F:N7:21[X21 - BTW - File #2 MAIN_PRGRM - 2                          | N7:40 |
| N7:35/9 - -(L)- - File #2 MAIN_PRGRM - 599                           +--(L)--+
| _F:N7:21[X21 - BTW - File #2 MAIN_PRGRM - 2                          |  12   |
|                                                                      |MANUAL |
|                                                                      |MOTOR 13
|                                                                      |REVERSE|
|                                                                      |DISABLE|
|                                                                      |MM13RD |
|                                                                      | N7:35 |
|                                                                      +--(U)--+
|                                                                          9
Rung #581
|MOTOR 14                                                              MOTOR 14
|REVERSE                                                               REVERSE
|ENABLE                                                                M14R
|M14RE                                                                    B3
|  N7:19
|--] [-----------------------------------------------------------------+--(L)--+
|   13                                                                 |  114  |
|[3]                                                                   |       |
|                                                                      |MANUAL |
| B3/114 - -] [- - File #2 MAIN_PRGRM - 292                            |MOTOR 14
|          -]/[- - File #2 MAIN_PRGRM - 290                            |REVERSE|
|          -(U)- - File #2 MAIN_PRGRM - 600                            |ENABLE |
| N7:40/13 - -(U)- - File #2 MAIN_PRGRM - 600                          |MM14RE |
| _F:N7:21[X21 - BTW - File #2 MAIN_PRGRM - 2                          | N7:40 |
| N7:35/10 - -(L)- - File #2 MAIN_PRGRM - 600                          +--(L)--+
| _F:N7:21[X21 - BTW - File #2 MAIN_PRGRM - 2                          |  13   |
|                                                                      |MANUAL |
|                                                                      |MOTOR 14
|                                                                      |REVERSE|
|                                                                      |DISABLE|
|                                                                      |MM14RD |
|                                                                      | N7:35 |
|                                                                      +--(U)--+
|                                                                          10
```

```
Rung #582
|MOTOR 15
|REVERSE                                                    MOTOR 15
|ENABLE                                                     REVERSE
|M15RE                                                      M15R
| N7:19                                                       B3
|--] [------------------------------------------------------+--(L)--+
|   14                                                      |  115  |
|(3)                                                        |       |
|                                                           |MANUAL |
| B3/115 - ] [ - File #2 MAIN_PRGRM - 297                   |MOTOR 15
|          ]/[ - File #2 MAIN_PRGRM - 295                   |REVERSE|
|          -(U)- - File #2 MAIN_PRGRM - 601                 |ENABLE |
| N7:40/14 - -(U)- - File #2 MAIN_PRGRM - 601               |MM15RE |
| _F:N7:21(X21 - BTW - File #2 MAIN_PRGRM - 2               | N7:40 |
| N7:35/11 - -(L)- - File #2 MAIN_PRGRM - 601               +--(L)--+
| _F:N7:21(X21 - BTW - File #2 MAIN_PRGRM - 2               |  14   |
|                                                           |MANUAL |
|                                                           |MOTOR 15
|                                                           |REVERSE|
|                                                           |DISABLE|
|                                                           |MM15RD |
|                                                           | N7:35 |
|                                                           +--(U)--+
|                                                              11
Rung #583
|MOTOR 16
|REVERSE                                                    MOTOR 16
|ENABLE                                                     REVERSE
|M16RE                                                      M16R
| N7:19                                                       B3
|--] [------------------------------------------------------+--(L)--+
|   15                                                      |  116  |
|(3)                                                        |       |
|                                                           |MANUAL |
| B3/116 - ] [ - File #2 MAIN_PRGRM - 306                   |MOTOR 16
|          ]/[ - File #2 MAIN_PRGRM - 306                   |REVERSE|
|          -(U)- - File #2 MAIN_PRGRM - 602                 |ENABLE |
| N7:40/15 - -(U)- - File #2 MAIN_PRGRM - 602               |MM16RE |
| _F:N7:21(X21 - BTW - File #2 MAIN_PRGRM - 2               | N7:40 |
| N7:35/12 - -(L)- - File #2 MAIN_PRGRM - 602               +--(L)--+
| _F:N7:21(X21 - BTW - File #2 MAIN_PRGRM - 2               |  15   |
|                                                           |MANUAL |
|                                                           |MOTOR 16
|                                                           |REVERSE|
|                                                           |DISABLE|
|                                                           |MM16RD |
|                                                           | N7:35 |
|                                                           +--(U)--+
|                                                              12
```

- 402 -

```
Rung #584
|MOTOR 17                                                        MOTOR 17
|REVERSE                                                         REVERSE
|ENABLE                                                          M17R
|M17RE                                                              B3
|  N7:20
|--] [-----------------------------------------------------------+--(L)--+-
|    0                                                           |  117  |
|[3]                                                             |       |
|                                                                |MANUAL |
| B3/117 - -] [- - File #2 MAIN_PRGRM - 312                      |MOTOR 17
|          -]/[- - File #2 MAIN_PRGRM - 310                      |REVERSE|
|          -(U)- - File #2 MAIN_PRGRM - 603                      |ENABLE |
| N7:41/0 - -(U)- - File #2 MAIN_PRGRM - 603                     |MM17RE |
| _F:N7:21[%21 - BTW - File #2 MAIN_PRGRM - 2                    | N7:41 |
| N7:35/13 - -(L)- - File #2 MAIN_PRGRM - 603                    +--(L)--+
| _F:N7:21[%21 - BTW - File #2 MAIN_PRGRM - 2                    |   0   |
|                                                                |MANUAL |
|                                                                |MOTOR 17
|                                                                |REVERSE|
|                                                                |DISABLE|
|                                                                |MM17RD |
|                                                                | N7:35 |
|                                                                +--(U)--+
|                                                                   13
Rung #585
|MOTOR 18                                                        MOTOR 18
|REVERSE                                                         REVERSE
|ENABLE                                                          M18R
|M18RE                                                              B3
|  N7:20
|--] [-----------------------------------------------------------+--(L)--+-
|    1                                                           |  118  |
|[3]                                                             |       |
|                                                                |MANUAL |
| B3/118 - -] [- - File #2 MAIN_PRGRM - 317                      |MOTOR 18
|          -]/[- - File #2 MAIN_PRGRM - 315                      |REVERSE|
|          -(U)- - File #2 MAIN_PRGRM - 604                      |ENABLE |
| N7:41/1 - -(U)- - File #2 MAIN_PRGRM - 604                     |MM18RE |
| _F:N7:21[%21 - BTW - File #2 MAIN_PRGRM - 2                    | N7:41 |
| N7:35/14 - -(L)- - File #2 MAIN_PRGRM - 604                    +--(L)--+
| _F:N7:21[%21 - BTW - File #2 MAIN_PRGRM - 2                    |   1   |
|                                                                |MANUAL |
|                                                                |MOTOR 18
|                                                                |REVERSE|
|                                                                |DISABLE|
|                                                                |MM18RD |
|                                                                | N7:35 |
|                                                                +--(U)--+
|                                                                   14
```

- 403 -

Rung #586

```
|MOTOR 19                                                          MOTOR 19
|REVERSE                                                           REVERSE
|ENABLE                                                            M19R
|M19RE                                                               B3
| N7:20
|--] [------------------------------------------------------------+--(L)--+
|   2                                                             |  119  |
|[3]                                                              |       |
|                                                                 |MANUAL |
| B3/119 - ] [ - File #2 MAIN_PRGRM - 322                         |MOTOR 19
|          ]/[ - File #2 MAIN_PRGRM - 320                         |REVERSE|
|          -(U)- - File #2 MAIN_PRGRM - 605                       |ENABLE |
| N7:41/2 - -(U)- - File #2 MAIN_PRGRM - 605                      |MM19RE |
| _F:N7:21[X21 - BTW - File #2 MAIN_PRGRM - 2                     | N7:41 |
| N7:35/15 - -(L)- - File #2 MAIN_PRGRM - 605                     +--(L)--+
| _F:N7:21[X21 - BTW - File #2 MAIN_PRGRM - 2                     |   2   |
|                                                                 |MANUAL |
|                                                                 |MOTOR 19
|                                                                 |REVERSE|
|                                                                 |DISABLE|
|                                                                 |MM19RD |
|                                                                 | N7:35 |
|                                                                 +--(U)--+
                                                                     15
```

Rung #587

```
|MOTOR 20                                                          MOTOR 20
|REVERSE                                                           REVERSE
|ENABLE                                                            M20R
|M20RE                                                               B3
| N7:20
|--] [------------------------------------------------------------+--(L)--+
|   3                                                             |  120  |
|[3]                                                              |       |
|                                                                 |MANUAL |
| B3/120 - ] [ - File #2 MAIN_PRGRM - 333                         |MOTOR 20
|          ]/[ - File #2 MAIN_PRGRM - 331                         |REVERSE|
|          -(U)- - File #2 MAIN_PRGRM - 606                       |ENABLE |
| N7:41/3 - -(U)- - File #2 MAIN_PRGRM - 606                      |MM20RE |
| _F:N7:21[X21 - BTW - File #2 MAIN_PRGRM - 2                     | N7:41 |
| N7:36/0 - -(L)- - File #2 MAIN_PRGRM - 606                      +--(L)--+
| _F:N7:21[X21 - BTW - File #2 MAIN_PRGRM - 2                     |   3   |
|                                                                 |MANUAL |
|                                                                 |MOTOR 20
|                                                                 |REVERSE|
|                                                                 |DISABLE|
|                                                                 |MM20RD |
|                                                                 | N7:36 |
|                                                                 +--(U)--+
                                                                     0
```

Rung #588

```
|MOTOR 21                                                          MOTOR 21
|REVERSE                                                           REVERSE
|ENABLE                                                            M21R
|M21RE                                                               B3
| N7:20
|--] [------------------------------------------------------------+--(L)--+
|   4                                                              |  121  |
|[3]                                                               |       |
|                                                                  |MANUAL |
| B3/121 - -] [- - File #2 MAIN_PRGRM - 357                        |MOTOR 21
|          -]/[- - File #2 MAIN_PRGRM - 355                        |REVERSE|
|          -(U)- - File #2 MAIN_PRGRM - 607                        |ENABLE |
| N7:41/4 - -(U)- - File #2 MAIN_PRGRM - 607                       |MM21_RE|
| _F:N7:21[X21 - BTW - File #2 MAIN_PRGRM - 2                      | N7:41 |
| N7:36/1 - -(L)- - File #2 MAIN_PRGRM - 607                       +--(L)--+
| _F:N7:21[X21 - BTW - File #2 MAIN_PRGRM - 2                      |   4   |
|                                                                  |MANUAL |
|                                                                  |MOTOR 21
|                                                                  |REVERSE|
|                                                                  |DISABLE|
|                                                                  |MM21RD |
|                                                                  | N7:36 |
|                                                                  +--(U)--+
                                                                       1
```

Rung #589

```
| MOTOR 3                                                          MOTOR 3
| REVERSE                                                          REVERSE
| DISABLE                                                          M3R
| M3RD                                                               B3
|   N7:13
|-+--] [---+-------------------------------------------------------+--(U)--+
| |   15   |                                                       |  103  |
| |[3]     |                                                       |       |
| |        | B3/103 - -] [- - File #2 MAIN_PRGRM - 187             |MANUAL |
| |        |          -]/[- - File #2 MAIN_PRGRM - 185             |MOTOR 3|
| |        |          -(L)- - File #2 MAIN_PRGRM - 570             |REVERSE|
| |        | N7:40/2 - -(L)- - File #2 MAIN_PRGRM - 570            |ENABLE |
| |PREPARE FOR | _F:N7:21[X21 - BTW - File #2 MAIN_PRGRM - 2       |MM3RE  |
| |AUTO RUN    | N7:34/15 - -(U)- - File #2 MAIN_PRGRM - 570       | N7:40 |
| |>AUTO       | _F:N7:21[X21 - BTW - File #2 MAIN_PRGRM - 2       +--(U)--+
| |  N7:37 |                                                       |   2   |
| +--] [---+                                                       |       |
|     1                                                            |MANUAL |
|  [162]                                                           |MOTOR 3|
|                                                                  |REVERSE|
|                                                                  |DISABLE|
|                                                                  |MM3RD  |
|                                                                  | N7:34 |
|                                                                  +--(L)--+
                                                                      15
```

Rung #590

```
MOTOR 4                                                           MOTOR 4
REVERSE                                                           REVERSE
DISABLE                                                           M4R
M4RD                                                                B3
 N7:14                                                            -(U)-
--] [--                                                            104
    0
 [3]                                                              MANUAL
       B3/104 - -] [- - File #2 MAIN_PRGRM - 192                   MOTOR 4
                -]/[- - File #2 MAIN_PRGRM - 190                   REVERSE
                -(L)- - File #2 MAIN_PRGRM - 571                   ENABLE
       N7:40/3 - -(L)- - File #2 MAIN_PRGRM - 571                  MM4RE
PREPARE FOR  _F:N7:21[X21 - BTW - File #2 MAIN_PRGRM - 2            N7:40
AUTO RUN     N7:35/0 - -(U)- - File #2 MAIN_PRGRM - 571             -(U)-
>AUTO        _F:N7:21[X21 - BTW - File #2 MAIN_PRGRM - 2              3
 N7:37
--] [--                                                            MANUAL
    1                                                              MOTOR 4
 [162]                                                             REVERSE
                                                                   DISABLE
                                                                   MM4RD
                                                                    N7:35
                                                                    -(L)-
                                                                      0
```

Rung #591

```
MOTOR 5                                                           MOTOR 5
REVERSE                                                           REVERSE
DISABLE                                                           M5R
M5RD                                                                B3
 N7:14                                                            -(U)-
--] [--                                                            105
    1
 [3]                                                              MANUAL
       B3/105 - -] [- - File #2 MAIN_PRGRM - 197                   MOTOR 5
                -]/[- - File #2 MAIN_PRGRM - 195                   REVERSE
                -(L)- - File #2 MAIN_PRGRM - 572                   ENABLE
       N7:40/4 - -(L)- - File #2 MAIN_PRGRM - 572                  MM5RE
PREPARE FOR  _F:N7:21[X21 - BTW - File #2 MAIN_PRGRM - 2            N7:40
AUTO RUN     N7:35/1 - -(U)- - File #2 MAIN_PRGRM - 572             -(U)-
>AUTO        _F:N7:21[X21 - BTW - File #2 MAIN_PRGRM - 2              4
 N7:37
--] [--                                                            MANUAL
    1                                                              MOTOR 5
 [162]                                                             REVERSE
                                                                   DISABLE
                                                                   MM5RD
                                                                    N7:35
                                                                    -(L)-
                                                                      1
```

```
Rung #592
| MOTOR 6                                                                                    MOTOR 6
| REVERSE                                                                                    REVERSE
| DISABLE                                                                                    M6R
| M6RD                                                                                        B3
|  N7:14
|--] [---------------------------------------------------------------------------------------+--(U)--+
|    2                                                                                        | 106
| [3]                                                                                         |
|        | B3/106 - ] [ - File #2 MAIN_PRGRM - 220                                            |MANUAL
|        |          ]/[ - File #2 MAIN_PRGRM - 218                                            |MOTOR 6
|        |          -(L)- - File #2 MAIN_PRGRM - 573                                          |REVERSE
|        | N7:40/5 - -(L)- - File #2 MAIN_PRGRM - 573                                         |ENABLE
|PREPARE FOR | _F:N7:21L%21 - BTW - File #2 MAIN_PRGRM - 2                                    |MM6RE
|AUTO RUN    | N7:35/2 - -(U)- - File #2 MAIN_PRGRM - 573                                     | N7:40
|>AUTO       | _F:N7:21L%21 - BTW - File #2 MAIN_PRGRM - 2                                    +--(U)--+
|  N7:37                                                                                      |  5
|--] [---                                                                                     |
|    1                                                                                        |MANUAL
| [162]                                                                                       |MOTOR 6
|                                                                                             |REVERSE
|                                                                                             |DISABLE
|                                                                                             |MM6RD
|                                                                                             | N7:35
|                                                                                             +--(L)--+
|                                                                                                2
Rung #593
| MOTOR 7                                                                                    MOTOR 7
| REVERSE                                                                                    REVERSE
| DISABLE                                                                                    M7R
| M7RD                                                                                        B3
|  N7:14
|--] [---------------------------------------------------------------------------------------+--(U)--+
|    3                                                                                        | 107
| [3]                                                                                         |
|        | B3/107 - ] [ - File #2 MAIN_PRGRM - 233                                            |MANUAL
|        |          ]/[ - File #2 MAIN_PRGRM - 231                                            |MOTOR 7
|        |          -(L)- - File #2 MAIN_PRGRM - 574                                          |REVERSE
|        | N7:40/6 - -(L)- - File #2 MAIN_PRGRM - 574                                         |ENABLE
|PREPARE FOR | _F:N7:21L%21 - BTW - File #2 MAIN_PRGRM - 2                                    |MM7RE
|AUTO RUN    | N7:35/3 - -(U)- - File #2 MAIN_PRGRM - 574                                     | N7:40
|>AUTO       | _F:N7:21L%21 - BTW - File #2 MAIN_PRGRM - 2                                    +--(U)--+
|  N7:37                                                                                      |  6
|--] [---                                                                                     |
|    1                                                                                        |MANUAL
| [162]                                                                                       |MOTOR 7
|                                                                                             |REVERSE
|                                                                                             |DISABLE
|                                                                                             |MM7RD
|                                                                                             | N7:35
|                                                                                             +--(L)--+
|                                                                                                3
```

Rung #594

```
MOTOR 8                                                   MOTOR 8
REVERSE                                                   REVERSE
DISABLE                                                   M8R
M8RD                                                      B3
N7:14                                                     -(U)-
-| |-                                                     108
 4
[3]      B3/108 - -| |- - File #2 MAIN_PRGRM - 249         MANUAL
                  -|/|- - File #2 MAIN_PRGRM - 249         MOTOR 8
                  -(L)- - File #2 MAIN_PRGRM - 575         REVERSE
         N7:40/7 - -(L)- - File #2 MAIN_PRGRM - 575        ENABLE
PREPARE FOR  _F:N7:21(X21 - BTW - File #2 MAIN_PRGRM - 2   MM8RE
AUTO RUN     N7:35/4 - -(U)- - File #2 MAIN_PRGRM - 575    N7:40
>AUTO        _F:N7:21(X21 - BTW - File #2 MAIN_PRGRM - 2   -(U)-
N7:37                                                      7
-| |-
 1                                                         MANUAL
[162]                                                      MOTOR 8
                                                           REVERSE
                                                           DISABLE
                                                           MM8RD
                                                           N7:35
                                                           -(L)-
                                                           4
```

Rung #595

```
MOTOR 9                                                   MOTOR 9
REVERSE                                                   REVERSE
DISABLE                                                   M9R
M9RD                                                      B3
N7:14                                                     -(U)-
-| |-                                                     109
 5
[3]      B3/109 - -| |- - File #2 MAIN_PRGRM - 255         MANUAL
                  -|/|- - File #2 MAIN_PRGRM - 253         MOTOR 9
                  -(L)- - File #2 MAIN_PRGRM - 576         REVERSE
         N7:40/8 - -(L)- - File #2 MAIN_PRGRM - 576        ENABLE
PREPARE FOR  _F:N7:21(X21 - BTW - File #2 MAIN_PRGRM - 2   MM9RE
AUTO RUN     N7:35/5 - -(U)- - File #2 MAIN_PRGRM - 576    N7:40
>AUTO        _F:N7:21(X21 - BTW - File #2 MAIN_PRGRM - 2   -(U)-
N7:37                                                      8
-| |-
 1                                                         MANUAL
[162]                                                      MOTOR 9
                                                           REVERSE
                                                           DISABLE
                                                           MM9RD
                                                           N7:35
                                                           -(L)-
                                                           5
```

Rung #596

```
| MOTOR 10                                                                                  |
| REVERSE                                                                 MOTOR 10          |
| DISABLE                                                                 REVERSE           |
| M10RD                                                                   M10R              |
|   N7:14                                                                    B3             |
|-+--] [---+------------------------------------------------------------+---(U)---+--------|
| |    6    |                                                            |   110    |        |
| | [3]     |                                                            |          |        |
| |         | B3/110 - ] [ - File #2 MAIN_PRGRM - 260                    |MANUAL    |        |
| |         |          ]/[ - File #2 MAIN_PRGRM - 258                    |MOTOR 10  |        |
| |         |          -(L)- - File #2 MAIN_PRGRM - 577                  |REVERSE   |        |
| |         | N7:40/9 - -(L)- - File #2 MAIN_PRGRM - 577                 |ENABLE    |        |
| |PREPARE FOR | _F:N7:211X21 - BTW - File #2 MAIN_PRGRM - 2             |MM10RE    |        |
| |AUTO RUN  | N7:35/6 - -(L)- - File #2 MAIN_PRGRM - 577                | N7:40    |        |
| |>AUTO     | _F:N7:211X21 - BTW - File #2 MAIN_PRGRM - 2               +---(U)----+        |
| |  N7:37   |                                                           |    9     |        |
| +----] [---+                                                           |          |        |
|       1                                                                |MANUAL    |        |
|  [162]                                                                 |MOTOR 10  |        |
|                                                                        |REVERSE   |        |
|                                                                        |DISABLE   |        |
|                                                                        |MM10RD    |        |
|                                                                        | N7:35    |        |
|                                                                        +---(L)----+        |
|                                                                            6               |
```

Rung #597

```
| MOTOR 11                                                                                  |
| REVERSE                                                                 MOTOR 11          |
| DISABLE                                                                 REVERSE           |
| M11RD                                                                   M11R              |
|   N7:14                                                                    B3             |
|-+--] [---+------------------------------------------------------------+---(U)---+--------|
| |    7    |                                                            |   111    |        |
| | [3]     |                                                            |          |        |
| |         | B3/111 - ] [ - File #2 MAIN_PRGRM - 265                    |MANUAL    |        |
| |         |          ]/[ - File #2 MAIN_PRGRM - 263                    |MOTOR 11  |        |
| |         |          -(L)- - File #2 MAIN_PRGRM - 578                  |REVERSE   |        |
| |         | N7:40/10 - -(L)- - File #2 MAIN_PRGRM - 578                |ENABLE    |        |
| |PREPARE FOR | _F:N7:211X21 - BTW - File #2 MAIN_PRGRM - 2             |MM11RE    |        |
| |AUTO RUN  | N7:35/7 - -(U)- - File #2 MAIN_PRGRM - 578                | N7:40    |        |
| |>AUTO     | _F:N7:211X21 - BTW - File #2 MAIN_PRGRM - 2               +---(U)----+        |
| |  N7:37   |                                                           |    10    |        |
| +----] [---+                                                           |          |        |
|       1                                                                |MANUAL    |        |
|  [162]                                                                 |MOTOR 11  |        |
|                                                                        |REVERSE   |        |
|                                                                        |DISABLE   |        |
|                                                                        |MM11RD    |        |
|                                                                        | N7:35    |        |
|                                                                        +---(L)----+        |
|                                                                            7               |
```

```
Rung #598
| MOTOR 12                                                                      MOTOR 12
| REVERSE                                                                       REVERSE
| DISABLE                                                                       M12R
| M12RD                                                                           B3
|   N7:14
|---] [------------------------------------------------------------------------+--(U)--+-
|     8                                                                           112
| [3]
|          B3/112 - ] [ - - File #2 MAIN_PRGRM - 281                           |MANUAL
|                   ]/[ - - File #2 MAIN_PRGRM - 281                           |MOTOR 12
|                   -(L)- - File #2 MAIN_PRGRM - 579                           |REVERSE
|          N7:40/11 - -(L)- - File #2 MAIN_PRGRM - 579                         |ENABLE
| |PREPARE FOR  _F:N7:21[X21 - BTW - File #2 MAIN_PRGRM - 2                    |MM12RE
| |AUTO RUN     N7:35/8 - -(U)- - File #2 MAIN_PRGRM - 579                     |  N7:40
| |>AUTO        _F:N7:21[X21 - BTW - File #2 MAIN_PRGRM - 2                    +--(U)--
| |   N7:37                                                                       11
| +---] [---+
|       1                                                                      |MANUAL
|  [162]                                                                       |MOTOR 12
|                                                                              |REVERSE
|                                                                              |DISABLE
|                                                                              |MM12RD
|                                                                              |  N7:35
|                                                                              +--(L)--
|                                                                                  8
Rung #599
| MOTOR 13                                                                      MOTOR 13
| REVERSE                                                                       REVERSE
| DISABLE                                                                       M13R
| M13RD                                                                           B3
|   N7:14
|---] [------------------------------------------------------------------------+--(U)--+-
|     9                                                                           113
| [3]
|          B3/113 - ] [ - - File #2 MAIN_PRGRM - 287                           |MANUAL
|                   ]/[ - - File #2 MAIN_PRGRM - 285                           |MOTOR 13
|                   -(L)- - File #2 MAIN_PRGRM - 580                           |REVERSE
|          N7:40/12 - -(L)- - File #2 MAIN_PRGRM - 580                         |ENABLE
| |PREPARE FOR  _F:N7:21[X21 - BTW - File #2 MAIN_PRGRM - 2                    |MM13RE
| |AUTO RUN     N7:35/9 - -(U)- - File #2 MAIN_PRGRM - 580                     |  N7:40
| |>AUTO        _F:N7:21[X21 - BTW - File #2 MAIN_PRGRM - 2                    +--(U)--
| |   N7:37                                                                       12
| +---] [---+
|       1                                                                      |MANUAL
|  [162]                                                                       |MOTOR 13
|                                                                              |REVERSE
|                                                                              |DISABLE
|                                                                              |MM13RD
|                                                                              |  N7:35
|                                                                              +--(L)--
|                                                                                  9
```

```
Rung #600
| MOTOR 14                                                                          MOTOR 14
| REVERSE                                                                           REVERSE
| DISABLE                                                                           M14R
| M14RD                                                                               B3
|  N7:14
|--| |----+------------------------------------------------------------------------+--(U)--+
|    10   |                                                                        |  114   |
| [3]     |                                                                        |        |
|         | B3/114 - -| |- - File #2 MAIN_PRGRM - 292                              |MANUAL  |
|         |          -|/|- - File #2 MAIN_PRGRM - 290                              |MOTOR 14|
|         |          -(L)- - File #2 MAIN_PRGRM - 581                              |REVERSE |
|         | N7:40/13 - -(L)- - File #2 MAIN_PRGRM - 581                            |ENABLE  |
|PREPARE FOR | _F:N7:21[X21 - BTW - File #2 MAIN_PRGRM - 2                         |MM14RE  |
|AUTO RUN   | N7:35/10 - -(U)- - File #2 MAIN_PRGRM - 581                          | N7:40  |
|>AUTO      | _F:N7:21[X21 - BTW - File #2 MAIN_PRGRM - 2                          +--(U)---+
|  N7:37    |                                                                    |  13    |
+---| |-----+                                                                    |        |
     1                                                                           |MANUAL  |
 [162]                                                                           |MOTOR 14|
                                                                                 |REVERSE |
                                                                                 |DISABLE |
                                                                                 |MM14RD  |
                                                                                 | N7:35  |
                                                                                 +--(L)---+
                                                                                    10

Rung #601
| MOTOR 15                                                                          MOTOR 15
| REVERSE                                                                           REVERSE
| DISABLE                                                                           M15R
| M15RD                                                                               B3
|  N7:14
|--| |----+------------------------------------------------------------------------+--(U)--+
|    11   |                                                                        |  115   |
| [3]     |                                                                        |        |
|         | B3/115 - -| |- - File #2 MAIN_PRGRM - 297                              |MANUAL  |
|         |          -|/|- - File #2 MAIN_PRGRM - 295                              |MOTOR 15|
|         |          -(L)- - File #2 MAIN_PRGRM - 582                              |REVERSE |
|         | N7:40/14 - -(L)- - File #2 MAIN_PRGRM - 582                            |ENABLE  |
|PREPARE FOR | _F:N7:21[X21 - BTW - File #2 MAIN_PRGRM - 2                         |MM15RE  |
|AUTO RUN   | N7:35/11 - -(U)- - File #2 MAIN_PRGRM - 582                          | N7:40  |
|>AUTO      | _F:N7:21[X21 - BTW - File #2 MAIN_PRGRM - 2                          +--(U)---+
|  N7:37    |                                                                    |  14    |
+---| |-----+                                                                    |        |
     1                                                                           |MANUAL  |
 [162]                                                                           |MOTOR 15|
                                                                                 |REVERSE |
                                                                                 |DISABLE |
                                                                                 |MM15RD  |
                                                                                 | N7:35  |
                                                                                 +--(L)---+
                                                                                    11
```

```
Rung #602
| MOTOR 16                                                                  MOTOR 16
| REVERSE                                                                   REVERSE
| DISABLE                                                                   M16R
| M16RD                                                                        B3
|   N7:14                                                                   --(U)--
|---| |---------------------------------------------------------------------+--+
| |   12    |                                                               | 116  |
| |[3]      |                                                               |      |
| |         | B3/116 - -| |- - File #2 MAIN_PRGRM - 306                     |MANUAL
| |         |          -|/|- - File #2 MAIN_PRGRM - 306                     |MOTOR 16
| |         |          -(L)- - File #2 MAIN_PRGRM - 583                     |REVERSE
| |         | N7:40/15 - -(L)- - File #2 MAIN_PRGRM - 583                   |ENABLE
| |PREPARE FOR | _F:N7:21{X21 - BTW - File #2 MAIN_PRGRM - 2                |MM16RE
| |AUTO RUN  | N7:35/12 - -(U)- - File #2 MAIN_PRGRM - 583                  | N7:40
| |>AUTO     | _F:N7:21{X21 - BTW - File #2 MAIN_PRGRM - 2                  +--(U)--+
| |  N7:37   |                                                              |  15
| +---| |----+                                                              |
|      1                                                                    |MANUAL
|  [162]                                                                    |MOTOR 16
|                                                                           |REVERSE
|                                                                           |DISABLE
|                                                                           |MM16RD
|                                                                           | N7:35
|                                                                           +--(L)--+
|                                                                              12
Rung #603
| MOTOR 17                                                                  MOTOR 17
| REVERSE                                                                   REVERSE
| DISABLE                                                                   M17R
| M17RD                                                                        B3
|   N7:14                                                                   --(U)--
|---| |---------------------------------------------------------------------+--+
| |   13    |                                                               | 117  |
| |[3]      |                                                               |      |
| |         | B3/117 - -| |- - File #2 MAIN_PRGRM - 312                     |MANUAL
| |         |          -|/|- - File #2 MAIN_PRGRM - 310                     |MOTOR 17
| |         |          -(L)- - File #2 MAIN_PRGRM - 584                     |REVERSE
| |         | N7:41/0 - -(L)- - File #2 MAIN_PRGRM - 584                    |ENABLE
| |PREPARE FOR | _F:N7:21{X21 - BTW - File #2 MAIN_PRGRM - 2                |MM17RE
| |AUTO RUN  | N7:35/13 - -(U)- - File #2 MAIN_PRGRM - 584                  | N7:41
| |>AUTO     | _F:N7:21{X21 - BTW - File #2 MAIN_PRGRM - 2                  +--(U)--+
| |  N7:37   |                                                              |  0
| +---| |----+                                                              |
|      1                                                                    |MANUAL
|  [162]                                                                    |MOTOR 17
|                                                                           |REVERSE
|                                                                           |DISABLE
|                                                                           |MM17RD
|                                                                           | N7:35
|                                                                           +--(L)--+
|                                                                              13
```

```
Rung #604
| MOTOR 18                                                         MOTOR 18
| REVERSE                                                          REVERSE
| DISABLE                                                          M18R
| M18RD
|  N7:14                                                              B3
|---| |----------------------------------------------------------------(U)---
|    14                                                               118
| [3]
|          | B3/118 - -| |- - File #2 MAIN_PRGRM - 317               |MANUAL
|          |          -|/|- - File #2 MAIN_PRGRM - 315              |MOTOR 18
|          |           -(L)- - File #2 MAIN_PRGRM - 585             |REVERSE
|          | N7:41/1 - -(L)- - File #2 MAIN_PRGRM - 585             |ENABLE
|PREPARE FOR| _F:N7:21[X21 - BTW - File #2 MAIN_PRGRM - 2           |MM18RE
|AUTO RUN  | N7:35/14 - -(U)- - File #2 MAIN_PRGRM - 585            | N7:41
|>AUTO     | _F:N7:21[X21 - BTW - File #2 MAIN_PRGRM - 2            |---(U)---
|  N7:37                                                            1
|---| |----                                                         |MANUAL
|    1                                                              |MOTOR 18
| [162]                                                             |REVERSE
|                                                                   |DISABLE
|                                                                   |MM18RD
|                                                                   | N7:35
|                                                                   |---(L)---
|                                                                     14

Rung #605
| MOTOR 19                                                         MOTOR 19
| REVERSE                                                          REVERSE
| DISABLE                                                          M19R
| M19RD
|  N7:14                                                              B3
|---| |----------------------------------------------------------------(U)---
|    15                                                               119
| [3]
|          | B3/119 - -| |- - File #2 MAIN_PRGRM - 322               |MANUAL
|          |          -|/|- - File #2 MAIN_PRGRM - 320              |MOTOR 19
|          |           -(L)- - File #2 MAIN_PRGRM - 586             |REVERSE
|          | N7:41/2 - -(L)- - File #2 MAIN_PRGRM - 586             |ENABLE
|PREPARE FOR| _F:N7:21[X21 - BTW - File #2 MAIN_PRGRM - 2           |MM19RE
|AUTO RUN  | N7:35/15 - -(U)- - File #2 MAIN_PRGRM - 586            | N7:41
|>AUTO     | _F:N7:21[X21 - BTW - File #2 MAIN_PRGRM - 2            |---(U)---
|  N7:37                                                            2
|---| |----                                                         |MANUAL
|    1                                                              |MOTOR 19
| [162]                                                             |REVERSE
|                                                                   |DISABLE
|                                                                   |MM19RD
|                                                                   | N7:35
|                                                                   |---(L)---
|                                                                     15
```

Rung #606

```
MOTOR 20
REVERSE
DISABLE
M20RD
N7:15
--] [--
   0
[3]
        B3/120 - -] [- - File #2 MAIN_PRGRM - 333
                 -]/[- - File #2 MAIN_PRGRM - 331
                 -(L)- - File #2 MAIN_PRGRM - 587
        N7:41/3 - -(L)- - File #2 MAIN_PRGRM - 587
        _F:N7:21[X21 - BTW - File #2 MAIN_PRGRM - 2
        N7:36/0 - -(U)- - File #2 MAIN_PRGRM - 587
        _F:N7:21[X21 - BTW - File #2 MAIN_PRGRM - 2
PREPARE FOR
AUTO RUN
>AUTO
N7:37
--] [--
   1
[162]

MOTOR 20
REVERSE
M20R
B3
--(U)--
  120

MANUAL
MOTOR 20
REVERSE
ENABLE
MM20RE
N7:41
--(U)--
   3

MANUAL
MOTOR 20
REVERSE
DISABLE
MM20RD
N7:36
--(L)--
   0
```

Rung #607

```
MOTOR 21
REVERSE
DISABLE
M21RD
N7:15
--] [--
   1
[3]
        B3/121 - -] [- - File #2 MAIN_PRGRM - 357
                 -]/[- - File #2 MAIN_PRGRM - 355
                 -(L)- - File #2 MAIN_PRGRM - 588
        N7:41/4 - -(L)- - File #2 MAIN_PRGRM - 588
        _F:N7:21[X21 - BTW - File #2 MAIN_PRGRM - 2
        N7:36/1 - -(U)- - File #2 MAIN_PRGRM - 588
        _F:N7:21[X21 - BTW - File #2 MAIN_PRGRM - 2
PREPARE FOR
AUTO RUN
>AUTO
N7:37
--] [--
   1
[162]

MOTOR 21
REVERSE
M21R
B3
--(U)--
  121

MANUAL
MOTOR 21
REVERSE
ENABLE
MM21_RE
N7:41
--(U)--
   4

MANUAL
MOTOR 21
REVERSE
DISABLE
MM21RD
N7:36
--(L)--
   1
```

Rung #608
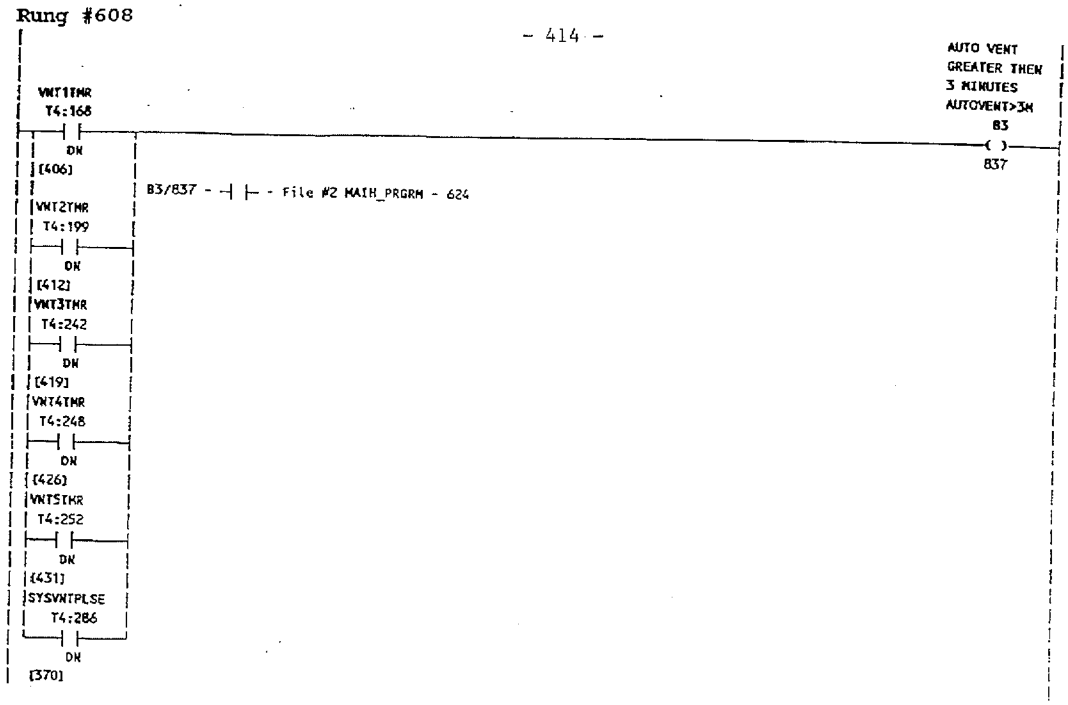

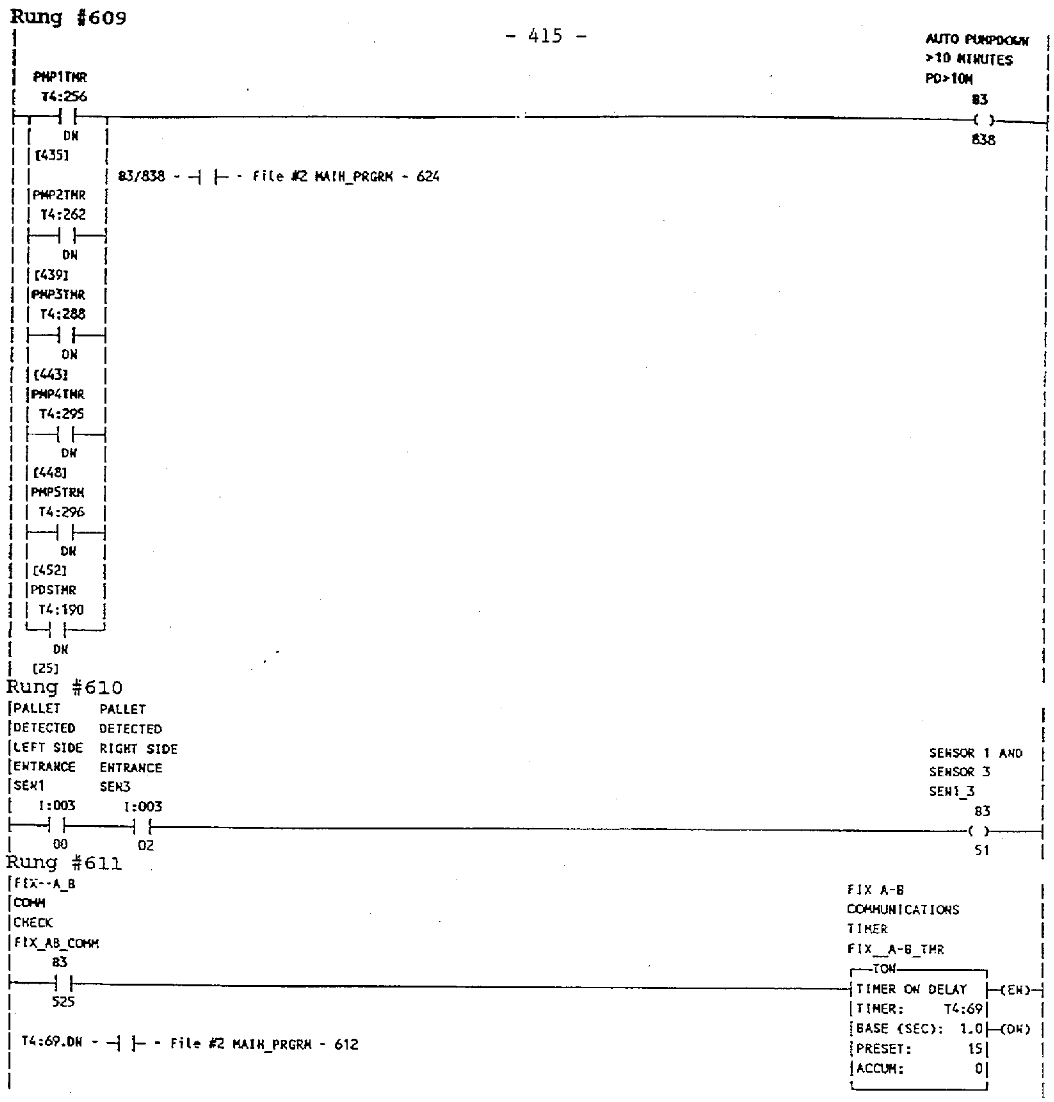
Rung #609
- 415 -
PMP1TMR
T4:256
DN
[435]
83/838 - ┤ ├ - File #2 MAIN_PRGRM - 624
PMP2TMR
T4:262
DN
[439]
PMP3TMR
T4:288
DN
[443]
PMP4TMR
T4:295
DN
[448]
PMP5TRM
T4:296
DN
[452]
PDSTMR
T4:190
DN
[25]
AUTO PUMPDOWN
>10 MINUTES
PD>10M
83
838
Rung #610
PALLET
DETECTED
LEFT SIDE
ENTRANCE
SEN1
I:003
00
PALLET
DETECTED
RIGHT SIDE
ENTRANCE
SEN3
I:003
02
SENSOR 1 AND
SENSOR 3
SEN1_3
83
51
Rung #611
FIX--A_B
COMM
CHECK
FIX_AB_COMM
83
525
T4:69.DN - ┤ ├ - File #2 MAIN_PRGRM - 612
FIX A-B
COMMUNICATIONS
TIMER
FIX__A-B_TMR
TON
TIMER ON DELAY
TIMER: T4:69
BASE (SEC): 1.0
PRESET: 15
ACCUM: 0
(EN)
(DN)

Rung #612

```
|FIX                                                          FIX_A-B            |
|AB                                                           COMMUNICATIONS     |
|TIMER                                                        LOST!              |
|FIX__A-B_THR                                                 NO_FX_A-B_CONN     |
|   T4:69                                                        B3              |
|----] [--------------------------------------------------------(L)--------------|
|    DN                                                          810             |
|[611]                                                                           |
B3/810 - ] [ - File #2 MAIN_PRGRM - 626
        -(L)- - File #2 MAIN_PRGRM - 612
        -(U)- - File #2 MAIN_PRGRM - 617
```

Rung #613

```
|ARGON GAS                                                    NO ARGON   |
|PRESSURE                                                     SIGNAL TO  |
|SENSOR                                                       THE FIX    |
|NO_ARGON                                                     NO=ARGON   |
|   I:052                                                        B3      |
|----] [--------------------------------------------------------(L)------|
|    03                                                          809     |
B3/809 - ] [ - File #2 MAIN_PRGRM - 626
        -(L)- - File #2 MAIN_PRGRM - 613
        -(U)- - File #2 MAIN_PRGRM - 617
```

Rung #614

```
|AUTO    PROCESS                                                               |
|MODE    PRESSURE                                                              |
|ENABLE  FAILURE                                   PRESSURE FAIL               |
|AUTO    PRESS_FAILURE                             TIMER                       |
| N7:37      B3                                    PRESS_FAIL_THR              |
|--] [------] [-----------------------------------+-TON--------------+         |
|   11      529                                   |TIMER ON DELAY    |-(EN)-   |
|[158]                                            |TIMER:      T4:331|         |
|                                                 |BASE (SEC):   1.0 |-(DN)    |
|                                                 |PRESET:        10 |         |
|                                                 |ACCUM:          0 |         |
|                                                 +------------------+         |
T4:331.DN - ] [ - File #2 MAIN_PRGRM - 615
```

Rung #615

```
|                                                              PRESSURE      |
|                                                              FAILURE       |
|PRESS_FAIL_THR                                                PRESS_FAIL    |
|   T4:331                                                        B3         |
|----] [---------------------------------------------------------(L)---------|
|    DN                                                           388        |
|[614]                                                                       |
B3/388 - ] [ - File #2 MAIN_PRGRM - 627
        -(L)- - File #2 MAIN_PRGRM - 615
        -(U)- - File #2 MAIN_PRGRM - 617
```

Rung #616

```
|AUTO                                                                        |
|MODE    ARGON FLOW                                                          |
|ENABLE  FAILURE                                              NO_ARGON       |
|AUTO    NO_ARGON_FLOW                                        LATCH          |
| N7:37      B3                                               NO_ARGONLTCH   |
|--] [------] [-------------------------------------------------B3-----------|
|   11      528                                                (L)           |
|[158]                                                          387          |
B3/387 - ] [ - File #2 MAIN_PRGRM - 627
        -(L)- - File #2 MAIN_PRGRM - 616
        -(U)- - File #2 MAIN_PRGRM - 617
```

Rung #617

```
|PAUSE                                                                NO_ARGON
|DISABLE                                                              LATCH
|TS12                                                                 NO_ARGONLTCH
| N7:16                                                                  B3
|--] [---------------------------------------------------------------+---(U)---
|   4                                                                |  387
|[3]                                                                 |
| B3/387 - ] [ - File #2 MAIN_PRGRM - 627                            |
|          -(L)- - File #2 MAIN_PRGRM - 616                          |PRESSURE
| B3/388 - ] [ - File #2 MAIN_PRGRM - 627                            |FAILURE
|          -(L)- - File #2 MAIN_PRGRM - 615                          |PRESS_FAIL
| B3/272 - ] [ - File #2 MAIN_PRGRM - 627                            |  B3
|          -(L)- - File #2 MAIN_PRGRM - 619                          +---(U)---
| B3/809 - ] [ - File #2 MAIN_PRGRM - 626                            |  388
|          -(L)- - File #2 MAIN_PRGRM - 613                          |
| B3/810 - ] [ - File #2 MAIN_PRGRM - 626                            |
|          -(L)- - File #2 MAIN_PRGRM - 612                          |
|                                                                    |ARC DETECT
|                                                                    |LATCH
|                                                                    |ARC_DET
|                                                                    |  B3
|                                                                    +---(U)---
|                                                                    |  272
|                                                                    |NO ARGON
|                                                                    |SIGNAL TO
|                                                                    |THE FIX
|                                                                    |NO=ARGON
|                                                                    |  B3
|                                                                    +---(U)---
|                                                                    |  809
|                                                                    |FIX_A-B
|                                                                    |COMMUNICATIONS
|                                                                    |LOST!
|                                                                    |NO_FX_A-B_COMM
|                                                                    |  B3
|                                                                    +---(U)---
                                                                        810
```

```
Rung #618
| CHROME ARC                                                    ARC FAULT
| DETECT #1                                                     DELAY
| CHR_ARC1                                                      ARCFLTDLY
|     B3                                                        +--TON------------+
+-+---| |---+---------------------------------------------------+TIMER ON DELAY   +-(EN)-
| |   534   |                                                   |TIMER:   T4:100  |
| |         |                                                   |BASE (SEC):  1.0 +-(DN)
| |         | T4:100.DN - -| |- - File #2 MAIN_PRGRM - 619      |PRESET:      10  |
| |         |                                                   |ACCUM:        0  |
| |MAG ARC  |                                                   +-----------------+
| |DETECT #1|
| |MAG_ARC1 |
| |   B3    |
| +---| |---+
| |   535   |
| |CARBON ARC
| |DETECT #1|
| |CAR_ARC1 |
| |   B3    |
| +---| |---+
| |   536   |
| |CHROME ARC
| |DETECT #2|
| |CHR_ARC2 |
| |   B3    |
| +---| |---+
| |   540   |
| |MAG ARC  |
| |DETECT #2|
| |MAG_ARC2 |
| |   B3    |
| +---| |---+
| |   541   |
| |CARBON ARC
| |DETECT #2|
| |CAR_ARC2 |
| |   B3    |
| +---| |---+
|     542
Rung #619
|
|                                                               ARC DETECT
|                                                               LATCH
|ARCFLTDLY                                                      ARC_DET
| T4:100                                                           B3
+---| |-----------------------------------------------------------(L)----
|   DN                                                             272
|[618]
B3/272 - -| |- - File #2 MAIN_PRGRM -  627
         -(L)- - File #2 MAIN_PRGRM -  619
         -(U)- - File #2 MAIN_PRGRM -  617
```

Rung #620

```
HIGH POWER       CHROME POWER SUPPLY SETPOINT ALARM 1
CHROME 1 & 2 TO THE FIX
HIPRCH1,2        CHRSPAL1
  B3               B3
--] [--------------] [------------------------------ POWER SUPPLY SETPOINT ALARM DELAY
  831              531                               PSSPALMDLY
[236]                                                TON
                                                     TIMER ON DELAY      -(EN)-
  T4:333.DN - ] [ - - File #2 MAIN_PRGRM - 621       TIMER:     T4:333
                                                     BASE (SEC):   1.0   -(DN)
                                                     PRESET:        10
                                                     ACCUM:          0

HIGH POWER       MAGNETIC POWER SUPPLY
MAG 1 & 2        SETPOINT ALARM
TO THE FIX       1
HIMAG1,2         MAGSPAL1
  B3               B3
--] [--------------] [--
  833              532
[268]

HIGH POWER       CARBON POWER SUPPLY
CARBON 1 & 2     SETPOINT ALARM
TO THE FIX       1
HIPRCAR1,2       CARSPAL1
  B3               B3
--] [--------------] [--
  835              533
[299]

HIGH POWER       CHROME PS
CHROME 3 & 4     SETPOINT ALARM
TO THE FIX       2
HIPRCHR3,4       CHRSPAL2
  B3               B3
--] [--------------] [--
  832              537
[242]

HIGH POWER       MAG PS
MAG 3 & 4        SETPOINT ALARM
TO THE FIX       2
HIPRMAG3,4       MAGSPAL2
  B3               B3
--] [--------------] [--
  834              538
[274]

HIGH POWER       CARBON PS
CARBON 3 & 4     SETPOINT ALARM
TO THE FIX       2
HIPRCAR3,4       CARSPAL2
  B3               B3
--] [--------------] [--
  836              539
[300]
```

Rung #621

```
PSSPALMDLY                                           POWER SUPPLY
  T4:333                                             SETPOINT ALARM
--] [----------------------------------------------- PSSPALARM
  DN                                                    B3
[620]                                                 -(L)-
                                                        147
```

```
B3/147 - -| |- - File #2 MAIN_PRGRM -  625
       -(L)- - File #2 MAIN_PRGRM -  621
       -(U)- - File #2 MAIN_PRGRM -  629
Rung #622
| HIGH POWER                                              POWER SUPPLY |
| CHROME 1 & 2                                            HIGH POWER   |
| TO THE FIX                                              ON           |
| HIPRCH1,2                                               HIPWRON      |
|     B3                                                      B3       |
|-+---| |---+-------------------------------------------------( )------|
| |   831   |                                                 301      |
| |[236]    |                                                          |
| |HIGH POWER                                                          |
| |CHROME 3 & 4                                                        |
| |TO THE FIX                                                          |
| |HIPRCHR3,4                                                          |
| |   B3    |                                                          |
| |---| |---|                                                          |
| |   832   |                                                          |
| |[242]    |                                                          |
| |HIGH POWER                                                          |
| |MAG 1 & 2|                                                          |
| |TO THE FIX                                                          |
| |HIMAG1,2 |                                                          |
| |   B3    |                                                          |
| |---| |---|                                                          |
| |   833   |                                                          |
| |[268]    |                                                          |
| |HIGH POWER                                                          |
| |MAG 3 & 4|                                                          |
| |TO THE FIX                                                          |
| |HIPRMAG3,4                                                          |
| |   B3    |                                                          |
| |---| |---|                                                          |
| |   834   |                                                          |
| |[274]    |                                                          |
| |HIGH POWER                                                          |
| |CARBON 1 & 2                                                        |
| |TO THE FIX                                                          |
| |HIPRCAR1,2                                                          |
| |   B3    |                                                          |
| |---| |---|                                                          |
| |   835   |                                                          |
| |[299]    |                                                          |
| |HIGH POWER                                                          |
| |CARBON 3 & 4                                                        |
| |TO THE FIX                                                          |
| |HIPRCAR3,4                                                          |
| |   B3    |                                                          |
| +---| |---+                                                          |
|     836                                                              |
|  [300]                                                               |
```

Rung #623

```
| C1RERUF                                                              RERUF GREATER |
|  C5:1                                                                THAN 10       |
|--] [--+--------------------------------------------------------------TIMES---------|
|  DN   |                                                              RERUF>10      |
| [3:19]|                                                                 B3         |
|       | B3/819 - -] [- - File #2 MAIN_PRGRM - 624                    --( )---------|
|C2RERUF|                                                                 819        |
|  C5:2 |
|--] [--|
|  DN   |
|[3:196]|
|C2RERUF|
|  C5:2 |
|--] [--|
|  DN   |
|[3:196]|
|C3RERUF|
|  C5:3 |
|--] [--|
|  DN   |
|[3:197]|
|C4RERUF|
|  C5:4 |
|--] [--|
|  DN   |
|[3:198]|
|C5RERUF|
|  C5:5 |
|--] [--|
|  DN   |
|[3:199]|
|C6R3RUF|
|  C5:6 |
|--] [--|
|  DN   |
|[3:200]|
|C7RERUF|
|  C5:7 |
|--] [--|
|  DN   |
|[3:201]|
|C8RERUF|
|  C5:8 |
|--] [--+
   DN
 [3:202]
```

Rung #624
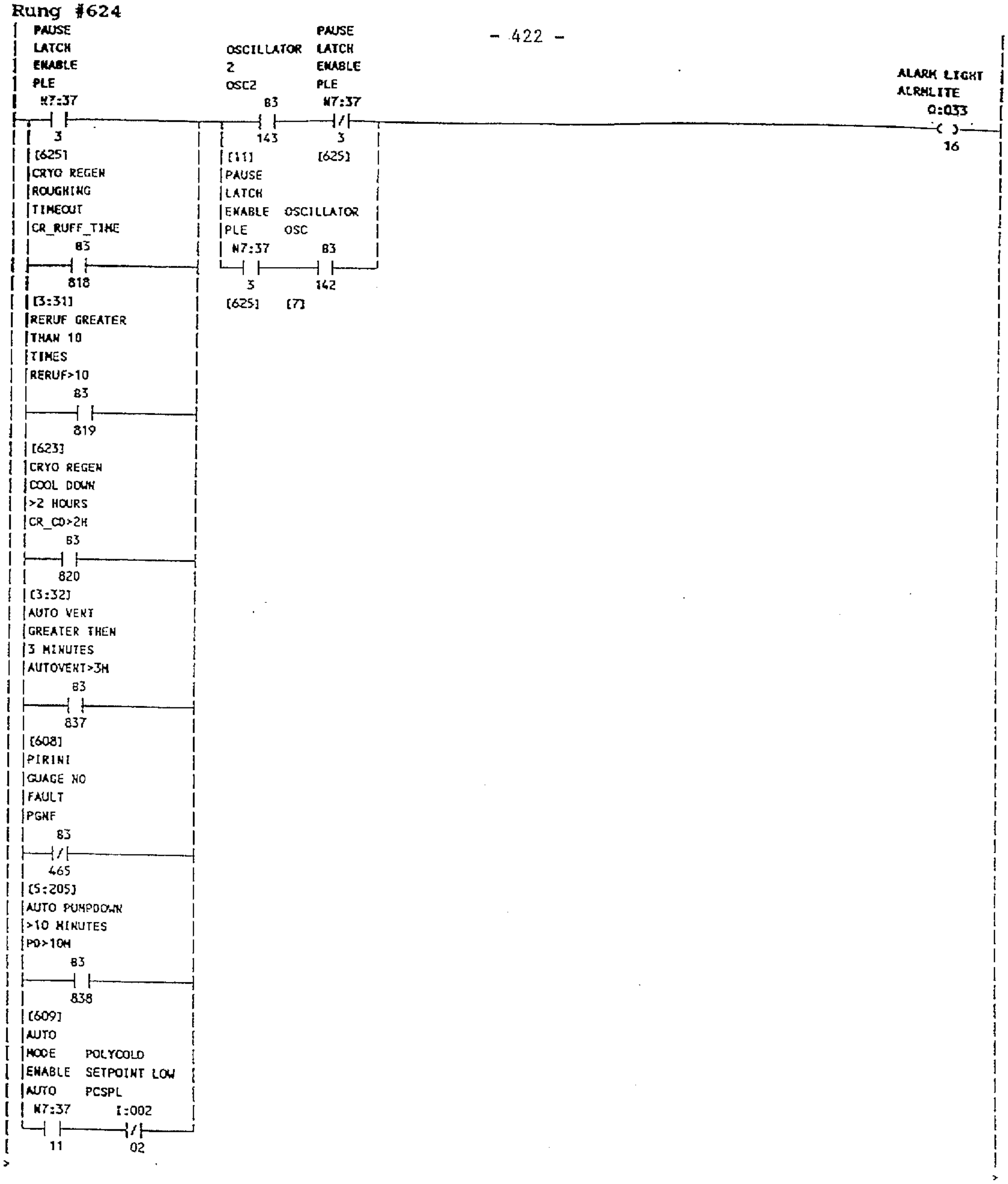

```
[158]
Rung #625
AUTO                                                                                  PAUSE
MODE           PAUSE                                                                  LATCH
ENABLE         ENABLE                                                                 ENABLE
AUTO           TS11                                                                   PLE
 N7:37          N7:16                                                                  N7:37
--| |-----------| |-------------------------------------------------------------------(L)--
   11            3                                                                      3
 [158]          [3]
                      N7:37/3 - -| |- - File #2 MAIN_PRGRM - 624, 635, 636, 637, 638, 639, 640,
                                   641, 642, 643, 644, 645, 646, 647, 648, 649, 650
                              -|/|- - File #2 MAIN_PRGRM - 181, 200, 215, 326, 327, 351, 624
                              -(U)- - File #2 MAIN_PRGRM - 628                        PAUSE
 PREPARE FOR    POWER SUPPLY   _F:N7:21[X21 - BTW - File #2 MAIN_PRGRM - 2            LATCH
 AUTO RUN       SETPOINT ALARM  N7:37/4 - -(L)- - File #2 MAIN_PRGRM - 628            DISABLE
 >AUTO          PSSPALARM      _F:N7:21[X21 - BTW - File #2 MAIN_PRGRM - 2            PLD
  N7:37          B3                                                                    N7:37
--| |-------+---| |---+                                                               --(U)--
   1               147                                                                  4
 [162]           [621]
                 DOOR FAULT
                 DRFLT
                  B3
            +---| |---+
                 215
                 [5:67]
                 HIVAC VALVE
                 FAULT
                 HVFLT
                  B3
            +---| |---+
                 245
                 [5:142]
                 CHAMBER
                 VENT VALVE
                 FAULT
                 CHVF
                  B3
            +---| |---+
                 174
                 [5:157]
                 ROUGH VENT
                 VALVE
                 FAULT
                 RVVF
                  B3
            +---| |---+
                 386
                 [5:180]
                 HEATER
                 SHIELD H20
                 FLOW FAULT
                 HSFF
                  B3
            +---| |---+
                 219
                 [5:200]
                 CATHODE
                 H20 FLOW
                 FAULT
                 CWFF
```

```
<                                   <
|    83                             |
|---] [-----------------------------|
|   220                             |
| [S:203]                           |
|EMERGENCY                          |
|STOP                               |
|E_STOP                             |
|   I:005                           |
|---]/[-----------------------------|
|    15                             |
|AUXILLIARY                         |
|PAUSE LATCH                        |
|SIGNALS                            |
|AUXPL                              |
|    B3                             |
|---] [-----------------------------|
|   199                             |
|[626]                              |
|AUXILLIARY                         |
|PAUSE 2 LATCH                      |
|AUX2PL                             |
|    B3                             |
+---] [-----------------------------+
    390
[627]
```

Rung #626

```
| NO ARGON                                                        AUXILLIARY |
| SIGNAL TO                                                       PAUSE LATCH|
| THE FIX                                                         SIGNALS    |
| NO=ARGON                                                        AUXPL      |
|     B3                                                          B3         |
|----] [----+---------------------------------------------------------( )----|
|    809    |                                                     199        |
| |[617]    |                                                                |
| |         | B3/199 - ] [ - File #2 MAIN_PRGRM - 625                        |
| |FIX_A-B  |                                                                |
| |COMMUNICATIONS                                                            |
| |LOST!    |                                                                |
| |NO_FX_A-B_COMM                                                            |
| |    B3   |                                                                |
| |---] [------[AFI]-|                                                       |
| |   810   |                                                                |
| |[617]    |                                                                |
| |MOTOR FAULT                                                               |
| |TIMER DONE                                                                |
| |MOTOR_FLT|                                                                |
| |    B3   |                                                                |
| |---] [---|                                                                |
| |   811   |                                                                |
| |[5:15]   |                                                                |
| |CHAMBER  |                                                                |
| |NOT AT   |                                                                |
| |VACUUM   |                                                                |
| |NO_VACUUM|                                                                |
| |    B3   |                                                                |
| |---] [---|                                                                |
| |   812   |                                                                |
| |[633]    |                                                                |
| |CRYO TEMP|                                                                |
| |ABOVE 20K|                                                                |
| |CRYO_>20K|                                                                |
| |    B3   |                                                                |
| |---] [---|                                                                |
| |   813   |                                                                |
| |[630]    |                                                                |
| |LOAD LOCK|                                                                |
| |VENT >30 SECS                                                             |
| |LLVNT>30SECS                                                              |
| |    B3   |                                                                |
| |---] [---|                                                                |
| |   814   |                                                                |
| |[176]    |                                                                |
| |EXIT LOCK|                                                                |
| |VENT>30 SECS                                                              |
| |EXLKVNT>30SECS                                                            |
| |    B3   |                                                                |
| |---] [---|                                                                |
| |   815   |                                                                |
| |[349]    |                                                                |
| |LOAD LOCK|                                                                |
| |ROUGHING |                                                                |
| |>60 SECONDS                                                               |
| |LLRUF>60 |                                                                |
| |    B3   |                                                                |
| |---] [---|                                                                |
| |   816   |                                                                |
| |[170]    |                                                                |
| |EXIT LOCK|                                                                |
> >         >                                                                >
```

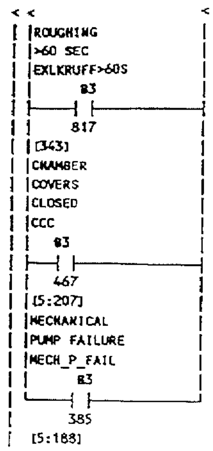
ROUGHING
>60 SEC
EXLKRUFF>60S
83
817
[343]
CHAMBER
COVERS
CLOSED
CCC
83
467
[5:207]
MECHANICAL
PUMP FAILURE
MECH_P_FAIL
83
385
[5:188]

Rung #627

```
ARC DETECT                                                   AUXILLIARY
LATCH                                                        PAUSE 2 LATCH
ARC_DET                                                      AUX2PL
   B3                                                           B3
--] [----------------------------------------------------------( )--
  272                                                           390
[619]
         B3/390 - ] [ - File #2 MAIN_PRGRM - 625
PRESSURE
FAILURE
PRESS_FAIL
   B3
--] [--
  388
[617]
NO_ARGON
LATCH
NO_ARGONLTCH
   B3
--] [--
  387
[617]
AIR PRESSURE
SWITCH
APS
  I:003
--]/[--
   17
HEATER ALARM
HTRALM
   B3
--] [--
  290
[152]
HEATER
SUPPLY
ALARM
HTRFLT
   B3
--] [--
  289
[631]
```

BASE : Rung #628
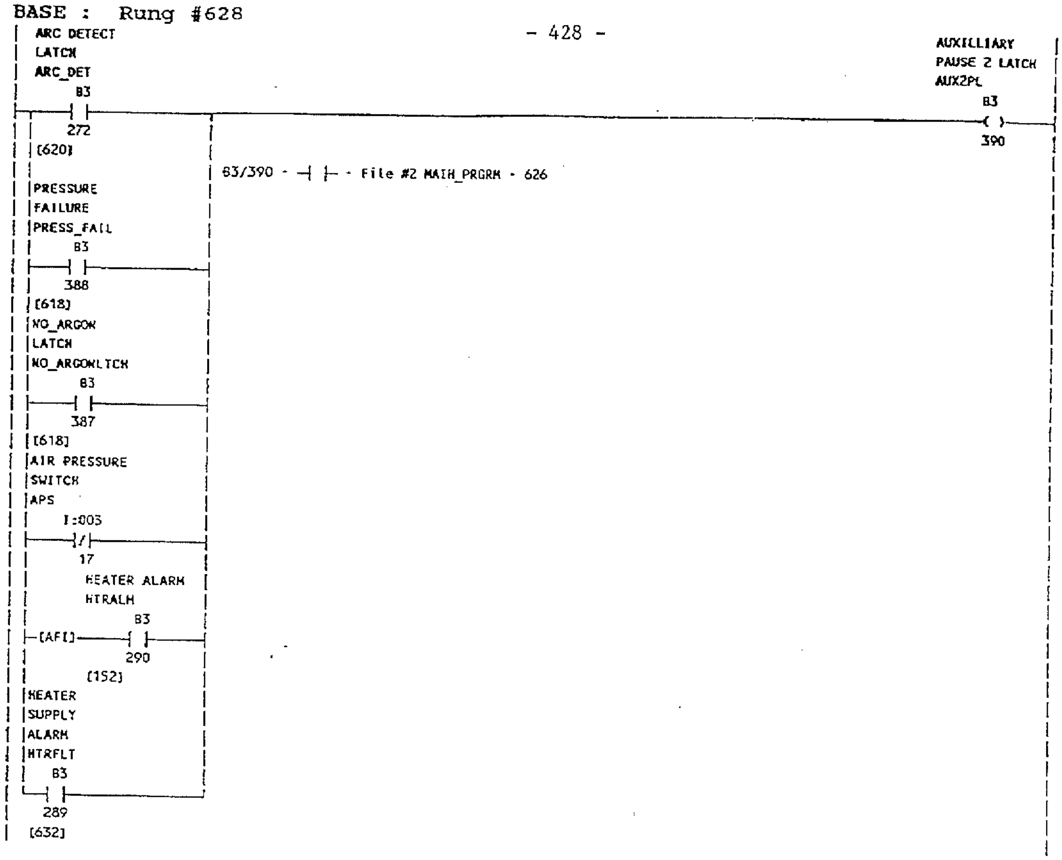

```
Rung #629
|PAUSE                                                              POWER SUPPLY
|DISABLE                                                            SETPOINT ALARM
|TS12                                                               PSSPALARM
| N7:16                                                                  B3
|--] [---------------------------------------------------------+-------(U)------+-
|   4                                                          |        147     |
|(3)                                                           |                |
| B3/147 - ] [ - - File #2 MAIN_PRGRM - 625                    |                |
|          -(L)- - File #2 MAIN_PRGRM - 621                    |                |
| B3/474 - ]/[ - - File #2 MAIN_PRGRM - 218                    |STOP MOTOR 6    |
|          -(L)- - File #2 MAIN_PRGRM - 638                    |PAUSE LATCH     |
| B3/475 - ]/[ - - File #2 MAIN_PRGRM - 258                    |M6PL            |
|          -(L)- - File #2 MAIN_PRGRM - 641                    |        B3      |
| B3/476 - ]/[ - - File #2 MAIN_PRGRM - 290                    |-------(U)------|
|          -(L)- - File #2 MAIN_PRGRM - 644                    |        474     |
| B3/477 - ]/[ - - File #2 MAIN_PRGRM - 315                    |                |
|          -(L)- - File #2 MAIN_PRGRM - 647                    |                |
|                                                              |STOP MOTOR 10   |
|                                                              |PAUSE LATCH     |
|                                                              |M10PL           |
|                                                              |        B3      |
|                                                              |-------(U)------|
|                                                              |        475     |
|                                                              |STOP MOTOR 14   |
|                                                              |PAUSE LATCH     |
|                                                              |M14PL           |
|                                                              |        B3      |
|                                                              |-------(U)------|
|                                                              |        476     |
|                                                              |STOP MOTOR 18   |
|                                                              |PAUSE LATCH     |
|                                                              |M18PL           |
|                                                              |        B3      |
|                                                              +-------(U)------+
                                                                        477
```

Rung #630

```
|AUTO      CRYO 1                                                         CRYO TEMP |
|MODE      TEMPERATUR                                                     ABOVE 20K |
|ENABLE    =<20K                                                          CRYO_>20K |
|AUTO      CY1TMP20                                                          B3     |
| N7:37      B3                                                                     |
|--] [----+--]/[--+------------------------------------------------------------(L)---|
|   11    |  501  |                                                         813     |
|[158]    |       |                                                                 |
|         |       | B3/813 - ] [ - File #2 MAIN_PRGRM - 626                         |
|         |CRYO 2 |          -(U)- - File #2 MAIN_PRGRM - 632                       |
|         |TEMPERATUR                                                               |
|         |=<20K  |                                                                 |
|         |CY2TMP20                                                                 |
|         |  B3   |                                                                 |
|         +--]/[--+                                                                 |
|         |  502  |                                                                 |
|         |CRYO 3 |                                                                 |
|         |TEMPERATUR                                                               |
|         |=<20K  |                                                                 |
|         |CY3TMP20                                                                 |
|         |  B3   |                                                                 |
|         +--]/[--+                                                                 |
|         |  503  |                                                                 |
|         |CRYO 4 |                                                                 |
|         |TEMPERATUR                                                               |
|         |=<20K  |                                                                 |
|         |CY4TMP20                                                                 |
|         |  B3   |                                                                 |
|         +--]/[--+                                                                 |
|         |  504  |                                                                 |
|         |CRYO 5 |                                                                 |
|         |TEMPERATUR                                                               |
|         |=<20K  |                                                                 |
|         |CY5TMP20                                                                 |
|         |  B3   |                                                                 |
|         +--]/[--+                                                                 |
|         |  505  |                                                                 |
|         |CRYO 6 |                                                                 |
|         |TEMPERATUR                                                               |
|         |=<20K  |                                                                 |
|         |CY6TMP20                                                                 |
|         |  B3   |                                                                 |
|         +--]/[--+                                                                 |
|         |  506  |                                                                 |
|         |CRYO 7 |                                                                 |
|         |TEMPERATUR                                                               |
|         |=<20K  |                                                                 |
|         |CY7TMP20                                                                 |
|         |  B3   |                                                                 |
|         +--]/[--+                                                                 |
|         |  507  |                                                                 |
|         |CRYO 8 |                                                                 |
|         |TEMPERATUR                                                               |
|         |=<20K  |                                                                 |
|         |CY8TMP20                                                                 |
|         |  B3   |                                                                 |
|         +--]/[--+                                                                 |
|         |  508  |                                                                 |
|         |CRYO 9 |                                                                 |
|         |TEMPERATUR                                                               |
|         |=<20K  |                                                                 |
|         |CY9TMP20                                                                 |
>         >       >                                                                 >
```

```
<         <               <
|         |     B3        |
|         |----|/|--------|
|         |     509       |
|         |CRYO 10        |
|         |TEMPERATUR     |
|         |=<20K          |
|         |CY10TMP20      |
|         |     B3        |
|         |----|/|--------|
|         |     510       |
|         |CRYO 11        |
|         |TEMPERATUR     |
|         |=<20K          |
|         |CY11TMP20      |
|         |     B3        |
|         |----|/|--------|
|         |     511       |
|         |CRYO 12        |
|         |TEMPERATUR     |
|         |=<20K          |
|         |CY12TMP20      |
|         |     B3        |
|         +----|/|--------+
|               512
```

Rung #631

```
|AUTO                                                                                HEATER |
|MODE      HEATER 1A                                                                 SUPPLY |
|ENABLE    NO FAULT                                                                  ALARM  |
|AUTO      H1A0FLT                                                                   HTRFLT |
| N7:37       I:025                                                                    B3   |
|--| |----+--|/|--+--------------------------------------------------------------------( )--|
|   11    |   06  |                                                                   289   |
|[158]    |       |                                                                         |
|         |       | B3/289 - -| |- - File #2 MAIN_PRGRM - 627                               |
|         |HEATER 1B |
|         |NO FAULT  |
|         |H1B0FLT   |
|         |   I:025  |
|         +---|/|----+
|         |    07    |
|         |HEATER 2A |
|         |NO FAULT  |
|         |H2A0FLT   |
|         |   I:025  |
|         +---|/|----+
|         |    10    |
|         |HEATER 2B |
|         |NOFAULT   |
|         |H2B0FLT   |
|         |   I:025  |
|         +---|/|----+
|         |    11    |
|         |HEATER 2C |
|         |NO FAULT  |
|         |H2C0FLT   |
|         |   I:026  |
|         +---|/|----+
|         |    04    |
|         |HEATER 3A |
|         |NO FAULT  |
|         |H3A0FLT   |
|         |   I:026  |
|         +---|/|----+
|         |    05    |
|         |HEATER 3B |
|         |NO FAULT  |
|         |H3B0FLT   |
|         |   I:026  |
|         +---|/|----+
|         |    06    |
|         |HEATER 3C |
|         |NO FAULT  |
|         |H3C0FLT   |
|         |   I:026  |
|         +---|/|----+
|              07
```

Rung #632

```
|PAUSE                                                                           CRYO TEMP |
|DISABLE                                                                         ABOVE 20K |
|TS12                                                                            CRYO_>20K |
| N7:16                                                                             B3     |
|--| |--------------------------------------------------------------------------(U)-------|
|   4                                                                              813     |
|[3]                                                                                       |
B3/813 - -| |- - File #2 MAIN_PRGRM -  626
       -(L)- - File #2 MAIN_PRGRM -  630
```

```
-(U)- - File #2 MAIN_PRGRM - 632
Rung #633
      HEATER 1
AUTO  CHAMBER                                              CHAMBER
MODE  =<250                                                NOT AT
ENABLE MICRONS                                             VACUUM
AUTO  PIR2                                                 NO_VACUUM
N7:37  I:004                                               B3
|-| |----|/|----------------------------------------------(L)-
  11   |  10   |                                           812
[158]  |       |
       |CHROME | B3/812 - -| |- - File #2 MAIN_PRGRM - 626
       |CHAMBER|          -(U)- - File #2 MAIN_PRGRM - 634
       |=<250  |
       |MICRONS|
       |PIR6   |
       | I:024 |
       |--|/|--|
       |   07  |
       |MAGNETIC
       |CHAMBER|
       |=<250  |
       |MICRONS|
       |PIR11  |
       | I:040 |
       |--|/|--|
       |   07  |
       |CARBON |
       |CHAMBER|
       |=<250  |
       |MICRONS|
       |PIR16  |
       | I:054 |
       |--|/|--|
       |   07  |
       |EXIT BUFFER
       |CHAMBER|
       |=<250  |
       |MICRONS|
       |PIR15  |
       |  I:040|
       ---|/|--
          13
Rung #634
PAUSE                                                      CHAMBER
DISABLE                                                    NOT AT
TS12                                                       VACUUM
 N7:16                                                     NO_VACUUM
|-| |------------------------------------------------------B3
   4                                                     --(U)--
[3]                                                        812
B3/812 - -| |- - File #2 MAIN_PRGRM - 626
        -(L)- - File #2 MAIN_PRGRM - 633
        -(U)- - File #2 MAIN_PRGRM - 634
```

```
Rung #635
|
|        PALLET     PALLET
|PAUSE   DETECTED   DETECTED
|LATCH   LEFT SIDE  RIGHT SIDE                                       PAUSE PALLET  |
|ENABLE  ENTRANCE   ENTRANCE                                         IN ENTRANCE   |
|PLE     SEN1       SEN3                                             MOTOR 3       |
| N7:37    I:003     I:003                                           M3PLL         |
|--] [------] [-------] [---------------------------------------------- B3         |
|   3        00        02                                           ---(L)---------|
| [628]                                                                 473        |
B3/473 - -]/[- - File #2 MAIN_PRGRM -  185,187
         -(L)- - File #2 MAIN_PRGRM -  635
         -(U)- - File #2 MAIN_PRGRM -  628
Rung #636
|
|        PALLET     PALLET
|PAUSE   DETECTED   DETECTED                                         PAUSE         |
|LATCH   LEFT SIDE  RIGHT SIDE                                       PALLET IN     |
|ENABLE  LOADLOCK   LOADLOCK                                         LLOCK         |
|PLE     SEN4       SEN6                                             MOTOR 4       |
| N7:37    I:003     I:003                                           M4PLL         |
|--] [------] [-------] [---------------------------------------------- B3         |
|   3        03        05                                           ---(L)---------|
| [628]                                                                 401        |
B3/401 - -]/[- - File #2 MAIN_PRGRM -  190,192
         -(L)- - File #2 MAIN_PRGRM -  636
         -(U)- - File #2 MAIN_PRGRM -  628
Rung #637
|
|        PALLET     PALLET
|PAUSE   DETECTED   DETECTED                                         PAUSE         |
|LATCH   LEFT SIDE  RIGHT SIDE                                       PALLET IN     |
|ENABLE  HEATER 1   HEATER 1                                         HEATER 1      |
|PLE     SEN7       SEN9                                             MOTOR 5       |
| N7:37    I:003     I:003                                           M5PH1         |
|--] [------] [-------] [---------------------------------------------- B3         |
|   3        06        10                                           ---(L)---------|
| [628]                                                                 402        |
B3/402 - -]/[- - File #2 MAIN_PRGRM -  195,195,197
         -(L)- - File #2 MAIN_PRGRM -  637
         -(U)- - File #2 MAIN_PRGRM -  628
Rung #638
|
|        PALLET     PALLET
|PAUSE   DETECTED   DETECTED
|LATCH   LEFT SIDE  RIGHT SIDE
|ENABLE  HEATER 1   HEATER 1                                         STOP MOTOR 6  |
|PLE     SEN7       SEN9                                             PAUSE LATCH   |
| N7:37    I:003     I:003                                           M6PL          |
|--] [------] [-------] [---------------------------------------------- B3         |
|   3        06        10                                           ---(L)---------|
| [628]                                                                 474        |
B3/474 - -]/[- - File #2 MAIN_PRGRM -  218
         -(L)- - File #2 MAIN_PRGRM -  638
         -(U)- - File #2 MAIN_PRGRM -  629
Rung #639
|
|        PALLET     PALLET
|PAUSE   DETECTED   DETECTED                                         PAUSE         |
|LATCH   LEFT SIDE  RIGHT SIDE                                       PALLET IN     |
|ENABLE  DWELL 1    DWELL 1                                          DWELL 1       |
|PLE     SEN13      SEN15                                            MOTOR 7       |
| N7:37    I:003     I:003                                           M7PD1         |
|--] [------] [-------] [---------------------------------------------- B3         |
|   3        14        16                                           ---(L)---------|
| [628]                                                                 403        |
```

```
B3/403 - -|/|- - File #2 MAIN_PRGRM - 231,231,233
         -(L)- - File #2 MAIN_PRGRM - 639
         -(U)- - File #2 MAIN_PRGRM - 628
Rung #640
|        PALLET      PALLET                                          PAUSE        |
|PAUSE   DETECTED    DETECTED                                        PALLET IN    |
|LATCH   LEFT SIDE   RIGHT SIDE                                      DWELL 2      |
|ENABLE  DWELL 2     DWELL 2                                         MOTOR 9      |
|PLE     SEN19       SEN21                                           M9PD2        |
| N7:37    I:023       I:023                                           B3         |
|-| |------| |---------| |-------------------------------------------(L)---------|
| 3        03          05                                              404        |
|[628]                                                                            |
B3/404 - -|/|- - File #2 MAIN_PRGRM - 253,255
         -(L)- - File #2 MAIN_PRGRM - 640
         -(U)- - File #2 MAIN_PRGRM - 628
Rung #641
|        PALLET      PALLET                                                       |
|PAUSE   DETECTED    DETECTED                                                     |
|LATCH   LEFT SIDE   RIGHT SIDE                                  STOP MOTOR 10    |
|ENABLE  DWELL 2     DWELL 2                                     PAUSE LATCH      |
|PLE     SEN19       SEN21                                       M10PL            |
| N7:37    I:023       I:023                                         B3           |
|-| |------| |---------| |-------------------------------------------(L)---------|
| 3        03          05                                            475          |
|[628]                                                                            |
B3/475 - -|/|- - File #2 MAIN_PRGRM - 258
         -(L)- - File #2 MAIN_PRGRM - 641
         -(U)- - File #2 MAIN_PRGRM - 629
Rung #642
|        PALLET      PALLET                                          PAUSE        |
|PAUSE   DETECTED    DETECTED                                        PALLET IN    |
|LATCH   LEFT SIDE   RIGHT SIDE                                      DWELL 3      |
|ENABLE  DWELL 3     DWELL 3                                         MOTOR 11     |
|PLE     SEN25       SEN27                                           M11PD3       |
| N7:37    I:023       I:023                                           B3         |
|-| |------| |---------| |-------------------------------------------(L)---------|
| 3        11          13                                              405        |
|[628]                                                                            |
B3/405 - -|/|- - File #2 MAIN_PRGRM - 263,265
         -(L)- - File #2 MAIN_PRGRM - 642
         -(U)- - File #2 MAIN_PRGRM - 628
Rung #643
|        PALLET      PALLET      PALLET                              PAUSE        |
|PAUSE   DETECTED    DETECTED    DETECTED                            PALLET IN    |
|LATCH   LEFT SIDE   RIGHT SIDE  CENTER                              DWELL 4      |
|ENABLE  DWELL 4     DWELL 4     MAGNETIC                            MOTOR 13     |
|PLE     SEN31       SEN33       SEN29                               M13PD4       |
| N7:37    I:037       I:037       I:037                               B3         |
|-| |------| |---------| |---------|/|-------------------------------(L)---------|
| 3        03          05          01                                  406        |
|[628]                                                                            |
B3/406 - -|/|- - File #2 MAIN_PRGRM - 285,287
         -(L)- - File #2 MAIN_PRGRM - 643
         -(U)- - File #2 MAIN_PRGRM - 628
```

```
Rung #644
|        PALLET     PALLET
|PAUSE   DETECTED   DETECTED
|LATCH   LEFT SIDE  RIGHT SIDE
|ENABLE  DWELL 4    DWELL 4                                   STOP MOTOR 14
|PLE     SEN31      SEN33                                     PAUSE LATCH
| N7:37    I:037      I:037                                   M14PL
|-| |-----| |--------| |------------------------------------------ B3
|  3       03          05                                       -(L)-
|[628]                                                           476
B3/476 - -|/|- - File #2 MAIN_PRGRM - 290
         -(L)- - File #2 MAIN_PRGRM - 644
         -(U)- - File #2 MAIN_PRGRM - 629
Rung #645
|        PALLET     PALLET
|PAUSE   DETECTED   DETECTED                                  PAUSE
|LATCH   LEFT SIDE  RIGHT SIDE                                PALLET IN
|ENABLE  DWELL 5    DWELL 5                                   DWELL 5
|PLE     SEN37      SEN39                                     MOTOR 15
| N7:37    I:037      I:037                                   M15P05
|-| |-----| |--------| |------------------------------------------ B3
|  3       11          13                                       -(L)-
|[628]                                                           407
B3/407 - -|/|- - File #2 MAIN_PRGRM - 295,297
         -(L)- - File #2 MAIN_PRGRM - 645
         -(U)- - File #2 MAIN_PRGRM - 628
Rung #646
|        PALLET     PALLET      PALLET
|PAUSE   DETECTED   DETECTED    DETECTED                      PAUSE
|LATCH   LEFT SIDE  RIGHT SIDE  CENTER                        PALLET IN
|ENABLE  DWELL 6    DWELL 6     CARBON                        DWELL 6
|PLE     SEN43      SEN45       SEN41                         MOTOR 17
| N7:37    I:053      I:053       I:053                       M17P06
|-| |-----| |--------| |---------|/|------------------------------ B3
|  3       03          05          01                           -(L)-
|[628]                                                           408
B3/408 - -|/|- - File #2 MAIN_PRGRM - 310,312
         -(L)- - File #2 MAIN_PRGRM - 646
         -(U)- - File #2 MAIN_PRGRM - 628
Rung #647
|        PALLET     PALLET
|PAUSE   DETECTED   DETECTED
|LATCH   LEFT SIDE  RIGHT SIDE
|ENABLE  DWELL 6    DWELL 6                                   STOP MOTOR 18
|PLE     SEN43      SEN45                                     PAUSE LATCH
| N7:37    I:053      I:053                                   M18PL
|-| |-----| |--------| |------------------------------------------ B3
|  3       03          05                                       -(L)-
|[628]                                                           477
B3/477 - -|/|- - File #2 MAIN_PRGRM - 315
         -(L)- - File #2 MAIN_PRGRM - 647
         -(U)- - File #2 MAIN_PRGRM - 629
Rung #648
|        PALLET     PALLET
|PAUSE   DETECTED   DETECTED                                  PAUSE
|LATCH   LEFT SIDE  RIGHT SIDE                                PALLET IN
|ENABLE  EXBUFFER   EXBUFFER                                  EXITBUFFER
|PLE     SEN49      SEN51                                     MOTOR 19
| N7:37    I:053      I:053                                   M19PXB
|-| |-----| |--------| |------------------------------------------ B3
|  3       11          13                                       -(L)-
|[628]                                                           409
```

```
B3/409 - -|/|- - File #2 MAIN_PRGRM -  320,322
         -(L)- - File #2 MAIN_PRGRM -  648
         -(U)- - File #2 MAIN_PRGRM -  628
Rung #649
|        PALLET     PALLET                                                           PAUSE PALLET |
|PAUSE   DETECTED   DETECTED                                                         EXITLOCK     |
|LATCH   LEFT SIDE  RIGHT SIDE                                                       MOTOR 20     |
|ENABLE  EXIT LOCK  EXLOCK                                                           PAUSE        |
|PLE     SENS2      SENS4                                                            M20PXL       |
| N7:37    I:053      I:053                                                             B3        |
|-| |------| |--------| |-------------------------------------------------------------(L)---------|
| 3          14         16                                                              490       |
|[628]                                                                                            |
B3/490 - -|/|- - File #2 MAIN_PRGRM -  331,333
         -(L)- - File #2 MAIN_PRGRM -  649
         -(U)- - File #2 MAIN_PRGRM -  628
Rung #650
|        PALLET     PALLET                                                           PAUSE        |
|PAUSE   DETECTED   DETECTED                                                         PALLET AT    |
|LATCH   LEFT SIDE  RIGHT SIDE                                                       EXIT         |
|ENABLE  EXIT END   EXIT END                                                         MOTOR 21     |
|PLE     SENS5      SENS7                                                            M21PPX       |
| N7:37    I:053      I:054                                                             B3        |
|-| |------| |--------| |-------------------------------------------------------------(L)---------|
| 3          17         17                                                              410       |
|[628]                                                                                            |
B3/410 - -|/|- - File #2 MAIN_PRGRM -  355,357
         -(L)- - File #2 MAIN_PRGRM -  650
         -(U)- - File #2 MAIN_PRGRM -  628
Rung #651
|LLOCK                                                                                            |
|CHAMBER                                                                             SCREEN       |
|PRESSUR AT                                                                          AREA 1       |
|ATMOSPHERE                                                                          VENTED       |
|PS2                                                                                 V1DN         |
|  I:002                                                                                B3        |
|---| |---------------------------------------------------------------------------------(L)-------|
|   04                                                                                  821       |
B3/821 - -(L)- - File #2 MAIN_PRGRM -  651
         -(U)- - File #2 MAIN_PRGRM -  652
Rung #652
|HEATER 1                                                                                         |
|CHAMBER                                                                             SCREEN       |
|=<250                                                                               AREA 1       |
|MICRONS                                                                             VENTED       |
|PIR2                                                                                V1DN         |
|  I:004                                                                                B3        |
|---| |---------------------------------------------------------------------------------(U)-------|
|   10                                                                                  821       |
B3/821 - -(L)- - File #2 MAIN_PRGRM -  651
         -(U)- - File #2 MAIN_PRGRM -  652
Rung #653
|DWELL 1                                                                                          |
|CHAMBER                                                                             SCREEN       |
|PRESSUR AT                                                                          AREA 1       |
|ATMOSPHERE                                                                          VENTED       |
|PS3                                                                                 V2DN         |
|  I:002                                                                                B3        |
|---| |---------------------------------------------------------------------------------(L)-------|
|   05                                                                                  822       |
B3/822 - -(L)- - File #2 MAIN_PRGRM -  653
         -(U)- - File #2 MAIN_PRGRM -  654
```

Rung #654
```
|CHROME                                                              |
|CHAMBER                                                      SCREEN |
|=<250                                                        AREA 1 |
|MICRONS                                                      VENTED |
|PIR6                                                         V20N   |
|  I:024                                                        B3   |
|---] [-----------------------------------------------------------(U)---|
|   07                                                          822  |
B3/822 - -(L)- - File #2 MAIN_PRGRM - 653
         -(U)- - File #2 MAIN_PRGRM - 654
```
Rung #655
```
|DWELL 3                                                             |
|CHAMBER                                                      SCREEN |
|PRESSUR AT                                                   AREA 3 |
|ATMOSPHERE                                                   VENTED |
|PS4                                                          V30N   |
|  I:022                                                        B3   |
|---] [-----------------------------------------------------------(L)---|
|   04                                                          823  |
B3/823 - -(L)- - File #2 MAIN_PRGRM - 655
         -(U)- - File #2 MAIN_PRGRM - 656
```
Rung #656
```
|MAGNETIC                                                            |
|CHAMBER                                                      SCREEN |
|=<250                                                        AREA 3 |
|MICRONS                                                      VENTED |
|PIR11                                                        V30N   |
|  I:040                                                        B3   |
|---] [-----------------------------------------------------------(U)---|
|   07                                                          823  |
B3/823 - -(L)- - File #2 MAIN_PRGRM - 655
         -(U)- - File #2 MAIN_PRGRM - 656
```
Rung #657
```
|DWELL 5                                                             |
|CHAMBER                                                      SCREEN |
|PRESSUR AT                                                   AREA 4 |
|ATMOSPHERE                                                   VENTED |
|PS5                                                          V4DN   |
|  I:036                                                        B3   |
|---] [-----------------------------------------------------------(L)---|
|   04                                                          824  |
B3/824 - -(L)- - File #2 MAIN_PRGRM - 657
         -(U)- - File #2 MAIN_PRGRM - 658
```
Rung #658
```
|CARBON                                                              |
|CHAMBER                                                      SCREEN |
|=<250                                                        AREA 4 |
|MICRONS                                                      VENTED |
|PIR16                                                        V4DN   |
|  I:054                                                        B3   |
|---] [-----------------------------------------------------------(U)---|
|   07                                                          824  |
B3/824 - -(L)- - File #2 MAIN_PRGRM - 657
         -(U)- - File #2 MAIN_PRGRM - 658
```
Rung #659
```
|EXLOCK                                                              |
|CHAMBER                                                      SCREEN |
|PRESSUR AT                                                   AREA 5 |
|ATMOSPHERE                                                   VENTED |
|PS6                                                          V5DN   |
|  I:052                                                        B3   |
|---] [-----------------------------------------------------------(L)---|
>                                                                    >
```

```
<                                                                        <
|    04                                                              825 |
B3/825 - -(L)- - File #2 MAIN_PRGRM -  659
        -(U)- - File #2 MAIN_PRGRM -  660
Rung #660
|EXIT BUFFER                                                             |
|CHAMBER                                                          SCREEN |
|=<250                                                            AREA 5 |
|MICRONS                                                          VENTED |
|PIR15                                                            V5DN   |
|    I:040                                                          B3   |
|----| |---------------------------------------------------------------(U)----|
|     13                                                            825  |
B3/825 - -(L)- - File #2 MAIN_PRGRM -  659
        -(U)- - File #2 MAIN_PRGRM -  660
Rung #661
|HEATER 1                                                                |
|CHAMBER                                                          SCREEN |
|=<250                                                            AREA 1 |
|MICRONS                                                          PUMPED |
|PIR2                                                             P1DN   |
|  I:004                                                            B3   |
|----| |---------------------------------------------------------------(L)----|
|     10                                                            826  |
B3/826 - -(L)- - File #2 MAIN_PRGRM -  661
        -(U)- - File #2 MAIN_PRGRM -  662
Rung #662
|LLOCK                                                                   |
|CHAMBER                                                          SCREEN |
|PRESSUR AT                                                       AREA 1 |
|ATMOSPHERE                                                       PUMPED |
|PS2                                                              P1DN   |
|  I:002                                                            B3   |
|----| |---------------------------------------------------------------(U)----|
|     04                                                            826  |
B3/826 - -(L)- - File #2 MAIN_PRGRM -  661
        -(U)- - File #2 MAIN_PRGRM -  662
Rung #663
|CHROME                                                                  |
|CHAMBER                                                          SCREEN |
|=<250                                                            AREA 2 |
|MICRONS                                                          PUMPED |
|PIR6                                                             P2DN   |
|  I:024                                                            B3   |
|----| |---------------------------------------------------------------(L)----|
|     07                                                            827  |
B3/827 - -(L)- - File #2 MAIN_PRGRM -  663
        -(U)- - File #2 MAIN_PRGRM -  664
Rung #664
|DWELL 1                                                                 |
|CHAMBER                                                          SCREEN |
|PRESSUR AT                                                       AREA 2 |
|ATMOSPHERE                                                       PUMPED |
|PS3                                                              P2DN   |
|  I:002                                                            B3   |
|----| |---------------------------------------------------------------(U)----|
|     05                                                            827  |
B3/827 - -(L)- - File #2 MAIN_PRGRM -  663
        -(U)- - File #2 MAIN_PRGRM -  664
```

```
Rung #665
|MAGNETIC                                                              |
|CHAMBER                                                       SCREEN  |
|=<250                                                         AREA 3  |
|MICRONS                                                       PUMPED  |
|PIR11                                                         P3DN    |
|  I:040                                                         B3    |
|--] [-------------------------------------------------------------(L)---|
|  07                                                            828   |
B3/828 - -(L)- - File #2 MAIN_PRGRM -  665
         -(U)- - File #2 MAIN_PRGRM -  666
Rung #666
|DWELL 3                                                               |
|CHAMBER                                                       SCREEN  |
|PRESSUR AT                                                    AREA 3  |
|ATMOSPHERE                                                    PUMPED  |
|PS4                                                           P3DN    |
|  I:022                                                         B3    |
|--] [-------------------------------------------------------------(U)---|
|  04                                                            828   |
B3/828 - -(L)- - File #2 MAIN_PRGRM -  665
         -(U)- - File #2 MAIN_PRGRM -  666
Rung #667
|CARBON                                                                |
|CHAMBER                                                       SCREEN  |
|=<250                                                         AREA 4  |
|MICRONS                                                       PUMPED  |
|PIR16                                                         P4DN    |
|  I:054                                                         B3    |
|--] [-------------------------------------------------------------(L)---|
|  07                                                            829   |
B3/829 - -(L)- - File #2 MAIN_PRGRM -  667
         -(U)- - File #2 MAIN_PRGRM -  668
Rung #668
|DWELL 5                                                               |
|CHAMBER                                                       SCREEN  |
|PRESSUR AT                                                    AREA 4  |
|ATMOSPHERE                                                    PUMPED  |
|PS5                                                           P4DN    |
|  I:036                                                         B3    |
|--] [-------------------------------------------------------------(U)---|
|  04                                                            829   |
B3/829 - -(L)- - File #2 MAIN_PRGRM -  667
         -(U)- - File #2 MAIN_PRGRM -  668
Rung #669
|EXIT BUFFER                                                           |
|CHAMBER                                                       SCREEN  |
|=<250                                                         AREA 5  |
|MICRONS                                                       PUMPED  |
|PIR15                                                         P5DN    |
|  I:040                                                         B3    |
|--] [-------------------------------------------------------------(L)---|
|  13                                                            830   |
B3/830 - -(L)- - File #2 MAIN_PRGRM -  669
         -(U)- - File #2 MAIN_PRGRM -  670
Rung #670
|EXLOCK                                                                |
|CHAMBER                                                       SCREEN  |
|PRESSUR AT                                                    AREA 5  |
|ATMOSPHERE                                                    PUMPED  |
|PS6                                                           P5DN    |
|  I:052                                                         B3    |
|--] [-------------------------------------------------------------(U)---|
>                                                                      >
```

```
<                                                                                          <
|     04                                                                               830 |
B3/830 - -(L)- - File #2 MAIN_PRGRM -  669
        -(U)- - File #2 MAIN_PRGRM -  670
Rung #671
|MECHANICAL
|PUMP 2                                                                                    |
|TC=<50                                                                                    |
|MICRONS                                                                   LINE PRESSURE   |
|PIR10                                                                     MADE-TC10       |
|   I:024                                                                  LPK-TC10        |
|                                                                               B3         |
|---] [---------------------------------------------------------------------------(L)------|
|     13                                                                         250       |
B3/250 - ] [ - File #3 CRYO_REGEN -  15,164,165,166,167,168,169,170,171,172,173,174
               File #6 TECH_RUNGS -  15
         -(L)- - File #2 MAIN_PRGRM -  671
         -(U)- - File #2 MAIN_PRGRM -  673
Rung #672
|MECHANICAL
|PUMP 2                                                                                    |
|TC=<50                                                                                    |
|MICRONS                                                              TC10 FAULT           |
|PIR10                                                                DELAY TIMER          |
|   I:024                                                             TC10FDT              |
|                                                                     +--TON--------+      |
|---]/[----------------------------------------------------------------|TIMER ON DELAY |-(EN)-|
|     13                                                              |TIMER:     T4:70|     |
|                                                                     |BASE (SEC):  1.0|-(DN) |
| T4:70.DN - ] [ - File #2 MAIN_PRGRM - 673                           |PRESET:       60|     |
|                                                                     |ACCUM:        60|     |
|                                                                     +----------------+     |
Rung #673
|TC10
|TIMEOUT                                                                   LINE PRESSURE   |
|TC10FDT                                                                   MADE-TC10       |
|   T4:70                                                                  LPK-TC10        |
|                                                                               B3         |
|---] [---------------------------------------------------------------------------(U)------|
|     DN                                                                         250       |
|[672]                                                                                     |
B3/250 - ] [ - File #3 CRYO_REGEN -  15,164,165,166,167,168,169,170,171,172,173,174
               File #6 TECH_RUNGS -  15
         -(L)- - File #2 MAIN_PRGRM -  671
         -(U)- - File #2 MAIN_PRGRM -  673
Rung #674
|                                                         LLOCK
|VENT         AUTO                    PUMP-VENT            CHAMBER                          |
|LOAD LOCK    MODE                    CYCLE LOAD PUMPDOWN  PRESSUR AT                       |
|PUSHBUTTON   ENABLE                  LOCK       LOADLOCK  ATMOSPHERE            VENT       |
|VNTLLPB      AUTO                    PD-VNT-LL  POLL      PS2                   LOAD LOCK  |
|   N7:3       N7:37                   N7:24      N7:24      I:002               VNT_LL     |
|                                                                                N7:24      |
|---] [---+---]/[------------------+----]/[--------]/[--------]/[------------------(L)------|
|    13   |     11                 |     14          15         04                 13       |
|[3]      |[158]                   | [676]       [684]                                      |
|         |PALLET     PALLET       |                                                         |
|         |DETECTED   DETECTED     |                                                         |
|         |CENTER     RIGHT SIDE   |                                                         |
|         |LOADLOCK   LOADLOCK     |                                                         |
|         |SEN5       SEN6         |                                                         |
|         |  I:003      I:003      |                                                         |
|         +---]/[-------]/[--------+                                                         |
|              04          05                                                                |
N7:24/13 - ] [ - File #2 MAIN_PRGRM -  166,173,202,675
          ]/[ - File #2 MAIN_PRGRM -  676,684
```

-(L)- - File #2 MAIN_PRGRM - 674
-(U)- - File #2 MAIN_PRGRM - 675
_F:N7:21(X21 - BTW - File #2 MAIN_PRGRM - 2
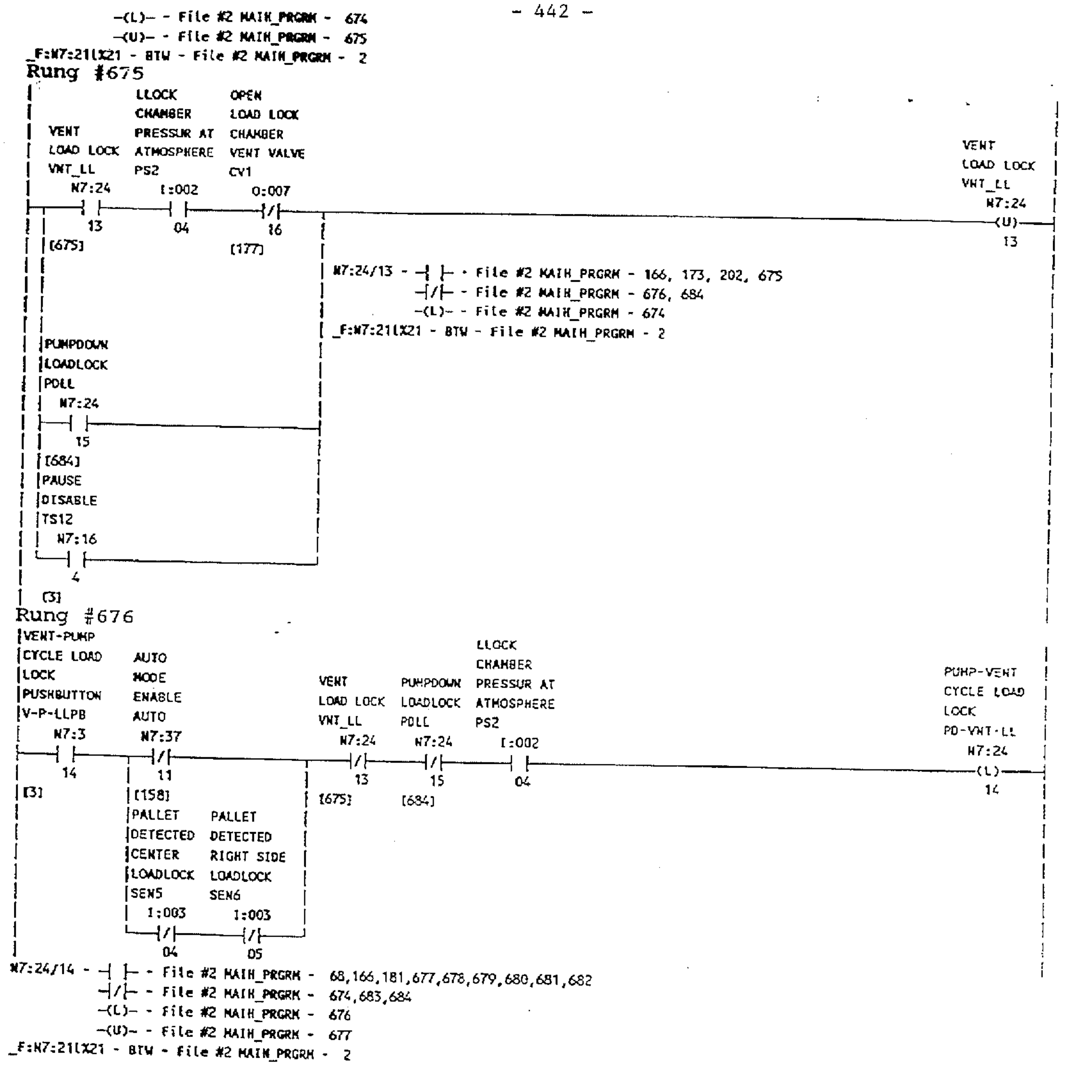

```
Rung #677
| PUMP-VENT                                                                  PUMP-VENT |
| CYCLE LOAD  DOOR 1                                                         CYCLE LOAD|
| LOCK        OPEN                                                           LOCK      |
| PD-VNT-LL   DROP1S                                                         PD-VNT-LL |
|   N7:24      I:006                                                         N7:24     |
|---] [--------] [---+--------------------------------------------------------(U)------|
| |  14          01  |                                                       14        |
| |[677]             |                                                                 |
| |                  | N7:24/14 - ] [ - File #2 MAIN_PRGRM - 68, 166, 181, 677, 678, 679, 680, 681, 682
| |                  |            ]/[ - File #2 MAIN_PRGRM - 674, 683, 684
| |                  |            -(L)- - File #2 MAIN_PRGRM - 676
| |                  | _F:N7:211X21 - BTW - File #2 MAIN_PRGRM - 2
| |PAUSE             |
| |DISABLE           |
| |TS12              |
| | N7:16            |
| +--] [-------------+
|     4
| [3]

Rung #678
|
|PUMP-VENT                                        LLOCK        VENT                    PUMPDOWN |
|CYCLE LOAD  DOOR 1   DOOR 2   THREE CYCLES      CHAMBER      LOADLOCK                LOADLOCK |
|LOCK        CLOSED   CLOSED   COMPLETE          PRESSUR AT   CLEAN                   CLEAN    |
|PD-VNT-LL   DRCL1S   DRCL2S   LL-CCC            ATMOSPHERE   CYCLE                   CYCLE    |
|                                                PS2          VNT-LL-CC               PD-LL-CC |
|  N7:24     I:006    I:006     C5:9             I:002        B3                      B3       |
|---] [--------] [------] [-------]/[--------------] [----------]/[--------------------(L)------|
|    14        00       02        DN               04          145                    144      |
|[677]                         [682]                           [680]                           |
B3/144 - ] [ - File #2 MAIN_PRGRM - 167,202
         ]/[ - File #2 MAIN_PRGRM - 167
        -(L)- - File #2 MAIN_PRGRM - 678
        -(U)- - File #2 MAIN_PRGRM - 679

Rung #679
|
| PUMP-VENT   LOAD LOCK                                                      PUMPDOWN |
| CYCLE LOAD  CHAMBER =<250                                                  LOADLOCK |
| LOCK        MICRONS                                                        CLEAN    |
| PD-VNT-LL   PIR1                                                           CYCLE    |
|   N7:24       I:004                                                        PD-LL-CC |
|                                                                            B3       |
|---] [----------] [---+------------------------------------------------------(U)------|
| |  14            07  |                                                     144      |
| |[677]               |                                                              |
| |                    | B3/144 - ] [ - File #2 MAIN_PRGRM - 167, 202
| |                    |          ]/[ - File #2 MAIN_PRGRM - 167
| |                    |         -(L)- - File #2 MAIN_PRGRM - 678
| |PAUSE               |
| |DISABLE             |
| |TS12                |
| | N7:16              |
| +--] [---------------+
|     4
| [3]
```

Rung #680

```
|                         LLOCK
|PUMP-VENT   LOAD LOCK    CHAMBER                                         VENT       |
|CYCLE LOAD  CHAMBER =<250 PRESSUR AT  THREE CYCLES                        LOADLOCK   |
|LOCK        MICRONS      ATMOSPHERE   COMPLETE                           CLEAN      |
|PD-VNT-LL   PIR1         PS2          LL-CCC                             CYCLE      |
|  N7:24        I:004        I:002        C5:9                            VNT-LL-CC  |
|                                                                           B3       |
|---] [---------]/[----------]/[----------]/[-------------------------------(L)------|
|    14          07           04           DN                              145       |
|[677]                                    [682]
B3/145 - ] [ - - File #2 MAIN_PRGRM - 173
         ]/[ - - File #2 MAIN_PRGRM - 678,682
         -(L)- - File #2 MAIN_PRGRM - 680
         -(U)- - File #2 MAIN_PRGRM - 681
```

Rung #681

```
|             OPEN        LLOCK
| PUMP-VENT   LOAD LOCK   CHAMBER                                         VENT       |
| CYCLE LOAD  CHAMBER     PRESSUR AT                                      LOADLOCK   |
| LOCK        VENT VALVE  ATMOSPHERE                                      CLEAN      |
| PD-VNT-LL   CV1         PS2                                             CYCLE      |
|   N7:24       O:007       I:002                                         VNT-LL-CC  |
|                                                                           B3       |
|-+---] [---------]/[---------] [---+-------------------------------------(U)------|
| |     14          16          04  |                                      145       |
| |[677]          [177]             |                                              |
| |                                 | B3/145 - ] [ - - File #2 MAIN_PRGRM - 173     |
| |                                 |          ]/[ - - File #2 MAIN_PRGRM - 678, 682|
| |                                 |          -(L)- - File #2 MAIN_PRGRM - 680     |
| |PAUSE                            |                                              |
| |DISABLE                          |                                              |
| |TS12                             |                                              |
| |  N7:16                          |                                              |
| +---] [---------------------------+                                              |
|     4                                                                            |
|  [3]                                                                             |
```

Rung #682

```
|            VENT        LLOCK
|PUMP-VENT   LOADLOCK    CHAMBER                                                    |
|CYCLE LOAD  CLEAN       PRESSUR AT                        LOAD LOCK                |
|LOCK        CYCLE       ATMOSPHERE                        CLEAN CYCLE              |
|PD-VNT-LL   VNT-LL-CC   PS2                               COUNTER                  |
|  N7:24        B3         I:002                           LL-CCC                   |
|                                                          +-CTU------------+        |
|---] [---------]/[---------] [----------------------------+COUNT UP        +-(CU)-|
|    14          145          04                           |COUNTER:   C5:9|        |
|[677]         [681]                                       |PRESET:       4+-(DN)  |
|                                                          |ACCUM:        0|        |
|                                                          +----------------+        |
C5:9 - CTU - File #2 MAIN_PRGRM - 682
       RES - File #2 MAIN_PRGRM - 683
C5:9.DN - ] [ - - File #2 MAIN_PRGRM - 181
          ]/[ - - File #2 MAIN_PRGRM - 678,680
```

Rung #683

PUMP-VENT CYCLE LOAD LOCK PD-VNT-LL N7:24 —|/|— 14 [677]

DOOR 1 OPEN DROP1S I:006 —| |— 01

PAUSE DISABLE TS12 N7:16 —| |— 4 [3]

LOAD LOCK CLEAN CYCLE COUNTER LL-CCC C5:9 —[RES]—

C5:9 - CTU - File #2 MAIN_PRGRM - 682
C5:9.DN - —| |— - File #2 MAIN_PRGRM - 181
—|/|— - File #2 MAIN_PRGRM - 678, 680

Rung #684

PUMP DOWN LOAD LOCK PUSH BUTTON PDLLPB N7:3 —| |— 15 [3]

VENT AREA 1 ENABLE VENT1E N7:37 —| |— 6 [410]

AUTO MODE ENABLE AUTO N7:37 —|/|— 11 [158]

PALLET DETECTED CENTER LOADLOCK SENS I:003 —|/|— 04

PALLET DETECTED RIGHT SIDE LOADLOCK SEN6 I:003 —|/|— 05

DOOR 2 CLOSED DRCL2S I:006 —| |— 02

LOAD LOCK CHAMBER =<250 MICRONS PIR1 I:004 —|/|— 07

PIRANI GUAGE 1 NO FAULT PGNF1 I:004 —| |— 14

VENT LOAD LOCK VNT_LL N7:24 —|/|— 13 [675]

PUMP-VENT CYCLE LOAD LOCK PD-VNT-LL N7:24 —|/|— 14 [677]

LOAD LOCK CHAMBER =<250 MICRONS PIR1 I:004 —|/|— 07

PUMPDOWN LOADLOCK POLL N7:24 —(L)— 15

N7:24/15 - —| |— - File #2 MAIN_PRGRM - 68,167,675,685,686
—|/|— - File #2 MAIN_PRGRM - 167,674,676
—(L)— - File #2 MAIN_PRGRM - 684
—(U)— - File #2 MAIN_PRGRM - 687
_F:N7:21L21 - BTW - File #2 MAIN_PRGRM - 2

Rung #685

PUMPDOWN LOADLOCK POLL N7:24 —| |— 15 [684]

ROUGH VALVE 1 OPEN DELAY RV1OP_DLY

TON
TIMER ON DELAY —(EN)—
TIMER: T4:189
BASE (SEC): 1.0 —(DN)—
PRESET: 5
ACCUM: 0

T4:189.DN - —| |— - File #2 MAIN_PRGRM - 167

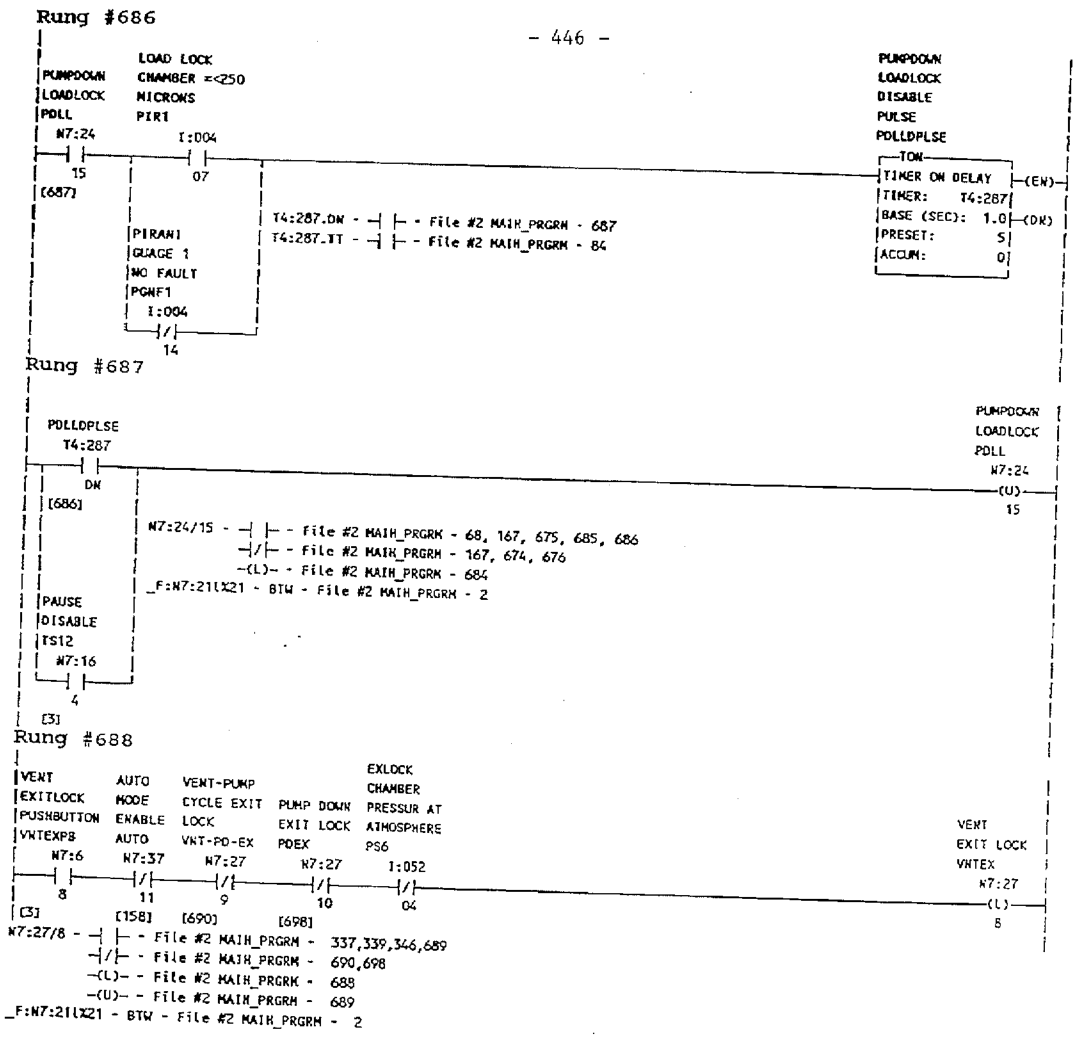
Rung #686
- 446 -
PUMPDOWN
LOADLOCK
POLL
N7:24
15
[687]
LOAD LOCK
CHAMBER =<250
MICRONS
PIR1
I:004
07
PIRANI
GUAGE 1
NO FAULT
PGNF1
I:004
14
T4:287.DN - ┤ ├ - File #2 MAIN_PRGRM - 687
T4:287.TT - ┤ ├ - File #2 MAIN_PRGRM - 84
PUMPDOWN
LOADLOCK
DISABLE
PULSE
POLLDPLSE
TON
TIMER ON DELAY
TIMER: T4:287
BASE (SEC): 1.0
PRESET: 5
ACCUM: 0
(EN)
(DN)
Rung #687
POLLDPLSE
T4:287
DN
[686]
N7:24/15 - ┤ ├ - File #2 MAIN_PRGRM - 68, 167, 675, 685, 686
┤/├ - File #2 MAIN_PRGRM - 167, 674, 676
-(L)- - File #2 MAIN_PRGRM - 684
_F:N7:21[X21 - BTW - File #2 MAIN_PRGRM - 2
PAUSE
DISABLE
TS12
N7:16
4
[3]
PUMPDOWN
LOADLOCK
POLL
N7:24
(U)
15
Rung #688
VENT
EXITLOCK
PUSHBUTTON
VNTEXPB
N7:6
8
[3]
AUTO
MODE
ENABLE
AUTO
N7:37
11
[158]
VENT-PUMP
CYCLE EXIT
LOCK
VNT-PD-EX
N7:27
9
[690]
PUMP DOWN
EXIT LOCK
PDEX
N7:27
10
[698]
EXLOCK
CHAMBER
PRESSUR AT
ATMOSPHERE
PS6
I:052
04
VENT
EXIT LOCK
VNTEX
N7:27
(L)
8
N7:27/8 - ┤ ├ - File #2 MAIN_PRGRM - 337,339,346,689
┤/├ - File #2 MAIN_PRGRM - 690,698
-(L)- - File #2 MAIN_PRGRM - 688
-(U)- - File #2 MAIN_PRGRM - 689
_F:N7:21[X21 - BTW - File #2 MAIN_PRGRM - 2

Rung #689

```
        EXLOCK        OPEN
        CHAMBER       EXLOCK
VENT    PRESSUR AT    CHAMBER                                          VENT
EXIT LOCK ATMOSPHERE  VENT VALVE                                       EXIT LOCK
VNTEX   PS6           CVS                                              VNTEX
N7:27   I:052         O:057                                            N7:27
--| |------| |-----------|/|----------------------------------------------(U)--
   8        04            16                                              8
[689]                     [367]
                            N7:27/8 - -| |- - File #2 MAIN_PRGRM - 337, 339, 346, 689
                                      -|/|- - File #2 MAIN_PRGRM - 690, 698
                                      -(L)- - File #2 MAIN_PRGRM - 688
                            _F:N7:21lX21 - BTW - File #2 MAIN_PRGRM - 2
PUMP DOWN
EXIT LOCK
PUSH BUTTON
PDEXPB
N7:6
--| |---------------------
   10
[3]
PAUSE
DISABLE
TS12
N7:16
--| |---------------------
   4
[3]
```

Rung #690

```
VENT-PUMP                                       EXLOCK
CYCLE EXIT  AUTO                                CHAMBER
LOCK        MODE     VENT       PUMP DOWN       PRESSUR AT                 VENT-PUMP
PUSHBUTTON  ENABLE   EXIT LOCK  EXIT LOCK       ATMOSPHERE                 CYCLE EXIT
V-P-EXPB    AUTO     VNTEX      PDEX            PS6                        LOCK
N7:6        N7:37    N7:27      N7:27           I:052                      VNT-PD-EX
                                                                           N7:27
--| |--------|/|-------|/|--------|/|-------------| |------------------------(L)--
   9          11        8          10              04                         9
[3]         [158]    [689]      [698]
N7:27/9 - -| |- - File #2 MAIN_PRGRM - 78,339,351,691,692,693,694,695,696
          -|/|- - File #2 MAIN_PRGRM - 688,697,698
          -(L)- - File #2 MAIN_PRGRM - 690
          -(U)- - File #2 MAIN_PRGRM - 691
_F:N7:21lX21 - BTW - File #2 MAIN_PRGRM - 2
```

Rung #691

```
VENT-PUMP
CYCLE EXIT  DOOR 12                                                    VENT-PUMP
LOCK        OPEN                                                       CYCLE EXIT
VNT-PD-EX   DROP12S                                                    LOCK
N7:27       I:056                                                      VNT-PD-EX
                                                                       N7:27
--| |---------| |--------------------------------------------------------(U)--
   9           07                                                         9
[691]
              N7:27/9 - -| |- - File #2 MAIN_PRGRM - 78, 339, 351, 691, 692, 693, 694, 695, 696
                        -|/|- - File #2 MAIN_PRGRM - 688, 697, 698
                        -(L)- - File #2 MAIN_PRGRM - 690
              _F:N7:21lX21 - BTW - File #2 MAIN_PRGRM - 2
PAUSE
DISABLE
TS12
N7:16
--| |---------------------
   4
[3]
```

```
Rung #692
|                                                              EXLOCK
|VENT-PUMP                                                     CHAMBER
|CYCLE EXIT  DOOR 12   DOOR 11   THREE CYCLES   PRESSUR AT   VENT                     PUMPDOWN
|LOCK     -  CLOSED    CLOSED    COMPLETE       ATMOSPHERE   EXIT LOCK                EXIT LOCK
|VNT-PD-EX   DRCL12S   DRCL11S   EX-CCC         PS6          VNT-EX                   CLEAN CYCLE
|  N7:27      I:056     I:056      C5:11         I:052        B3                      PD-EX-CC
|---] [-------] [-------] [--------]/[----------] [--------]/[----------------------------B3
|    9          06        04         DN            04          498                     -(L)---|
|[691]                             [696]                     [694]                     497
B3/497 - ] [ - File #2 MAIN_PRGRM - 337,340,367
       -(L)- - File #2 MAIN_PRGRM - 692
       -(U)- - File #2 MAIN_PRGRM - 693
Rung #693
|             EXITLOCK
| VENT-PUMP   CHAMBER
| CYCLE EXIT  <250                                                                    PUMPDOWN
| LOCK        MICRONS                                                                 EXIT LOCK
| VNT-PD-EX   PIR17                                                                   CLEAN CYCLE
|   N7:27      I:054                                                                  PD-EX-CC
|-+--] [--------] [---+---------------------------------------------------------------B3
| |   9           10  |                                                               -(U)---|
| |[691]              |                                                               497
| |                   | B3/497 - ] [ - File #2 MAIN_PRGRM - 337, 340, 367
| |                   |        -(L)- - File #2 MAIN_PRGRM - 692
| |PAUSE              |
| |DISABLE            |
| |TS12               |
| |  N7:16            |
| +--] [--------------+
|     4
|  [3]
Rung #694
|           EXITLOCK  EXLOCK
|VENT-PUMP  CHAMBER   CHAMBER
|CYCLE EXIT <250      PRESSUR AT  THREE CYCLES
|LOCK       MICRONS   ATMOSPHERE  COMPLETE                                            VENT
|VNT-PD-EX  PIR17     PS6         EX-CCC                                              EXIT LOCK
|  N7:27     I:054     I:052       C5:11                                              VNT-EX
|---] [-------] [-------]/[---------]/[-------------------------------------------------B3
|    9         10        04          DN                                               -(L)---|
|[691]                             [696]                                              498
B3/498 - ] [ - File #2 MAIN_PRGRM - 346,367
       ]/[ - File #2 MAIN_PRGRM - 692,696
       -(L)- - File #2 MAIN_PRGRM - 694
       -(U)- - File #2 MAIN_PRGRM - 695
```

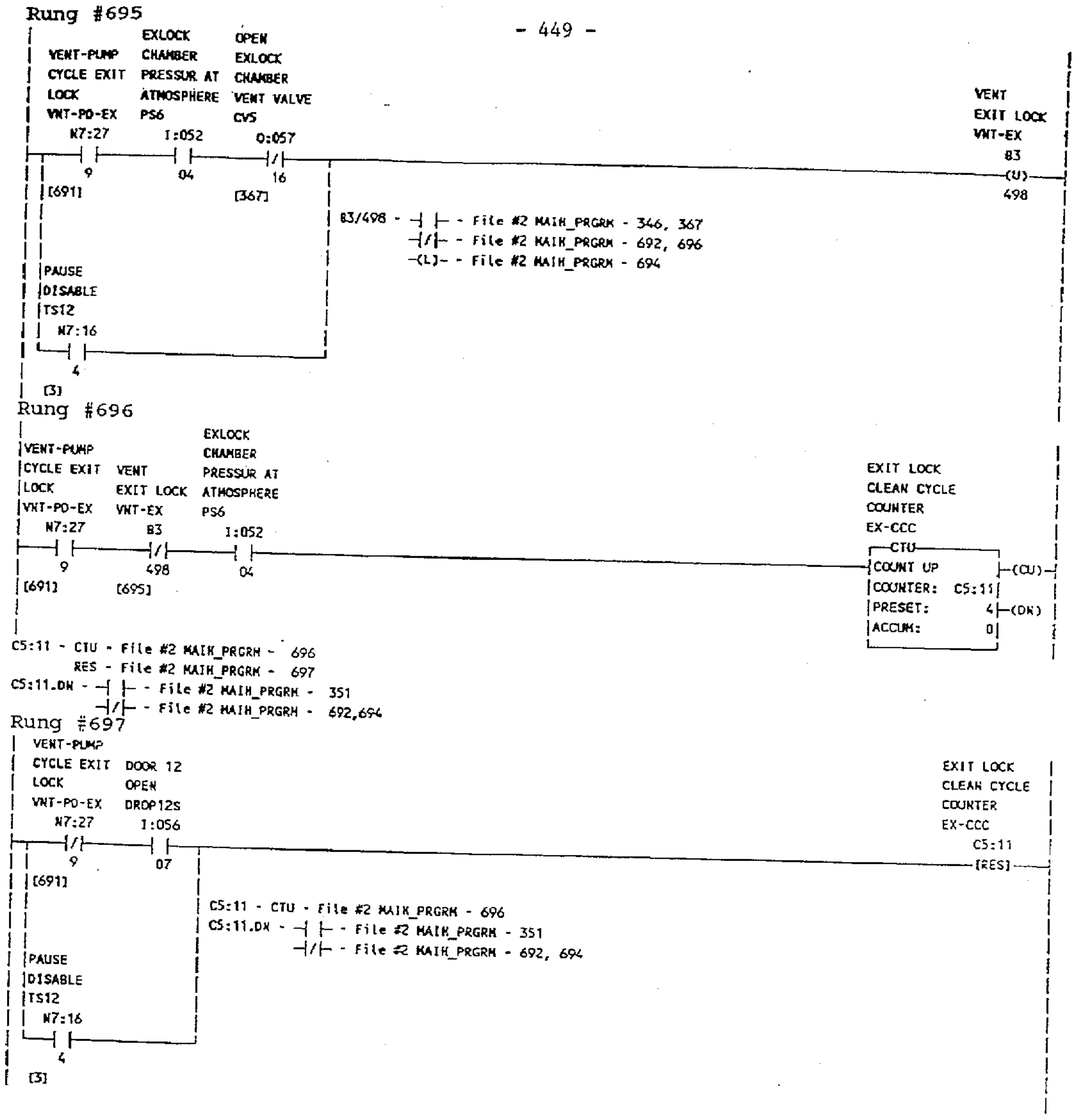
Rung #695
- 449 -
VENT-PUMP CYCLE EXIT LOCK VNT-PD-EX N7:27 9 [691]
EXLOCK CHAMBER PRESSUR AT ATMOSPHERE PS6 I:052 04
OPEN EXLOCK CHAMBER VENT VALVE CV5 O:057 16 [367]
VENT EXIT LOCK VNT-EX B3 (U) 498
B3/498 - ┤ ├ - File #2 MAIN_PRGRM - 346, 367
┤/├ - File #2 MAIN_PRGRM - 692, 696
-(L)- - File #2 MAIN_PRGRM - 694
PAUSE DISABLE TS12 N7:16 4 [3]
Rung #696
VENT-PUMP CYCLE EXIT LOCK VNT-PD-EX N7:27 9 [691]
VENT EXIT LOCK VNT-EX B3 498 [695]
EXLOCK CHAMBER PRESSUR AT ATMOSPHERE PS6 I:052 04
EXIT LOCK CLEAN CYCLE COUNTER EX-CCC
CTU
COUNT UP
COUNTER: C5:11
PRESET: 4
ACCUM: 0
(CU)
(DN)
C5:11 - CTU - File #2 MAIN_PRGRM - 696
RES - File #2 MAIN_PRGRM - 697
C5:11.DN - ┤ ├ - File #2 MAIN_PRGRM - 351
┤/├ - File #2 MAIN_PRGRM - 692,694
Rung #697
VENT-PUMP CYCLE EXIT LOCK VNT-PD-EX N7:27 9 [691]
DOOR 12 OPEN DROP12S I:056 07
EXIT LOCK CLEAN CYCLE COUNTER EX-CCC C5:11 [RES]
C5:11 - CTU - File #2 MAIN_PRGRM - 696
C5:11.DN - ┤ ├ - File #2 MAIN_PRGRM - 351
┤/├ - File #2 MAIN_PRGRM - 692, 694
PAUSE DISABLE TS12 N7:16 4 [3]

Rung #698

```
PUMP DOWN      AUTO               EXITLOCK   PIRINI                    VENT-PUMP    EXITLOCK
EXIT LOCK      MODE     DOOR 11   CHAMBER    GUAGE 8      VENT         CYCLE EXIT   CHAMBER      PUMP DOWN
PUSH BUTTON    ENABLE   CLOSED    <250       NO FAULT     EXIT LOCK    LOCK         <250         EXIT LOCK
PDEXPB         AUTO     DRCL11S   MICRONS    PGNF8        VNTEX        VNT-PD-EX    MICRONS      PDEX
                                  PIR17                                             PIR17
   N7:6        N7:37    I:056     I:054      I:054        N7:27        N7:27        I:054        N7:27
---] [---------]/[------] [-------]/[--------] [----------]/[----------]/[----------]/[----------(L)---
   10          11       04        10         15           8            9            10           10
 [3]           [158]                                      [689]        [691]
 VENT AREA
 5 ENABLE
 VENT5E
   N7:37
---] [---
   10
[433]
```

N7:27/10 - ] [ - File #2 MAIN_PRGRM - 78,340,699
]/[ - File #2 MAIN_PRGRM - 109,688,690
(L) - File #2 MAIN_PRGRM - 698
(U) - File #2 MAIN_PRGRM - 700
_F:N7:211X21 - BTW - File #2 MAIN_PRGRM - 2

Rung #699

```
               EXITLOCK
               CHAMBER
PUMP DOWN      <250                                              PUMPDOWN
EXIT LOCK      MICRONS                                           EXITLOCK
PDEX           PIR17                                             COMPLETE
                                                                 PFEXEND
   N7:27       I:054                                             +-TON-----------------+
---] [---------] [-----------------------------------------------|TIMER ON DELAY       |-(EN)-
   10          10                                                |TIMER:       T4:222 |
[698]                                                            |BASE (SEC):     1.0 |-(DN)
                                                                 |PRESET:           5 |
               PIRINI                                            |ACCUM:            0 |
               GUAGE 8                                           +---------------------+
               NO FAULT
               PGNF8
                 I:054
               --]/[--
                 15
```

T4:222.DN - ] [ - File #2 MAIN_PRGRM - 700
T4:222.TT - ] [ - File #2 MAIN_PRGRM - 98

Rung #700

```
                                                                 PUMP DOWN
 PFEXEND                                                         EXIT LOCK
 T4:222                                                          PDEX
                                                                 N7:27
---] [-----------------------------------------------------------(U)---
   DN                                                            10
 [699]

 PAUSE
 DISABLE
 TS12
   N7:16
---] [---
   4
[3]
```

N7:27/10 - ] [ - File #2 MAIN_PRGRM - 78, 340, 699
]/[ - File #2 MAIN_PRGRM - 109, 688, 690
(L) - File #2 MAIN_PRGRM - 698
_F:N7:211X21 - BTW - File #2 MAIN_PRGRM - 2

Rung #701

```
|MANUAL                                                    MANUAL
|CONTROL                                                   CHAMBER
|CHAMBER                                                   VENT 1
|VENT 1                                                    CLOSE
|CLOSE                                                     MCVNT1CL
|M-CV1-0                                                    N7:25
|  N7:4
|---] [-----------------------------------------------------+--(L)--+-|
|    0                                                      |   0   |
|[3]                                                        |       |
|                                                           |MANUAL |
| N7:25/0 - -(U)- - File #2 MAIN_PRGRM - 706                |CHAMBER|
| _F:N7:21[X21 - BTW - File #2 MAIN_PRGRM - 2               |VENT 1 |
| N7:27/11 - -(L)- - File #2 MAIN_PRGRM - 706               |OPEN   |
| _F:N7:21[X21 - BTW - File #2 MAIN_PRGRM - 2               |MCVNT1OP
|                                                           | N7:27 |
|                                                           +--(U)--+
                                                                11
```

Rung #702

```
|MANUAL
|CONTROL                                                   MANUAL
|CHAMBER                                                   CHAMBER
|VENT VALVE                                                VENT 2
|CLOSE                                                     CLOSE
|M-CV2-0                                                   MCVNT2CL
|    N7:4                                                   N7:25
|---] [-----------------------------------------------------+--(L)--+-|
|     1                                                     |   1   |
|[3]                                                        |       |
|                                                           |MANUAL |
| N7:25/1 - -(U)- - File #2 MAIN_PRGRM - 707                |CHAMBER|
| _F:N7:21[X21 - BTW - File #2 MAIN_PRGRM - 2               |VENT 2 |
| N7:27/12 - -(L)- - File #2 MAIN_PRGRM - 707               |OPEN   |
| _F:N7:21[X21 - BTW - File #2 MAIN_PRGRM - 2               |MCVNT2OP
|                                                           | N7:27 |
|                                                           +--(U)--+
                                                                12
```

Rung #703

```
|MANUAL
|CONTROL                                                   MANUAL
|CHAMBER                                                   CHAMBER
|VENT VALVE                                                VENT 3
|CLOSE                                                     CLOSE
|M-CV3-0                                                   MCVNT3CL
|    N7:4                                                   N7:25
|---] [-----------------------------------------------------+--(L)--+-|
|     2                                                     |   2   |
|[3]                                                        |       |
|                                                           |MANUAL |
| N7:25/2 - -(U)- - File #2 MAIN_PRGRM - 708                |CHAMBER|
| _F:N7:21[X21 - BTW - File #2 MAIN_PRGRM - 2               |VENT 3 |
| N7:27/13 - -(L)- - File #2 MAIN_PRGRM - 708               |OPEN   |
| _F:N7:21[X21 - BTW - File #2 MAIN_PRGRM - 2               |MCVNT3OP
|                                                           | N7:27 |
|                                                           +--(U)--+
                                                                13
```

Rung #704

MANUAL CONTROL CHAMBER VENT VALVE 4 CLOSE M-CV4-0 N7:4 3 [3]

MANUAL CHAMBER VENT_4 CLOSE MCVNT4CL N7:25 (L) 3

MANUAL CHAMBER VENT 4 OPEN MCVNT4OP N7:27 (U) 14

N7:25/3 - -(U)- - File #2 MAIN_PRGRM - 709
_F:N7:21[X21 - BTW - File #2 MAIN_PRGRM - 2
N7:27/14 - -(L)- - File #2 MAIN_PRGRM - 709
_F:N7:21[X21 - BTW - File #2 MAIN_PRGRM - 2

Rung #705

MANUAL CONTROL CHAMBER VENT VALVE 5 CLOSE M-CV5-0 N7:4 4 [3]

MANUAL CHAMBER VENT 5 CLOSE MCVNT5CL N7:25 (L) 4

MANUAL CHAMBER VENT 5 OPEN MCVNT5OP N7:27 (U) 15

N7:25/4 - -(U)- - File #2 MAIN_PRGRM - 710
_F:N7:21[X21 - BTW - File #2 MAIN_PRGRM - 2
N7:27/15 - -(L)- - File #2 MAIN_PRGRM - 710
_F:N7:21[X21 - BTW - File #2 MAIN_PRGRM - 2

Rung #706

MANUAL CONTROL CHAMBER VENT 1 OPEN M-CV1-1 N7:6 11 [3]

MANUAL CHAMBER VENT 1 OPEN MCVNT1OP N7:27 (L) 11

MANUAL CHAMBER VENT 1 CLOSE MCVNT1CL N7:25 (U) 0

N7:27/11 - -(U)- - File #2 MAIN_PRGRM - 701
_F:N7:21[X21 - BTW - File #2 MAIN_PRGRM - 2
N7:25/0 - -(L)- - File #2 MAIN_PRGRM - 701
_F:N7:21[X21 - BTW - File #2 MAIN_PRGRM - 2

```
Rung #707
|MANUAL                                                          |
|CONTROL                                              MANUAL     |
|CHAMBER                                              CHAMBER    |
|VENT 2                                               VENT 2     |
|OPEN                                                 OPEN       |
|M-CV2-1                                              MCVNT2OP   |
|  N7:6                                                N7:27     |
|---| |------------------------------------------------+--(L)--+-|
|    12                                                |   12  | |
|[3]                                                   |       | |
|                                                      |MANUAL | |
| N7:27/12 - -(U)- - File #2 MAIN_PRGRM - 702          |CHAMBER| |
| _F:N7:21[X21 - BTW - File #2 MAIN_PRGRM - 2          |VENT 2 | |
| N7:25/1 - -(L)- - File #2 MAIN_PRGRM - 702           |CLOSE  | |
| _F:N7:21[X21 - BTW - File #2 MAIN_PRGRM - 2          |MCVNT2CL |
|                                                      | N7:25 | |
|                                                      +--(U)--+ |
                                                           1
Rung #708
|MANUAL                                                          |
|CONTROL                                              MANUAL     |
|CHAMBER                                              CHAMBER    |
|VENT 3                                               VENT 3     |
|OPEN                                                 OPEN       |
|M-CV3-1                                              MCVNT3OP   |
|  N7:6                                                N7:27     |
|---| |------------------------------------------------+--(L)--+-|
|    13                                                |   13  | |
|[3]                                                   |       | |
|                                                      |MANUAL | |
| N7:27/13 - -(U)- - File #2 MAIN_PRGRM - 703          |CHAMBER| |
| _F:N7:21[X21 - BTW - File #2 MAIN_PRGRM - 2          |VENT 3 | |
| N7:25/2 - -(L)- - File #2 MAIN_PRGRM - 703           |CLOSE  | |
| _F:N7:21[X21 - BTW - File #2 MAIN_PRGRM - 2          |MCVNT3CL |
|                                                      | N7:25 | |
|                                                      +--(U)--+ |
                                                           2
Rung #709
|MANUAL                                                          |
|CONTROL                                              MANUAL     |
|CHAMBER                                              CHAMBER    |
|VENT 4                                               VENT 4     |
|OPEN                                                 OPEN       |
|M-CV4-1                                              MCVNT4OP   |
|  N7:6                                                N7:27     |
|---| |------------------------------------------------+--(L)--+-|
|    14                                                |   14  | |
|[3]                                                   |       | |
|                                                      |MANUAL | |
| N7:27/14 - -(U)- - File #2 MAIN_PRGRM - 704          |CHAMBER| |
| _F:N7:21[X21 - BTW - File #2 MAIN_PRGRM - 2          |VENT 4 | |
| N7:25/3 - -(L)- - File #2 MAIN_PRGRM - 704           |CLOSE  | |
| _F:N7:21[X21 - BTW - File #2 MAIN_PRGRM - 2          |MCVNT4CL |
|                                                      | N7:25 | |
|                                                      +--(U)--+ |
                                                           3
```

- 454 -

```
Rung #710
|
|MANUAL CONTROL                                                                 MANUAL
|CHAMBER VENT 5                                                                 CHAMBER
|OPEN                                                                           VENT 5
|M-CV5-1                                                                        OPEN
|     N7:6                                                                      MCVNT5OP
|-----| |------------------------------------------------------------------------ N7:27
|      15                                                                    +---(L)---+
|[3]                                                                         |    15   |
|                                                                            |MANUAL   |
| N7:27/15 - -(U)- - File #2 MAIN_PRGRM - 705                                |CHAMBER  |
| _F:N7:21ΣX21 - BTW - File #2 MAIN_PRGRM - 2                                |VENT 5   |
| N7:25/4 - -(L)- - File #2 MAIN_PRGRM - 705                                 |CLOSE    |
| _F:N7:21ΣX21 - BTW - File #2 MAIN_PRGRM - 2                                |MCVNT5CL |
|                                                                            | N7:25   |
|                                                                            +---(U)---+
Rung #711                                                                         4
|              WATER TEST
|              LOCK                                                        WATER FLOW
| AUTOPULSE    H2O_TST_LOK                                                 SWITCH TEST
|  T4:282         B3                                                       WFS_TST
|+----| |----+----| |--------------------------------------------------------- B3
|||     TT   |     33                                                      ---(L)---
|| [158]     |                                                                281
||           | B3/281 - -| |- - File #2 MAIN_PRGRM - 712
||           |          -(U)- - File #2 MAIN_PRGRM - 713
||AUOFPULSE  |
||  T4:283   |
|+----| |----+
|      DN
| [155]
Rung #712
|WATER FLOW
|SWITCH TEST                                            WATER FLOW
|WFS_TST                                                SWITCH TIMER
|   B3                                                  WFS_TMR
|---| |-------------------------------------------------+-TON-----------------+
|   281                                                 |TIMER ON DELAY       |-(EN)-
|[711]                                                  |TIMER:       T4:330  |
|                                                       |BASE (SEC):     1.0  |-(DN)
|                                                       |PRESET:          20  |
|                                                       |ACCUM:            0  |
|                                                       +---------------------+
T4:330 - TON - File #2 MAIN_PRGRM -  712
         LEQ - File #2 MAIN_PRGRM -  719
T4:330.ACC - LEQ - File #2 MAIN_PRGRM -  717,718,720
             GEQ - File #2 MAIN_PRGRM -  717,718,719,720
T4:330.DN - -| |- - File #2 MAIN_PRGRM -  713
Rung #713
|
|                                                              WATER FLOW
|WFS_TMR                                                       SWITCH TEST
| T4:330                                                       WFS_TST
|---| |--------------------------------------------------------- B3
|   DN                                                         ---(U)---
|[712]                                                            281
B3/281 - -| |- - File #2 MAIN_PRGRM -  712
         -(L)- - File #2 MAIN_PRGRM -  711
         -(U)- - File #2 MAIN_PRGRM -  713
```

- 455 -

Rung #714

| CATHODE WATER FLOW SWITCH 1 CHR1A | CATHODE WATER FLOW SWITC:I 1 CHR1A | CATHODE WATER FLOW SWITCH 1 CHR1A | CATHODE WATER FLOW SWITCH 4 CHR4A | WATER FLOW SWITCH 5 CHR1B | CATHODE WATER FLOW SWITCH 6 CHR2B | CATHODE WATER FLOW SWITCH 7 CHR3B | CATHODE WATER FLOW SWITCH 8 CHR4B | CATHODE WATER FLOW SWITCH 9 WFS9 | CATHODE WATER FLOW SWITCH 10 WFS10 |
|---|---|---|---|---|---|---|---|---|---|
| I:026 -\|/\|- 10 | I:026 -\|/\|- 10 | I:026 -\|/\|- 10 | I:026 -\|/\|- 13 | I:026 -\|/\|- 14 | I:026 -\|/\|- 15 | 1:026 -\|/\|- 16 | I:026 -\|/\|- 17 | I:042 -\|/\|- 10 | I:042 -\|/\|- 11 |

| CATHODE WATER FLOW SWITCH 11 WFS11 | CATHODE WATER FLOW SWITCH 12 WFS12 | FLOW SWITCH GROUP 1 OK FTST1_OK |
|---|---|---|
| I:042 -\|/\|- 12 | I:042 -\|/\|- 13 | B3 -( )- 283 |

B3/283 - -\| \|- - File #2 MAIH_PRGRM - 717
-( )- - File #2 MAIH_PRGRM - 714

Rung #715

| CATHODE WATER FLOW SWITCH 13 WFS13 | CATHODE WATER FLOW SWITCH 14 WFS14 | CATHODE WATER FLOW SWITCH 15 WFS15 | CATHODE WATER FLOW SWITCH 16 WFS16 | CATHODE WATER FLOW SWITCH 17 WFS17 | CATHODE WATER FLOW SWITCH 18 WFS18 | CATHODE WATER FLOW SWITCH 19 WFS19 | CATHODE WATER FLOW SWITCH 20 WFS20 | CATHODE WATER FLOW SWITCH 21 WFS21 | CATHODE WATER FLOW SWITCH 22 WFS22 |
|---|---|---|---|---|---|---|---|---|---|
| I:042 -\|/\|- 14 | I:042 -\|/\|- 15 | I:042 -\|/\|- 16 | I:042 -\|/\|- 17 | I:056 -\|/\|- 10 | I:056 -\|/\|- 11 | I:056 -\|/\|- 12 | I:056 -\|/\|- 13 | I:056 -\|/\|- 14 | I:056 -\|/\|- 15 |

| CATHODE WATER FLOW SWITCH 23 WFS23 | CATHODE WATER FLOW SWITCH 24 WFS24 | FLOW TEST GROUP 2 OK FTST2_OK |
|---|---|---|
| I:056 -\|/\|- 16 | I:056 -\|/\|- 17 | B3 -( )- 284 |

B3/284 - -\| \|- - File #2 MAIH_PRGRM - 717
-( )- - File #2 MAIH_PRGRM - 715

Rung #716

| CATHODE SHIELD H2O FLOW SWITCH 1 CSFS1 | CATHODE SHIELD H2O FLOW SWITCH 2 CSFS2 | CATHODE SHIELD H2O FLOW SWITCH 9 CSFS9 | CATHODE SHIELD H2O FLOW SWITCH 10 CSFS10 | CATHODE SHIELD H2O FLOW SWITCH 17 CSFS17 | CATHODE SHIELD H2O FLOW SWITCH 18 CSFS18 | HEATER SHIELD H2O FLOW SWITCH 1 HSFS1 | HEATER SHIELD H2O FLOW SWITCH 2 HSFS2 | HEATER SHIELD H2O FLOW SWITCH 3 HSFS3 | HEATER SHIELD H2O FLOW SWITCH 4 HSFS4 | HEATER SHIELD H2O FLOW SWITCH 5 HSFS5 |
|---|---|---|---|---|---|---|---|---|---|---|
| I:025 -\|/\|- 04 | I:025 -\|/\|- 05 | I:041 -\|/\|- 04 | I:041 -\|/\|- 05 | I:055 -\|/\|- 04 | I:055 -\|/\|- 05 | I:006 -\|/\|- 10 | I:006 -\|/\|- 11 | I:006 -\|/\|- 12 | I:006 -\|/\|- 13 | I:023 -\|/\|- 16 |

| HEATER SHIELD H2O FLOW SWITCH 6 HSFS6 | FLOW TEST GROUP 3 OK FTST3_OK |
|---|---|
| I:023 -\|/\|- 17 | B3 -( )- 285 |

B3/285 - -\| \|- - File #2 MAIH_PRGRM - 717
-( )- - File #2 MAIH_PRGRM - 716

```
Rung #717
|FLOW SWITCH  FLOW TEST    FLOW TEST                                                                        FLOW TEST CLOSE  |
|GROUP 1 OK   GROUP 2 OK   GROUP 3 OK                                                                       SUMMARY          |
|FTST1_OK     FTST2_OK     FTST3_OK     WFS_TMR                      WFS_TMR                                FLOW_CL_TST      |
|   B3           B3           B3       +-GEQ-----------------------+ +-LEQ-----------------------+              B3           |
|---] [----------] [----------] [------+GRTR THAN OR EQUAL (A>=B)+-+LESS THAN OR EQUAL (A<=B)+--------------( )-----------|
|   283          284          285      |SOURCE A:    T4:330.ACC| |SOURCE A:    T4:330.ACC|              286            |
|[714]       [715]        [716]        |                      0| |                      0|                             |
|                                      |SOURCE B:             8| |SOURCE B:             9|                             |
|                                      |                      8| |                      9|                             |
|                                      +-----------------------+ +-----------------------+                             |
|                                      T4:330.ACC - [712]        T4:330.ACC - [712]                                   |
Rung #718
|                                                                                                  WATER FLOW  |
|                                                                                                  OPEN TEST   |
| WSFFTMR    WFS_TMR                      WFS_TMR                                                  WFS_OP_TST  |
|  T4:93    +-GEQ----------------------+  +-LEQ-----------------------+                                B3     |
|+--] [--+--+GRTR THAN OR EQUAL (A>=B)+--+LESS THAN OR EQUAL (A<=B)+----------------------------------( )----|
||   TT   |  |SOURCE A:    T4:330.ACC|  |SOURCE A:    T4:330.ACC|                                   339     |
||[5:199] |  |                      0|  |                      0|                                           |
||        |  |SOURCE B:            17|  |SOURCE B:            18|                                           |
||        |  |                     17|  |                     18|                                           |
||        |  +-----------------------+  +-----------------------+                                           |
||        |  T4:330.ACC - [712]         T4:330.ACC - [712]                                                 |
||CFFTMR  |                                                                                                 |
|| T4:94  |                                                                                                 |
|+--] [---+                                                                                                 |
|   TT                                                                                                      |
| [5:202]                                                                                                   |
Rung #719
|                               WATER FLOW                                                   OPEN WATER    |
|                               SWITCH TIMER                                                 VALVE FOR TEST|
|WFS_TMR                        WFS_TMR                                                      OP_VLV        |
|+-GEQ-----------------------+ +-LEQ-----------------------+                                    B3        |
|+GRTR THAN OR EQUAL (A>=B)+-+LESS THAN OR EQUAL (A<=B)+--------------------------------------( )---------|
||SOURCE A:    T4:330.ACC| |SOURCE A:          T4:330|                                      342          |
||                      0| |                       512|                                                   |
||SOURCE B:            11| |SOURCE B:               19|                                                   |
||                     11| |                        19|                                                   |
|+-----------------------+ +-------------------------+                                                    |
|T4:330.ACC - [712]        T4:330 - [712]                                                                  |
B3/342 - ] [ - File #2 MAIN_PRGRM - 721
         -( )- - File #2 MAIN_PRGRM - 719
Rung #720
|                                                                                            CLOSE WATER   |
|                                                                                            VALVE FOR TEST|
|WFS_TMR                        WFS_TMR                                                      CL_VLV        |
|+-GEQ-----------------------+ +-LEQ-----------------------+                                    B3        |
|+GRTR THAN OR EQUAL (A>=B)+-+LESS THAN OR EQUAL (A<=B)+--------------------------------------( )---------|
||SOURCE A:    T4:330.ACC| |SOURCE A:      T4:330.ACC|                                       341         |
||                      0| |                        0|                                                    |
||SOURCE B:             1| |SOURCE B:               9|                                                    |
||                      1| |                        9|                                                    |
|+-----------------------+ +-------------------------+                                                    |
|T4:330.ACC - [712]        T4:330.ACC - [712]                                                              |
B3/341 - ]/[ - File #2 MAIN_PRGRM - 721
         -( )- - File #2 MAIN_PRGRM - 720
```

Rung #721

RESET WATER VALVE RESET RSTH2OPB I:024 16

WATER VALVE EMERGENCY OFF PUSHBUTTON H2OEOFPB I:024 17

MAIN WATER ON MAIN_H2O I:002 07

CLOSE WATER VALVE FOR TEST CL_VLV B3 341 [720]

WATER VALVES H2O_VLV B3 ( ) 146

WATER VALVES H2O_VLV B3 146 [721]

OPEN WATER VALVE FOR TEST OP_VLV B3 342 [719]

B3/146 - -| |- - File #2 MAIN_PRGRM - 721,723,728,731,734,737
-( )- - File #2 MAIN_PRGRM - 721

Rung #722

CHR_OF_DLY T4:322 DN [728]

CHROME WATER ON CHR_ON B3 (U) 273

B3/273 - -| |- - File #2 MAIN_PRGRM - 724
-(L)- - File #2 MAIN_PRGRM - 723
-(U)- - File #2 MAIN_PRGRM - 722

Rung #723

WATER VALVES H2O_VLV B3 146 [721]

MAIN WATER ON MAIN_H2O I:002 07

CHROME WATER ON CHR_ON B3 (L) 273

MAG WATER ON MAG_ON B3 (L) 274

CARBON WATER ON CAR_ON B3 (L) 275

HEATER WATER ON HTR_ON B3 (L) 276

B3/273 - -| |- - File #2 MAIN_PRGRM - 724
-(U)- - File #2 MAIN_PRGRM - 722
B3/274 - -| |- - File #2 MAIN_PRGRM - 730
-(U)- - File #2 MAIN_PRGRM - 729
B3/275 - -| |- - File #2 MAIN_PRGRM - 733
-(U)- - File #2 MAIN_PRGRM - 732
B3/276 - -| |- - File #2 MAIN_PRGRM - 736
-(U)- - File #2 MAIN_PRGRM - 735

Rung #724

```
|CHROME WATER                                                          CHROME RETURN
|ON                                                                    VALVE 3
|CHR_OK         CHR_OF_DLY                                             CHRTV3
|    B3           T4:322                                                 O:030
|----| |-----------| |----------------------------------------------+----( )----+-
|   273            DN                                                |    16     |
|[723]          [728]                                                |           |
| O:030/16 - -| |- - File #2 MAIN_PRGRM - 725                        |CHROME RETURN
| O:030/17 - -| |- - File #2 MAIN_PRGRM - 725                        |VALVE 4
|                                                                    |CHRTV4
|                                                                    |   O:030
|                                                                    +----( )----+
|                                                                         17
```

Rung #725

```
|CHROME SUPPLY  CHROME SUPPLY  CHROME RETURN  CHROME RETURN
|VALVE 1        VALVE 2        VALVE 3        VALVE 4                  CHROME WATER OK
|CHSUV1         CHSUV2         CHRTV3         CHRTV4                   CHR-OK
|   O:030          O:030          O:030          O:030                    B3
|----| |------------| |------------| |------------| |---------------------( )----|
|    14             15             16             17                      277
|[728]          [728]          [724]          [724]
B3/277 - -| |- - File #2 MAIN_PRGRM -  235,236,238,242
         -|/|- - File #2 MAIN_PRGRM -  237,240,243
         -( )- - File #2 MAIN_PRGRM -  725
```

Rung #726

```
|MAG SUPPLY  MAG SUPPLY  MAG RETURN  MAG RETURN
|VALVE 5     VALVE 6     VALVE 7     VALVE 8                           MAG WATER OK
|MGSUV5      MGSUV6      MGRTV7      MGRTV8                            MAG_OK
|  O:044       O:044       O:044       O:044                             B3
|----| |---------| |---------| |---------| |-----------------------------( )----|
|    14          15          16          17                             278
|[731]       [731]       [730]       [730]
B3/278 - -| |- - File #2 MAIN_PRGRM -  267,268,270,274
         -|/|- - File #2 MAIN_PRGRM -  269,272,275
         -( )- - File #2 MAIN_PRGRM -  726
```

Rung #727

```
|CARBON SUPPLY  CARBON SUPPLY  CARBON RETURN  CARBON RETURN
|VALVE 9        VALVE 10       VALVE 11       VALVE 12                 CARBON WATER OK
|CASUV9         CASUV10        CARTV11        CARTV12                  CAR_OK
|   O:060          O:060          O:060          O:060                    B3
|----| |------------| |------------| |------------| |---------------------( )----|
|    14             15             16             17                      279
|[734]          [734]          [733]          [733]
B3/279 - -| |- - File #2 MAIN_PRGRM -  299,300
         -( )- - File #2 MAIN_PRGRM -  727
```

```
Rung #728
 CHROME
 CHAMBER
 =<250
 MICRONS          WATER VALVES                                                          CHROME SUPPLY
 PIR6             H20_VLV                                                               VALVE 1
  I:024              B3                                                   CHR_ON_DLY    CHSUV1
 --] [----------------] [-----------------------------------------------------] [--------( )--
    07               146                                                    T4:321       O:030
                  [721]                                                       DN           14
                  O:030/14 - ] [ - File #2 MAIN_PRGRM - 725                 [728]
                  O:030/15 - ] [ - File #2 MAIN_PRGRM - 725
 RESET WATER      T4:321.DN - ] [ - File #2 MAIN_PRGRM - 728                            CHROME SUPPLY
 VALVE RESET      T4:322.DN - ] [ - File #2 MAIN_PRGRM - 724                            VALVE 2
 RSTH2OPB                     ]/[ - File #2 MAIN_PRGRM - 722                            CHSUV2
  I:024                                                                                   O:030
 --] [--                                                                                --( )--
    16                                                                                     15
                                                                          CHROME WATER
                                                                          ON DELAY
                                                                          CHR_ON_DLY
                                                                          +-TON-----------------+
                                                                          |TIMER ON DELAY       |-(EN)-
                                                                          |TIMER:        T4:321 |
                                                                          |BASE (SEC):      1.0 |-(DN)
                                                                          |PRESET:           10 |
                                                                          |ACCUM:            10 |
                                                                          +---------------------+
                                                                          CHROME WATER
                                                                          OFF DELAY
                                                                          CHR_OF_DLY
                                                                          +-TOF-----------------+
                                                                          |TIMER OFF DELAY      |-(EN)-
                                                                          |TIMER:        T4:322 |
                                                                          |BASE (SEC):      1.0 |-(DN)
                                                                          |PRESET:            2 |
                                                                          |ACCUM:             0 |
                                                                          +---------------------+
Rung #729
 MAGNETIC WATER
 OFF DELAY
 MAG_OF_DLY                                                                            MAG WATER ON
  T4:324                                                                               MAG_ON
 --]/[----------------------------------------------------------------------------------- B3
    DN                                                                                  --(U)--
 [731]                                                                                     274
 B3/274 - ] [ - File #2 MAIN_PRGRM - 730
          -(L)- - File #2 MAIN_PRGRM - 723
          -(U)- - File #2 MAIN_PRGRM - 729
Rung #730
                 MAGNETIC WATER
 MAG WATER ON    OFF DELAY                                                             MAG RETURN
 MAG_ON          MAG_OF_DLY                                                            VALVE 7
   B3               T4:324                                                             MGRTV7
 --] [----------------] [-----------------------------------------------------------     O:044
   274                 DN                                                              --( )--
 [729]           [731]                                                                     16
 O:044/16 - ] [ - File #2 MAIN_PRGRM - 726
 O:044/17 - ] [ - File #2 MAIN_PRGRM - 726
                                                                                       MAG RETURN
                                                                                       VALVE 8
                                                                                       MGRTV8
                                                                                         O:044
                                                                                       --( )--
                                                                                           17
```

Rung #731

```
MAGNETIC
CHAMBER
=<250
MICRONS            WATER VALVES                                                      MAG SUPPLY
PIR11              H2O_VLV                                                           VALVE 5
 I:040               B3                                           MAG_ON_DLY         MGSUV5
                                                                   T4:323             0:044
---] [-------------] [--------------------------------------------] [-------------( )---
   07               146                                             DN                14
                   [721]                                           [731]
                   0:044/14 - ] [ - - File #2 MAIN_PRGRM - 726
 RESET WATER       0:044/15 - ] [ - - File #2 MAIN_PRGRM - 726
 VALVE RESET       T4:323.DN - ] [ - - File #2 MAIN_PRGRM - 731                      MAG SUPPLY
 RSTH2OPB          T4:324.DN - ] [ - - File #2 MAIN_PRGRM - 730                      VALVE 6
  I:024                        ]/[ - - File #2 MAIN_PRGRM - 729                      MGSUV6
---] [---                                                                             0:044
   16                                                                             ---( )---
                                                                                      15
                                                                   MAG WATER
                                                                   ON DELAY
                                                                   MAG_ON_DLY
                                                                   +-TON-------------+
                                                                   |TIMER ON DELAY   |-(EN)-
                                                                   |TIMER:     T4:323|
                                                                   |BASE (SEC):   1.0|-(DN)
                                                                   |PRESET:        10|
                                                                   |ACCUM:         10|
                                                                   +-----------------+
                                                                   MAG WATER
                                                                   OFF DELAY
                                                                   MAG_OF_DLY
                                                                   +-TOF-------------+
                                                                   |TIMER OFF DELAY  |-(EN)-
                                                                   |TIMER:     T4:324|
                                                                   |BASE (SEC):   1.0|-(DN)
                                                                   |PRESET:         2|
                                                                   |ACCUM:          0|
                                                                   +-----------------+
```

Rung #732

```
CAR_OF_DLY                                                               CARBON WATER ON
 T4:326                                                                  CAR_ON
                                                                           B3
---]/[-----------------------------------------------------------------------(U)---
   DN                                                                      275
[734]
B3/275 - ] [ - - File #2 MAIN_PRGRM -  733
        -(L)- - File #2 MAIN_PRGRM -  723
        -(U)- - File #2 MAIN_PRGRM -  732
```

Rung #733

```
CARBON WATER ON                                                          CARBON RETURN
CAR_ON              CAR_OF_DLY                                           VALVE 11
   B3                T4:326                                              CARTV11
                                                                           0:060
---] [---------------] [--------------------------------------------------( )---
   275                DN                                                   16
[732]               [734]
0:060/16 - ] [ - - File #2 MAIN_PRGRM - 727
0:060/17 - ] [ - - File #2 MAIN_PRGRM - 727
                                                                         CARBON RETURN
                                                                         VALVE 12
                                                                         CARTV12
                                                                           0:060
                                                                        ---( )---
                                                                           17
```

Rung #734

```
CARBON
CHAMBER
=<250
MICRONS        WATER VALVES                                   CARBON SUPPLY
PIR16          H20_VLV                          CAR_ON_DLY    VALVE 9
I:054          B3                               T4:325        CASUV9
                                                              O:060
--| |----------| |------------------------------| |-----------( )---
  07           146                              DN            14
               [721]                            [734]
               O:060/14 - -| |- - File #2 MAIN_PRGRM - 727
               O:060/15 - -| |- - File #2 MAIN_PRGRM - 727    CARBON SUPPLY
RESET WATER    T4:325.DN - -| |- - File #2 MAIN_PRGRM - 734   VALVE 10
VALVE RESET    T4:326.DN - -| |- - File #2 MAIN_PRGRM - 733   CASUV10
RSTH2OPB                   -|/|- - File #2 MAIN_PRGRM - 732   O:060
I:024                                                         ( )
--| |--                                                       15
  16
                                                CARBON WATER
                                                ON DELAY
                                                CAR_ON_DLY
                                                +-TON--------------+
                                                |TIMER ON DELAY    |-(EN)-
                                                |TIMER:     T4:325 |
                                                |BASE (SEC):   1.0 |-(DN)
                                                |PRESET:        10 |
                                                |ACCUM:         10 |
                                                +------------------+
                                                CARBON WATER
                                                OFF DELAY
                                                CAR_OF_DLY
                                                +-TOF--------------+
                                                |TIMER OFF DELAY   |-(EN)-
                                                |TIMER:     T4:326 |
                                                |BASE (SEC):   1.0 |-(DN)
                                                |PRESET:         2 |
                                                |ACCUM:          0 |
                                                +------------------+
```

Rung #735

```
                                                              HEATER WATER ON
HTR_OF_DLY                                                    HTR_ON
T4:328                                                        B3
--|/|---------------------------------------------------------(U)---
  DN                                                          276
[737]
B3/276 - -| |- - File #2 MAIN_PRGRM - 736
         -(L)- - File #2 MAIN_PRGRM - 723
         -(U)- - File #2 MAIN_PRGRM - 735
```

Rung #736

```
                                                              HEATER WATER
HEATER WATER ON                                               VALVE 2
HTR_ON          HTR_OF_DLY                                    HH202
B3              T4:328                                        O:010
--| |-----------| |-------------------------------------------( )---
  276           DN                                            17
[735]           [737]
O:010/17 - -| |- - File #2 MAIN_PRGRM - 147,148
           -|/|- - File #2 MAIN_PRGRM - 149,150
           -( )- - File #2 MAIN_PRGRM - 736
```

Rung #737
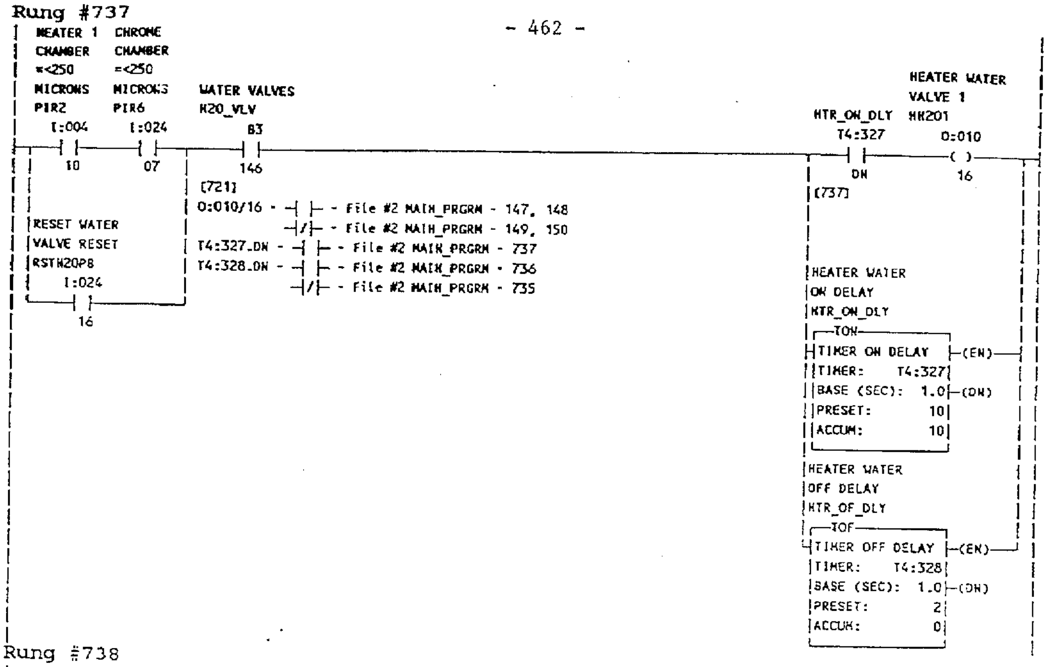
Rung #738
Rung #739
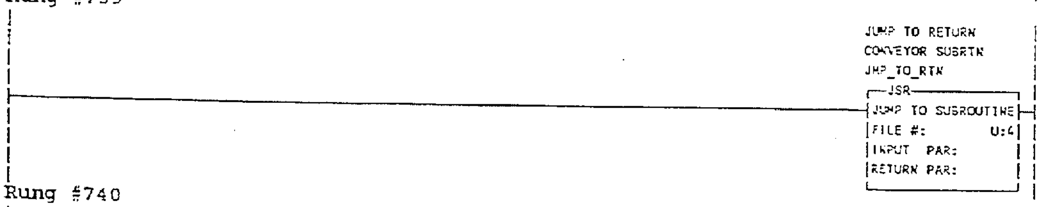
Rung #740
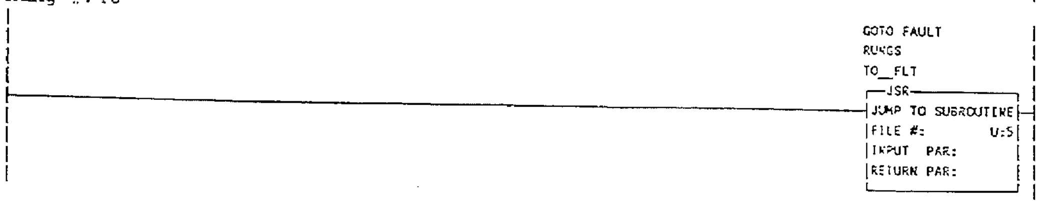

```
Rung #741                          - 463 -
                                                       JUMP TO TECH
                                                       RUNGS
                                                       JMP_TR
                                                       +--JSR--------------+
|------------------------------------------------------+JUMP TO SUBROUTINE +-|
                                                       |FILE #:        U:6 |
                                                       |INPUT  PAR:        |
                                                       |RETURN PAR:        |
                                                       +-------------------+
Rung #742
|-----------------------------------------------------------------------[END]-|
```

COPYRIGHT 1989, 1990, 1991
CONNER PERIPHERALS, INC.

```
Rung #000
                                                                        COMPRESSOR
 REGENERATE   ABORT CRYO                                                1 REGEN-
 CRYO 1       TIMER                                                     ERATION
 TS01         ABORTCRYO                                                 PROGRAM
   N7:15        T4:297                                                  CYRGN1
                                                                           B3
---] [----------]/[--------------------------------------------------+----(L)----
    9            TT                                                  |    321
 [2:3]        [27]                                                   |
                                                                     | MANUAL
              B3/321 - ] [ - - File #2 MAIN_PRGRM - 115, 458         | COMPRESSOR 1
                               File #3 CRYO_REGEN - 1, 3, 4, 5, 21, 29, 30, 259
                               File #6 TECH_RUNGS - 14               | REGENERATION
 REGENERATE           ]/[ - - File #2 MAIN_PRGRM - 26, 115           | ENABLE
 ALL CRYO'S                    File #3 CRYO_REGEN - 10, 12, 14, 17, 21, 23, 24, 33
 TS20                 -(U)- - File #3 CRYO_REGEN - 25                | MC1RE
   N7:16      N7:36/9 - -(U)- - File #3 CRYO_REGEN - 25              |    N7:36
 +--] [--+    _F:N7:21[X21 - BTW - File #2 MAIN_PRGRM - 2            +----(L)----
     12                                                                    9
 [2:3]
Rung #001
 COMPRESSOR   HEATER 1
 1 REGEN-     CHAMBER
 ERATION      GATE VALVE                                     REGEN COMP. 1
 PROGRAM      CLOSE                                          PULSE TIMER
 CYRGN1       HV1S1                                          CR1PT
    B3         I:002                                         +-TON--------------+
---] [----------] [------------------------------------------+-TIMER ON DELAY   +-(EN)-
    321         06                                           | TIMER:     T4:61 |
 [0]                                                         | BASE (SEC):  1.0 +-(DN)
                                                             | PRESET:        1 |
 T4:61.TT - ] [ - - File #3 CRYO_REGEN - 5, 6, 7             | ACCUM:         0 |
 T4:341.ACC - LEQ - File #3 CRYO_REGEN - 3                   +------------------+
 T4:341.TT - ] [ - - File #3 CRYO_REGEN - 2, 263             |
             ]/[ - - File #3 CRYO_REGEN - 264                |
                                                             | SIEVE TRAP
                                                             | 1 TIMER
                                                             | S_TRAP_1
                                                             | +-TON--------------+
                                                             +-TIMER ON DELAY     +-(EN)-
                                                               | TIMER:    T4:341 |
                                                               | BASE (SEC):  1.0 +-(DN)
                                                               | PRESET:     5400 |
                                                               | ACCUM:         0 |
                                                               +------------------+
```

```
Rung #002
|                  MECHANICAL
|                  PUMP 2
|                  ISOLATION                                          SIEVE TRAP
|                  VALVE OPEN                                         ISOLATION TRAP
|  S_TRAP_1        MP2IVOP                                            1
|   T4:341          I:025                                             SVIV1
|                                                                       O:010
+--+--] [--+------] [-----------------------------------------------------( )---+
|  |   TT   |      13                                                    00
|  |[1]     |
|  |        | O:010/00 - -] [- - File #3 CRYO_REGEN - 3
|  |OPEN    |
|  |CRYO ROUGH
|  |VALVE 1 |
|  |CR1     |
|  |  O:007 |
|  +--] [---+
|      11
| [15]
Rung #003
|COMPRESSOR
|1 REGEN-
|ERATION                         SIEVE TRAP
|PROGRAM                         ISOLATION TRAP                       SIEVE TRAP
|CYRGN1     S_TRAP_1             1                                    1 HEATER
|   B3      +-LEQ---------------+ SVIV1                               SVHTR1
+---] [-----+LESS THAN OR EQUAL (A<=B)+  O:010                           O:010
|   321     |SOURCE A:   T4:341.ACC|---] [-----------------------------( )---+
|[0]        |                     0| [2]  00                             12
|           |SOURCE B:         3600|
|           |                  3600|
|           +----------------------+
|           T4:341.ACC - [1]
Rung #004
|COMPRESSOR
|1 REGEN-
|ERATION                                                             SCREEN
|PROGRAM                                                             REGENERATION
|CYRGN1                                                              CRYO 1
|   B3                                                               SCRRGN1
+---] [--------------------------------------------------------------B3
|   321                                                              ( )---+
|[0]                                                                 801
Rung #005
|COMPRESSOR
|1 REGEN-
|ERATION    CRYO REGEN
|PROGRAM    1 PULSE
|CYRGN1     CR1PT                                                     PURGE 1
|   B3       T4:61                                                    P1
+---] [------] [-----------------------------------------------------B3
|   321       TT                                                     (L)---+
|[0]        [1]                                                      631
B3/631 - -] [- - File #3 CRYO_REGEN -  7,9,11
                 File #6 TECH_RUNGS -  15
         -(L)- - File #3 CRYO_REGEN -  5
         -(U)- - File #3 CRYO_REGEN -  12
```

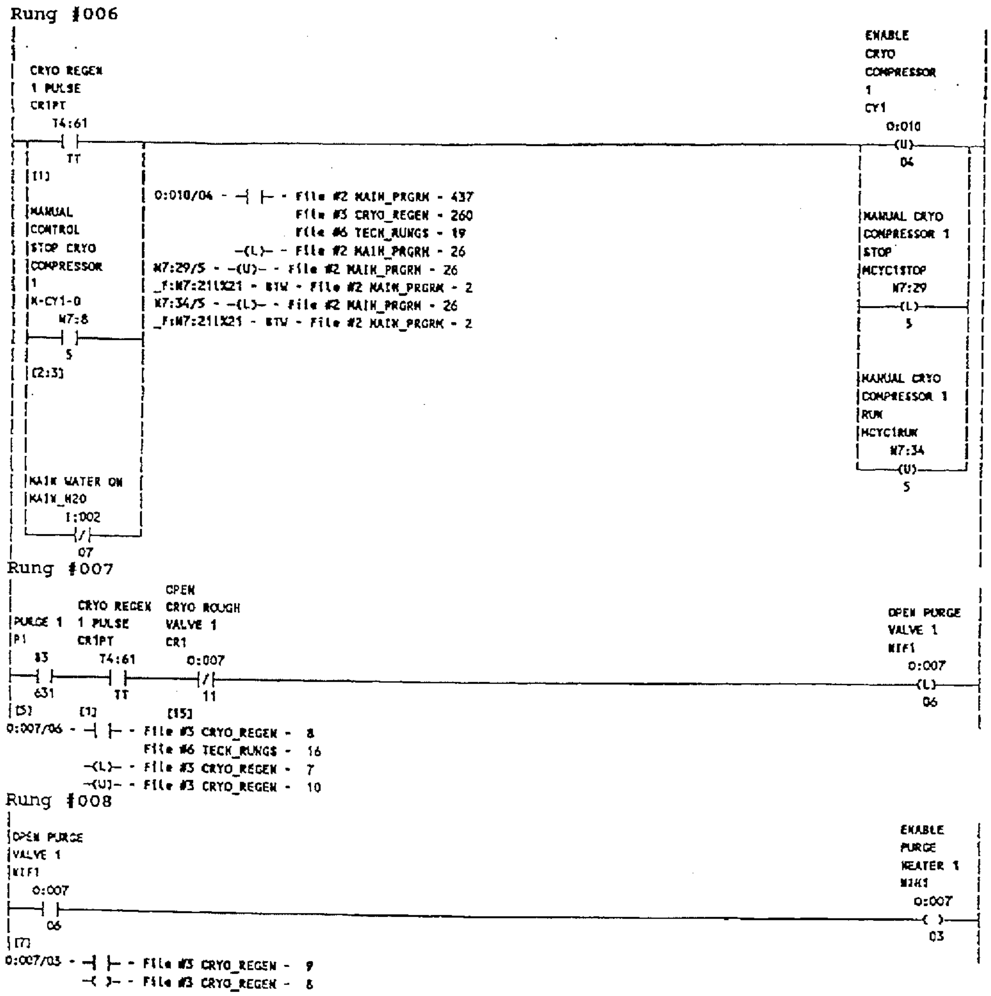
Rung #006
CRYO REGEN
1 PULSE
CR1PT
T4:61
TT
[1]
MANUAL
CONTROL
STOP CRYO
COMPRESSOR
1
M-CY1-0
N7:8
5
[2:3]
MAIN WATER ON
MAIN_H20
I:002
07
O:010/04 - -| |- - File #2 MAIN_PRGRM - 437
File #3 CRYO_REGEN - 260
File #6 TECH_RUNGS - 19
-(L)- - File #2 MAIN_PRGRM - 26
N7:29/5 - -(U)- - File #2 MAIN_PRGRM - 26
_F:N7:211X21 - BTW - File #2 MAIN_PRGRM - 2
N7:34/5 - -(L)- - File #2 MAIN_PRGRM - 26
_F:N7:211X21 - BTW - File #2 MAIN_PRGRM - 2
ENABLE
CRYO
COMPRESSOR
1
CY1
O:010
(U)
04
MANUAL CRYO
COMPRESSOR 1
STOP
MCYC1STOP
N7:29
(L)
5
MANUAL CRYO
COMPRESSOR 1
RUN
MCYC1RUN
N7:34
(U)
5
Rung #007
PURGE 1
P1
B3
631
[5]
CRYO REGEN
1 PULSE
CR1PT
T4:61
TT
[1]
OPEN
CRYO ROUGH
VALVE 1
CR1
O:007
11
[15]
OPEN PURGE
VALVE 1
MIF1
O:007
(L)
06
O:007/06 - -| |- - File #3 CRYO_REGEN - 8
File #6 TECH_RUNGS - 16
-(L)- - File #3 CRYO_REGEN - 7
-(U)- - File #3 CRYO_REGEN - 10
Rung #008
OPEN PURGE
VALVE 1
MIF1
O:007
06
[7]
ENABLE
PURGE
HEATER 1
MIH1
O:007
( )
03
O:007/03 - -| |- - File #3 CRYO_REGEN - 9
-( )- - File #3 CRYO_REGEN - 8

```
Rung #009
|         ENABLE     CYRO 1      PURGE                                                    PURGE TIME         |
|         PURGE      TEMPERATUR  TIMER                                                    MONITOR            |
|PURGE 1  HEATER 1   =>290K      DEFEAT                                                   COMPRESSOR 1       |
|P1       MIN1       CY1TMP290   PG_DEFEAT                                                PGC1               |
|  B3      O:007       B3         B3                                                      +-TON-----------+  |
|--| |-----| |--------| |--------| |-------------------------------------------------------|TIMER ON DELAY |-(EN)-|
|  631      03        513        288                                                      |TIMER:   T4:21 |  |
|[12]      [8]                                                                            |BASE (SEC): 1.0|-(DN) |
|                                                                                         |PRESET:   7200 |  |
|                                                                                         |ACCUM:       0 |  |
|                                                                                         +---------------+  |
T4:21.ACC - GEQ - File #3 CRYO_REGEN -  30
T4:21.DN - -| |- - File #3 CRYO_REGEN -  10,11,262
T4:21.TT - -| |- - File #6 TECH_RUNGS -  15
Rung #010
|              PURGE TIME                                                                     |
|              MONITOR                                                                        |
| CYRO 1       CRYO 1                                                                         |
| TEMPERATUR   60 MIN      BLOWER 2                                                           |
| =>290K       DONE        ENABLED                                          OPEN PURGE        |
| CY1TMP290    PGC1        BL2                                              VALVE 1           |
|     B3          T4:21      O:027                                          MIF1              |
|                                                                             O:007           |
|-+---| |--------| |--------| |---+------------------------------------------(U)------------|
| |   513         DN         01   |                                           06              |
| |               [9]      [2:74] |                                                         |
| |                               | O:007/06 - -| |- - File #3 CRYO_REGEN - 8                 |
| |                               |                    File #6 TECH_RUNGS - 16                |
| |COMPRESSOR                     |             -(L)- - File #3 CRYO_REGEN - 7                |
| |1 REGEN-                       |                                                         |
| |ERATION                        |                                                         |
| |PROGRAM                        |                                                         |
| |CYRGN1                         |                                                         |
| |   B3                          |                                                         |
| +---|/|-----------------------+                                                           |
|    321                                                                                      |
| [0]                                                                                         |
Rung #011
|         PURGE TIME                                                                          |
|         MONITOR                                                                             |
|         CRYO 1      CYRO 1                                                                  |
|         60 MIN      TEMPERATUR  BLOWER 2                                                    |
|PURGE 1  DONE        =>290K      ENABLED                                   ROUGHING          |
|P1       PGC1        CY1TMP290   BL2                                       AND ROR 1         |
|  B3      T4:21        B3         O:027                                    R&ROR1            |
|                                                                              B3              |
|--| |-----| |--------| |--------| |-----------------------------------------(L)-------------|
|  631      DN        513         01                                          641             |
|[12]      [9]                  [2:74]                                                        |
B3/641 - -| |- - File #3 CRYO_REGEN -  12,15,16,17,18,19,20
                 File #6 TECH_RUNGS -  17
          -(L)- - File #3 CRYO_REGEN -  11
          -(U)- - File #3 CRYO_REGEN -  21
```

Rung #012

ROUGHING AND ROR 1
R&ROR1
B3
641
[11]

COMPRESSOR 1 REGEN- ERATION PROGRAM
CYRGN1
B3
321
[0]

B3/631 - -| |- - File #3 CRYO_REGEN - 7, 9, 11
File #6 TECH_RUNGS - 15
-(L)- - File #3 CRYO_REGEN - 5

PURGE 1
P1
B3
-(U)-
631

Rung #013

MANUAL CONTROL CRYO ROUGH VALVE 1 OPEN
M-CR1-1
N7:12
9
[2:3]

N7:33/9 - -| |- - File #3 CRYO_REGEN - 15
-(U)- - File #3 CRYO_REGEN - 14
_F:N7:21[X21 - BTW - File #2 MAIN_PRGRM - 2
N7:28/9 - -(L)- - File #3 CRYO_REGEN - 14
_F:N7:21[X21 - BTW - File #2 MAIN_PRGRM - 2

MANUAL CRYO ROUGH 1 OPEN
MCR1OP
N7:33
-(L)-
9

MANUAL CRYO ROUGH 1 CLOSE
MCR1CL
N7:28
-(U)-
9

Rung #014

MANUAL CONTROL CLOSE CRYO ROUGH VALVE 1
M-CR1-O
N7:7
9
[2:3]

COMPRESSOR 1 REGEN- ERATION PROGRAM
CYRGN1
B3
321
[25]

CRYO 1 TEMPERATUR =<20K
CY1TMP20
B3
501

N7:33/9 - -| |- - File #3 CRYO_REGEN - 15
-(L)- - File #3 CRYO_REGEN - 13
_F:N7:21[X21 - BTW - File #2 MAIN_PRGRM - 2
N7:28/9 - -(U)- - File #3 CRYO_REGEN - 13
_F:N7:21[X21 - BTW - File #2 MAIN_PRGRM - 2

MANUAL CRYO ROUGH 1 OPEN
MCR1OP
N7:33
-(U)-
9

MANUAL CRYO ROUGH 1 CLOSE
MCR1CL
N7:28
-(L)-
9

```
Rung #015
|
| ROUGHING  COMPRESSOR 1  LINE PRESSURE BLOWER 2  CRYO 1                     OPEN
| AND ROR 1 ROR LATCH     MADE-TC10     ENABLED   THERMCOUPL                 CRYO ROUGH
| R&ROR1    CY1RORL       LPM-TC10      BL2       50 MICRON                  VALVE 1
|    B3        B3            B3         O:027     PIR3                       CR1
|                                                 I:004                       O:007
|-+--] [------]/[-----+------] [--------] [-------]/[------------------------+---( )---+-
| |  641       601    |     250          01        11                       |    11   |
| | [11]      [16]    | [2:67]]       [2:74]                                |         |
| |                   | O:007/11 - -] [- - File #3 CRYO_REGEN - 2           |CRYO REGEN 1
| |                   |                    File #6 TECH_RUNGS - 14          |ROUGHING |
| |MANUAL CRYO CRYO 1 |           -]/[- - File #2 MAIN_PRGRM - 115, 387     |TIMER    |
| |ROUGH 1    TEMPERATUR                   File #3 CRYO_REGEN - 7           |CR1RUF_TMR
| |OPEN       =<20K   | T4:171.DN - -] [- - File #3 CRYO_REGEN - 31        |+-TON-------+
| |MCR1OP     CY1TMP20|                                                    +|TIMER ON DELAY|-(EN)-+
| | N7:33       B3    |                                                     |TIMER:  T4:171|
| |---] [------]/[----|                                                     |BASE (SEC): 1.0|-(DN)
| |    9        501   |                                                     |PRESET:   600|
| |[14]               |                                                     |ACCUM:      0|
| |                   |                                                     +-------------+
| |COOL DOWN          |
| |1                  |
| |CD1                |
| |  B3               |
| +--] [--------------+
|   651
|  [20]
Rung #016
|           CRYO 1                         CRYO 1
|ROUGHING   THERMCOUPL  BLOWER 2  ROR LATCH                      COMPRESSOR 1
|AND ROR 1  50 MICRON   ENABLED   ONE SHOT                       ROR LATCH
|R&ROR1     PIR3        BL2       C1RORLOS                       CY1RORL
|  B3        I:004      O:027       B3                              B3
|---] [-------] [--------] [-------[ONS]-----------------------------(L)----
|  641        11          01        551                              601
|[11]                   [2:74]
B3/601 - -] [- - File #3 CRYO_REGEN -  18
                 File #6 TECH_RUNGS -  17
       -]/[- - File #3 CRYO_REGEN -  15
       -(L)- - File #3 CRYO_REGEN -  16
       -(U)- - File #3 CRYO_REGEN -  17
Rung #017
|            ROR WAIT
|            CRYO 1
| ROUGHING   60 SEC                                              COMPRESSOR 1
| AND ROR 1  DONE                                                ROR LATCH
| R&ROR1     C1RORTMR                                            CY1RORL
|    B3       T4:31                                                 B3
|-+--] [-------] [----+----------------------------------------------(U)----
| |  641        DN    |                                             601
| |[21]        [18]   |
| |                   | B3/601 - -] [- - File #3 CRYO_REGEN - 18
| |                   |                  File #6 TECH_RUNGS - 17
| |COMPRESSOR         |           -]/[- - File #3 CRYO_REGEN - 15
| |1 REGEN-           |           -(L)- - File #3 CRYO_REGEN - 16
| |ERATION            |
| |PROGRAM            |
| |CYRGN1             |
| |  B3               |
| +--]/[--------------+
|   321
|  [25]
```

Rung #018

```
|ROUGHING    COMPRESSOR 1                                          ROR WAIT
|AND ROR 1   ROR LATCH                                             COMPRESSOR 1
|R&ROR1      CY1RORL                                               60 SEC
|   B3          B3                                                 C1RORTMR
|                                                                  +-TON-----------+
|---] [---------] [------------------------------------------------+TIMER ON DELAY +-(EN)-
|   641         601                                                |TIMER:    T4:31|
|[21]        [17]                                                  |BASE (SEC):  1.0+-(DN)
|                                                                  |PRESET:      30|
|                                                                  |ACCUM:        0|
|                                                                  +---------------+
T4:31.DN - ] [ - File #3 CRYO_REGEN -  17,20
T4:31.TT - ] [ - File #6 TECH_RUNGS -  18
```

Rung #019

```
|                                                                  REROUGH
|            CRYO 1                                                COUNTER
|ROUGHING    THERMCOUPL                                            COMPRESSOR
|AND ROR 1   50 MICRON                                             1
|R&ROR1      PIR3                                                  C1RERUF
|   B3        I:004                                                +-CTU-----------+
|---] [---------]/[------------------------------------------------+COUNT UP       +-(CU)-
|   641         11                                                 |COUNTER:   C5:1|
|[21]                                                              |PRESET:      20+-(DN)
|                                                                  |ACCUM:        0|
|                                                                  +---------------+
C5:1 - CTU - File #3 CRYO_REGEN -  19
       RES - File #3 CRYO_REGEN -  23
C5:1.DN - ] [ - File #2 MAIN_PRGRM -  623
```

Rung #020

```
|                        ROR WAIT
|            CRYO 1      CRYO 1      CRYO 1
|ROUGHING    THERMCOUPL  60 SEC      TEMPERATUR
|AND ROR 1   50 MICRON   DONE        =<20K                              COOL DOWN
|R&ROR1      PIR3        C1RORTMR    CY1TMP20                           1
|   B3        I:004       T4:31       B3                                CD1
|                                                                         B3
|---] [---------] [---------] [---------]/[---------------------------------(L)---
|   641         11          DN          501                                651
|[21]                      [18]
B3/651 - ] [ - File #2 MAIN_PRGRM -  26,115
               File #3 CRYO_REGEN -  15,21,22,25
               File #6 TECH_RUNGS -  19
        -(L)- - File #3 CRYO_REGEN -  20
        -(U)- - File #3 CRYO_REGEN -  24
```

Rung #021

```
| COMPRESSOR
| 1 REGEN-
| ERATION          COOL DOWN                                            ROUGHING
| PROGRAM          1                                                    AND ROR 1
| CYRGN1    PDM1   CD1                                                  RERORI
|     B3    T4:41    B3                                                    B3
|-+---] [----] [----] [-+----------------------------------------------------(U)---|
| |   321    TT     651 |                                                   641
| |[25]    [22]  [20]   |
| |                     | B3/641 - ] [ - File #3 CRYO_REGEN - 12, 15, 16, 17, 18, 19, 20
| |                     |              File #6 TECH_RUNGS - 17
| |COMPRESSOR           |        -(L)- - File #3 CRYO_REGEN - 11
| |1 REGEN-             |
| |ERATION              |
| |PROGRAM              |
| |CYRGN1               |
| |     B3              |
| +----]/[--------------+
|     321
|  [25]
```

Rung #022

```
|          CRYO 1
|COOL DOWN TEMPERATUR                                          REGEN
|1         =<20K                                               TIME TO
|CD1       CY1TMP20                                            20K  1
|    B3       B3                                               PDM1
|---] [------]/[-----------------------------------------------+-TON--------------+
|   651       501                                              |TIMER ON DELAY    |-(EN)-
|[20]                                                          |TIMER:      T4:41 |
|                                                              |BASE (SEC):   1.0 |-(DN)
|                                                              |PRESET:      7200 |
|                                                              |ACCUM:          0 |
|                                                              +------------------+
T4:41.DN - ] [ - File #3 CRYO_REGEN - 30,32
T4:41.TT - ] [ - File #3 CRYO_REGEN - 21
```

```
[25]
C5:1 - CTU - File #3 CRYO_REGEN - 19
       RES - File #3 CRYO_REGEN - 23
C5:1.DN - ] [ - File #2 MAIN_PRGRM - 623
```

Rung #024

```
|COMPRESSOR
|1 REGEN-
|ERATION                                                          COOL DOWN
|PROGRAM                                                          1
|CYRGN1                                                           CD1
|     B3                                                             B3
|----]/[-------------------------------------------------------------(U)---|
|    321                                                             651
|[25]
B3/651 - ] [ - File #2 MAIN_PRGRM - 26,115
               File #3 CRYO_REGEN - 15,21,22,25
               File #6 TECH_RUNGS - 19
       -(L)- - File #3 CRYO_REGEN - 20
```

BASE : Rung #023
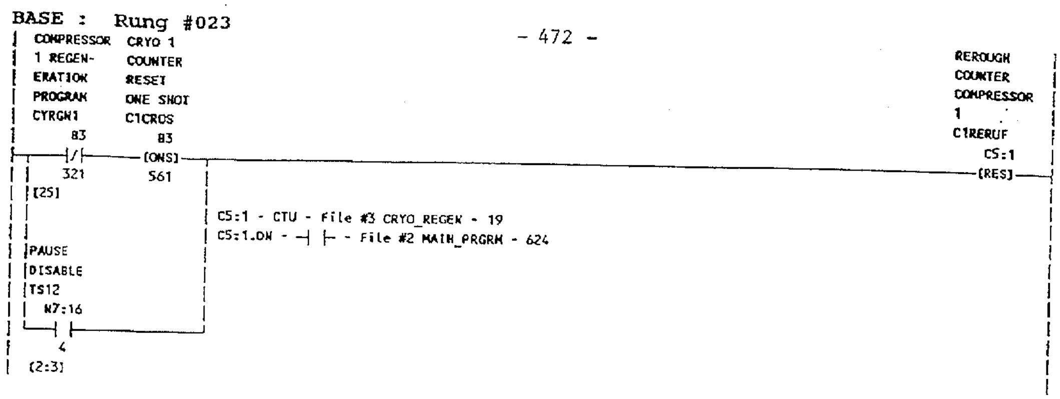

```
    -(U)- - File #3 CRYO_REGEN -
                                         - 473 -
Rung #025
                                                                      COMPRESSOR
           CRYO 1                                                     1 REGEN-
 COOL DOWN TEMPERATUR                                                 ERATION
 1         =<20K                                                      PROGRAM
 CD1       CY1TMP20                                                   CYRGN1
   B3        B3                                                         B3
---] [-------] [------------------------------------------------------(U)---
   651       501                                                        321
 [24]
                       B3/321 - ] [ - File #2 MAIN_PRGRM - 115, 458    MANUAL
                                      File #3 CRYO_REGEN - 1, 3, 4, 5, 21, 29, 30, 259   COMPRESSOR 1
                                      File #6 TECH_RUNGS - 14          REGENERATION
                              ]/[ - File #2 MAIN_PRGRM - 26, 115       ENABLE
 REGENERATE  ABORT CRYO               File #3 CRYO_REGEN - 10, 12, 14, 17, 21, 23, 24, 33   MC1RE
 CRYO 1      TIMER            -(L)- - File #3 CRYO_REGEN - 0            N7:36
 TS01        ABORTCRYO   N7:36/9 - -(L)- - File #3 CRYO_REGEN - 0    ---(U)---
   N7:15       T4:297    _F:N7:21%21 - BTW - File #2 MAIN_PRGRM - 2      9
---] [--------] [---
   9           TT
 [2:3]        [27]
 REGENERATE
 ALL CRYO'S
 TS20
   N7:16
---] [---
   12
 [2:3]
 PIRANI
 GUAGE 2
 NO FAULT
 PGNF2
   I:004
---]/[---
   15
 CRYO RE-
 GENERATION
 FAULT
 COMPRESSOR
 1
 CRFLT1
   B3
---] [---
   331
 [30]
 PREPARE FOR
 AUTO RUN
 >AUTO
   N7:37
---] [---
   1
 [2:157]
Rung #026
 ABORT CRYO                                                           ABORT CRYO
 REGENERATION                                                         REGEN ENABLE
 BT_CR                                                                ABORTCRGN
   N7:17                                                                 B3
---] [----------------------------------------------------------------(L)---
   9                                                                     297
 [2:3]
B3/297 - ] [ - File #2 MAIN_PRGRM - 21
```

```
                    File #3 CRYO_REGEN      7
          -(L)- - File #3 CRYO_REGEN -  26
          -(U)- - File #3 CRYO_REGEN -  28
Rung #027
|ABORT CRYO                                                                    ABORT CRYO       |
|REGEN ENABLE                                                                  REGEN TIMER      |
|ABORTCRGN                                                                     ABORTCRYO        |
|    B3                                                                        +-TON-----------+ |
|---| |--------------------------------------------------------------------------|TIMER ON DELAY |-(EN)-|
|   297                                                                        |TIMER:   T4:297| |
|(26)                                                                          |BASE (SEC): 1.0|-(DN) |
|                                                                              |PRESET:     10| |
|                                                                              |ACCUM:       0| |
|                                                                              +---------------+ |
T4:297.DN - -| |- - File #3 CRYO_REGEN -  28
T4:297.TT - -| |- - File #2 MAIN_PRGRM -  91
                    File #3 CRYO_REGEN -  25,238,239,240,241,242,243,244
           -|/|- - File #3 CRYO_REGEN -  0,34,38,42,46,52,53,57,63
Rung #028
|                                                                                 ABORT CRYO   |
|                                                                                 REGEN ENABLE |
|ABORTCRYO                                                                        ABORTCRGN    |
|  T4:297                                                                             B3       |
|---| |-------------------------------------------------------------------------------(U)------|
|    DN                                                                              297       |
|(27)                                                                                          |
B3/297 - -| |- - File #2 MAIN_PRGRM -  21
                 File #3 CRYO_REGEN -  27
        -(L)- - File #3 CRYO_REGEN -  26
        -(U)- - File #3 CRYO_REGEN -  28
Rung #029
|COMPRESSOR  HEATER 1                                                                           |
|1 REGEN-    CHAMBER                                                        CRYO REGEN          |
|ERATION     GATE VALVE                                                     COMPRESSOR 1        |
|PROGRAM     CLOSE                                                          HV1 FAULT           |
|CYRGN1      HV1S1                                                          CR1FLT              |
|    B3        I:002                                                        +-TON-----------+   |
|---| |--------|/|------------------------------------------------------------|TIMER ON DELAY |-(EN)-|
|   321         06                                                          |TIMER:    T4:11|   |
|(25)                                                                       |BASE (SEC): 1.0|-(DN) |
|                                                                           |PRESET:     30|   |
|                                                                           |ACCUM:       0|   |
|                                                                           +---------------+   |
T4:11.DN - -| |- - File #3 CRYO_REGEN -  30
```

Rung #030
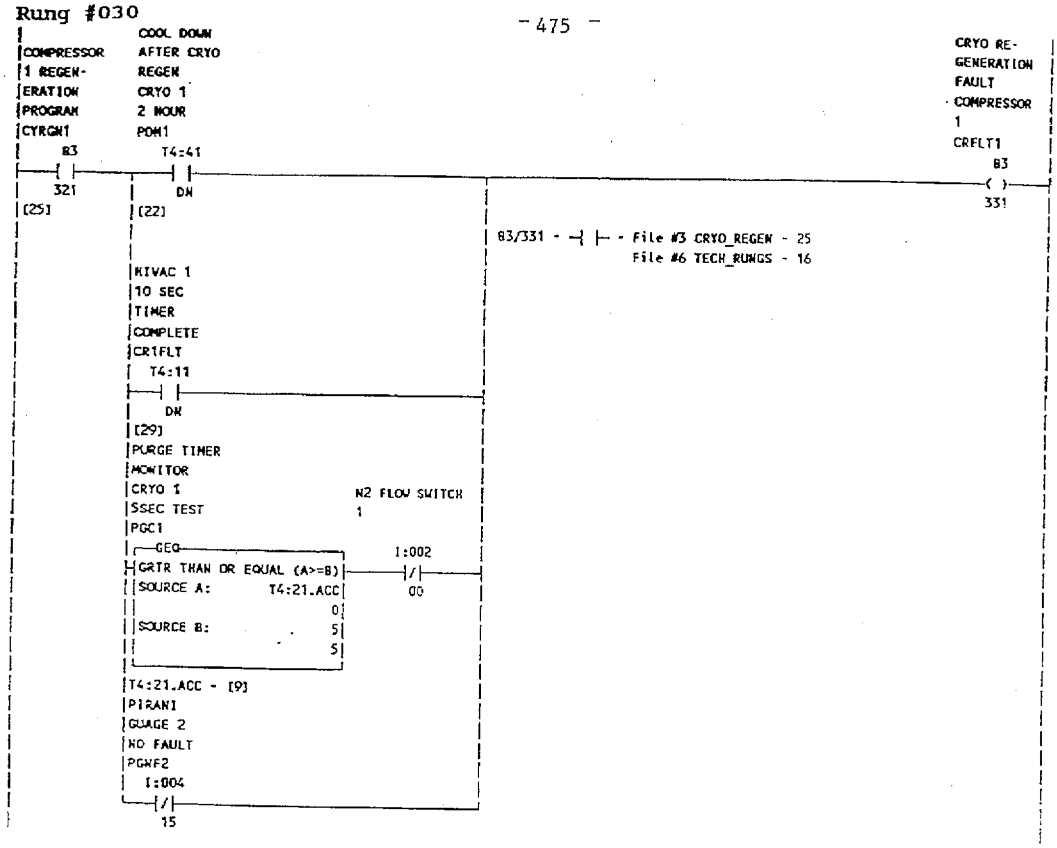

Rung #031

```
                REPURGE
                COMPRESSOR
                1 TIMER                                   CRYO REGEN
NO CRYOS BEING  DONE                                      ROUGHING
REGENERATED     5 MINUTE                                  TIMEOUT
NO_CYRGN        CR1RUF_TMR                                CR_RUFF_TIME
    B3            T4:171                                      B3
---]/[----------+---] [---+-----------------------------------( )---
   233          |    DN   |                                   818
[33]            |[15]     |
                |         | B3/818 - -] [- - File #2 MAIN_PRGRM - 624
                |EXCESS   |
                |ROUGHING |
                |TIME     |
                |CRYOPUMP 2
                |CR2RUF_TMR
                |  T4:172 |
                +---] [---+
                |    DN   |
                |[164]    |
                |REPURGE  |
                |COMPRESSOR
                |3 TIMER  |
                |DONE     |
                |5 MINUTE |
                |CR3RUF_TMR
                |  T4:173 |
                +---] [---+
                |    DN   |
                |[165]    |
                |REPURGE  |
                |COMPRESSOR
                |4 TIMER  |
                |DONE     |
                |5 MINUTE |
                |CR4RUF_TMR
                |  T4:174 |
                +---] [---+
                |    DN   |
                |[167]    |
                |REPURGE  |
                |COMPRESSOR
                |5 TIMER  |
                |DONE     |
                |5 MINUTE |
                |CR5RUF_TMR
                |  T4:175 |
                +---] [---+
                |    DN   |
                |[166]    |
                |REPURGE  |
                |COMPRESSOR
                |6 TIMER  |
                |DONE     |
                |5 MINUTE |
                |CR6RUF_TMR
                |  T4:176 |
                +---] [---+
                |    DN   |
                |[168]    |
                |REPURGE  |
                |COMPRESSOR
>               >         >                                        >
```

- 477 -

```
|7 TIMER      |
|DONE         |
|5 MINUTE     |
|CR7RUF_TMR   |
|   T4:177    |
|----] [------|
|     DN      |
|[169]        |
|CR8RUF_TMR   |
|   T4:178    |
|----] [------|
|     DN      |
|[170]        |
|CR9RUF_TMR   |
|   T4:179    |
|----] [------|
|     DN      |
|[171]        |
|CR10RUF_TMR  |
|   T4:180    |
|----] [------|
|     DN      |
|[172]        |
|CR11RUF_TMR  |
|   T4:181    |
|----] [------|
|     DN      |
|[174]        |
```

Rung #032

NO CRYOS BEING REGENERATED
NO_CYRGN
B3
-|/|-
233
[33]

COOL DOWN AFTER CRYO REGEN CRYO 1 2 HOUR
PDM1
T4:41
-| |-
DN
[22]

COOL DOWN AFTER CRYO REGEN CRYO 2 2 HOUR
PDM2
T4:42
-| |-
DN
[217]

PUMPDOWN AFTER CRYO REGEN COMPRESSOR 3 2 HOUR
PDM3
T4:43
-| |-
DN
[218]

PUMPDOWN AFTER CRYO REGEN COMPRESSOR 4 2 HOUR
PDM4
T4:44
-| |-
DN
[219]

PUMPDOWN AFTER CRYO REGEN COMPRESSOR 5 2 HOUR
PDM5
T4:45
-| |-
DN
[220]

PUMPDOWN AFTER CRYO REGEN COMPRESSOR 6 2 HOUR
PDM6
T4:46
-| |-
DN
[221]
PUMPDOWN

CRYO REGEN COOL DOWN >2 HOURS
CR_CD>2H
B3
-( )-
820

B3/820 - -| |- - File #2 MAIN_PRGRM - 624

```
|AFTER CRYO
|REGEN
|COMPRESSOR
|7 2 HOUR
|PDM7
|   T4:47
|---] [---
|    DN
|[222]
|PUMPDOWN
|AFTER CRYO
|REGEN
|COMPRESSOR
|8 2 HOUR
|PDM8
|   T4:48
|---] [---
|    DN
 [223]
```

Rung #033

```
|COMPRESSOR COMPRESSOR COMPRESSOR COMPRESSOR COMPRESSOR COMPRESSOR COMPRESSOR COMPRESSOR
|1 REGEN-   2 REGEN-   3 REGEN-   4 REGEN-   5 REGEN-   6 REGEN-   7 REGEN-   8 REGEN-
|ERATION    ERATION    ERATION    ERATION    ERATION    ERATION    ERATION    ERATION      NO CRYOS BEING
|PROGRAM    PROGRAM    PROGRAM    PROGRAM    PROGRAM    PROGRAM    PROGRAM    PROGRAM      REGENERATED
|CYRGN1     CYRGN2     CYRGN3     CYRGN4     CYRGN5     CYRGN6     CYRGN7     CYRGN8       NO_CYRGN
|  B3         B3         B3         B3         B3         B3         B3         B3             B3
|--]/[-------]/[--------]/[--------]/[--------]/[--------]/[--------]/[--------]/[-------------( )--
|  321        322        323        324        325        326        327        328            233
|[25]       [34]       [38]       [42]       [46]       [52]       [57]       [63]
B3/233 - ] [ - File #2 MAIN_PRGRM - 23,91
        ]/[ - File #2 MAIN_PRGRM - 91
              File #3 CRYO_REGEN - 31,32
        -( )- - File #3 CRYO_REGEN - 33
```

Rung #034

```
|                                                                         COMPRESSOR
| REGENERATE                                                              2 REGEN-
| CRYO 2                   ABORT CRYO                                     ERATION
| TS02                     TIMER                                          PROGRAM
|  N7:15                   ABORTCRYO                                      CYRGN2
|                            T4:297                                          B3
|---] [----------------+------]/[--------------------------------------+----(L)----
|    10                |      TT                                       |    322
| [2:3]                | [27]                                          |
|                      |                                               |
|                      | B3/322 - ] [ - File #2 MAIN_PRGRM - 110, 117, 118, 460, 462
|                      |                File #3 CRYO_REGEN - 35, 37, 67, 74, 210, 245, 252,
|                      |                259                            |MANUAL
|                      |                File #6 TECH_RUNGS - 14        |COMPRESSOR 2
|                      |          ]/[ - File #2 MAIN_PRGRM - 27, 117, 118  |REGENERATION
|                      |                File #3 CRYO_REGEN - 33, 117, 135, 143, 176, 210, 224,
|                      |                231                            |ENABLE
| HI_STAG              |          -(U)- - File #3 CRYO_REGEN - 238     |MC2RE
|+-GEQ-----------------+ N7:36/10 - -(U)- - File #3 CRYO_REGEN - 238   |   N7:36
+-GRTR THAN OR EQUAL (A>=B)-+ _F:N7:21[%21 - BTW - File #2 MAIN_PRGRM - 2 +----(L)----
| SOURCE A:   T4:197.ACC|                                                   10
|                      0|
| SOURCE B:            5|
|                      5|
+-----------------------+
T4:197.ACC - [2:20]
```

```
Rung #035
|COMPRESSOR  HEATER 2
|2 REGEN-    CHAMBER
|ERATION     GATE VALVE
|PROGRAM     CLOSE                                              REGEN COMP. 2
|CYRGN2      HV2S1                                              PULSE TIMER
|   B3        I:004                                             CR2PT
|---| |--------| |------------------------------------------+-TON--------------+
|   322        00                                           +|TIMER ON DELAY   |-(EN)-+-
|[34]                                                       ||TIMER:      T4:62|      |
|                                                           ||BASE (SEC):   1.0|-(DN) |
| T4:62.TT - -| |- - File #3 CRYO_REGEN - 74, 81, 88        ||PRESET:         1|      |
| T4:342.ACC - LEQ - File #3 CRYO_REGEN - 37                ||ACCUM:          0|      |
| T4:342.TT - -| |- - File #3 CRYO_REGEN - 36, 263          |+-----------------+      |
|             -|/|- - File #3 CRYO_REGEN - 264              |                         |
|                                                           |SIEVE TRAP               |
|                                                           |2 TIMER                  |
|                                                           |S_TRAP_2                 |
|                                                           |+-TON--------------+     |
|                                                           +|TIMER ON DELAY    |-(EN)-+
|                                                            |TIMER:     T4:342|
|                                                            |BASE (SEC):   1.0|-(DN)
|                                                            |PRESET:      5400|
|                                                            |ACCUM:          0|
|                                                            +------------------+
Rung #036
|           MECHANICAL
|           PUMP 2
|           ISOLATION                                             SIEVE TRAP
|           VALVE OPEN                                            ISOLATION VALVE
| S_TRAP_2  MP2IVOP                                               2
|  T4:342    I:025                                                SVIV2
|---+--| |--+--| |-------------------------------------------------- 0:010
|   |  TT   |   13                                                ---( )---
|   |[35]   |                                                        01
|   |       | O:010/01 - -| |- - File #3 CRYO_REGEN - 37
|   |OPEN   |
|   |CRYO ROUGH
|   |VALVE 2|
|   |CR2    |
|   | O:007 |
|   +--| |--+
|       12
| [164]
Rung #037
|COMPRESSOR
|2 REGEN-
|ERATION                        SIEVE TRAP
|PROGRAM                        ISOLATION VALVE                   SIEVE TRAP
|CYRGN2    S_TRAP_2             2                                 HEATER 2
|  B3     +-LEQ-------------------+ SVIV2                          SVHTR2
|---| |---+LESS THAN OR EQUAL (A<=B)+  O:010                        O:010
|   322   |SOURCE A:    T4:342.ACC|---| |------------------------------( )---
|[34]     |                      0| [36] 01                           14
|         |SOURCE B:          3600|
|         |                   3600|
|         +-----------------------+
|          T4:342.ACC - [35]
```

Rung #038

- 481 -

```
REGENERATE                    ABORT CRYO                                              COMPRESSOR
CRYO 3                        TIMER                                                   3 REGEN-
TS03                          ABORTCRYO                                               ERATION
N7:15                         T4:297                                                  PROGRAM
                                                                                      CYRGN3
                                                                                      B3
--] [--------------------------]/[------------------------------------------------------(L)--
  11                            TT                                                    323
[2:3]                         [27]
                                                                                      MANUAL
                              B3/323 - ] [ - File #2 MAIN_PRGRM - 111, 119, 120, 464, 466      COMPRESSOR 3
                                            File #3 CRYO_REGEN - 39, 41, 68, 75, 211, 246, 253, REGENERATION
                                            259                                                ENABLE
                                            File #6 TECH_RUNGS - 14                            MC3RE
                                       ]/[ - File #2 MAIN_PRGRM - 28, 119, 120                 N7:36
HI_STAG                                     File #3 CRYO_REGEN - 33, 118, 136, 145, 178, 211, 225, --(L)--
--GEQ--                                     232                                                 11
GRTR THAN OR EQUAL (A>=B)              -(U)- - File #3 CRYO_REGEN - 239
SOURCE A:         T4:197.ACC  N7:36/11 - -(U)- - File #3 CRYO_REGEN - 239
                           0  _F:N7:211X21 - BTW - File #2 MAIN_PRGRM - 2
SOURCE B:                 10
                          10

T4:197.ACC - [2:20]
```

Rung #039

```
COMPRESSOR  DWELL 1
3 REGEN-    CHAMBER
ERATION     GATE VALVE
PROGRAM     CLOSED                                              REGEN COMP. 3
CYRGN3      HV3S1                                               PULSE TIMER
B3          I:004                                               CR3PT
                                                                --TON--
--] [---------] [-----------------------------------------------TIMER ON DELAY  -(EN)-
  323          03                                               TIMER:       T4:63
[38]                                                            BASE (SEC):   1.0 -(DN)
                                                                PRESET:         1
T4:63.TT - ] [ - File #3 CRYO_REGEN - 75, 82, 89                ACCUM:          0
T4:343.ACC - LEQ - File #3 CRYO_REGEN - 41
T4:343.TT - ] [ - File #3 CRYO_REGEN - 40, 263
            ]/[ - File #3 CRYO_REGEN - 264
                                                                STEVE TRAP
                                                                3 TIMER
                                                                S_TRAP_3
                                                                --TON--
                                                                TIMER ON DELAY  -(EN)-
                                                                TIMER:      T4:343
                                                                BASE (SEC):   1.0 -(DN)
                                                                PRESET:      5400
                                                                ACCUM:          0
```

```
Rung #040
            MECHANICAL
            PUMP 2
            ISOLATION                                               SIEVE TRAP
            VALVE OPEN                                              ISOLATION VALVE
  S_TRAP_3  MP2IVOP                                                 3
   T4:343     I:025                                                 SVIV3
                                                                      O:011
|---] [-------+---] [-------------------------------------------------( )---|
      TT      |    13                                                  17
  [39]        |
              | O:011/17 - -] [- - File #3 CRYO_REGEN - 41
  |OPEN       |
  |CRYO ROUGH |
  |VALVE 3    |
  |CR3        |
  |   O:007   |
  +----] [----+
        13
  [165]
Rung #041
|COMPRESSOR
|3 REGEN-
|ERATION                        SIEVE TRAP
|PROGRAM                        ISOLATION VALVE                    SIEVE TRAP
|CYRGN3    S_TRAP_3             3                                  HEATER 3
   B3      +-LEQ----------------+ SVIV3                            SVHTR3
|---] [----+LESS THAN OR EQUAL (A<=B)+   O:011                       O:010
   323     |SOURCE A:   T4:343.ACC|-----] [--------------------------( )---|
|[38]      |                     0| [40]  17                          15
           |SOURCE B:         3600|
           |                  3600|
           +----------------------+
           T4:343.ACC - [39]
Rung #042
                                                                    COMPRESSOR
  REGENERATE                      ABORT CRYO                        4 REGEN-
  CRYO 4                          TIMER                             ERATION
  TS04                            ABORTCRYO                         PROGRAM
   N7:15                            T4:297                          CYRGN4
|---] [---------------------------+---]/[---------------------------+---B3---|
     12                           |    TT                           |--(L)--
  [2:3]                           | [27]                            |  324
                                  |                                 |
                                  | B3/324 - -] [- - File #2 MAIN_PRGRM - 111, 123, 124, 470, 472, 474
                                  |                  File #3 CRYO_REGEN - 43, 45, 69, 76, 212, 247, 254,
                                  |                  259
                                  |                  File #6 TECH_RUNGS - 14
  |HI_STAG                        |          -]/[- - File #2 MAIN_PRGRM - 29, 123, 124
  |+-GEQ----------------------+   |                  File #3 CRYO_REGEN - 33, 119, 137, 149, 180, 212, 226,
  +-GRTR THAN OR EQUAL (A>=B)-+---+                  233
   |SOURCE A:      T4:197.ACC|              -(U)- - File #3 CRYO_REGEN - 240
   |                        0|   N7:36/12 - -(U)- - File #3 CRYO_REGEN - 240
   |SOURCE B:              15|   _F:N7:21(%21 - BTW - File #2 MAIN_PRGRM - 2
   |                       15|
   +-------------------------+
  T4:197.ACC - [2:20]

                                                                   |MANUAL
                                                                   |COMPRESSOR 4
                                                                   |REGENERATION
                                                                   |ENABLE
                                                                   |MC4RE
                                                                   |   N7:36
                                                                   +---(L)---
                                                                       12
```

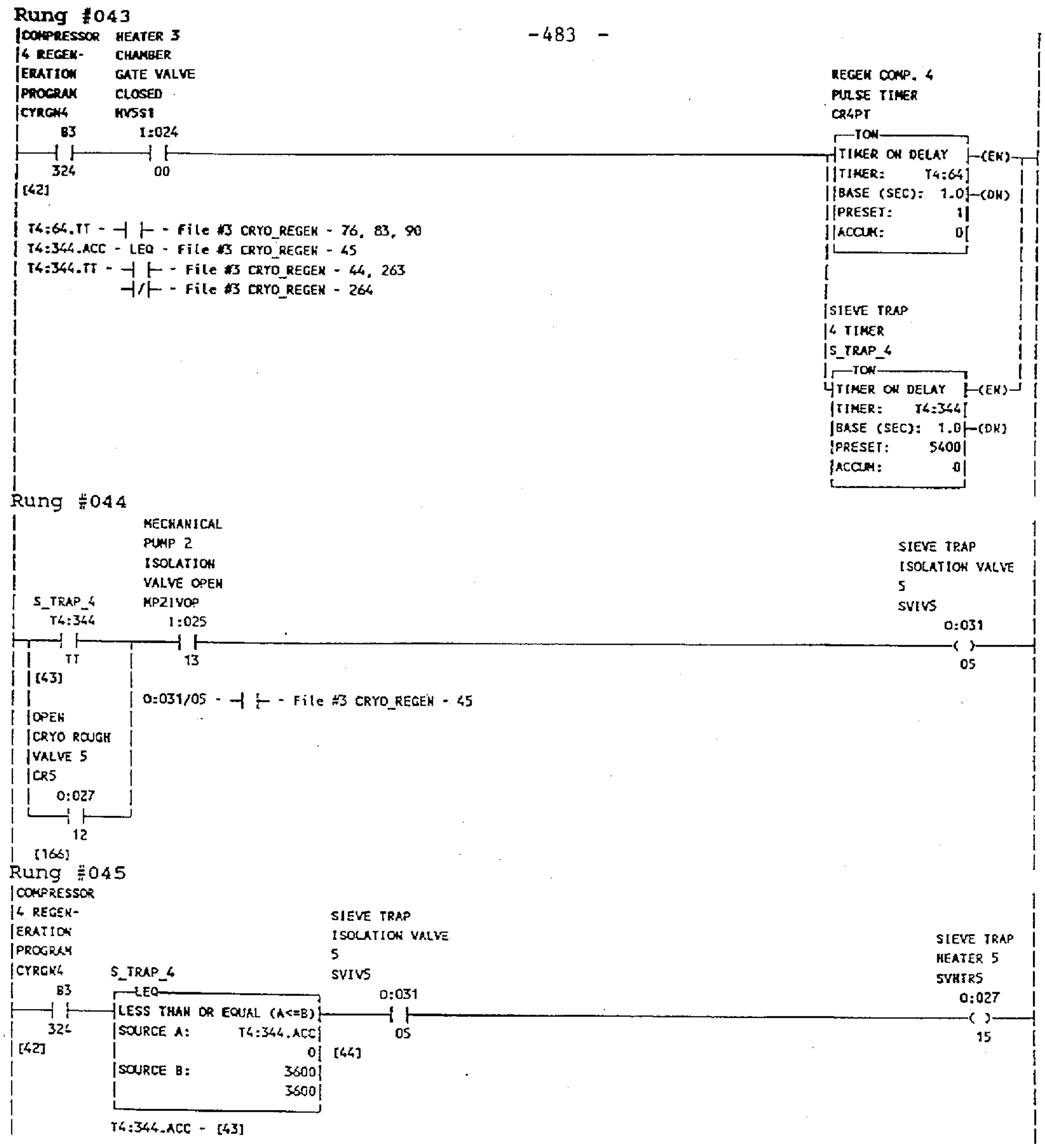
Rung #043
-483 -
COMPRESSOR 4 REGEN-ERATION PROGRAM CYRGN4
HEATER 3 CHAMBER GATE VALVE CLOSED HV5S1
B3
324
I:024
00
[42]
REGEN COMP. 4 PULSE TIMER CR4PT
TON
TIMER ON DELAY
TIMER: T4:64
BASE (SEC): 1.0
PRESET: 1
ACCUM: 0
(EN)
(DN)
T4:64.TT - ┤ ├ - File #3 CRYO_REGEN - 76, 83, 90
T4:344.ACC - LEQ - File #3 CRYO_REGEN - 45
T4:344.TT - ┤ ├ - File #3 CRYO_REGEN - 44, 263
┤/├ - File #3 CRYO_REGEN - 264
SIEVE TRAP 4 TIMER S_TRAP_4
TON
TIMER ON DELAY
TIMER: T4:344
BASE (SEC): 1.0
PRESET: 5400
ACCUM: 0
(EN)
(DN)
Rung #044
MECHANICAL PUMP 2 ISOLATION VALVE OPEN MP2IVOP
S_TRAP_4
T4:344
TT
[43]
I:025
13
SIEVE TRAP ISOLATION VALVE 5 SVIV5
O:031
05
O:031/05 - ┤ ├ - File #3 CRYO_REGEN - 45
OPEN CRYO ROUGH VALVE 5 CR5
O:027
12
[166]
Rung #045
COMPRESSOR 4 REGEN-ERATION PROGRAM CYRGN4
B3
324
[42]
S_TRAP_4
LEQ
LESS THAN OR EQUAL (A<=B)
SOURCE A: T4:344.ACC
0
SOURCE B: 3600
3600
T4:344.ACC - [43]
SIEVE TRAP ISOLATION VALVE 5 SVIV5
O:031
05
[44]
SIEVE TRAP HEATER 5 SVHTR5
O:027
15

Rung #046

```
 REGENERATE                  ABORT CRYO                                                    COMPRESSOR
 CRYO 5                      TIMER                                                         5 REGEN-
 TS05                        ABORTCRYO                                                     ERATION
   N7:15                       T4:297                                                      PROGRAM
                                                                                           CYRGN5
                                                                                             B3
|--] [------------------------]/[--------------------------------------------------------(L)---
    13                          TT                                                           325
 [2:3]                       [27]
                             B3/325 - ] [ - File #2 MAIN_PRGRM - 111, 112, 121, 122, 125, 126, 127,   MANUAL
                                          128, 468, 476, 478, 480, 482                               COMPRESSOR 5
                                          File #3 CRYO_REGEN - 47, 51, 70, 77, 213, 248, 255,        REGENERATION
                                          259                                                         ENABLE
                                          File #6 TECH_RUNGS - 14                                     MCSRE
 HI_STAG                                ]/[ - File #2 MAIN_PRGRM - 30, 121, 122, 125, 126, 127, 128     N7:36
 --GEQ--                                  File #3 CRYO_REGEN - 33, 120, 121, 122, 138, 147, 151,  ---(L)---
 GRTR THAN OR EQUAL (A>=B)                153, 182, 213, 227, 234                                      13
 SOURCE A:       T4:197.ACC             -(U)- - File #3 CRYO_REGEN - 241
                          0          N7:36/13 - -(U)- - File #3 CRYO_REGEN - 241
 SOURCE B:               20          _F:N7:21[X21 - BTW - File #2 MAIN_PRGRM - 2
                         20
 T4:197.ACC - [2:20]
```

Rung #047

```
COMPRESSOR  DWELL 2      DWELL 3      DWELL 4
5 REGEN-    CHAMBER      CHAMBER      CHAMBER
ERATION     GATE VALVE   GATE VALVE   GATE VALVE
PROGRAM     CLOSED       CLOSED       CLOSED                         REGEN COMP. 5
CYRGN5      HV4S1        HV6S1        HV7S1                          PULSE TIMER
   B3         I:022        I:024        I:036                        CRSPT
                                                                     --TON--
|--] [---------] [----------] [----------] [------------------------TIMER ON DELAY  -(EN)-
   325         06           03           06                          TIMER:      T4:65
[46]                                                                 BASE (SEC):   1.0-(DN)
                                                                     PRESET:        65
T4:65.TT - ] [ - File #3 CRYO_REGEN - 77, 84, 91, 92, 93             ACCUM:          0
T4:345.ACC - LEQ - File #3 CRYO_REGEN - 51
T4:345.TT - ] [ - File #3 CRYO_REGEN - 48, 49, 50, 263
            ]/[ - File #3 CRYO_REGEN - 264                          SIEVE TRAP
                                                                     5 TIMER
                                                                     S_TRAP_5
                                                                     --TON--
                                                                     TIMER ON DELAY  -(EN)-
                                                                     TIMER:     T4:345
                                                                     BASE (SEC):   1.0-(DN)
                                                                     PRESET:      5400
                                                                     ACCUM:          0
```

```
Rung #048
      MECHANICAL
      PUMP 2
      ISOLATION
      VALVE OPEN                                    SIEVE TRAP
 S_TRAP_5   MP2IVOP                                 ISOLATION VALVE
  T4:345     I:025                                  4
                                                    SVIV4
                                                      O:031
|-+--] [---+--] [-----------------------------------( )---|
  |   TT   |    13                                    04
  |[47]    |
  |        | O:031/04 - ] [ - File #3 CRYO_REGEN - 51
  |OPEN    |
  |CRYO ROUGH
  |VALVE 4 |
  |CR4     |
  |  O:027 |
  +--] [---+
      11
 [167]

Rung #049
      MECHANICAL
      PUMP 2
      ISOLATION
      VALVE OPEN                                    SIEVE TRAP
 S_TRAP_5   MP2IVOP                                 ISOLATION VALVE
  T4:345     I:025                                  6
                                                    SVIV6
                                                      O:031
|-+--] [---+--] [-----------------------------------( )---|
  |   TT   |    13                                    06
  |[47]    |
  |        | O:031/06 - ] [ - File #3 CRYO_REGEN - 51
  |OPEN    |
  |CRYO ROUGH
  |VALVE 6 |
  |CR6     |
  |  O:027 |
  +--] [---+
      13
 [168]

Rung #050
      MECHANICAL
      PUMP 2
      ISOLATION
      VALVE OPEN                                    SIEVE TRAP
 S_TRAP_5   MP2IVOP                                 ISOLATION VALVE
  T4:345     I:025                                  7
                                                    SVIV7
                                                      O:031
|-+--] [---+--] [-----------------------------------( )---|
  |   TT   |    13                                    07
  |[47]    |
  |        | O:031/07 - ] [ - File #3 CRYO_REGEN - 51
  |OPEN    |
  |CRYO ROUGH
  |VALVE 7 |
  |CR7     |
  |  O:043 |
  +--] [---+
      11
 [169]
```

Rung #051

COMPRESSOR
5 REGEN-
ERATION
PROGRAM
CYRGN5
B3
325
[46]

S_TRAP_5
LEQ
LESS THAN OR EQUAL (A<=B)
SOURCE A: T4:345.ACC
0
SOURCE B: 3600
3600

T4:345.ACC - [47]

SIEVE TRAP
ISOLATION VALVE
4
SVIV4
0:031
04
[48]

SIEVE TRAP
HEATER 4
SVHTR4
0:027
14

SIEVE TRAP
ISOLATION VALVE
6
SVIV6
0:031
06
[49]

SIEVE TRAP
HEATER 6
SVHTR6
0:027
17

SIEVE TRAP
ISOLATION VALVE
7
SVIV7
0:031
07
[50]

SIEVE TRAP
HEATER 7
SVHTR7
0:030
12

Rung #052

REGENERATE
CRYO 6
TS06
N7:15
14
[2:3]

ABORT CRYO
TIMER
ABORTCRYO
T4:297
TT
[27]

COMPRESSOR
6 REGEN-
ERATION
PROGRAM
CYRGN6
B3
(L)
326

MANUAL
COMPRESSOR 6
REGENERATION
ENABLE
MC6RE
N7:36
(L)
14

B3/326 - -| |- - File #2 MAIN_PRGRM - 112, 129, 130, 484, 486
File #3 CRYO_REGEN - 54, 56, 71, 78, 214, 249, 256, 259
File #6 TECH_RUNGS - 14
-|/|- - File #2 MAIN_PRGRM - 31, 129, 130
File #3 CRYO_REGEN - 33, 123, 139, 155, 184, 214, 228, 235
-(L)- - File #3 CRYO_REGEN - 53
-(U)- - File #3 CRYO_REGEN - 242
N7:36/14 - -(L)- - File #3 CRYO_REGEN - 53
-(U)- - File #3 CRYO_REGEN - 242
_F:N7:21[X21 - BTW - File #2 MAIN_PRGRM - 2

HI_STAG
GEQ
GRTR THAN OR EQUAL (A>=B)
SOURCE A: T4:197.ACC
0
SOURCE B: 25
25

T4:197.ACC - [2:20]

Rung #053

```
REGENERATE          ABORT CRYO                                   COMPRESSOR
CRYO 6              TIMER                                        6 REGEN-
TS06                ABORTCRYO                                    ERATION
 N7:15              T4:297                                       PROGRAM
                                                                 CYRGN6
                                                                   B3
--] [-------------]/[------------------------------------------(L)--
   14               TT                                             326
 [2:3]            [27]
                                                                 MANUAL
                  B3/326 - ] [ - File #2 MAIN_PRGRM - 112, 129, 130, 484, 486     COMPRESSOR 6
                             File #3 CRYO_REGEN - 54, 56, 71, 78, 214, 249, 256,  REGENERATION
                             259                                                   ENABLE
                             File #6 TECH_RUNGS - 14                               MC6RE
                         ]/[ - File #2 MAIN_PRGRM - 31, 129, 130                    N7:36
 HI_STAG                     File #3 CRYO_REGEN - 33, 123, 139, 155, 184, 214, 228, --(L)--
 GEQ                         235                                                    14
 GRTR THAN OR EQUAL (A>=B)  -(L)- - File #3 CRYO_REGEN - 52
 SOURCE A:   T4:197.ACC     -(U)- - File #3 CRYO_REGEN - 242
                      0   N7:36/14 - -(L)- - File #3 CRYO_REGEN - 52
 SOURCE B:           25            -(U)- - File #3 CRYO_REGEN - 242
                     25   _F:N7:21[X21 - BTW - File #2 MAIN_PRGRM - 2

T4:197.ACC - [2:20]
```

Rung #054

```
COMPRESSOR  BUFFER 3
6 REGEN-    CHAMBER
ERATION     GATE VALVE                                 REGEN COMP. 6
PROGRAM     CLOSED                                     PULSE TIMER
CYRGN6      HV8S1                                      CR6PT
  B3        I:040                                      TON
--] [--------] [---------------------------------------TIMER ON DELAY  -(EN)-
  326        00                                        TIMER:      T4:66
[53]                                                   BASE (SEC):   1.0 -(DN)
                                                       PRESET:         1
T4:66.TT - ] [ - File #3 CRYO_REGEN - 78, 85, 94       ACCUM:          0
T4:346.ACC - LEQ - File #3 CRYO_REGEN - 56
T4:346.TT - ] [ - File #3 CRYO_REGEN - 55, 263
            ]/[ - File #3 CRYO_REGEN - 264
                                                       SIEVE TRAP
                                                       6 TIMER
                                                       S_TRAP_6
                                                       TON
                                                       TIMER ON DELAY  -(EN)-
                                                       TIMER:     T4:346
                                                       BASE (SEC):   1.0 -(DN)
                                                       PRESET:      5400
                                                       ACCUM:          0
```

```
Rung #055
|           MECHANICAL                                                              SIEVE TRAP
|           PUMP 2                                                                  ISOLATION VALVE
|           ISOLATION                                                               8
|           VALVE OPEN                                                              SVIV8
| S_TRAP_6  MP2IVOP                                                                   O:031
|  T4:346    I:025
|-+--] [--+----] [--------------------------------------------------------------------( )---|
| |   TT  |     13                                                                     10
| | [54]  |
| |       | O:031/10 - -] [- - File #3 CRYO_REGEN - 56
| |OPEN   |
| |CRYO ROUGH
| |VALVE 8|
| |CR8    |
| | O:043 |
| +--] [--+
|     12
| [170]
Rung #056
|COMPRESSOR
|6 REGEN-
|ERATION                           SIEVE TRAP
|PROGRAM                           ISOLATION VALVE                               SIEVE TRAP
|CYRGN6    S_TRAP_6                8                                             HEATER 8
|  B3     +-LEQ---------------------+ SVIV8                                      SVHTR8
|--] [----+LESS THAN OR EQUAL (A<=B)+------] [--------------------------------------( )---|
|  326    |SOURCE A:     T4:346.ACC|     O:031                                     O:031
|[53]     |                       0| [55]  10                                      17
|         |SOURCE B:           3600|
|         |                    3600|
|         +------------------------+
|          T4:346.ACC - [54]
Rung #057
|                                                                               COMPRESSOR
| REGENERATE              ABORT CRYO                                            7 REGEN-
| CRYO 7                  TIMER                                                 ERATION
| TS07                    ABORTCRYO                                             PROGRAM
|   N7:15                   T4:297                                              CYRGN7
|-+--] [--------------------+---]/[------------------------------------------+-----(L)----+-|
| |   15                    |    TT                                          |     B3       |
| |[2:3]                    |[27]                                          |     327      |
| |                         |                                              |              |
| |                         |B3/327 - -] [- - File #2 MAIN_PRGRM - 113, 114, 131, 132, 133, 134, 137,
| |                         |                 138, 488, 490, 492, 494, 500, 502
| |                         |                 File #3 CRYO_REGEN - 58, 62, 72, 79, 215, 250, 257,
| |                         |                 259
| |                         |                 File #6 TECH_RUNGS - 14
| |HI_STAG                  |        -]/[- - File #2 MAIN_PRGRM - 32, 131, 132, 133, 134, 137, 138
| |+-GEQ--------------------+|                File #3 CRYO_REGEN - 33, 124, 125, 126, 140, 157, 159,
| +GRTR THAN OR EQUAL (A>=B)+-+               163, 186, 215, 229, 236
|  |SOURCE A:    T4:197.ACC|          -(U)- - File #3 CRYO_REGEN - 243
|  |                      0|  N7:36/15 - -(U)- - File #3 CRYO_REGEN - 243
|  |SOURCE B:            30|  _F:N7:211X21 - BTW - File #2 MAIN_PRGRM - 2
|  |                     30|
|  +-----------------------+
|  T4:197.ACC - [2:20]
                                                                               |MANUAL
                                                                               |COMPRESSOR 7
                                                                               |REGENERATION
                                                                               |ENABLE
                                                                               |MC7RE
                                                                               |   N7:36
                                                                               +----(L)----+
                                                                                    15
```

```
Rung #058
|COMPRESSOR  DWELL 5     DWELL 6     EXITLOCK
|7 REGEN-    CHAMBER     CHAMBER     CHAMBER
|ERATION     GATE VALVE  GATE VALVE  GATE VALVE                          REGEN COMP. 7
|PROGRAM     CLOSED      CLOSED      CLOSED                              PULSE TIMER
|CYRGN7      HV9S1       HV10S1      HV12S1                              CR7PT
|   83       I:040       I:052       I:054                               +-TON-----------------+
|---] [--------] [---------] [---------] [-------------------------------+-|TIMER ON DELAY      |-(EN)-+-
|   327        03          06          03                                | |TIMER:        T4:67 |      |
|[57]                                                                    | |BASE (SEC):    1.0  |-(DN) |
|                                                                        | |PRESET:          1  |      |
| T4:67.TT - ] [ - File #3 CRYO_REGEN - 79, 86, 95, 96, 97               | |ACCUM:           0  |      |
| T4:347.ACC - LEQ - File #3 CRYO_REGEN - 62                             | +--------------------+      |
| T4:347.TT - ] [ - File #3 CRYO_REGEN - 59, 60, 61, 263                 |                             |
|             ]/[ - File #3 CRYO_REGEN - 264                             |                             |
|                                                                        |SIEVE TRAP                   |
|                                                                        |7 TIMER                      |
|                                                                        |S_TRAP_7                     |
|                                                                        | +-TON-----------------+     |
|                                                                        +-|TIMER ON DELAY      |-(EN)-+
|                                                                          |TIMER:       T4:347 |
|                                                                          |BASE (SEC):    1.0  |-(DN)
|                                                                          |PRESET:       5400  |
|                                                                          |ACCUM:           0  |
|                                                                          +--------------------+
Rung #059
|              MECHANICAL
|              PUMP 2                                                      SIEVE TRAP
|              ISOLATION                                                   ISOLATION VALVE
|              VALVE OPEN                                                  9
| S_TRAP_7     MP2IVOP                                                     SVIV9
|  T4:347       I:025                                                         0:045
|-+--] [---+-----] [----------------------------------------------------------( )---
| |   TT   |      13                                                            04
| |[58]    |
| |        | 0:045/04 - ] [ - File #3 CRYO_REGEN - 62
| |OPEN    |
| |CRYO ROUGH
| |VALVE 9 |
| |CR9     |
| |  0:043 |
| +--] [---+
|     13
| [171]
Rung #060
|              MECHANICAL
|              PUMP 2                                                      SIEVE TRAP
|              ISOLATION                                                   ISOLATION VALVE
|              VALVE OPEN                                                  10
| S_TRAP_7     MP2IVOP                                                     SVIV10
|  T4:347       I:025                                                         0:045
|-+--] [---+-----] [----------------------------------------------------------( )---
| |   TT   |      13                                                            05
| |[58]    |
| |        | 0:045/05 - ] [ - File #3 CRYO_REGEN - 62
| |OPEN    |
| |CRYO ROUGH
| |VALVE 10|
| |CR10    |
| |  0:057 |
| +--] [---+
|     11
| [172]
```

- 490 -
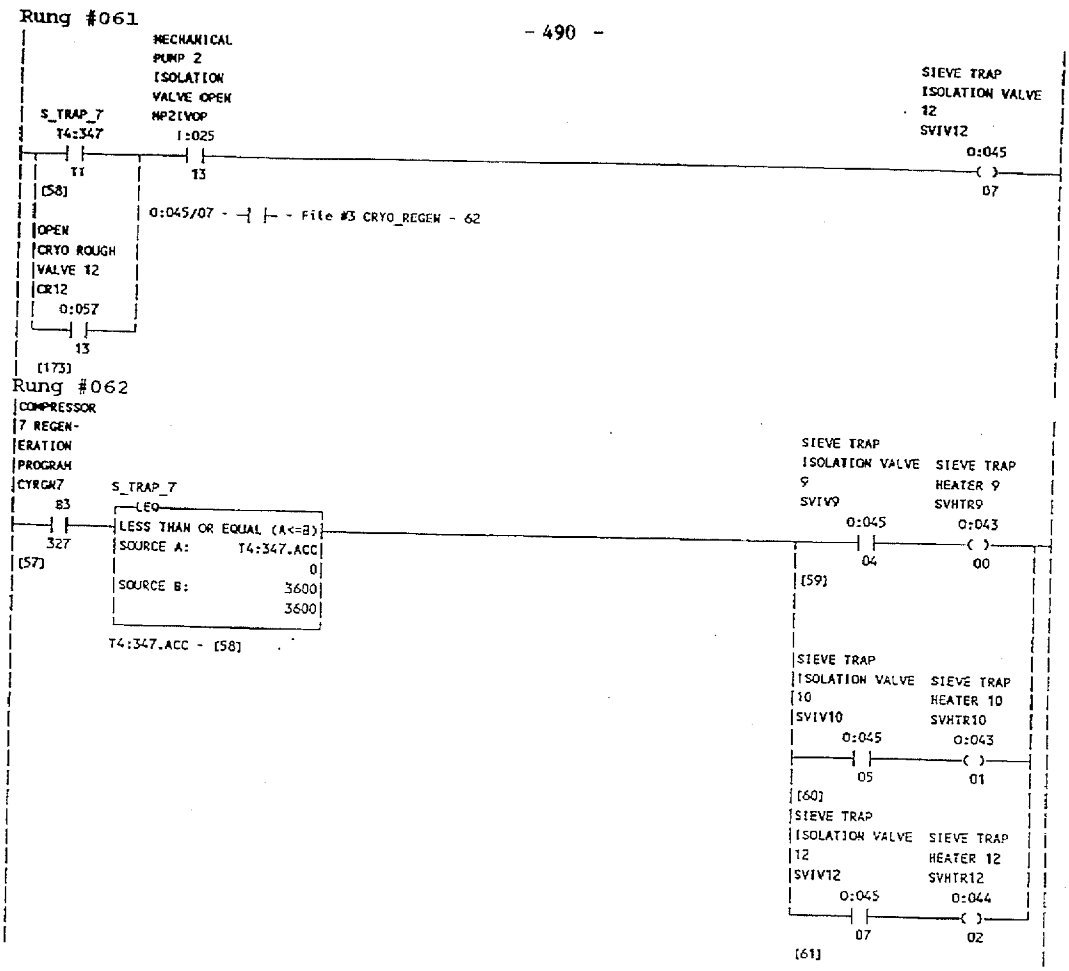

Rung #063

```
REGENERATE    ABORT CRYO                                        COMPRESSOR
CRYO 8        TIMER                                             8 REGEN-
TS08          ABORTCRYO                                         ERATION
 N7:16         T4:297                                           PROGRAM
                                                                CYRGN8
                                                                 B3
--] [--------]/[-------------------------------------------------(L)--
   0           TT                                                328
 [2:3]        [27]

              B3/328 - ] [ - File #2 MAIN_PRGRM - 113, 135, 136, 496, 498
                         File #3 CRYO_REGEN - 64, 66, 73, 80, 216, 251, 258, 259
                         File #6 TECH_RUNGS - 14
                       ]/[ - File #2 MAIN_PRGRM - 33, 135, 136
                         File #3 CRYO_REGEN - 33, 127, 141, 161, 188, 216, 230, 237
                       -(U)- - File #3 CRYO_REGEN - 244
HI_STAG       N7:37/0 - -(U)- - File #3 CRYO_REGEN - 244
 T4:197       _F:N7:21[X21 - BTW - File #2 MAIN_PRGRM - 2
--] [--
   DN
 [2:20]
                                                                MANUAL
                                                                COMPRESSOR 8
                                                                REGENERATION
                                                                ENABLE
                                                                MC8RE
                                                                 N7:37
                                                                -(L)-
                                                                  0
```

Rung #064

```
COMPRESSOR  BUFFER 4
8 REGEN-    CHAMBER
ERATION     GATE VALVE
PROGRAM     CLOSED                                   REGEN COMP. 8
CYRGN8      HV11S1                                   PULSE TIMER
  B3         I:054                                   CREPT
                                                     +-TON-----------------+
--] [--------] [-------------------------------------+TIMER ON DELAY       +-(EN)-
  328         00                                     |TIMER:         T4:68 |
[63]                                                 |BASE (SEC):    1.0   +-(DN)
                                                     |PRESET:          1   |
T4:68.TT - ] [ - File #3 CRYO_REGEN - 80, 87, 98     |ACCUM:           0   |
T4:348.ACC - LEQ - File #3 CRYO_REGEN - 66           +---------------------+
T4:348.TT - ] [ - File #3 CRYO_REGEN - 65, 263
           ]/[ - File #3 CRYO_REGEN - 264            SIEVE TRAP
                                                     8 TIMER
                                                     S_TRAP_8
                                                     +-TON-----------------+
                                                     +TIMER ON DELAY       +-(EN)-
                                                     |TIMER:        T4:348 |
                                                     |BASE (SEC):    1.0   +-(DN)
                                                     |PRESET:       5400   |
                                                     |ACCUM:           0   |
                                                     +---------------------+
```

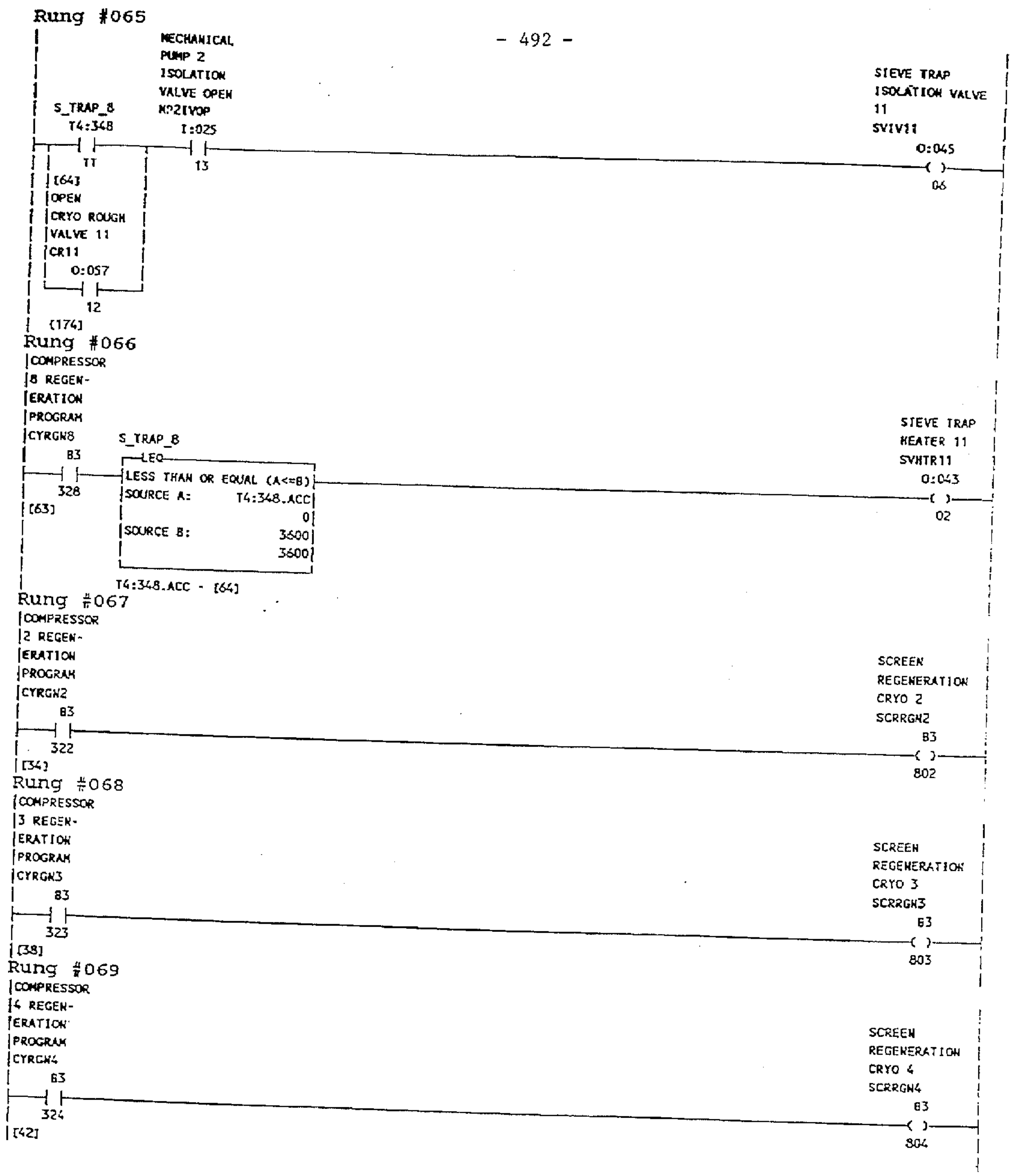
Rung #065
S_TRAP_8
T4:348
TT
[64]
OPEN
CRYO ROUGH
VALVE 11
CR11
O:057
12
[174]
MECHANICAL
PUMP 2
ISOLATION
VALVE OPEN
MP2IVOP
I:025
13
SIEVE TRAP
ISOLATION VALVE
11
SVIV11
O:045
06
Rung #066
COMPRESSOR
8 REGEN-
ERATION
PROGRAM
CYRGN8
B3
328
[63]
S_TRAP_8
LEQ
LESS THAN OR EQUAL (A<=B)
SOURCE A: T4:348.ACC
0
SOURCE B: 3600
3600
T4:348.ACC - [64]
SIEVE TRAP
HEATER 11
SVHTR11
O:043
02
Rung #067
COMPRESSOR
2 REGEN-
ERATION
PROGRAM
CYRGN2
B3
322
[34]
SCREEN
REGENERATION
CRYO 2
SCRRGN2
B3
802
Rung #068
COMPRESSOR
3 REGEN-
ERATION
PROGRAM
CYRGN3
B3
323
[38]
SCREEN
REGENERATION
CRYO 3
SCRRGN3
B3
803
Rung #069
COMPRESSOR
4 REGEN-
ERATION
PROGRAM
CYRGN4
B3
324
[42]
SCREEN
REGENERATION
CRYO 4
SCRRGN4
B3
804

```
Rung #070
|COMPRESSOR
|5 REGEN-
|ERATION                                                     SCREEN
|PROGRAM                                                     REGENERATION
|CYRGN5                                                      CRYO 5
|   B3                                                       SCRRGN5
|                                                               B3
|---| |-------------------------------------------------------( )---|
|  325                                                          805
|[46]
Rung #071
|COMPRESSOR
|6 REGEN-
|ERATION                                                     SCREEN
|PROGRAM                                                     REGENERATION
|CYRGN6                                                      CRYO 6
|   B3                                                       SCRRGN6
|                                                               B3
|---| |-------------------------------------------------------( )---|
|  326                                                          806
|[53]
Rung #072
|COMPRESSOR
|7 REGEN-
|ERATION                                                     SCREEN
|PROGRAM                                                     REGENERATION
|CYRGN7                                                      CRYO 7
|   B3                                                       SCRRGN7
|                                                               B3
|---| |-------------------------------------------------------( )---|
|  327                                                          807
|[57]
Rung #073
|COMPRESSOR
|8 REGEN-
|ERATION                                                     SCREEN
|PROGRAM                                                     REGENERATION
|CYRGN8                                                      CRYO 8
|   B3                                                       SCRRGN8
|                                                               B3
|---| |-------------------------------------------------------( )---|
|  328                                                          808
|[63]
Rung #074
|COMPRESSOR
|2 REGEN-
|ERATION     CRYO REGEN
|PROGRAM     2 PULSE
|CYRGN2      CR2PT                                           PURGE 2
|   B3        T4:62                                          P2
|                                                               B3
|---| |--------| |--------------------------------------------(L)---|
|  322          TT                                              632
|[34]        [35]
B3/632 - -| |- - File #3 CRYO_REGEN -  88,110,128
                 File #6 TECH_RUNGS -  15
         -(L)- - File #3 CRYO_REGEN -  74
         -(U)- - File #3 CRYO_REGEN -  135
```

```
Rung #075
|COMPRESSOR
|3 REGEN-
|ERATION     CRYO REGEN
|PROGRAM     3 PULSE
|CYRGN3      CR3PT                                                   PURGE 3
|   B3        T4:63                                                  P3
|---| |-------| |-----------------------------------------------------B3
|   323        TT                                                 --(L)--|
|[38]        [39]                                                    633
B3/633 - -| |- - File #3 CRYO_REGEN -  89,111,129
                 File #6 TECH_RUNGS -  15
          -(L)- - File #3 CRYO_REGEN -  75
          -(U)- - File #3 CRYO_REGEN -  136
```

```
Rung #076
|COMPRESSOR
|4 REGEN-
|ERATION     CRYO REGEN
|PROGRAM     4 PULSE
|CYRGN4      CR4PT                                                   PURGE 4
|   B3        T4:64                                                  P4
|---| |-------| |-----------------------------------------------------B3
|   324        TT                                                 --(L)--|
|[42]        [43]                                                    634
B3/634 - -| |- - File #3 CRYO_REGEN -  90,112,130
                 File #6 TECH_RUNGS -  15
          -(L)- - File #3 CRYO_REGEN -  76
          -(U)- - File #3 CRYO_REGEN -  137
```

```
Rung #077
|COMPRESSOR
|5 REGEN-
|ERATION     CRYO REGEN
|PROGRAM     5 PULSE
|CYRGN5      CR5PT                                                   PURGE 5
|   B3        T4:65                                                  P5
|---| |-------| |-----------------------------------------------------B3
|   325        TT                                                 --(L)--|
|[46]        [47]                                                    635
B3/635 - -| |- - File #3 CRYO_REGEN -  91,92,93,113,131
                 File #6 TECH_RUNGS -  15
          -(L)- - File #3 CRYO_REGEN -  77
          -(U)- - File #3 CRYO_REGEN -  138
```

```
Rung #078
|COMPRESSOR
|6 REGEN-
|ERATION     CRYO REGEJ
|PROGRAM     6 PULSE
|CYRGN6      CR6PT                                                   PURGE 6
|   B3        T4:66                                                  P6
|---| |-------| |-----------------------------------------------------B3
|   326        TT                                                 --(L)--|
|[53]        [54]                                                    636
B3/636 - -| |- - File #3 CRYO_REGEN -  94,114,132
                 File #6 TECH_RUNGS -  15
          -(L)- - File #3 CRYO_REGEN -  78
          -(U)- - File #3 CRYO_REGEN -  139
```

Rung #079

```
|COMPRESSOR
|7 REGEN-
|ERATION     CRYO REGEN
|PROGRAM     7 PULSE
|CYRGN7      CR7PT                                          PURGE 7
|   B3        T4:67                                         P7
|---] [------] [-------------------------------------------  B3
|   327       TT                                            -(L)-
|[57]        [58]                                           637
B3/637 - ] [ - File #3 CRYO_REGEN -  95,96,97,115,133
               File #6 TECH_RUNGS -  15
       -(L)- - File #3 CRYO_REGEN -  79
       -(U)- - File #3 CRYO_REGEN -  140
```

Rung #080

```
|COMPRESSOR
|8 REGEN-
|ERATION     CRYO REGEN
|PROGRAM     8 PULSE
|CYRGN8      CR8PT                                          PURGE 8
|   B3        T4:68                                         P8
|---] [------] [-------------------------------------------  B3
|   328       TT                                            -(L)-
|[63]        [64]                                           638
B3/638 - ] [ - File #3 CRYO_REGEN -  98,116,134
               File #6 TECH_RUNGS -  15
       -(L)- - File #3 CRYO_REGEN -  80
       -(U)- - File #3 CRYO_REGEN -  141
```

Rung #081

```
|                                                           ENABLE
| CRYO REGEN                                                CRYO
| 2 PULSE                                                   COMPRESSOR
| CR2PT                                                     2
|   T4:62                                                   CY2
|---] [---+-------------------------------------------+     O:010
|   TT    |                                           +-----(U)-----
|[35]     |                                           |     05
|         | O:010/05 - ] [ - File #2 MAIN_PRGRM - 436, 440
|         |                  File #3 CRYO_REGEN - 260
|         |                  File #6 TECH_RUNGS - 19      |MANUAL CRYO
|         |            -(L)- - File #2 MAIN_PRGRM - 27    |COMPRESSOR 2
|         | N7:34/6 - -(L)- - File #2 MAIN_PRGRM - 27     |RUN
|MAIN WATER ON  _F:N7:21LX21 - BTW - File #2 MAIN_PRGRM - 2  |MCYC2RUN
|MAIN_H2O   | N7:29/6 - -(U)- - File #2 MAIN_PRGRM - 27     |  N7:34
|  I:002    | _F:N7:21LX21 - BTW - File #2 MAIN_PRGRM - 2  +----(U)----
|---]/[-----|                                           |     6
|   07      |                                           |
|MANUAL     |                                           |
|CONTROL    |                                           |MANUAL CRYO
|STOP CRYO  |                                           |COMPRESSOR 2
|COMPRESSOR |                                           |STOP
|2          |                                           |MCYC2STOP
|M-CY2-O    |                                           |  N7:29
|  N7:8     |                                           +----(L)----
|---] [-----+                                                 6
|   6
|[2:3]
```

Rung #082

- 496 -

```
CRYO REGEN                                                        ENABLE
3 PULSE                                                           CRYO
CR3PT                                                             COMPRESSOR
 T4:63                                                            3
--| |--                                                           CY3
   TT                                                               O:030
[39]                                                              --(U)--
                                                                     04
     O:030/04 - -| |- - File #2 MAIN_PRGRM - 440
                        File #3 CRYO_REGEN - 260
                        File #6 TECH_RUNGS - 19                   MANUAL CRYO
                  -(L)- - File #2 MAIN_PRGRM - 28                 COMPRESSOR 3
     N7:34/7 - -(L)- - File #2 MAIN_PRGRM - 28                    RUN
MAIN WATER ON  _F:N7:21[X21 - BTW - File #2 MAIN_PRGRM - 2        MCYC3RUN
MAIN_H20       N7:29/7 - -(U)- - File #2 MAIN_PRGRM - 28            N7:34
  I:002        _F:N7:21[X21 - BTW - File #2 MAIN_PRGRM - 2        --(U)--
--|/|--                                                              7
   07
MANUAL                                                            MANUAL CRYO
CONTROL                                                           COMPRESSOR 3
STOP CRYO                                                         STOP
COMPRESSOR                                                        MCYC3STOP
3                                                                   N7:29
M-CY3-O                                                           --(L)--
  N7:8                                                               7
--| |--
   7
[2:3]
```

Rung #083

```
CRYO REGEN                                                        ENABLE
4 PULSE                                                           CRYO
CR4PT                                                             COMPRESSOR
 T4:64                                                            4
--| |--                                                           CY4
   TT                                                               O:030
[43]                                                              --(U)--
                                                                     05
     O:030/05 - -| |- - File #2 MAIN_PRGRM - 440
                        File #3 CRYO_REGEN - 260
                        File #6 TECH_RUNGS - 19                   MANUAL CRYO
                  -(L)- - File #2 MAIN_PRGRM - 29                 COMPRESSOR 4
     N7:34/8 - -(L)- - File #2 MAIN_PRGRM - 29                    RUN
MAIN WATER ON  _F:N7:21[X21 - BTW - File #2 MAIN_PRGRM - 2        MCYC4RUN
MAIN_H20       N7:29/8 - -(U)- - File #2 MAIN_PRGRM - 29            N7:34
  I:002        _F:N7:21[X21 - BTW - File #2 MAIN_PRGRM - 2        --(U)--
--|/|--                                                              8
   07
MANUAL                                                            MANUAL CRYO
CONTROL                                                           COMPRESSOR 4
STOP CRYO                                                         STOP
COMPRESSOR                                                        MCYC4STOP
4                                                                   N7:29
M-CY4-O                                                           --(L)--
  N7:8                                                               8
--| |--
   8
[2:3]
```

```
Rung #084

 CRYO REGEN                                                              ENABLE
 5 PULSE                                                                 CRYO
 CR5PT                                                                   COMPRESSOR
   T4:65                                                                 5
                                                                         CY5
                                                                           O:044
 --] [----------------------------------------------------------------------(U)--
     TT                                                                     04
 [47]
           O:044/04 - -] [- - File #2 MAIN_PRGRM - 440, 444
                              File #3 CRYO_REGEN - 260                   MANUAL CRYO
                              File #6 TECH_RUNGS - 19                    COMPRESSOR 5
                        -(L)- - File #2 MAIN_PRGRM - 30                  RUN
           N7:34/9 - -(L)- - File #2 MAIN_PRGRM - 30                     MCYC5RUN
 MAIN WATER ON   _F:N7:21[X21 - BTW - File #2 MAIN_PRGRM - 2               N7:34
 MAIN_H20        N7:29/9 - -(U)- - File #2 MAIN_PRGRM - 30               ---(U)---
    I:002        _F:N7:21[X21 - BTW - File #2 MAIN_PRGRM - 2                 9
 ---]/[---
     07                                                                  MANUAL CRYO
 MANUAL                                                                  COMPRESSOR 5
 CONTROL                                                                 STOP
 STOP CRYO                                                               MCYC5STOP
 COMPRESSOR                                                                N7:29
 5                                                                       ---(L)---
 M-CY5-0                                                                     9
   N7:8
 ---] [---
     9
 [2:3]

Rung #085

 CRYO REGE]                                                              ENABLE
 6 PULSE                                                                 CRYO
 CR6PT                                                                   COMPRESSOR
   T4:66                                                                 6
                                                                         CY6
                                                                           O:044
 --] [----------------------------------------------------------------------(U)--
     TT                                                                     05
 [54]
           O:044/05 - -] [- - File #2 MAIN_PRGRM - 444
                              File #3 CRYO_REGEN - 260                   MANUAL CRYO
                              File #6 TECH_RUNGS - 19                    COMPRESSOR 6
                        -(L)- - File #2 MAIN_PRGRM - 31                  RUN
           N7:34/10 - -(L)- - File #2 MAIN_PRGRM - 31                    MCYC6RUN
 MAIN WATER ON   _F:N7:21[X21 - BTW - File #2 MAIN_PRGRM - 2               N7:34
 MAIN_H20        N7:29/10 - -(U)- - File #2 MAIN_PRGRM - 31              ---(U)---
    I:002        _F:N7:21[X21 - BTW - File #2 MAIN_PRGRM - 2                 10
 ---]/[---
     07                                                                  MANUAL CRYO
 MANUAL                                                                  COMPRESSOR 6
 CONTROL                                                                 STOP
 STOP CRYO                                                               MCYC6STOP
 COMPRESSOR                                                                N7:29
 6                                                                       ---(L)---
 M-CY6-0                                                                     10
   N7:8
 ---] [---
     10
 [2:3]
```

Rung #086

- 498 -

```
CRYO REGEN                                                                    ENABLE
7 PULSE                                                                       CRYO
CR7PT                                                                         COMPRESSOR
T4:67                                                                         7
--] [--                                                                       CY7
 TT                                                                           O:060
[58]                                                                          --(U)--
                                                                               04
 O:060/04 - -] [- - File #2 MAIN_PRGRM - 449, 453
                    File #3 CRYO_REGEN - 260                                  MANUAL CRYO
                    File #6 TECH_RUNGS - 19                                   COMPRESSOR 7
               -(L)- - File #2 MAIN_PRGRM - 32                                RUN
 N7:34/11 - -(L)- - File #2 MAIN_PRGRM - 32                                   MCYC7RUN
 _F:N7:21[X21 - BTW - File #2 MAIN_PRGRM - 2                                  N7:34
 N7:29/11 - -(U)- - File #2 MAIN_PRGRM - 32                                   --(U)--
 _F:N7:21[X21 - BTW - File #2 MAIN_PRGRM - 2                                   11
MAIN WATER ON
MAIN_H20                                                                      MANUAL CRYO
I:002                                                                         COMPRESSOR 7
--]/[--                                                                       STOP
 07                                                                           MCYC7STOP
MANUAL                                                                        N7:29
CONTROL                                                                       --(L)--
STOP CRYO                                                                      11
COMPRESSOR
7
M-CY7-0
N7:8
--] [--
 11
[2:3]
```

Rung #087

```
CRYO REGEN                                                                    ENABLE
8 PULSE                                                                       CRYO
CR8PT                                                                         COMPRESSOR
T4:68                                                                         8
--] [--                                                                       CY8
 TT                                                                           O:060
[64]                                                                          --(U)--
                                                                               05
 O:060/05 - -] [- - File #2 MAIN_PRGRM - 449
                    File #3 CRYO_REGEN - 260                                  MANUAL CRYO
                    File #6 TECH_RUNGS - 19                                   COMPRESSOR 8
               -(L)- - File #2 MAIN_PRGRM - 33                                RUN
 N7:34/12 - -(L)- - File #2 MAIN_PRGRM - 33                                   MCYC8RUN
 _F:N7:21[X21 - BTW - File #2 MAIN_PRGRM - 2                                  N7:34
 N7:29/12 - -(U)- - File #2 MAIN_PRGRM - 33                                   --(U)--
 _F:N7:21[X21 - BTW - File #2 MAIN_PRGRM - 2                                   12
MAIN WATER ON
MAIN_H20                                                                      MANUAL CRYO
I:002                                                                         COMPRESSOR 8
--]/[--                                                                       STOP
 07                                                                           MCYC8STOP
MANUAL                                                                        N7:29
CONTROL                                                                       --(L)--
STOP CRYO                                                                      12
COMPRESSOR
8
M-CY8-0
N7:8
--] [--
 12
[2:3]
```

```
Rung #088
|
|                      OPEN
|          CRYO REGEN  CRYO ROUGH
|PURGE 2   2 PULSE     VALVE 2                                              OPEN PURGE
|P2        CR2PT       CR2                                                  VALVE 2
|  B3        T4:62       O:007                                              NIF2
|--| |--------| |--------|/|--------------------------------------------------O:007
|  632        TT          12                                                 -(L)--
|[74]     [35]        [164]                                                  07
O:007/07 - -| |- - File #3 CRYO_REGEN -  99
                   File #6 TECH_RUNGS -  16
           -(L)- - File #3 CRYO_REGEN -  88
           -(U)- - File #3 CRYO_REGEN -  117
Rung #089
|
|                      OPEN
|          CRYO REGEN  CRYO ROUGH
|PURGE 3   3 PULSE     VALVE 3                                              OPEN PURGE
|P3        CR3PT       CR3                                                  VALVE 3
|  B3        T4:63       O:007                                              NIF3
|--| |--------| |--------|/|--------------------------------------------------O:007
|  633        TT          13                                                 -(L)--
|[75]     [39]        [165]                                                  10
O:007/10 - -| |- - File #3 CRYO_REGEN -  100
                   File #6 TECH_RUNGS -  16
           -(L)- - File #3 CRYO_REGEN -  89
           -(U)- - File #3 CRYO_REGEN -  118
Rung #090
|
|                      OPEN
|          CRYO REGEN  CRYO ROUGH
|PURGE 4   4 PULSE     VALVE 5                                              OPEN PURGE
|P4        CR4PT       CR5                                                  VALVE 5
|  B3        T4:64       O:027                                              NIF5
|--| |--------| |--------|/|--------------------------------------------------O:027
|  634        TT          12                                                 -(L)--
|[76]     [43]        [166]                                                  07
O:027/07 - -| |- - File #3 CRYO_REGEN -  102
                   File #6 TECH_RUNGS -  16
           -(L)- - File #3 CRYO_REGEN -  90
           -(U)- - File #3 CRYO_REGEN -  119
Rung #091
|
|                      OPEN
|          CRYO REGEN  CRYO ROUGH
|PURGE 5   5 PULSE     VALVE 4                                              OPEN PURGE
|P5        CR5PT       CR4                                                  VALVE 4
|  B3        T4:65       O:027                                              NIF4
|--| |--------| |--------|/|--------------------------------------------------O:027
|  635        TT          11                                                 -(L)--
|[77]     [47]        [167]                                                  06
O:027/06 - -| |- - File #3 CRYO_REGEN -  101
                   File #6 TECH_RUNGS -  16
           -(L)- - File #3 CRYO_REGEN -  91
           -(U)- - File #3 CRYO_REGEN -  120
Rung #092
|
|                      OPEN
|          CRYO REGEN  CRYO ROUGH
|PURGE 5   5 PULSE     VALVE 6                                              OPEN PURGE
|P5        CR5PT       CR6                                                  VALVE 6
|  B3        T4:65       O:027                                              NIF6
|--| |--------| |--------|/|--------------------------------------------------O:027
|  635        TT          13                                                 -(L)--
|[77]     [47]        [168]                                                  10
O:027/10 - -| |- - File #3 CRYO_REGEN -  103
```

```
                      File #6 TECH_RUNGS      16
            -(L)- - File #3 CRYO_REGEN      92
            -(U)- - File #3 CRYO_REGEN -   121
Rung #093
|                    OPEN
|        CRYO REGEN  CRYO ROUGH                                        OPEN PURGE |
|PURGE 5 5 PULSE     VALVE 7                                           VALVE 7    |
|P5      CR5PT       CR7                                               NIF7       |
|  B3      T4:65       0:043                                             0:043    |
|--] [-----] [--------]/[-------------------------------------------------(L)-----|
|  635       TT          11                                               06      |
|[77]    [47]        [169]                                                        |
0:043/06 - ] [ - - File #3 CRYO_REGEN -  104
                   File #6 TECH_RUNGS -  16
          -(L)- - File #3 CRYO_REGEN -  93
          -(U)- - File #3 CRYO_REGEN -  122
Rung #094
|                    OPEN
|        CRYO REGE]  CRYO ROUGH                                        OPEN PURGE |
|PURGE 6 6 PULSE     VALVE 8                                           VALVE 8    |
|P6      CR6PT       CR8                                               NIF8       |
|  B3      T4:66       0:043                                             0:043    |
|--] [-----] [--------]/[-------------------------------------------------(L)-----|
|  636       TT          12                                               07      |
|[78]    [54]        [170]                                                        |
0:043/07 - ] [ - - File #3 CRYO_REGEN -  106
                   File #6 TECH_RUNGS -  16
          -(L)- - File #3 CRYO_REGEN -  94
          -(U)- - File #3 CRYO_REGEN -  123
Rung #095
|                    OPEN
|        CRYO REGEN  CRYO ROUGH                                        OPEN PURGE |
|PURGE 7 7 PULSE     VALVE 9                                           VALVE 9    |
|P7      CR7PT       CR9                                               NIF9       |
|  B3      T4:67       0:043                                             0:043    |
|--] [-----] [--------]/[-------------------------------------------------(L)-----|
|  637       TT          13                                               10      |
|[79]    [58]        [171]                                                        |
0:043/10 - ] [ - - File #3 CRYO_REGEN -  105
                   File #6 TECH_RUNGS -  16
          -(L)- - File #3 CRYO_REGEN -  95
          -(U)- - File #3 CRYO_REGEN -  124
Rung #096
|                    OPEN
|        CRYO REGEN  CRYO ROUGH                                        OPEN PURGE |
|PURGE 7 7 PULSE     VALVE 10                                          VALVE 10   |
|P7      CR7PT       CR10                                              NIF10      |
|  B3      T4:67       0:057                                             0:057    |
|--] [-----] [--------]/[-------------------------------------------------(L)-----|
|  637       TT          11                                               06      |
|[79]    [58]        [172]                                                        |
0:057/06 - ] [ - - File #3 CRYO_REGEN -  107
                   File #6 TECH_RUNGS -  16
          -(L)- - File #3 CRYO_REGEN -  96
          -(U)- - File #3 CRYO_REGEN -  125
```

```
Rung #097
|
|                      OPEN
|           CRYO REGEN CRYO ROUGH                                     OPEN PURGE |
|PURGE 7    7 PULSE    VALVE 12                                      VALVE 12   |
|P7         CR7PT      CR12                                          NIF12      |
|  B3         T4:67      O:057                                         O:057    |
|--] [--------] [--------]/[-------------------------------------------(L)------|
|  637          TT        13                                             10     |
|[79]       [58]       [173]                                                    |
O:057/10 - ] [ - File #3 CRYO_REGEN - 108
                 File #6 TECH_RUNGS - 16
         -(L)- - File #3 CRYO_REGEN - 97
         -(U)- - File #3 CRYO_REGEN - 126
Rung #098
|
|                      OPEN
|           CRYO REGEN CRYO ROUGH                                     OPEN PURGE |
|PURGE 8    8 PULSE    VALVE 11                                      VALVE 11   |
|P8         CR8PT      CR11                                          NIF11      |
|  B3         T4:68      O:057                                         O:057    |
|--] [--------] [--------]/[-------------------------------------------(L)------|
|  638          TT        12                                             07     |
|[80]       [64]       [174]                                                    |
O:057/07 - ] [ - File #3 CRYO_REGEN - 109
                 File #6 TECH_RUNGS - 16
         -(L)- - File #3 CRYO_REGEN - 98
         -(U)- - File #3 CRYO_REGEN - 127
Rung #099
|
|OPEN PURGE                                                          ENABLE     |
|VALVE 2                                                             PURGE      |
|NIF2                                                                HEATER 2   |
|  O:007                                                             NIH2       |
|                                                                      O:007     |
|--] [-----------------------------------------------------------------( )------|
|  07                                                                    04     |
|[88]                                                                           |
O:007/04 - ] [ - File #3 CRYO_REGEN - 110
         -( )- - File #3 CRYO_REGEN - 99
Rung #100
|
|OPEN PURGE                                                          ENABLE     |
|VALVE 3                                                             PURGE      |
|NIF3                                                                HEATER 3   |
|  O:007                                                             NIH3       |
|                                                                      O:007     |
|--] [-----------------------------------------------------------------( )------|
|  10                                                                    05     |
|[89]                                                                           |
O:007/05 - ] [ - File #3 CRYO_REGEN - 111
         -( )- - File #3 CRYO_REGEN - 100
Rung #101
|
|OPEN PURGE                                                          ENABLE     |
|VALVE 4                                                             PURGE      |
|NIF4                                                                HEATER 4   |
|  O:027                                                             NIH4       |
|                                                                      O:027     |
|--] [-----------------------------------------------------------------( )------|
|  06                                                                    03     |
|[91]                                                                           |
O:027/03 - ] [ - File #3 CRYO_REGEN - 113
         -( )- - File #3 CRYO_REGEN - 101
```

Rung #102

```
|                                                              |
|OPEN PURGE                                         ENABLE     |
|VALVE 5                                            PURGE      |
|NIF5                                               HEATER 5   |
|  0:027                                            NIH5       |
|---] [-------------------------------------------- 0:027      |
|    07                                             --( )------|
|[90]                                                 04       |
0:027/04 - -] [- - File #3 CRYO_REGEN -  112
           -( )- - File #3 CRYO_REGEN -  102
```

Rung #103

```
|                                                              |
|OPEN PURGE                                         ENABLE     |
|VALVE 6                                            PURGE      |
|NIF6                                               HEATER 6   |
|  0:027                                            NIH6       |
|---] [-------------------------------------------- 0:027      |
|    10                                             --( )------|
|[92]                                                 05       |
0:027/05 - -] [- - File #3 CRYO_REGEN -  113
           -( )- - File #3 CRYO_REGEN -  103
```

Rung #104

```
|                                                              |
|OPEN PURGE                                         ENABLE     |
|VALVE 7                                            PURGE      |
|NIF7                                               HEATER 7   |
|  0:043                                            NIH7       |
|---] [-------------------------------------------- 0:043      |
|    06                                             --( )------|
|[93]                                                 03       |
0:043/03 - -] [- - File #3 CRYO_REGEN -  113
           -( )- - File #3 CRYO_REGEN -  104
```

Rung #105

```
|                                                              |
|OPEN PURGE                                         ENABLE     |
|VALVE 9                                            PURGE      |
|NIF9                                               HEATER 9   |
|  0:043                                            NIH9       |
|---] [-------------------------------------------- 0:043      |
|    10                                             --( )------|
|[95]                                                 05       |
0:043/05 - -] [- - File #3 CRYO_REGEN -  115
           -( )- - File #3 CRYO_REGEN -  105
```

Rung #106

```
|                                                              |
|OPEN PURGE                                         ENABLE     |
|VALVE 8                                            PURGE      |
|NIF8                                               HEATER 8   |
|  0:043                                            NIH8       |
|---] [-------------------------------------------- 0:043      |
|    07                                             --( )------|
|[94]                                                 04       |
0:043/04 - -] [- - File #3 CRYO_REGEN -  114
           -( )- - File #3 CRYO_REGEN -  106
```

Rung #107

```
|OPEN PURGE                                              ENABLE      |
|VALVE 10                                                PURGE       |
|NIF10                                                   HEATER 10   |
|  O:057                                                 NIH10       |
|                                                          O:057     |
|--| |--------------------------------------------------------( )----|
|   06                                                        03     |
|[96]
O:057/03 - -| |- - File #3 CRYO_REGEN - 115
           -( )- - File #3 CRYO_REGEN - 107
```

Rung #108

```
|OPEN PURGE                                              ENABLE      |
|VALVE 12                                                PURGE       |
|NIF12                                                   HEATER 12   |
|  O:057                                                 NIH12       |
|                                                          O:057     |
|--| |--------------------------------------------------------( )----|
|   10                                                        05     |
|[97]
O:057/05 - -| |- - File #3 CRYO_REGEN - 115
           -( )- - File #3 CRYO_REGEN - 108
```

Rung #109

```
|OPEN PURGE                                              ENABLE      |
|VALVE 11                                                PURGE       |
|NIF11                                                   HEATER 11   |
|  O:057                                                 NIH11       |
|                                                          O:057     |
|--| |--------------------------------------------------------( )----|
|   07                                                        04     |
|[98]
O:057/04 - -| |- - File #3 CRYO_REGEN - 116
           -( )- - File #3 CRYO_REGEN - 109
```

Rung #110

```
|         ENABLE    CRYO 2      PURGE                 PURGE TIME              |
|         PURGE     TEMPERATUR  TIMER                 MONITOR                 |
|PURGE 2  HEATER 2  =>290K      DEFEAT                COMPRESSOR 2            |
|P2       NIH2      CY2TMP290   PG_DEFEAT             PGC2                    |
|  B3      O:007      B3          B3                  +-TON-------------+     |
|--| |------| |-------| |---------| |-----------------+TIMER ON DELAY   +-(EN)-|
|  632      04        514         288                 |TIMER:     T4:22 |     |
|[135]    [99]                                        |BASE (SEC):  1.0 +-(DN) |
|                                                     |PRESET:     7200 |     |
|                                                     |ACCUM:         0 |     |
|                                                     +-----------------+     |
T4:22.ACC - GEQ - File #3 CRYO_REGEN - 252
T4:22.DN - -| |- - File #3 CRYO_REGEN - 117,128,262
T4:22.TT - -| |- - File #6 TECH_RUNGS - 15
```

Rung #111

```
|         ENABLE    CRYO 3      PURGE                 PURGE TIME              |
|         PURGE     TEMPERATUR  TIMER                 MONITOR                 |
|PURGE 3  HEATER 3  =>290K      DEFEAT                COMPRESSOR 3            |
|P3       NIH3      CY3TMP290   PG_DEFEAT             PGC3                    |
|  B3      O:007      B3          B3                  +-TON-------------+     |
|--| |------| |-------| |---------| |-----------------+TIMER ON DELAY   +-(EN)-|
|  633      05        515         288                 |TIMER:     T4:23 |     |
|[136]    [100]                                       |BASE (SEC):  1.0 +-(DN) |
|                                                     |PRESET:     7200 |     |
|                                                     |ACCUM:         0 |     |
|                                                     +-----------------+     |
T4:23.ACC - GEQ - File #3 CRYO_REGEN - 253
T4:23.DN - -| |- - File #3 CRYO_REGEN - 118,129,262
```

```
T4:23.TT - -| |- - File #6 TECH_RUNGS -  15
Rung #112                                                    - 504 -
|        ENABLE     CRYO 5      PURGE                                                   PURGE TIME          |
|        PURGE      TEMPERATUR  TIMER                                                   MONITOR             |
|PURGE 4 HEATER 5   =>290K      DEFEAT                                                  COMPRESSOR 4        |
|P4      NIH5       CY5TMP290   PG_DEFEAT                                               PGC4                |
|  B3     O:027       B3          B3                                                    +-TON-----------+   |
|--| |----| |--------| |---------| |----------------------------------------------------|TIMER ON DELAY |-(EN)-|
|  634     04         517         288                                                   |TIMER:    T4:24|   |
|[137]   [102]                                                                          |BASE (SEC):  1.0|-(DN)|
|                                                                                       |PRESET:    7200|   |
|                                                                                       |ACCUM:        0|   |
|                                                                                       +---------------+   |
T4:24.ACC - GEQ - File #3 CRYO_REGEN -  254
T4:24.DN - -| |- - File #3 CRYO_REGEN -  119,130,262
T4:24.TT - -| |- - File #6 TECH_RUNGS -  15
Rung #113
|        ENABLE     CRYO 4      CRYO 6      CRYO 7      PURGE                           PURGE TIME          |
|        PURGE      TEMPERATUR  TEMPERATUR  TEMPERATUR  TIMER                           MONITOR             |
|PURGE 5 HEATER 4   =>290K      =>290K      =>290K      DEFEAT                          COMPRESSOR 5        |
|P5      NIH4       CY4TMP290   CY6TMP290   CY7TMP290   PG_DEFEAT                       PGC5                |
|  B3     O:027       B3          B3          B3          B3                            +-TON-----------+   |
|--| |--+--| |--+------| |---------| |---------| |---------| |--------------------------|TIMER ON DELAY |-(EN)-|
|  635  |   03  |     516         518         519         288                           |TIMER:    T4:25|   |
|[138]  |[101]  |                                                                       |BASE (SEC):  1.0|-(DN)|
|       |       | T4:25.ACC - GEQ - File #3 CRYO_REGEN - 255                            |PRESET:    7200|   |
|       |       | T4:25.DN - -| |- - File #3 CRYO_REGEN - 120, 121, 122, 131, 262       |ACCUM:        0|   |
|       |       | T4:25.TT - -| |- - File #6 TECH_RUNGS - 15                            +---------------+   |
|       |ENABLE |                                                                                           |
|       |PURGE  |                                                                                           |
|       |HEATER 6                                                                                           |
|       |NIH6   |                                                                                           |
|       |  O:027|                                                                                           |
|       +--| |--+                                                                                           |
|       |   05  |                                                                                           |
|       |[103]  |                                                                                           |
|       |ENABLE |                                                                                           |
|       |PURGE  |                                                                                           |
|       |HEATER 7                                                                                           |
|       |NIH7   |                                                                                           |
|       |  O:043|                                                                                           |
|       +--| |--+                                                                                           |
|          03                                                                                               |
|        [104]                                                                                              |
Rung #114
|        ENABLE     CRYO 8      PURGE                                                   PURGE TIME          |
|        PURGE      TEMPERATUR  TIMER                                                   MONITOR             |
|PURGE 6 HEATER 8   =>290K      DEFEAT                                                  COMPRESSOR 6        |
|P6      NIH8       CY8TMP290   PG_DEFEAT                                               PGC6                |
|  B3     O:043       B3          B3                                                    +-TON-----------+   |
|--| |----| |--------| |---------| |----------------------------------------------------|TIMER ON DELAY |-(EN)-|
|  636     04         520         288                                                   |TIMER:    T4:26|   |
|[139]   [106]                                                                          |BASE (SEC):  1.0|-(DN)|
|                                                                                       |PRESET:    7200|   |
|                                                                                       |ACCUM:        0|   |
|                                                                                       +---------------+   |
T4:26.ACC - GEQ - File #3 CRYO_REGEN -  256
T4:26.DN - -| |- - File #3 CRYO_REGEN -  123,132,262
T4:26.TT - -| |- - File #6 TECH_RUNGS -  15
```

Rung #115
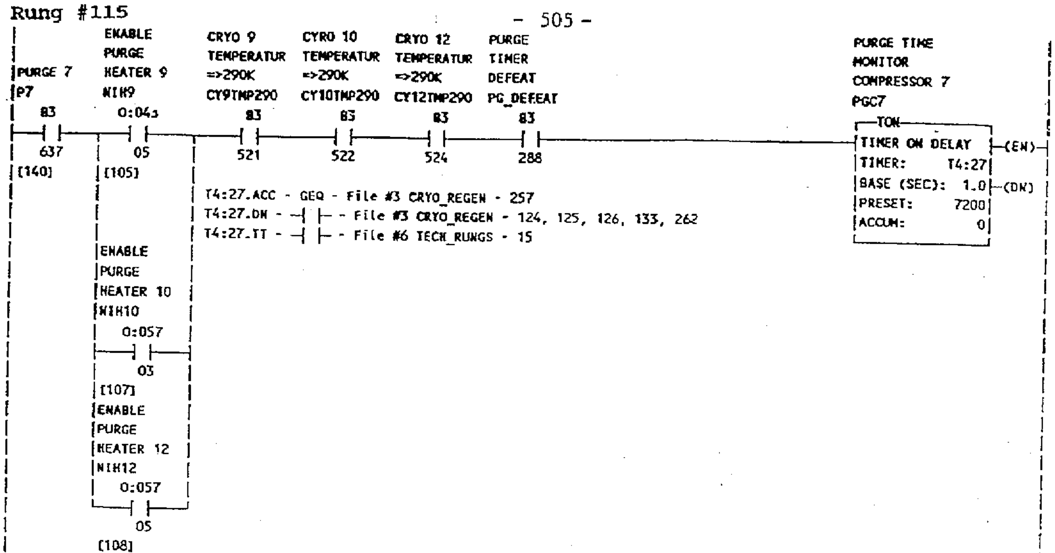
Rung #116
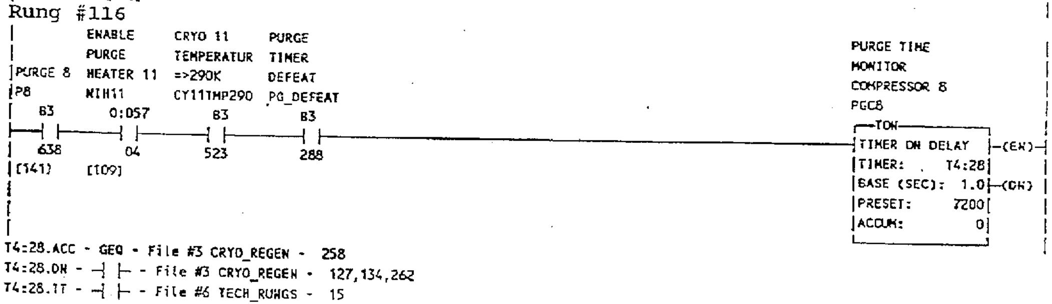

Rung #117

- 506 -

```
|              PURGE TIME
|              MONITOR
| CRYO 2       CRYO 2
| TEMPERATUR   120 MIN.      BLOWER 2
| =>290K       DONE          ENABLED                                    OPEN PURGE
| CY2TMP290    PGC2          BL2                                        VALVE 2
|    B3          T4:22        0:027                                     KIF2
+-+--] [------] [-------] [--+                                            0:007
| |  514         DN          01 |----------------------------------------(U)----|
| |             [110]      [2:74]|                                          07
| |                              | 0:007/07 - ] [ - File #3 CRYO_REGEN - 99
| |                              |              File #6 TECH_RUNGS - 16
| |COMPRESSOR                    |       -(L)- - File #3 CRYO_REGEN - 88
| |2 REGEN-                      |
| |ERATION                       |
| |PROGRAM                       |
| |CYRGN2                        |
| |   B3                         |
| +--]/[-------------------------+
|    322
| [34]
```

Rung #118

```
|              PURGE TIME
|              MONITOR
| CRYO 3       CRYO 3
| TEMPERATUR   120 MIN.      BLOWER 2
| =>290K       DONE          ENABLED                                    OPEN PURGE
| CY3TMP290    PGC3          BL2                                        VALVE 3
|    B3          T4:23        0:027                                     KIF3
+-+--] [------] [-------] [--+                                            0:007
| |  515         DN          01 |----------------------------------------(U)----|
| |             [111]      [2:74]|                                          10
| |                              | 0:007/10 - ] [ - File #3 CRYO_REGEN - 100
| |                              |              File #6 TECH_RUNGS - 16
| |COMPRESSOR                    |       -(L)- - File #3 CRYO_REGEN - 89
| |3 REGEN-                      |
| |ERATION                       |
| |PROGRAM                       |
| |CYRGN3                        |
| |   B3                         |
| +--]/[-------------------------+
|    323
| [38]
```

```
Rung #119
              PURGE TIME
              MONITOR
 CRYO 5       CRYO 4
 TEMPERATUR   120 MIN      BLOWER 2                                  OPEN PURGE
 =>290K       DONE         ENABLED                                   VALVE 5
 CYSTMP290    PGC4         BL2                                       N1F5
    B3          T4:24        O:027                                     O:027
---] [----------] [----------] [-------------------------------------------(U)---
   517           DN            01                                       07
              [112]         [2:74]
                                     O:027/07 - ] [ - - File #3 CRYO_REGEN - 102
                                                         File #6 TECH_RUNGS - 16
 |COMPRESSOR                                    -(L)- - File #3 CRYO_REGEN - 90
 |4 REGEN-
 |ERATION
 |PROGRAM
 |CYRGN4
 |   B3
 +---]/[--------------------------
    324
 [42]

Rung #120
              PURGE TIME
              MONITOR
 CRYO 4       CRYO 5
 TEMPERATUR   120 MIN      BLOWER 2                                  OPEN PURGE
 =>290K       DONE         ENABLED                                   VALVE 4
 CY4TMP290    PGC5         BL2                                       N1F4
    B3          T4:25        O:027                                     O:027
---] [----------] [----------] [-------------------------------------------(U)---
   516           DN            01                                       06
              [113]         [2:74]
                                     O:027/06 - ] [ - - File #3 CRYO_REGEN - 101
                                                         File #6 TECH_RUNGS - 16
 |COMPRESSOR                                    -(L)- - File #3 CRYO_REGEN - 91
 |5 REGEN-
 |ERATION
 |PROGRAM
 |CYRGN5
 |   B3
 +---]/[--------------------------
    325
 [46]
```

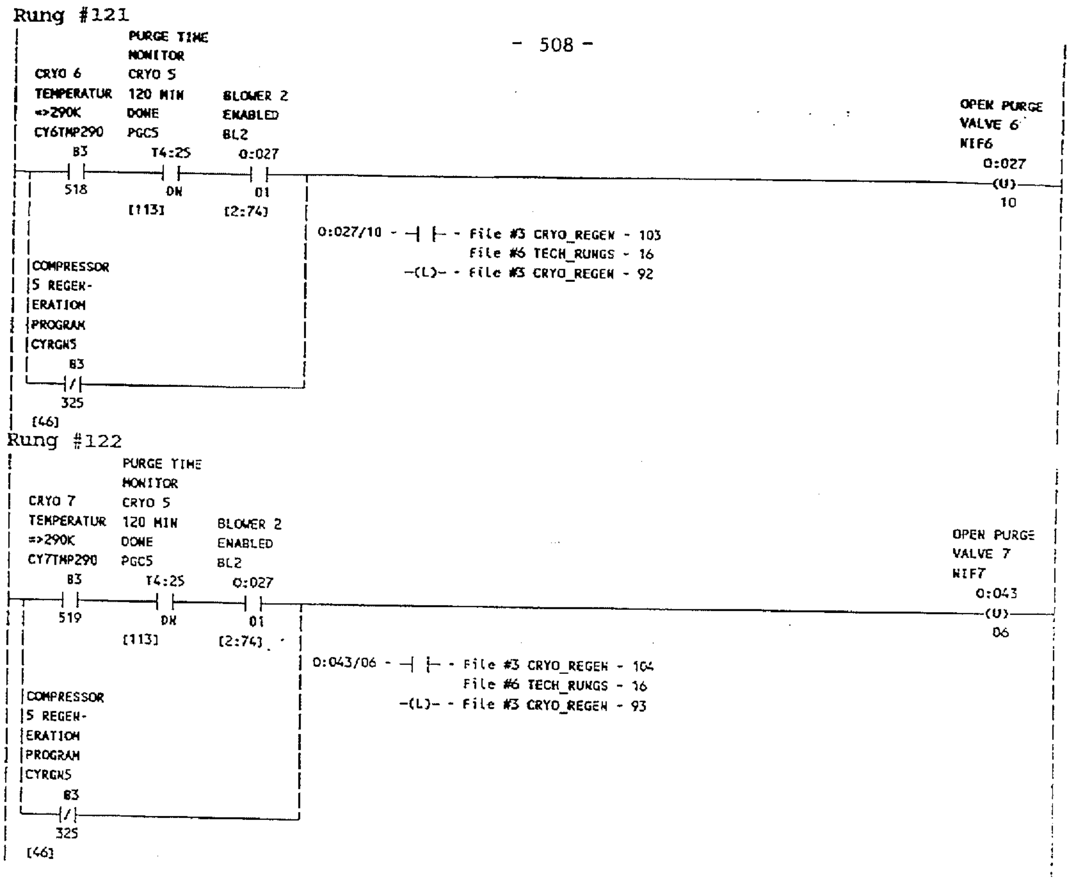
Rung #121
CRYO 6 TEMPERATUR =>290K CY6TMP290
B3
518
PURGE TIME MONITOR CRYO 5 120 MIN DONE PGC5
T4:25
DN
[113]
BLOWER 2 ENABLED BL2
O:027
01
[2:74]
OPEN PURGE VALVE 6 NIF6
O:027
(U)
10
O:027/10 - ┤ ├ - - File #3 CRYO_REGEN - 103
File #6 TECH_RUNGS - 16
-(L)- - File #3 CRYO_REGEN - 92
COMPRESSOR 5 REGEN- ERATION PROGRAM CYRGN5
B3
325
[46]
Rung #122
CRYO 7 TEMPERATUR =>290K CY7TMP290
B3
519
PURGE TIME MONITOR CRYO 5 120 MIN DONE PGC5
T4:25
DN
[113]
BLOWER 2 ENABLED BL2
O:027
01
[2:74]
OPEN PURGE VALVE 7 NIF7
O:043
(U)
06
O:043/06 - ┤ ├ - - File #3 CRYO_REGEN - 104
File #6 TECH_RUNGS - 16
-(L)- - File #3 CRYO_REGEN - 93
COMPRESSOR 5 REGEN- ERATION PROGRAM CYRGN5
B3
325
[46]

Rung #123

```
              PURGE TIME
              MONITOR
  CRYO 8      CRYO 6
  TEMPERATUR  120 MIN     BLOWER 2                                OPEN PURGE
  =>290K      DONE        ENABLED                                 VALVE 8
  CY8TMP290   PGC6        BL2                                     NIF8
     B3        T4:26      O:027                                    O:043
+-+--| |-------| |---------| |--+-----------------------------------(U)---+
| |  520        DN          01  |                                    07
| |            [114]      [2:74]|
| |                             | O:043/07 - -| |- - File #3 CRYO_REGEN - 106
| |                             |                    File #6 TECH_RUNGS - 16
| |COMPRESSOR                   |             -(L)- - File #3 CRYO_REGEN - 94
| |6 REGEN-                     |
| |ERATION                      |
| |PROGRAM                      |
| |CYRGN6                       |
| |   B3                        |
| +---|/|-----------------------+
|     326
| [53]
```

Rung #124

```
              PURGE TIME
              MONITOR
  CRYO 9      CRYO 7
  TEMPERATUR  120 MIN     BLOWER 2                                OPEN PURGE
  =>290K      DONE        ENABLED                                 VALVE 9
  CY9TMP290   PGC7        BL2                                     NIF9
     B3        T4:27      O:027                                    O:043
+-+--| |-------| |---------| |--+-----------------------------------(U)---+
| |  521        DN          01  |                                    10
| |            [115]      [2:74]|
| |                             | O:043/10 - -| |- - File #3 CRYO_REGEN - 105
| |                             |                    File #6 TECH_RUNGS - 16
| |COMPRESSOR                   |             -(L)- - File #3 CRYO_REGEN - 95
| |7 REGEN-                     |
| |ERATION                      |
| |PROGRAM                      |
| |CYRGN7                       |
| |   B3                        |
| +---|/|-----------------------+
|     327
| [57]
```

Rung #125

```
|                PURGE TIME
|                MONITOR
| CYRO 10        CRYO 7
| TEMPERATUR     120 MIN      BLOWER 2                                          OPEN PURGE
| =>290K         DONE         ENABLED                                           VALVE 10
| CY10TMP290     PGC7         BL2                                               NIF10
|     B3         T4:27        O:027                                              O:057
|----| |---------| |----------| |-----------------------------------------------(U)----|
| |  522          DN           01     |                                            06
| |               [115]        [2:74] |
| |                                   | O:057/06 - -| |- - File #3 CRYO_REGEN - 107
| |                                   |                    File #6 TECH_RUNGS - 16
| |COMPRESSOR                         |           -(L)- - File #3 CRYO_REGEN - 96
| |7 REGEN-                           |
| |ERATION                            |
| |PROGRAM                            |
| |CYRGN7                             |
| |  B3                               |
| |--|/|------------------------------|
|    327
| [57]
```

Rung #126

```
|                PURGE TIME
|                MONITOR
| CRYO 12        CRYO 7
| TEMPERATUR     120 MIN      BLOWER 2                                          OPEN PURGE
| =>290K         DONE         ENABLED                                           VALVE 12
| CY12TMP290     PGC7         BL2                                               NIF12
|     B3         T4:27        O:027                                              O:057
|----| |---------| |----------| |-----------------------------------------------(U)----|
| |  524          DN           01     |                                            10
| |               [115]        [2:74] |
| |                                   | O:057/10 - -| |- - File #3 CRYO_REGEN - 108
| |                                   |                    File #6 TECH_RUNGS - 16
| |COMPRESSOR                         |           -(L)- - File #3 CRYO_REGEN - 97
| |7 REGEN-                           |
| |ERATION                            |
| |PROGRAM                            |
| |CYRGN7                             |
| |  B3                               |
| |--|/|------------------------------|
|    327
| [57]
```

```
Rung #127
|             PURGE TIME                                                                        |
|             MONITOR                                                                           |
|  CRYO 11    CRYO 8                                                                            |
|  TEMPERATUR 120 MIN     BLOWER 2                                              OPEN PURGE      |
|  =>290K     DONE        ENABLED                                               VALVE 11.       |
|  CY11TMP290 PGC8        BL2                                                   NIF11           |
|     B3        T4:28       O:027                                                 O:057         |
|-+---] [--------] [---------] [----+----------------------------------------------(U)---------|
| |   523        DN          01     |                                                07         |
| |           [116]       [2:74]    |                                                           |
| |                                 | O:057/07 - -] [- - File #3 CRYO_REGEN - 109               |
| |                                 |                    File #6 TECH_RUNGS - 16                |
| |COMPRESSOR                       |            -(L)- - File #3 CRYO_REGEN - 98                |
| |8 REGEN-                         |                                                           |
| |ERATION                          |                                                           |
| |PROGRAM                          |                                                           |
| |CYRGN8                           |                                                           |
| |   B3                            |                                                           |
| +---]/[---------------------------+                                                           |
|     328                                                                                       |
|  [63]                                                                                         |
Rung #128
|          PURGE TIME                                                                           |
|          MONITOR                                                                              |
|          CRYO 2       CRYO 2                                                                  |
|          120 MIN.     TEMPERATUR  BLOWER 2                                       ROUGHING     |
|PURGE 2   DONE         =>290K      ENABLED                                        AND ROR 2    |
|P2        PGC2         CY2TMP290   BL2                                            R&ROR2       |
|  B3        T4:22         B3        O:027                                            B3        |
|---] [--------] [---------] [---------] [--------------------------------------------(L)-------|
|  632        DN          514         01                                              642       |
|[135]     [110]                   [2:74]                                                       |
B3/642 - -] [- - File #3 CRYO_REGEN -  135,164,175,176,189,196,203
                 File #6 TECH_RUNGS -  17
         -(L)- - File #3 CRYO_REGEN -  128
         -(U)- - File #3 CRYO_REGEN -  210
Rung #129
|          PURGE TIME                                                                           |
|          MONITOR                                                                              |
|          CRYO 3       CRYO 3                                                                  |
|          120 MIN.     TEMPERATUR  BLOWER 2                                       ROUGHING     |
|PURGE 3   DONE         =>290K      ENABLED                                        AND ROR 3    |
|P3        PGC3         CY3TMP290   BL2                                            R&ROR3       |
|  B3        T4:23         B3        O:027                                            B3        |
|---] [--------] [---------] [---------] [--------------------------------------------(L)-------|
|  633        DN          515         01                                              643       |
|[136]     [111]                   [2:74]                                                       |
B3/643 - -] [- - File #3 CRYO_REGEN -  136,165,177,178,190,197,204
                 File #6 TECH_RUNGS -  17
         -(L)- - File #3 CRYO_REGEN -  129
         -(U)- - File #3 CRYO_REGEN -  211
Rung #130
|          PURGE TIME                                                                           |
|          MONITOR                                                                              |
|          CRYO 4       CRYO 5                                                                  |
|          120 MIN      TEMPERATUR  BLOWER 2                                       ROUGHING     |
|PURGE 4   DONE         =>290K      ENABLED                                        AND ROR 4    |
|P4        PGC4         CY5TMP290   BL2                                            R&ROR4       |
|  B3        T4:24         B3        O:027                                            B3        |
|---] [--------] [---------] [---------] [--------------------------------------------(L)-------|
|  634        DN          517         01                                              644       |
|[137]     [112]                   [2:74]                                                       |
```

```
B3/644 - -] [- - File #3 CRYO_REGEN -  137,166,179,180,191,198,205
                 File #6 TECH_RUNGS -  17
        -(L)- - File #3 CRYO_REGEN -  130
        -(U)- - File #3 CRYO_REGEN -  212
Rung #131
|        PURGE TIME
|        MONITOR
|        CRYO 5     CRYO 4      CRYO 6      CRYO 7
|        120 MIN    TEMPERATUR  TEMPERATUR  TEMPERATUR  BLOWER 2                        ROUGHING
|PURGE 5 DONE       =>290K      =>290K      =>290K      ENABLED                         AND ROR 5
|P5      PGC5       CY4TMP290   CY6TMP290   CY7TMP290   BL2                             R&ROR5
|  B3      T4:25       B3          B3          B3       O:027                             B3
|--] [-----] [--------] [---------] [---------] [--------] [-------------------------------(L)--|
|  635      DN         516         518         519        01                              645
|[138]    [113]                                         [2:74]
B3/645 - -] [- - File #3 CRYO_REGEN -  138,167,168,169,181,182,192,199,206
                 File #6 TECH_RUNGS -  17
        -(L)- - File #3 CRYO_REGEN -  131
        -(U)- - File #3 CRYO_REGEN -  213
Rung #132
|        PURGE TIME
|        MONITOR
|        CRYO 6     CRYO 8
|        120 MIN    TEMPERATUR  BLOWER 2                                                ROUGHING
|PURGE 6 DONE       =>290K      ENABLED                                                 AND ROR 6
|P6      PGC6       CY8THP290   BL2                                                     R&ROR6
|  B3      T4:26       B3       O:027                                                     B3
|--] [-----] [--------] [--------] [-----------------------------------------------------(L)--|
|  636      DN         520        01                                                      646
|[139]    [114]                 [2:74]
B3/646 - -] [- - File #3 CRYO_REGEN -  139,170,183,184,193,200,207
                 File #6 TECH_RUNGS -  17
        -(L)- - File #3 CRYO_REGEN -  132
        -(U)- - File #3 CRYO_REGEN -  214
Rung #133
|        PURGE TIME
|        MONITOR
|        CRYO 7     CRYO 9      CYRO 10     CRYO 12
|        120 MIN    TEMPERATUR  TEMPERATUR  TEMPERATUR  BLOWER 2                        ROUGHING
|PURGE 7 DONE       =>290K      =>290K      =>290K      ENABLED                         AND ROR 7
|P7      PGC7       CY9TMP290   CY10TMP290  CY12TMP290  BL2                             R&ROR7
|  B3      T4:27       B3          B3          B3       O:027                             B3
|--] [-----] [--------] [---------] [---------] [--------] [-------------------------------(L)--|
|  637      DN         521         522         524        01                              647
|[140]    [115]                                         [2:74]
B3/647 - -] [- - File #3 CRYO_REGEN -  140,171,172,173,185,186,194,201,208
                 File #6 TECH_RUNGS -  17
        -(L)- - File #3 CRYO_REGEN -  133
        -(U)- - File #3 CRYO_REGEN -  215
Rung #134
|        PURGE TIME
|        MONITOR
|        CRYO 8     CRYO 11
|        120 MIN    TEMPERATUR  BLOWER 2                                                ROUGHING
|PURGE 8 DONE       =>290K      ENABLED                                                 AND ROR 8
|P8      PGC8       CY11TMP290  BL2                                                     R&ROR8
|  B3      T4:28       B3       O:027                                                     B3
|--] [-----] [--------] [--------] [-----------------------------------------------------(L)--|
|  638      DN         523        01                                                      648
|[141]    [116]                 [2:74]
B3/648 - -] [- - File #3 CRYO_REGEN -  141,174,187,188,195,202,209
                 File #6 TECH_RUNGS -  17
```

```
     -(L)- - File #3 CRYO_REGEN -  134
     -(U)- - File #3 CRYO_REGEN -  216                   - 513 -
Rung #135
|                      CRYO 2                                                          |
|  ROUGHING  BLOWER 2  TEMPERATUR                                                      |
|  AND ROR 2 ENABLED   =>290K                                              PURGE 2     |
|  R&ROR2    BL2       CY2TMP290                                           P2          |
|     B3      O:027      B3                                                   B3       |
|----| |------| |-------| |---+--------------------------------------------------(U)----|
| |  642       01        514  |                                                 632    |
| |[128]      [2:74]          |                                                        |
| |                           | B3/632 - -| |- - File #3 CRYO_REGEN - 88, 110, 128      |
| |                           |                 File #6 TECH_RUNGS - 15                |
| |COMPRESSOR                 |         -(L)- - File #3 CRYO_REGEN - 74                |
| |2 REGEN-                   |                                                        |
| |ERATION                    |                                                        |
| |PROGRAM                    |                                                        |
| |CYRGN2                     |                                                        |
| |    B3                     |                                                        |
| +---|/|---------------------+                                                        |
|    322                                                                               |
|  [34]                                                                                |
Rung #136
|                      CRYO 3                                                          |
|  ROUGHING  BLOWER 2  TEMPERATUR                                                      |
|  AND ROR 3 ENABLED   =>290K                                              PURGE 3     |
|  R&ROR3    BL2       CY3TMP290                                           P3          |
|     B3      O:027      B3                                                   B3       |
|----| |------| |-------| |---+--------------------------------------------------(U)----|
| |  643       01        515  |                                                 633    |
| |[129]      [2:74]          |                                                        |
| |                           | B3/633 - -| |- - File #3 CRYO_REGEN - 89, 111, 129      |
| |                           |                 File #6 TECH_RUNGS - 15                |
| |COMPRESSOR                 |         -(L)- - File #3 CRYO_REGEN - 75                |
| |3 REGEN-                   |                                                        |
| |ERATION                    |                                                        |
| |PROGRAM                    |                                                        |
| |CYRGN3                     |                                                        |
| |    B3                     |                                                        |
| +---|/|---------------------+                                                        |
|    323                                                                               |
|  [38]                                                                                |
Rung #137
|                      CRYO 5                                                          |
|  ROUGHING  BLOWER 2  TEMPERATUR                                                      |
|  AND ROR 4 ENABLED   =>290K                                              PURGE 4     |
|  R&ROR4    BL2       CY5TMP290                                           P4          |
|     B3      O:027      B3                                                   B3       |
|----| |------| |-------| |---+--------------------------------------------------(U)----|
| |  644       01        517  |                                                 634    |
| |[130]      [2:74]          |                                                        |
| |                           | B3/634 - -| |- - File #3 CRYO_REGEN - 90, 112, 130      |
| |                           |                 File #6 TECH_RUNGS - 15                |
| |COMPRESSOR                 |         -(L)- - File #3 CRYO_REGEN - 76                |
| |4 REGEN-                   |                                                        |
| |ERATION                    |                                                        |
| |PROGRAM                    |                                                        |
| |CYRGN4                     |                                                        |
| |    B3                     |                                                        |
| +---|/|---------------------+                                                        |
|    324                                                                               |
|  [42]                                                                                |
```

```
Rung #138                                                    - 514 -
                          CRYO 4      CRYO 6      CRYO 7
  ROUGHING    BLOWER 2   TEMPERATUR  TEMPERATUR  TEMPERATUR
  AND ROR 5   ENABLED    =>290K      =>290K      =>290K                                          PURGE 5
  R&ROR5      BL2        CY4TMP290   CY6TMP290   CY7TMP290                                       P5
    B3        O:027        B3          B3          B3                                              B3
|-+--] [------] [---------] [---------] [---------] [---+-------------------------------------------(U)--|
| |  645       01          516         518         519  |                                         635
| |[131]     [2:74]                                     |
| |                                                     | B3/635 - ] [ - File #3 CRYO_REGEN - 91, 92, 93, 113, 131
| |                                                     |            File #6 TECH_RUNGS - 15
| |COMPRESSOR                                           |      -(L)- - File #3 CRYO_REGEN - 77
| |5 REGEN-                                             |
| |ERATION                                              |
| |PROGRAM                                              |
| |CYRGN5                                               |
| |   B3                                                |
| +--]/[------------------------------------------------+
|     325
|   [46]
Rung #139
                          CRYO 8
  ROUGHING    BLOWER 2   TEMPERATUR
  AND ROR 6   ENABLED    =>290K                                                                  PURGE 6
  R&ROR6      BL2        CY8TMP290                                                               P6
    B3        O:027        B3                                                                      B3
|-+--] [------] [---------] [---+-----------------------------------------------------------------(U)--|
| |  646       01          520  |                                                                 636
| |[132]     [2:74]             |
| |                             | B3/636 - ] [ - File #3 CRYO_REGEN - 94, 114, 132
| |                             |            File #6 TECH_RUNGS - 15
| |COMPRESSOR                   |      -(L)- - File #3 CRYO_REGEN - 78
| |6 REGEN-                     |
| |ERATION                      |
| |PROGRAM                      |
| |CYRGN6                       |
| |   B3                        |
| +--]/[------------------------+
|     326
|   [53]
Rung #140
                          CRYO 9      CYRO 10     CRYO 12
  ROUGHING    BLOWER 2   TEMPERATUR  TEMPERATUR  TEMPERATUR
  AND ROR 7   ENABLED    =>290K      =>290K      =>290K                                          PURGE 7
  R&ROR7      BL2        CY9TMP290   CY10TMP290  CY12TMP290                                      P7
    B3        O:027        B3          B3          B3                                              B3
|-+--] [------] [---------] [---------] [---------] [---+-------------------------------------------(U)--|
| |  647       01          521         522         524  |                                         637
| |[133]     [2:74]                                     |
| |                                                     | B3/637 - ] [ - File #3 CRYO_REGEN - 95, 96, 97, 115, 133
| |                                                     |            File #6 TECH_RUNGS - 15
| |COMPRESSOR                                           |      -(L)- - File #3 CRYO_REGEN - 79
| |7 REGEN-                                             |
| |ERATION                                              |
| |PROGRAM                                              |
| |CYRGN7                                               |
| |   B3                                                |
| +--]/[------------------------------------------------+
|     327
|   [57]
```

```
Rung #141
|                                CRYO 11
| ROUGHING     BLOWER 2   TEMPERATUR            - 515 -
| AND ROR 8    ENABLED    =>290K                                                            PURGE 8
| R&ROR8       BL2        CY11TMP290                                                        PB
|     B3         O:027      B3                                                                B3
|---+--] [--------] [--------] [---+--------------------------------------------------------(U)---|
| |   648          01         523  |                                                          638
| |[134]        [2:74]             |
| |                                | B3/638 - -] [- - File #3 CRYO_REGEN - 98, 116, 134
| |                                |                  File #6 TECH_RUNGS - 15
| |COMPRESSOR                      |            -(L)- - File #3 CRYO_REGEN - 80
| |8 REGEN-                        |
| |ERATION                         |
| |PROGRAM                         |
| |CYRGN8                          |
| |    B3                          |
| +---]/[--------------------------+
|    328
|  [63]
Rung #142
|MANUAL
|CONTROL
|CRYO ROUGH                                                                  MANUAL CRYO
|VALVE 2                                                                     ROUGH 2
|OPEN                                                                        OPEN
|M-CR2-1                                                                     MCR2OP
|   N7:12                                                                       N7:33
|---] [------------------------------------------------------------------+-------(L)-------+-|
|    10                                                                  |        10       |
|[2:3]                                                                   |                 |
| N7:33/10 - -] [- - File #3 CRYO_REGEN - 164                            |MANUAL CRYO      |
|            -(U)- - File #3 CRYO_REGEN - 143                            |ROUGH 2          |
| _F:N7:21%21 - BTW - File #2 MAIN_PRGRM - 2                             |CLOSE            |
| N7:28/10 - -(L)- - File #3 CRYO_REGEN - 143                            |MCR2CL           |
| _F:N7:21%21 - BTW - File #2 MAIN_PRGRM - 2                             |   N7:28         |
|                                                                        +-------(U)-------+
                                                                                  10
Rung #143
| MANUAL
| CONTROL
| CLOSE CRYO                                                                 MANUAL CRYO
| ROUGH                                                                      ROUGH 2
| VALVE 2                                                                    OPEN
| M-CR2-O                                                                    MCR2OP
|    N7:7                                                                       N7:33
|---+--] [---------------------+-----------------------------------------+-------(U)-------+-|
| |    10                      |                                         |        10       |
| |[2:3]                       |                                         |                 |
| |                            | N7:33/10 - -] [- - File #3 CRYO_REGEN - 164               |
| |                            |             -(L)- - File #3 CRYO_REGEN - 142 |MANUAL CRYO |
| |COMPRESSOR                  | _F:N7:21%21 - BTW - File #2 MAIN_PRGRM - 2   |ROUGH 2     |
| |2 REGEN-     CRYO 2         | N7:28/10 - -(U)- - File #3 CRYO_REGEN - 142  |CLOSE       |
| |ERATION      TEMPERATUR     | _F:N7:21%21 - BTW - File #2 MAIN_PRGRM - 2   |MCR2CL      |
| |PROGRAM      =<20K          |                                         |   N7:28         |
| |CYRGN2       CY2TMP20       |                                         +-------(L)-------+
| |    B3           B3         |                                                  10
| +---]/[---------] [----------+
|    322         502
|  [238]
```

```
Rung #144
|MANUAL
|CONTROL
|CRYO ROUGH                                                        MANUAL CRYO
|VALVE 3                                                           ROUGH 3
|OPEN                                                              OPEN
|M-CR3-1                                                           MCR3OP
|  N7:12                                                              N7:33
|---] [-----------------------------------------------------------+---(L)---+
|    11                                                           |    11    |
|[2:3]                                                            |          |
| N7:33/11 - -] [- - File #3 CRYO_REGEN - 165                     |MANUAL CRYO
|           -(U)- - File #3 CRYO_REGEN - 145                      |ROUGH 3   |
| _F:N7:21(X21 - BTW - File #2 MAIN_PRGRM - 2                     |CLOSE     |
| N7:28/11 - -(L)- - File #3 CRYO_REGEN - 145                     |MCR3CL    |
| _F:N7:21(X21 - BTW - File #2 MAIN_PRGRM - 2                     |  N7:28   |
|                                                                 +---(U)----+
|                                                                      11
Rung #145
| MANUAL
| CONTROL
| CLOSE CRYO                                                       MANUAL CRYO
| ROUGH                                                            ROUGH 3
| VALVE 3                                                          OPEN
| M-CR3-O                                                          MCR3OP
|     N7:7                                                            N7:33
|-+---] [-----------+---------------------------------------------+---(U)---+
| |    11           |                                             |    11    |
| |[2:3]            |                                             |          |
| |                 | N7:33/11 - -] [- - File #3 CRYO_REGEN - 165 |          |
| |                 |           -(L)- - File #3 CRYO_REGEN - 144  |MANUAL CRYO
| |COMPRESSOR       | _F:N7:21(X21 - BTW - File #2 MAIN_PRGRM - 2 |ROUGH 3   |
| |3 REGEN-  CRYO 3 | N7:28/11 - -(U)- - File #3 CRYO_REGEN - 144 |CLOSE     |
| |ERATION TEMPERATUR| _F:N7:21(X21 - BTW - File #2 MAIN_PRGRM - 2|MCR3CL    |
| |PROGRAM   =<20K  |                                             |  N7:28   |
| |CYRGN3  CY3TMP20 |                                             +---(L)----+
| |  B3       B3    |                                                  11
| +--]/[------] [---+
|   323      503
| [239]
Rung #146
|MANUAL
|CONTROL
|CRYO ROUGH                                                        MANUAL CRYO
|VALVE 4                                                           ROUGH 4
|OPEN                                                              OPEN
|M-CR4-1                                                           MCR4OP
|  N7:12                                                              N7:33
|---] [-----------------------------------------------------------+---(L)---+
|    12                                                           |    12    |
|[2:3]                                                            |          |
| N7:33/12 - -] [- - File #3 CRYO_REGEN - 167                     |MANUAL CRYO
|           -(U)- - File #3 CRYO_REGEN - 147                      |ROUGH 4   |
| _F:N7:21(X21 - BTW - File #2 MAIN_PRGRM - 2                     |CLOSE     |
| N7:28/12 - -(L)- - File #3 CRYO_REGEN - 147                     |MCR4CL    |
| _F:N7:21(X21 - BTW - File #2 MAIN_PRGRM - 2                     |  N7:28   |
|                                                                 +---(U)----+
|                                                                      12
```

- 517 -

```
Rung #147
| MANUAL
| CONTROL                                                              MANUAL CRYO
| CLOSE CRYO                                                           ROUGH 4
| ROUGH                                                                OPEN
| VALVE 4                                                              MCR4OP
| M-CR4-O                                                                 N7:33
|     N7:7
|----| |----+-----------------------------------------------------+--------(U)-------+
|     12    |                                                     |        12        |
| [2:3]     |                                                     |                  |
|           | N7:33/12 - -| |- - File #3 CRYO_REGEN - 167        |                  |
|           |            -(L)- - File #3 CRYO_REGEN - 146         |MANUAL CRYO       |
|COMPRESSOR | _F:N7:21l%21 - BTW - File #2 MAIN_PRGRM - 2         |ROUGH 4           |
|5 REGEN-      CRYO 4  | N7:28/12 - -(U)- - File #3 CRYO_REGEN - 146 |CLOSE        |
|ERATION       TEMPERATUR | _F:N7:21l%21 - BTW - File #2 MAIN_PRGRM - 2 |MCR4CL    |
|PROGRAM       =<20K    |                                       |   N7:28          |
|CYRGN5        CY4TMP20 |                                       +--------(L)-------+
|  B3           B3      |                                                12
+--|/|----------| |-----+
   325          504
 [241]

Rung #148
|MANUAL
|CONTROL                                                               MANUAL CRYO
|CRYO ROUGH                                                            ROUGH 5
|5 OPEN                                                                OPEN
|M-CR5-1                                                               MCR5OP
|  N7:12                                                                  N7:33
|----| |---------------------------------------------------------+--------(L)-------+
     13                                                          |        13        |
|[2:3]                                                           |                  |
| N7:33/13 - -| |- - File #3 CRYO_REGEN - 166                    |MANUAL CRYO       |
|           -(U)- - File #3 CRYO_REGEN - 149                     |ROUGH 5           |
| _F:N7:21l%21 - BTW - File #2 MAIN_PRGRM - 2                    |CLOSE             |
| N7:28/13 - -(L)- - File #3 CRYO_REGEN - 149                    |MCR5CL            |
| _F:N7:21l%21 - BTW - File #2 MAIN_PRGRM - 2                    |   N7:28          |
|                                                                +--------(U)-------+
|                                                                         13

Rung #149
| MANUAL
| CONTROL                                                              MANUAL CRYO
| CLOSE CRYO                                                           ROUGH 5
| ROUGH                                                                OPEN
| VALVE 5                                                              MCR5OP
| M-CR5-O                                                                 N7:33
|     N7:7
|----| |----+-----------------------------------------------------+--------(U)-------+
|     13    |                                                     |        13        |
| [2:3]     |                                                     |                  |
|           | N7:33/13 - -| |- - File #3 CRYO_REGEN - 166        |                  |
|           |            -(L)- - File #3 CRYO_REGEN - 148         |MANUAL CRYO       |
|COMPRESSOR | _F:N7:21l%21 - BTW - File #2 MAIN_PRGRM - 2         |ROUGH 5           |
|4 REGEN-      CRYO 5  | N7:28/13 - -(U)- - File #3 CRYO_REGEN - 148 |CLOSE        |
|ERATION       TEMPERATUR | _F:N7:21l%21 - BTW - File #2 MAIN_PRGRM - 2 |MCR5CL    |
|PROGRAM       =<20K    |                                       |   N7:28          |
|CYRGN4        CY5TMP20 |                                       +--------(L)-------+
|  B3           B3      |                                                13
+--|/|----------| |-----+
   324          505
 [240]
```

```
Rung #150
|MANUAL
|CONTROL
|CRYO ROUGH                                              MANUAL CRYO
|VALVE 6                                                 ROUGH 6
|OPEN                                                    OPEN
|M-CR6-1                                                 MCR6OP
|  N7:12                                                   N7:33
|---] [----------------------------------------------------+--(L)--+-|
|   14                                                     |   14  |
|[2:3]                                                     |       |
| N7:33/14 - ] [ - File #3 CRYO_REGEN - 168                |MANUAL CRYO
|            -(U)- - File #3 CRYO_REGEN - 151              |ROUGH 6
| _F:N7:21(%21 - BTW - File #2 MAIN_PRGRM - 2              |CLOSE
| N7:28/14 - -(L)- - File #3 CRYO_REGEN - 151              |MCR6CL
| _F:N7:21(%21 - BTW - File #2 MAIN_PRGRM - 2              |  N7:28
|                                                          +--(U)--+
|                                                              14

Rung #151
| MANUAL
| CONTROL
| CLOSE CRYO                                             MANUAL CRYO
| ROUGH                                                  ROUGH 6
| VALVE 6                                                OPEN
| M-CR6-O                                                MCR6OP
|    N7:7                                                  N7:33
|-+--] [--------------+------------------------------------+--(U)--+-|
| |  14               |                                    |   14  |
| |[2:3]              |                                    |       |
| |                   | N7:33/14 - ] [ - File #3 CRYO_REGEN - 168
| |                   |            -(L)- - File #3 CRYO_REGEN - 150
| |COMPRESSOR         | _F:N7:21(%21 - BTW - File #2 MAIN_PRGRM - 2   |MANUAL CRYO
| |5 REGEN-    CRYO 6 | N7:28/14 - -(U)- - File #3 CRYO_REGEN - 150   |ROUGH 6
| |ERATION TEMPERATUR | _F:N7:21(%21 - BTW - File #2 MAIN_PRGRM - 2   |CLOSE
| |PROGRAM     =<20K  |                                    |MCR6CL
| |CYRGN5    CY6TMP20 |                                    |  N7:28
| |   B3          B3  |                                    +--(L)--+
| +--]/[--------] [---+                                        14
|   325         506
| [241]

Rung #152
|MANUAL
|CONTROL
|CRYO ROUGH                                              MANUAL CRYO
|VALVE 7                                                 ROUGH 7
|OPEN                                                    OPEN
|M-CR7-1                                                 MCR7OP
|  N7:12                                                   N7:33
|---] [----------------------------------------------------+--(L)--+-|
|   15                                                     |   15  |
|[2:3]                                                     |       |
| N7:33/15 - ] [ - File #3 CRYO_REGEN - 169                |MANUAL CRYO
|            -(U)- - File #3 CRYO_REGEN - 153              |ROUGH 7
| _F:N7:21(%21 - BTW - File #2 MAIN_PRGRM - 2              |CLOSE
| N7:28/15 - -(L)- - File #3 CRYO_REGEN - 153              |MCR7CL
| _F:N7:21(%21 - BTW - File #2 MAIN_PRGRM - 2              |  N7:28
|                                                          +--(U)--+
|                                                              15
```

Rung #153

```
MANUAL                                                          MANUAL CRYO
CONTROL                                                         ROUGH 7
CLOSE CRYO                                                      OPEN
ROUGH                                                           MCR7OP
VALVE 7                                                         N7:33
M-CR7-O                                                         -(U)-
N7:7                                                            15
-| |-
15
[2:3]
              N7:33/15 - -| |- - File #3 CRYO_REGEN - 169
                         -(L)- - File #3 CRYO_REGEN - 152       MANUAL CRYO
COMPRESSOR    _F:N7:21[X21 - BTW - File #2 MAIN_PRGRM - 2       ROUGH 7
5 REGEN-    CRYO 7      N7:28/15 - -(U)- - File #3 CRYO_REGEN - 152   CLOSE
ERATION     TEMPERATUR  _F:N7:21[X21 - BTW - File #2 MAIN_PRGRM - 2   MCR7CL
PROGRAM     =<20K                                               N7:28
CYRGN5      CY7TMP20                                            -(L)-
B3          B3                                                  15
-|/|--------| |-
325         507
[241]
```

Rung #154

```
MANUAL                                                          MANUAL CRYO
CONTROL                                                         ROUGH 8
CRYO ROUGH                                                      OPEN
VALVE 8                                                         MCR8OP
OPEN                                                            N7:34
M-CR8-1                                                         -(L)-
N7:13                                                           0
-| |-
0
[2:3]                                                           MANUAL CRYO
N7:34/0 - -| |- - File #3 CRYO_REGEN - 170                      ROUGH 8
          -(U)- - File #3 CRYO_REGEN - 155                      CLOSE
_F:N7:21[X21 - BTW - File #2 MAIN_PRGRM - 2                     MCR8CL
N7:29/0 - -(L)- - File #3 CRYO_REGEN - 155                      N7:29
_F:N7:21[X21 - BTW - File #2 MAIN_PRGRM - 2                     -(U)-
                                                                0
```

Rung #155

```
MANUAL                                                          MANUAL CRYO
CONTROL                                                         ROUGH 8
CLOSE CRYO                                                      OPEN
ROUGH                                                           MCR8OP
VALVE 8                                                         N7:34
M-CR8-O                                                         -(U)-
N7:8                                                            0
-| |-
0
[2:3]
              N7:34/0 - -| |- - File #3 CRYO_REGEN - 170
                        -(L)- - File #3 CRYO_REGEN - 154        MANUAL CRYO
COMPRESSOR    _F:N7:21[X21 - BTW - File #2 MAIN_PRGRM - 2       ROUGH 8
6 REGEN-    CRYO 8      N7:29/0 - -(U)- - File #3 CRYO_REGEN - 154   CLOSE
ERATION     TEMPERATUR  _F:N7:21[X21 - BTW - File #2 MAIN_PRGRM - 2  MCR8CL
PROGRAM     =<20K                                               N7:29
CYRGN6      CY8TMP20                                            -(L)-
B3          B3                                                  0
-|/|--------| |-
326         508
[242]
```

Rung #156

```
MANUAL
CONTROL
CRYO ROUGH
VALVE 9
OPEN                                                    MANUAL CRYO
M-CR9-1                                                 ROUGH 9
   N7:13                                                OPEN
---] [----------------------------------------------    MCR9OP
    1                                                     N7:34
[2:3]                                                   --(L)--
 N7:34/1 - ] [ - - File #3 CRYO_REGEN - 171                  1
           -(U)- - File #3 CRYO_REGEN - 157
 _F:N7:21[%21 - BTW - File #2 MAIN_PRGRM - 2
 N7:29/1 - -(L)- - File #3 CRYO_REGEN - 157
 _F:N7:21[%21 - BTW - File #2 MAIN_PRGRM - 2            N7:29
                                                        --(U)--
                                                            1
```

Rung #157

```
MANUAL
CONTROL
CLOSE CRYO
ROUGH                                                   MANUAL CRYO
VALVE 9                                                 ROUGH 9
M-CR9-O                                                 OPEN
    N7:8                                                MCR9OP
---] [----------------------------------------------      N7:34
     1                                                  --(U)--
 [2:3]                                                      1
                N7:34/1 - ] [ - - File #3 CRYO_REGEN - 171
                          -(L)- - File #3 CRYO_REGEN - 156
 COMPRESSOR     _F:N7:21[%21 - BTW - File #2 MAIN_PRGRM - 2
 7 REGEN-    CRYO 9       N7:29/1 - -(U)- - File #3 CRYO_REGEN - 156
 ERATION     TEMPERATUR   _F:N7:21[%21 - BTW - File #2 MAIN_PRGRM - 2
 PROGRAM     =<20K
 CYRGN7      CY9TMP20                                   N7:29
   B3          B3                                       --(L)--
 --]/[---------] [--                                        1
   327         509
[243]
```

Rung #158

```
MANUAL
CONTROL
CRYO ROUGE
VALVE 10                                                MANUAL CRYO
OPEN                                                    ROUGH 10
M-CR10-1                                                OPEN
   N7:13                                                MCR10OP
---] [----------------------------------------------      N7:34
    2                                                   --(L)--
[2:3]                                                       2
 N7:34/2 - ] [ - - File #3 CRYO_REGEN - 172
          -(U)- - File #3 CRYO_REGEN - 159
 _F:N7:21[%21 - BTW - File #2 MAIN_PRGRM - 2
 N7:29/2 - -(L)- - File #3 CRYO_REGEN - 159
 _F:N7:21[%21 - BTW - File #2 MAIN_PRGRM - 2            N7:29
                                                        --(U)--
                                                            2
```

Rung #159

```
| MANUAL
| CONTROL
| CLOSE CRYO
| ROUGH                                                                    MANUAL CRYO
| VALVE 10                                                                 ROUGH 10
| M-CR10-O                                                                 OPEN
|    N7:8                                                                  MCR10OP
|---] [--------------------------------------------------------------------N7:34
| |   2         |                                                       |--(U)----|
| [2:3]         |                                                       |   2     |
| |             | N7:34/2 - ] [ - - File #3 CRYO_REGEN - 172            |         |
| |             |           -(L)- - File #3 CRYO_REGEN - 158            |         |
| |COMPRESSOR   | _F:N7:21(X21 - BTW - File #2 MAIN_PRGRM - 2           |         |
| |7 REGEN-    CRYO 10   | N7:29/2 - -(U)- - File #3 CRYO_REGEN - 158   |         |
| |ERATION     TEMPERATUR| _F:N7:21(X21 - BTW - File #2 MAIN_PRGRM - 2  |         |
| |PROGRAM     =<20K     |                                              |         |
| |CYRGN7      CY10TMP20 |                                              | N7:29   |
| |   B3          B3     |                                              |--(L)----|
| |---]/[--------] [-----|                                              |   2
|    327          510
|  [243]
```

Rung #160

```
|MANUAL
|CONTROL
|CRYO 11                                                                   MANUAL CRYO
|OPEN                                                                      ROUGH 11
|M-CR11-1                                                                  OPEN
| N7:13                                                                    MCR11OP
|---] [--------------------------------------------------------------------N7:34
|   3                                                                   |--(L)----|
|[2:3]                                                                  |   3     |
| N7:34/3 - ] [ - - File #3 CRYO_REGEN - 174                            |         |
|           -(U)- - File #3 CRYO_REGEN - 161                            |         |
| _F:N7:21(X21 - BTW - File #2 MAIN_PRGRM - 2                           |         |
| N7:29/3 - -(L)- - File #3 CRYO_REGEN - 161                            |         |
| _F:N7:21(X21 - BTW - File #2 MAIN_PRGRM - 2                           | N7:29   |
|                                                                       |--(U)----|
|                                                                           3
```

Rung #161

```
| MANUAL
| CONTROL
| CLOSE CRYO
| ROUGH                                                                    MANUAL CRYO
| VALVE 11                                                                 ROUGH 11
| M-CR11-O                                                                 OPEN
|    N7:8                                                                  MCR11OP
|---] [--------------------------------------------------------------------N7:34
| |   3         |                                                       |--(U)----|
| [2:3]         |                                                       |   3     |
| |             | N7:34/3 - ] [ - - File #3 CRYO_REGEN - 174            |         |
| |             |           -(L)- - File #3 CRYO_REGEN - 160            |         |
| |COMPRESSOR   | _F:N7:21(X21 - BTW - File #2 MAIN_PRGRM - 2           |         |
| |8 REGEN-    CRYO 11   | N7:29/3 - -(U)- - File #3 CRYO_REGEN - 160   |         |
| |ERATION     TEMPERATUR| _F:N7:21(X21 - BTW - File #2 MAIN_PRGRM - 2  |         |
| |PROGRAM     =<20K     |                                              |         |
| |CYRGN8      CY11TMP20 |                                              | N7:29   |
| |   B3          B3     |                                              |--(L)----|
| |---]/[--------] [-----|                                              |   3
|    328          511
|  [244]
```

```
Rung #162
|MANUAL
|CONTROL
|CRYO ROUGH                                                    MANUAL CRYO
|VALVE 12                                                      ROUGH 12
|OPEN                                                          OPEN
|M-CR12-1                                                      MCR12OP
|   N7:13                                                        N7:34
|---] [-----------------------------------------------------+----(L)----+-
|    4                                                      |     4     |
|[2:3]                                                      |           |
| N7:34/4 - -] [- - File #3 CRYO_REGEN - 173                |           |
|          -(U)- - File #3 CRYO_REGEN - 163                 |           |
| _F:N7:21[X21 - BTW - File #2 MAIN_PRGRM - 2               |           |
| N7:29/4 - -(L)- - File #3 CRYO_REGEN - 163                |           |
| _F:N7:21[X21 - BTW - File #2 MAIN_PRGRM - 2               | N7:29     |
|                                                           +--(U)------+
|                                                              4
Rung #163
|  MANUAL
|  CONTROL
|  CLOSE CRYO                                                  MANUAL CRYO
|  ROUGH                                                       ROUGH 12
|  VALVE 12                                                    OPEN
|  M-RV12-O                                                    MCR12OP
|     N7:8                                                       N7:34
|-+----] [-----------+-------------------------------------+----(U)----+-
| |     4            |                                     |     4     |
| |[2:3]             |                                     |           |
| |                  | N7:34/4 - -] [- - File #3 CRYO_REGEN - 173      |
| |                  |          -(L)- - File #3 CRYO_REGEN - 162       |
| |COMPRESSOR        | _F:N7:21[X21 - BTW - File #2 MAIN_PRGRM - 2     |
| |7 REGEN-   CRYO 12 | N7:29/4 - -(U)- - File #3 CRYO_REGEN - 162     |
| |ERATION  TEMPERATUR | _F:N7:21[X21 - BTW - File #2 MAIN_PRGRM - 2   |
| |PROGRAM    =<20K  |                                     |           |
| |CYRGN7    CY12TMP20 |                                    | N7:29     |
| |   B3         B3   |                                     +--(L)------+
| +---]/[-------] [---+                                         4
|    327        512
|  [243]
```

Rung #164
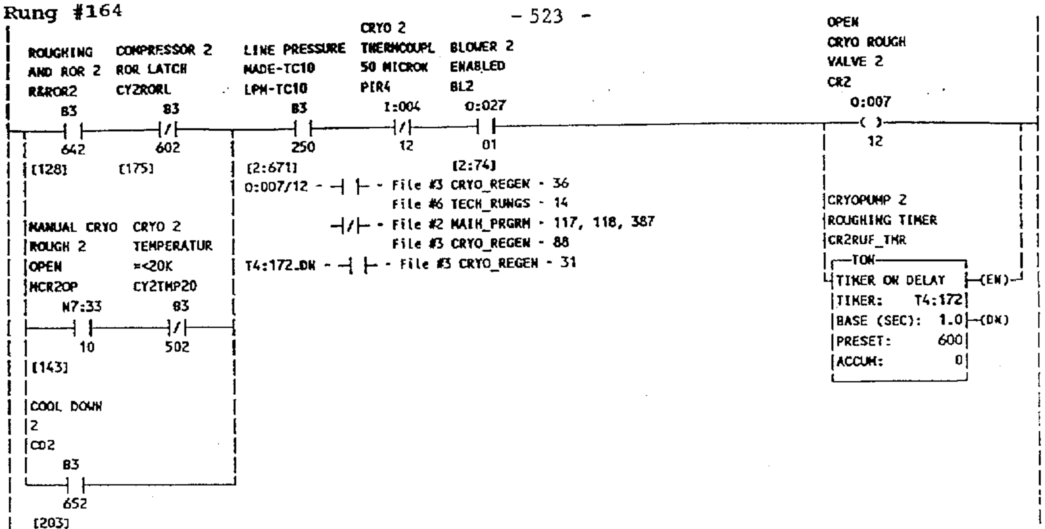
Rung #165
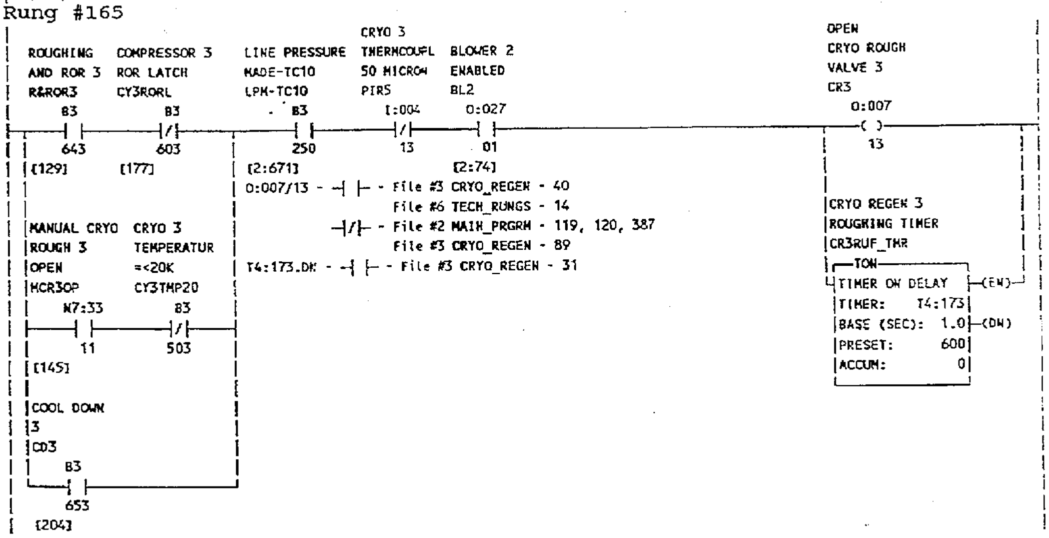

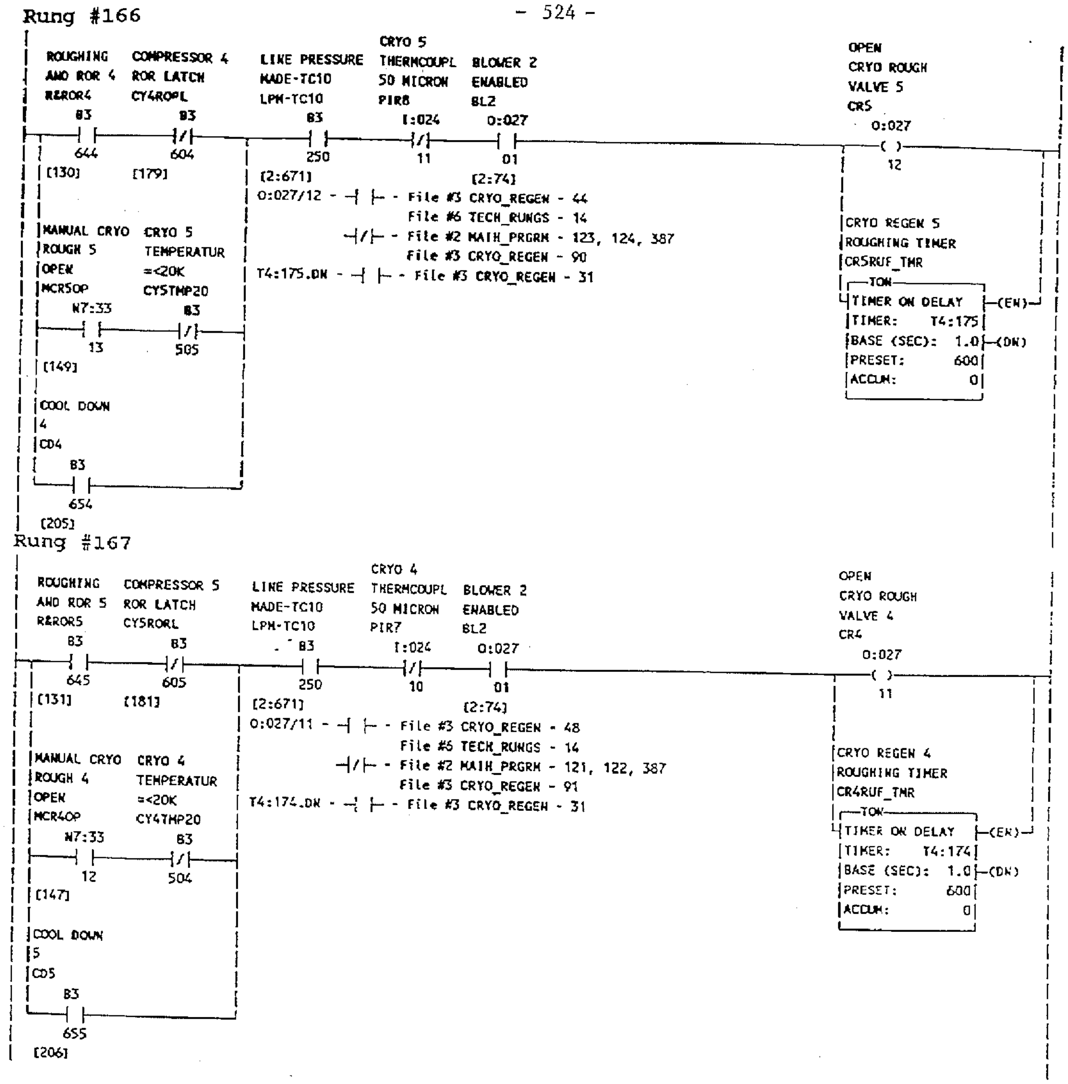
Rung #166
ROUGHING AND ROR 4 R&ROR4
B3 644 [130]
COMPRESSOR 4 ROR LATCH CY4ROPL
B3 604 [179]
LINE PRESSURE MADE-TC10 LPM-TC10
B3 250 [2:67]
CRYO 5 THERMCOUPL 50 MICRON PIR8
I:024 11
BLOWER 2 ENABLED BL2
O:027 01 [2:74]
OPEN CRYO ROUGH VALVE 5 CR5
O:027 12
O:027/12 - -| |- - File #3 CRYO_REGEN - 44
File #6 TECH_RUNGS - 14
-|/|- - File #2 MAIN_PRGRM - 123, 124, 387
File #3 CRYO_REGEN - 90
T4:175.DN - -| |- - File #3 CRYO_REGEN - 31
MANUAL CRYO ROUGH 5 OPEN MCR5OP
N7:33 13 [149]
CRYO 5 TEMPERATUR =<20K CY5TMP20
B3 505
COOL DOWN 4 CD4
B3 654 [205]
CRYO REGEN 5 ROUGHING TIMER CR5RUF_TMR
TON
TIMER ON DELAY (EN)
TIMER: T4:175
BASE (SEC): 1.0 (DN)
PRESET: 600
ACCUM: 0
Rung #167
ROUGHING AND ROR 5 R&ROR5
B3 645 [131]
COMPRESSOR 5 ROR LATCH CY5RORL
B3 605 [181]
LINE PRESSURE MADE-TC10 LPM-TC10
B3 250 [2:67]
CRYO 4 THERMCOUPL 50 MICRON PIR7
I:024 10
BLOWER 2 ENABLED BL2
O:027 01 [2:74]
OPEN CRYO ROUGH VALVE 4 CR4
O:027 11
O:027/11 - -| |- - File #3 CRYO_REGEN - 48
File #6 TECH_RUNGS - 14
-|/|- - File #2 MAIN_PRGRM - 121, 122, 387
File #3 CRYO_REGEN - 91
T4:174.DN - -| |- - File #3 CRYO_REGEN - 31
MANUAL CRYO ROUGH 4 OPEN MCR4OP
N7:33 12 [147]
CRYO 4 TEMPERATUR =<20K CY4TMP20
B3 504
COOL DOWN 5 CD5
B3 655 [206]
CRYO REGEN 4 ROUGHING TIMER CR4RUF_TMR
TON
TIMER ON DELAY (EN)
TIMER: T4:174
BASE (SEC): 1.0 (DN)
PRESET: 600
ACCUM: 0

Rung #168
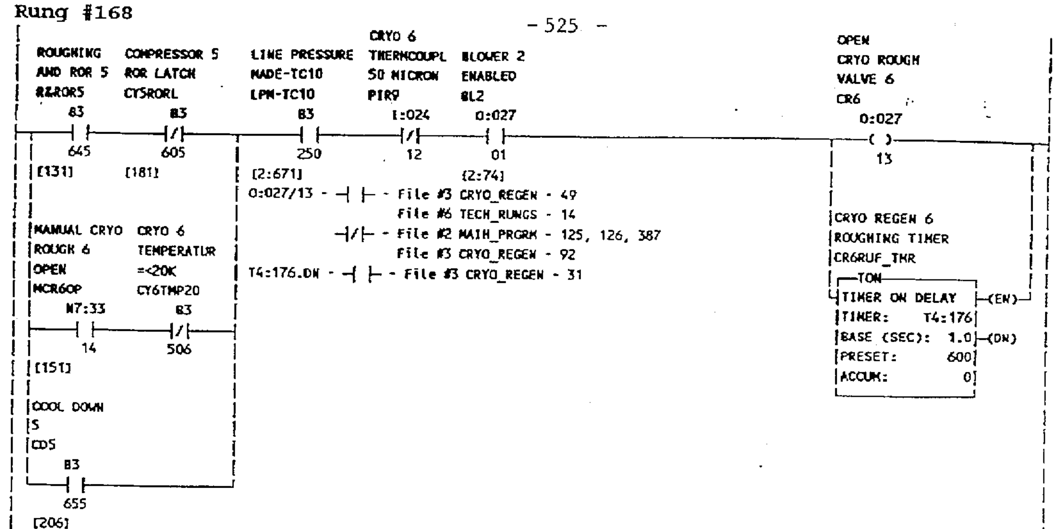
Rung #169
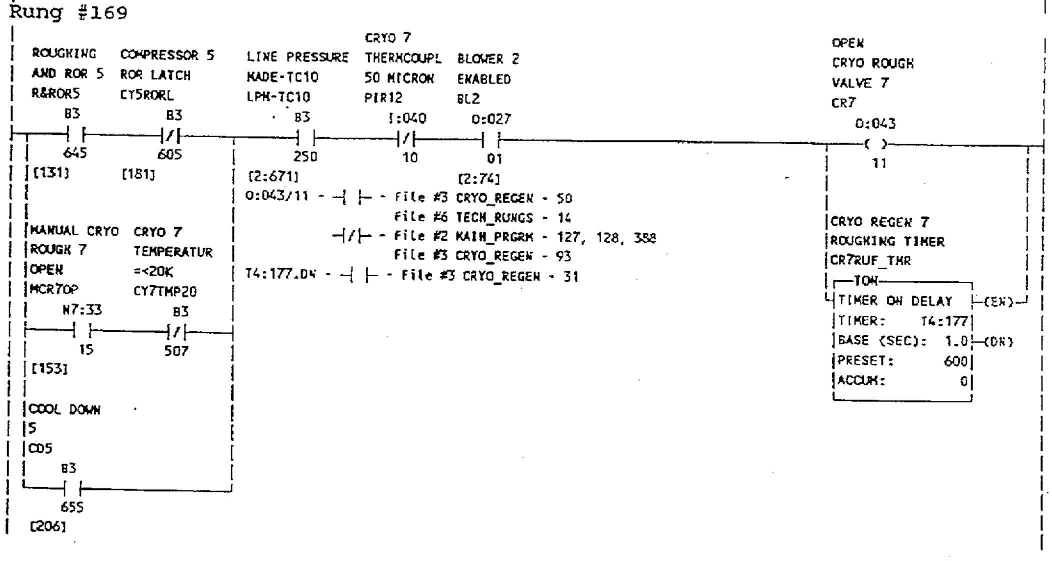

```
Rung #170
                                               CRYO 8                               OPEN
ROUGHING    COMPRESSOR 6   LINE PRESSURE  THERMCOUPL  BLOWER 2                      CRYO ROUGH
AND ROR 6   ROR LATCH      MADE-TC10      50 MICRON   ENABLED                       VALVE 8
R&ROR6      CY6RORL        LPM-TC10       PIR13       BL2                           CR8
   B3          B3             B3          I:040       0:027                           0:043
---] [--------]/[--------+----] [----------]/[--------] [--------------------------+----( )----
   646         606       |    250          11          01                        |     12
[132]       [183]        | [2:67]]                   [2:74]                      |
                         | 0:043/12 - ] [ - File #3 CRYO_REGEN - 55              |
                         |              File #6 TECH_RUNGS - 14                  |CRYO REGEN 8
MANUAL CRYO  CRYO 8      |          ]/[ - File #2 MAIN_PRGRM - 129, 130, 388     |ROUGHING TIMER
ROUGH 8      TEMPERATUR  |              File #3 CRYO_REGEN - 94                  |CR8RUF_TMR
OPEN         =<20K       | T4:178.DN - ] [ - File #3 CRYO_REGEN - 31             |+-TON-----------+
MCR8OP       CY8TMP20    |                                                       +|TIMER ON DELAY |-(EN)-
   N7:34        B3       |                                                        |TIMER:   T4:178|
---] [--------]/[--------+                                                        |BASE (SEC): 1.0|-(DN)
   0            508      |                                                        |PRESET:     600|
[155]                    |                                                        |ACCUM:        0|
                         |                                                        +---------------+
COOL DOWN                |
6                        |
CD6                      |
   B3                    |
---] [-------------------+
   656
[207]

Rung #171
                                               CRYO 9                               OPEN
ROUGHING    COMPRESSOR 7   LINE PRESSURE  THERMCOUPL  BLOWER 2                      CRYO ROUGH
AND ROR 7   ROR LATCH      MADE-TC10      50 MICRON   ENABLED                       VALVE 9
R&ROR7      CY7RORL        LPM-TC10       PIR14       BL2                           CR9
   B3          B3             B3          I:040       0:027                           0:043
---] [--------]/[--------+----] [----------]/[--------] [--------------------------+----( )----
   647         607       |    250          12          01                        |     13
[133]       [185]        | [2:67]]                   [2:74]                      |
                         | 0:043/13 - ] [ - File #3 CRYO_REGEN - 59              |
                         |              File #6 TECK_RUNGS - 14                  |CRYO REGEN 9
MANUAL CRYO  CRYO 9      |          ]/[ - File #2 MAIN_PRGRM - 131, 132, 388     |ROUGHING TIMER
ROUGH 9      TEMPERATUR  |              File #3 CRYO_REGEN - 95                  |CR9RUF_TMR
OPEN         =<20K       | T4:179.DN - ] [ - File #3 CRYO_REGEN - 31             |+-TON-----------+
MCR9OP       CY9TMP20    |                                                       +|TIMER ON DELAY |-(EN)-
   N7:34        B3       |                                                        |TIMER:   T4:179|
---] [--------]/[--------+                                                        |BASE (SEC): 1.0|-(DN)
   1            509      |                                                        |PRESET:     600|
[157]                    |                                                        |ACCUM:        0|
                         |                                                        +---------------+
COOL DOWN                |
7                        |
CD7                      |
   B3                    |
---] [-------------------+
   657
[208]
```

Rung #172
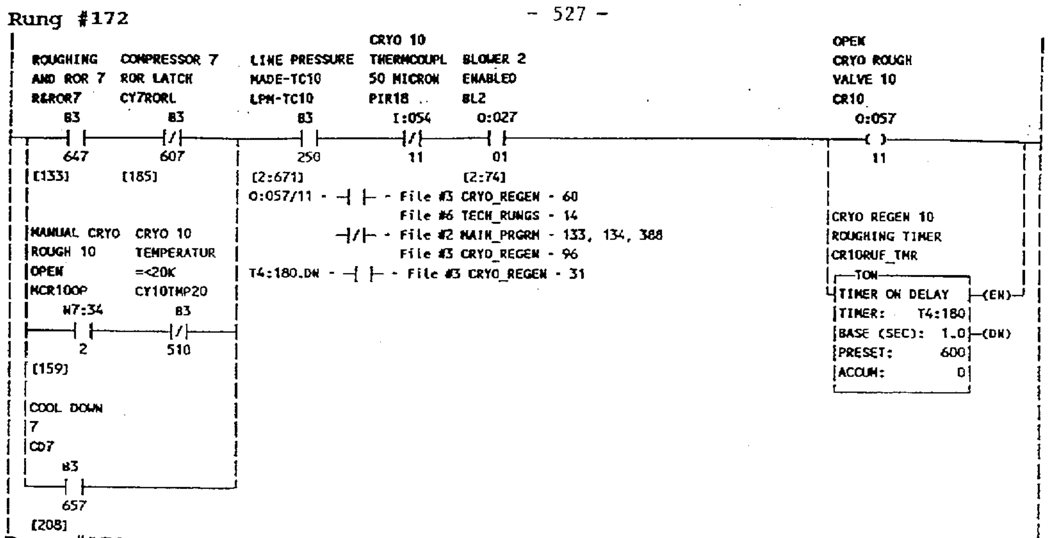
Rung #173
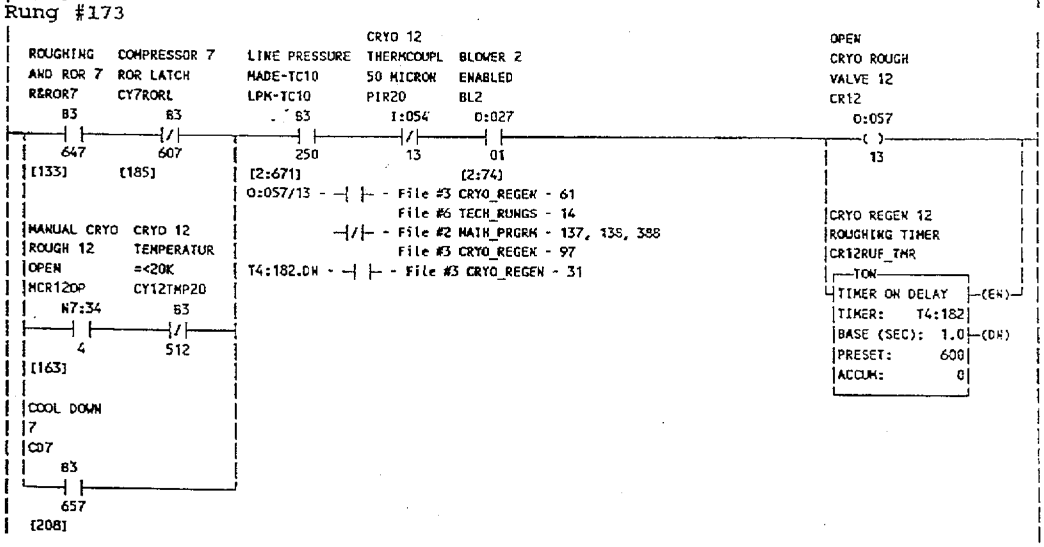

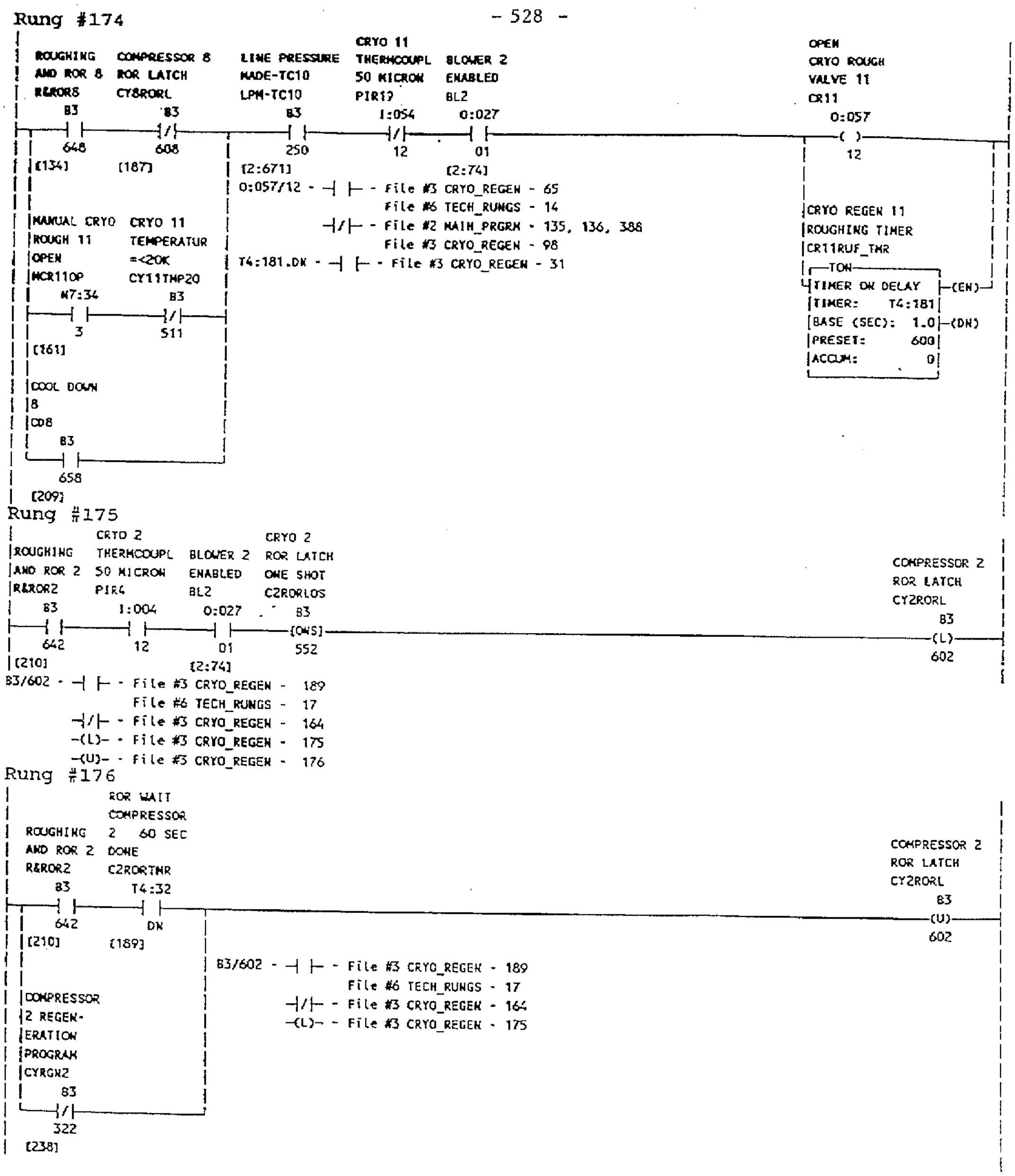
Rung #174
ROUGHING AND ROR 8 R&ROR8
B3 648 [134]
COMPRESSOR 8 ROR LATCH CY8RORL
B3 608 [187]
LINE PRESSURE MADE-TC10 LPM-TC10
B3 250 [2:671]
CRYO 11 THERMCOUPL 50 MICRON PIR17
I:054 12
BLOWER 2 ENABLED BL2
O:027 01 [2:74]
O:057/12 - -| |- - File #3 CRYO_REGEN - 65
File #6 TECH_RUNGS - 14
-|/|- - File #2 MAIN_PRGRM - 135, 136, 388
File #3 CRYO_REGEN - 98
T4:181.DN - -| |- - File #3 CRYO_REGEN - 31
MANUAL CRYO ROUGH 11 OPEN MCR11OP
N7:34 3 [161]
CRYO 11 TEMPERATUR =<20K CY11TMP20
B3 511
COOL DOWN 8 CD8
B3 658 [209]
OPEN CRYO ROUGH VALVE 11 CR11
O:057 12
CRYO REGEN 11 ROUGHING TIMER CR11RUF_TMR
TON
TIMER ON DELAY (EN)
TIMER: T4:181
BASE (SEC): 1.0 (DN)
PRESET: 600
ACCUM: 0
Rung #175
ROUGHING AND ROR 2 R&ROR2
B3 642 [210]
CRYO 2 THERMCOUPL 50 MICRON PIR4
I:004 12
BLOWER 2 ENABLED BL2
O:027 01 [2:74]
CRYO 2 ROR LATCH ONE SHOT C2RORLOS
B3 [ONS] 552
COMPRESSOR 2 ROR LATCH CY2RORL
B3 (L) 602
B3/602 - -| |- - File #3 CRYO_REGEN - 189
File #6 TECH_RUNGS - 17
-|/|- - File #3 CRYO_REGEN - 164
-(L)- - File #3 CRYO_REGEN - 175
-(U)- - File #3 CRYO_REGEN - 176
Rung #176
ROUGHING AND ROR 2 R&ROR2
B3 642 [210]
ROR WAIT COMPRESSOR 2 60 SEC DONE C2RORTMR
T4:32 DN [189]
COMPRESSOR 2 REGEN-ERATION PROGRAM CYRGN2
B3 322 [238]
COMPRESSOR 2 ROR LATCH CY2RORL
B3 (U) 602
B3/602 - -| |- - File #3 CRYO_REGEN - 189
File #6 TECH_RUNGS - 17
-|/|- - File #3 CRYO_REGEN - 164
-(L)- - File #3 CRYO_REGEN - 175

```
Rung #177
[             CRYO 3                        CRYO 3
|ROUGHING     THERMCOUPL   BLOWER 2        ROR LATCH                                              COMPRESSOR 3 |
|AND ROR 3    50 MICRON    ENABLED         ONE SHOT                                               ROR LATCH    |
|R&ROR3       PIR5         BL2             C3RORLOS                                               CY3RORL      |
|   B3        I:004        O:027           B3                                                        B3        |
|---] [--------] [----------] [-----------[ONS]-------------------------------------------------------(L)-------|
|   643         13          01             553                                                       603       |
|[211]                     [2:74]
B3/603 - ] [ - File #3 CRYO_REGEN -  190
               File #6 TECH_RUNGS -  17
         ]/[ - File #3 CRYO_REGEN -  165
         -(L)- - File #3 CRYO_REGEN -  177
         -(U)- - File #3 CRYO_REGEN -  178
Rung #178
|                ROR WAIT
|                COMPRESSOR
| ROUGHING       3   60 SEC                                                                    COMPRESSOR 3 |
| AND ROR 3      DONE                                                                          ROR LATCH    |
| R&ROR3         C3RORTMR                                                                      CY3RORL      |
|    B3          T4:33                                                                            B3        |
|-+--] [---------] [--+-----------------------------------------------------------------------------(U)-------|
| |  643           DN |                                                                             603       |
| |[211]        [190] |
| |                   | B3/603 - ] [ - File #3 CRYO_REGEN - 190
| |                   |                File #6 TECH_RUNGS - 17
| |COMPRESSOR         |          ]/[ - File #3 CRYO_REGEN - 165
| |3 REGEN-           |          -(L)- - File #3 CRYO_REGEN - 177
| |ERATION            |
| |PROGRAM            |
| |CYRGN3             |
| |   B3              |
| +--]/[--------------+
|   323
|  [239]
Rung #179
|             CRYO 5                        CRYO 4
|ROUGHING     THERMCOUPL   BLOWER 2        ROR LATCH                                              COMPRESSOR 4 |
|AND ROR 4    50 MICRON    ENABLED         ONE SHOT                                               ROR LATCH    |
|R&ROR4       PIR8         BL2             C4RORLOS                                               CY4RORL      |
|   B3        I:024        O:027           B3                                                        B3        |
|---] [--------] [----------] [-----------[ONS]-------------------------------------------------------(L)-------|
|   644         11          01             554                                                       604       |
|[212]                     [2:74]
B3/604 - ] [ - File #3 CRYO_REGEN -  191
               File #6 TECH_RUNGS -  17
         ]/[ - File #3 CRYO_REGEN -  166
         -(L)- - File #3 CRYO_REGEN -  179
         -(U)- - File #3 CRYO_REGEN -  180
```

Rung #180

```
              ROR WAIT
              COMPRESSOR
 ROUGHING     4   60 SEC                                           COMPRESSOR 4
 AND ROR 4    DONE                                                 ROR LATCH
 R&ROR4       C4RORTMR                                             CY4RORL
   B3           T4:34                                                 B3
|--] [--------] [----------------------------------------------------(U)---|
   644          DN                                                    604
 [212]        [191]
                        B3/604 - ] [ - File #3 CRYO_REGEN - 191
                                       File #6 TECH_RUNGS - 17
 COMPRESSOR                    ]/[ - File #3 CRYO_REGEN - 166
 4 REGEN-                      -(L)- - File #3 CRYO_REGEN - 179
 ERATION
 PROGRAM
 CYRGN4
   B3
 --]/[--
   324
 [240]
```

Rung #181

```
          CRYO 4      CRYO 6      CRYO 7                 CRYO 5
ROUGHING  THERMCOUPL  THERMCOUPL  THERMCOUPL  BLOWER 2   ROR LATCH            COMPRESSOR 5
AND ROR 5 50 MICRON   50 MICRON   50 MICRON   ENABLED    ONE SHOT             ROR LATCH
R&ROR5    PIR7        PIR9        PIR12       BL2        C5RORLOS             CY5RORL
  B3      I:024       I:024       I:040       O:027      B3                      B3
|--] [------] [---------] [---------] [--------] [-------[ONS]------------------(L)----|
  645       10          12          10          01        555                    605
[213]                                         [2:74]
B3/605 - ] [ - File #3 CRYO_REGEN -  192
               File #6 TECH_RUNGS -  17
        ]/[ - File #3 CRYO_REGEN -  167,168,169
        -(L)- - File #3 CRYO_REGEN -  181
        -(U)- - File #3 CRYO_REGEN -  182
```

Rung #182

```
              ROR WAIT
              COMPRESSOR
 ROUGHING     5   60 SEC                                           COMPRESSOR 5
 AND ROR 5    DONE                                                 ROR LATCH
 R&ROR5       C5RORTHR                                             CY5RORL
   B3           T4:35                                                 B3
|--] [--------] [----------------------------------------------------(U)---|
   645          DN                                                    605
 [213]        [192]
                        B3/605 - ] [ - File #3 CRYO_REGEN - 192
                                       File #5 TECH_RUNGS - 17
 COMPRESSOR                    ]/[ - File #3 CRYO_REGEN - 167, 168, 169
 5 REGEN-                      -(L)- - File #3 CRYO_REGEN - 181
 ERATION
 PROGRAM
 CYRGN5
   B3
 --]/[--
   325
 [241]
```

```
Rung #183
|           CRYO 8                       CRYO 6
|ROUGHING   THERMCOUPL  BLOWER 2   ROR LATCH                                  COMPRESSOR 6 |
|AND ROR 6  50 MICRON   ENABLED    ONE SHOT                                   ROR LATCH    |
|R&ROR6     PIR13       BL2        C6RORLOS                                   CY6RORL      |
|   B3        I:040      O:027       B3                                          B3        |
|---] [--------] [--------] [--------[ONS]-----------------------------------------(L)-----|
|   646        11          01        556                                          606       |
|[214]                   [2:74]
B3/606 - ] [ - File #3 CRYO_REGEN -  193
               File #6 TECH_RUNGS -  17
       ]/[ - File #3 CRYO_REGEN -  170
       (L) - File #3 CRYO_REGEN -  183
       (U) - File #3 CRYO_REGEN -  184
Rung #184
|           ROR WAIT
|           COMPRESSOR
|  ROUGHING 6   60 SEC                                                                 |
|  AND ROR 6  DONE                                                        COMPRESSOR 6 |
|  R&ROR6     C6RORTMR                                                    ROR LATCH    |
|    B3          T4:36                                                    CY6RORL      |
|--+--] [--------] [--+----------------------------------------------------------B3    |
|  |  646         DN   |                                                  ----(U)------|
|  |[214]       [193]  |                                                       606     |
|  |                   | B3/606 - ] [ - File #3 CRYO_REGEN - 193
|  |                   |                File #6 TECH_RUNGS - 17
|  |COMPRESSOR         |         ]/[ - File #3 CRYO_REGEN - 170
|  |6 REGEN-           |         (L) - File #3 CRYO_REGEN - 183
|  |ERATION            |
|  |PROGRAM            |
|  |CYRGN6             |
|  |    B3             |
|  +---]/[-------------+
|      326
|  [242]
Rung #185
|         CRYO 10     CRYO 9      CRYO 12                CRYO 7
|ROUGHING THERMCOUPL  THERMCOUPL  THERMCOUPL  BLOWER 2   ROR LATCH                  COMPRESSOR 7 |
|AND ROR 7 50 MICRON  50 MICRON   50 MICRON   ENABLED    ONE SHOT                   ROR LATCH    |
|R&ROR7   PIR18       PIR14       PIR20       BL2        C7RORLOS                   CY7RORL      |
|   B3      I:054       I:040       I:054      O:027       B3                          B3        |
|---] [------] [--------] [---------] [---------] [--------[ONS]---------------------(L)---------|
|   647       11          12          13          01        557                        607       |
|[215]                                        [2:74]
B3/607 - ] [ - File #3 CRYO_REGEN -  194
               File #6 TECH_RUNGS -  17
       ]/[ - File #3 CRYO_REGEN -  171,172,173
       (L) - File #3 CRYO_REGEN -  185
       (U) - File #3 CRYO_REGEN -  186
```

Rung #186

```
|               ROR WAIT
|               COMPRESSOR
| ROUGHING      7   60 SEC                                              COMPRESSOR 7
| AND ROR 7     DONE                                                    ROR LATCH
| R&ROR7        C7RORTMR                                                CY7RORL
|    B3            T4:37                                                   B3
|---] [---------] [----+------------------------------------------------(U)----|
|    647            DN |                                                   607
| [215]          [194] |
|                      | B3/607 - ] [ - File #3 CRYO_REGEN - 194
|                      |                File #6 TECH_RUNGS - 17
| COMPRESSOR           |          ]/[ - File #3 CRYO_REGEN - 171, 172, 173
| 7 REGEN-             |          (L) - File #3 CRYO_REGEN - 185
| ERATION              |
| PROGRAM              |
| CYRGN7               |
|    B3                |
|---]/[----------------+
|    327
| [243]
```

Rung #187

```
|            CRYO 11               CRYO 8
| ROUGHING   THERMCOUPL  BLOWER 2  ROR LATCH                            COMPRESSOR 8
| AND ROR 8  50 MICRON   ENABLED   ONE SHOT                             ROR LATCH
| R&ROR8     PIR19       BL2       C8RORLOS                             CY8RORL
|    B3        I:054      O:027       B3                                   B3
|---] [--------] [--------] [--------[ONS]------------------------------(L)----|
|    648         12         01        558                                  608
| [216]                  [2:74]
B3/608 - ] [ - File #3 CRYO_REGEN - 195
               File #6 TECH_RUNGS - 17
         ]/[ - File #3 CRYO_REGEN - 174
         (L) - File #3 CRYO_REGEN - 187
         (U) - File #3 CRYO_REGEN - 188
```

Rung #188

```
|               ROR WAIT
|               COMPRESSOR
| ROUGHING      8   60 SEC                                              COMPRESSOR 8
| AND ROR 8     DONE                                                    ROR LATCH
| R&ROR8        C8RORTMR                                                CY8RORL
|    B3            T4:38                                                   B3
|---] [---------] [----+------------------------------------------------(U)----|
|    648            DN |                                                   608
| [216]          [195] |
|                      | B3/608 - ] [ - File #3 CRYO_REGEN - 195
|                      |                File #6 TECH_RUNGS - 17
| COMPRESSOR           |          ]/[ - File #3 CRYO_REGEN - 174
| 8 REGEN-             |          (L) - File #3 CRYO_REGEN - 187
| ERATION              |
| PROGRAM              |
| CYRGN8               |
|    B3                |
|---]/[----------------+
|    328
| [244]
```

```
Rung #189
|
|ROUGHING   COMPRESSOR 2                                                         ROR WAIT
|AND ROR 2  ROR LATCH                                                           COMPRESSOR
|R&ROR2     CY2RORL                                                             2   60 SEC
|   B3          B3                                                              C2RORTMR
|                                                                               +-TON-----------+
|---] [---------] [-------------------------------------------------------------|TIMER ON DELAY |-(EN)-
|   642         602                                                             |TIMER:   T4:32 |
|[210]     [176]                                                                |BASE (SEC): 1.0|-(DN)
|                                                                               |PRESET:     30 |
|                                                                               |ACCUM:       0 |
|                                                                               +---------------+
T4:32.DN - ] [ - File #3 CRYO_REGEN -  176,196,203
T4:32.TT - ] [ - File #6 TECH_RUNGS -  18
Rung #190
|
|ROUGHING   COMPRESSOR 3                                                          ROR WAIT
|AND ROR 3  ROR LATCH                                                           COMPRESSOR
|R&ROR3     CY3RORL                                                             3   60 SEC
|   B3          B3                                                              C3RORTMR
|                                                                               +-TON-----------+
|---] [---------] [-------------------------------------------------------------|TIMER ON DELAY |-(EN)-
|   643         603                                                             |TIMER:   T4:33 |
|[211]     [178]                                                                |BASE (SEC): 1.0|-(DN)
|                                                                               |PRESET:     30 |
|                                                                               |ACCUM:       0 |
|                                                                               +---------------+
T4:33.DN - ] [ - File #3 CRYO_REGEN -  178,197,204
T4:33.TT - ] [ - File #6 TECH_RUNGS -  18
Rung #191
|
|ROUGHING   COMPRESSOR 4                                                          ROR WAIT
|AND ROR 4  ROR LATCH                                                           COMPRESSOR
|R&ROR4     CY4RORL                                                             4   60 SEC
|   B3          B3                                                              C4RORTMR
|                                                                               +-TON-----------+
|---] [---------] [-------------------------------------------------------------|TIMER ON DELAY |-(EN)-
|   644         604                                                             |TIMER:   T4:34 |
|[212]     [180]                                                                |BASE (SEC): 1.0|-(DN)
|                                                                               |PRESET:     30 |
|                                                                               |ACCUM:       0 |
|                                                                               +---------------+
T4:34.DN - ] [ - File #3 CRYO_REGEN -  180,198,205
T4:34.TT - ] [ - File #6 TECH_RUNGS -  18
Rung #192
|
|ROUGHING   COMPRESSOR 5                                                          ROR WAIT
|AND ROR 5  ROR LATCH                                                           COMPRESSOR
|R&ROR5     CY5RORL                                                             5   60 SEC
|   B3          B3                                                              C5RORTMR
|                                                                               +-TON-----------+
|---] [---------] [-------------------------------------------------------------|TIMER ON DELAY |-(EN)-
|   645         605                                                             |TIMER:   T4:35 |
|[213]     [182]                                                                |BASE (SEC): 1.0|-(DN)
|                                                                               |PRESET:     30 |
|                                                                               |ACCUM:       0 |
|                                                                               +---------------+
T4:35.DN - ] [ - File #3 CRYO_REGEN -  182,199,206
T4:35.TT - ] [ - File #6 TECH_RUNGS -  18
```

Rung #193

```
|                                                                        ROR WAIT
|ROUGHING    COMPRESSOR 6                                                COMPRESSOR
|AND ROR 6   ROR LATCH                                                   6   60 SEC
|R&ROR6      CY6RORL                                                     C6RORTMR
|   B3           B3                                                      +-TON-------------+
|---] [----------] [----------------------------------------------------+TIMER ON DELAY    +-(EN)-
|   646          606                                                     |TIMER:      T4:36|
|[214]        [184]                                                      |BASE (SEC):   1.0+-(DN)
|                                                                        |PRESET:        30|
|                                                                        |ACCUM:          0|
|                                                                        +-----------------+
T4:36.DN - ] [ - File #3 CRYO_REGEN -  184,200,207
T4:36.TT - ] [ - File #6 TECH_RUNGS -  18
```

Rung #194

```
|                                                                        ROR WAIT
|ROUGHING    COMPRESSOR 7                                                COMPRESSOR
|AND ROR 7   ROR LATCH                                                   7   60 SEC
|R&ROR7      CY7RORL                                                     C7RORTMR
|   B3           B3                                                      +-TON-------------+
|---] [----------] [----------------------------------------------------+TIMER ON DELAY    +-(EN)-
|   647          607                                                     |TIMER:      T4:37|
|[215]        [186]                                                      |BASE (SEC):   1.0+-(DN)
|                                                                        |PRESET:        30|
|                                                                        |ACCUM:          0|
|                                                                        +-----------------+
T4:37.DN - ] [ - File #3 CRYO_REGEN -  186,201,208
T4:37.TT - ] [ - File #6 TECH_RUNGS -  18
```

Rung #195

```
|                                                                        ROR WAIT
|ROUGHING    COMPRESSOR 8                                                COMPRESSOR
|AND ROR 8   ROR LATCH                                                   8   60 SEC
|R&ROR8      CY8RORL                                                     C8RORTMR
|   B3           B3                                                      +-TON-------------+
|---] [----------] [----------------------------------------------------+TIMER ON DELAY    +-(EN)-
|   648          608                                                     |TIMER:      T4:38|
|[216]        [188]                                                      |BASE (SEC):   1.0+-(DN)
|                                                                        |PRESET:        30|
|                                                                        |ACCUM:          0|
|                                                                        +-----------------+
T4:38.DN - ] [ - File #3 CRYO_REGEN -  188,202,209
T4:38.TT - ] [ - File #6 TECH_RUNGS -  18
```

Rung #196

```
|            ROR WAIT
|            COMPRESSOR  CRYO 2                                          REROUGH
|ROUGHING    2   60 SEC  THERMCOUPL                                      COUNTER
|AND ROR 2   DONE        50 MICRON                                       COMPRESSOR
|R&ROR2      C2RORTMR    PIR4                                            2
|   B3          T4:32      I:004                                         C2RERUF
|                                                                        +-CTU-------------+
|---] [----------] [---------]/[----------------------------------------+COUNT UP         +-(CU)-
|   642          DN          12                                          |COUNTER:     C5:2|
|[210]        [189]                                                      |PRESET:        10+-(DN)
|                                                                        |ACCUM:          0|
|                                                                        +-----------------+
C5:2 - CTU - File #3 CRYO_REGEN -  196
       RES - File #3 CRYO_REGEN -  224
C5:2.DN - ] [ - File #2 MAIN_PRGRM -  623,623
```

Rung #197
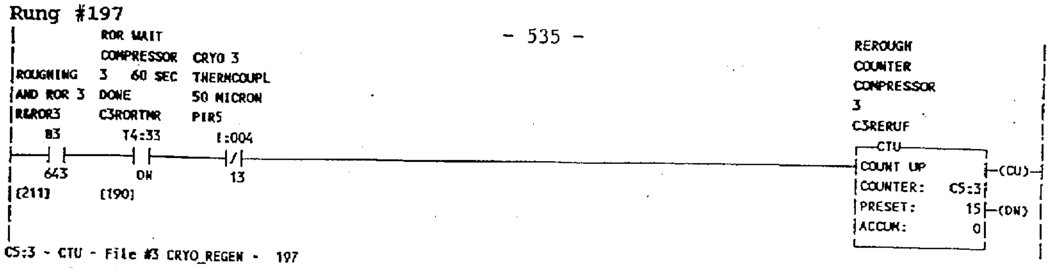
C5:3 - CTU - File #3 CRYO_REGEN - 197
RES - File #3 CRYO_REGEN - 225
C5:3.DN - ┤ ├ - File #2 MAIN_PRGRM - 623
Rung #198
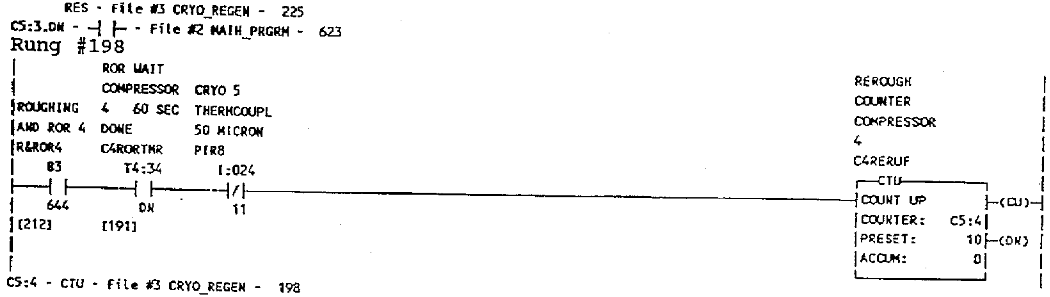
C5:4 - CTU - File #3 CRYO_REGEN - 198
RES - File #3 CRYO_REGEN - 226
C5:4.DN - ┤ ├ - File #2 MAIN_PRGRM - 623
Rung #199
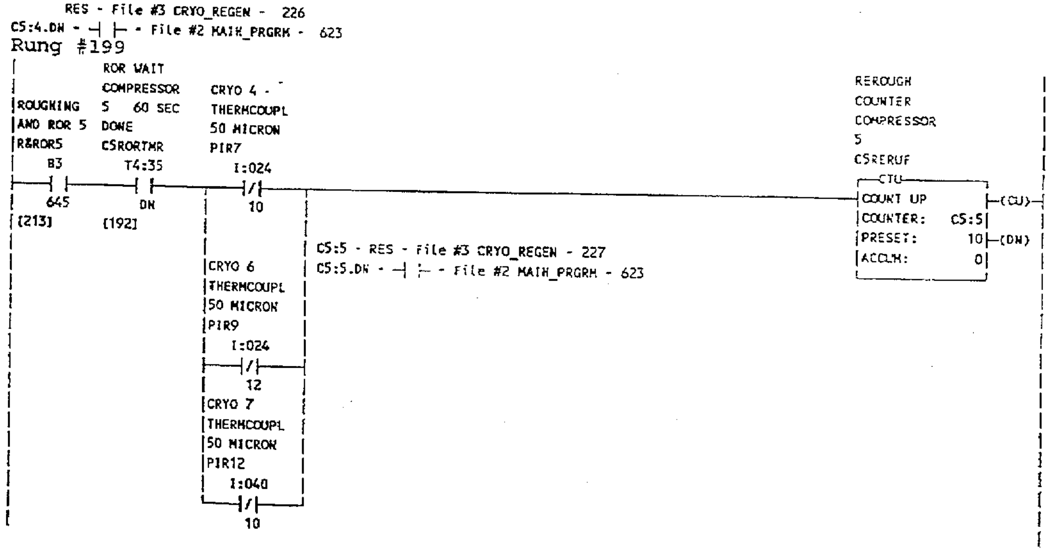

```
Rung #200
|         ROR WAIT                                                         REROUGH
|         COMPRESSOR  CRYO 8                                               COUNTER
|ROUGHING  6   60 SEC THERMCOUPL                                           COMPRESSOR
|AND ROR 6 DONE       50 MICRON                                            6
|R&ROR6    C6RORTMR   PIR13                                                C6R3RUF
|  B3       T4:36      I:040                                               +-CTU--------------+
|--] [-------] [--------]/[-----------------------------------------------+COUNT UP          +-(CU)-
|  646       DN         11                                                 |COUNTER:    C5:6|
|[214]     [193]                                                           |PRESET:       10+-(DN)
|                                                                          |ACCUM:         0|
|                                                                          +----------------+
C5:6 - CTU - File #3 CRYO_REGEN -  200
       RES - File #3 CRYO_REGEN -  228
C5:6.DN - ] [ - File #2 MAIN_PRGRM -  623
Rung #201
|         ROR WAIT                                                         REROUGH
|         COMPRESSOR  CRYO 9                                               COUNTER
|ROUGHING  7   60 SEC THERMCOUPL                                           COMPRESSOR
|AND ROR 7 DONE       50 MICRON                                            7
|R&ROR7    C7RORTMR   PIR14                                                C7RERUF
|  B3       T4:37      I:040                                               +-CTU--------------+
|--] [-------] [----+---]/[---+-------------------------------------------+COUNT UP          +-(CU)-
|  647       DN     |   12    |                                            |COUNTER:    C5:7|
|[215]     [194]    |         |                                            |PRESET:       10+-(DN)
|                   |         | C5:7 - RES - File #3 CRYO_REGEN - 229      |ACCUM:         0|
|                   |CRYO 10  | C5:7.DN - ] [ - File #2 MAIN_PRGRM - 623   +----------------+
|                   |THERMCOUPL
|                   |50 MICRON|
|                   |PIR18    |
|                   |  I:054  |
|                   +---]/[---+
|                   |   11    |
|                   |CRYO 12  |
|                   |THERMCOUPL
|                   |50 MICRON|
|                   |PIR20    |
|                   |  I:054  |
|                   +---]/[---+
|                       13
Rung #202
|         ROR WAIT                                                         REROUGH
|         COMPRESSOR  CRYO 11                                              COUNTER
|ROUGHING  8   60 SEC THERMCOUPL                                           COMPRESSOR
|AND ROR 8 DONE       50 MICRON                                            8
|R&ROR8    C8RORTMR   PIR19                                                C8RERUF
|  B3       T4:38      I:054                                               +-CTU--------------+
|--] [-------] [--------]/[-----------------------------------------------+COUNT UP          +-(CU)-
|  648       DN         12                                                 |COUNTER:    C5:8|
|[216]     [195]                                                           |PRESET:       10+-(DN)
|                                                                          |ACCUM:         0|
|                                                                          +----------------+
C5:8 - CTU - File #3 CRYO_REGEN -  202
       RES - File #3 CRYO_REGEN -  230
C5:8.DN - ] [ - File #2 MAIN_PRGRM -  623
```

Rung #203

```
|                              ROR WAIT
|              CRYO 2          COMPRESSOR  CRYO 2                                          |
|ROUGHING      THERMCOUPL      2   60 SEC  TEMPERATUR                          COOL DOWN   |
|AND ROR 2     50 MICRON       DONE        =<20K                               2           |
|R&ROR2        PIR4            C2RORTMR    CY2TMP20                            CD2         |
|  B3          I:004           T4:32       B3                                  B3          |
|--] [---------] [-------------] [----------]/[-------------------------------(L)---------|
|  642          12             DN          502                                 652         |
|[210]                         [189]                                                       |
B3/652 - ] [ - File #2 MAIN_PRGRM -  27,117,118
               File #3 CRYO_REGEN -  164,210,217,238
               File #6 TECH_RUNGS -  19
        -(L)- - File #3 CRYO_REGEN -  203
        -(U)- - File #3 CRYO_REGEN -  231
```

Rung #204

```
|                              ROR WAIT
|              CRYO 3          COMPRESSOR  CRYO 3                                          |
|ROUGHING      THERMCOUPL      3   60 SEC  TEMPERATUR                          COOL DOWN   |
|AND ROR 3     50 MICRON       DONE        =<20K                               3           |
|R&ROR3        PIR5            C3RORTMR    CY3TMP20                            CD3         |
|  B3          I:004           T4:33       B3                                  B3          |
|--] [---------] [-------------] [----------]/[-------------------------------(L)---------|
|  643          13             DN          503                                 653         |
|[211]                         [190]                                                       |
B3/653 - ] [ - File #2 MAIN_PRGRM -  28,119,120
               File #3 CRYO_REGEN -  165,211,218,239
               File #6 TECH_RUNGS -  19
        -(L)- - File #3 CRYO_REGEN -  204
        -(U)- - File #3 CRYO_REGEN -  232
```

Rung #205

```
|                              ROR WAIT
|              CRYO 5          COMPRESSOR  CRYO 5                                          |
|ROUGHING      THERMCOUPL      4   60 SEC  TEMPERATUR                          COOL DOWN   |
|AND ROR 4     50 MICRON       DONE        =<20K                               4           |
|R&ROR4        PIR8            C4RORTMR    CY5TMP20                            CD4         |
|  B3          I:024           T4:34       B3                                  B3          |
|--] [---------] [-------------] [----------]/[-------------------------------(L)---------|
|  644          11             DN          505                                 654         |
|[212]                         [191]                                                       |
B3/654 - ] [ - File #2 MAIN_PRGRM -  29,123,124
               File #3 CRYO_REGEN -  166,212,219,240
               File #6 TECH_RUNGS -  19
        -(L)- - File #3 CRYO_REGEN -  205
        -(U)- - File #3 CRYO_REGEN -  233
```

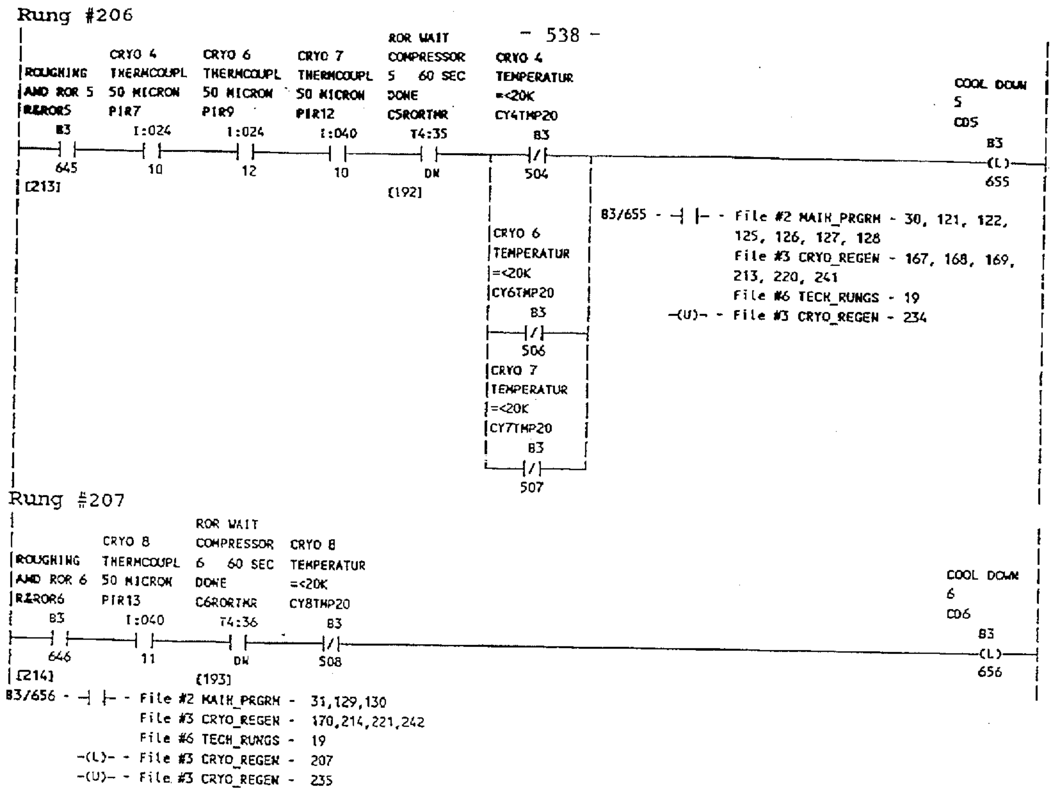
Rung #206
- 538 -
ROUGHING AND ROR 5 RERORS
B3
645
[213]
CRYO 4 THERMCOUPL 50 MICRON PIR7
I:024
10
CRYO 6 THERMCOUPL 50 MICRON PIR9
I:024
12
CRYO 7 THERMCOUPL 50 MICRON PIR12
I:040
10
ROR WAIT COMPRESSOR 5 60 SEC DONE C5RORTMR
T4:35
DN
[192]
CRYO 4 TEMPERATUR =<20K CY4TMP20
B3
504
CRYO 6 TEMPERATUR =<20K CY6TMP20
B3
506
CRYO 7 TEMPERATUR =<20K CY7TMP20
B3
507
COOL DOWN 5 CD5
B3
(L)
655
B3/655 - ┤ ├ - - File #2 MAIN_PRGRM - 30, 121, 122, 125, 126, 127, 128
File #3 CRYO_REGEN - 167, 168, 169, 213, 220, 241
File #6 TECH_RUNGS - 19
-(U)- - File #3 CRYO_REGEN - 234
Rung #207
ROUGHING AND ROR 6 R&ROR6
B3
646
[214]
CRYO 8 THERMCOUPL 50 MICRON PIR13
I:040
11
ROR WAIT COMPRESSOR 6 60 SEC DONE C6RORTMR
T4:36
DN
[193]
CRYO 8 TEMPERATUR =<20K CY8TMP20
B3
508
COOL DOWN 6 CD6
B3
(L)
656
B3/656 - ┤ ├ - - File #2 MAIN_PRGRM - 31,129,130
File #3 CRYO_REGEN - 170,214,221,242
File #6 TECH_RUNGS - 19
-(L)- - File #3 CRYO_REGEN - 207
-(U)- - File #3 CRYO_REGEN - 235

Rung #208 - 539 -

```
ROUGHING      CRYO 9       CRYO 10      CRYO 12      ROR WAIT      CRYO 9                         COOL DOWN
AND ROR 7     THERMCOUPL   THERMCOUPL   THERMCOUPL   COMPRESSOR    TEMPERATUR                     7
R&ROR7        50 MICRON    50 MICRON    50 MICRON    7   60 SEC    =<20K                          CD7
              PIR14        PIR18        PIR20        DONE          CY9TMP20
                                                     C7RORTMR
B3            I:040        I:054        I:054        T4:37         B3                             B3
-| |----------| |----------| |----------| |----------| |-------+---|/|---+-------------------------(L)-
647           12           11           13           DN        |   509  |                         657
[215]                                                [194]     |        |
                                                               | CRYO 10       B3/657 - -| |- - File #2 MAIN_PRGRM - 32, 131, 132,
                                                               | TEMPERATUR                        133, 134, 137, 138
                                                               | =<20K                             File #3 CRYO_REGEN - 171, 172, 173,
                                                               | CY10TMP20                         215, 222, 243
                                                               |   B3                              File #6 TECH_RUNGS - 19
                                                               +---|/|---+              -(U)- - File #3 CRYO_REGEN - 236
                                                               |   510   |
                                                               | CRYO 12 |
                                                               | TEMPERATUR
                                                               | =<20K   |
                                                               | CY12TMP20
                                                               |   B3    |
                                                               +---|/|---+
                                                                   512
```

Rung #209

```
ROUGHING      CRYO 11      ROR WAIT      CRYO 11                                              COOL DOWN
AND ROR 8     THERMCOUPL   COMPRESSOR    TEMPERATUR                                           8
R&ROR8        50 MICRON    8   60 SEC    =<20K                                                CD8
              PIR19        DONE          CY11TMP20
                           C8RORTMR
B3            I:054        T4:38         B3                                                   B3
-| |----------| |----------| |-----------|/|--------------------------------------------------(L)-
648           12           DN            511                                                  658
[216]                      [195]
B3/658 - -| |- - File #2 MAIN_PRGRM - 33,135,136
                 File #3 CRYO_REGEN - 174,216,223,244
                 File #6 TECH_RUNGS - 19
         -(L)- - File #3 CRYO_REGEN - 209
         -(U)- - File #3 CRYO_REGEN - 237
```

Rung #210

```
COMPRESSOR
2 REGEN-
ERATION                  COOL DOWN                                                ROUGHING
PROGRAM                  2                                                        AND ROR 2
CYRGN2        PON2       CD2                                                      R&ROR2
B3            T4:42      B3                                                       B3
-+-| |--------| |--------| |---+--------------------------------------------------(U)-
 | 322        TT         652   |                                                  642
 | [238]      [217]      [203] |
 |                             | B3/642 - -| |- - File #3 CRYO_REGEN - 135, 164, 175, 176, 189, 196, 203
 | COMPRESSOR                  |                  File #6 TECH_RUNGS - 17
 | 2 REGEN-                    |          -(L)- - File #3 CRYO_REGEN - 128
 | ERATION                     |
 | PROGRAM                     |
 | CYRGN2                      |
 |   B3                        |
 +---|/|-----------------------+
     322
 [238]
```

Rung #211

```
COMPRESSOR
3 REGEN-
ERATION                COOL DOWN                                    ROUGHING
PROGRAM                3                                            AND ROR 3
CYRGN3       PDM3      CD3                                          R&ROR3
B3           T4:43     B3                                           B3
--] [--------] [-------] [---------------------------------------------(U)--
  323        TT        653                                          643
[239]        [218]     [204]

                  B3/643 - ] [ - - File #3 CRYO_REGEN - 136, 165, 177, 178, 190, 197, 204
                                   File #6 TECH_RUNGS - 17
                           -(L)- - File #3 CRYO_REGEN - 129
COMPRESSOR
3 REGEN-
ERATION
PROGRAM
CYRGN3
B3
--]/[--
  323
[239]
```

Rung #212

```
COMPRESSOR
4 REGEN-
ERATION                COOL DOWN                                    ROUGHING
PROGRAM                4                                            AND ROR 4
CYRGN4       PDM4      CD4                                          R&ROR4
B3           T4:44     B3                                           B3
--] [--------] [-------] [---------------------------------------------(U)--
  324        TT        654                                          644
[240]        [219]     [205]

                  B3/644 - ] [ - - File #3 CRYO_REGEN - 137, 166, 179, 180, 191, 198, 205
                                   File #6 TECH_RUNGS - 17
                           -(L)- - File #3 CRYO_REGEN - 130
COMPRESSOR
4 REGEN-
ERATION
PROGRAM
CYRGN4
B3
--]/[--
  324
[240]
```

Rung #213

```
COMPRESSOR
5 REGEN-
ERATION                COOL DOWN                                    ROUGHING
PROGRAM                5                                            AND ROR 5
CYRGN5       PDM5      CD5                                          R&ROR5
B3           T4:45     B3                                           B3
--] [--------] [-------] [---------------------------------------------(U)--
  325        TT        655                                          645
[241]        [220]     [206]

                  B3/645 - ] [ - - File #3 CRYO_REGEN - 138, 167, 168, 169, 181, 182, 192, 199, 206
                                   File #6 TECH_RUNGS - 17
                           -(L)- - File #3 CRYO_REGEN - 131
COMPRESSOR
5 REGEN-
ERATION
PROGRAM
CYRGN5
B3
--]/[--
  325
[241]
```

Rung #214

```
| COMPRESSOR
| 6 REGEN-
| ERATION                   COOL DOWN
| PROGRAM                   6                                                     ROUGHING
| CYRGN6          PDM6      CD6                                                   AND ROR 6
|      B3         T4:46     B3                                                    R&ROR6
|                                                                                    B3
|-+---] [--------] [-------] [-+------------------------------------------------------(U)---|
| |    326         TT      656 |                                                     646
| | [242]        [221]   [207] |
| |                            | B3/646 - ] [ - File #3 CRYO_REGEN - 139, 170, 183, 184, 193, 200, 207
| |                            |                File #6 TECH_RUNGS - 17
| | COMPRESSOR                 |         -(L)- - File #3 CRYO_REGEN - 132
| | 6 REGEN-                   |
| | ERATION                    |
| | PROGRAM                    |
| | CYRGN6                     |
| |      B3                    |
| +-----]/[--------------------+
|       326
|  [242]
```

Rung #215

```
| COMPRESSOR
| 7 REGEN-
| ERATION                   COOL DOWN
| PROGRAM                   7                                                     ROUGHING
| CYRGN7          PDM7      CD7                                                   AND ROR 7
|      B3         T4:47     B3                                                    R&ROR7
|                                                                                    B3
|-+---] [--------] [-------] [-+------------------------------------------------------(U)---|
| |    327         TT      657 |                                                     647
| | [243]        [222]   [208] |
| |                            | B3/647 - ] [ - File #3 CRYO_REGEN - 140, 171, 172, 173, 185, 186, 194, 201, 208
| |                            |                File #6 TECH_RUNGS - 17
| | COMPRESSOR                 |         -(L)- - File #3 CRYO_REGEN - 133
| | 7 REGEN-                   |
| | ERATION                    |
| | PROGRAM                    |
| | CYRGN7                     |
| |      B3                    |
| +-----]/[--------------------+
|       327
|  [243]
```

Rung #216

```
| COMPRESSOR
| 8 REGEN-
| ERATION                   COOL DOWN
| PROGRAM                   8                                                     ROUGHING
| CYRGN8          PDM8      CD8                                                   AND ROR 8
|      B3         T4:48     B3                                                    R&ROR8
|                                                                                    B3
|-+---] [--------] [-------] [-+------------------------------------------------------(U)---|
| |    328         TT      658 |                                                     648
| | [244]        [223]   [209] |
| |                            | B3/648 - ] [ - File #3 CRYO_REGEN - 141, 174, 187, 185, 195, 202, 209
| |                            |                File #6 TECH_RUNGS - 17
| | COMPRESSOR                 |         -(L)- - File #3 CRYO_REGEN - 134
| | 8 REGEN-                   |
| | ERATION                    |
| | PROGRAM                    |
| | CYRGN8                     |
| |      B3                    |
| +-----]/[--------------------+
|       328
|  [244]
```

```
Rung #217
|              CRYO 2                                                      REGEN                 |
|COOL DOWN     TEMPERATUR                                                  TIME TO               |
|2             =<20K                                                       20K  2                |
|CD2           CY2TMP20                                                    PDM2                  |
|   B3           B3                                                        +-TON-------------+   |
|---] [--------]/[---------------------------------------------------------+TIMER ON DELAY   +-(EN)-|
|   652          502                                                       |TIMER:     T4:42 |   |
|[203]                                                                     |BASE (SEC):  1.0 +-(DN)|
|                                                                          |PRESET:     7200 |   |
|                                                                          |ACCUM:         0 |   |
|                                                                          +-----------------+   |
T4:42.DN - ] [ - File #3 CRYO_REGEN - 32,252
T4:42.TT - ] [ - File #3 CRYO_REGEN - 210
Rung #218
|              CRYO 3                                                      REGEN                 |
|COOL DOWN     TEMPERATUR                                                  TIME TO               |
|3             =<20K                                                       20K  3                |
|CD3           CY3TMP20                                                    PDM3                  |
|   B3           B3                                                        +-TON-------------+   |
|---] [--------]/[---------------------------------------------------------+TIMER ON DELAY   +-(EN)-|
|   653          503                                                       |TIMER:     T4:43 |   |
|[204]                                                                     |BASE (SEC):  1.0 +-(DN)|
|                                                                          |PRESET:     7200 |   |
|                                                                          |ACCUM:         0 |   |
|                                                                          +-----------------+   |
T4:43.DN - ] [ - File #3 CRYO_REGEN - 32,253
T4:43.TT - ] [ - File #3 CRYO_REGEN - 211
Rung #219
|              CRYO 5                                                      REGEN                 |
|COOL DOWN     TEMPERATUR                                                  TIME TO               |
|4             =<20K                                                       20K  4                |
|CD4           CY5TMP20                                                    PDM4                  |
|   B3           B3                                                        +-TON-------------+   |
|---] [--------]/[---------------------------------------------------------+TIMER ON DELAY   +-(EN)-|
|   654          505                                                       |TIMER:     T4:44 |   |
|[205]                                                                     |BASE (SEC):  1.0 +-(DN)|
|                                                                          |PRESET:     7200 |   |
|                                                                          |ACCUM:         0 |   |
|                                                                          +-----------------+   |
T4:44.DN - ] [ - File #3 CRYO_REGEN - 32,254
T4:44.TT - ] [ - File #3 CRYO_REGEN - 212
```

- 543 -

Rung #220

COOL DOWN 5 CD5 B3 655 [206]

CRYO 4 TEMPERATUR =<20K CY4TMP20 B3 504

CRYO 6 TEMPERATUR =<20K CY6TMP20 B3 506

CRYO 7 TEMPERATUR =<20K CY7TMP20 B3 507

T4:45.DN - ┤ ├ - File #3 CRYO_REGEN - 32, 255
T4:45.TT - ┤ ├ - File #3 CRYO_REGEN - 213

REGEN TIME TO 20K 5 PDM5

TON
TIMER ON DELAY (EN)
TIMER: T4:45
BASE (SEC): 1.0 (DN)
PRESET: 7200
ACCUM: 0

Rung #221

COOL DOWN 6 CD6 B3 656 [207]

CRYO 8 TEMPERATUR =<20K CY8TMP20 B3 508

REGEN TIME TO 20K 6 PDM6

TON
TIMER ON DELAY (EN)
TIMER: T4:46
BASE (SEC): 1.0 (DN)
PRESET: 7200
ACCUM: 0

T4:46.DN - ┤ ├ - File #3 CRYO_REGEN - 32,256
T4:46.TT - ┤ ├ - File #3 CRYO_REGEN - 214

Rung #222

COOL DOWN 7 CD7 B3 657 [208]

CRYO 9 TEMPERATUR =<20K CY9TMP20 B3 509

CRYO 10 TEMPERATUR =<20K CY10TMP20 B3 510

CRYO 12 TEMPERATUR =<20K CY12TMP20 B3 512

T4:47.DN - ┤ ├ - File #3 CRYO_REGEN - 32, 257
T4:47.TT - ┤ ├ - File #3 CRYO_REGEN - 215

REGEN TIME TO 20K 7 PDM7

TON
TIMER ON DELAY (EN)
TIMER: T4:47
BASE (SEC): 1.0 (DN)
PRESET: 7200
ACCUM: 0

- 544 -

Rung #223

```
|           CRYO 11                                                              REGEN                    |
|COOL DOWN  TEMPERATUR                                                           TIME TO                  |
|8          =<20K                                                                20K  8                   |
|CD8        CY11TMP20                                                            PDN8                     |
|   B3         B3                                                                +--TON---------------+   |
|---] [-------]/[----------------------------------------------------------------+TIMER ON DELAY     +-(EN)-|
|   658        511                                                               |TIMER:        T4:48|   |
|[209]                                                                           |BASE (SEC):    1.0+-(DN)|
|                                                                                |PRESET:       7200|   |
|                                                                                |ACCUM:           0|   |
|                                                                                +-------------------+   |
T4:48.DN - ] [ - - File #3 CRYO_REGEN -  32,258
T4:48.TT - ] [ - - File #3 CRYO_REGEN -  216
```

BASE : Rung #224

```
| COMPRESSOR  CRYO 2                                                                       REROUGH     |
| 2 REGEN-    COUNTER                                                                      COUNTER     |
| ERATION     RESET                                                                        COMPRESSOR  |
| PROGRAM     ONE SHOT                                                                     2           |
| CYRGN2      C2CROS                                                                       C2RERUF     |
|      B3          B3                                                                         C5:2     |
|-+----]/[--------[ONS]--+-----------------------------------------------------------------(RES)-------|
| |    322         562   |                                                                             |
| |[238]                 |                                                                             |
| |                      | C5:2 - CTU - File #3 CRYO_REGEN - 196                                       |
| |                      | C5:2.DN - ] [ - - File #2 MAIN_PRGRM - 624                                  |
| |PAUSE                 |                                                                             |
| |DISABLE               |                                                                             |
| |TS12                  |                                                                             |
| | N7:16                |                                                                             |
| +----] [---------------+                                                                             |
|      4                                                                                               |
|  [2:3]                                                                                               |
```

BASE : Rung #225

- 545 -

```
| COMPRESSOR  CRYO 3                                                                 REROUGH    |
| 3 REGEN-    COUNTER                                                                COUNTER    |
| ERATION     RESET                                                                  COMPRESSOR |
| PROGRAM     ONE SHOT                                                               3          |
| CYRGN3      C3CROS                                                                 C3RERUF    |
|      B3          B3                                                                    C5:3   |
|-+----]/[---------[ONS]--+----------------------------------------------------------(RES)-----|
| |    323         563    |                                                                     |
| |[239]                  |                                                                     |
| |                       | C5:3 - CTU - File #3 CRYO_REGEN - 197                               |
| |                       | C5:3.DN - -] [- - File #2 MAIN_PRGRM - 624                          |
| |PAUSE                  |                                                                     |
| |DISABLE                |                                                                     |
| |TS12                   |                                                                     |
| |  N7:16                |                                                                     |
| +---] [-----------------+                                                                     |
|     4                                                                                         |
|  [2:3]                                                                                        |
```

```
BASE :   Rung #226
| COMPRESSOR  CRYO 4                                                        REROUGH     |
| 4 REGEN-    COUNTER                                                       COUNTER     |
| ERATION     RESET                                                         COMPRESSOR  |
| PROGRAM     ONE SHOT                                                      4.          |
| CYRGN4      C4CROS                                                        C4RERUF     |
|      B3          B3                                                          C5:4     |
|-+----]/[------[ONS]-+-------------------------------------------------------(RES)-----|
| |    324        564 |                                                                 |
| |[240]              |                                                                 |
| |                   | C5:4 - CTU - File #3 CRYO_REGEN - 198                           |
| |                   | C5:4.DN - -| |- - File #2 MAIN_PRGRM - 624                     |
| |PAUSE              |                                                                 |
| |DISABLE            |                                                                 |
| |TS12               |                                                                 |
| |  N7:16            |                                                                 |
| +---] [-------------+                                                                 |
|      4                                                                                |
|   [2:3]                                                                               |
```

BASE : Rung #227

```
| COMPRESSOR  CRYO 5                                                        REROUGH     |
| 5 REGEN-    COUNTER                                                       COUNTER     |
| ERATION     RESET                                                         COMPRESSOR  |
| PROGRAM     ONE SHOT                                                      5           |
| *CYRGN5     C5CROS                                                        C5RERUF     |
|      B3        B3                                                            C5:5     |
|-+---]/[------[ONS]--+-------------------------------------------------------[RES]----|
| |    325       565  |                                                                 |
| |[241]              |                                                                 |
| |                   | C5:5 - CTU - File #3 CRYO_REGEN - 199                          |
| |                   | C5:5.DN - -] [- - File #2 MAIN_PRGRM - 624                     |
| |PAUSE              |                                                                 |
| |DISABLE            |                                                                 |
| |TS12               |                                                                 |
| |  N7:16            |                                                                 |
| +---] [-------------+                                                                 |
|      4                                                                                 |
|  [2:3]                                                                                |
```

BASE : Rung #228

```
| COMPRESSOR CRYO 6                                               REROUGH    |
| 6 REGEN-   COUNTER                                              COUNTER    |
| ERATION    RESET                                                COMPRESSOR |
| PROGRAM    ONE SHOT                                             6          |
| CYRGN6     C6CROS                                               C6R3RUF    |
|       B3       B3                                                  C5:6    |
|-+----]/[------[ONS]--+--------------------------------------------[RES]----|
| |    326       566   |                                                     |
| |[242]               |                                                     |
| |                    | C5:6 - CTU - File #3 CRYO_REGEN - 200               |
| |                    | C5:6.DN - -] [- - File #2 MAIN_PRGRM - 624          |
| |PAUSE               |                                                     |
| |DISABLE             |                                                     |
| |TS12                |                                                     |
| | N7:16              |                                                     |
| +---] [--------------+                                                     |
|      4                                                                     |
|  [2:3]                                                                     |
```

BASE : Rung #229

- 549 -

```
| COMPRESSOR  CRYO 7                                                          REROUGH     |
| 7 REGEN-    COUNTER                                                         COUNTER     |
| ERATION     RESET                                                           COMPRESSOR  |
| PROGRAM     ONE SHOT                                                        7           |
| CYRGN7      C7CROS                                                          C7RERUF     |
|     B3          B3                                                             C5:7     |
+---]/[------[ONS]--+----------------------------------------------------------[RES]-----+
| |  327      567   |                                                                     |
| |[243]            |                                                                     |
| |                 | C5:7 - CTU - File #3 CRYO_REGEN - 201                               |
| |                 | C5:7.DN - ] [ - File #2 MAIN_PRGRM - 624                            |
| |PAUSE            |                                                                     |
| |DISABLE          |                                                                     |
| |TS12             |                                                                     |
| |  N7:16          |                                                                     |
| +---] [-----------+                                                                     |
|     4                                                                                   |
|  [2:3]                                                                                  |
```

- 550 -

```
BASE :  Rung #230
| COMPRESSOR  CRYO 8                                                   REROUGH    |
| 8 REGEN-    COUNTER                                                  COUNTER    |
| ERATION     RESET                                                    COMPRESSOR |
| PROGRAM     ONE SHOT                                                 8          |
| CYRGN8      C8CROS                                                   C8RERUF    |
|       B3        B3                                                      C5:8    |
|-+---|/|-------[ONS]-+--------------------------------------------------[RES]-----|
| |   328        568  |                                                           |
| |[244]              |                                                           |
| |                   | C5:8 - CTU - File #3 CRYO_REGEN - 202                     |
| |                   | C5:8.DN - -| |- - File #2 MAIN_PRGRM - 624                |
| |PAUSE              |                                                           |
| |DISABLE            |                                                           |
| |TS12               |                                                           |
| | N7:16             |                                                           |
| +---| |-------------+                                                           |
|      4                                                                          |
|  [2:3]                                                                          |
```

```
Rung #231
|COMPRESSOR                                                                       |
|2 REGEN-                                                                         |
|ERATION                                                              COOL DOWN   |
|PROGRAM                                                              2           |
|CYRGN2                                                               CD2         |
|    B3                                                                  B3       |
|---|/|----------------------------------------------------------------(U)--------|
|    322                                                                 652      |
|[238]                                                                            |
B3/652 - -| |- - File #2 MAIN_PRGRM -  27,117,118
                 File #3 CRYO_REGEN -  164,210,217,238
                 File #6 TECH_RUNGS -  19
         -(L)- - File #3 CRYO_REGEN -  203
         -(U)- - File #3 CRYO_REGEN -  231
```

```
Rung #232
|COMPRESSOR                                                        COOL DOWN |
|3 REGEN-                                                          3         |
|ERATION                                                           CD3       |
|PROGRAM                                                              B3     |
|CYRGN3                                                                      |
|    B3                                                                      |
|---]/[--------------------------------------------------------------(U)-----|
|    323                                                              653    |
|[239]
B3/653 - ] [ - - File #2 MAIN_PRGRM -  28,119,120
                 File #3 CRYO_REGEN -  165,211,218,239
                 File #6 TECH_RUNGS -  19
        -(L)- - File #3 CRYO_REGEN -  204
        -(U)- - File #3 CRYO_REGEN -  232
Rung #233
|COMPRESSOR                                                        COOL DOWN |
|4 REGEN-                                                          4         |
|ERATION                                                           CD4       |
|PROGRAM                                                              B3     |
|CYRGN4                                                                      |
|    B3                                                                      |
|---]/[--------------------------------------------------------------(U)-----|
|    324                                                              654    |
|[240]
B3/654 - ] [ - - File #2 MAIN_PRGRM -  29,123,124
                 File #3 CRYO_REGEN -  166,212,219,240
                 File #6 TECH_RUNGS -  19
        -(L)- - File #3 CRYO_REGEN -  205
        -(U)- - File #3 CRYO_REGEN -  233
Rung #234
|COMPRESSOR                                                        COOL DOWN |
|5 REGEN-                                                          5         |
|ERATION                                                           CD5       |
|PROGRAM                                                              B3     |
|CYRGN5                                                                      |
|    B3                                                                      |
|---]/[--------------------------------------------------------------(U)-----|
|    325                                                              655    |
|[241]
B3/655 - ] [ - - File #2 MAIN_PRGRM -  30,121,122,125,126,127,128
                 File #3 CRYO_REGEN -  167,168,169,213,220,241
                 File #6 TECH_RUNGS -  19
        -(L)- - File #3 CRYO_REGEN -  206
        -(U)- - File #3 CRYO_REGEN -  234
Rung #235
|COMPRESSOR                                                        COOL DOWN |
|6 REGEN-                                                          6         |
|ERATION                                                           CD6       |
|PROGRAM                                                              B3     |
|CYRGN6                                                                      |
|    B3                                                                      |
|---]/[--------------------------------------------------------------(U)-----|
|    326                                                              656    |
|[242]
B3/656 - ] [ - - File #2 MAIN_PRGRM -  31,129,130
                 File #3 CRYO_REGEN -  170,214,221,242
                 File #6 TECH_RUNGS -  19
        -(L)- - File #3 CRYO_REGEN -  207
        -(U)- - File #3 CRYO_REGEN -  235
```

```
Rung #236
|COMPRESSOR
|7 REGEN-                                                              COOL DOWN
|ERATION                                                               7
|PROGRAM                                                               CD7
|CYRGN7                                                                  B3
|     B3
|----]/[---------------------------------------------------------------(U)----|
|     327                                                                657
|[243]
B3/657 - ] [ - - File #2 MAIN_PRGRM -  32,131,132,133,134,137,138
                 File #3 CRYO_REGEN -  171,172,173,215,222,243
                 File #6 TECH_RUNGS -  19
         -(L)- - File #3 CRYO_REGEN -  208
         -(U)- - File #3 CRYO_REGEN -  236
Rung #237
|COMPRESSOR
|8 REGEN-                                                              COOL DOWN
|ERATION                                                               8
|PROGRAM                                                               CD8
|CYRGN8                                                                  B3
|     B3
|----]/[---------------------------------------------------------------(U)----|
|     328                                                                658
|[244]
B3/658 - ] [ - - File #2 MAIN_PRGRM -  33,135,136
                 File #3 CRYO_REGEN -  174,216,223,244
                 File #6 TECH_RUNGS -  19
         -(L)- - File #3 CRYO_REGEN -  209
         -(U)- - File #3 CRYO_REGEN -  237
```

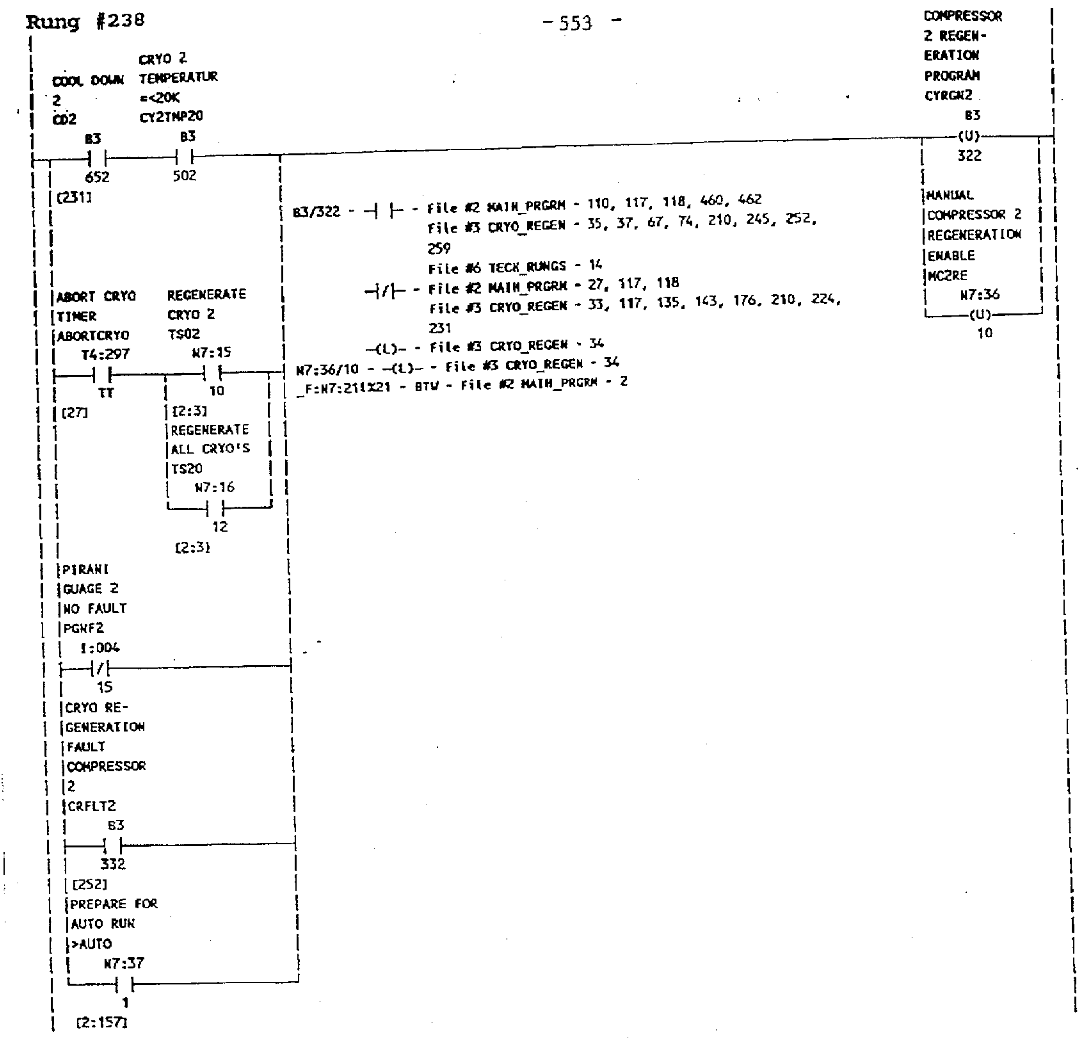
Rung #238
- 553 -
COOL DOWN
2
CO2
B3
652
[231]
CRYO 2
TEMPERATUR
=<20K
CY2TMP20
B3
502
ABORT CRYO
TIMER
ABORTCRYO
T4:297
TT
[27]
REGENERATE
CRYO 2
TS02
N7:15
10
[2:3]
REGENERATE
ALL CRYO'S
TS20
N7:16
12
[2:3]
PIRANI
GUAGE 2
NO FAULT
PGNF2
I:004
15
CRYO RE-
GENERATION
FAULT
COMPRESSOR
2
CRFLT2
B3
332
[252]
PREPARE FOR
AUTO RUN
>AUTO
N7:37
1
[2:157]
B3/322 - ] [ - File #2 MAIN_PRGRM - 110, 117, 118, 460, 462
File #3 CRYO_REGEN - 35, 37, 67, 74, 210, 245, 252, 259
File #6 TECK_RUNGS - 14
]/[ - File #2 MAIN_PRGRM - 27, 117, 118
File #3 CRYO_REGEN - 33, 117, 135, 143, 176, 210, 224, 231
-(L)- - File #3 CRYO_REGEN - 34
N7:36/10 - -(L)- - File #3 CRYO_REGEN - 34
_F:N7:211X21 - BTW - File #2 MAIN_PRGRM - 2
COMPRESSOR
2 REGEN-
ERATION
PROGRAM
CYRGN2
B3
(U)
322
MANUAL
COMPRESSOR 2
REGENERATION
ENABLE
MC2RE
N7:36
(U)
10

Rung #239
- 554 -
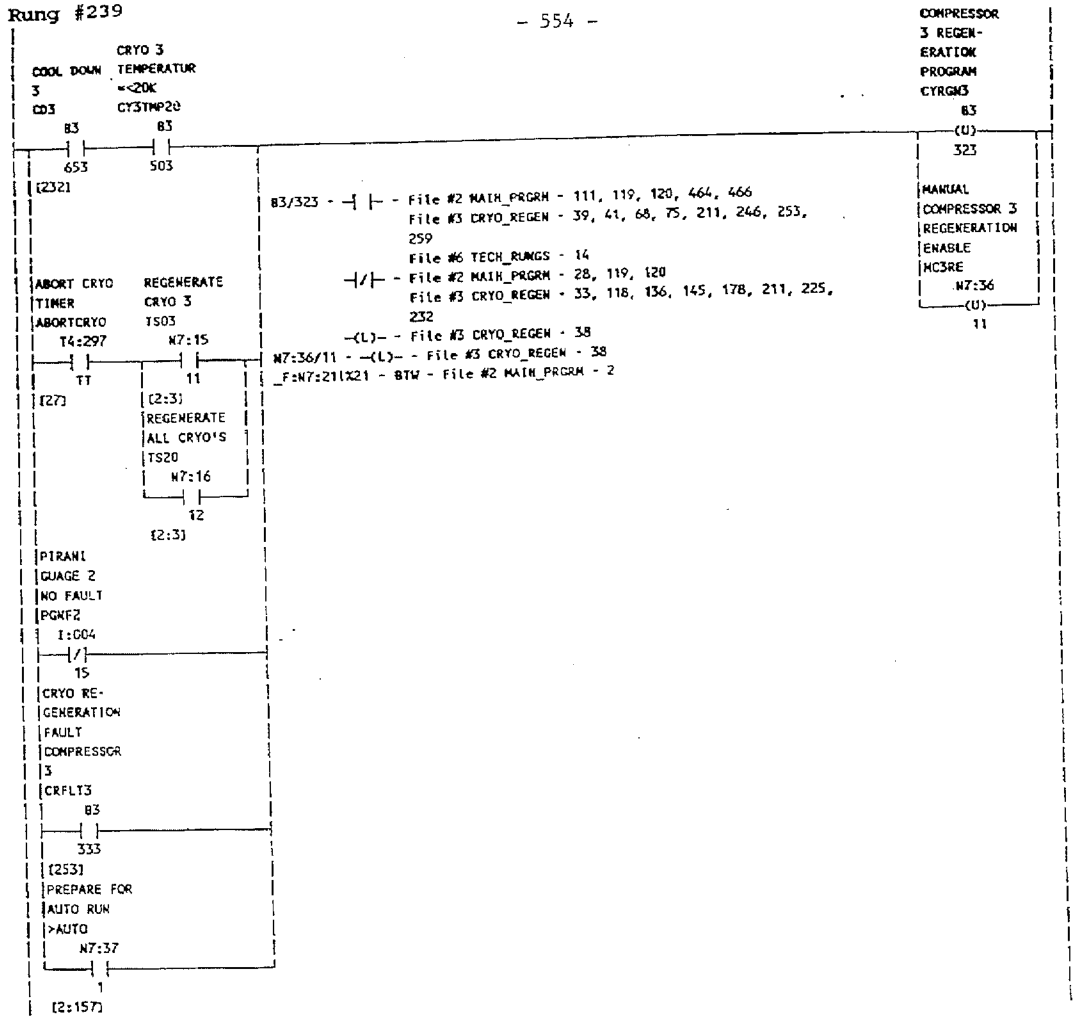

Rung #240
- 555 -
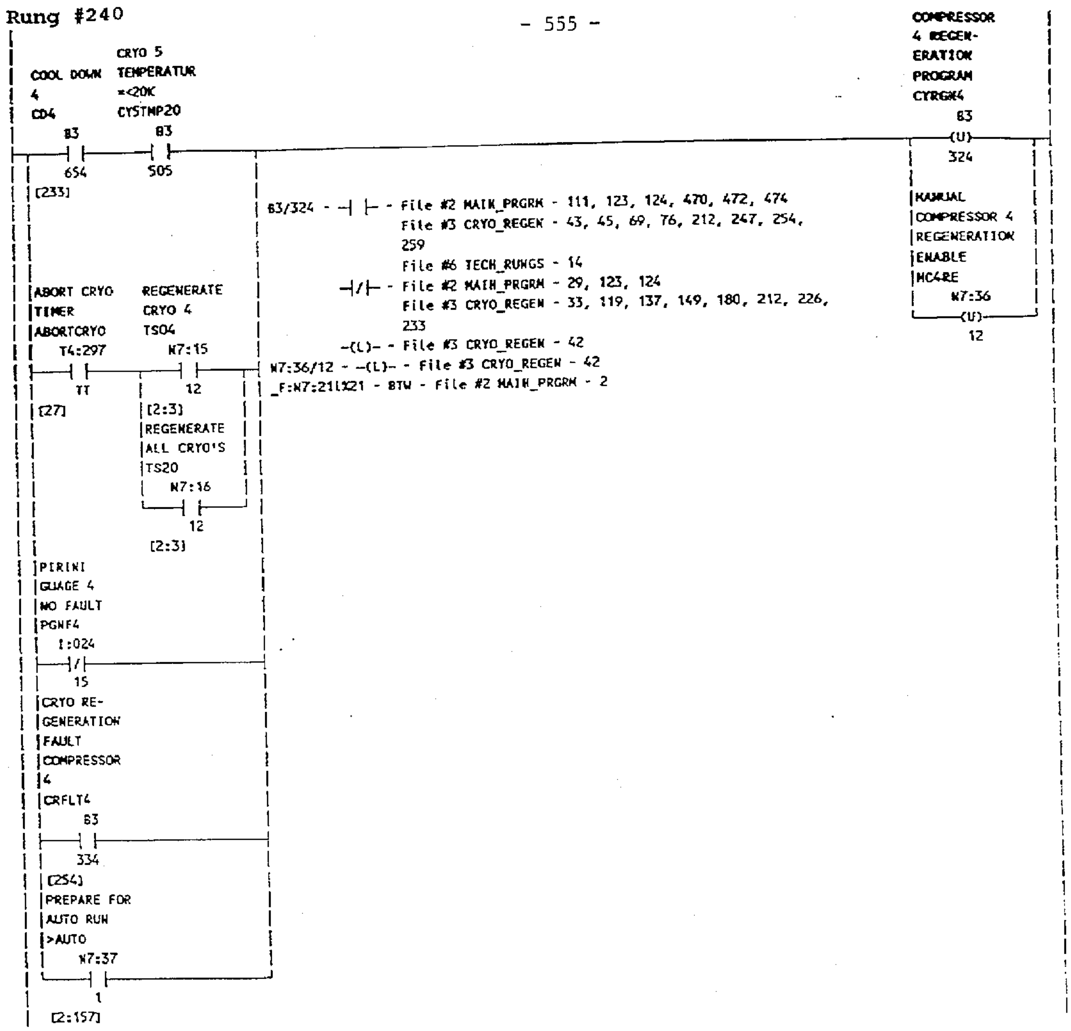

Rung #241

- 556 -

```
          CRYO 4      CRYO 6      CRYO 7                                              COMPRESSOR
COOL DOWN TEMPERATUR  TEMPERATUR  TEMPERATUR                                          5 REGEN-
5         =<20K       =<20K       =<20K                                               ERATION
CD5       CY4TMP20    CY6TMP20    CY7TMP20                                            PROGRAM
   B3         B3          B3          B3                                              CYRGN5
--] [------] [-------] [-------] [--------------------------------------------------- B3
  655        504         506         507                                              --(U)--
[234]                                                                                   325
                                    B3/325 - ] [ - File #2 MAIN_PRGRM - 111, 112, 121, 122,   MANUAL
                                                   125, 126, 127, 128, 468, 476, 478,         COMPRESSOR 5
                                                   480, 482                                   REGENERATION
                                                   File #3 CRYO_REGEN - 47, 51, 70, 77,       ENABLE
ABORT CRYO  REGENERATE                             213, 248, 255, 259                         MC5RE
TIMER       CRYO 5                                 File #6 TECH_RUNGS - 14                      N7:36
ABORTCRYO   TS05                             ]/[ - File #2 MAIN_PRGRM - 30, 121, 122, 125,    --(U)--
  T4:297      N7:15                                126, 127, 128                                13
--] [------] [-----                                File #3 CRYO_REGEN - 33, 120, 121, 122,
   TT         13                                   138, 147, 151, 153, 182, 213, 227,
[27]        [2:3]                                  234
                                             -(L)- - File #3 CRYO_REGEN - 46
                                    N7:36/13 - -(L)- - File #3 CRYO_REGEN - 46
                                    _F:N7:21[X21 - BTW - File #2 MAIN_PRGRM - 2
            REGENERATE
            ALL CRYO'S
            TS20
              N7:16
            --] [--
               12
            [2:3]
PIRINI
GUAGE 3
NO FAULT
PGNF3
  I:024
--]/[-----------------
   14
PIRINI
GUAGE 4
NO FAULT
PGNF4
  I:024
--]/[-----------------
   15
PIRINI
GUAGE 5
NO FAULT
PGNF5
  I:040
--]/[-----------------
   14
CRYO RE-
GENERATION
FAULT
COMPRESSOR
5
CRFLT5
   B3
--] [-----------------
   335
[255]
PREPARE FOR
> >                                  >                                                                 >
```

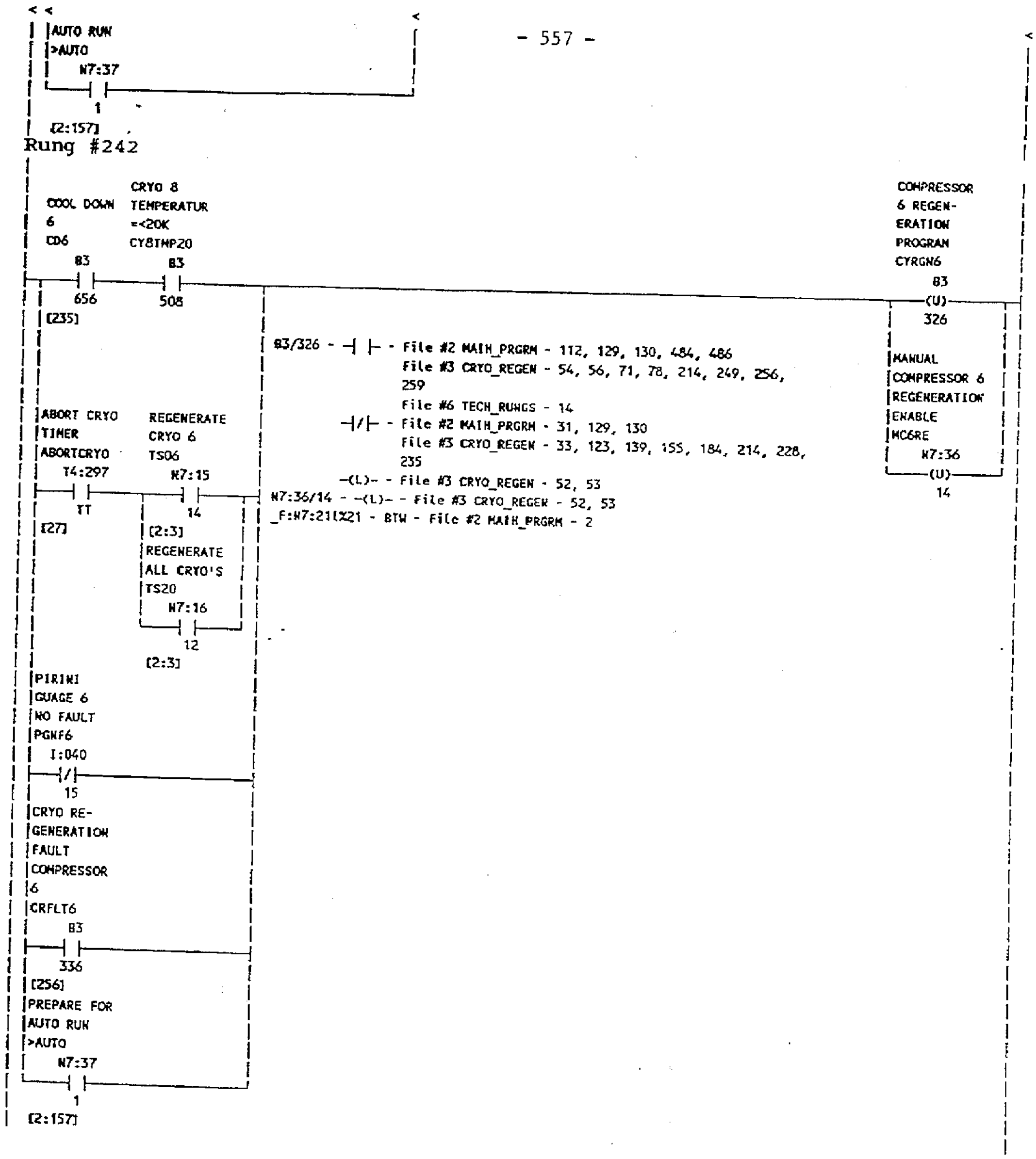
AUTO RUN
>AUTO
N7:37
1
[2:157]
Rung #242
COOL DOWN 6 CD6
B3
656
[235]
CRYO 8 TEMPERATUR =<20K CY8TMP20
B3
508
COMPRESSOR 6 REGEN-ERATION PROGRAM CYRGN6
B3
(U)
326
B3/326 - ┤ ├ - File #2 MAIN_PRGRM - 112, 129, 130, 484, 486
File #3 CRYO_REGEN - 54, 56, 71, 78, 214, 249, 256, 259
File #6 TECH_RUNGS - 14
┤/├ - File #2 MAIN_PRGRM - 31, 129, 130
File #3 CRYO_REGEN - 33, 123, 139, 155, 184, 214, 228, 235
-(L)- - File #3 CRYO_REGEN - 52, 53
N7:36/14 - -(L)- - File #3 CRYO_REGEN - 52, 53
_F:N7:21[X21 - BTW - File #2 MAIN_PRGRM - 2
MANUAL COMPRESSOR 6 REGENERATION ENABLE MC6RE
N7:36
(U)
14
ABORT CRYO TIMER ABORTCRYO
T4:297
TT
[27]
REGENERATE CRYO 6 TS06
N7:15
14
[2:3]
REGENERATE ALL CRYO'S TS20
N7:16
12
[2:3]
PIRINI GUAGE 6 NO FAULT PGNF6
I:040
15
CRYO RE-GENERATION FAULT COMPRESSOR 6 CRFLT6
B3
336
[256]
PREPARE FOR AUTO RUN >AUTO
N7:37
1
[2:157]

Rung #243
- 558 -
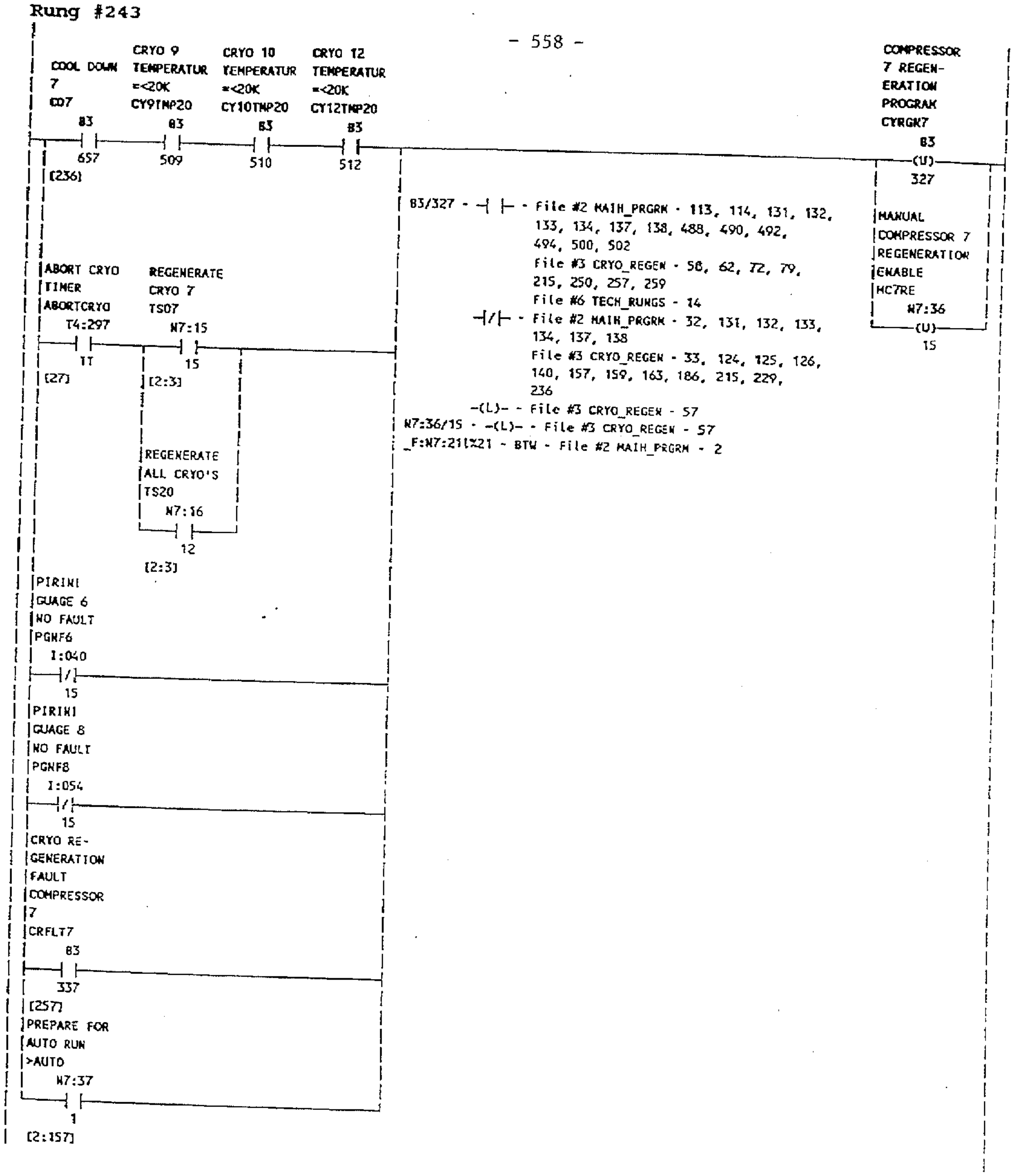

Rung #244

```
COOL DOWN 8 CD8 B3/658 [237]
CRYO 11 TEMPERATUR =<20K CY11TMP20 B3/511
COMPRESSOR 8 REGENERATION PROGRAM CYRGM8 B3 -(U)- 328

B3/328 - ┤ ├ - File #2 MAIN_PRGRM - 113, 135, 136, 496, 498
               File #3 CRYO_REGEN - 64, 66, 73, 80, 216, 251, 258, 259
               File #6 TECH_RUNGS - 14
         ┤/├ - File #2 MAIN_PRGRM - 33, 135, 136
               File #3 CRYO_REGEN - 33, 127, 141, 161, 188, 216, 230, 237
         -(L)- - File #3 CRYO_REGEN - 63
N7:37/0 - -(L)- - File #3 CRYO_REGEN - 63
_F:N7:21[X21 - BTW - File #2 MAIN_PRGRM - 2

MANUAL COMPRESSOR 8 REGENERATION ENABLE MC8RE N7:37 -(U)- 0

ABORT CRYO TIMER ABORTCRYO T4:297 TT [27]
REGENERATE CRYO 8 TS08 N7:16 0 [2:3]
REGENERATE ALL CRYO'S TS20 N7:16 12 [2:3]
PIRINI GUAGE 8 NO FAULT PGNF8 I:054 ┤/├ 15
CRYO REGENERATION FAULT COMPRESSOR 8 CRFLT8 B3 338 [258]
PREPARE FOR AUTO RUN >AUTO N7:37 1 [2:157]
```

- 560 -

```
Rung #245
|COMPRESSOR  HEATER 2
|2 REGEN-    CHAMBER                                               CRYO REGEN
|ERATION     GATE VALVE                                            COMPRESSOR
|PROGRAM     CLOSE                                                 2 HV2 FAULT
|CYRGN2      HV2S1                                                 CR2FLT
|   B3         I:004                                               +-TON----------+
|---] [--------]/[-------------------------------------------------+TIMER ON DELAY+-(EN)-
|   322        00                                                  |TIMER:   T4:12|
|[238]                                                             |BASE (SEC): 1.0+-(DN)
|                                                                  |PRESET:     30|
|                                                                  |ACCUM:       0|
|                                                                  +--------------+
T4:12.DN - ] [ - File #3 CRYO_REGEN - 252
Rung #246
|COMPRESSOR  DWELL 1
|3 REGEN-    CHAMBER                                               CRYO REGEN
|ERATION     GATE VALVE                                            COMPRESSOR
|PROGRAM     CLOSED                                                3 HV3 FAULT
|CYRGN3      HV3S1                                                 CR3FLT
|   B3         I:004                                               +-TON----------+
|---] [--------]/[-------------------------------------------------+TIMER ON DELAY+-(EN)-
|   323        03                                                  |TIMER:   T4:13|
|[239]                                                             |BASE (SEC): 1.0+-(DN)
|                                                                  |PRESET:     30|
|                                                                  |ACCUM:       0|
|                                                                  +--------------+
T4:13.DN - ] [ - File #3 CRYO_REGEN - 253
Rung #247
|COMPRESSOR  HEATER 3
|4 REGEN-    CHAMBER                                               CRYO REGEN
|ERATION     GATE VALVE                                            COMPRESSOR
|PROGRAM     CLOSED                                                4 HV5 FAULT
|CYRGN4      HV5S1                                                 CR5FLT
|   B3         I:024                                               +-TON----------+
|---] [--------]/[-------------------------------------------------+TIMER ON DELAY+-(EN)-
|   324        00                                                  |TIMER:   T4:14|
|[240]                                                             |BASE (SEC): 1.0+-(DN)
|                                                                  |PRESET:     30|
|                                                                  |ACCUM:       0|
|                                                                  +--------------+
T4:14.DN - ] [ - File #3 CRYO_REGEN - 254
```

Rung #248

```
|COMPRESSOR   DWELL 2                                                   |
|5 REGEN-     CHAMBER                                   CRYO REGEN      |
|ERATION      GATE VALVE                                COMPRESSOR      |
|PROGRAM      CLOSED                                    5 HV4,6,7 FAULT |
|CYRGN5       HV4S1                                     CR467FLT        |
|    B3          I:022                                  +-TON--------+  |
|---] [------+---]/[---+--------------------------------+TIMER ON DELAY+-(EN)-|
|   325      |    06   |                                |TIMER:   T4:15|  |
|[241]       |         |                                |BASE (SEC): 1.0+-(DN) |
|            |DWELL 3  | T4:15.DN - ] [ - File #3 CRYO_REGEN - 255      |PRESET:    30|  |
|            |CHAMBER  |                                |ACCUM:      0|  |
|            |GATE VALVE|                               +-------------+  |
|            |CLOSED   |                                                 |
|            |HV6S1    |                                                 |
|            |  I:024  |                                                 |
|            +---]/[---+                                                 |
|            |   03    |                                                 |
|            |DWELL 4  |                                                 |
|            |CHAMBER  |                                                 |
|            |GATE VALVE|                                                |
|            |CLOSED   |                                                 |
|            |HV7S1    |                                                 |
|            |  I:036  |                                                 |
|            +---]/[---+                                                 |
|               06                                                       |
```

Rung #249

```
|COMPRESSOR   BUFFER 3                                                  |
|6 REGEN-     CHAMBER                                   CRYO REGEN      |
|ERATION      GATE VALVE                                COMPRESSOR      |
|PROGRAM      CLOSED                                    6 HV8 FAULT     |
|CYRGN6       HV8S1                                     CR8FLT          |
|    B3          I:040                                  +-TON--------+  |
|---] [----------]/[------------------------------------+TIMER ON DELAY+-(EN)-|
|   326           00                                    |TIMER:   T4:16|  |
|[242]                                                  |BASE (SEC): 1.0+-(DN) |
|                                                       |PRESET:    30|  |
|                                                       |ACCUM:      0|  |
|                                                       +-------------+  |
T4:16.DN - ] [ - File #3 CRYO_REGEN - 256
```

```
Rung #250
|COMPRESSOR  DWELL 5
|7 REGEN-    CHAMBER                                                   CRYO REGEN
|ERATION     GATE VALVE                                                COMPRESSOR
|PROGRAM     CLOSED                                                    7 HV91012 FAULT
|CYRGN7      HV9S1                                                     CR91012FLT
|   B3         I:040                                                   +-TON-----------------+
+---] [---+----]/[----+------------------------------------------------+TIMER ON DELAY       +-(EN)-
|   327   |    03     |                                                |TIMER:        T4:17  |
|[243]    |           |                                                |BASE (SEC):   1.0    +-(DN)
|         |DWELL 6    | T4:17.DN - -] [- - File #3 CRYO_REGEN - 257    |PRESET:       30     |
|         |CHAMBER    |                                                |ACCUM:        0      |
|         |GATE VALVE |                                                +---------------------+
|         |CLOSED     |
|         |HV10S1     |
|         |   I:052   |
|         +----]/[----+
|         |    06     |
|         |EXITLOCK   |
|         |CHAMBER    |
|         |GATE VALVE |
|         |CLOSED     |
|         |HV12S1     |
|         |   I:054   |
|         +----]/[----+
|              03
Rung #251
|COMPRESSOR  BUFFER 4
|8 REGEN-    CHAMBER                                                   CRYO REGEN
|ERATION     GATE VALVE                                                COMPRESSOR
|PROGRAM     CLOSED                                                    8 HV11 FAULT
|CYRGN8      HV11S1                                                    CR11FLT
|   B3         I:054                                                   +-TON-----------------+
+---] [--------]/[-----------------------------------------------------+TIMER ON DELAY       +-(EN)-
|   328        00                                                      |TIMER:        T4:18  |
|[244]                                                                 |BASE (SEC):   1.0    +-(DN)
|                                                                      |PRESET:       30     |
|                                                                      |ACCUM:        0      |
|                                                                      +---------------------+
T4:18.DN - -] [- - File #3 CRYO_REGEN - 258
```

Rung #252

```
|                COOL DOWN                                                                  CRYO RE-      |
|COMPRESSOR      AFTER CRYO                                                                 GENERATION    |
|2 REGEN-        REGEN                                                                      FAULT         |
|ERATION         CRYO 2                                                                     COMPRESSOR    |
|PROGRAM         2 HOUR                                                                     2             |
|CYRGN2          PCHZ                                                                       CRFLT2        |
|    B3           T4:42                                                                       B3          |
|----] [------+----] [-------------------+-----------------------------------------------------( )--------|
|    322      |   DN                     |                                                    332         |
|[238]        |[217]                     |                                                                |
|             |                          | B3/332 - ] [ - File #3 CRYO_REGEN - 238                        |
|             |                          |                File #6 TECH_RUNGS - 16                         |
|             |HIVAC 2                   |                                                                |
|             |10 SEC                    |                                                                |
|             |TIMER                     |                                                                |
|             |COMPETE                   |                                                                |
|             |CR2FLT                    |                                                                |
|             |  T4:12                   |                                                                |
|             |----] [-------------------+                                                                |
|             |    DN                    |                                                                |
|             |[245]                     |                                                                |
|             |PURGE TIME                |                                                                |
|             |MONITOR                   |                                                                |
|             |COMPRESSOR 2       N2 FLOW SWITCH                                                          |
|             |5 SECOND TEST      2       |                                                                |
|             |PGC2               NIFS2   |                                                                |
|             |+-GEQ--------------+  I:002|                                                                |
|             +|GRTR THAN OR EQUAL (A>=B)|----]/[----+                                                     |
|             ||SOURCE A:      T4:22.ACC|   17      |                                                     |
|             ||                       0|           |                                                     |
|             ||SOURCE B:              5|           |                                                     |
|             ||                       5|           |                                                     |
|             |+-----------------------+           |                                                     |
|             |T4:22.ACC - [110]                   |                                                     |
|             |PIRANI                              |                                                     |
|             |GUAGE 2                             |                                                     |
|             |NO FAULT                            |                                                     |
|             |PGNF2                               |                                                     |
|             |  I:004                             |                                                     |
|             +----]/[-----------------------------+                                                     |
|                  15                                                                                     |
```

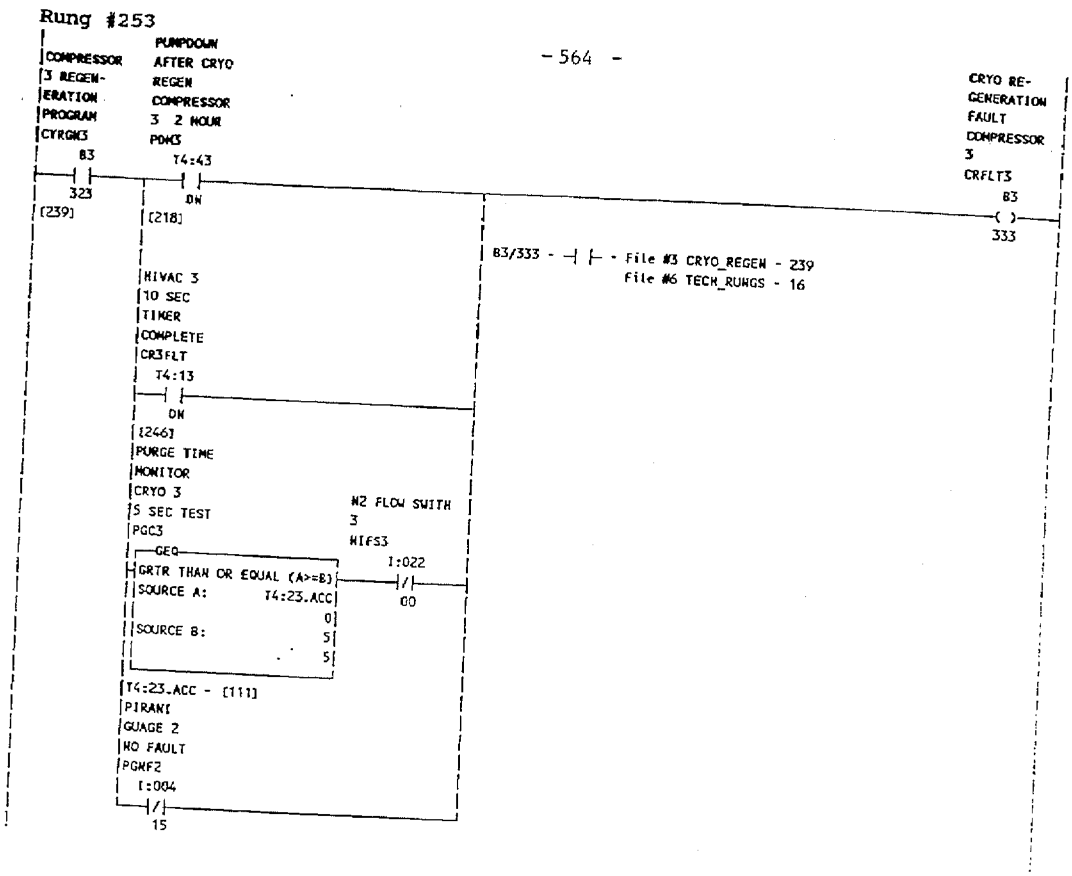
Rung #253
- 564 -
COMPRESSOR 3 REGEN- ERATION PROGRAM CYRGM3
B3
323
[239]
PUMPDOWN AFTER CRYO REGEN COMPRESSOR 3 2 HOUR PDM3
T4:43
DN
[218]
HIVAC 3 10 SEC TIMER COMPLETE CR3FLT
T4:13
DN
[246]
PURGE TIME MONITOR CRYO 3 5 SEC TEST PGC3
GEQ
GRTR THAN OR EQUAL (A>=B)
SOURCE A: T4:23.ACC
0
SOURCE B: 5
5
T4:23.ACC - [111]
N2 FLOW SWITH 3 N1FS3
I:022
00
PIRANI GUAGE 2 NO FAULT PGMF2
I:004
15
CRYO RE- GENERATION FAULT COMPRESSOR 3 CRFLT3
B3
333
B3/333 - ┤ ├ - File #3 CRYO_REGEN - 239
File #6 TECH_RUNGS - 16

Rung #254
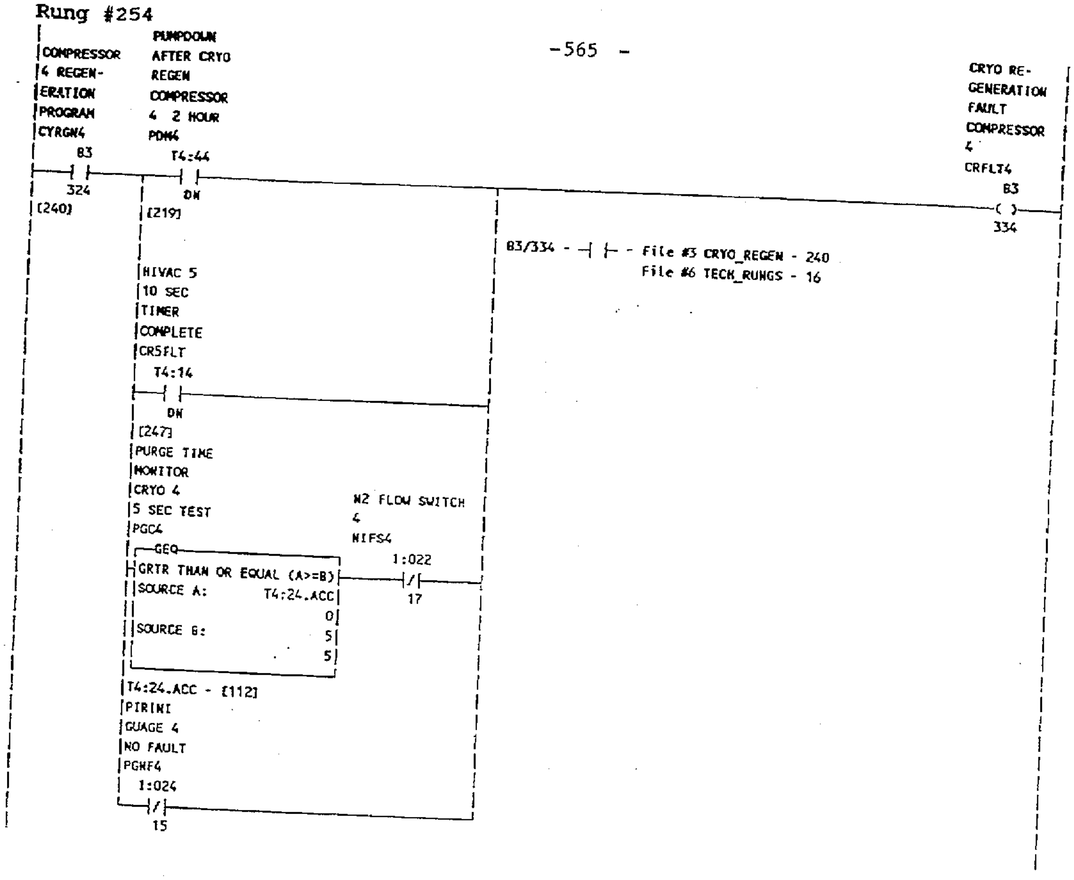

Rung #255
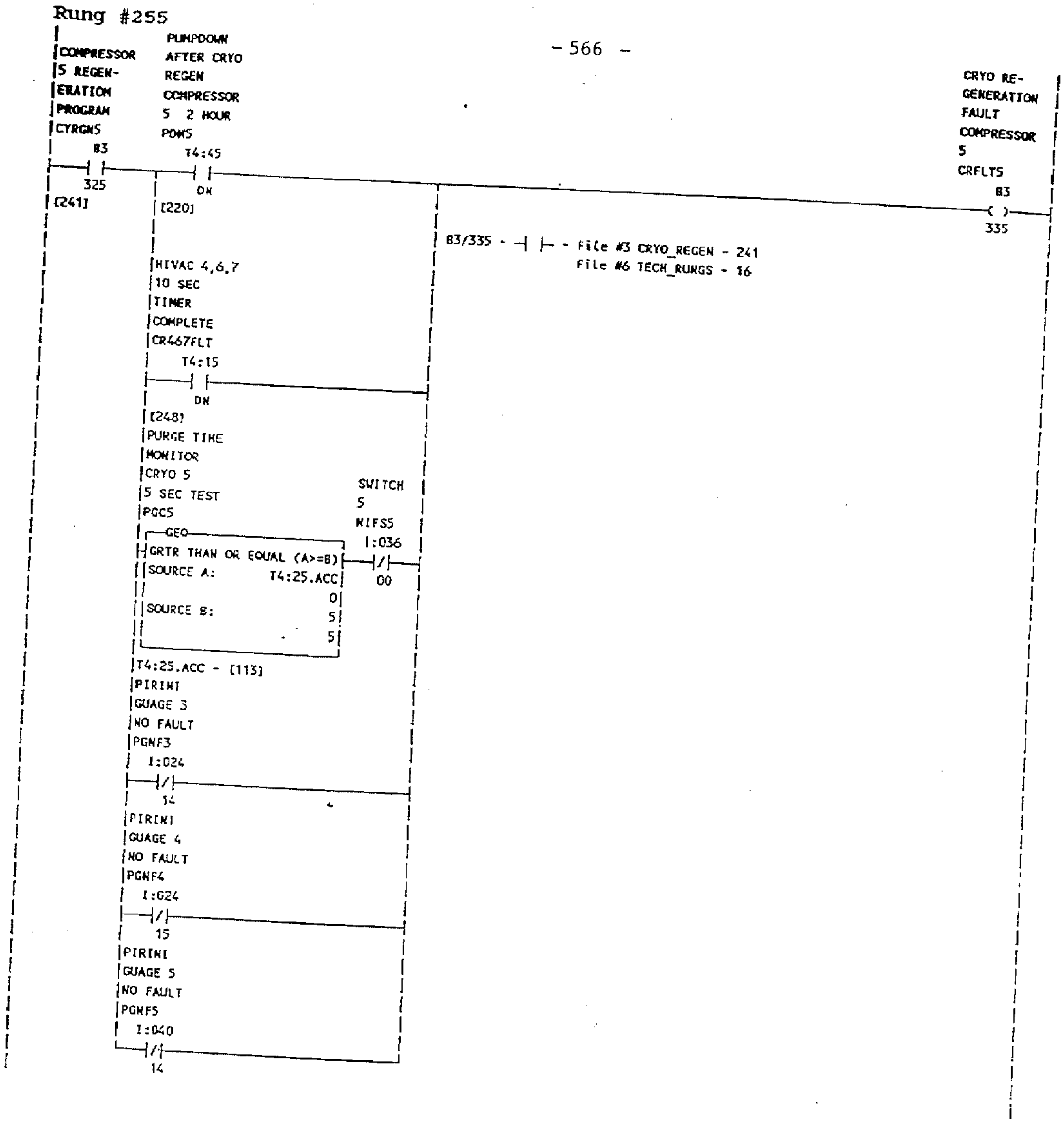

Rung #256
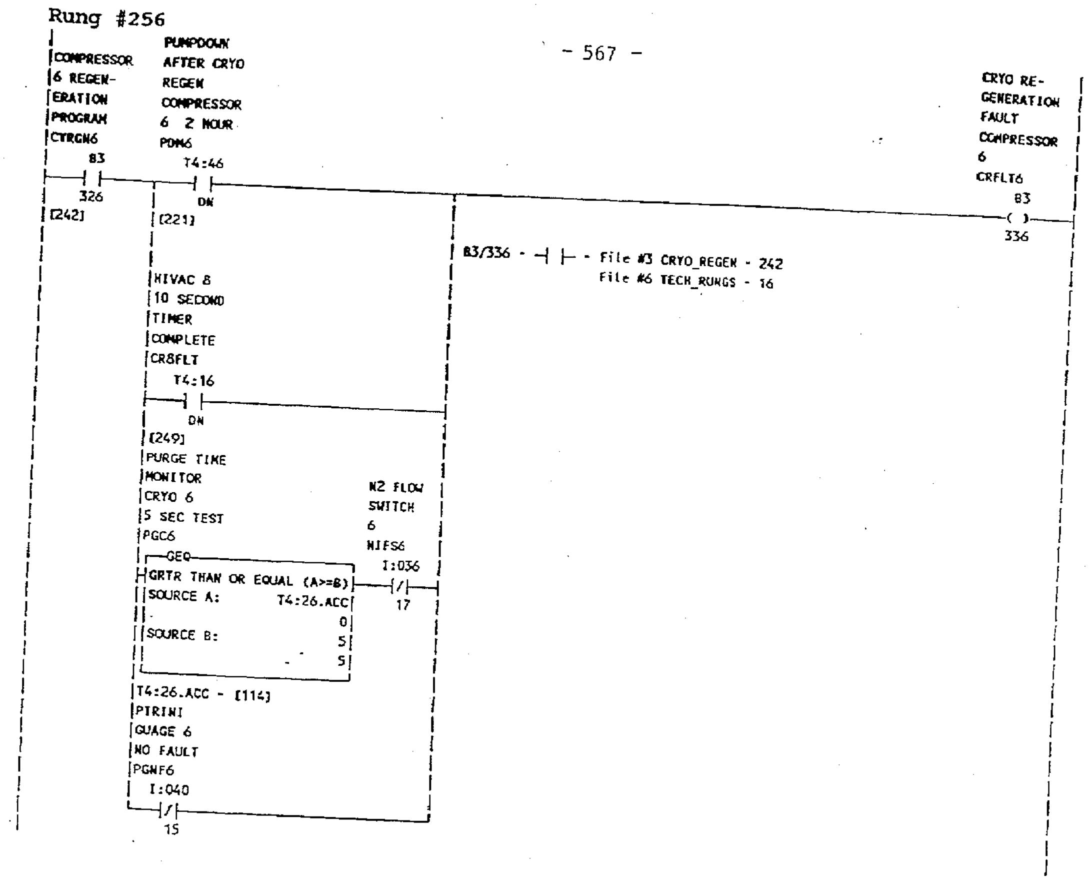

Rung #257
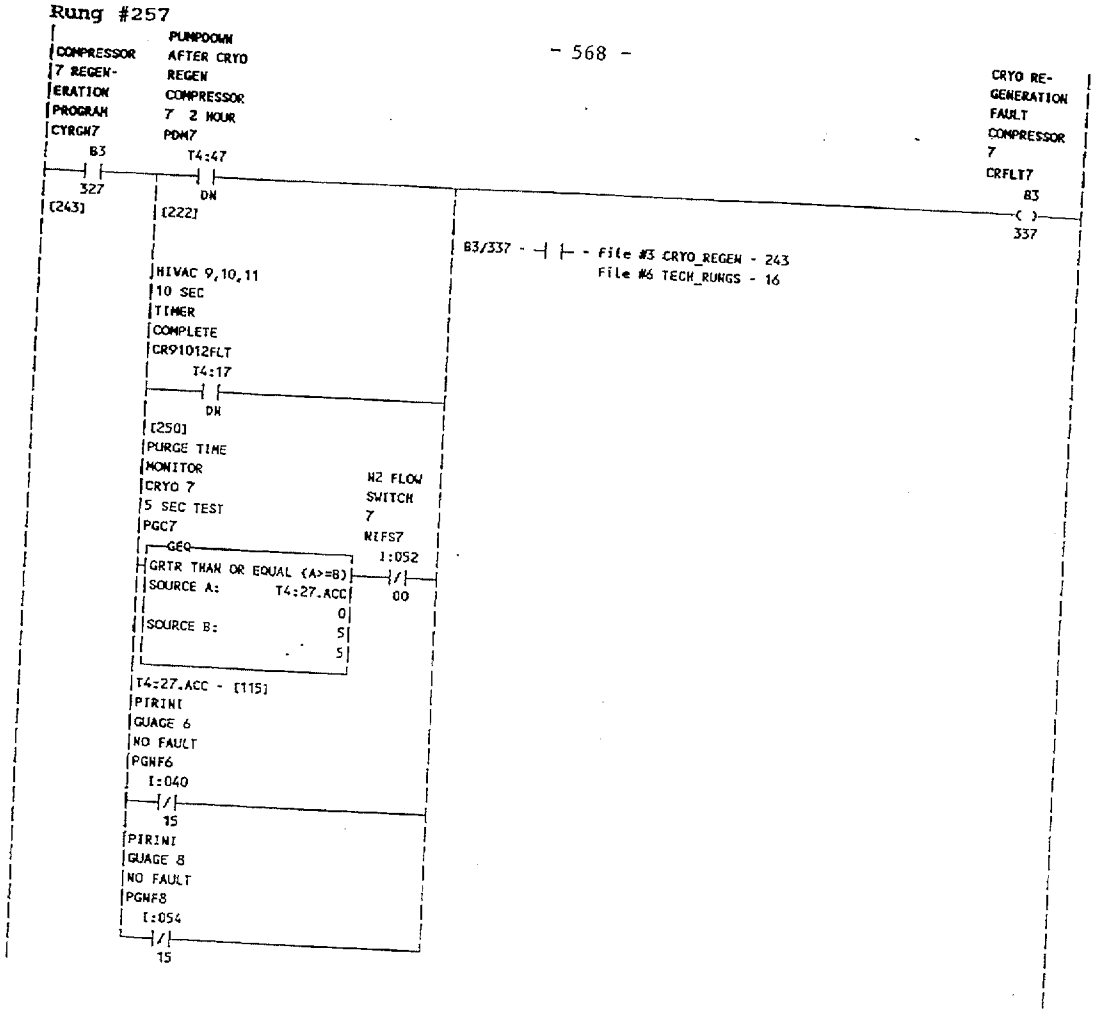

Rung #258

```
|
|COMPRESSOR  PUMPDOWN                                                    CRYO RE-
|8 REGEN-    AFTER CRYO                                                  GENERATION
|ERATION     REGEN                                                       FAULT
|PROGRAM     COMPRESSOR                                                  COMPRESSOR
|CYRGN8      8  2 HOUR                                                   8
|            PON8                                                        CRFLT8
|   B3         T4:48                                                       B3
|----] [------+---] [--------+------------------------------------------------( )----|
|    328      |     DN       |                                             338
|[244]        |[223]         |
|             |              | B3/338 - -] [- - File #3 CRYO_REGEN - 244
|             |              |                  File #6 TECH_RUNGS - 16
|             |HIVAC 11      |
|             |10 SEC        |
|             |TIMER         |
|             |COMPLETE      |
|             |CR11FLT       |
|             | T4:18        |
|             |----] [-------+
|             |    DN        |
|             |[251]         |
|             |PURGE TIME    |
|             |MONITOR                 N2 FLOW |
|             |CRYO 8                  SWITCH  |
|             |5 SEC TEST              8       |
|             |PGC8                    NIFS8   |
|             | +-GEQ-----------------+  I:052 |
|             |-|GRTR THAN OR EQUAL (A>=B)|----]/[---|
|             | |SOURCE A:   T4:28.ACC|   13   |
|             | |                    0|        |
|             | |SOURCE B:           5|        |
|             | |                    5|        |
|             | +---------------------+        |
|             |T4:28.ACC - [116]               |
|             |PIRINI                          |
|             |GUAGE 8                         |
|             |NO FAULT                        |
|             |PGNF8                           |
|             | I:054                          |
|             +---]/[--------------------------+
|                 15
```

Rung #259

```
 COMPRESSOR                                                       REGEN-
 1 REGEN-                                                         ERATION
 ERATION                                                          'OR'
 PROGRAM                                                          RGN_OR
 CYRGN1                                                           B3
     B3
 ---] [------------------------------------------------------------( )---
     321                                                          316
 [25]
             B3/316 - ] [ - File #3 CRYO_REGEN - 260
 COMPRESSOR
 2 REGEN-
 ERATION
 PROGRAM
 CYRGN2
     B3
 ---] [---
     322
 [238]
 COMPRESSOR
 3 REGEN-
 ERATION
 PROGRAM
 CYRGN3
     B3
 ---] [---
     323
 [239]
 COMPRESSOR
 4 REGEN-
 ERATION
 PROGRAM
 CYRGN4
     B3
 ---] [---
     324
 [240]
 COMPRESSOR
 5 REGEN-
 ERATION
 PROGRAM
 CYRGN5
     B3
 ---] [---
     325
 [241]
 COMPRESSOR
 6 REGEN-
 ERATION
 PROGRAM
 CYRGN6
     B3
 ---] [---
     326
 [242]
 COMPRESSOR
 7 REGEN-
 ERATION
 PROGRAM
 CYRGN7
     B3
 ---] [---
```

```
< <          <                                                                                      <
| |    327   |                                                                                      |
| |[243]     |                                                                                      |
| |COMPRESSOR|                                                                                      |
| |8 REGEN-  |                                                                                      |
| |ERATION   |                                                                                      |
| |PROGRAM   |                                                                                      |
| |CYRGN8    |                                                                                      |
| |     B3   |                                                                                      |
| |____] [___|                                                                                      |
|      328                                                                                          |
| [244]                                                                                             |
Rung #260
|        ENABLE     ENABLE     ENABLE     ENABLE     ENABLE     ENABLE     ENABLE     ENABLE                     |
|REGEN-  CRYO       CRYO       CRYO       CRYO       CRYO       CRYO       CRYO       CRYO                       |
|ERATION COMPRESSOR COMPRESSOR COMPRESSOR COMPRESSOR COMPRESSOR COMPRESSOR COMPRESSOR COMPRESSOR COOL DOWN MODE  |
|'OR'    1          2          3          4          5          6          7          8          MP2 OFF DELAY   |
|RGN_OR  CY1        CY2        CY3        CY4        CY5        CY6        CY7        CY8        CD_MP2OFF       |
|  B3      0:010      0:010      0:030      0:030      0:044      0:044      0:060      0:060    +-TON---------+ |
|--] [------] [--------] [--------] [--------] [--------] [--------] [--------] [--------] [-----|TIMER ON DELAY|-(EN)-|
|  316       04         05         04         05         04         05         04         05     |TIMER:   T4:79|      |
|[259]   [6]        [81]       [82]       [83]       [84]       [85]       [86]       [87]       |BASE (SEC): 1.0|-(DN) |
|                                                                                                |PRESET:   3600|      |
|                                                                                                |ACCUM:       0|      |
|                                                                                                +--------------+      |
T4:79.DN - -] [- - File #3 CRYO_REGEN - 261
Rung #261
|          DWELL 2    DWELL 4  DWELL 5                                          |
|          CHAMBER    CHAMBER  CHAMBER                            CRYO REGEN    |
|          ROUGH      ROUGH    ROUGH                              MECH PUMP AND |
|          VALVE RV2  VALVE    VALVE                              BLOWER 2      |
|          CLOSED     CLOSED   CLOSED                             DISABLE       |
|CD_MP2OFF RVS3      RVS5     RVS7                               CRMPBL2D      |
|  T4:79    I:022     I:036    I:052                             +-TON-----------+ |
|---] [-------] [-------] [------] [-----------------------------|TIMER ON DELAY |-(EN)-|
|    DN       15        15       14                              |TIMER:  T4:170|       |
|[260]                                                           |BASE (SEC): 0.01|-(DN)|
|                                                                |PRESET:     100|      |
|                                                                |ACCUM:        0|      |
|                                                                +---------------+      |
T4:170.TT - -] [- - File #2 MAIN_PRGRM - 91
```

Rung #262

```
PURGE TIME                                                          PURGE COMPLETE
MONITOR                                                             PRGDONE
CRYO 1                                                              TON
60 MIN                                                              TIMER ON DELAY    (EN)
DONE                                                                TIMER:    T4:130
PGC1                                                                BASE (SEC):  1.0  (DN)
T4:21                                                               PRESET:       10
DN                                                                  ACCUM:         0
[9]
         T4:130.TT - -| |- - File #2 MATH_PRGRM - 73
PURGE TIME
MONITOR
CRYO 2
120 MIN.
DONE
PGC2
T4:22
DN
[110]
PURGE TIME
MONITOR
CRYO 3
120 MIN.
DONE
PGC3
T4:23
DN
[111]
PURGE TIME
MONITOR
CRYO 4
120 MIN
DONE
PGC4
T4:24
DN
[112]
PURGE TIME
MONITOR
CRYO 5
120 MIN
DONE
PGC5
T4:25
DN
[113]
PURGE TIME
MONITOR
CRYO 6
120 MIN
DONE
PGC6
T4:26
DN
[114]
PURGE TIME
```

```
< <            <
| |MONITOR     |
| |CRYO 7      |
| |120 MIN     |
| |DONE        |
| |PGC7        |
| |   T4:27    |
| |----] [----|
| |     DN     |
| |[115]       |
| |PURGE TIME  |
| |MONITOR     |
| |CRYO 8      |
| |120 MIN     |
| |DONE        |
| |PGC8        |
| |   T4:28    |
| |----] [----|
|       DN
|  [116]
```

Rung #263

S_TRAP_1 T4:341 TT [1]
S_TRAP_2 T4:342 TT [35]
S_TRAP_3 T4:343 TT [39]
S_TRAP_4 T4:344 TT [43]
S_TRAP_5 T4:345 TT [47]
S_TRAP_6 T4:346 TT [54]
S_TRAP_7 T4:347 TT [58]
S_TRAP_8 T4:348 TT [64]

B3/125 - -| |- - File #2 MAIN_PRGRM - 73

SIEVE TRAP MECH PUMP ENABLE SVMPEN B3 ( ) 125

Rung #264

S_TRAP_1 T4:341 -|/|- TT [1]
S_TRAP_2 T4:342 -|/|- TT [35]
S_TRAP_3 T4:343 -|/|- TT [39]
S_TRAP_4 T4:344 -|/|- TT [43]
S_TRAP_5 T4:345 -|/|- TT [47]
S_TRAP_6 T4:346 -|/|- TT [54]
S_TRAP_7 T4:347 -|/|- TT [58]
S_TRAP_8 T4:348 -|/|- TT [64]

SIEVE MECHANICA PUMP DISABLE PULSE SMPDP B3 [ONS] 175

SIEVE TRAP MECH PUMP DISABLE SVMPDIS B3 ( ) 102

B3/102 - -| |- - File #2 MAIN_PRGRM - 91
-( )- - File #3 CRYO_REGEN - 264

Rung #265

RETURN FROM RETURN CONVEYOR TO MAIN PROGRAM RTN_MAIN
RET
RETURN ()
>>>>>>>>>>>>>>>> >

- 575 -
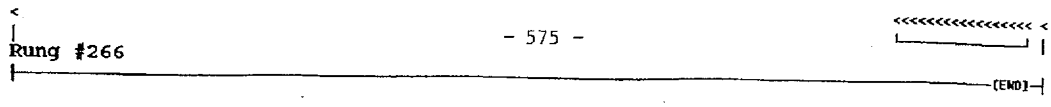

COPYRIGHT 1989, 1990, 1991
CONNER PERIPHERALS, INC.
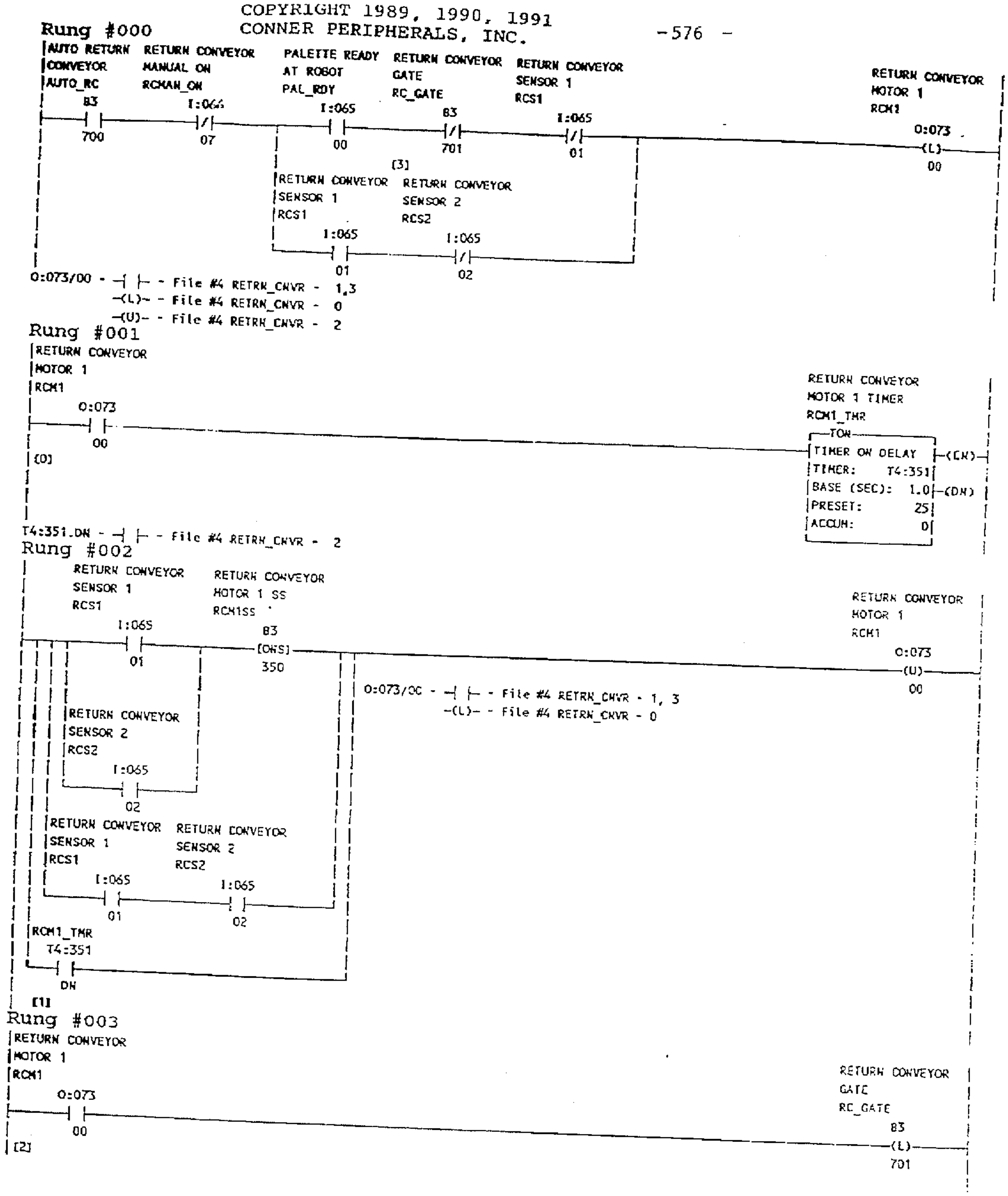

```
B3/701 - -| |- - File #4 RETRN_CNVR - 4
         -|/|- - File #4 RETRN_CNVR - 0
         -(L)- - File #4 RETRN_CNVR - 3
         -(U)- - File #4 RETRN_CNVR - 5
Rung #004
|RETURN CONVEYOR                                              RETURN CONVEYOR
|GATE                                                         GATE TIMER
|RC_GATE                                                      RC_GATE_TMRA
|   B3                                                        +--TON-----------+
|---| |-------------------------------------------------------|TIMER ON DELAY  |-(EN)-
|   701                                                       |TIMER:    T4:350|
|[3]                                                          |BASE (SEC):  1.0|-(DN)
|                                                             |PRESET:       25|
|                                                             |ACCUM:         0|
T4:350.DN - -| |- - File #4 RETRN_CNVR - 5                   +----------------+
Rung #005
|
|RC_GATE_THRA                                                 RETURN CONVEYOR
|   T4:350                                                    GATE
|---| |-------------------------------------------------------RC_GATE
|   DN                                                          B3
|[4]                                                          -(U)-
B3/701 - -| |- - File #4 RETRN_CNVR - 4                         701
         -|/|- - File #4 RETRN_CNVR - 0
         -(L)- - File #4 RETRN_CNVR - 3
         -(U)- - File #4 RETRN_CNVR - 5
Rung #006
|AUTO RETURN   RETURN CONVEYOR  RETURN CONVEYOR
|CONVEYOR      SENSOR 1         SENSOR 2                      RETURN CONVEYOR
|AUTO_RC       RCS1             RCS2                          MOTOR 2
|   B3              I:065            I:065                    RCM2
|---| |-------+-----| |--------------|/|---+--------------------0:073
|   700       |      01               02   |                  -(L)-
|             |                            | 0:073/01 - -| |- - File #4 RETRN_CNVR - 7   01
|             |                            |          -(U)- - File #4 RETRN_CNVR - 8
|             |RETURN CONVEYOR  RETURN CONVEYOR
|             |SENSOR 2         SENSOR 3
|             |RCS2             RCS3
|             |     I:065            I:065 |
|             +-----| |--------------|/|---+
|                   02               03
Rung #007
|RETURN CONVEYOR
|MOTOR 2                                                      RETURN CONVEYOR
|RCM2                                                         MOTOR 2 TIMER
|   0:073                                                     RCM2_TMR
|---| |-------------------------------------------------------+--TON-----------+
|   01                                                        |TIMER ON DELAY  |-(EN)-
|[6]                                                          |TIMER:    T4:352|
|                                                             |BASE (SEC):  1.0|-(DN)
|                                                             |PRESET:       25|
T4:352.DN - -| |- - File #4 RETRN_CNVR - 8                   |ACCUM:         0|
                                                              +----------------+
```

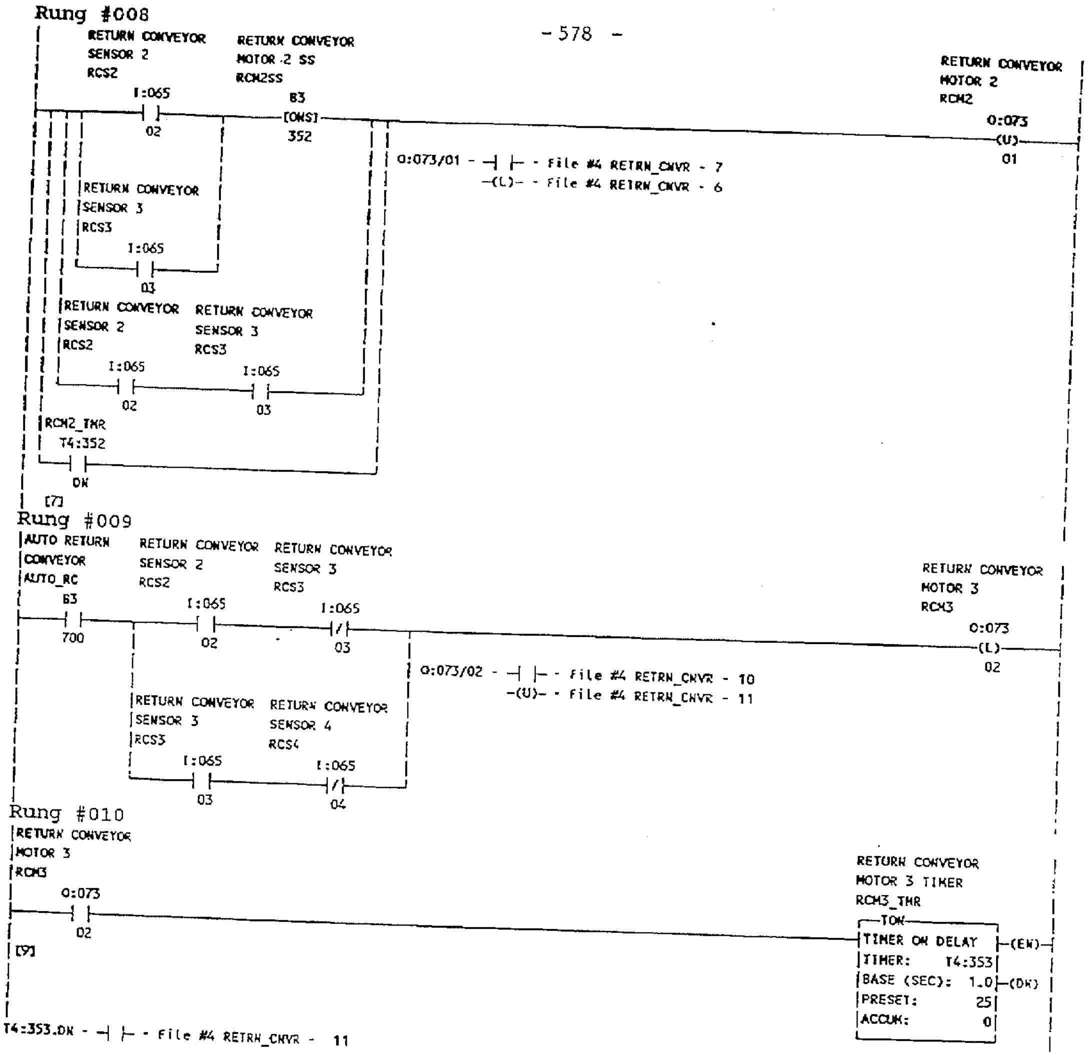
Rung #008
RETURN CONVEYOR SENSOR 2 RCS2
I:065
02
RETURN CONVEYOR MOTOR 2 SS RCM2SS
B3
[ONS]
352
RETURN CONVEYOR MOTOR 2 RCM2
O:073
(U)
01
O:073/01 - ] [ - File #4 RETRN_CNVR - 7
-(L)- - File #4 RETRN_CNVR - 6
RETURN CONVEYOR SENSOR 3 RCS3
I:065
03
RETURN CONVEYOR SENSOR 2 RCS2
I:065
02
RETURN CONVEYOR SENSOR 3 RCS3
I:065
03
RCM2_TMR
T4:352
DN
[7]
Rung #009
AUTO RETURN CONVEYOR AUTO_RC
B3
700
RETURN CONVEYOR SENSOR 2 RCS2
I:065
02
RETURN CONVEYOR SENSOR 3 RCS3
I:065
03
RETURN CONVEYOR MOTOR 3 RCM3
O:073
(L)
02
O:073/02 - ] [ - File #4 RETRN_CNVR - 10
-(U)- - File #4 RETRN_CNVR - 11
RETURN CONVEYOR SENSOR 3 RCS3
I:065
03
RETURN CONVEYOR SENSOR 4 RCS4
I:065
04
Rung #010
RETURN CONVEYOR MOTOR 3 RCM3
O:073
02
[9]
RETURN CONVEYOR MOTOR 3 TIMER RCM3_TMR
TON
TIMER ON DELAY
TIMER: T4:353
BASE (SEC): 1.0
PRESET: 25
ACCUM: 0
(EN)
(DN)
T4:353.DN - ] [ - File #4 RETRN_CNVR - 11

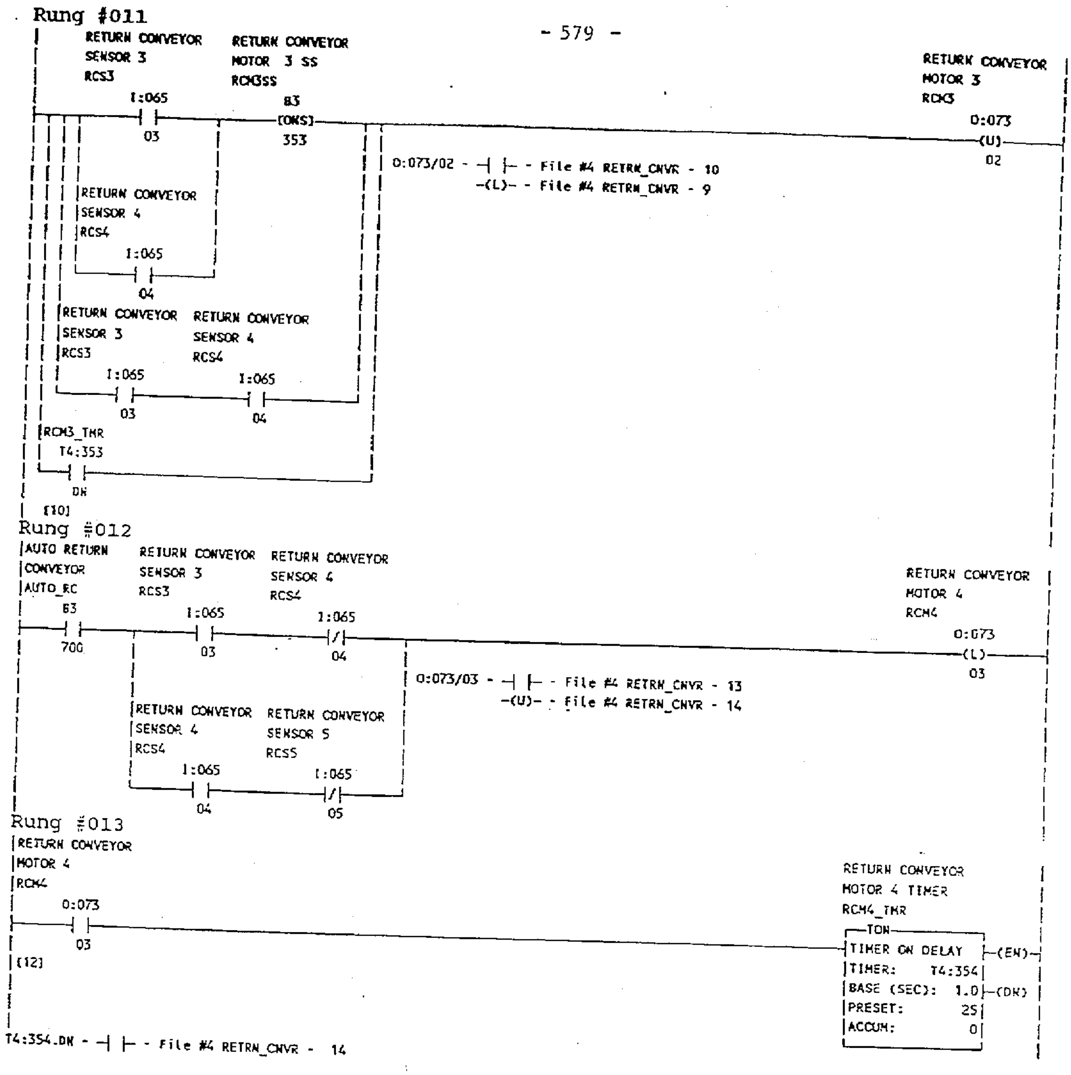
- 579 -
Rung #011
RETURN CONVEYOR SENSOR 3 RCS3
I:065
03
RETURN CONVEYOR MOTOR 3 SS RCM3SS
B3
[ONS]
353
RETURN CONVEYOR MOTOR 3 RCM3
O:073
(U)
02
O:073/02 - ┤ ├ - - File #4 RETRN_CNVR - 10
-(L)- - File #4 RETRN_CNVR - 9
RETURN CONVEYOR SENSOR 4 RCS4
I:065
04
RETURN CONVEYOR SENSOR 3 RCS3
I:065
03
RETURN CONVEYOR SENSOR 4 RCS4
I:065
04
RCM3_TMR
T4:353
DN
[10]
Rung #012
AUTO RETURN CONVEYOR AUTO_RC
B3
700
RETURN CONVEYOR SENSOR 3 RCS3
I:065
03
RETURN CONVEYOR SENSOR 4 RCS4
I:065
04
RETURN CONVEYOR MOTOR 4 RCM4
O:073
(L)
03
O:073/03 - ┤ ├ - - File #4 RETRN_CNVR - 13
-(U)- - File #4 RETRN_CNVR - 14
RETURN CONVEYOR SENSOR 4 RCS4
I:065
04
RETURN CONVEYOR SENSOR 5 RCS5
I:065
05
Rung #013
RETURN CONVEYOR MOTOR 4 RCM4
O:073
03
[12]
RETURN CONVEYOR MOTOR 4 TIMER RCM4_TMR
TON
TIMER ON DELAY
TIMER: T4:354
BASE (SEC): 1.0
PRESET: 25
ACCUM: 0
(EN)
(DN)
T4:354.DN - ┤ ├ - - File #4 RETRN_CNVR - 14

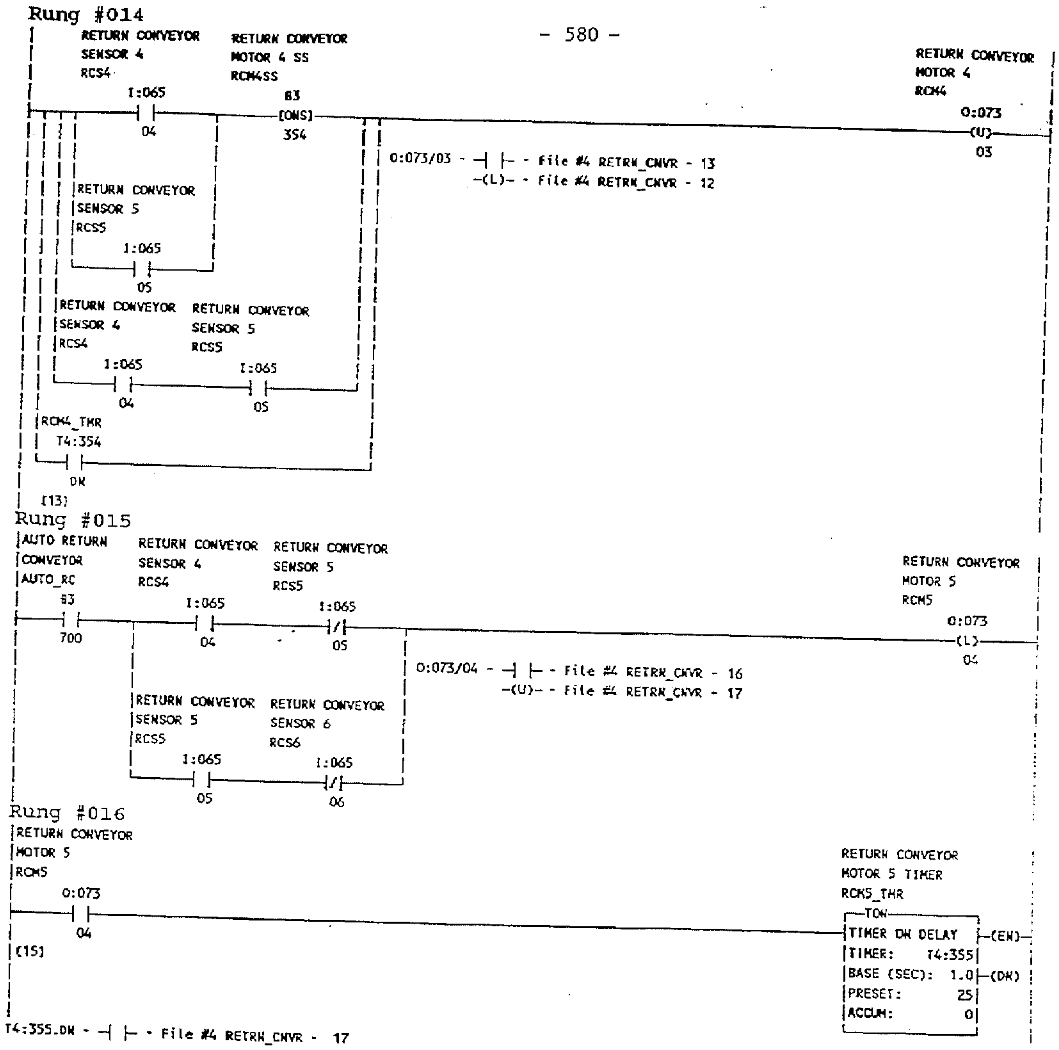
Rung #014
RETURN CONVEYOR SENSOR 4 RCS4
I:065
04
RETURN CONVEYOR MOTOR 4 SS RCM4SS
B3
[ONS]
354
RETURN CONVEYOR MOTOR 4 RCM4
O:073
(U)
03
O:073/03 - ┤ ├ - File #4 RETRN_CNVR - 13
-(L)- - File #4 RETRN_CNVR - 12
RETURN CONVEYOR SENSOR 5 RCS5
I:065
05
RETURN CONVEYOR SENSOR 4 RCS4
I:065
04
RETURN CONVEYOR SENSOR 5 RCS5
I:065
05
RCM4_TMR
T4:354
DN
(13)
Rung #015
AUTO RETURN CONVEYOR AUTO_RC
B3
700
RETURN CONVEYOR SENSOR 4 RCS4
I:065
04
RETURN CONVEYOR SENSOR 5 RCS5
I:065
05
RETURN CONVEYOR MOTOR 5 RCM5
O:073
(L)
04
O:073/04 - ┤ ├ - File #4 RETRN_CNVR - 16
-(U)- - File #4 RETRN_CNVR - 17
RETURN CONVEYOR SENSOR 5 RCS5
I:065
05
RETURN CONVEYOR SENSOR 6 RCS6
I:065
06
Rung #016
RETURN CONVEYOR MOTOR 5 RCM5
O:073
04
(15)
RETURN CONVEYOR MOTOR 5 TIMER RCM5_TMR
TON
TIMER ON DELAY
TIMER: T4:355
BASE (SEC): 1.0
PRESET: 25
ACCUM: 0
(EN)
(DN)
T4:355.DN - ┤ ├ - File #4 RETRN_CNVR - 17

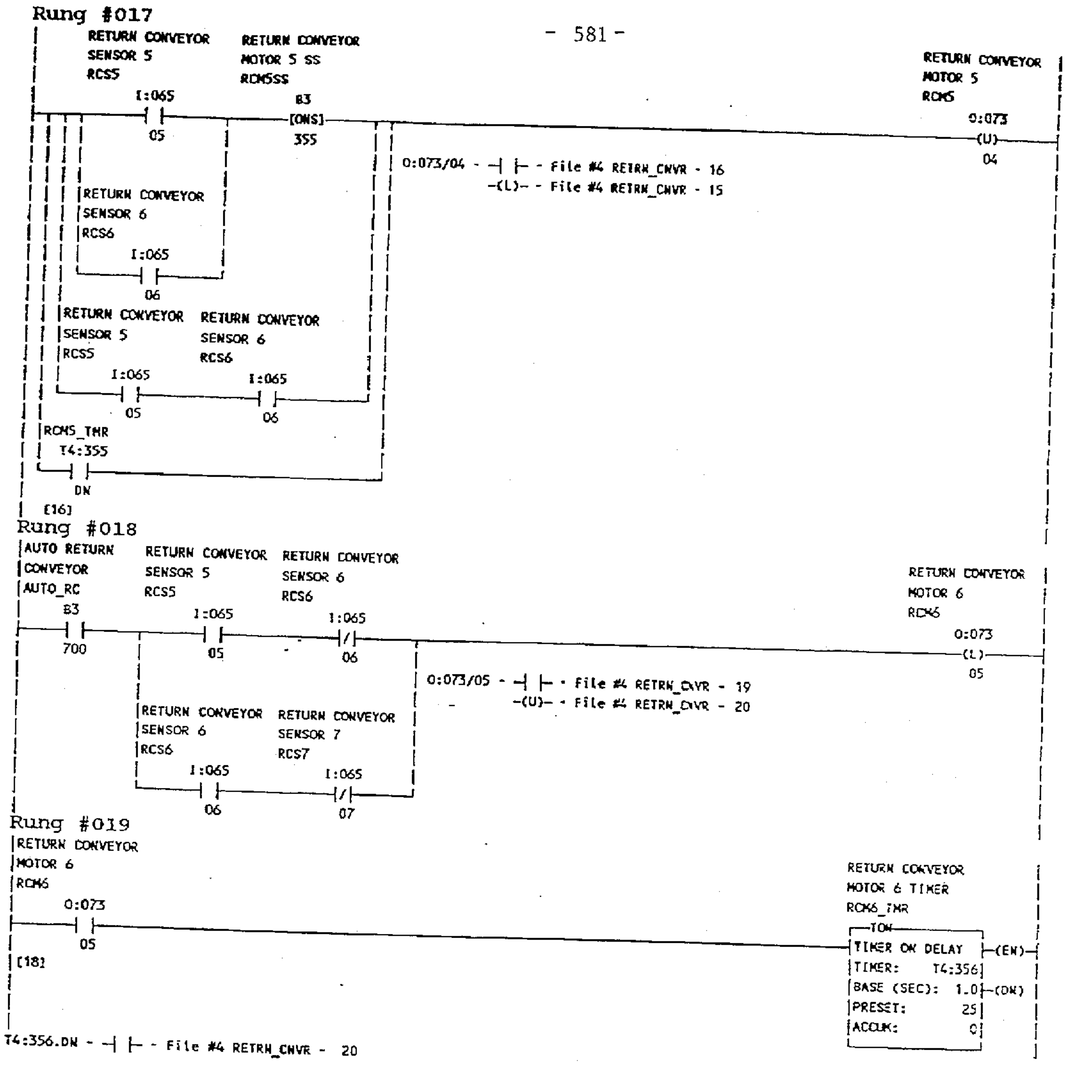
Rung #017
RETURN CONVEYOR SENSOR 5 RCS5
I:065
05
RETURN CONVEYOR MOTOR 5 SS RCM5SS
B3
[ONS]
355
RETURN CONVEYOR MOTOR 5 RCM5
O:073
(U)
04
O:073/04 - ┤ ├ - File #4 RETRN_CNVR - 16
-(L)- - File #4 RETRN_CNVR - 15
RETURN CONVEYOR SENSOR 6 RCS6
I:065
06
RETURN CONVEYOR SENSOR 5 RCS5
I:065
05
RETURN CONVEYOR SENSOR 6 RCS6
I:065
06
RCM5_TMR
T4:355
DN
[16]
Rung #018
AUTO RETURN CONVEYOR AUTO_RC
B3
700
RETURN CONVEYOR SENSOR 5 RCS5
I:065
05
RETURN CONVEYOR SENSOR 6 RCS6
I:065
06
RETURN CONVEYOR MOTOR 6 RCM6
O:073
(L)
05
O:073/05 - ┤ ├ - File #4 RETRN_CNVR - 19
-(U)- - File #4 RETRN_CNVR - 20
RETURN CONVEYOR SENSOR 6 RCS6
I:065
06
RETURN CONVEYOR SENSOR 7 RCS7
I:065
07
Rung #019
RETURN CONVEYOR MOTOR 6 RCM6
O:073
05
[18]
RETURN CONVEYOR MOTOR 6 TIMER RCM6_TMR
TON
TIMER ON DELAY
(EN)
TIMER: T4:356
BASE (SEC): 1.0
(DN)
PRESET: 25
ACCUM: 0
T4:356.DN - ┤ ├ - File #4 RETRN_CNVR - 20

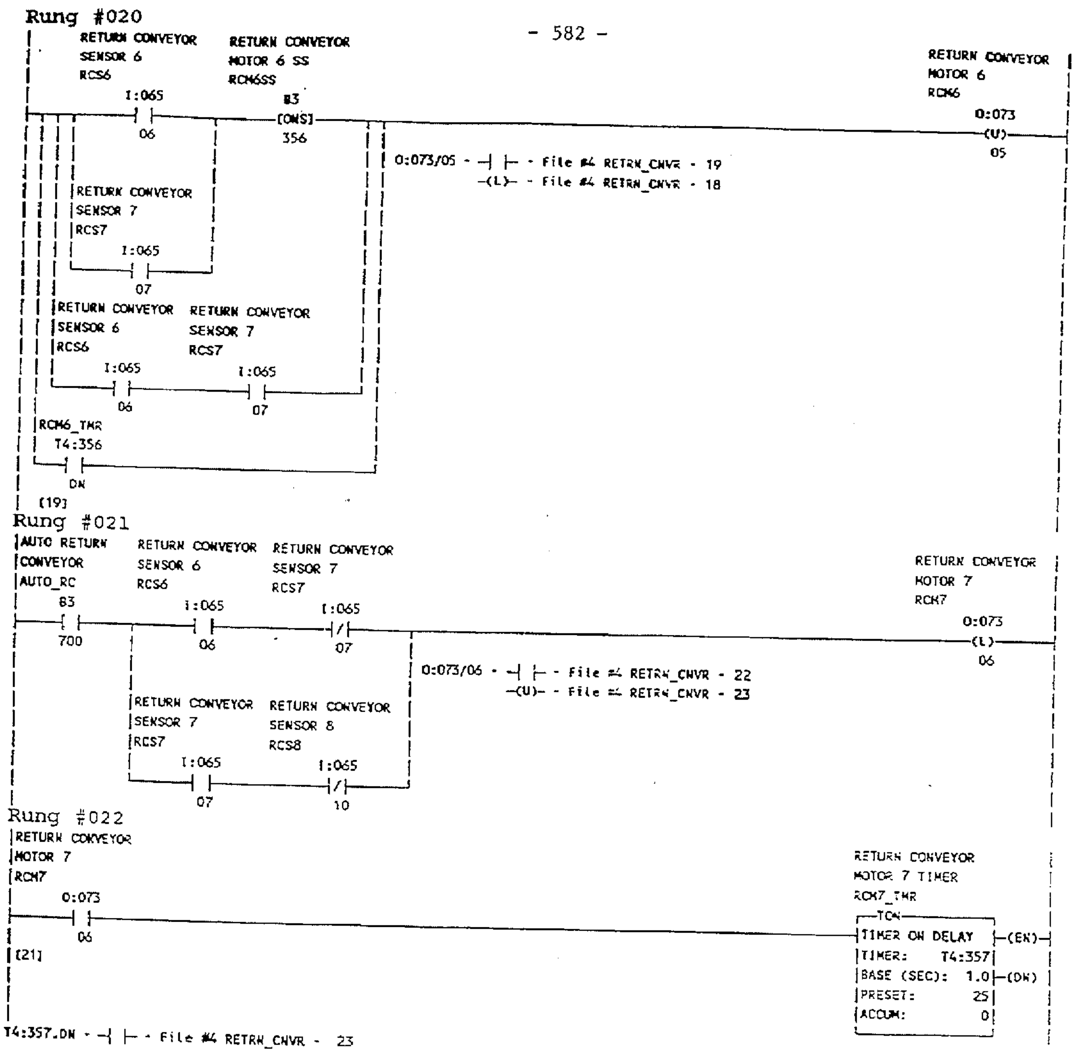
Rung #020
- 582 -
RETURN CONVEYOR
SENSOR 6
RCS6
I:065
06
RETURN CONVEYOR
MOTOR 6 SS
RCM6SS
B3
[OWS]
356
RETURN CONVEYOR
MOTOR 6
RCM6
O:073
(U)
05
O:073/05 - ] [ - File #4 RETRN_CNVR - 19
-(L)- - File #4 RETRN_CNVR - 18
RETURN CONVEYOR
SENSOR 7
RCS7
I:065
07
RETURN CONVEYOR
SENSOR 6
RCS6
I:065
06
RETURN CONVEYOR
SENSOR 7
RCS7
I:065
07
RCM6_TMR
T4:356
DN
(19)
Rung #021
AUTO RETURN
CONVEYOR
AUTO_RC
B3
700
RETURN CONVEYOR
SENSOR 6
RCS6
I:065
06
RETURN CONVEYOR
SENSOR 7
RCS7
I:065
07
RETURN CONVEYOR
MOTOR 7
RCM7
O:073
(L)
06
O:073/06 - ] [ - File #4 RETRN_CNVR - 22
-(U)- - File #4 RETRN_CNVR - 23
RETURN CONVEYOR
SENSOR 7
RCS7
I:065
07
RETURN CONVEYOR
SENSOR 8
RCS8
I:065
10
Rung #022
RETURN CONVEYOR
MOTOR 7
RCM7
O:073
06
(21)
RETURN CONVEYOR
MOTOR 7 TIMER
RCM7_TMR
TON
TIMER ON DELAY
(EN)
TIMER: T4:357
BASE (SEC): 1.0
(DN)
PRESET: 25
ACCUM: 0
T4:357.DN - ] [ - File #4 RETRN_CNVR - 23

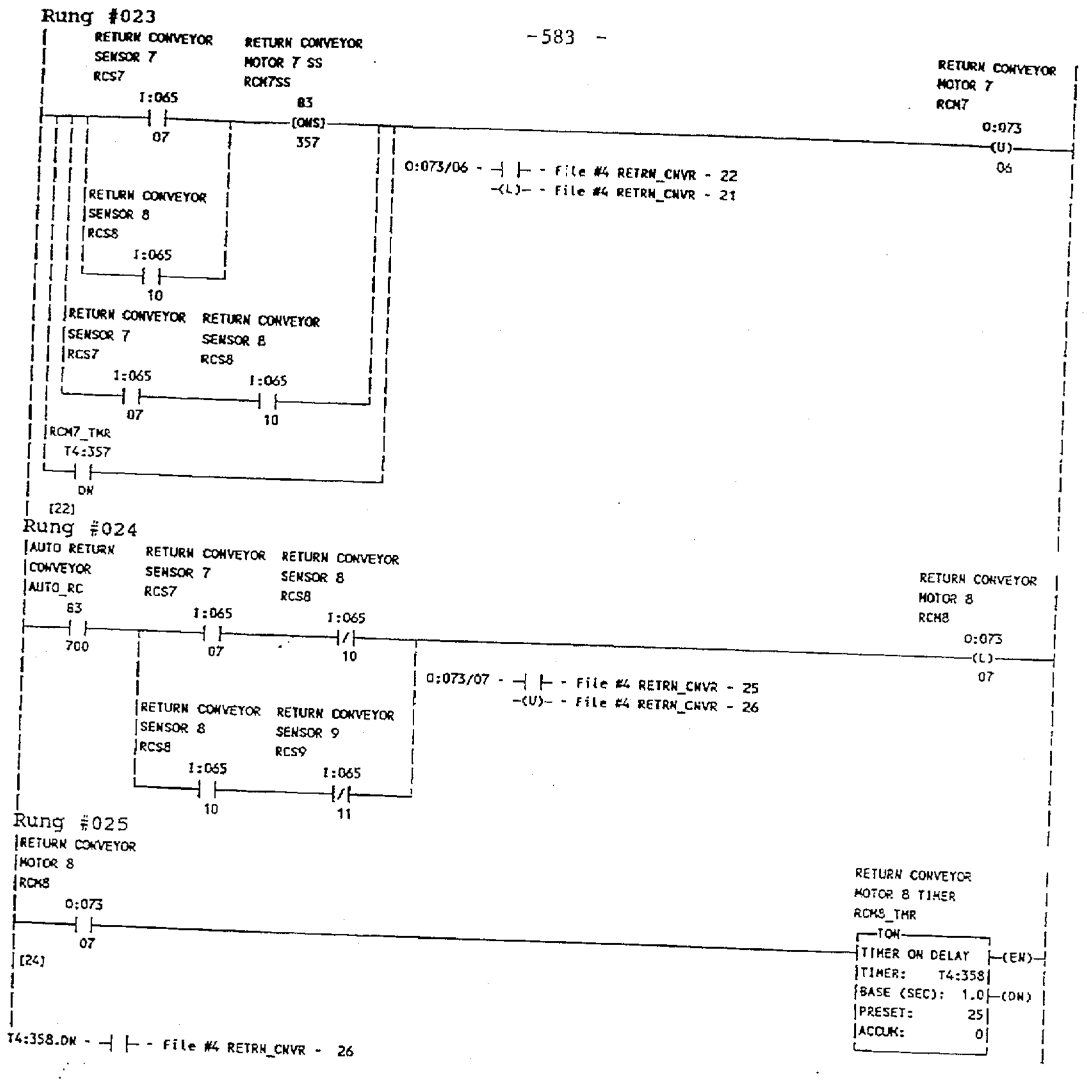
Rung #023
-583 -
RETURN CONVEYOR SENSOR 7 RCS7
I:065
07
RETURN CONVEYOR MOTOR 7 SS RCM7SS
B3
[ONS]
357
RETURN CONVEYOR MOTOR 7 RCM7
O:073
(U)
06
O:073/06 - ┤ ├ - File #4 RETRN_CNVR - 22
-(L)- - File #4 RETRN_CNVR - 21
RETURN CONVEYOR SENSOR 8 RCS8
I:065
10
RETURN CONVEYOR SENSOR 7 RCS7
I:065
07
RETURN CONVEYOR SENSOR 8 RCS8
I:065
10
RCM7_TMR
T4:357
DN
[22]
Rung #024
AUTO RETURN CONVEYOR AUTO_RC
B3
700
RETURN CONVEYOR SENSOR 7 RCS7
I:065
07
RETURN CONVEYOR SENSOR 8 RCS8
I:065
10
RETURN CONVEYOR MOTOR 8 RCM8
O:073
(L)
07
O:073/07 - ┤ ├ - File #4 RETRN_CNVR - 25
-(U)- - File #4 RETRN_CNVR - 26
RETURN CONVEYOR SENSOR 8 RCS8
I:065
10
RETURN CONVEYOR SENSOR 9 RCS9
I:065
11
Rung #025
RETURN CONVEYOR MOTOR 8 RCM8
O:073
07
[24]
RETURN CONVEYOR MOTOR 8 TIMER RCM8_TMR
TON
TIMER ON DELAY
TIMER: T4:358
BASE (SEC): 1.0
PRESET: 25
ACCUM: 0
(EN)
(DN)
T4:358.DN - ┤ ├ - File #4 RETRN_CNVR - 26

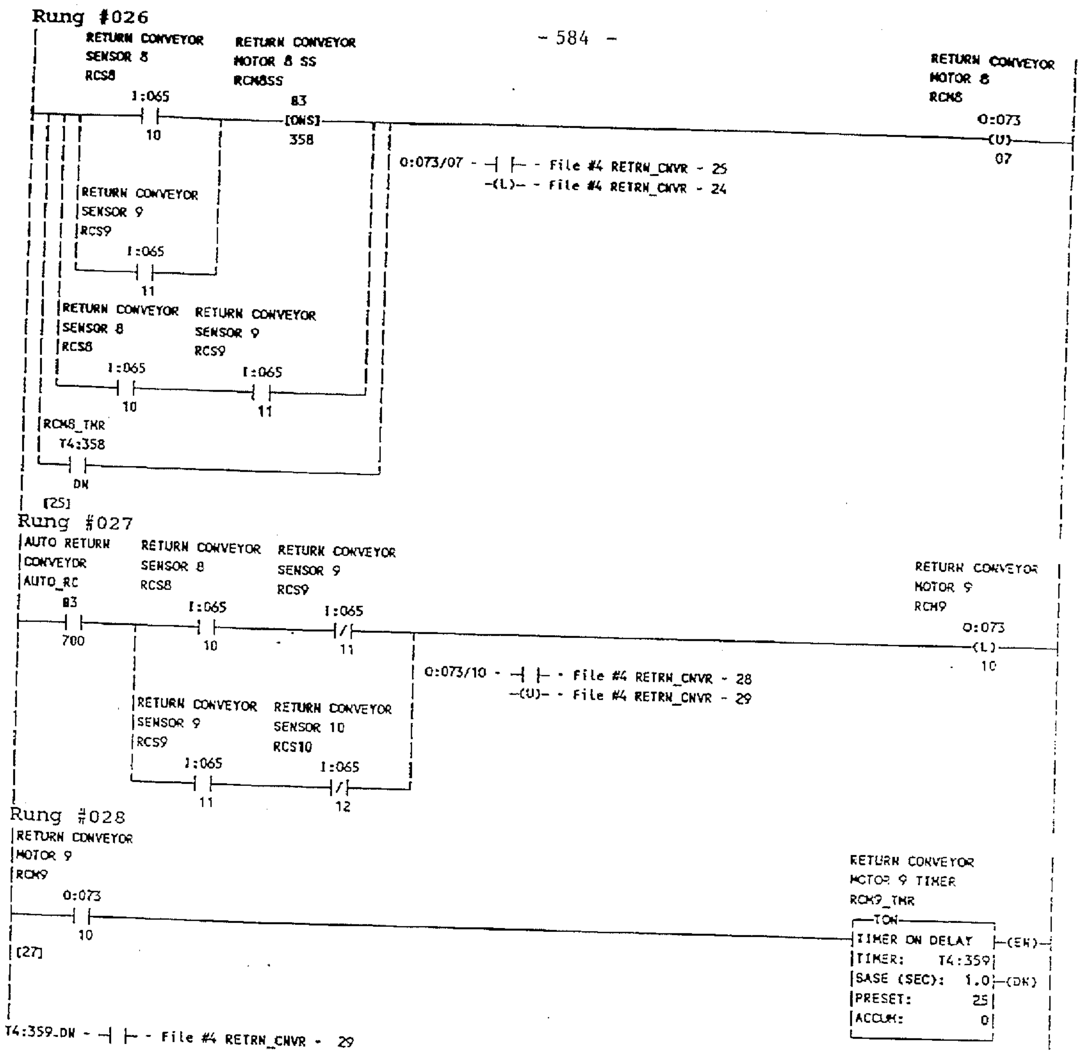
Rung #026
RETURN CONVEYOR SENSOR 8 RCS8
I:065 10
RETURN CONVEYOR MOTOR 8 SS RCM8SS
B3 [ONS] 358
RETURN CONVEYOR MOTOR 8 RCM8
O:073 (U) 07
O:073/07 - ┤ ├ - File #4 RETRN_CNVR - 25
-(L)- - File #4 RETRN_CNVR - 24
RETURN CONVEYOR SENSOR 9 RCS9
I:065 11
RETURN CONVEYOR SENSOR 8 RCS8
I:065 10
RETURN CONVEYOR SENSOR 9 RCS9
I:065 11
RCM8_TMR T4:358 DN
[25]
Rung #027
AUTO RETURN CONVEYOR AUTO_RC
B3 700
RETURN CONVEYOR SENSOR 8 RCS8
I:065 10
RETURN CONVEYOR SENSOR 9 RCS9
I:065 11
RETURN CONVEYOR MOTOR 9 RCM9
O:073 (L) 10
O:073/10 - ┤ ├ - File #4 RETRN_CNVR - 28
-(U)- - File #4 RETRN_CNVR - 29
RETURN CONVEYOR SENSOR 9 RCS9
I:065 11
RETURN CONVEYOR SENSOR 10 RCS10
I:065 12
Rung #028
RETURN CONVEYOR MOTOR 9 RCM9
O:073 10
[27]
RETURN CONVEYOR MOTOR 9 TIMER RCM9_TMR
TON
TIMER ON DELAY (EN)
TIMER: T4:359
BASE (SEC): 1.0 (DN)
PRESET: 25
ACCUM: 0
T4:359.DN - ┤ ├ - File #4 RETRN_CNVR - 29

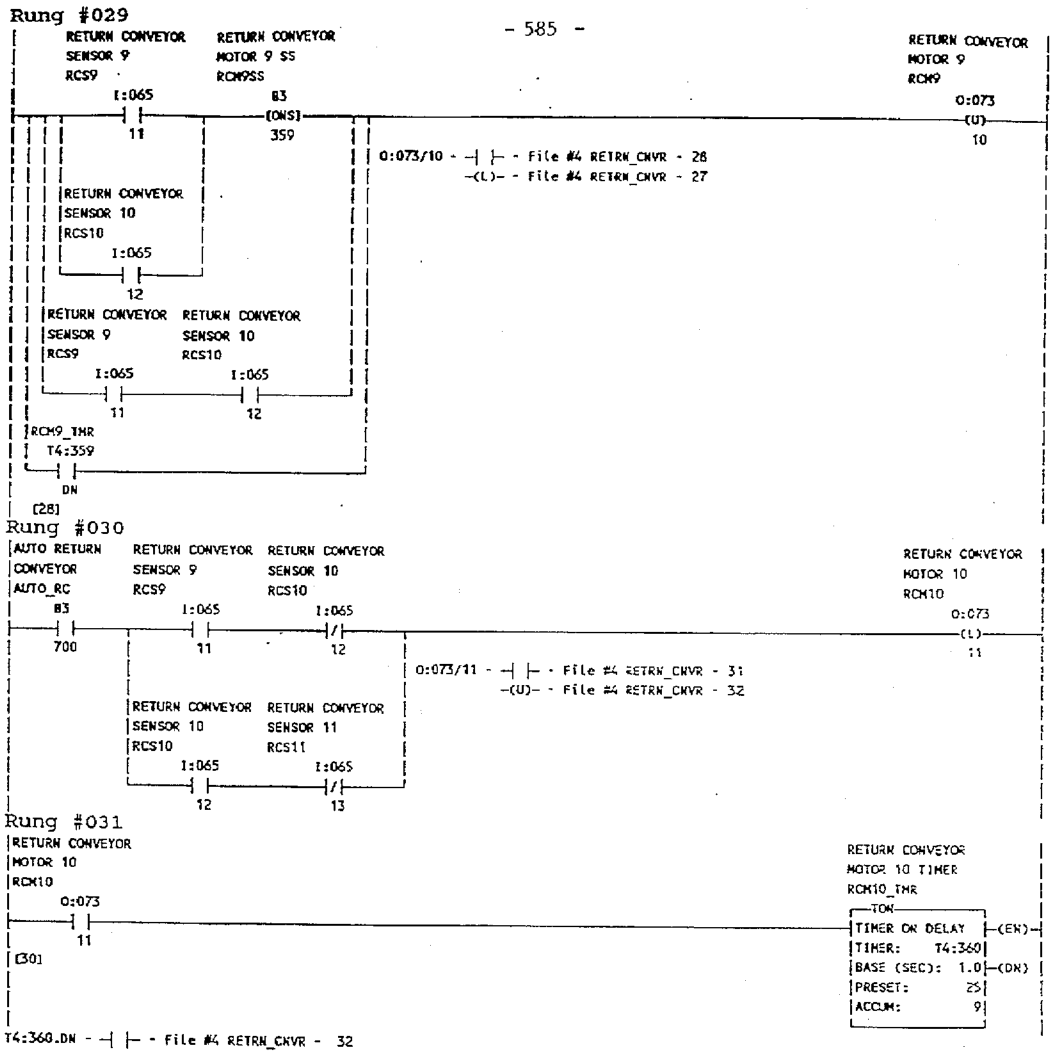
Rung #029
RETURN CONVEYOR SENSOR 9 RCS9
I:065
11
RETURN CONVEYOR MOTOR 9 SS RCM9SS
B3
[ONS]
359
RETURN CONVEYOR MOTOR 9 RCM9
O:073
(U)
10
O:073/10 - ┤ ├ - File #4 RETRN_CNVR - 28
-(L)- - File #4 RETRN_CNVR - 27
RETURN CONVEYOR SENSOR 10 RCS10
I:065
12
RETURN CONVEYOR SENSOR 9 RCS9
I:065
11
RETURN CONVEYOR SENSOR 10 RCS10
I:065
12
RCM9_TMR
T4:359
DN
[28]
Rung #030
AUTO RETURN CONVEYOR AUTO_RC
B3
700
RETURN CONVEYOR SENSOR 9 RCS9
I:065
11
RETURN CONVEYOR SENSOR 10 RCS10
I:065
12
RETURN CONVEYOR MOTOR 10 RCM10
O:073
(L)
11
O:073/11 - ┤ ├ - File #4 RETRN_CNVR - 31
-(U)- - File #4 RETRN_CNVR - 32
RETURN CONVEYOR SENSOR 10 RCS10
I:065
12
RETURN CONVEYOR SENSOR 11 RCS11
I:065
13
Rung #031
RETURN CONVEYOR MOTOR 10 RCM10
O:073
11
[30]
RETURN CONVEYOR MOTOR 10 TIMER RCM10_TMR
TON
TIMER ON DELAY
TIMER: T4:360
BASE (SEC): 1.0
PRESET: 25
ACCUM: 9
(EN)
(DN)
T4:360.DN - ┤ ├ - File #4 RETRN_CNVR - 32

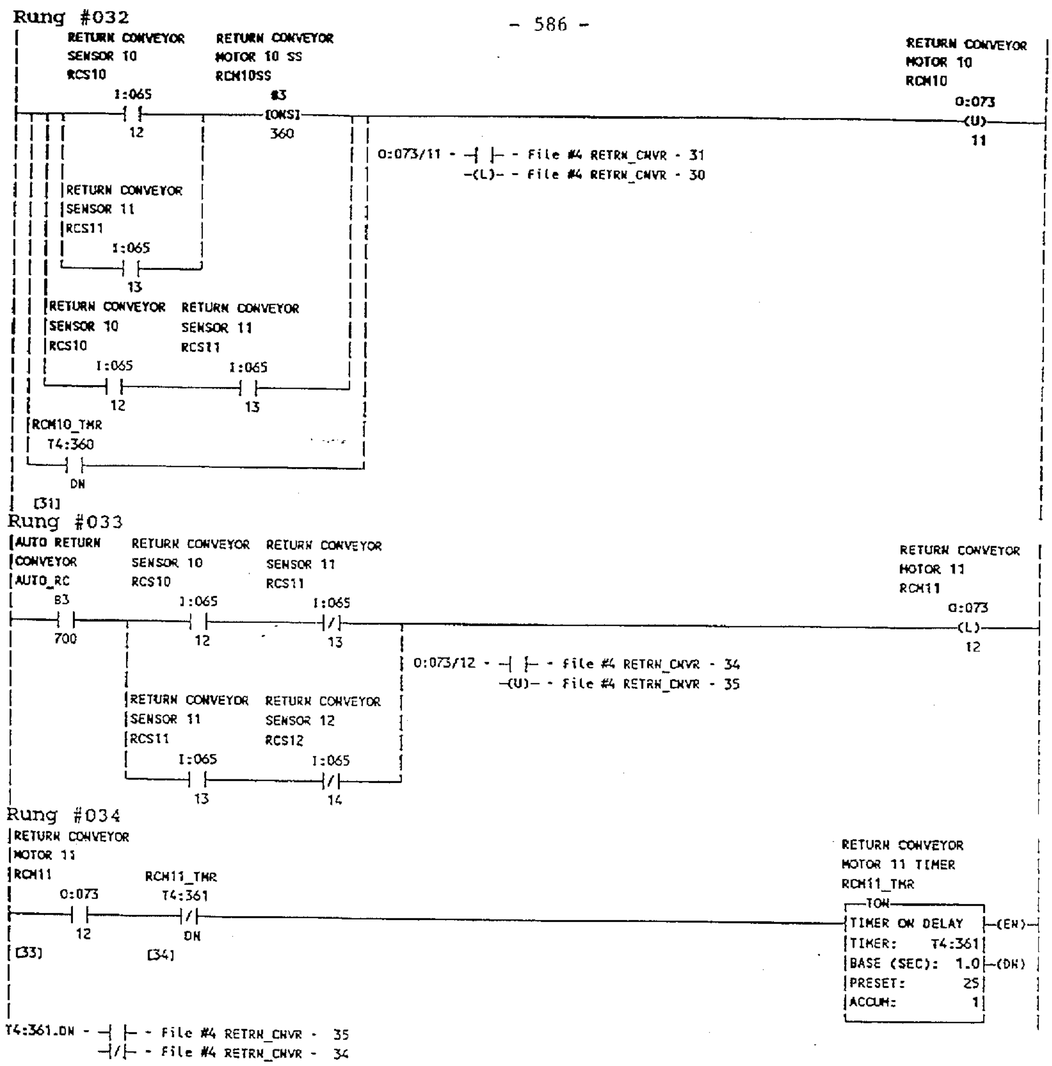
Rung #032
RETURN CONVEYOR SENSOR 10 RCS10
I:065
12
RETURN CONVEYOR MOTOR 10 SS RCM10SS
#3
[ONS]
360
RETURN CONVEYOR SENSOR 11 RCS11
I:065
13
RETURN CONVEYOR SENSOR 10 RCS10
I:065
12
RETURN CONVEYOR SENSOR 11 RCS11
I:065
13
RCM10_TMR T4:360
DN
[31]
O:073/11 - ┤ ├ - File #4 RETRN_CNVR - 31
-(L)- - File #4 RETRN_CNVR - 30
RETURN CONVEYOR MOTOR 10 RCM10
O:073
(U)
11
Rung #033
AUTO RETURN CONVEYOR AUTO_RC
B3
700
RETURN CONVEYOR SENSOR 10 RCS10
I:065
12
RETURN CONVEYOR SENSOR 11 RCS11
I:065
13
RETURN CONVEYOR SENSOR 11 RCS11
I:065
13
RETURN CONVEYOR SENSOR 12 RCS12
I:065
14
O:073/12 - ┤ ├ - File #4 RETRN_CNVR - 34
-(U)- - File #4 RETRN_CNVR - 35
RETURN CONVEYOR MOTOR 11 RCM11
O:073
(L)
12
Rung #034
RETURN CONVEYOR MOTOR 11 RCM11
O:073
12
[33]
RCM11_TMR T4:361
DN
[34]
RETURN CONVEYOR MOTOR 11 TIMER RCM11_TMR
TON
TIMER ON DELAY
TIMER: T4:361
BASE (SEC): 1.0
PRESET: 25
ACCUM: 1
(EN)
(DN)
T4:361.DN - ┤ ├ - File #4 RETRN_CNVR - 35
┤/├ - File #4 RETRN_CNVR - 34

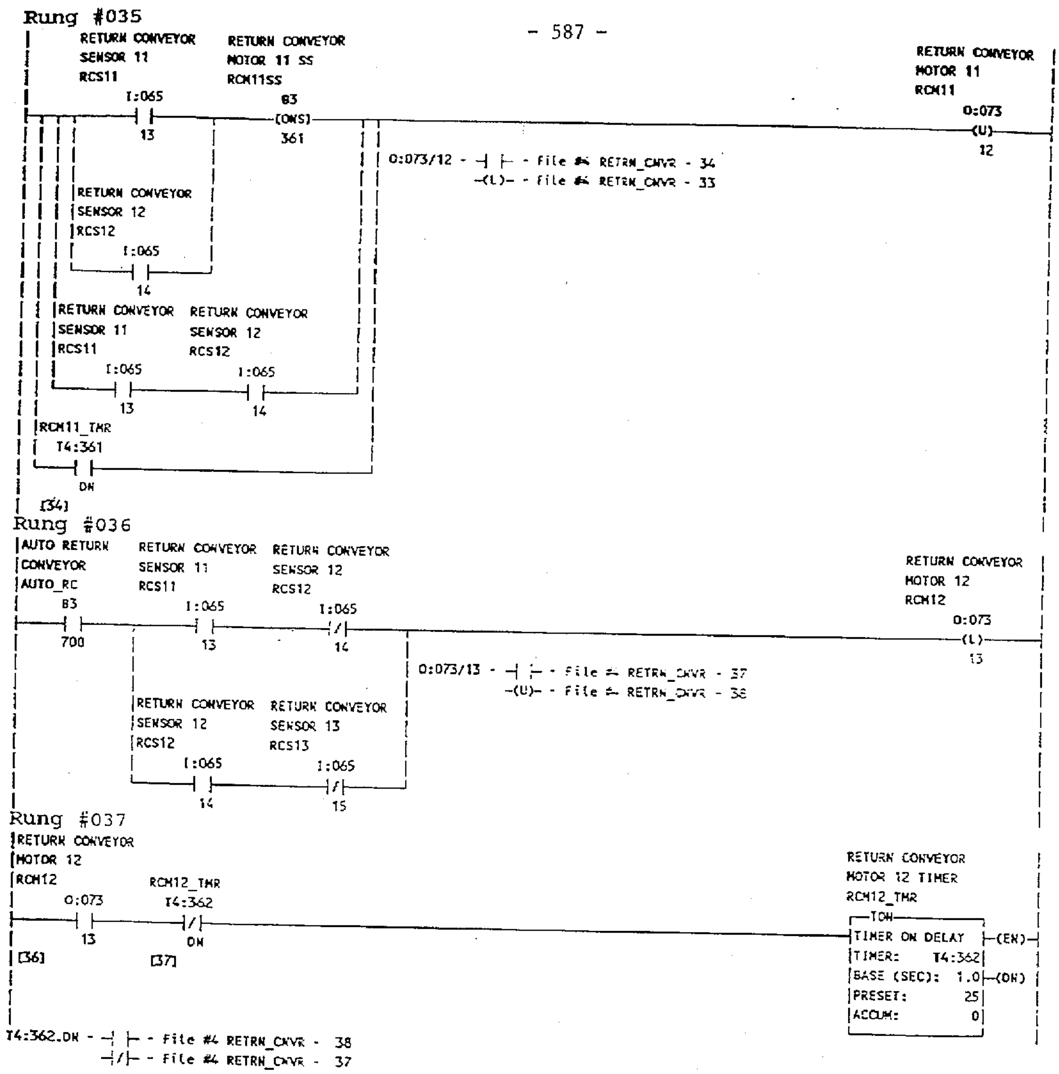
- 587 -
Rung #035
RETURN CONVEYOR
SENSOR 11
RCS11
I:065
13
RETURN CONVEYOR
MOTOR 11 SS
RCM11SS
B3
[ONS]
361
RETURN CONVEYOR
MOTOR 11
RCM11
O:073
(U)
12
O:073/12 - ┤ ├ - File #4 RETRN_CNVR - 34
-(L)- - File #4 RETRN_CNVR - 33
RETURN CONVEYOR
SENSOR 12
RCS12
I:065
14
RETURN CONVEYOR
SENSOR 11
RCS11
I:065
13
RETURN CONVEYOR
SENSOR 12
RCS12
I:065
14
RCM11_TMR
T4:361
DN
[34]
Rung #036
AUTO RETURN
CONVEYOR
AUTO_RC
B3
700
RETURN CONVEYOR
SENSOR 11
RCS11
I:065
13
RETURN CONVEYOR
SENSOR 12
RCS12
I:065
14
RETURN CONVEYOR
MOTOR 12
RCM12
O:073
(L)
13
O:073/13 - ┤ ├ - File #4 RETRN_CNVR - 37
-(U)- - File #4 RETRN_CNVR - 38
RETURN CONVEYOR
SENSOR 12
RCS12
I:065
14
RETURN CONVEYOR
SENSOR 13
RCS13
I:065
15
Rung #037
RETURN CONVEYOR
MOTOR 12
RCM12
O:073
13
[36]
RCM12_TMR
T4:362
DN
[37]
RETURN CONVEYOR
MOTOR 12 TIMER
RCM12_TMR
TON
TIMER ON DELAY
(EN)
TIMER: T4:362
BASE (SEC): 1.0
(DN)
PRESET: 25
ACCUM: 0
T4:362.DN - ┤ ├ - File #4 RETRN_CNVR - 38
┤/├ - File #4 RETRN_CNVR - 37

Rung #038

RETURN CONVEYOR SENSOR 12 RCS12 I:065 14
RETURN CONVEYOR MOTOR 12 SS RCM12SS 83 [ONS] 362
RETURN CONVEYOR MOTOR 12 RCM12 O:073 (U) 13

RETURN CONVEYOR SENSOR 13 RCS13 I:065 15

RETURN CONVEYOR SENSOR 12 RCS12 I:065 14
RETURN CONVEYOR SENSOR 13 RCS13 I:065 15

RCM12_TMR T4:362 DN

O:073/13 - ┤ ├ - File #4 RETRN_CNVR - 37
-(L)- - File #4 RETRN_CNVR - 36

[37]

Rung #039

AUTO RETURN CONVEYOR AUTO_RC 83 700
RETURN CONVEYOR SENSOR 12 RCS12 I:065 14
RETURN CONVEYOR SENSOR 13 RCS13 I:065 /15
RETURN CONVEYOR MOTOR 13 RCM13 O:073 (L) 14

RETURN CONVEYOR SENSOR 13 RCS13 I:065 15
RETURN CONVEYOR SENSOR 14 RCS14 I:065 /16

O:073/14 - ┤ ├ - File #4 RETRN_CNVR - 40
-(U)- - File #4 RETRN_CNVR - 41

Rung #040

RETURN CONVEYOR MOTOR 13 RCM13 O:073 14

RETURN CONVEYOR MOTOR 13 TIMER RCM13_TMR

TON
TIMER ON DELAY (EN)
TIMER: T4:363
BASE (SEC): 1.0 (DN)
PRESET: 25
ACCUM: 0

[39]

T4:363.DN - ┤ ├ - File #4 RETRN_CNVR - 41

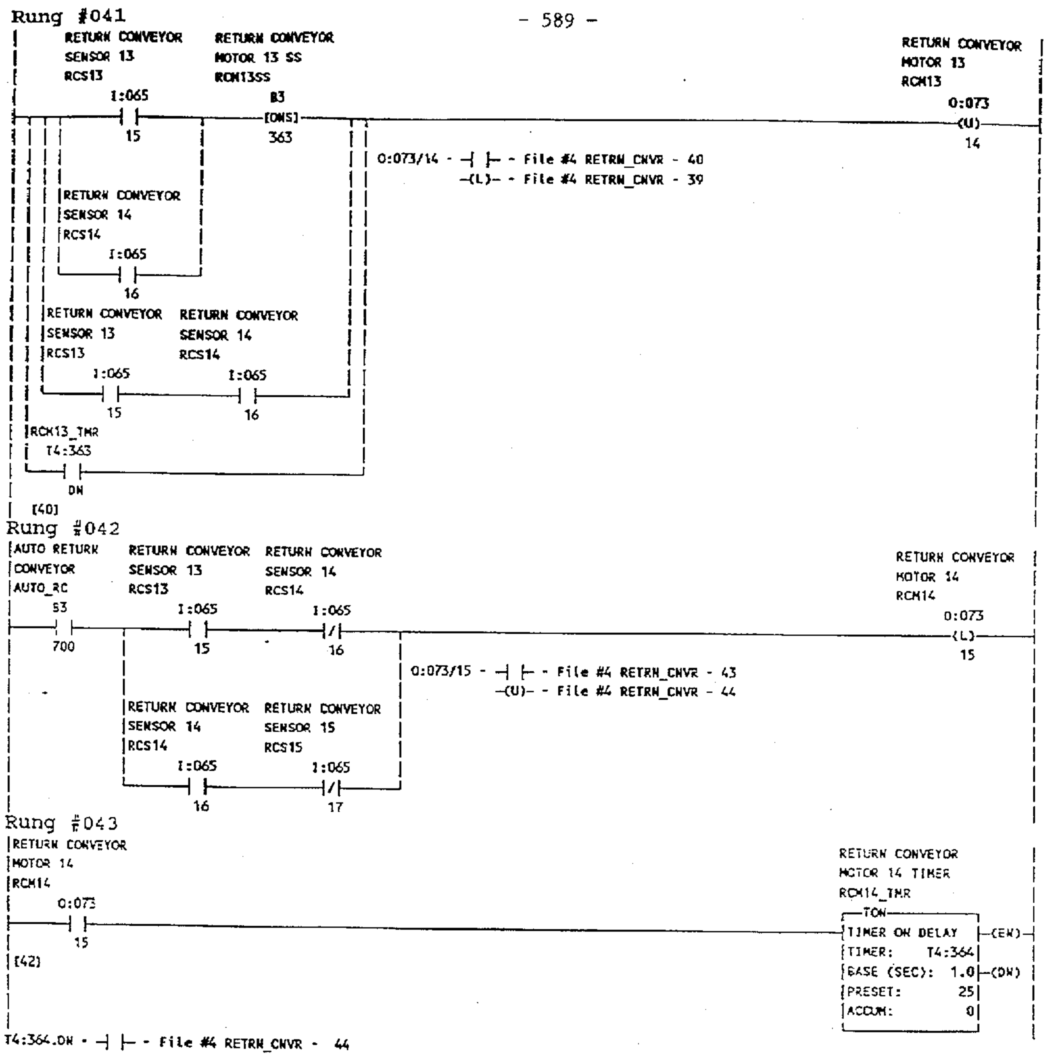
Rung #041
RETURN CONVEYOR SENSOR 13 RCS13
I:065
15
RETURN CONVEYOR MOTOR 13 SS RCM13SS
B3
[ONS]
363
RETURN CONVEYOR MOTOR 13 RCM13
0:073
(U)
14
0:073/14 - ┤ ├ - File #4 RETRN_CNVR - 40
-(L)- - File #4 RETRN_CNVR - 39
RETURN CONVEYOR SENSOR 14 RCS14
I:065
16
RETURN CONVEYOR SENSOR 13 RCS13
I:065
15
RETURN CONVEYOR SENSOR 14 RCS14
I:065
16
RCM13_TMR
T4:363
DN
[40]
Rung #042
AUTO RETURN CONVEYOR AUTO_RC
B3
700
RETURN CONVEYOR SENSOR 13 RCS13
I:065
15
RETURN CONVEYOR SENSOR 14 RCS14
I:065
16
RETURN CONVEYOR MOTOR 14 RCM14
0:073
(L)
15
0:073/15 - ┤ ├ - File #4 RETRN_CNVR - 43
-(U)- - File #4 RETRN_CNVR - 44
RETURN CONVEYOR SENSOR 14 RCS14
I:065
16
RETURN CONVEYOR SENSOR 15 RCS15
I:065
17
Rung #043
RETURN CONVEYOR MOTOR 14 RCM14
0:073
15
[42]
RETURN CONVEYOR MOTOR 14 TIMER RCM14_TMR
TON
TIMER ON DELAY
TIMER: T4:364
BASE (SEC): 1.0
PRESET: 25
ACCUM: 0
(EN)
(DN)
T4:364.DN - ┤ ├ - File #4 RETRN_CNVR - 44

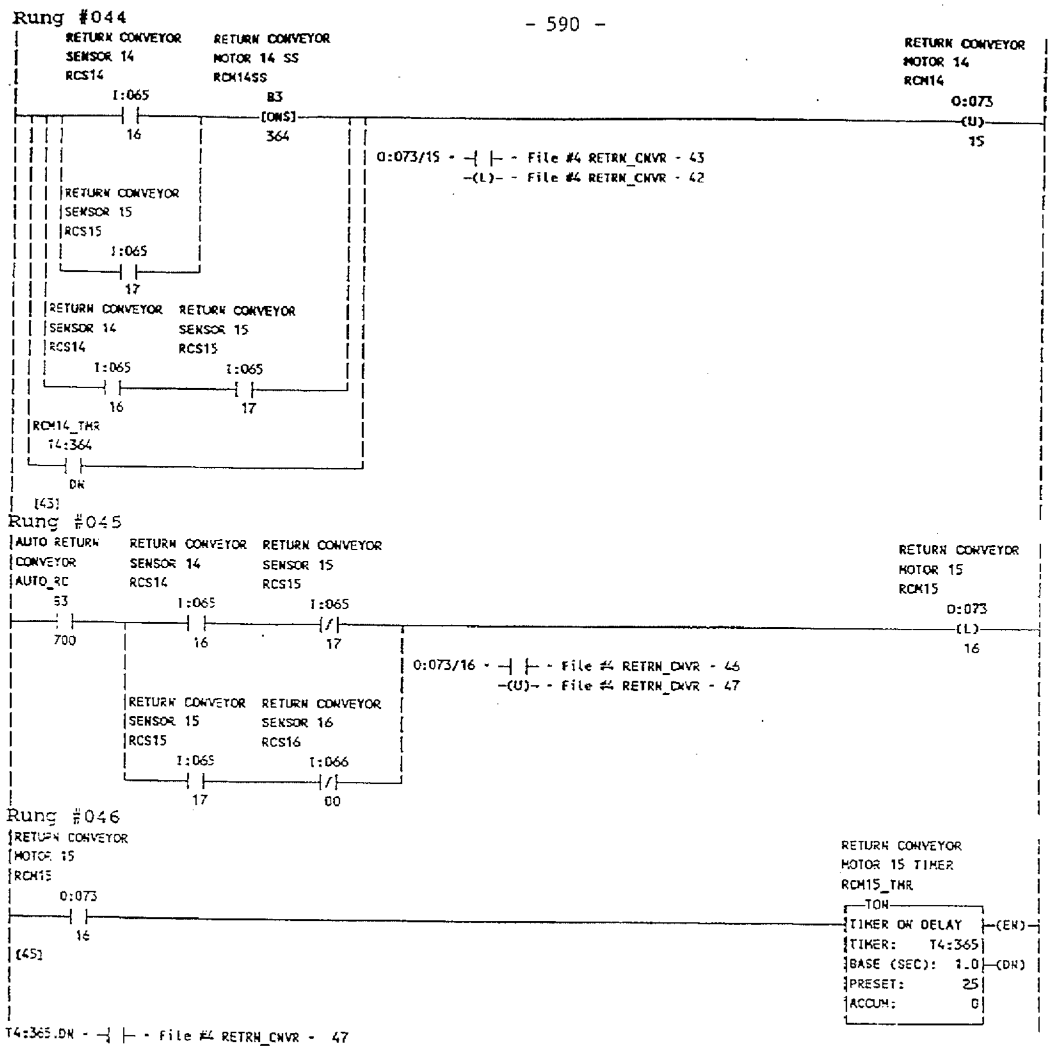
Rung #044
RETURN CONVEYOR SENSOR 14 RCS14
I:065
16
RETURN CONVEYOR MOTOR 14 SS RCM14SS
B3
[ONS]
364
RETURN CONVEYOR MOTOR 14 RCM14
O:073
(U)
15
O:073/15 - ┤ ├ - File #4 RETRN_CNVR - 43
-(L)- - File #4 RETRN_CNVR - 42
RETURN CONVEYOR SENSOR 15 RCS15
I:065
17
RETURN CONVEYOR SENSOR 14 RCS14
I:065
16
RETURN CONVEYOR SENSOR 15 RCS15
I:065
17
RCM14_THR
T4:364
DN
[43]
Rung #045
AUTO RETURN CONVEYOR AUTO_RC
B3
700
RETURN CONVEYOR SENSOR 14 RCS14
I:065
16
RETURN CONVEYOR SENSOR 15 RCS15
I:065
17
RETURN CONVEYOR MOTOR 15 RCM15
O:073
(L)
16
O:073/16 - ┤ ├ - File #4 RETRN_CNVR - 46
-(U)- - File #4 RETRN_CNVR - 47
RETURN CONVEYOR SENSOR 15 RCS15
I:065
17
RETURN CONVEYOR SENSOR 16 RCS16
I:066
00
Rung #046
RETURN CONVEYOR MOTOR 15 RCM15
O:073
16
[45]
RETURN CONVEYOR MOTOR 15 TIMER RCM15_THR
TON
TIMER ON DELAY
TIMER: T4:365
BASE (SEC): 1.0
PRESET: 25
ACCUM: 0
(EN)
(DN)
T4:365.DN - ┤ ├ - File #4 RETRN_CNVR - 47

Rung #047

```
RETURN CONVEYOR  RETURN CONVEYOR                                RETURN CONVEYOR
SENSOR 15        MOTOR 15 SS                                    MOTOR 15
RCS15            RCM15SS                                        RCM15
I:065            B3                                             O:073
--] [------------[ONS]----------------------------------------------(U)--
  17             365                                              16
                         O:073/16 - ] [ - File #4 RETRN_CNVR - 46
                                  -(L)- - File #4 RETRN_CNVR - 45
RETURN CONVEYOR
SENSOR 16
RCS16
I:066
--] [--
  00
RETURN CONVEYOR  RETURN CONVEYOR
SENSOR 15        SENSOR 16
RCS15            RCS16
I:065            I:066
--] [------------] [--
  17              00
RCM15_TMR
T4:365
--] [--
  DN
[46]
```

Rung #048

```
AUTO RETURN  RETURN CONVEYOR  RETURN CONVEYOR                   RETURN CONVEYOR
CONVEYOR     SENSOR 15        SENSOR 16                         MOTOR 16
AUTO_RC      RCS15            RCS16                             RCM16
B3           I:065            I:066                             O:073
--] [--------] [--------------]/[-------------------------------------(L)--
  700          17               00                                    17
                           O:073/17 - ] [ - File #4 RETRN_CNVR - 49
                                    -(U)- - File #4 RETRN_CNVR - 50
             RETURN CONVEYOR  RETURN CONVEYOR
             SENSOR 16        SENSOR 17
             RCS16            RCS17
             I:066            I:066
             --] [------------]/[--
               00               01
```

Rung #049

```
RETURN CONVEYOR                                  RETURN CONVEYOR
MOTOR 16                                         MOTOR 16 TIMER
RCM16                                            RCM16_TMR
O:073                                            +-TON-----------------+
--] [--------------------------------------------+TIMER ON DELAY       +-(EN)-
  17                                             |TIMER:       T4:366  |
[48]                                             |BASE (SEC):     1.0  +-(DN)
                                                 |PRESET:          25  |
                                                 |ACCUM:            0  |
                                                 +---------------------+

T4:366.DN - ] [ - File #4 RETRN_CNVR - 50
```

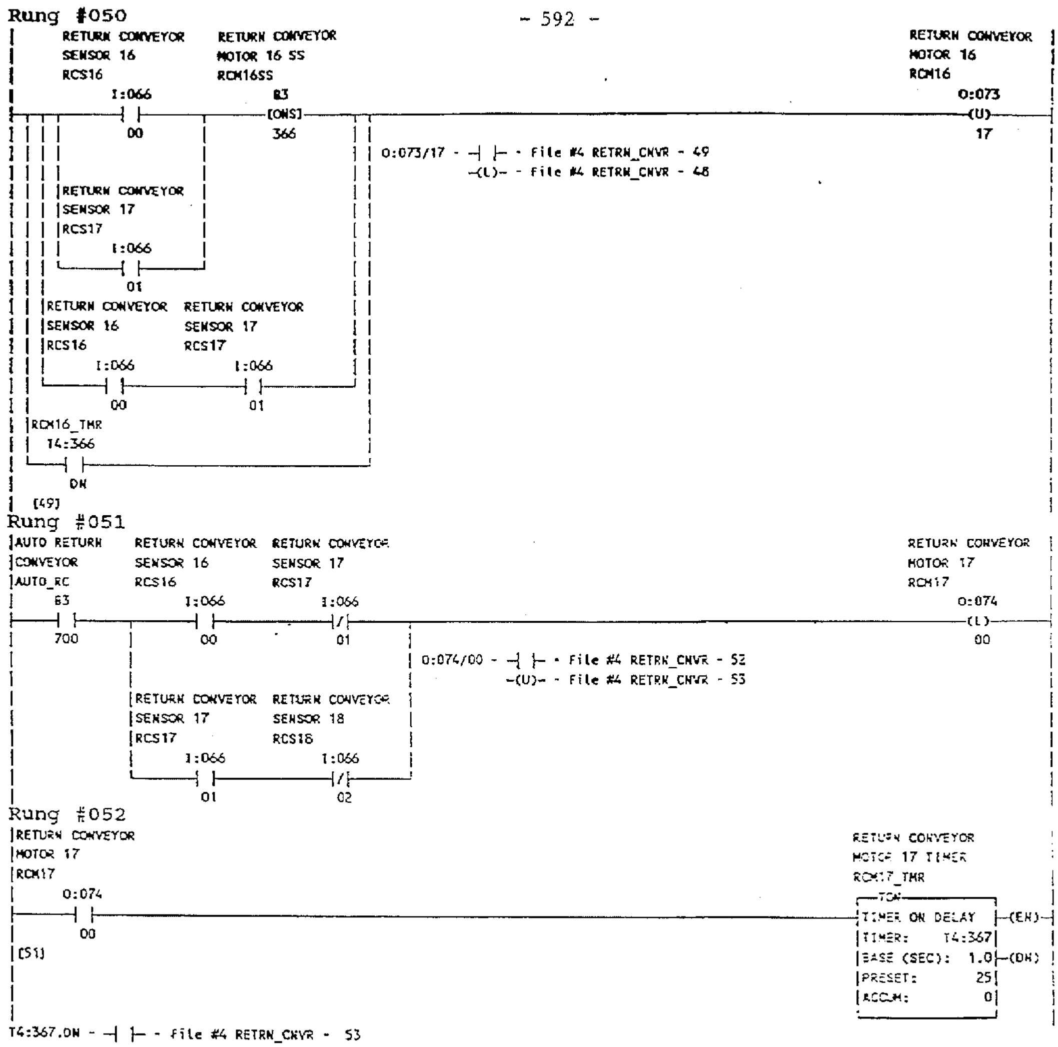
Rung #050
RETURN CONVEYOR SENSOR 16 RCS16
RETURN CONVEYOR MOTOR 16 SS RCM16SS
RETURN CONVEYOR MOTOR 16 RCM16
I:066
00
B3
[ONS]
366
0:073
(U)
17
0:073/17 - -] [- - File #4 RETRN_CNVR - 49
-(L)- - File #4 RETRN_CNVR - 48
RETURN CONVEYOR SENSOR 17 RCS17
I:066
01
RETURN CONVEYOR SENSOR 16 RCS16
RETURN CONVEYOR SENSOR 17 RCS17
I:066
00
I:066
01
RCM16_THR
T4:366
DN
(49)
Rung #051
AUTO RETURN CONVEYOR AUTO_RC
RETURN CONVEYOR SENSOR 16 RCS16
RETURN CONVEYOR SENSOR 17 RCS17
RETURN CONVEYOR MOTOR 17 RCM17
B3
700
I:066
00
I:066
01
0:074
(L)
00
0:074/00 - -] [- - File #4 RETRN_CNVR - 52
-(U)- - File #4 RETRN_CNVR - 53
RETURN CONVEYOR SENSOR 17 RCS17
RETURN CONVEYOR SENSOR 18 RCS18
I:066
01
I:066
02
Rung #052
RETURN CONVEYOR MOTOR 17 RCM17
0:074
00
(51)
RETURN CONVEYOR MOTOR 17 TIMER RCM17_THR
TON
TIMER ON DELAY
TIMER: T4:367
BASE (SEC): 1.0
PRESET: 25
ACCUM: 0
(EN)
(DN)
T4:367.DN - -] [- - File #4 RETRN_CNVR - 53

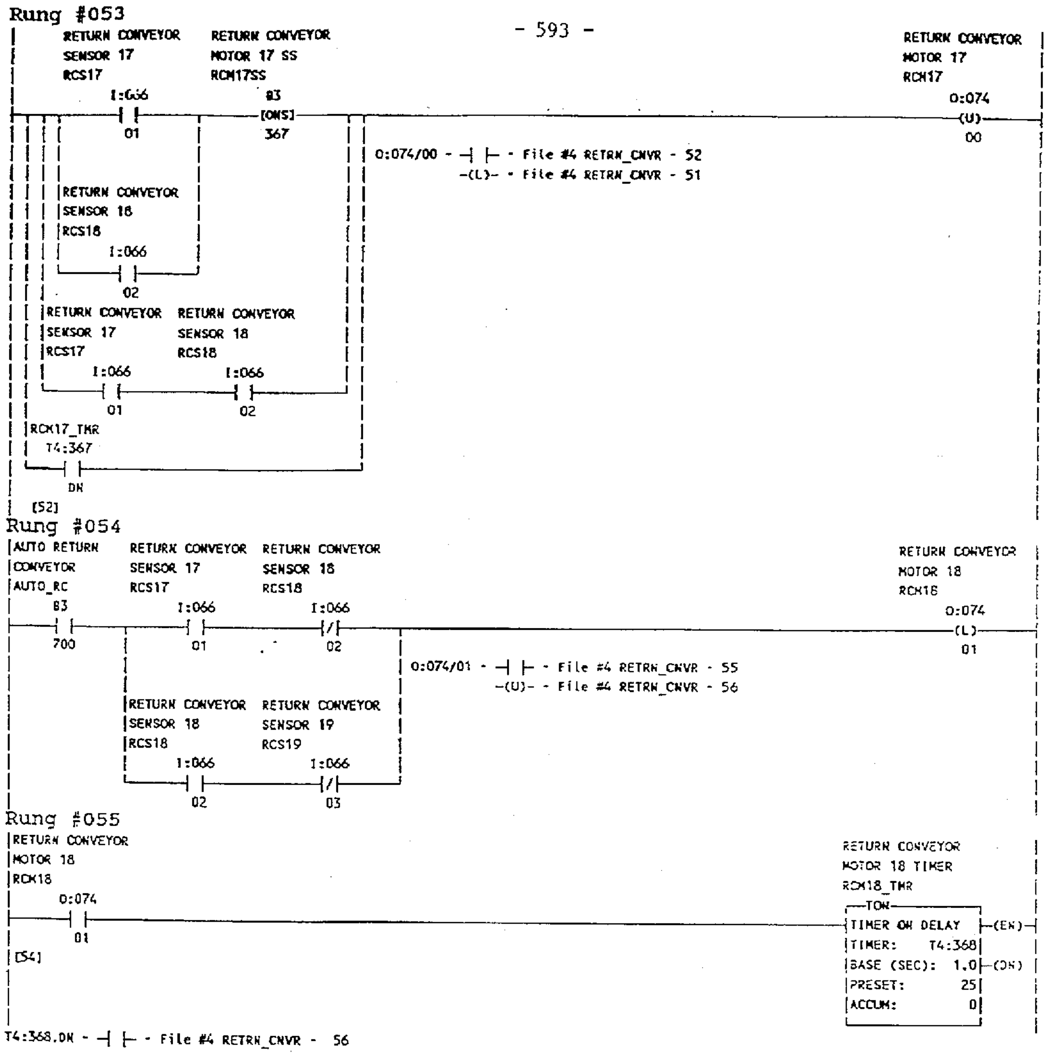
Rung #053
RETURN CONVEYOR SENSOR 17 RCS17
I:066 01
RETURN CONVEYOR MOTOR 17 SS RCM17SS
B3 [ONS] 367
RETURN CONVEYOR MOTOR 17 RCM17
O:074 (U) 00
0:074/00 - ┤ ├ - File #4 RETRN_CNVR - 52
-(L)- - File #4 RETRN_CNVR - 51
RETURN CONVEYOR SENSOR 18 RCS18
I:066 02
RETURN CONVEYOR SENSOR 17 RCS17
I:066 01
RETURN CONVEYOR SENSOR 18 RCS18
I:066 02
RCM17_TMR T4:367 DN
[52]
Rung #054
AUTO RETURN CONVEYOR AUTO_RC
B3 700
RETURN CONVEYOR SENSOR 17 RCS17
I:066 01
RETURN CONVEYOR SENSOR 18 RCS18
I:066 02
RETURN CONVEYOR MOTOR 18 RCM18
O:074 (L) 01
O:074/01 - ┤ ├ - File #4 RETRN_CNVR - 55
-(U)- - File #4 RETRN_CNVR - 56
RETURN CONVEYOR SENSOR 18 RCS18
I:066 02
RETURN CONVEYOR SENSOR 19 RCS19
I:066 03
Rung #055
RETURN CONVEYOR MOTOR 18 RCM18
O:074 01
[54]
RETURN CONVEYOR MOTOR 18 TIMER RCM18_TMR
TON
TIMER ON DELAY (EN)
TIMER: T4:368
BASE (SEC): 1.0 (DN)
PRESET: 25
ACCUM: 0
T4:368.DN - ┤ ├ - File #4 RETRN_CNVR - 56

```
Rung #056
|     RETURN CONVEYOR    RETURN CONVEYOR                                          RETURN CONVEYOR |
|     SENSOR 18          MOTOR 18 SS                                              MOTOR 18        |
|     RCS18              RCM18SS                                                  RCM18           |
|          I:066             B3                                                       O:074     |
|-+-+-+-+-----] [------+-------[ONS]------+-+------------------------------------------(U)-------|
| | | | |      02      |       368        | |                                          01        |
| | | | |              |                  | | O:074/01 - ] [ - File #4 RETRN_CNVR - 55          |
| | | | |              |                  | |          -(L)- - File #4 RETRN_CNVR - 54          |
| | | | |RETURN CONVEYOR                  | |                                                    |
| | | | |SENSOR 19     |                  | |                                                    |
| | | | |RCS19         |                  | |                                                    |
| | | | |      I:066   |                  | |                                                    |
| | | | +-----] [------+                  | |                                                    |
| | | |         03                        | |                                                    |
| | | |RETURN CONVEYOR  RETURN CONVEYOR   | |                                                    |
| | | |SENSOR 18        SENSOR 19         | |                                                    |
| | | |RCS18            RCS19             | |                                                    |
| | | |    I:066            I:066         | |                                                    |
| | | +-----] [--------------] [----------+ |                                                    |
| | |        02               03            |                                                    |
| | |RCM18_TMR                              |                                                    |
| |   T4:368                                |                                                    |
| +-----] [---------------------------------+                                                    |
|        DN                                                                                      |
| [55]                                                                                           |
Rung #057
|AUTO RETURN  RETURN CONVEYOR  RETURN CONVEYOR                                   RETURN CONVEYOR |
|CONVEYOR     SENSOR 18        SENSOR 19                                         MOTOR 19        |
|AUTO_RC      RCS18            RCS19                                             RCM19           |
|   B3            I:066            I:066                                             O:074       |
|---] [------+-----] [--------------]/[-----+------------------------------------------(L)-------|
|   700      |      02               03     |                                          02        |
|            |                              | O:074/02 - ] [ - File #4 RETRN_CNVR - 58          |
|            |                              |          -(U)- - File #4 RETRN_CNVR - 59          |
|            |RETURN CONVEYOR  RETURN CONVEYOR                                                  |
|            |SENSOR 19        SENSOR 20    |                                                    |
|            |RCS19            RCS20        |                                                    |
|            |     I:066            I:066   |                                                    |
|            +-----] [--------------]/[-----+                                                    |
|                   03               04                                                          |
Rung #058
|RETURN CONVEYOR                                                   RETURN CONVEYOR               |
|MOTOR 19                                                          MOTOR 19 TIMER                |
|RCM19                                                             RCM19_TMR                     |
|    O:074                                                         +-TON-----------------+       |
|------] [---------------------------------------------------------+TIMER ON DELAY       +-(EN)--|
|       02                                                         |TIMER:        T4:369 |       |
|[57]                                                              |BASE (SEC):      1.0 +-(DN)  |
|                                                                  |PRESET:           25 |       |
|                                                                  |ACCUM:             0 |       |
|                                                                  +---------------------+       |
-T4:369.DN - ] [ - File #4 RETRN_CNVR - 59
```

```
Rung #059                                                    - 595 --
|     RETURN CONVEYOR   RETURN CONVEYOR                                                        RETURN CONVEYOR |
|     SENSOR 19         MOTOR SS                                                               MOTOR 19        |
|     RCS19             RCM19SS                                                                RCM19           |
|          I:066             B3                                                                    O:074       |
|-+-+-+-------] [-----+-----[ONS]------+-+------------------------------------------------------------(U)------|
| | | |         03    |       369      | |                                                              02      |
| | | |               |                | | O:074/02 - ] [ - File #4 RETRN_CNVR - 58                              |
| | | |               |                | |         -(L)- - File #4 RETRN_CNVR - 57                              |
| | | |RETURN CONVEYOR|                | |                                                                      |
| | | |SENSOR 20      |                | |                                                                      |
| | | |RCS20          |                | |                                                                      |
| | | |    I:066      |                | |                                                                      |
| | | +-----] [-------+                | |                                                                      |
| | |        04                        | |                                                                      |
| | |                         SUSPEND  | |                                                                      |
| | |RETURN CONVEYOR RETURN CONVEYOR OPERATION                                                                 |
| | |SENSOR 19       SENSOR 20       LATCH   | |                                                                |
| | |RCS19           RCS20           SUSOPL  | |                                                                |
| | |   I:066           I:066          B3    | |                                                                |
| | +----] [-------------] [-----------]/[---+ |                                                                |
| |       03               04          101     |                                                                |
| |                                   [2:16]   |                                                                |
| |RCM19_TMR                                   |                                                                |
| | T4:369                                     |                                                                |
| +----] [-------------------------------------+                                                                |
|        DN                                                                                                     |
| [58]                                                                                                          |
Rung #060
|                                        SUSPEND                                                               |
|AUTO RETURN  RETURN CONVEYOR RETURN CONVEYOR OPERATION                                      RETURN CONVEYOR  |
|CONVEYOR     SENSOR 19       SENSOR 20       LATCH                                          MOTOR 20         |
|AUTO_RC      RCS19           RCS20           SUSOPL                                         RCM20            |
|  B3             I:066          I:066          B3                                              O:074         |
|---] [-------+-----] [-----------]/[-----------]/[---+-----------------------------------------(L)-----------|
|   700       |      03            04           101   |                                          03           |
|             |                                [2:16] |                                                       |
|             |                                       | O:074/03 - ] [ - File #4 RETRN_CNVR - 61              |
|             |                                       |         -(U)- - File #4 RETRN_CNVR - 62               |
|             |RETURN CONVEYOR RETURN CONVEYOR        |                                                       |
|             |SENSOR 20       INDEXER READY          |                                                       |
|             |RCS20           IDX_RDY                |                                                       |
|             |    I:066          I:066               |                                                       |
|             +-----] [------------]/[----------------+                                                       |
|                    04             05                                                                        |
Rung #061
|RETURN CONVEYOR                                                               RETURN CONVEYOR               |
|MOTOR 20                                                                      MOTOR 20 TIMER                |
|RCM20                                                                         RCM20_TMR                     |
|    O:074                                                                     +-TON--------------+          |
|-----] [----------------------------------------------------------------------+TIMER ON DELAY    +-(EN)-----|
|       03                                                                     |TIMER:    T4:370  |          |
|[60]                                                                          |BASE (SEC):  1.0  +-(DN)     |
|                                                                              |PRESET:       25  |          |
|                                                                              |ACCUM:         0  |          |
|                                                                              +------------------+          |

T4:370.DN - ] [ - File #4 RETRN_CNVR - 62
```

Rung #062

```
|                                                               RETURN CONVEYOR |
|                                                               MOTOR 20        |
|RCM20_THR                                                      RCM20           |
| T4:370                                                            O:074       |
|---] [-------------------------------------------------------------(U)---------|
|   DN                                                              03          |
|[61]
O:074/03 - -] [- - File #4 RETRN_CNVR - 61
          -(L)- - File #4 RETRN_CNVR - 60
          -(U)- - File #4 RETRN_CNVR - 62
```

Rung #063

```
|AUTO RETURN  RETURN CONVEYOR  RETURN CONVEYOR                 RETURN CONVEYOR |
|CONVEYOR     SENSOR 20        INDEXER READY                   INDEXER MOTOR   |
|AUTO_RC      RCS20            IDX_RDY                         LATCH           |
|   B3           I:066            I:066                        RCIML           |
|---] [----------] [--------------] [------------------------------B3----------|
|   700          04               05                              -(L)---------|
B3/372 - -] [- - File #4 RETRN_CNVR - 65                           372         |
        -]/[- - File #4 RETRN_CNVR - 64
        -(L)- - File #4 RETRN_CNVR - 63
        -(U)- - File #4 RETRN_CNVR - 66
```

Rung #064

```
|RETURN CONVEYOR
|INDEXER MOTOR                                                 RETURN CONVEYOR |
|LATCH                                                         INDEXER MOTOR   |
|RCIML                                                         START           |
|   B3                                                         RCIMS           |
|---]/[-------------------------------------------------------------O:076------|
|   372                                                            -( )--------|
|[63]                                                               00         |
```

Rung #065

```
|RETURN CONVEYOR
|INDEXER MOTOR                                          RETURN CONVEYOR        |
|LATCH                                                  INDEXER MOTOR          |
|RCIML                                                  TIMER                  |
|   B3                                                  RCIM_THR               |
|---] [-------------------------------------------------+-TON----------------+ |
|   372                                                 |TIMER ON DELAY      |-(EN)-|
|[66]                                                   |TIMER:      T4:340  |      |
|                                                       |BASE (SEC):    1.0  |-(DN) |
|                                                       |PRESET:         15  |      |
|                                                       |ACCUM:           0  |      |
|                                                       +--------------------+      |
T4:340.DN - -] [- - File #4 RETRN_CNVR - 66
```

Rung #066

```
|                                                              RETURN CONVEYOR |
|                                                              INDEXER MOTOR   |
|RCIM_THR                                                      LATCH           |
| T4:340                                                       RCIML           |
|---] [------------------------------------------------------------B3----------|
|   DN                                                            -(U)---------|
|[65]                                                              372         |
B3/372 - -] [- - File #4 RETRN_CNVR - 65
        -]/[- - File #4 RETRN_CNVR - 64
        -(L)- - File #4 RETRN_CNVR - 63
        -(U)- - File #4 RETRN_CNVR - 66
```

Rung #067

```
|                                                           +-RET-----------+  |
|-----------------------------------------------------------|RETURN ()      |--|
|                                                           +---------------+  |
```

- 597 -

Rung #068

[END]

COPYRIGHT 1989, 1990, 1991
CONNER PERIPHERALS, INC.

```
Rung #000
|AUTO                                                    MOTOR 3
|MODE    MOTOR 3  PAUSE                                  FAULT
|ENABLE  FAST     DISABLE                                TIMER
|AUTO    M3F      TS12                                   M3FLT
| N7:37   O:012    N7:16                                 +-TON---------------+
+-] [-----] [------]/[-----------------------------------+TIMER ON DELAY     +-(EN)-+
|  11      12       4                                    |TIMER:      T4:303 |
|[2:158] [2:185]  [2:3]                                  |BASE (SEC):   1.0  +-(DN)
|                                                        |PRESET:       100  |
|                                                        |ACCUM:          0  |
|                                                        +-------------------+
T4:303.DN - ] [ - File #5 FAULTS - 15

Rung #001
|AUTO                                                    MOTOR 4
|MODE    MOTOR 4  PAUSE                                  FAULT
|ENABLE  FAST     DISABLE                                TIMER
|AUTO    M4F      TS12                                   M4FLT
| N7:37   O:012    N7:16                                 +-TON---------------+
+-] [-----] [------]/[-----------------------------------+TIMER ON DELAY     +-(EN)-+
|  11      13       4                                    |TIMER:      T4:304 |
|[2:158] [2:190]  [2:3]                                  |BASE (SEC):   1.0  +-(DN)
|                                                        |PRESET:       100  |
|                                                        |ACCUM:          0  |
|                                                        +-------------------+
T4:304.DN - ] [ - File #5 FAULTS - 15

Rung #002
|AUTO                                                    MOTOR 5
|MODE    MOTOR 5  PAUSE                                  FAULT
|ENABLE  FAST     DISABLE                                TIMER
|AUTO    M5F      TS12                                   M5FLT
| N7:37   O:012    N7:16                                 +-TON---------------+
+-] [-----] [------]/[-----------------------------------+TIMER ON DELAY     +-(EN)-+
|  11      14       4                                    |TIMER:      T4:305 |
|[2:158] [2:195]  [2:3]                                  |BASE (SEC):   1.0  +-(DN)
|                                                        |PRESET:       100  |
|                                                        |ACCUM:          0  |
|                                                        +-------------------+
T4:305.DN - ] [ - File #5 FAULTS - 15

Rung #003
|AUTO                                                    MOTOR 6 OR 7
|MODE    MOTOR 6     PAUSE                               FAULT
|ENABLE  FAST        DISABLE                             TIMER
|AUTO    M6F         TS12                                M6,7FLT
| N7:37     O:012      N7:16                             +-TON---------------+
+-] [----+---] [---+----]/[------------------------------+TIMER ON DELAY     +-(EN)-+
|  11    |   15    |     4                               |TIMER:      T4:306 |
|[2:158] |[2:218]  |   [2:3]                             |BASE (SEC):   1.0  +-(DN)
|        |         |                                     |PRESET:       200  |
|        |         |                                     |ACCUM:         62  |
|        |MOTOR 7  |                                     +-------------------+
|        |FAST     |
|        |M7F      |
|        | O:012   |
|        +---] [---+
|            16
|         [2:231]
T4:306.DN - ] [ - File #5 FAULTS - 15
```

```
Rung #004
|AUTO
|MODE      MOTOR 8   PAUSE                                                          MOTOR 8
|ENABLE    FAST      DISABLE                                                        FAULT TIMER
|AUTO      M8F       TS12                                                           M8FLT
| N7:37    O:012     N7:16                                                          +-TON------------+
|-| |------| |------|/|----------------------------------------------------------+-|TIMER ON DELAY  |-(EN)-|
|  11       17        4                                                            |TIMER:   T4:335 |
|[2:158]  [2:249]   [2:3]                                                          |BASE (SEC): 1.0 |-(DN) |
|                                                                                  |PRESET:     200 |
|                                                                                  |ACCUM:        4 |
|                                                                                  +----------------+
T4:335.DN - -| |- - File #5 FAULTS - 15

Rung #005
|AUTO
|MODE      MOTOR 9   PAUSE                                                          MOTOR 9
|ENABLE    FAST      DISABLE                                                        FAULT FAULT
|AUTO      M9F       TS12                                                           M9FLT
| N7:37    O:032     N7:16                                                          +-TON------------+
|-| |------| |------|/|----------------------------------------------------------+-|TIMER ON DELAY  |-(EN)-|
|  11       10        4                                                            |TIMER:   T4:307 |
|[2:158]  [2:253]   [2:3]                                                          |BASE (SEC): 1.0 |-(DN) |
|                                                                                  |PRESET:     150 |
|                                                                                  |ACCUM:        0 |
|                                                                                  +----------------+
T4:307.DN - -| |- - File #5 FAULTS - 15

Rung #006
|AUTO                                                                               MOTOR 10 OR 11
|MODE      MOTOR 10     PAUSE                                                       FAULT
|ENABLE    FAST         DISABLE                                                     TIMER
|AUTO      M10F         TS12                                                        M10,11FLT
| N7:37      O:032        N7:16                                                     +-TON------------+
|-| |----+----| |----+----|/|------------------------------------------------------+-|TIMER ON DELAY  |-(EN)-|
|  11    |     11    |     4                                                       |TIMER:   T4:308 |
|[2:158] | [2:258]   |   [2:3]                                                     |BASE (SEC): 1.0 |-(DN) |
|        |           |                                                             |PRESET:     200 |
|        |           |                                                             |ACCUM:        0 |
|        |           |                                                             +----------------+
|        |MOTOR 11   |
|        |FAST       |
|        |M11F       |
|        |  O:032    |
|        +----| |----+
|              12
|            [2:263]
T4:308.DN - -| |- - File #5 FAULTS - 15

Rung #007
|AUTO
|MODE      MOTOR 12  PAUSE                                                          MOTOR 12
|ENABLE    FAST      DISABLE                                                        FAULT TIMER
|AUTO      M12F      TS12                                                           M12FLT
| N7:37    O:032     N7:16                                                          +-TON------------+
|-| |------| |------|/|----------------------------------------------------------+-|TIMER ON DELAY  |-(EN)-|
|  11       13        4                                                            |TIMER:   T4:336 |
|[2:158]  [2:281]   [2:3]                                                          |BASE (SEC): 1.0 |-(DN) |
|                                                                                  |PRESET:     200 |
|                                                                                  |ACCUM:        0 |
|                                                                                  +----------------+
T4:336.DN - -| |- - File #5 FAULTS - 15
```

Rung #008

```
|AUTO
|MODE    MOTOR 13  PAUSE                                              MOTOR 13
|ENABLE  FAST      DISABLE                                            FAULT TIMER
|AUTO    M13F      TS12                                               M13FLT
| N7:37   O:032     N7:16                                             +-TON-----------+
|-| |------| |--------|/|---------------------------------------------+TIMER ON DELAY +-(EN)-
|  11       14         4                                              |TIMER:   T4:309|
|[2:158]  [2:285]    [2:3]                                            |BASE (SEC): 1.0+-(DN)
|                                                                     |PRESET:     150|
|                                                                     |ACCUM:        0|
|                                                                     +---------------+
T4:309.DN - -| |- - File #5 FAULTS -  15
```

Rung #009

```
|                              PALLET
|AUTO                          DETECTED
|MODE    MOTOR 14    PAUSE     RIGHT SIDE                             MOTOR 14 OR 15
|ENABLE  FAST        DISABLE   CARBON                                 FAULT TIMER
|AUTO    M14F        TS12      SEN42                                  M14,15FLT
| N7:37    O:032      N7:16      I:053                                +-TON-----------+
|-| |----+--| |--+----|/|--------|/|--------------------------------+TIMER ON DELAY +-(EN)-
|  11    |   15  |     4          02                                  |TIMER:   T4:310|
|[2:158] |[2:290]|  [2:3]                                             |BASE (SEC): 1.0+-(DN)
|        |       |                                                    |PRESET:     180|
|        |       |                                                    |ACCUM:       47|
|        |       |                                                    +---------------+
|        |MOTOR 15|
|        |FAST    |
|        |M15F    |
|        | O:032  |
|        +--| |---+
|            16
|         [2:295]
T4:310.DN - -| |- - File #5 FAULTS -  15
```

Rung #010

```
|                           PALLET
|AUTO                       DETECTED
|MODE    MOTOR 16  PAUSE    RIGHT SIDE                                MOTOR 16
|ENABLE  FAST      DISABLE  DWELL 6                                   FAULT TIMER
|AUTO    M16F      TS12     SEN45                                     M16FLT
| N7:37   O:032     N7:16     I:053                                   +-TON-----------+
|-| |------| |--------|/|-------|/|---------------------------------+TIMER ON DELAY +-(EN)-
|  11       17         4        05                                    |TIMER:   T4:337|
|[2:158]  [2:306]    [2:3]                                            |BASE (SEC): 1.0+-(DN)
|                                                                     |PRESET:     120|
|                                                                     |ACCUM:       15|
|                                                                     +---------------+
T4:337.DN - -| |- - File #5 FAULTS -  15
```

Rung #011

```
|                           PALLET
|AUTO                       DETECTED
|MODE    MOTOR 17  PAUSE    RIGHT SIDE                                MOTOR 17
|ENABLE  FAST      DISABLE  BUFFER 4                                  FAULT TIMER
|AUTO    M17F      TS12     SEN48                                     M17FLT
| N7:37   O:062     N7:16     I:053                                   +-TON-----------+
|-| |------| |--------|/|-------|/|---------------------------------+TIMER ON DELAY +-(EN)-
|  11       10         4        10                                    |TIMER:   T4:311|
|[2:158]  [2:310]    [2:3]                                            |BASE (SEC): 1.0+-(DN)
|                                                                     |PRESET:     130|
|                                                                     |ACCUM:        0|
|                                                                     +---------------+
T4:311.DN - -| |- - File #5 FAULTS -  15
```

Rung #012

```
|AUTO
|MODE      MOTOR 18  PAUSE                                                  MOTOR 18 OR 19
|ENABLE    FAST      DISABLE                                                FAULT TIMER
|AUTO      M18F      TS12                                                   M18,19FLT
| N7:37     O:062     N7:16                                                 +-TON-----------+
|-] [-----+--] [---+---]/[--------------------------------------------------+TIMER ON DELAY +-(EN)-
|  11     |  11    |    4                                                   |TIMER:   T4:312|
|[2:158]  |[2:315] |  [2:3]                                                 |BASE (SEC): 1.0+-(DN)
|         |        |                                                        |PRESET:     100|
|         |        |                                                        |ACCUM:       30|
|         |MOTOR 19|                                                        +---------------+
|         |FAST    |
|         |M19F    |
|         |  O:062 |
|         +--] [---+
|            12
|         [2:320]
T4:312.DN - ] [ - File #5 FAULTS - 15
```

Rung #013

```
|AUTO
|MODE     MOTOR 20  PAUSE                                                   MOTOR 20
|ENABLE   FAST      DISABLE                                                 FAULT TIMER
|AUTO     M20F      TS12                                                    M20FLT
| N7:37    O:062     N7:16                                                  +-TON-----------+
|-] [------] [-------]/[----------------------------------------------------+TIMER ON DELAY +-(EN)-
|  11       13        4                                                     |TIMER:   T4:313|
|[2:158]  [2:331]   [2:3]                                                   |BASE (SEC): 1.0+-(DN)
|                                                                           |PRESET:     100|
|                                                                           |ACCUM:        0|
|                                                                           +---------------+
T4:313.DN - ] [ - File #5 FAULTS - 15
```

Rung #014

```
|AUTO
|MODE     MOTOR 21  PAUSE                                                   MOTOR 21
|ENABLE   FAST      DISABLE                                                 FAULT TIMER
|AUTO     M21F      TS12                                                    M21FLT
| N7:37    O:062     N7:16                                                  +-TON-----------+
|-] [------] [-------]/[----------------------------------------------------+TIMER ON DELAY +-(EN)-
|  11       14        4                                                     |TIMER:   T4:314|
|[2:158]  [2:355]   [2:3]                                                   |BASE (SEC): 1.0+-(DN)
|                                                                           |PRESET:     100|
|                                                                           |ACCUM:        0|
|                                                                           +---------------+
T4:314.DN - ] [ - File #5 FAULTS - 15
```

Rung #015

```
                                                                    MOTOR FAULT
                                                                    TIMER DONE
 M3FLT                                                              MOTOR_FLT
 T4:303                                                             B3
--] [--------------------------------------------------------------(L)--
   DN                                                               811
 [0]
          B3/811 - -] [- - File #2 MAIN_PRGRM - 626
                   -(U)- - File #5 FAULTS - 16
 M4FLT
 T4:304
--] [--
   DN
 [1]
 M5FLT
 T4:305
--] [--
   DN
 [2]
 M6,7FLT
 T4:306
--] [--
   DN
 [3]
 M8FLT
 T4:335
--] [--
   DN
 [4]
 M9FLT
 T4:307
--] [--
   DN
 [5]
 M10,11FLT
 T4:308
--] [--
   DN
 [6]
 M12FLT
 T4:336
--] [--
   DN
 [7]
 M13FLT
 T4:309
--] [--
   DN
 [8]
 M14,15FLT
 T4:310
--] [--
   DN
 [9]
 M16FLT
 T4:337
--] [--
   DN
 [10]
```

```
Rung #016                                                          MOTOR FAULT  |
|PAUSE                                                             TIMER DONE   |
|DISABLE                                                           MOTOR_FLT    |
|TS12                                                                  B3       |
|  N7:16                                                                        |
|---] [----------------------------------------------------------------(U)-----|
|    4                                                                811       |
|[2:3]                                                                          |
B3/811 - -] [- - File #2 MAIN_PRGRM -  626
         -(L)- - File #5 FAULTS -  15
         -(U)- - File #5 FAULTS -  16
Rung #017
|DOOR CLOSE                                              DOOR 1                 |
|SOLENOID                                                CLOSE                  |
|1 ENABLE                                                TIMER                  |
|DRCL1                                                   D1CLTMR                |
|  O:011                                                 +-TON-------------+    |
|---] [--------------------------------------------------|TIMER ON DELAY   |-(EN)-|
|    00                                                  |TIMER:      T4:81|    |
|[2:183]                                                 |BASE (SEC):   1.0|-(DN) |
|                                                        |PRESET:         4|    |
|                                                        |ACCUM:          0|    |
|                                                        +-----------------+    |
T4:81.DN - -] [- - File #5 FAULTS -  18
Rung #018                                                                       |
|FAULT                                                               DOOR 1     |
|DETECT                                                              CLOSED     |
|DOOR 1    DOOR 1                                                    FAULT      |
|CLOSED    CLOSED                                                    D1CLFLT    |
|D1CLTMR   DRCL1S                                                      B3       |
|  T4:81    I:006                                                               |
|---] [------]/[---------------------------------------------------------( )----|
|    DN      00                                                        201      |
|[17]                                                                           |
B3/201 - -]/[- - File #5 FAULTS -  65
         -( )- - File #5 FAULTS -  18
Rung #019
|DOOR CLOSE                                              DOOR 2                 |
|SOLENOID                                                CLOSE                  |
|2 ENABLE                                                TIMER                  |
|DRCL2                                                   D2CLTMR                |
|  O:011                                                 +-TON-------------+    |
|---] [--------------------------------------------------|TIMER ON DELAY   |-(EN)-|
|    02                                                  |TIMER:      T4:82|    |
|[2:202]                                                 |BASE (SEC):   1.0|-(DN) |
|                                                        |PRESET:         4|    |
|                                                        |ACCUM:          0|    |
|                                                        +-----------------+    |
T4:82.DN - -] [- - File #5 FAULTS -  20
Rung #020                                                                       |
|FAULT                                                               DOOR 2     |
|DETECT                                                              CLOSED     |
|DOOR 2    DOOR 2                                                    FAULT      |
|CLOSED    CLOSED                                                    D2CLFLT    |
|D2CLTMR   DRCL2S                                                      B3       |
|  T4:82    I:006                                                               |
|---] [------]/[---------------------------------------------------------( )----|
|    DN      02                                                        202      |
|[19]                                                                           |
B3/202 - -]/[- - File #5 FAULTS -  65
         -( )- - File #5 FAULTS -  20
```

```
Rung #021
|                                                              DOOR 3          |
|CLOSE                                                         CLOSE           |
|DOOR 3                                                        TIMER           |
|DRCL3                                                         D3CLTMR         |
| O:011                                                        +-TON------------+
|--] [---------------------------------------------------------|TIMER ON DELAY  |-(EN)-|
|   04                                                         |TIMER:     T4:83|      |
|[2:229]                                                       |BASE (SEC):  1.0|-(DN) |
|                                                              |PRESET:        4|      |
|                                                              |ACCUM:         0|      |
|                                                              +----------------+      |
T4:83.DN - -] [- - File #5 FAULTS - 22
Rung #022
|FAULT                                                                               |
|DETECT                                                                 DOOR 3       |
|DOOR 3    DOOR 3                                                       CLOSED       |
|CLOSED    CLOSED                                                       FAULT        |
|D3CLTMR   DRCL3S                                                       D3CLFLT      |
|  T4:83    I:006                                                         B3         |
|---] [------]/[--------------------------------------------------------( )---------|
|    DN      04                                                          203         |
|[21]                                                                                |
B3/203 - -]/[- - File #5 FAULTS - 65
         -( )- - File #5 FAULTS - 22
Rung #023
|DOOR CLOSE                                                   DOOR 4                 |
|SOLENOID                                                     CLOSE                  |
|4 ENABLE                                                     TIMER                  |
|DRCL4                                                        D4CLTMR                |
|  O:011                                                      +-TON------------+
|---] [-------------------------------------------------------|TIMER ON DELAY  |-(EN)-|
|    06                                                       |TIMER:     T4:84|      |
|[2:408]                                                      |BASE (SEC):  1.0|-(DN) |
|                                                             |PRESET:        4|      |
|                                                             |ACCUM:         0|      |
|                                                             +----------------+      |
T4:84.DN - -] [- - File #5 FAULTS - 24
Rung #024
|FAULT                                                                               |
|DETECT                                                                 DOOR 4       |
|DOOR 4    DOOR 4                                                       CLOSED       |
|CLOSED    CLOSED                                                       FAULT        |
|D4CLTMR   DRCL4S                                                       D4CLFLT      |
|  T4:84    I:006                                                         B3         |
|---] [------]/[--------------------------------------------------------( )---------|
|    DN      06                                                          204         |
|[23]                                                                                |
B3/204 - -]/[- - File #5 FAULTS - 65
         -( )- - File #5 FAULTS - 24
Rung #025
|DOOR CLOSE                                                   DOOR 5                 |
|SOLENOID                                                     CLOSE                  |
|5 ENABLE                                                     TIMER                  |
|DRCL5                                                        D5CLTMR                |
|  O:031                                                      +-TON------------+
|---] [-------------------------------------------------------|TIMER ON DELAY  |-(EN)-|
|    00                                                       |TIMER:     T4:85|      |
|[2:414]                                                      |BASE (SEC):  1.0|-(DN) |
|                                                             |PRESET:        4|      |
|                                                             |ACCUM:         0|      |
|                                                             +----------------+      |
```

- 605 -

```
T4:85.DN - -| |- - File #5 FAULTS - 26
Rung #026
|FAULT
|DETECT
|DOOR 5    DOOR 5                                                    DOOR 5
|CLOSED    CLOSED                                                    CLOSED
|D5CLTMR   ORCL5S                                                    FAULT
| T4:85    I:026                                                     D5CLFLT
|--| |-----|/|------------------------------------------------------- B3
|   DN      00                                                    ---( )---|
|[25]                                                                205
B3/205 - -|/|- - File #5 FAULTS - 65
         -( )- - File #5 FAULTS - 26
Rung #027
|DOOR CLOSE                                              DOOR 6
|SOLENOID                                                CLOSE
|6 ENABLE                                                TIMER
|ORCL6                                                   D6CLTMR
|  O:031                                                 +--TON-----------+
|--| |---------------------------------------------------|TIMER ON DELAY  |-(EN)-
|   02                                                   |TIMER:     T4:86|
|[2:420]                                                 |BASE (SEC):  1.0|-(DN)
|                                                        |PRESET:        4|
|                                                        |ACCUM:         0|
|                                                        +----------------+
T4:86.DN - -| |- - File #5 FAULTS - 28
Rung #028
|FAULT
|DETECT
|DOOR 6    DOOR 6                                                    DOOR 6
|CLOSED    CLOSED                                                    CLOSED
|D6CLTMR   ORCL6S                                                    FAULT
| T4:86    I:026                                                     D6CLFLT
|--| |-----|/|------------------------------------------------------- B3
|   DN      02                                                    ---( )---|
|[27]                                                                206
B3/206 - -|/|- - File #5 FAULTS - 65
         -( )- - File #5 FAULTS - 28
Rung #029
|DOOR CLOSE                                              DOOR 7
|SOLENOID                                                CLOSE
|7 ENABLE                                                TIMER
|ORCL7                                                   D7CLTMR
|  O:045                                                 +--TON-----------+
|--| |---------------------------------------------------|TIMER ON DELAY  |-(EN)-
|   00                                                   |TIMER:     T4:87|
|[2:422]                                                 |BASE (SEC):  1.0|-(DN)
|                                                        |PRESET:        4|
|                                                        |ACCUM:         0|
|                                                        +----------------+
T4:87.DN - -| |- - File #5 FAULTS - 30
Rung #030
|FAULT
|DETECT
|DOOR 7    DOOR 7                                                    DOOR 7
|CLOSED    CLOSED                                                    CLOSED
|D7CLTMR   ORCL7S                                                    FAULT
| T4:87    I:042                                                     D7CLFLT
|--| |-----|/|------------------------------------------------------- B3
|   DN      00                                                    ---( )---|
|[29]                                                                207
B3/207 - -|/|- - File #5 FAULTS - 65
```

```
      -( )- - File #5 FAULTS -  30          - 606 -
Rung #031
|DOOR CLOSE                                                          DOOR 8
|SOLENOID                                                            CLOSE
|8 ENABLE                                                            TIMER
|DRCL8                                                               D8CLTMR
|  O:045                                                             +-TON-----------+
|---] [------------------------------------------------------------+-|TIMER ON DELAY |-(EN)-
|    02                                                              |TIMER:    T4:88|
|[2:427]                                                             |BASE (SEC):  1.0|-(DN)
|                                                                    |PRESET:       4|
|                                                                    |ACCUM:        0|
|                                                                    +---------------+
T4:88.DN - -] [- - File #5 FAULTS -  32
Rung #032
|FAULT
|DETECT                                                                      DOOR 8
|DOOR 8   DOOR 8                                                             CLOSED
|CLOSED   CLOSED                                                             FAULT
|D8CLTMR  DRCL8S                                                             D8CLFLT
| T4:88    I:042                                                             B3
|---] [------]/[-------------------------------------------------------------( )---
|  DN       02                                                               208
|[31]
B3/208 - -]/[- - File #5 FAULTS -  65
      -( )- - File #5 FAULTS -  32
Rung #033
|CLOSE
|DOOR 9                                                              DOOR 9
|SOLENOID                                                            CLOSE
|ENABLE                                                              TIMER
|DRCL9                                                               D9CLTMR
|  O:061                                                             +-TON-----------+
|---] [--------------------------------------------------------------|TIMER ON DELAY |-(EN)-
|    00                                                              |TIMER:    T4:89|
|[2:329]                                                             |BASE (SEC):  1.0|-(DN)
|                                                                    |PRESET:       4|
|                                                                    |ACCUM:        0|
|                                                                    +---------------+
T4:89.DN - -] [- - File #5 FAULTS -  34
Rung #034
|FAULT
|DETECT                                                                      DOOR 9
|DOOR 9   DOOR 9                                                             CLOSED
|CLOSED   CLOSED                                                             FAULT
|D9CLTMR  DRCL9S                                                             D9CLFLT
| T4:89    I:056                                                             B3
|---] [------]/[-------------------------------------------------------------( )---
|  DN       00                                                               209
|[33]
B3/209 - -]/[- - File #5 FAULTS -  65
      -( )- - File #5 FAULTS -  34
Rung #035
|                                                                    DOOR 10
|CLOSE DOOR                                                          CLOSE
|10 ENABLE                                                           TIMER
|DRCL10                                                              D10CLTMR
|  O:061                                                             +-TON-----------+
|---] [--------------------------------------------------------------|TIMER ON DELAY |-(EN)-
|    02                                                              |TIMER:    T4:90|
|[2:335]                                                             |BASE (SEC):  1.0|-(DN)
|                                                                    |PRESET:       4|
|                                                                    |ACCUM:        0|
>                                                                    >>>>>>>>>>>>>>>>>    >
```

```
<                                                        <<<<<<<<<<<<<<<<<<   <
|
T4:90.DN - -| |- - File #5 FAULTS -  36
Rung #036
|FAULT                                                                        |
|DETECT                                                          DOOR 10      |
|DOOR 10   DOOR 10                                               CLOSED       |
|CLOSED    CLOSED                                                FAULT        |
|D10CLTMR  DRCL10S                                               D10CLFLT     |
| T4:90     I:056                                                  B3         |
|--| |------|/|--------------------------------------------------------( )------|
|   DN       02                                                    210        |
|[35]                                                                         |
B3/210 - -|/|- - File #5 FAULTS -  65
        -( )- - File #5 FAULTS -  36
Rung #037
|                                                        DOOR 11              |
|CLOSE                                                   CLOSE                |
|DOOR 11                                                 TIMER                |
|DRCL11                                                  D11CLTMR             |
| O:061                                                  +-TON-----------+    |
|--| |---------------------------------------------------|TIMER ON DELAY |-(EN)-|
|   04                                                   |TIMER:    T4:91|    |
|[2:337]                                                 |BASE (SEC): 1.0|-(DN)|
|                                                        |PRESET:      4|     |
|                                                        |ACCUM:       0|     |
|                                                        +---------------+    |
T4:91.DN - -| |- - File #5 FAULTS -  38
Rung #038
|FAULT                                                                        |
|DETECT                                                          DOOR 11      |
|DOOR 11   DOOR 11                                               CLOSED       |
|CLOSED    CLOSED                                                FAULT        |
|D11CLTMR  DRCL11S                                               D11CLFLT     |
| T4:91     I:056                                                  B3         |
|--| |------|/|--------------------------------------------------------( )------|
|   DN       04                                                    211        |
|[37]                                                                         |
B3/211 - -|/|- - File #5 FAULTS -  65
        -( )- - File #5 FAULTS -  38
Rung #039
|DOOR CLOSE                                              DOOR 12              |
|SOLENOID12                                              CLOSE                |
|ENABLE                                                  TIMER                |
|DRCL12                                                  D12CLTMR             |
| O:061                                                  +-TON-----------+    |
|--| |---------------------------------------------------|TIMER ON DELAY |-(EN)-|
|   06                                                   |TIMER:    T4:92|    |
|[2:353]                                                 |BASE (SEC): 1.0|-(DN)|
|                                                        |PRESET:      4|     |
|                                                        |ACCUM:       0|     |
|                                                        +---------------+    |
T4:92.DN - -| |- - File #5 FAULTS -  40
Rung #040
|FAULT                                                           DOOR 12      |
|DETECT    DOOR 12                                               CLOSED       |
|DOOR 12   CLOSED                                                FAULT        |
|D12CLTMR  DRCL12S                                               D12CLFLT     |
| T4:92     I:056                                                  B3         |
|--| |------|/|--------------------------------------------------------( )------|
|   DN       06                                                    212        |
|[39]                                                                         |
```

```
B3/212 - -|/|- - File #5 FAULTS -  65
         -( )- - File #5 FAULTS -  40
Rung #041
|                                                             DOOR 1          |
|OPEN DOOR                                                    OPEN            |
|1                                                            TIMER           |
|DROP1                                                        D1OPTMR         |
|  O:011                                                      +-TON----------+|
|---| |-------------------------------------------------------|TIMER ON DELAY|-(EN)-|
|    01                                                       |TIMER:  T4:101|      |
|[2:181]                                                      |BASE (SEC): 1.0|-(DN) |
|                                                             |PRESET:      4|      |
|                                                             |ACCUM:       0|      |
|                                                             +--------------+      |
T4:101.DN - -| |- - File #5 FAULTS -  42
Rung #042
|FAULT                                                                        |
|DETECTED                                                           DOOR 1    |
|DOOR 1     DOOR 1                                                  OPEN      |
|OPEN       OPEN                                                    FAULT     |
|D1OPTMR    DROP1S                                                  D1OPFLT   |
|  T4:101    I:006                                                  B3        |
|---| |-------|/|---------------------------------------------------( )-------|
|    DN        01                                                   221       |
|[41]                                                                         |
B3/221 - -|/|- - File #5 FAULTS -  66
         -( )- - File #5 FAULTS -  42
Rung #043
|OPEN DOOR                                                    DOOR 2          |
|SOLENOID                                                     OPEN            |
|2 ENABLE                                                     TIMER           |
|DROP2                                                        D2OPTMR         |
|  O:011                                                      +-TON----------+|
|---| |-------------------------------------------------------|TIMER ON DELAY|-(EN)-|
|    03                                                       |TIMER:  T4:102|      |
|[2:200]                                                      |BASE (SEC): 1.0|-(DN) |
|                                                             |PRESET:      4|      |
|                                                             |ACCUM:       2|      |
|                                                             +--------------+      |
T4:102.DN - -| |- - File #5 FAULTS -  44
Rung #044
|FAULT                                                                        |
|DETECT                                                             DOOR 2    |
|DOOR 2     DOOR 2                                                  OPEN      |
|OPEN       OPEN                                                    FAULT     |
|D2OPTMR    DROP2S                                                  D2OPFLT   |
|  T4:102    I:006                                                  B3        |
|---| |-------|/|---------------------------------------------------( )-------|
|    DN        03                                                   222       |
|[43]                                                                         |
B3/222 - -|/|- - File #5 FAULTS -  66
         -( )- - File #5 FAULTS -  44
Rung #045
|DOOR OPEN                                                    DOOR 3          |
|SOLENOID                                                     OPEN            |
|3 ENABLE                                                     TIMER           |
|DROP3                                                        D3OPTMR         |
|  O:011                                                      +-TON----------+|
|---| |-------------------------------------------------------|TIMER ON DELAY|-(EN)-|
|    05                                                       |TIMER:  T4:103|      |
|[2:216]                                                      |BASE (SEC): 1.0|-(DN) |
|                                                             |PRESET:      4|      |
|                                                             |ACCUM:       0|      |
>                                                             >>>>>>>>>>>>>>>>>>   >
```

```
<                                                        <<<<<<<<<<<<<<<<<<      <
|
T4:103.DN - ┤ ├ - File #5 FAULTS -  46
Rung #046
|FAULT                                                                           |
|DETECT                                                                 DOOR 3   |
|DOOR 3   DOOR 3                                                        OPEN     |
|OPEN     OPEN                                                          FAULT    |
|D3OPTMR  DROP3S                                                        D3OPFLT  |
| T4:103   I:006                                                          B3     |
|──┤ ├────┤/├─────────────────────────────────────────────────────────────( )────|
|    DN     05                                                            223    |
|[45]                                                                            |
B3/223 - ┤/├ - File #5 FAULTS -  66
       -( )- - File #5 FAULTS -  46
Rung #047
|DOOR OPEN                                                   DOOR 4              |
|SOLENOID                                                    OPEN                |
|4 ENABLE                                                    TIMER               |
|DROP4                                                       D4OPTMR             |
|   O:011                                                    ┌─TON──────────┐    |
|──┤ ├───────────────────────────────────────────────────────┤TIMER ON DELAY ├─(EN)─|
|    07                                                     |TIMER:   T4:104|    |
|[2:415]                                                    |BASE (SEC): 1.0├─(DN)|
|                                                           |PRESET:       4|    |
|                                                           |ACCUM:        0|    |
|                                                           └──────────────┘    |
T4:104.DN - ┤ ├ - File #5 FAULTS -  48
Rung #048
|FAULT                                                                           |
|DETECT                                                                 DOOR 4   |
|DOOR 4   DOOR 4                                                        OPEN     |
|OPEN     OPEN                                                          FAULT    |
|D4OPTMR  DROP4S                                                        D4OPFLT  |
| T4:104   I:006                                                          B3     |
|──┤ ├────┤/├─────────────────────────────────────────────────────────────( )────|
|    DN     07                                                            224    |
|[47]                                                                            |
B3/224 - ┤/├ - File #5 FAULTS -  66
       -( )- - File #5 FAULTS -  48
Rung #049
|DOOR OPEN                                                   DOOR 5              |
|SOLENOID                                                    OPEN                |
|5 ENABLE                                                    TIMER               |
|DROP5                                                       D5OPTMR             |
|   O:031                                                    ┌─TON──────────┐    |
|──┤ ├───────────────────────────────────────────────────────┤TIMER ON DELAY ├─(EN)─|
|    01                                                     |TIMER:   T4:105|    |
|[2:46]                                                     |BASE (SEC): 1.0├─(DN)|
|                                                           |PRESET:       4|    |
|                                                           |ACCUM:        0|    |
|                                                           └──────────────┘    |
T4:105.DN - ┤ ├ - File #5 FAULTS -  50
Rung #050
|FAULT                                                                           |
|DETECT                                                                 DOOR 5   |
|DOOR 5   DOOR 5                                                        OPEN     |
|OPEN     OPEN                                                          FAULT    |
|D5OPTMR  DROP5S                                                        D5OPFLT  |
| T4:105   I:026                                                          B3     |
|──┤ ├────┤/├─────────────────────────────────────────────────────────────( )────|
|    DN     01                                                            225    |
|[49]                                                                            |
```

```
B3/225 - -|/|- - File #5 FAULTS -  66
         -( )- - File #5 FAULTS -  50
Rung #051
|DOOR OPEN                                                              DOOR 6
|SOLENOID                                                               OPEN
|6 ENABLE                                                               TIMER
|DROP6                                                                  D6OPTMR
|  O:031                                                                +-TON-----------------+
|--| |-------------------------------------------------------------------|TIMER ON DELAY       |-(EN)-
|  03                                                                   |TIMER:       T4:106  |
|[2:47]                                                                 |BASE (SEC):    1.0   |-(DN)
|                                                                       |PRESET:          4   |
|                                                                       |ACCUM:           0   |
|                                                                       +---------------------+
T4:106.DN - -| |- - File #5 FAULTS -  52
Rung #052
|FAULT
|DETECT
|DOOR 6   DOOR 6                                                                        DOOR 6
|OPEN     OPEN                                                                          OPEN
|D6OPTMR  DROP6S                                                                        FAULT
| T4:106   I:026                                                                        D6OPFLT
|--| |-----|/|----------------------------------------------------------------------------B3
|   DN      03                                                                          -( )-
|[51]                                                                                   226
B3/226 - -|/|- - File #5 FAULTS -  66
         -( )- - File #5 FAULTS -  52
Rung #053
|DOOR OPEN                                                              DOOR 7
|SOLENOID                                                               OPEN
|7 ENABLE                                                               TIMER
|DROP7                                                                  D7OPTMR
|  O:045                                                                +-TON-----------------+
|--| |-------------------------------------------------------------------|TIMER ON DELAY       |-(EN)-
|  01                                                                   |TIMER:       T4:107  |
|[2:48]                                                                 |BASE (SEC):    1.0   |-(DN)
|                                                                       |PRESET:          4   |
|                                                                       |ACCUM:           0   |
|                                                                       +---------------------+
T4:107.DN - -| |- - File #5 FAULTS -  54
Rung #054
|FAULT
|DETECT
|DOOR 7   DOOR 7                                                                        DOOR 7
|OPEN     OPEN                                                                          OPEN
|D7OPTMR  DROP7S                                                                        FAULT
| T4:107   I:042                                                                        D7OPFLT
|--| |-----|/|----------------------------------------------------------------------------B3
|   DN      01                                                                          -( )-
|[53]                                                                                   227
B3/227 - -|/|- - File #5 FAULTS -  66
         -( )- - File #5 FAULTS -  54
Rung #055
|DOOR OPEN                                                              DOOR 8
|SOLENOID                                                               OPEN
|8 ENABLE                                                               TIMER
|DROP8                                                                  D8OPTMR
|  O:045                                                                +-TON-----------------+
|--| |-------------------------------------------------------------------|TIMER ON DELAY       |-(EN)-
|  03                                                                   |TIMER:       T4:108  |
|[2:49]                                                                 |BASE (SEC):    1.0   |-(DN)
|                                                                       |PRESET:          4   |
|                                                                       |ACCUM:           0   |
>                                                                       >>>>>>>>>>>>>>>>>>       >
```

```
T4:108.DN - -] [- - File #5 FAULTS -  56
Rung #056
|FAULT
|DETECT                                                       DOOR 8
|DOOR 8   DOOR 8                                              OPEN
|OPEN     OPEN                                                FAULT
|D8OPTMR  DROP8S                                              D8OPFLT
| T4:108   I:042                                               B3
|--] [-----]/[---------------------------------------------------( )--
|   DN      03                                                 228
|[55]
B3/228 - -]/[- - File #5 FAULTS -  66
         -( )- - File #5 FAULTS -  56
Rung #057
|DOOR OPEN                                          DOOR 9
|SOLENOID                                           OPEN
|9 ENABLE                                           TIMER
|DROP9                                              D9OPTMR
|   O:061                                           +-TON-----------+
|---] [---------------------------------------------|TIMER ON DELAY |-(EN)-
|    01                                             |TIMER:   T4:109|
|[2:325]                                            |BASE (SEC): 1.0|-(DN)
|                                                   |PRESET:       4|
|                                                   |ACCUM:        0|
|                                                   +---------------+
T4:109.DN - -] [- - File #5 FAULTS -  58
Rung #058
|FAULT
|DETECT                                                       DOOR 9
|DOOR 9   DOOR 9                                              OPEN
|OPEN     OPEN                                                FAULT
|D9OPTMR  DROP9S                                              D9OPFLT
| T4:109   I:056                                               B3
|--] [-----]/[---------------------------------------------------( )--
|   DN      01                                                 229
|[57]
B3/229 - -]/[- - File #5 FAULTS -  66
         -( )- - File #5 FAULTS -  58
Rung #059
|DOOR OPEN                                          DOOR 10
|SOLENOID                                           OPEN
|10 ENABLE                                          TIMER
|DROP10                                             D10OPTMR
|   O:061                                           +-TON-----------+
|---] [---------------------------------------------|TIMER ON DELAY |-(EN)-
|    03                                             |TIMER:   T4:110|
|[2:326]                                            |BASE (SEC): 1.0|-(DN)
|                                                   |PRESET:       4|
|                                                   |ACCUM:        0|
|                                                   +---------------+
T4:110.DN - -] [- - File #5 FAULTS -  60
Rung #060
|FAULT
|DETECT                                                       DOOR 10
|DOOR 10   DOOR 10                                            OPEN
|OPEN      OPEN                                               FAULT
|D10OPTMR  DROP10S                                            D10OPFLT
| T4:110    I:056                                              B3
|--] [------]/[--------------------------------------------------( )--
|   DN       03                                                230
|[59]
```

```
B3/230 - -|/|- - File #5 FAULTS -  66
         -( )- - File #5 FAULTS -  60
Rung #061
|DOOR OPEN                                                           DOOR 11
|SOLENOID                                                            OPEN
|11 ENABLE                                                           TIMER
|DROP11                                                              D11OPTMR
|  O:061                                                             +-TON--------------+
|---] [--------------------------------------------------------------|TIMER ON DELAY    |-(EN)-
|   05                                                               |TIMER:    T4:111 |
|[2:327]                                                             |BASE (SEC):  1.0 |-(DN)
|                                                                    |PRESET:        4 |
|                                                                    |ACCUM:         0 |
|                                                                    +------------------+
T4:111.DN - -] [- - File #5 FAULTS -  62
Rung #062
|FAULT
|DETECT                                                                    DOOR 11
|DOOR 11   DOOR 11                                                         OPEN
|OPEN      OPEN                                                            FAULT
|D11OPTMR  DROP11S                                                         D11OPFLT
| T4:111   I:056                                                           B3
|---] [------]/[------------------------------------------------------------( )---
|  DN        05                                                            231
|[61]
B3/231 - -|/|- - File #5 FAULTS -  66
         -( )- - File #5 FAULTS -  62
Rung #063
|DOOR OPEN                                                           DOOR 12
|SOLENOID                                                            OPEN
|12 ENABLE                                                           TIMER
|DROP12                                                              D12OPTMR
|  O:061                                                             +-TON--------------+
|---] [--------------------------------------------------------------|TIMER ON DELAY    |-(EN)-
|   07                                                               |TIMER:    T4:112 |
|[2:351]                                                             |BASE (SEC):  1.0 |-(DN)
|                                                                    |PRESET:        4 |
|                                                                    |ACCUM:         0 |
|                                                                    +------------------+
T4:112.DN - -] [- - File #5 FAULTS -  64
Rung #064
|FAULT
|DETECT                                                                    DOOR 12
|DOOR 12   DOOR 12                                                         OPEN
|OPEN      OPEN                                                            FAULT
|D12OPTMR  DROP12S                                                         D12OPFLT
| T4:112   I:056                                                           B3
|---] [------]/[------------------------------------------------------------( )---
|  DN        07                                                            232
|[63]
B3/232 - -|/|- - File #5 FAULTS -  66
         -( )- - File #5 FAULTS -  64
Rung #065
|DOOR 1   DOOR 2   DOOR 3   DOOR 4   DOOR 5   DOOR 6   DOOR 7   DOOR 8   DOOR 9   DOOR 10   DOOR 11   DOOR 12    DOOR
|CLOSED   CLOSED   CLOSED   CLOSED   CLOSED   CLOSED   CLOSED   CLOSED   CLOSED   CLOSED    CLOSED    CLOSED     CLOSED
|FAULT    FAULT    FAULT    FAULT    FAULT    FAULT    FAULT    FAULT    FAULT    FAULT     FAULT     FAULT      NO FAULT
|D1CLFLT  D2CLFLT  D3CLFLT  D4CLFLT  D5CLFLT  D6CLFLT  D7CLFLT  D8CLFLT  D9CLFLT  D10CLFLT  D11CLFLT  D12CLFLT   DRCLNOFLT
|  B3       B3       B3       B3       B3       B3       B3       B3       B3       B3        B3        B3         B3
|--]/[------]/[------]/[------]/[------]/[------]/[------]/[------]/[------]/[------]/[-------]/[-------]/[---------( )---
|  201      202      203      204      205      206      207      208      209      210       211       212        213
|[18]     [20]     [22]     [24]     [26]     [28]     [30]     [32]     [34]     [36]      [38]      [40]
B3/213 - -|/|- - File #5 FAULTS -  67
```

```
        -( )- - File #5 FAULTS -  65
Rung #066                                   - 613 -
|DOOR 1   DOOR 2   DOOR 3   DOOR 4   DOOR 5   DOOR 6   DOOR 7   DOOR 8   DOOR 9   DOOR 10   DOOR 11   DOOR 12          DOOR        |
|OPEN     OPEN     OPEN     OPEN     OPEN     OPEN     OPEN     OPEN     OPEN     OPEN      OPEN      OPEN             OPEN        |
|FAULT    FAULT    FAULT    FAULT    FAULT    FAULT    FAULT    FAULT    FAULT    FAULT     FAULT     FAULT            NO FAULT    |
|D1OPFLT  D2OPFLT  D3OPFLT  D4OPFLT  D5OPFLT  D6OPFLT  D7OPFLT  D8OPFLT  D9OPFLT  D10OPFLT  D11OPFLT  D12OPFLT         DROPNOFLT   |
|  B3       B3       B3       B3       B3       B3       B3       B3       B3       B3        B3        B3               B3        |
|--|/|------|/|------|/|------|/|------|/|------|/|------|/|------|/|------|/|------|/|-------|/|-------|/|----------------( )-------|
|  221      222      223      224      225      226      227      228      229      230       231       232              214       |
|[42]     [44]     [46]     [48]     [50]     [52]     [54]     [56]     [58]     [60]      [62]      [64]                         |
B3/214 - -|/|- - File #5 FAULTS -  67
        -( )- - File #5 FAULTS -  66
Rung #067
| DOOR                                                                              |
| CLOSED                                                                            |
| NO FAULT                                                              DOOR FAULT  |
| DRCLNOFLT                                                             DRFLT       |
|    B3                                                                    B3       |
|----|/|----+---------------------------------------------------------------(L)------|
| |   213    |                                                               215     |
| |[65]      |                                                                      |
| |          | B3/215 - -| |- - File #2 MAIN_PRGRM - 625                           |
| |          |          -|/|- - File #2 MAIN_PRGRM - 158                           |
| |          |          -(U)- - File #5 FAULTS - 68                                |
| |DOOR      |                                                                      |
| |OPEN      |                                                                      |
| |NO FAULT  |                                                                      |
| |DROPNOFLT |                                                                      |
| |   B3     |                                                                      |
| +---|/|----+                                                                      |
|    214                                                                            |
| [66]                                                                              |
Rung #068
|PAUSE                                                                              |
|DISABLE                                                                DOOR FAULT  |
|TS12                                                                   DRFLT       |
| N7:16                                                                    B3       |
|---| |------------------------------------------------------------------(U)--------|
|    4                                                                     215      |
|[2:3]                                                                              |
B3/215 - -| |- - File #2 MAIN_PRGRM -  625
        -|/|- - File #2 MAIN_PRGRM -  158
        -(L)- - File #5 FAULTS -  67
        -(U)- - File #5 FAULTS -  68
Rung #069
|CRYO GATE                                                    CRYO VALVE              |
|HEATER 1                                                     1 OPEN                  |
|CHAMBER                                                      TIMER                   |
|HV1                                                          CV1OPTMR                |
|  O:011                                                      +--TON-------------+    |
|---| |-------------------------------------------------------+TIMER ON DELAY    +-(EN)-|
|    11                                                       |TIMER:      T4:49 |    |
|[2:115]                                                      |BASE (SEC):   1.0 +-(DN)|
|                                                             |PRESET:         7 |    |
|                                                             |ACCUM:          7 |    |
|                                                             +------------------+    |
T4:49.DN - -| |- - File #5 FAULTS -  70
```

```
Rung #070
|FAULT        HEATER 1                                                   |
|DETECT       CHAMBER                                        CRYO VALVE  |
|CRYO VALVE   GATE VALVE                                     1 OPEN      |
|1 OPEN       OPEN                                           FAULT       |
|CV1OPTMR     HV1S3                                          CV1OPFLT    |
|  T4:49       I:002                                          B3         |
|---] [--------]/[-------------------------------------------( )--------|
|    DN          10                                          251         |
|[69]                                                                    |
B3/251 - ]/[ - File #5 FAULTS - 93
       -( )- - File #5 FAULTS - 70
Rung #071
|CRYO GATE    CRYO GATE                                                  |
|SOLENOID 1   SOLENOID 2                          CRYO VALVE             |
|HEATER 2     HEATER 2                            2 OPEN                 |
|CHAMBER      CHAMBER                             TIMER                  |
|HV2_1        HV2_2                               CV2OPTMR               |
|  O:011       O:011                              +-TON--------------+   |
|---] [--------] [--------------------------------|TIMER ON DELAY    |-(EN)-|
|    13          14                               |TIMER:       T4:50|   |
|[2:117]      [2:118]                             |BASE (SEC):   1.0|-(DN)|
|                                                 |PRESET:          5|   |
|                                                 |ACCUM:           0|   |
|                                                 +------------------+   |
T4:50.DN - ] [ - File #5 FAULTS - 72
Rung #072
|FAULT        HEATER 2                                                   |
|DETECT       CHAMBER                                        CRYO VALVE  |
|CRYO VALVE   GATE VALVE                                     2 OPEN      |
|2 OPEN       OPEN                                           FAULT       |
|CV2OPTMR     HV2S3                                          CV2OPFLT    |
|  T4:50       I:004                                          B3         |
|---] [--------]/[-------------------------------------------( )--------|
|    DN          02                                          252         |
|[71]                                                                    |
B3/252 - ]/[ - File #5 FAULTS - 93
       -( )- - File #5 FAULTS - 72
Rung #073
|CRYO GATE    CRYO GATE                                                  |
|SOLENOID 1   SOLENOID 2                          CRYO VALVE             |
|DWELL 1      DWELL 1                             3 OPEN                 |
|CHAMBER      CHAMBER                             TIMER                  |
|HV3_1        HV3_2                               CV3OPTMR               |
|  O:011       O:011                              +-TON--------------+   |
|---] [--------] [--------------------------------|TIMER ON DELAY    |-(EN)-|
|    15          16                               |TIMER:       T4:51|   |
|[2:119]      [2:120]                             |BASE (SEC):   1.0|-(DN)|
|                                                 |PRESET:          5|   |
|                                                 |ACCUM:           0|   |
|                                                 +------------------+   |
T4:51.DN - ] [ - File #5 FAULTS - 74
Rung #074
|FAULT        DWELL 1                                                    |
|DETECT       CHAMBER                                        CRYO VALVE  |
|CRYO VALVE   GATE VALVE                                     3 OPEN      |
|3 OPEN       OPEN                                           FAULT       |
|CV3OPTMR     HV3S3                                          CV3OPFLT    |
|  T4:51       I:004                                          B3         |
|---] [--------]/[-------------------------------------------( )--------|
|    DN          05                                          253         |
|[73]                                                                    |
```

```
B3/253 - -|/|- - File #5 FAULTS -  93
         -( )- - File #5 FAULTS -  74
Rung #075
|CRYO GATE    CRYO GATE                                                CRYO VALVE
|SOLENOID 1   SOLENOID 2                                               4 OPEN
|DWELL 2      DWELL 2                                                  TIMER
|CHAMBER      CHAMBER                                                  CV4OPTMR
|HV4_1        HV4_2                                                    +-TON-----------------+
|  O:031        O:031                                                  |TIMER ON DELAY       |-(EN)-
|---| |---------| |----------------------------------------------------|TIMER:         T4:52|
|    11           12                                                   |BASE (SEC):     1.0|-(DN)
|[2:121]      [2:122]                                                  |PRESET:           5|
|                                                                      |ACCUM:            0|
|                                                                      +---------------------+
T4:52.DN - -| |- - File #5 FAULTS -  76
Rung #076
|FAULT        DWELL 2
|DETECT       CHAMBER                                                      CRYO VALVE
|CRYO VALVE   GATE VALVE                                                   4 OPEN
|4 OPEN       OPEN                                                         FAULT
|CV4OPTMR     HV4S3                                                        CV4OPFLT
|  T4:52        I:022                                                          B3
|---| |---------|/|--------------------------------------------------------( )---|
|    DN           10                                                          254
|[75]
B3/254 - -|/|- - File #5 FAULTS -  93
         -( )- - File #5 FAULTS -  76
Rung #077
|CRYO GATE    CRYO GATE                                                CRYO VALVE
|SOLENOID 1   SOLENOID 2                                               5 OPEN
|HEATER 2     HEATER 2                                                 TIMER
|CHAMBER      CHAMBER                                                  CV5OPTMR
|HV5_1        HV5_2                                                    +-TON-----------------+
|  O:031        O:031                                                  |TIMER ON DELAY       |-(EN)-
|---| |---------| |----------------------------------------------------|TIMER:         T4:53|
|    13           14                                                   |BASE (SEC):     1.0|-(DN)
|[2:123]      [2:124]                                                  |PRESET:           5|
|                                                                      |ACCUM:            0|
|                                                                      +---------------------+
T4:53.DN - -| |- - File #5 FAULTS -  78
Rung #078
|FAULT        HEATER 3
|DETECT       CHAMBER                                                      CRYO VALVE
|CRYO VALVE   GATE VALVE                                                   5 OPEN
|5 OPEN       OPEN                                                         FAULT
|CV5OPTMR     HV5S3                                                        CV5OPFLT
|  T4:53        I:024                                                          B3
|---| |---------|/|--------------------------------------------------------( )---|
|    DN           02                                                          255
|[77]
B3/255 - -|/|- - File #5 FAULTS -  93
         -( )- - File #5 FAULTS -  78
```

Rung #079

```
|CRYO GATE   CRYO GATE                                              CRYO VALVE
|SOLENOID 1  SOLENOID 2                                             6 OPEN
|DWELL 3     DWELL 3                                                TIMER
|CHAMBER     CHAMBER                                                CV6OPTMR
|HV6_1       HV6_2                                                  +-TON---------------+
|  O:031       O:031                                                |TIMER ON DELAY     |-(EN)-
|---] [--------] [--------------------------------------------------|TIMER:        T4:54|
|   15          16                                                  |BASE (SEC):    1.0 |-(DN)
|[2:125]      [2:126]                                               |PRESET:          5 |
|                                                                   |ACCUM:           0 |
|                                                                   +-------------------+
T4:54.DN - -] [- - File #5 FAULTS - 80
```

Rung #080

```
|FAULT       DWELL 3
|DETECT      CHAMBER                                                CRYO VALVE
|CRYO VALVE  GATE VALVE                                             6 OPEN
|6 OPEN      OPEN                                                   FAULT
|CV6OPTMR    HV6S3                                                  CV6OPFLT
|  T4:54       I:024                                                   B3
|---] [--------]/[--------------------------------------------------------( )---
|   DN          05                                                     256
|[79]
B3/256 - -]/[- - File #5 FAULTS - 93
         -( )- - File #5 FAULTS - 80
```

Rung #081

```
|CRYO GATE   CRYO GATE                                              CRYO VALVE
|SOLENOID 1  SOLENOID 2                                             7 OPEN
|DWELL 4     DWELL 4                                                TIMER
|CHAMBER     CHAMBER                                                CV7OPTMR
|HV7_1       HV7_2                                                  +-TON---------------+
|  O:045       O:045                                                |TIMER ON DELAY     |-(EN)-
|---] [--------] [--------------------------------------------------|TIMER:        T4:55|
|   11          12                                                  |BASE (SEC):    1.0 |-(DN)
|[2:127]      [2:128]                                               |PRESET:          5 |
|                                                                   |ACCUM:           0 |
|                                                                   +-------------------+
T4:55.DN - -] [- - File #5 FAULTS - 82
```

Rung #082

```
|FAULT       DWELL 4
|DETECT      CHAMBER                                                CRYO VALVE
|CRYO VALVE  GATE VALVE                                             7 OPEN
|7 OPEN      OPEN                                                   FAULT
|CV7OPTMR    HV7S3                                                  CV7OPFLT
|  T4:55       I:036                                                   B3
|---] [--------]/[--------------------------------------------------------( )---
|   DN          10                                                     257
|[81]
B3/257 - -]/[- - File #5 FAULTS - 93
         -( )- - File #5 FAULTS - 82
```

Rung #083

```
|CRYO GATE   CRYO GATE                                                                                    |
|SOLENOID 1  SOLENOID 2                                                        CRYO VALVE                 |
|BUFFER 3    BUFFER 3                                                          8 OPEN                     |
|CHAMBER     CHAMBER                                                           TIMER                      |
|HV8_1       HV8_2                                                             CV8OPTMR                   |
|  O:045       O:045                                                           +-TON--------------+       |
|---] [--------] [-------------------------------------------------------------+TIMER ON DELAY    +-(EN)-|
|    13          14                                                            |TIMER:      T4:56 |       |
|[2:129]     [2:130]                                                           |BASE (SEC):   1.0 +-(DN) |
|                                                                              |PRESET:         5 |       |
|                                                                              |ACCUM:          0 |       |
|                                                                              +------------------+       |
T4:56.DN - ] [ - File #5 FAULTS -  84
```

Rung #084

```
|FAULT       BUFFER 3                                                                                     |
|DETECT      CHAMBER                                                                          CRYO VALVE |
|CRYO VALVE  GATE VALVE                                                                       8 OPEN     |
|8 OPEN      OPEN                                                                             FAULT      |
|CV8OPTMR    HV8S3                                                                            CV8OPFLT   |
|  T4:56       I:040                                                                             B3      |
|---] [--------]/[----------------------------------------------------------------------------( )-------|
|    DN          02                                                                              258     |
|[83]                                                                                                    |
B3/258 - ]/[ - File #5 FAULTS -  93
       -( )- - File #5 FAULTS -  84
```

Rung #085

```
|CRYO GATE   CRYO GATE                                                                                    |
|SOLENOID 1  SOLENOID 2                                                        CRYO VALVE                 |
|DWELL 5     DWELL 5                                                           9 OPEN                     |
|CHAMBER     CHAMBER                                                           TIMER                      |
|HV9_1       HV9_2                                                             CV9OPTMR                   |
|  O:045       O:045                                                           +-TON--------------+       |
|---] [--------] [-------------------------------------------------------------+TIMER ON DELAY    +-(EN)-|
|    15          16                                                            |TIMER:      T4:57 |       |
|[2:131]     [2:132]                                                           |BASE (SEC):   1.0 +-(DN) |
|                                                                              |PRESET:         5 |       |
|                                                                              |ACCUM:          0 |       |
|                                                                              +------------------+       |
T4:57.DN - ] [ - File #5 FAULTS -  86
```

Rung #086

```
|FAULT       DWELL 5                                                                                      |
|DETECT      CHAMBER                                                                          CRYO VALVE |
|CRYO VALVE  GATE VALVE                                                                       9 OPEN     |
|9 OPEN      OPEN                                                                             FAULT      |
|CV9OPTMR    HV9S3                                                                            CV9OPFLT   |
|  T4:57       I:040                                                                             B3      |
|---] [--------]/[----------------------------------------------------------------------------( )-------|
|    DN          05                                                                              259     |
|[85]                                                                                                    |
B3/259 - ]/[ - File #5 FAULTS -  93
       -( )- - File #5 FAULTS -  86
```

```
Rung #087
|CRYO GATE   CRYO GATE
|SOLENOID 1  SOLENOID 2                                          CRYO VALVE
|DWELL 6     DWELL 6                                             10 OPEN
|CHAMBER     CHAMBER                                             TIMER
|HV10_1      HV10_2                                              CV10OPTRM
|  O:061       O:061                                             +-TON-----------+
|---] [--------] [-----------------------------------------------|TIMER ON DELAY |-(EN)-
|    11         12                                               |TIMER:    T4:58|
|[2:133]     [2:134]                                             |BASE (SEC):  1.0|-(DN)
|                                                                |PRESET:       5|
|                                                                |ACCUM:        0|
|                                                                +---------------+
T4:58.DN - ] [ - File #5 FAULTS - 88
Rung #088
|FAULT       DWELL 6
|DETEC       CHAMBER                                                   CRYO VALVE
|CRYO VALVE  GATE VALVE                                                10 OPEN
|10 OPEN     OPEN                                                      FAULT
|CV10OPTRM   HV10S3                                                    CV10OPFLT
|  T4:58      I:052                                                       B3
|---] [--------]/[-----------------------------------------------------( )---
|   DN         10                                                        260
|[87]
B3/260 - ]/[ - File #5 FAULTS - 93
         -( )- - File #5 FAULTS - 88
Rung #089
|CRYO GATE   CRYO GATE
|SOLENOID 1  SOLENOID 2                                          CRYO VALVE
|BUFFER 4    BUFFER 4                                            11 OPEN
|CHAMBER     CHAMBER                                             TIMER
|HV11_1      HV11_2                                              CV11OPTHR
|  O:061       O:061                                             +-TON-----------+
|---] [--------] [-----------------------------------------------|TIMER ON DELAY |-(EN)-
|    13         14                                               |TIMER:    T4:59|
|[2:135]     [2:136]                                             |BASE (SEC):  1.0|-(DN)
|                                                                |PRESET:       5|
|                                                                |ACCUM:        0|
|                                                                +---------------+
T4:59.DN - ] [ - File #5 FAULTS - 90
Rung #090
|FAULT       BUFFER 4
|DETECT      CHAMBER                                                   CRYO VALVE
|CRYO VALVE  GATE VALVE                                                11 OPEN
|11 OPEN     OPEN                                                      FAULT
|CV11OPTHR   HV11S3                                                    CV11OPFLT
|  T4:59      I:054                                                       B3
|---] [--------]/[-----------------------------------------------------( )---
|   DN         02                                                        261
|[89]
B3/261 - ]/[ - File #5 FAULTS - 93
         -( )- - File #5 FAULTS - 90
```

```
Rung #091
|CRYO GATE    CRYO GATE                                                    CRYO VALVE          |
|SOLENOID 1   SOLENOID 2                                                   12 OPEN             |
|EXBUFFER     EXBUFFER                                                     TIMER               |
|CHAMBER      CHAMBER                                                      CV12OPTMR           |
|HV12_1       HV12_2                                                      +-TON-----------+    |
|  O:061        O:061                                                     |TIMER ON DELAY |-(EN)-|
|---| |---------| |-------------------------------------------------------|TIMER:    T4:60|      |
|   15           16                                                       |BASE (SEC): 1.0|-(DN) |
|[2:137]      [2:138]                                                     |PRESET:       5|      |
|                                                                         |ACCUM:        0|      |
|                                                                         +---------------+      |
T4:60.DN - -| |- - File #5 FAULTS -  92

Rung #092
|FAULT        EXIT                                                                              |
|DETECT       BUFFER                                                                CRYO VALVE  |
|CRYO VALVE   GATE VALVE                                                            12 OPEN     |
|12 OPEN      OPEN                                                                  FAULT       |
|CV12OPTMR    HV12S3                                                                CV12OPFLT   |
|  T4:60        I:054                                                                  B3       |
|---| |---------|/|------------------------------------------------------------------( )--------|
|    DN           05                                                                   262      |
|[91]                                                                                           |
B3/262 - -|/|- - File #5 FAULTS -  93
         -( )- - File #5 FAULTS -  92

Rung #093
|CRYO VALVE  CRYO VALVE  CRYO VALVE  CRYO VALVE  CRYO VALVE  CRYO VALVE  CRYO VALVE  CRYO VALVE  CRYO VALVE  CRYO VALVE
|1 OPEN      2 OPEN      3 OPEN      4 OPEN      5 OPEN      6 OPEN      7 OPEN      8 OPEN      9 OPEN      10 OPEN
|FAULT       FAULT       FAULT       FAULT       FAULT       FAULT       FAULT       FAULT       FAULT       FAULT
|CV1OPFLT    CV2OPFLT    CV3OPFLT    CV4OPFLT    CV5OPFLT    CV6OPFLT    CV7OPFLT    CV8OPFLT    CV9OPFLT    CV10OPFLT
|   B3          B3          B3          B3          B3          B3          B3          B3          B3          B3
|---|/|-------|/|---------|/|---------|/|---------|/|---------|/|---------|/|---------|/|---------|/|---------|/|---
|   251         252         253         254         255         256         257         258         259         260
|[70]        [72]        [74]        [76]        [78]        [80]        [82]        [84]        [86]        [88]
                                                                                     CRYO VALVE  CRYO VALVE              |
                                                                                     11 OPEN     12 OPEN     CRYO VALVE  |
                                                                                     FAULT       FAULT       OPEN FAULT  |
                                                                                     CV11OPFLT   CV12OPFLT   CVOPFLT     |
                                                                                        B3          B3          B3       |
                                                                                     ---|/|---------|/|---------( )------|
                                                                                        261         262         312      |
                                                                                     [90]        [92]                    |
B3/312 - -|/|- - File #5 FAULTS -  142
         -( )- - File #5 FAULTS -  93

Rung #094
|CRYO GATE    CRYO GATE                                                   CRYO VALVE            |
|SOLENOID 1   SOLENOID 2                                                  2 THROTTLE            |
|HEATER 2     HEATER 2                                                    TIMER                 |
|CHAMBER      CHAMBER                                                     CV2THTMR              |
|HV2_1        HV2_2                                                      +-TON------------+     |
|  O:011        O:011                                                    |TIMER ON DELAY  |-(EN)-|
|---|/|---------| |------------------------------------------------------|TIMER:    T4:114|      |
|    13           14                                                     |BASE (SEC):  1.0|-(DN) |
|[2:117]      [2:118]                                                    |PRESET:        5|      |
|                                                                        |ACCUM:         5|      |
|                                                                        +----------------+      |
T4:114.DN - -| |- - File #5 FAULTS -  95
```

Rung #095
```
|FAULT        HEATER 2                                               |
|DETECT       CHAMBER                                   CRYO VALVE   |
|CRYO VALVE   GATE VALVE                                2 THROTTLE   |
|2 THROTTLE   THROTTLED                                 FAULT        |
|CV2THTMR     HV2S2                                     CV2THFLT     |
|  T4:114      I:004                                       B3        |
|---] [--------]/[----------------------------------------( )--------|
|    DN         01                                        234        |
|[94]                                                                |
B3/234 - ]/[ - File #5 FAULTS - 116
       -( )- - File #5 FAULTS - 95
```

Rung #096
```
|CRYO GATE    CRYO GATE                                              |
|SOLENOID 1   SOLENOID 2                       CRYO VALVE            |
|DWELL 1      DWELL 1                          3 THROTTLE            |
|CHAMBER      CHAMBER                          TIMER                 |
|HV3_1        HV3_2                            CV3THTMR              |
|  O:011        O:011                          +-TON------------+    |
|---]/[--------] [-----------------------------+TIMER ON DELAY  +-(EN)-|
|    15           16                           |TIMER:    T4:115|    |
|[2:119]      [2:120]                          |BASE (SEC):  1.0+-(DN)|
|                                              |PRESET:        5|    |
|                                              |ACCUM:         5|    |
|                                              +----------------+    |
T4:115.DN - ] [ - File #5 FAULTS - 97
```

Rung #097
```
|FAULT        DWELL 1                                                |
|DETECT       CHAMBER                                   CRYO VALVE   |
|CRYO VALVE   GATE VALVE                                3 THROTTLE   |
|3 THROTTLE   THROTTLED                                 FAULT        |
|CV3THTMR     HV3S2                                     CV3THFLT     |
|  T4:115      I:004                                       B3        |
|---] [--------]/[----------------------------------------( )--------|
|    DN         04                                        235        |
|[96]                                                                |
B3/235 - ]/[ - File #5 FAULTS - 116
       -( )- - File #5 FAULTS - 97
```

Rung #098
```
|CRYO GATE    CRYO GATE                                              |
|SOLENOID 1   SOLENOID 2                       CRYO VALVE            |
|DWELL 2      DWELL 2                          4 THROTTLE            |
|CHAMBER      CHAMBER                          TIMER                 |
|HV4_1        HV4_2                            CV4THTMR              |
|  O:031        O:031                          +-TON------------+    |
|---]/[--------] [-----------------------------+TIMER ON DELAY  +-(EN)-|
|    11           12                           |TIMER:    T4:116|    |
|[2:121]      [2:122]                          |BASE (SEC):  1.0+-(DN)|
|                                              |PRESET:        5|    |
|                                              |ACCUM:         5|    |
|                                              +----------------+    |
T4:116.DN - ] [ - File #5 FAULTS - 99
```

Rung #099
```
|FAULT        DWELL 2                                                |
|DETECT       CHAMBER                                   CRYO VALVE   |
|CRYO VALVE   GATE VALVE                                4 THROTTLE   |
|4 THROTTLE   THROTTLED                                 FAULT        |
|CV4THTMR     HV4S2                                     CV4THFLT     |
|  T4:116      I:022                                       B3        |
|---] [--------]/[----------------------------------------( )--------|
|    DN         07                                        236        |
|[98]                                                                |
```

```
B3/236 - -|/|- - File #5 FAULTS -  116
        -( )- - File #5 FAULTS -  99
```

```
Rung #100
|CRYO GATE   CRYO GATE
|SOLENOID 1  SOLENOID 2                                                        CRYO VALVE
|HEATER 2    HEATER 2                                                          5 THROTTLE
|CHAMBER     CHAMBER                                                           TIMER
|HVS_1       HVS_2                                                             CVSTHTMR
|  O:031      O:031                                                           +--TON--------+
|---|/|-------| |-------------------------------------------------------------|TIMER ON DELAY|-(EN)-|
|    13        14                                                             |TIMER:  T4:117|
|[2:123]     [2:124]                                                          |BASE (SEC): 1.0|-(DN)
|                                                                             |PRESET:      5|
|                                                                             |ACCUM:       5|
|                                                                             +--------------+
T4:117.DN - -| |- - File #5 FAULTS -  101
Rung #101
|FAULT       HEATER 3
|DETECT      CHAMBER                                                                   CRYO VALVE
|CRYO VALVE  GATE VALVE                                                                5 THROTTLE
|5 THROTTLE  THROTTLED                                                                 FAULT
|CVSTHTMR    HV5S2                                                                     CVSTHFLT
|  T4:117     I:024                                                                       B3
|---| |-------|/|--------------------------------------------------------------------------( )---|
|    DN        01                                                                         237
|[100]
B3/237 - -|/|- - File #5 FAULTS -  116
        -( )- - File #5 FAULTS -  101
Rung #102
|CRYO GATE   CRYO GATE
|SOLENOID 1  SOLENOID 2                                                        CRYO VALVE
|DWELL 3     DWELL 3                                                           6 THROTTLE
|CHAMBER     CHAMBER                                                           TIMER
|HV6_1       HV6_2                                                             CV6THTMR
|  O:031      O:031                                                           +--TON--------+
|---|/|-------| |-------------------------------------------------------------|TIMER ON DELAY|-(EN)-|
|    15        16                                                             |TIMER:  T4:118|
|[2:125]     [2:126]                                                          |BASE (SEC): 1.0|-(DN)
|                                                                             |PRESET:      5|
|                                                                             |ACCUM:       5|
|                                                                             +--------------+
T4:118.DN - -| |- - File #5 FAULTS -  103
Rung #103
|FAULT       DWELL 3
|DETECT      CHAMBER                                                                   CRYO VALVE
|CRYO VALVE  GATE VALVE                                                                6 THROTTLE
|6 THROTTLE  THROTTLED                                                                 FAULT
|CV6THTMR    HV6S2                                                                     CV6THFLT
|  T4:118     I:024                                                                       B3
|---| |-------|/|--------------------------------------------------------------------------( )---|
|    DN        04                                                                         238
|[102]
B3/238 - -|/|- - File #5 FAULTS -  116
        -( )- - File #5 FAULTS -  103
```

```
Rung #104
|CRYO GATE    CRYO GATE                                              CRYO VALVE
|SOLENOID 1   SOLENOID 2                                             7 THROTTLE
|DWELL 4      DWELL 4                                                TIMER
|CHAMBER      CHAMBER                                                CV7THTMR
|HV7_1        HV7_2                                                  +-TON-----------+
|  O:045        O:045                                                |               |
+--]/[----------] [--------------------------------------------------+TIMER ON DELAY +-(EN)-
|   11           12                                                  |TIMER:   T4:119|
|(2:127)      (2:128)                                                |BASE (SEC): 1.0+-(DN)
|                                                                    |PRESET:       5|
|                                                                    |ACCUM:        5|
|                                                                    +---------------+
T4:119.DN - ] [ - File #5 FAULTS -  105
Rung #105
|FAULT        DWELL 4                                                CRYO VALVE
|DETECT       CHAMBER                                                7 THROTTLE
|CRYO VALVE   GATE VALVE                                             FAULT
|7 THROTTLE   THROTTLED                                              CV7THFLT
|CV7THTMR     HV7S2                                                     B3
|  T4:119       I:036
+--] [----------]/[------------------------------------------------------( )---
|   DN           07                                                     239
|[104]
B3/239 - ]/[ - File #5 FAULTS -  116
         ( ) - File #5 FAULTS -  105
Rung #106
|CRYO GATE    CRYO GATE                                              CRYO VALVE
|SOLENOID 1   SOLENOID 2                                             8 THROTTLE
|BUFFER 3     BUFFER 3                                               TIMER
|CHAMBER      CHAMBER                                                CV8THTMR
|HV8_1        HV8_2                                                  +-TON-----------+
|  O:045        O:045                                                |               |
+--]/[----------] [--------------------------------------------------+TIMER ON DELAY +-(EN)-
|   13           14                                                  |TIMER:   T4:120|
|(2:129)      (2:130)                                                |BASE (SEC): 1.0+-(DN)
|                                                                    |PRESET:       5|
|                                                                    |ACCUM:        5|
|                                                                    +---------------+
T4:120.DN - ] [ - File #5 FAULTS -  107
Rung #107
|FAULT        BUFFER 3                                               CRYO VALVE
|DETECT       CHAMBER                                                8 THROTTLE
|CRYO VALVE   GATE VALVE                                             FAULT
|8 THROTTLE   THROTTLED                                              CV8THFLT
|CV8THTMR     HV8S2                                                     B3
|  T4:120       I:040
+--] [----------]/[------------------------------------------------------( )---
|   DN           01                                                     240
|[106]
B3/240 - ]/[ - File #5 FAULTS -  116
         ( ) - File #5 FAULTS -  107
```

```
Rung #108
|CRYO GATE   CRYO GATE
|SOLENOID 1  SOLENOID 2
|DWELL 5     DWELL 5                                              CRYO VALVE
|CHAMBER     CHAMBER                                              9 THROTTLE
|HV9_1       HV9_2                                                TIMER
|  O:045       O:045                                              CV9THTMR
|                                                                 +-TON----------+
|---|/|--------| |------------------------------------------------|TIMER ON DELAY |-(EN)-
|   15         16                                                 |TIMER:  T4:121|
|[2:131]     [2:132]                                              |BASE (SEC): 1.0|-(DN)
|                                                                 |PRESET:      5|
|                                                                 |ACCUM:       5|
|                                                                 +--------------+
T4:121.DN - -| |- - File #5 FAULTS - 109
Rung #109
|FAULT       DWELL 5
|DETECT      CHAMBER
|CRYO VALVE  GATE VALVE                                                   CRYO VALVE
|9 THROTTLE  THROTTLED                                                    9 THROTTLE
|CV9THTMR    HV9S2                                                        FAULT
|  T4:121      I:040                                                      CV9THFLT
|                                                                            B3
|---| |--------|/|----------------------------------------------------------( )---
|   DN         04                                                            241
|[108]
B3/241 - -|/|- - File #5 FAULTS - 116
       -( )- - File #5 FAULTS - 109
Rung #110
|CRYO GATE   CRYO GATE
|SOLENOID 1  SOLENOID 2
|DWELL 6     DWELL 6                                              CRYO VALVE
|CHAMBER     CHAMBER                                              10THROTTLE
|HV10_1      HV10_2                                               TIMER
|  O:061       O:061                                              CV10THTMR
|                                                                 +-TON----------+
|---| |--------|/|------------------------------------------------|TIMER ON DELAY |-(EN)-
|   11         12                                                 |TIMER:  T4:122|
|[2:133]     [2:134]                                              |BASE (SEC): 1.0|-(DN)
|                                                                 |PRESET:      5|
|                                                                 |ACCUM:       0|
|                                                                 +--------------+
T4:122.DN - -| |- - File #5 FAULTS - 111
Rung #111
|FAULT       DWELL 6
|DETECT      CHAMBER
|CRYO VALVE  GATE VALVE                                                   CRYO VALVE
|10THROTTLE  THROTTLED                                                    10THROTTLE
|CV10THTMR   HV10S2                                                       FAULT
|  T4:122      I:052                                                      CV10THFLT
|                                                                            B3
|---| |--------|/|----------------------------------------------------------( )---
|   DN         07                                                            242
|[110]
B3/242 - -|/|- - File #5 FAULTS - 116
       -( )- - File #5 FAULTS - 111
```

```
Rung #112
|CRYO GATE    CRYO GATE                                              CRYO VALVE
|SOLENOID 1   SOLENOID 2                                             11THROTTLE
|BUFFER 4     BUFFER 4                                               TIMER
|CHAMBER      CHAMBER                                                CV11THTMR
|HV11_1       HV11_2                                                 +-TON--------------+
|  O:061        O:061                                                |TIMER ON DELAY    |-(EN)-
|---]/[---------] [----------------------------------------------------|TIMER:     T4:123|
|   13           14                                                  |BASE (SEC):  1.0|-(DN)
|[2:135]      [2:136]                                                |PRESET:        5|
|                                                                    |ACCUM:         5|
|                                                                    +------------------+
T4:123.DN - ] [ - File #5 FAULTS - 113
Rung #113
|FAULT        BUFFER 4
|DETECT       CHAMBER                                                CRYO VALVE
|CRYO VALVE   GATE VALVE                                             11THROTTLE
|11THROTTLE   THROTTLED                                              FAULT
|CV11THTMR    HV11S2                                                 CV11THFLT
|  T4:123       I:054                                                B3
|---] [---------]/[------------------------------------------------------( )---
|    DN          01                                                  243
|[112]
B3/243 - ]/[ - File #5 FAULTS - 116
       -( )- - File #5 FAULTS - 113
Rung #114
|CRYO GATE    CRYO GATE
|SOLENOID 1   SOLENOID 2                                             CRYO VALVE
|EXBUFFER     EXBUFFER                                               12THROTTLE
|CHAMBER      CHAMBER                                                TIMER
|HV12_1       HV12_2                                                 CV12THTMR
|  O:061        O:061                                                +-TON--------------+
|---]/[---------] [----------------------------------------------------|TIMER ON DELAY    |-(EN)-
|   15           16                                                  |TIMER:     T4:124|
|[2:137]      [2:138]                                                |BASE (SEC):  1.0|-(DN)
|                                                                    |PRESET:        5|
|                                                                    |ACCUM:         5|
|                                                                    +------------------+
T4:124.DN - ] [ - File #5 FAULTS - 115
Rung #115
|FAULT        EXIT
|DETECT       BUFFER                                                 CRYO VALVE
|CRYO VALVE   GATE VALVE                                             12THROTTLE
|12THROTTLE   THROTTLED                                              FAULT
|CV12THTMR    HV12S2                                                 CV12THFLT
|  T4:124       I:054                                                B3
|---] [---------]/[------------------------------------------------------( )---
|    DN          04                                                  244
|[114]
B3/244 - ]/[ - File #5 FAULTS - 116
       -( )- - File #5 FAULTS - 115
Rung #116
|CRYO VALVE  CRYO VALVE  CRYO VALVE  CRYO VALVE  CRYO VALVE  CRYO VALVE  CRYO VALVE  CRYO VALVE  CRYO VALVE  CRYO VALVE
|2 THROTTLE  3 THROTTLE  4 THROTTLE  5 THROTTLE  6 THROTTLE  7 THROTTLE  8 THROTTLE  9 THROTTLE  10THROTTLE  11THROTTLE
|FAULT       FAULT       FAULT       FAULT       FAULT       FAULT       FAULT       FAULT       FAULT       FAULT
|CV2THFLT    CV3THFLT    CV4THFLT    CV5THFLT    CV6THFLT    CV7THFLT    CV8THFLT    CV9THFLT    CV10THFLT   CV11THFLT
|  B3          B3          B3          B3          B3          B3          B3          B3          B3          B3
|---]/[-------]/[---------]/[---------]/[---------]/[---------]/[---------]/[---------]/[---------]/[---------]/[---
|  234         235         236         237         238         239         240         241         242         243
|[95]        [97]        [99]        [101]       [103]       [105]       [107]       [109]       [111]       [113]
                                                                                                 CRYO VALVE  CRYO VALVE
                                                                                                 12THROTTLE  THROTTLE
```

```
                                                                         FAULT       FAULT
                                                                         CV12TKFLT   CVTKFLT
                                                                         B3          B3
                                                                     ----]/[--------( )----
                                                                         244         311
                                                                     [115]
B3/311 - ]/[ - File #5 FAULTS - 142
         ( ) - File #5 FAULTS - 116
Rung #117
|CRYO GATE
|HEATER 1
|CHAMBER                                                             CYRO VALVE
|HV1                                                                 1 CLOSE
|  O:011                                                             TIMER
|---]/[------------------------------------------------------------- CV1CLTMR
|   11                                                               +-TON--------------+
|[2:115]                                                            -|TIMER ON DELAY    |-(EN)-
|                                                                    |TIMER:    T4:131  |
|                                                                    |BASE (SEC):  1.0  |-(DN)
|                                                                    |PRESET:        7  |
|                                                                    |ACCUM:         0  |
                                                                     +------------------+
T4:131.DN - ] [ - File #5 FAULTS - 118
Rung #118
|FAULT        HEATER 1
|DETECT       CHAMBER
|CRYO VALVE   GATE VALVE                                                       CRYO VALVE
|1 CLOSE      CLOSE                                                            1 CLOSE
|CV1CLTMR     HV1S1                                                            FAULT
|  T4:131     I:002                                                            CV1CLFLT
|---] [---------]/[----------------------------------------------------------- B3
|   DN          06                                                         ----( )----
|[117]                                                                         151
B3/151 - ]/[ - File #5 FAULTS - 141
         ( ) - File #5 FAULTS - 118
Rung #119
|CRYO GATE    CRYO GATE
|SOLENOID 1   SOLENOID 2
|HEATER 2     HEATER 2                                              CRYO VALVE
|CHAMBER      CHAMBER                                               2 CLOSE
|HV2_1        HV2_2                                                 TIMER
|  O:011      O:011                                                 CV2CLTMR
|---]/[---------]/[------------------------------------------------ +-TON--------------+
|   13          14                                                 -|TIMER ON DELAY    |-(EN)-
|[2:117]      [2:118]                                               |TIMER:    T4:132  |
|                                                                   |BASE (SEC):  1.0  |-(DN)
|                                                                   |PRESET:        5  |
|                                                                   |ACCUM:         0  |
                                                                    +------------------+
T4:132.DN - ] [ - File #5 FAULTS - 120
Rung #120
|FAULT        HEATER 2
|DETECT       CHAMBER
|CRYO VALVE   GATE VALVE                                                       CRYO VALVE
|2 CLOSE      CLOSE                                                            2 CLOSE
|CV2CLTMR     HV2S1                                                            FAULT
|  T4:132     I:004                                                            CV2CLFLT
|---] [---------]/[----------------------------------------------------------- B3
|   DN          00                                                         ----( )----
|[119]                                                                         152
B3/152 - ]/[ - File #5 FAULTS - 141
         ( ) - File #5 FAULTS - 120
```

Rung #121

```
|CRYO GATE    CRYO GATE                                                  CRYO VALVE
|SOLENOID 1   SOLENOID 2                                                 3 CLOSE
|DWELL 1      DWELL 1                                                    TIMER
|CHAMBER      CHAMBER                                                    CV3CLTMR
|HV3_1        HV3_2                                                      +-TON-----------------+
|  O:011        O:011                                                    |                     |
|---|/|---------|/|------------------------------------------------------+TIMER ON DELAY       +-(EN)-
|    15          16                                                      |TIMER:       T4:133|
|[2:119]      [2:120]                                                    |BASE (SEC):     1.0+-(DN)
|                                                                        |PRESET:           5|
|                                                                        |ACCUM:            0|
|                                                                        +---------------------+
```

T4:133.DN - -| |- - File #5 FAULTS - 122

Rung #122

```
|FAULT        DWELL 1
|DETECT       CHAMBER                                                    CRYO VALVE
|CRYO VALVE   GATE VALVE                                                 3 CLOSED
|3 CLOSE      CLOSED                                                     FAULT
|CV3CLTMR     HV3S1                                                      CV3CLFLT
|  T4:133       I:004                                                       B3
|---| |---------|/|--------------------------------------------------------( )---
|   DN           03                                                        153
|[121]
```

B3/153 - -|/|- - File #5 FAULTS - 141
-( )- - File #5 FAULTS - 122

Rung #123

```
|CRYO GATE    CRYO GATE
|SOLENOID 1   SOLENOID 2                                                 CRYO VALVE
|DWELL 2      DWELL 2                                                    4 CLOSE
|CHAMBER      CHAMBER                                                    TIMER
|HV4_1        HV4_2                                                      DV4CLFLT
|  O:031        O:031                                                    +-TON-----------------+
|---|/|---------|/|------------------------------------------------------+TIMER ON DELAY       +-(EN)-
|    11          12                                                      |TIMER:       T4:134|
|[2:121]      [2:122]                                                    |BASE (SEC):     1.0+-(DN)
|                                                                        |PRESET:           5|
|                                                                        |ACCUM:            0|
|                                                                        +---------------------+
```

T4:134.DN - -| |- - File #5 FAULTS - 124

Rung #124

```
|FAULT        DWELL 2
|DETECT       CHAMBER                                                    CRYO VALVE
|CRYO VALVE   GATE VALVE                                                 4 CLOSE
|4 CLOSE      CLOSED                                                     FAULT
|DV4CLFLT     HV4S1                                                      CV4CLFLT
|  T4:134       I:022                                                       B3
|---| |---------|/|--------------------------------------------------------( )---
|   DN           06                                                        154
|[123]
```

B3/154 - -|/|- - File #5 FAULTS - 141
-( )- - File #5 FAULTS - 124

```
Rung #129
|CRYO GATE    CRYO GATE
|SOLENOID 1   SOLENOID 2                                                   CRYO VALVE
|DWELL 4      DWELL 4                                                      7 CLOSE
|CHAMBER      CHAMBER                                                      TIMER
|HV7_1        HV7_2                                                        CV7CLTMR
|  O:045        O:045                                                      +-TON-----------------+
|---|/|---------|/|--------------------------------------------------------+TIMER ON DELAY       +-(EN)-|
|    11          12                                                        |TIMER:       T4:137  |
|[2:127]      [2:128]                                                      |BASE (SEC):   1.0    +-(DN) |
|                                                                          |PRESET:         5    |
|                                                                          |ACCUM:          0    |
|                                                                          +---------------------+
T4:137.DN - -| |- - File #5 FAULTS -  130
Rung #130
|FAULT        DWELL 4
|DETECT       CHAMBER                                                           CRYO VALVE
|CRYO VALVE   GATE VALVE                                                        7 CLOSE
|7 CLOSE      CLOSED                                                            FAULT
|CV7CLTMR     HV7S1                                                             DV7CLFLT
|  T4:137       I:036                                                              B3
|---| |---------|/|----------------------------------------------------------------( )---|
|    DN          06                                                                157
|[129]
B3/157 - -|/|- - File #5 FAULTS -  141
         -( )- - File #5 FAULTS -  130
Rung #131
|CRYO GATE    CRYO GATE
|SOLENOID 1   SOLENOID 2                                                   CRYO VALVE
|BUFFER 3     BUFFER 3                                                     8 CLOSE
|CHAMBER      CHAMBER                                                      TIMER
|HV8_1        HV8_2                                                        CV8CLTMR
|  O:045        O:045                                                      +-TON-----------------+
|---|/|---------|/|--------------------------------------------------------+TIMER ON DELAY       +-(EN)-|
|    13          14                                                        |TIMER:       T4:138  |
|[2:129]      [2:130]                                                      |BASE (SEC):   1.0    +-(DN) |
|                                                                          |PRESET:         5    |
|                                                                          |ACCUM:          0    |
|                                                                          +---------------------+
T4:138.DN - -| |- - File #5 FAULTS -  132
Rung #132
|FAULT        BUFFER 3
|DETECT       CHAMBER                                                           CRYO VALVE
|CRYO VALVE   GATE VALVE                                                        8 CLOSE
|8 CLOSE      CLOSED                                                            FAULT
|CV8CLTMR     HV8S1                                                             CV8CLFLT
|  T4:138       I:040                                                              B3
|---| |---------|/|----------------------------------------------------------------( )---|
|    DN          00                                                                158
|[131]
B3/158 - -|/|- - File #5 FAULTS -  141
         -( )- - File #5 FAULTS -  132
```

```
Rung #133
|CRYO GATE   CRYO GATE                                                                                    |
|SOLENOID 1  SOLENOID 2                                                                CRYO VALVE         |
|DWELL 5     DWELL 5                                                                   9 CLOSE            |
|CHAMBER     CHAMBER                                                                   TIMER              |
|HV9_1       HV9_2                                                                     CV9CLTMR           |
|  O:045       O:045                                                                   +--TON-----------+ |
|---|/|---------|/|--------------------------------------------------------------------|TIMER ON DELAY  |-(EN)-|
|   15          16                                                                     |TIMER:    T4:139| |
|[2:131]      [2:132]                                                                  |BASE (SEC): 1.0 |-(DN) |
|                                                                                      |PRESET:        5| |
|                                                                                      |ACCUM:         0| |
|                                                                                      +----------------+ |
T4:139.DN - -| |- - File #5 FAULTS -  134
Rung #134
|FAULT       DWELL 5                                                                                      |
|DETECT      CHAMBER                                                                         CRYO VALVE   |
|CRYO VALVE  GATE VALVE                                                                      9 CLOSE      |
|9 CLOSE     CLOSED                                                                          FAULT        |
|CV9CLTMR    HV9S1                                                                           CV9CLFLT     |
|  T4:139      I:040                                                                           B3         |
|---| |---------|/|----------------------------------------------------------------------------( )--------|
|   DN          03                                                                             159        |
|[133]                                                                                                    |
B3/159 - -|/|- - File #5 FAULTS -  141
       -( )- - File #5 FAULTS -  134
Rung #135
|CRYO GATE   CRYO GATE                                                                                    |
|SOLENOID 1  SOLENOID 2                                                                CRYO VALVE         |
|DWELL 6     DWELL 6                                                                   10 CLOSE           |
|CHAMBER     CHAMBER                                                                   TIMER              |
|HV10_1      HV10_2                                                                    CV10CLTMR          |
|  O:061       O:061                                                                   +--TON-----------+ |
|---|/|---------|/|--------------------------------------------------------------------|TIMER ON DELAY  |-(EN)-|
|   11          12                                                                     |TIMER:    T4:140| |
|[2:133]      [2:134]                                                                  |BASE (SEC): 1.0 |-(DN) |
|                                                                                      |PRESET:        5| |
|                                                                                      |ACCUM:         0| |
|                                                                                      +----------------+ |
T4:140.DN - -| |- - File #5 FAULTS -  136
Rung #136
|FAULT       DWELL 6                                                                                      |
|DETECT      CHAMBER                                                                         CRYO VALVE   |
|CRYO VALVE  GATE VALVE                                                                      10 CLOSE     |
|10 CLOSE    CLOSED                                                                          FAULT        |
|CV10CLTMR   HV10S1                                                                          CV10CLFLT    |
|  T4:140      I:052                                                                           B3         |
|---| |---------|/|----------------------------------------------------------------------------( )--------|
|   DN          06                                                                             160        |
|[135]                                                                                                    |
B3/160 - -|/|- - File #5 FAULTS -  141
       -( )- - File #5 FAULTS -  136
```

```
Rung #137
|CRYO GATE   CRYO GATE
|SOLENOID 1  SOLENOID 2                                                        CRYO VALVE
|BUFFER 4    BUFFER 4                                                          11 CLOSE
|CHAMBER     CHAMBER                                                           TIMER
|HV11_1      HV11_2                                                            CV11CLTMR
|  O:061       O:061                                                          +-TON--------------+
|---|/|--------|/|-------------------------------------------------------------+TIMER ON DELAY    +-(EN)-
|    13         14                                                             |TIMER:     T4:141 |
|[2:135]     [2:136]                                                           |BASE (SEC):   1.0 +-(DN)
|                                                                              |PRESET:         5 |
|                                                                              |ACCUM:          0 |
|                                                                              +------------------+
T4:141.DN - -| |- - File #5 FAULTS - 138
Rung #138
|FAULT       BUFFER 4
|DETECT      CHAMBER                                                                     CRYO VALVE
|CRYO VALVE  GATE VALVE                                                                  11 CLOSE
|11 CLOSE    CLOSED                                                                      FAULT
|CV11CLTMR   HV11S1                                                                      CV11CLFLT
|  T4:141      I:054                                                                        B3
|---| |--------|/|-------------------------------------------------------------------------( )---
|    DN         00                                                                          161
|[137]
B3/161 - -|/|- - File #5 FAULTS - 141
         -( )- - File #5 FAULTS - 138
Rung #139
|CRYO GATE   CRYO GATE
|SOLENOID 1  SOLENOID 2                                                        CRYO VALVE
|EXBUFFER    EXBUFFER                                                          12 CLOSE
|CHAMBER     CHAMBER                                                           TIMER
|HV12_1      HV12_2                                                            CV12CLTMR
|  O:061       O:061                                                          +-TON--------------+
|---|/|--------|/|-------------------------------------------------------------+TIMER ON DELAY    +-(EN)-
|    15         16                                                             |TIMER:     T4:142 |
|[2:137]     [2:138]                                                           |BASE (SEC):   1.0 +-(DN)
|                                                                              |PRESET:         5 |
|                                                                              |ACCUM:          0 |
|                                                                              +------------------+
T4:142.DN - -| |- - File #5 FAULTS - 140
Rung #140
|FAULT       EXITLOCK
|DETECT      CHAMBER                                                                     CRYO VALVE
|CRYO VALVE  GATE VALVE                                                                  12 CLOSE
|12 CLOSE    CLOSED                                                                      FAULT
|CV12CLTMR   HV12S1                                                                      CV12CLFLT
|  T4:142      I:054                                                                        B3
|---| |--------|/|-------------------------------------------------------------------------( )---
|    DN         03                                                                          162
|[139]
B3/162 - -|/|- - File #5 FAULTS - 141
         -( )- - File #5 FAULTS - 140
Rung #141
|CRYO VALVE CRYO VALVE CRYO VALVE CRYO VALVE CRYO VALVE CRYO VALVE CRYO VALVE CRYO VALVE CRYO VALVE CRYO VALVE
|1 CLOSE    2 CLOSE    3 CLOSED   4 CLOSE    5 CLOSE    6 CLOSE    7 CLOSE    8 CLOSE    9 CLOSE    10 CLOSE
|FAULT      FAULT      FAULT      FAULT      FAULT      FAULT      FAULT      FAULT      FAULT      FAULT
|CV1CLFLT   CV2CLFLT   CV3CLFLT   CV4CLFLT   CV5CLFLT   CV6CLFLT   DV7CLFLT   CV8CLFLT   CV9CLFLT   CV10CLFLT
|   B3         B3         B3         B3         B3         B3         B3         B3         B3         B3
|---|/|--------|/|--------|/|--------|/|--------|/|--------|/|--------|/|--------|/|--------|/|--------|/|---
|   151        152        153        154        155        156        157        158        159        160
|[118]      [120]      [122]      [124]      [126]      [128]      [130]      [132]      [134]      [136]
                                                                                CRYO VALVE CRYO VALVE CRYO VALVE
                                                                                11 CLOSE   12 CLOSE   CLOSE
```

```
                                                              FAULT      FAULT      FAULT       |
                                                              CV11CLFLT  CV12CLFLT  CVCLFLT     |
                                                                 B3         B3        B3        |
                                                              ---|/|--------|/|-------( )-------|
                                                                 161        162       313       |
                                                              [138]      [140]                  |
B3/313 - -|/|- - File #5 FAULTS - 142
        -( )- - File #5 FAULTS - 141
```

Rung #142

```
|CRYO VALVE                CRYO VALVE                                                          |
|THROTTLE    CRYO VALVE    CLOSE                                              HIVAC VALVE     |
|FAULT       OPEN FAULT    FAULT                                              FAULT           |
|CVTHFLT     CVOPFLT       CVCLFLT                                            HVFLT           |
|   B3          B3            B3                                                 B3           |
|---|/|---------|/|-----------|/|--------------------------------------------------(L)--------|
|   311         312           313                                               245           |
|[116]       [93]          [141]                                                              |
B3/245 - -| |- - File #2 MAIN_PRGRM - 625
        -(L)- - File #5 FAULTS - 142
        -(U)- - File #5 FAULTS - 143
```

Rung #143

```
|PAUSE                                                                        HIVAC VALVE     |
|DISABLE                                                                      FAULT           |
|TS12                                                                         HVFLT           |
|  N7:16                                                                         B3           |
|---| |------------------------------------------------------------------------------(U)------|
|   4                                                                            245          |
|[2:3]                                                                                         |
B3/245 - -| |- - File #2 MAIN_PRGRM - 625
        -(L)- - File #5 FAULTS - 142
        -(U)- - File #5 FAULTS - 143
```

Rung #144

```
|                                                                   OPEN                         |
|OPEN                                                               CHAMBER                      |
|DWELL 2                                                            VENT VALVE                   |
|VENT VALVE                                                         2 TIMER                      |
|CV2                                                                OPCHV2T                      |
|  O:007                                                            +-TON-------------------+    |
|---| |-------------------------------------------------------------|TIMER ON DELAY         |-(EN)-|
|    17                                                             |TIMER:         T4:145  |    |
|[2:396]                                                            |BASE (SEC):       1.0  |-(DN) |
|                                                                   |PRESET:             5  |    |
|                                                                   |ACCUM:              0  |    |
|                                                                   +-----------------------+    |
T4:145.DN - -| |- - File #5 FAULTS - 145
```

Rung #145

```
|FAULT                                                                                        |
|DETECT      DWELL 1                                                         CHAMBER          |
|CHAMBER     CHAMBER                                                         VENT VALVE       |
|VENT VALVE  VENT VALVE                                                      2 OPEN           |
|2 OPEN      OPEN                                                            FAULT            |
|OPCHV2T     CVS4                                                            CHV2OPF          |
|  T4:145      I:002                                                            B3            |
|---| |---------|/|---------------------------------------------------------------( )---------|
|    DN          14                                                            165            |
|[144]                                                                                        |
B3/165 - -|/|- - File #5 FAULTS - 156
        -( )- - File #5 FAULTS - 145
```

Rung #146

```
|                                                            CLOSE
|OPEN                                                        CHAMBER
|DWELL 2                                                     VENT VALVE
|VENT VALVE                                                  2 TIMER
|CV2                                                         CLCHV2T
|  O:007                                                     +-TON------------------+
+--]/[-------------------------------------------------------+TIMER ON DELAY        +-(EN)-
|   17                                                       |TIMER:        T4:146  |
|[2:396]                                                     |BASE (SEC):      1.0  +-(DN)
|                                                            |PRESET:            5  |
|                                                            |ACCUM:             5  |
|                                                            +----------------------+
T4:146.DN - ] [ - File #5 FAULTS - 147
```

Rung #147

```
|FAULT
|DETECT       DWELL 1                                                 CHAMBER
|CHAMBER      CHAMBER                                                 VENT VALVE
|VENT VALVE   VENT VALVE                                              2 CLOSE
|2 CLOSE      CLOSED                                                  FAULT
|CLCHV2T      CVS3                                                    CHV2CLF
|  T4:146       I:002                                                   B3
+---] [---------]/[-----------------------------------------------------( )---
|    DN          13                                                     166
|[146]
B3/166 - ]/[ - File #5 FAULTS - 156
       -( )- - File #5 FAULTS - 147
```

Rung #148

```
|                                                            OPEN
|OPEN                                                        CHAMBER
|DWELL 3                                                     VENT VALVE
|VENT VALVE                                                  3 TIMER
|CV3                                                         OPCHV3T
|  O:027                                                     +-TON------------------+
+--] [-------------------------------------------------------+TIMER ON DELAY        +-(EN)-
|   16                                                       |TIMER:        T4:147  |
|[2:401]                                                     |BASE (SEC):      1.0  +-(DN)
|                                                            |PRESET:            5  |
|                                                            |ACCUM:             0  |
|                                                            +----------------------+
T4:147.DN - ] [ - File #5 FAULTS - 149
```

Rung #149

```
|FAULT
|DETECT       DWELL 3                                                 CHAMBER
|CHAMBER      CHAMBER                                                 VENT VALVE
|VENT VALVE   VENT VALVE                                              3 OPEN
|3 OPEN       OPEN                                                    FAULT
|OPCHV3T      CVS6                                                    CHV3OPF
|  T4:147       I:022                                                   B3
+---] [---------]/[-----------------------------------------------------( )---
|    DN          12                                                     167
|[148]
B3/167 - ]/[ - File #5 FAULTS - 156
       -( )- - File #5 FAULTS - 149
```

```
Rung #150
|
|OPEN                                                              CLOSE
|DWELL 3                                                           CHAMBER
|VENT VALVE                                                        VENT VALVE
|CV3                                                               3 TIMER
|                                                                  CLCHV3T
|   O:027                                                          +-TON-----------------+
|---]/[------------------------------------------------------------|TIMER ON DELAY       |-(EN)-|
|    16                                                            |TIMER:       T4:148  |
|(2:401)                                                           |BASE (SEC):     1.0  |-(DN)
|                                                                  |PRESET:           5  |
|                                                                  |ACCUM:            5  |
|                                                                  +---------------------+
T4:148.DN - ] [ - File #5 FAULTS - 151
Rung #151
|FAULT
|DETECT      DWELL 4                                                        CHAMBER
|CHAMBER     CHAMBER                                                        VENT VALVE
|VENT VALVE  VENT VALVE                                                     3 CLOSE
|3 CLOSE     CLOSED                                                         FAULT
|CLCHV3T     CVS5                                                           CHV3CLF
|  T4:148     I:022                                                         B3
|---] [--------]/[----------------------------------------------------------( )----|
|    DN        11                                                           168
|(150)
B3/168 - ]/[ - File #5 FAULTS - 156
       -( )- - File #5 FAULTS - 151
Rung #152
|                                                                  OPEN
|OPEN                                                              CHAMBER
|DWELL 5                                                           VENT VALVE
|VENT VALVE                                                        4 TIMER
|CV4                                                               OPCHV4T
|   O:043                                                          +-TON-----------------+
|---] [------------------------------------------------------------|TIMER ON DELAY       |-(EN)-|
|    16                                                            |TIMER:       T4:149  |
|(2:403)                                                           |BASE (SEC):     1.0  |-(DN)
|                                                                  |PRESET:           5  |
|                                                                  |ACCUM:            0  |
|                                                                  +---------------------+
T4:149.DN - ] [ - File #5 FAULTS - 153
Rung #153
|FAULT
|DETECT      DWELL 5                                                        CHAMBER
|CHAMBER     CHAMBER                                                        VENT VALVE
|VENT VALVE  VENT VALVE                                                     4 OPEN
|4 OPEN      OPEN                                                           FAULT
|OPCHV4T     CVS8                                                           CHV4OPF
|  T4:149     I:036                                                         B3
|---] [--------]/[----------------------------------------------------------( )----|
|    DN        12                                                           169
|(152)
B3/169 - ]/[ - File #5 FAULTS - 156
       -( )- - File #5 FAULTS - 153
```

```
Rung #154
|
|OPEN                                                                  CLOSE
|DWELL 5                                                               CHAMBER
|VENT VALVE                                                            VENT VALVE
|CV4                                                                   4 TIMER
|  O:043                                                               CLCHV4T
|                                                                      +--TON-----------------+
|---]/[--------------------------------------------------------------+TIMER ON DELAY        +-(EN)-|
|   16                                                                 |TIMER:        T4:150  |
|[2:403]                                                               |BASE (SEC):     1.0   +-(DN) |
|                                                                      |PRESET:           5   |
|                                                                      |ACCUM:            5   |
|                                                                      +----------------------+
T4:150.DN - ] [ - File #5 FAULTS - 155
Rung #155
|FAULT
|DETECT      DWELL 5
|CHAMBER     CHAMBER                                                   CHAMBER
|VENT VALVE  VENT VALVE                                                VENT VALVE
|4 CLOSE     CLOSED                                                    4 CLOSE
|CLCHV4T     CVS7                                                      FAULT
|  T4:150     I:036                                                    CHV4CLF
|                                                                        B3
|---] [-------]/[-------------------------------------------------------( )----|
|    DN        11                                                        170
|[154]
B3/170 - ]/[ - File #5 FAULTS - 156
         -( )- - File #5 FAULTS - 155
Rung #156
|CHAMBER    CHAMBER    CHAMBER    CHAMBER    CHAMBER    CHAMBER
|VENT VALVE VENT VALVE VENT VALVE VENT VALVE VENT VALVE VENT VALVE     CHAMBER
|2 OPEN     2 CLOSE    3 OPEN     3 CLOSE    4 OPEN     4 CLOSE        VENT VALVE
|FAULT      FAULT      FAULT      FAULT      FAULT      FAULT          NO FAULT
|CHV2OPF    CHV2CLF    CHV3OPF    CHV3CLF    CHV4OPF    CHV4CLF        CHVNF
|   B3         B3         B3         B3         B3         B3            B3
|---]/[------]/[--------]/[--------]/[--------]/[--------]/[------------( )----|
|   165        166        167        168        169        170           173
|[145]      [147]      [149]      [151]      [153]      [155]
B3/173 - ]/[ - File #5 FAULTS - 157
         -( )- - File #5 FAULTS - 156
Rung #157
|CHAMBER                                                               CHAMBER
|VENT VALVE                                                            VENT VALVE
|NO FAULT                                                              FAULT
|CHVNF                                                                 CHVF
|   B3                                                                   B3
|---]/[-----------------------------------------------------------------(L)----|
|   173                                                                  174
|[156]
B3/174 - ] [ - File #2 MAIN_PRGRM - 625
         -(L)- - File #5 FAULTS - 157
         -(U)- - File #5 FAULTS - 158
Rung #158
|
|PAUSE                                                                 CHAMBER
|DISABLE                                                               VENT VALVE
|TS12                                                                  FAULT
|  N7:16                                                               CHVF
|                                                                        B3
|---] [-----------------------------------------------------------------(U)----|
|    4                                                                   174
|[2:3]
B3/174 - ] [ - File #2 MAIN_PRGRM - 625
         -(L)- - File #5 FAULTS - 157
```

```
-(U)- - File #5 FAULTS -  15(
Rung #159
|OPEN                                                      OPEN
|LOAD LOCK                                                 ROUGH VENT
|ROUGH                                                     VALVE 1
|VALVE                                                     TIMER
|RV1                                                       OPRV1T
|  O:010                                                   +-TON-----------+
|---] [----------------------------------------------------|TIMER ON DELAY |-(EN)-
|   11                                                     |TIMER:  T4:153 |
|[2:167]                                                   |BASE (SEC): 1.0|-(DN)
|                                                          |PRESET:     23 |
|                                                          |ACCUM:       0 |
|                                                          +---------------+
T4:153.DN - ] [ - File #5 FAULTS -  160
Rung #160
|FAULT       LLOCK
|DETECT      CHAMBER
|ROUGH VENT  ROUGH
|VALVE 1     VALVE                                     ROUGH VALVE 1
|OPEN        OPEN                                      OPEN FAULT
|OPRV1T      RVS2                                      RV1OPF
|  T4:153    I:002                                          B3
|---] [-------]/[-------------------------------------------( )---
|    DN       16                                            126
|[159]
B3/126 - ]/[ - File #5 FAULTS -  179
       -( )- - File #5 FAULTS -  160
Rung #161
|OPEN                                                      CLOSE
|LOAD LOCK                                                 ROUGH VENT
|ROUGH                                                     VALVE 1
|VALVE                                                     TIMER
|RV1                                                       CLRV1T
|  O:010                                                   +-TON-----------+
|---]/[----------------------------------------------------|TIMER ON DELAY |-(EN)-
|   11                                                     |TIMER:  T4:154 |
|[2:167]                                                   |BASE (SEC): 1.0|-(DN)
|                                                          |PRESET:      5 |
|                                                          |ACCUM:       4 |
|                                                          +---------------+
T4:154.DN - ] [ - File #5 FAULTS -  162
Rung #162
|FAULT       LLOCK
|DETECT      CHAMBER                                       ROUGH
|ROUGH VENT  ROUGH                                         VALVE 1
|VALVE 1     VALVE                                         CLOSE
|CLOSE       CLOSED                                        FAULT
|CLRV1T      RVS1                                          RV1CLF
|  T4:154    I:002                                          B3
|---] [-------]/[-------------------------------------------( )---
|    DN       15                                            127
|[161]
B3/127 - ]/[ - File #5 FAULTS -  179
       -( )- - File #5 FAULTS -  162
```

```
Rung #163
|OPEN                                                                  OPEN               |
|DWELL 2                                                               ROUGH VENT         |
|ROUGH                                                                 VALVE 2            |
|VALVE                                                                 TIMER              |
|RV2                                                                   OPRV2T             |
|  O:030                                                               +--TON---------+   |
|--] [-----------------------------------------------------------------+TIMER ON DELAY +-(EN)-|
|   11                                                                 |TIMER:  T4:155|   |
|[2:56]                                                                |BASE (SEC): 1.0+-(DN) |
|                                                                      |PRESET:      5|   |
|                                                                      |ACCUM:       0|   |
|                                                                      +--------------+   |
T4:155.DN - ] [ - File #5 FAULTS - 164
Rung #164
|FAULT      DWELL 2                                                                       |
|DETECT     CHAMBER                                                                       |
|ROUGH VENT ROUGH                                                                         |
|VALVE 2    VALVE                                                     ROUGH VALVE 2       |
|OPEN       OPEN                                                      OPEN FAULT          |
|OPRV2T     RVS4                                                      RV2OPF              |
|  T4:155    I:022                                                        B3              |
|--] [-------]/[----------------------------------------------------------( )-------------|
|    DN       16                                                          128             |
|[163]                                                                                    |
B3/128 - ]/[ - File #5 FAULTS - 179
       -( )- - File #5 FAULTS - 164
Rung #165
|OPEN                                                                  CLOSE              |
|DWELL 2                                                               ROUGH VENT         |
|ROUGH                                                                 VALVE 2            |
|VALVE                                                                 TIMER              |
|RV2                                                                   CLRV2T             |
|  O:030                                                               +--TON---------+   |
|--]/[-----------------------------------------------------------------+TIMER ON DELAY +-(EN)-|
|   11                                                                 |TIMER:  T4:156|   |
|[2:56]                                                                |BASE (SEC): 1.0+-(DN) |
|                                                                      |PRESET:      5|   |
|                                                                      |ACCUM:       5|   |
|                                                                      +--------------+   |
T4:156.DN - ] [ - File #5 FAULTS - 166
Rung #166
|FAULT      DWELL 2                                                                       |
|DETECT     CHAMBER                                                                       |
|ROUGH VENT ROUGH                                                                         |
|VALVE 2    VALVE RV2                                                 ROUGH VALVE 2       |
|CLOSE      CLOSED                                                    CLOSE FAULT         |
|CLRV2T     RVS3                                                      RV2CLF              |
|  T4:156    I:022                                                        B3              |
|--] [-------]/[----------------------------------------------------------( )-------------|
|    DN       15                                                          129             |
|[165]                                                                                    |
B3/129 - ]/[ - File #5 FAULTS - 179
       -( )- - File #5 FAULTS - 166
```

```
Rung #167
|OPEN                                                              OPEN              |
|DWELL 4                                                           ROUGH VENT        |
|ROUGH                                                             VALVE 3           |
|VALVE                                                             TIMER             |
|RV3                                                               OPRV3T            |
| O:044                                                            +-TON-----------+ |
|--] [-------------------------------------------------------------+TIMER ON DELAY +-(EN)-|
|   11                                                             |TIMER:   T4:157| |
|[2:57]                                                            |BASE (SEC):  1.0+-(DN)|
|                                                                  |PRESET:       5| |
|                                                                  |ACCUM:        0| |
|                                                                  +---------------+ |
T4:157.DN - ] [ - File #5 FAULTS - 168
Rung #168
|FAULT        DWELL 4                                                                 |
|DETECT       CHAMBER                                                                 |
|ROUGH VENT   ROUGH                                                                   |
|VALVE 3      VALVE                                                  ROUGH VALVE 3    |
|OPEN         OPEN                                                   OPEN FAULT       |
|OPRV3T       RVS6                                                   RV3OPF           |
| T4:157      I:036                                                     B3            |
|--] [--------]/[-------------------------------------------------------( )---------|
|   DN         16                                                       130           |
|[167]                                                                                |
B3/130 - ]/[ - File #5 FAULTS - 179
        -( )- - File #5 FAULTS - 168
Rung #169
|OPEN                                                              CLOSE             |
|DWELL 4                                                           ROUGH VENT        |
|ROUGH                                                             VALVE 1           |
|VALVE                                                             TIMER             |
|RV3                                                               CLRV3T            |
| O:044                                                            +-TON-----------+ |
|--]/[-------------------------------------------------------------+TIMER ON DELAY +-(EN)-|
|   11                                                             |TIMER:   T4:158| |
|[2:57]                                                            |BASE (SEC):  1.0+-(DN)|
|                                                                  |PRESET:       5| |
|                                                                  |ACCUM:        5| |
|                                                                  +---------------+ |
T4:158.DN - ] [ - File #5 FAULTS - 170
Rung #170
|FAULT        DWELL 4                                                                 |
|DETECT       CHAMBER                                                                 |
|ROUGH VENT   ROUGH                                                                   |
|VALVE 3      VALVE                                                  ROUGH VALVE 3    |
|CLOSE        CLOSED                                                 CLOSE FAULT      |
|CLRV3T       RVS5                                                   RV3CLF           |
| T4:158      I:036                                                     B3            |
|--] [--------]/[-------------------------------------------------------( )---------|
|   DN         15                                                       131           |
|[169]                                                                                |
B3/131 - ]/[ - File #5 FAULTS - 179
        -( )- - File #5 FAULTS - 170
```

```
Rung #171
|OPEN                                                        OPEN                   |
|DWELL 6                                                     ROUGH VENT             |
|ROUGH                                                       VALVE 4                |
|VALVE                                                       TIMER                  |
|RV4                                                         OPRV4T                 |
| O:060                                                      +-TON-----------+      |
|--| |-------------------------------------------------------|TIMER ON DELAY |-(EN)-|
|   11                                                       |TIMER:  T4:159 |      |
|[2:58]                                                      |BASE (SEC): 1.0|-(DN) |
|                                                            |PRESET:       5|      |
|                                                            |ACCUM:        0|      |
|                                                            +---------------+      |
T4:159.DN - -| |- - File #5 FAULTS - 172
Rung #172
|          DWELL 5                                                                  |
|FAULT     CHAMBER                                                                  |
|DETECT    ROUGH                                                                    |
|ROUGH VENT VALVE                                                  ROUGH VALVE 4    |
|VALVE 4   OPEN                                                    OPEN FAULT       |
|OPRV4T    RVS8                                                    RV4OPF           |
| T4:159   I:052                                                      B3            |
|--| |------|/|----------------------------------------------------------( )---------|
|   DN       15                                                       132           |
|[171]                                                                              |
B3/132 - -|/|- - File #5 FAULTS - 179
         -( )- - File #5 FAULTS - 172
Rung #173
|OPEN                                                        CLOSE                  |
|DWELL 6                                                     ROUGH VENT             |
|ROUGH                                                       VALVE 4                |
|VALVE                                                       TIMER                  |
|RV4                                                         CLRV4T                 |
| O:060                                                      +-TON-----------+      |
|--|/|-------------------------------------------------------|TIMER ON DELAY |-(EN)-|
|   11                                                       |TIMER:  T4:160 |      |
|[2:58]                                                      |BASE (SEC): 1.0|-(DN) |
|                                                            |PRESET:       5|      |
|                                                            |ACCUM:        5|      |
|                                                            +---------------+      |
T4:160.DN - -| |- - File #5 FAULTS - 174
Rung #174
|FAULT     DWELL 5                                                                  |
|DETECT    CHAMBER                                                                  |
|ROUGH VENT ROUGH                                                                   |
|VALVE 4   VALVE                                                   ROUGH VALVE 4    |
|CLOSE     CLOSED                                                  CLOSE FAULT      |
|CLRV4T    RVS7                                                    RV4CLF           |
| T4:160    I:052                                                     B3            |
|--| |------|/|----------------------------------------------------------( )---------|
|   DN       14                                                       133           |
|[173]                                                                              |
B3/133 - -|/|- - File #5 FAULTS - 179
         -( )- - File #5 FAULTS - 174
```

```
Rung #175
|OPEN                                                              OPEN
|EXLOCK                                                            ROUGH VENT
|ROUGH                                                             VALVE 5
|VALVE                                                             TIMER
|RVS                                                               OPRVST
| O:060                                                            +-TON-----------------+
+-] [--------------------------------------------------------------+TIMER ON DELAY       +-(EN)-
|  12                                                              |TIMER:      T4:161|
|[2:340]                                                           |BASE (SEC):  1.0+-(DN)
|                                                                  |PRESET:       60|
|                                                                  |ACCUM:         0|
|                                                                  +------------------+
T4:161.DN - ] [ - File #5 FAULTS - 176
Rung #176
|FAULT       EXLOCK
|DETECT      CHAMBER
|ROUGH VENT  ROUGH
|VALVE 5     VALVE                                                 ROUGH VALVE 5
|OPEN        OPEN                                                  OPEN FAULT
|OPRVST      RVS10                                                 RVS0PF
|  T4:161     I:052                                                B3
+---] [-------]/[---------------------------------------------------( )---
|   DN        17                                                   134
|[175]
B3/134 - ]/[ - File #5 FAULTS - 179
       -( )- - File #5 FAULTS - 176
Rung #177
|OPEN                                                              CLOSE
|EXLOCK                                                            ROUGH VENT
|ROUGH                                                             VALVE 5
|VALVE                                                             TIMER
|RVS                                                               CLRVST
| O:060                                                            +-TON-----------------+
+-]/[--------------------------------------------------------------+TIMER ON DELAY       +-(EN)-
|  12                                                              |TIMER:      T4:162|
|[2:340]                                                           |BASE (SEC):  1.0+-(DN)
|                                                                  |PRESET:        5|
|                                                                  |ACCUM:         5|
|                                                                  +------------------+
T4:162.DN - ] [ - File #5 FAULTS - 178
Rung #178
|FAULT       EXLOCK
|DETECT      CHAMBER
|ROUGH VENT  ROUGH
|VALVE 5     VALVE                                                 ROUGH VALVE 5
|CLOSE       CLOSED                                                CLOSE FAULT
|CLRVST      RVS9                                                  RVSCLF
|  T4:162     I:052                                                B3
+---] [-------]/[---------------------------------------------------( )---
|   DN        16                                                   135
|[177]
B3/135 - ]/[ - File #5 FAULTS - 179
       -( )- - File #5 FAULTS - 178
Rung #179
|
|              ROUGH
|              VALVE 1
|ROUGH VALVE 1 CLOSE    ROUGH VALVE 2 ROUGH VALVE 2 ROUGH VALVE 3 ROUGH VALVE 3 ROUGH VALVE 4 ROUGH VALVE 4 ROUGH VALVE 5
|OPEN FAULT    FAULT    OPEN FAULT    CLOSE FAULT   OPEN FAULT    CLOSE FAULT   OPEN FAULT    CLOSE FAULT   OPEN FAULT
|RV1OPF        RV1CLF   RV2OPF        RV2CLF        RV3OPF        RV3CLF        RV4OPF        RV4CLF        RV5OPF
|    B3          B3        B3            B3            B3            B3            B3            B3            B3
+---]/[--------]/[-------]/[-----------]/[-----------]/[-----------]/[-----------]/[-----------]/[-----------]/[---
|   126         127       128           129           130           131           132           133           134
>
```

```
<
|[160]       [162]   [164]      [166]      [168]      [170]      [172]      [174]      [176]
                                                                                      ROUGH VENT  |
                                                                          ROUGH VALVE 5  VALVE    |
                                                                          CLOSE FAULT  NO FAULT   |
                                                                          RVSCLF       RVVNF      |
                                                                             B3           B3      |
                                                                        ----|/|----------( )------|
                                                                            135          384      |
                                                                         [178]                    |

B3/384 - -|/|- - File #5 FAULTS -  180
        -( )- - File #5 FAULTS -  179
Rung #180
|ROUGH VENT                                                                           ROUGH VENT  |
|VALVE                                                                                VALVE       |
|NO FAULT                                                                             FAULT       |
|RVVNF                                                                                RVVF        |
|    B3                                                                                  B3       |
|----|/|---------------------------------------------------------------------------------(L)------|
|    384                                                                                 386      |
|[179]                                                                                            |
B3/386 - -| |- - File #2 MAIN_PRGRM -  625
        -(L)- - File #5 FAULTS -  180
        -(U)- - File #5 FAULTS -  181
Rung #181
|                                                                                     ROUGH VENT  |
|PAUSE                                                                                VALVE       |
|DISABLE                                                                              FAULT       |
|TS12                                                                                 RVVF        |
|  N7:16                                                                                 B3       |
|----| |---------------------------------------------------------------------------------(U)------|
|    4                                                                                   386      |
|[2:3]                                                                                            |
B3/386 - -| |- - File #2 MAIN_PRGRM -  625
        -(L)- - File #5 FAULTS -  180
        -(U)- - File #5 FAULTS -  181
Rung #182
|MECHANICAL            ROUGHING                                           ROUGHING                |
|PUMP 1      BLOWER 1  SECTION 1                                          SECTION 1               |
|ENABLED     ENABLED   PRESSURE                                           TIMER                   |
|MP1         BL1       PS1                                                RS1T                    |
|  0:007       0:007     1:002                                            +-TON-------------+     |
|----| |---------| |-------| |--------------------------------------------|TIMER ON DELAY   |-(EN)-|
|    00          01        03                                             |TIMER:      T4:7 |     |
| [2:68]      [2:69]                                                      |BASE (SEC):  1.0 |-(DN) |
|                                                                         |PRESET:       60 |     |
|                                                                         |ACCUM:         0 |     |
|                                                                         +-----------------+     |
T4:7.DN - -| |- - File #5 FAULTS -  183
Rung #183
|FAULT                                                                                 ROUGHING   |
|DETECT                                                                                SECTION 1  |
|ROUGHING                                                                              FAULT      |
|SECTION 1                                                                             RS1F       |
|RS1T                                                                                     B3      |
|  T4:7                                                                                           |
|----| |------------------------------------------------------------------------------------( )---|
|    DN                                                                                   438     |
|[182]                                                                                            |
B3/438 - -| |- - File #5 FAULTS -  188
        -( )- - File #5 FAULTS -  183
```

```
Rung #184
|MECHANICAL              ROUGHING                                    ROUGHING
|PUMP 2      BLOWER 2    SECTION 2                                   SECTION 2
|ENABLED     ENABLED     PRESSURE                                    TIMER
|MP2         BL2         PS8                                         RS2T
|  O:027      O:027       I:022                                     +-TON-----------------+
|---] [--------] [--------] [---------------------------------------+TIMER ON DELAY       +-(EN)-
|    00         01          05                                      |TIMER:         T4:8 |
|[2:73]      [2:74]                                                 |BASE (SEC):    1.0  +-(DN)
|                                                                   |PRESET:         60  |
|                                                                   |ACCUM:           0  |
|                                                                   +---------------------+
T4:8.DN - ] [ - File #5 FAULTS -  185
Rung #185
|FAULT
|DETECT                                                                    ROUGHING
|ROUGHING                                                                  SECTION 2
|SECTION 2                                                                 FAULT
|RS2T                                                                      RS2F
|  T4:8                                                                       B3
|---] [------------------------------------------------------------------------( )---
|    DN                                                                       439
|[184]
B3/439 - ] [ - File #5 FAULTS -  188
       -( )- - File #5 FAULTS -  185
Rung #186
|MECHANICAL              ROUGHING                                    ROUGHING
|PUMP 3      BLOWER 3    SECTION 3                                   SECTION 3
|ENABLED     ENABLED     PRESSURE                                    TIMER
|MP3         BL3         PS7                                         RS3T
|  O:057      O:057       I:052                                     +-TON-----------------+
|---] [--------] [--------] [---------------------------------------+TIMER ON DELAY       +-(EN)-
|    00         01          05                                      |TIMER:         T4:9 |
|[2:78]      [2:79]                                                 |BASE (SEC):    1.0  +-(DN)
|                                                                   |PRESET:         60  |
|                                                                   |ACCUM:           0  |
|                                                                   +---------------------+
T4:9.DN - ] [ - File #5 FAULTS -  187
Rung #187
|FAULT
|DETECT                                                                    ROUGHING
|ROUGHING                                                                  SECTION 3
|SECTION 3                                                                 FAULT
|RS3T                                                                      RS3F
|  T4:9                                                                       B3
|---] [------------------------------------------------------------------------( )---
|    DN                                                                       440
|[186]
B3/440 - ] [ - File #5 FAULTS -  188
       -( )- - File #5 FAULTS -  187
```

```
Rung #188
ROUGHING                                                MECHANICAL
SECTION 1                                               PUMP FAILURE
FAULT                                                   MECH_P_FAIL
RS1F                                                    B3
  B3
--] [-------------------------------------------------------(L)--
  438                                                   385
[183]
          B3/385 - ] [ - - File #2 MAIN_PRGRM - 626
                   -(U)- - File #5 FAULTS - 189
ROUGHING
SECTION 2
FAULT
RS2F
  B3
--] [--
  439
[185]
ROUGHING
SECTION 3
FAULT
RS3F
  B3
--] [--
  440
[187]
Rung #189
PAUSE                                                   MECHANICAL
DISABLE                                                 PUMP FAILURE
TS12                                                    MECH_P_FAIL
 K7:16                                                  B3
--] [-------------------------------------------------------(U)--
  4                                                     385
[2:3]
B3/385 - ] [ - - File #2 MAIN_PRGRM - 626
         -(L)- - File #5 FAULTS - 188
         -(U)- - File #5 FAULTS - 189
Rung #190
                                                        HEATER
HEATER                                                  SHIELD H2O
SHIELD H2O                                              FLOW
FLOW                                                    GROUP 1
SWITCH 1                                                FAULT
HSFS1                                                   HSFG1F
  I:006                                                 B3
--]/[-------------------------------------------------------( )--
  10                                                    216
HEATER      B3/216 - ] [ - - File #5 FAULTS - 199
SHIELD H2O           ]/[ - - File #2 MAIN_PRGRM - 213
FLOW
SWITCH 2
HSFS2
  I:006
--]/[--
  11
```

- 643 -
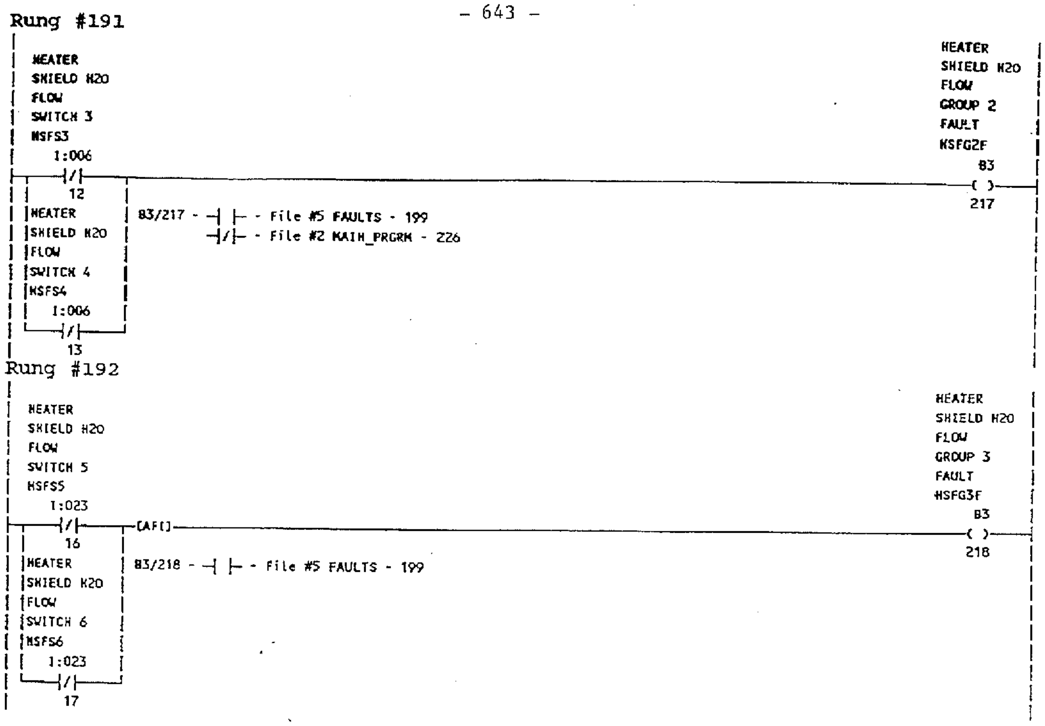

Rung #193

```
CATHODE                                                     CATHODE
WATER FLOW                                                  H2O FLOW
SWITCH 1                                                    SWITCH
CHR1A                                                       GROUP 1
  I:026                                                     FAULT
---]/[---+------------------------------------------------  CWFSG1F
    10   |                                                    B3
         | B3/136 - -] [- - File #5 FAULTS - 202          ---( )---
CATHODE  |                                                    136
WATER FLOW
SWITCH 2
CHR2A
  I:026
---]/[---+
    11
CATHODE
WATER FLOW
SWITCH 3
CHR3A
  I:026
---]/[---+
    12
CATHODE
WATER FLOW
SWITCH 4
CHR4A
  I:026
---]/[---+
    13
CATHODE
SHIELD H2O
FLOW
SWITCH 1
CSFS1
  I:025
---]/[---+
    04
CATHODE
SHIELD H2O
FLOW
SWITCH 2
CSFS2
  I:025
---]/[---+
    05
```

Rung #194
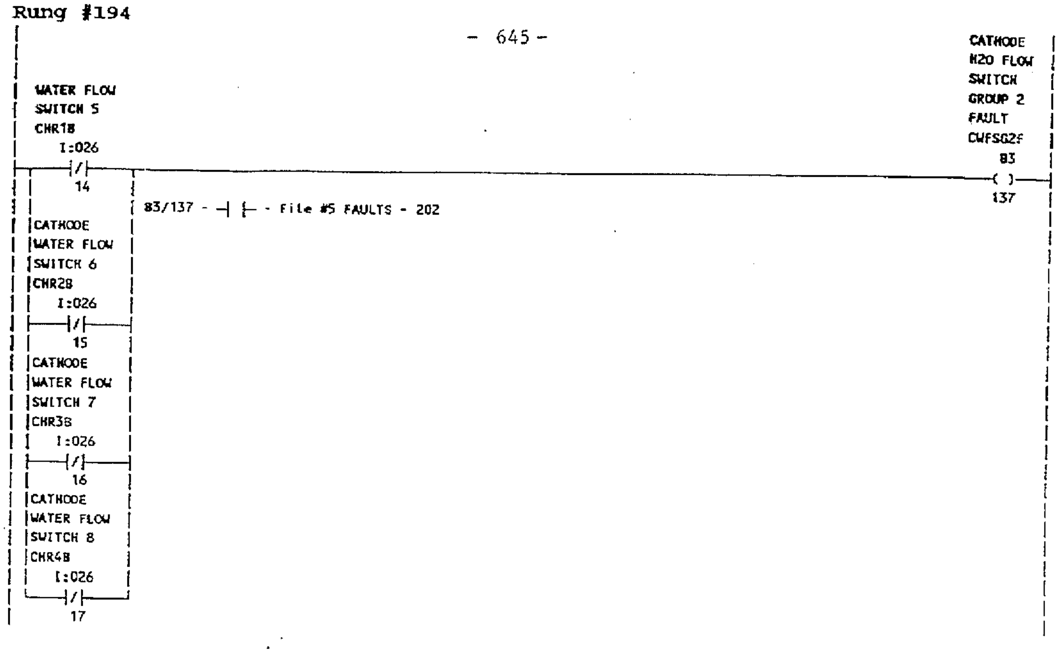

Rung #195

```
|                                                                        CATHODE   |
|  CATHODE                                                               H2O FLOW  |
|  WATER FLOW                                                            SWITCH    |
|  SWITCH 9                                                              GROUP 3   |
|  WFS9                                                                  FAULT     |
|     I:042                                                              CWFSG3F   |
|-+---|/|---+-------------------------------------------------------------  B3     |
| |    10   |                                                            -( )------|
| |         | B3/138 - -| |- - File #5 FAULTS - 202                        138     |
| |CATHODE  |
| |WATER FLOW
| |SWITCH 10|
| |WFS10    |
| |  I:042  |
| +---|/|---+
| |    11   |
| |CATHODE  |
| |WATER FLOW
| |SWITCH 11|
| |WFS11    |
| |  I:042  |
| +---|/|---+
| |    12   |
| |CATHODE  |
| |WATER FLOW
| |SWITCH 12|
| |WFS12    |
| |  I:042  |
| +---|/|---+
| |    13   |
| |CATHODE  |
| |SHIELD H2O
| |FLOW     |
| |SWITCH 9 |
| |CSFS9    |
| |  I:041  |
| +---|/|---+
| |    04   |
| |CATHODE  |
| |SHIELD H2O
| |FLOW     |
| |SWITCH 10|
| |CSFS10   |
| |  I:041  |
| +---|/|---+
|      05
```

- 647 -
Rung #196
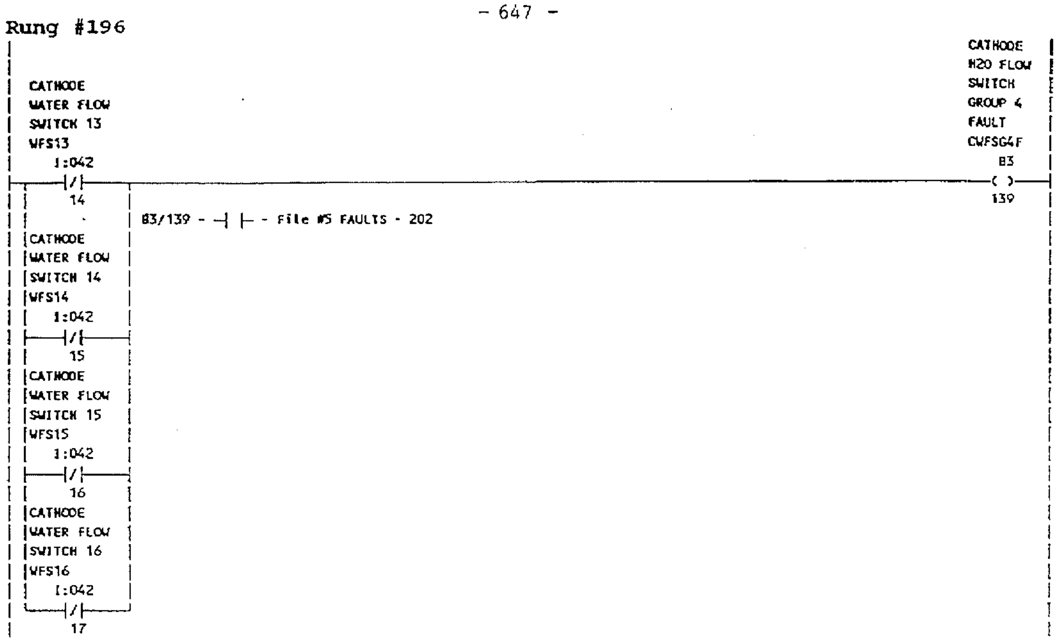

```
Rung #197
|                                                                                          CATHODE   |
|                                                                                          H2O FLOW  |
| CATHODE                                                                                  SWITCH    |
| WATER FLOW                                                                               GROUP 5   |
| SWITCH 17                                                                                FAULT     |
| WFS17                                                                                    CWFSG5F   |
|    I:056                                                                                   B3      |
|-+---]/[----+--------------------------------------------------------------------------------( )---|
| |    10    |                                                                              140      |
| |          | B3/140 - -] [- - File #5 FAULTS - 202                                                 |
| |CATHODE   |                                                                                       |
| |WATER FLOW|                                                                                       |
| |SWITCH 18 |                                                                                       |
| |WFS18     |                                                                                       |
| |  I:056   |                                                                                       |
| +---]/[----+                                                                                       |
| |    11    |                                                                                       |
| |CATHODE   |                                                                                       |
| |WATER FLOW|                                                                                       |
| |SWITCH 19 |                                                                                       |
| |WFS19     |                                                                                       |
| |  I:056   |                                                                                       |
| +---]/[----+                                                                                       |
| |    12    |                                                                                       |
| |CATHODE   |                                                                                       |
| |WATER FLOW|                                                                                       |
| |SWITCH 20 |                                                                                       |
| |WFS20     |                                                                                       |
| |  I:056   |                                                                                       |
| +---]/[----+                                                                                       |
| |    13    |                                                                                       |
| |CATHODE   |                                                                                       |
| |SHIELD    |                                                                                       |
| |H2O FLOW  |                                                                                       |
| |SWITCH 17 |                                                                                       |
| |CSFS17    |                                                                                       |
| |  I:055   |                                                                                       |
| +---]/[----+                                                                                       |
| |    04    |                                                                                       |
| |CATHODE   |                                                                                       |
| |SHIELD    |                                                                                       |
| |H2O FLOW  |                                                                                       |
| |SWITCH 18 |                                                                                       |
| |CSFS18    |                                                                                       |
| |  I:055   |                                                                                       |
| +---]/[----+                                                                                       |
|      05                                                                                            |
```

Rung #198

```
CATHODE                                                        CATHODE
WATER FLOW                                                     H2O FLOW
SWITCH 21                                                      SWITCH
WFS21                                                          GROUP 6
I:056                                                          FAULT
                                                               CWFSG6F
                                                               B3
--|/|--+-------------------------------------------------------( )--
  14   |                                                       141
       | B3/141 - -| |- - File #5 FAULTS - 202
CATHODE
WATER FLOW
SWITCH 22
WFS22
I:056
--|/|--
  15
CATHODE
WATER FLOW
SWITCH 23
WFS23
I:056
--|/|--
  16
CATHODE
WATER FLOW
SWITCH 24
WFS24
I:056
--|/|--
  17
```

```
Rung #199
| HEATER
| SHIELD H20
| FLOW                                                                    HEATER SHIELD
| GROUP 1      PAUSE                                                      FLOW FAULT
| FAULT        DISABLE                                                    TIMER
| HSFG1F       TS12                                                       HSFFTMR
|      B3      N7:16                                                      +--TON-----------+
|-+---] [---+---]/[-------------------------------------------------------+TIMER ON DELAY  +-(EN)-|
| |    216  |    4                                                        |TIMER:     T4:93|
| |[190]    |  [2:3]                                                      |BASE (SEC):  1.0+-(DN) |
| |         |                                                             |PRESET:       20|
| |HEATER   |                                                             |ACCUM:         0|
| |SHIELD H20                                                             +----------------+
| |FLOW     |
| |GROUP 2  |
| |FAULT    |
| |HSFG2F   |
| |    B3   |
| +---] [---+
| |   217   |
| |[191]    |
| |HEATER   |
| |SHIELD H20
| |FLOW     |
| |GROUP 3  |
| |FAULT    |
| |HSFG3F   |
| |    B3   |
| +---] [---+
|     218
|  [192]
T4:93.DN - ] [ - File #2 MAIN_PRGRM -  223
                 File #5 FAULTS -  200
T4:93.TT - ] [ - File #2 MAIN_PRGRM -  718
Rung #200
|                                                                       HEATER      |
|                                                                       SHIELD H20  |
|                                                                       FLOW FAULT  |
|HSFFTMR                                                                HSFF        |
| T4:93                                                                    B3       |
|---] [-----------------------------------------------------------------(L)--------|
|   DN                                                                    219       |
|[199]                                                                              |
B3/219 - ] [ - File #2 MAIN_PRGRM -  625
       -(L)- - File #5 FAULTS -  200
       -(U)- - File #5 FAULTS -  201
Rung #201
|                                                                       HEATER      |
|PAUSE                                                                  SHIELD H20  |
|DISABLE                                                                FLOW FAULT  |
|TS12                                                                   HSFF        |
| N7:16                                                                    B3       |
|---] [-----------------------------------------------------------------(U)--------|
|   4                                                                     219       |
|[2:3]                                                                              |
B3/219 - ] [ - File #2 MAIN_PRGRM -  625
       -(L)- - File #5 FAULTS -  200
       -(U)- - File #5 FAULTS -  201
```

- 651 -
Rung #202
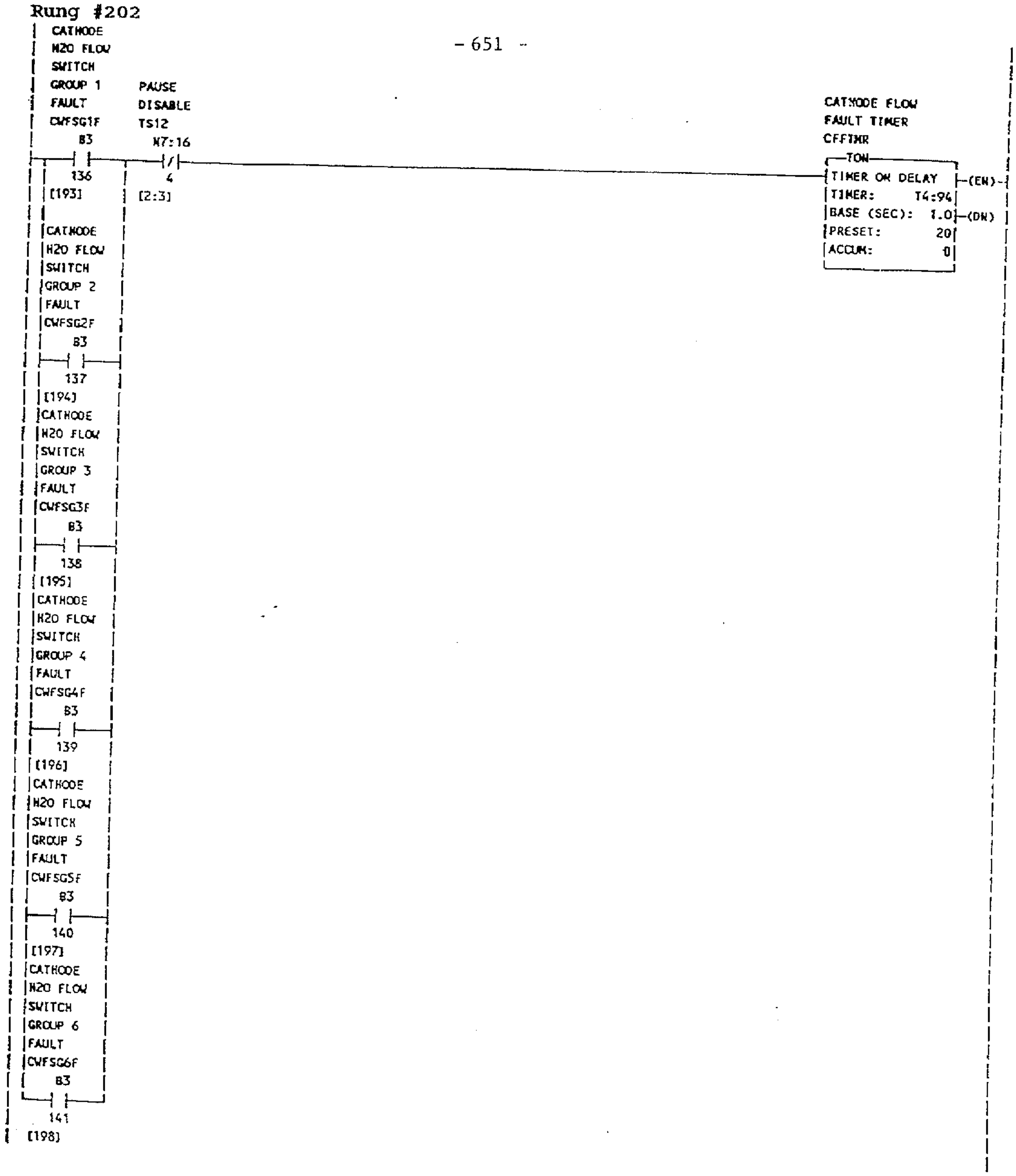

```
T4:94.DN - -| |- - File #5 FAULTS -  203
T4:94.TT - -| |- - File #2 MAIN_PRGRM -  718
```

Rung #203

```
|                                                                   CATHODE
|                                                                   H2O FLOW
|CFFTMR                                                             FAULT
| T4:94                                                             CWFF
|-| |---------------------------------------------------------------  B3
|   DN                                                              -(L)-
|[202]                                                               220
B3/220 - -| |- - File #2 MAIN_PRGRM -  625
         -(L)- - File #5 FAULTS -  203
         -(U)- - File #5 FAULTS -  204
```

Rung #204

```
|
|PAUSE                                                              CATHODE
|DISABLE                                                            H2O FLOW
|TS12                                                               FAULT
| N7:16                                                             CWFF
|-| |---------------------------------------------------------------  B3
|   4                                                               -(U)-
|[2:3]                                                               220
B3/220 - -| |- - File #2 MAIN_PRGRM -  625
         -(L)- - File #5 FAULTS -  203
         -(U)- - File #5 FAULTS -  204
```

Rung #205

```
|PIRANI    PIRANI    PIRINI    PIRINI    PIRINI    PIRINI    PIRINI    PIRINI
|GUAGE 1   GUAGE 2   GUAGE 3   GUAGE 4   GUAGE 5   GUAGE 6   GUAGE 7   GUAGE 8      PIRINI
|NO FAULT  NO FAULT  NO FAULT  NO FAULT  NO FAULT  NO FAULT  NO FAULT  NO FAULT     GUAGE NO
|PGNF1     PGNF2     PGNF3     PGNF4     PGNF5     PGNF6     PGNF7     PGNF8        FAULT
| I:004    I:004     I:024     I:024     I:040     I:040     I:054     I:054        PGNF
|-| |-------| |-------| |-------| |-------| |-------| |-------| |-------| |-------   B3
|  14        15        14        15        14        15        14        15        -( )-
B3/465 - -| |- - File #2 MAIN_PRGRM -  23                                            465
         -|/|- - File #2 MAIN_PRGRM -  22,624
         -( )- - File #5 FAULTS -  205
```

Rung #206

```
|CHAMBER  CHAMBER  CHAMBER  CHAMBER   CHAMBER   CHAMBER
|COVER 5  COVER 6  COVER 9  COVER 10  COVER 11  COVER 12              ALL CHAMBER
|CC5      CC6      CC9      CC10      CC11      CC12                  COVERS CLOSED
| I:025   I:025    I:041    I:041     I:055     I:055                 ACCC
|-| |------| |------| |------| |-------| |-------| |----------------     B3
|  00       01       00       01        00        01                  -( )-
B3/315 - -|/|- - File #5 FAULTS -  207                                  315
         -( )- - File #5 FAULTS -  206
```

Rung #207

```
|
|ALL CHAMBER                                                        CHAMBER
|COVERS CLOSED                                                      COVERS
|ACCC                                                               CLOSED
|     B3                                                            CCC
|----|/|------------------------------------------------------------  B3
|    315                                                            -(L)-
|[206]                                                               467
B3/467 - -| |- - File #2 MAIN_PRGRM -  626
         -(L)- - File #5 FAULTS -  207
         -(U)- - File #5 FAULTS -  208
```

```
Rung #208
|
|PAUSE                                                               CHAMBER  |
|DISABLE                                                             COVERS   |
|TS12                                                                CLOSED   |
|  N7:16                                                             CCC      |
|--] [---------------------------------------------------------------  B3     |
|    4                                                               --(U)----|
|[2:3]                                                                 467    |
B3/467 - -] [- - File #2 MAIN_PRGRM -  626                                    |
         -(L)- - File #5 FAULTS -  207
         -(U)- - File #5 FAULTS -  208
Rung #209
|
|                                                          RETURN TO MAIN    |
|                                                          FROM_CRYO_RGM     |
|                                                          +-RET---------+   |
|---------------------------------------------------------+RETURN ()    +---|
|                                                          +-------------+   |
Rung #210
|-----------------------------------------------------------------------[END]-|
```

COPYRIGHT 1989, 1990, 1991
CONNER PERIPHERALS, INC.
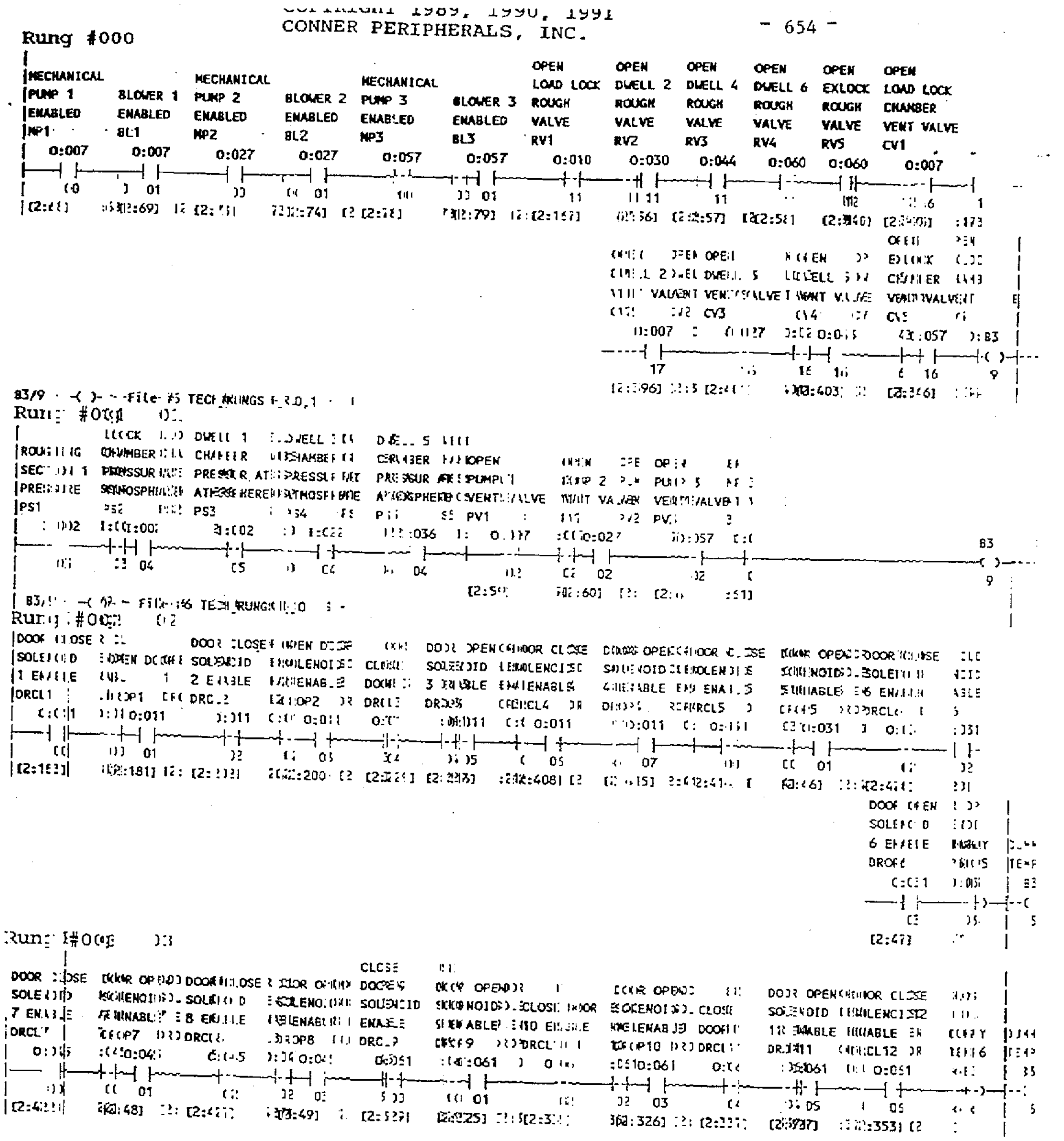

Rung #008

| Contact | Tag | Address | Bit |
|---|---|---|---|
| HEATER 1 CHAMBER GATE VALVE CLOSE | HV1S1 | I:002 | 06 |
| HEATER 2 CHAMBER GATE VALVE CLOSE | HV2S1 | I:004 | 00 |
| DWELL 1 CHAMBER GATE VALVE CLOSED | HV3S1 | I:004 | 03 |
| DWELL 2 CHAMBER GATE VALVE CLOSED | HV4S1 | I:022 | 06 |
| HEATER 3 CHAMBER GATE VALVE CLOSED | HV5S1 | I:024 | 00 |
| DWELL 3 CHAMBER GATE VALVE CLOSED | HV6S1 | I:024 | 03 |
| DWELL 4 CHAMBER GATE VALVE CLOSED | HV7S1 | I:036 | 06 |
| BUFFER 3 CHAMBER GATE VALVE CLOSED | HV8S1 | I:040 | 00 |
| DWELL 5 CHAMBER GATE VALVE CLOSED | HV9S1 | I:040 | 03 |
| DWELL 6 CHAMBER GATE VALVE CLOSED | HV10S1 | I:052 | 06 |
| BUFFER 4 CHAMBER GATE VALVE CLOSED | HV11S1 | I:054 | 00 |
| EXITLOCK CHAMBER GATE VALVE CLOSED | HV12S1 | I:054 | 03 |
| DUMMY DUMMY ( ) | | B3 | 30 |

B3/30 - -( )- - File #6 TECH_RUNGS - 4,9,10,11,12,13

Rung #009

| Contact | Tag | Address | Bit |
|---|---|---|---|
| HEATER 2 CHAMBER GATE VALVE THROTTLED | HV2S2 | I:004 | 01 |
| DWELL 1 CHAMBER GATE VALVE THROTTLED | HV3S2 | I:004 | 04 |
| DWELL 2 CHAMBER GATE VALVE THROTTLED | HV4S2 | I:022 | 07 |
| HEATER 3 CHAMBER GATE VALVE THROTTLED | HV5S2 | I:024 | 01 |
| DWELL 3 CHAMBER GATE VALVE THROTTLED | HV6S2 | I:024 | 04 |
| DWELL 4 CHAMBER GATE VALVE THROTTLED | HV7S2 | I:036 | 07 |
| BUFFER 3 CHAMBER GATE VALVE THROTTLED | HV8S2 | I:040 | 01 |
| DWELL 5 CHAMBER GATE VALVE THROTTLED | HV9S2 | I:040 | 04 |
| DWELL 6 CHAMBER GATE VALVE THROTTLED | HV10S2 | I:052 | 07 |
| BUFFER 4 CHAMBER GATE VALVE THROTTLED | HV11S2 | I:054 | 01 |
| EXIT BUFFER GATE VALVE THROTTLED | HV12S2 | I:054 | 04 |
| DUMMY DUMMY ( ) | | B3 | 30 |

B3/30 - -( )- - File #6 TECH_RUNGS - 4,8,10,11,12,13

Rung #010

| Contact | Tag | Address | Bit |
|---|---|---|---|
| HEATER 1 CHAMBER GATE VALVE OPEN | HV1S3 | I:002 | 10 |
| HEATER 2 CHAMBER GATE VALVE OPEN | HV2S3 | I:004 | 02 |
| DWELL 1 CHAMBER GATE VALVE OPEN | HV3S3 | I:004 | 05 |
| DWELL 2 CHAMBER GATE VALVE OPEN | HV4S3 | I:022 | 10 |
| HEATER 3 CHAMBER GATE VALVE OPEN | HV5S3 | I:024 | 02 |
| DWELL 3 CHAMBER GATE VALVE OPEN | HV6S3 | I:024 | 05 |
| DWELL 4 CHAMBER GATE VALVE OPEN | HV7S3 | I:036 | 10 |
| BUFFER 3 CHAMBER GATE VALVE OPEN | HV8S3 | I:040 | 02 |
| DWELL 5 CHAMBER GATE VALVE OPEN | HV9S3 | I:040 | 05 |
| DWELL 6 CHAMBER GATE VALVE OPEN | HV10S3 | I:052 | 10 |
| BUFFER 4 CHAMBER GATE VALVE OPEN | HV11S3 | I:054 | 02 |
| EXIT BUFFER GATE VALVE OPEN | HV12S3 | I:054 | 05 |
| DUMMY DUMMY ( ) | | B3 | 30 |

B3/30 - -( )- - File #6 TECH_RUNGS - 4,8,9,11,12,13

Rung #011

| Contact | Tag | Address | Bit |
|---|---|---|---|
| PALLET DETECTED LEFT SIDE ENTRANCE | SEN1 | I:003 | 00 |
| PALLET DETECTED CENTER ENTRANCE | SEN2 | I:003 | 01 |
| PALLET DETECTED RIGHT SIDE ENTRANCE | SEN3 | I:003 | 02 |
| PALLET DETECTED LEFT SIDE LOADLOCK | SEN4 | I:003 | 03 |
| PALLET DETECTED CENTER LOADLOCK | SEN5 | I:003 | 04 |
| PALLET DETECTED RIGHT SIDE LOADLOCK | SEN6 | I:003 | 05 |
| PALLET DETECTED LEFT SIDE HEATER 1 | SEN7 | I:003 | 06 |
| PALLET DETECTED CENTER HEATER 1 | SEN8 | I:003 | 07 |
| PALLET DETECTED RIGHT SIDE HEATER 1 | SEN9 | I:003 | 10 |
| PALLET DETECTED LEFT SIDE HEATER 2 | SEN10 | I:003 | 11 |
| PALLET DETECTED CENTER BUFFER 1 | SEN11 | I:003 | 12 |

Rung #004

```
|DOOR 1  DOOR 2  DOOR 3  DOOR 4  DOOR 5                                         |
|OPEN    OPEN    OPEN    OPEN    OPEN                                    DUMMY  |
|DROP1S  DROP2S  DROP3S  DROP4S  DROP5S                                  DUMMY  |
| I:006   I:006   I:006   I:006   I:026                                   B3    |
|--] [----] [----] [----] [----] [--------------------------------------( )----|
|   01      03      05      07      01                                    30    |
```

B3/30 - -( )- - File #6 TECH_RUNGS - 4,8,9,10,11,12,13

Rung #005

```
|DOOR 1  DOOR 2  DOOR 3  DOOR 4  DOOR 5  DOOR 6  DOOR 7  DOOR 8  DOOR 9  DOOR 10  DOOR 11  DOOR 12                  |
|CLOSED  CLOSED  CLOSED  CLOSED  CLOSED  CLOSED  CLOSED  CLOSED  CLOSED  CLOSED   CLOSED   CLOSED         TEMP      |
|DRCL1S  DRCL2S  DRCL3S  DRCL4S  DRCL5S  DRCL6S  DRCL7S  DRCL8S  DRCL9S  DRCL10S  DRCL11S  DRCL12S        DUMMY_97  |
| I:006   I:006   I:006   I:006   I:026   I:026   I:042   I:042   I:056   I:056    I:056    I:056           B3      |
|--] [----] [----] [----] [----] [----] [----] [----] [----] [----] [-----] [-----] [-----] [-------------( )-----|
|   00      02      04      06      00      02      00      02      00      02       04       06             97      |
```

Rung #006

```
|            CRYO GATE   CRYO GATE   CRYO GATE   CRYO GATE   CRYO GATE   CRYO GATE   CRYO GATE   CRYO GATE   CRYO GATE   CRYO GATE
|CRYO GATE   SOLENOID 1  SOLENOID 2  SOLENOID 1  SOLENOID 2  SOLENOID 1  SOLENOID 2  SOLENOID 1  SOLENOID 2  SOLENOID 1  SOLENOID 2
|HEATER 1    HEATER 2    HEATER 2    DWELL 1     DWELL 1     DWELL 2     DWELL 2     HEATER 2    HEATER 2    DWELL 3     DWELL 3
|CHAMBER     CHAMBER     CHAMBER     CHAMBER     CHAMBER     CHAMBER     CHAMBER     CHAMBER     CHAMBER     CHAMBER     CHAMBER
|HV1         HV2_1       HV2_2       HV3_1       HV3_2       HV4_1       HV4_2       HV5_1       HV5_2       HV6_1       HV6_2
|  O:011       O:011       O:011       O:011       O:011       O:031       O:031       O:031       O:031       O:031       O:031
|---] [---------] [---------] [---------] [---------] [---------] [---------] [---------] [---------] [---------] [---------] [---
|    11          13          14          15          16          11          12          13          14          15          16
|[2:115]     [2:117]     [2:118]     [2:119]     [2:120]     [2:121]     [2:122]     [2:123]     [2:124]     [2:125]     [2:126]

             CRYO GATE   CHROME      CHROME      MAGNETIC    MAGNETIC    CARBON      CARBON                 |
             SOLENOID 1  HI POWER    HI POWER    HI POWER    HI POWER    HI POWER    HI POWER               |
             DWELL 4     SUPPLY 1    SUPPLY 3    SUPPLY 1    SUPPLY 3    SUPPLY 1    SUPPLY 3               |
             CHAMBER     OUTPUT      OUTPUT      OUTPUT      OUTPUT      OUTPUT      OUTPUT      DUMMY      |
             HV7_1       CHRPS1      CHRPS3      MAGPS1      MAGPS3      CARPS1      CARPS3      TEMP7      |
               O:045       O:033       O:033       O:033       O:063       O:063       O:063      B3        |
            ------] [---------] [---------] [---------] [---------] [---------] [---------] [------( )-----|
                  11          10          12          14          10          12          14       7        |
             [2:127]     [2:236]     [2:242]     [2:268]     [2:274]     [2:299]     [2:300]                |
```

B3/7 - -( )- - File #6 TECH_RUNGS - 6,7

Rung #007

```
|CRYO GATE   CRYO GATE   CRYO GATE   CRYO GATE   CRYO GATE   CRYO GATE   CRYO GATE   CRYO GATE   CRYO GATE   CRYO GATE
|SOLENOID 2  SOLENOID 1  SOLENOID 2  SOLENOID 1  SOLENOID 2  SOLENOID 1  SOLENOID 2  SOLENOID 1  SOLENOID 2  SOLENOID 1
|DWELL 4     BUFFER 3    BUFFER 3    DWELL 5     DWELL 5     DWELL 6     DWELL 6     BUFFER 4    BUFFER 4    EXBUFFER
|CHAMBER     CHAMBER     CHAMBER     CHAMBER     CHAMBER     CHAMBER     CHAMBER     CHAMBER     CHAMBER     CHAMBER
|HV7_2       HV8_1       HV8_2       HV9_1       HV9_2       HV10_1      HV10_2      HV11_1      HV11_2      HV12_1
|  O:045       O:045       O:045       O:045       O:045       O:061       O:061       O:061       O:061       O:061
|---] [---------] [---------] [---------] [---------] [---------] [---------] [---------] [---------] [---------] [---
|    12          13          14          15          16          11          12          13          14          15
|[2:128]     [2:129]     [2:130]     [2:131]     [2:132]     [2:133]     [2:134]     [2:135]     [2:136]     [2:137]

                                                         OPEN         OPEN         OPEN         OPEN         |CRYO GA
  CRYO GATE                                              CAPACITANC   CAPACITANC   CAPACITANC   CAPACITANC   |SOLENOI
  SOLENOID 2  OPEN RGA    OPEN RGA    OPEN RGA    OPEN RGA    MANOMETER    MANOMETER    MANOMETER    MANOMETER    |DWELL 4
  EXBUFFER    ISOLATION   ISOLATION   ISOLATION   ISOLATION   ISOLATION    ISOLATION    ISOLATION    ISOLATION    |CHAMBER
  CHAMBER     VALVE 1     VALVE 2     VALVE 3     VALVE 4     VALVE 1      VALVE 2      VALVE 3      VALVE 4      |HV7_2
  HV12_2      RGAV1       RGAV2       RGAV3       RGAV4       CMV1         CMV2         CMV3         CMV4         |  O:04
    O:061       O:010       O:030       O:044       O:060       O:010        O:030        O:044        O:060      |---] [
 ------] [---------] [---------] [---------] [---------] [---------] [----------] [----------] [----------] [------|    12
       16          13          13          13          13          06           06           06           06      |[2:128]
  [2:138]     [2:371]     [2:372]     [2:373]     [2:374]     [2:375]      [2:376]      [2:377]      [2:378]      |
```

B3/7 - -( )- - File #6 TECH_RUNGS - 6

(continued)
- PALLET DETECTED RIGHT SIDE HEATER 2 SEN12 — I:003 / 13
- PALLET DETECTED LEFT SIDE DWELL 1 SEN13 — I:003 / 14
- PALLET DETECTED CENTER DWELL 1 SEN14 — I:003 / 15
- PALLET DETECTED RIGHT SIDE DWELL 1 SEN15 — I:003 / 16
- PALLET DETECTED LEFT SIDE CHROME SEN16 — I:023 / 00
- PALLET DETECTED CENTER CHROME SEN17 — I:023 / 01
- PALLET DETECTED RIGHT SIDE CHROME SEN18 — I:023 / 02
- DUMMY DUMMY — B3 ( ) 30

B3/30 - -( )- - File #6 TECH_RUNGS - 4,8,9,10,12,13

Rung #012
- PALLET DETECTED LEFT SIDE DWELL 2 SEN19 — I:023 / 03
- PALLET DETECTED CENTER DWELL 2 SEN20 — I:023 / 04
- PALLET DETECTED RIGHT SIDE DWELL 2 SEN21 — I:023 / 05
- PALLET DETECTED LEFT SIDE HEATER 3 SEN22 — I:023 / 06
- PALLET DETECTED RIGHT SIDE HEATER 3 SEN24 — I:023 / 10
- PALLET DETECTED LEFT SIDE DWELL 3 SEN25 — I:023 / 11
- PALLET DETECTED CENTER DWELL 3 SEN26 — I:023 / 12
- PALLET DETECTED RIGHT SIDE DWELL 3 SEN27 — I:023 / 13
- PALLET DETECTED LEFT SIDE MAGNETIC SEN28 — I:037 / 00
- PALLET DETECTED CENTER MAGNETIC SEN29 — I:037 / 01
- PALLET DETECTED RIGHT SIDE MAGNETIC SEN30 — I:037 / 02
- PALLET DETECTED LEFT SIDE DWELL 4 SEN31 — I:037 / 03
- PALLET DETECTED MIDDLE DWELL 4 SEN32 — I:037 / 04
- PALLET DETECTED RIGHT SIDE DWELL 4 SEN33 — I:037 / 05
- PALLET DETECTED LEFT SIDE BUFFER 3 SEN34 — I:037 / 06
- PALLET DETECTED RIGHT SIDE BUFFER 3 SEN36 — I:037 / 10
- DUMMY DUMMY — B3 ( ) 30

B3/30 - -( )- - File #6 TECH_RUNGS - 4,8,9,10,11,13

Rung #013
- PALLET DETECTED LEFT SIDE DWELL 5 SEN37 — I:037 / 11
- PALLET DETECTED CENTER DWELL 5 SEN38 — I:037 / 12
- PALLET DETECTED RIGHT SIDE DWELL 5 SEN39 — I:037 / 13
- PALLET DETECTED LEFT SIDE CARBON SEN40 — I:053 / 00
- PALLET DETECTED CENTER CARBON SEN41 — I:053 / 01
- PALLET DETECTED RIGHT SIDE CARBON SEN42 — I:053 / 02
- PALLET DETECTED LEFT SIDE DWELL 6 SEN43 — I:053 / 03
- PALLET DETECTED CENTER DWELL 6 SEN44 — I:053 / 04
- PALLET DETECTED RIGHT SIDE DWELL 6 SEN45 — I:053 / 05
- PALLET DETECTED LEFT SIDE BUFFER 4 SEN46 — I:053 / 06
- PALLET DETECTED RIGHT SIDE BUFFER 4 SEN48 — I:053 / 10
- PALLET DETECTED LEFT SIDE EXBUFFER SEN49 — I:053 / 11
- PALLET DETECTED RIGHT SIDE EXBUFFER SEN51 — I:053 / 13
- PALLET DETECTED LEFT SIDE EXIT LOCK SEN52 — I:053 / 14
- PALLET DETECTED RIGHT SIDE EXLOCK SEN54 — I:053 / 16
- PALLET DETECTED LEFT SIDE EXIT END SEN55 — I:053 / 17
- PALLET DETECTED CENTER EXIT END SEN56 — I:054 / 16
- PALLET DETECTED RIGHT SIDE EXIT END SEN57 — I:054 / 17
- DUMMY DUMMY — B3 ( ) 30

B3/30 - -( )- - File #6 TECH_RUNGS - 4,8,9,10,11,12

Rung #014
- COMPRESSOR 1 REGEN-ERATION PROGRAM CYRGN1 — B3 / 321 [3:0]
- COMPRESSOR 2 REGEN-ERATION PROGRAM CYRGN2 — B3 / 322 [3:34]
- COMPRESSOR 3 REGEN-ERATION PROGRAM CYRGN3 — B3 / 323 [3:38]
- COMPRESSOR 4 REGEN-ERATION PROGRAM CYRGN4 — B3 / 324 [3:42]
- COMPRESSOR 5 REGEN-ERATION PROGRAM CYRGN5 — B3 / 325 [3:46]
- COMPRESSOR 6 REGEN-ERATION PROGRAM CYRGN6 — B3 / 326 [3:52]
- COMPRESSOR 7 REGEN-ERATION PROGRAM CYRGN7 — B3 / 327 [3:57]
- COMPRESSOR 8 REGEN-ERATION PROGRAM CYRGN8 — B3 / 328 [3:63]
- OPEN CRYO ROUGH VALVE 1 CR1 — O:007 / 11 [3:15]
- OPEN CRYO ROUGH VALVE 2 CR2 — O:007 / 12 [3:164]
- OPEN CRYO ROUGH VALVE 3 CR3 — O:007
- OPEN CRYO ROUGH VALVE 4 CR4 — O:027
- OPEN CRYO ROUGH VALVE 5 CR5 — O:027
- OPEN CRYO ROUGH VALVE 6 CR6 — O:027
- OPEN CRYO ROUGH VALVE 7 CR7 — O:043
- OPEN CRYO ROUGH VALVE 8 CR8 — O:043
- OPEN CRYO ROUGH VALVE 9 CR9 — O:043
- OPEN CRYO ROUGH VALVE 10 CR10 — O:057
- OPEN CRYO ROU VALVE 11 CR11 — O:057

>>>>>> >>>>>>>>>>> >>>>>>>>>>> >>>>>>>>>>> >>>>>>>>>>> >>>>>>>>>>> >>>>>>>>>>> >>>>>>>>>>> >>>>>>>>>>> >>>
- COMPRESSOR 1 REGEN-ERATION PROGRAM CYRGN1 — B3
- COMPRESSOR 2 REGEN-ERATION PROGRAM CYRGN2 — B3

- 658 -

<<<<<< <<<<<<<<<<< <<<<<<<<<<< <<<<<<<<<<< <<<<<<<<<<< <<<<<<<<<<< <<<<<<<<<<< <<<<<<<<<<< <<<<<<<<<<< <<<

13 11 12 13 11 12 13 11 12 321 322
[3:165] [3:167] [3:166] [3:168] [3:169] [3:170] [3:171] [3:172] [3:174] [3:0] [3:34]

B3/15 - -( )- - File #6 TECH_RUNGS - 14,15,17

Rung #015

PURGE 1 P1 B3 631 [3:5]
PURGE 2 P2 B3 632 [3:74]
PURGE 3 P3 B3 633 [3:75]
PURGE 4 P4 B3 634 [3:76]
PURGE 5 P5 B3 635 [3:77]
PURGE 6 P6 B3 636 [3:78]
PURGE 7 P7 B3 637 [3:79]
PURGE 8 P8 B3 638 [3:80]
PGC1 T4:21 TT [3:9]
PGC2 T4:22 TT [3:110]
PGC3 T4:23 TT [3:111]
PURGING TIME PGC4 T4:24 TT [3:112]
PURGING TIME 5 PGC5 T4:25 TT [3:113]
PGC6 T4:26 TT [3:114]
PGC7 T4:27 TT [3:115]

PGC8 T4:28 TT [3:116]
MECHANICAL PUMP 2 ENABLED MP2 O:027 00 [2:73]
BLOWER 2 ENABLED BL2 O:027 01 [2:74]
LINE PRESSURE MADE-TC10 LPM-TC10 B3 250 [2:671]
TEMP TEMP15 B3 -( )- 15

B3/15 - -( )- - File #6 TECH_RUNGS - 14,17

Rung #016

OPEN PURGE VALVE 1 NIF1 O:007 06 [3:7]
OPEN PURGE VALVE 2 NIF2 O:007 07 [3:88]
OPEN PURGE VALVE 3 NIF3 O:007 10 [3:89]
OPEN PURGE VALVE 4 NIF4 O:027 06 [3:91]
OPEN PURGE VALVE 5 NIF5 O:027 07 [3:90]
OPEN PURGE VALVE 6 NIF6 O:027 10 [3:92]
OPEN PURGE VALVE 7 NIF7 O:043 06 [3:93]
OPEN PURGE VALVE 8 NIF8 O:043 07 [3:94]
OPEN PURGE VALVE 9 NIF9 O:043 10 [3:95]
OPEN PURGE VALVE 10 NIF10 O:057 06 [3:96]

OPEN PURGE VALVE 11 NIF11 O:057 07 [3:98]
OPEN PURGE VALVE 12 NIF12 O:057 10 [3:97]
CRYO RE-GENERATION FAULT COMPRESSOR 1 CRFLT1 B3 331 [3:30]
CRYO RE-GENERATION FAULT COMPRESSOR 2 CRFLT2 B3 332 [3:252]
CRYO RE-GENERATION FAULT COMPRESSOR 3 CRFLT3 B3 333 [3:253]
CRYO RE-GENERATION FAULT COMPRESSOR 4 CRFLT4 B3 334 [3:254]
CRYO RE-GENERATION FAULT COMPRESSOR 5 CRFLT5 B3 335 [3:255]
CRYO RE-GENERATION FAULT COMPRESSOR 6 CRFLT6 B3 336 [3:256]
CRYO RE-GENERATI FAULT COMPRESS 7 CRFLT7 B3 337 [3:257]
OPEN PURGE VALVE 1 NIF1 O:007 06 [3:7]
OPEN PURGE VALVE 2 NIF2 O:007 07 [3:88]

Rung #017

ROUGHING AND ROR 1 R&ROR1 B3 641 [3:11]
ROUGHING AND ROR 2 R&ROR2 B3 642 [3:128]
ROUGHING AND ROR 3 R&ROR3 B3 643 [3:129]
ROUGHING AND ROR 4 R&ROR4 B3 644 [3:130]
ROUGHING AND ROR 5 R&ROR5 B3 645 [3:131]
ROUGHING AND ROR 6 R&ROR6 B3 646 [3:132]
ROUGHING AND ROR 7 R&ROR7 B3 647 [3:133]
ROUGHING AND ROR 8 R&ROR8 B3 648 [3:134]
COMPRESSOR 1 ROR LATCH CY1RORL B3 601 [3:16]
COMPRESSOR 2 ROR LATCH CY2RORL B3 602 [3:175]
COMPRESSOR 3 ROR LATCH CY3RORL B3 603 [3:177]

COMPRESSOR 4 ROR LATCH CY4RORL B3 604 [3:179]
COMPRESSOR 5 ROR LATCH CY5RORL B3 605 [3:181]
COMPRESSOR 6 ROR LATCH CY6RORL B3 606 [3:183]
COMPRESSOR 7 ROR LATCH CY7RORL B3 607 [3:185]
COMPRESSOR 8 ROR LATCH CY8RORL B3 608 [3:187]
MECHANICAL PUMP 2 TC=<50 MICRONS PIR10 I:024 13
TEMP TEMP15 B3 -( )- 15

B3/15 - -( )- - File #6 TECH_RUNGS - 14,15

```
Rung #018
|CRYO 1      CRYO 2      CRYO 3      CRYO 4      CRYO 5      CRYO 6      CRYO 7      CRYO 8      CRYO 9      CRYO 10
|THERMCOUPL  THERMCOUPL  THERMCOUPL  THERMCOUPL  THERMCOUPL  THERMCOUPL  THERMCOUPL  THERMCOUPL  THERMCOUPL  THERMCOUPL
|50 MICRON   50 MICRON   50 MICRON   50 MICRON   50 MICRON   50 MICRON   50 MICRON   50 MICRON   50 MICRON   50 MICRON
|PIR3        PIR4        PIR5        PIR7        PIR8        PIR9        PIR12       PIR13       PIR14       PIR18
|  I:004       I:004       I:004       I:024       I:024       I:024       I:040       I:040       I:040       I:054
|---| |-------| |---------| |--------| |--------| |--------| |--------| |--------| |--------| |--------| |---
|   11        12          13          10          11          12          10          11          12          11
| B3/16 - -( )- - File #6 TECH_RUNGS - 22

            CRYO 11     CRYO 12                                                                                  |CRYO 1
            THERMCOUPL  THERMCOUPL                                                                               |THERMCOU
            50 MICRON   50 MICRON                                                                                |50 MICRO
            PIR19       PIR20      C1RORTMR  C2RORTMR  C3RORTMR  C4RORTMR  C5RORTMR  C6RORTMR  C7RORTMR  C8RORTMR |PIR3
              I:054       I:054      T4:31     T4:32     T4:33     T4:34     T4:35     T4:36     T4:37     T4:38  |  I:004
 ...      ----| |---------| |--------| |-------| |-------| |-------| |-------| |-------| |-------| |-------| |---|---| |-
               12          13         TT        TT        TT        TT        TT        TT        TT        TT   |   11
                                     [3:18]    [3:189]   [3:190]   [3:191]   [3:192]   [3:193]   [3:194]   [3:195] | B3/16 -
Rung #019
|
|                                                                                  ENABLE      ENABLE      ENABLE
|                                                                                  CRYO        CRYO        CRYO
|COOL DOWN  COOL DOWN  COOL DOWN  COOL DOWN  COOL DOWN  COOL DOWN  COOL DOWN  COOL DOWN  COMPRESSOR  COMPRESSOR  COMPRESSOR
|1          2          3          4          5          6          7          8          1           2           3
|CD1        CD2        CD3        CD4        CD5        CD6        CD7        CD8        CY1         CY2         CY3
|  B3         B3         B3         B3         B3         B3         B3         B3         O:010       O:010       O:030
|--| |-------| |-------| |-------| |-------| |-------| |-------| |-------| |---------| |---------| |---------| |---
|  651        652        653        654        655        656        657        658        04          05          04
|[3:20]     [3:203]    [3:204]    [3:205]    [3:206]    [3:207]    [3:208]    [3:209]    [2:26]      [2:27]      [2:28]
                                              ENABLE      ENABLE      ENABLE      ENABLE      ENABLE                |
                                              CRYO        CRYO        CRYO        CRYO        CRYO                  |
                                              COMPRESSOR  COMPRESSOR  COMPRESSOR  COMPRESSOR  COMPRESSOR            |
                                              4           5           6           7           8          TEMP 20    |
                                              CY4         CY5         CY6         CY7         CY8        TMP20      |
                                                O:030       O:044       O:044       O:060       O:060      B3       |
                                              ---| |---------| |---------| |---------| |---------| |--------( )----|
                                                 05          04          05          04          05         20      |
                                              [2:29]      [2:30]      [2:31]      [2:32]      [2:33]                |
Rung #020
|CYRO 1      CRYO 2      CRYO 3      CRYO 4      CRYO 5      CRYO 6      CRYO 7      CRYO 8      CRYO 9      CRYO 10
|TEMPERATUR  TEMPERATUR  TEMPERATUR  TEMPERATUR  TEMPERATUR  TEMPERATUR  TEMPERATUR  TEMPERATUR  TEMPERATUR  TEMPERATUR
|=>290K      =>290K      =>290K      =>290K      =>290K      =>290K      =>290K      =>290K      =>290K      =>290K
|CY1TMP290   CY2TMP290   CY3TMP290   CY4TMP290   CY5TMP290   CY6TMP290   CY7TMP290   CY8TMP290   CY9TMP290   CY10TMP290
|  B3          B3          B3          B3          B3          B3          B3          B3          B3          B3
|--| |--------| |---------| |---------| |---------| |---------| |---------| |---------| |---------| |---------| |---
|  513         514         515         516         517         518         519         520         521         522
                                                                                         CRYO 11     CRYO 12          |
                                                                                         TEMPERATUR  TEMPERATUR       |
                                                                                         =>290K      =>290K           |
                                                                                         CY11TMP290  CY12TMP290       |
                                                                                           B3          B3        B3   |
                                                                                       ---| |---------| |--------( )--|
                                                                                           523         524       25   |
Rung #021
|CRYO 1      CRYO 2      CRYO 3      CRYO 4      CRYO 5      CRYO 6      CRYO 7      CRYO 8      CRYO 9      CRYO 10
|TEMPERATUR  TEMPERATUR  TEMPERATUR  TEMPERATUR  TEMPERATUR  TEMPERATUR  TEMPERATUR  TEMPERATUR  TEMPERATUR  TEMPERATUR
|=<20K       =<20K       =<20K       =<20K       =<20K       =<20K       =<20K       =<20K       =<20K       =<20K
|CY1TMP20    CY2TMP20    CY3TMP20    CY4TMP20    CY5TMP20    CY6TMP20    CY7TMP20    CY8TMP20    CY9TMP20    CY10TMP20
|  B3          B3          B3          B3          B3          B3          B3          B3          B3          B3
|--| |--------| |---------| |---------| |---------| |---------| |---------| |---------| |---------| |---------| |---
|  501         502         503         504         505         506         507         508         509         510
                                                                                         CRYO 11     CRYO 12          |
                                                                                         TEMPERATUR  TEMPERATUR       |
                                                                                         =<20K       =<20K    TEMP 21 |
                                                                                                                      >
```

```
                                                                                      CY11TMP20  CY12TMP20  TEMP21
                                                                                         B3         B3        B3
                                                                                      ---] [------] [-------( )---
                                                                                        511        512        21
GOTO
Rung #022
|PALLET     PALLET      PALLET     PALLET     PALLET     PALLET     PALLET     PALLET     PALLET     PALLET     PALLET
|DETECTED   DETECTED    DETECTED   DETECTED   DETECTED   DETECTED   DETECTED   DETECTED   DETECTED   DETECTED   DETECTED
|LEFT SIDE  RIGHT SIDE  LEFT SIDE  LEFT SIDE  LEFT SIDE  LEFT SIDE  LEFT SIDE  LEFT SIDE  LEFT SIDE  LEFT SIDE  LEFT SIDE
|ENTRANCE   ENTRANCE    HEATER 1   HEATER 2   DWELL 1    CHROME     DWELL 2    HEATER 3   DWELL 3    MAGNETIC   DWELL 4
|SEN1       SEN3        SEN7       SEN10      SEN13      SEN16      SEN19      SEN22      SEN25      SEN28      SEN31
|  I:003      I:003       I:003      I:003      I:003      I:023      I:023      I:023      I:023      I:037      I:037
|---] [-------] [---------] [--------] [--------] [--------] [--------] [--------] [--------] [--------] [--------] [---
|    00         02          06         11         14         00         03         06         11         00         03
                                                                       PALLET     PALLET     PALLET     PALLET
                                                                       DETECTED   DETECTED   DETECTED   DETECTED
                                                                       LEFT SIDE  LEFT SIDE  LEFT SIDE  LEFT SIDE
                                                                       BUFFER 3   DWELL 5    CARBON     DWELL 6    TEMP
                                                                       SEN34      SEN37      SEN40      SEN43      TEMP16
                                                                         I:037      I:037      I:053      I:053      B3
                                                                       ---] [--------] [--------] [--------] [-------( )---
                                                                           06         11         00         03         16
B3/16 - -( )- - File #6 TECH_RUNGS - 18
Rung #023
|PALLET     PALLET     PALLET     PALLET     PALLET
|DETECTED   DETECTED   DETECTED   DETECTED   DETECTED
|LEFT SIDE  LEFT SIDE  LEFT SIDE  LEFT SIDE  RIGHT SIDE
|BUFFER 4   EXBUFFER   EXIT LOCK  EXIT END   EXIT END
|SEN46      SEN49      SEN52      SEN55      SEN57
|  I:053      I:053      I:053      I:053      I:054                                                          B3
|---] [--------] [--------] [--------] [--------] [--------------------------------------------------------( )---
|    06         11         14         17         17                                                            17
Rung #024
|                                                                                             RETURN FROM
|                                                                                             TECH RUNGS
|                                                                                             TO MAIN
|                                                                                             FROM_TR
|                                                                                            +-RET---------+
|--------------------------------------------------------------------------------------------+RETURN ()    +---
|                                                                                            +-------------+
Rung #025
|------------------------------------------------------------------------------------------------------[END]---
```

SECTION N

COPYRIGHT 1989, 1990, 1991
CONNER PERIPHERALS, INC.

COPYRIGHT 1989, 1990, 1991
CONNER PERIPHERALS, INC.

CA -- GENERAL CALCULATION

| | EL | EH | ET | RN | OUTPUT | B | C | D | E | F | G | H | NX | CP |
|---|---|---|---|---|---|---|---|---|---|---|---|---|---|---|
| : | 0 | 432 | DegK | Y | OUTPUT = ((B*A)+C) | TD2H | TD2B | 0.0000 | 0.0000 | 0.0000 | 0.00 | 0.00 | TD2AB | . |
| : | 0 | 432 | DegK | Y | OUTPUT = ((B*A)+C) | TD3H | TD3B | 0.0000 | 0.0000 | 0.0000 | 0.00 | 0.00 | TD3AB | . |
| : | 0 | 432 | DegK | Y | OUTPUT = ((B*A)+C) | TD4H | TD4B | 0.0000 | 0.0000 | 0.0000 | 0.00 | 0.00 | TD4AB | . |
| : | 0 | 432 | DegK | Y | OUTPUT = ((B*A)+C) | TD5H | TD5B | 0.0000 | 0.0000 | 0.0000 | 0.00 | 0.00 | TD5AB | . |
| : | 0 | 432 | DegK | Y | OUTPUT = ((B*A)+C) | TD6H | TD6B | 0.0000 | 0.0000 | 0.0000 | 0.00 | 0.00 | TD6AB | . |
| : | 0 | 432 | DegK | Y | OUTPUT = ((B*A)+C) | TD7H | TD7B | 0.0000 | 0.0000 | 0.0000 | 0.00 | 0.00 | TD7AB | . |
| | 0 | 432 | DegK | Y | OUTPUT = ((B*A)+C) | TD8H | TD8B | 0.0000 | 0.0000 | 0.0000 | 0.00 | 0.00 | TD8AB | . |
| : | 0 | 432 | DegK | Y | OUTPUT = ((B*A)+C) | TD9H | TD9B | 0.0000 | 0.0000 | 0.0000 | 0.00 | 0.00 | TD9AB | . |
| C | 0 | 432 | DegK | Y | OUTPUT = ((B*A)+C) | TD10H | TD10B | 0.0000 | 0.0000 | 0.0000 | 0.00 | 0.00 | TD10AB | . |
| C | 0 | 432 | DegK | Y | OUTPUT = ((B*A)+C) | TD11H | TD11B | 0.0000 | 0.0000 | 0.0000 | 0.00 | 0.00 | TD11AB | . |
| C | 0 | 432 | DegK | Y | OUTPUT = ((B*A)+C) | TD12H | TD12B | 0.0000 | 0.0000 | 0.0000 | 0.00 | 0.00 | TD12AB | . |
| | 0 | 432 | DegK | Y | OUTPUT = ((B*A)+C) | TD1H | TD1B | 0.0000 | 0.0000 | 0.0000 | 0.00 | 0.00 | TD1AB | . |
| | 0.00 | 100.00 | PCT | N | OUTPUT = ((((C/D)*B)*A)/E) | 240.00 | HSP1 | 100.00 | 1000.0 | 0.00 | 0.00 | 0.00 | . | |
| | 0.00 | 100.00 | PCT | N | OUTPUT = ((((C/D)*B)*A)/E) | 240.00 | HSP2 | 100.00 | 1000.0 | 0.00 | 0.00 | 0.00 | . | |
| | 0.00 | 100.00 | PCT | N | OUTPUT = ((((C/D)*B)*A)/E) | 240.00 | HSP3 | 100.00 | 1000.0 | 0.00 | 0.00 | 0.00 | . | |
| | 0.00 | 100.00 | PCT | N | OUTPUT = ((((C/D)*A)*B)/E) | 240.00 | HSP4 | 100.00 | 1000.0 | 0.00 | 0.00 | 0.00 | . | |
| | 0.00 | 100.00 | PCT | N | OUTPUT = ((((C/D)*B)*A)/E) | 240.00 | HSP5 | 100.00 | 1000.0 | 0.00 | 0.00 | 0.00 | . | |
| | 0.00 | 100.00 | PCT | N | OUTPUT = ((((C/D)*A)*B)/E) | 240.00 | HSP6 | 100.00 | 1000.0 | 0.00 | 0.00 | 0.00 | . | |
| | 0.00 | 100.00 | PCT | N | OUTPUT = ((((C/D)*A)*B)/E) | 240.00 | HSP7 | 100.00 | 1000.0 | 0.00 | 0.00 | 0.00 | . | |
| | 0.00 | 100.00 | PCT | N | OUTPUT = ((((C/D)*A)*B)/E) | 240.00 | HSP8 | 100.00 | 1000.0 | 0.00 | 0.00 | 0.00 | . | |
| | 0.0 | 80.0 | amps | Y | OUTPUT = (A*B) | PSF1 | 0.00 | 0.00 | 0.00 | 0.00 | 0.00 | 0.00 | PSSP1A | . |
| | 0.0 | 80.0 | amps | Y | OUTPUT = (A*B) | PSF2 | 0.00 | 0.00 | 0.00 | 0.00 | 0.00 | 0.00 | PSSP2A | . |
| | 0.0 | 80.0 | amps | Y | OUTPUT = (A*B) | PSF3 | 0.00 | 0.00 | 0.00 | 0.00 | 0.00 | 0.00 | PSSP3A | . |
| | 0.0 | 80.0 | amps | Y | OUTPUT = (A*B) | PSF4 | 0.00 | 0.00 | 0.00 | 0.00 | 0.00 | 0.00 | PSSP4A | . |
| | 0.0 | 80.0 | amps | Y | OUTPUT = (A*B) | PSF1 | 0.00 | 0.00 | 0.00 | 0.00 | 0.00 | 0.00 | PSSP1B | . |
| | 0.0 | 80.0 | amps | Y | OUTPUT = (A*B) | PSF2 | 0.00 | 0.00 | 0.00 | 0.00 | 0.00 | 0.00 | PSSP2B | . |
| | 0.0 | 80.0 | amps | Y | OUTPUT = (A*B) | PSF3 | 0.00 | 0.00 | 0.00 | 0.00 | 0.00 | 0.00 | PSSP3B | . |
| | 0.0 | 80.0 | amps | Y | OUTPUT = (A*B) | PSF4 | 0.00 | 0.00 | 0.00 | 0.00 | 0.00 | 0.00 | PSSP4B | . |
| | 0.0 | 80.0 | amps | Y | OUTPUT = (A*B) | PSF5 | 0.00 | 0.00 | 0.00 | 0.00 | 0.00 | 0.00 | PSSP5A | . |
| | 0.0 | 80.0 | amps | Y | OUTPUT = (A*B) | PSF6 | 0.00 | 0.00 | 0.00 | 0.00 | 0.00 | 0.00 | PSSP6A | . |
| | 0.0 | 80.0 | amps | Y | OUTPUT = (A*B) | PSF5 | 0.00 | 0.00 | 0.00 | 0.00 | 0.00 | 0.00 | PSSP5B | . |
| | 0.0 | 80.0 | amps | Y | OUTPUT = (A*B) | PSF6 | 0.00 | 0.00 | 0.00 | 0.00 | 0.00 | 0.00 | PSSP6B | . |
| | 0.0 | 80.0 | amps | Y | OUTPUT = (A*B) | PSF7 | 0.00 | 0.00 | 0.00 | 0.00 | 0.00 | 0.00 | PSSP7A | . |
| | 0.0 | 80.0 | amps | Y | OUTPUT = (A*B) | PSF8 | 0.00 | 0.00 | 0.00 | 0.00 | 0.00 | 0.00 | PSSP8A | . |
| | 0.0 | 80.0 | amps | Y | OUTPUT = (A*B) | PSF7 | 0.00 | 0.00 | 0.00 | 0.00 | 0.00 | 0.00 | PSSP7B | . |
| | 0.0 | 80.0 | amps | Y | OUTPUT = (A*B) | PSF8 | 0.00 | 0.00 | 0.00 | 0.00 | 0.00 | 0.00 | PSSP8B | . |
| | 0.0 | 80.0 | amps | Y | OUTPUT = (A*B) | PSF9 | 0.00 | 0.00 | 0.00 | 0.00 | 0.00 | 0.00 | PSSP9A | . |
| A | 0.0 | 80.0 | amps | Y | OUTPUT = (A*B) | PSF10 | 0.00 | 0.00 | 0.00 | 0.00 | 0.00 | 0.00 | PSSP10A | . |
| A | 0.0 | 80.0 | amps | Y | OUTPUT = (A*B) | PSF11 | 0.00 | 0.00 | 0.00 | 0.00 | 0.00 | 0.00 | PSSP11A | . |
| A | 0.0 | 80.0 | amps | Y | OUTPUT = (A*B) | PSF12 | 0.00 | 0.00 | 0.00 | 0.00 | 0.00 | 0.00 | PSSP12A | . |
| | 0.0 | 80.0 | amps | Y | OUTPUT = (A*B) | PSF9 | 0.00 | 0.00 | 0.00 | 0.00 | 0.00 | 0.00 | PSSP9B | . |
| B | 0.0 | 80.0 | amps | Y | OUTPUT = (A*B) | PSF10 | 0.00 | 0.00 | 0.00 | 0.00 | 0.00 | 0.00 | PSSP10B | . |
| B | 0.0 | 80.0 | amps | Y | OUTPUT = (A*B) | PSF11 | 0.00 | 0.00 | 0.00 | 0.00 | 0.00 | 0.00 | PSSP11B | . |
| B | 0.0 | 80.0 | amps | Y | OUTPUT = (A*B) | PSF12 | 0.00 | 0.00 | 0.00 | 0.00 | 0.00 | 0.00 | PSSP12B | . |
| | 0.0 | 40.0 | PCT | Y | OUTPUT = (A/B) | PSF2 | 0.0000 | 0.00 | 0.00 | 0.00 | 0.00 | 0.00 | . | |
| | 0.0 | 40.0 | . | Y | OUTPUT = (A/B) | PSF1 | 0.00 | 0.00 | 0.00 | 0.00 | 0.00 | 0.00 | . | |

| :3A | 0.0 | 40.0 | . | Y | OUTPUT = (A/B) | PSF3 | 0.00 | 0.00 | 0.03 | 0.00 | 0.00 | 0.00 | . | |
|---|---|---|---|---|---|---|---|---|---|---|---|---|---|---|
| | EL | EH | ET | RH | OUTPUT | B | C | D | E | F | G | H | HX | CP |
| 5A | 0.0 | 40.0 | . | Y | OUTPUT = (A/B) | PSF4 | 0.00 | 0.00 | 0.00 | 0.00 | 0.00 | 0.00 | . | |
| IB | 0.0 | 40.0 | . | Y | OUTPUT = (A/B) | PSF1 | 0.00 | 0.00 | 0.00 | 0.00 | 0.00 | 0.00 | . | |
| :B | 0.0 | 40.0 | . | Y | OUTPUT = (A/B) | PSF2 | 0.00 | 0.00 | 0.00 | 0.00 | 0.00 | 0.00 | . | |
| B | 0.0 | 40.0 | . | Y | OUTPUT = (A/B) | PSF3 | 0.00 | 0.00 | 0.00 | 0.00 | 0.00 | 0.00 | . | |
| B | 0.0 | 40.0 | . | Y | OUTPUT = (A/B) | PSF4 | 0.00 | 0.00 | 0.00 | 0.00 | 0.00 | 0.00 | . | |
| A | 0.0 | 40.0 | . | Y | OUTPUT = (A/B) | PSF5 | 0.00 | 0.00 | 0.00 | 0.00 | 0.00 | 0.00 | . | |
| A | 0.0 | 40.0 | . | Y | OUTPUT = (A/B) | PSF6 | 0.00 | 0.00 | 0.00 | 0.00 | 0.00 | 0.00 | . | |
| B | 0.0 | 40.0 | . | Y | OUTPUT = (A/B) | PSF5 | 0.00 | 0.00 | 0.09 | 0.00 | 0.00 | 0.00 | . | |
| B | 0.0 | 40.0 | . | Y | OUTPUT = (A/B) | PSF6 | 0.00 | 0.00 | 0.00 | 0.00 | 0.00 | 0.00 | . | |
| \ | 0.0 | 40.0 | . | Y | OUTPUT = (A/B) | PSF7 | 0.00 | 0.00 | 0.00 | 0.00 | 0.00 | 0.00 | . | |
| \ | 0.0 | 40.0 | . | Y | OUTPUT = (A/B) | PSF8 | 0.00 | 0.00 | 0.00 | 0.00 | 0.00 | 0.00 | . | |
| I | 0.0 | 40.0 | . | Y | OUTPUT = (A/B) | PSF7 | 0.00 | 0.00 | 0.00 | 0.00 | 0.00 | 0.00 | . | |
| I | 0.0 | 40.0 | . | Y | OUTPUT = (A/B) | PSF8 | 0.00 | 0.00 | 0.00 | 0.00 | 0.00 | 0.00 | . | |
| \ | 0.0 | 40.0 | . | Y | OUTPUT = (A/B) | PSF9 | 0.00 | 0.00 | 0.00 | 0.00 | 0.00 | 0.00 | . | |
| )A | 0.0 | 40.0 | . | Y | OUTPUT = (A/B) | PSF10 | 0.00 | 0.00 | 0.00 | 0.00 | 0.00 | 0.00 | . | |
| IA | 0.0 | 40.0 | . | Y | OUTPUT = (A/B) | PSF11 | 0.00 | 0.00 | 0.00 | 0.00 | 0.00 | 0.00 | . | |
| 2A | 0.0 | 40.0 | . | Y | OUTPUT = (A/B) | PSF12 | 0.00 | 0.00 | 0.00 | 0.00 | 0.00 | 0.00 | . | |
| I | 0.0 | 40.0 | . | Y | OUTPUT = (A/B) | PSF9 | 0.00 | 0.00 | 0.00 | 0.00 | 0.00 | 0.00 | . | |
| IB | 0.0 | 40.0 | . | Y | OUTPUT = (A/B) | PSF10 | 0.00 | 0.00 | 0.00 | 0.00 | 0.00 | 0.00 | . | |
| B | 0.0 | 40.0 | . | Y | OUTPUT = (A/B) | PSF11 | 0.00 | 0.00 | 0.00 | 0.00 | 0.00 | 0.00 | . | |
| B | 0.0 | 40.0 | . | Y | OUTPUT = (A/B) | PSF12 | 0.00 | 0.00 | 0.00 | 0.00 | 0.00 | 0.00 | . | |
| | 0 | 32767 | . | N | OUTPUT = (((A*B)+(C*D))+(E*F)) | 10.000 | 0.00 | 100.00 | HV1S3 | 1000.0 | 0.00 | 0.00 | HV1ANA | . |
| | 0 | 32767 | . | N | OUTPUT = (((A*B)+(C*D))+(E*F)) | 10.000 | HV2S2 | 100.00 | HV2S3 | 1000.0 | 0.00 | 0.00 | HV2ANA | . |
| | 0 | 32767 | . | N | OUTPUT = ((A*B)+(C*D)) | 10.000 | DROP1S | 1000.0 | 0.00 | 0.00 | 0.00 | 0.00 | DR1ANA | . |
| | 0 | 32767 | . | N | OUTPUT = (((A*B)+(C*D))+(E*F)) | 10.000 | HV3S2 | 100.00 | HV3S3 | 1000.0 | 0.00 | 0.00 | HV3ANA | . |
| | 0 | 32767 | . | N | OUTPUT = (((A*B)+(C*D))+(E*F)) | 10.000 | HV4S2 | 100.00 | HV4S3 | 1000.0 | 0.00 | 0.00 | HV4ANA | . |
| | 0 | 32767 | . | N | OUTPUT = (((A*B)+(C*D))+(E*F)) | 10.000 | HV5S2 | 100.00 | HV5S3 | 1000.0 | 0.00 | 0.00 | HV5ANA | . |
| | 0 | 32767 | . | N | OUTPUT = ((A*B)+(C*D)) | 10.000 | HV6S2 | 100.00 | HV6S3 | 1000.0 | 0.00 | 0.00 | HV6ANA | . |
| | 0 | 32767 | . | N | OUTPUT = ((A*B)+(C*D)) | 10.000 | DROP2S | 1000.0 | 0.00 | 0.00 | 0.00 | 0.00 | DR2ANA | . |
| | 0 | 32767 | . | N | OUTPUT = ((A*B)+(C*D)) | 10.000 | DROP3S | 1000.0 | 0.00 | 0.00 | 0.00 | 0.00 | DR3ANA | . |
| | 0 | 32767 | . | N | OUTPUT = ((A*B)+(C*D)) | 10.000 | DROP4S | 1000.0 | 0.00 | 0.00 | 0.00 | 0.00 | DR4ANA | . |
| | 0 | 32767 | . | N | OUTPUT = ((A*B)+(C*D)) | 10.000 | DROP5S | 1000.0 | 0.00 | 0.00 | 0.00 | 0.00 | DR5ANA | . |
| | 0 | 32767 | . | N | OUTPUT = (((A*B)+(C*D))+(E*F)) | 10.000 | DROP6S | 1000.0 | 0.00 | 0.00 | 0.00 | 0.00 | DR6ANA | . |
| | 0 | 32767 | . | N | OUTPUT = (((A*B)+(C*D))+(E*F)) | 10.000 | HV7S2 | 100.00 | HV7S3 | 1000.0 | 0.00 | 0.00 | HV7ANA | . |
| | 0 | 32767 | . | N | OUTPUT = (((A*B)+(C*D))+(E*F)) | 10.000 | HV8S2 | 100.00 | HV8S3 | 1000.0 | 0.00 | 0.00 | HV8ANA | . |
| | 0 | 32767 | . | N | OUTPUT = (((A*B)+(C*D))+(E*F)) | 10.000 | HV9S2 | 100.00 | HV9S3 | 1000.0 | 0.00 | 0.00 | HV9ANA | . |
| | 0 | 32767 | . | N | OUTPUT = (((A*B)+(C*D))+(E*F)) | 10.000 | HV10S2 | 100.00 | HV10S3 | 1000.0 | 0.00 | 0.00 | HV10ANA | . |
| | 0 | 32767 | . | N | OUTPUT = (((A*B)+(C*D))+(E*F)) | 10.000 | HV11S2 | 100.00 | HV11S3 | 1000.0 | 0.00 | 0.00 | HV11ANA | . |
| | 0 | 32767 | . | N | OUTPUT = ((A*B)+(C*D)) | 10.000 | HV12S2 | 100.00 | HV12S3 | 1000.0 | 0.00 | 0.00 | HV12ANA | . |
| | 0 | 32767 | . | N | OUTPUT = ((A*B)+(C*D)) | 10.000 | DROP7S | 1000.0 | 0.00 | 0.00 | 0.00 | 0.00 | DR7ANA | . |
| | 0 | 32767 | . | N | OUTPUT = ((A*B)+(C*D)) | 10.000 | DROP8S | 1000.0 | 0.00 | 0.00 | 0.00 | 0.00 | DR8ANA | . |
| | 0 | 32767 | . | N | OUTPUT = ((A*B)+(C*D)) | 10.000 | DROP9S | 1000.0 | 0.00 | 0.00 | 0.00 | 0.00 | DR9ANA | . |
| | 0 | 32767 | . | N | OUTPUT = ((A*B)+(C*D)) | 10.000 | DROP10S | 1000.0 | 0.00 | 0.00 | 0.00 | 0.00 | DR10ANA | . |
| | 0 | 32767 | . | N | OUTPUT = ((A*B)+(C*D)) | 10.000 | DROP11S | 1000.0 | 0.00 | 0.00 | 0.00 | 0.00 | DR11ANA | . |
| | 0 | 32767 | . | N | OUTPUT = ((A*B)+(C*D)) | 10.000 | DROP12S | 1000.0 | 0.00 | 0.00 | 0.00 | 0.00 | DR12ANA | . |

'91

BL -- BOOLEAN BLOCK

| CT_CLO | OT_OP | ST_SC | IS_I | OUTPUT EQUAL | A_INPUT | B_INPUT | C_INPUT | D_INPUT | E_INPUT | F_INPUT | G_ | H_ | DESC | CP_COPY TO |
|---|---|---|---|---|---|---|---|---|---|---|---|---|---|---|
| CLOSE | OPEN | 2 | ON | (((((A+B)+C)+D)+E)+F) | PSON1 | PSON2 | PSON3 | PSON4 | PSON5 | PSON6 | 0 | 0 | Power Supplies on logic | PSAUTO1 |
| CLOSE | OPEN | 2 | ON | (((((A+B)+C)+D)+E)+F) | PSON7 | PSON8 | PSON9 | PSON10 | PSON11 | PSON12 | 0 | 0 | Power Supplies on logic | PSAUTO2 |
| CLOSE | OPEN | 2:1 | ON | (((((A*B)*C)*D)*E)*F) | CHR1A | CHR2A | CHR3A | CHR4A | CHRS1 | CHRS2 | 0 | 0 | Water Flow Interlock: PS1A-4A | PSIW1 |
| CLOSE | OPEN | 2:1 | ON | (((((A*B)*C)*D)*E)*F) | CHR1B | CHR2B | CHR3B | CHR4B | CHRS1 | CHRS2 | 0 | 0 | Water Flow Interlock: PS1B-4B | PSIW2 |
| CLOSE | OPEN | 2 | ON | (((((A*B)*C)*D)*E)*F) | MAG5A | MAG6A | MAG5B | MAG6B | MAGS1 | MAGS2 | 0 | 0 | Water Flow Interlocks: PS5 & 6 | PSIW3 |
| CLOSE | OPEN | 2 | ON | (((((A*B)*C)*D)*E)*F) | MAG7A | MAG8A | MAG7B | MAG8B | MAGS1 | MAGS2 | 0 | 0 | Water Flow Interlocks: PS7 & 8 | PSIW4 |
| CLOSE | OPEN | 2:1 | ON | (((((A*B)*C)*D)*E)*F) | CAR9A | CAR10A | CAR11A | CAR12A | CARS1 | CARS2 | 0 | 0 | Water Flow Interlocks: PS9A-12A | PSIW5 |
| CLOSE | OPEN | 2 | ON | (((((A*B)*C)*D)*E)*F) | CAR9B | CAR10B | CAR11B | CAR12B | CARS1 | CARS2 | 0 | 0 | Water Flow Interlocks: PS9B-12B | PSIW6 |
| CLOSE | OPEN | 2 | ON | (A*B) | CC5 | CC6 | 0 | 0 | 0 | 0 | 0 | 0 | Cover Interlocks - Chrome | PSIX1 |
| CLOSE | OPEN | 2:1 | ON | (A*B) | CC5 | CC6 | 0 | 0 | 0 | 0 | 0 | 0 | Cover Interlocks - Chrome | PSIX2 |
| CLOSE | OPEN | 2 | ON | (A*B) | CC9 | CC10 | 0 | 0 | 0 | 0 | 0 | 0 | Cover Interlocks - Mag | PSIX3 |
| CLOSE | OPEN | 2:1 | ON | (A*B) | CC9 | CC10 | 0 | 0 | 0 | 0 | 0 | 0 | Cover Interlocks - Mag | PSIX4 |
| CLOSE | OPEN | 2 | ON | (A*B) | CC11 | CC12 | 0 | 0 | 0 | 0 | 0 | 0 | Cover Interlocks - Carbon | PSIX5 |
| CLOSE | OPEN | 2:1 | ON | (A*B) | CC11 | CC12 | 0 | 0 | 0 | 0 | 0 | 0 | Cover Interlocks - Carbon | PSIX6 |
| 14 | 14 | 14 | 14 | 14 | 14 | 14 | 14 | 14 | 14 | 14 | 14 | 14 | 14 | 14 |

PG--PROGRAM BLOCK

3/07/91

| TAG | AD_ | AP | ST_SCA | IS_IN | IA_I | DESC | PROGRAM | | | | |
|---|---|---|---|---|---|---|---|---|---|---|---|
| COMPG | TH | L | 1 | | ON | AUTO AB/Fix Communications Detect | 00 | MAXWAIT | 10 | | |
| | | | | | | | 01 | OPEN | CONTIN | | |
| | | | | | | | 02 | WAITFOR | CONTIN | = CLOSE | |
| | | | | | | | 03 | CLOSE | CONTIN | | |
| | | | | | | | 04 | NUL | | | |
| | | | | | | | 05 | NUL | | | |
| | | | | | | | 06 | NUL | | | |
| | | | | | | | 07 | NUL | | | |
| | | | | | | | 08 | NUL | | | |
| | | | | | | | 09 | NUL | | | |
| | | | | | | | 10 | NUL | | | |
| | | | | | | | 11 | NUL | | | |
| | | | | | | | 12 | NUL | | | |
| | | | | | | | 13 | NUL | | | |
| | | | | | | | 14 | NUL | | | |
| | | | | | | | 15 | NUL | | | |
| | | | | | | | 16 | NUL | | | |
| | | | | | | | 17 | NUL | | | |
| | | | | | | | 18 | NUL | | | |
| | | | | | | | 19 | NUL | | | |
| CTRSTPG | TH | L | 5 | | ON | AUTO Pallet counter reset program | 00 | MAXWAIT | 6 | | |
| | | | | | | | 01 | IF | CTRST | = OPEN | GOTO 4 |
| | | | | | | | 02 | WAITFOR | CTRST | = OPEN | |
| | | | | | | | 03 | OPEN | CTRST | | |
| | | | | | | | 04 | GOTO | 0 | | |
| | | | | | | | 05 | NUL | | | |
| | | | | | | | 06 | NUL | | | |
| | | | | | | | 07 | NUL | | | |
| | | | | | | | 08 | NUL | | | |
| | | | | | | | 09 | NUL | | | |
| | | | | | | | 10 | NUL | | | |
| | | | | | | | 11 | NUL | | | |
| | | | | | | | 12 | NUL | | | |
| | | | | | | | 13 | NUL | | | |
| | | | | | | | 14 | NUL | | | |
| | | | | | | | 15 | NUL | | | |
| | | | | | | | 16 | NUL | | | |
| | | | | | | | 17 | NUL | | | |
| | | | | | | | 18 | NUL | | | |
| | | | | | | | 19 | NUL | | | |

3/07/91

| TAG | AD_ | AP | ST_SCA | IS_IN | IA_I | DESC | PROGRAM |
|---|---|---|---|---|---|---|---|
| GASPG1 | TH | L | 2:1 | OFF | AUTO | Gas Control Heater 1 | |

```
00  SETLIM          10.00
01  IF       GF1          = OPEN  GOTO 5
02  NUL
03  SETOUT   FLOST1   FLOSP1
04  GOTO     6
05  SETOUT   FLOST1          0
06  IF       GF2          = OPEN  GOTO 10
07  NUL
08  SETOUT   FLOST2   FLOSP2
09  GOTO     0
10  SETOUT   FLOST2          0
11  GOTO     0
12  NUL
13  NUL
14  NUL
15  NUL
16  NUL
17  NUL
18  NUL
19  NUL
```

| TAG | AD_ | AP | ST_SCA | IS_IN | IA_I | DESC | PROGRAM |
|---|---|---|---|---|---|---|---|
| GASPG2 | TH | L | 2 | OFF | AUTO | Gas Control Chrome | |

```
00  SETLIM          10.00
01  IF       GF3          = OPEN  GOTO 5
02  NUL
03  SETOUT   FLOST3   FLOSP3
04  GOTO     6
05  SETOUT   FLOST3          0
06  IF       GF4          = OPEN  GOTO 10
07  NUL
08  SETOUT   FLOST4   FLOSP4
09  GOTO     0
10  SETOUT   FLOSP4          0
11  GOTO     0
12  NUL
13  NUL
14  NUL
15  NUL
16  NUL
17  NUL
18  NUL
19  NUL
```

- 667 -

3/07/91

```
TAG      AD_ AP ST_SCA IS_IN IA_I DESC                                  PROGRAM
-------  --- -- ------ ----- ---- ----------------------------------  ------------------------------------------------
GASPG3   TH  L  2:1     OFF  AUTO Gas Control Mag                      00  SETLIM      10.00
                                                                       01  IF       GF5        = OPEN  GOTO 5
                                                                       02  NUL
                                                                       03  SETOUT   FLOST5     FLOSP5
                                                                       04  GOTO     6
                                                                       05  SETOUT   FLOST5          0
                                                                       06  IF       GF6        = OPEN  GOTO 10
                                                                       07  NUL
                                                                       08  SETOUT   FLOST6     FLOSP6
                                                                       09  GOTO     0
                                                                       10  SETOUT   FLOST6          0
                                                                       11  GOTO     0
                                                                       12  NUL
                                                                       13  NUL
                                                                       14  NUL
                                                                       15  NUL
                                                                       16  NUL
                                                                       17  NUL
                                                                       18  NUL
                                                                       19  NUL

GASPG4   TH  L  2       OFF  AUTO Gas Control Carbon                   00  SETLIM      10.00
                                                                       01  IF       GF7        = OPEN  GOTO 5
                                                                       02  NUL
                                                                       03  SETOUT   FLOST7     FLOSP7
                                                                       04  GOTO     6
                                                                       05  SETOUT   FLOST7          0
                                                                       06  IF       GF8        = OPEN  GOTO 10
                                                                       07  NUL
                                                                       08  SETOUT   FLOST8     FLOSP8
                                                                       09  GOTO     0
                                                                       10  SETOUT   FLOSP8          0
                                                                       11  GOTO     0
                                                                       12  NUL
                                                                       13  NUL
                                                                       14  NUL
                                                                       15  NUL
                                                                       16  NUL
                                                                       17  NUL
                                                                       18  NUL
                                                                       19  NUL
```

```
3/07/91
TAG     AD_ AP ST_SCA IS_IN IA_I DESC                          PROGRAM
------- --- -- ------ ----- ---- ----------------------------- -------------------------------------------
HTALPG  TH  L  2      ON    AUTO Heater Alarm Program          00  SETLIM        2.00
                                                               01  MAXWAIT   20
                                                               02  IF        RH1A     = OFF    GOTO 6
                                                               03  WAITFOR   RH1A     = OFF
                                                               04  IF        HV01     <     10.0 GOTO 18
                                                               05  IF        HV02     <     10.0 GOTO 18
                                                               06  IF        RH2A     = OFF    GOTO 11
                                                               07  WAITFOR   RH2A     = OFF
                                                               08  IF        HV03     <     10.0 GOTO 18
                                                               09  IF        HV04     <     10.0 GOTO 18
                                                               10  IF        HV05     <     10.0 GOTO 18
                                                               11  IF        RH3A     = OFF    GOTO 16
                                                               12  WAITFOR   RH3A     = OFF
                                                               13  IF        HV06     <     10.0 GOTO 18
                                                               14  IF        HV07     <     10.0 GOTO 18
                                                               15  IF        HV08     <     10.0 GOTO 18
                                                               16  OPEN      HTALH
                                                               17  GOTO      0
                                                               18  CLOSE     HTALH
                                                               19  GOTO      0

PGRUN   TH  L  30     ON    AUTO Run Flow and Pressure Blocks  00  IF        AUTO1    != Off   GOTO 9
                                                               01  IF        AUTO2    != Off   GOTO 9
                                                               02  STOP      CH2
                                                               03  STOP      CH3
                                                               04  STOP      CH4
                                                               05  STOP      FL03
                                                               06  STOP      FL05
                                                               07  STOP      FL07
                                                               08  GOTO      0
                                                               09  RUN       CH2
                                                               10  RUN       CH3
                                                               11  RUN       CH4
                                                               12  RUN       FL03
                                                               13  RUN       FL05
                                                               14  RUN       FL07
                                                               15  GOTO      0
                                                               16  NUL
                                                               17  NUL
                                                               18  NUL
                                                               19  NUL
```

3/07/91

| TAG | AD_ | AP | ST_SCA | IS_IN | IA_I | DESC | PROGRAM | | | | |
|---|---|---|---|---|---|---|---|---|---|---|---|
| ------- | --- | -- | ------ | ----- | ---- | ------------------------------------ | -- | -------- | ------- | ------- | ------- |
| PSALPG1 | TH | L | 3 | | ON | AUTO Power Supply Setpoint Alarm | 00 | MAXWAIT | 20 | | |
| | | | | | | | 01 | NUL | | | |
| | | | | | | | 02 | IF | PSON1 | = Off | GOTO 6 |
| | | | | | | | 03 | WAITFOR | PSSR1A | = OPEN | |
| | | | | | | | 04 | IF | PSSR1A | = CLOSE | GOTO 12 |
| | | | | | | | 05 | IF | PSSR1B | = CLOSE | GOTO 12 |
| | | | | | | | 06 | IF | PSON2 | = Off | GOTO 10 |
| | | | | | | | 07 | WAITFOR | PSSR2A | = OPEN | |
| | | | | | | | 08 | IF | PSSR2A | = CLOSE | GOTO 12 |
| | | | | | | | 09 | IF | PSSR2B | = CLOSE | GOTO 12 |
| | | | | | | | 10 | OPEN | CHRAL1 | | |
| | | | | | | | 11 | GOTO | 0 | | |
| | | | | | | | 12 | CLOSE | CHRAL1 | | |
| | | | | | | | 13 | GOTO | 0 | | |
| | | | | | | | 14 | NUL | | | |
| | | | | | | | 15 | NUL | | | |
| | | | | | | | 16 | NUL | | | |
| | | | | | | | 17 | NUL | | | |
| | | | | | | | 18 | NUL | | | |
| | | | | | | | 19 | NUL | | | |
| PSALPG10 | TH | L | 3 | | ON | AUTO Power Supply Setpoint Alarm | 00 | MAXWAIT | 20 | | |
| | | | | | | | 01 | NUL | | | |
| | | | | | | | 02 | IF | PSON3 | = Off | GOTO 6 |
| | | | | | | | 03 | WAITFOR | PSARC3A | = OPEN | |
| | | | | | | | 04 | IF | PSARC3A | = OPEN | GOTO 12 |
| | | | | | | | 05 | IF | PSARC3B | = OPEN | GOTO 12 |
| | | | | | | | 06 | IF | PSON4 | = Off | GOTO 10 |
| | | | | | | | 07 | WAITFOR | PSARC4A | = OPEN | |
| | | | | | | | 08 | IF | PSARC4A | = OPEN | GOTO 12 |
| | | | | | | | 09 | IF | PSARC4B | = OPEN | GOTO 12 |
| | | | | | | | 10 | OPEN | CHARC2 | | |
| | | | | | | | 11 | GOTO | 0 | | |
| | | | | | | | 12 | CLOSE | CHARC2 | | |
| | | | | | | | 13 | GOTO | 0 | | |
| | | | | | | | 14 | NUL | | | |
| | | | | | | | 15 | NUL | | | |
| | | | | | | | 16 | NUL | | | |
| | | | | | | | 17 | NUL | | | |
| | | | | | | | 18 | NUL | | | |
| | | | | | | | 19 | NUL | | | |

3/07/91

| TAG | AD_ | AP | ST_SCA | IS_IN | IA_I | DESC | PROGRAM | | | | |
|---|---|---|---|---|---|---|---|---|---|---|---|
| PSALPG11 | TH | L | 3:1 | ON | | AUTO Power Supply Setpoint Alarm | 00 | MAXWAIT | 20 | | |
| | | | | | | | 01 | NUL | | | |
| | | | | | | | 02 | IF | PSON7 | = Off | GOTO 6 |
| | | | | | | | 03 | WAITFOR | PSARC7A | = OPEN | |
| | | | | | | | 04 | IF | PSARC7A | = OPEN | GOTO 12 |
| | | | | | | | 05 | IF | PSARC7B | = OPEN | GOTO 12 |
| | | | | | | | 06 | IF | PSON8 | = Off | GOTO 10 |
| | | | | | | | 07 | WAITFOR | PSARC8A | = OPEN | |
| | | | | | | | 08 | IF | PSARC8A | = OPEN | GOTO 12 |
| | | | | | | | 09 | IF | PSARC8B | = OPEN | GOTO 12 |
| | | | | | | | 10 | OPEN | MGARC2 | | |
| | | | | | | | 11 | GOTO | 0 | | |
| | | | | | | | 12 | CLOSE | MGARC2 | | |
| | | | | | | | 13 | GOTO | 0 | | |
| | | | | | | | 14 | NUL | | | |
| | | | | | | | 15 | NUL | | | |
| | | | | | | | 16 | NUL | | | |
| | | | | | | | 17 | NUL | | | |
| | | | | | | | 18 | NUL | | | |
| | | | | | | | 19 | NUL | | | |
| PSALPG12 | TH | L | 3:2 | ON | | AUTO Power Supply Setpoint Alarm | 00 | MAXWAIT | 20 | | |
| | | | | | | | 01 | NUL | | | |
| | | | | | | | 02 | IF | PSON11 | = Off | GOTO 6 |
| | | | | | | | 03 | WAITFOR | PSARC11A | = OPEN | |
| | | | | | | | 04 | IF | PSARC11A | = OPEN | GOTO 12 |
| | | | | | | | 05 | IF | PSARC11B | = OPEN | GOTO 12 |
| | | | | | | | 06 | IF | PSON12 | = Off | GOTO 10 |
| | | | | | | | 07 | WAITFOR | PSARC2C | = OPEN | |
| | | | | | | | 08 | IF | PSARC2D | = OPEN | GOTO 12 |
| | | | | | | | 09 | NUL | | | |
| | | | | | | | 10 | OPEN | CAARC2 | | |
| | | | | | | | 11 | GOTO | 0 | | |
| | | | | | | | 12 | CLOSE | CAARC2 | | |
| | | | | | | | 13 | GOTO | 0 | | |
| | | | | | | | 14 | NUL | | | |
| | | | | | | | 15 | NUL | | | |
| | | | | | | | 16 | NUL | | | |
| | | | | | | | 17 | NUL | | | |
| | | | | | | | 18 | NUL | | | |
| | | | | | | | 19 | NUL | | | |

3/07/91

| TAG | AD_ | AP | ST_SCA | IS_IN | IA_I | DESC | PROGRAM | | | | |
|---|---|---|---|---|---|---|---|---|---|---|---|
| PSALPG2 | TH | L | 3:1 | ON | AUTO | Power Supply Setpoint Alarm | 00 | MAXWAIT | 20 | | |
| | | | | | | | 01 | NUL | | | |
| | | | | | | | 02 | IF | PSON5 | = Off | GOTO 6 |
| | | | | | | | 03 | WAITFOR | PSSR5A | = OPEN | |
| | | | | | | | 04 | IF | PSSR5A | = CLOSE | GOTO 12 |
| | | | | | | | 05 | IF | PSSR5B | = CLOSE | GOTO 12 |
| | | | | | | | 06 | IF | PSON6 | = Off | GOTO 10 |
| | | | | | | | 07 | WAITFOR | PSSR6A | = OPEN | |
| | | | | | | | 08 | IF | PSSR6A | = CLOSE | GOTO 12 |
| | | | | | | | 09 | IF | PSSR6B | = CLOSE | GOTO 12 |
| | | | | | | | 10 | OPEN | HAGAL1 | | |
| | | | | | | | 11 | GOTO | 0 | | |
| | | | | | | | 12 | CLOSE | KAGAL1 | | |
| | | | | | | | 13 | GOTO | 0 | | |
| | | | | | | | 14 | NUL | | | |
| | | | | | | | 15 | NUL | | | |
| | | | | | | | 16 | NUL | | | |
| | | | | | | | 17 | NUL | | | |
| | | | | | | | 18 | NUL | | | |
| | | | | | | | 19 | NUL | | | |
| PSALPG3 | TH | L | 3:2 | ON | AUTO | Power Supply Setpoint Alarm | 00 | MAXWAIT | 20 | | |
| | | | | | | | 01 | NUL | | | |
| | | | | | | | 02 | IF | PSON9 | = Off | GOTO 6 |
| | | | | | | | 03 | WAITFOR | PSSR9A | = OPEN | |
| | | | | | | | 04 | IF | PSSR9A | = CLOSE | GOTO 12 |
| | | | | | | | 05 | IF | PSSR9B | = CLOSE | GOTO 12 |
| | | | | | | | 06 | IF | PSON10 | = Off | GOTO 10 |
| | | | | | | | 07 | WAITFOR | PSSR10A | = OPEN | |
| | | | | | | | 08 | IF | PSSR10A | = CLOSE | GOTO 12 |
| | | | | | | | 09 | IF | PSSR10B | = CLOSE | GOTO 12 |
| | | | | | | | 10 | OPEN | CARAL1 | | |
| | | | | | | | 11 | GOTO | 0 | | |
| | | | | | | | 12 | CLOSE | CARAL1 | | |
| | | | | | | | 13 | GOTO | 0 | | |
| | | | | | | | 14 | NUL | | | |
| | | | | | | | 15 | NUL | | | |
| | | | | | | | 16 | NUL | | | |
| | | | | | | | 17 | NUL | | | |
| | | | | | | | 18 | NUL | | | |
| | | | | | | | 19 | NUL | | | |

3/07/91

| TAG | AD_ | AP | ST_SCA | IS_IN | IA_1 | DESC | PROGRAM | | | | |
|---|---|---|---|---|---|---|---|---|---|---|---|
| PSALPG4 | TH | L | 3 | ON | | AUTO Power Supply Setpoint Alarm | 00 | MAXWAIT | 20 | | |
| | | | | | | | 01 | NUL | | | |
| | | | | | | | 02 | IF | PSON3 | = Off | GOTO 6 |
| | | | | | | | 03 | WAITFOR | PSSR3A | = OPEN | |
| | | | | | | | 04 | IF | PSSR3A | = CLOSE | GOTO 12 |
| | | | | | | | 05 | IF | PSSR3B | = CLOSE | GOTO 12 |
| | | | | | | | 06 | IF | PSON4 | = Off | GOTO 10 |
| | | | | | | | 07 | WAITFOR | PSSR4A | = OPEN | |
| | | | | | | | 08 | IF | PSSR4A | = CLOSE | GOTO 12 |
| | | | | | | | 09 | IF | PSSR4B | = CLOSE | GOTO 12 |
| | | | | | | | 10 | OPEN | CHRAL2 | | |
| | | | | | | | 11 | GOTO | 0 | | |
| | | | | | | | 12 | CLOSE | CHRAL2 | | |
| | | | | | | | 13 | GOTO | 0 | | |
| | | | | | | | 14 | NUL | | | |
| | | | | | | | 15 | NUL | | | |
| | | | | | | | 16 | NUL | | | |
| | | | | | | | 17 | NUL | | | |
| | | | | | | | 18 | NUL | | | |
| | | | | | | | 19 | NUL | | | |
| PSALPG5 | TH | L | 3:1 | ON | | AUTO Power Supply Setpoint Alarm | 00 | MAXWAIT | 20 | | |
| | | | | | | | 01 | NUL | | | |
| | | | | | | | 02 | IF | PSON7 | = Off | GOTO 6 |
| | | | | | | | 03 | WAITFOR | PSSR7A | = OPEN | |
| | | | | | | | 04 | IF | PSSR7A | = CLOSE | GOTO 12 |
| | | | | | | | 05 | IF | PSSR7B | = CLOSE | GOTO 12 |
| | | | | | | | 06 | IF | PSON8 | = Off | GOTO 10 |
| | | | | | | | 07 | WAITFOR | PSSR8A | = OPEN | |
| | | | | | | | 08 | IF | PSSR8A | = CLOSE | GOTO 12 |
| | | | | | | | 09 | IF | PSSR8B | = CLOSE | GOTO 12 |
| | | | | | | | 10 | OPEN | MAGAL2 | | |
| | | | | | | | 11 | GOTO | 0 | | |
| | | | | | | | 12 | CLOSE | MAGAL2 | | |
| | | | | | | | 13 | GOTO | 0 | | |
| | | | | | | | 14 | NUL | | | |
| | | | | | | | 15 | NUL | | | |
| | | | | | | | 16 | NUL | | | |
| | | | | | | | 17 | NUL | | | |
| | | | | | | | 18 | NUL | | | |
| | | | | | | | 19 | NUL | | | |

3/07/91

| TAG | AD_ | AP | ST_SCA | IS_IN | IA_I | DESC | PROGRAM | | | | |
|---|---|---|---|---|---|---|---|---|---|---|---|
| PSALPG6 | TH | L | 3:2 | | ON | AUTO Power Supply Setpoint Alarm | 00 | MAXWAIT | 20 | | |
| | | | | | | | 01 | NUL | | | |
| | | | | | | | 02 | IF | PSON11 | = Off | GOTO 6 |
| | | | | | | | 03 | WAITFOR | PSSR11A | = OPEN | |
| | | | | | | | 04 | IF | PSSR11A | = CLOSE | GOTO 12 |
| | | | | | | | 05 | IF | PSSR11B | = CLOSE | GOTO 12 |
| | | | | | | | 06 | IF | PSON12 | = Off | GOTO 10 |
| | | | | | | | 07 | WAITFOR | PSSR12A | = OPEN | |
| | | | | | | | 08 | IF | PSSR12A | = CLOSE | GOTO 12 |
| | | | | | | | 09 | IF | PSSR12B | = CLOSE | GOTO 12 |
| | | | | | | | 10 | OPEN | CARAL2 | | |
| | | | | | | | 11 | GOTO | 0 | | |
| | | | | | | | 12 | CLOSE | CARAL2 | | |
| | | | | | | | 13 | GOTO | 0 | | |
| | | | | | | | 14 | NUL | | | |
| | | | | | | | 15 | NUL | | | |
| | | | | | | | 16 | NUL | | | |
| | | | | | | | 17 | NUL | | | |
| | | | | | | | 18 | NUL | | | |
| | | | | | | | 19 | NUL | | | |
| PSALPG7 | TH | L | 3 | | ON | AUTO Power Supply Setpoint Alarm | 00 | MAXWAIT | 20 | | |
| | | | | | | | 01 | NUL | | | |
| | | | | | | | 02 | IF | PSON1 | = Off | GOTO 6 |
| | | | | | | | 03 | WAITFOR | PSARC1A | = OPEN | |
| | | | | | | | 04 | IF | PSARC1A | = OPEN | GOTO 12 |
| | | | | | | | 05 | IF | PSARC1B | = OPEN | GOTO 12 |
| | | | | | | | 06 | IF | PSON2 | = Off | GOTO 10 |
| | | | | | | | 07 | WAITFOR | PSARC2A | = OPEN | |
| | | | | | | | 08 | IF | PSARC2A | = OPEN | GOTO 12 |
| | | | | | | | 09 | IF | PSARC2B | = OPEN | GOTO 12 |
| | | | | | | | 10 | OPEN | CHARC1 | | |
| | | | | | | | 11 | GOTO | 0 | | |
| | | | | | | | 12 | CLOSE | CHARC1 | | |
| | | | | | | | 13 | GOTO | 0 | | |
| | | | | | | | 14 | NUL | | | |
| | | | | | | | 15 | NUL | | | |
| | | | | | | | 16 | NUL | | | |
| | | | | | | | 17 | NUL | | | |
| | | | | | | | 18 | NUL | | | |
| | | | | | | | 19 | NUL | | | |

3/07/91

| TAG | AD_ | AP | ST_SCA | IS_IN | IA_I | DESC | PROGRAM | | | | |
|---|---|---|---|---|---|---|---|---|---|---|---|
| PSALPG8 | TH | L | 3:1 | ON | | AUTO Power Supply Setpoint Alarm | 00 | MAXWAIT | 20 | | |
| | | | | | | | 01 | NUL | | | |
| | | | | | | | 02 | IF | PSON5 | = Off | GOTO 6 |
| | | | | | | | 03 | WAITFOR | PSARC5A | = OPEN | |
| | | | | | | | 04 | IF | PSARC5A | = OPEN | GOTO 12 |
| | | | | | | | 05 | IF | PSARC5B | = OPEN | GOTO 12 |
| | | | | | | | 06 | IF | PSON6 | = Off | GOTO 10 |
| | | | | | | | 07 | WAITFOR | PSARC6A | = OPEN | |
| | | | | | | | 08 | IF | PSARC6A | = OPEN | GOTO 12 |
| | | | | | | | 09 | IF | PSARC6B | = OPEN | GOTO 12 |
| | | | | | | | 10 | OPEN | NGARC1 | | |
| | | | | | | | 11 | GOTO | 0 | | |
| | | | | | | | 12 | CLOSE | NGARC1 | | |
| | | | | | | | 13 | GOTO | 0 | | |
| | | | | | | | 14 | NUL | | | |
| | | | | | | | 15 | NUL | | | |
| | | | | | | | 16 | NUL | | | |
| | | | | | | | 17 | NUL | | | |
| | | | | | | | 18 | NUL | | | |
| | | | | | | | 19 | NUL | | | |
| PSALPG9 | TH | L | 3:2 | ON | | AUTO Power Supply Setpoint Alarm | 00 | MAXWAIT | 20 | | |
| | | | | | | | 01 | NUL | | | |
| | | | | | | | 02 | IF | PSON9 | = Off | GOTO 6 |
| | | | | | | | 03 | WAITFOR | PSARC9A | = OPEN | |
| | | | | | | | 04 | IF | PSARC9A | = OPEN | GOTO 12 |
| | | | | | | | 05 | NUL | | | |
| | | | | | | | 06 | IF | PSON10 | = Off | GOTO 10 |
| | | | | | | | 07 | WAITFOR | PSARC10A | = OPEN | |
| | | | | | | | 08 | IF | PSARC10A | = OPEN | GOTO 12 |
| | | | | | | | 09 | IF | PSARC10B | = OPEN | GOTO 12 |
| | | | | | | | 10 | OPEN | CAARC1 | | |
| | | | | | | | 11 | GOTO | 0 | | |
| | | | | | | | 12 | CLOSE | CAARC1 | | |
| | | | | | | | 13 | GOTO | 0 | | |
| | | | | | | | 14 | NUL | | | |
| | | | | | | | 15 | NUL | | | |
| | | | | | | | 16 | NUL | | | |
| | | | | | | | 17 | NUL | | | |
| | | | | | | | 18 | NUL | | | |
| | | | | | | | 19 | NUL | | | |

3/07/91

| TAG | AD_ | AP | ST_SCA | IS_IN | IA_I | DESC | PROGRAM |
|---|---|---|---|---|---|---|---|
| PSFPG1 | TH | L | 6 | | ON | AUTO Change PFS Value | see below |
| PSFPG2 | TH | L | 6:2 | | ON | AUTO Change PFS Value | see below |

PSFPG1 PROGRAM:

```
00  1     != Off   GOTO 3
01  SETOUT    PSF1          1
02  GOTO      4
03  SETOUT    PSF1          2
04  2     != Off   GOTO 7
05  SETOUT    PSF2          1
06  GOTO      8
07  SETOUT    PSF2          2
08  3     != Off   GOTO 11
09  SETOUT    PSF3          1
10  GOTO      12
11  SETOUT    PSF3          2
12  4     != Off   GOTO 15
13  SETOUT    PSF4          1
14  GOTO      0
15  SETOUT    PSF4          2
16  GOTO      0
17  NUL
18  NUL
19  NUL
```

PSFPG2 PROGRAM:

```
00  5     != Off   GOTO 3
01  SETOUT    PSF5          1
02  GOTO      4
03  SETOUT    PSF5          2
04  6     != Off   GOTO 7
05  SETOUT    PSF6          1
06  GOTO      8
07  SETOUT    PSF6          2
08  7     != Off   GOTO 11
09  SETOUT    PSF7          1
10  GOTO      12
11  SETOUT    PSF7          2
12  8     != Off   GOTO 15
13  SETOUT    PSF8          1
14  GOTO      0
15  SETOUT    PSF8          2
16  GOTO      0
17  NUL
18  NUL
19  NUL
```

3/07/91

```
TAG      AD_ AP ST_SCA IS_IN IA_I DESC                                           PROGRAM
-------  --- -- ------ ----- ---- ---------------------------------------------- ----------------------------------------------------
PSFPG3   TH  L  6:4    ON    AUTO Change PFS Value                               00  9       != Off    GOTO 3
                                                                                 01  SETOUT   PSF9          1
                                                                                 02  GOTO     4
                                                                                 03  SETOUT   PSF9          2
                                                                                 04  10      != Off    GOTO 7
                                                                                 05  SETOUT   PSF10         1
                                                                                 06  GOTO     8
                                                                                 07  SETOUT   PSF10         2
                                                                                 08  11      != Off    GOTO 11
                                                                                 09  SETOUT   PSF11         1
                                                                                 10  GOTO     12
                                                                                 11  SETOUT   PSF11         2
                                                                                 12  12      != Off    GOTO 15
                                                                                 13  SETOUT   PSF12         1
                                                                                 14  GOTO     0
                                                                                 15  SETOUT   PSF12         2
                                                                                 16  GOTO     0
                                                                                 17  NUL
                                                                                 18  NUL
                                                                                 19  NUL
PSVI1    TH  L  3      ON    AUTO Power Supply Vacuum Interlock - Chrome         00  IF       TC6       = OPEN  GOTO 5
                                                                                 01  IF       PSIV1     = CLOSE GOTO 0
                                                                                 02  CLOSE    PSIV1
                                                                                 03  CLOSE    PSIV2
                                                                                 04  GOTO     0
                                                                                 05  IF       PSIV1     = OPEN  GOTO 0
                                                                                 06  OPEN     PSIV1
                                                                                 07  OPEN     PSIV2
                                                                                 08  GOTO     0
                                                                                 09  NUL
                                                                                 10  NUL
                                                                                 11  NUL
                                                                                 12  NUL
                                                                                 13  NUL
                                                                                 14  NUL
                                                                                 15  NUL
                                                                                 16  NUL
                                                                                 17  NUL
                                                                                 18  NUL
                                                                                 19  NUL
```

3/07/91

| TAG | AD_ | AP | ST_SCA | IS_IN | IA_I | DESC | PROGRAM | | | |
|---|---|---|---|---|---|---|---|---|---|---|
| PSVI2 | TH | L | 3:1 | ON | AUTO | Power Supply Vacuum Interlock - Mag | 00 | IF | TC11 | = OPEN GOTO 5 |
| | | | | | | | 01 | IF | PSIV3 | = CLOSE GOTO 0 |
| | | | | | | | 02 | CLOSE | PSIV3 | |
| | | | | | | | 03 | CLOSE | PSIV4 | |
| | | | | | | | 04 | GOTO | 0 | |
| | | | | | | | 05 | IF | PSIV5 | = OPEN GOTO 0 |
| | | | | | | | 06 | OPEN | PSIV3 | |
| | | | | | | | 07 | OPEN | PSIV4 | |
| | | | | | | | 08 | GOTO | 0 | |
| | | | | | | | 09 | NUL | | |
| | | | | | | | 10 | NUL | | |
| | | | | | | | 11 | NUL | | |
| | | | | | | | 12 | NUL | | |
| | | | | | | | 13 | NUL | | |
| | | | | | | | 14 | NUL | | |
| | | | | | | | 15 | NUL | | |
| | | | | | | | 16 | NUL | | |
| | | | | | | | 17 | NUL | | |
| | | | | | | | 18 | NUL | | |
| | | | | | | | 19 | NUL | | |
| PSVI3 | TH | L | 3:2 | ON | AUTO | Power Supply Vacuum Interlock - Carbon | 00 | IF | TC16 | = OPEN GOTO 5 |
| | | | | | | | 01 | IF | PSIV5 | = CLOSE GOTO 0 |
| | | | | | | | 02 | CLOSE | PSIV5 | |
| | | | | | | | 03 | CLOSE | PSIV6 | |
| | | | | | | | 04 | GOTO | 0 | |
| | | | | | | | 05 | IF | PSIV5 | = OPEN GOTO 0 |
| | | | | | | | 06 | OPEN | PSIV5 | |
| | | | | | | | 07 | OPEN | PSIV6 | |
| | | | | | | | 08 | GOTO | 0 | |
| | | | | | | | 09 | NUL | | |
| | | | | | | | 10 | NUL | | |
| | | | | | | | 11 | NUL | | |
| | | | | | | | 12 | NUL | | |
| | | | | | | | 13 | NUL | | |
| | | | | | | | 14 | NUL | | |
| | | | | | | | 15 | NUL | | |
| | | | | | | | 16 | NUL | | |
| | | | | | | | 17 | NUL | | |
| | | | | | | | 18 | NUL | | |
| | | | | | | | 19 | NUL | | |

3/07/91

| TAG | AD_ | AP | ST_SCA | IS_IN | IA_I | DESC | PROGRAM | | | |
|---|---|---|---|---|---|---|---|---|---|---|
| RCPPG | TN | L | 3 | ON | AUTO | Select Recipe to Load | 00 | IF | SELRCP1 | != CLOSE GOTO 2 |
| | | | | | | | 01 | SETOUT | RCPREG | 1 |
| | | | | | | | 02 | IF | SELRCP2 | != CLOSE GOTO 4 |
| | | | | | | | 03 | SETOUT | RCPREG | 2 |
| | | | | | | | 04 | IF | SELRCP3 | != CLOSE GOTO 6 |
| | | | | | | | 05 | SETOUT | RCPREG | 3 |
| | | | | | | | 06 | IF | SELRCP4 | != CLOSE GOTO 0 |
| | | | | | | | 07 | SETOUT | RCPREG | 4 |
| | | | | | | | 08 | GOTO | 0 | |
| | | | | | | | 09 | NUL | | |
| | | | | | | | 10 | NUL | | |
| | | | | | | | 11 | NUL | | |
| | | | | | | | 12 | NUL | | |
| | | | | | | | 13 | NUL | | |
| | | | | | | | 14 | NUL | | |
| | | | | | | | 15 | NUL | | |
| | | | | | | | 16 | NUL | | |
| | | | | | | | 17 | NUL | | |
| | | | | | | | 18 | NUL | | |
| | | | | | | | 19 | NUL | | |
| TD1PROG | TN | L | 3:1 | ON | AUTO | Cryo #1 Temperature Select | 00 | IF | TD1 | <= 2.22 GOTO 4 |
| | | | | | | | 01 | SETOUT | 85 | |
| | | | | | | | 02 | SETOUT | 63 | |
| | | | | | | | 03 | GOTO | 6 | |
| | | | | | | | 04 | SETOUT | 58 | |
| | | | | | | | 05 | SETOUT | 00 | |
| | | | | | | | 06 | IF | TD2 | <= 2.22 GOTO 10 |
| | | | | | | | 07 | SETOUT | 85 | |
| | | | | | | | 08 | SETOUT | 63 | |
| | | | | | | | 09 | GOTO | 12 | |
| | | | | | | | 10 | SETOUT | 58 | |
| | | | | | | | 11 | SETOUT | 00 | |
| | | | | | | | 12 | IF | TD3 | <= 2.22 GOTO 16 |
| | | | | | | | 13 | SETOUT | 85 | |
| | | | | | | | 14 | SETOUT | 63 | |
| | | | | | | | 15 | GOTO | 0 | |
| | | | | | | | 16 | SETOUT | 58 | |
| | | | | | | | 17 | SETOUT | 00 | |
| | | | | | | | 18 | GOTO | 0 | |
| | | | | | | | 19 | NUL | | |

3/07/91

| TAG | AD_ | AP | ST_SCA | IS_IN | IA_I | DESC | PROGRAM | | | | |
|---|---|---|---|---|---|---|---|---|---|---|---|
| TD2PROG | TK | L | 3:2 | ON | AUTO | Cryo #1 Temperature Select | 00 | IF | TD4 | <= | 2.22 GOTO 4 |
| | | | | | | | 01 | SETOUT | 85 | | |
| | | | | | | | 02 | SETOUT | 63 | | |
| | | | | | | | 03 | GOTO | 6 | | |
| | | | | | | | 04 | SETOUT | 58 | | |
| | | | | | | | 05 | SETOUT | 00 | | |
| | | | | | | | 06 | IF | TD5 | <= | 2.22 GOTO 10 |
| | | | | | | | 07 | SETOUT | 85 | | |
| | | | | | | | 08 | SETOUT | 63 | | |
| | | | | | | | 09 | GOTO | 12 | | |
| | | | | | | | 10 | SETOUT | 58 | | |
| | | | | | | | 11 | SETOUT | 00 | | |
| | | | | | | | 12 | IF | TD6 | <= | 2.22 GOTO 16 |
| | | | | | | | 13 | SETOUT | 85 | | |
| | | | | | | | 14 | SETOUT | 63 | | |
| | | | | | | | 15 | GOTO | 0 | | |
| | | | | | | | 16 | SETOUT | 58 | | |
| | | | | | | | 17 | SETOUT | 00 | | |
| | | | | | | | 18 | GOTO | 0 | | |
| | | | | | | | 19 | NUL | | | |
| TD3PROG | TK | L | 3 | ON | AUTO | Cryo 3 Temperature Select | 00 | IF | TD7 | <= | 2.22 GOTO 4 |
| | | | | | | | 01 | SETOUT | 85 | | |
| | | | | | | | 02 | SETOUT | 63 | | |
| | | | | | | | 03 | GOTO | 6 | | |
| | | | | | | | 04 | SETOUT | 58 | | |
| | | | | | | | 05 | SETOUT | 00 | | |
| | | | | | | | 06 | IF | TD8 | <= | 2.22 GOTO 10 |
| | | | | | | | 07 | SETOUT | 85 | | |
| | | | | | | | 08 | SETOUT | 63 | | |
| | | | | | | | 09 | GOTO | 12 | | |
| | | | | | | | 10 | SETOUT | 58 | | |
| | | | | | | | 11 | SETOUT | 00 | | |
| | | | | | | | 12 | IF | TD9 | <= | 2.22 GOTO 16 |
| | | | | | | | 13 | SETOUT | 85 | | |
| | | | | | | | 14 | SETOUT | 63 | | |
| | | | | | | | 15 | GOTO | 0 | | |
| | | | | | | | 16 | SETOUT | 58 | | |
| | | | | | | | 17 | SETOUT | 00 | | |
| | | | | | | | 18 | GOTO | 0 | | |
| | | | | | | | 19 | NUL | | | |

3/07/91

| TAG | AD_ | AP | ST_SCA | IS_IN | IA_I | DESC | PROGRAM | | | | | |
|---|---|---|---|---|---|---|---|---|---|---|---|---|
| TC4PROG | TH | L | 3:1 | ON | AUTO | Cryo 4 Temperature Select | 00 | IF | TD10 | <= | 2.22 GOTO 4 |
| | | | | | | | 01 | SETOUT | 85 | | |
| | | | | | | | 02 | SETOUT | 63 | | |
| | | | | | | | 03 | GOTO | 6 | | |
| | | | | | | | 04 | SETOUT | 58 | | |
| | | | | | | | 05 | SETOUT | 00 | | |
| | | | | | | | 06 | IF | TD11 | <= | 2.22 GOTO 10 |
| | | | | | | | 07 | SETOUT | 58 | | |
| | | | | | | | 08 | SETOUT | 63 | | |
| | | | | | | | 09 | GOTO | 12 | | |
| | | | | | | | 10 | SETOUT | 58 | | |
| | | | | | | | 11 | SETOUT | 00 | | |
| | | | | | | | 12 | IF | TD12 | <= | 2.22 GOTO 16 |
| | | | | | | | 13 | SETOUT | 85 | | |
| | | | | | | | 14 | SETOUT | 63 | | |
| | | | | | | | 15 | GOTO | 0 | | |
| | | | | | | | 16 | SETOUT | 58 | | |
| | | | | | | | 17 | SETOUT | 00 | | |
| | | | | | | | 18 | GOTO | 0 | | |
| | | | | | | | 19 | NUL | | | |

The apparatus of the present invention provides a high-speed in-line sputtering apparatus for producing superior multilayer films on substrates, such as disks suitable for use in Winchester-type hard disk drives. The process of the present invention provides an improved method of providing multilayer coatings to a variety of substrate types at a much greater rate than prior art methods.

Also described herein are a novel means for heating substrates to be coated, a novel sputtering magnetron design, a novel, variable speed, overhead, non-contaminating substrate transportation system and a comprehensive, centralized, programmable electronic means for controlling the apparatus and process are provided. Still further, when the process and apparatus are used for providing magnetic coatings for substrates, such as disks, to be utilized in hard disk drives using Winchester-type technology, a unique disk texturing method for improving the disk's magnetic recording properties, and a novel disk carrier (or pallet) design which contributes to uniform substrate heating characteristics in a large, single, high capacity pallet, are also provided herein. Numerous variations are possible as will be apparent to those skilled in the art; such variations are intended to be within the scope of the invention as defined by this specification and the following claims are intended to cover all the modifications and equivalents falling within the scope of the invention.

We claim:

1. A high throughput, in-line sputtering apparatus for providing a single or multi-layer magnetic coating to the surface of a plurality of disk substrates, the plurality of substrates being provided in a planar disk carrier having a top and bottom, said apparatus comprising:

- a plurality of buffer chambers and a plurality of sputtering chambers;
- an input end and an output end, the buffer and sputtering chambers being positioned between the input end and the output end, wherein at least one buffer chamber is disposed between a first and second ones of the plurality of sputtering chambers; and
- a transport system moving the disk carrier through said buffer and sputtering chambers of said apparatus in a continuous motion at at least a first rate and a second, different rate of speed, the transport system including a coupling mechanism securing the disk carrier at the top of the disk carrier such that the disk carrier is suspended from the coupling mechanism during movement in the chambers of the apparatus.

2. The apparatus of claim 1 wherein the transport system moves the carrier through a first of the plurality of the sputtering chambers at the first rate of speed and through a second of the plurality of sputtering chambers at the second rate of speed.

3. The high throughput sputtering apparatus of claim 2 wherein said input end includes an entrance lock chamber, a stationary heater chamber, and a passby heater chamber, and said output end includes an exit lock, the exit lock comprising an exit buffer chamber and an exit lock chamber, and wherein said disk carrier is transported in a continuous motion from said passby heater to said exit buffer chamber.

4. The high throughput sputtering apparatus of claim 2 wherein said apparatus further includes an evacuation system for reducing the ambient pressure within the buffer and sputtering chambers, and a control system, coupled to the evacuation system and transport system.

5. The apparatus of claim 4 wherein the sputtering chambers are reduced to an ambient pressure in a range of between 2–12 mTorr during sputtering of the substrates.

6. The high throughput sputtering apparatus of claim 2 wherein the first rate of speed is in a range of approximately 2.0 to 5.9 ft. per min., and the second rate of speed is in a range of approximately 6.0 to 12.0 ft. per min.

7. The high throughput sputtering apparatus of claim 6 wherein the disk carrier is transported through said first and second of said plurality of sputtering chambers at at least the first and the second rate of speed, respectively, and through at least one buffer chamber at a third rate of speed, wherein the first rate of speed is in a range of approximately 2.7 to 3.0 ft. per min., the second rate of speed is approximately 6.0 to 7.5 ft. per min., and the third rate of speed is approximately 12.0 ft. per min.

8. The apparatus of claim 2 wherein each of the sputter chambers is evacuated by the vacuum system to a pressure in the range of 1–12 mTorr.

9. A high throughput, in-line sputtering apparatus for applying a magnetic coating to the surface of a plurality of disk substrates, the substrates being provided in a substrate carrier, said apparatus comprising:

- means for sputtering a multi-layer coating onto the plurality of substrates, said means for sputtering including a series of sputtering chambers, and at least one buffer chamber disposed between ones of said series of sputtering chambers, isolated from ambient atmospheric conditions;
- means for transporting said plurality of substrates through said means for sputtering, the means for transporting coupled to the substrate carrier such that the substrate carrier is suspended from a top portion of the substrate carrier and transported through the apparatus at at least a first velocity and a second, different velocity;
- means for evacuating said means for sputtering to a vacuum level within a pressure range sufficient to enable sputtering operation;
- means for heating said plurality of substrates to a temperature conducive to sputtering said multi-layer coatings thereon, said means for heating providing a substantially uniform temperature profile over the surface of said substrate; and
- control means for providing control signals to, and for receiving feedback input from, said means for sputtering, means for transporting, means for evacuating, and means for heating, said control means being programmable to automatically control said means for sputtering, means for transporting, means for evacuating and means for heating to synchronize said means for sputtering, means for transporting, and means for heating, the control means providing the feedback input to a user interface and being responsive to input from the user interface;

wherein the control means alters the control signals in real time responsive to the input from the user interface.

10. The high throughput sputtering apparatus of claim 9 wherein the pressure range provided by the means for evacuating is less than 20 mTorr.

11. The high throughput sputtering apparatus of claim 9 wherein said means for transporting moves the substrate at the first velocity through a first of the plurality of sputtering chambers, and at the second velocity through a second of the series of sputtering chambers.

12. The high throughput sputtering apparatus of claim 11, wherein said means for sputtering further includes a series of buffer chambers interposed between said ones of said series of sputtering chambers, to provide said relative isolation of each sputtering chamber and wherein said means for transporting moves the substrates at a third velocity through said buffer chambers.

13. The sputtering apparatus of claim 11, wherein said control means includes position sensor means for detecting a position of the substrate carrier in the apparatus, heat detector means for determining the heat of the substrate within the apparatus, pressure detection means for determining the atmospheric pressure within the means for sputtering, and at least one microprocessing unit, for operating control software, said position detecting means, heat detecting means, and pressure detecting means comprising the feedback input to the control means, said software providing a user interface for the system operator.

14. The high throughput sputtering apparatus of claim 9 wherein a plurality of substrate carriers are simultaneously processed by the apparatus, each of said plurality of substrate carriers is coupled to and suspended from the means for transporting, and said means for transporting moves one of said plurality of substrate carriers at at least the first velocity and another one of said plurality of substrate carriers at the second velocity when said respective substrate carriers are moving in a respective first and second ones of said sputtering chambers.

15. The sputtering apparatus of claim 14, wherein said first velocity is in a range of 2.7 to 3.0 ft. per min., and said second velocity is in a range of 6.0 to 12.0 ft. per min.

16. The sputtering apparatus of claim 14, wherein the means for heating includes a dwell heater chamber wherein the substrate carriers are maintained in an at rest position for a pre-determined period of time, and a passby heater chamber, through which the substrate carrier is transported at the first or second velocity.

17. An in-line, high throughput sputtering apparatus applying magnetic coatings to a plurality of disk substrates in a pallet, the pallet having a planar shape, a top and a bottom, comprising:

control means for providing control signals and for monitoring a plurality of sensory input signals;

an entrance lock chamber and an exit lock chamber;

a plurality of sequential sputtering chambers positioned between the entrance lock chamber and the exit lock chamber;

a transport system responsive to a first subset of said control signals and supporting the pallets at the top of the pallet, the entrance lock, and the exit lock, the transport system carrying said pallet at a first velocity of a minimum of about 2.5 ft/min through each of said plurality of sputtering chambers, and carrying said pallet at a second, different velocity in one of said sputtering chambers, the transport system including a first set of means for providing said sensory input signals to said control means;

means for evacuating the apparatus to a reduced pressure level within a pressure range to enable sputtering operation responsive to said control means, said means for reducing including a second set of means for providing said sensory input signals to said control means;

means for heating said plurality of substrates to an ambient temperature, said temperature having a substantially uniform profile over the surface of each said substrate and said pallet, said means for heating including a third set of means for providing said sensory input signals to said control means; and means for sputtering a multi-layer coating onto said substrate responsive to said control means, said means for sputtering including a third set of means for providing said sensory input signals to said control means.

18. The high throughput sputtering apparatus of claim 17 wherein the pressure level provided by the means for evacuating is in a range of 9–12 mTorr during sputtering.

19. The sputtering apparatus of claim 17 wherein the means for transporting includes a plurality of individual transport stages respectively corresponding to the sputtering chambers, and a plurality of motors, one of said plurality of motors being associated with each of said plurality of individual stages and governing motion of the pallet through the sputtering chamber.

20. The sputtering apparatus of claim 19 wherein the means for heating includes a stationary heating chamber and a passby heating chamber, wherein the pallet is transported through the passby heating chamber at said first or second velocity.

21. The sputtering apparatus of claim 19 wherein the control means is coupled to each of said plurality of individual sputtering chambers and each of said motors, and wherein a plurality of position detectors is associated with each of said individual stages, the outputs of each of the position detectors comprising a subset of the first set of means for providing sensory input signals to said control means, wherein said control means individually controls the velocity of the pallet at each of said individual stages.

22. An in-line sputtering apparatus for applying magnetic coatings to disk substrates, comprising:

an input chamber;

an output chamber;

a plurality of sputter and buffer chambers wherein at least one buffer chamber is disposed between a first and second ones of the plurality of sputter chambers;

a transport system including a plurality of pallets, each having a planar shape, a top portion and a bottom portion, and each supporting a plurality of the disk substrates, means for suspending each of the pallets from the top portion of each pallet, and for moving the pallet through the apparatus through the input, output, sputter and buffer chambers, and means for moving the means for suspending, from the input end to the output end, in continuous motion through the sputter and buffer chambers, at a first velocity and a second, different velocity;

a pumping system for evacuating the input, output, sputter and buffer chambers; and a control system coupled to the pumping system, input, output, sputter and buffer chambers, and transport system.

23. An in-line sputtering apparatus for applying magnetic coatings to disk substrates, comprising:

an input chamber;

an output chamber;

a plurality of sputter and buffer chambers wherein at least one buffer chamber is disposed between a first and second ones of the plurality of sputter chambers;

a transport system including a plurality of pallets, each having a planar shape, a top portion and a bottom portion, and each supporting a plurality of the disk substrates, an overhead carrier coupling each of the pallets from the top portion of each pallet, and transporting each pallet through the apparatus through the input, output, sputter and buffer chambers, and a plurality of motors for moving the overhead carrier at a first velocity and a second, different velocity through the sputter and buffer chambers;

a pumping system for evacuating the input, output, sputter and buffer chambers; and a control system coupled to the pumping system, input, output, sputter and buffer chambers, and transport system.

* * * * *